US007028899B2

(12) United States Patent
Tsikos et al.

(10) Patent No.: US 7,028,899 B2
(45) Date of Patent: Apr. 18, 2006

(54) METHOD OF SPECKLE-NOISE PATTERN REDUCTION AND APPARATUS THEREFORE BASED ON REDUCING THE TEMPORAL-COHERENCE OF THE PLANAR LASER ILLUMINATION BEAM BEFORE IT ILLUMINATES THE TARGET OBJECT BY APPLYING TEMPORAL PHASE MODULATION TECHNIQUES DURING THE TRANSMISSION OF THE PLIB TOWARDS THE TARGET

(75) Inventors: Constantine J. Tsikos, Voorhees, NJ (US); C. Harry Knowles, Moorestown, NJ (US); Xiaoxun Zhu, Marlton, NJ (US); Michael D. Schnee, Aston, PA (US); Ka Man Au, Philadelphia, PA (US); Sankar Ghosh, Glenolden, PA (US)

(73) Assignee: Metrologic Instruments, Inc., Blackwood, NJ (US)

( * ) Notice: Subject to any disclaimer, the term of this patent is extended or adjusted under 35 U.S.C. 154(b) by 484 days.

(21) Appl. No.: 09/990,585

(22) Filed: Nov. 21, 2001

(65) Prior Publication Data

US 2003/0098349 A1 May 29, 2003

Related U.S. Application Data

(63) Continuation-in-part of application No. 09/999,687, filed on Oct. 31, 2001, and a continuation-in-part of application No. 09/954,477, filed on Sep. 17, 2001, and a continuation-in-part of application No. 09/883,130, filed on Jun. 15, 2001, which is a continuation-in-part of application No. 09/781,665, filed on Feb. 12, 2001, and a continuation-in-part of application No. 09/780,027, filed on Feb. 9, 2001, and a continuation-in-part of application No. 09/721,885, filed on Nov. 24, 2000, and a continuation-in-part of application No. 09/327,756, filed on Jun. 7, 1999, now abandoned, and a continuation-in-part of application No. PCT/US00/15624, filed on Jun. 7, 2000.

(51) Int. Cl.
*G06K 7/10* (2006.01)

(52) U.S. Cl. .............................. 235/462.01; 235/462.25

(58) Field of Classification Search ................. 235/454, 235/455, 470, 462.01–462.45, 472.01–472.03; 359/359, 621, 618, 619, 980; 250/332, 208.1
See application file for complete search history.

(56) References Cited

U.S. PATENT DOCUMENTS

| | | | | |
|---|---|---|---|---|
| 3,901,597 A | | 8/1975 | White | |
| 4,687,325 A | | 8/1987 | Corby | |
| 4,826,299 A | | 5/1989 | Powell | |
| 4,900,907 A | | 2/1990 | Matusima et al. | |
| 4,961,195 A | | 10/1990 | Skupsky et al. | |
| 4,979,815 A | | 12/1990 | Tsikos | |
| 5,039,210 A | * | 8/1991 | Welstead et al. | 349/1 |
| 5,073,782 A | * | 12/1991 | Huguenin et al. | 342/179 |
| 5,136,145 A | | 8/1992 | Karney | |
| 5,192,856 A | | 3/1993 | Schaham | |
| 5,212,390 A | | 5/1993 | LeBeau et al. | |
| 5,258,605 A | * | 11/1993 | Metlitsky et al. | 235/462.32 |
| 5,319,181 A | | 6/1994 | Shellhammer et al. | |
| 5,319,185 A | | 6/1994 | Obata | |
| 5,378,883 A | | 1/1995 | Batterman et al. | |
| RE35,148 E | | 1/1996 | Lizzi et al. | |
| 5,532,467 A | | 7/1996 | Roustaei | |
| 5,545,886 A | | 8/1996 | Metlitsky et al. | |
| 5,568,318 A | * | 10/1996 | Leger et al. | 359/618 |
| 5,615,003 A | | 3/1997 | Hermary et al. | |
| 5,621,203 A | | 4/1997 | Swartz et al. | |
| 5,672,858 A | | 9/1997 | Li et al. | |
| 5,686,720 A | * | 11/1997 | Tullis | 250/208.1 |
| 5,710,417 A | | 1/1998 | Joseph et al. | |
| 5,786,582 A | | 7/1998 | Roustaei et al. | |
| 5,825,803 A | | 10/1998 | Labranche et al. | |
| 5,841,889 A | | 11/1998 | Seyed-Bolorforosh | |
| 5,923,475 A | * | 7/1999 | Kurtz et al. | 359/619 |
| 5,926,494 A | * | 7/1999 | Pepper | 372/70 |
| 5,986,745 A | | 11/1999 | Hermary et al. | |
| 5,988,506 A | | 11/1999 | Schabam et al. | |
| RE36,528 E | | 1/2000 | Roustaei | |
| 6,034,379 A | * | 3/2000 | Bunte et al. | 250/566 |
| 6,081,381 A | | 6/2000 | Shalapenok et al. | |
| 6,128,049 A | | 10/2000 | Butterworth | |

| | | | | |
|---|---|---|---|---|
| 6,159,153 | A | 12/2000 | Dubberstein et al. | |
| 6,184,981 | B1 | 2/2001 | Hasson et al. | |
| 6,191,887 | B1 | 2/2001 | Michaloski et al. | |
| 6,223,988 | B1 | 5/2001 | Batterman et al. | |
| 6,230,975 | B1 | 5/2001 | Colley et al. | |
| 6,356,700 | B1 * | 3/2002 | Strobl | 385/147 |
| 2002/0036233 | A1 * | 3/2002 | Itou | 235/454 |

FOREIGN PATENT DOCUMENTS

| | | |
|---|---|---|
| US | 60/190273 | 5/2001 |
| WO | WO 99/21252 | 4/1999 |
| WO | WO 99/31531 | 6/1999 |
| WO | WO 99/49787 | 10/1999 |
| WO | WO 99/60443 | 11/1999 |
| WO | WO 99/64916 | 12/1999 |
| WO | WO 99/64980 | 12/1999 |
| WO | WO 00/43822 | 7/2000 |
| WO | WO 00/62114 | 10/2000 |
| WO | WO 00/65401 | 11/2000 |
| WO | WO 01/71419 A2 | 9/2001 |
| WO | WO 01/72028 A1 | 9/2001 |

OTHER PUBLICATIONS

Web–based Product Brochure on Model 120 LIVAAR Short Wave IR Gated Camera Specification, by Intevac Corporation, Santa Clara CA, Sep. 2001, pp. 1–2.
Web–based presentation entitled "New LIVAR Imagery" by Intevac Corporation, Santa Clara CA, http://www.intevac-.com/livar imagery/livar imagery.html. 2001, pp. 1–9.
Web–based brochure for Intevac Photonics Division Products– Laser Illuminated Viewing and Ranging (LIVAR) System, Intevac, Inc., http://www.intevac.com/photonics/products.html, 2001, pp. 1–5.
Web–based publication entitled "Planar Etalon Theory" by TecOptics, www.tecoptics.com/etalons/theory.htm, 2001, pp. 1–2.
Web–based publication entitled "Introduction: Etalons" by TecOptics, http://www.tecoptics.com/etalons/index.htm, 2001, 1 page.
Web–based publication entitled "Types of Planar Etalons" by TecOptics, http://www.tecoptics.com/etalons/types.htm, 2001, pp. 1–3.
Web–based brochure entitled "High–Speed, Repetitively Pulsed Ruby Laser Light Source" by Physical Sciences Inc., http://www.psicvorp.com/html/prod/lasillum.htm, 2001, pp. 1–4.
Web–based brochure entitled "Collimated Laser Diode Arrays" by INO, Inc., http://www.ino.qe.ca/en/syst et compo/clda.asp, 2001, pp. 1–2.
Product Brochure for the Lasiris™ SNF Laser by StockerYale, Salem NH, 2001, pp. 1–4.
Academic publication entitled "Nonlinear Electro–Optic Effect and Kerr Shutter" by Jagat Shakya and Mim lal Nakarmi, Dept. of Physics, Kansas State Univ., Apr. 2001, pp. 1–14.
Product Brochure for the AV3700 High Speed CCD Bar Code Reader by Accu–Sort Corporation, 2001, pp. 1–2.
Chapter 4 entitled "Speckle Reduction" by T.S. McKechnie, Topics in Applied Physics vol. 9—Laser Speckle and Related Phenomena, Editor J.C. Dainty, Springer–Verlag, 1984, pp. 123–170.
Product brochure for DALSA IT–PA Image Sensors, by Dalsa, Inc., 2001pp. 1–14.
Web–based brochure for the Optical Shutter by Optron Systems, Inc., http://members.bellatlantic.net/optron3/shutter.htm#TypicalApplications, 2001, pp. 1–4.
Product Specification for "KAF–4202 Series Full–Frame CCD Image Sensor Performance Specification" by Eastman Kodak Company, Rochester NY, Jun. 29, 2000, pp. 1–15.
User Manual for the Piranha CT–P4, CL–P4 High Speed Line Scan Camera by Dalsa, Inc., 2000, pp. 1–30.
Scientific publication entitled "Speckle Reduction in Laser Projections with Ultrasonic Waves" by Wang et al., Opt. Eng. 39(6) 1659–1664 Jun. 2000, vol. 39, No. 6.
Scientific publication entitled "Principles of Parametric Temporal Imaging—Part I: System Configurations" by Bennett et al., IEEE Journal of Quantum Electronics, vol. 36, No. 4, Apr., 2000, vol. 36, No. 4, pp. 430–437.
Product brochure by Sony ICX085AL 2/3–inch Progressive Scan CCD Image Sensor with Square Pixel for B/W Cameras, by Sony Corporation, 2000, pp. 1–20.
Web–based slide show entitled "Speckle Noise and Laser Scanning Systems" by Kresic–Juric et al., www.ima.umn-.edu/industrial/99–2000/kresic/sld001.htm, 2000, pp. 1–25.
Product brochure for "ML1XX6 Series for Optical Information Systems" by Mitsubishi Electric, Dec. 1999, pp. 1–4.
NEC Press Release entitled "NEC Develops Highly Stable, Ultra–short Pulse Semiconductor Laser for Ultra–high Capacity Optical Communications" by NEC Corporation, Jan. 11, 1999, pp. 1–3.
Scientific publication entitled "High–speed visualization, a powerful diagnostic tool for microactuators—retrospect and prospect" by Krehl et al., Microsystem Technologie 5, Springer–Verlag 1999, pp. 113–132.
Web–based publication entitled "3–D Sensing" Papadoupoulos, http://perso.club–internet.fr/dpo/numeerisation 3d, 1995, pp. 1–12.
Scientific publication entitled "Laser triangulation: fundamental uncertainty in distance measurement" by Dorsch et al., Applied Optics, vol. 33(7), Mar. 1994, pp. 442–450.
Scientific publication entitled "The Use of Diode Laser Collimators for Targeting 3–D Objects" by Clarke et al., Dept. Engineering/City Univ./London, 1994, pp. 47–54.
Scientific publication entitled "Speckle Reduction by Virtual Spatial Coherence" by Freischlad et al., SPIE vol. 1755 Interferometry: Techniques and Analysis (1992), pp. 38–43.
2002 Search Report for International Application No. PCT/US01/44011.

* cited by examiner

*Primary Examiner*—Thien M. Le
(74) *Attorney, Agent, or Firm*—Thomas J. Perkowski, Esq., P.C.

(57) ABSTRACT

A planar laser illumination and imaging (PLLIM) based camera system capable of producing digital images with reduced levels of speckle-pattern noise. The PLIIM based camera system comprises a planar laser illumination array (PLIA) including a plurality of laser diodes for producing and projecting a planar laser illumination beam (PLIB), so as to illuminate an object as it is moving past said PLIIM based camera system. An image formation and detection (IFD) module is provided having a image detection array and imaging forming optics for providing the image detection array with a field of view (FOV). The PLIB and FOV are arranged in a coplanar relationship along the working range of the PLIIM based camera system so that the PLIB illuminates primarily within the FOV of the IFD module. A speckle-pattern noise reduction subsystem is integrated with the PLIA, for reducing the temporal-coherence of said planar laser illumination beam (PLIB) before the PLIB illuminates a target object. The speckle-pattern noise reduction subsystem carries out a temporal phase modulation technique during the transmission of the PLIB towards the target, so that the object is illuminate with a temporally coherent-reduced planar laser illumination beam (PLIB) and numerous substantially different time-varying speckle-noise patterns are produced at the image detection array over the photo-integration time period thereof. The numerous substantially different time-varying speckle-noise patterns are detected at the image detection array over the photo-integration time period, and the detected speckle-noise patterns are temporally averaged at said image detection array during the photo-integration time period thereof. As a result of such temporal averaging, the RMS power of observable speckle-noise patterns is reduced at the image detection array. By virtue of the present invention, it is now possible to enjoy the benefits of using laser-based illumination during high-speed imaging operations, without the adverse effects associated with speckle-pattern noise.

12 Claims, 397 Drawing Sheets

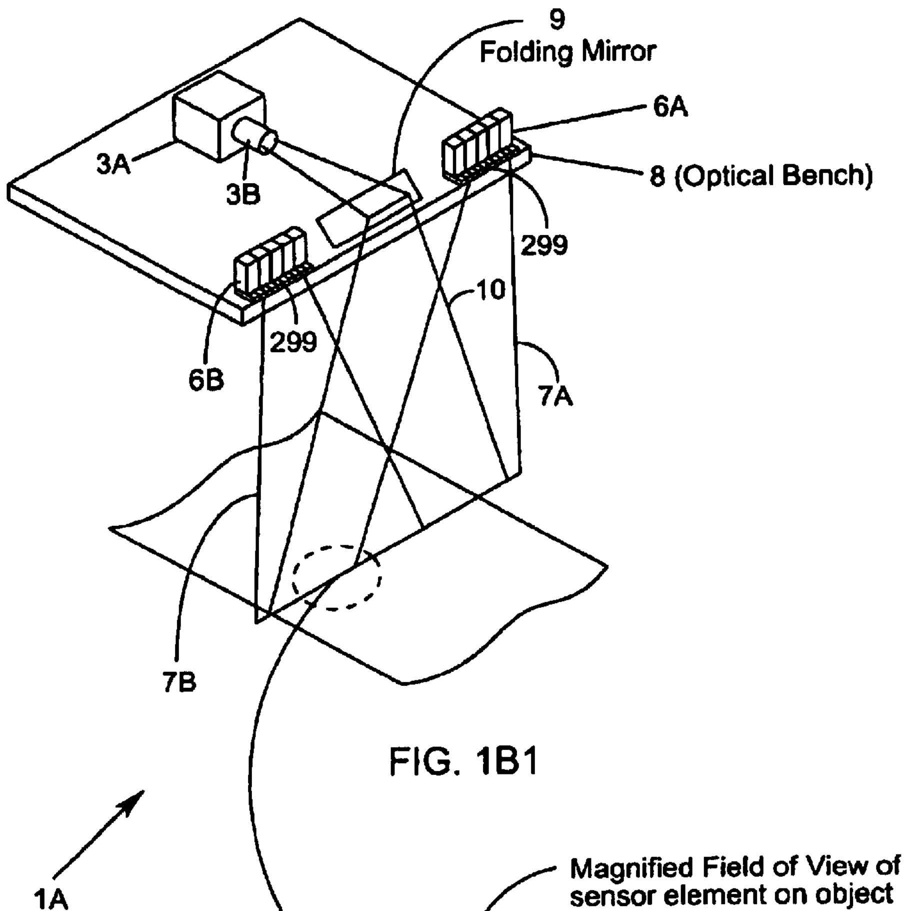
FIG. 1B1
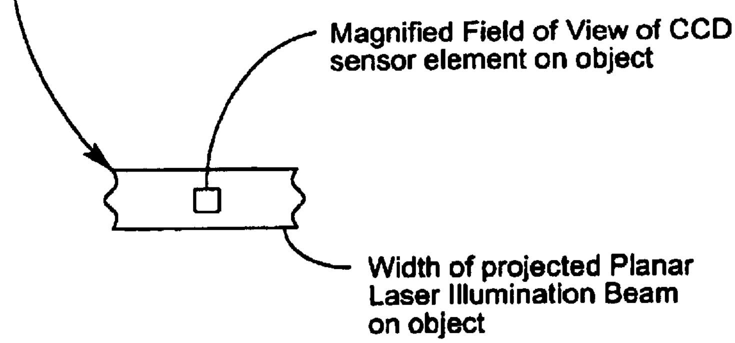
FIG. 1B3

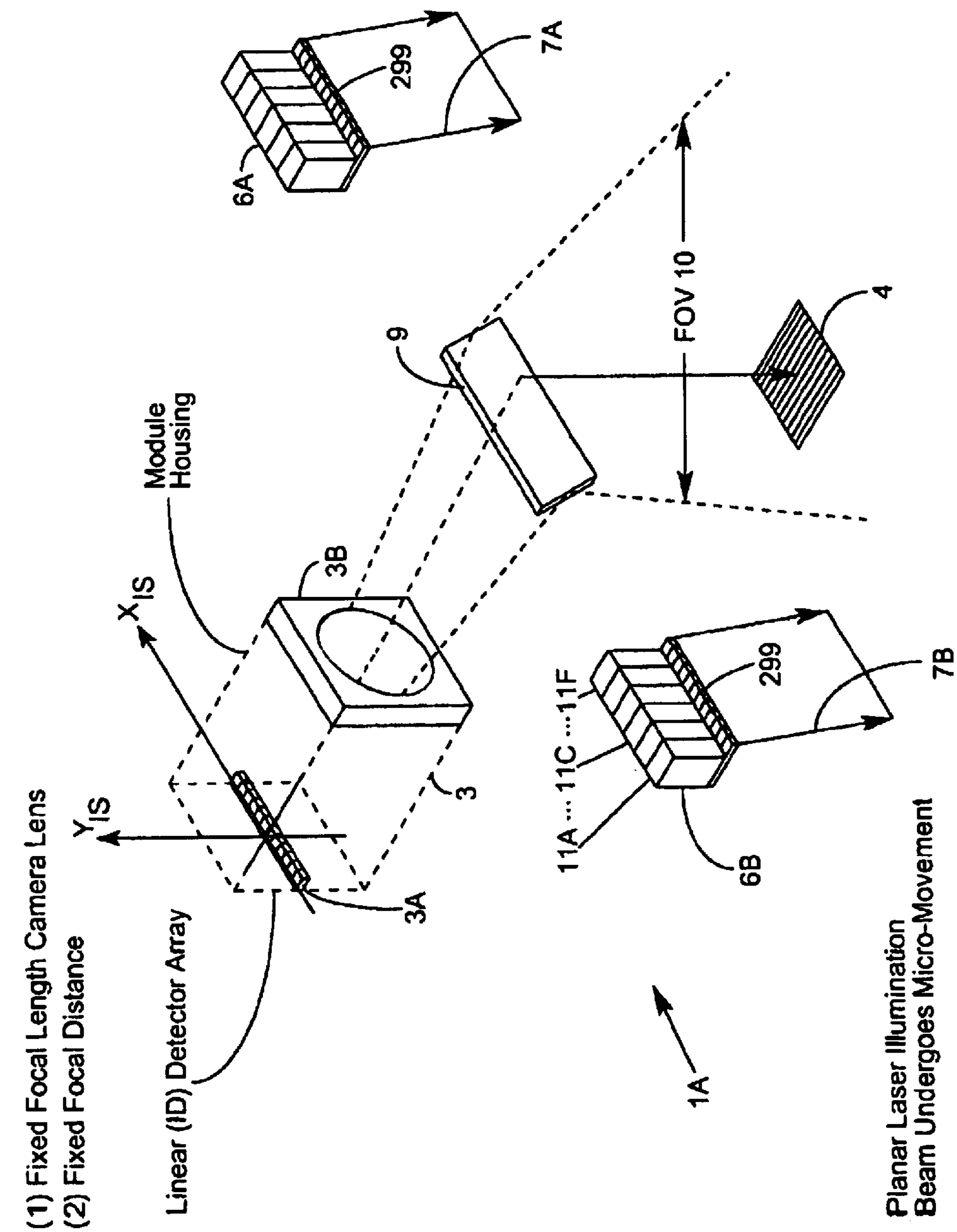
FIG. 1B2

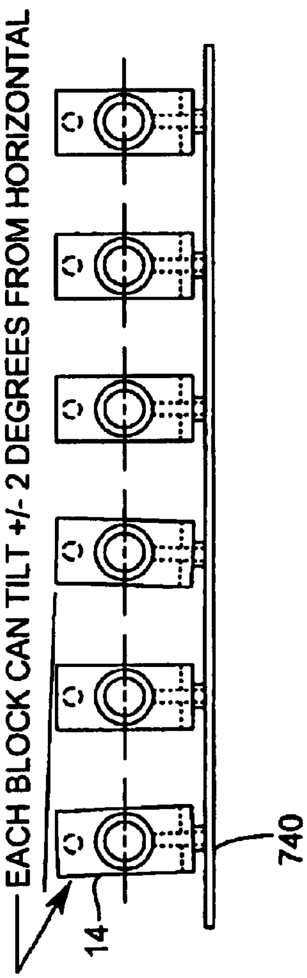
FIG. 1B4
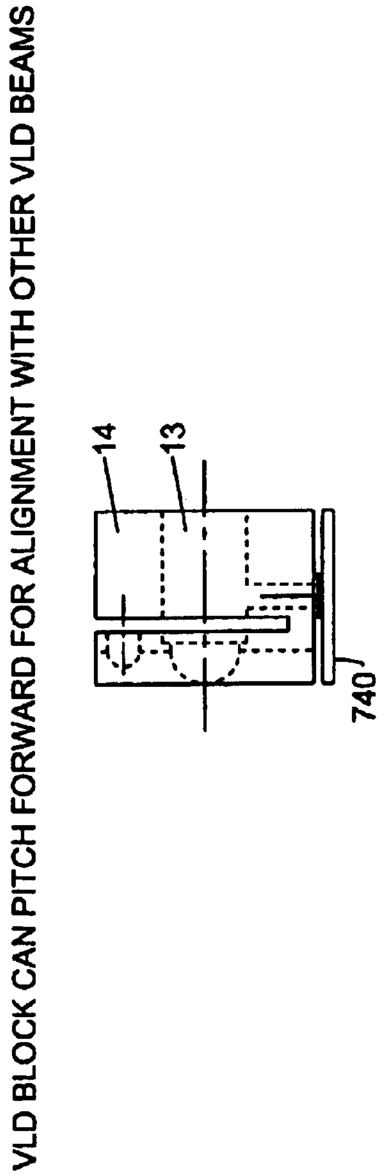
FIG. 1B5

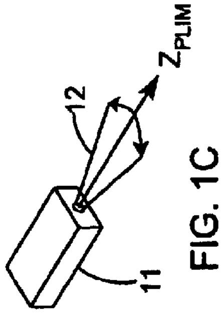
FIG. 1C
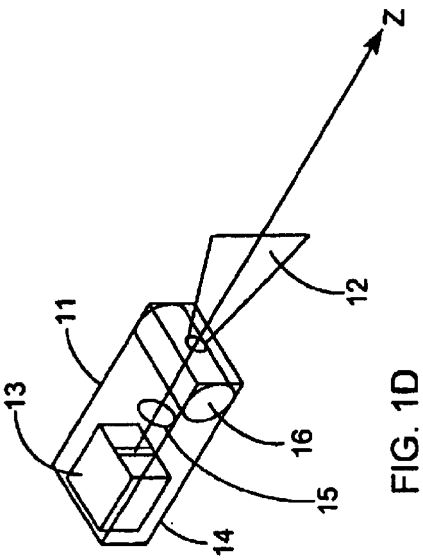
FIG. 1D
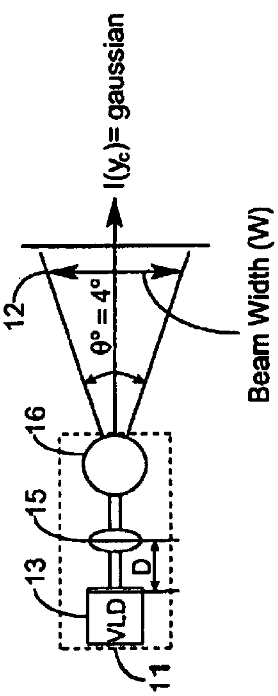
FIG. 1E1
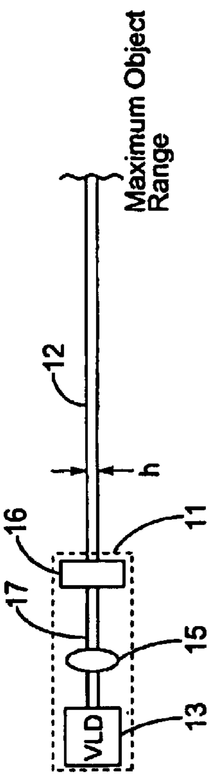
FIG. 1E2

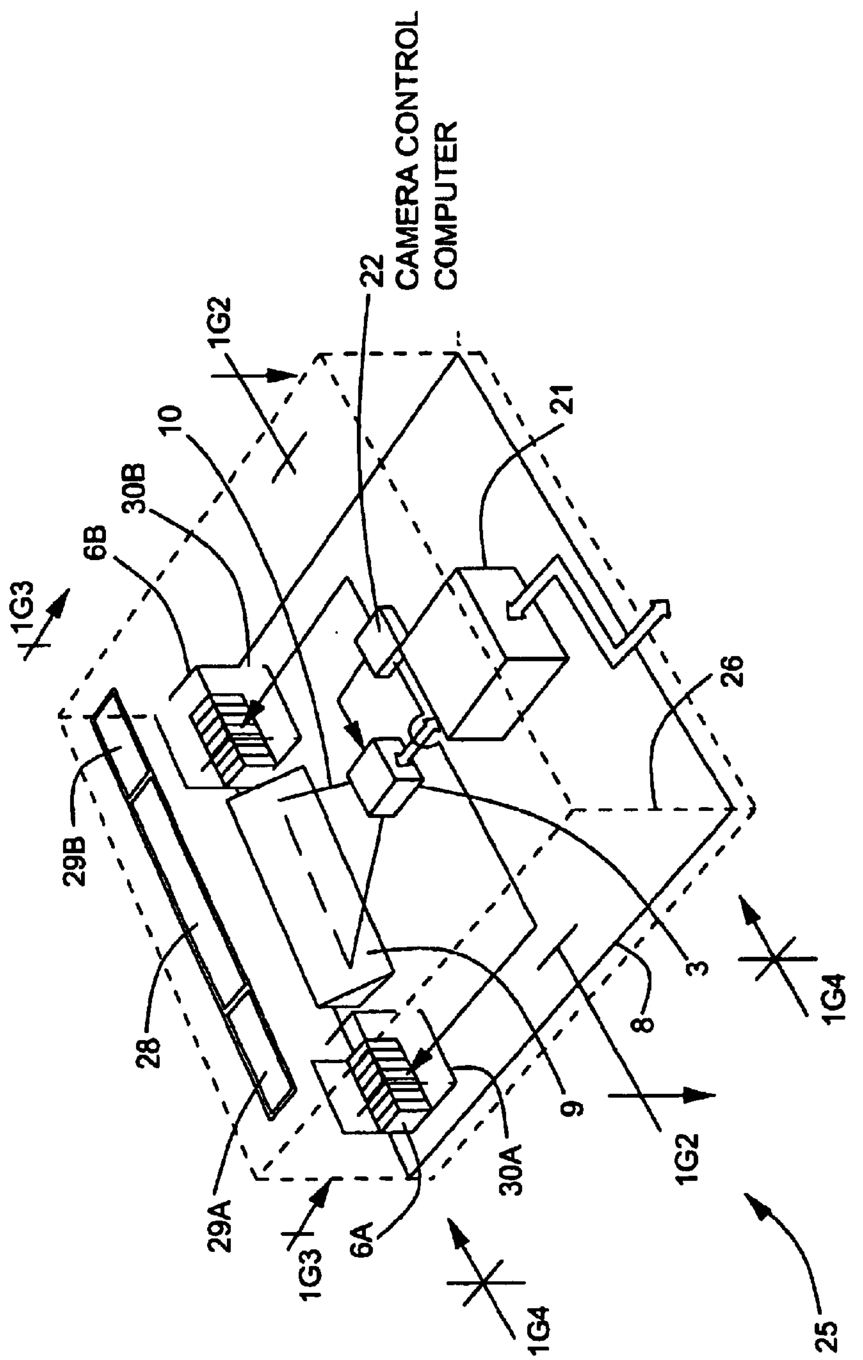
FIG. 1G1

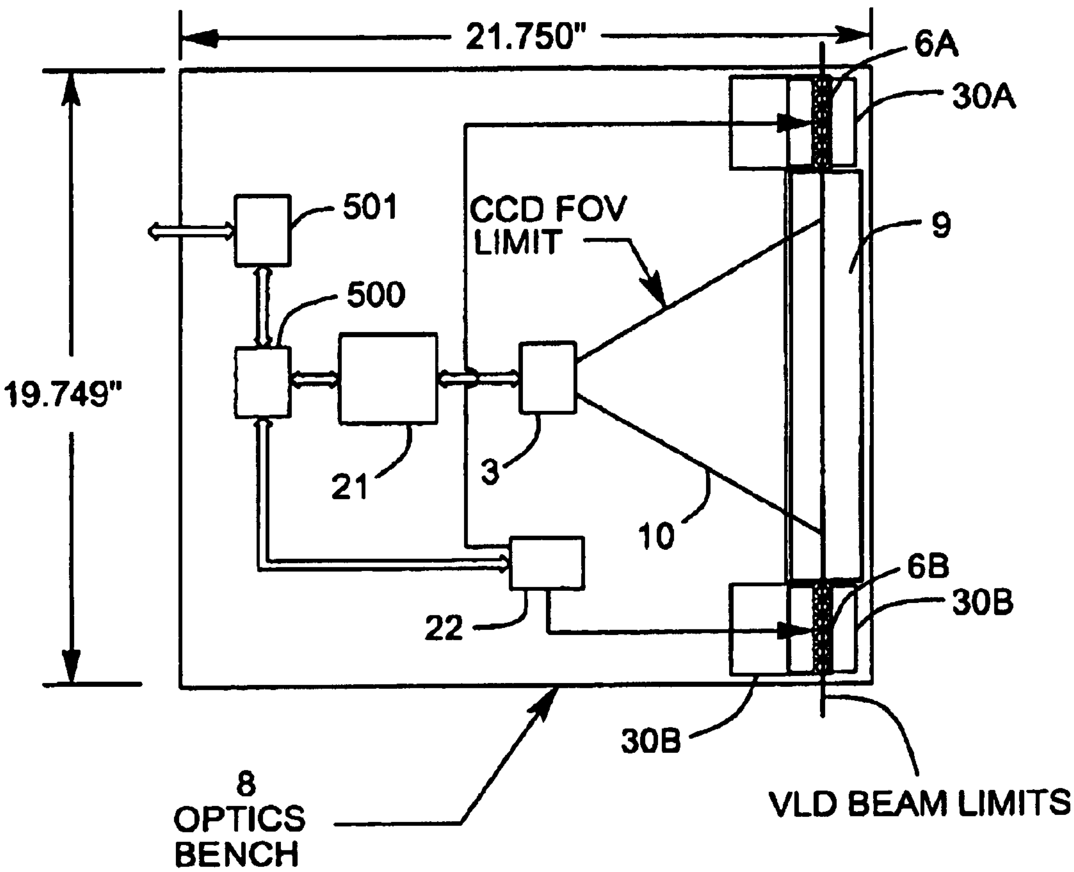
FIG. 1G2

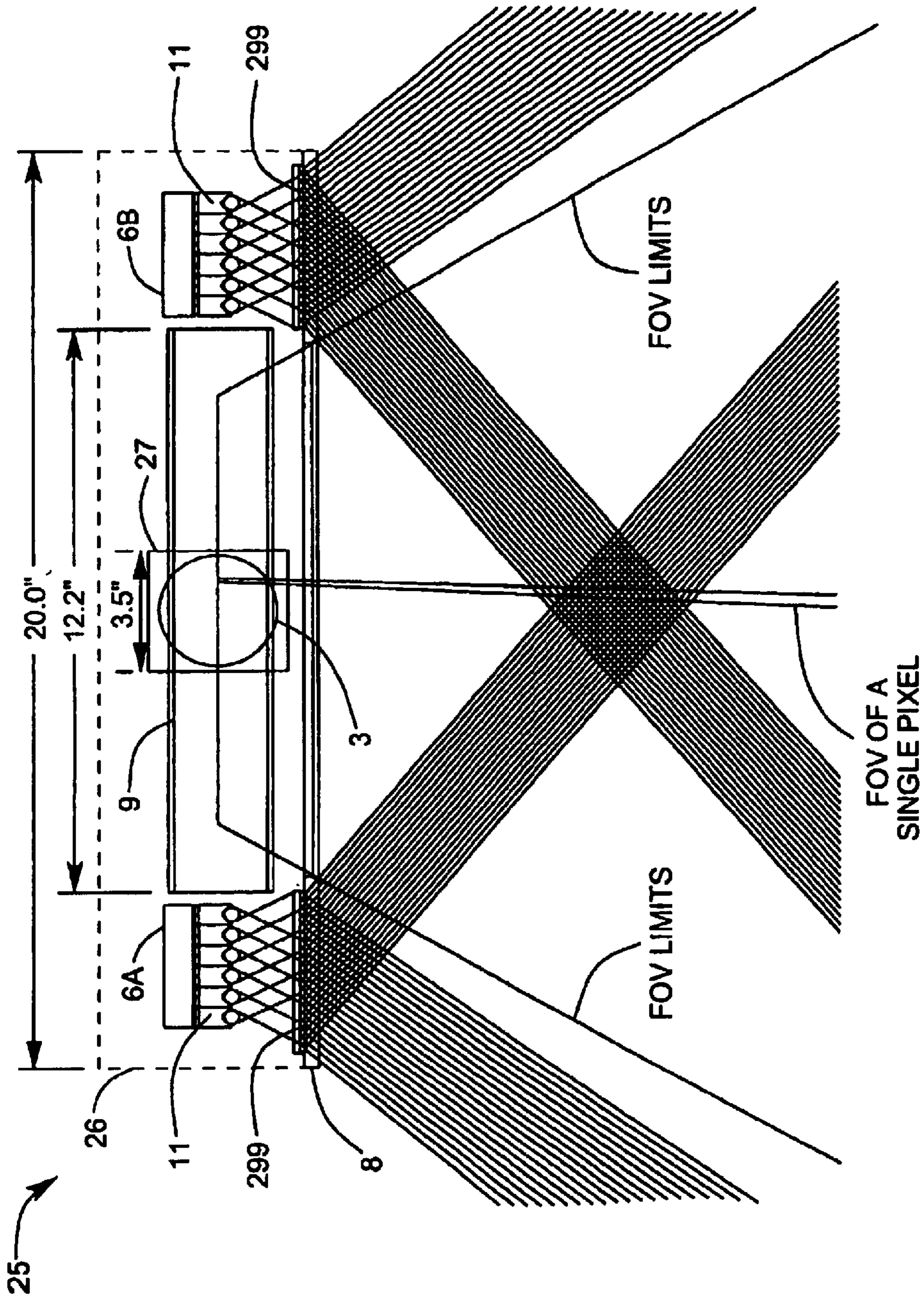
FIG. 1G3

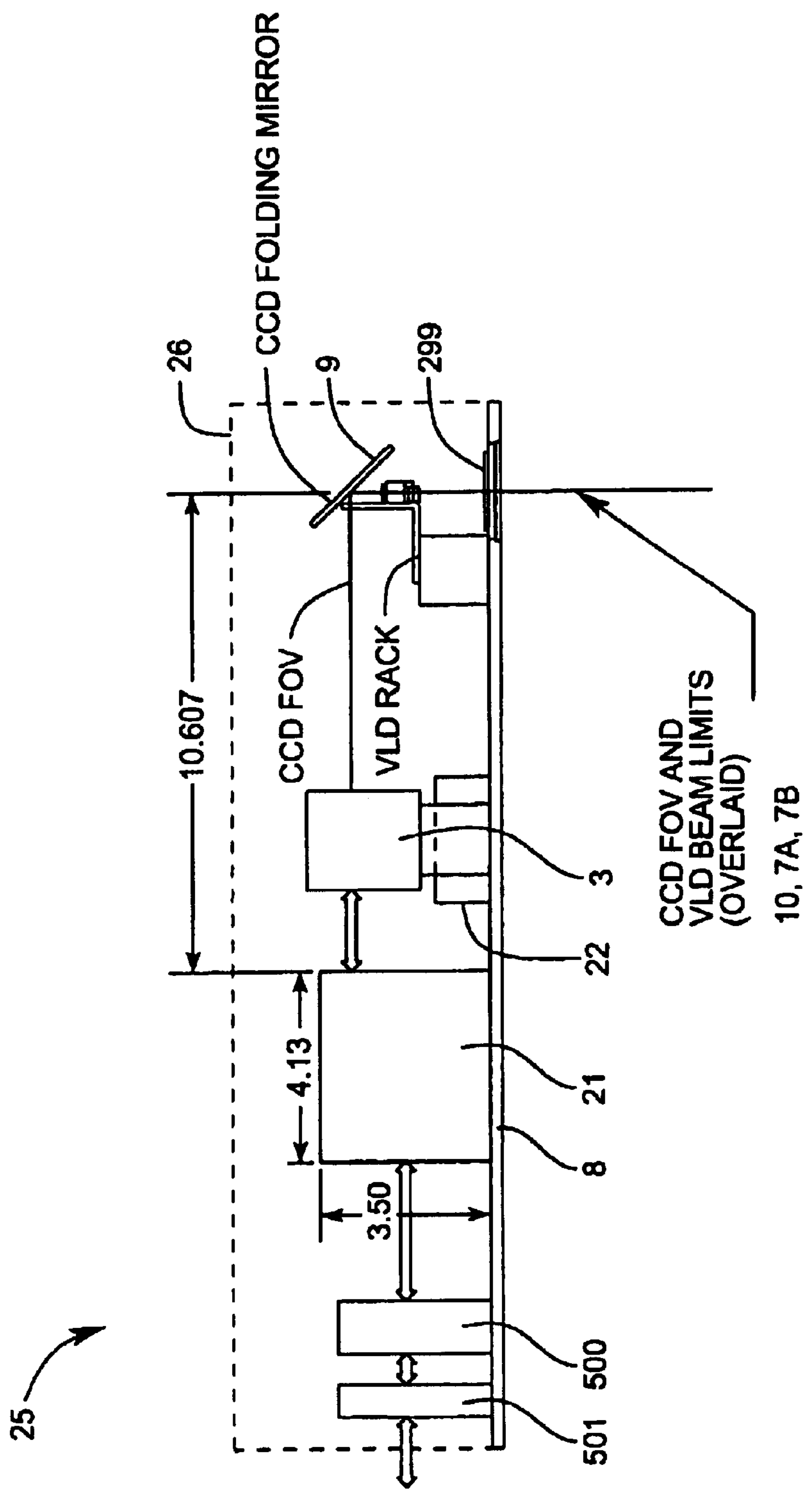
FIG. 1G4

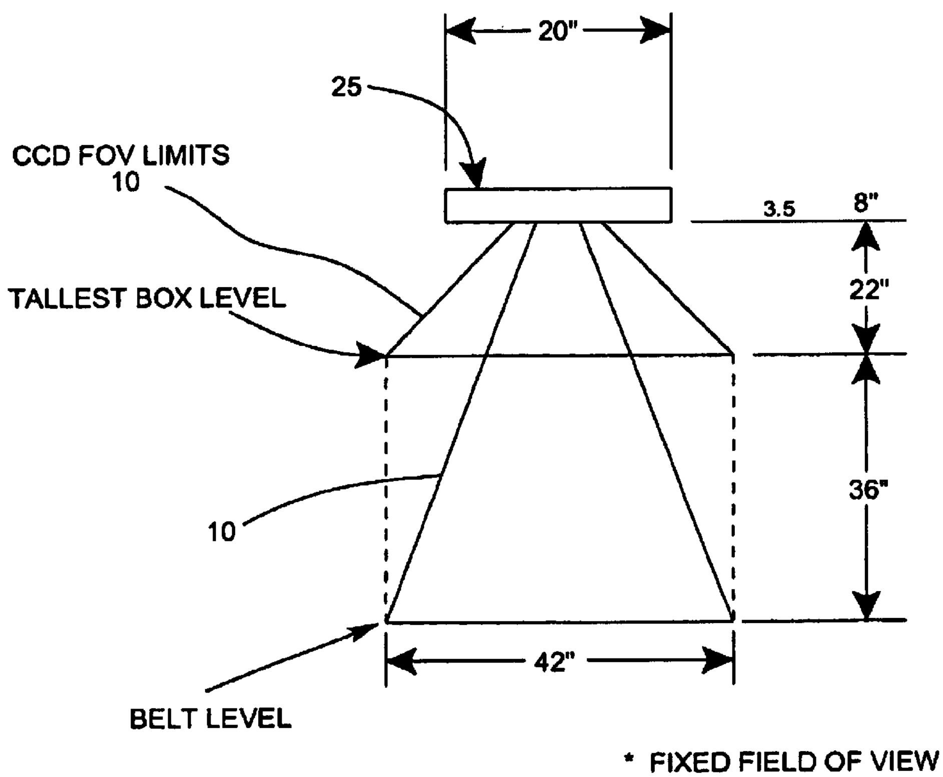
FIG. 1G5

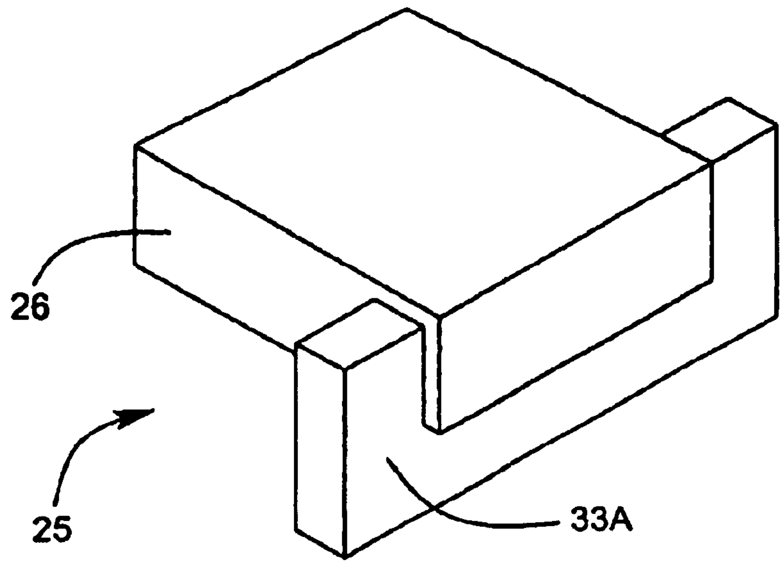
FIG. 1G6
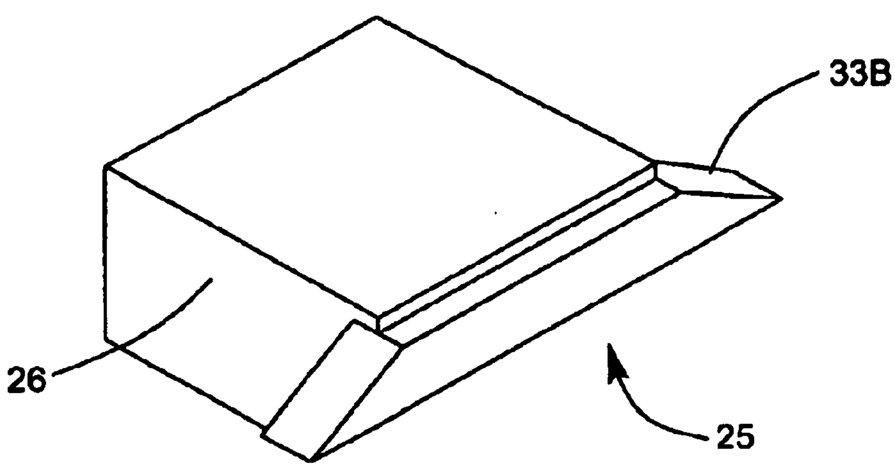
FIG. 1G7

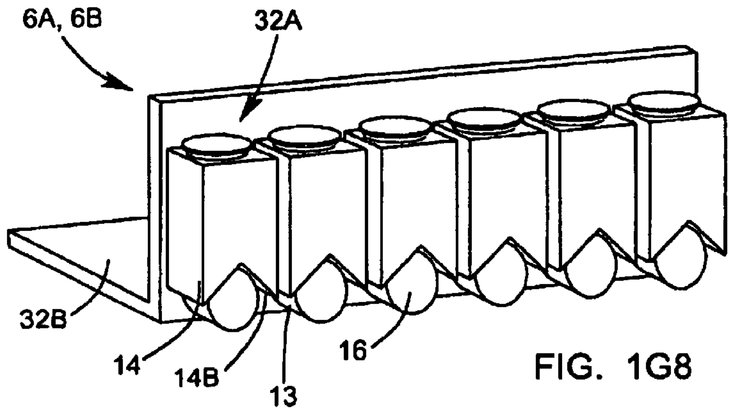
FIG. 1G8
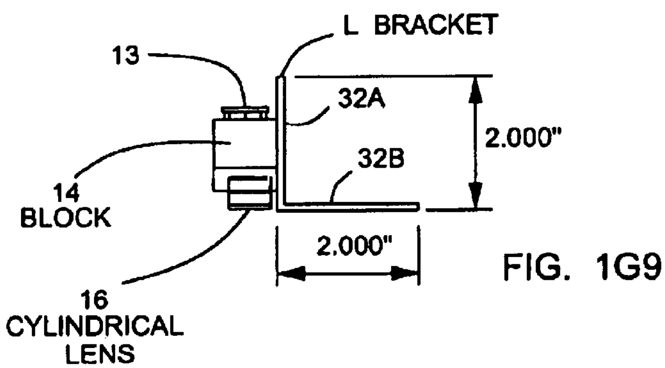
FIG. 1G9
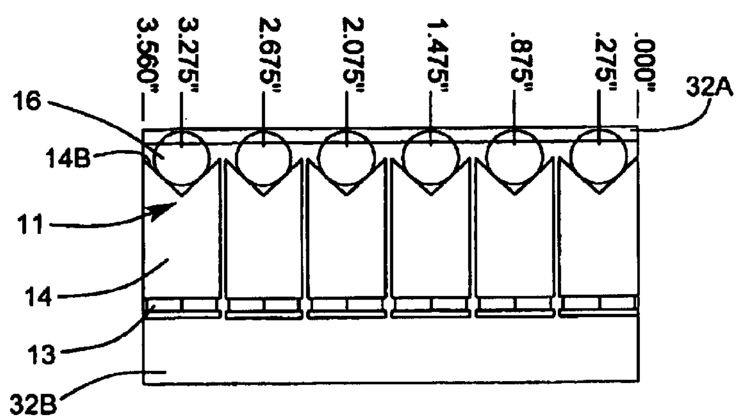
FIG. 1G10

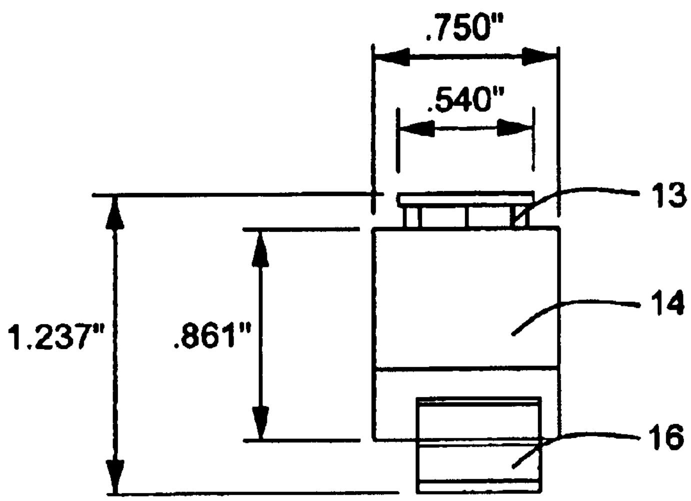
FIG. 1G11
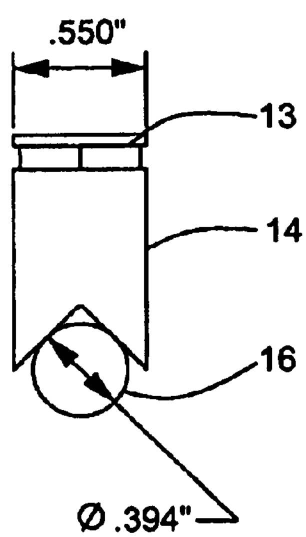
FIG. 1G12

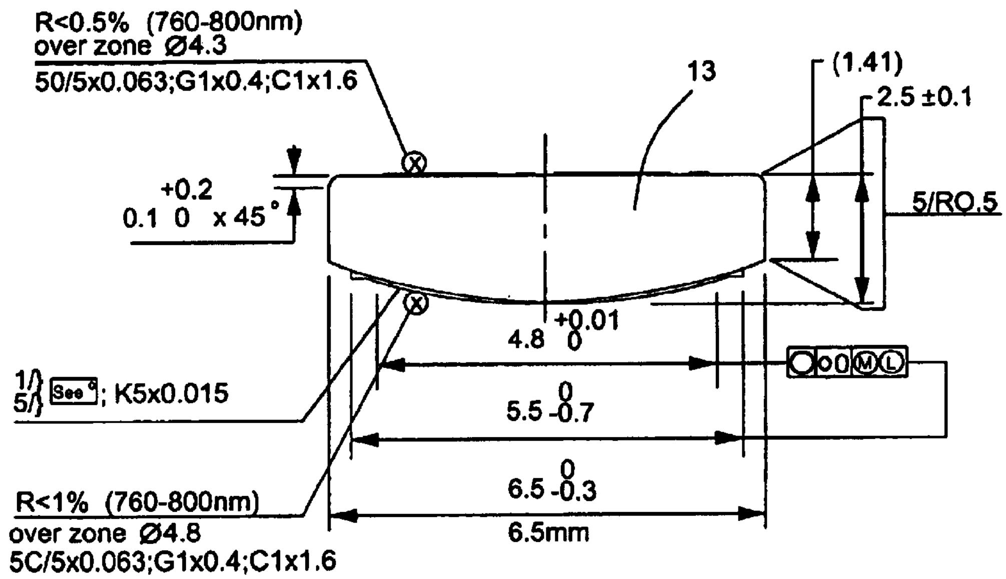
FIG. 1G13
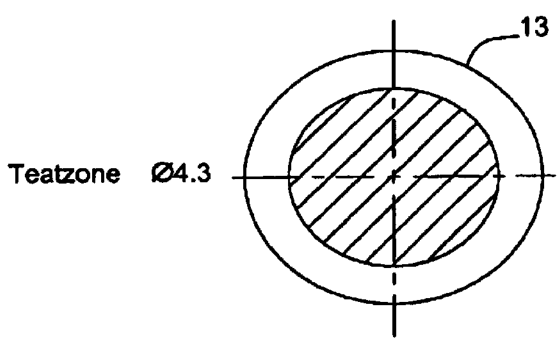
FIG. 1G14

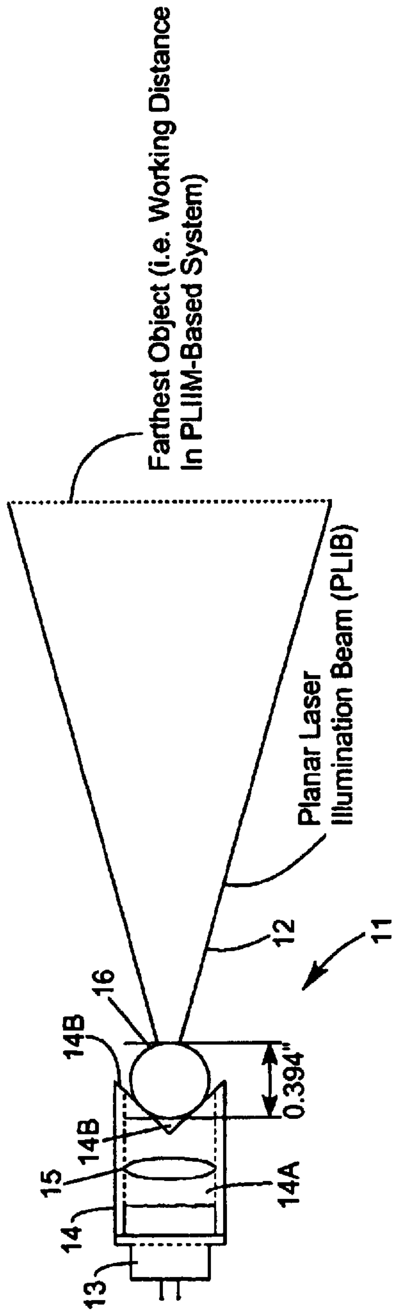
FIG. 1G15A
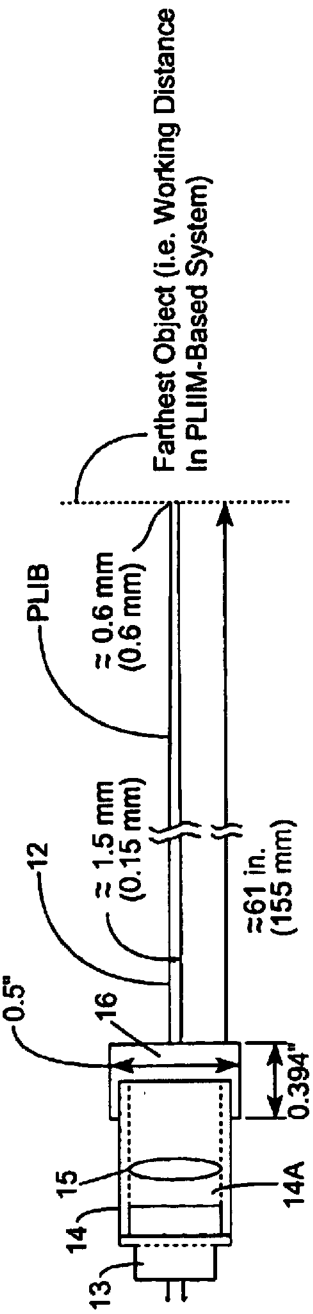
FIG. 1G15B

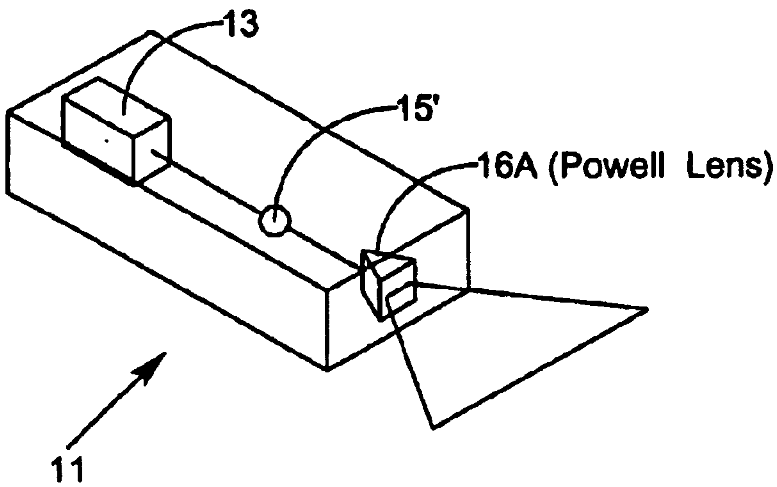
FIG. 1G16A
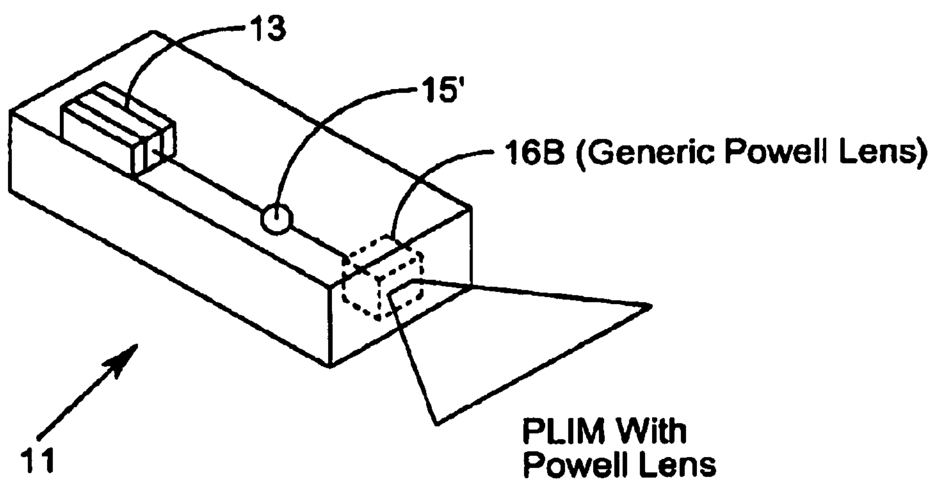
FIG. 1G16B

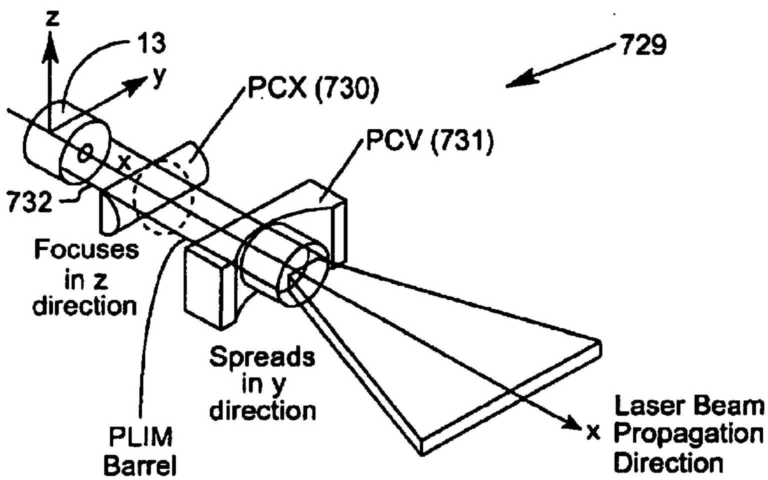
FIG. 1G17A
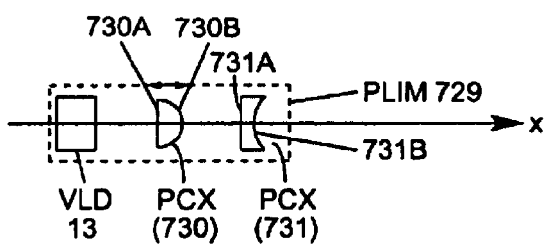
FIG. 1G17B
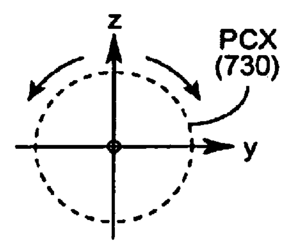
FIG. 1G17C
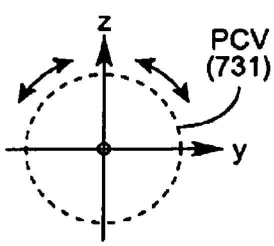
FIG. 1G17D
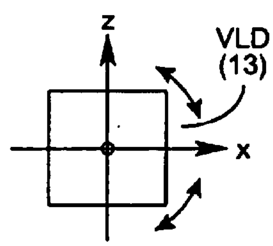
FIG. 1G17E
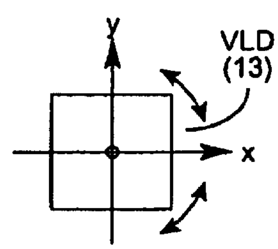
FIG. 1G17F

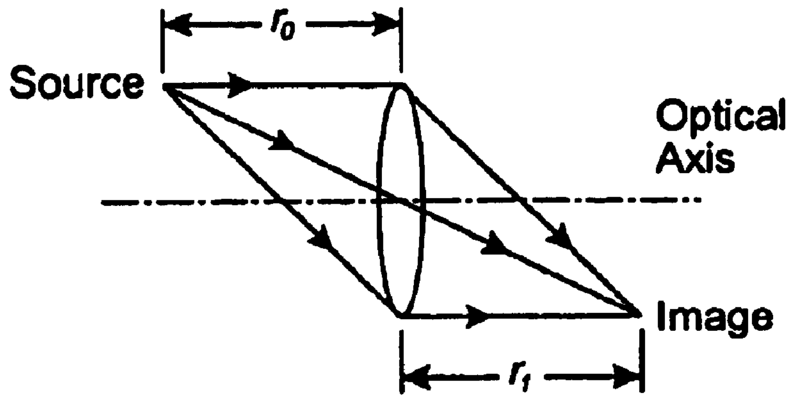
FIG. 1H1
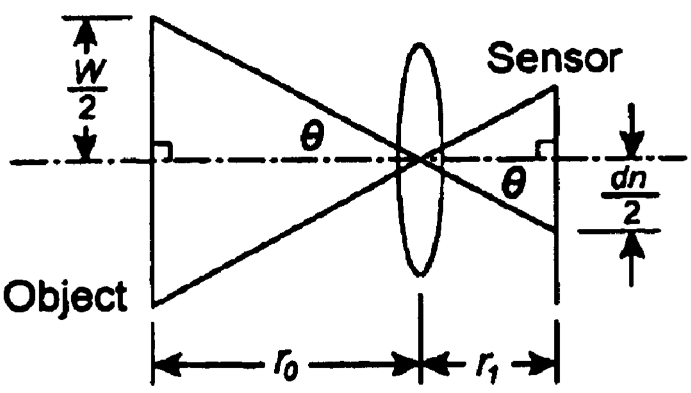
FIG. 1H2

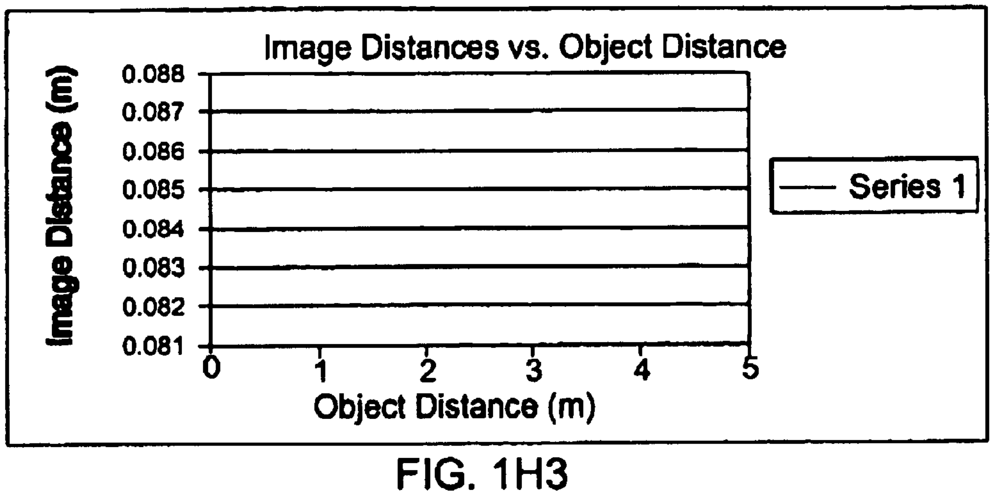
FIG. 1H3
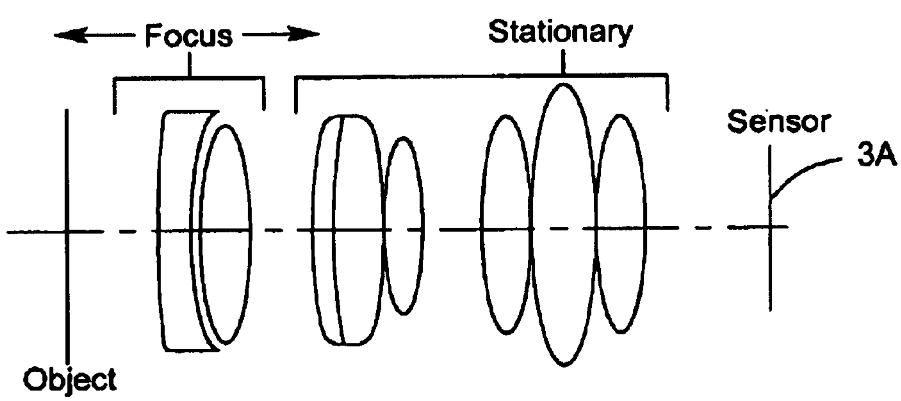
FIG. 1H4
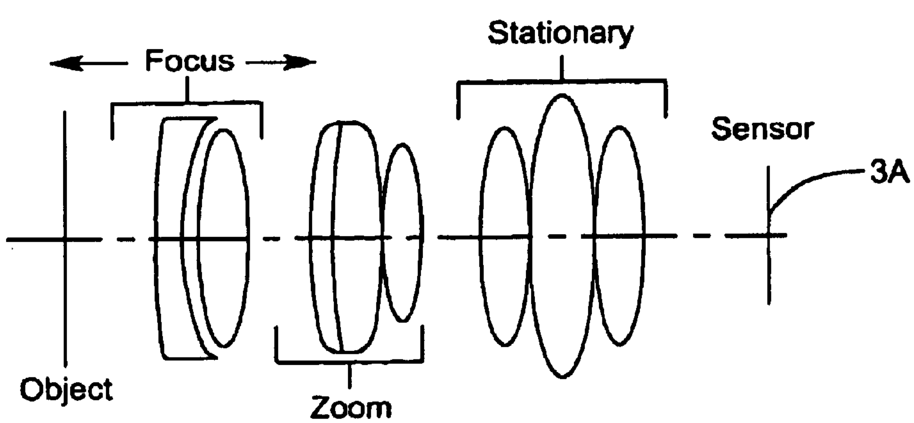
FIG. 1H5

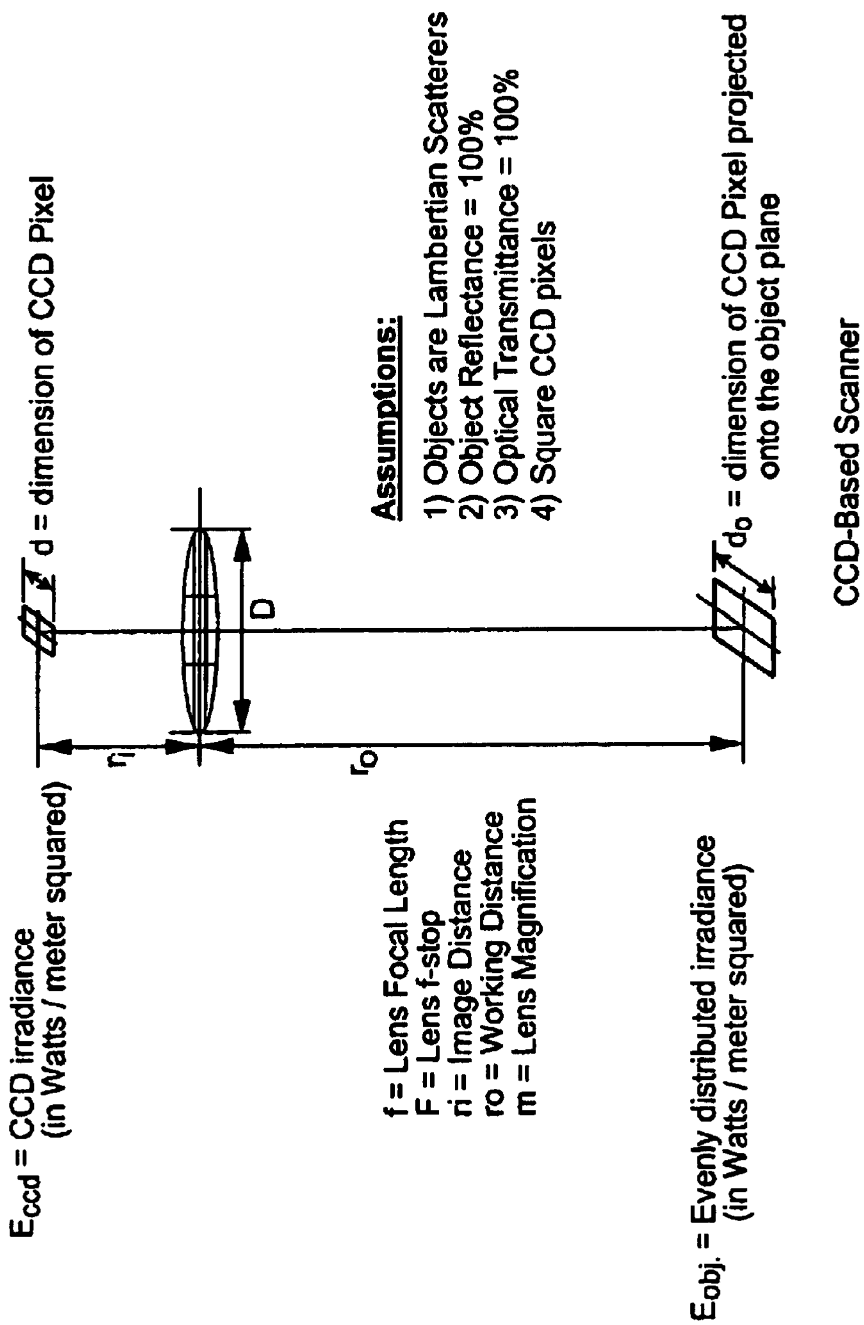
FIG. 1H6

FIRST GENERALIZED METHOD OF REDUCING SPECKLE-NOISE PATTERNS AT IMAGE DETECTION ARRAY OF THE IFD SUBSYSTEM (3)
(SPMF)
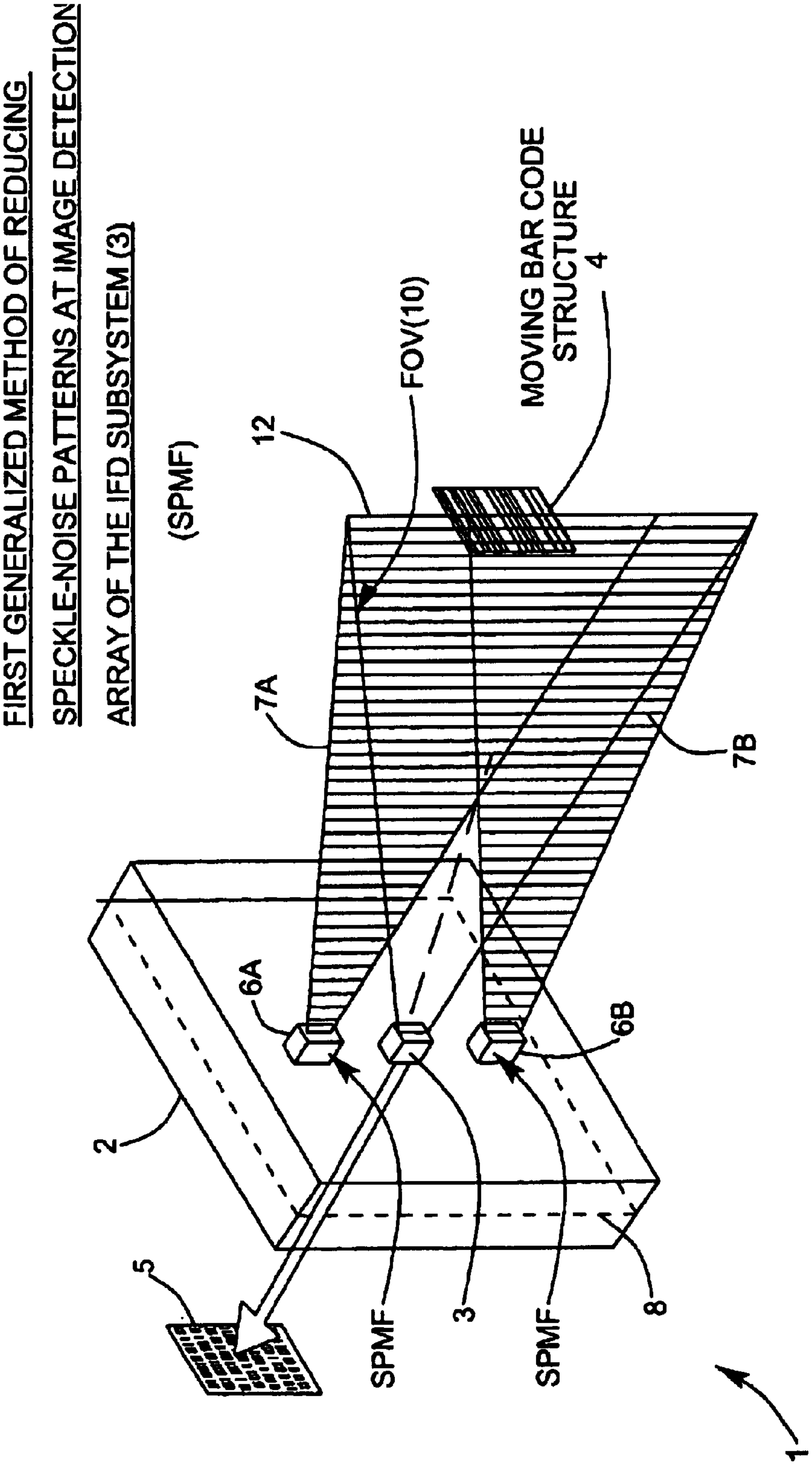
FIG. 1I1

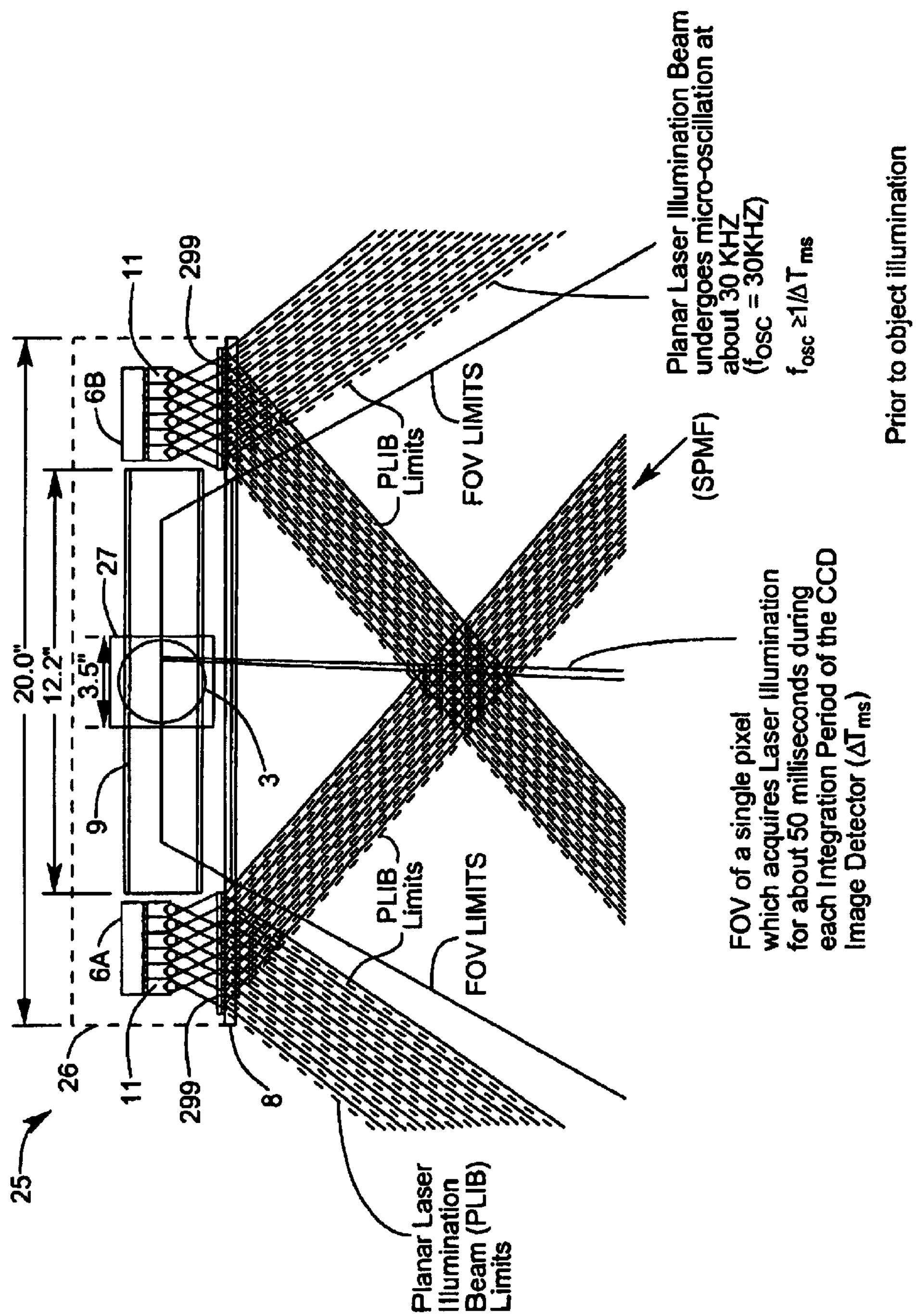
FIG. 1I2A

THE FIRST GENERALIZED SPECKLE-NOISE PATTERN REDUCTION METHOD OF THE PRESENT INVENTION

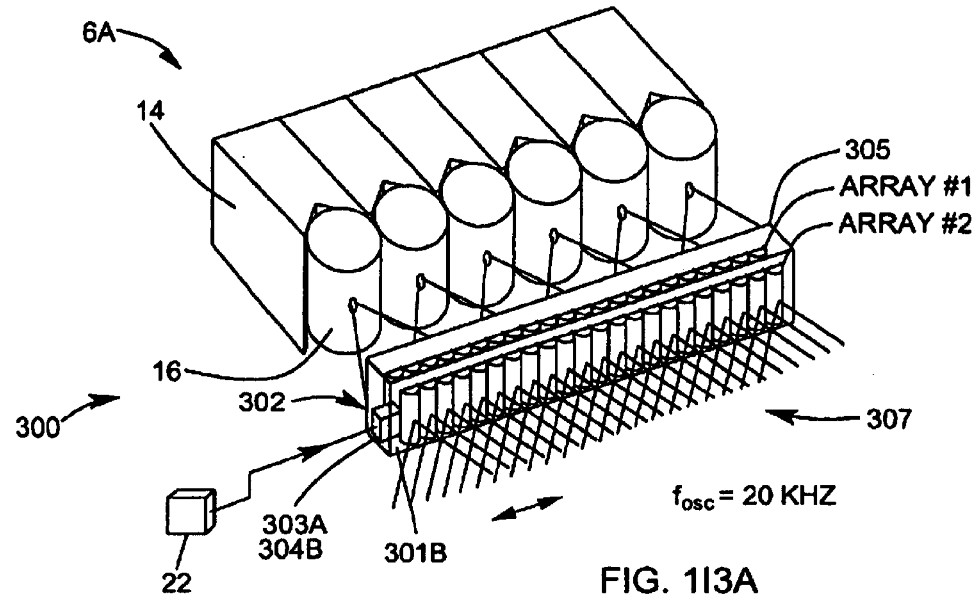
FIG. 1I3A
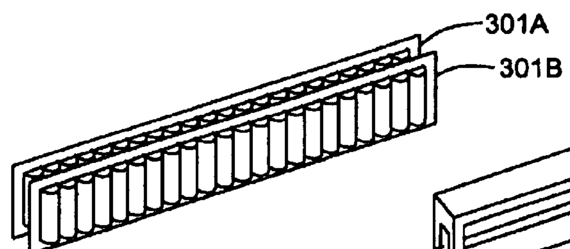
FIG. 1I3B
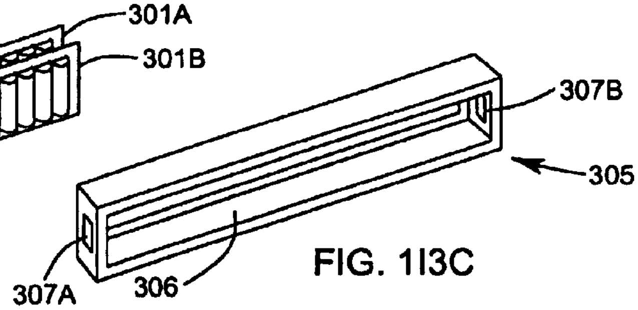
FIG. 1I3C
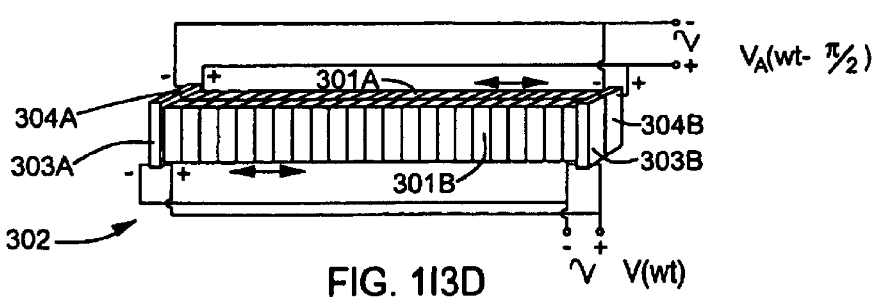
FIG. 1I3D

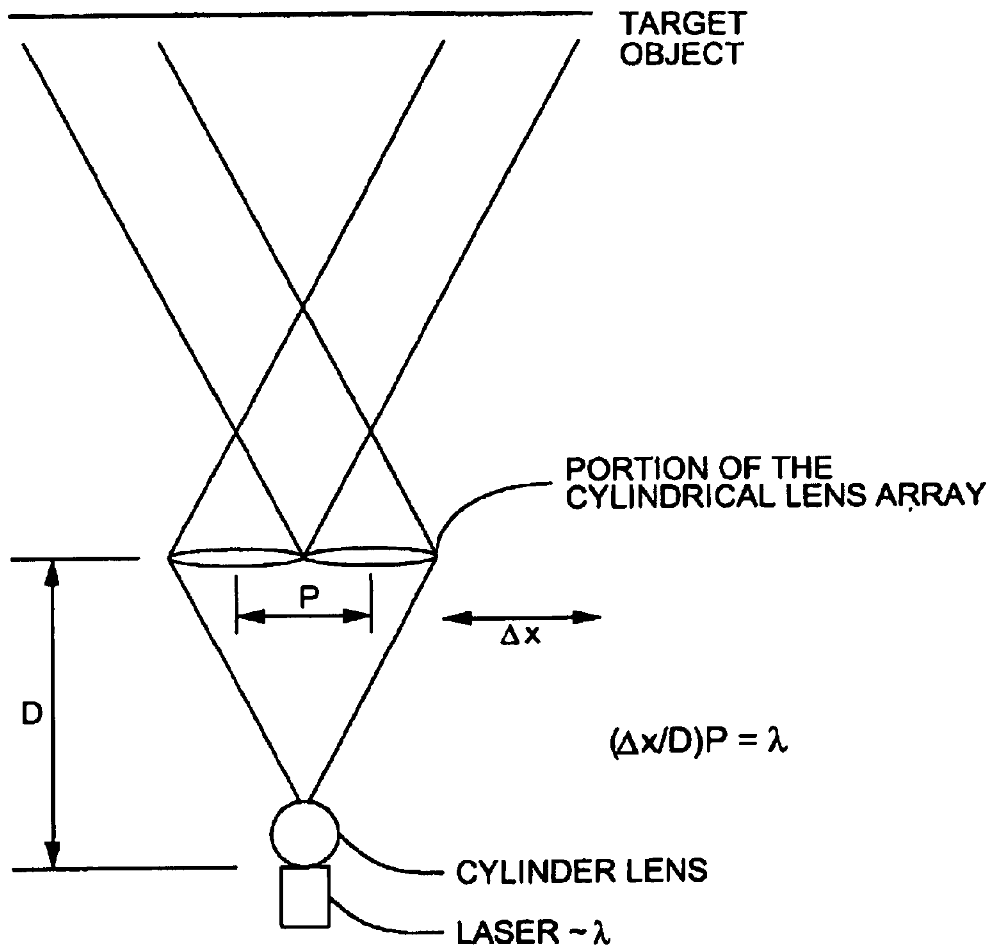
$$\Delta x \geq \frac{\lambda}{P} \cdot D$$
FIG. 1I3E

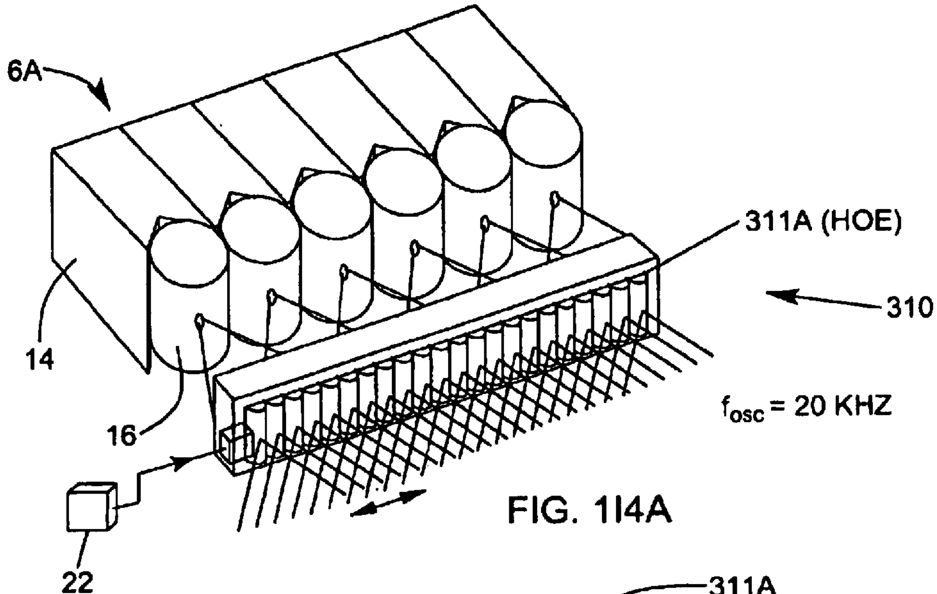
FIG. 1I4A
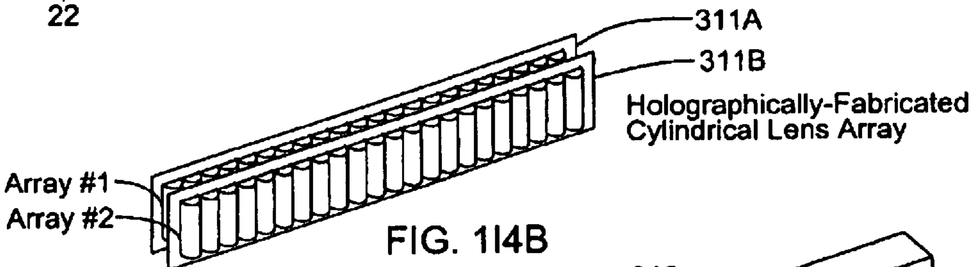
FIG. 1I4B
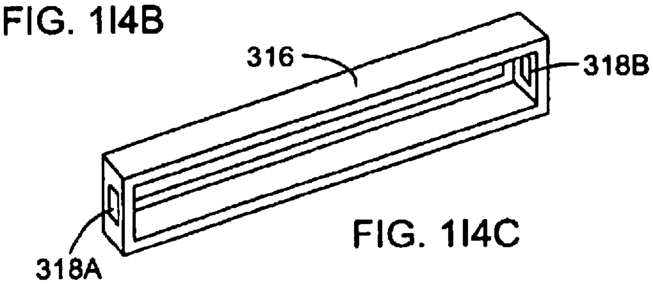
FIG. 1I4C
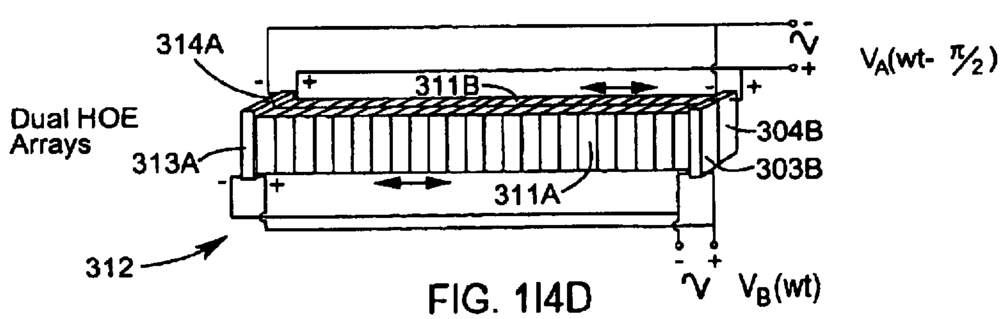
FIG. 1I4D

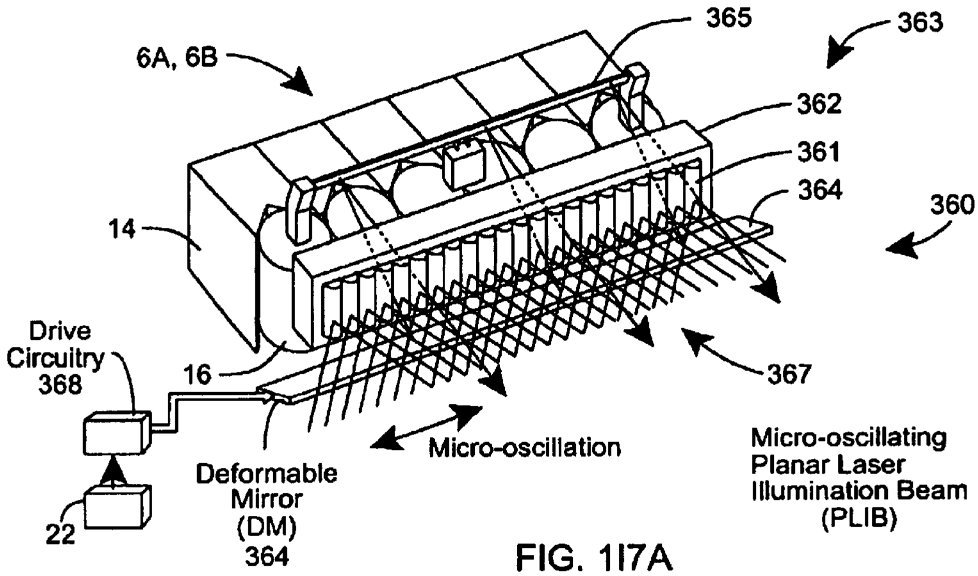
FIG. 1I7A
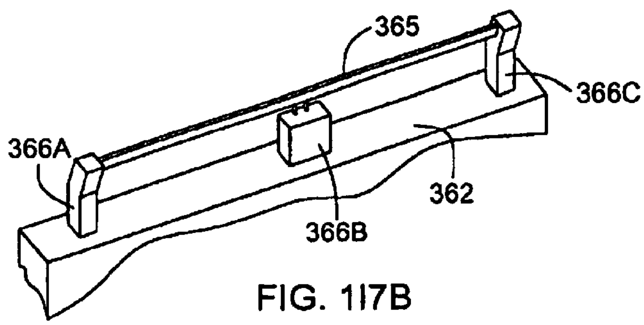
FIG. 1I7B
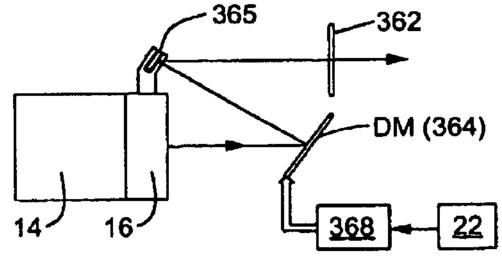
FIG. 1I7C

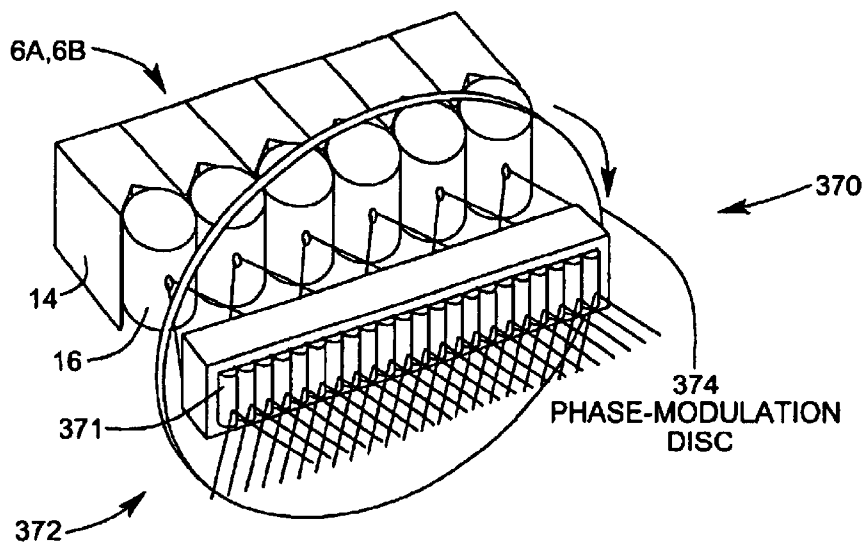
FIG. 1I8A
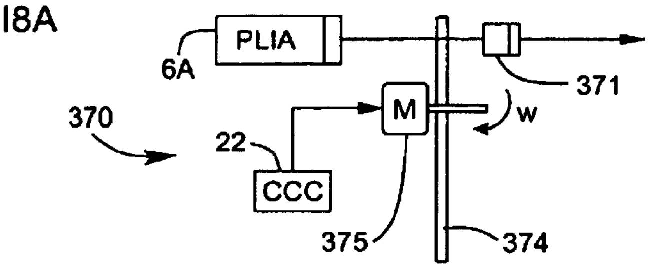
FIG. 1I8B
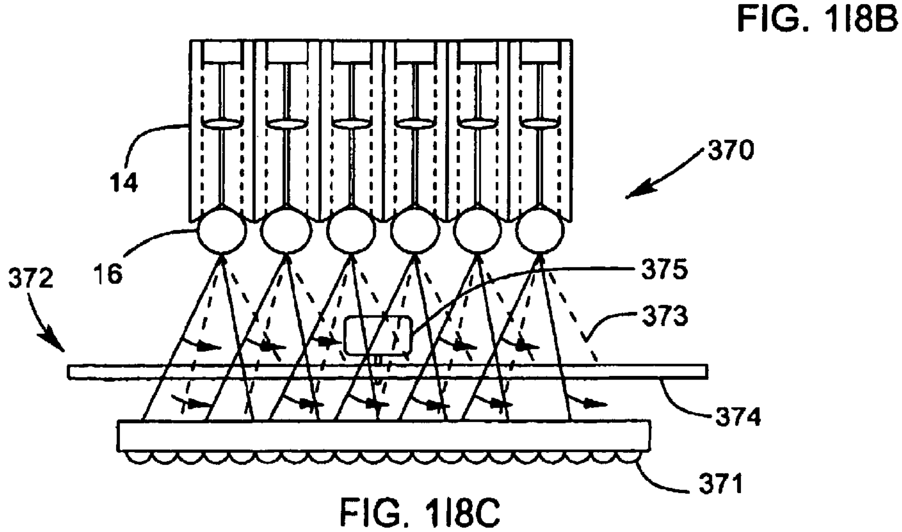
FIG. 1I8C

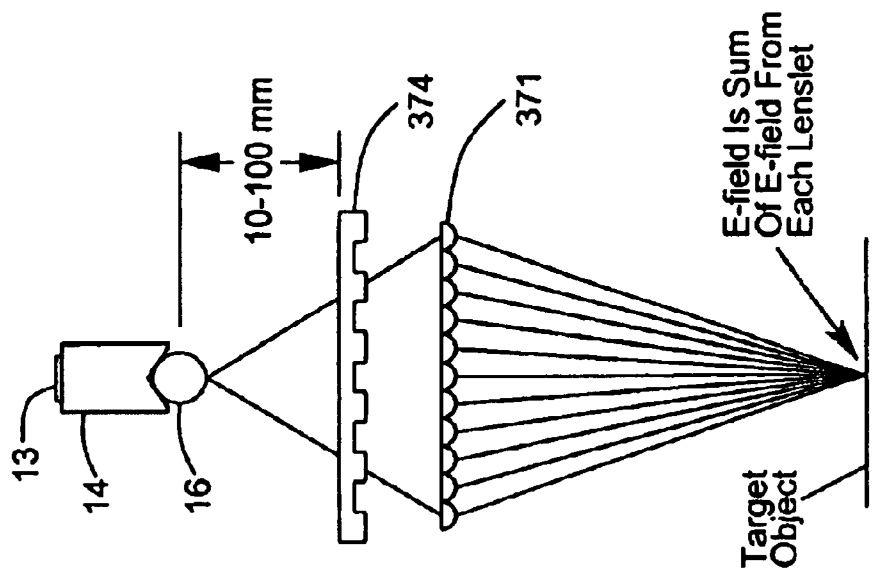
FIG. 1I8E
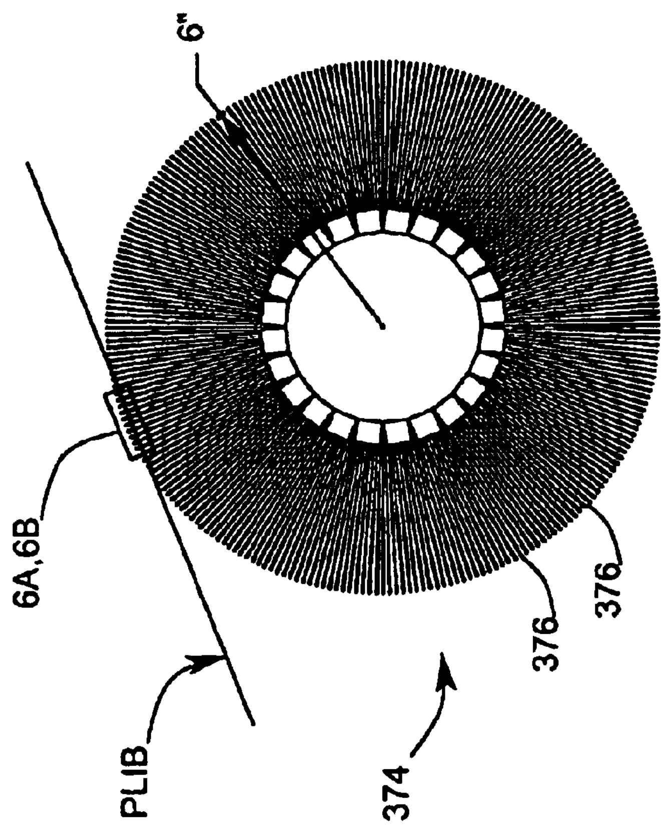
FIG. 1I8D

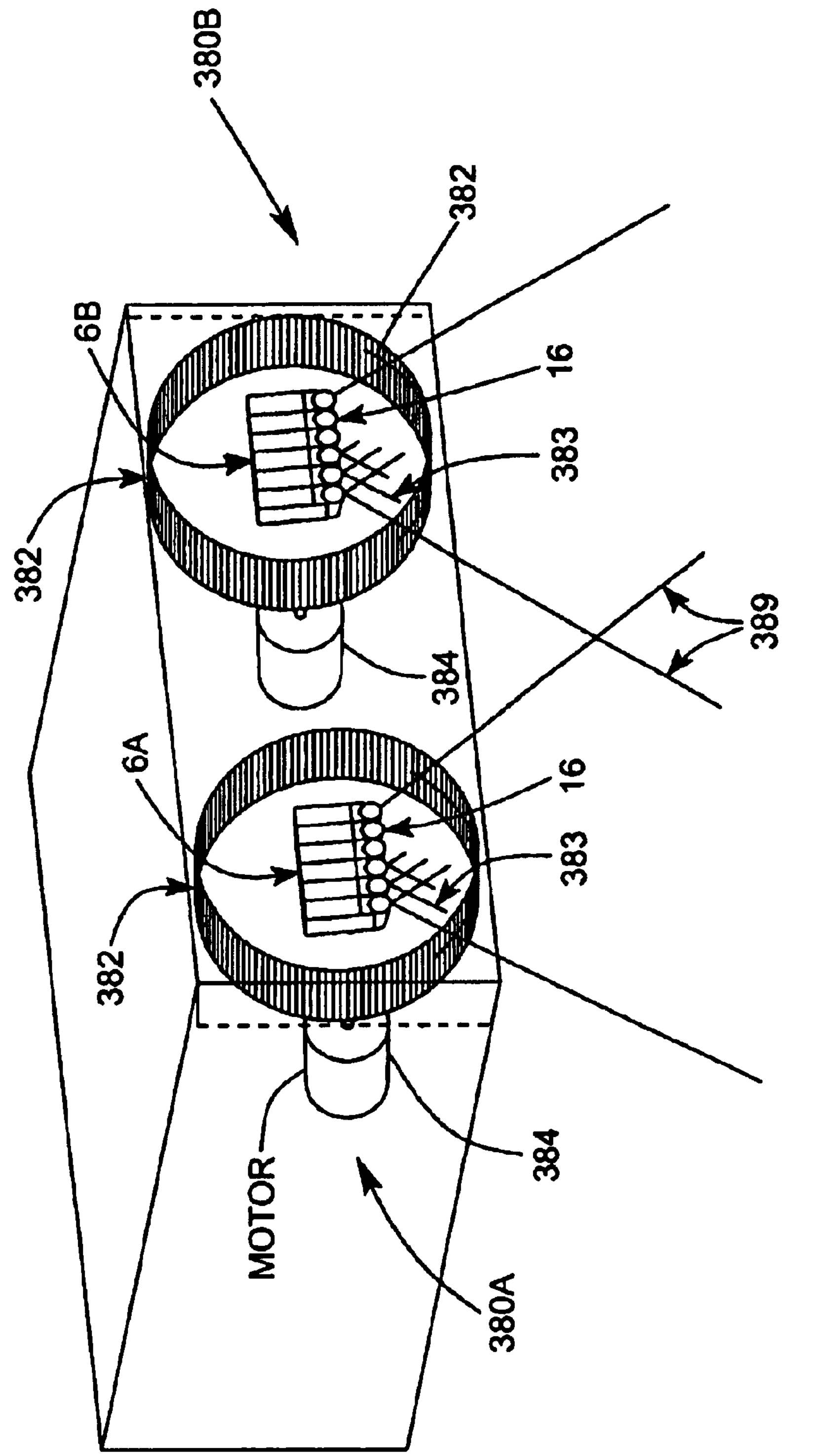
FIG. 1I9A

Optical Specifications:

- 30 Cylindrical Lens (Lines) Per Linear Inch
- Focal Length ≈ 20 Millimeters
- Diameter Of Lenticular Carousel ≈ 4 Inches
- Acrylic Material

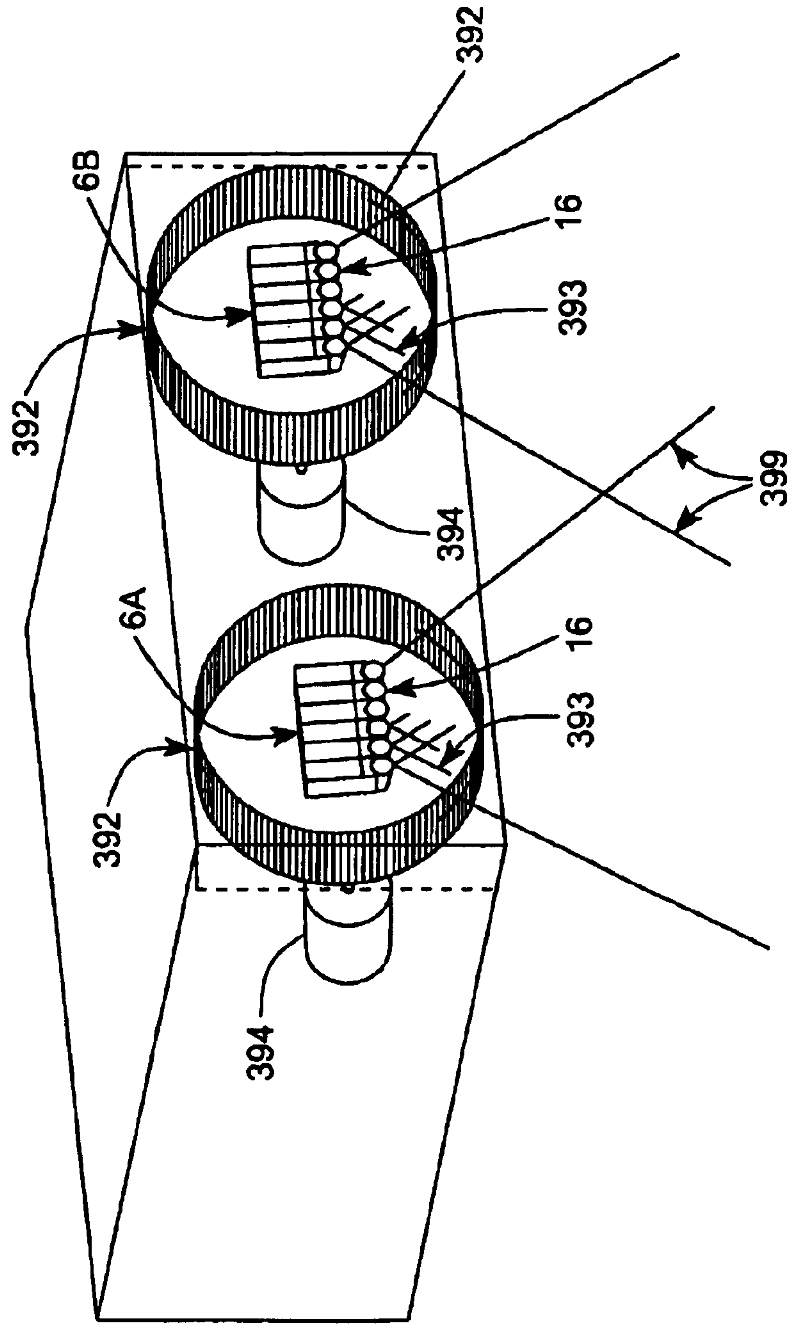
FIG. 1I10A

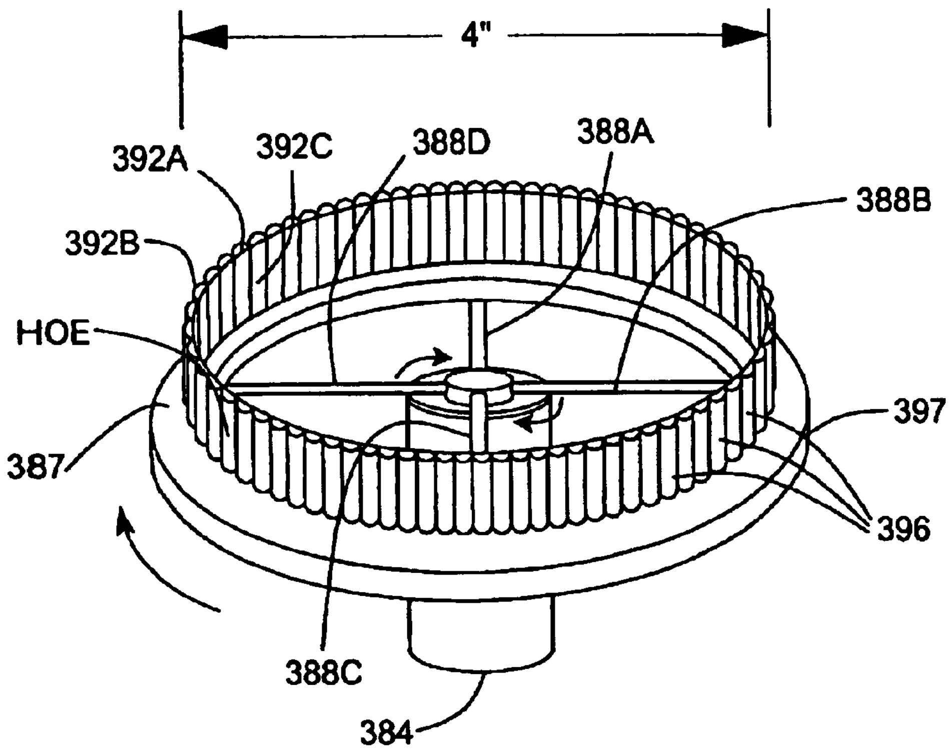
Optical Specifications:
- 30 Cylindrical Lens (Lines) Per Linear Inch
- Focal Length ≈ 20 Millimeters
- Diameter Of Lenticular Carousel ≈ 4 Inches
FIG. 1I10B

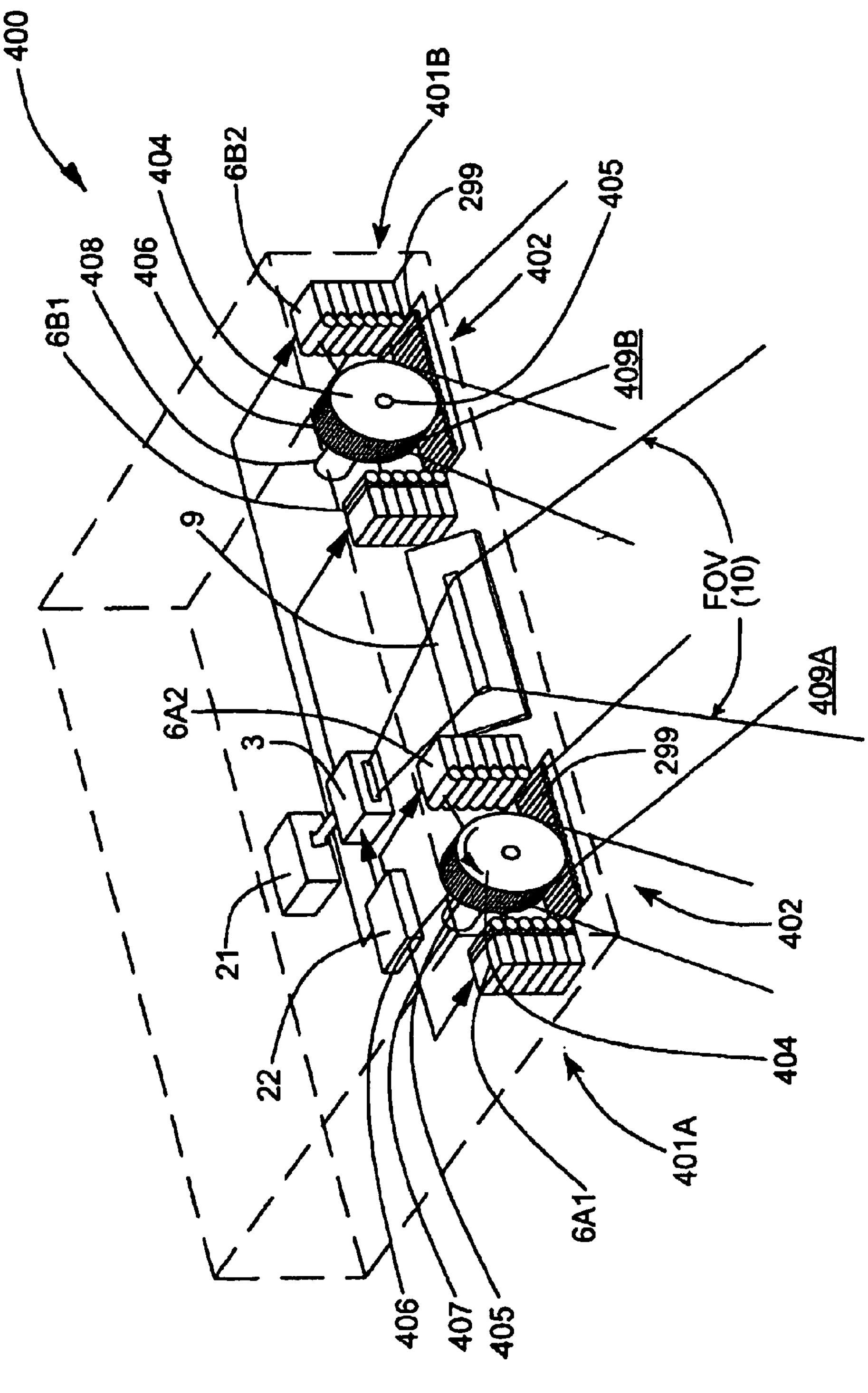
FIG. 1I11A

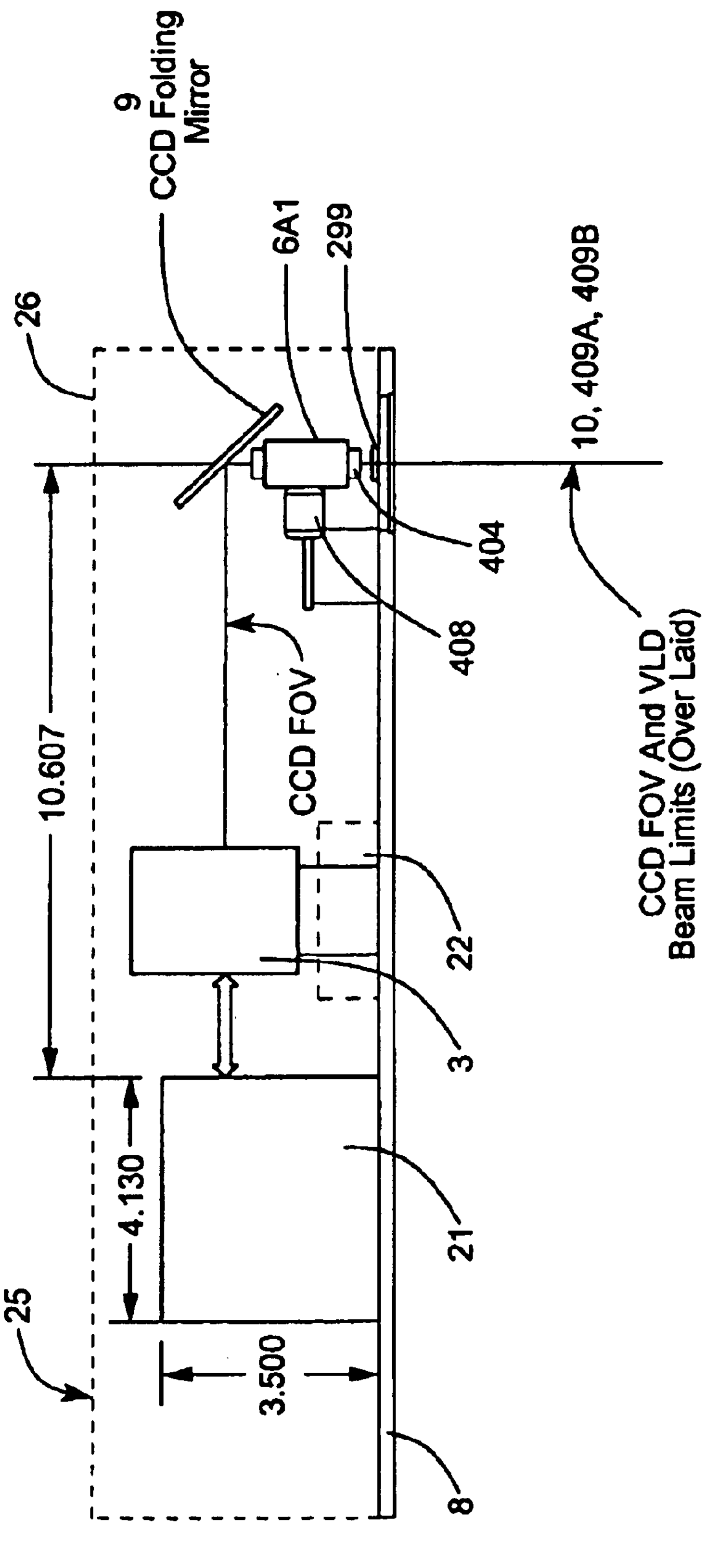
FIG. 1I11B

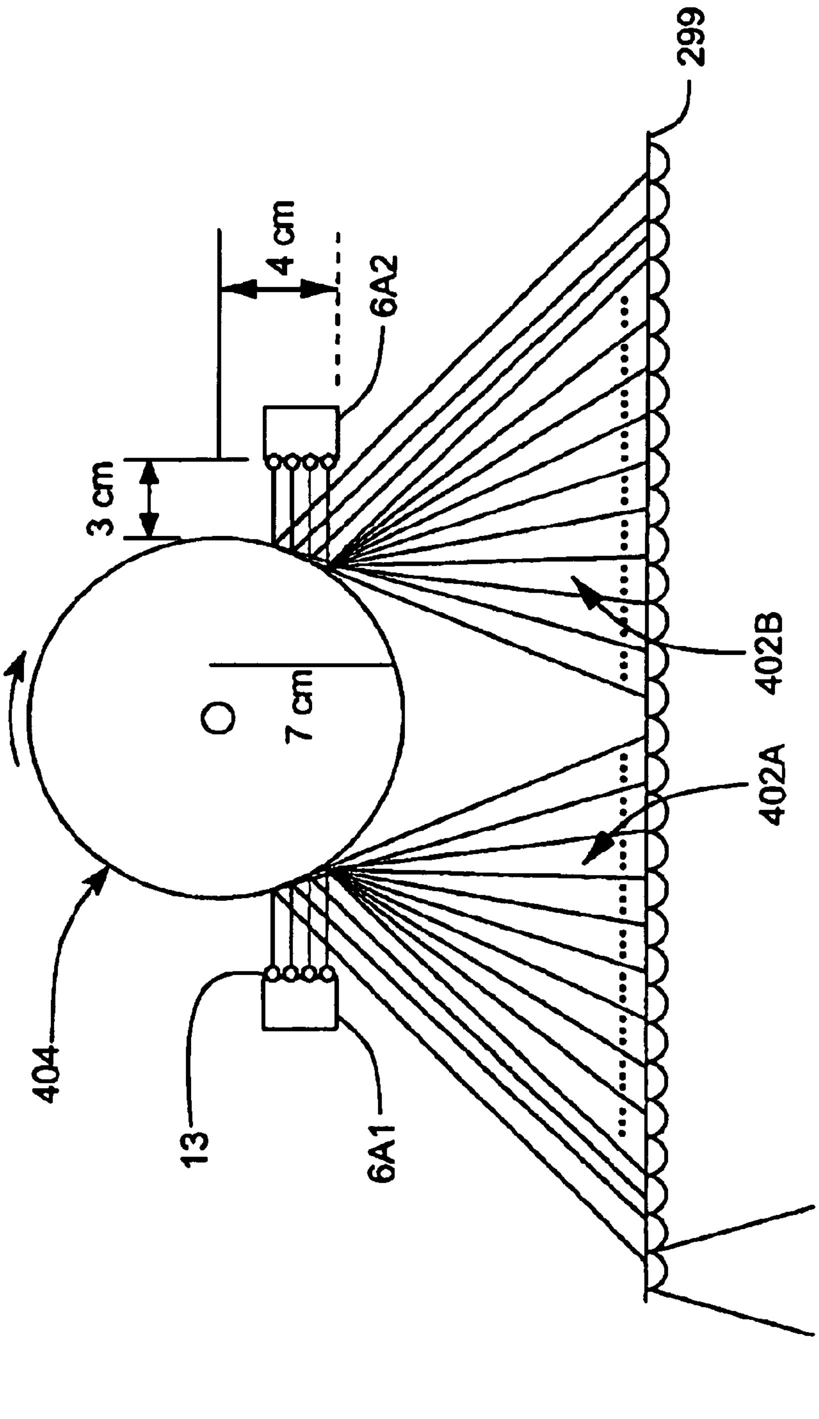
FIG. 1I11C

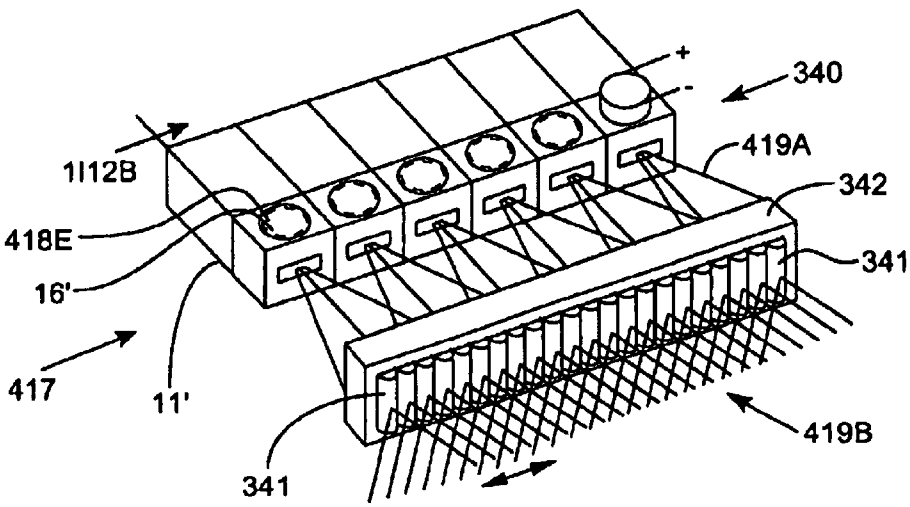
FIG. 1I12A
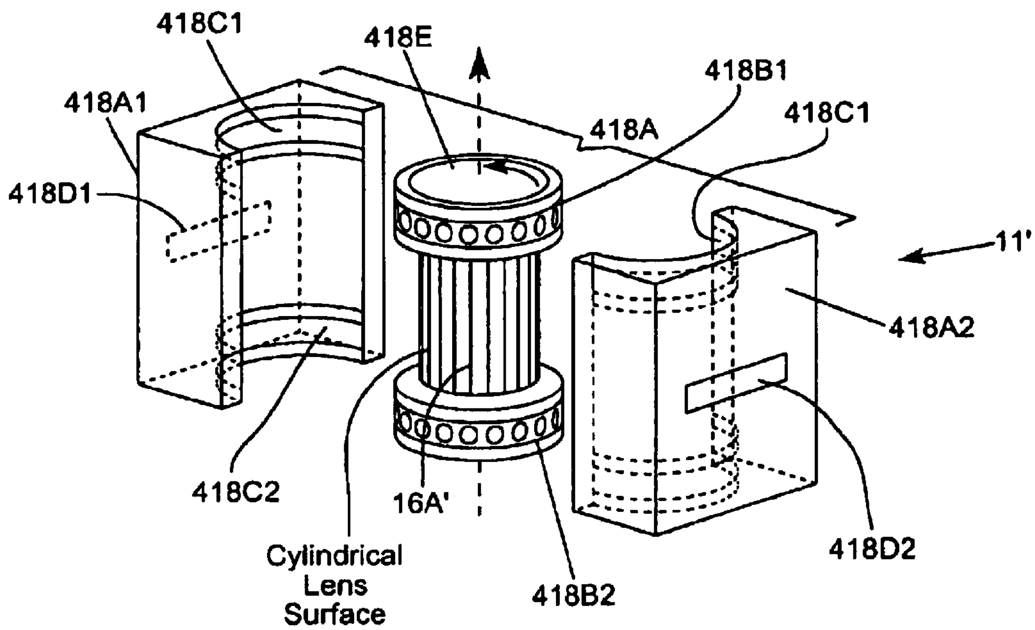
FIG. 1I12B

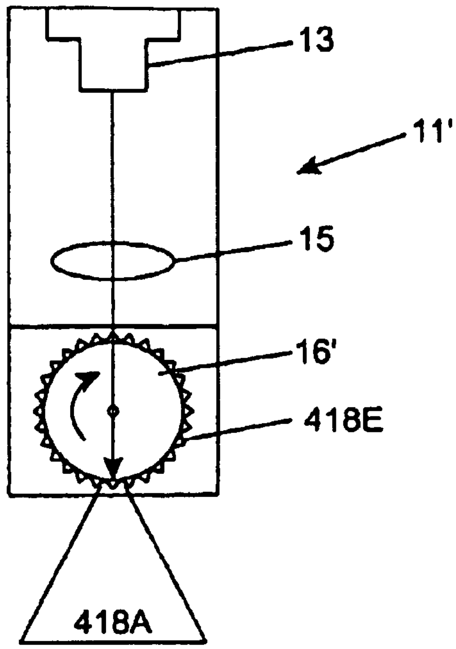
FIG. 1I12C
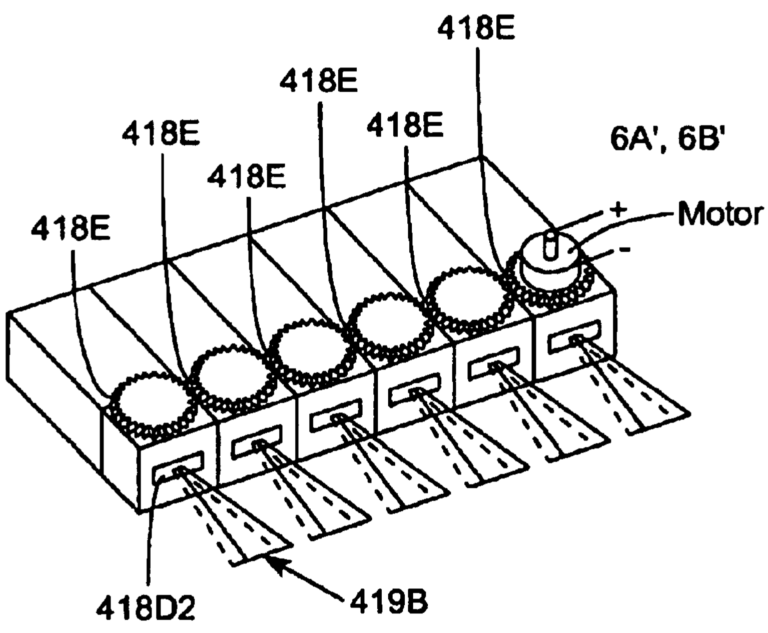
FIG. 1I12D

Second Generalized Method Of
Reducing Speckle-Noise Patterns
At Image Detection Array
Of The IFD Subsystem (3)
(TIMF)
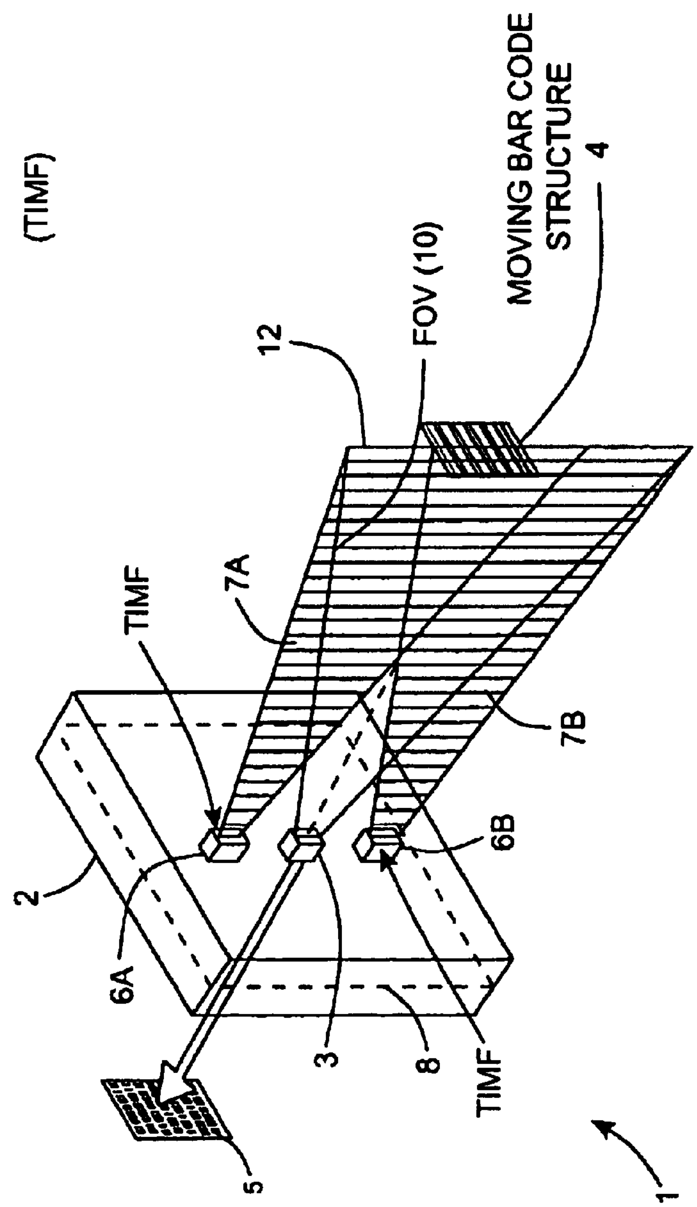
FIG. 1I13

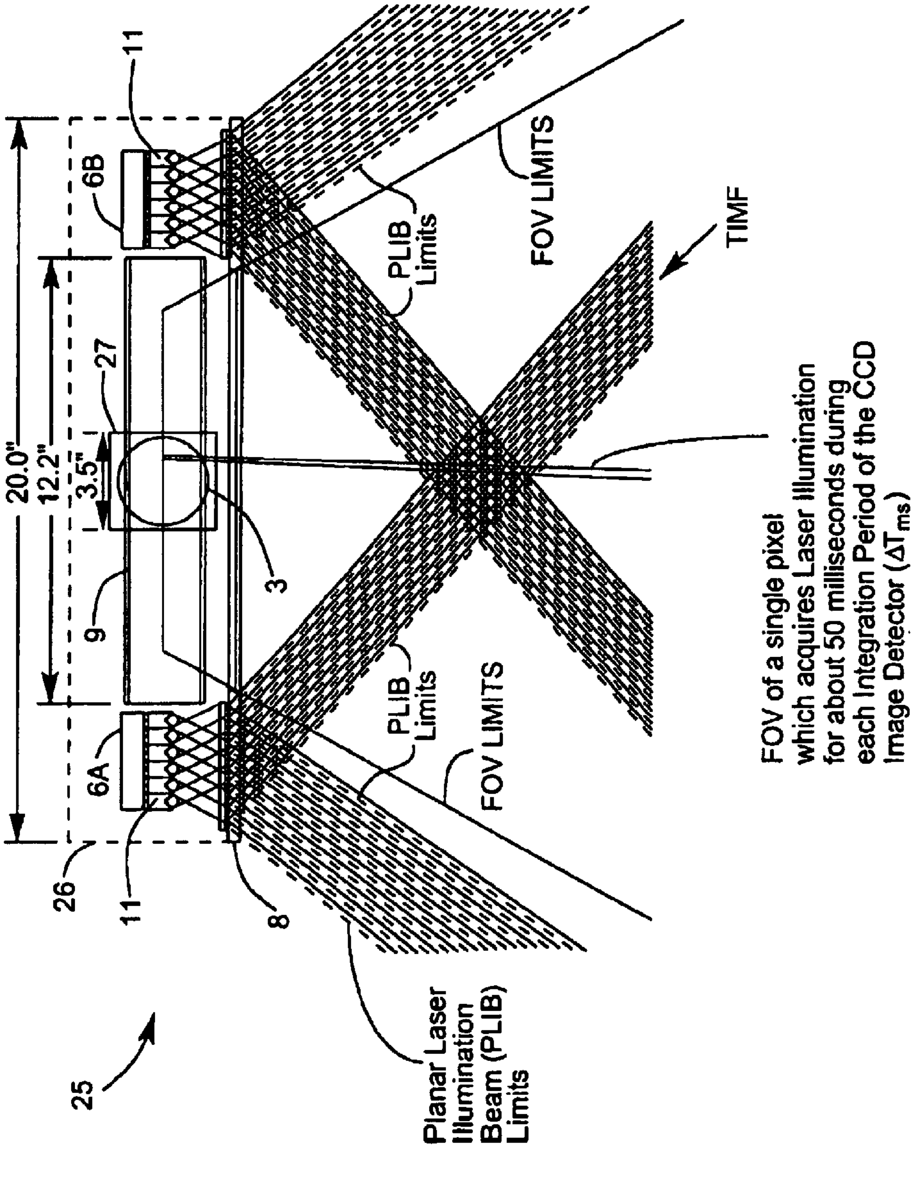
FIG. 1I13A

THE SECOND GENERALIZED SPECKLE-NOISE PATTERN REDUCTION METHOD OF THE PRESENT INVENTION
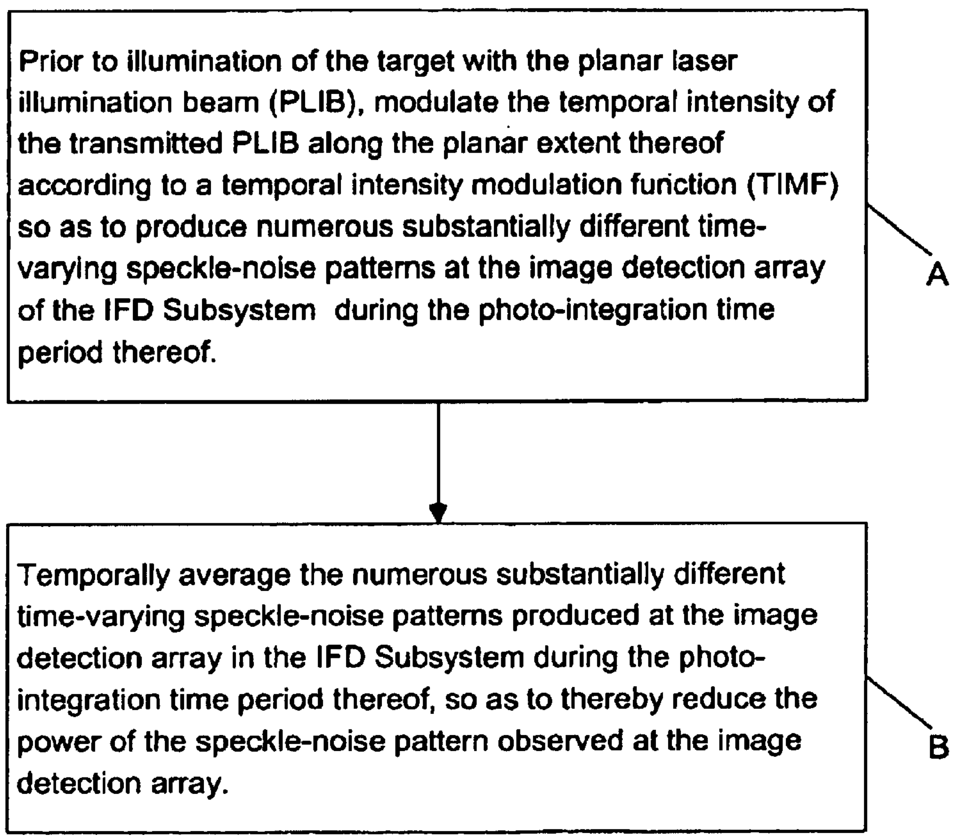
FIG. 1I13B

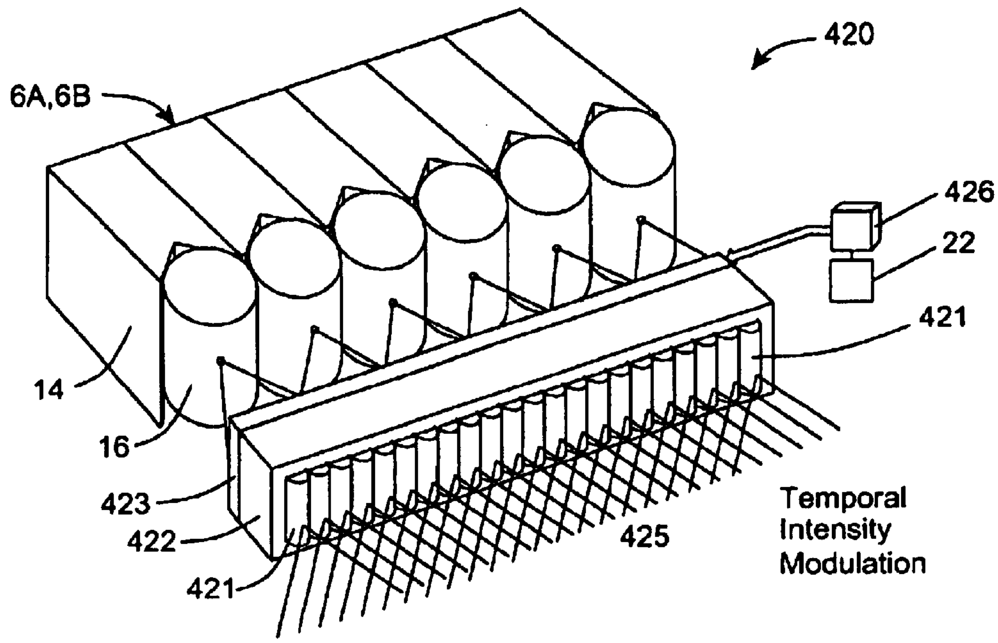
FIG. 1I14A
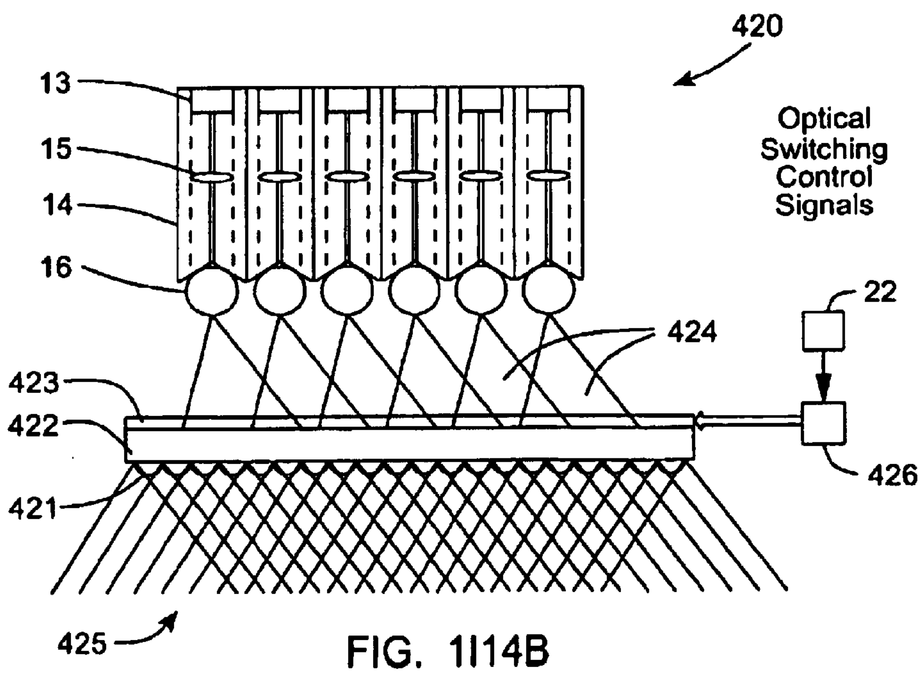
FIG. 1I14B

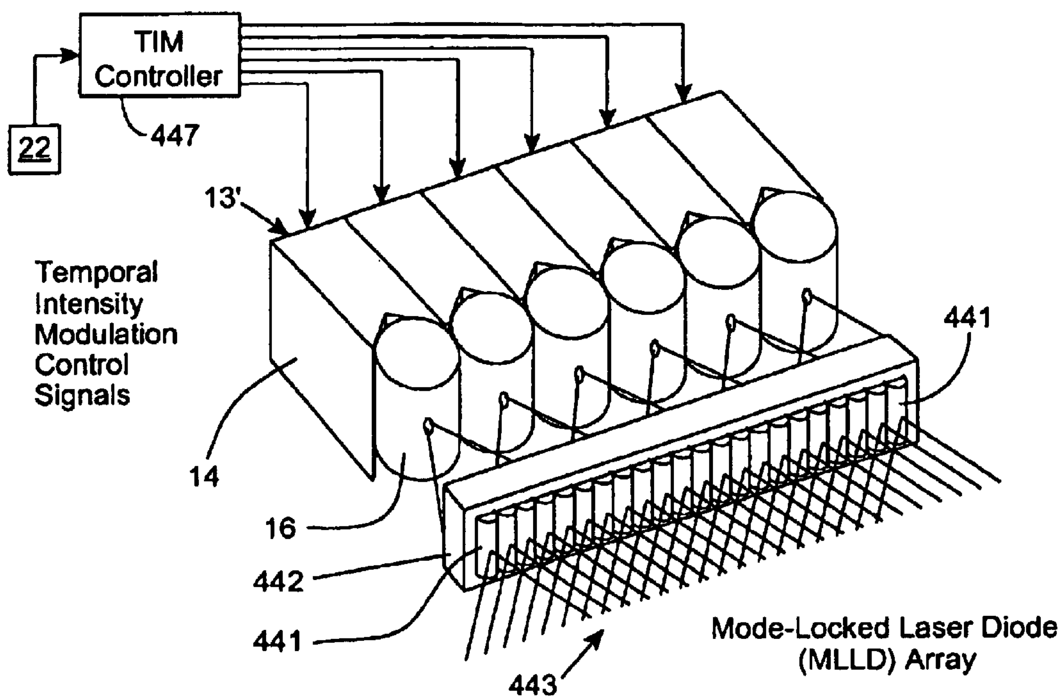
FIG. 1I15A
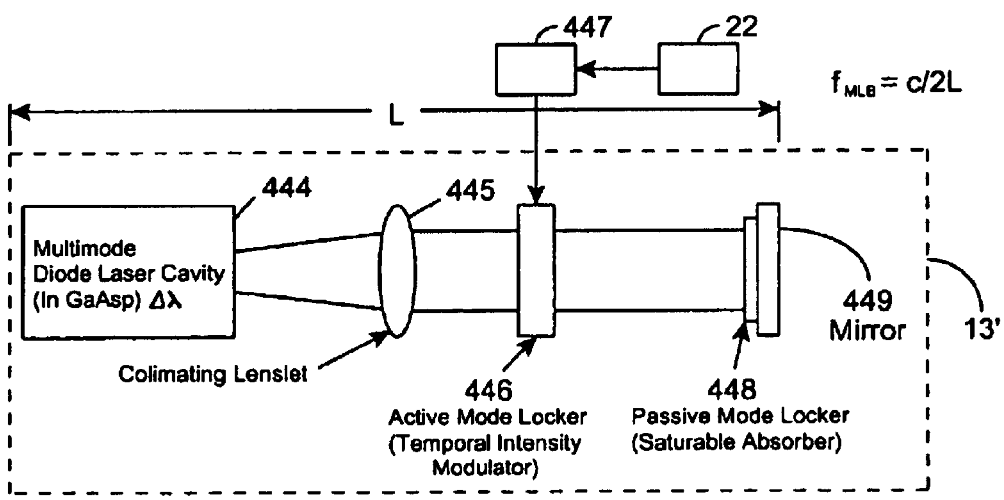
FIG. 1I15B

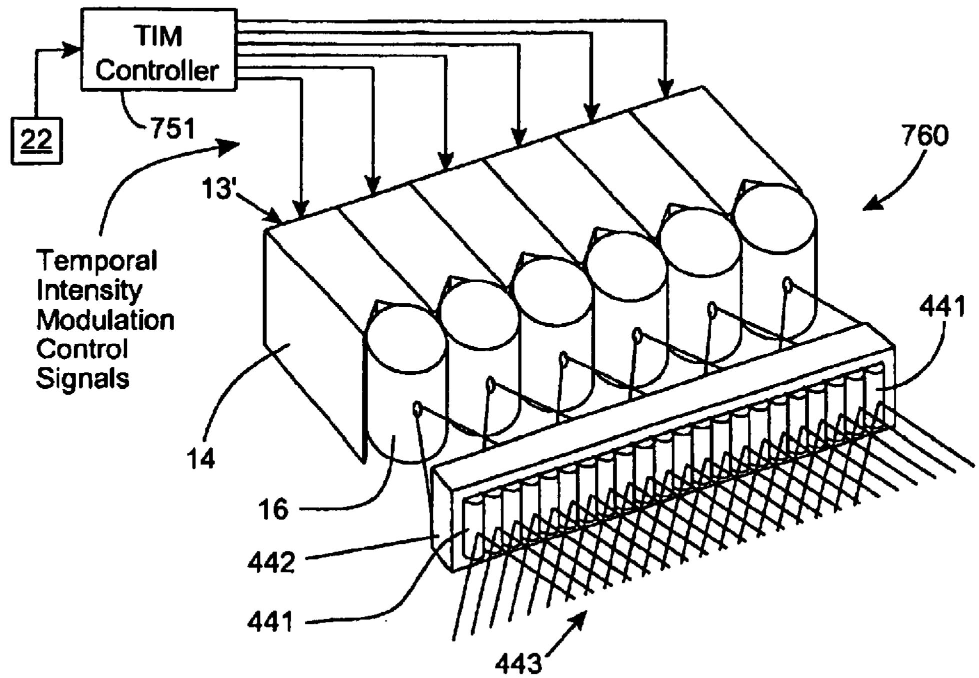
FIG. 1I15C
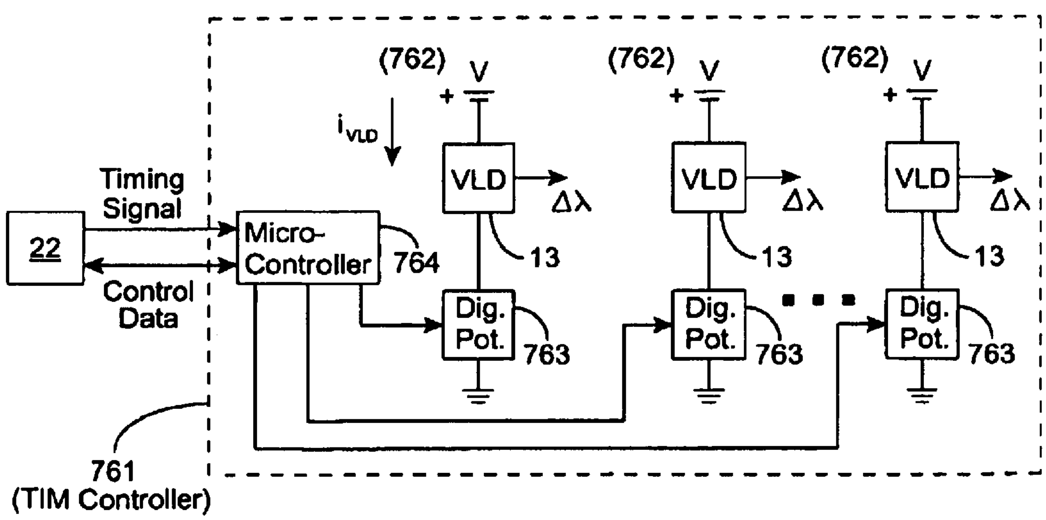
FIG. 1I15D

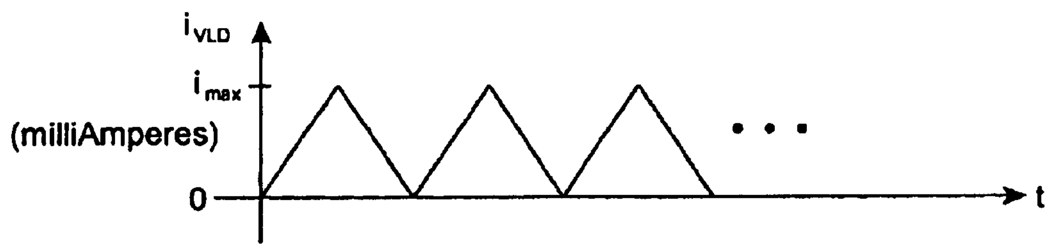
FIG. 1I15E
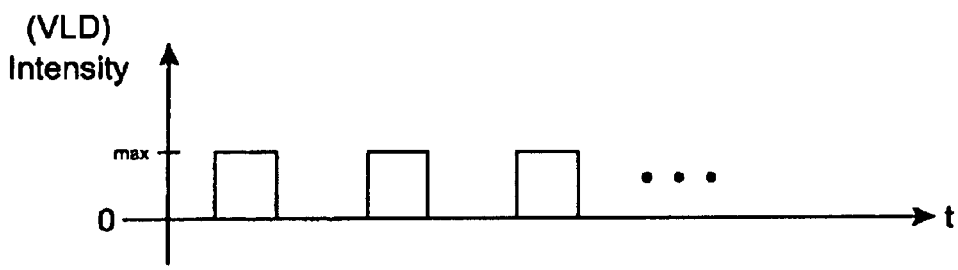
FIG. 1I15F

Third Generalized Method Of Reducing Speckle-Noise Patterns At Image Detection Array Of The IFD Subsystem (3)
(TIMF)
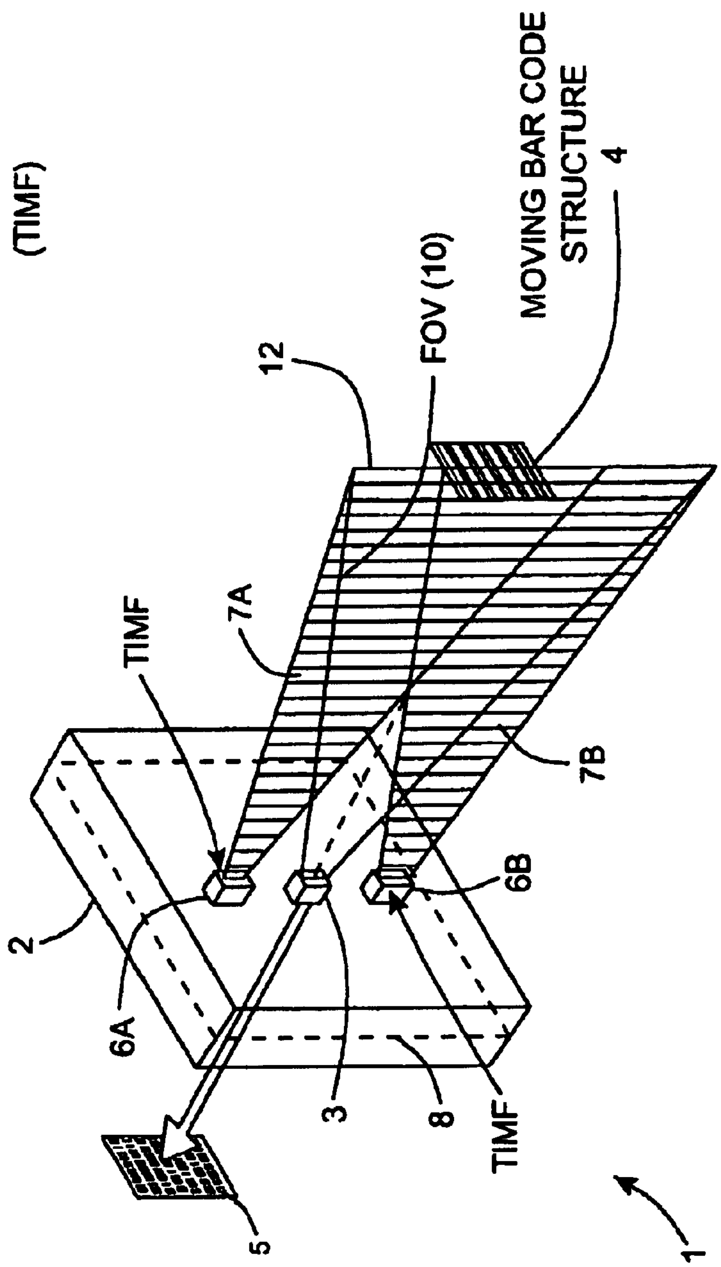
FIG. 1I16

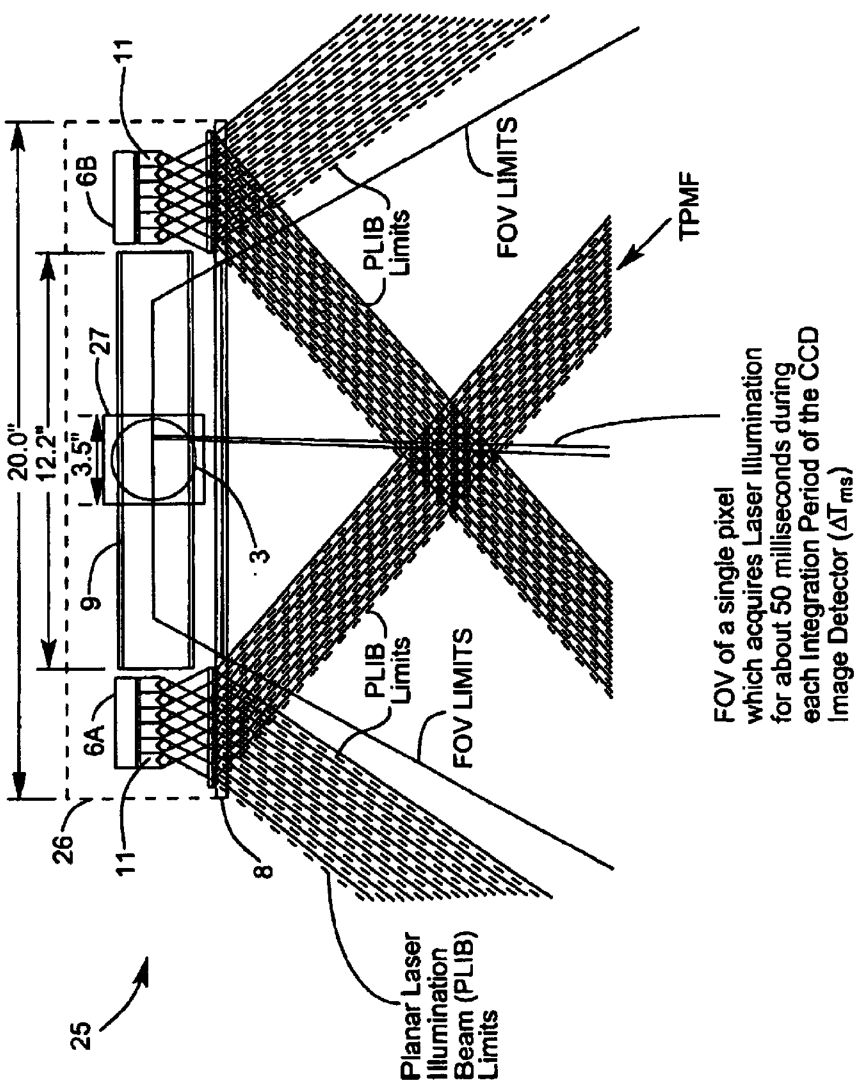
FIG. 1I16A

THE THIRD GENERALIZED SPECKLE-NOISE PATTERN REDUCTION METHOD OF THE PRESENT INVENTION
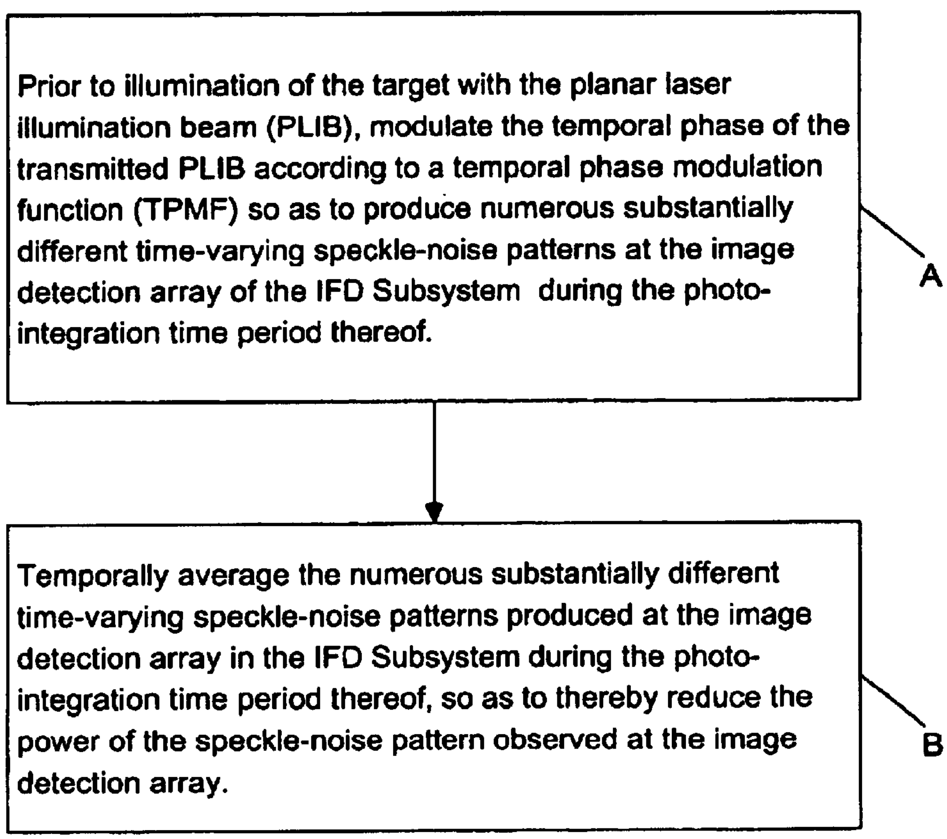
FIG. 1I16B

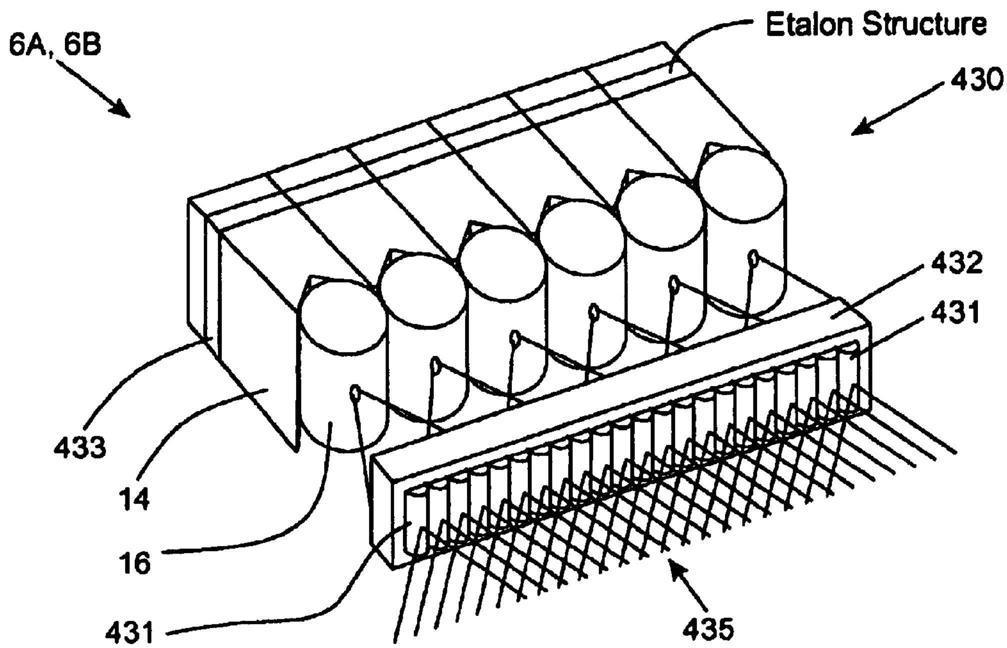
FIG. 1I17A
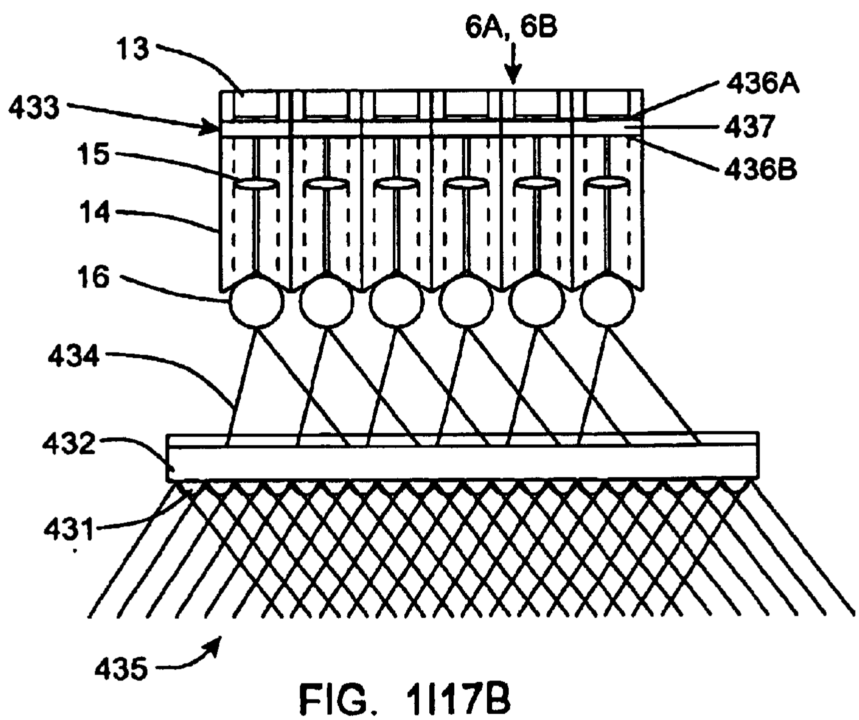
FIG. 1I17B

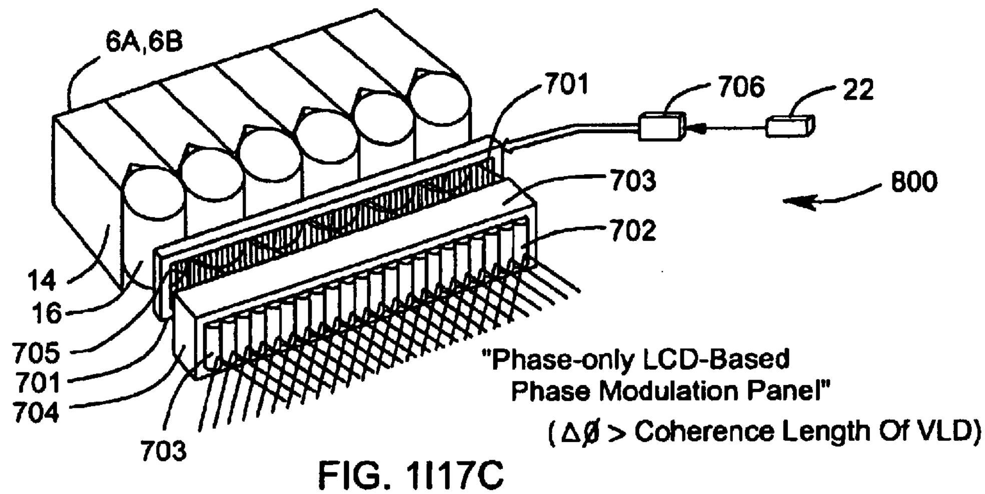
FIG. 1I17C
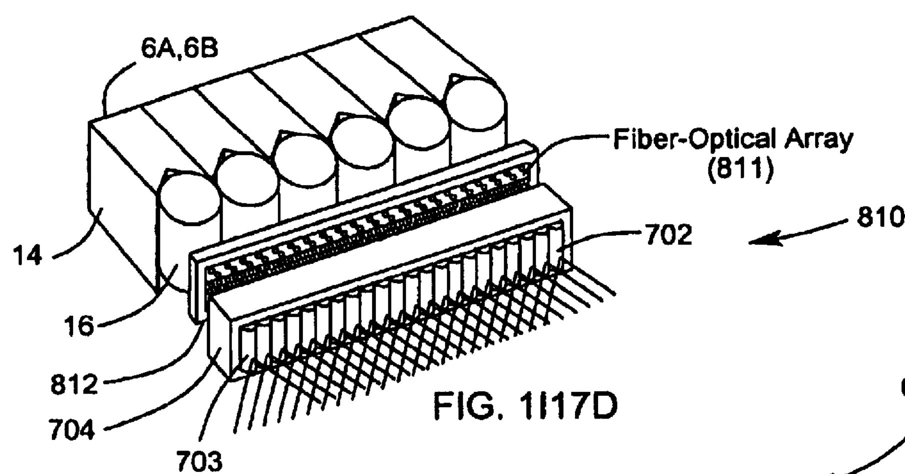
FIG. 1I17D
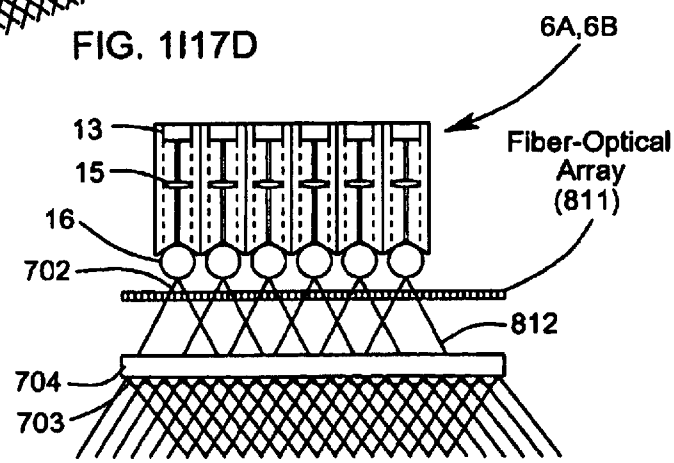
FIG. 1I17E

Fourth Generalized Method Of Reducing Speckle-Noise Patterns At Image Detection Array Of The IFD Subsystem (3)
(TFMF)
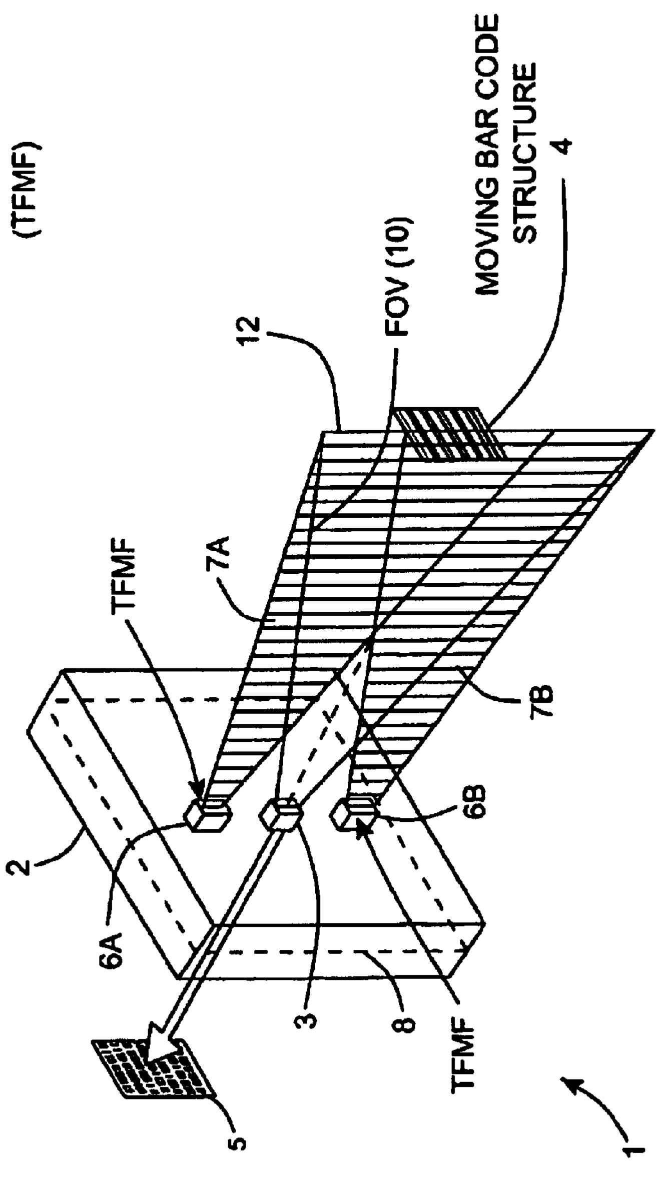
FIG. 1I18

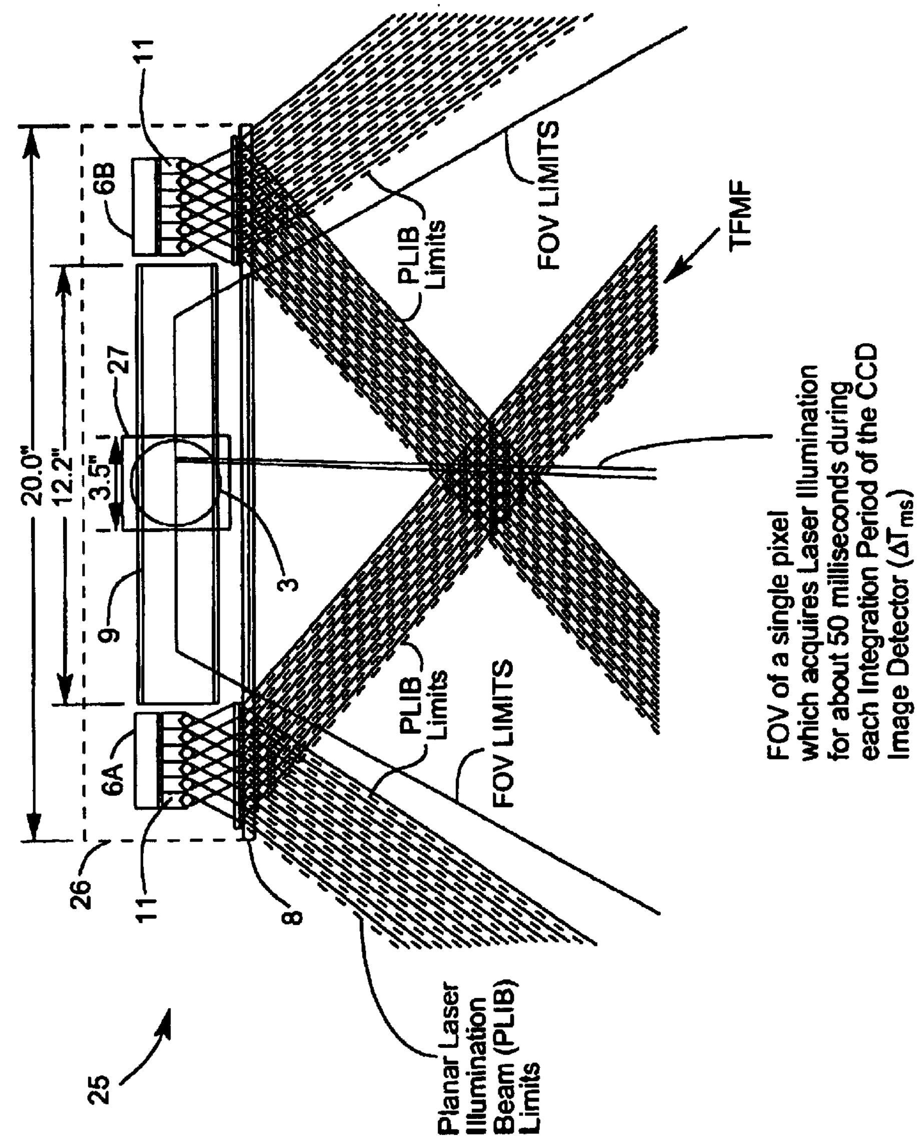
FIG. 1I18A

Figure 1I:
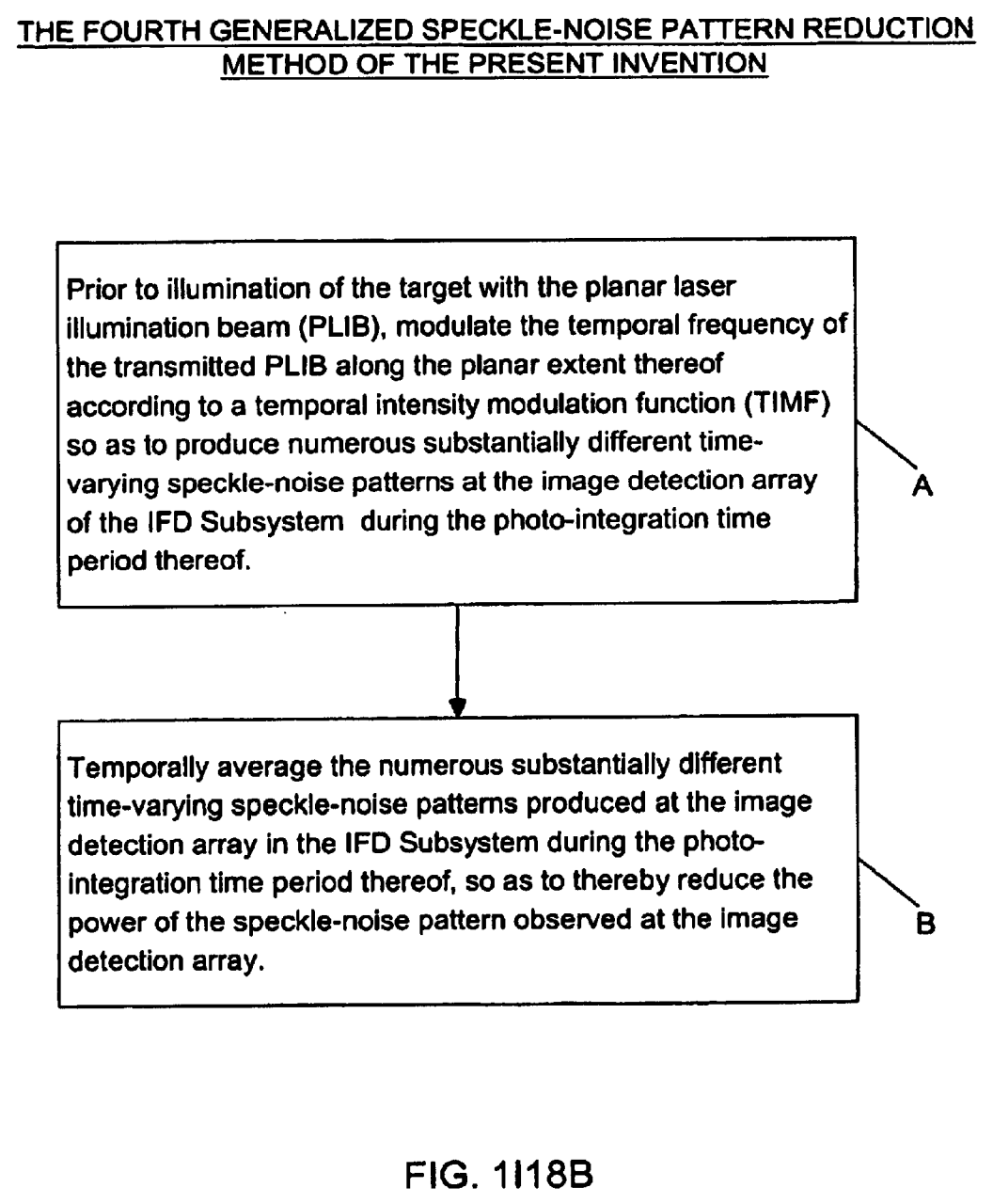

THE FOURTH GENERALIZED SPECKLE-NOISE PATTERN REDUCTION METHOD OF THE PRESENT INVENTION

Prior to illumination of the target with the planar laser illumination beam (PLIB), modulate the temporal frequency of the transmitted PLIB along the planar extent thereof according to a temporal intensity modulation function (TIMF) so as to produce numerous substantially different time-varying speckle-noise patterns at the image detection array of the IFD Subsystem during the photo-integration time period thereof.

A

Temporally average the numerous substantially different time-varying speckle-noise patterns produced at the image detection array in the IFD Subsystem during the photo-integration time period thereof, so as to thereby reduce the power of the speckle-noise pattern observed at the image detection array.

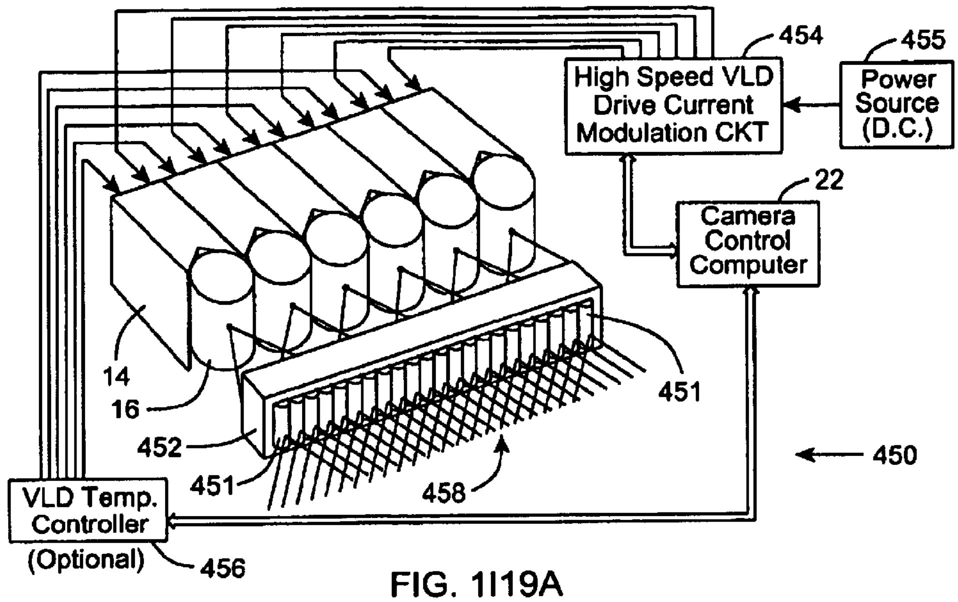
FIG. 1I19A
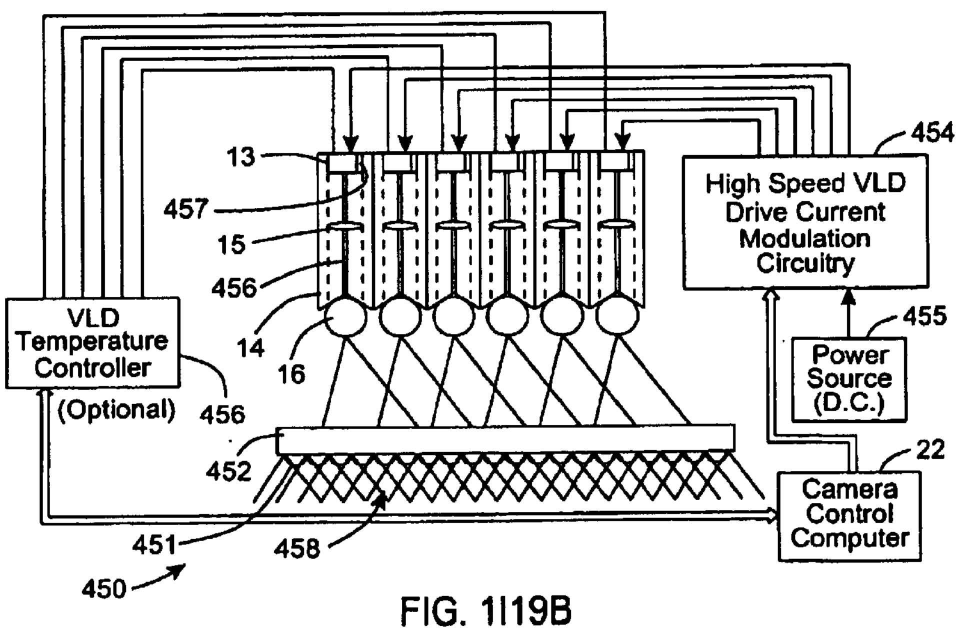
FIG. 1I19B

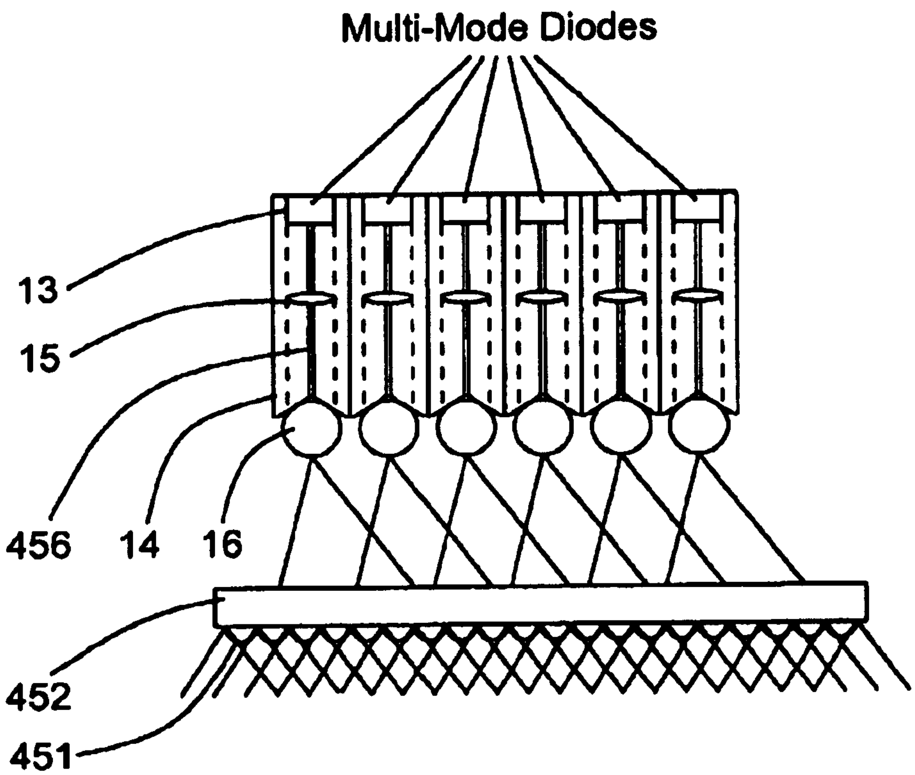
FIG. 1I19C

Fifth Generalized Method Of Reducing Speckle-Noise Patterns At Image Detection Array Of The IFD Subsystem (3)
(SIMF)
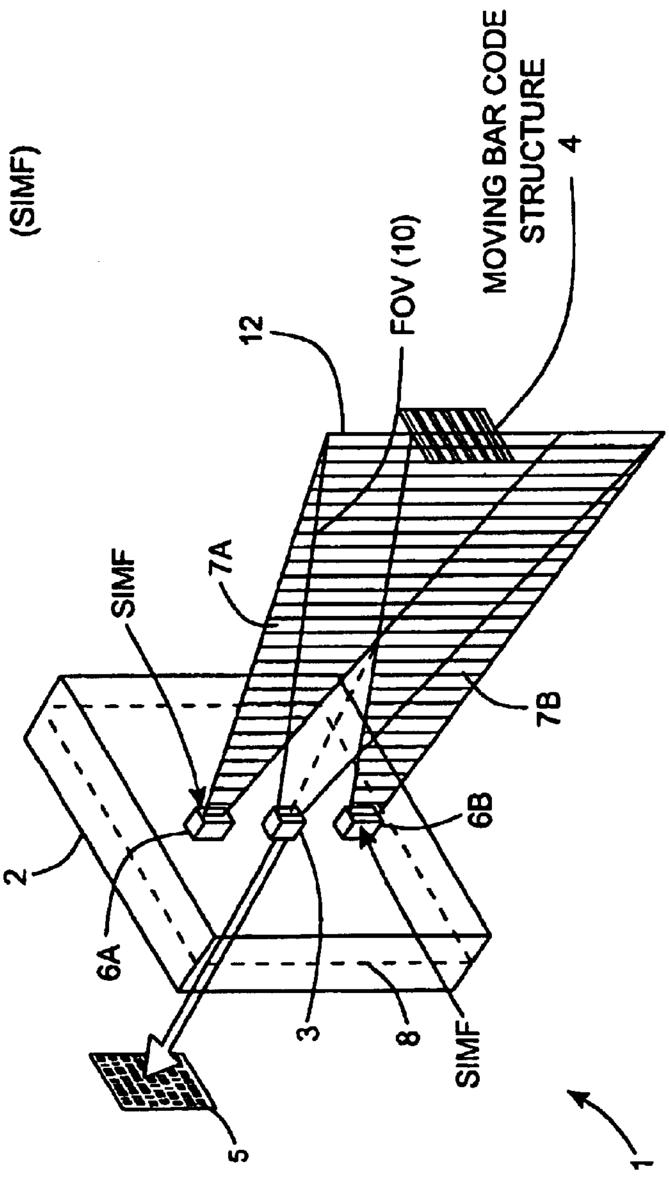
FIG. 1I20

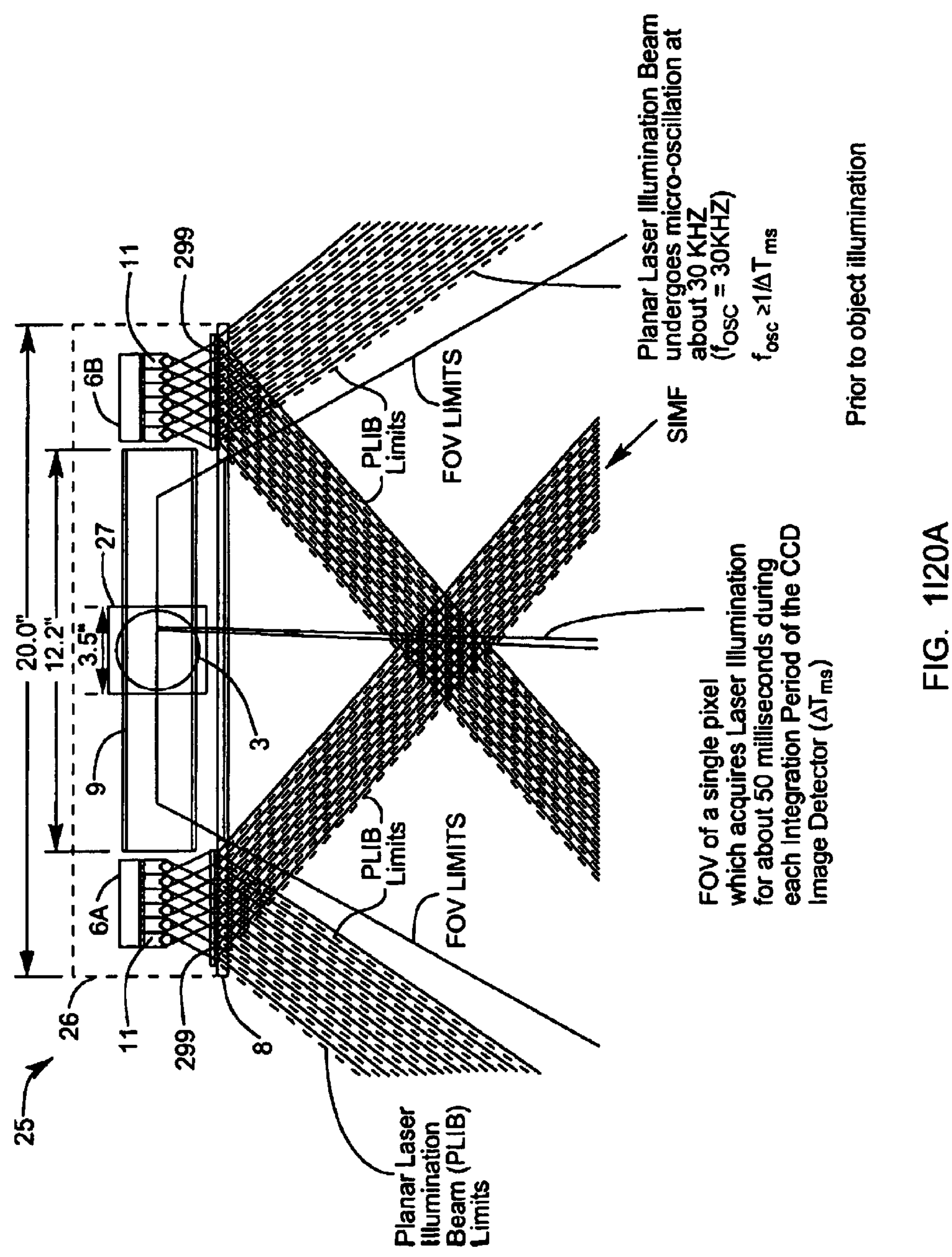
FIG. 1I20A

Figure 1I:
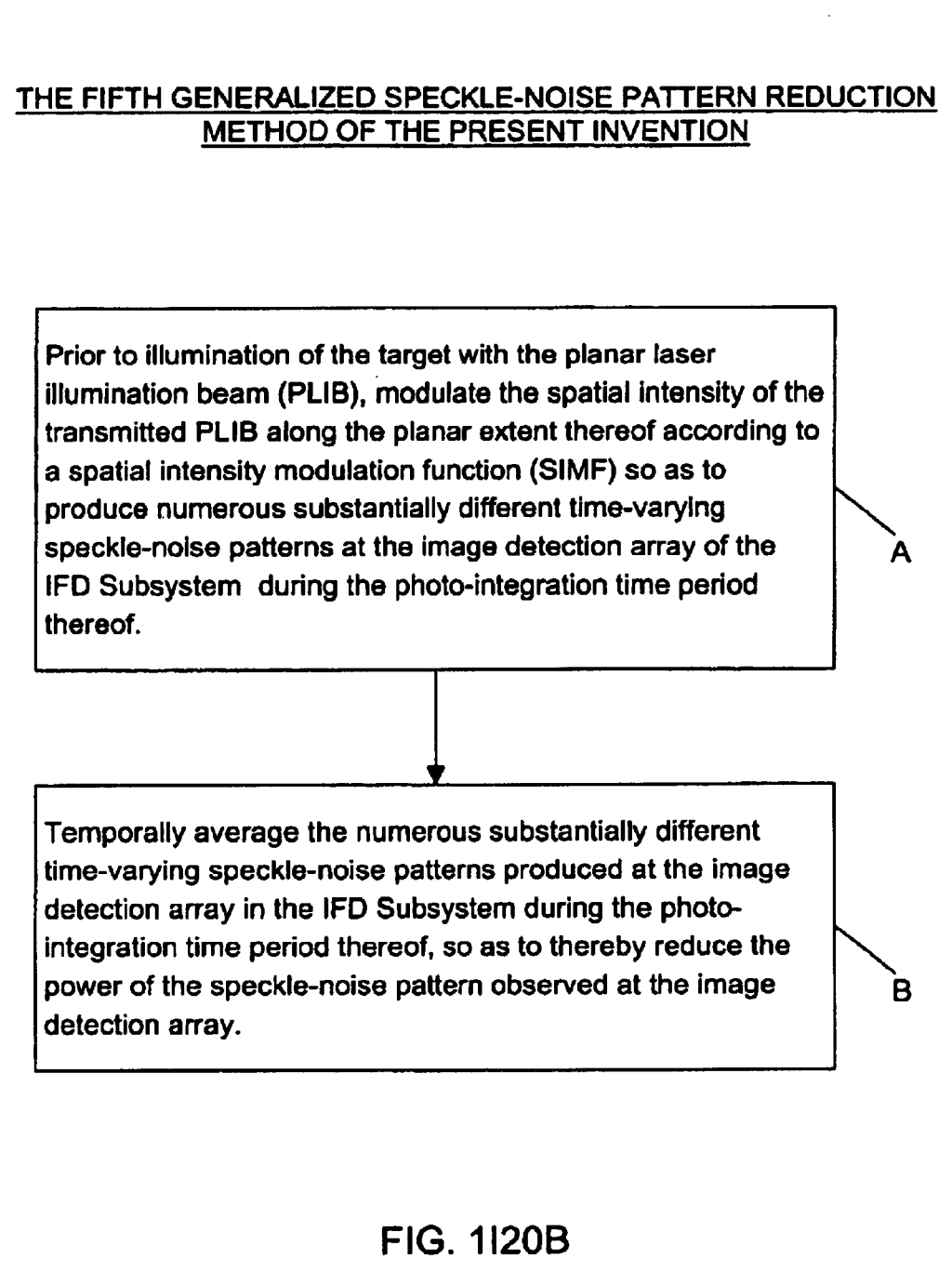

THE FIFTH GENERALIZED SPECKLE-NOISE PATTERN REDUCTION METHOD OF THE PRESENT INVENTION

Prior to illumination of the target with the planar laser illumination beam (PLIB), modulate the spatial intensity of the transmitted PLIB along the planar extent thereof according to a spatial intensity modulation function (SIMF) so as to produce numerous substantially different time-varying speckle-noise patterns at the image detection array of the IFD Subsystem during the photo-integration time period thereof.

A

↓

Temporally average the numerous substantially different time-varying speckle-noise patterns produced at the image detection array in the IFD Subsystem during the photo-integration time period thereof, so as to thereby reduce the power of the speckle-noise pattern observed at the image detection array.

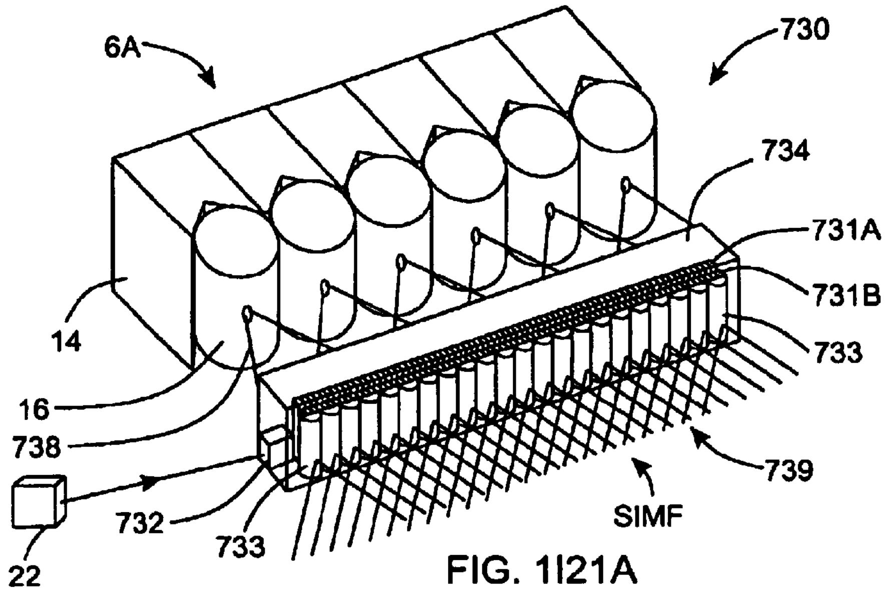
FIG. 1I21A
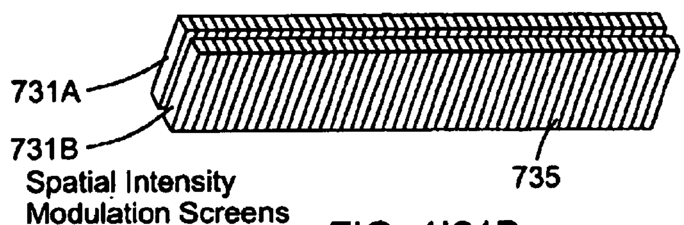
FIG. 1I21B
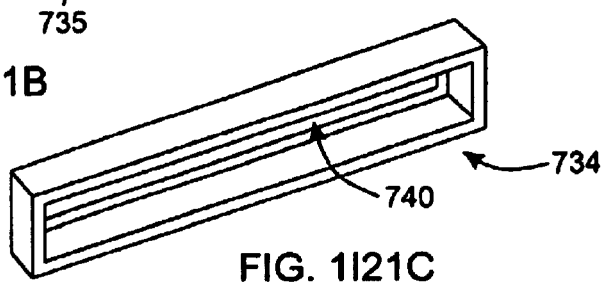
FIG. 1I21C
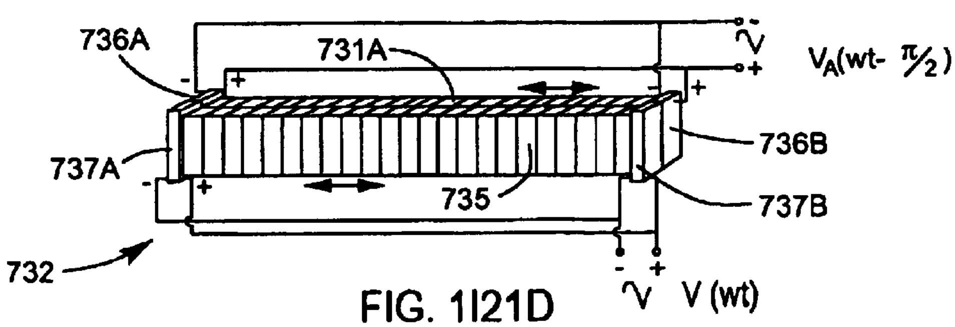
FIG. 1I21D Sixth Generalized Method Of Reducing Speckle-Noise Patterns At Image Detection Array Of The IFD Subsystem (3)
(SIMF)
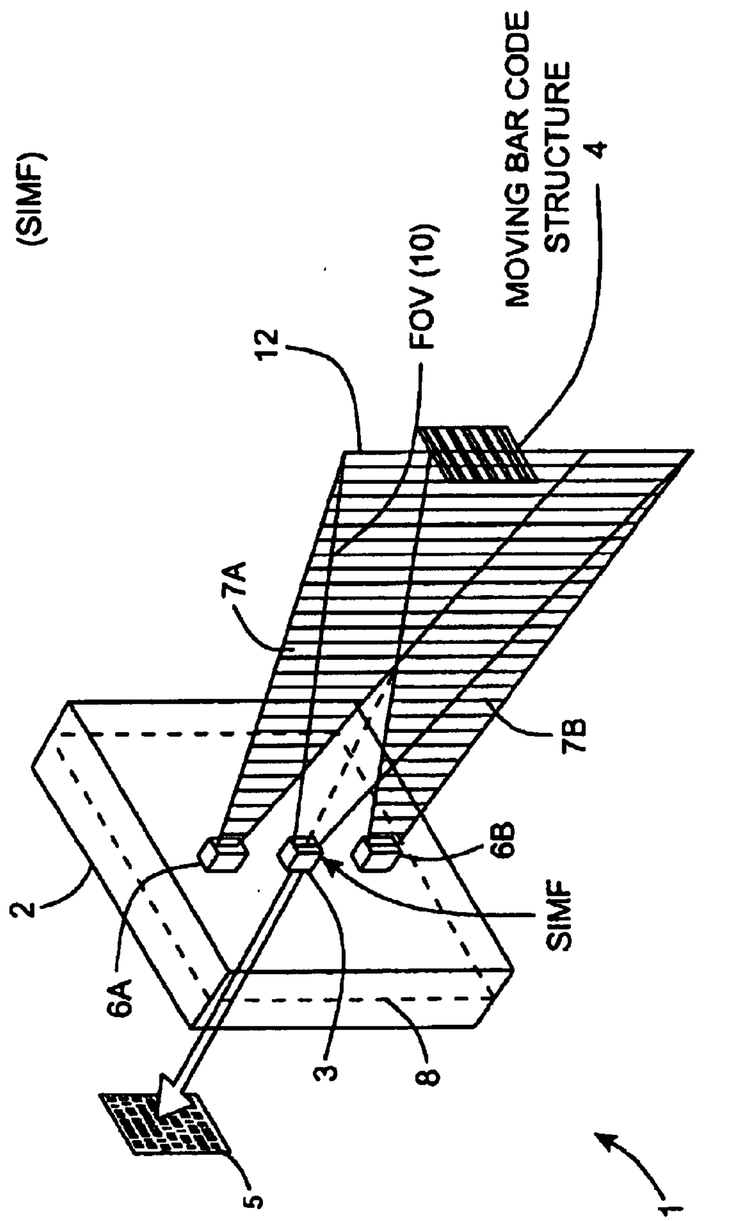
FIG. 1I22

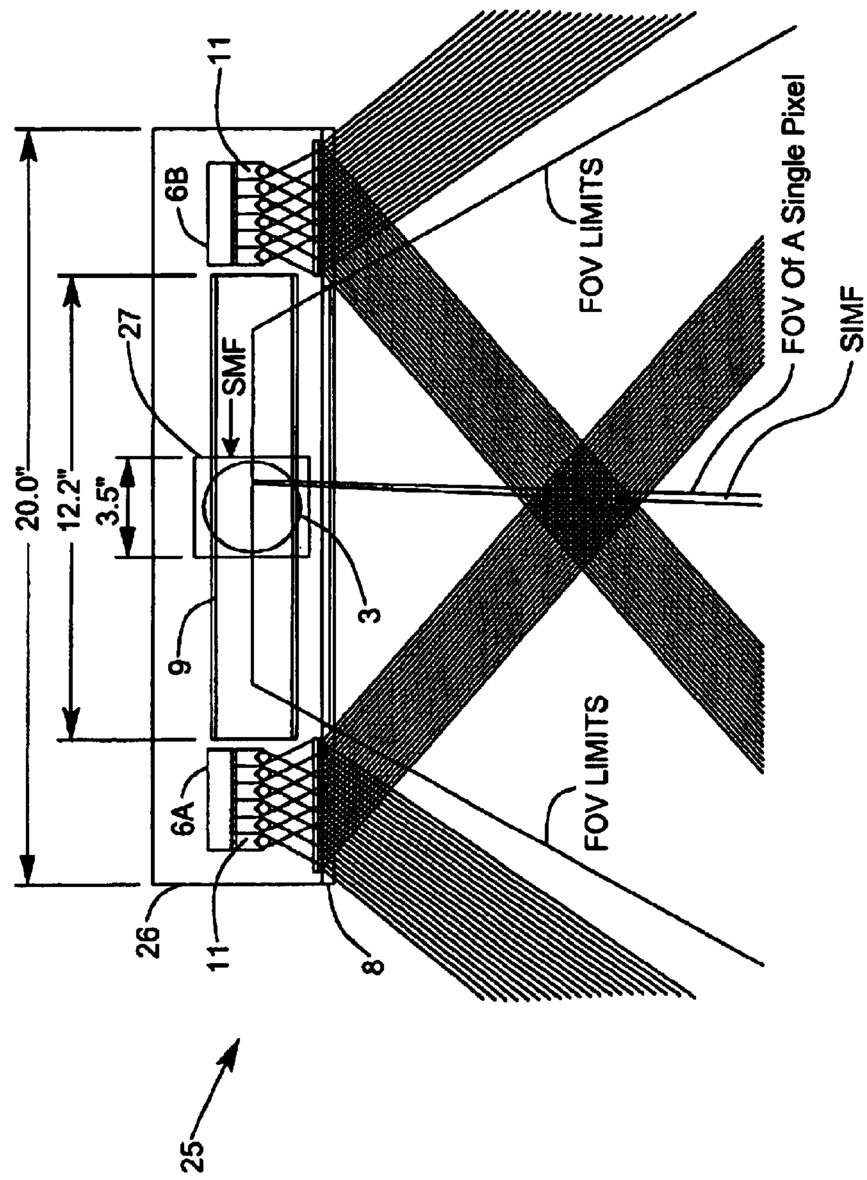
FIG. 1I22A

THE SIXTH GENERALIZED SPECKLE-NOISE PATTERN REDUCTION METHOD OF THE PRESENT INVENTION
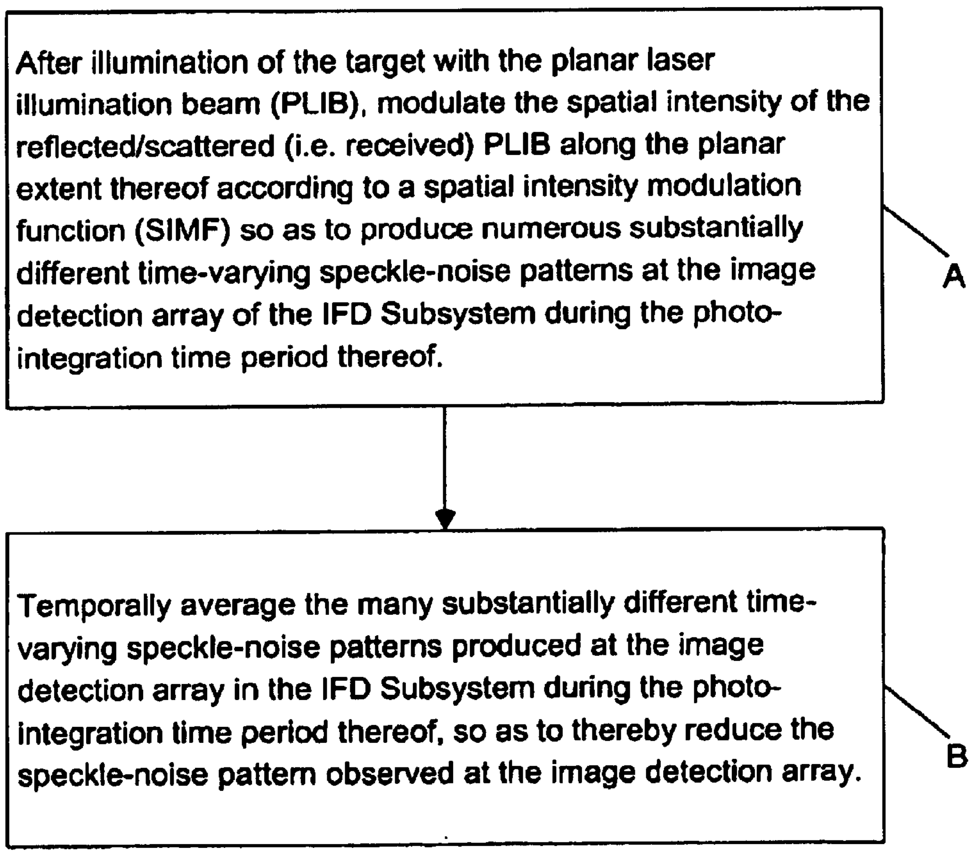
FIG. 1I22B

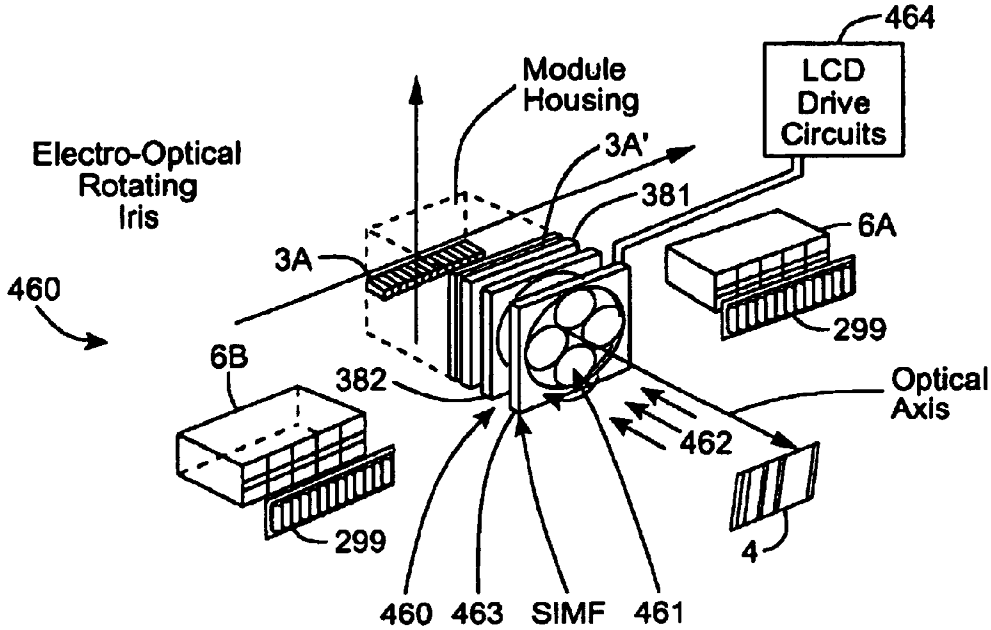
FIG. 1I23A
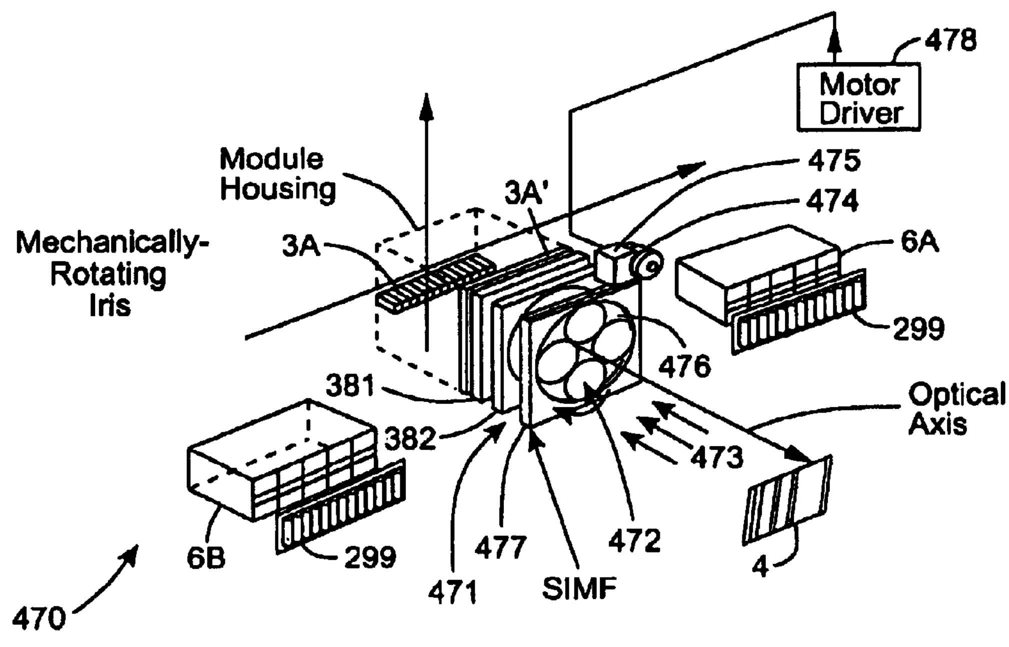
FIG. 1I23B

Seventh Generalized Method Of Reducing Speckle-Noise Patterns At Image Detection Array Of The IFD Subsystem (3)
(TIMF)
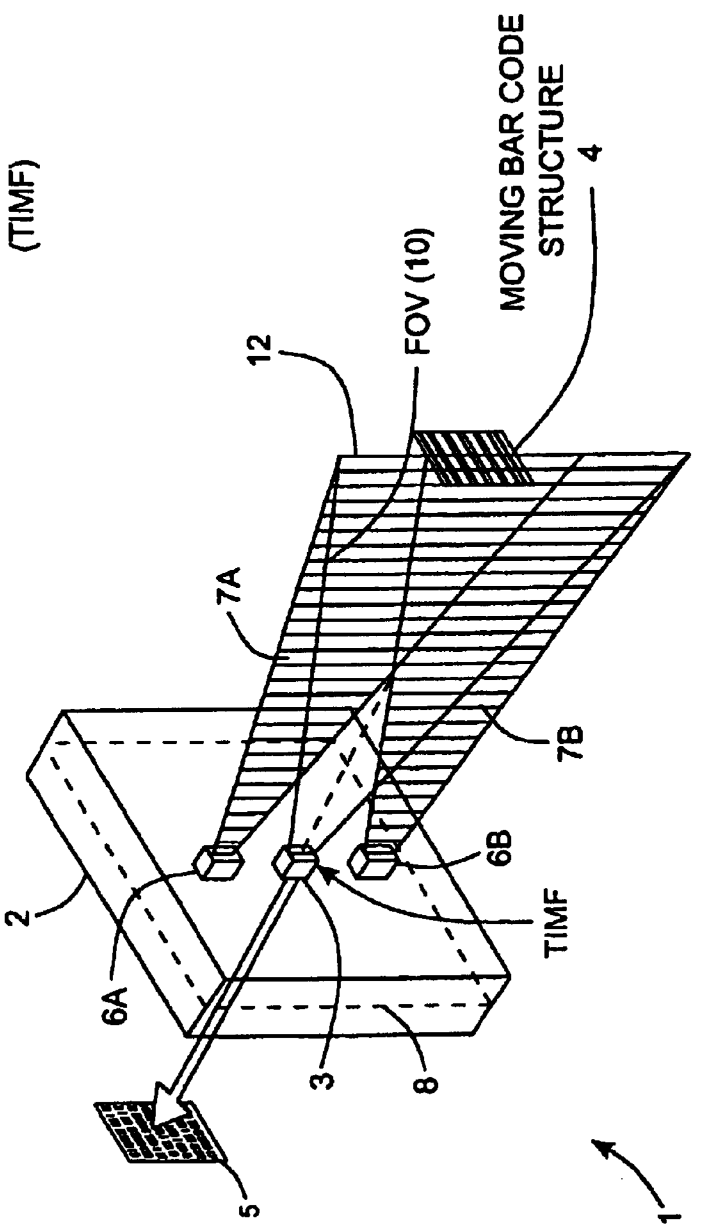
FIG. 1I24

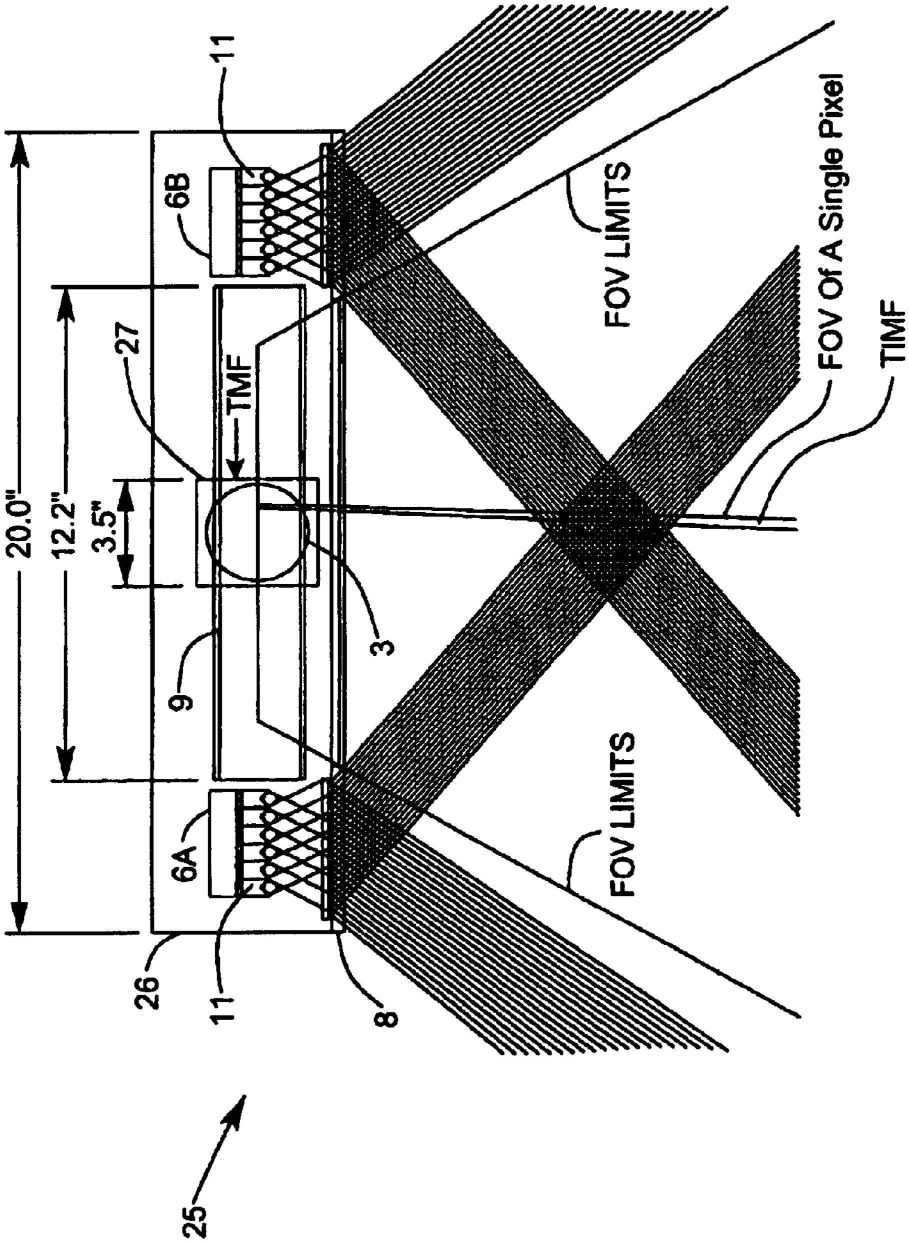
FIG. 1I24A

THE SEVENTH GENERALIZED SPECKLE-NOISE PATTERN REDUCTION METHOD OF THE PRESENT INVENTION
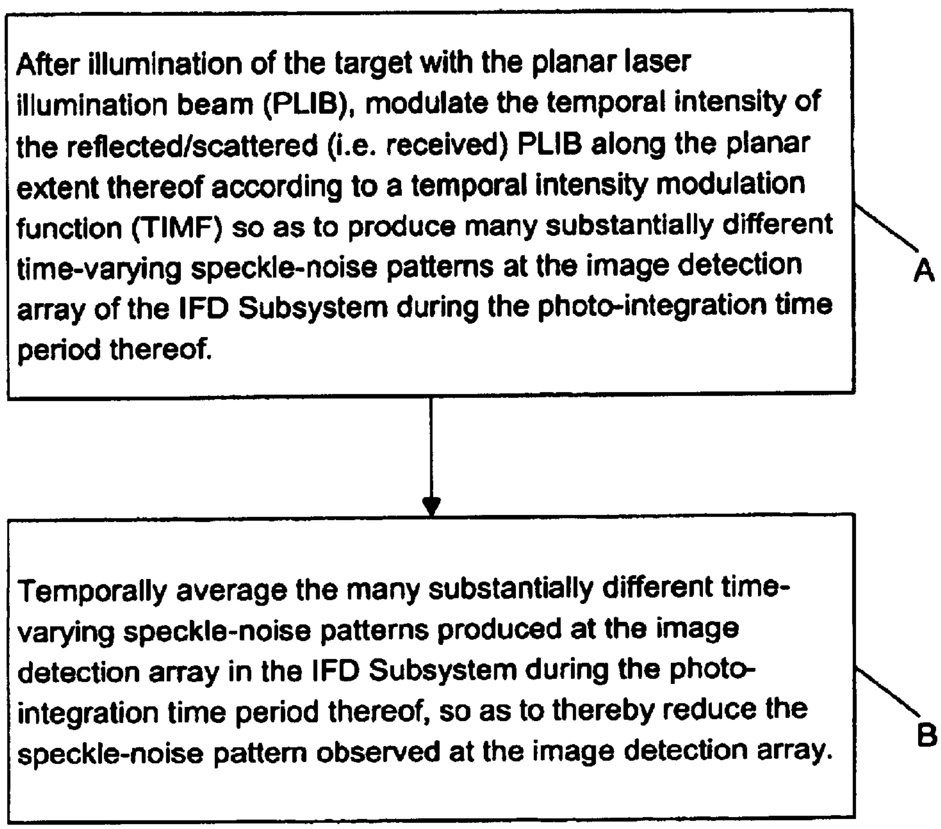
FIG. 1I24B

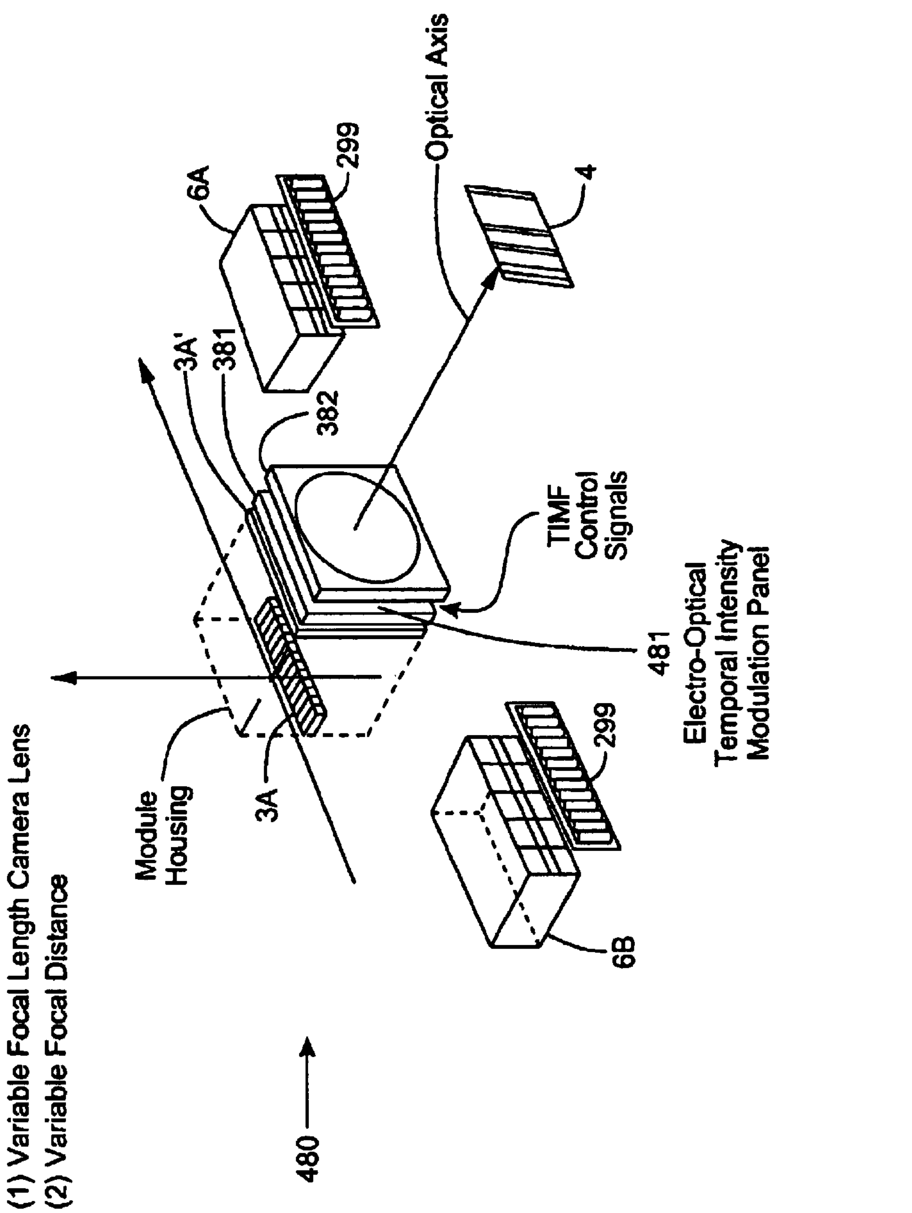
FIG. 1I24C

THE EIGHT GENERALIZED SPECKLE-NOISE PATTERN REDUCTION METHOD OF THE PRESENT INVENTION
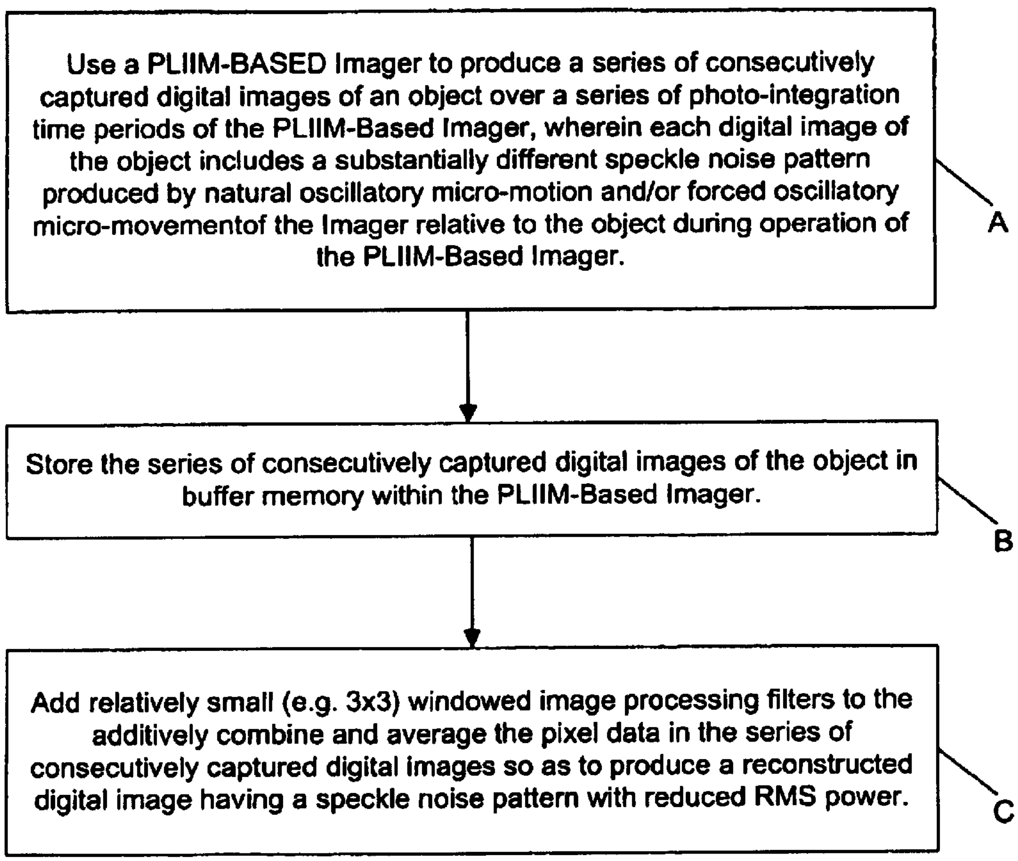
FIG. 1I24D

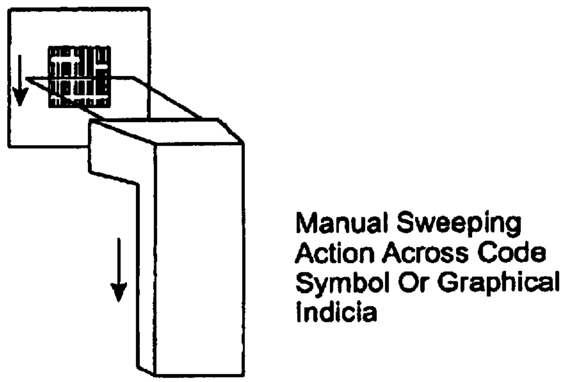
FIG. 1I24E
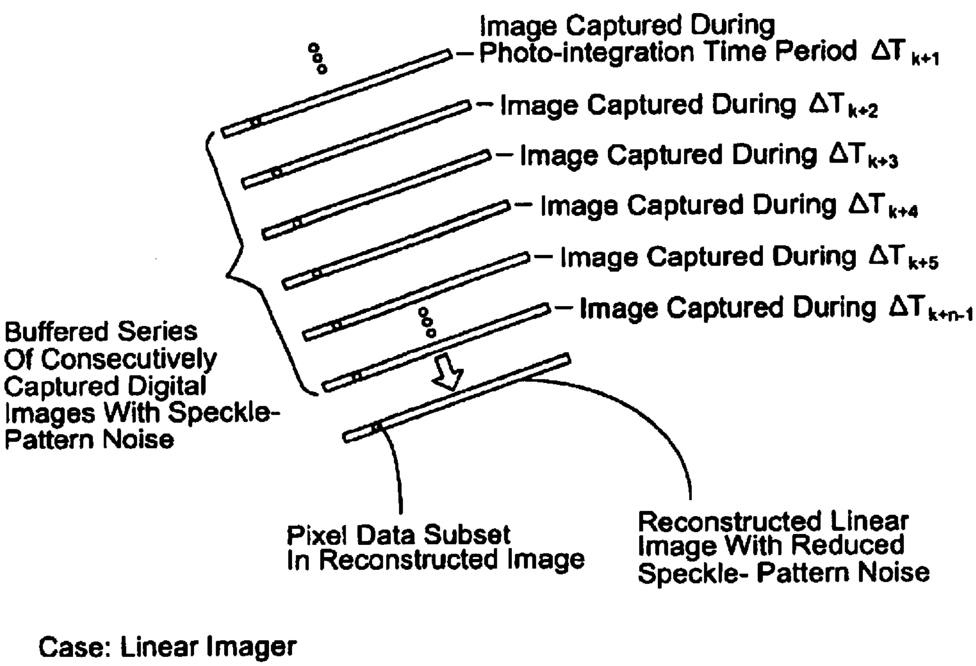
FIG. 1I24F

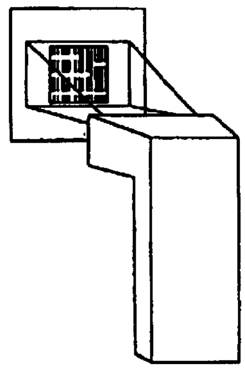
FIG. 1I24G
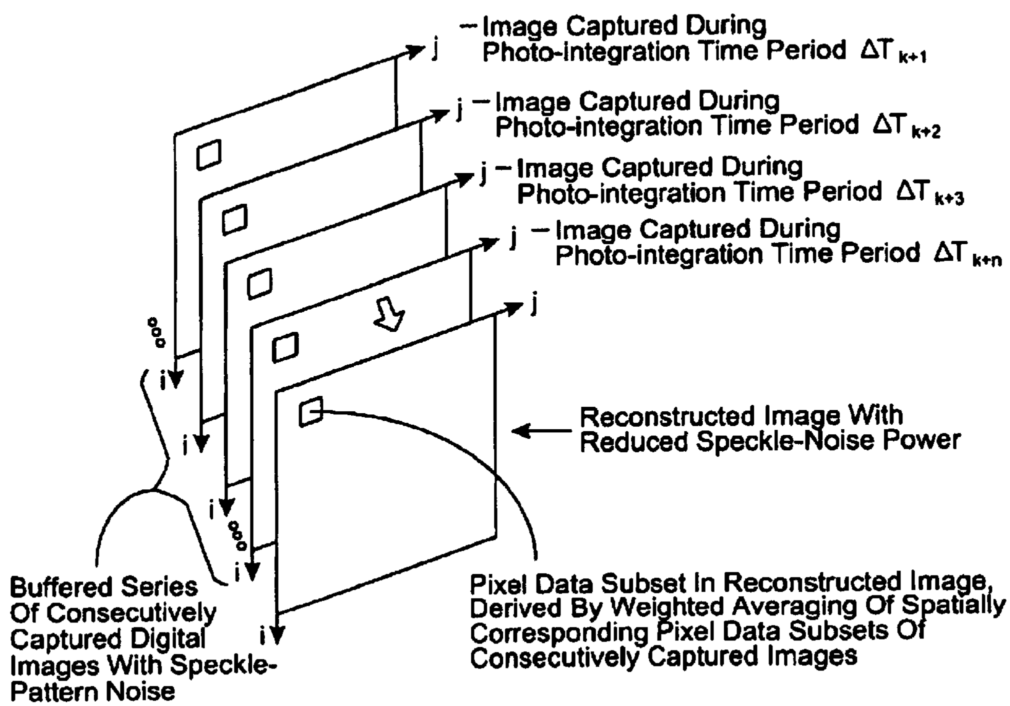
Case: 2D Area Imager
FIG. 1I24H

THE NINTH GENERALIZED METHOD OF REDUCING SPECKLE PATTERN NOISE IN PLIIM-BASED IMAGING SYSTEMS
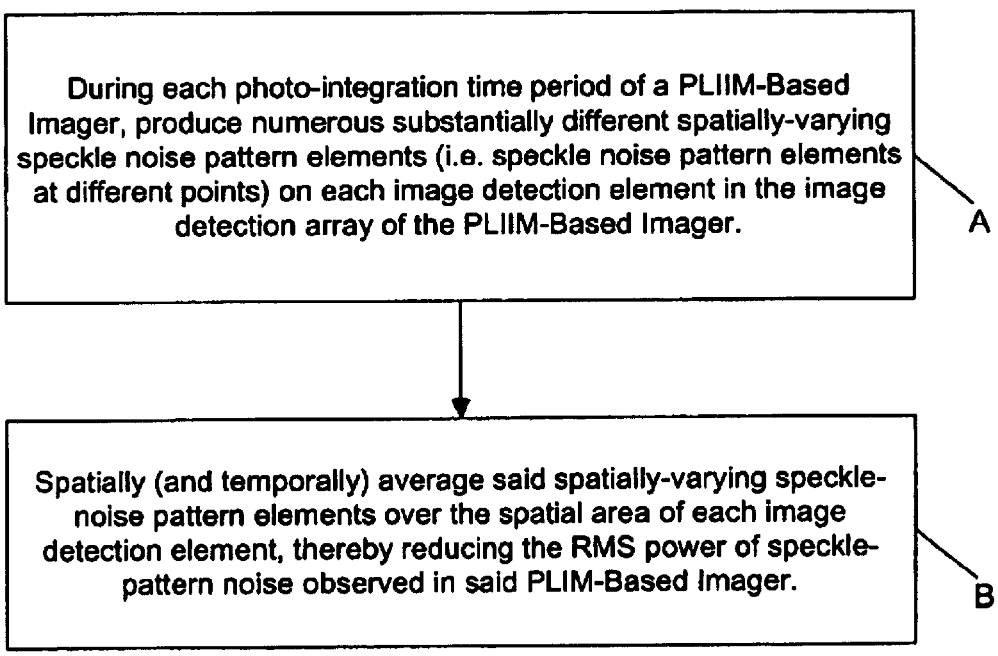
FIG. 11241

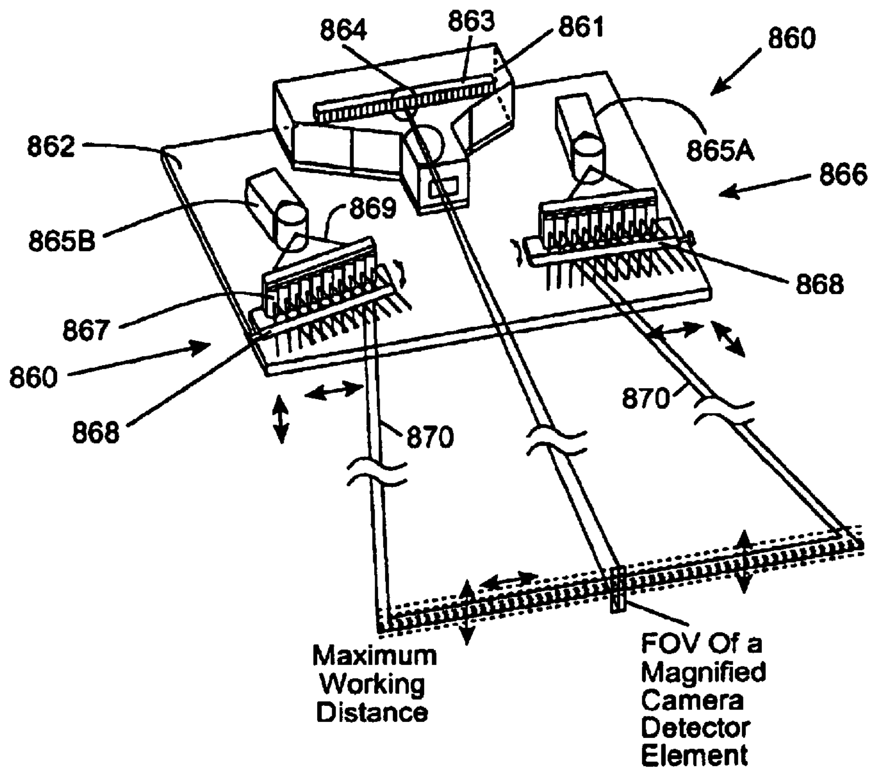
* Lateral And Transverse Micro-oscillation Of PLIB
FIG. 1I25A1
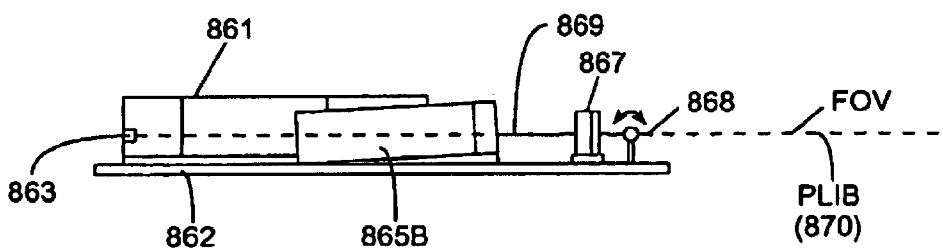
FIG. 1I25A2

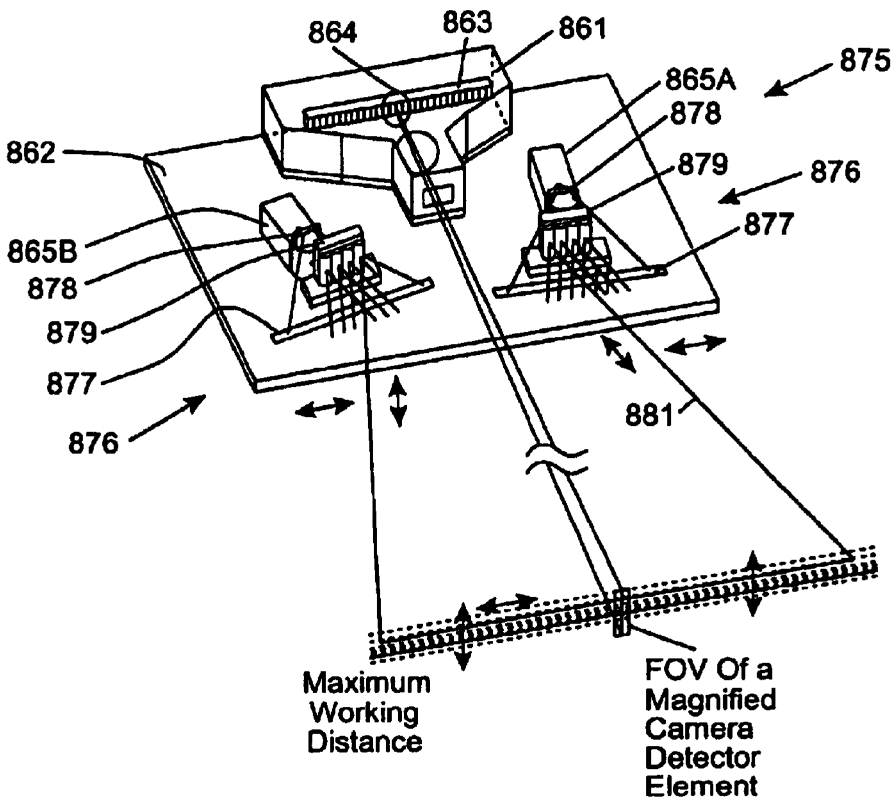
FIG. 1I25B1
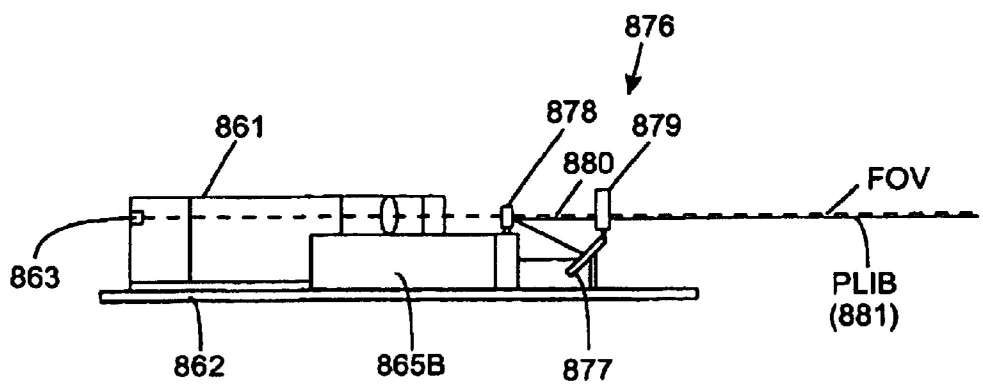
FIG. 1I25B2

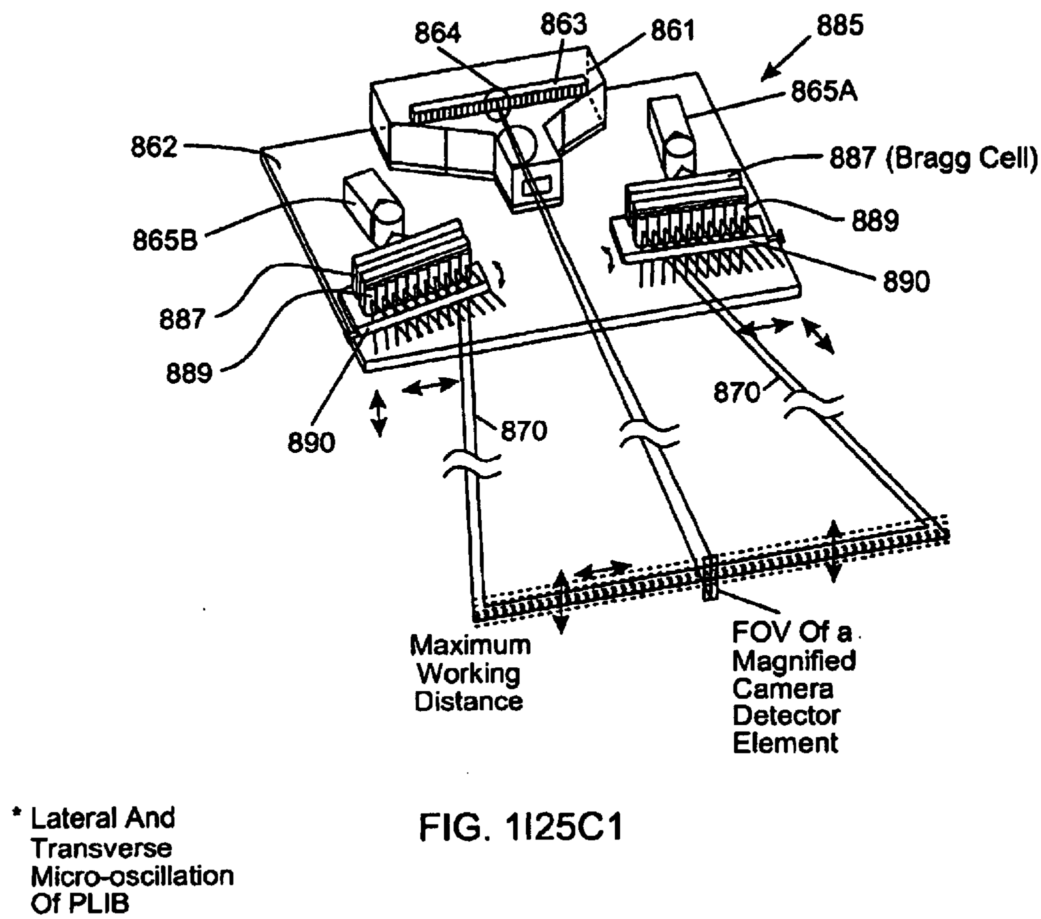
FIG. 1I25C1
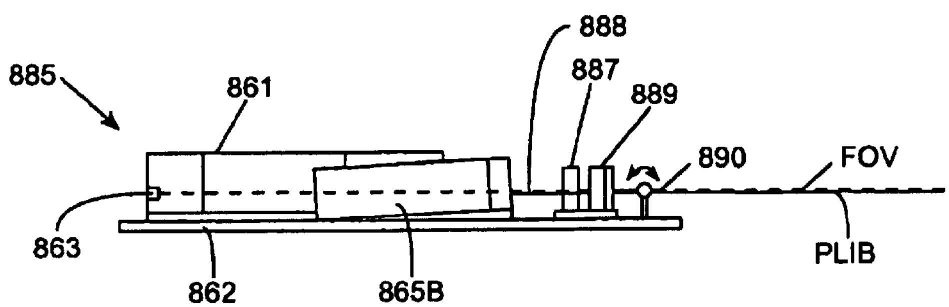
FIG. 1I25C2

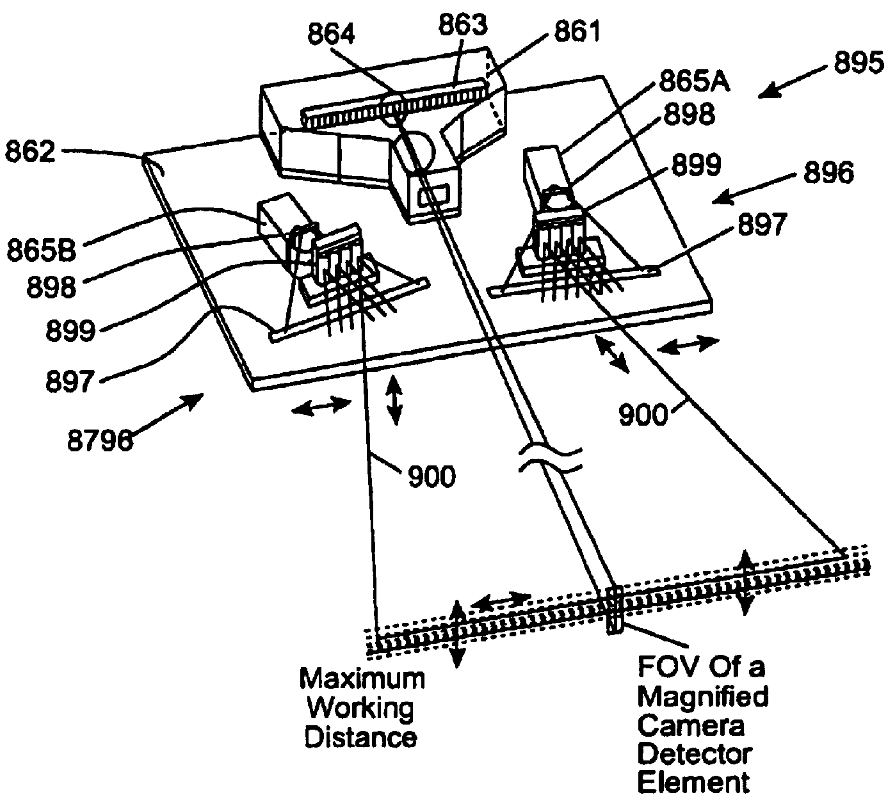
FIG. 1I25D1
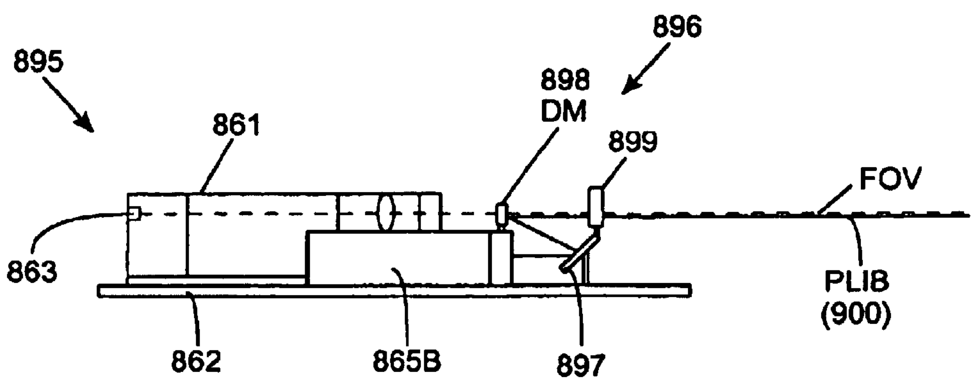
FIG. 1I25D2

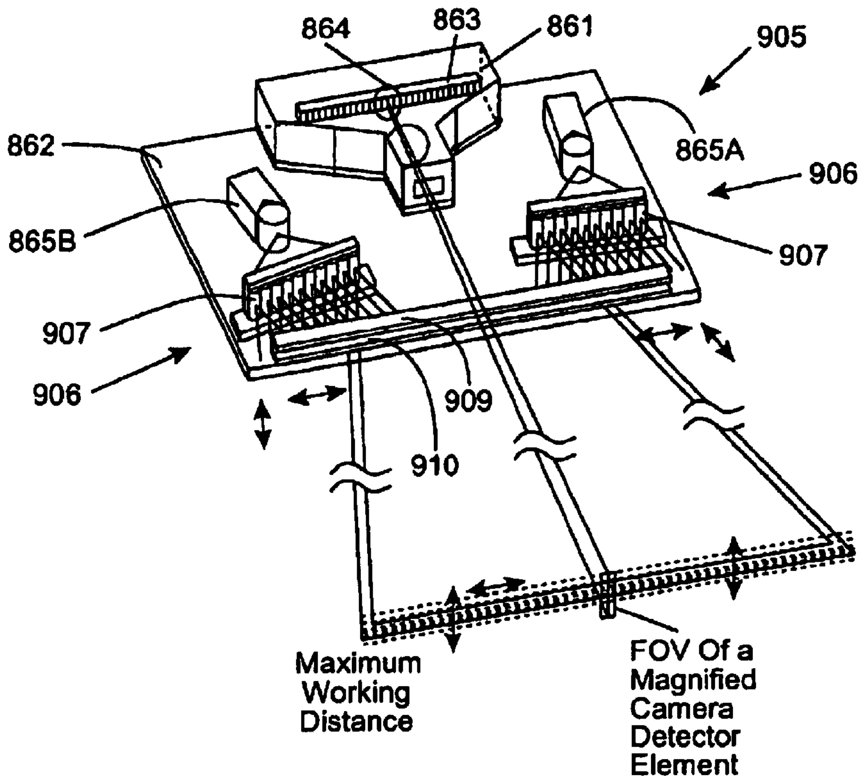
* Lateral And Transverse Micro-oscillation Of PLIB
FIG. 1I25E1
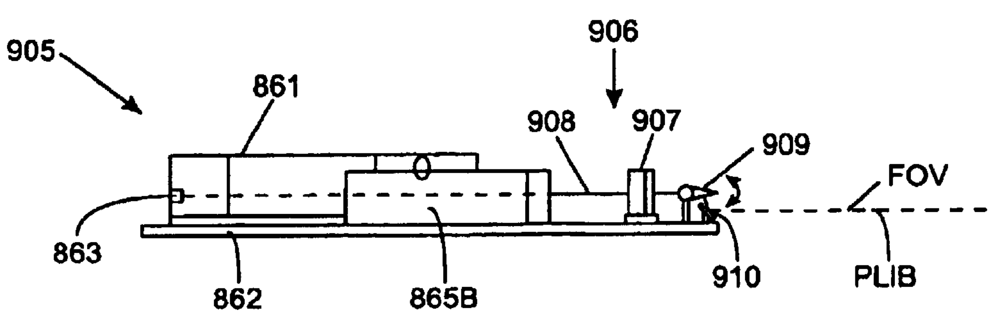
FIG. 1I25E2

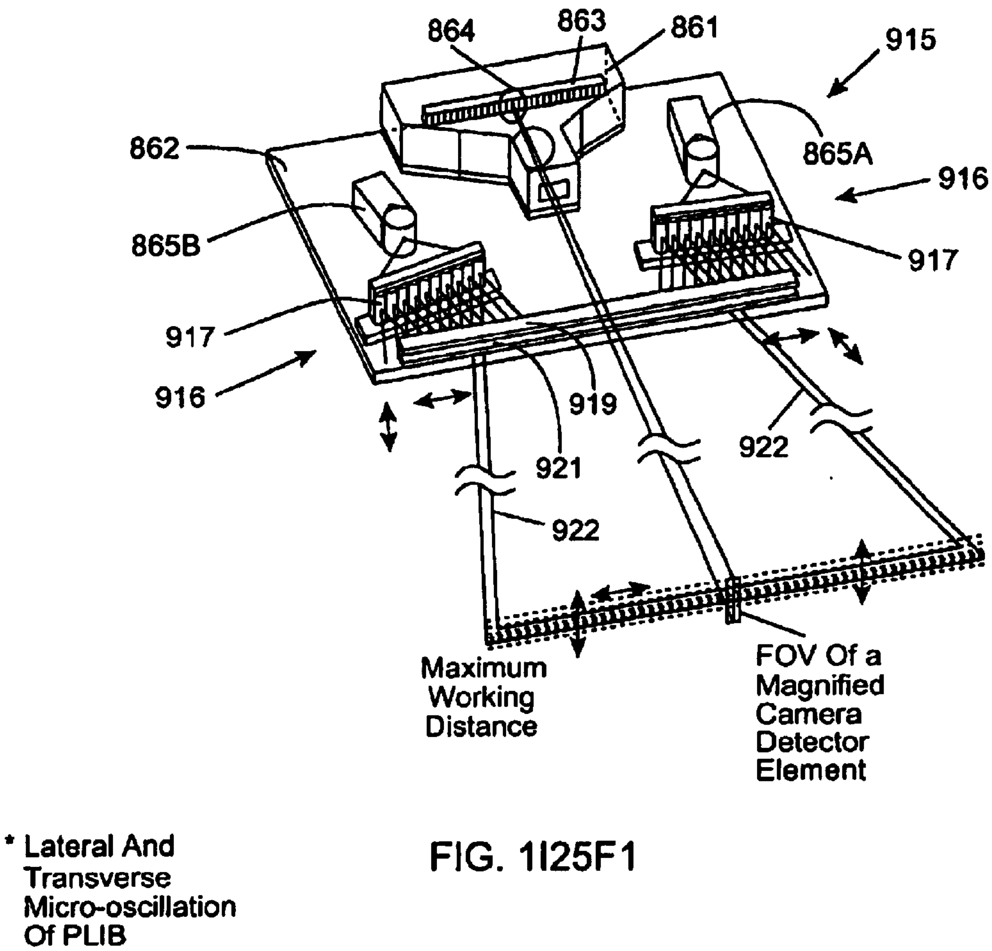
FIG. 1I25F1
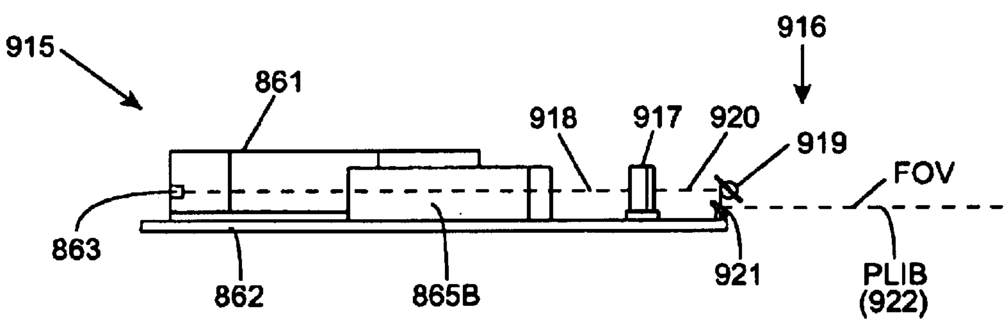
FIG. 1I25F2

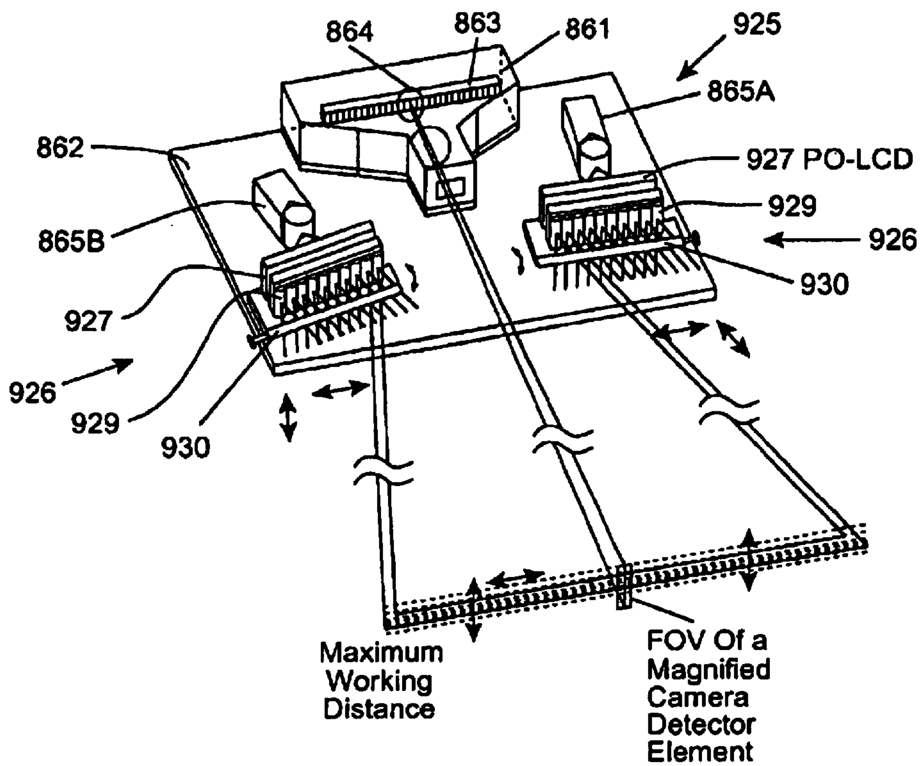
* Lateral And Transverse Micro-oscillation Of PLIB
FIG. 1I25G1
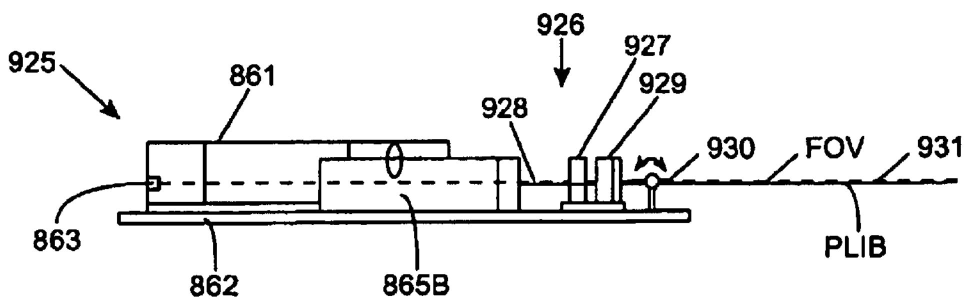
FIG. 1I25G2

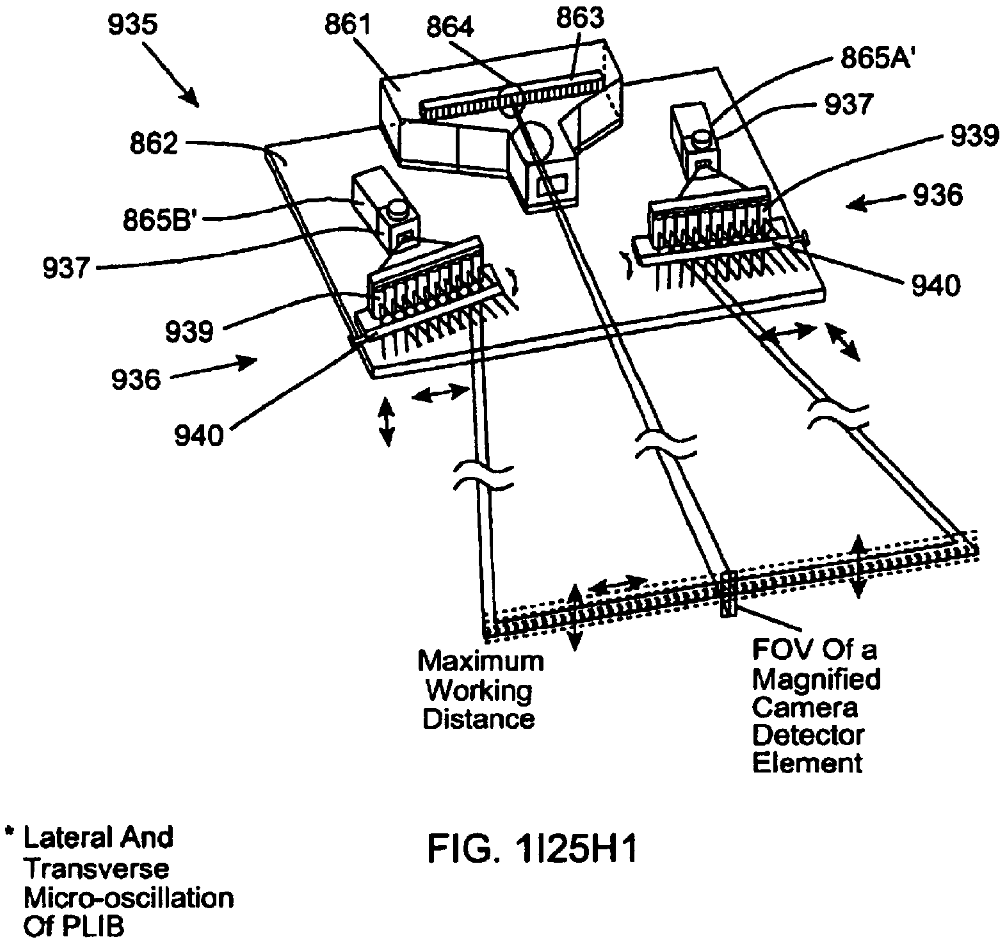
FIG. 1I25H1
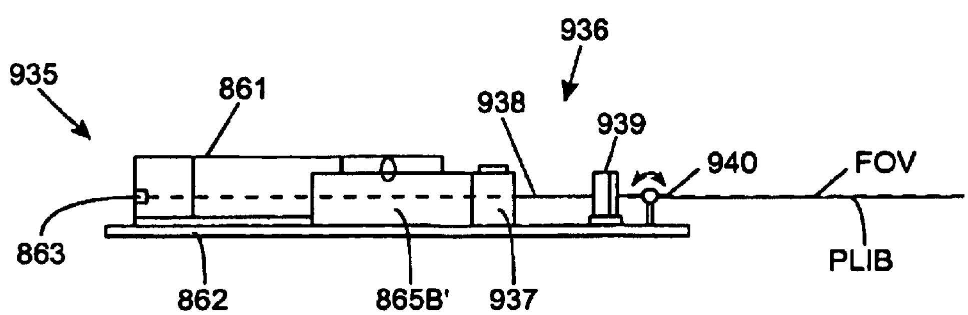
FIG. 1I25H2

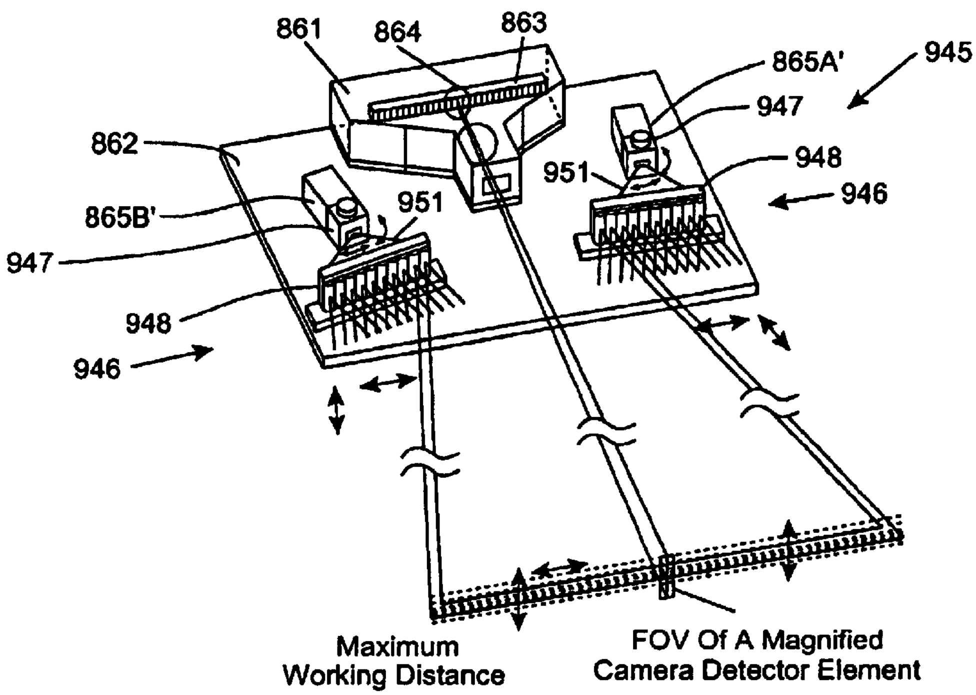
FIG. 1I25I1
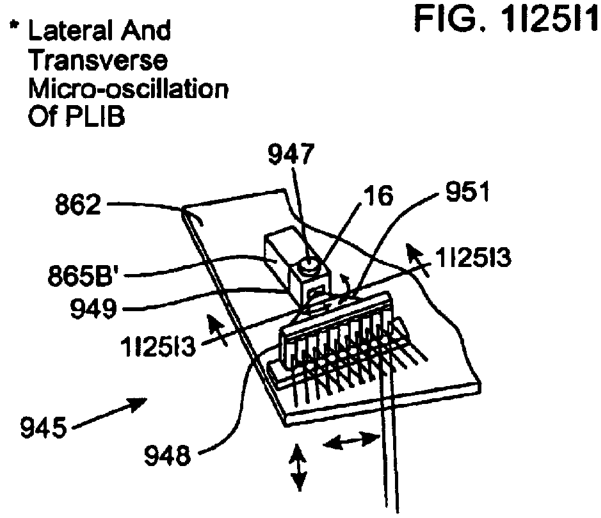
FIG. 1I25I2
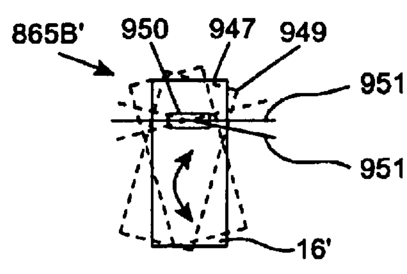
FIG. 1I25I3

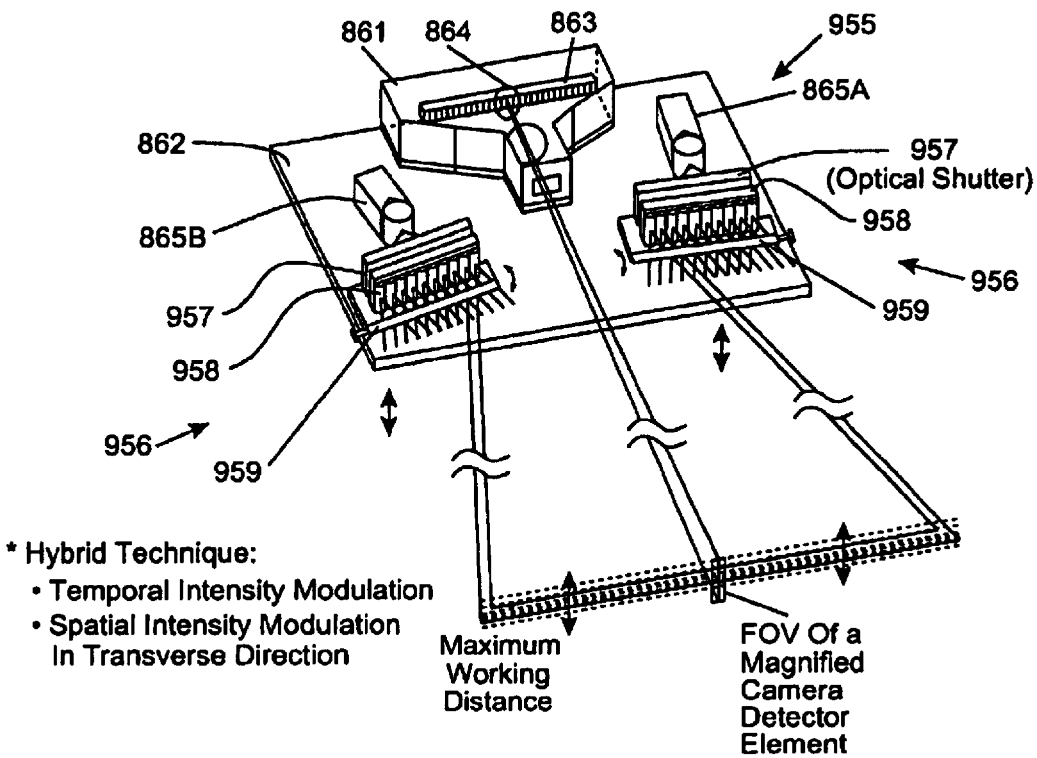
FIG. 1I25J1
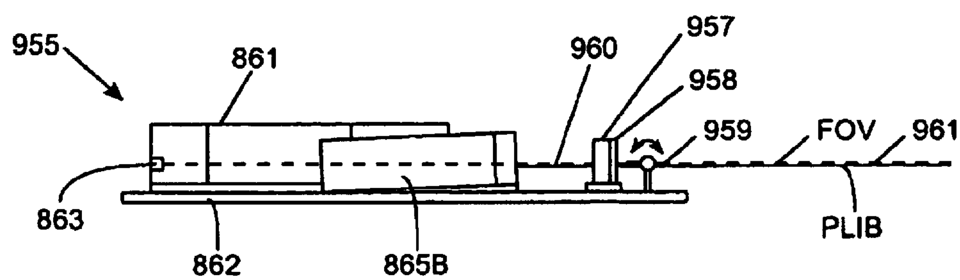
FIG. 1I25J2

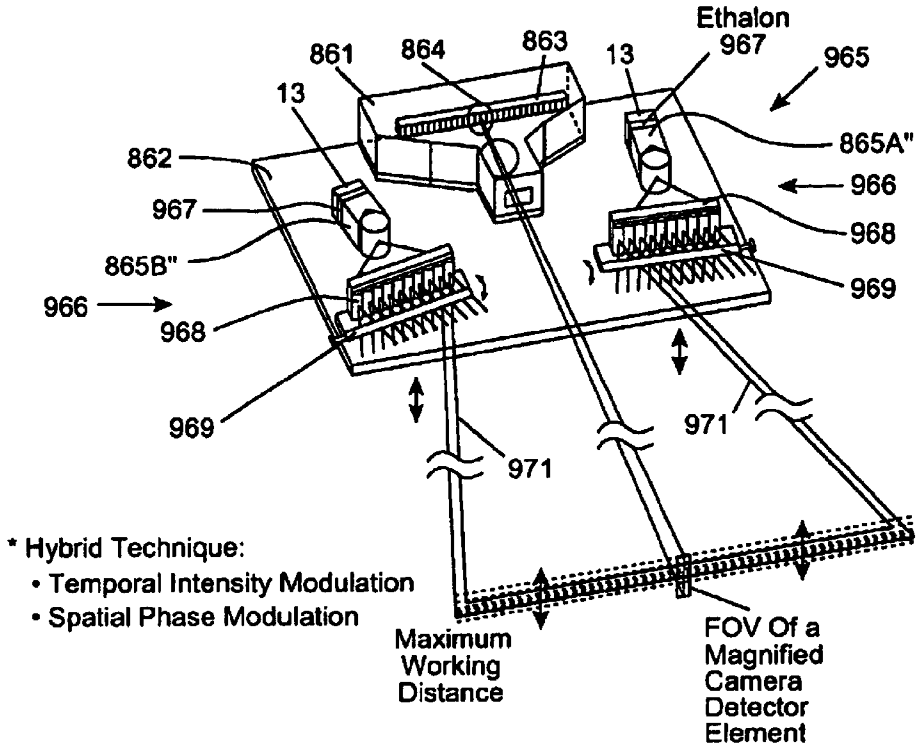
FIG. 1I25K1
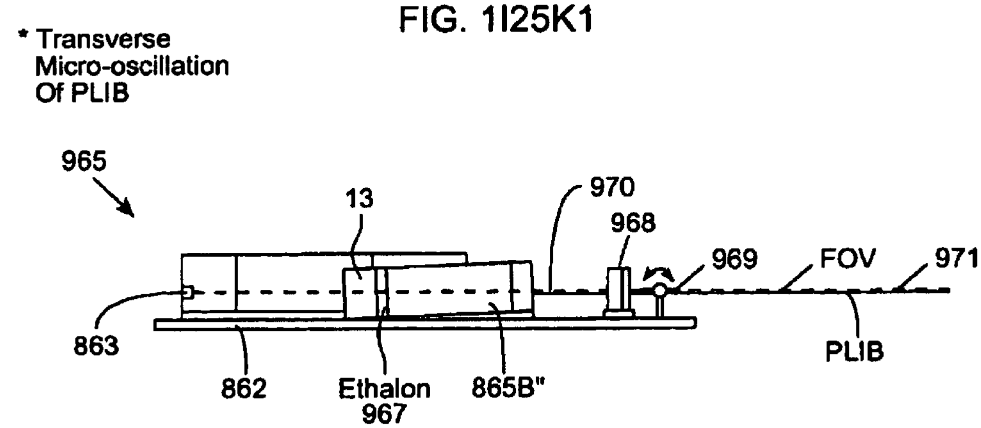
FIG. 1I25K2

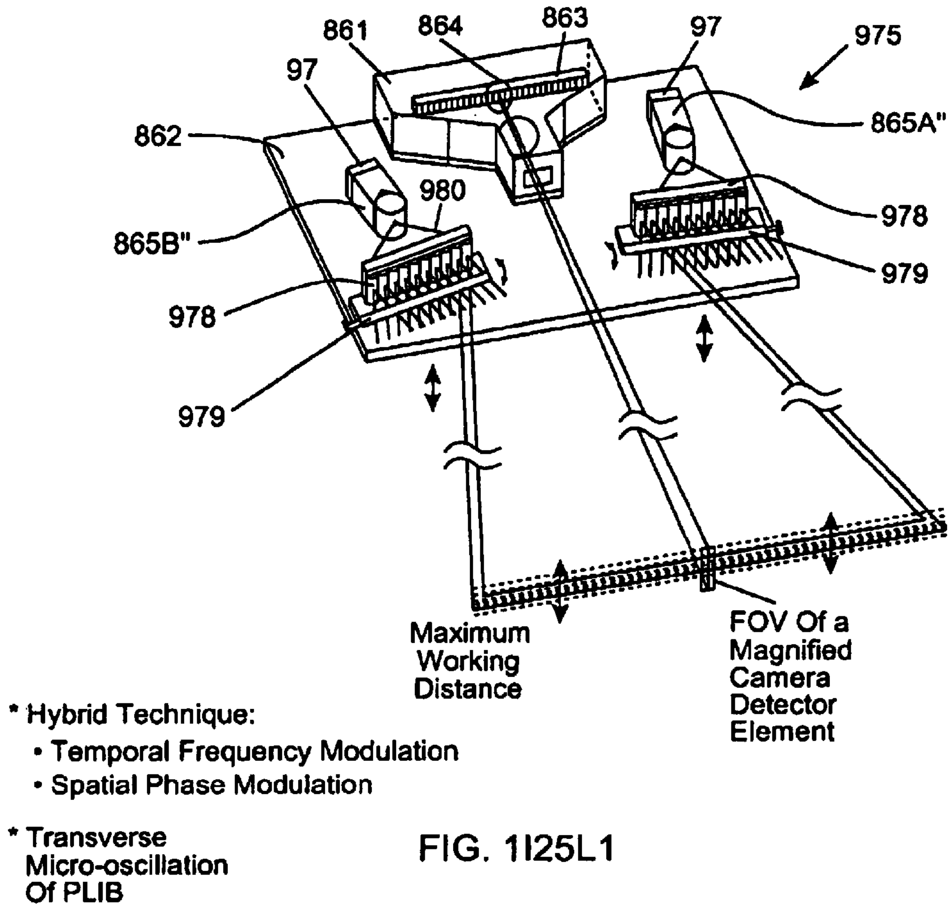
FIG. 1I25L1
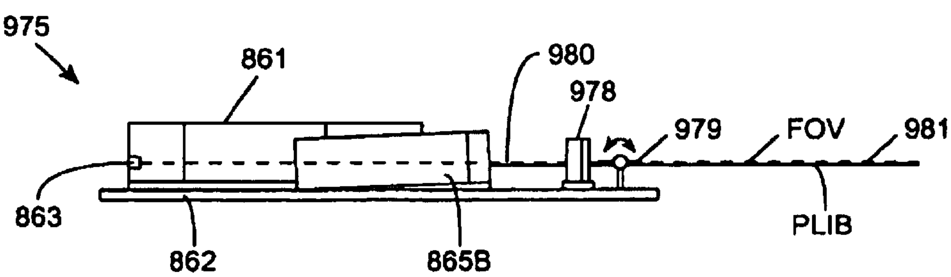
FIG. 1I25L2

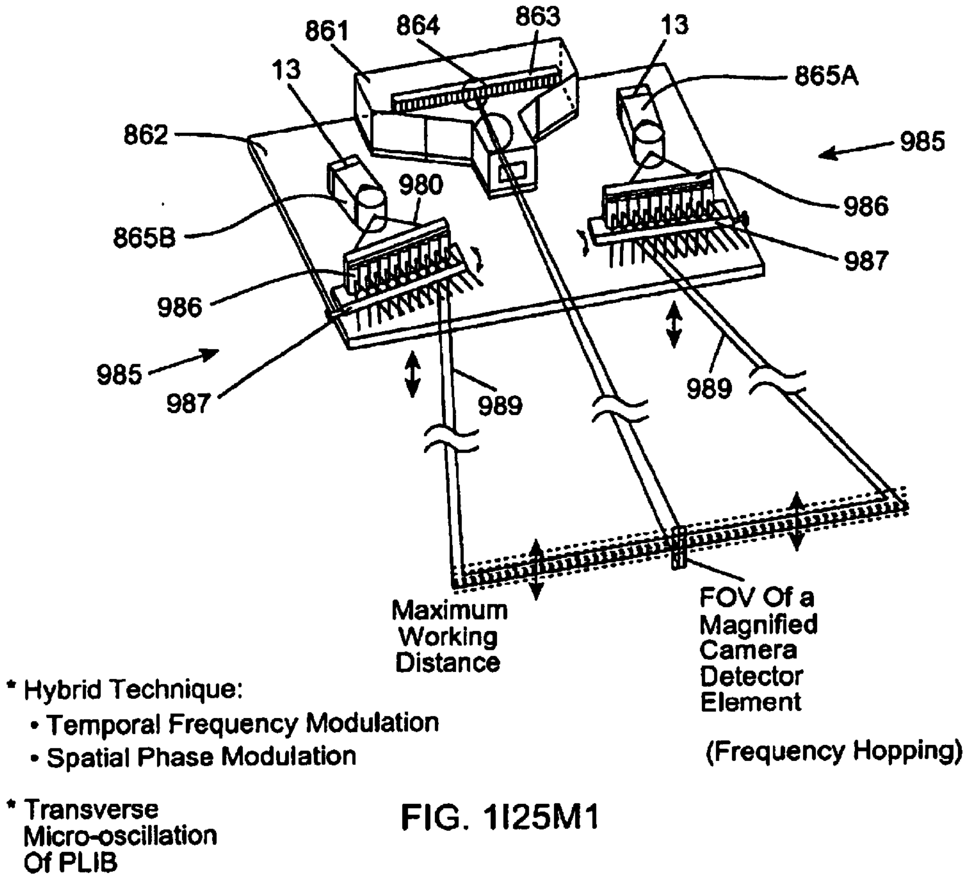
FIG. 1I25M1
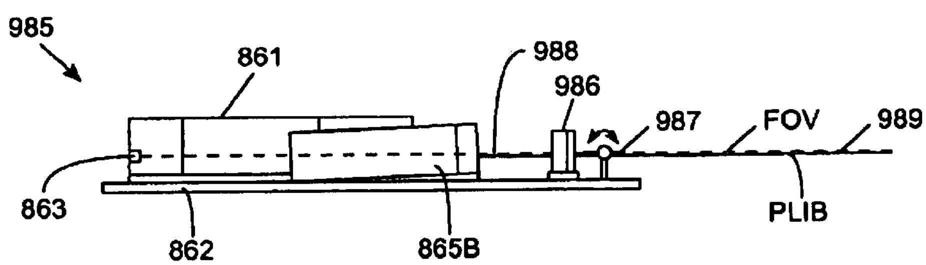
FIG. 1I25M2

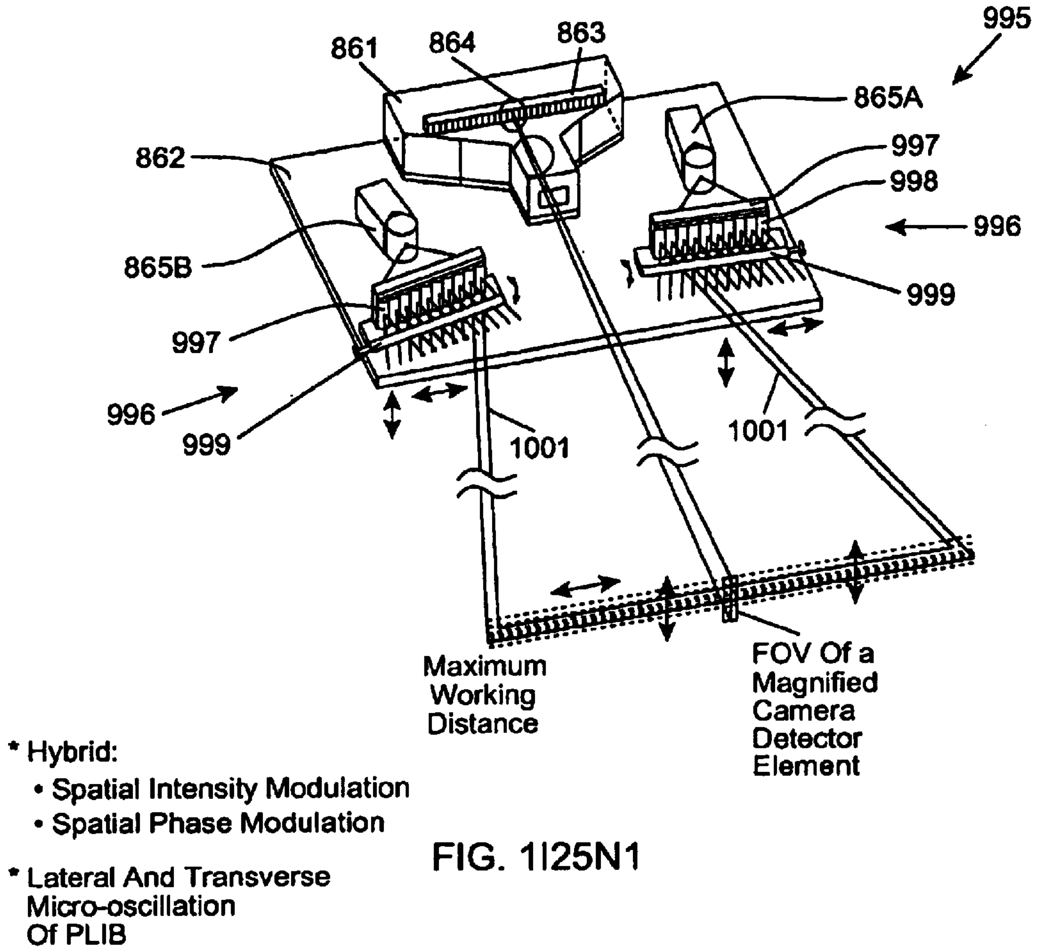
FIG. 1I25N1
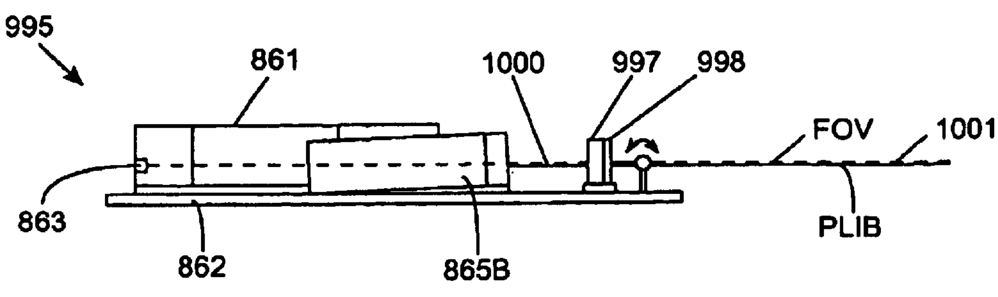
FIG. 1I25N2

Fixed Focal Length
Lens Cases
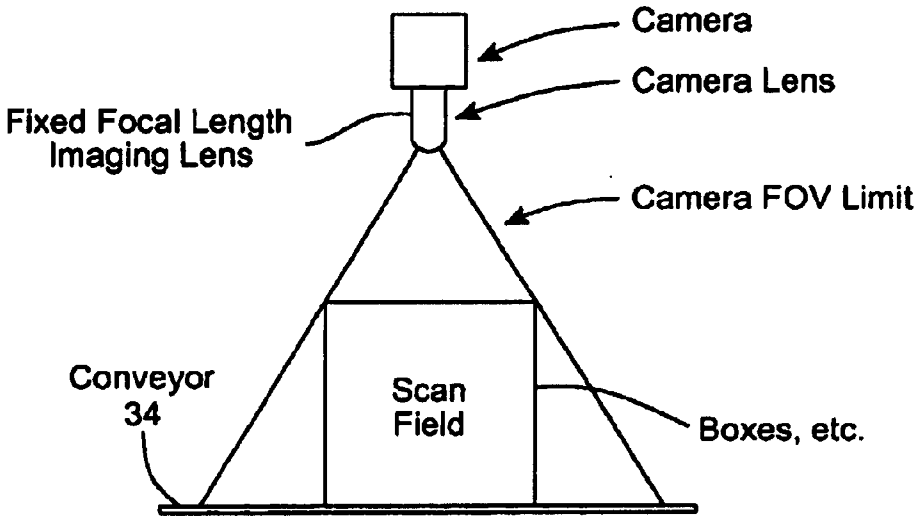
FIG. 1K1
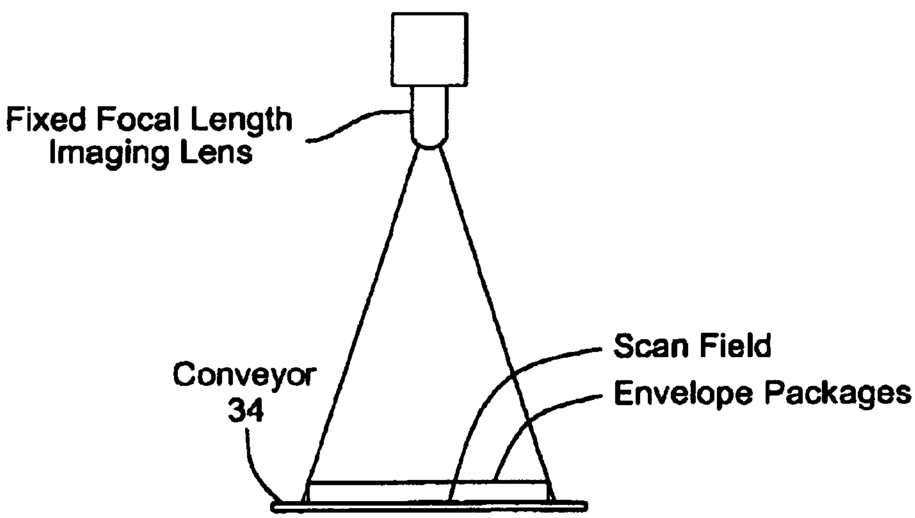
FIG. 1K2

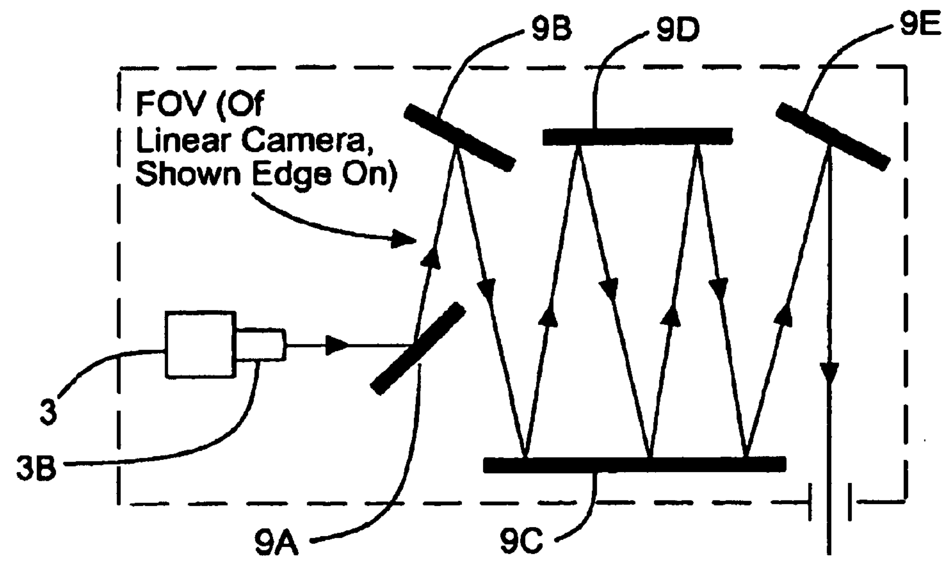
FIG. 1L1
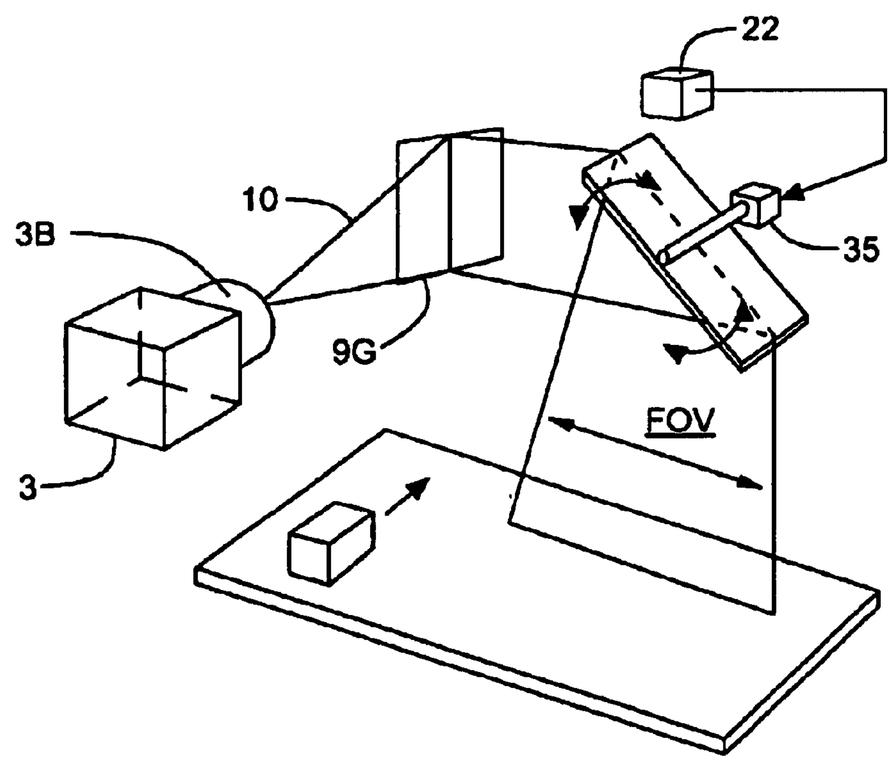
FIG. 1L2

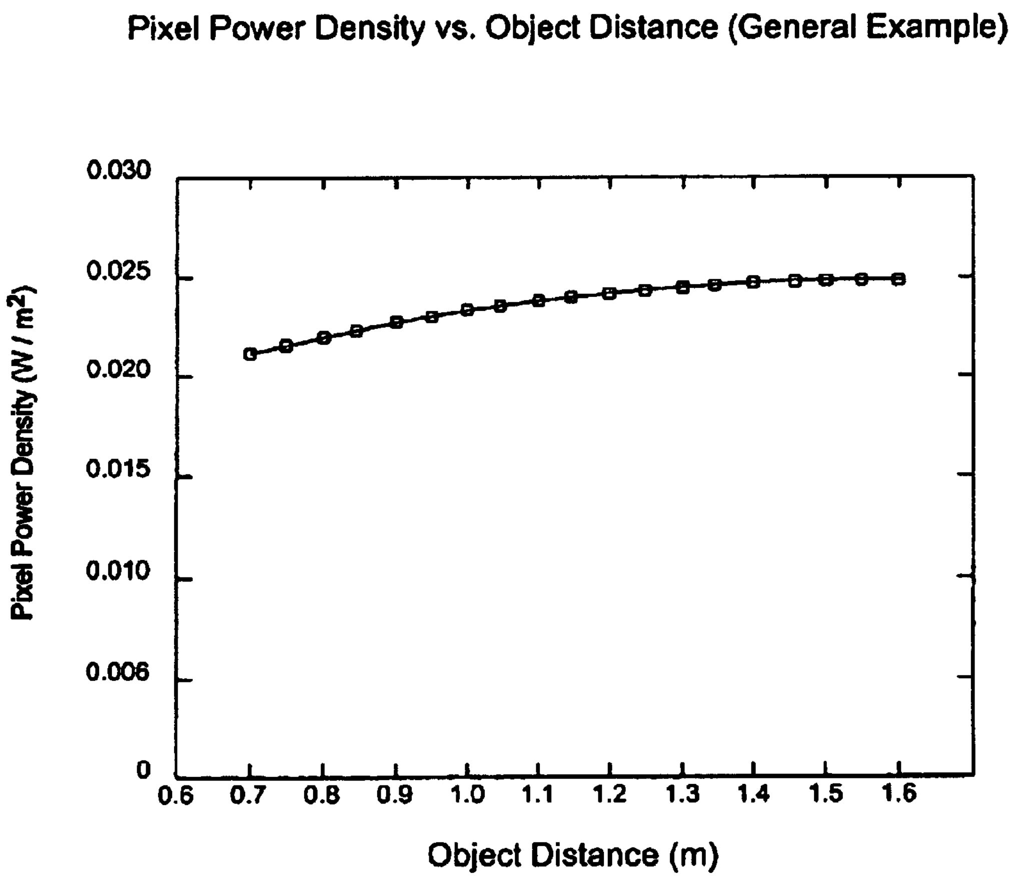
FIG. 1M1

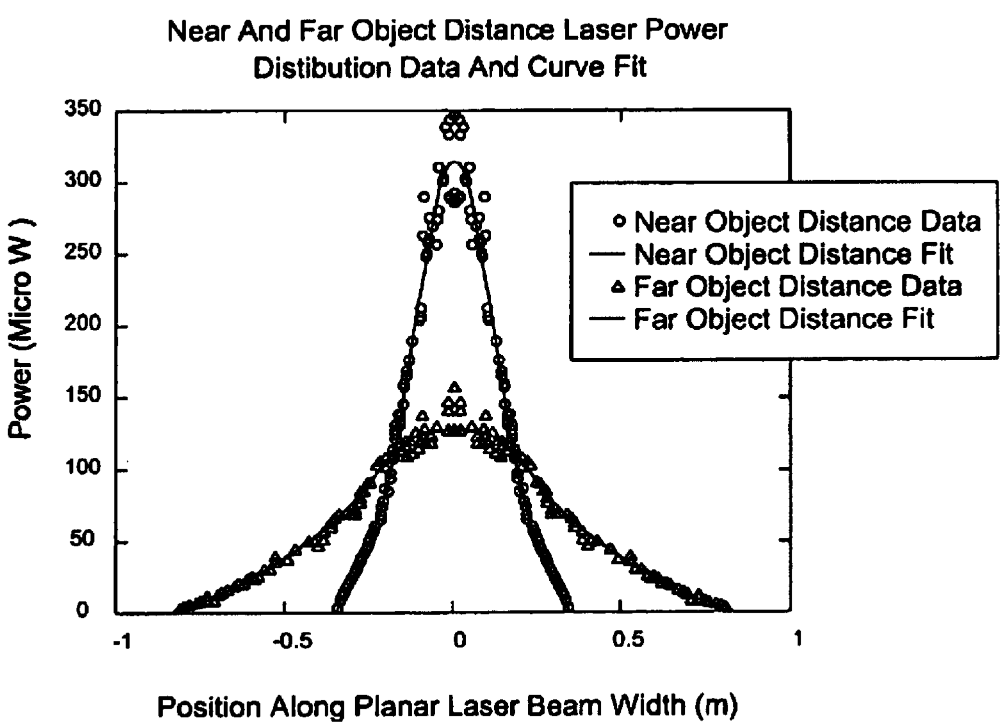
FIG. 1M2

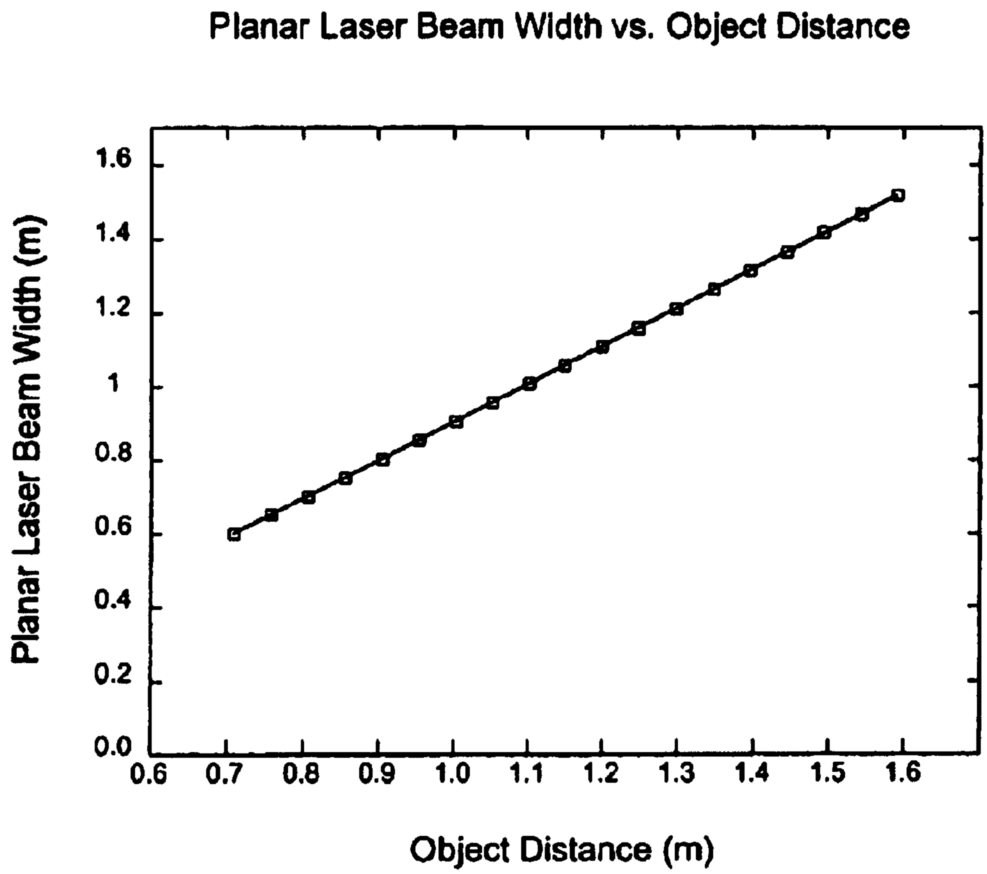
FIG. 1M3

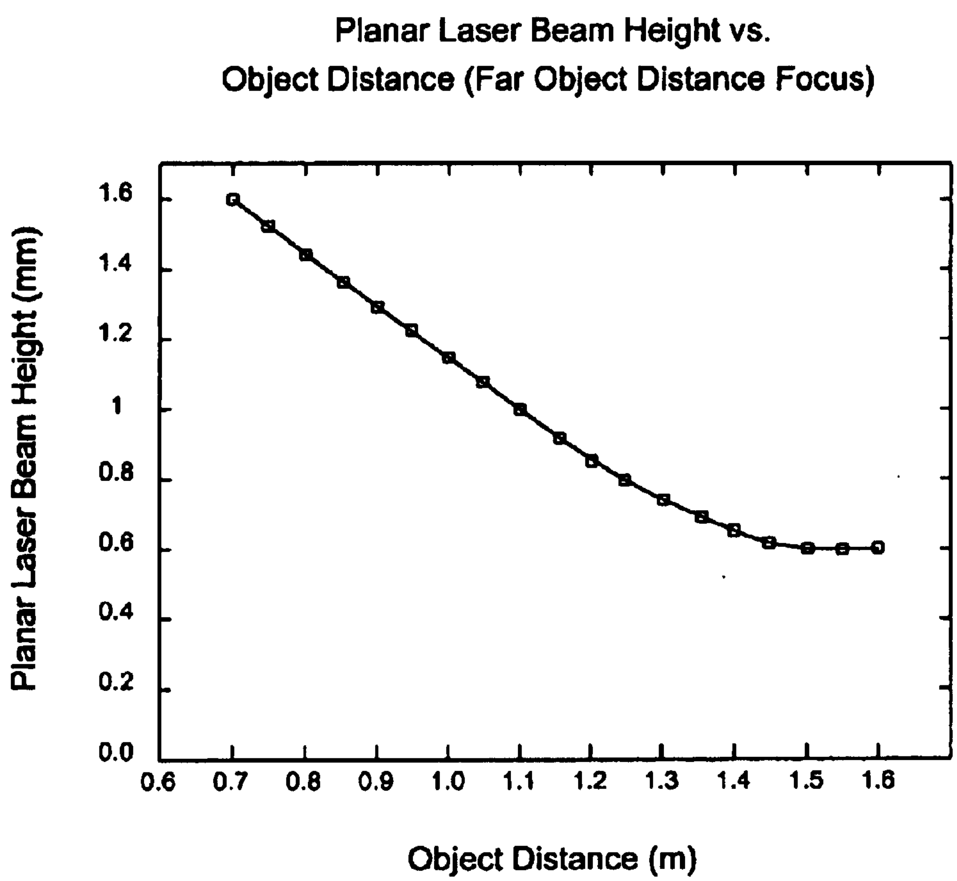
FIG. 1M4

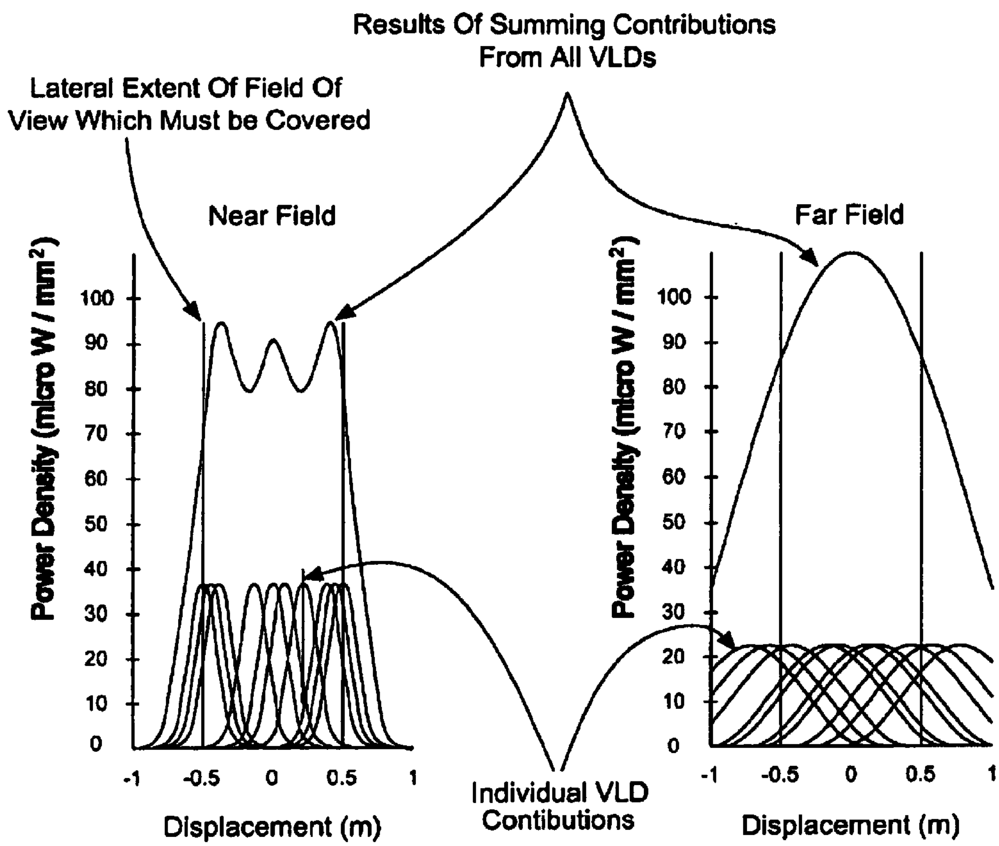
FIG. 1P1
FIG. 1P2

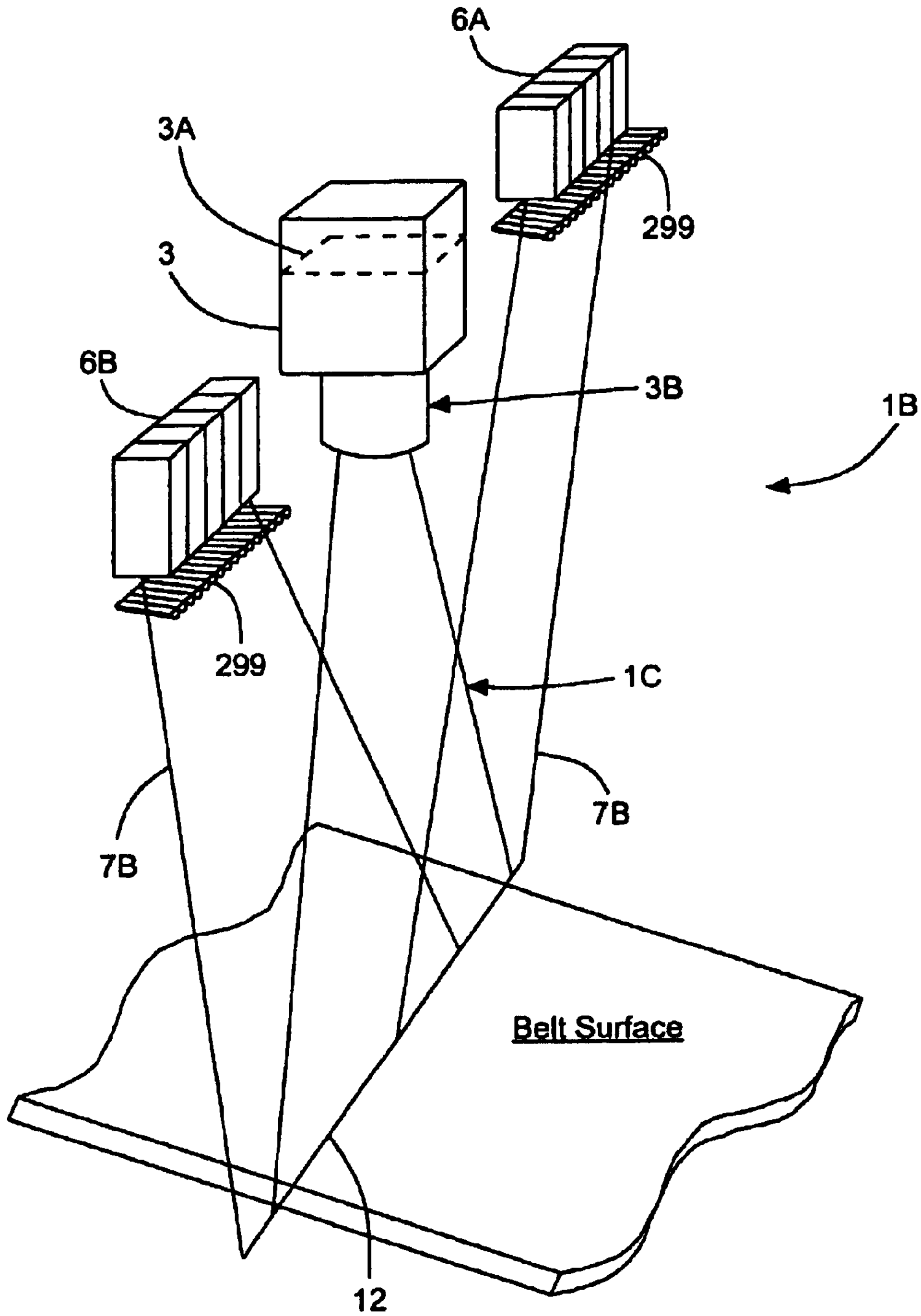
FIG. 1Q1

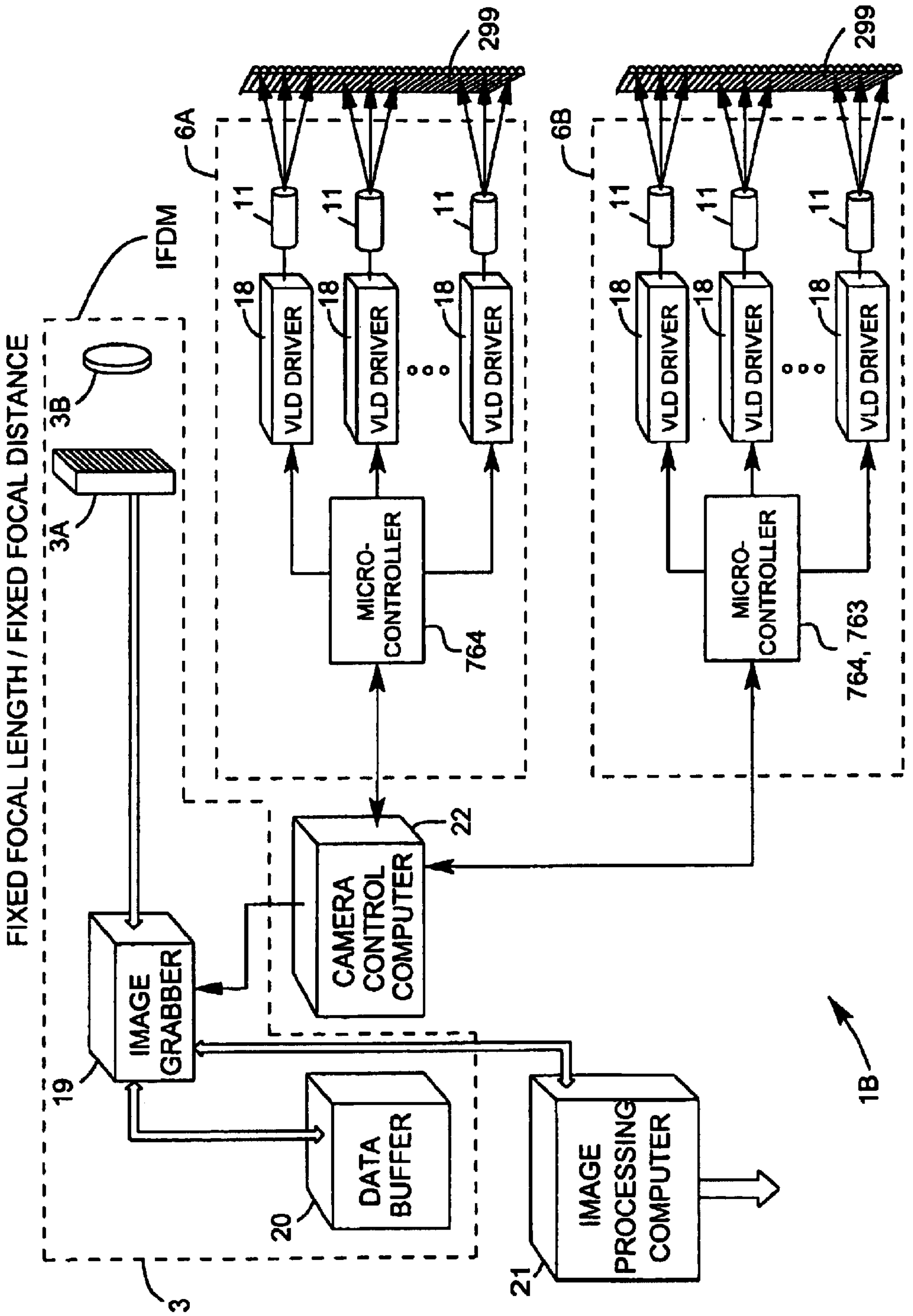
FIG. 1Q2

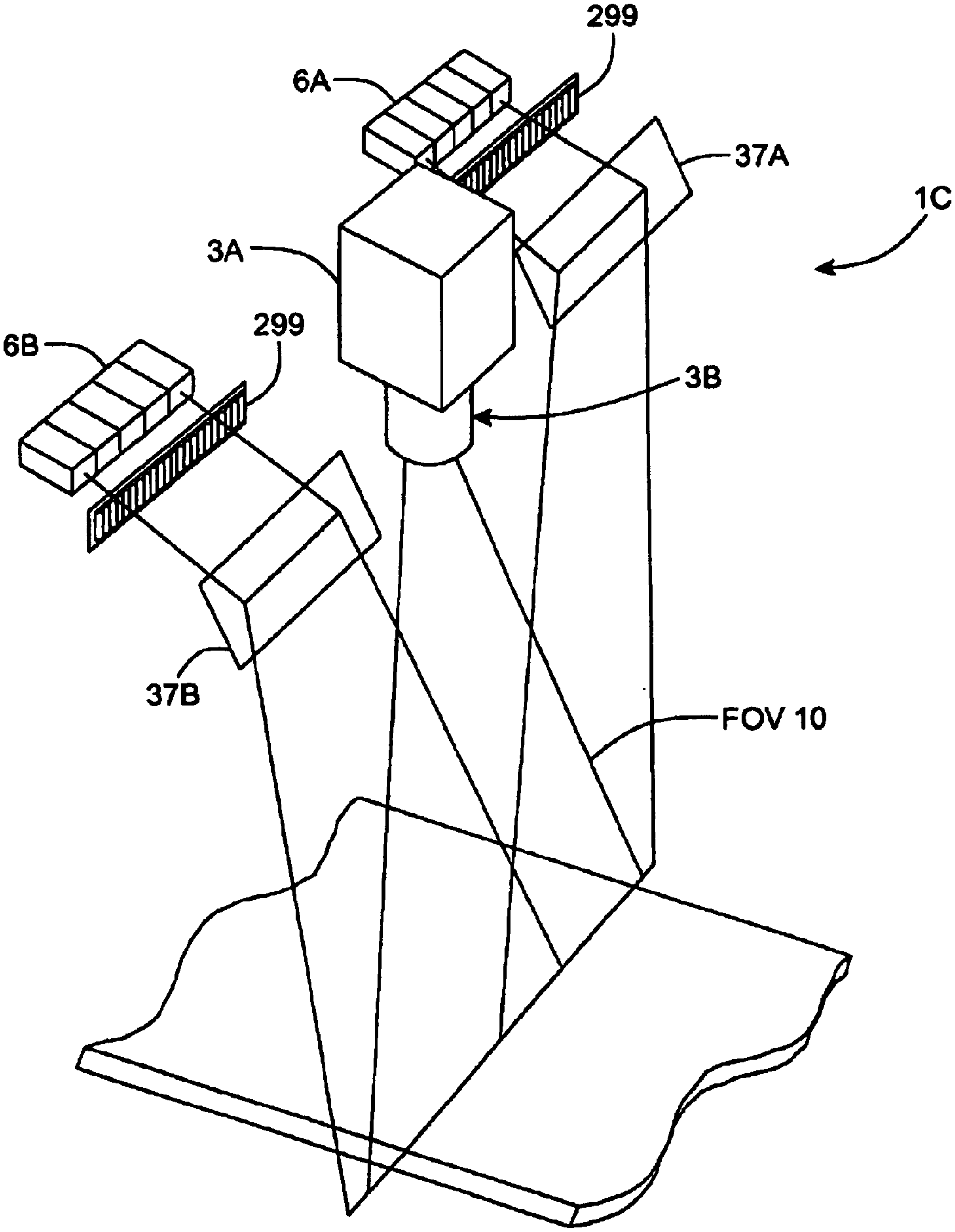
FIG. 1R1

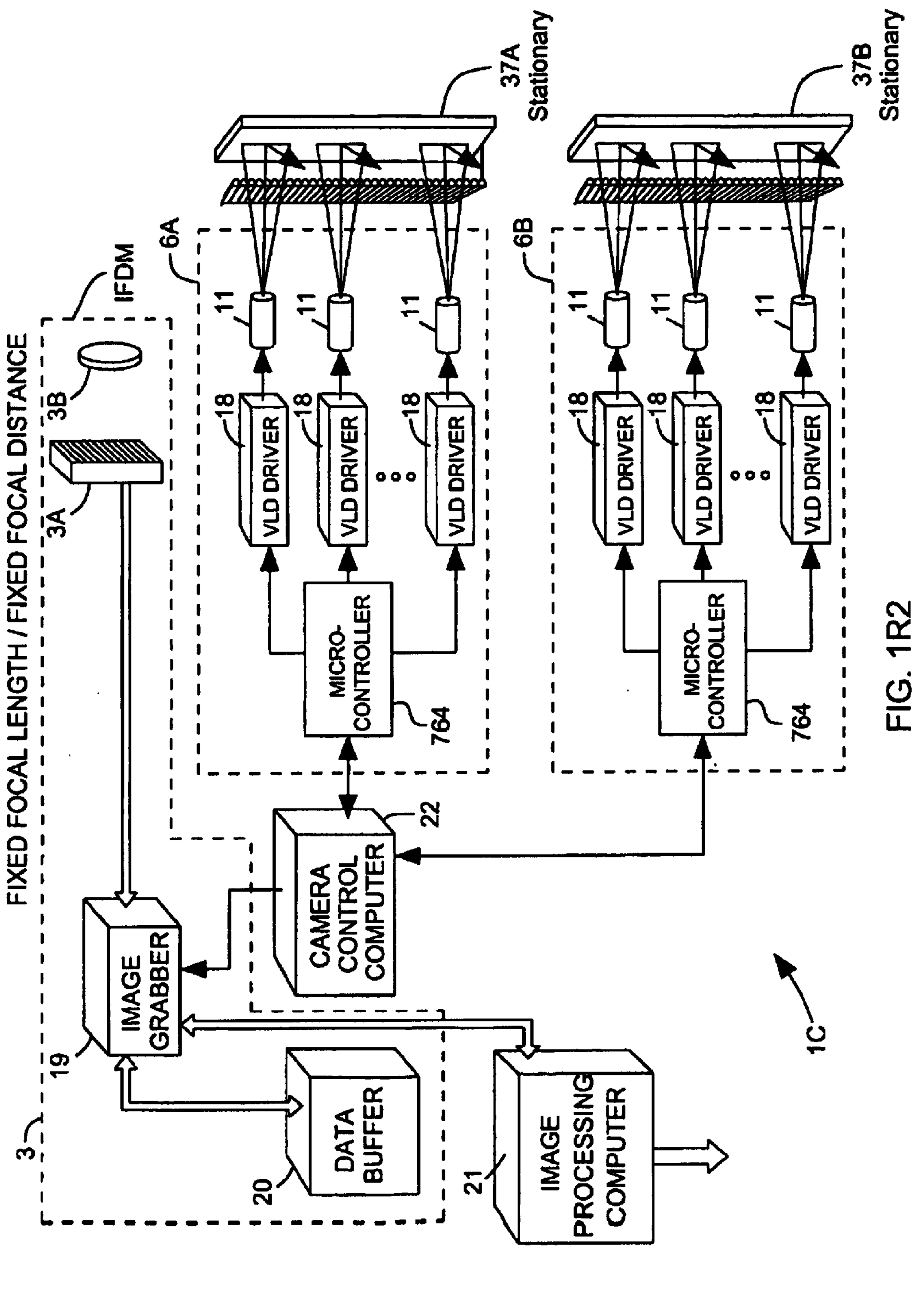
FIG. 1R2

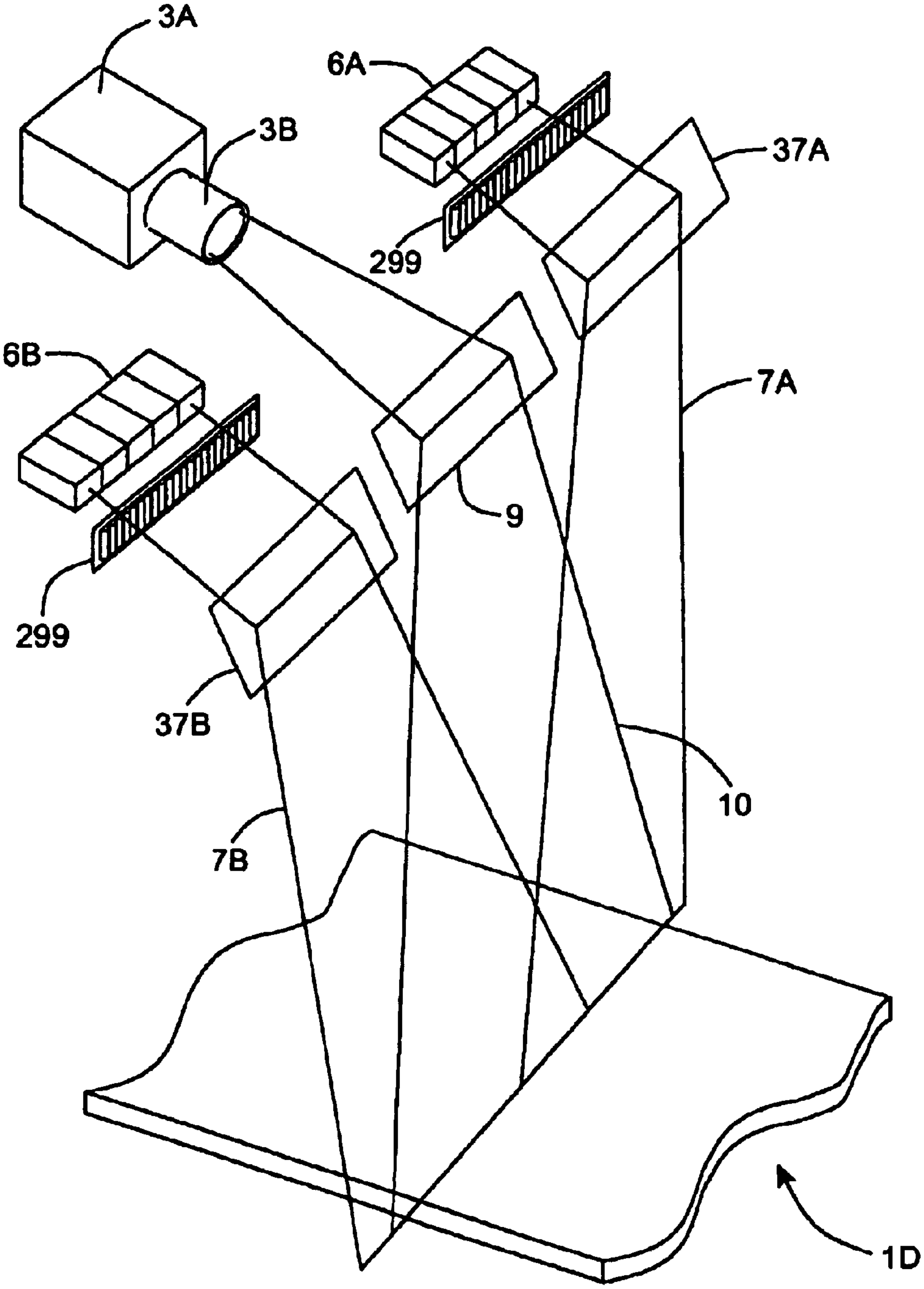
FIG. 1S1

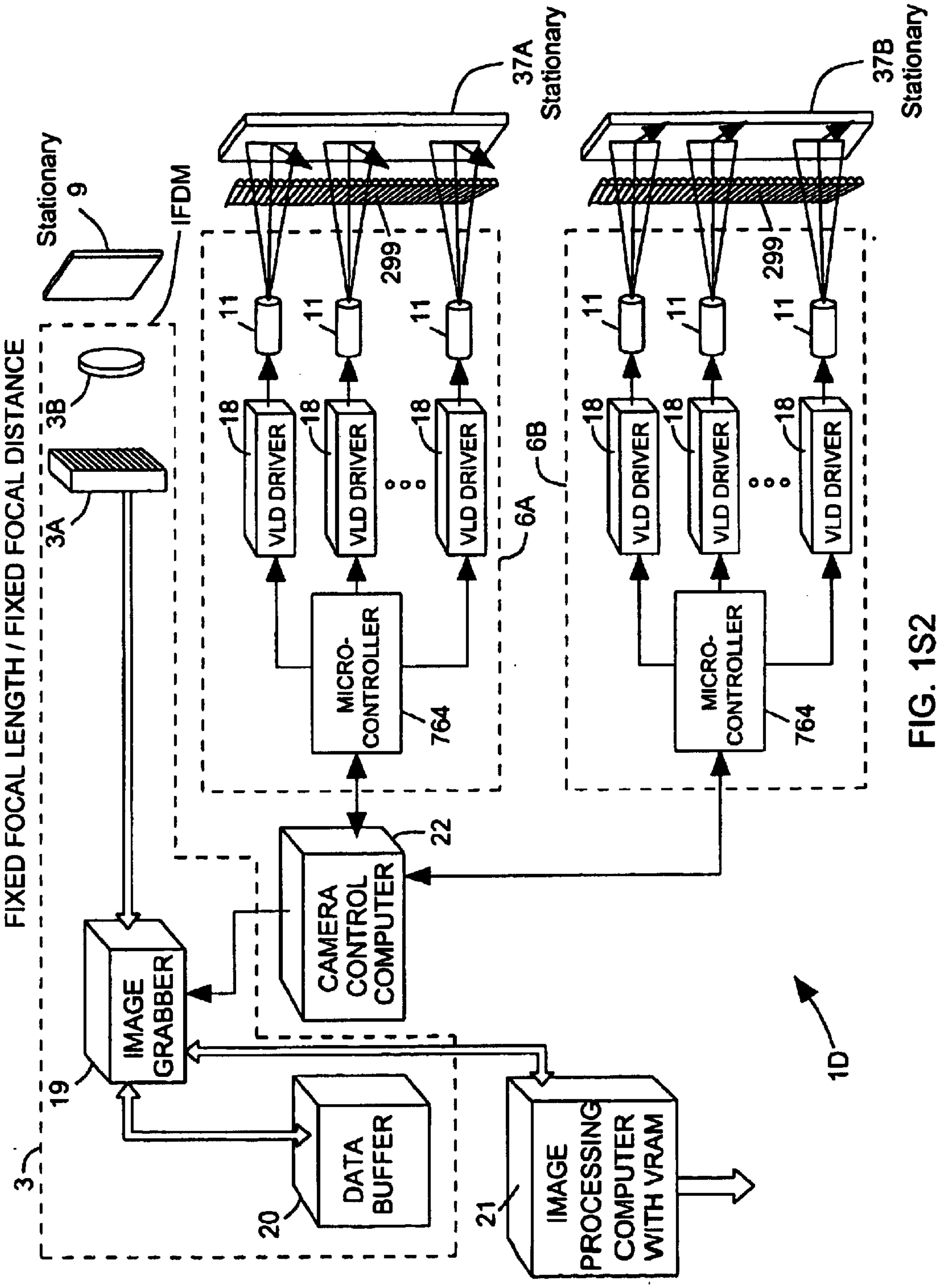
FIG. 1S2

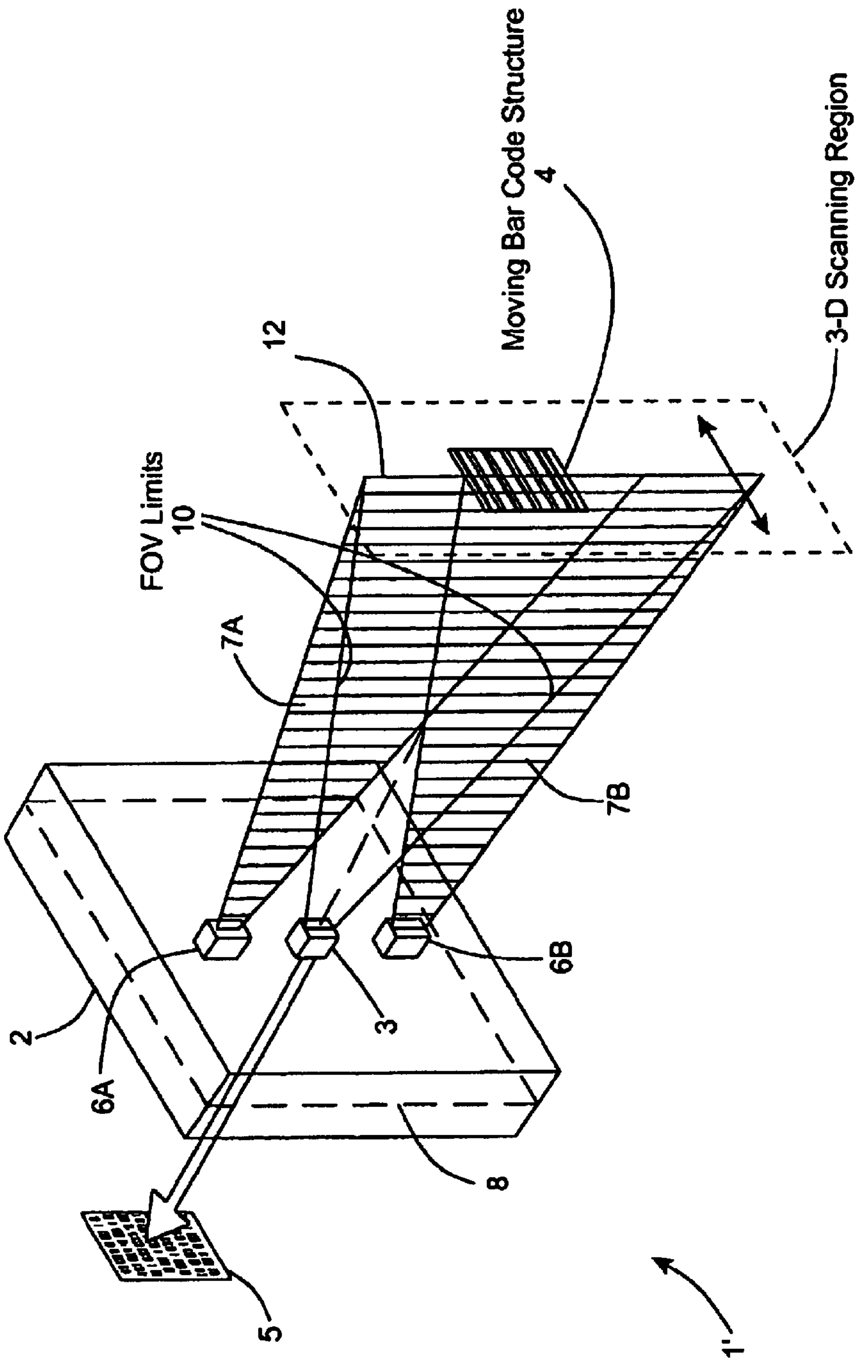
FIG. 1V1

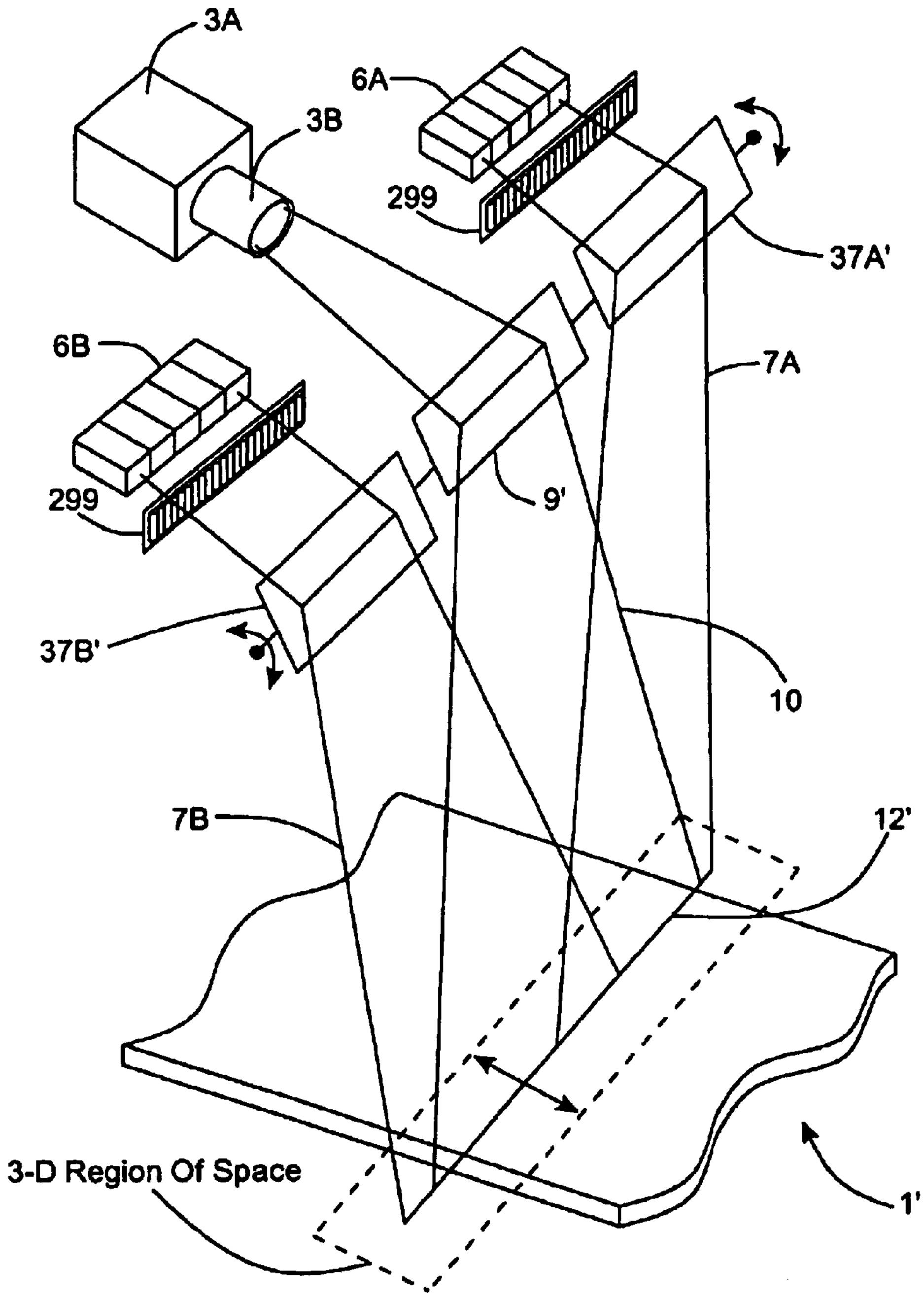
FIG. 1V2

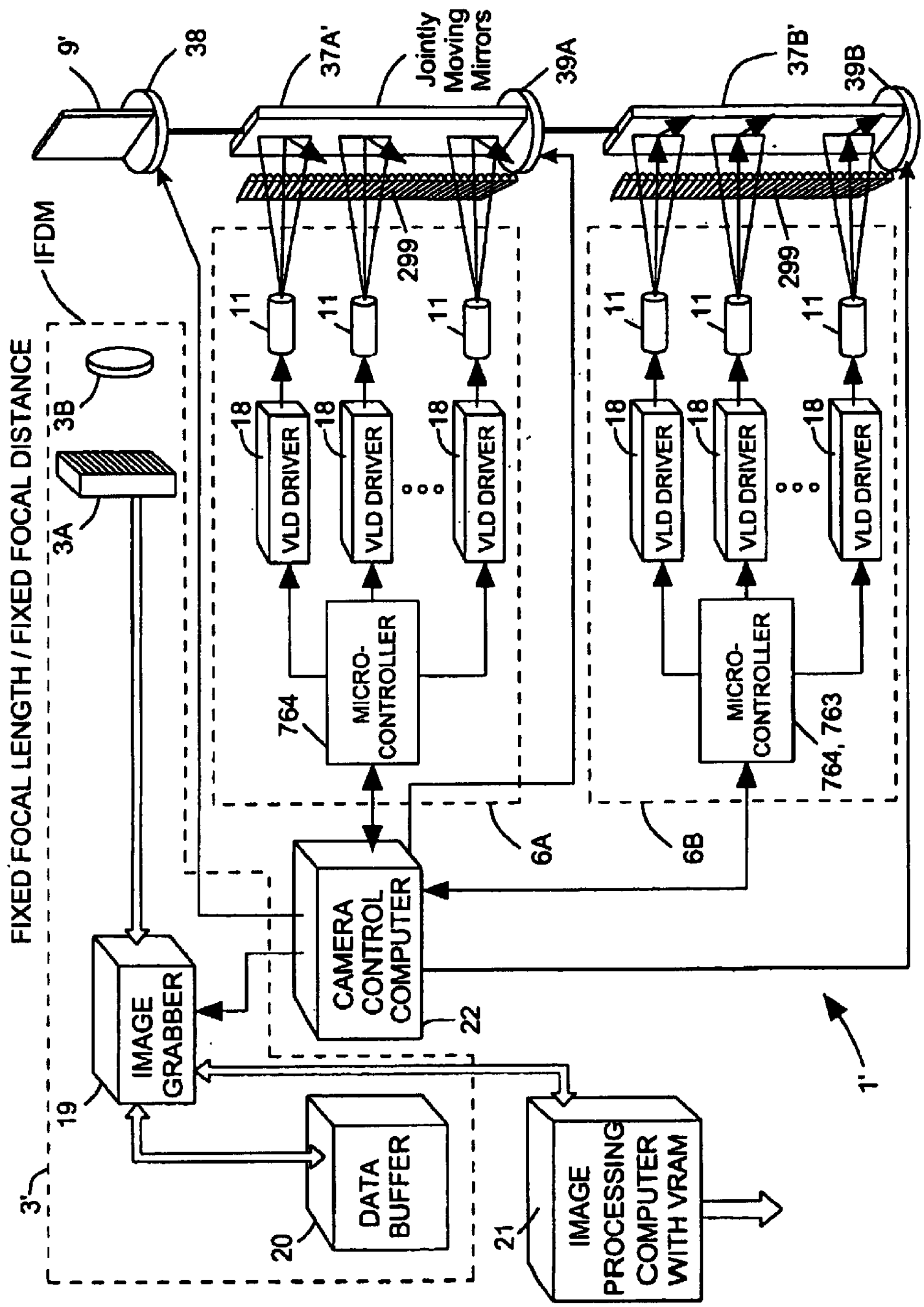
FIG. 1V3

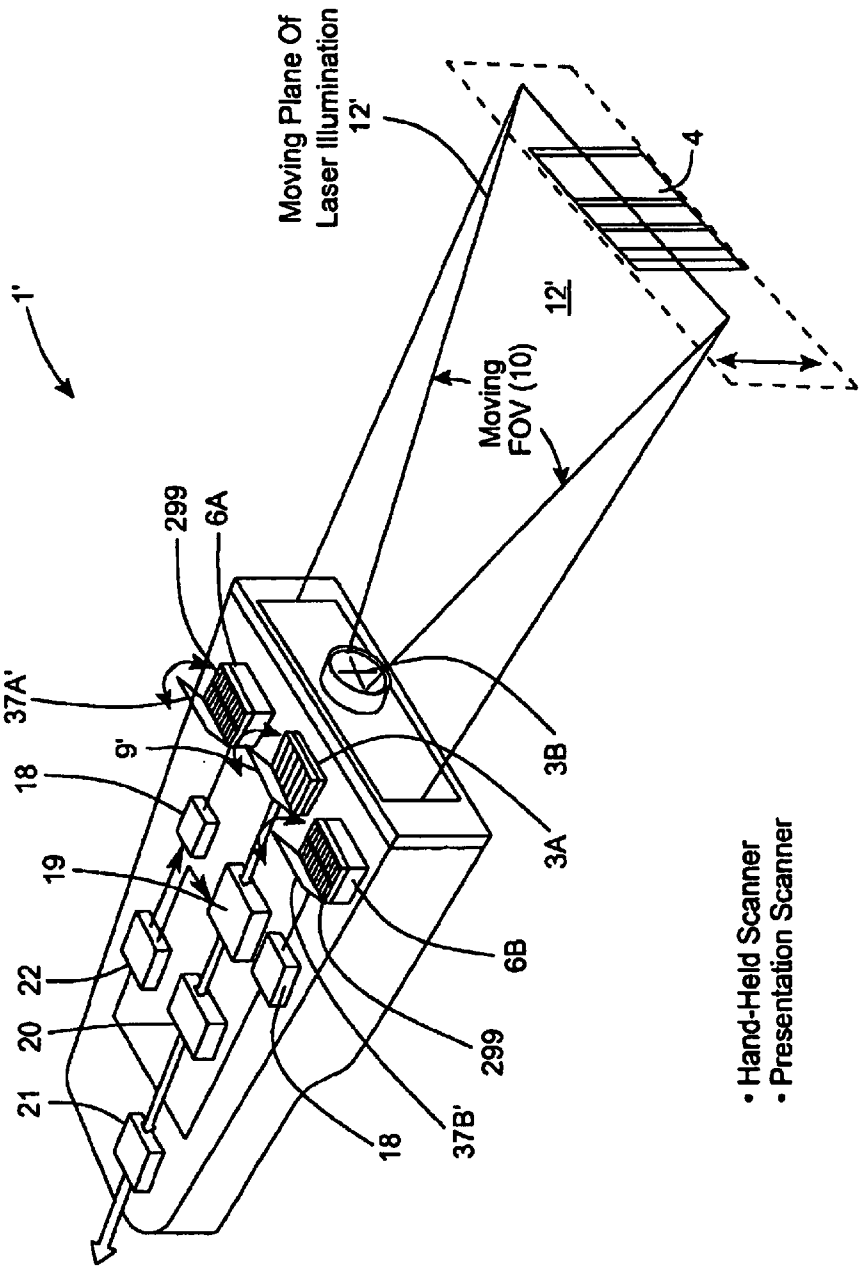
FIG. 1V4

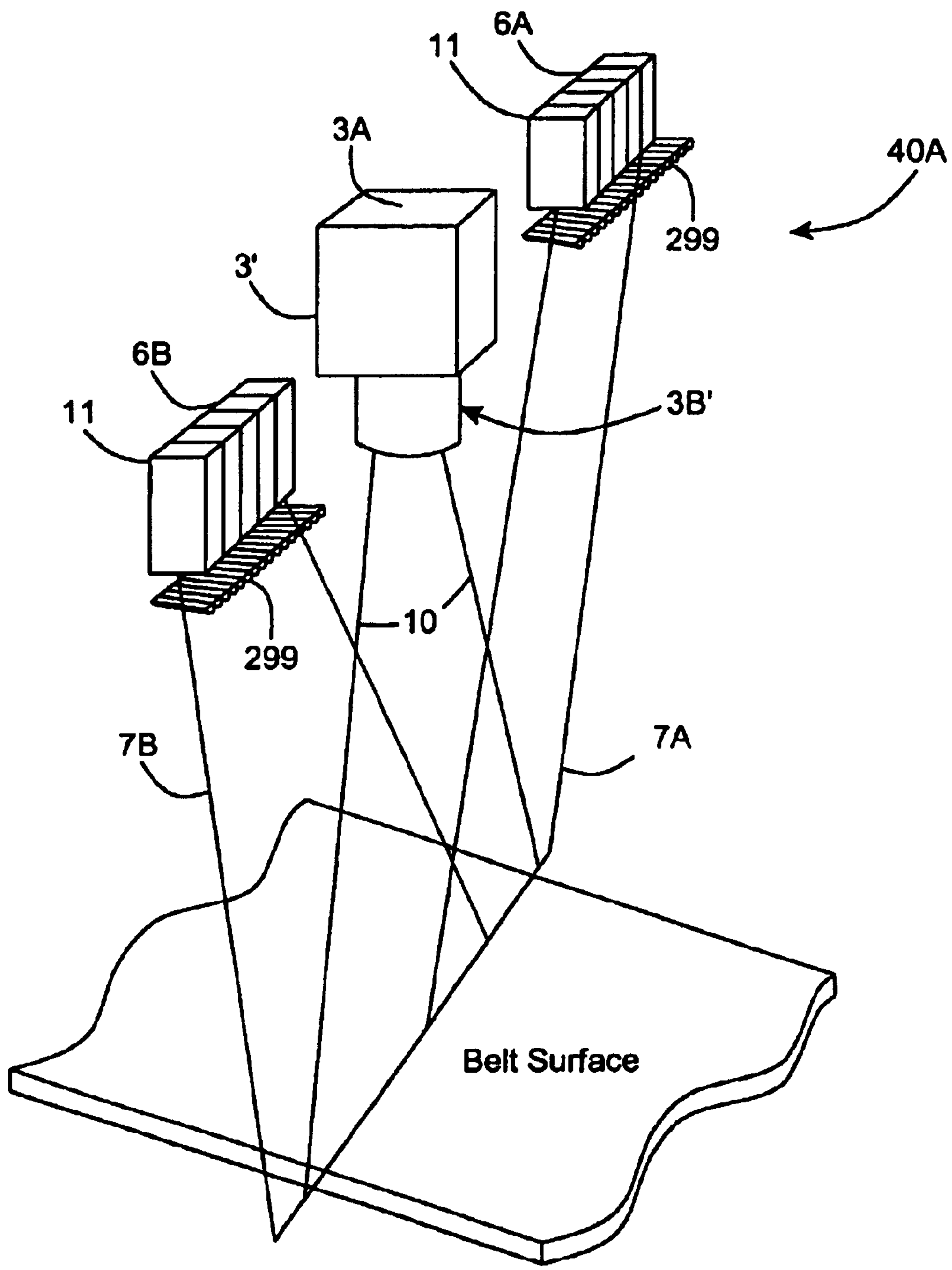
FIG. 2B1

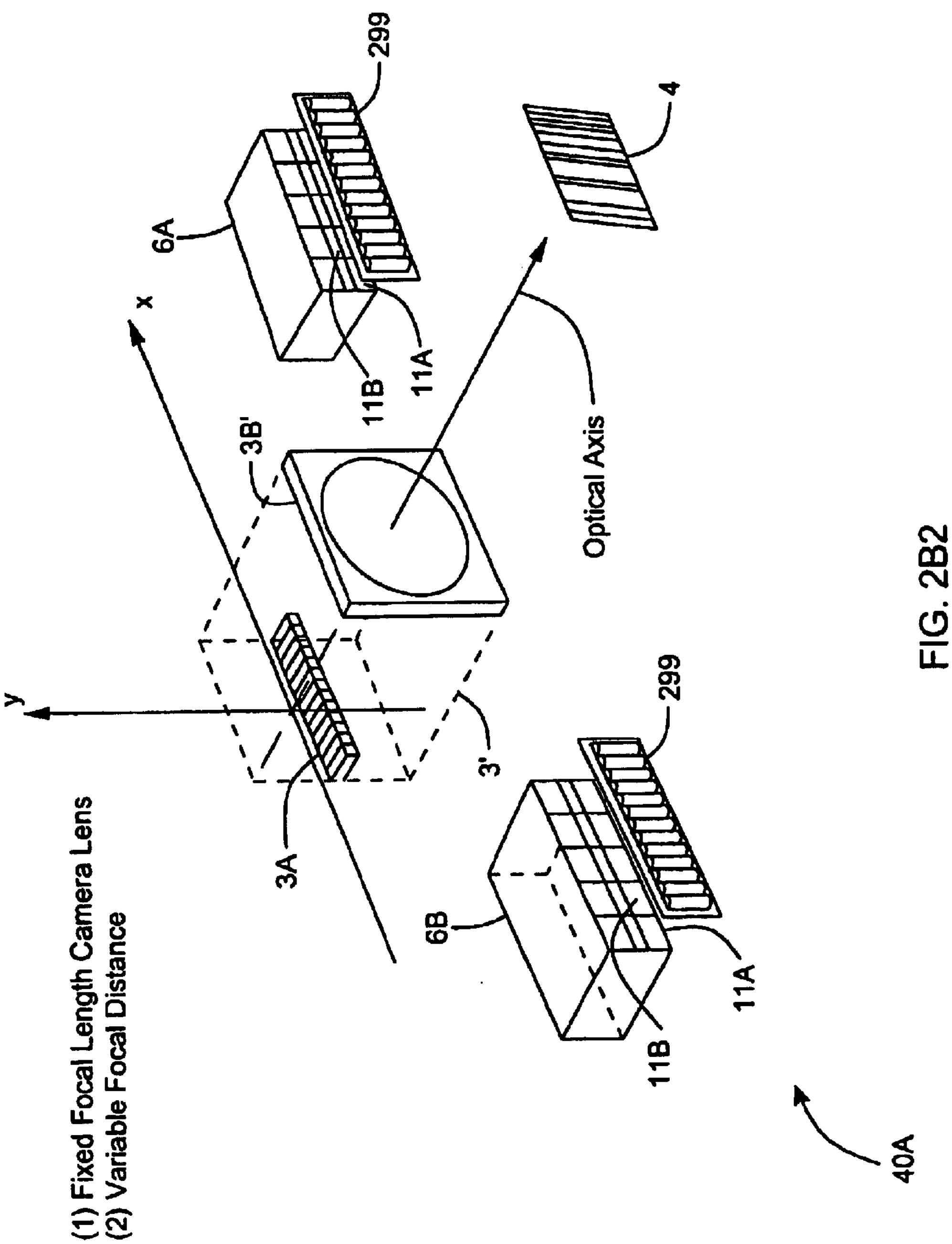
FIG. 2B2

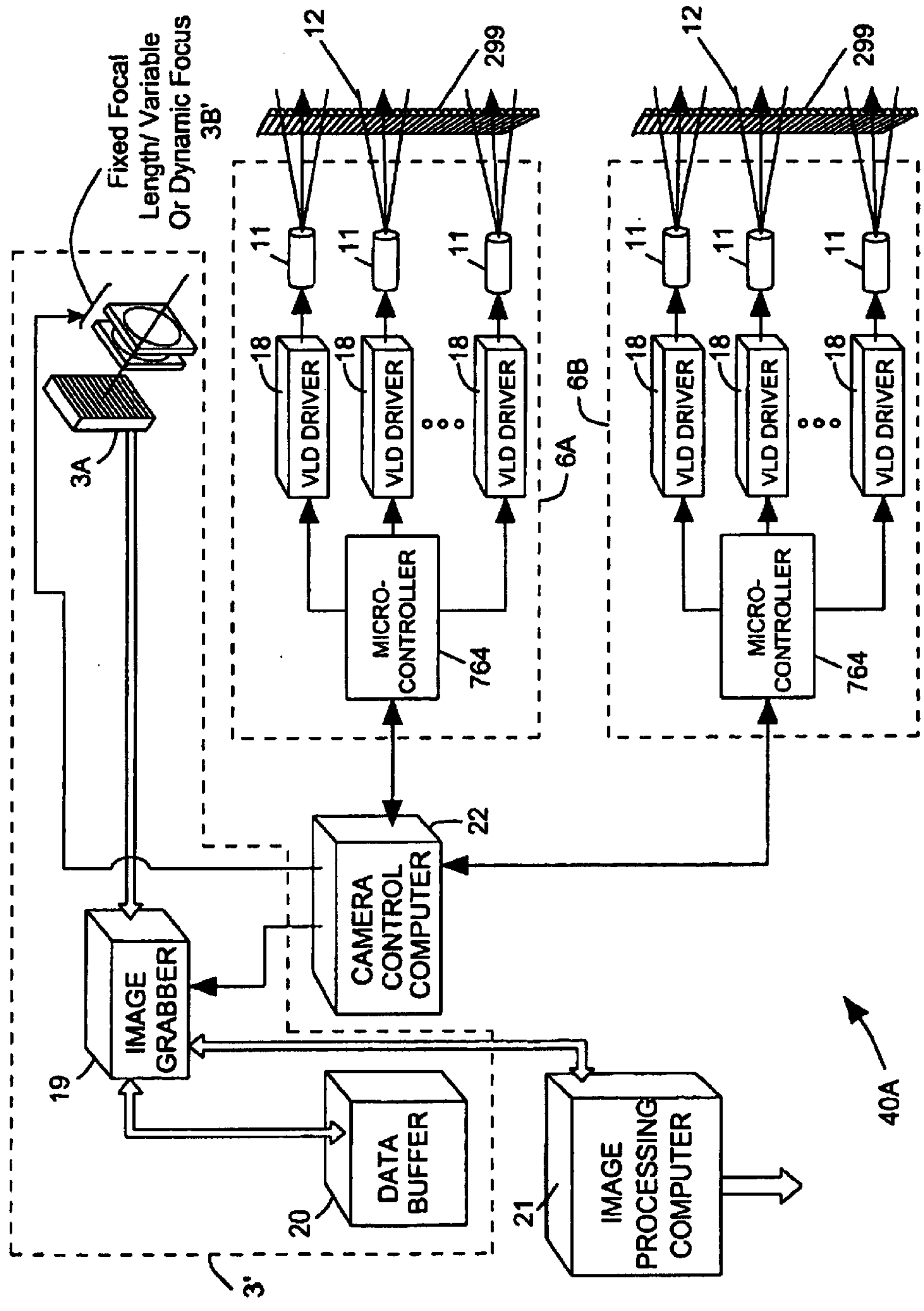
FIG. 2C1

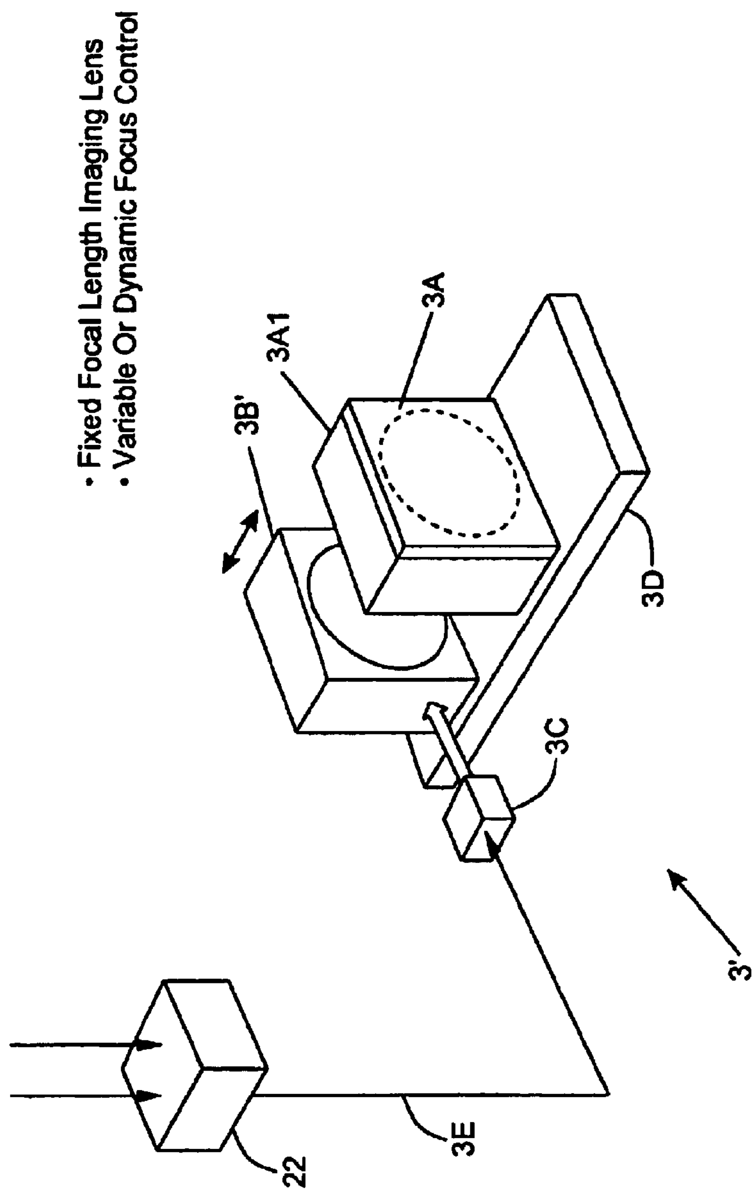
FIG. 2C2

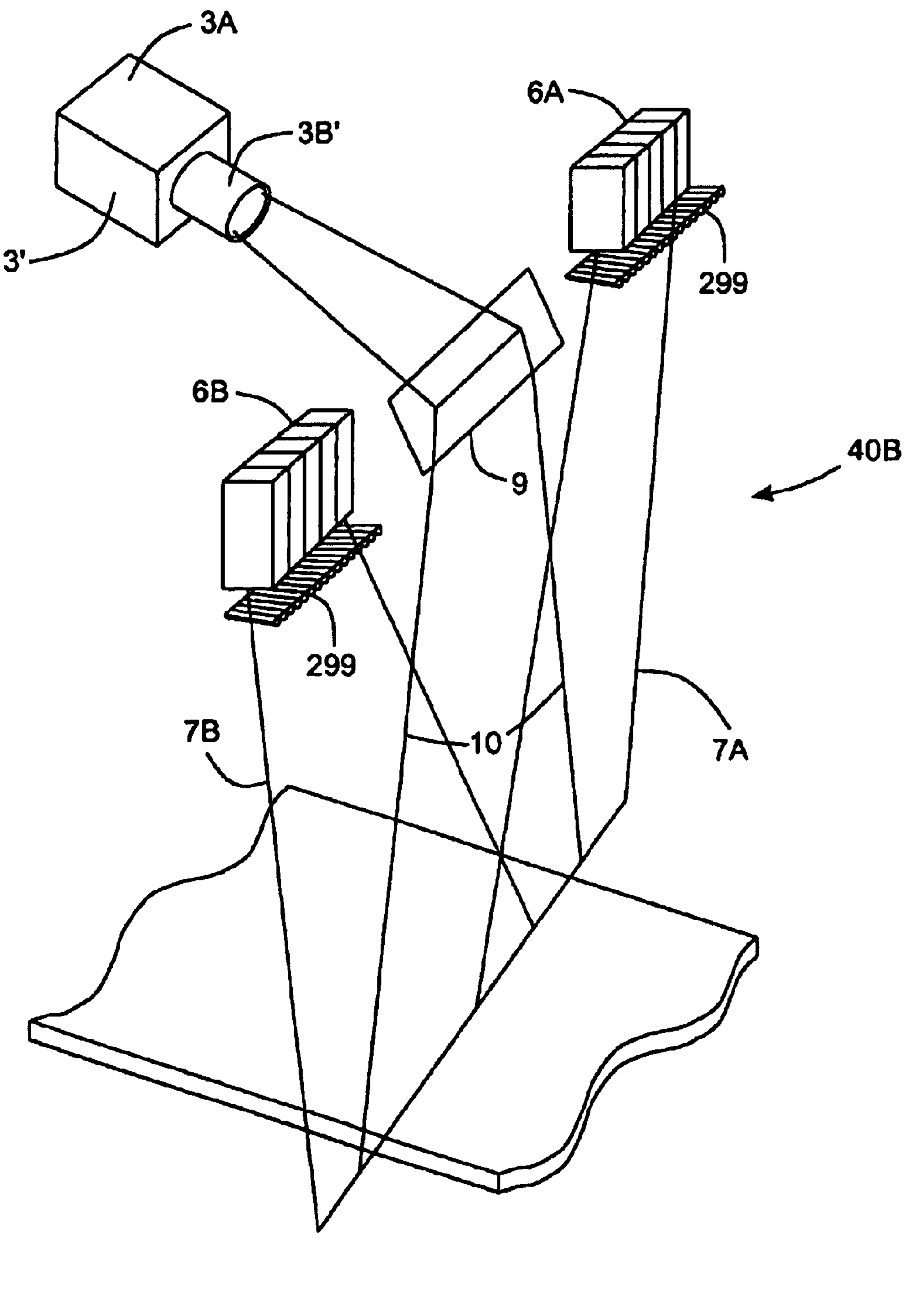
FIG. 2D1

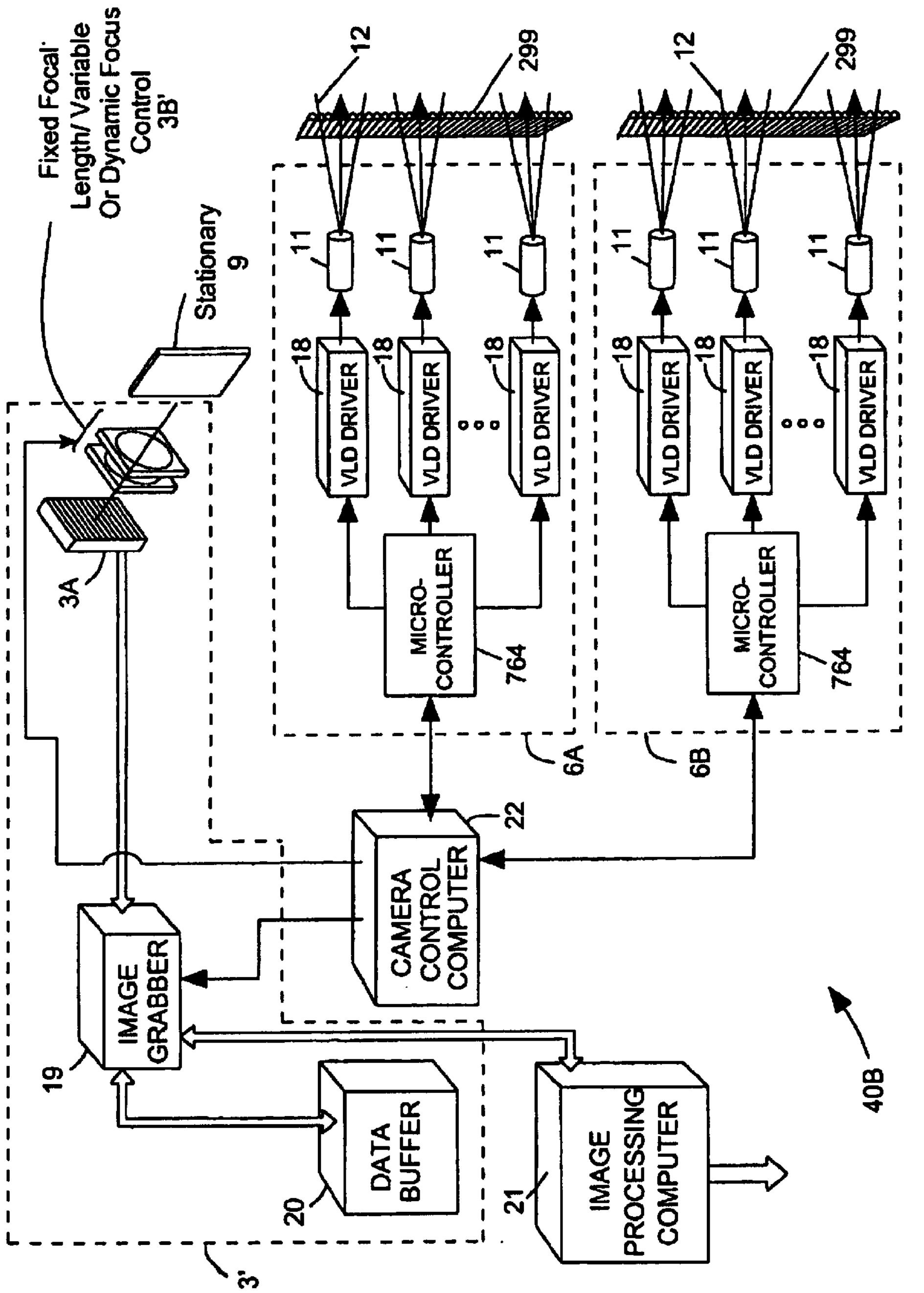
FIG. 2D2

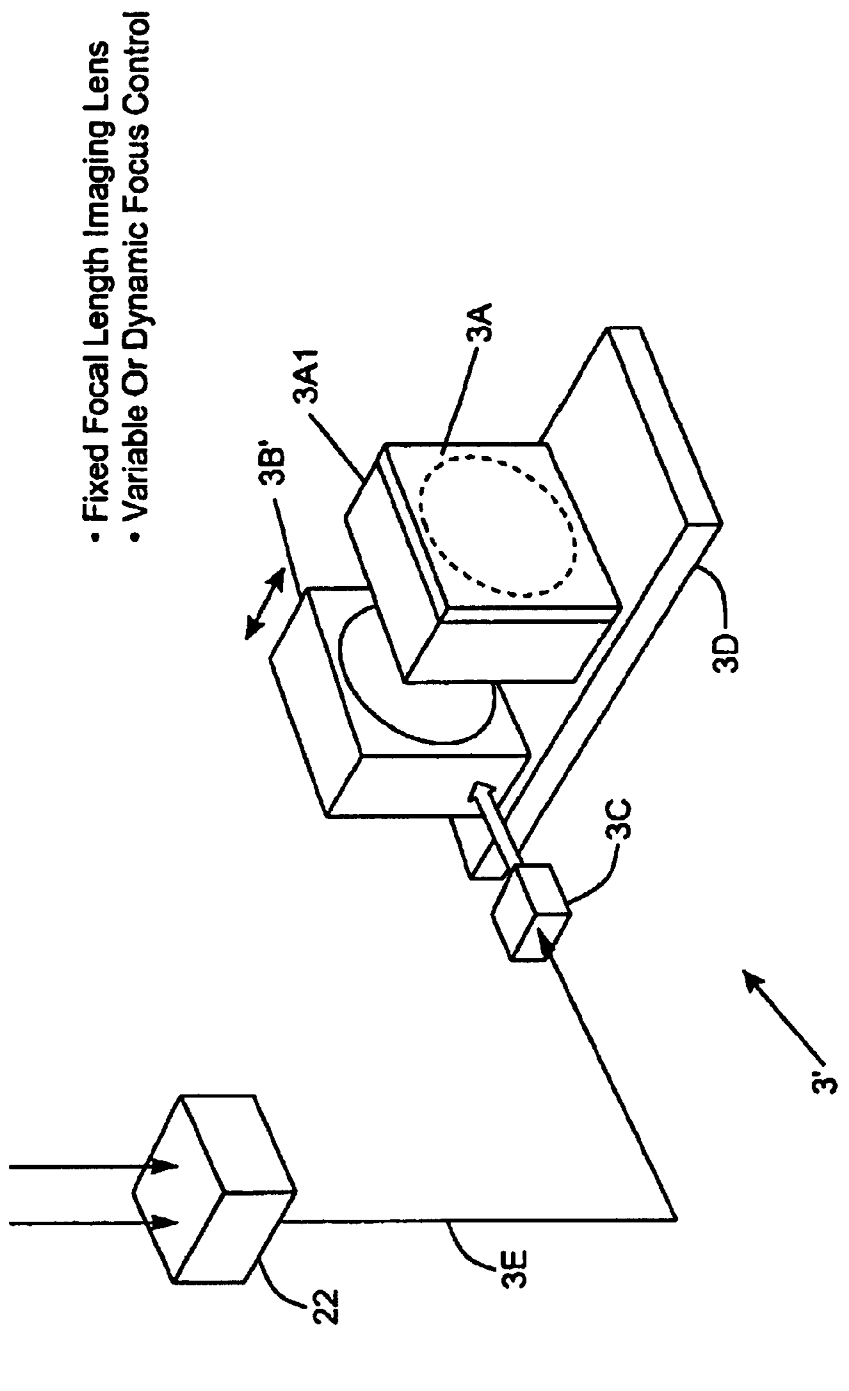
FIG. 2D3

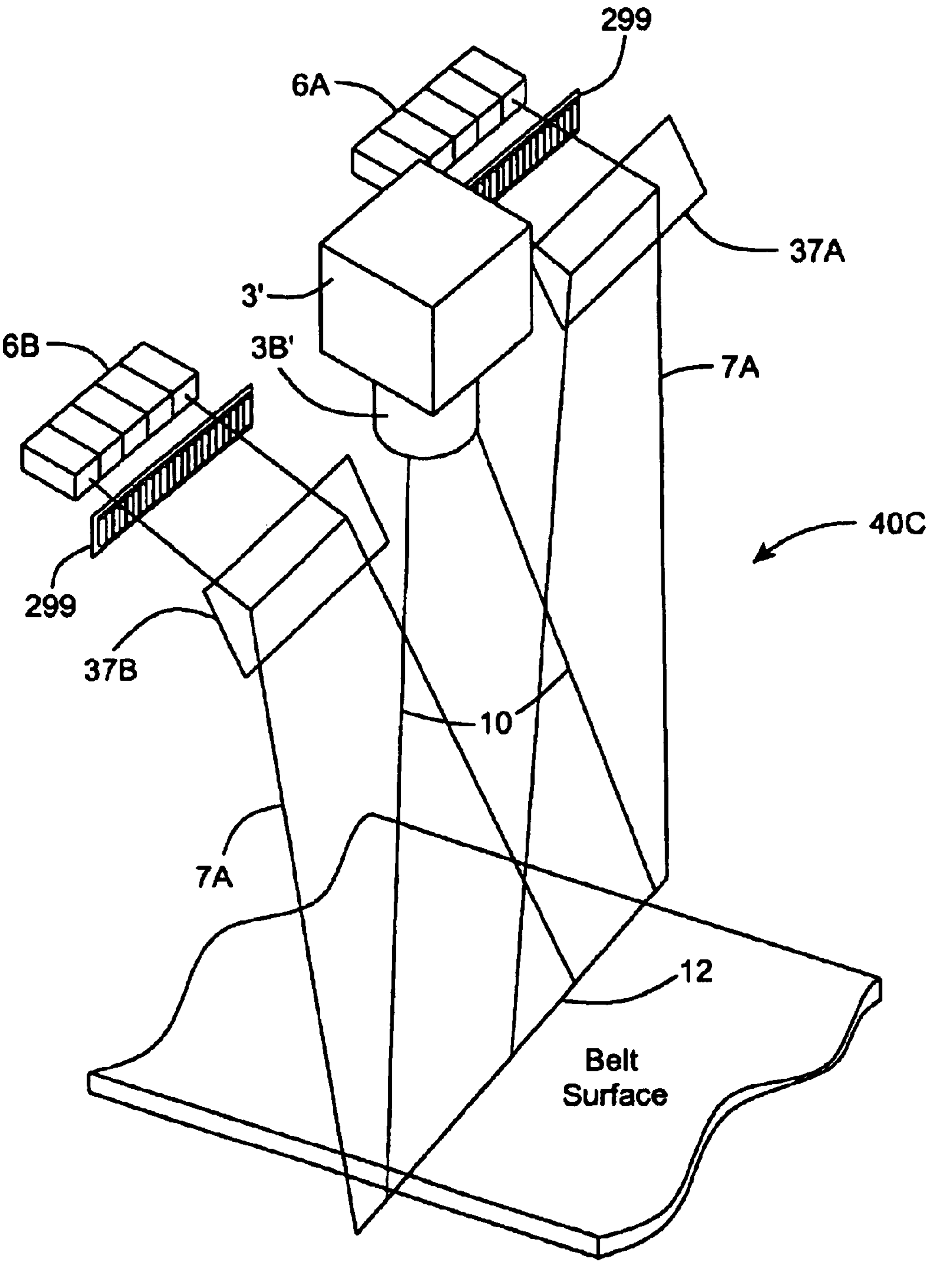
FIG. 2E1

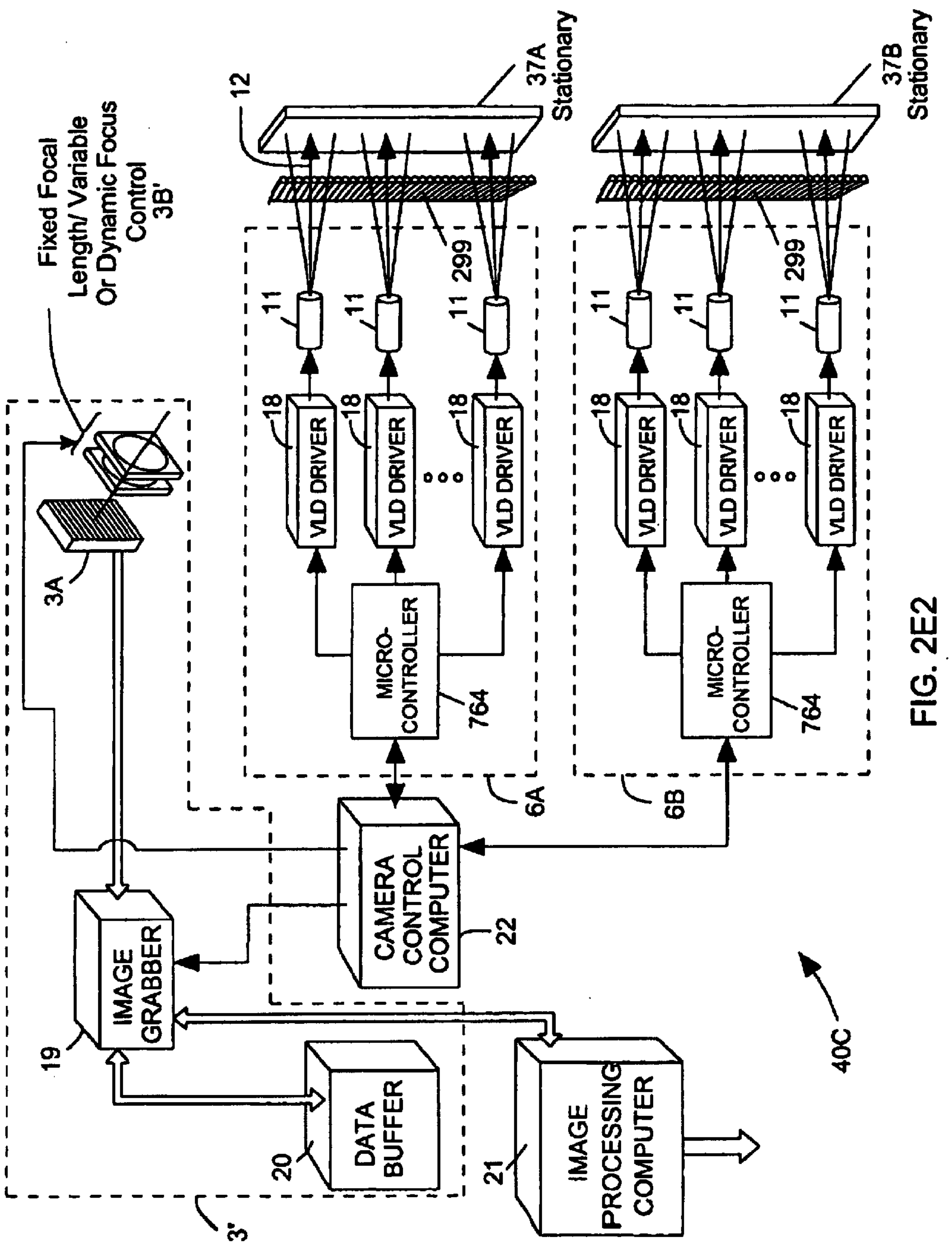
FIG. 2E2

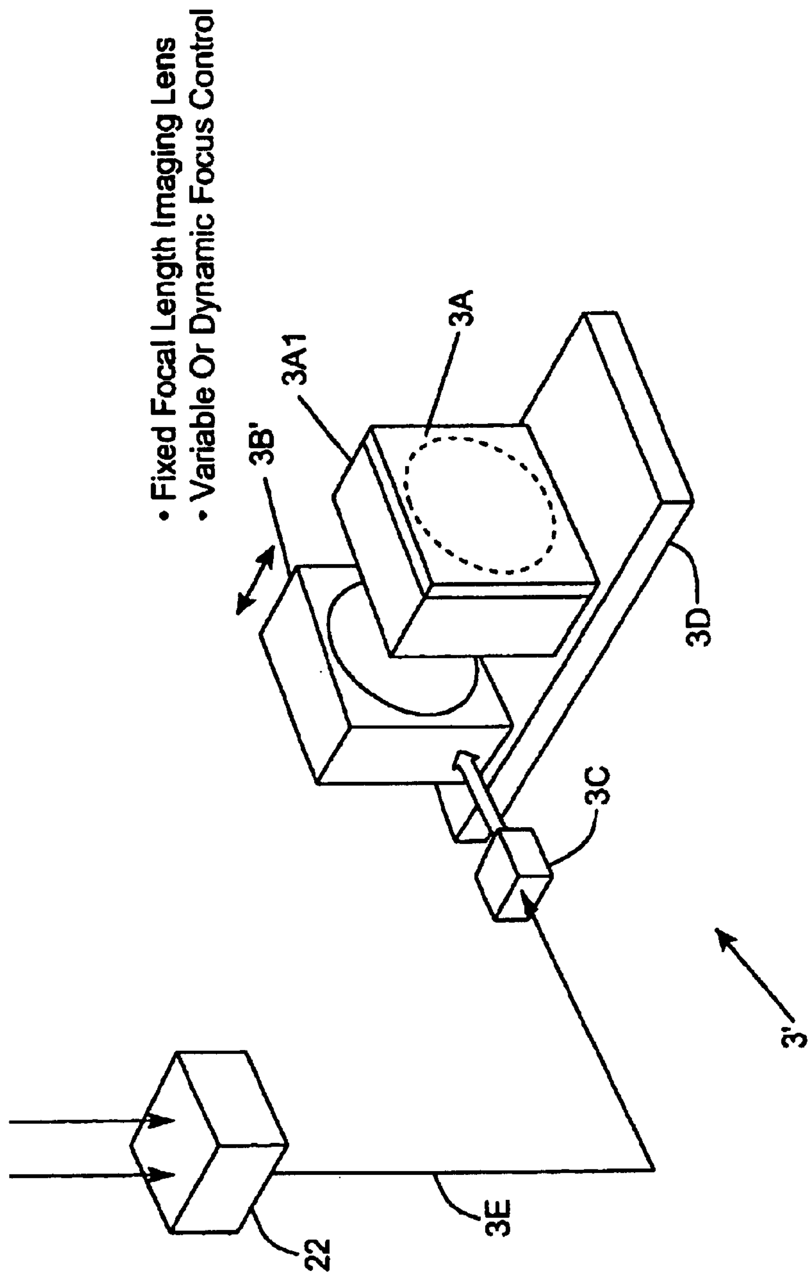
FIG. 2E3

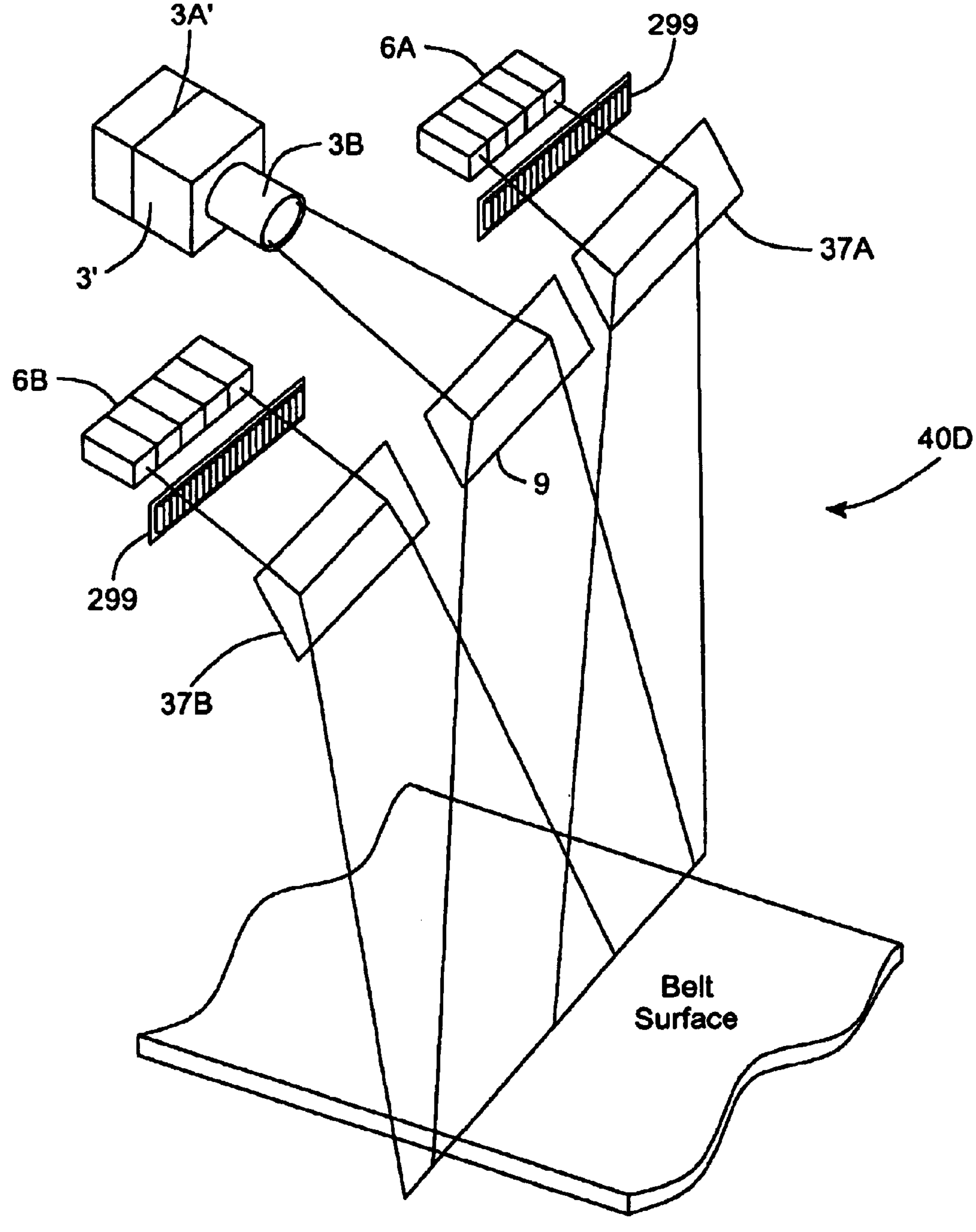
FIG. 2F1

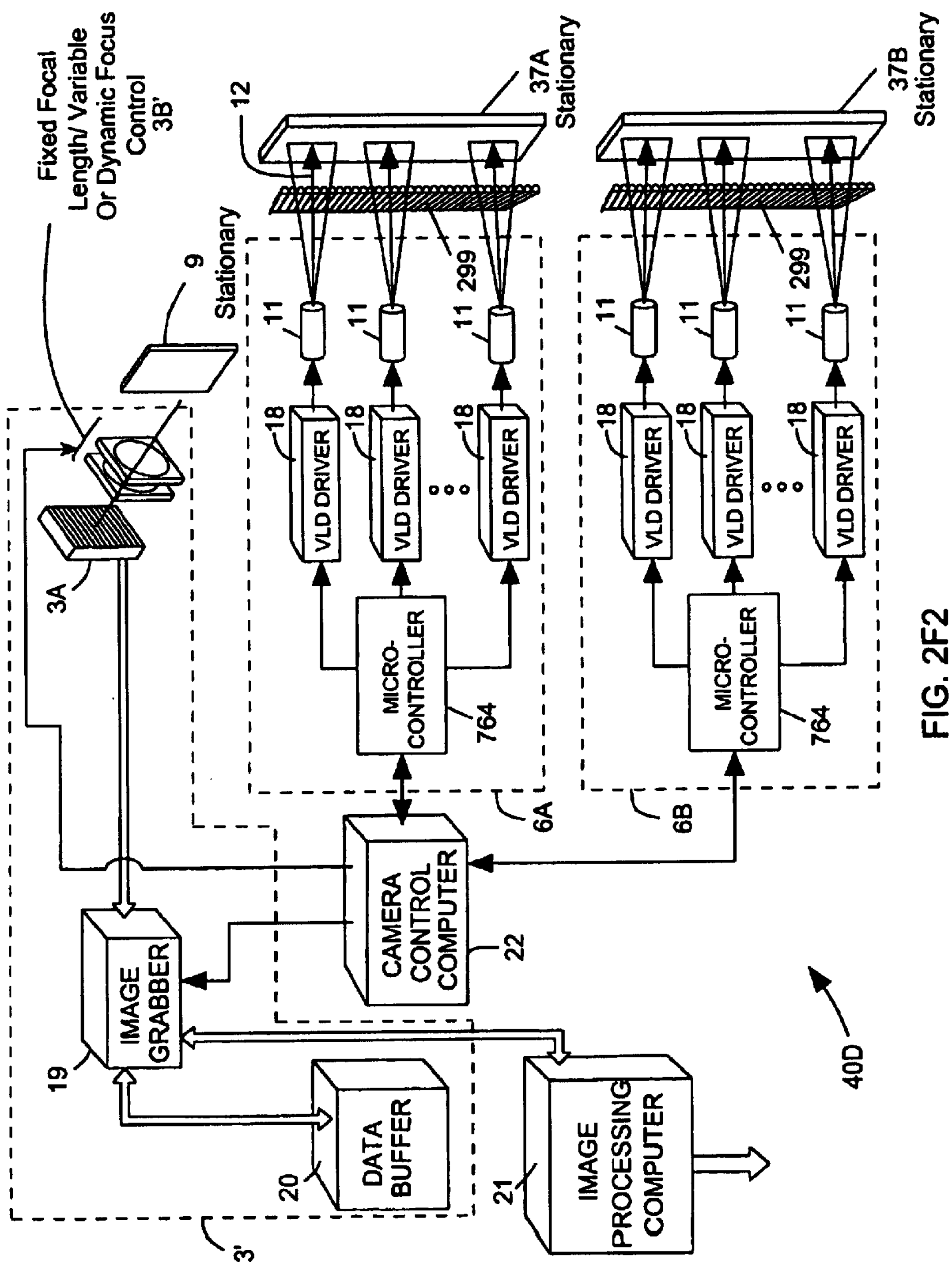
FIG. 2F2

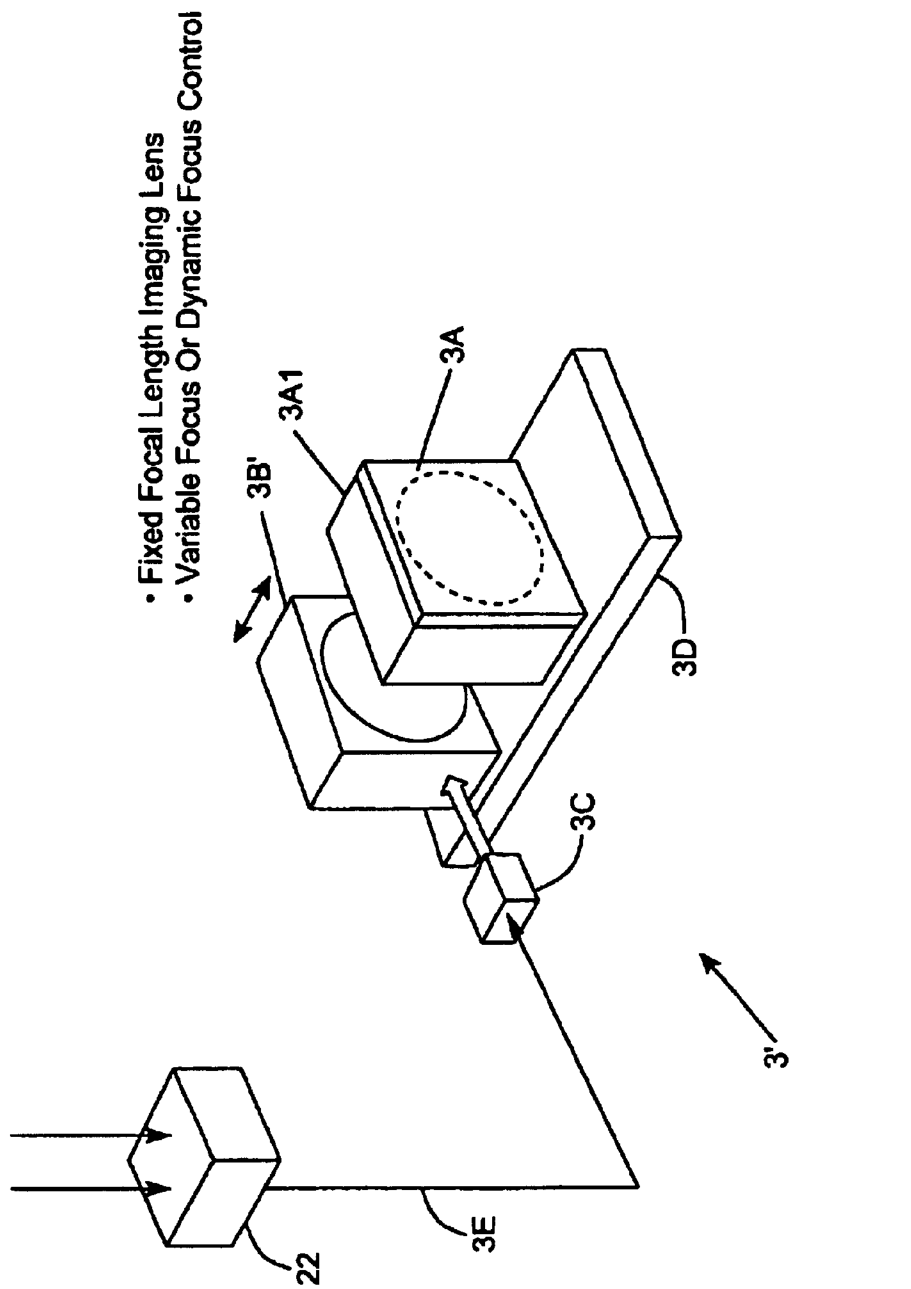
FIG. 2F3

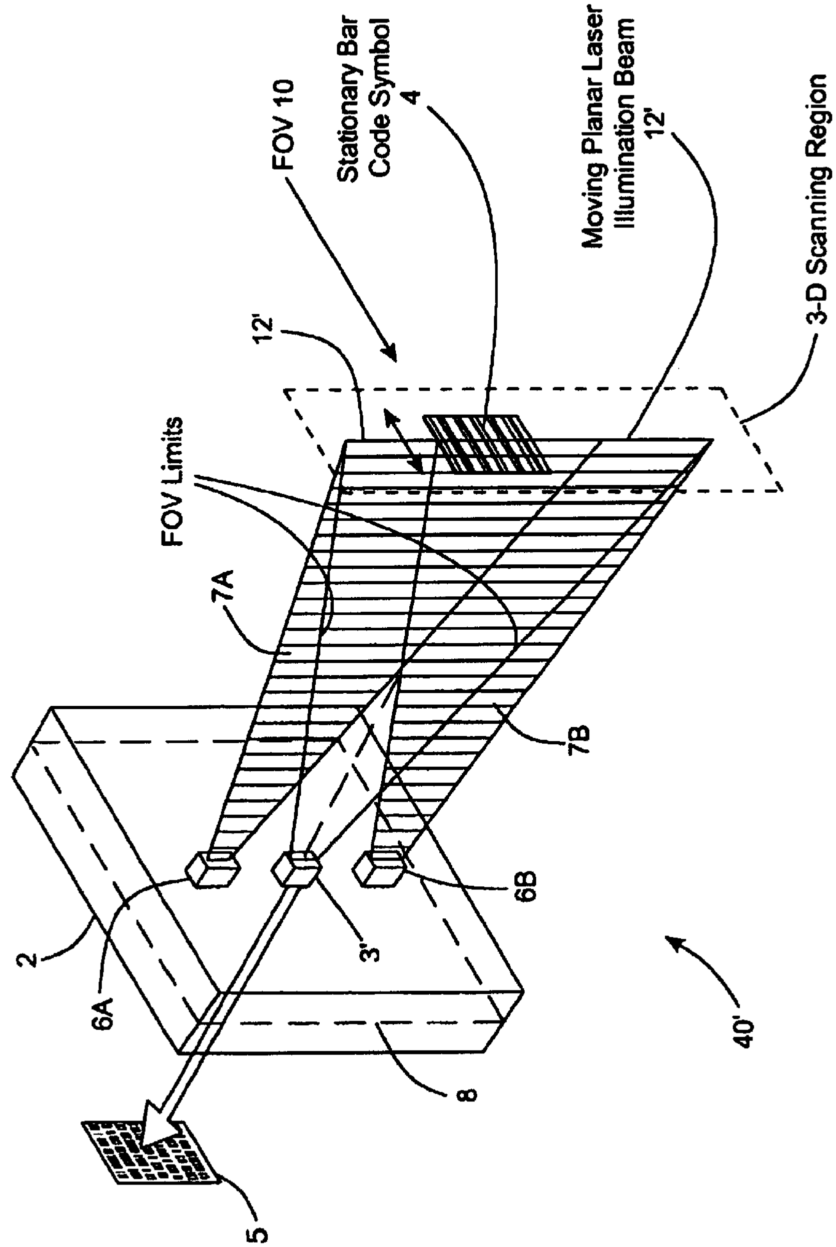
FIG. 2I1

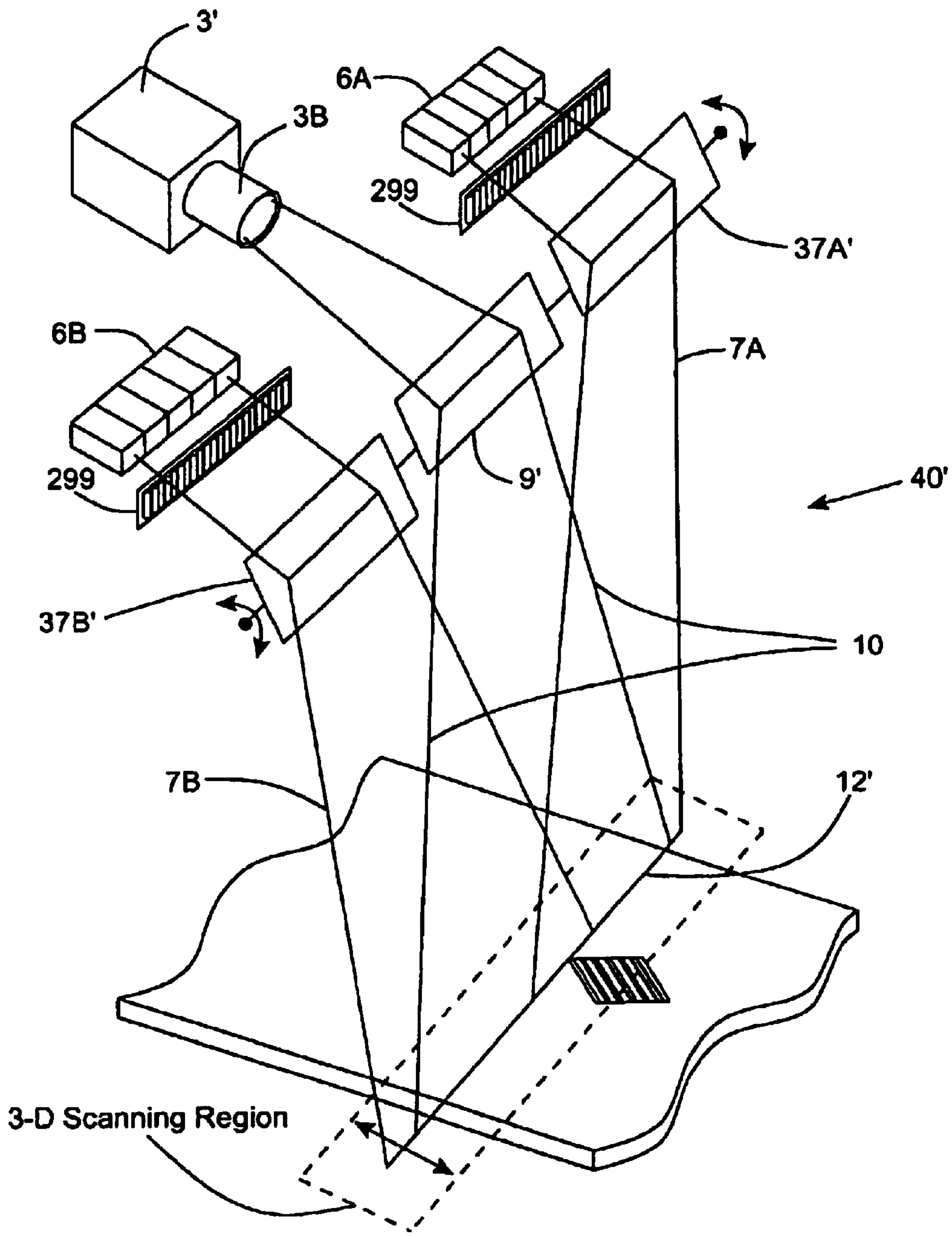
FIG. 2I2

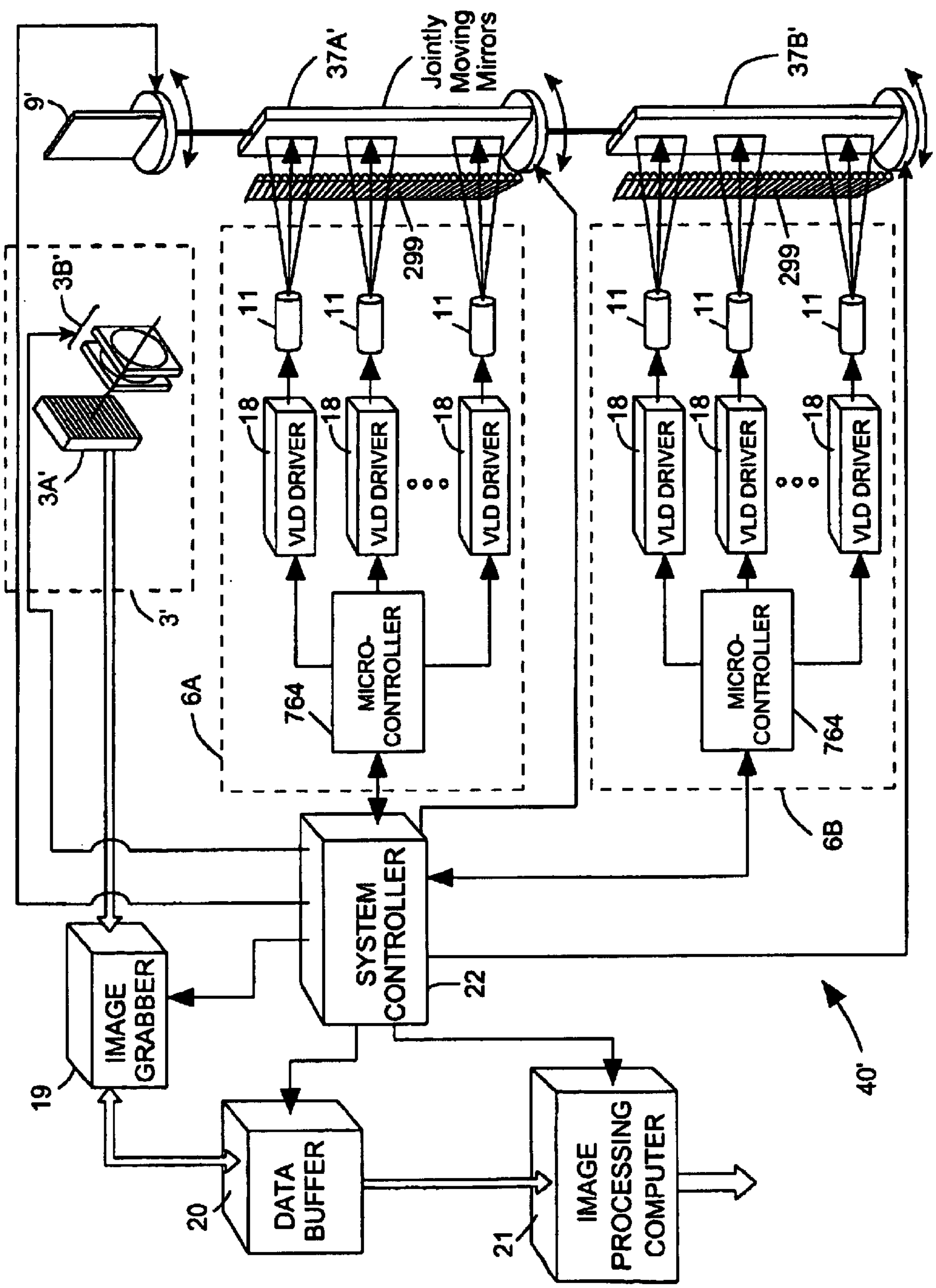
FIG. 2I3

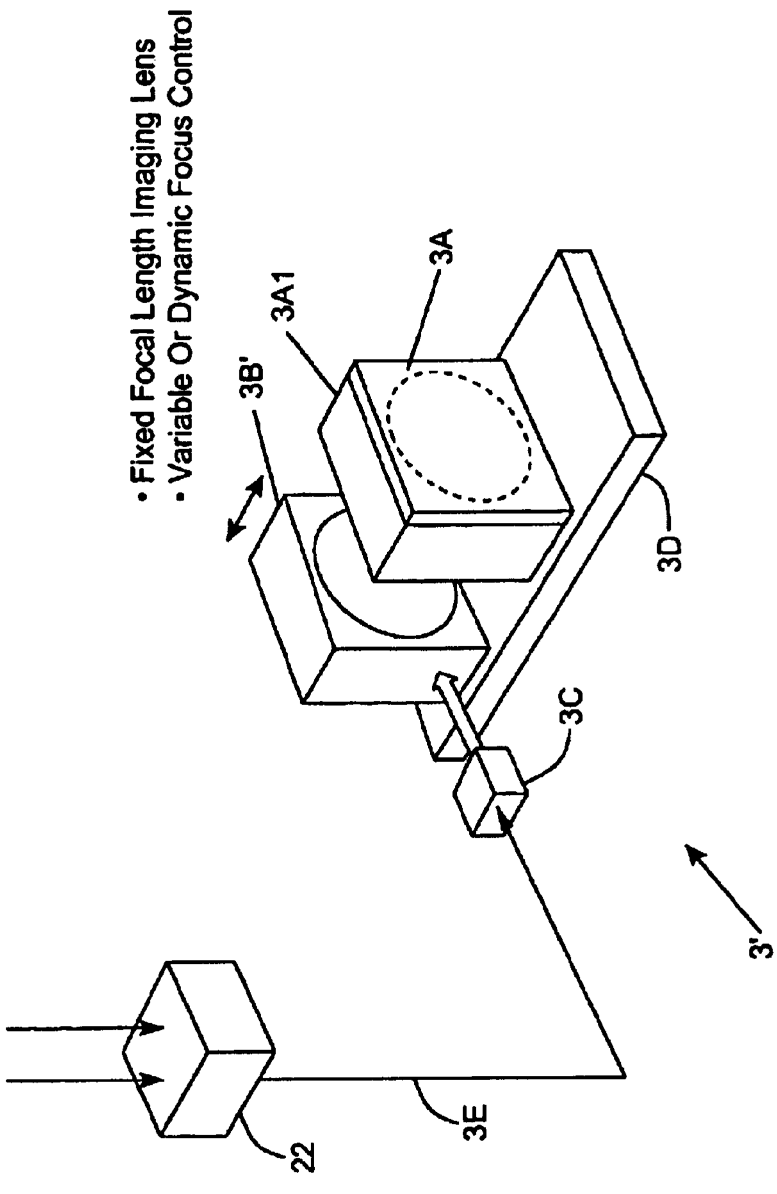
FIG. 2I4

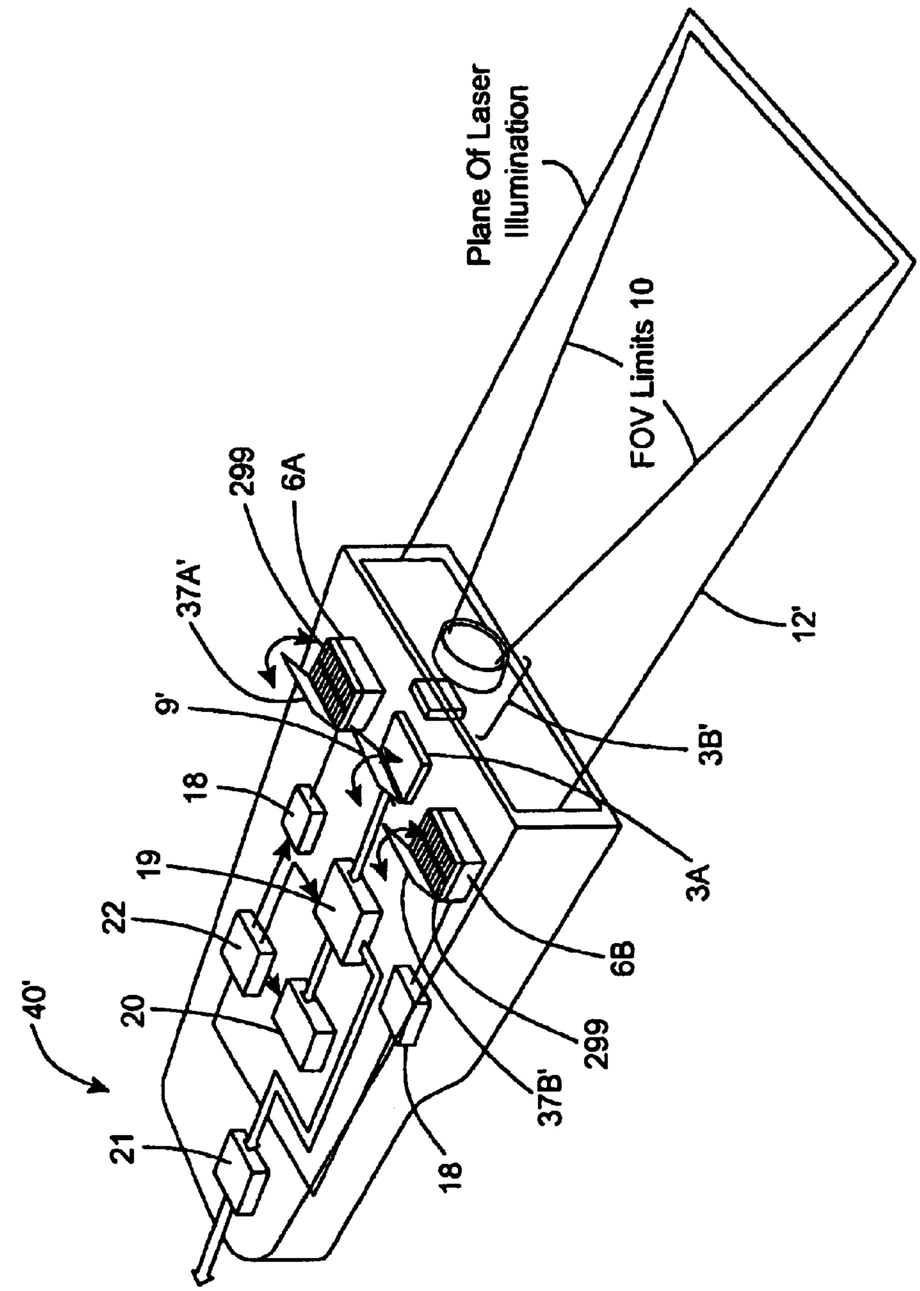
FIG. 2I5

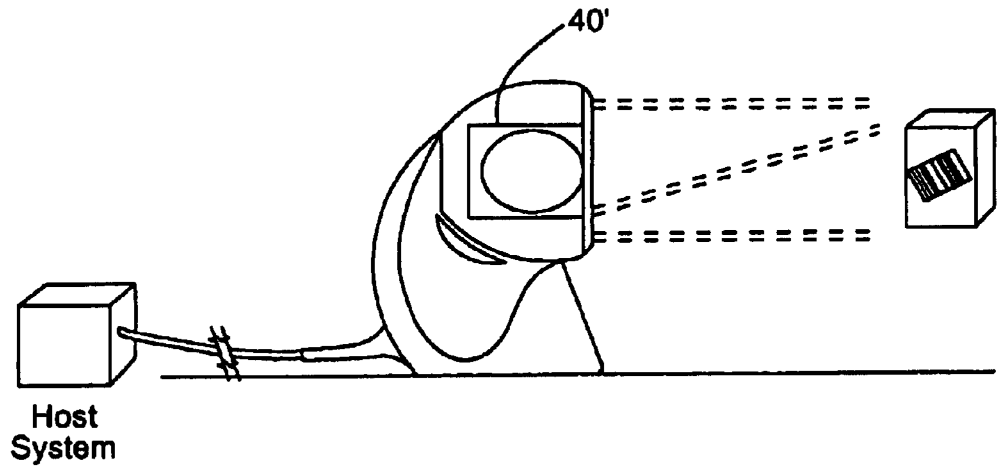
FIG. 2I6

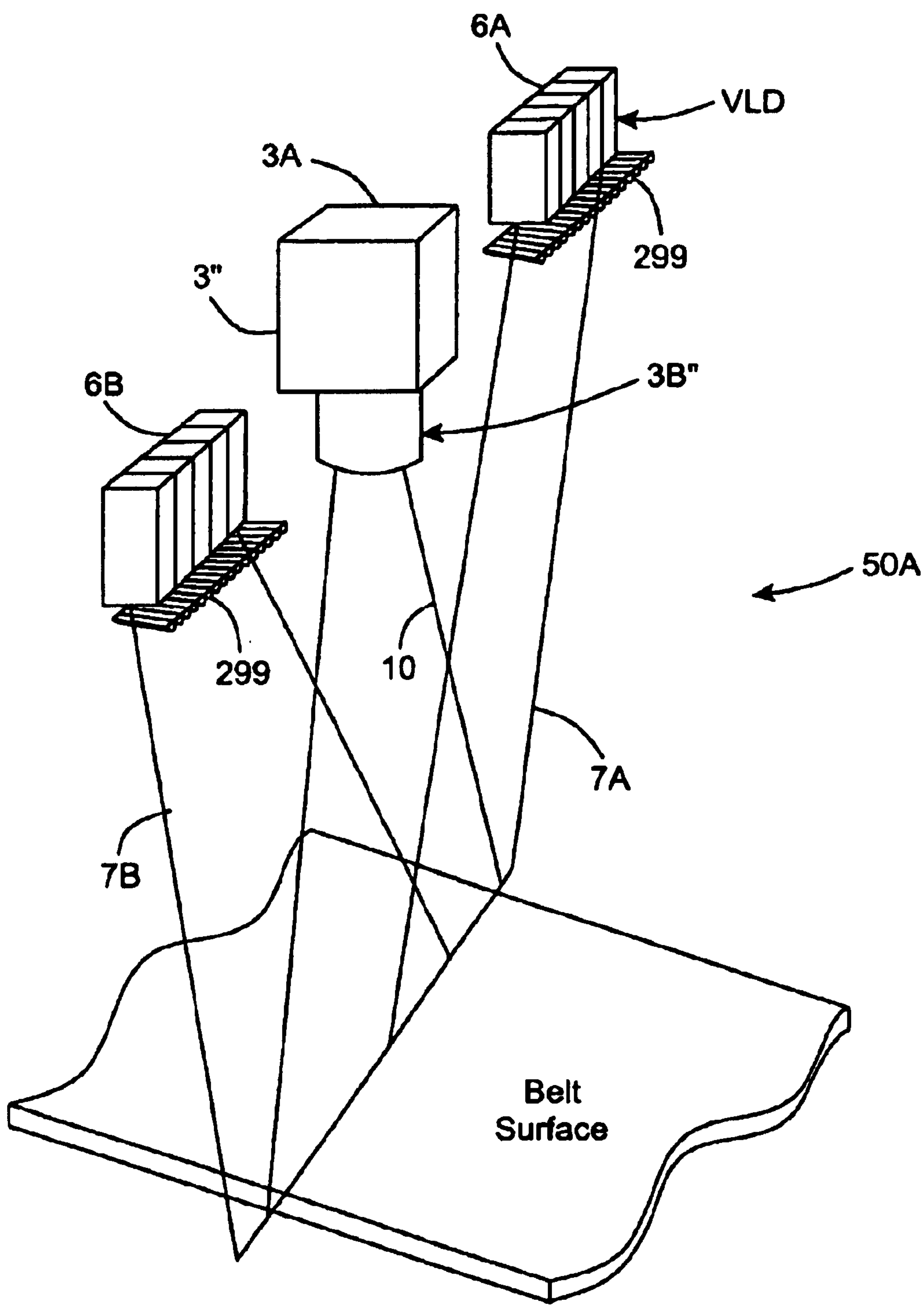
FIG. 3B1

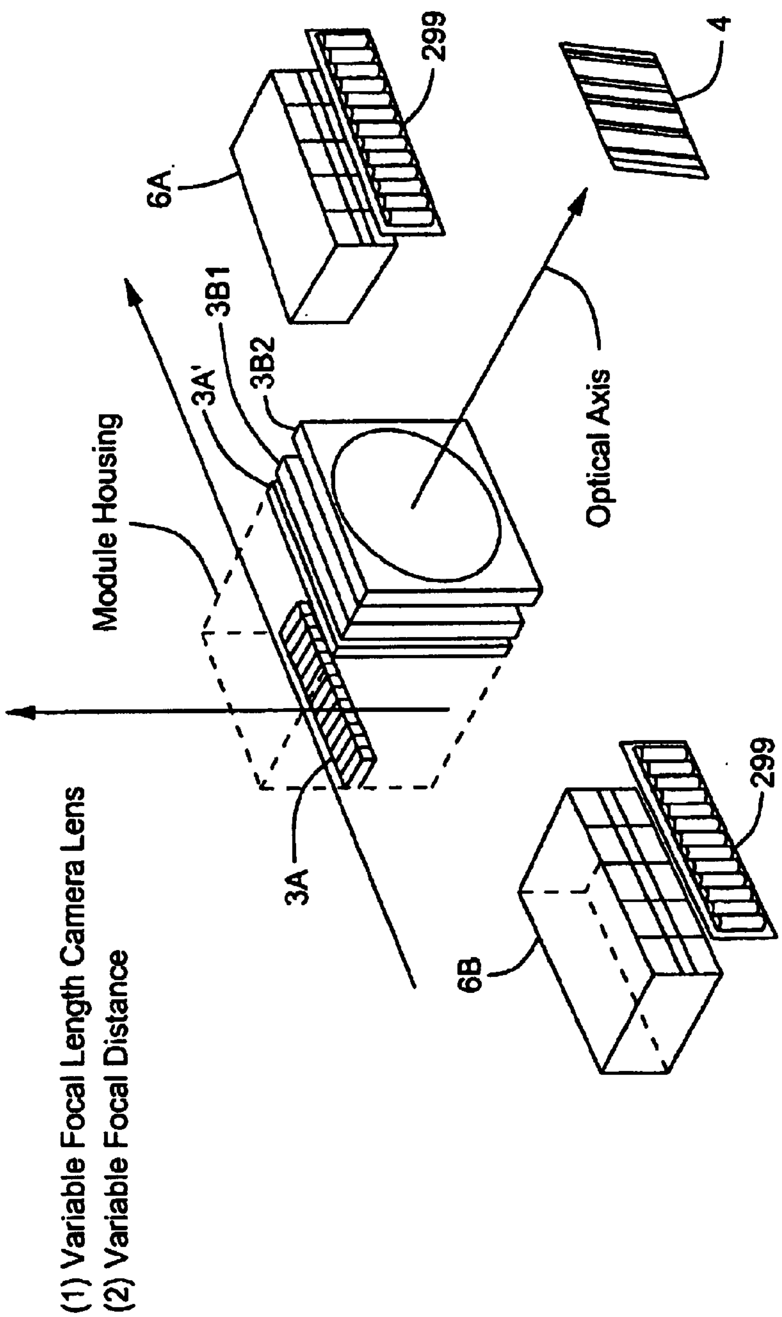
FIG. 3B2

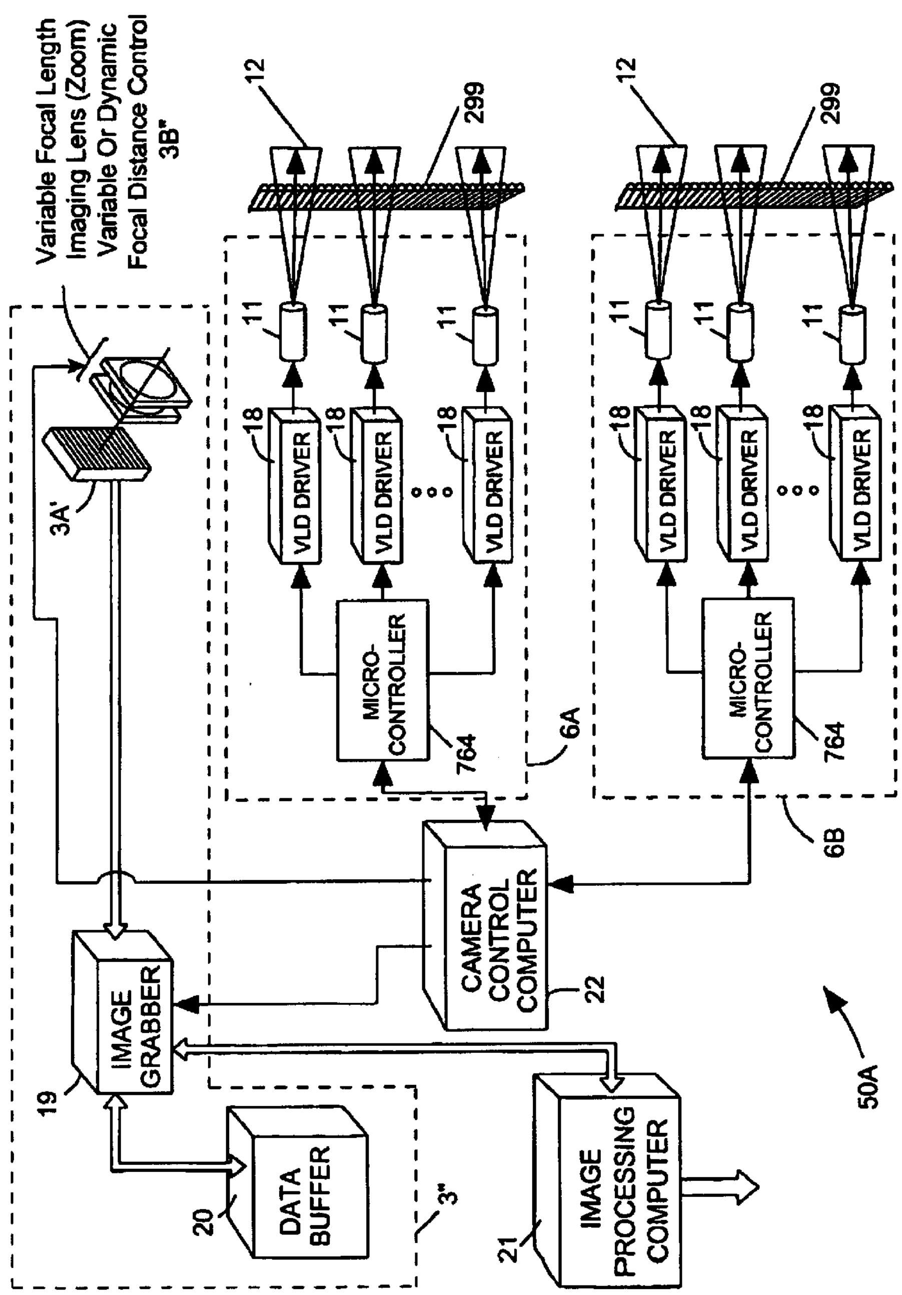
FIG. 3C1

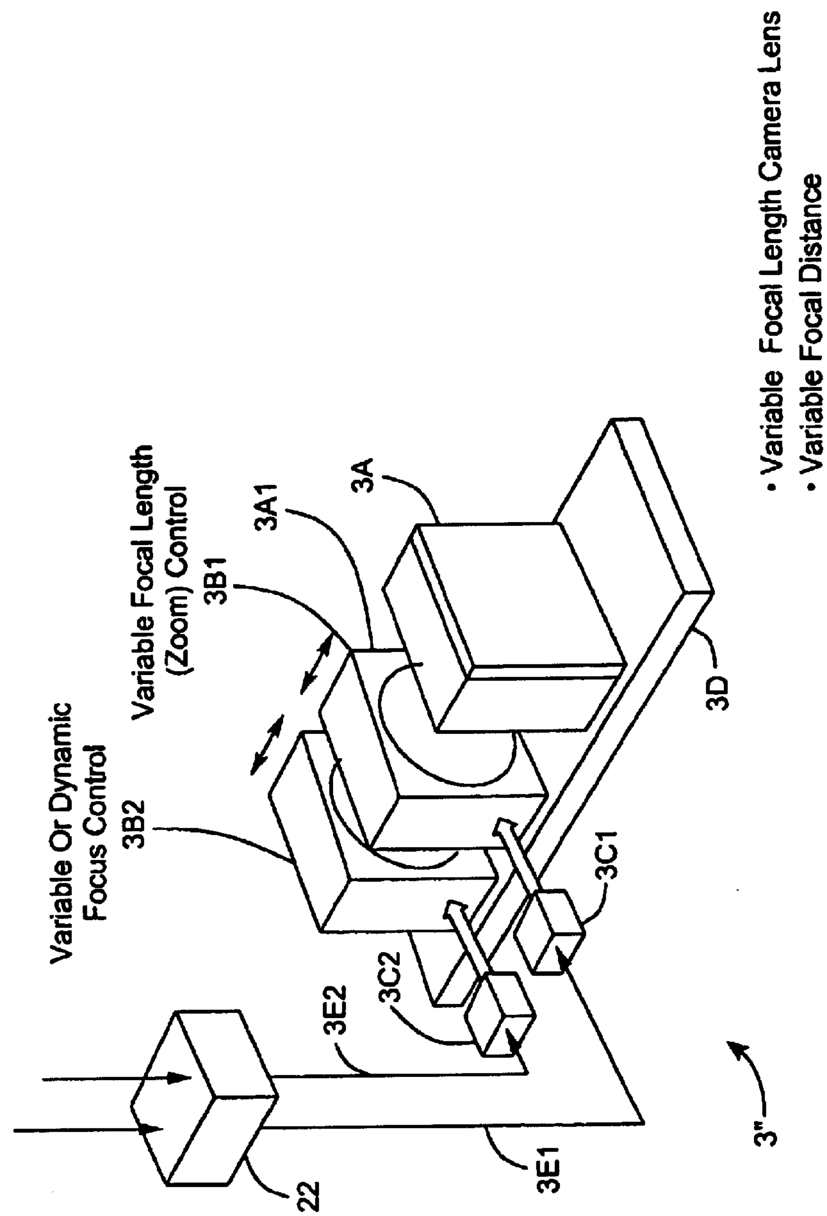
FIG. 3C2

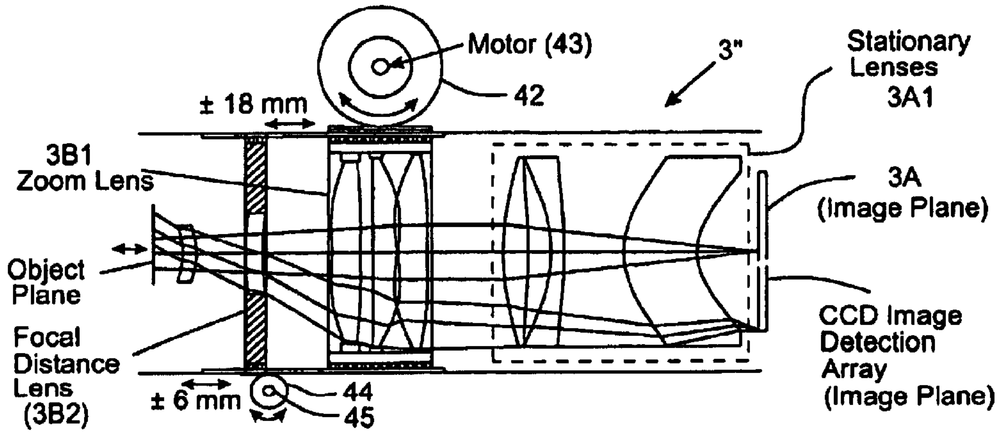
FIG. 3D1
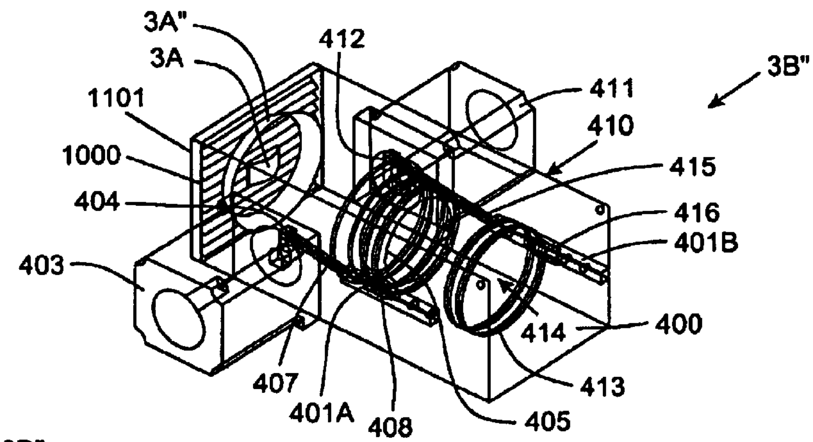
FIG. 3D2
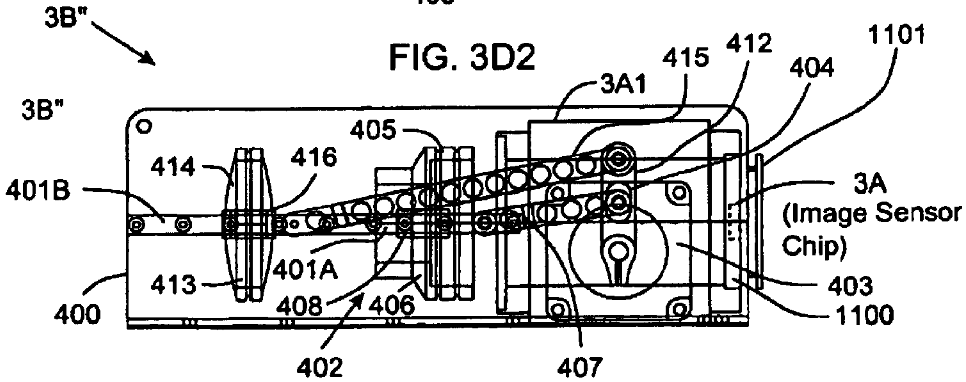
FIG. 3D3

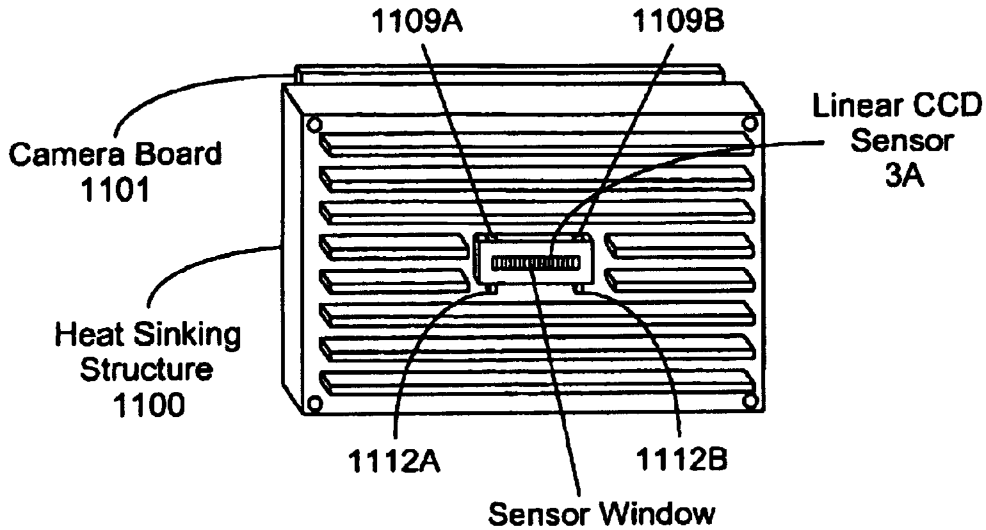
FIG. 3D4
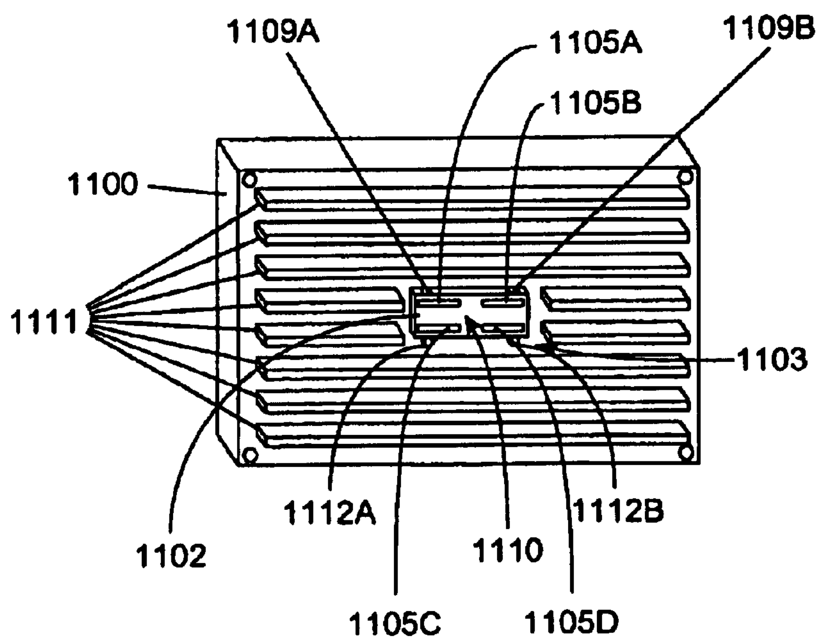
FIG. 3D5

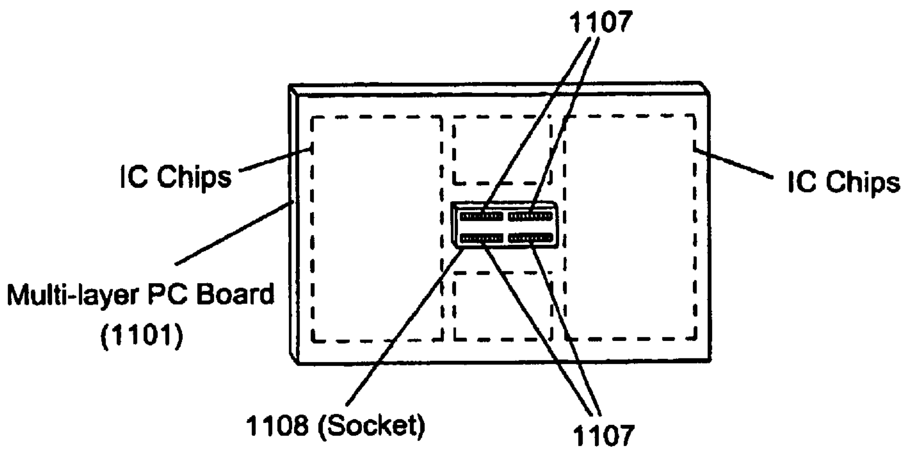
FIG. 3D6
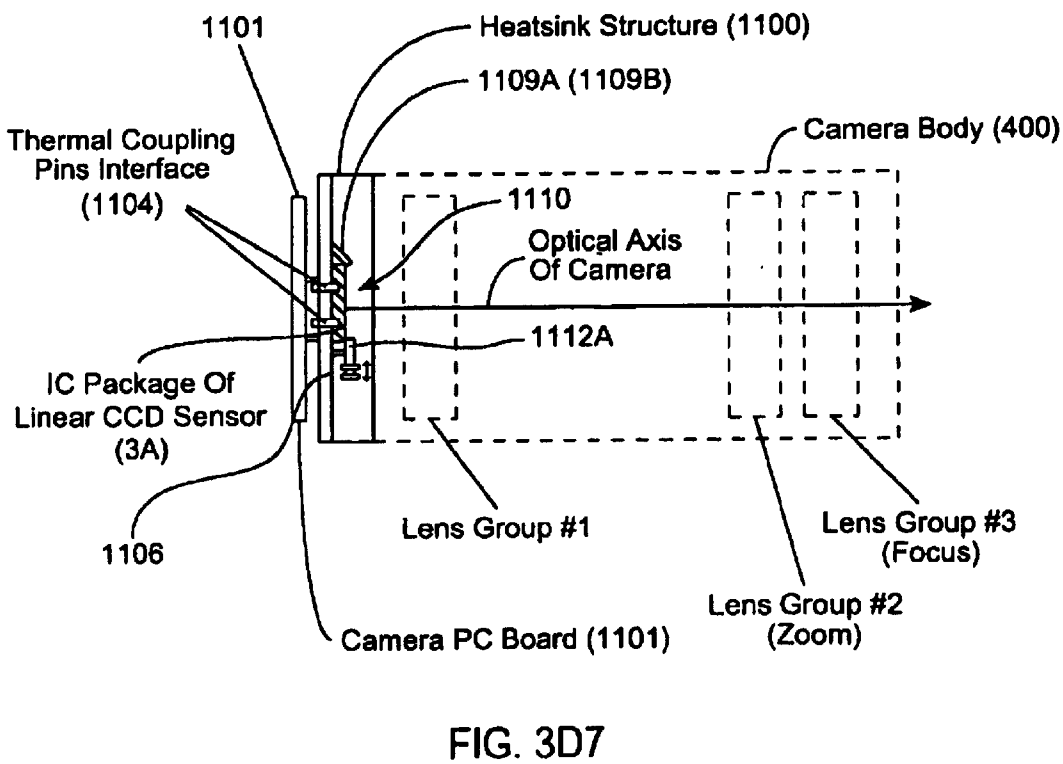
FIG. 3D7

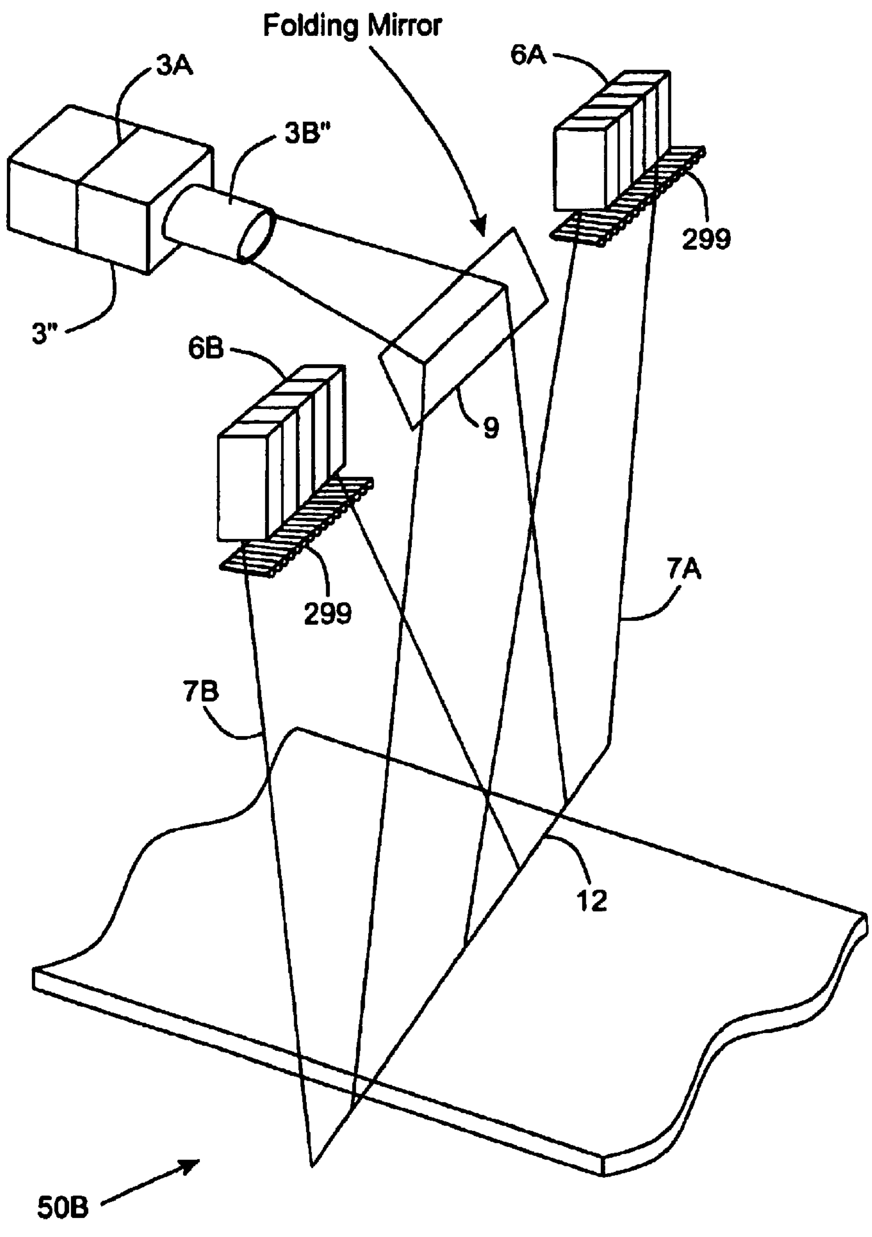
FIG. 3E1

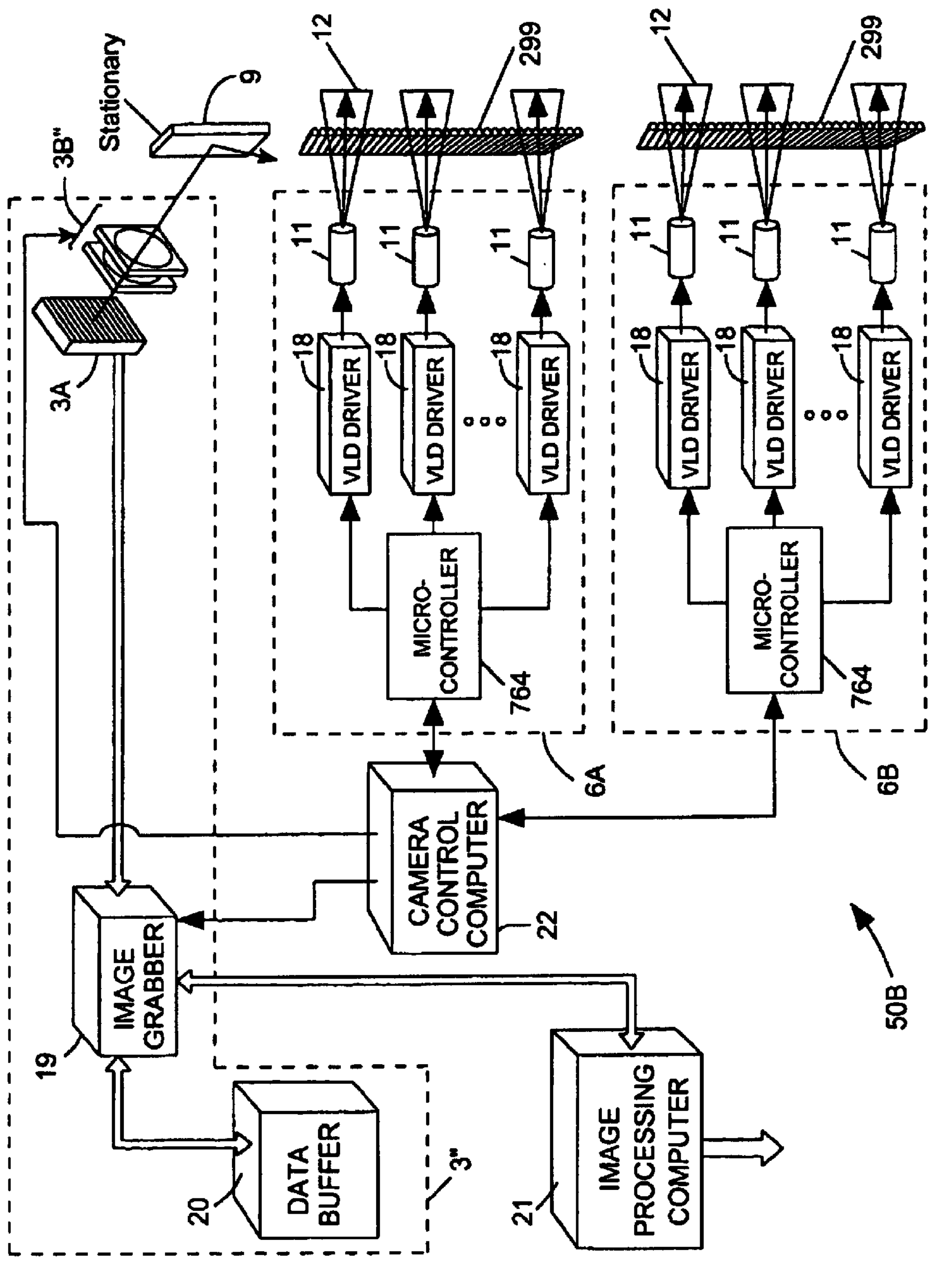
FIG. 3E2

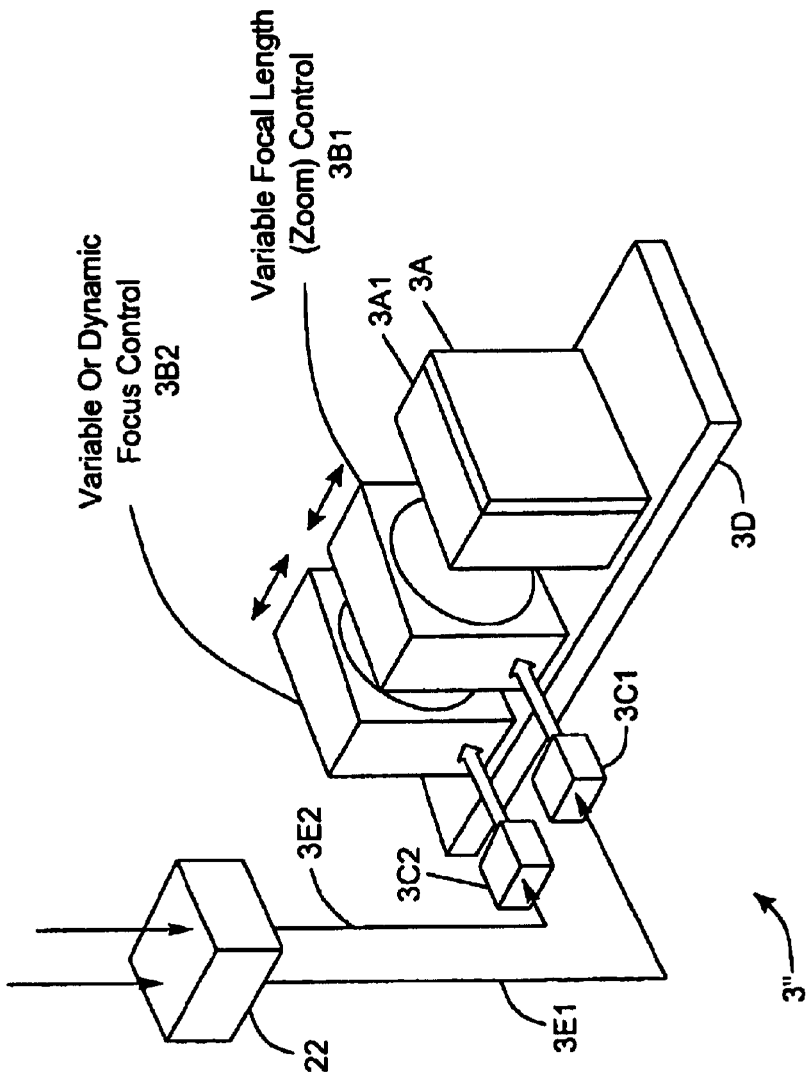
FIG. 3E3

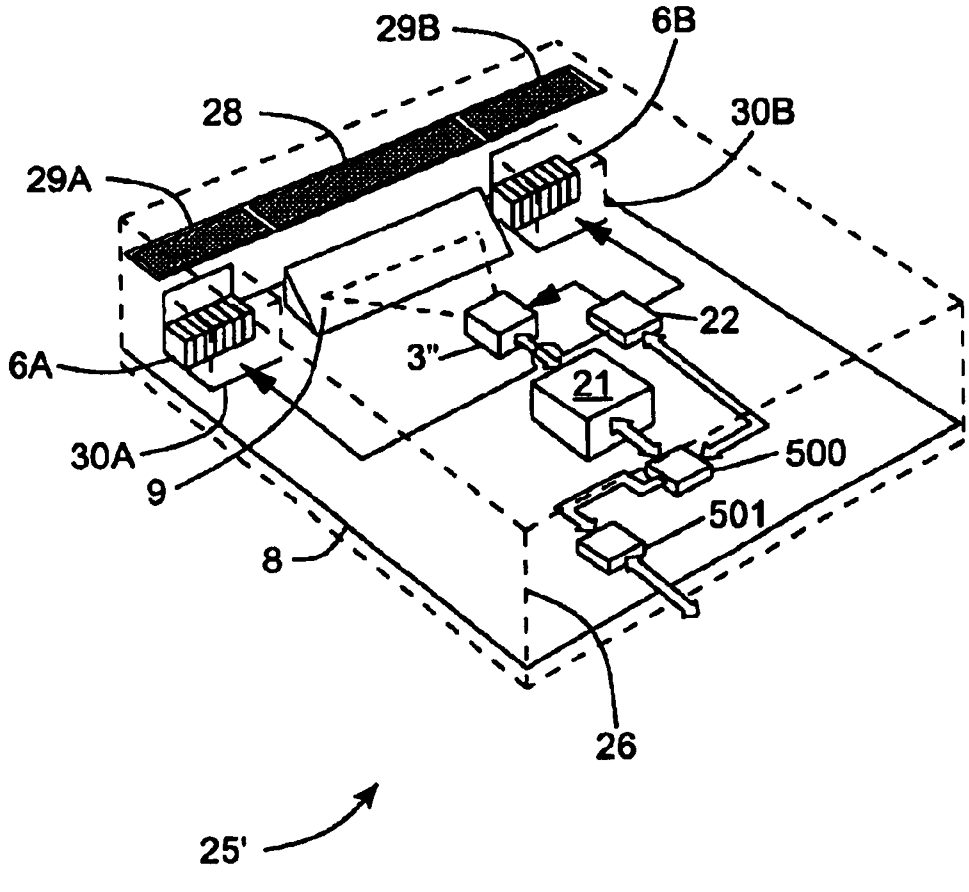
FIG. 3E4

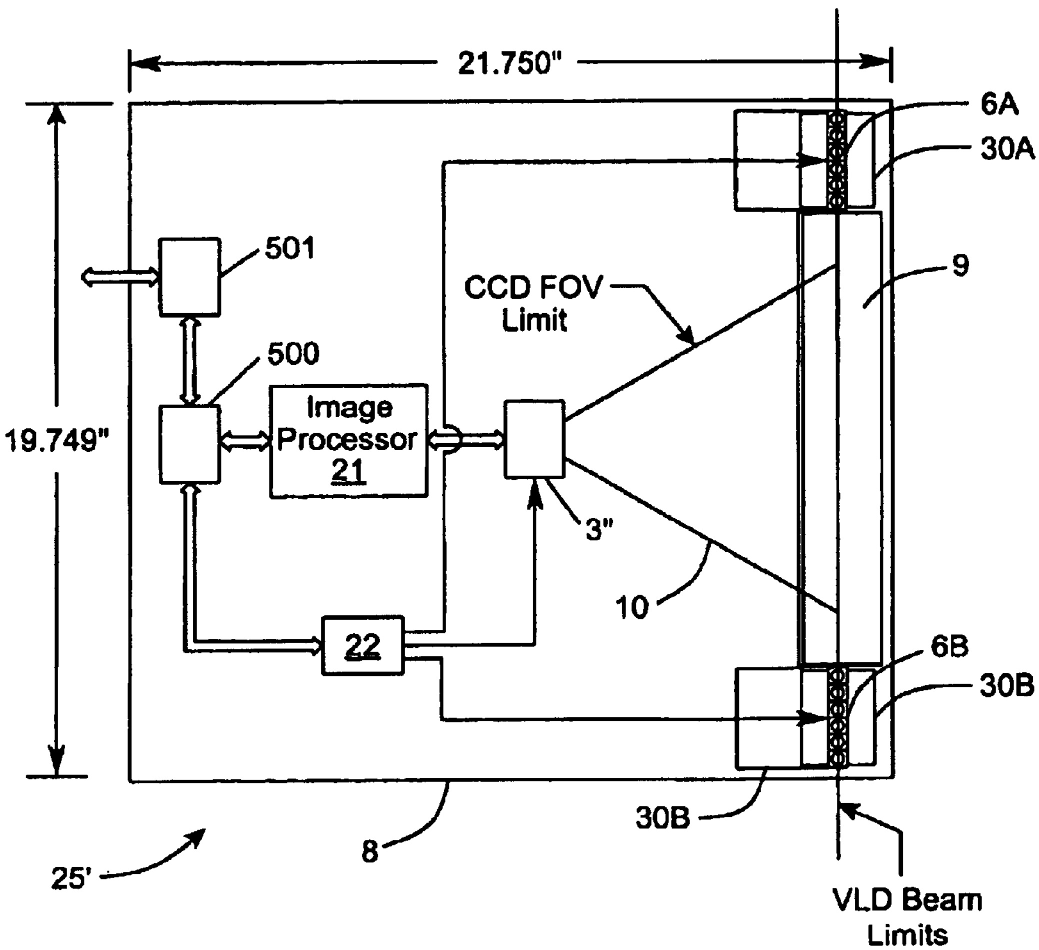
FIG. 3E5

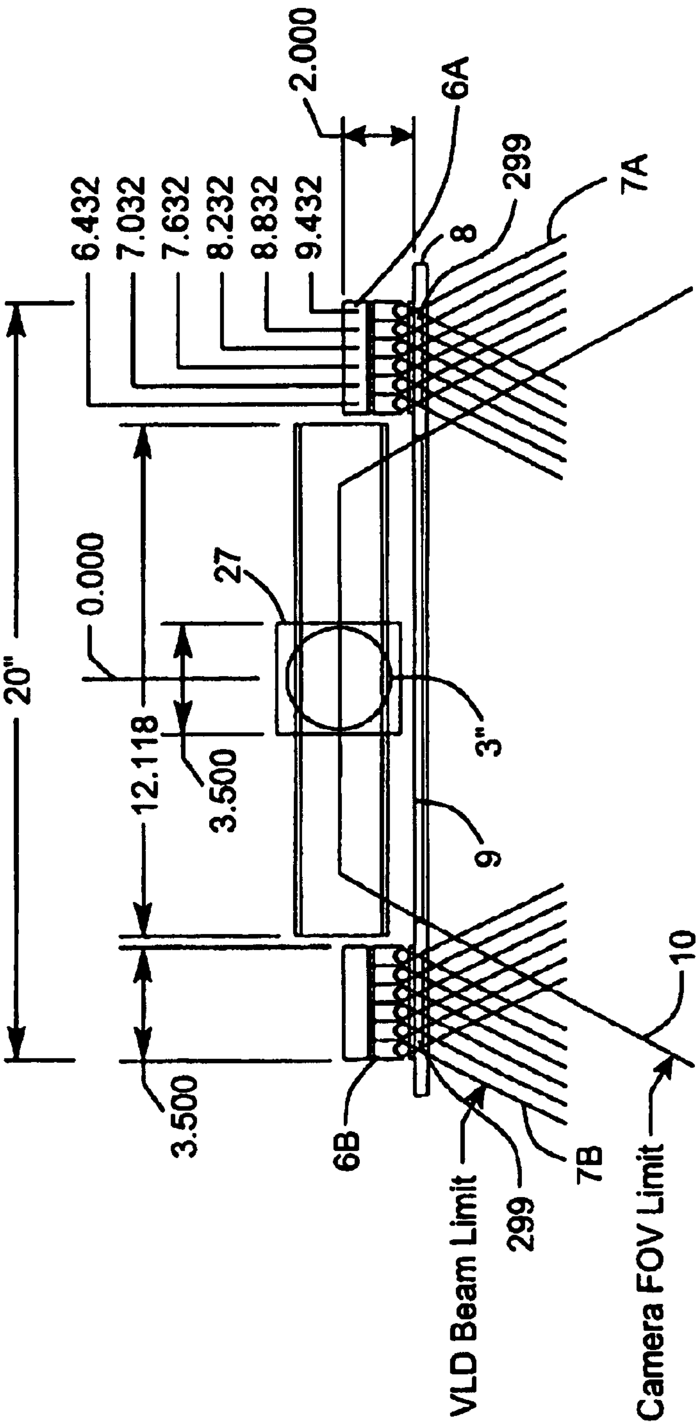
FIG. 3E6

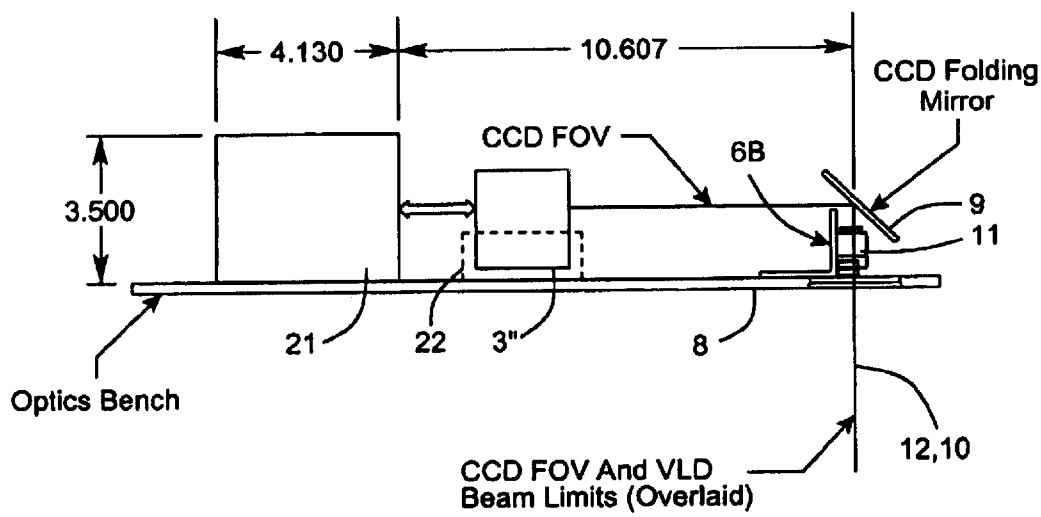
FIG. 3E7

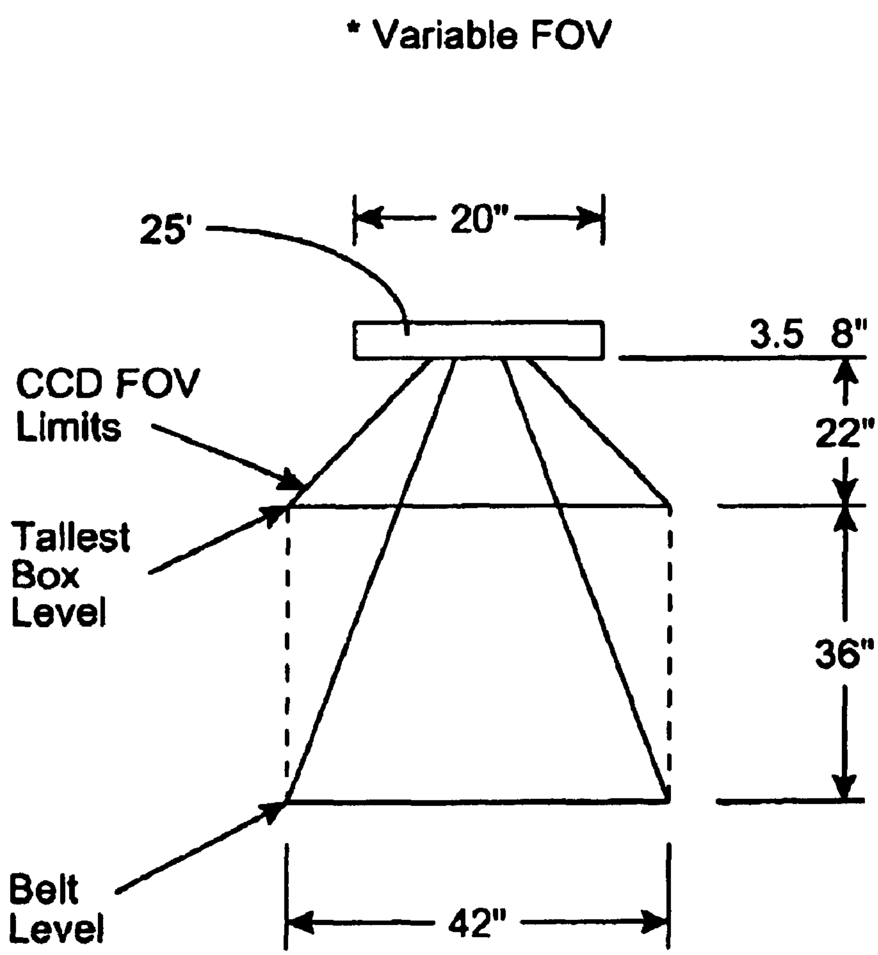
FIG. 3E8

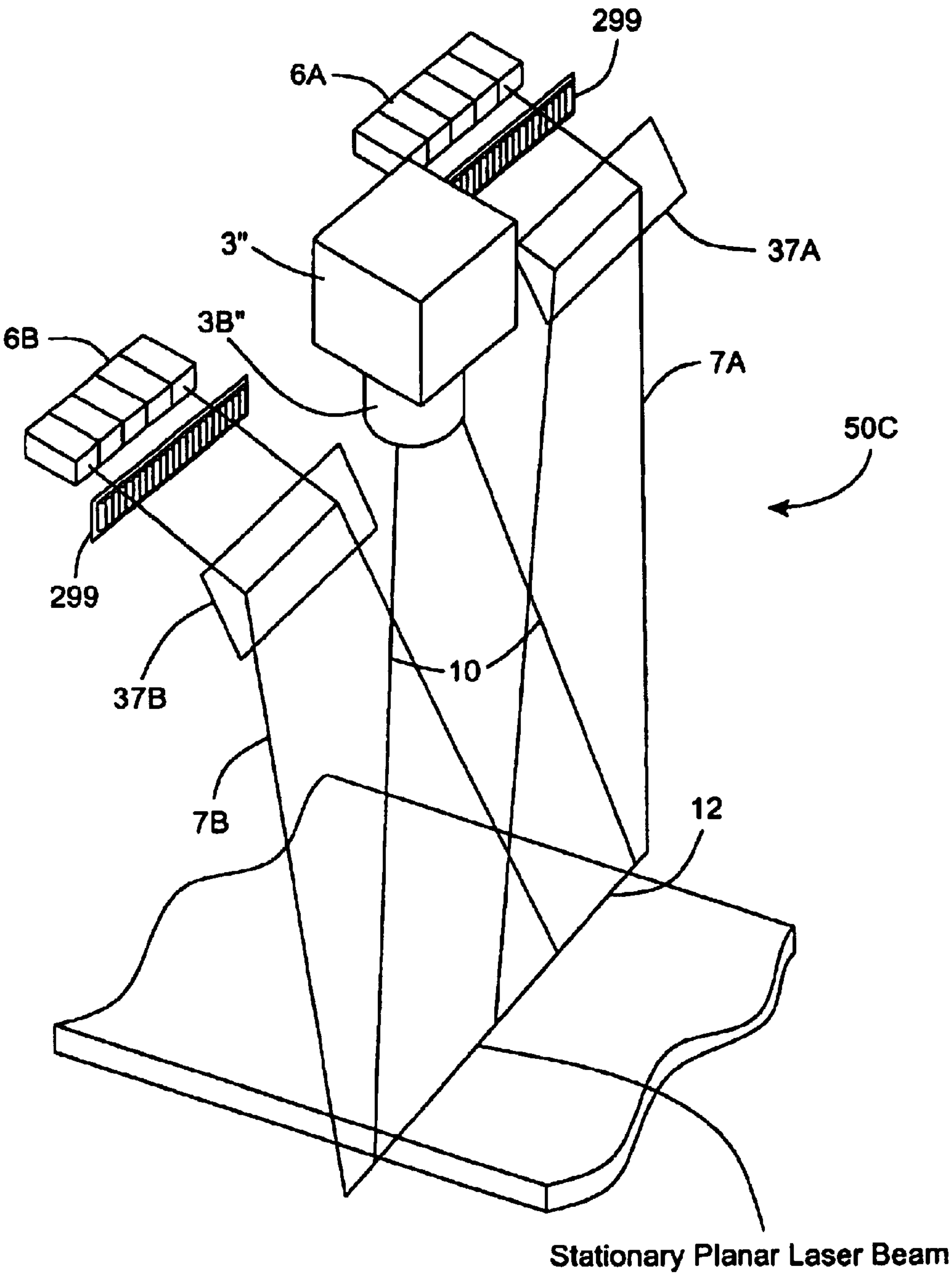
FIG. 3F1

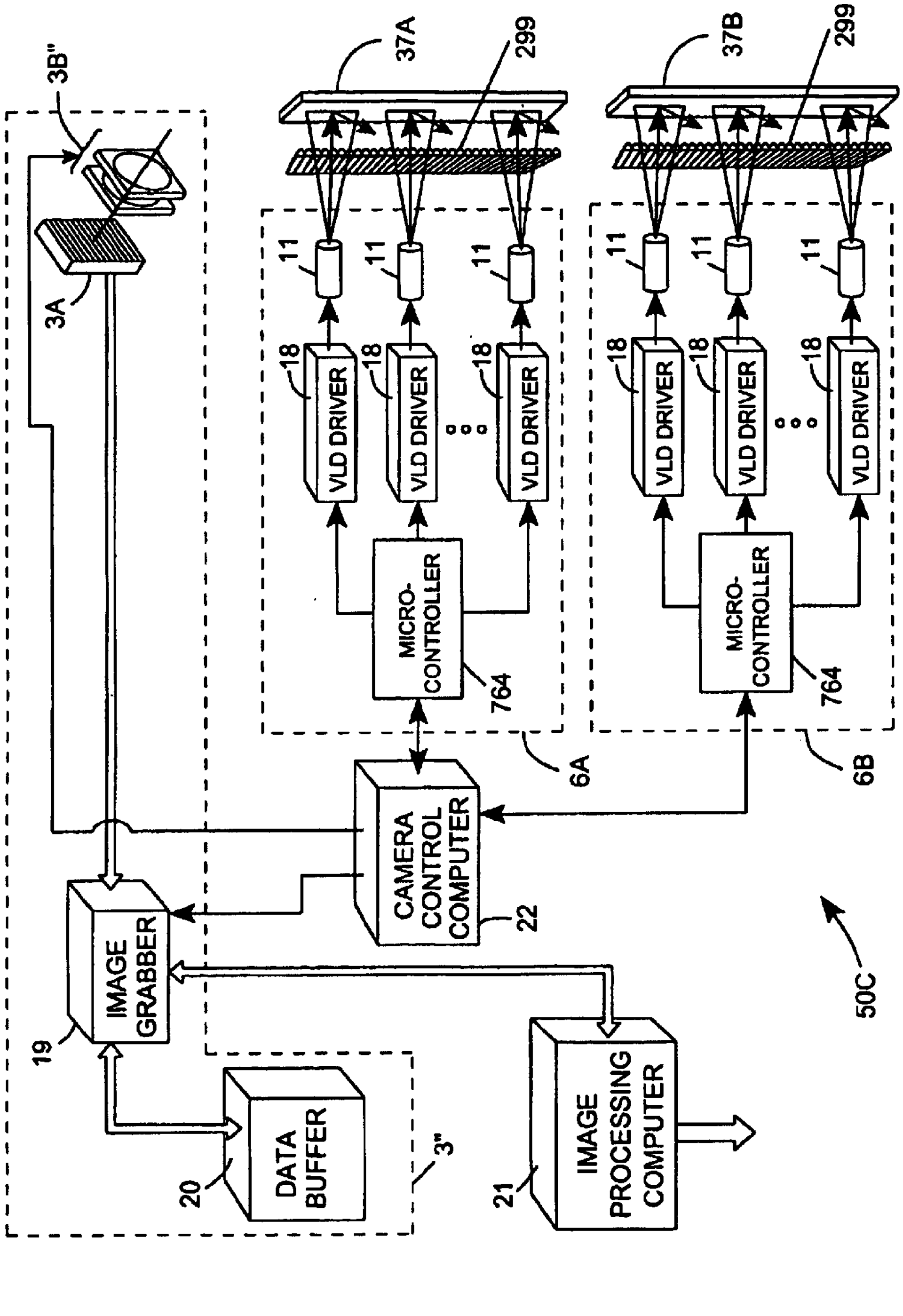
FIG. 3F2

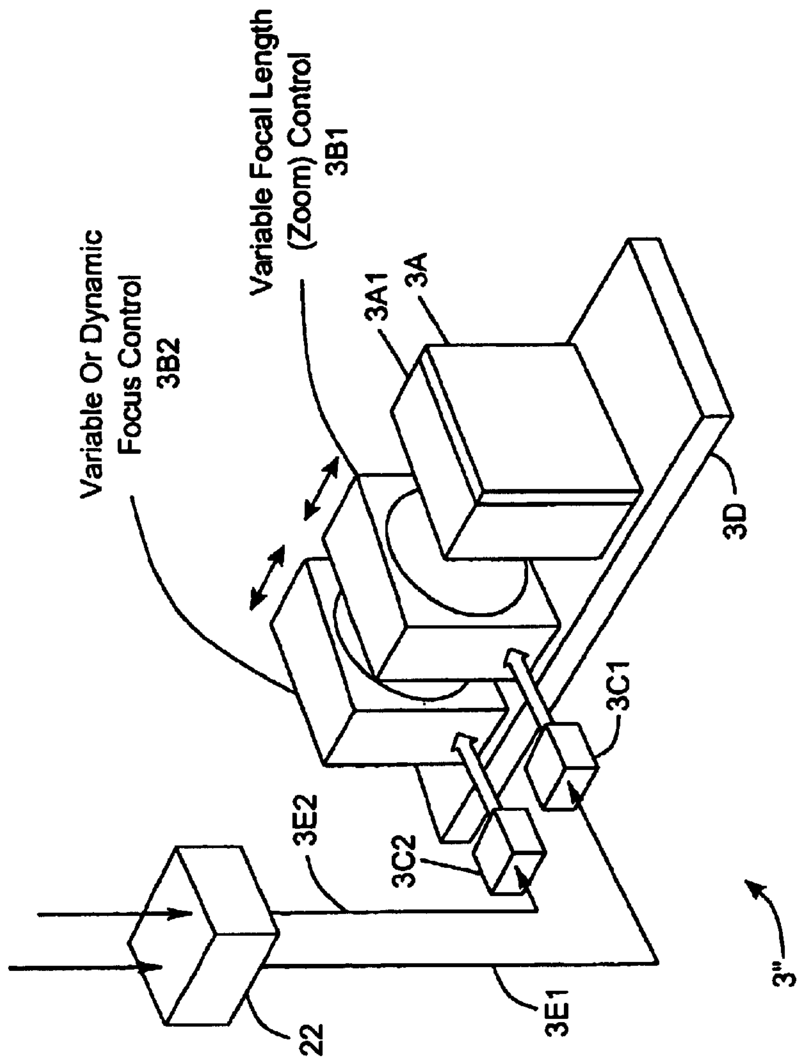
FIG. 3F3

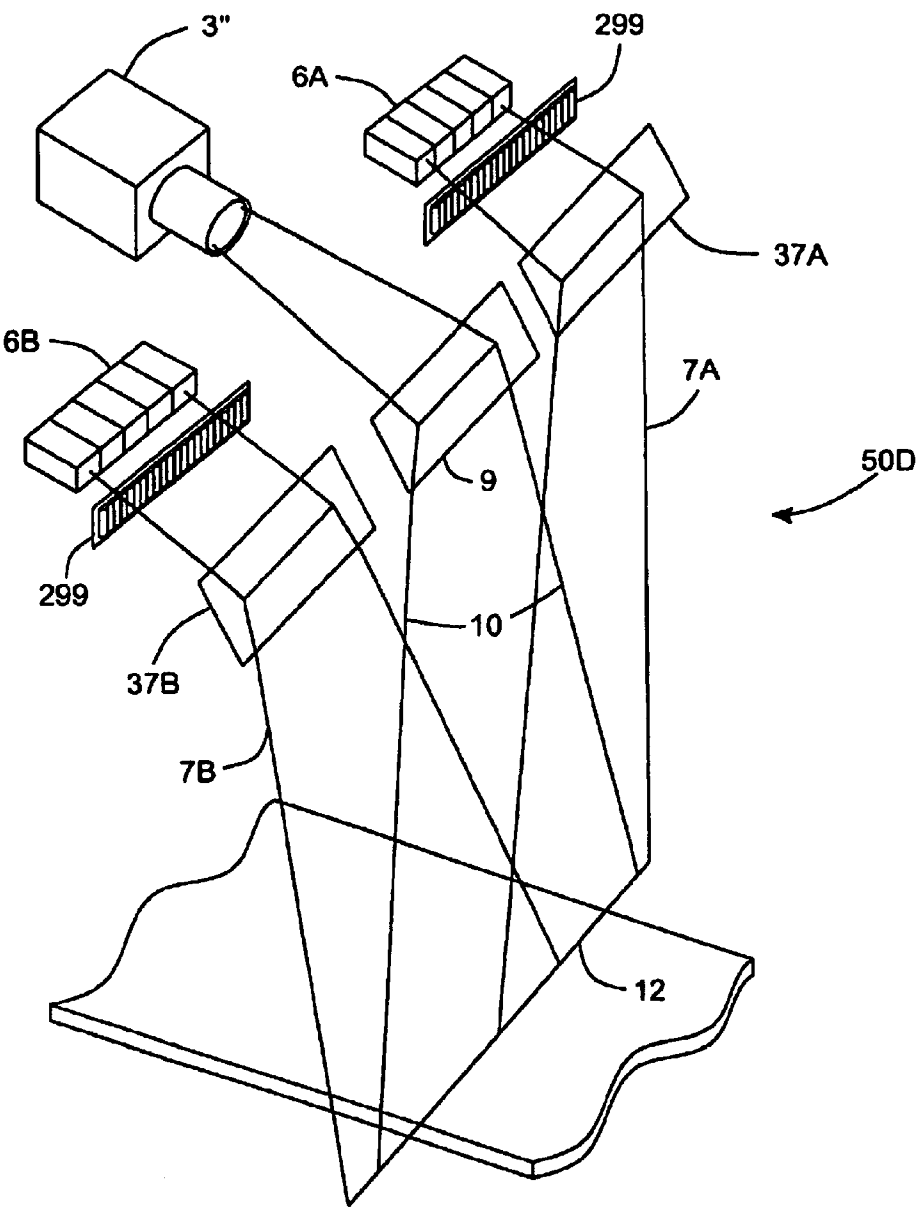
FIG. 3G1

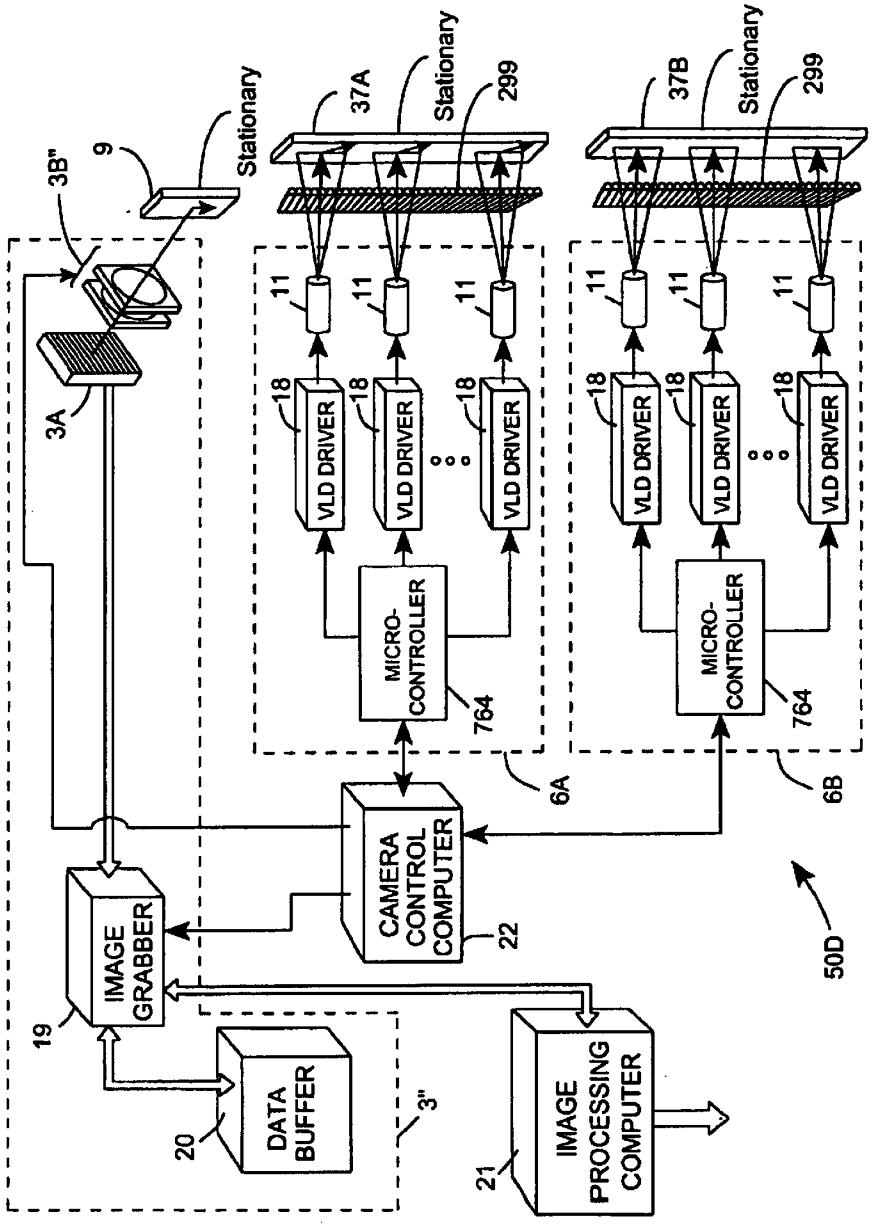
FIG. 3G2

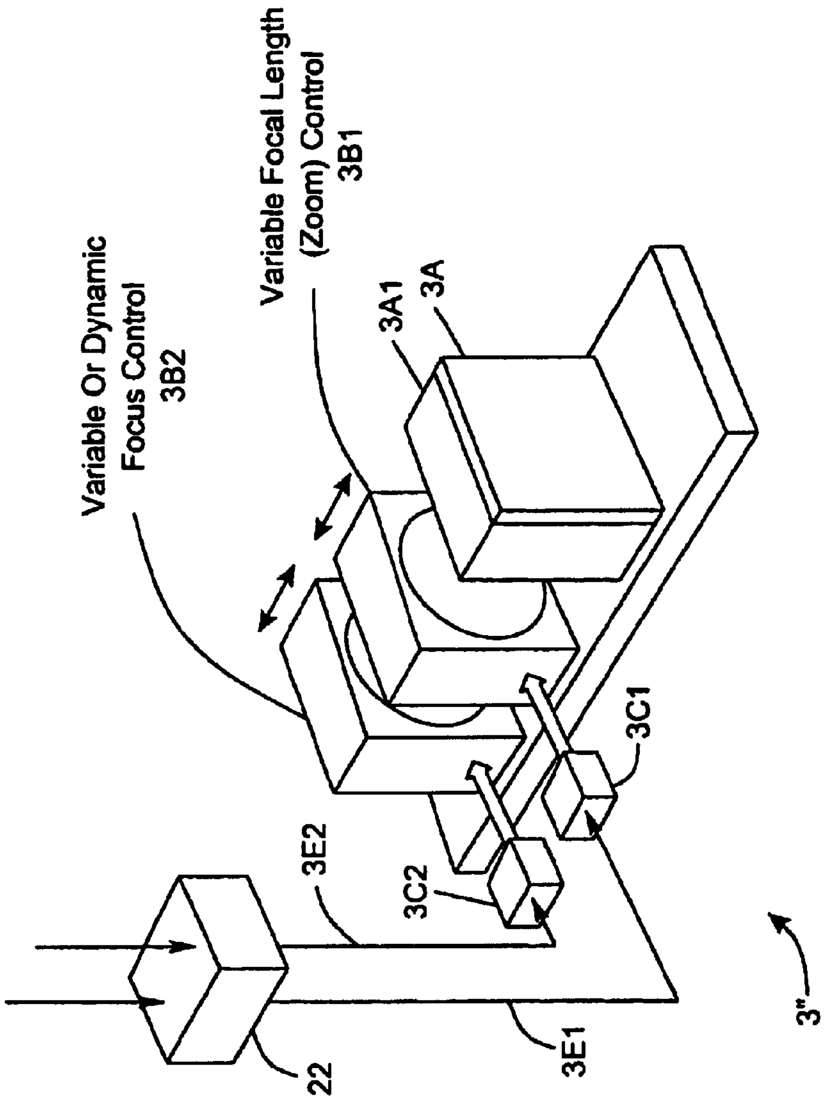
FIG. 3G3

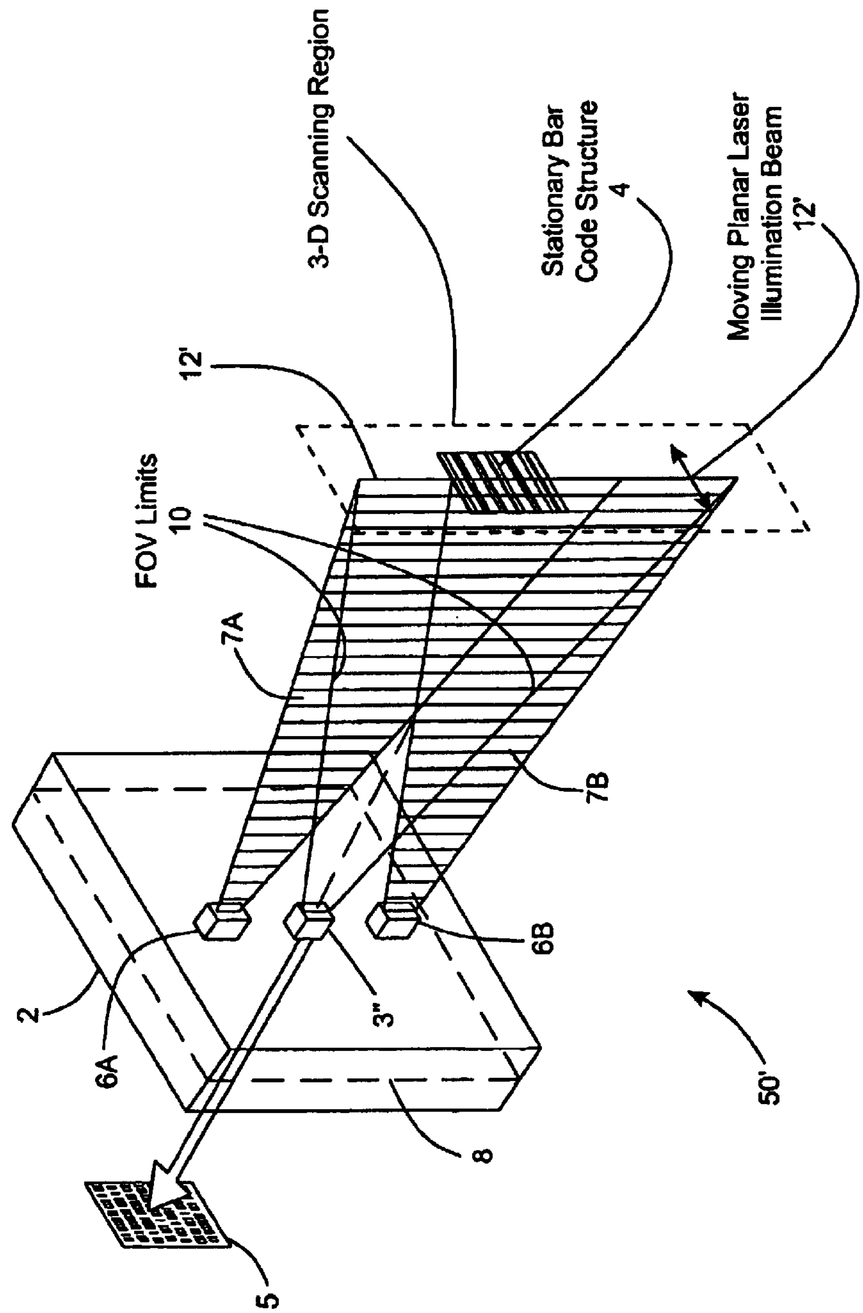
FIG. 3J1

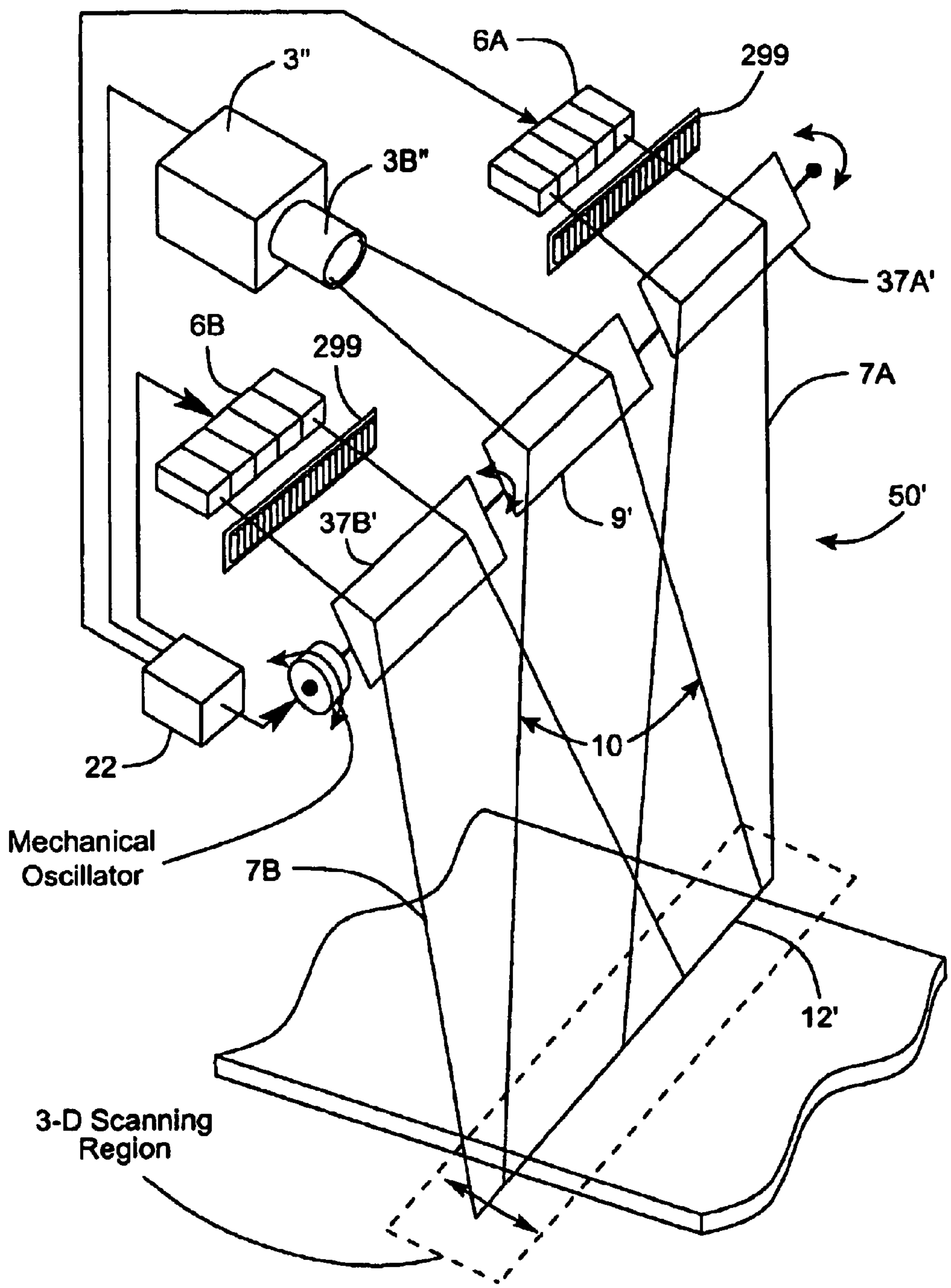
FIG. 3J2

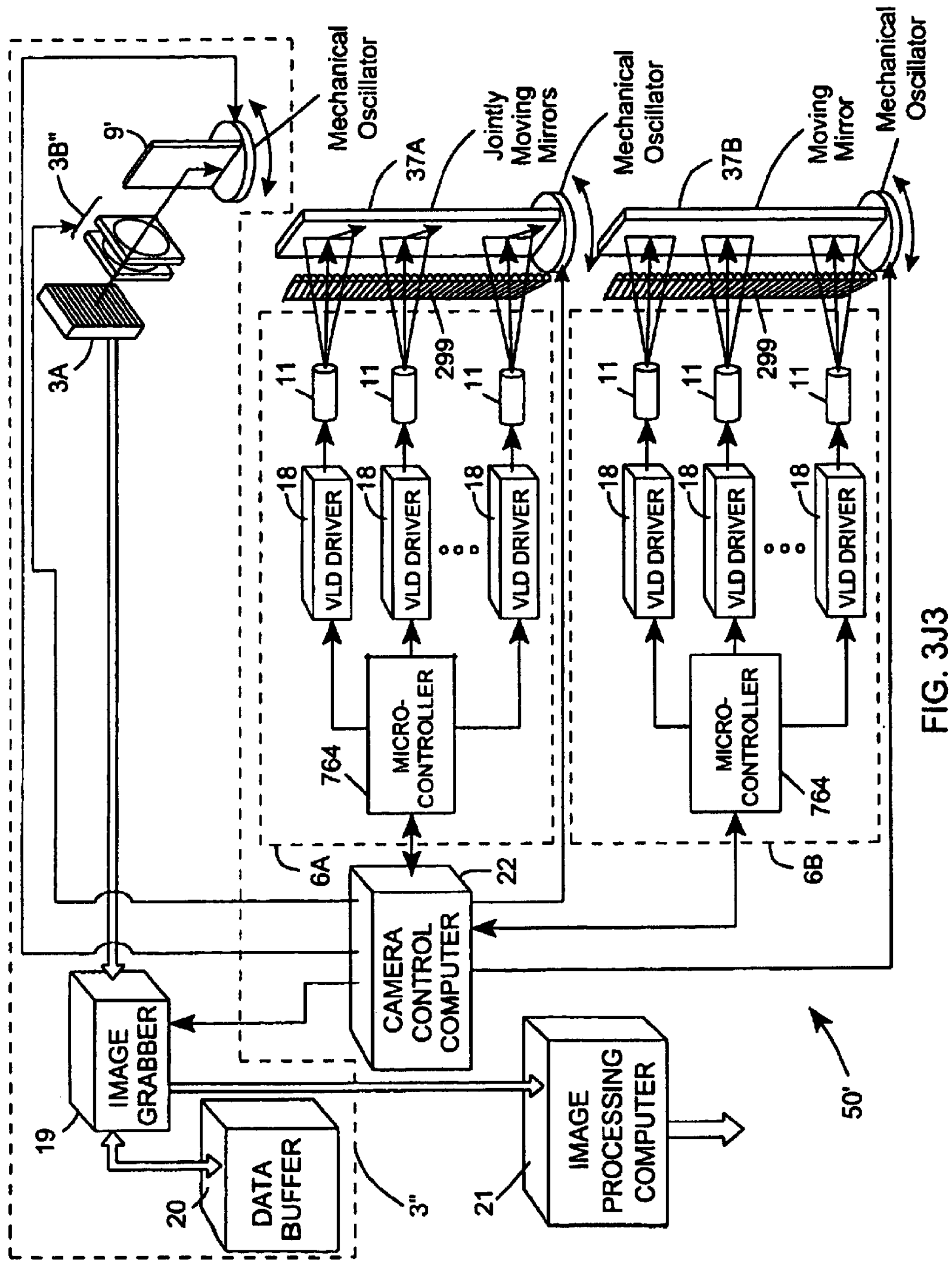
FIG. 3J3

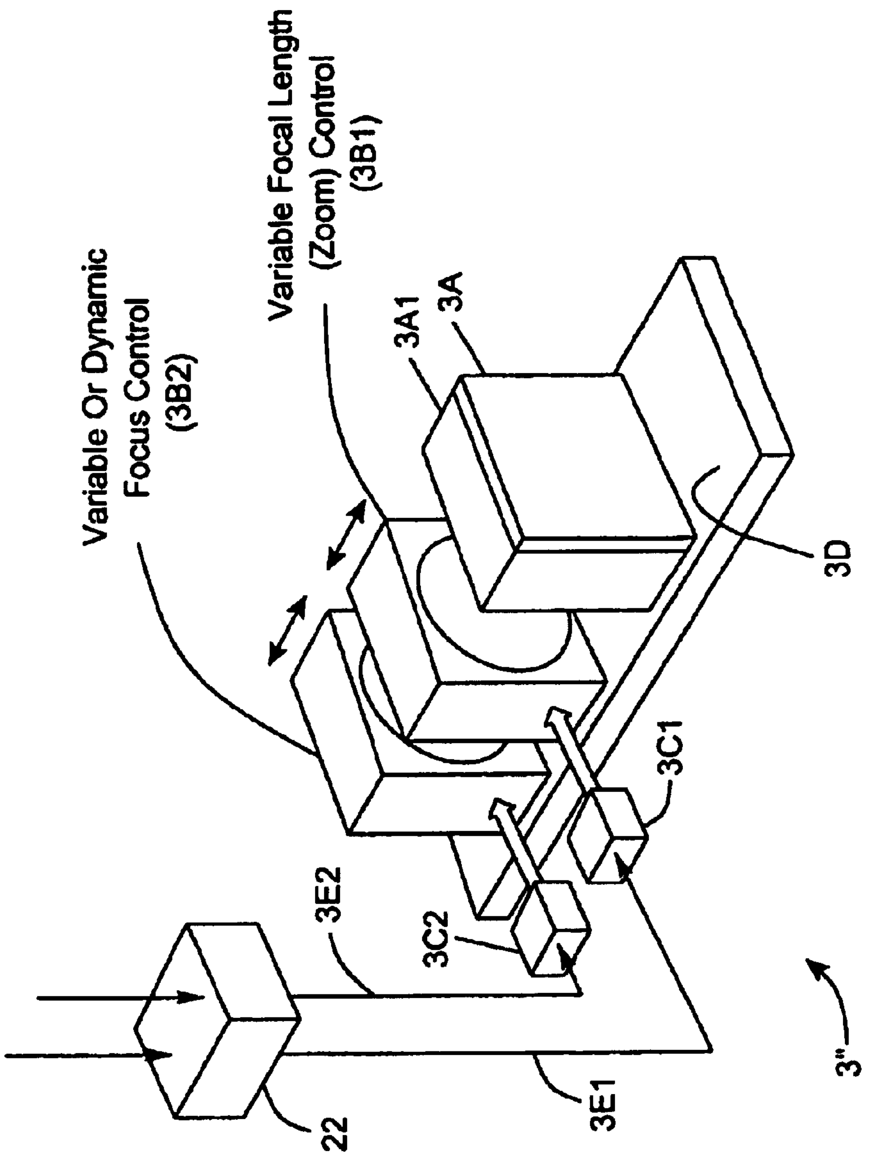
FIG. 3J4

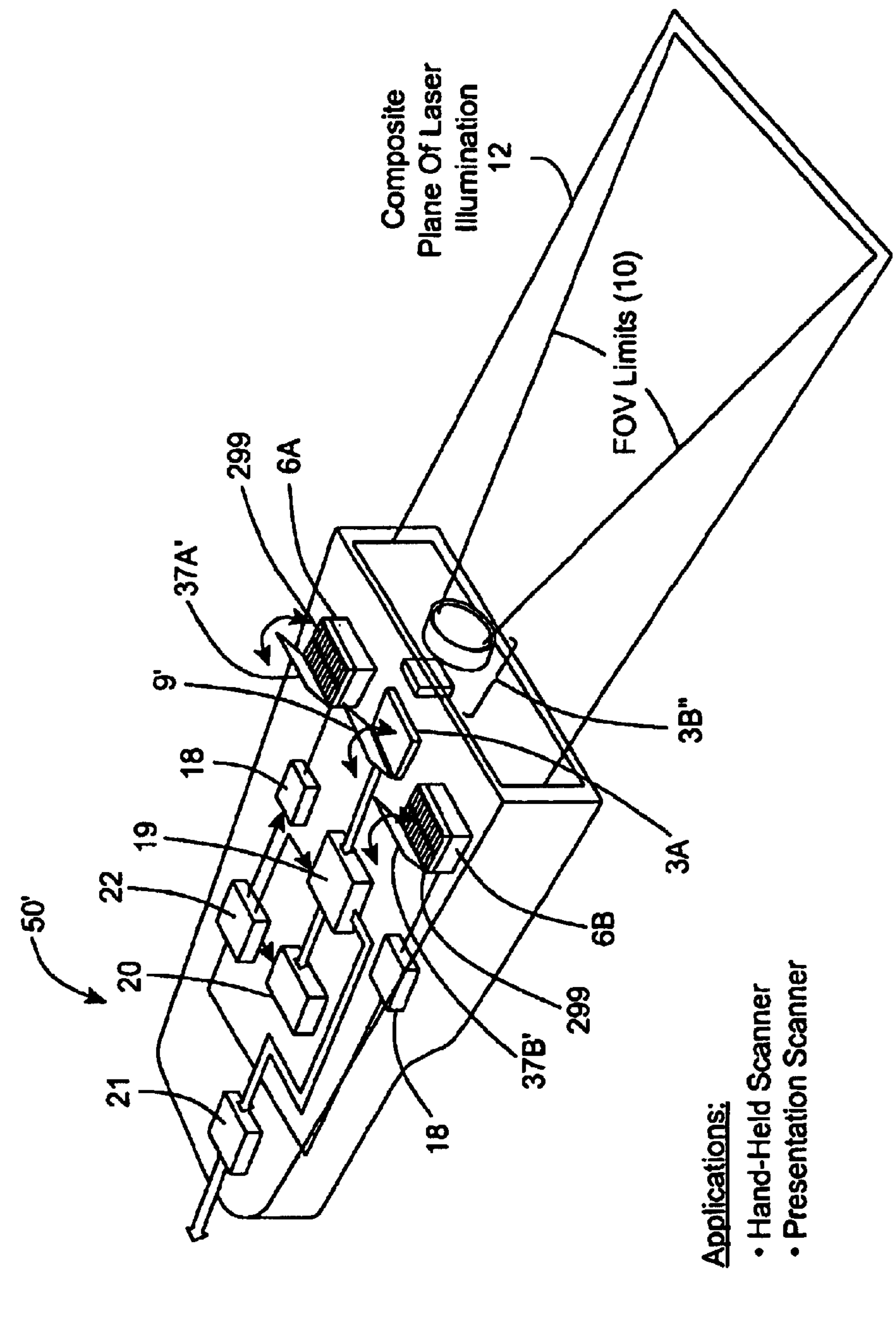
FIG. 3J5

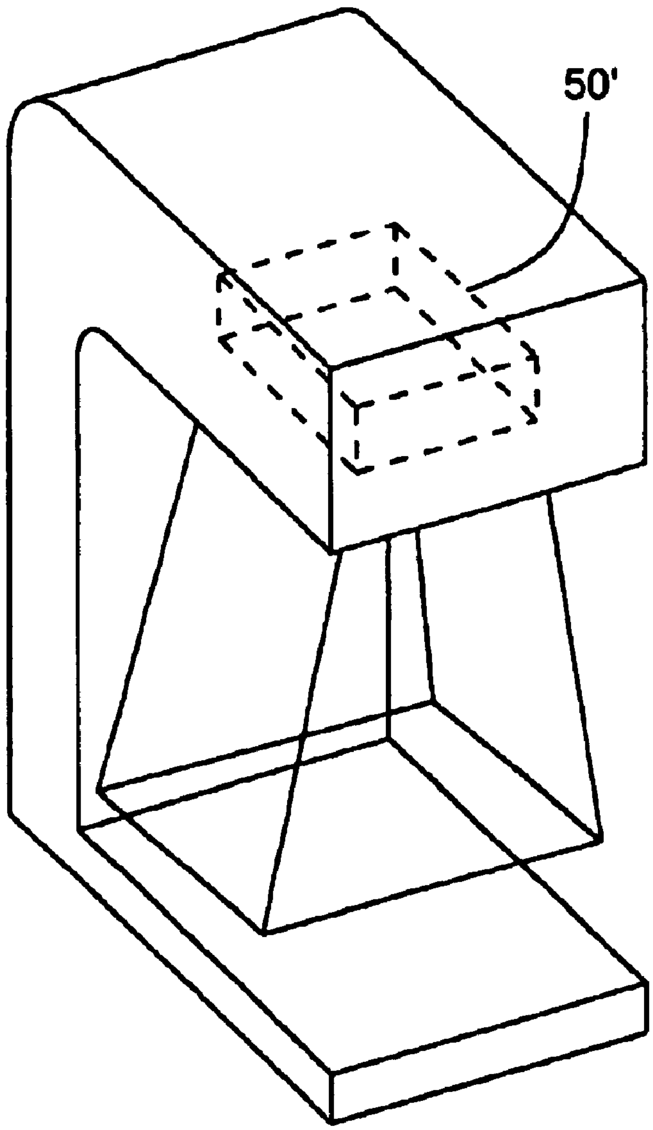
2-D Hold-under Scanner
FIG. 3J6

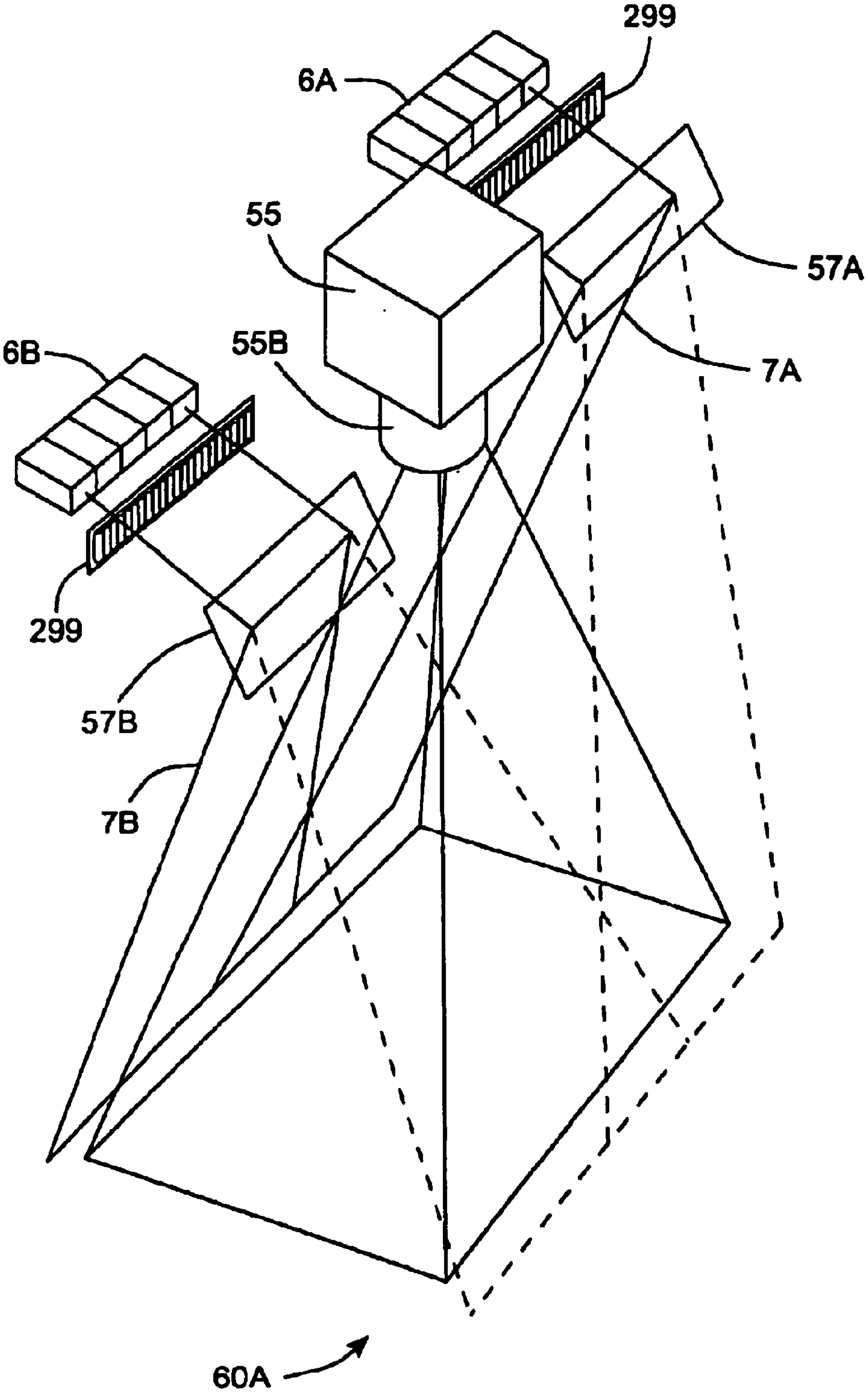
FIG. 4B1

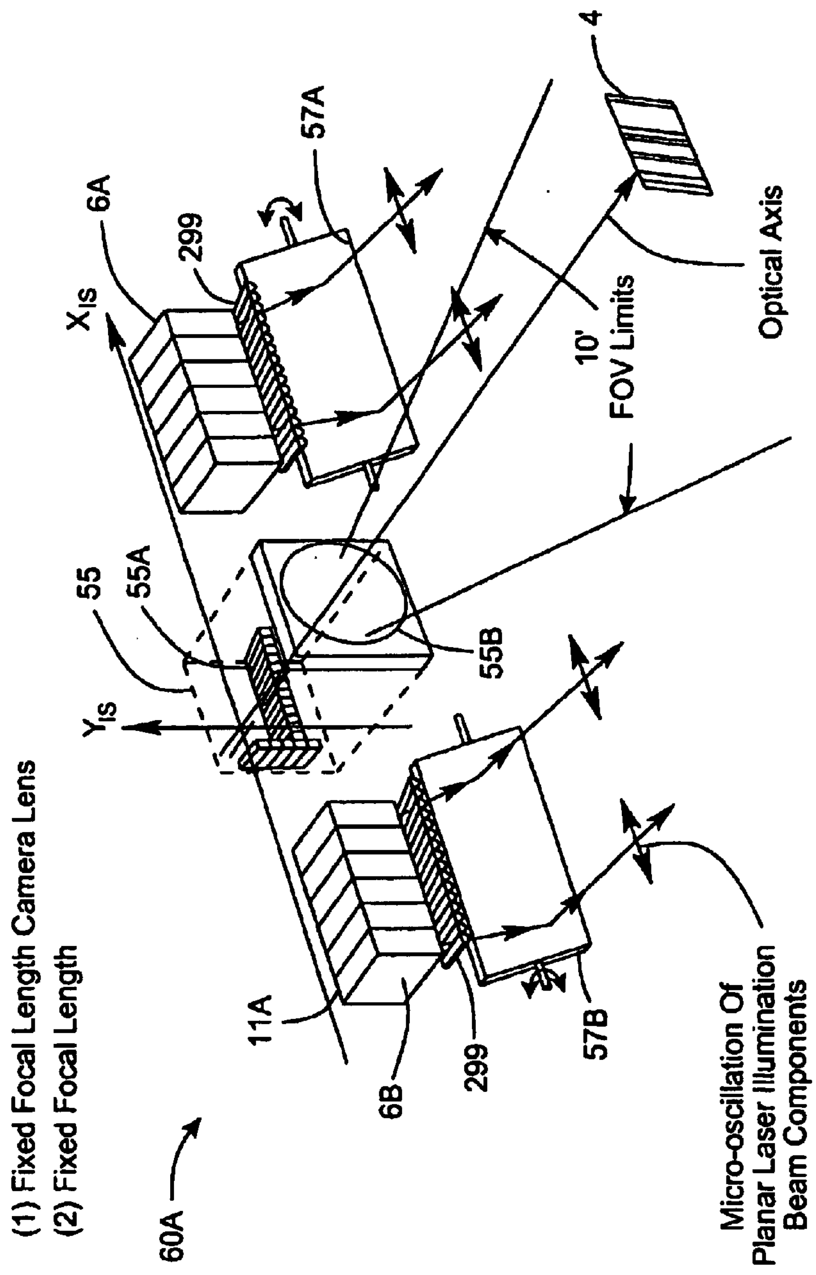
FIG. 4B2

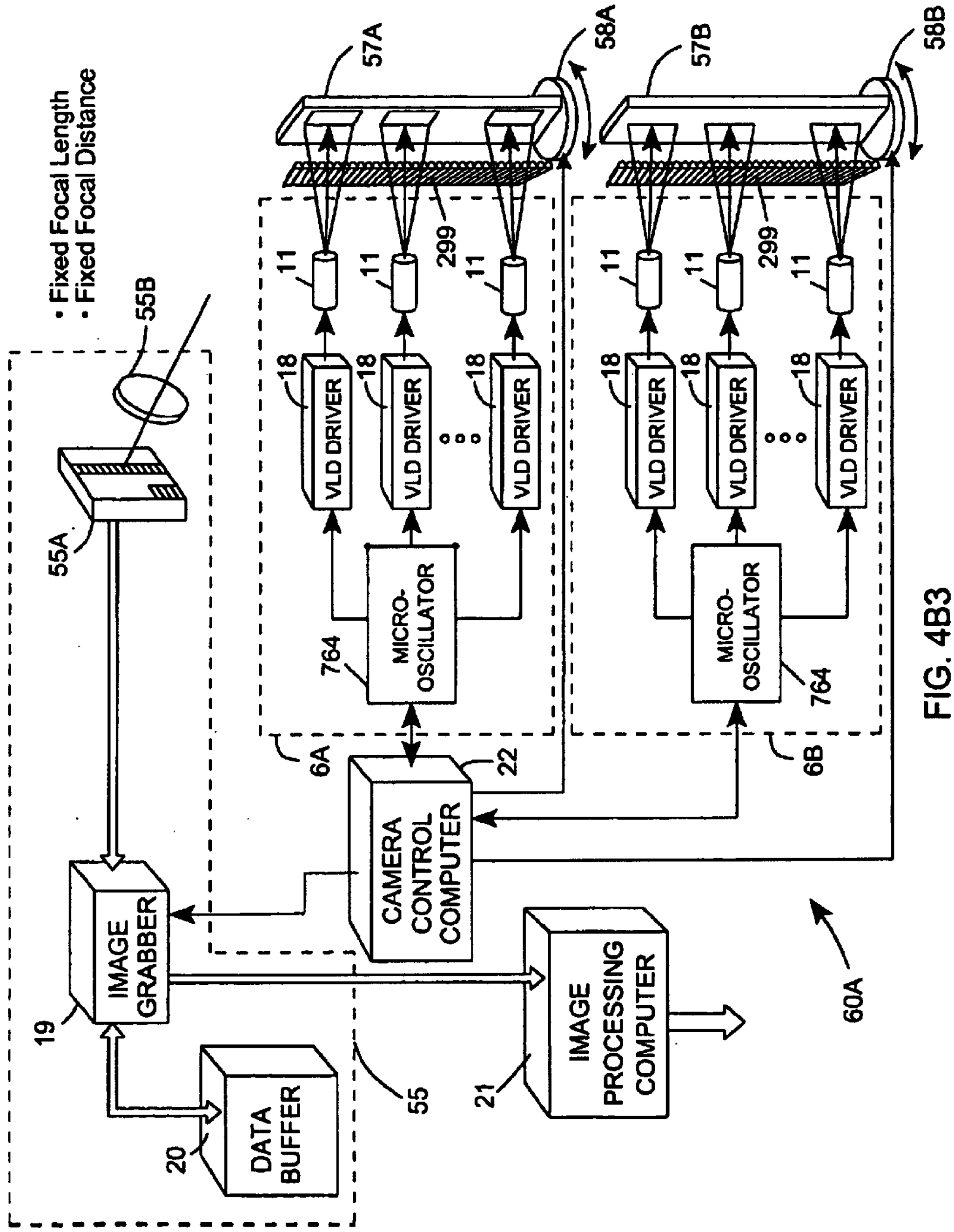
FIG. 4B3

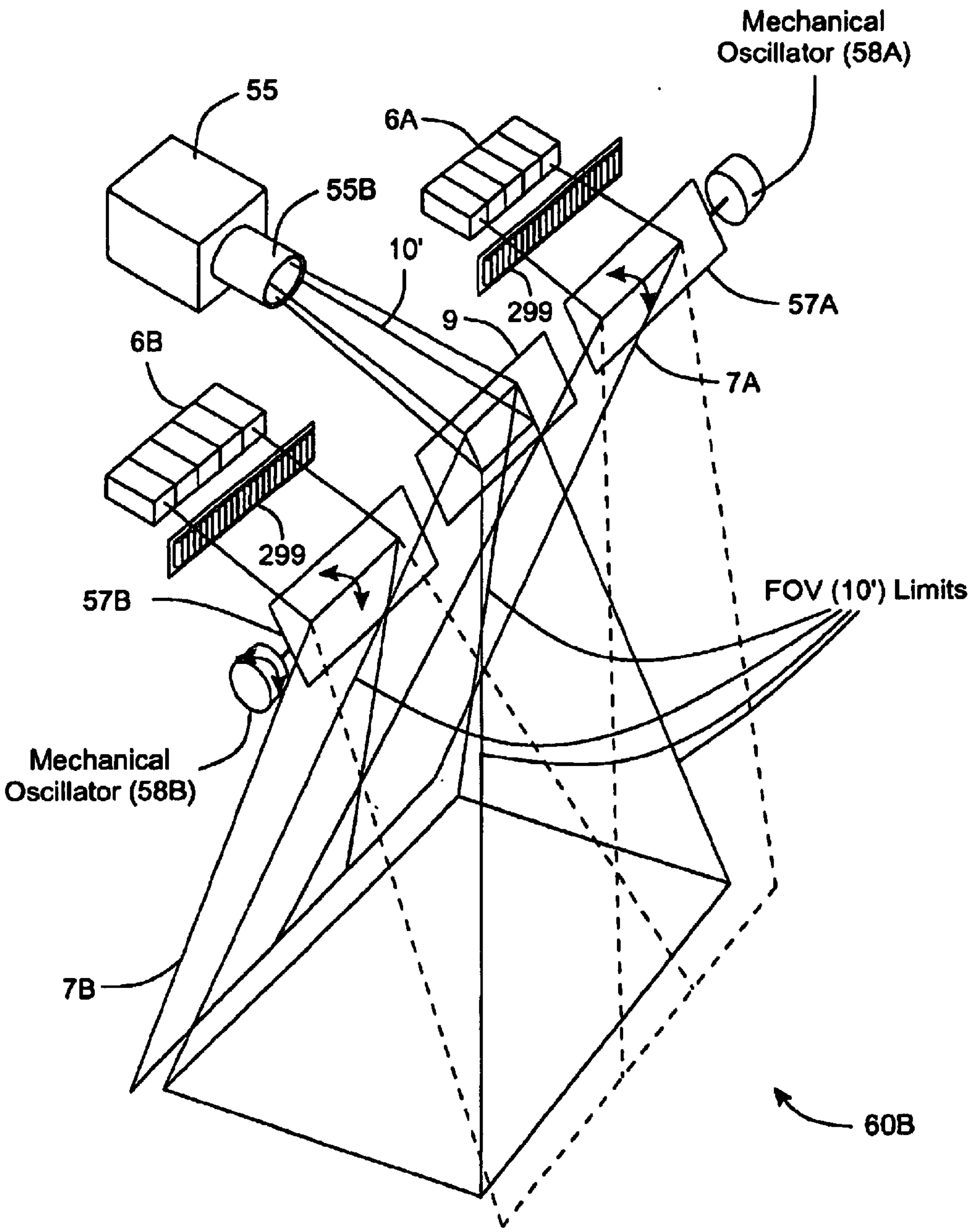
FIG. 4C1

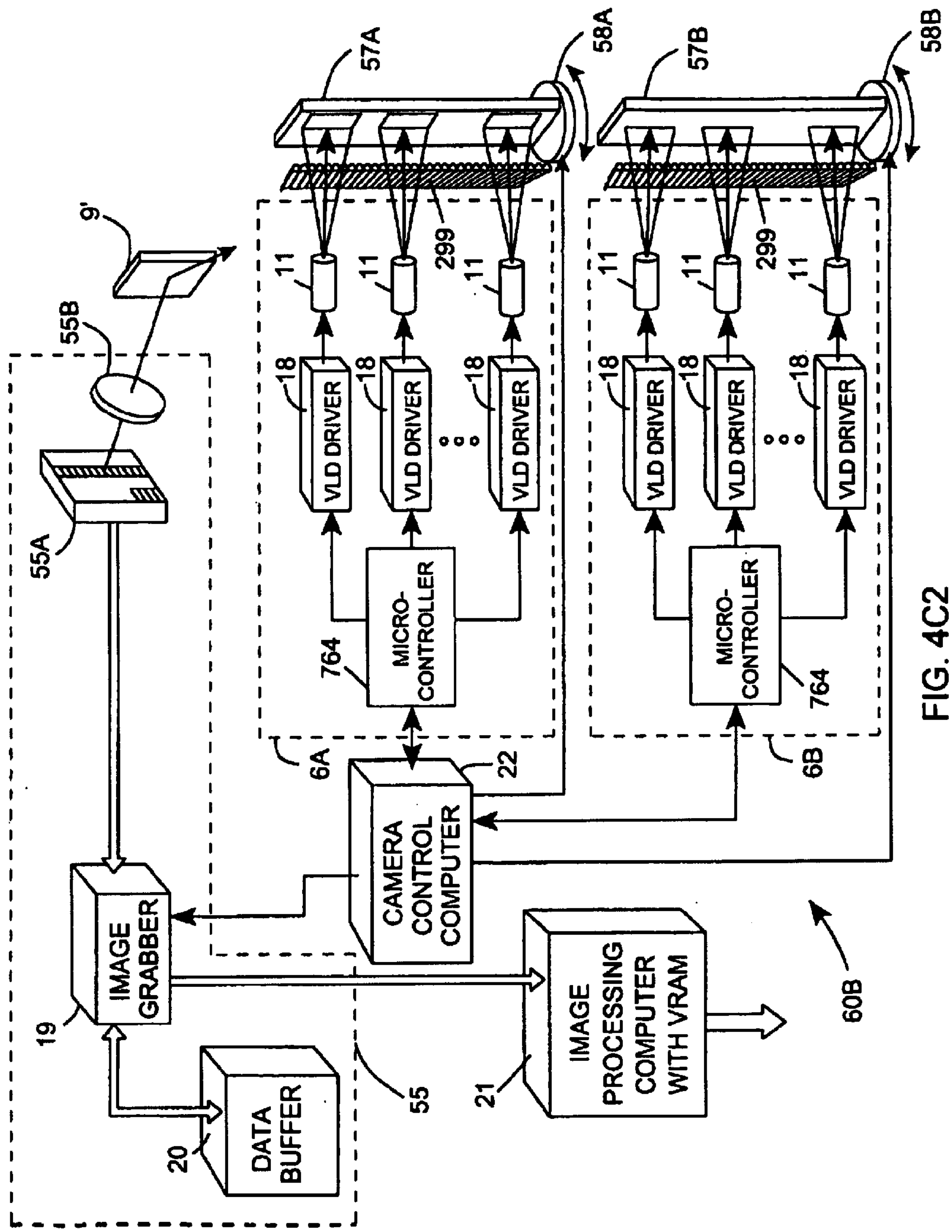
FIG. 4C2

2-D Hold-under Scanner

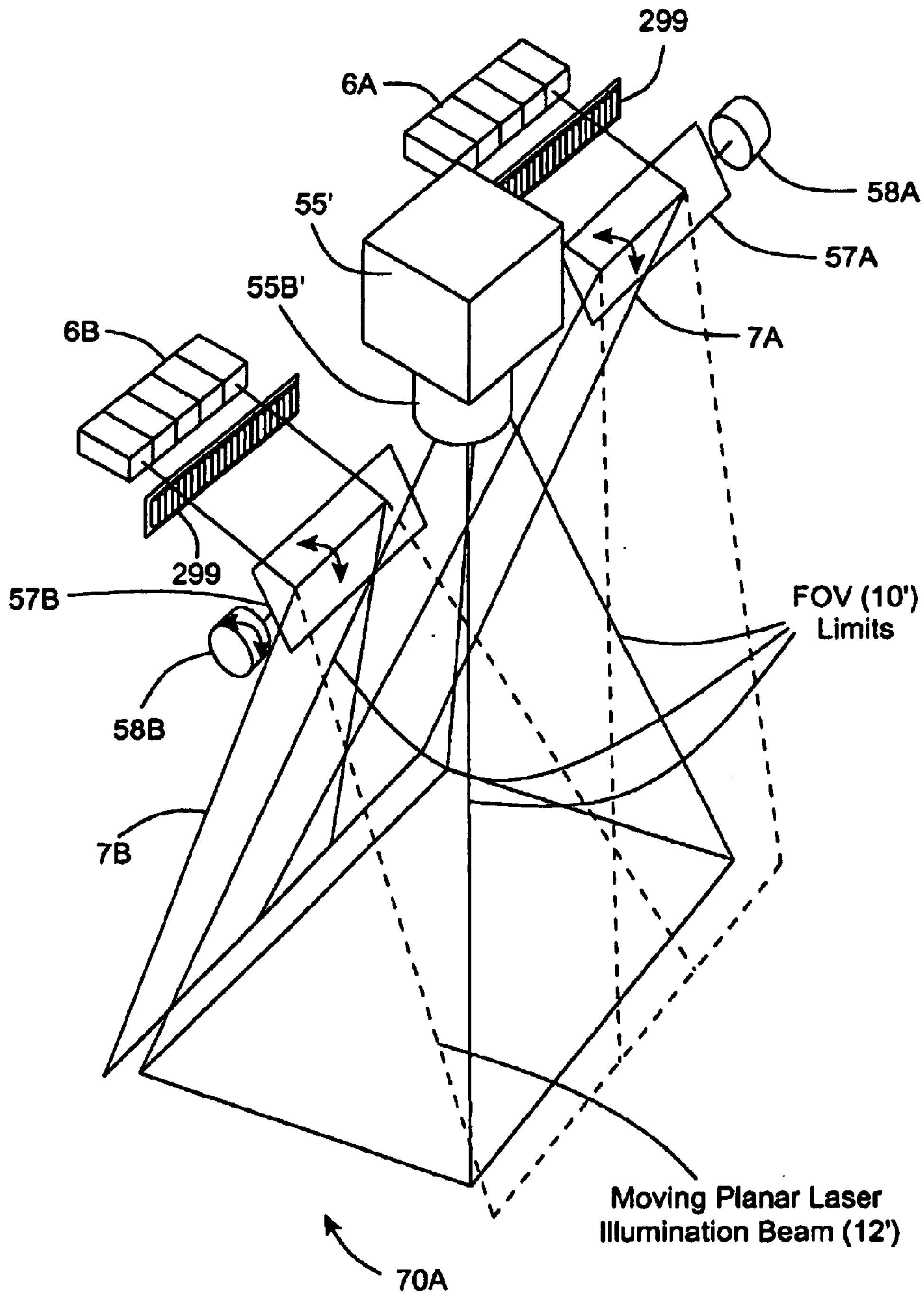
FIG. 5B1

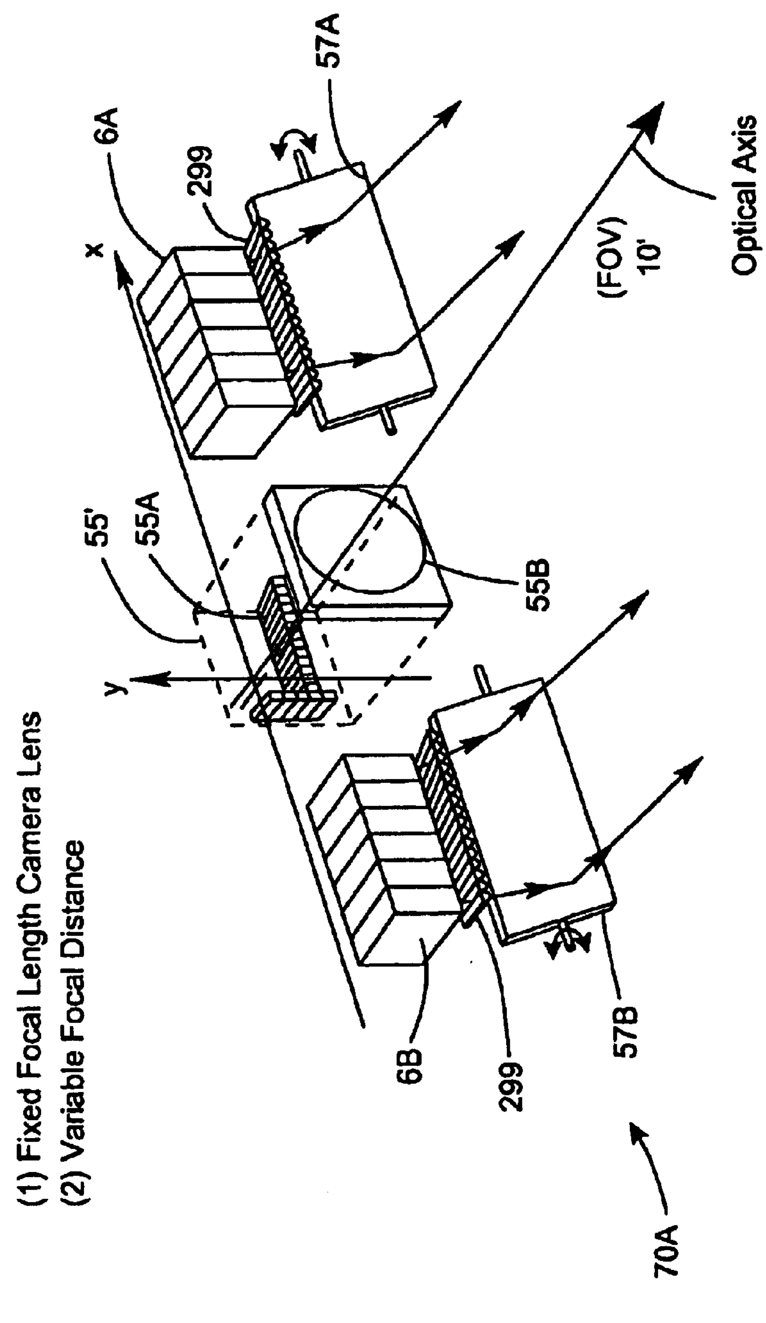
FIG. 5B2

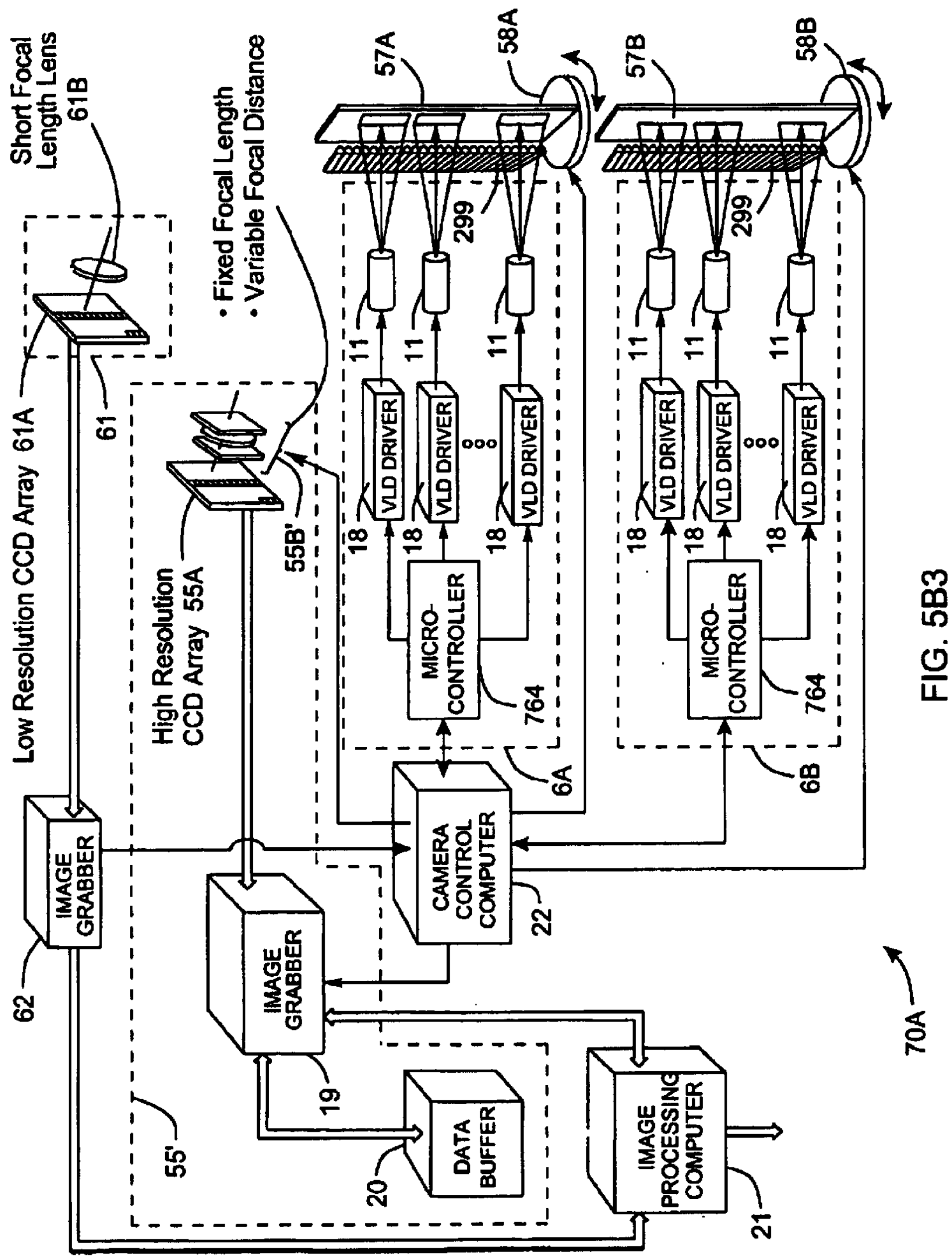
FIG. 5B3

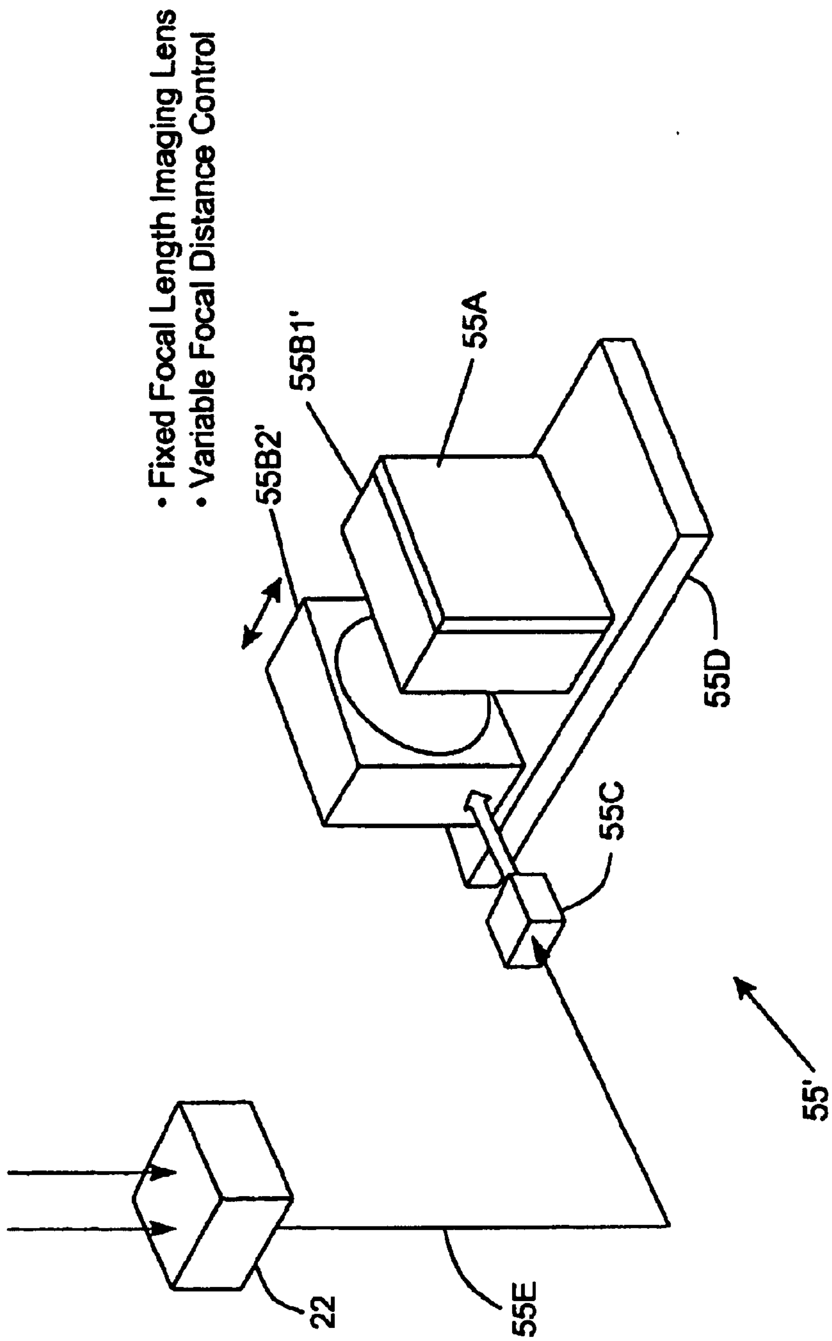
FIG. 5B4

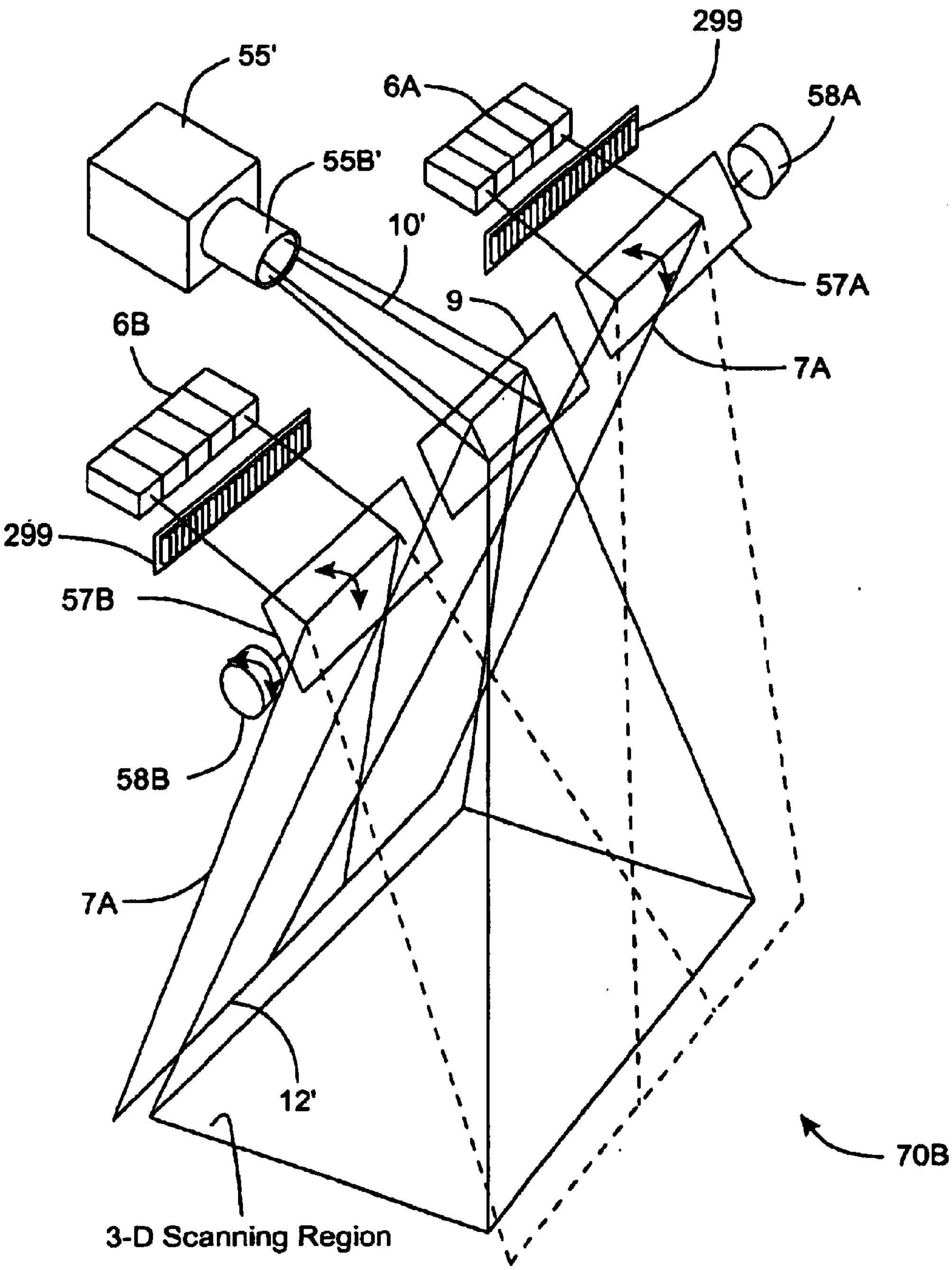
FIG. 5C1

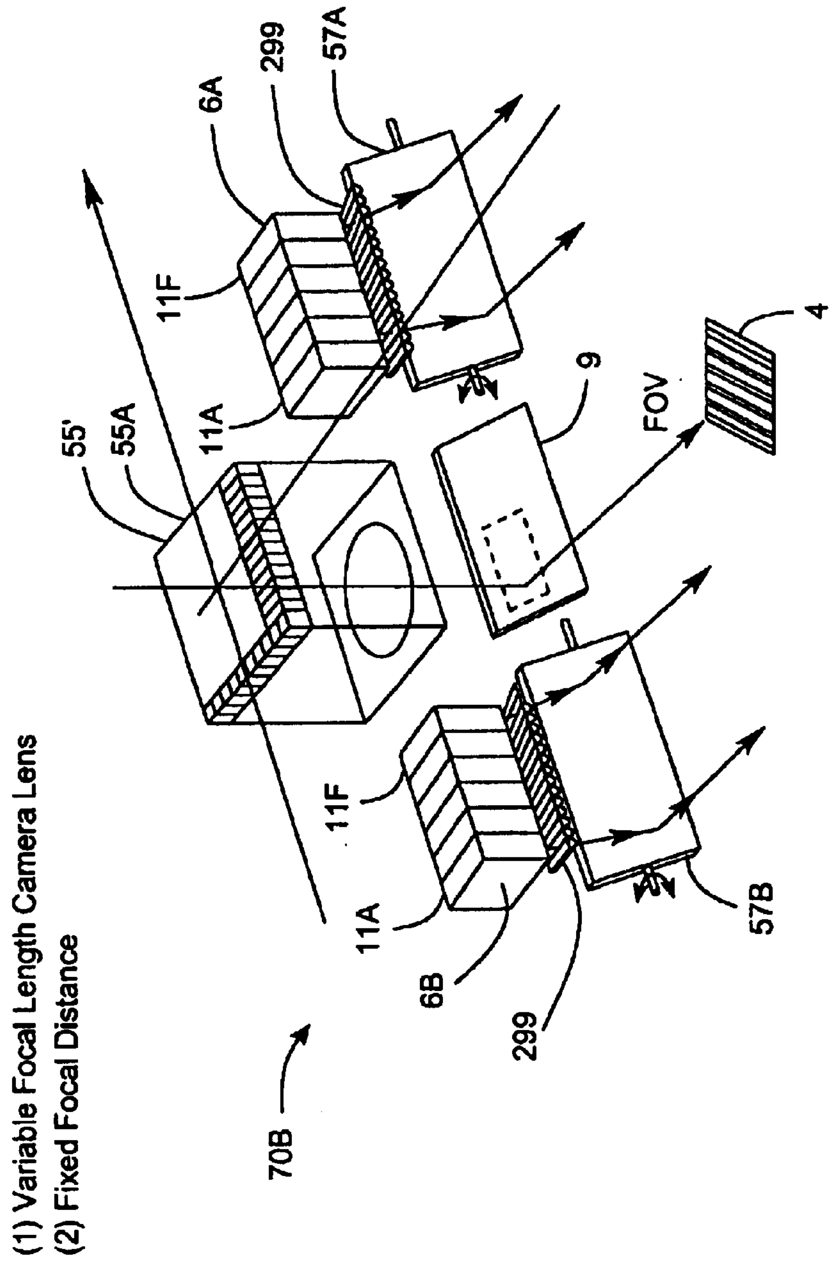
FIG. 5C2

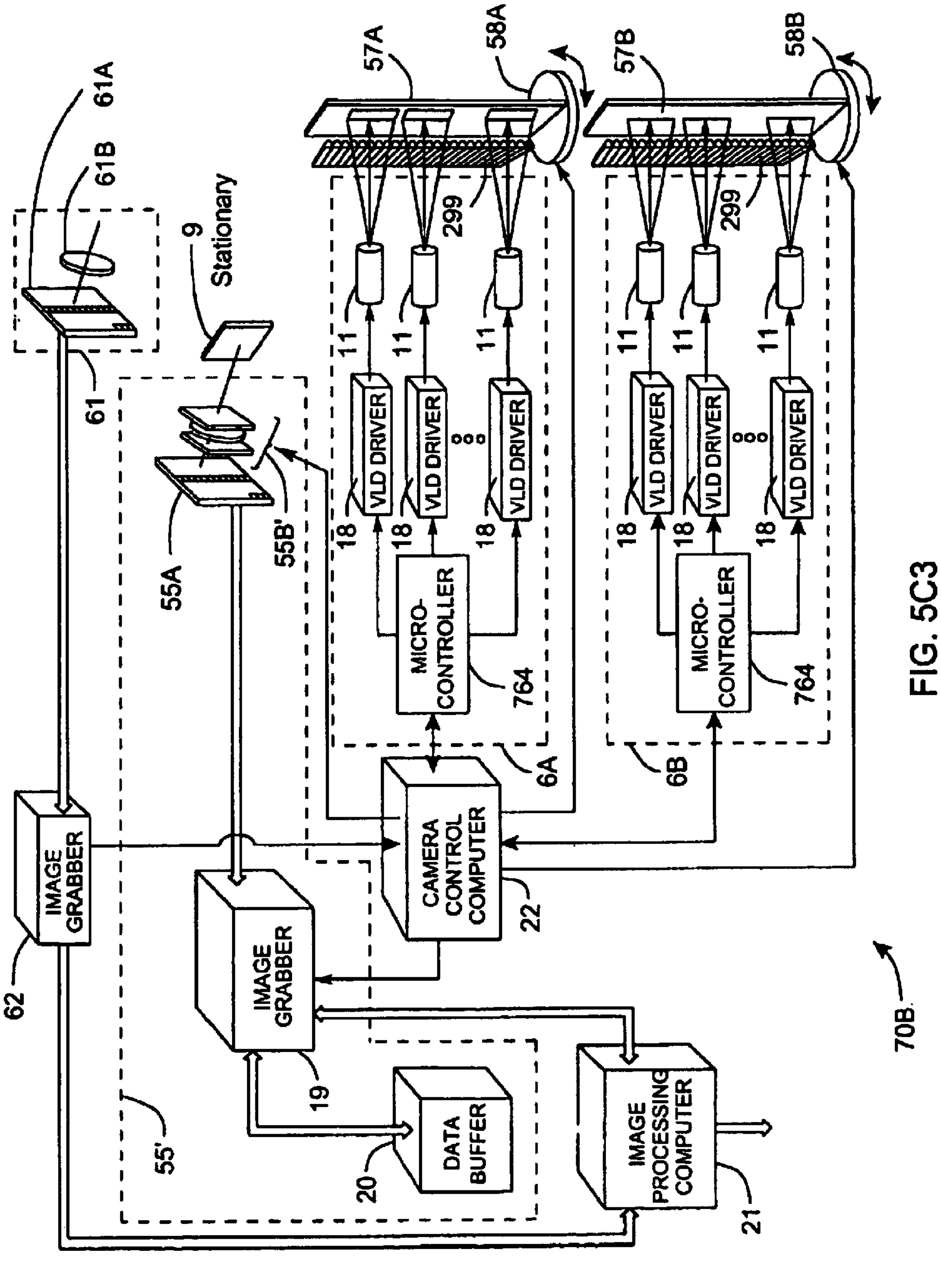
FIG. 5C3

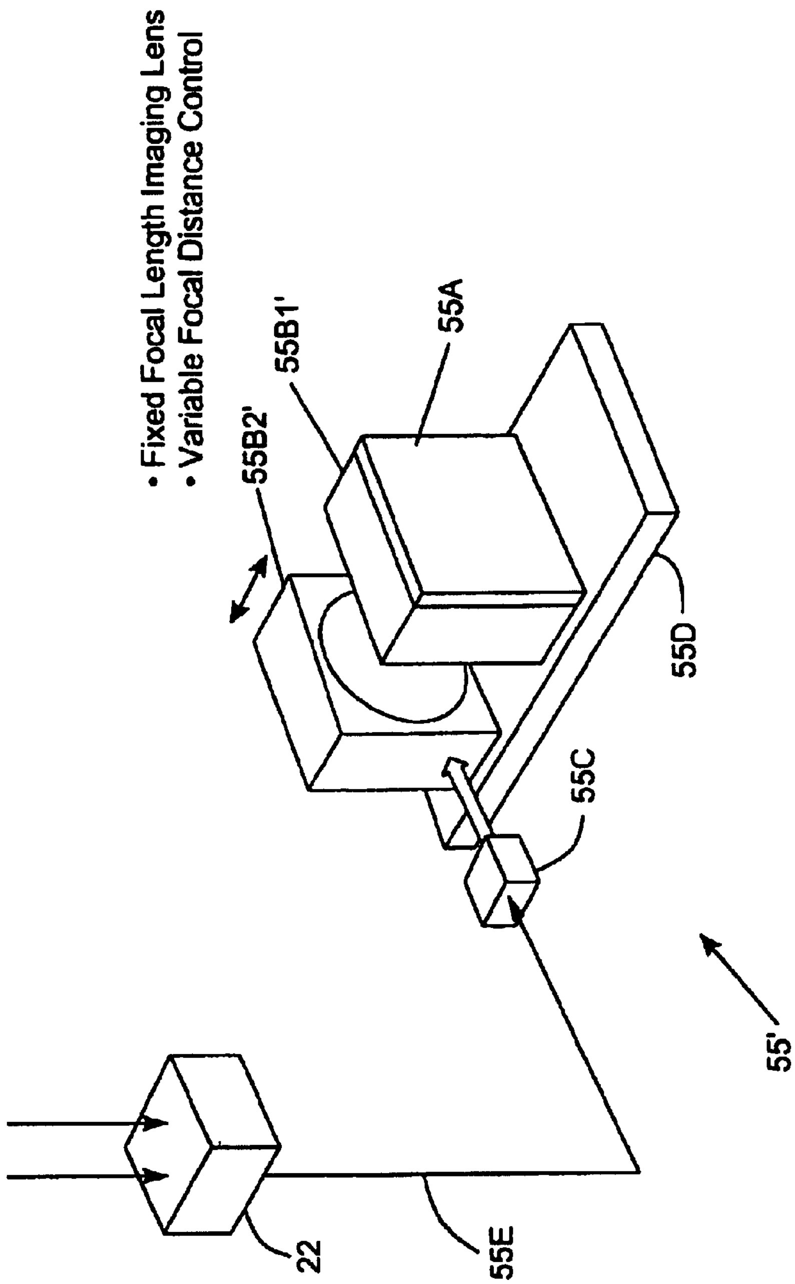
FIG. 5C4

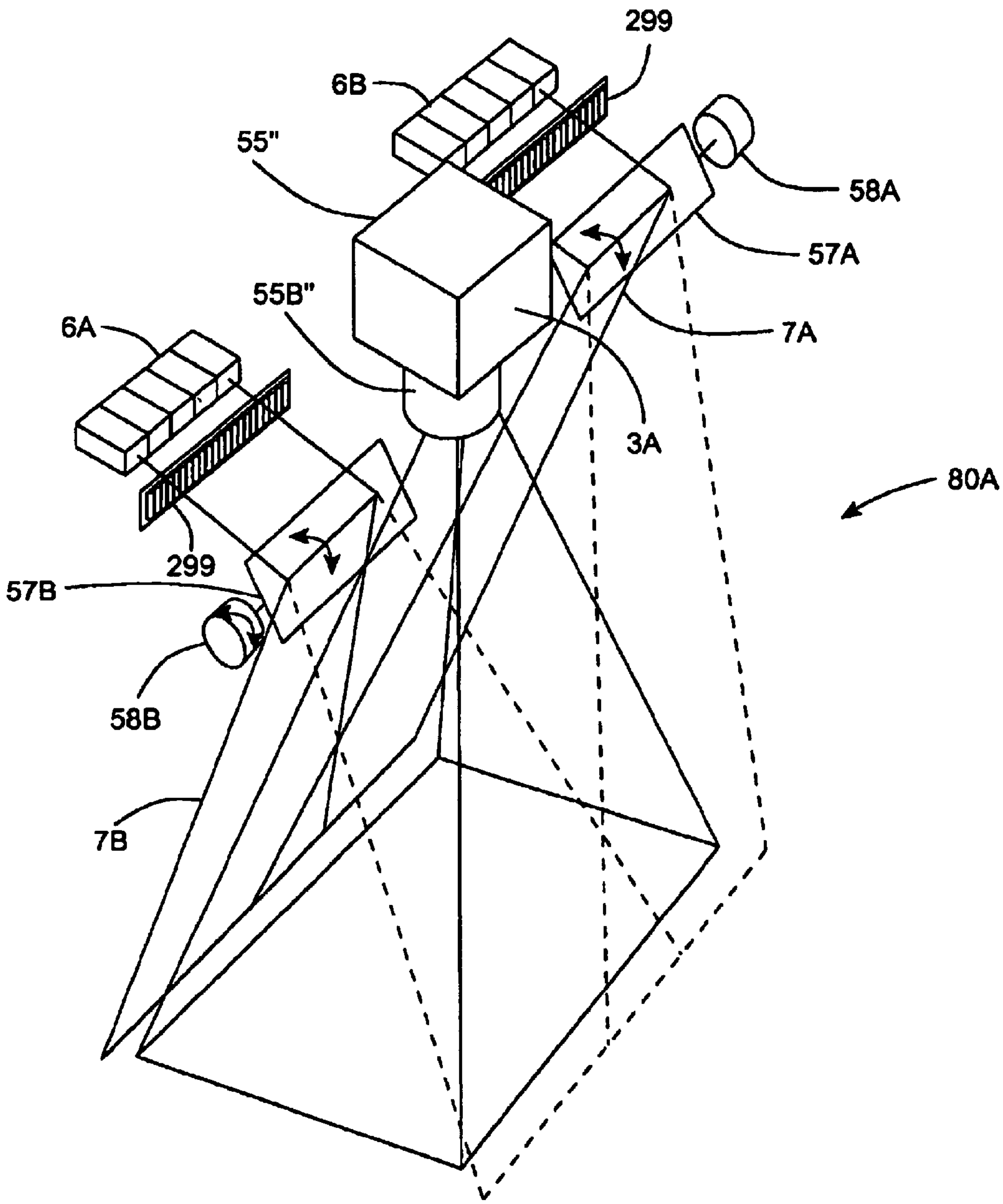
FIG. 6B1

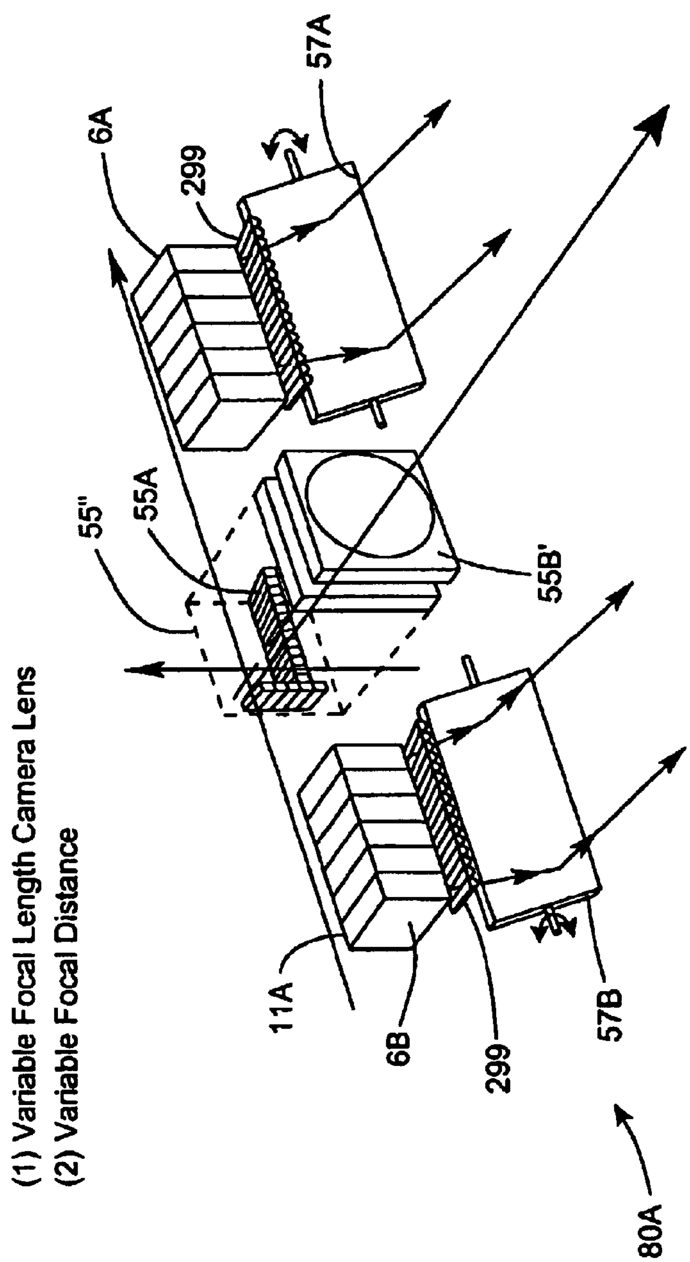
FIG. 6B2

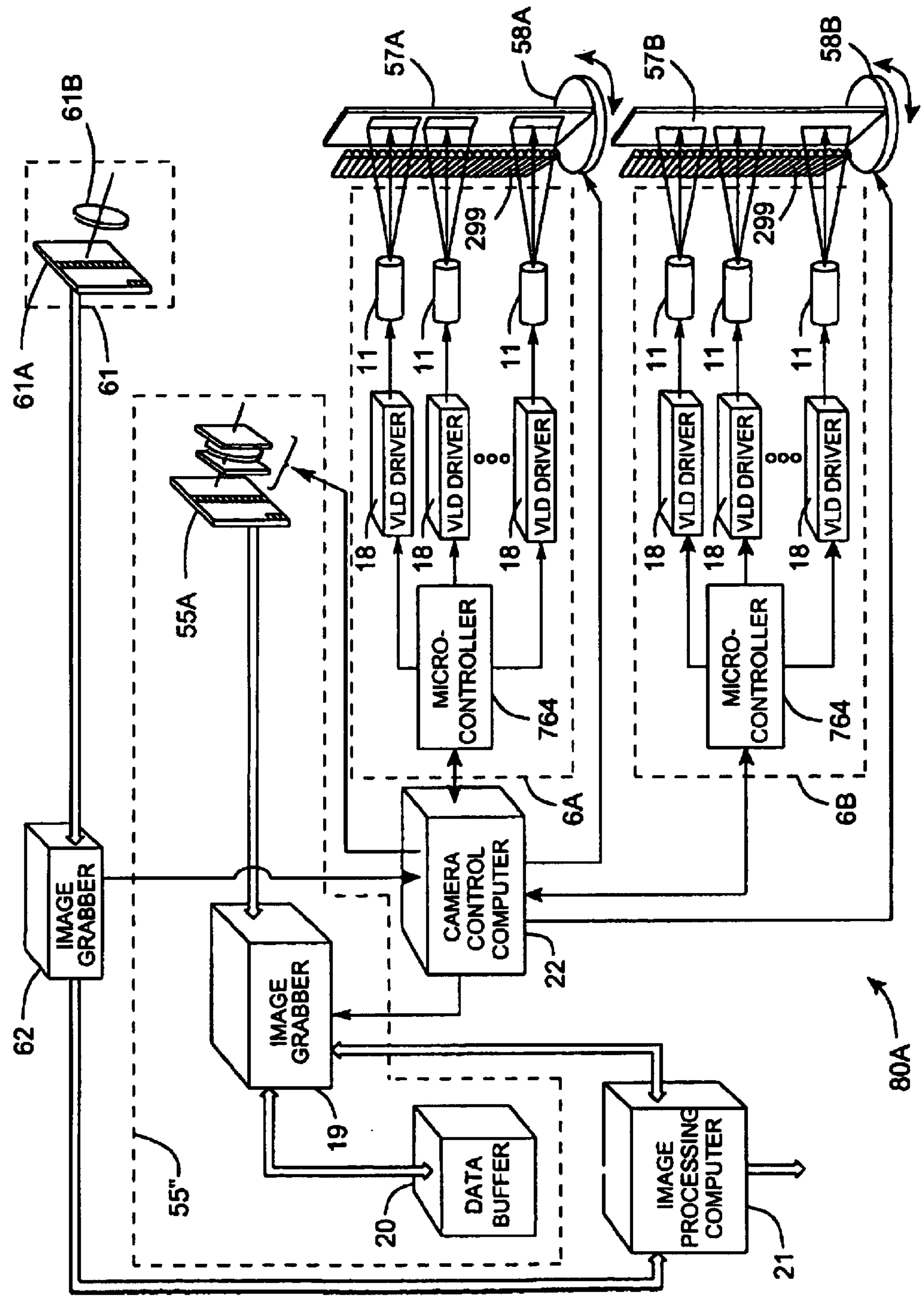
FIG. 6B3

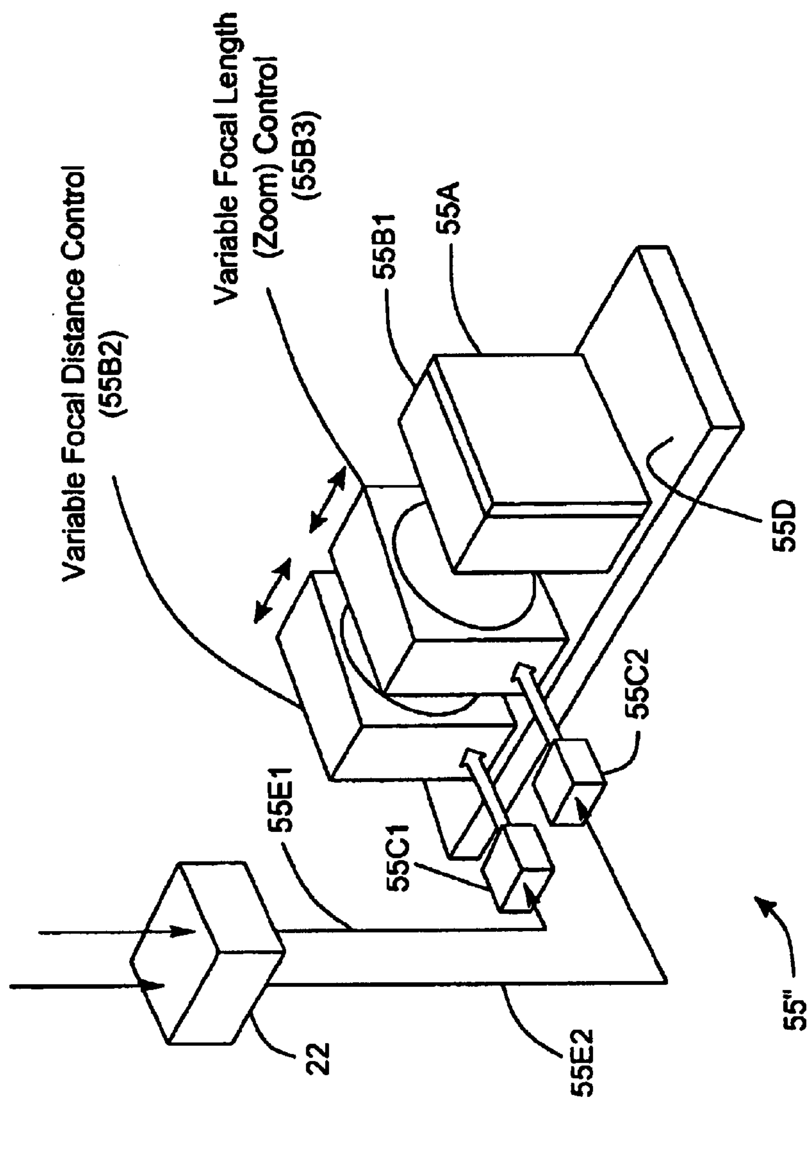
FIG. 6B4

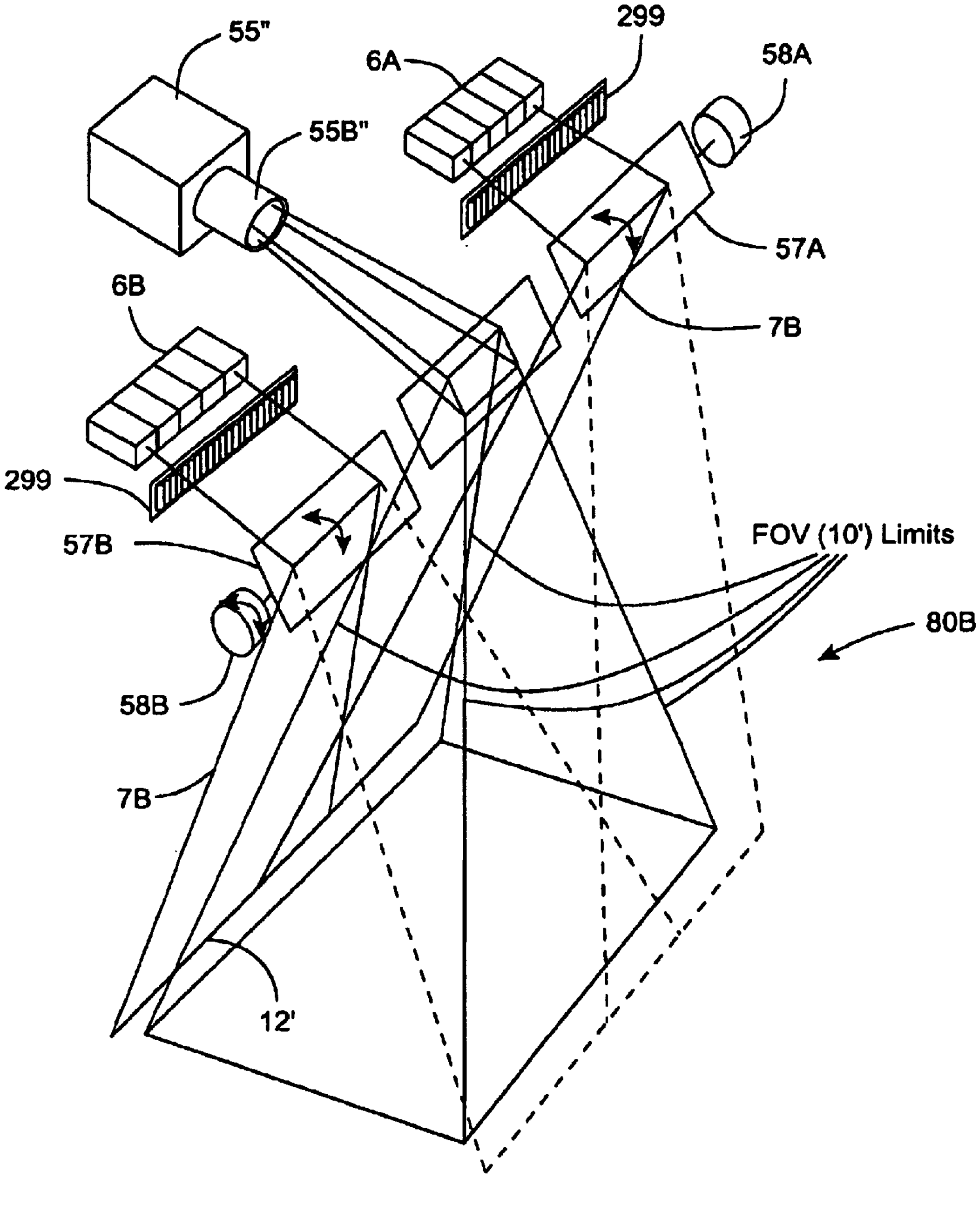
FIG. 6C1

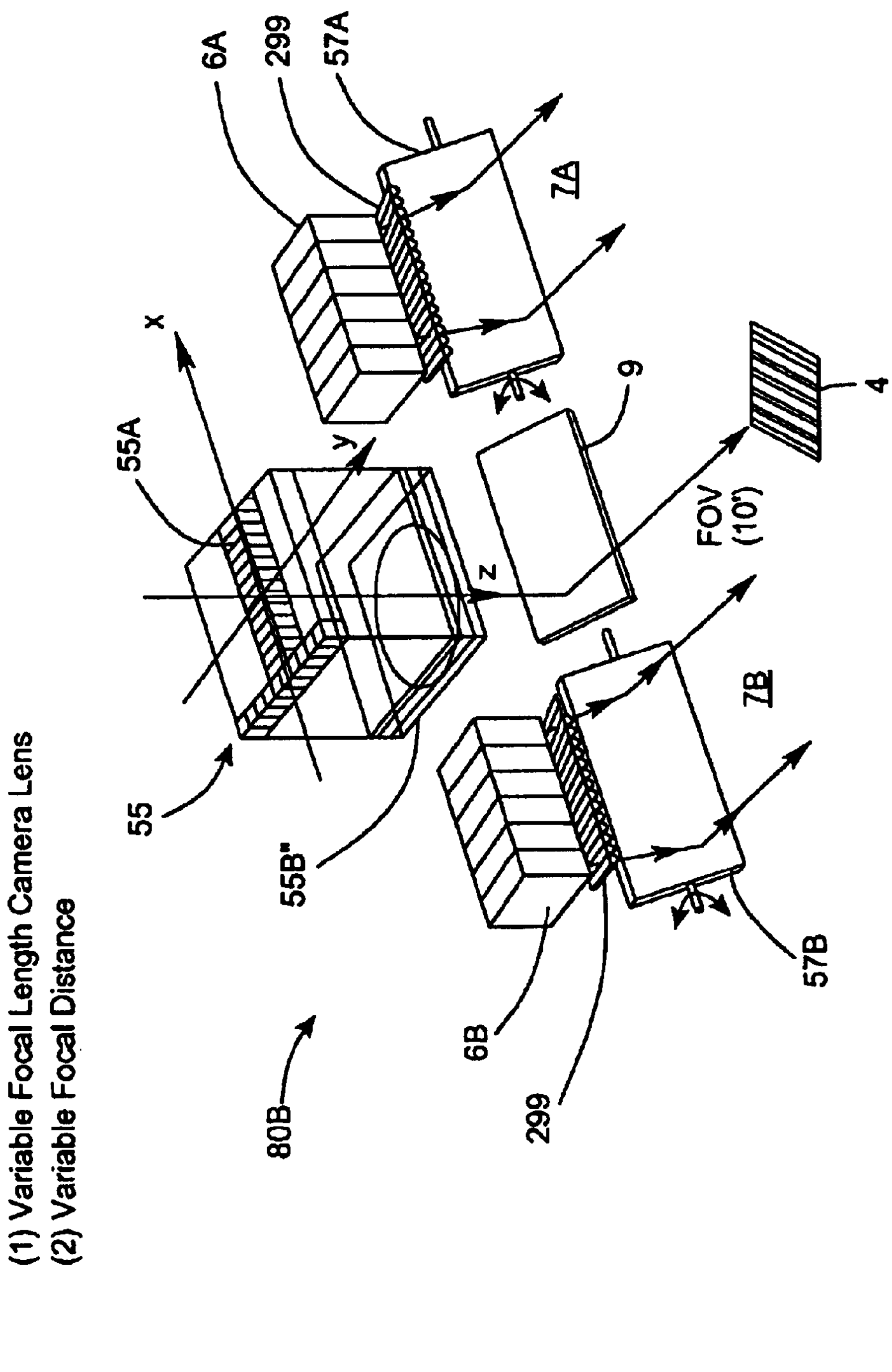
FIG. 6C2

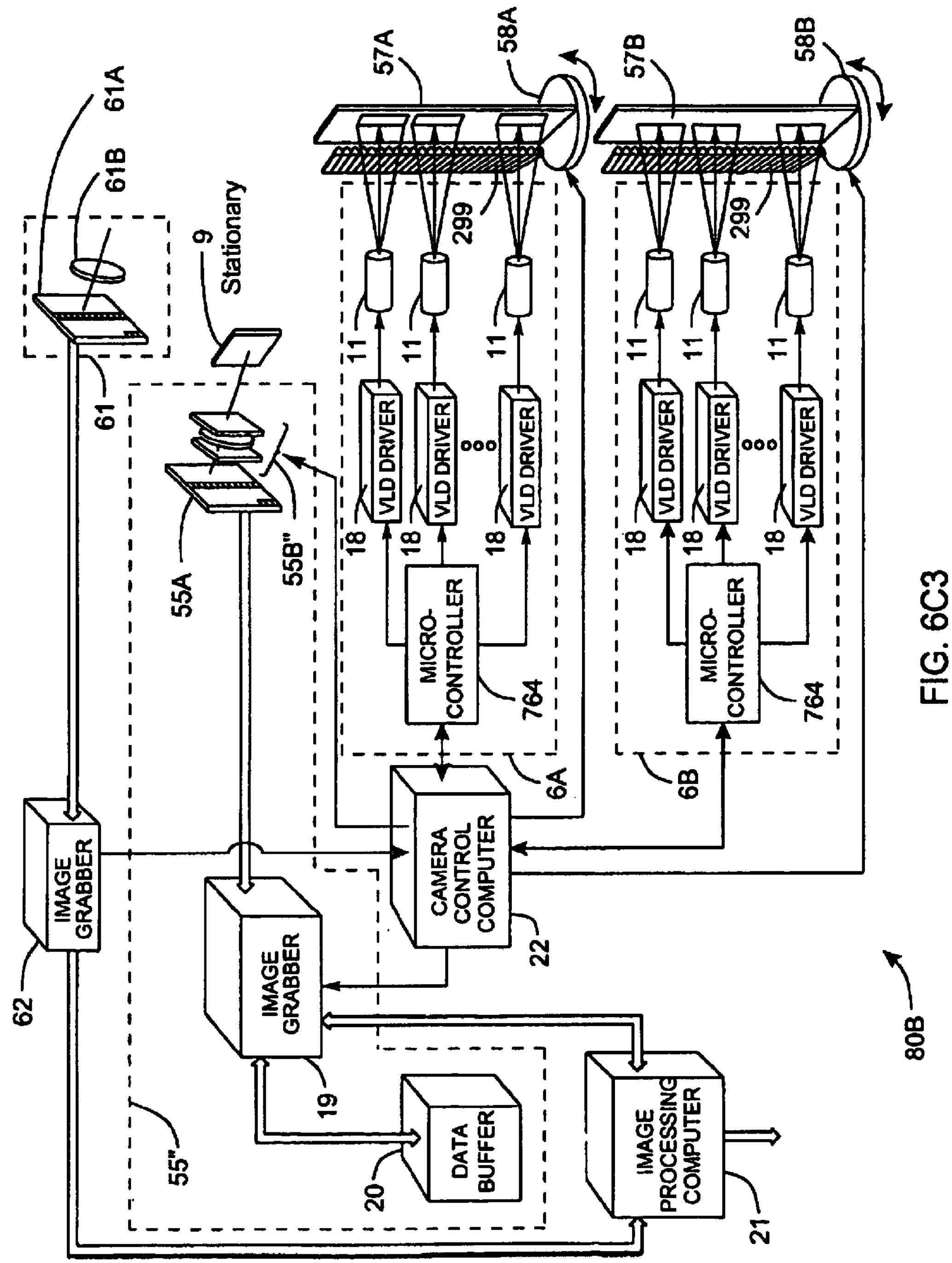
FIG. 6C3

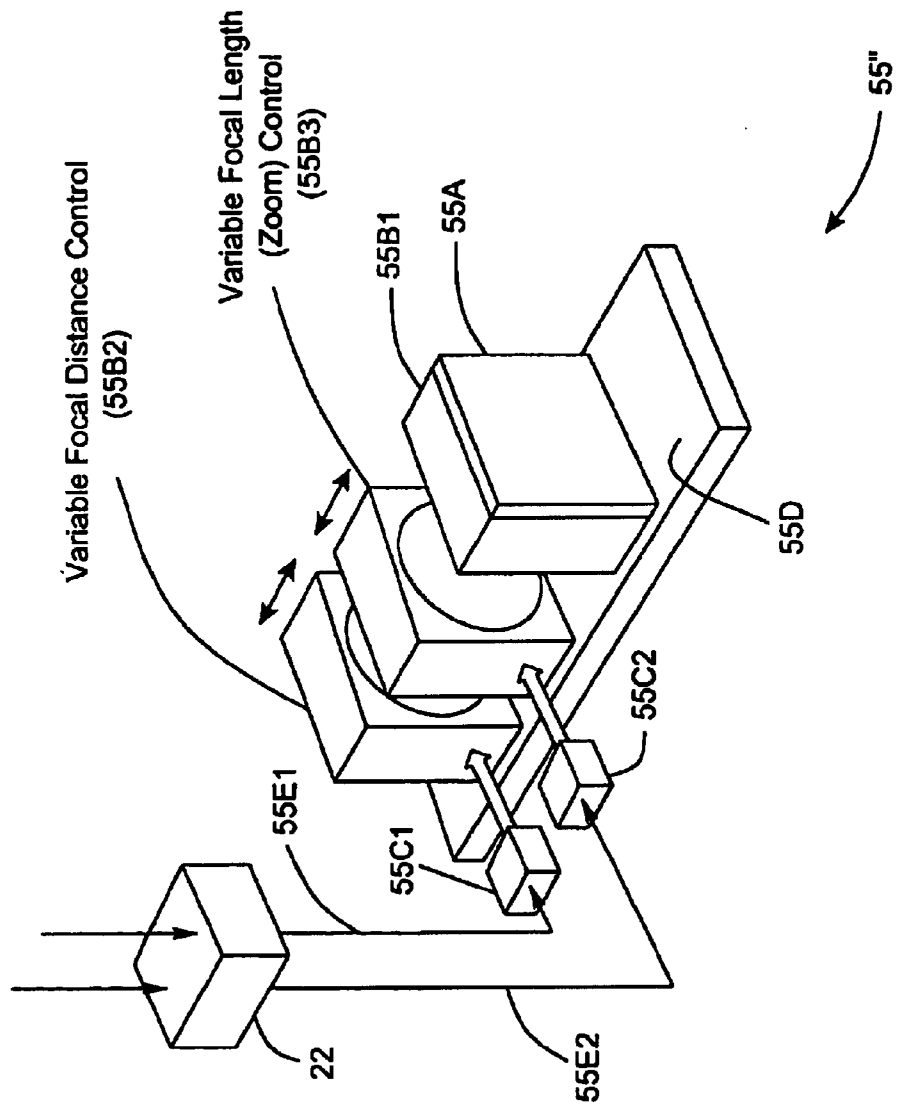
FIG. 6C4

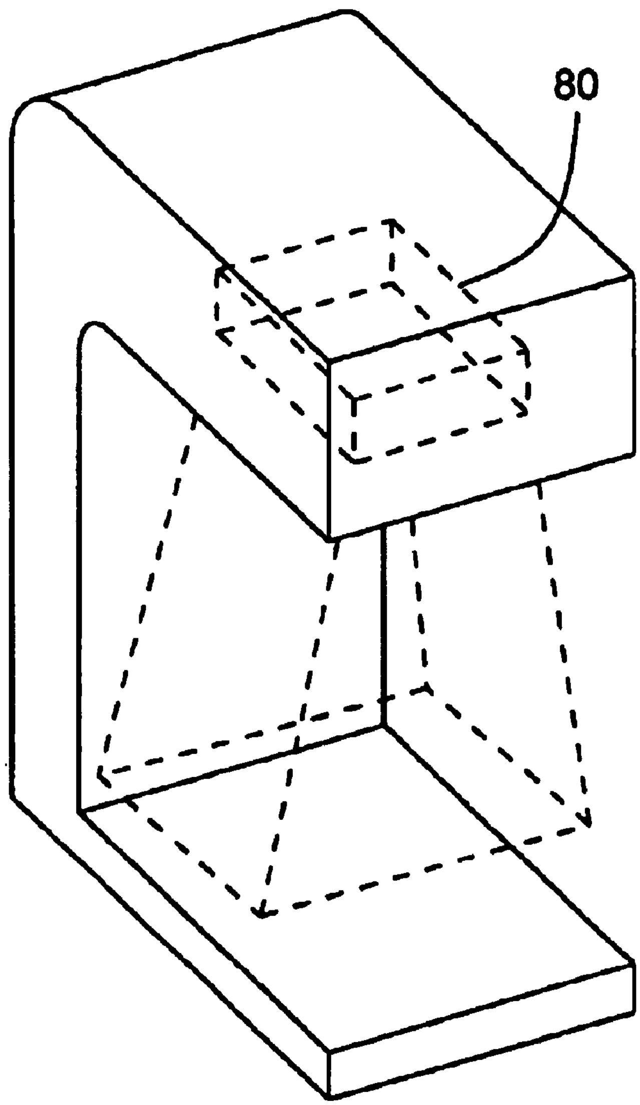
FIG. 6C5

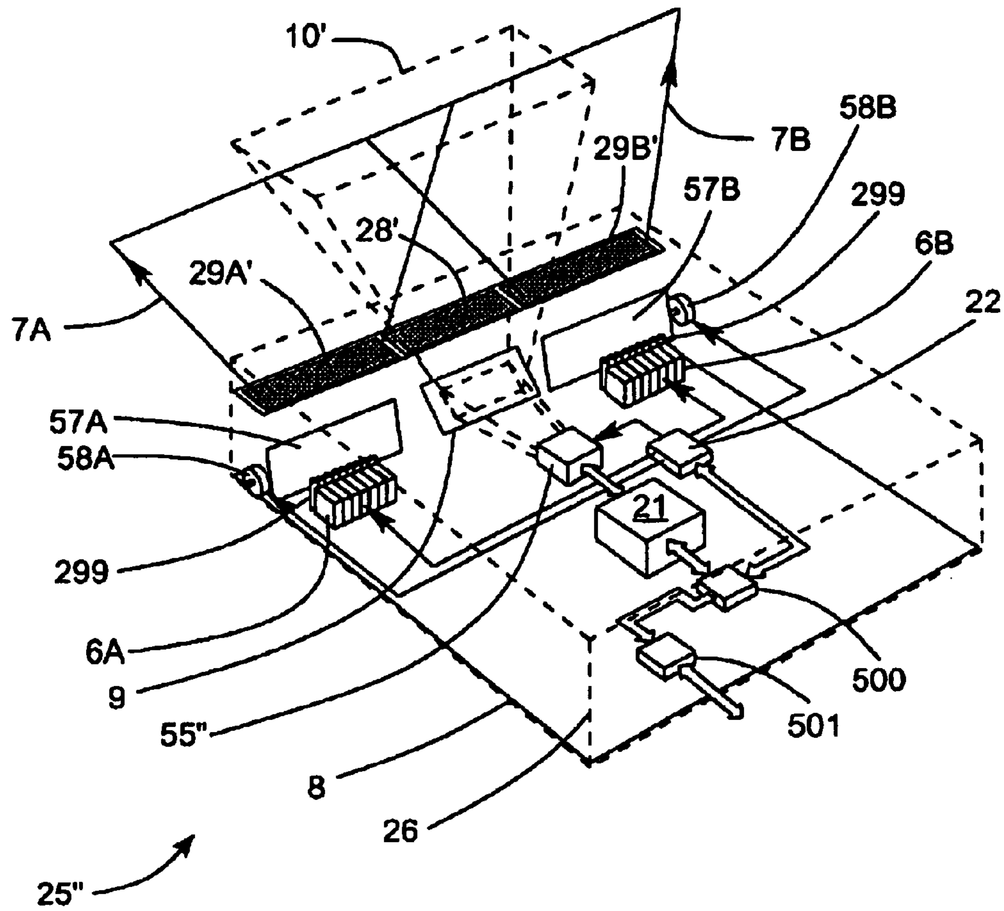
FIG. 6D1

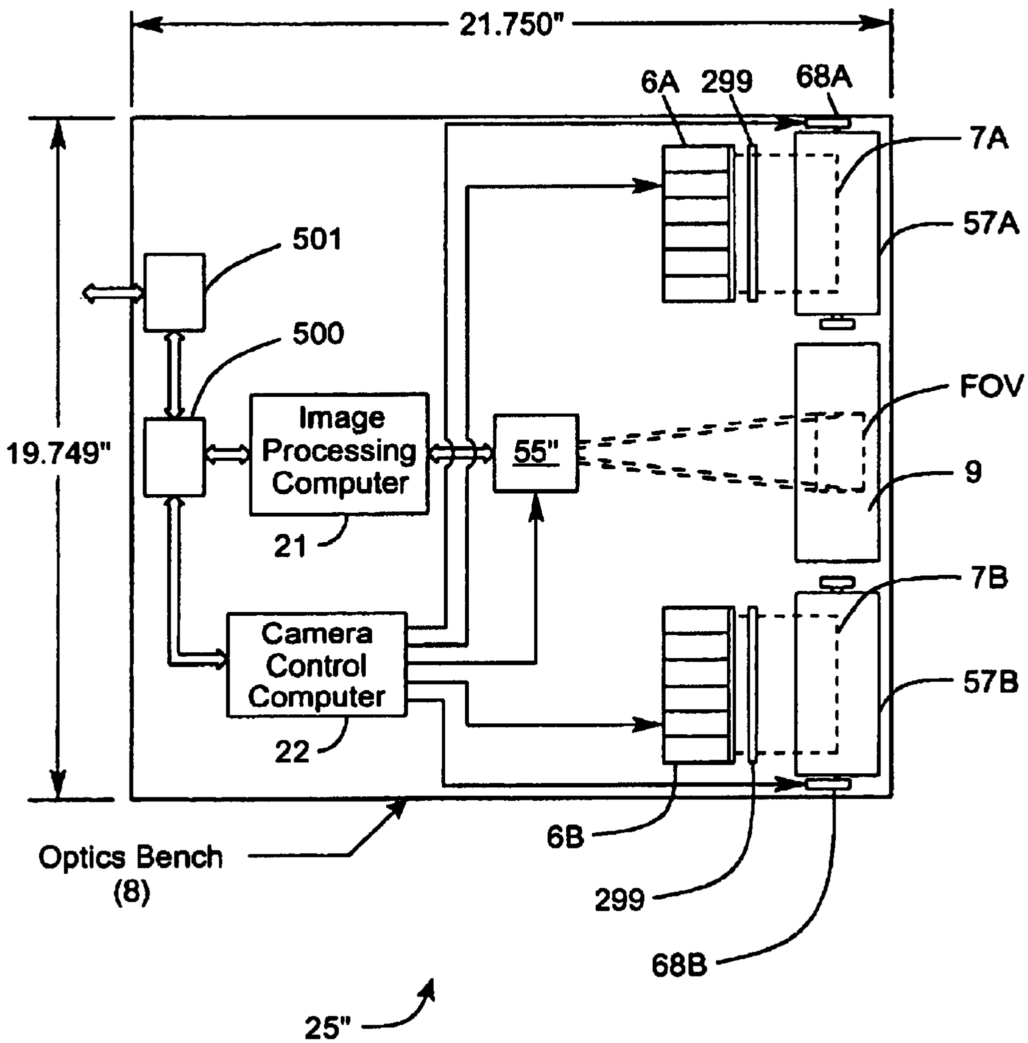
FIG. 6D2

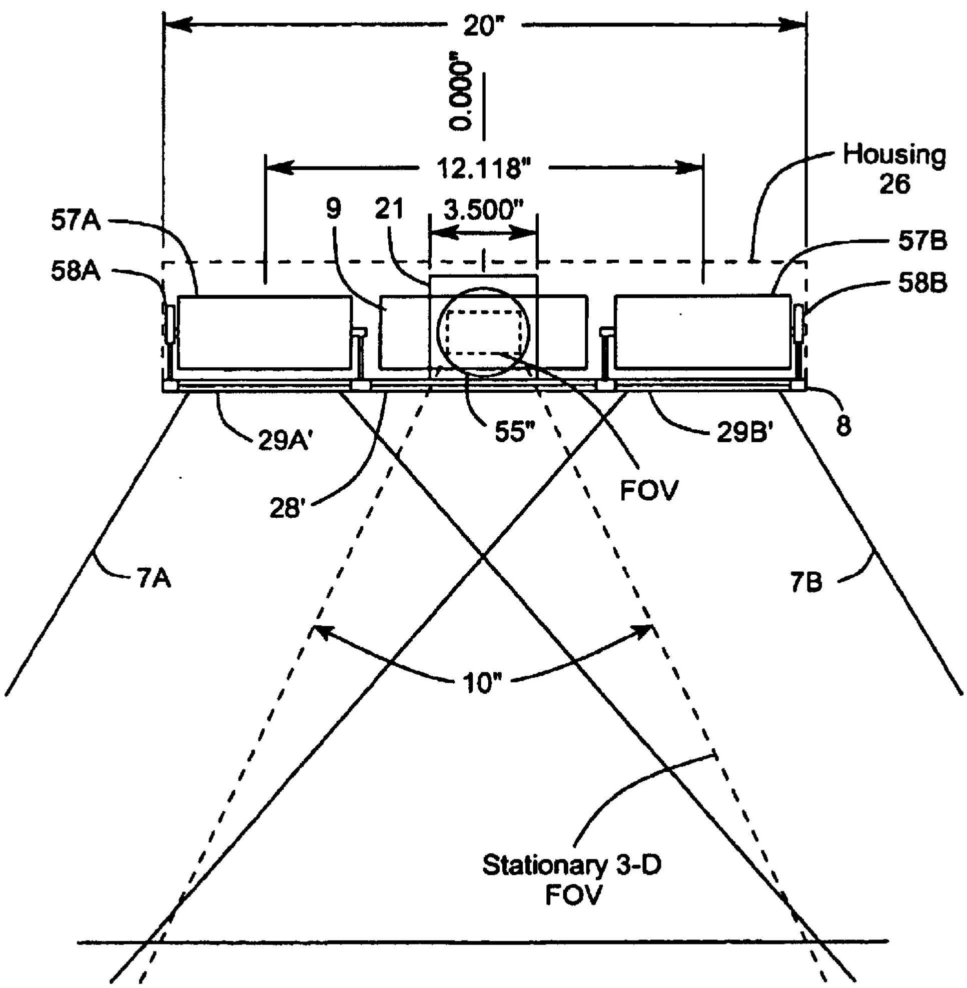
FIG. 6D3

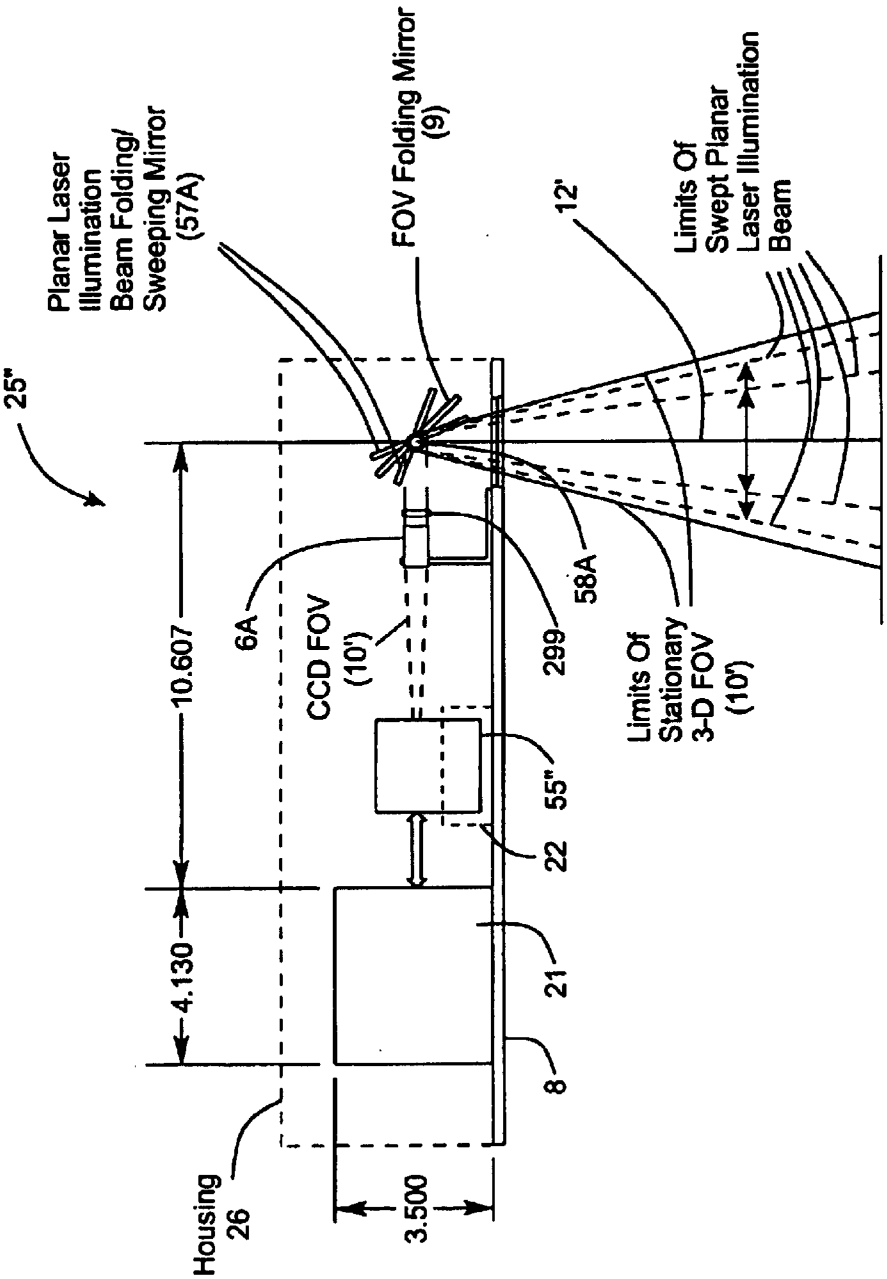
FIG. 6D4

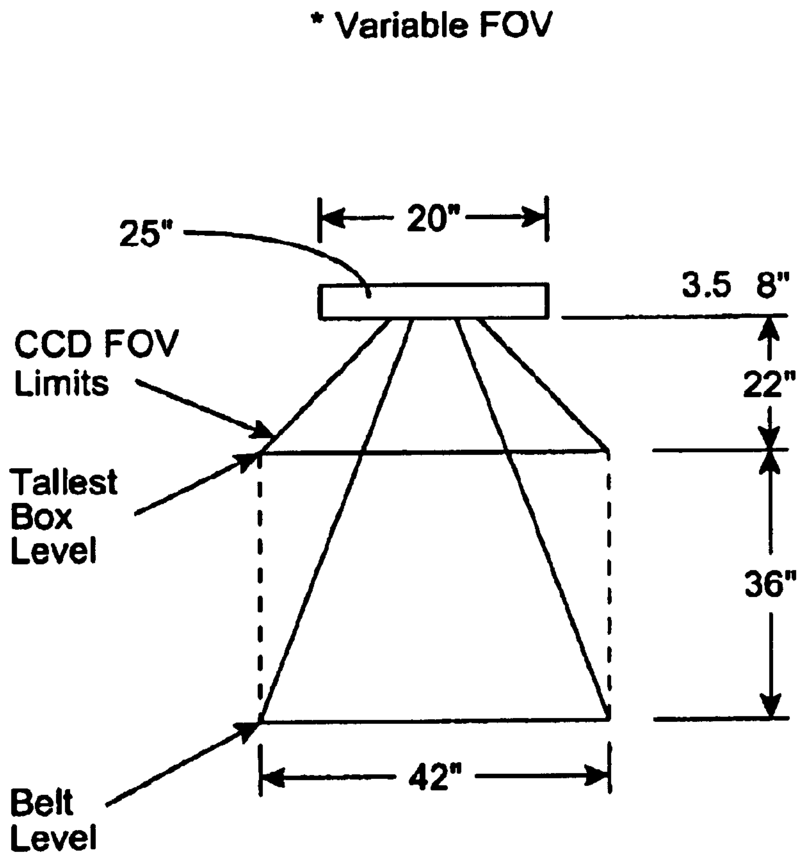
FIG. 6D5

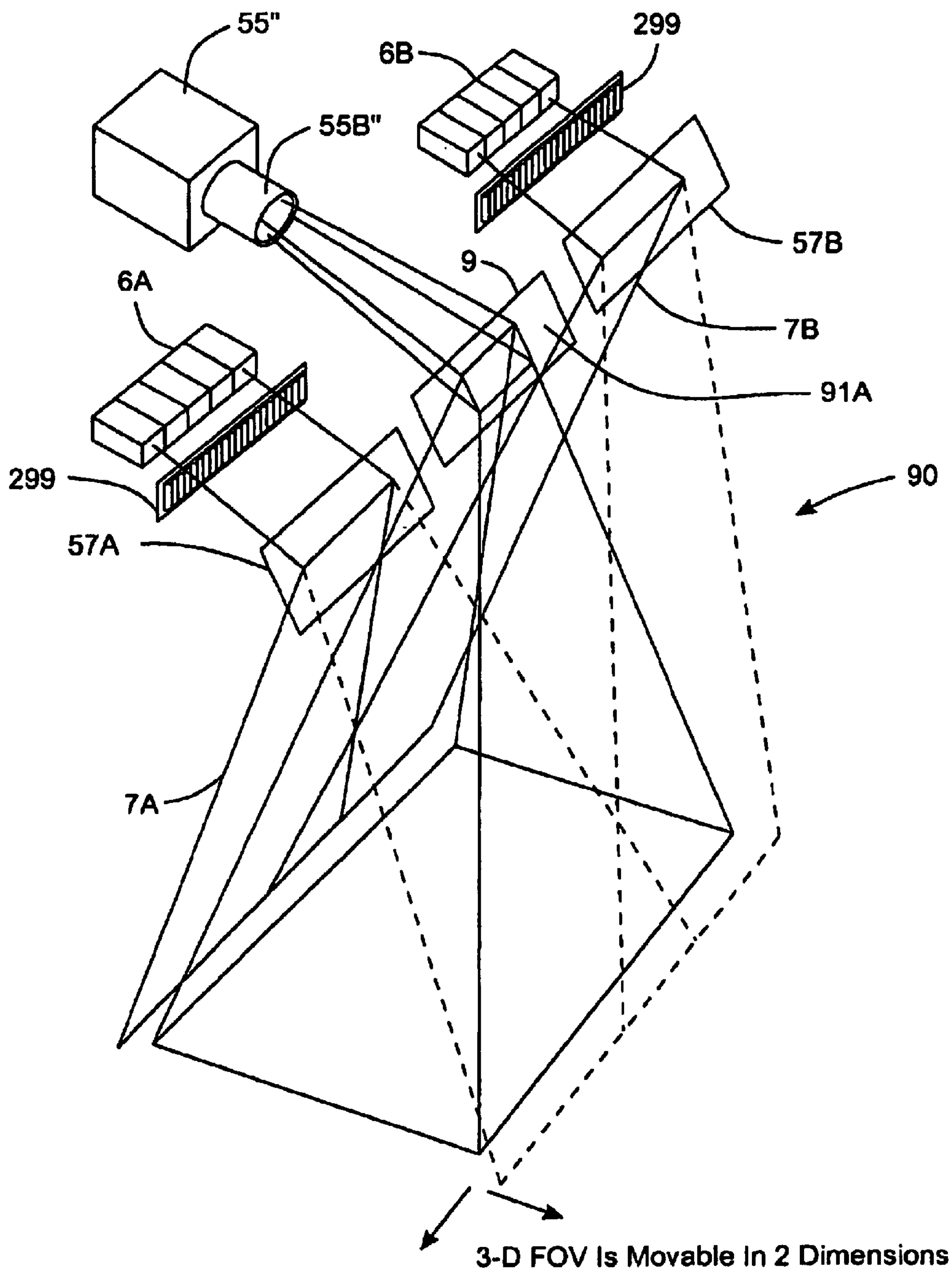
FIG. 6E1

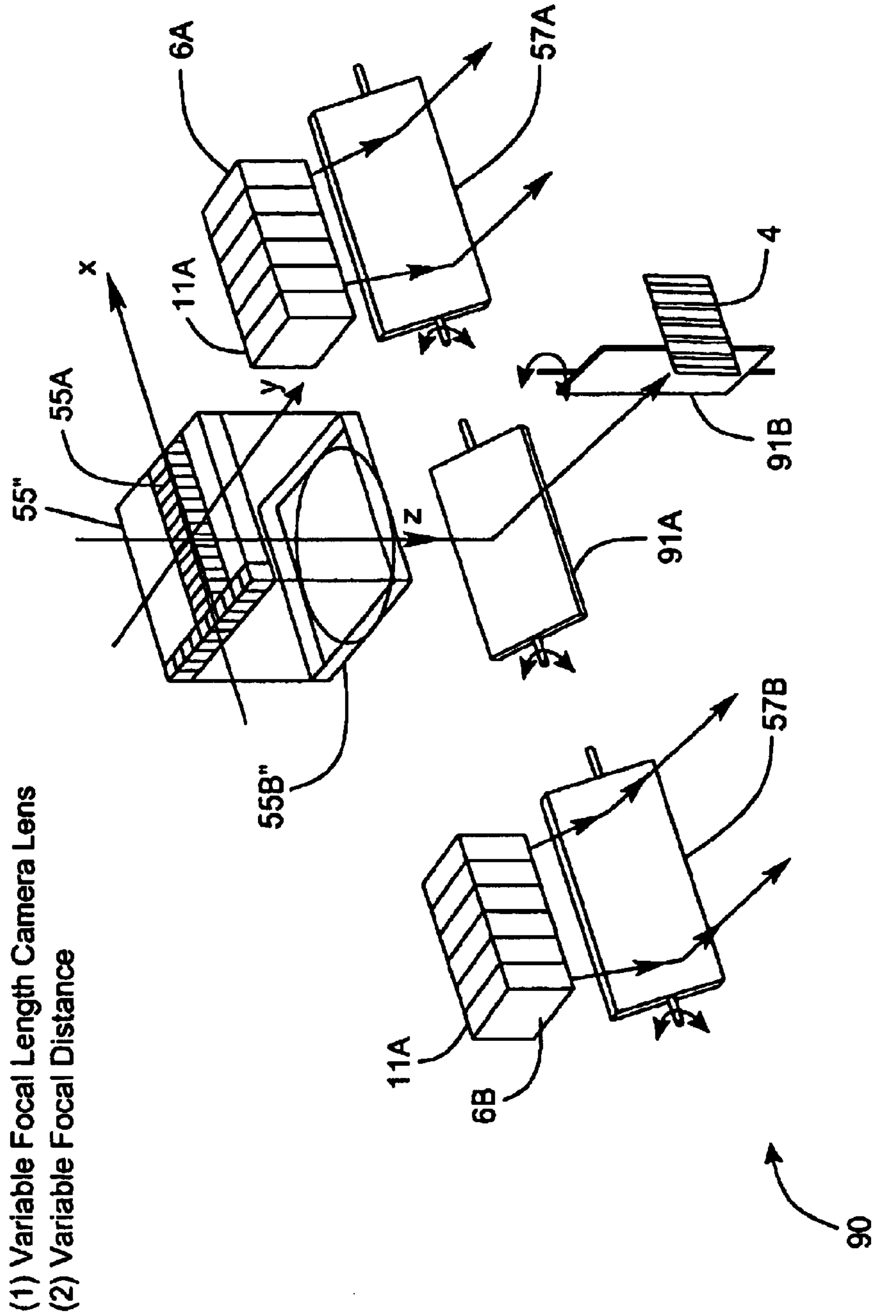
FIG. 6E2

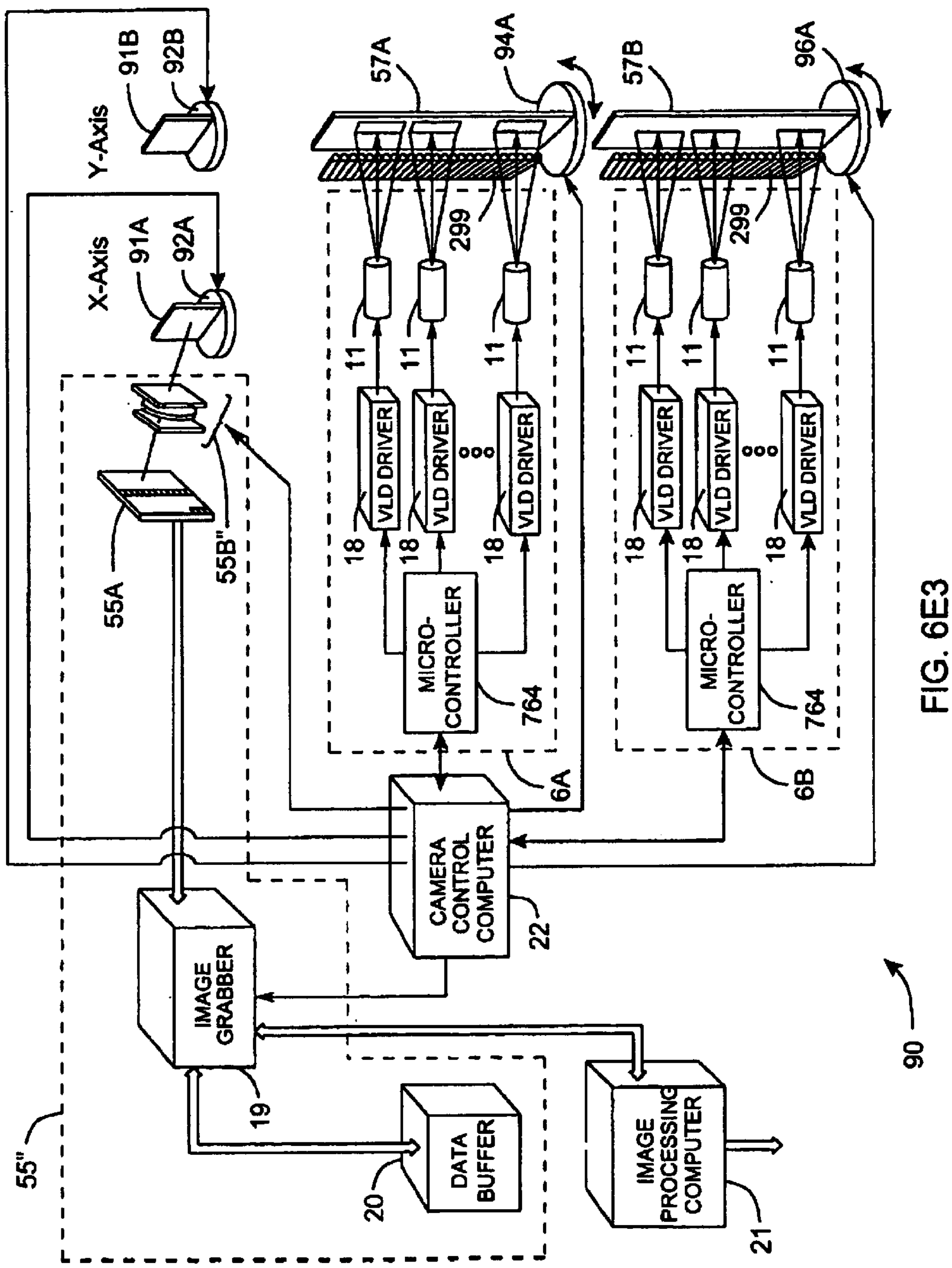
FIG. 6E3

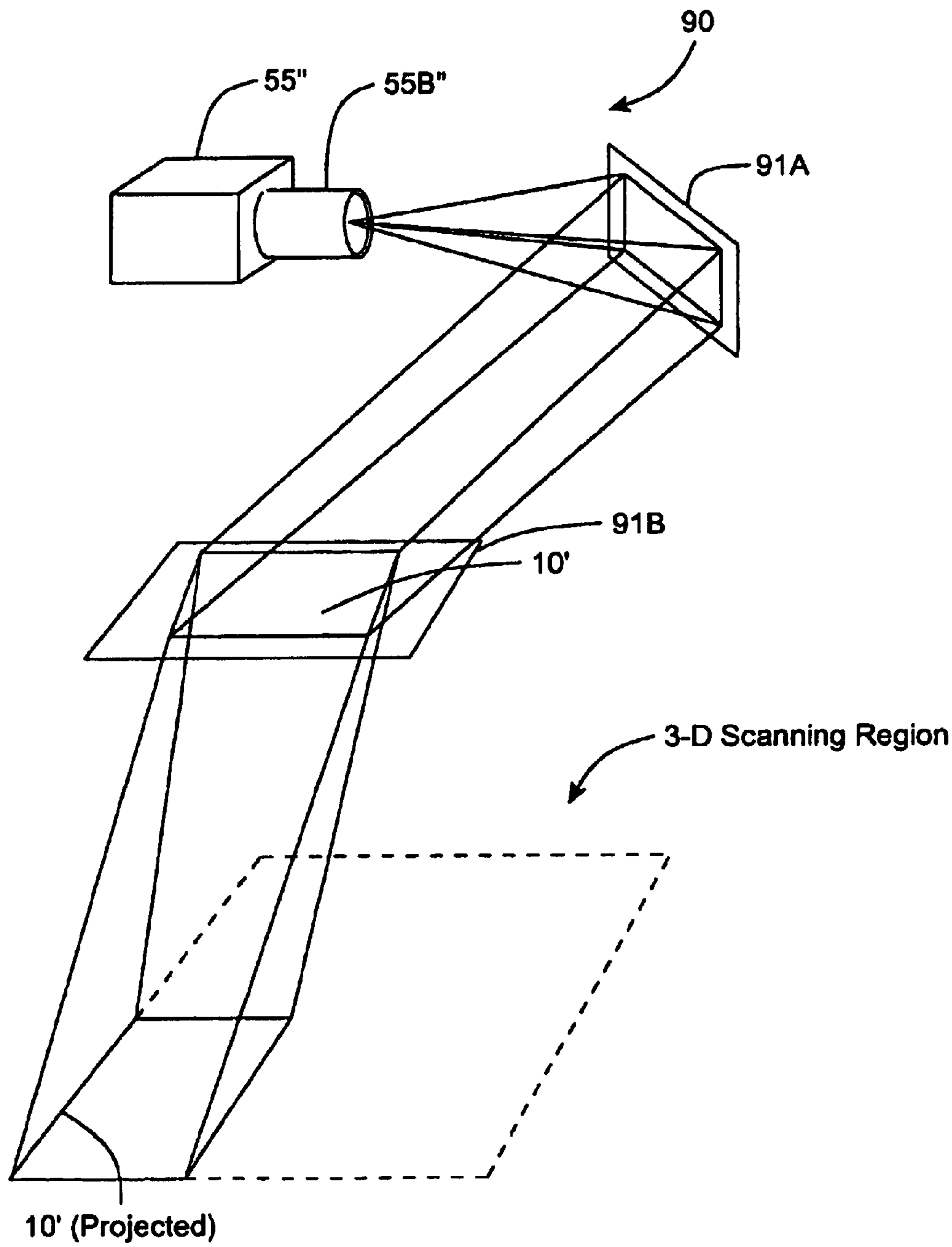
FIG. 6E4

1-D Scanner Embodiment

LDIP REAL-TIME PACKAGE EDGE DETECTION

Xa = Location Of Belt Left Edge; Xb = Location Of Belt Right Edge
Ia = Belt Left Edge Pixel; Ib = Belt Right Edge Pixel
LPE = Left package Edge; RPE = Right Package Edge
H[] = Pixel Height Array; X[] = Pixel Location Array
win = Package detection Window CAMERA CONTROL PROCESS CARRIED OUT WITHIN THE CAMERA CONTROL SUBSYSTEM OF EACH OBJECT IDENTIFICATION AND ATTRIBUTE ACQUISITION SYSTEM OF PRESENT INVENTION METHOD OF COMPUTING OPTICAL OUTPUT POWER FROM LASER DIODES IN A PLANAR LASER ILUMINATION ARRAY (PLIA) FOR CONTROLLING THE CONSTANT WHITE-LEVEL IN IMAGE PIXELS CAPTURED BY A PLIIM-BASED LINEAR IMAGER
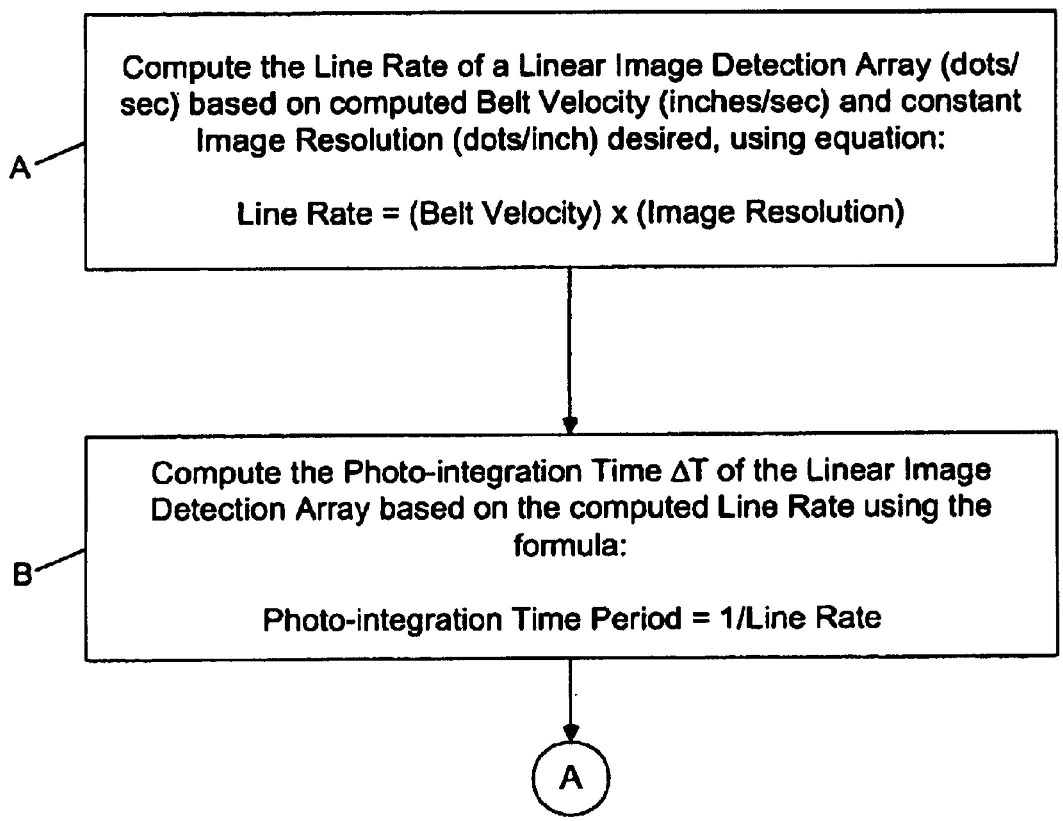
FIG. 18C1

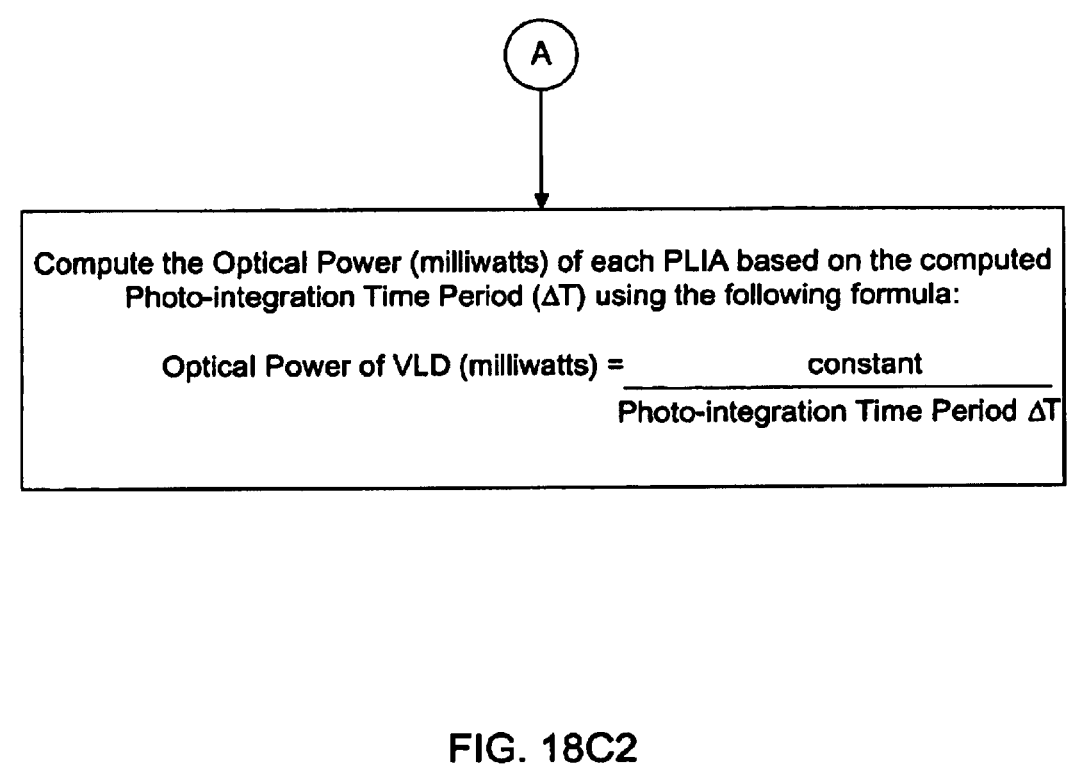

A

Compute the Optical Power (milliwatts) of each PLIA based on the computed Photo-integration Time Period ($\Delta T$) using the following formula:

$$\text{Optical Power of VLD (milliwatts)} = \frac{\text{constant}}{\text{Photo-integration Time Period } \Delta T}$$

FIG. 18C2

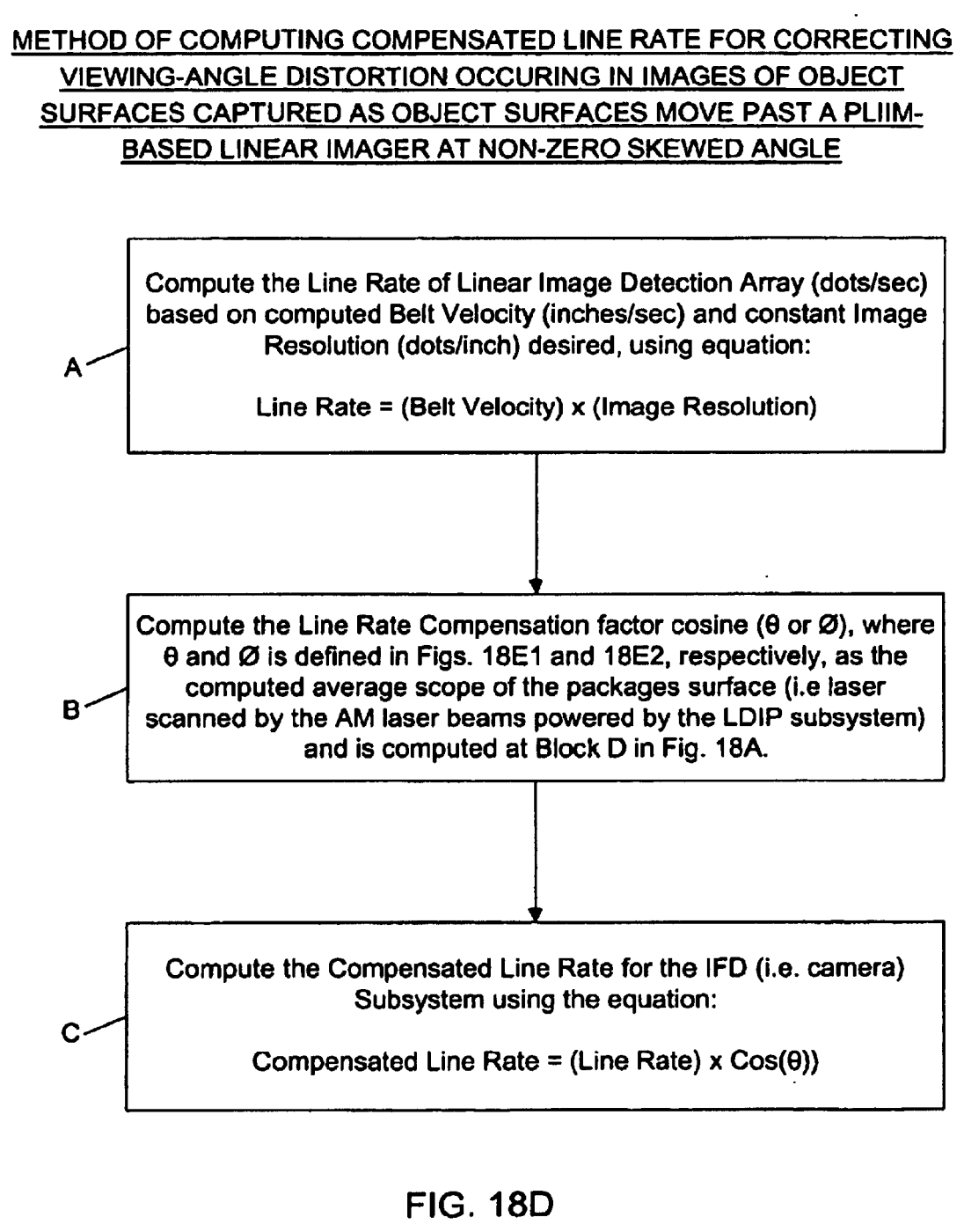

METHOD OF COMPUTING COMPENSATED LINE RATE FOR CORRECTING VIEWING-ANGLE DISTORTION OCCURING IN IMAGES OF OBJECT SURFACES CAPTURED AS OBJECT SURFACES MOVE PAST A PLIIM-BASED LINEAR IMAGER AT NON-ZERO SKEWED ANGLE

A — Compute the Line Rate of Linear Image Detection Array (dots/sec) based on computed Belt Velocity (inches/sec) and constant Image Resolution (dots/inch) desired, using equation:

Line Rate = (Belt Velocity) x (Image Resolution)

↓

B — Compute the Line Rate Compensation factor cosine (θ or Ø), where θ and Ø is defined in Figs. 18E1 and 18E2, respectively, as the computed average scope of the packages surface (i.e laser scanned by the AM laser beams powered by the LDIP subsystem) and is computed at Block D in Fig. 18A.

↓

C — Compute the Compensated Line Rate for the IFD (i.e. camera) Subsystem using the equation:

Compensated Line Rate = (Line Rate) x Cos(θ))

FIG. 18D

CASE 1:
Top Down Imaging
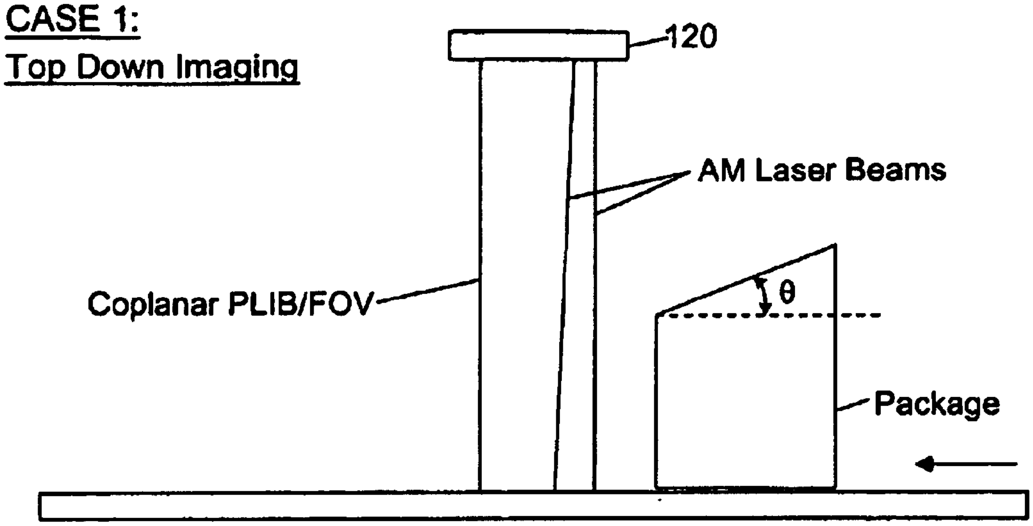
FIG. 18E1
CASE 2:
Side Imaging
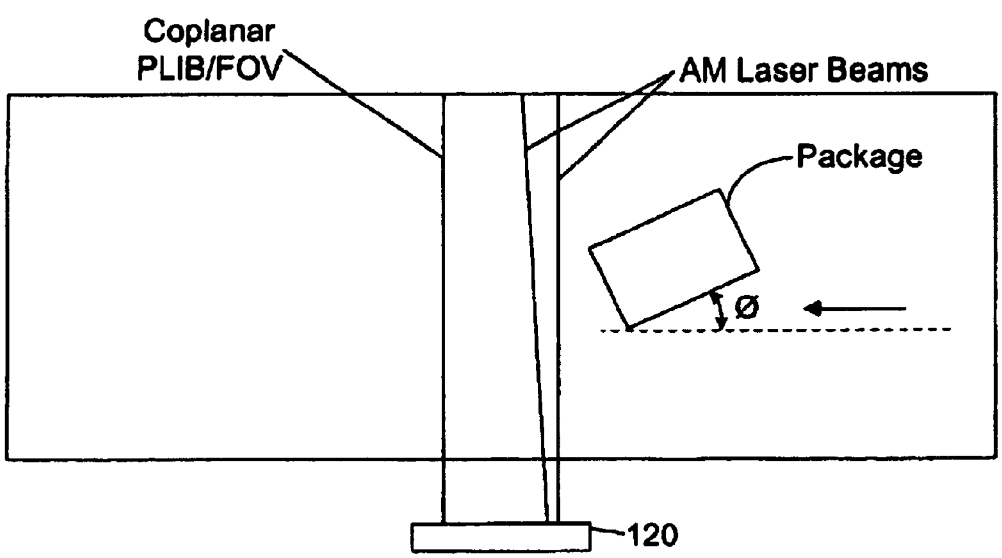
FIG. 18E2

Zoom And Focus Lens Group Position
Look-Up Table

| Distance From Camera H (mm) | Zoom Group Distance (mm) Y (Zoom) | Focus Group Distance (mm) Y (Focus) |
|---|---|---|
| 1000 | 21.57489228 | 2.47E-05 |
| 1100 | 19.38089696 | 10.99009783 |
| 1200 | 17.10673434 | 20.65783177 |
| 1300 | 14.77137314 | 29.10917002 |
| 1400 | 12.39153565 | 36.47312595 |
| 1500 | 9.979114358 | 42.87845436 |
| 1600 | 7.540639114 | 48.44003358 |
| 1700 | 5.078794775 | 53.25495831 |
| 1800 | 2.595989366 | 57.40834303 |
| 1900 | 0.099972739 | 60.98883615 |

(Use Interpolation Techniques For Working Distances Between Listed Points In Table)

FIG. 21

* Note: The focal distance and zoom (eff. focal length) of camera lens are coupled (inter-dependant) in this commercial embodiment.

Camera Has A Fixed Aperture F56

Focus And Zoom Lens Movement vs. Working Distances

Figure 23C1:
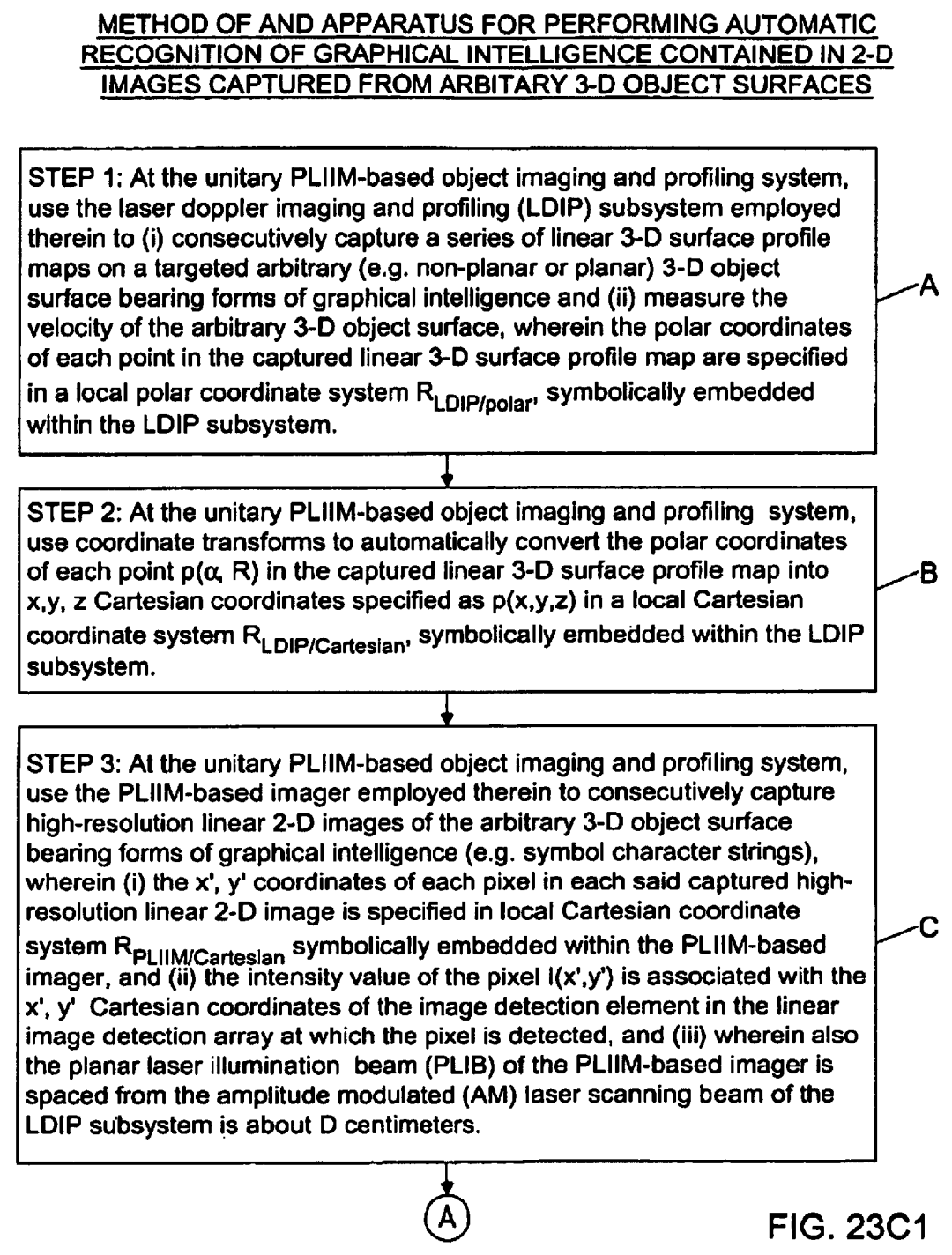

METHOD OF AND APPARATUS FOR PERFORMING AUTOMATIC RECOGNITION OF GRAPHICAL INTELLIGENCE CONTAINED IN 2-D IMAGES CAPTURED FROM ARBITARY 3-D OBJECT SURFACES

STEP 1: At the unitary PLIIM-based object imaging and profiling system, use the laser doppler imaging and profiling (LDIP) subsystem employed therein to (i) consecutively capture a series of linear 3-D surface profile maps on a targeted arbitrary (e.g. non-planar or planar) 3-D object surface bearing forms of graphical intelligence and (ii) measure the velocity of the arbitrary 3-D object surface, wherein the polar coordinates of each point in the captured linear 3-D surface profile map are specified in a local polar coordinate system $R_{LDIP/polar}$, symbolically embedded within the LDIP subsystem. — A

↓

STEP 2: At the unitary PLIIM-based object imaging and profiling system, use coordinate transforms to automatically convert the polar coordinates of each point p(α, R) in the captured linear 3-D surface profile map into x,y, z Cartesian coordinates specified as p(x,y,z) in a local Cartesian coordinate system $R_{LDIP/Cartesian}$, symbolically embedded within the LDIP subsystem. — B

↓

STEP 3: At the unitary PLIIM-based object imaging and profiling system, use the PLIIM-based imager employed therein to consecutively capture high-resolution linear 2-D images of the arbitrary 3-D object surface bearing forms of graphical intelligence (e.g. symbol character strings), wherein (i) the x', y' coordinates of each pixel in each said captured high-resolution linear 2-D image is specified in local Cartesian coordinate system $R_{PLIIM/Cartesian}$ symbolically embedded within the PLIIM-based imager, and (ii) the intensity value of the pixel I(x',y') is associated with the x', y' Cartesian coordinates of the image detection element in the linear image detection array at which the pixel is detected, and (iii) wherein also the planar laser illumination beam (PLIB) of the PLIIM-based imager is spaced from the amplitude modulated (AM) laser scanning beam of the LDIP subsystem is about D centimeters. — C

Figure 23C2:
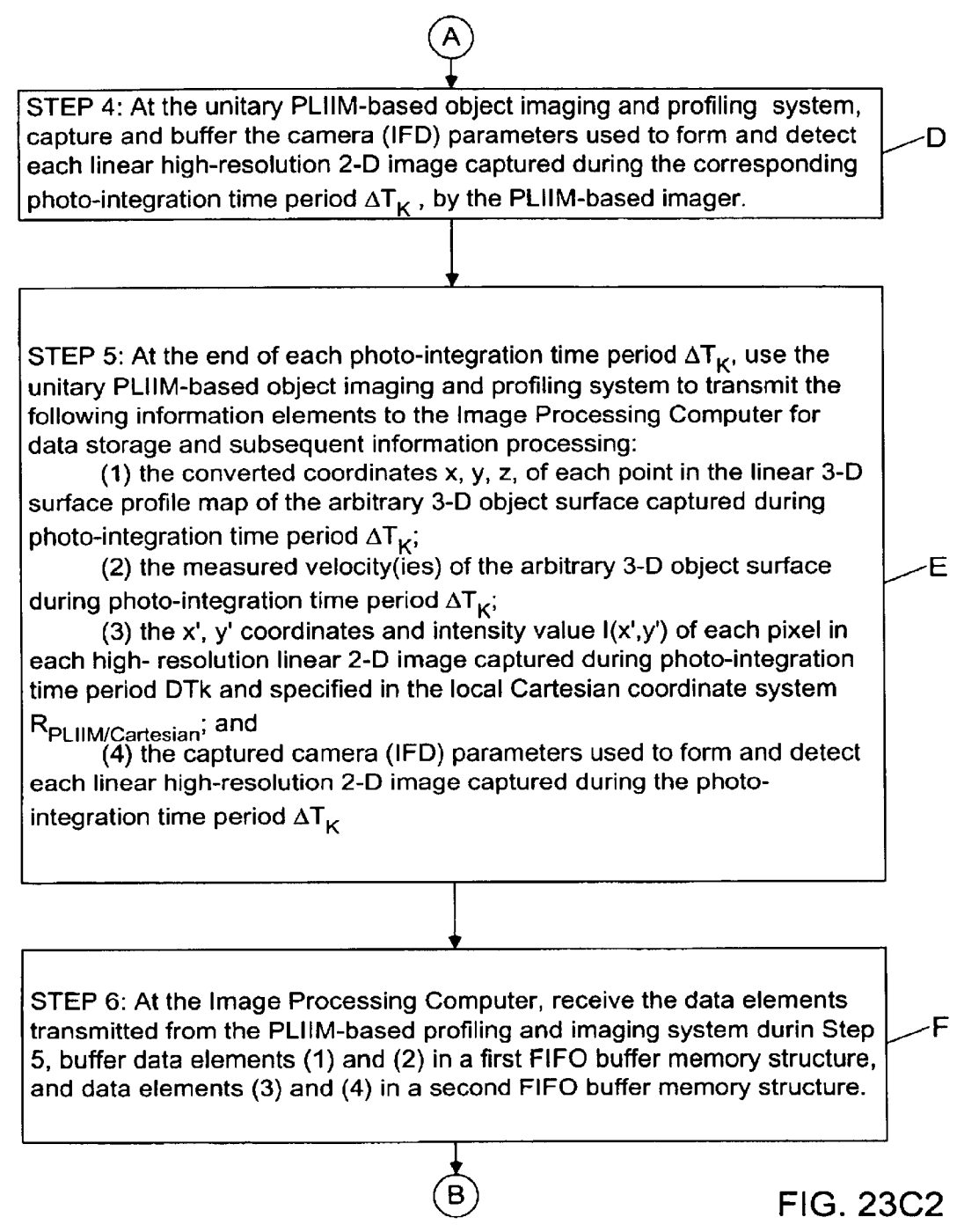

STEP 4: At the unitary PLIIM-based object imaging and profiling system, capture and buffer the camera (IFD) parameters used to form and detect each linear high-resolution 2-D image captured during the corresponding photo-integration time period $\Delta T_K$ , by the PLIIM-based imager.

D

STEP 5: At the end of each photo-integration time period $\Delta T_K$, use the unitary PLIIM-based object imaging and profiling system to transmit the following information elements to the Image Processing Computer for data storage and subsequent information processing:

(1) the converted coordinates x, y, z, of each point in the linear 3-D surface profile map of the arbitrary 3-D object surface captured during photo-integration time period $\Delta T_K$;

(2) the measured velocity(ies) of the arbitrary 3-D object surface during photo-integration time period $\Delta T_K$;

(3) the x', y' coordinates and intensity value I(x',y') of each pixel in each high- resolution linear 2-D image captured during photo-integration time period DTk and specified in the local Cartesian coordinate system $R_{PLIIM/Cartesian}$; and (4) the captured camera (IFD) parameters used to form and detect each linear high-resolution 2-D image captured during the photo-integration time period $\Delta T_K$

E

STEP 6: At the Image Processing Computer, receive the data elements transmitted from the PLIIM-based profiling and imaging system durin Step 5, buffer data elements (1) and (2) in a first FIFO buffer memory structure, and data elements (3) and (4) in a second FIFO buffer memory structure.

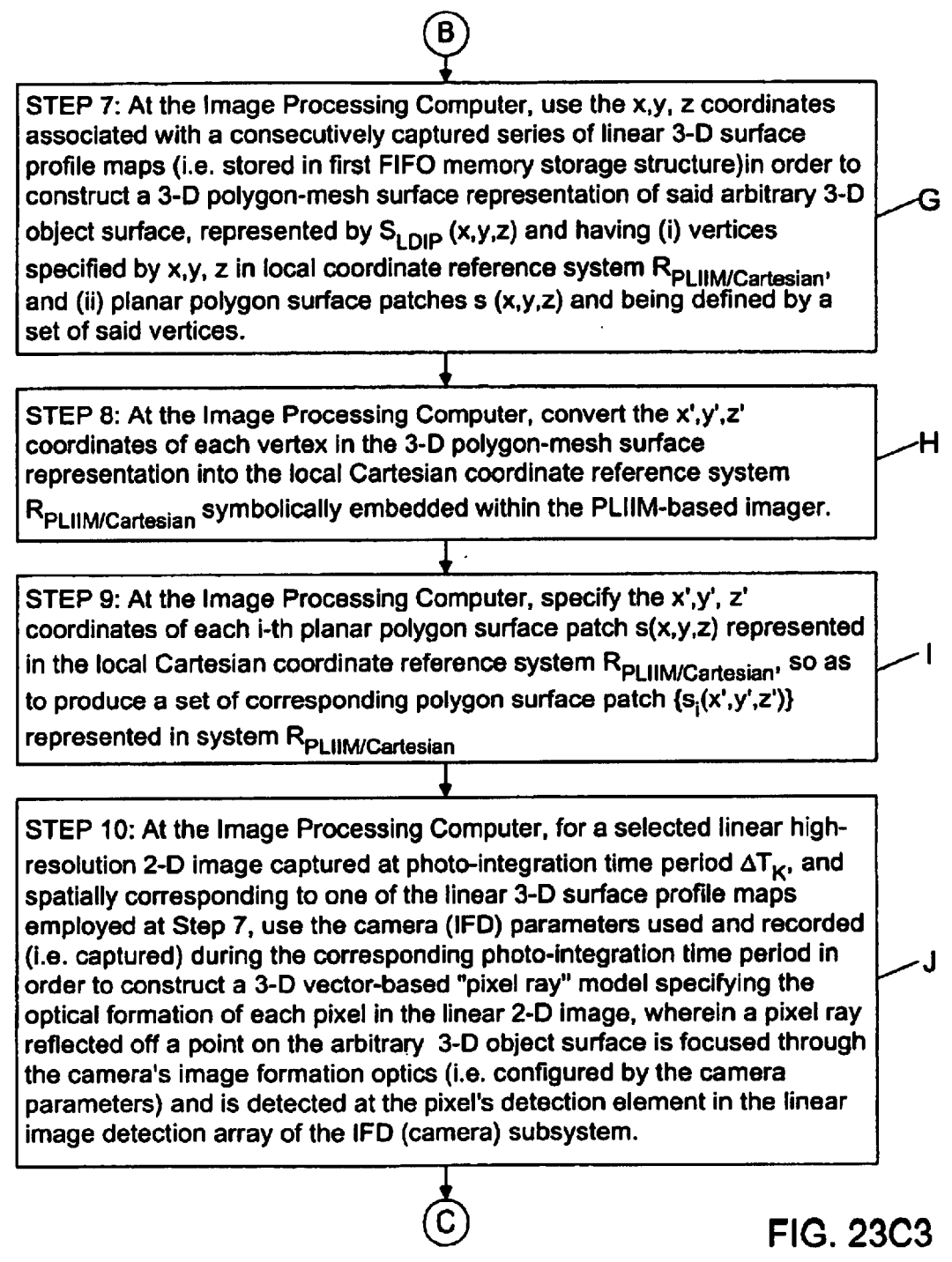

STEP 7: At the Image Processing Computer, use the x,y, z coordinates associated with a consecutively captured series of linear 3-D surface profile maps (i.e. stored in first FIFO memory storage structure)in order to construct a 3-D polygon-mesh surface representation of said arbitrary 3-D object surface, represented by $S_{LDIP}$ (x,y,z) and having (i) vertices specified by x,y, z in local coordinate reference system $R_{PLIIM/Cartesian}$, and (ii) planar polygon surface patches s (x,y,z) and being defined by a set of said vertices. — G STEP 8: At the Image Processing Computer, convert the x',y',z' coordinates of each vertex in the 3-D polygon-mesh surface representation into the local Cartesian coordinate reference system $R_{PLIIM/Cartesian}$ symbolically embedded within the PLIIM-based imager. — H STEP 9: At the Image Processing Computer, specify the x',y', z' coordinates of each i-th planar polygon surface patch s(x,y,z) represented in the local Cartesian coordinate reference system $R_{PLIIM/Cartesian}$, so as to produce a set of corresponding polygon surface patch $\{s_i(x',y',z')\}$ represented in system $R_{PLIIM/Cartesian}$ — I STEP 10: At the Image Processing Computer, for a selected linear high-resolution 2-D image captured at photo-integration time period $\Delta T_K$, and spatially corresponding to one of the linear 3-D surface profile maps employed at Step 7, use the camera (IFD) parameters used and recorded (i.e. captured) during the corresponding photo-integration time period in order to construct a 3-D vector-based "pixel ray" model specifying the optical formation of each pixel in the linear 2-D image, wherein a pixel ray reflected off a point on the arbitrary 3-D object surface is focused through the camera's image formation optics (i.e. configured by the camera parameters) and is detected at the pixel's detection element in the linear image detection array of the IFD (camera) subsystem. — J (C)

FIG. 23C3

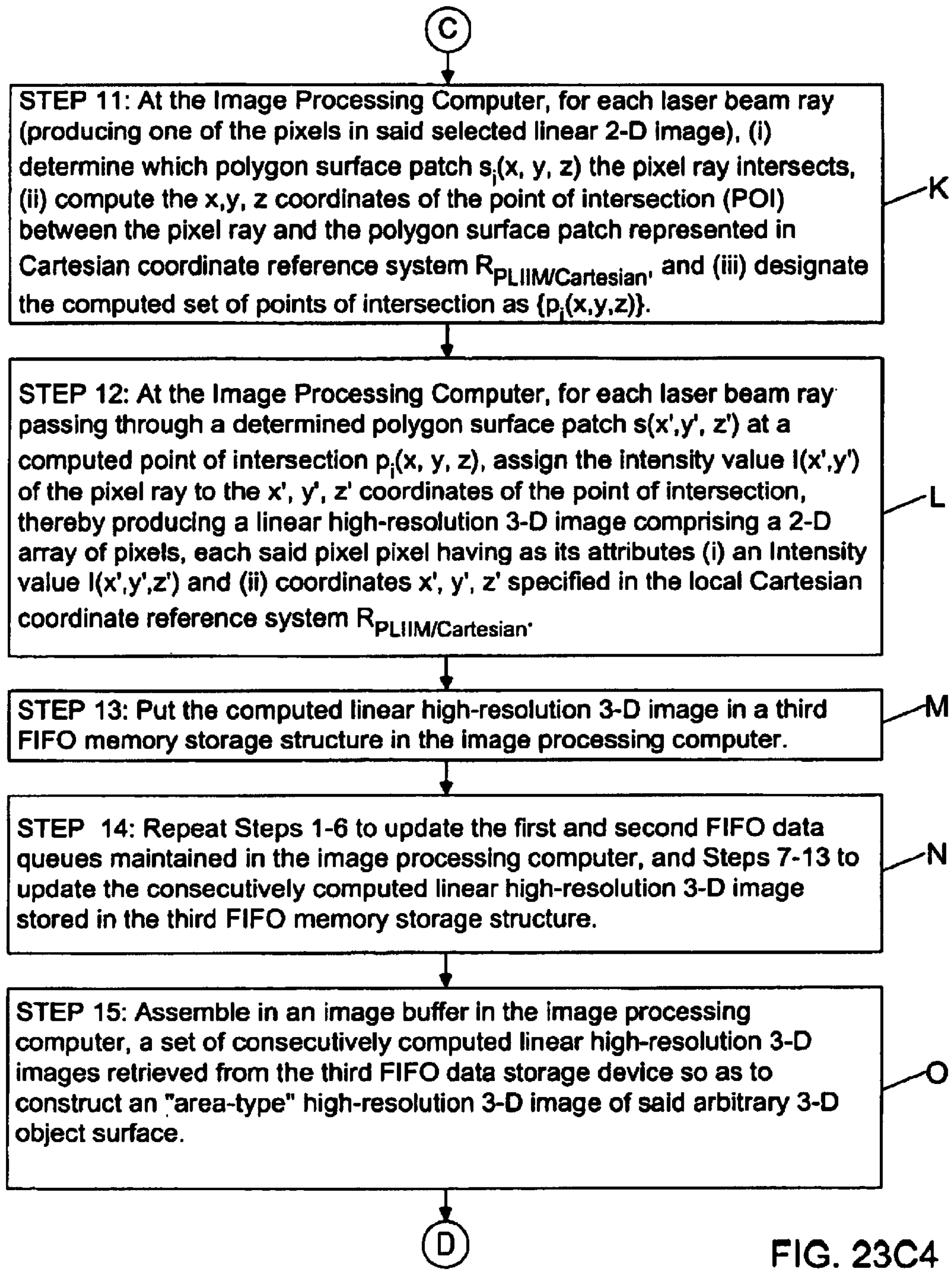
FIG. 23C4

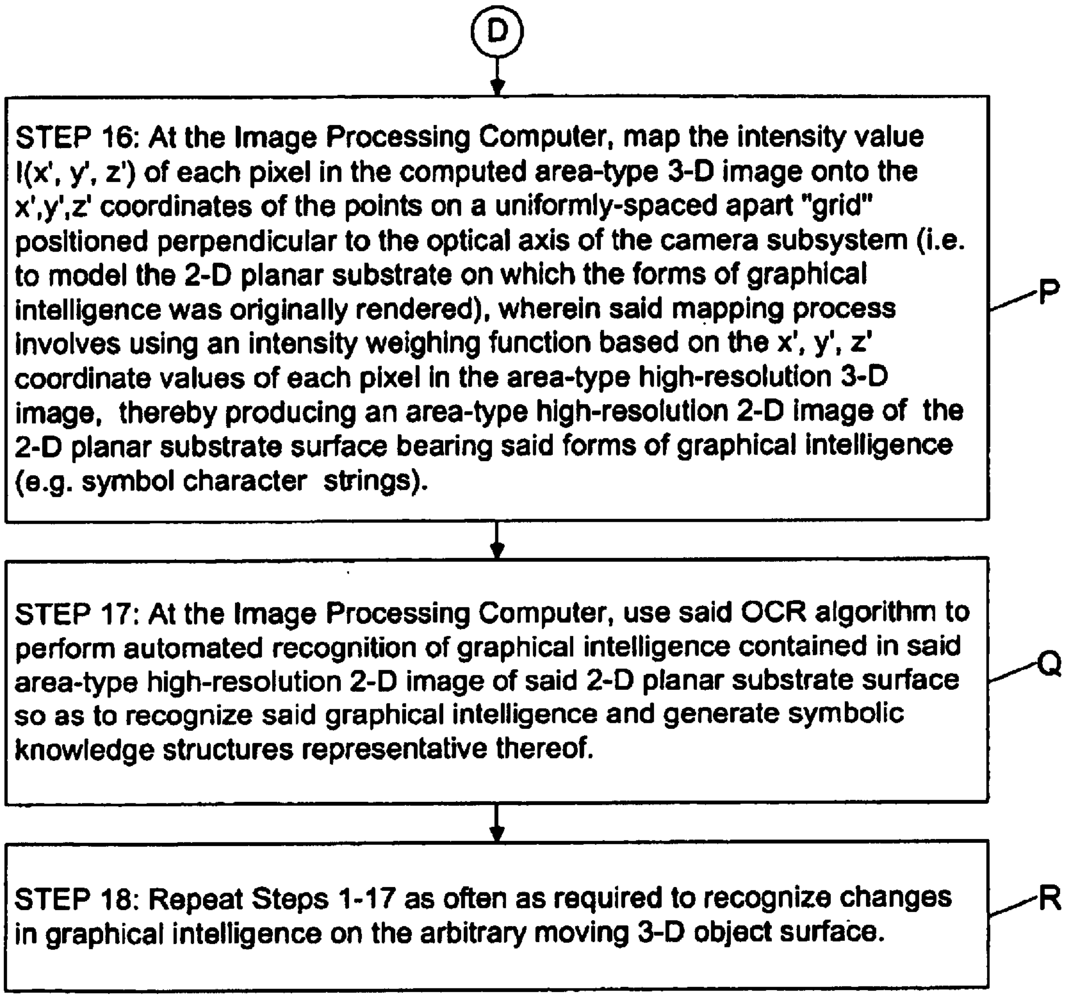
FIG. 23C5

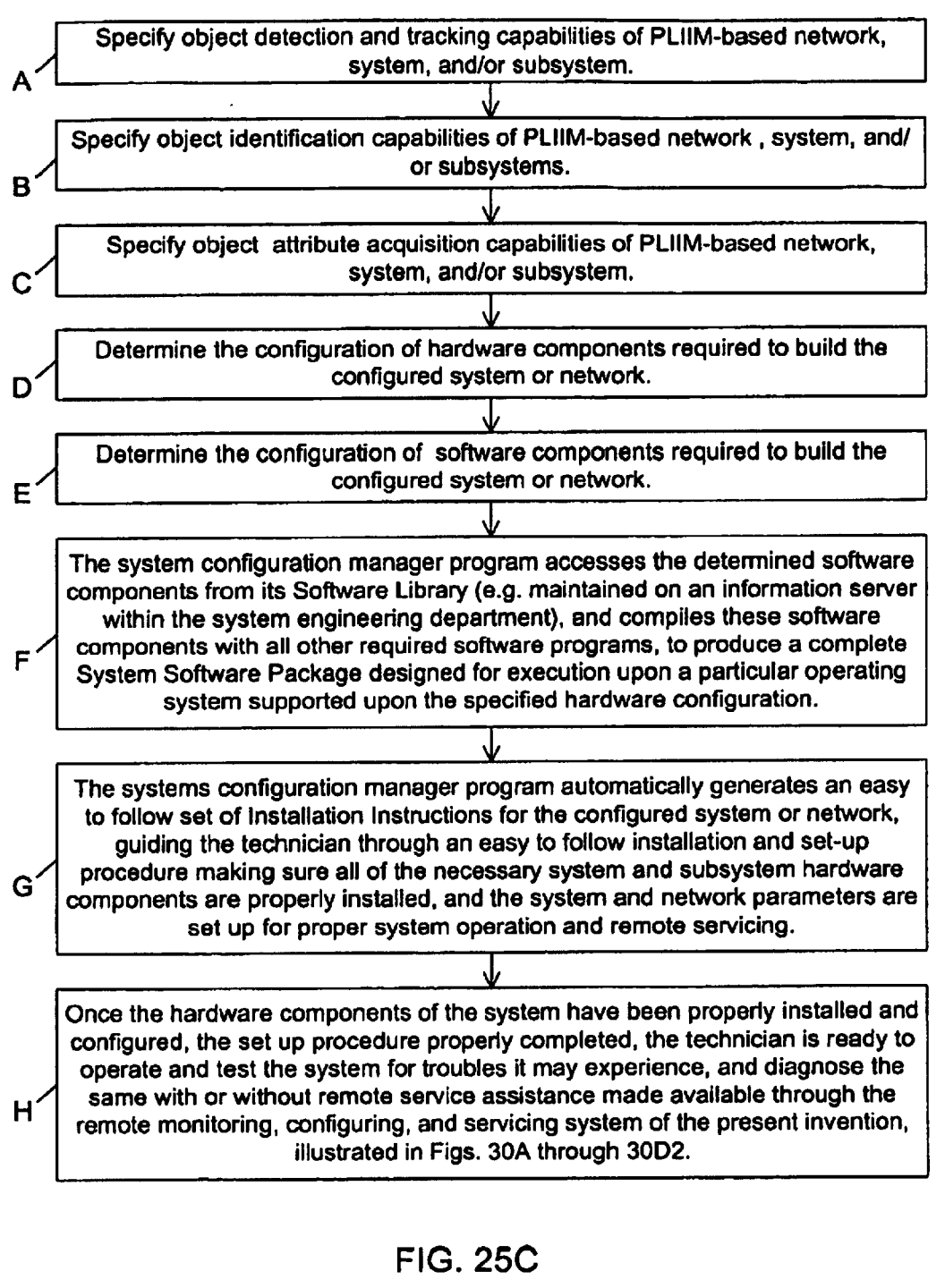

A — Specify object detection and tracking capabilities of PLIIM-based network, system, and/or subsystem.

↓

B — Specify object identification capabilities of PLIIM-based network , system, and/ or subsystems.

↓

C — Specify object attribute acquisition capabilities of PLIIM-based network, system, and/or subsystem.

↓

D — Determine the configuration of hardware components required to build the configured system or network.

↓

E — Determine the configuration of software components required to build the configured system or network.

↓

F — The system configuration manager program accesses the determined software components from its Software Library (e.g. maintained on an information server within the system engineering department), and compiles these software components with all other required software programs, to produce a complete System Software Package designed for execution upon a particular operating system supported upon the specified hardware configuration.

↓

G — The systems configuration manager program automatically generates an easy to follow set of Installation Instructions for the configured system or network, guiding the technician through an easy to follow installation and set-up procedure making sure all of the necessary system and subsystem hardware components are properly installed, and the system and network parameters are set up for proper system operation and remote servicing.

↓

H — Once the hardware components of the system have been properly installed and configured, the set up procedure properly completed, the technician is ready to operate and test the system for troubles it may experience, and diagnose the same with or without remote service assistance made available through the remote monitoring, configuring, and servicing system of the present invention, illustrated in Figs. 30A through 30D2.

FIG. 25C

Network Configuration Parameters:

[ Router IP address; no. of nodes (i.e. systems) in LAN; passwords, LAN location; name of customer facility; technical contact; phone no.; domain name; object identity codes; object attribute acquisition codes;.....]

System Configuration Parameters:

[ System IP Address; passwords; object identity codes; object attribute acquisition codes;....]

Monitorable and/or Configurable Parameters for Subsystems Within Each System:

These subsystems generate object identity parameters

- PLIIM-based object identification subsystem: [ object identity code; object attribute acquisition codes;....]
  - PLIM Subsystem: [VLD status; power VLD; TIM function; temp.;....]
  - IFD ( Camera) Subsystem: [sensor temp; .....]
  - Image Processing Subsystem (Computer): [processor load history; system up time; # of frames (pgs); barcode read rate; current line rate;....]
  - Camera Contact Subsystem (Computer): [number of frames dropped; number of focused zoom commands; number and kinds of motor control errors;....]
- RFID-based object identification subsystem: [....]

This system links object attribute data element parameters(i.e. object identity data element) to corresponding object identity parameters (i.e. object atrribute data element)

- Object identity and attribute data element queuing, handling and processing subsystem: [....]

These subsystems generate object attribute parameters

- LDIP object identification, velocity-measurement, and dimensioning subsystem: [....]
  - Object velocity measurement subsystem: [polygon RPM; polygon laser output X; channel X drift; channel X noise; trigger error events; instant lock reference drift; temperature]
  - Object H/W/L profiling subsystem
  - Object detection subsystem: [non- singulation/ singulation code;....]
- X-ray scanning subsystem: [....]
- Neutron-beam scanning subsystem: [....]

FIG. 30C

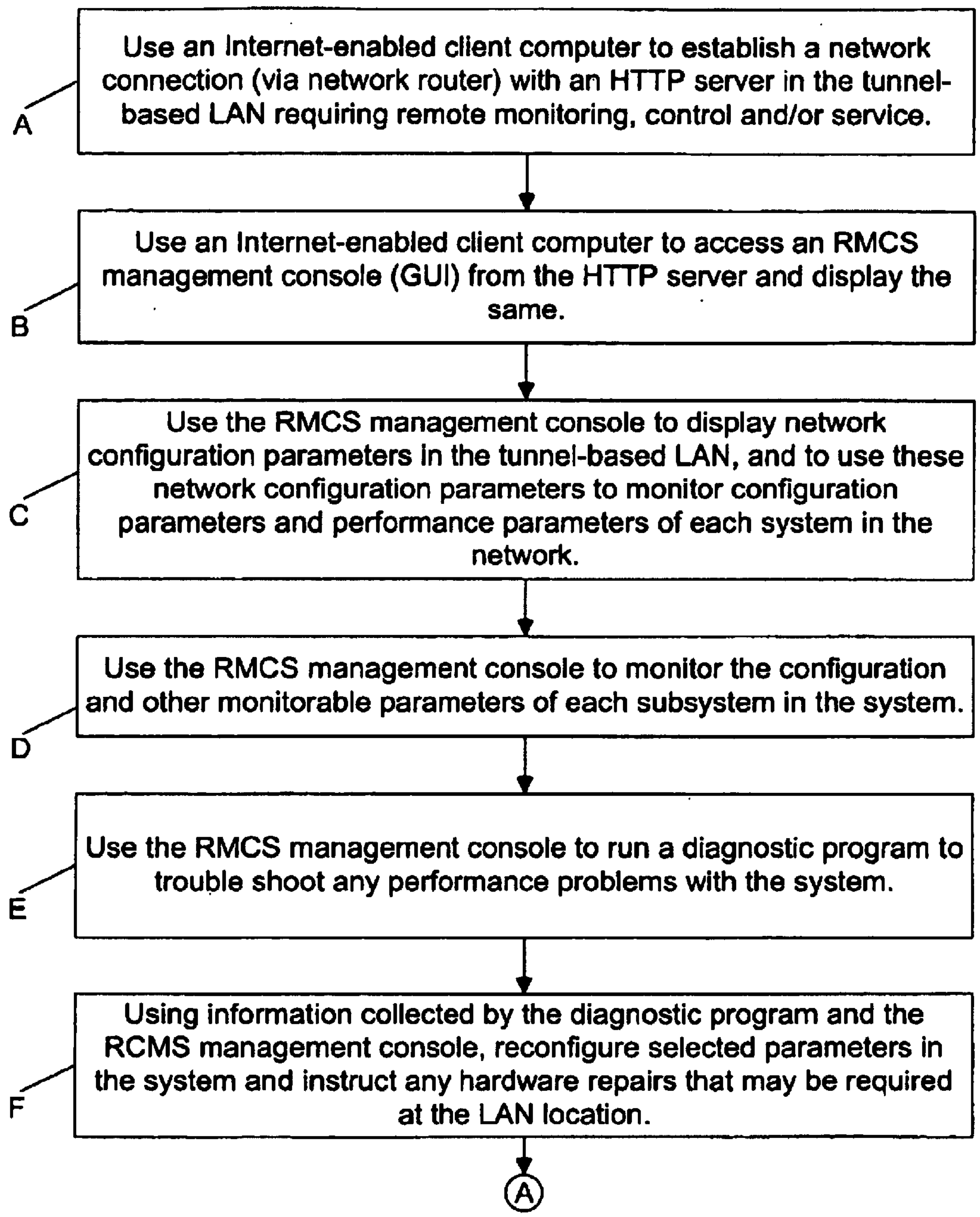
FIG. 30D1

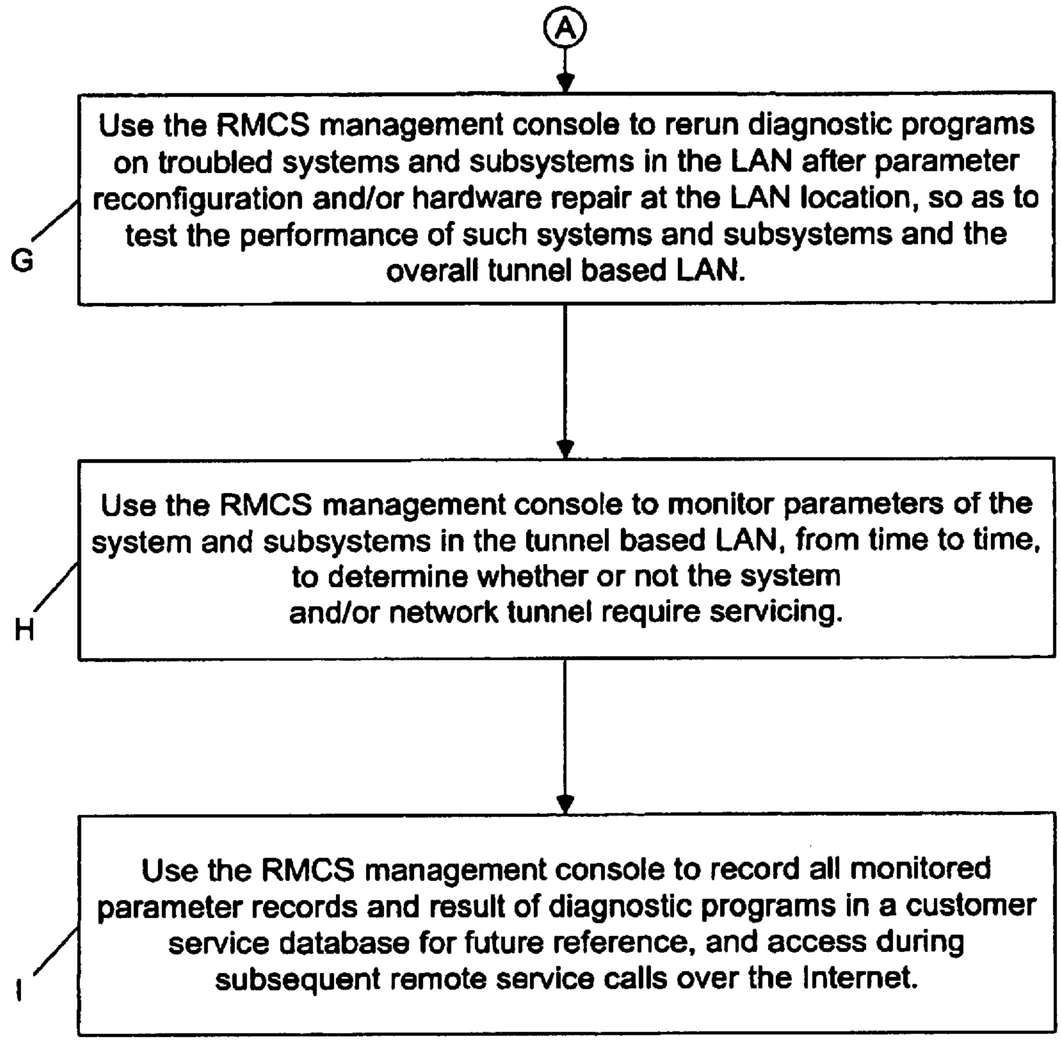
FIG. 30D2

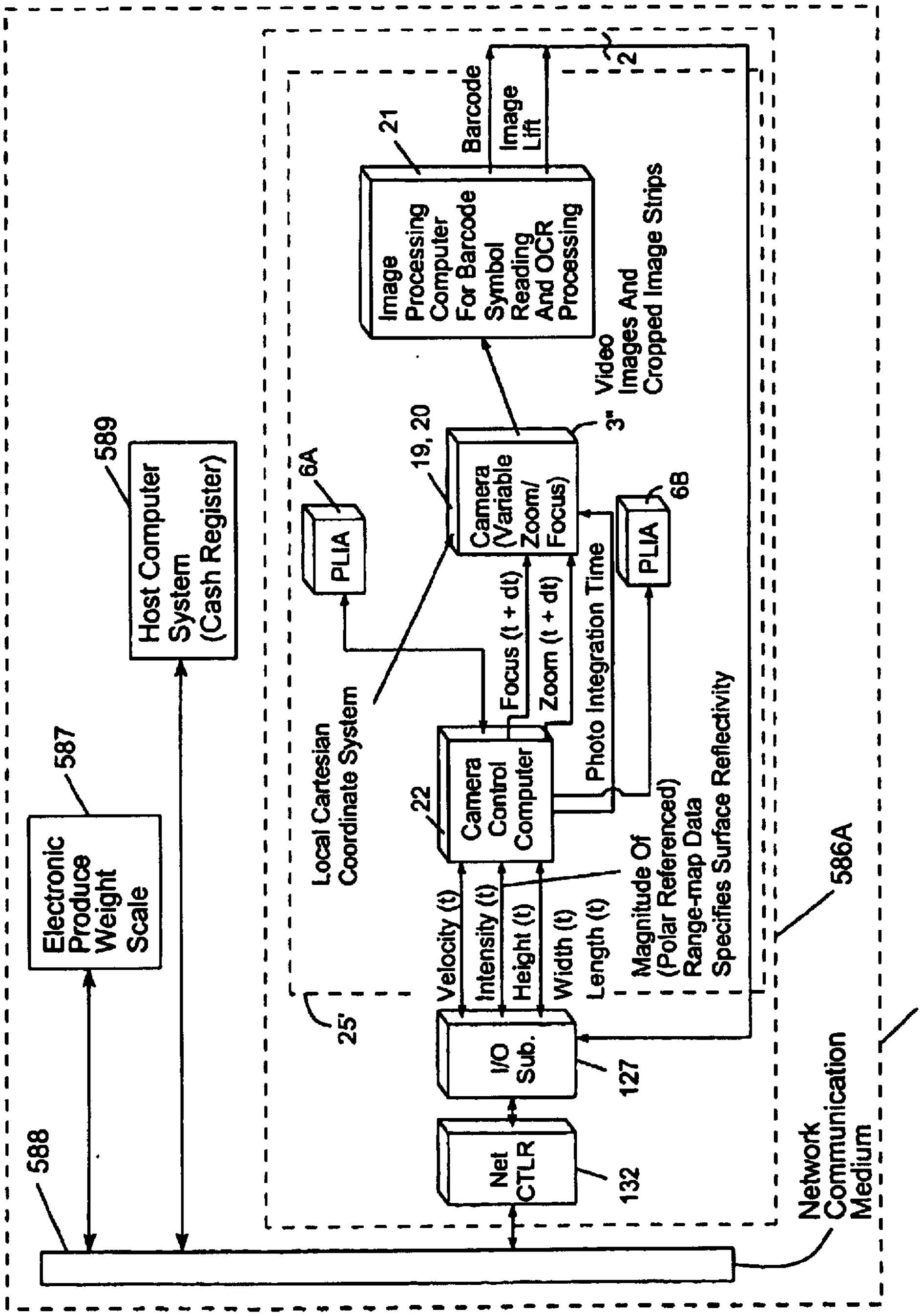
FIG. 33C1

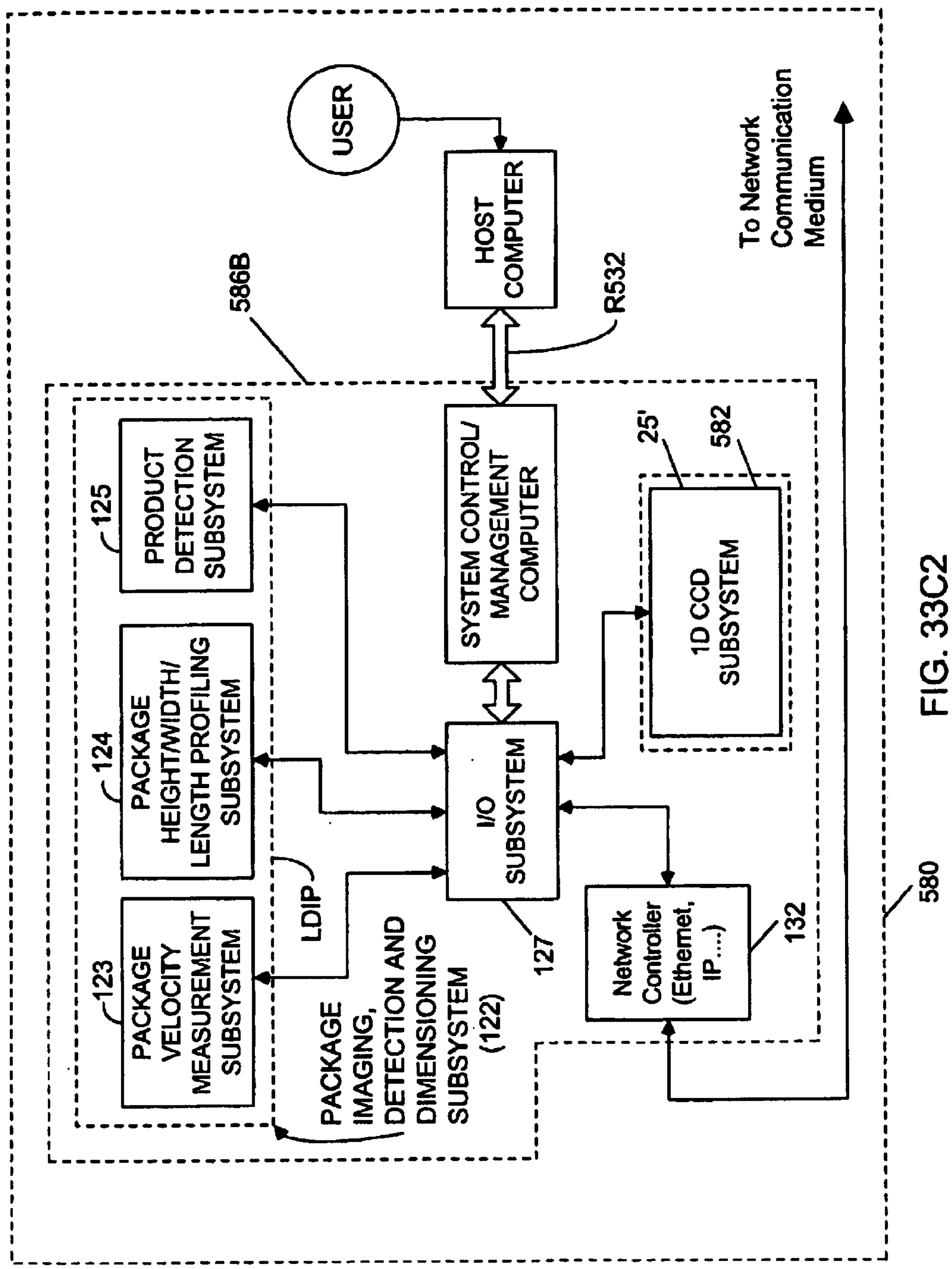
FIG. 33C2

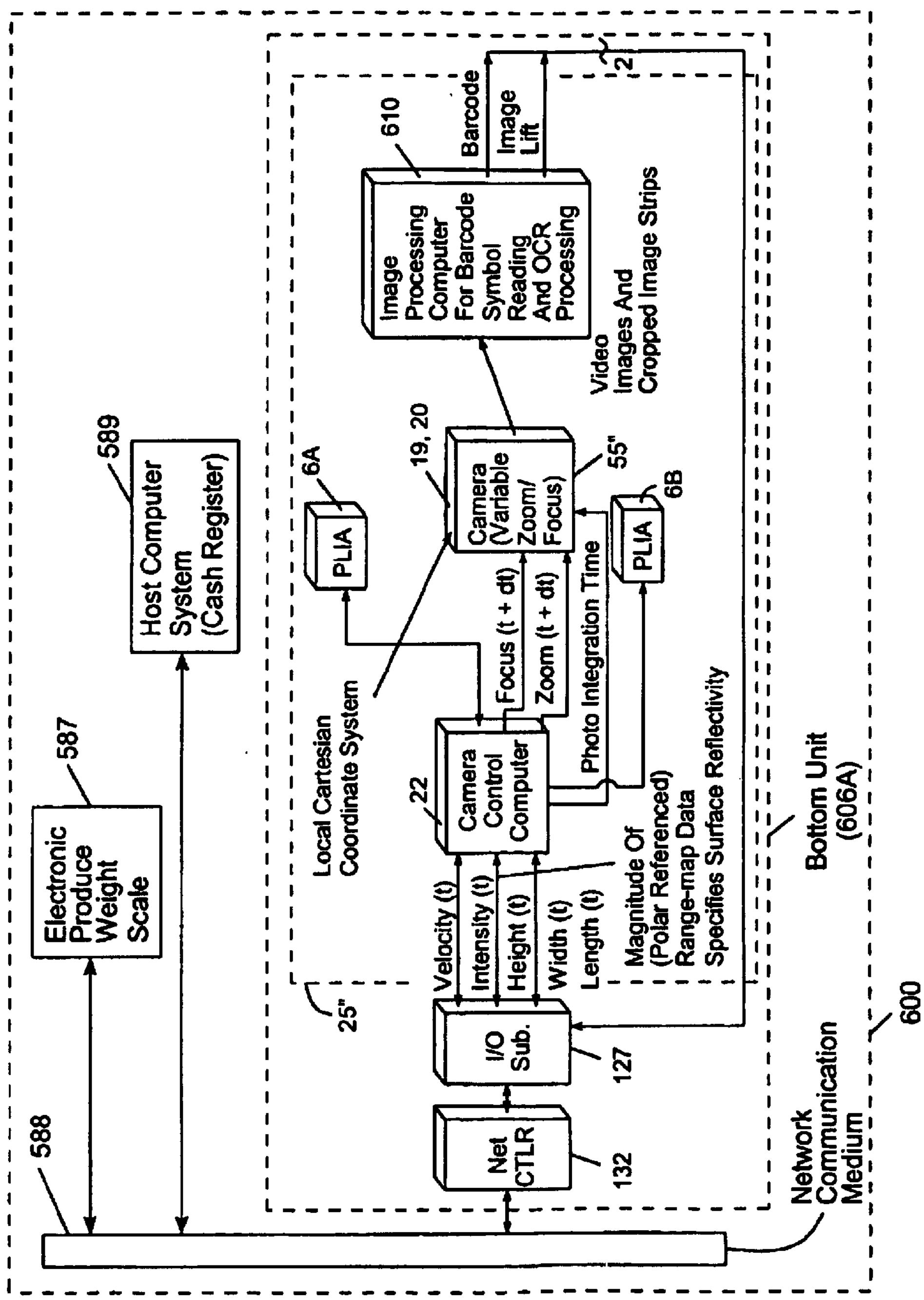
FIG. 34C1

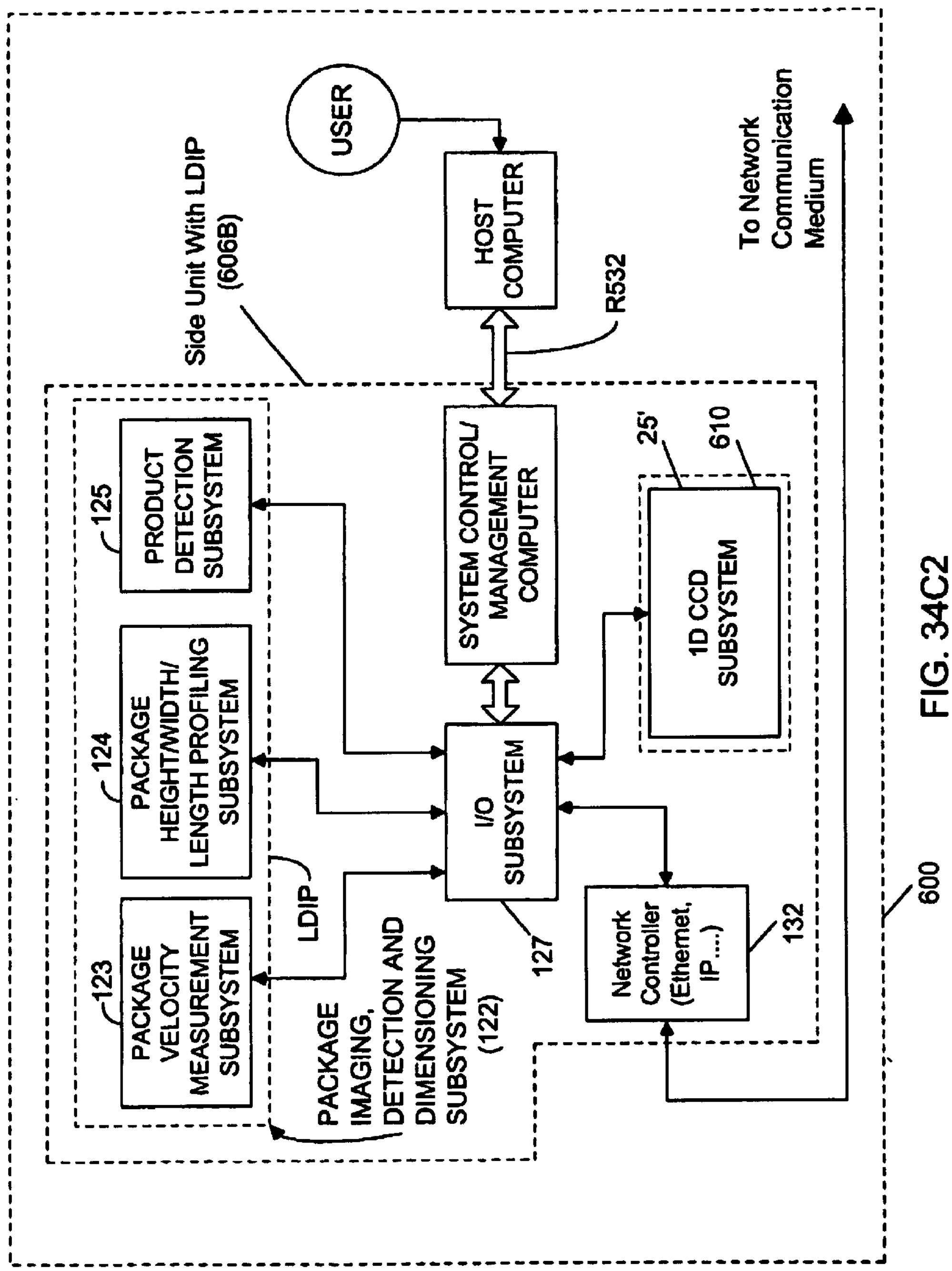
FIG. 34C2

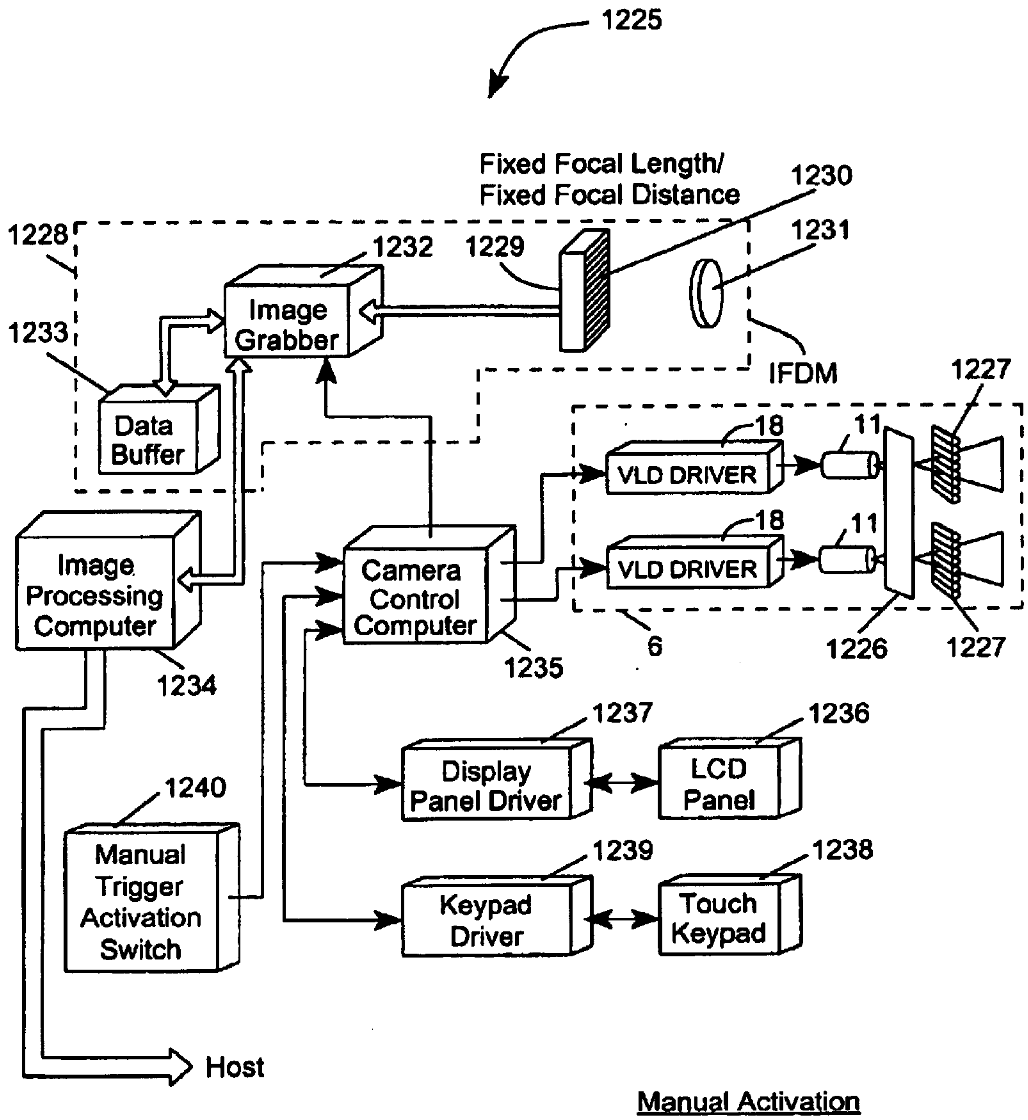
FIG. 40A1

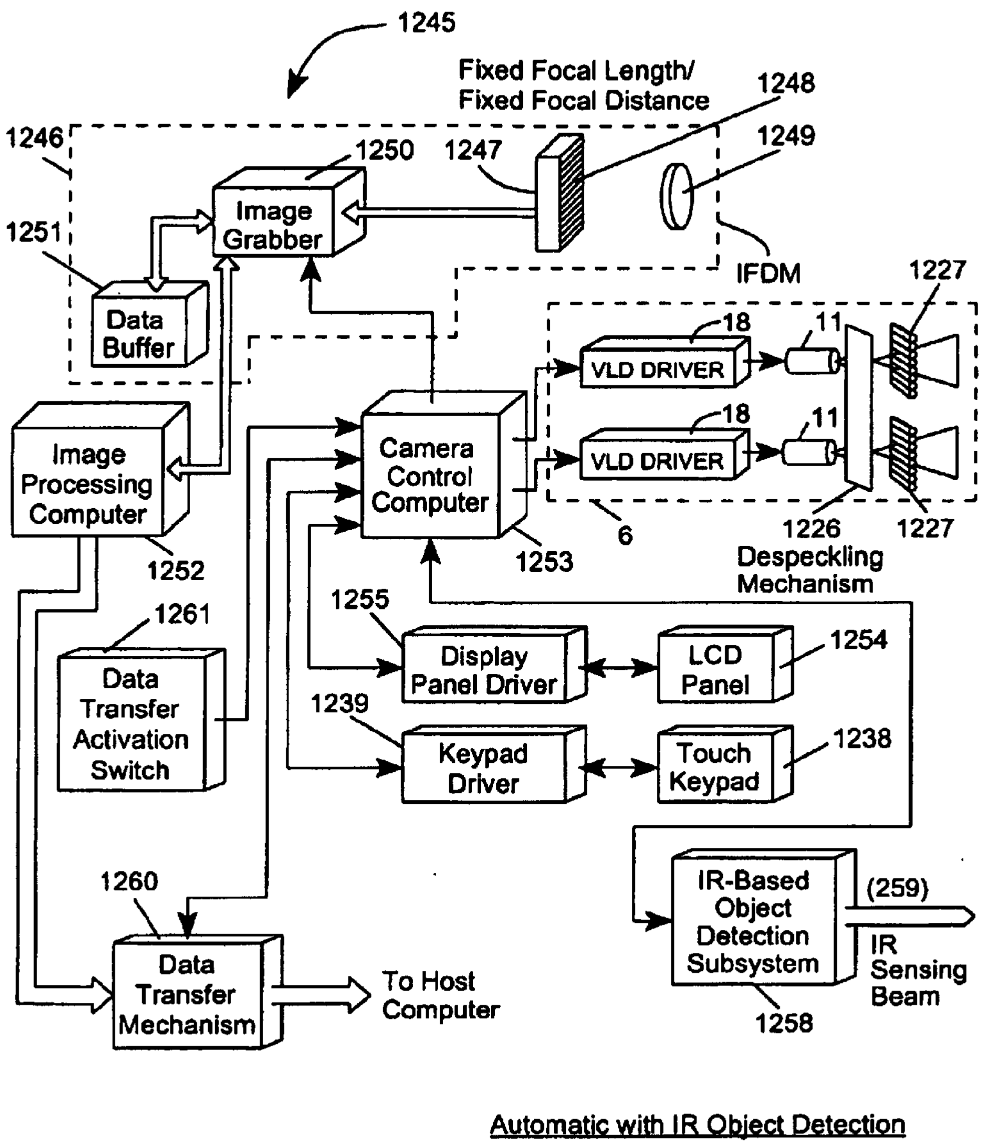
FIG. 40A2

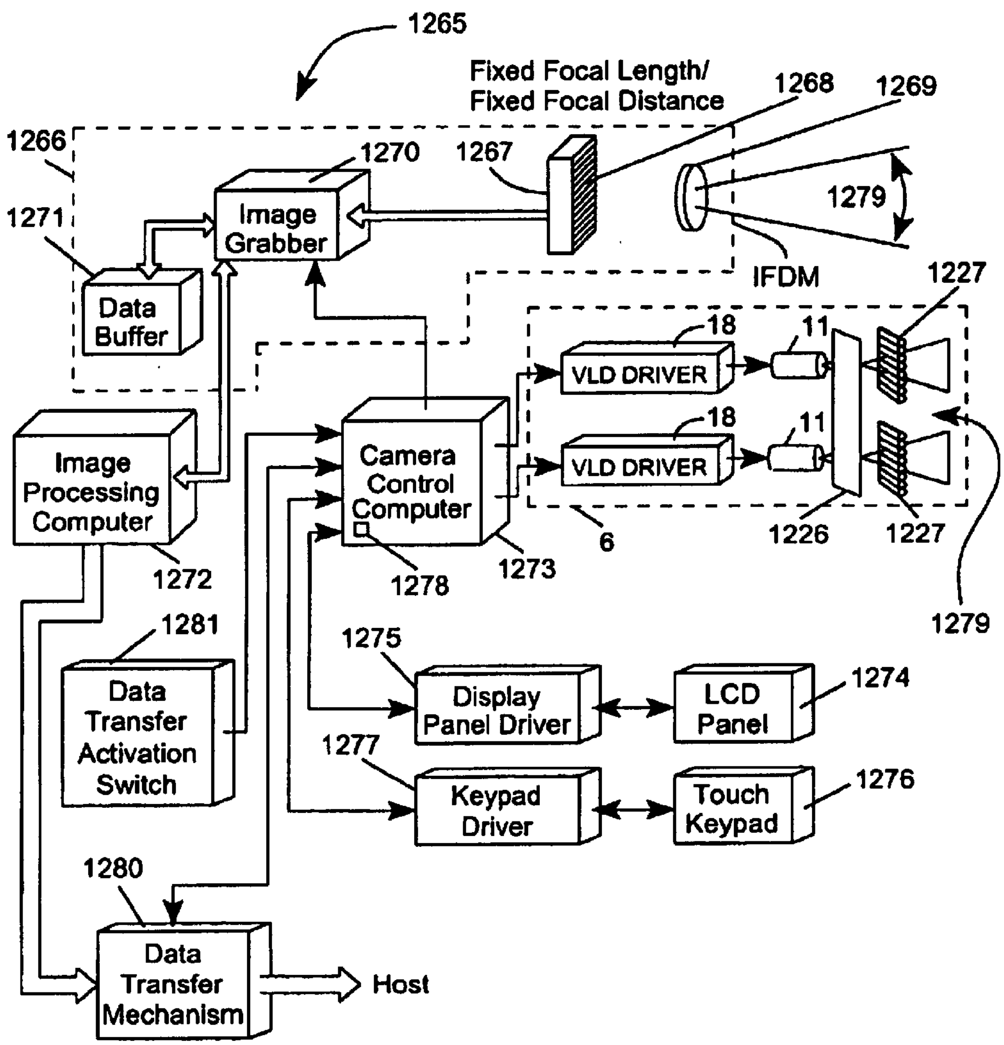
Automatic with Laser Based Object Detection
FIG. 40A3

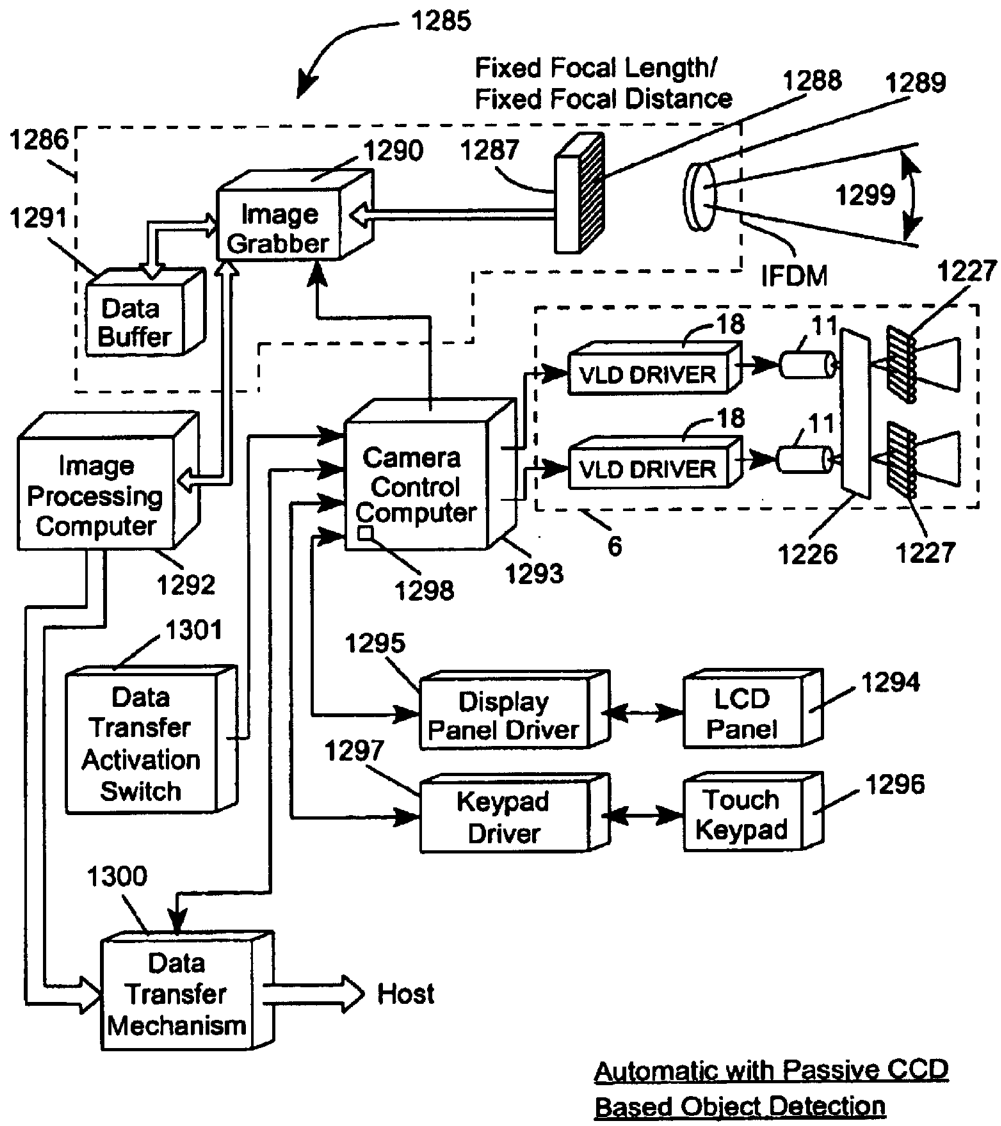
FIG. 40A4

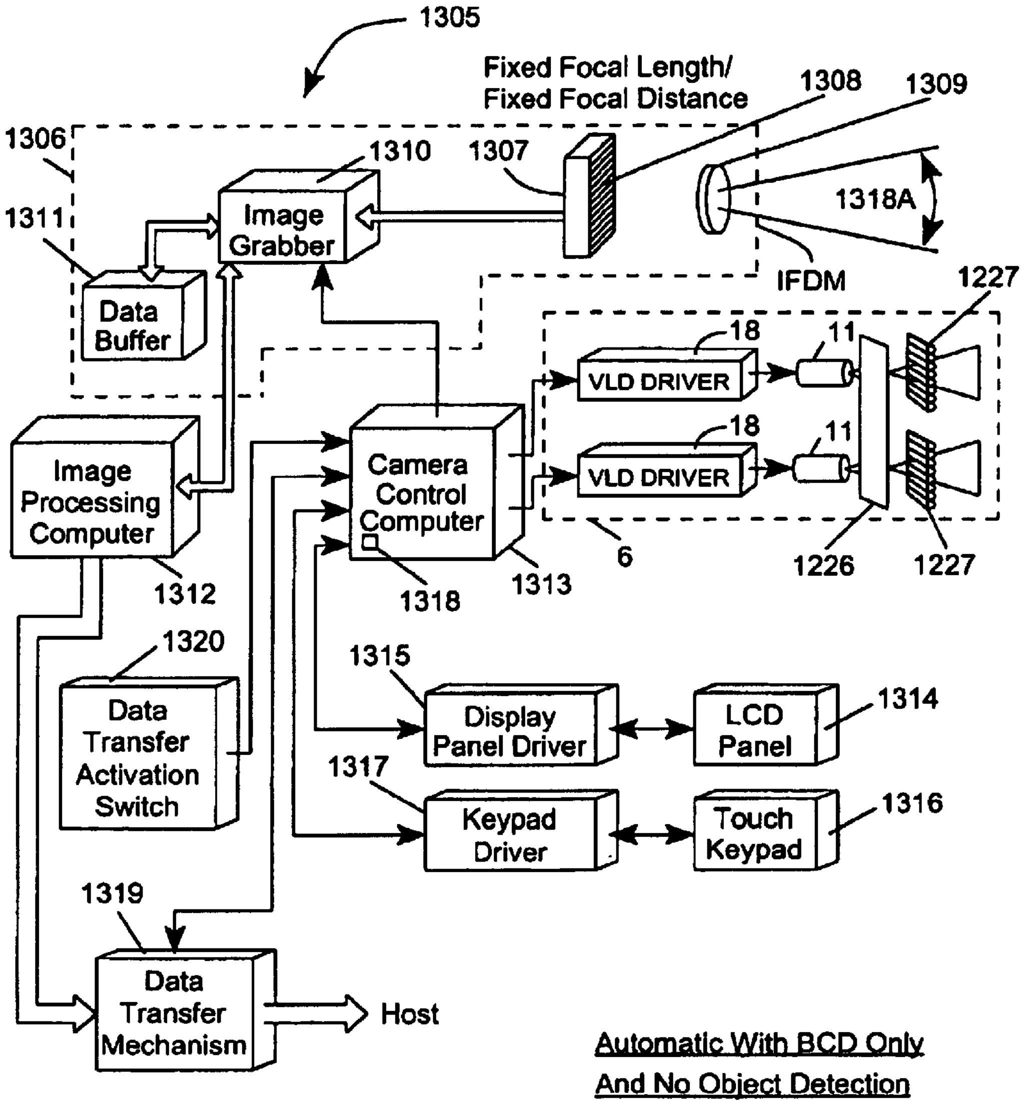
FIG. 40A5

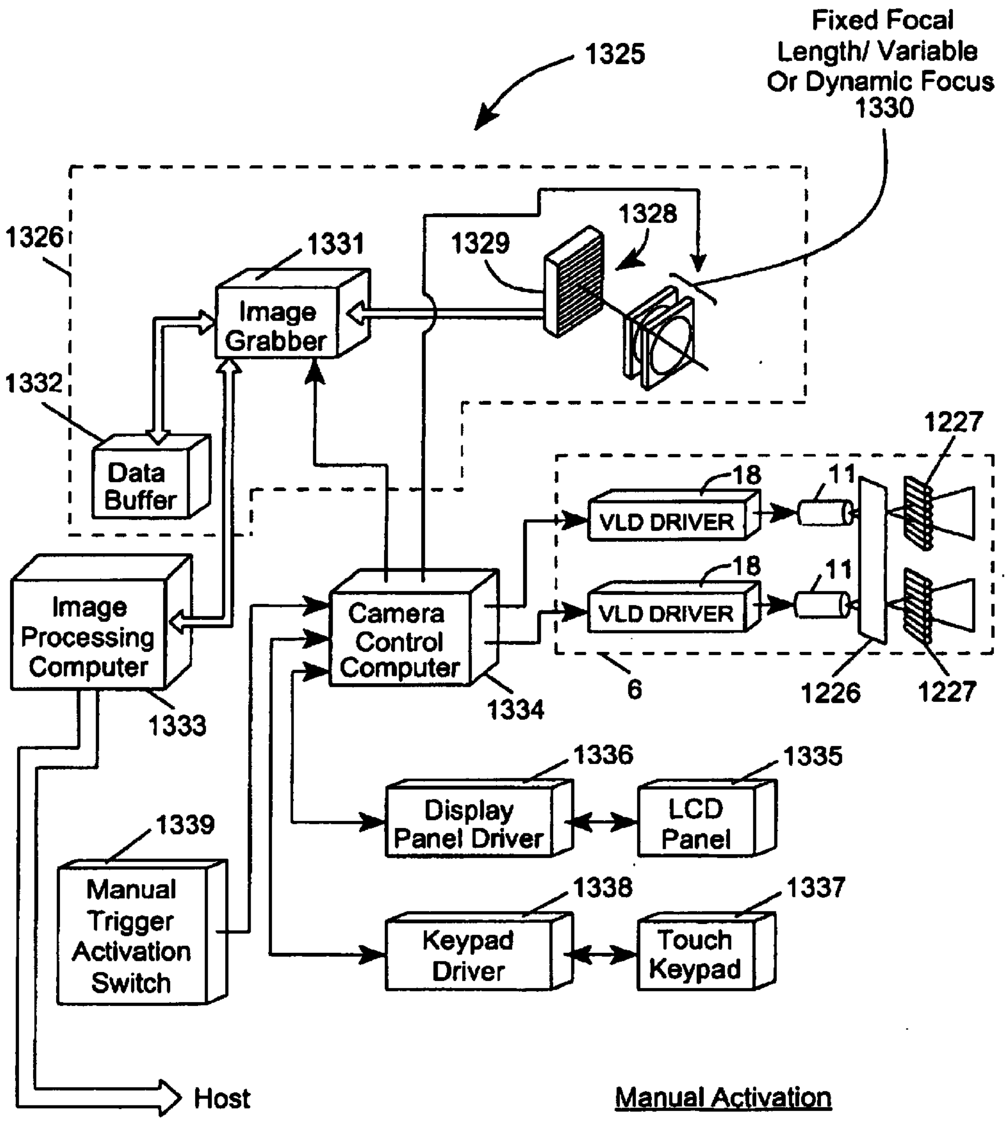
FIG. 40B1

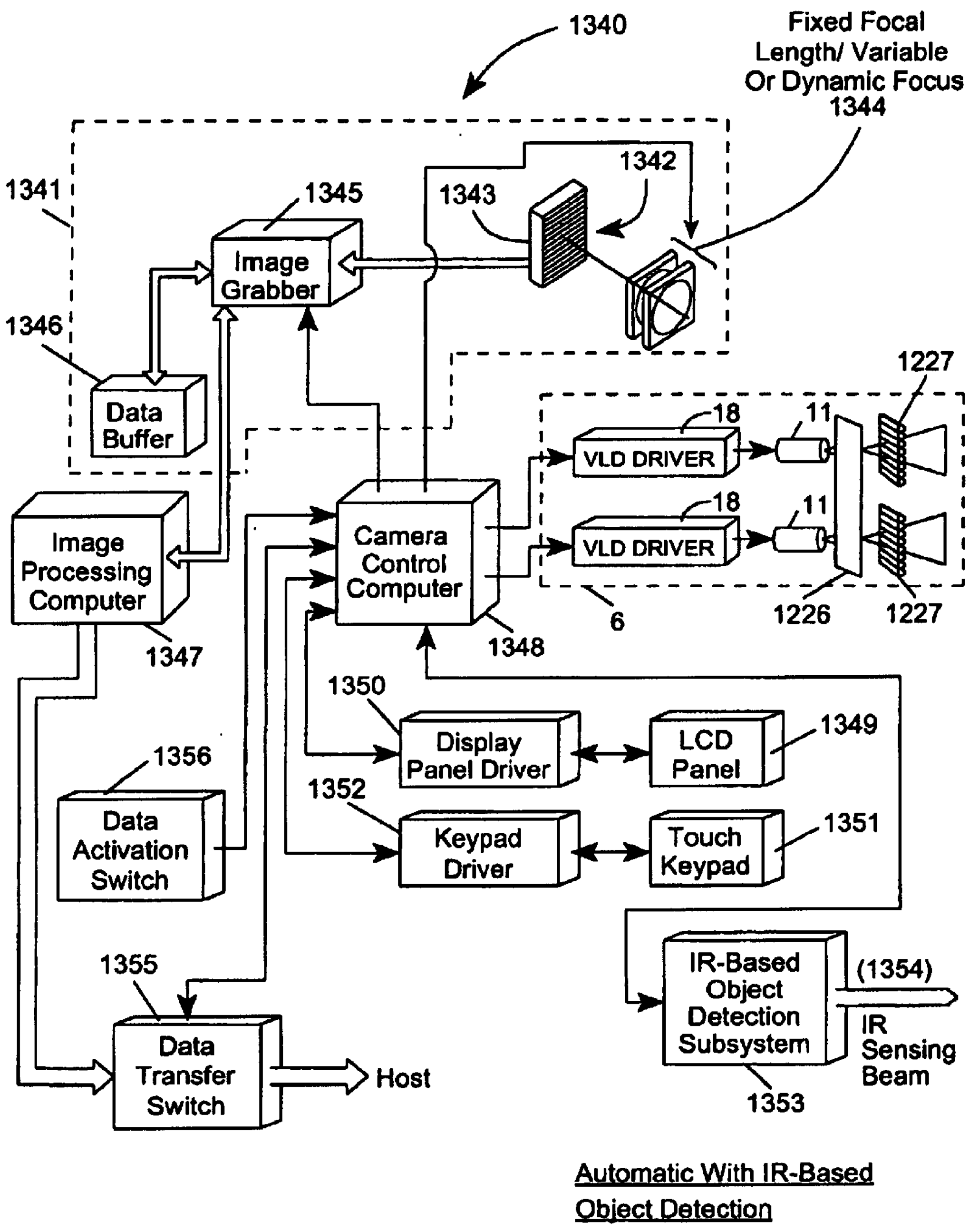
FIG. 40B2

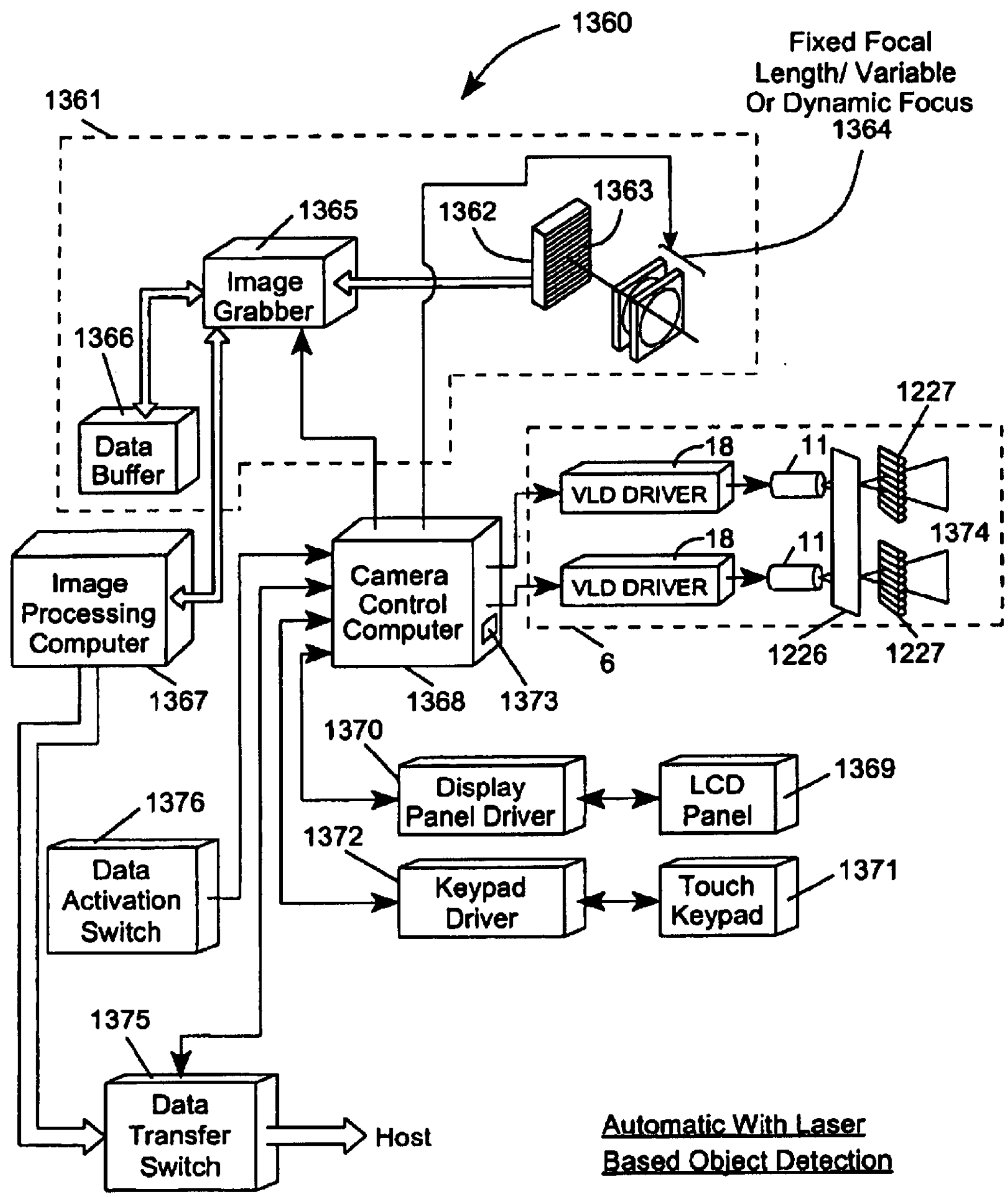
FIG. 40B3

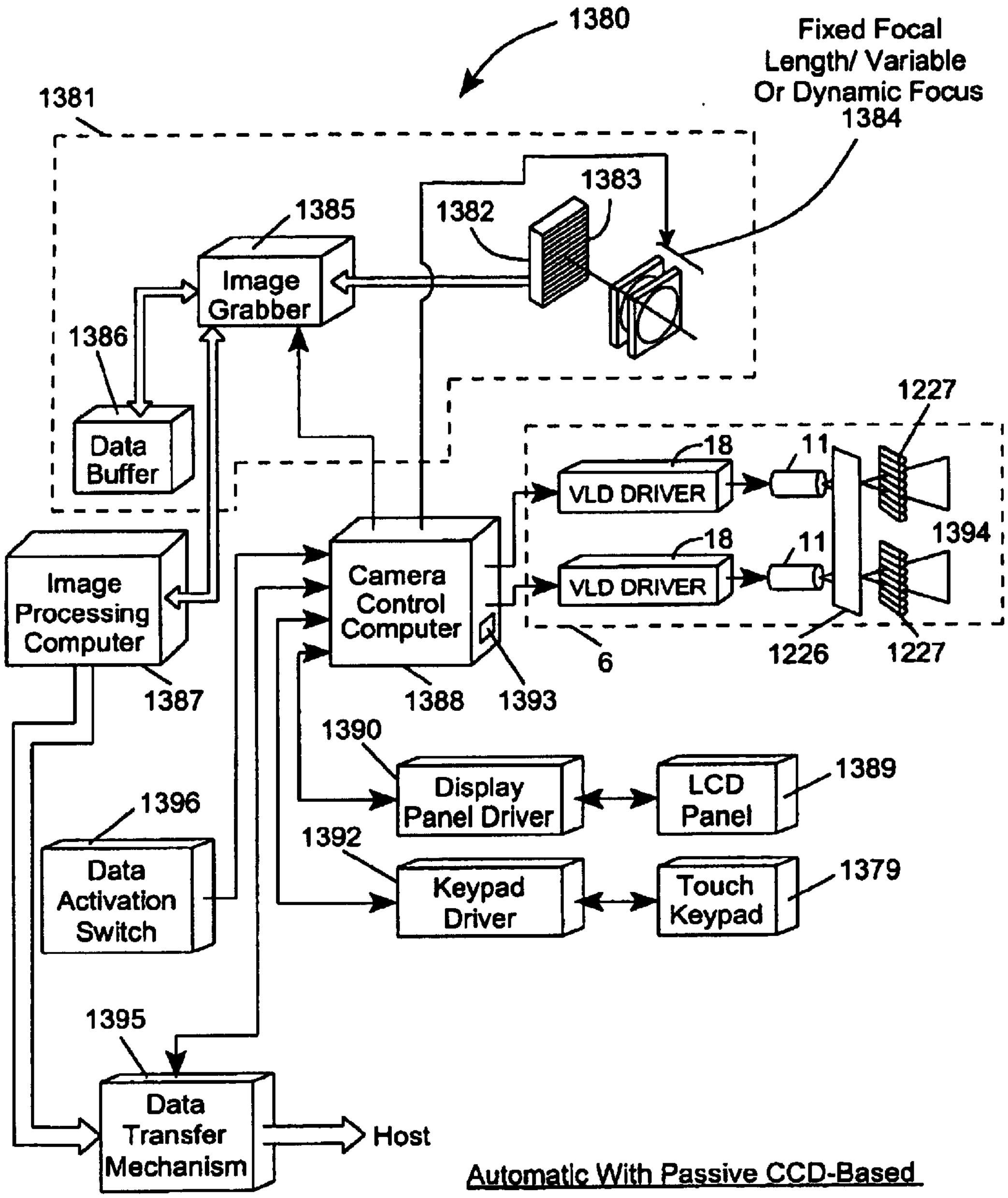
FIG. 40B4

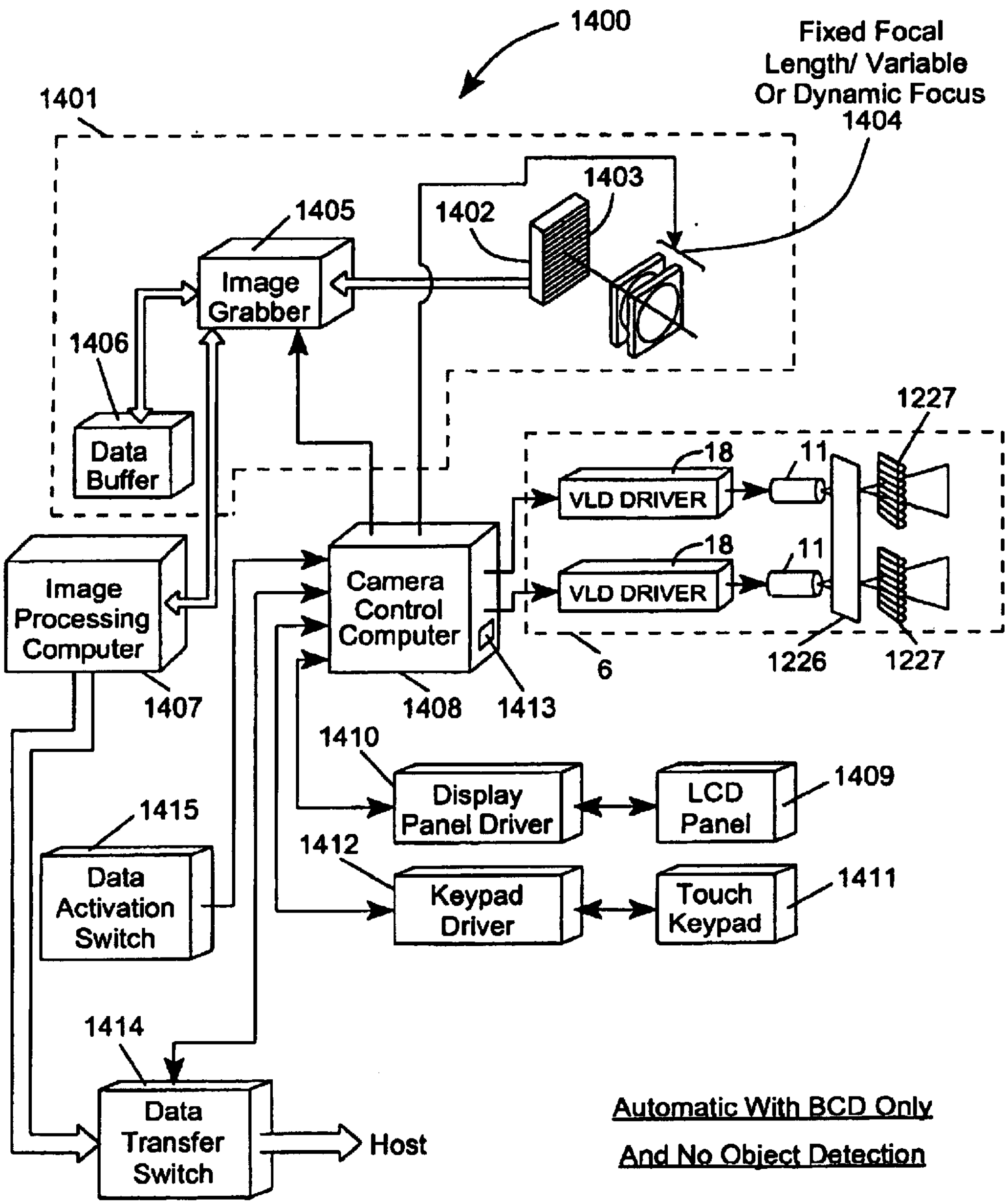
FIG. 40B5

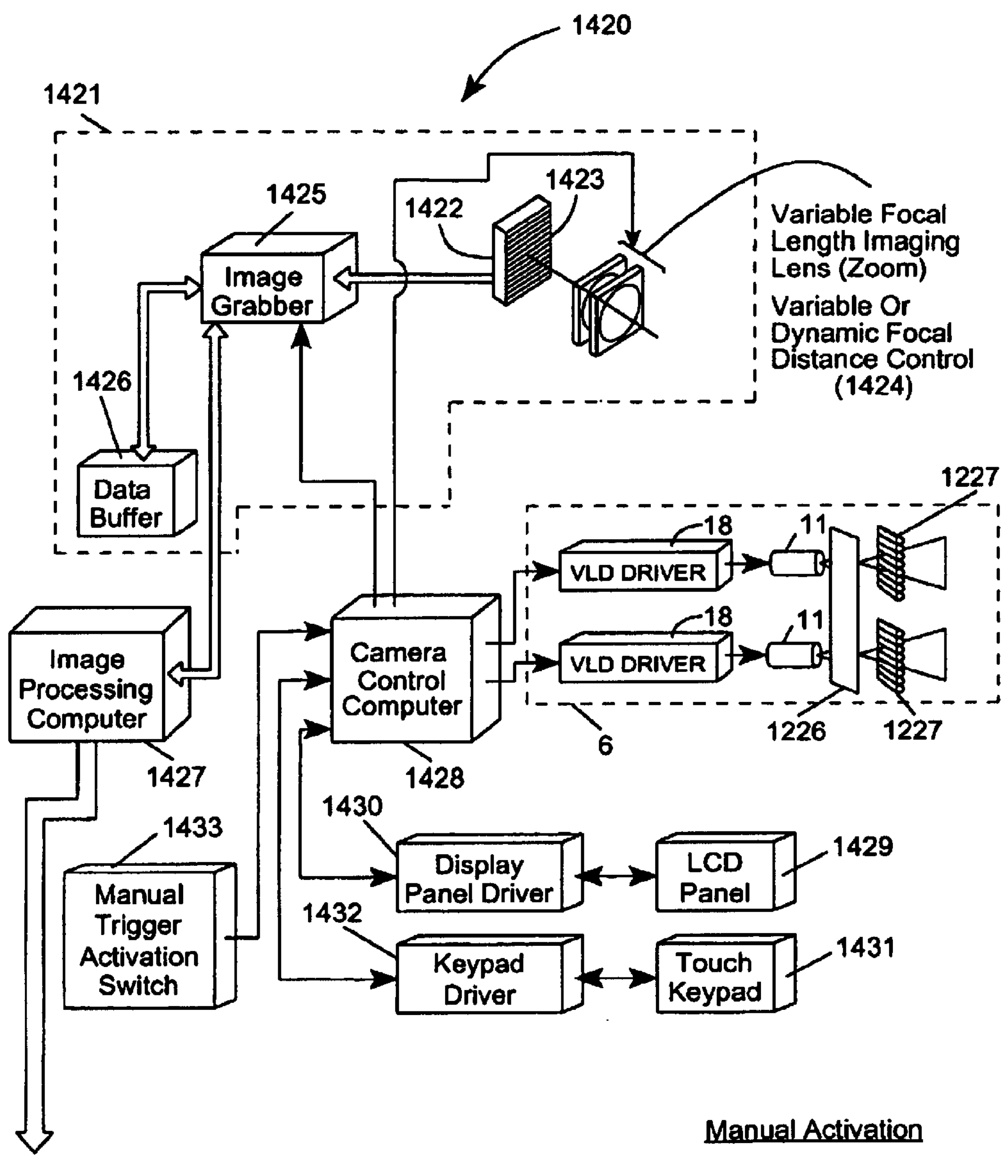
FIG. 40C1

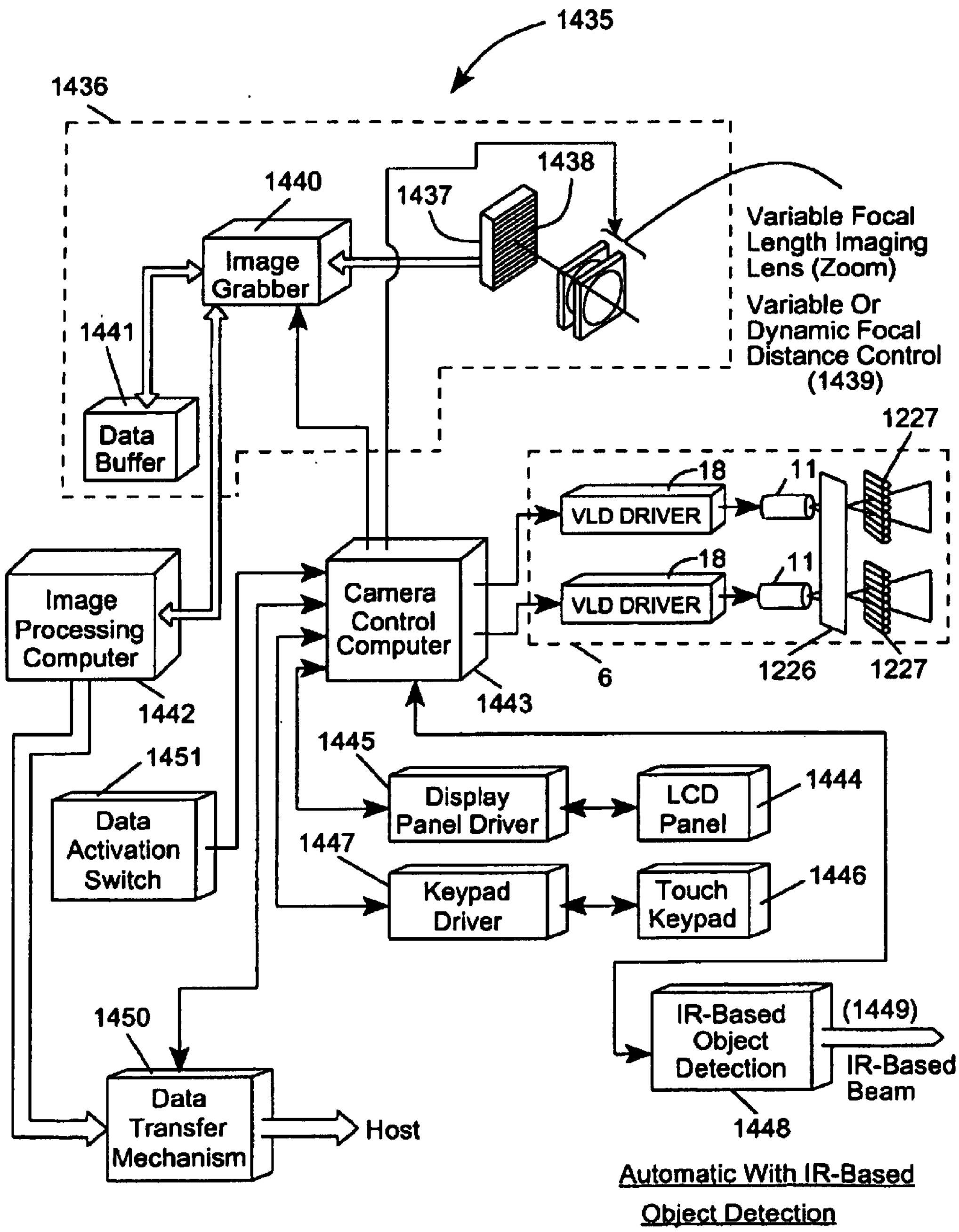
FIG. 40C2

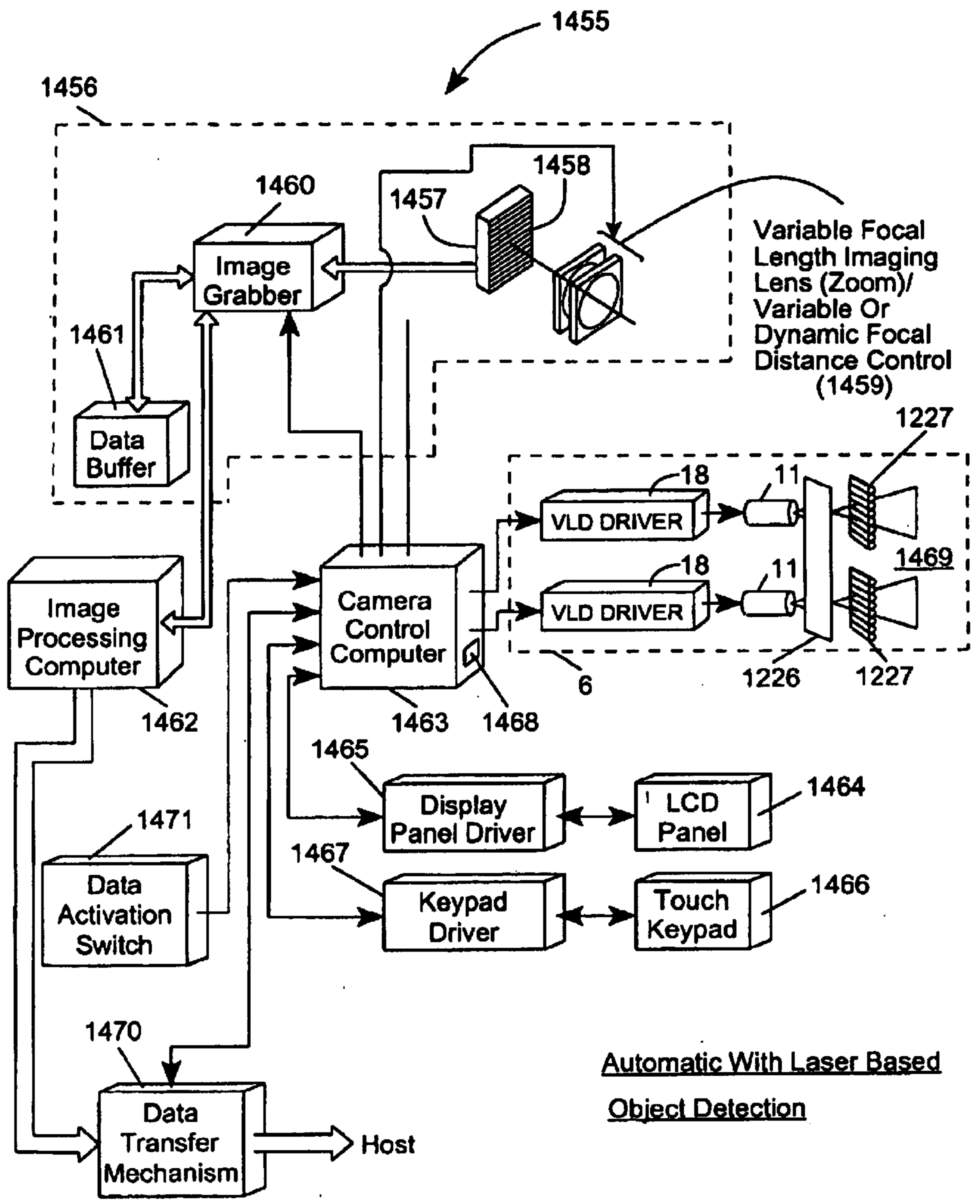
FIG. 40C3

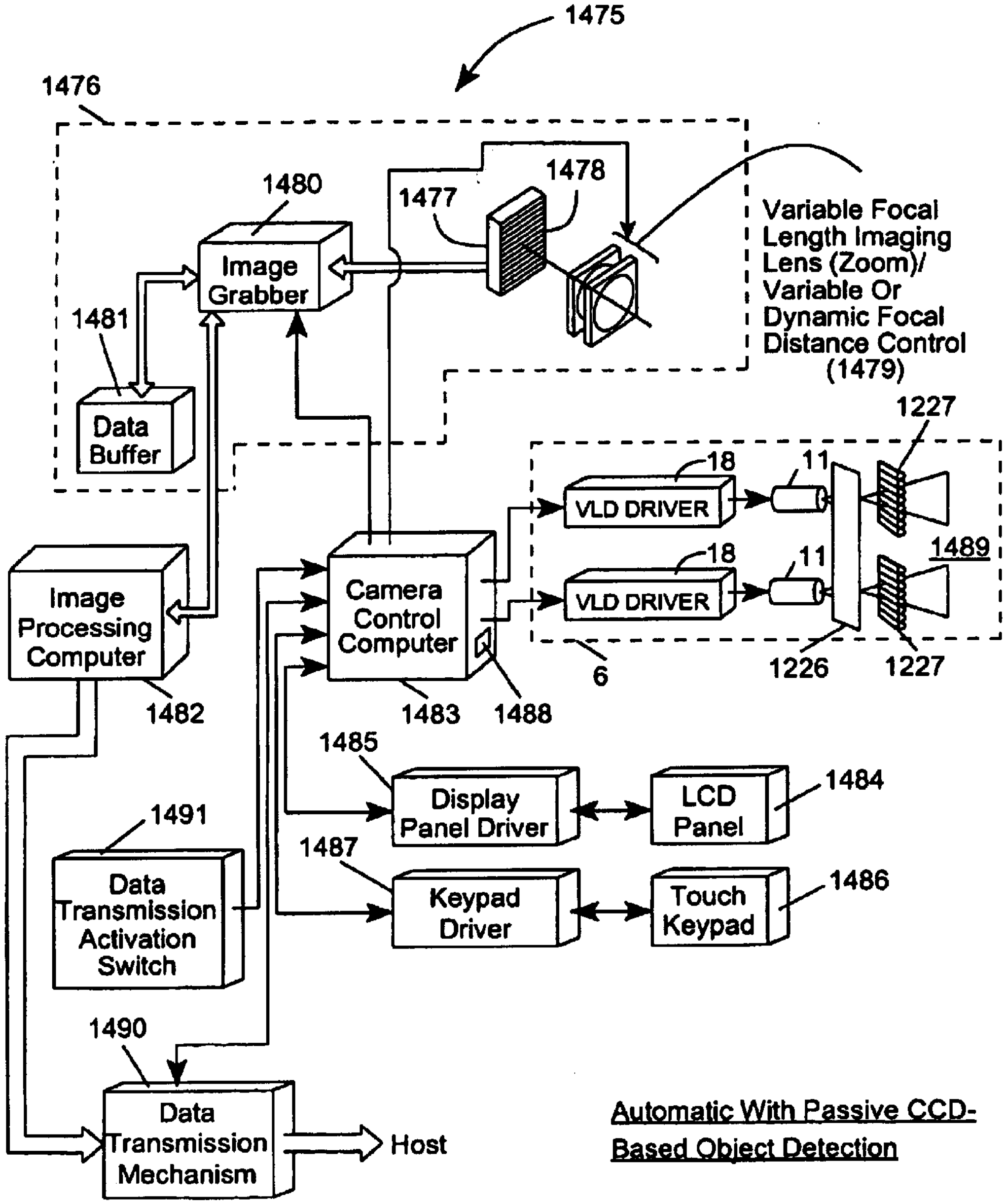
FIG. 40C4

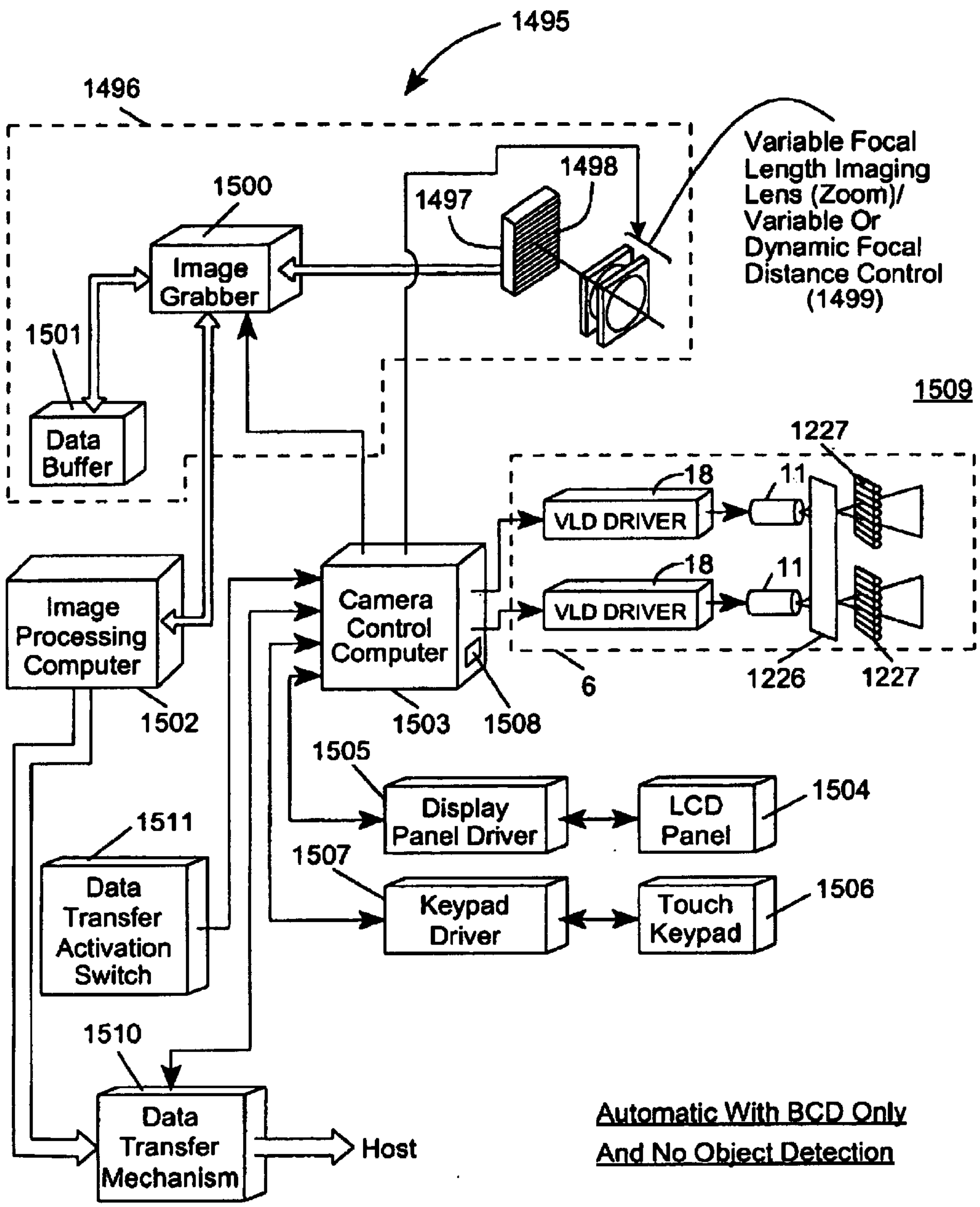
FIG. 40C5

Fig. 1I3A-3B

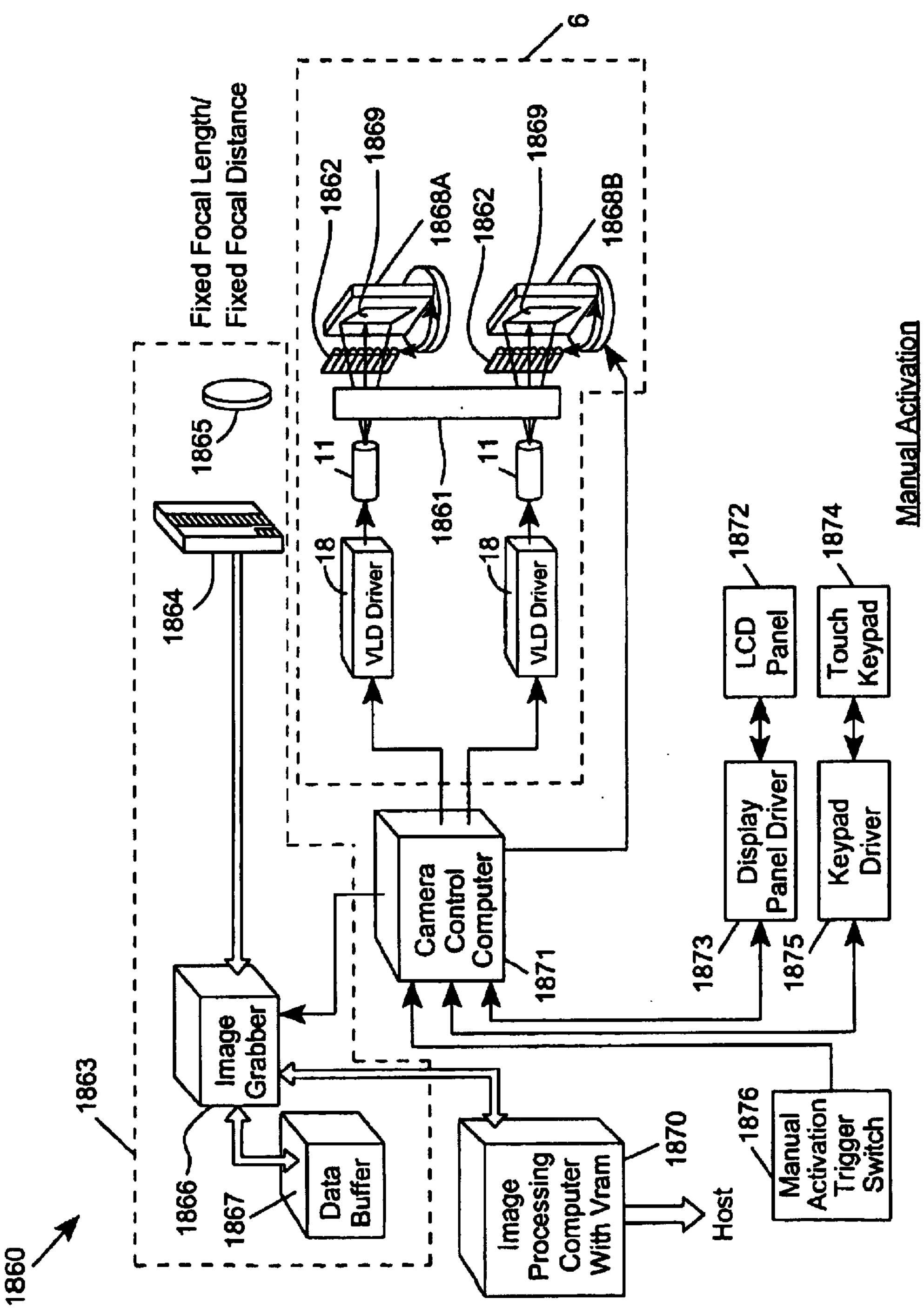
FIG. 53A1

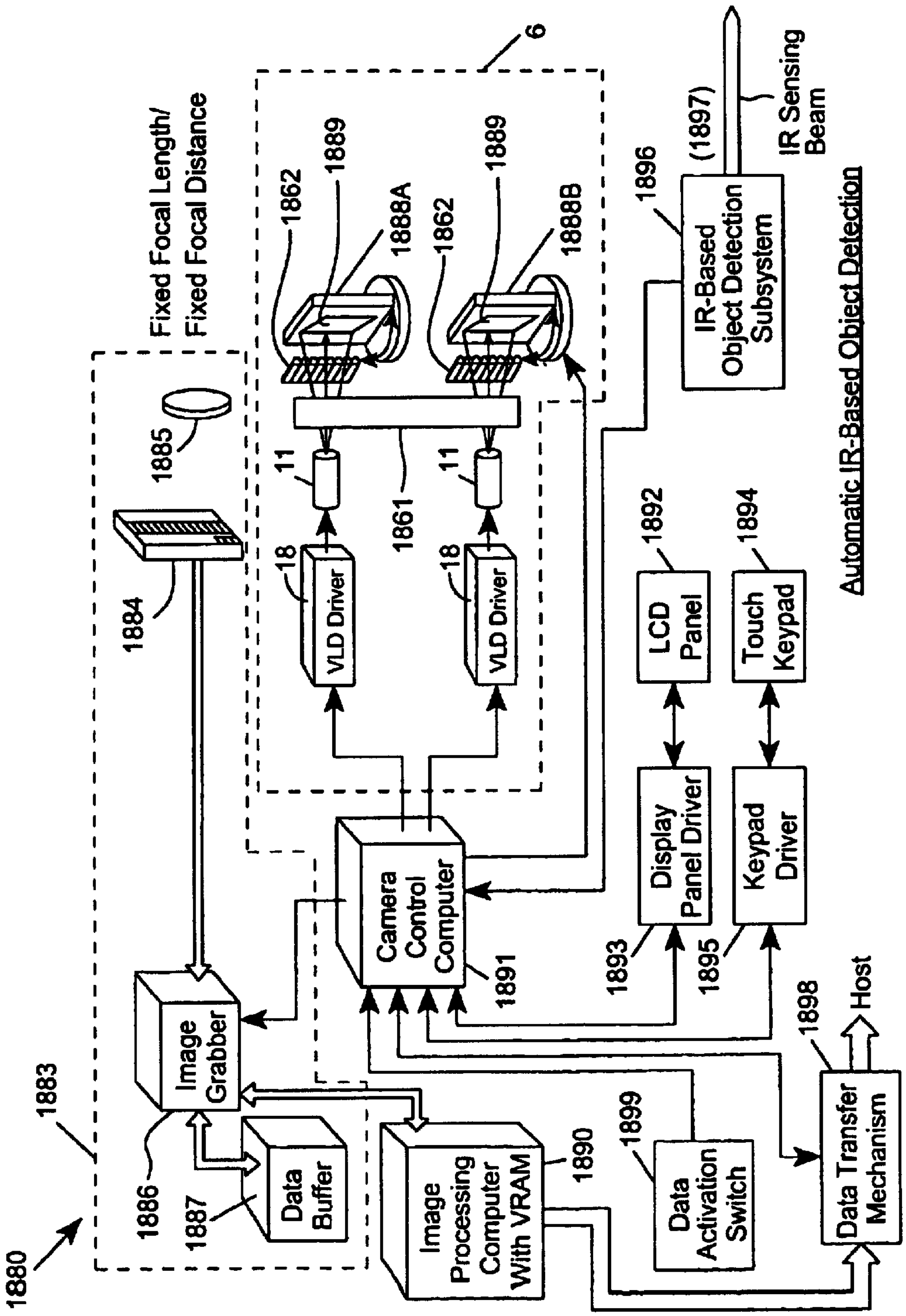
FIG. 53A2

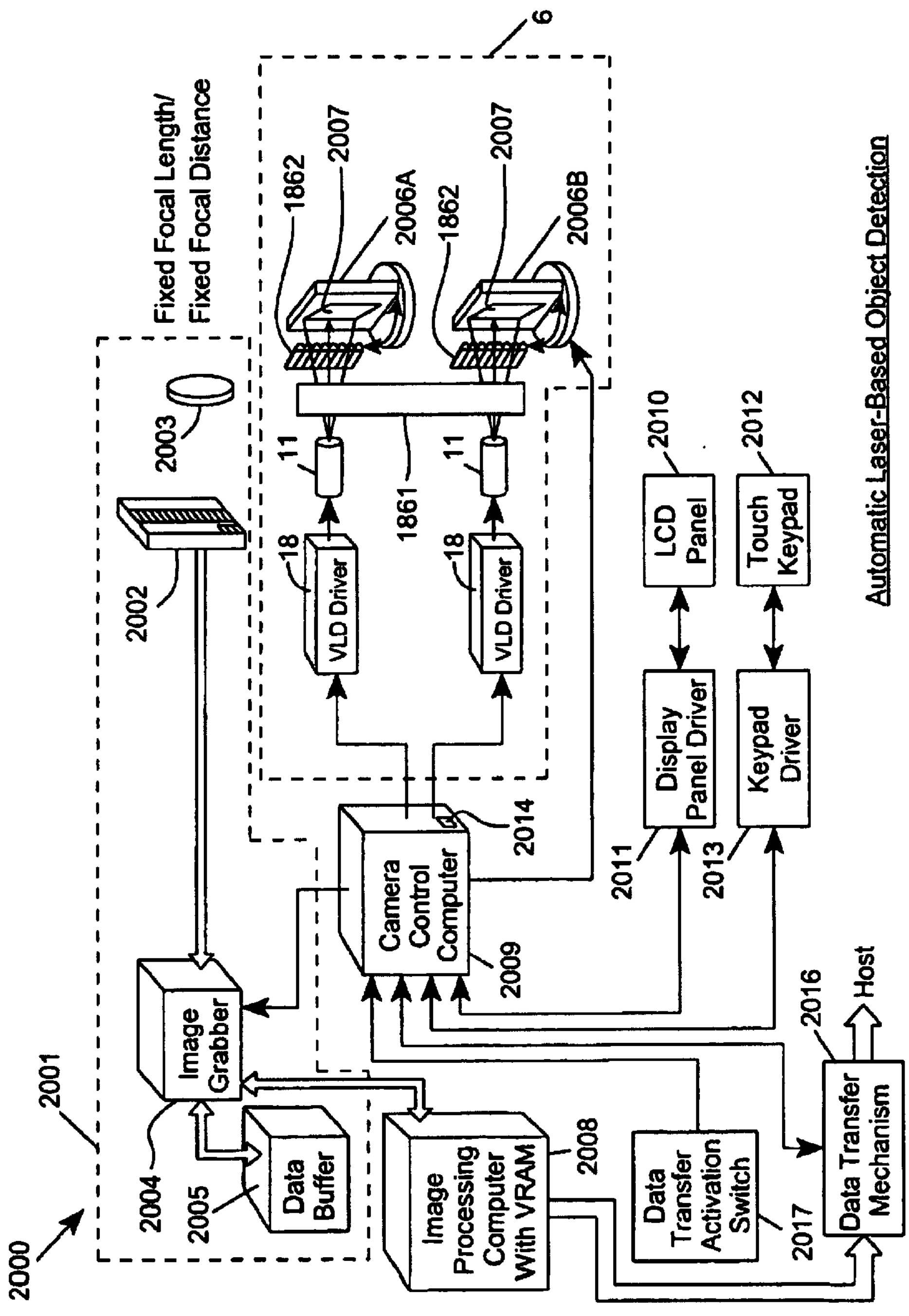
Automatic Laser-Based Object Detection
FIG. 53A3

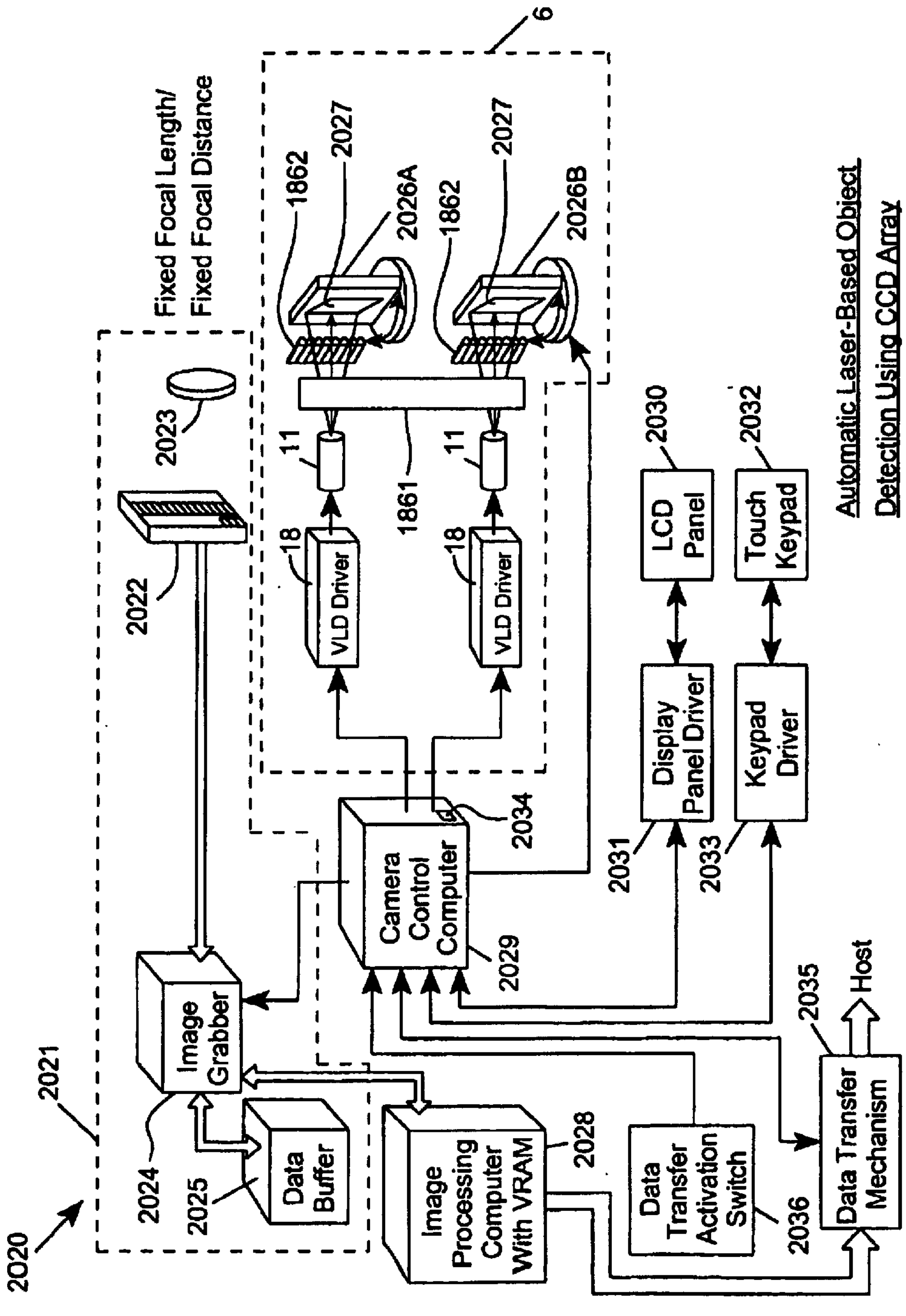
FIG. 53A4

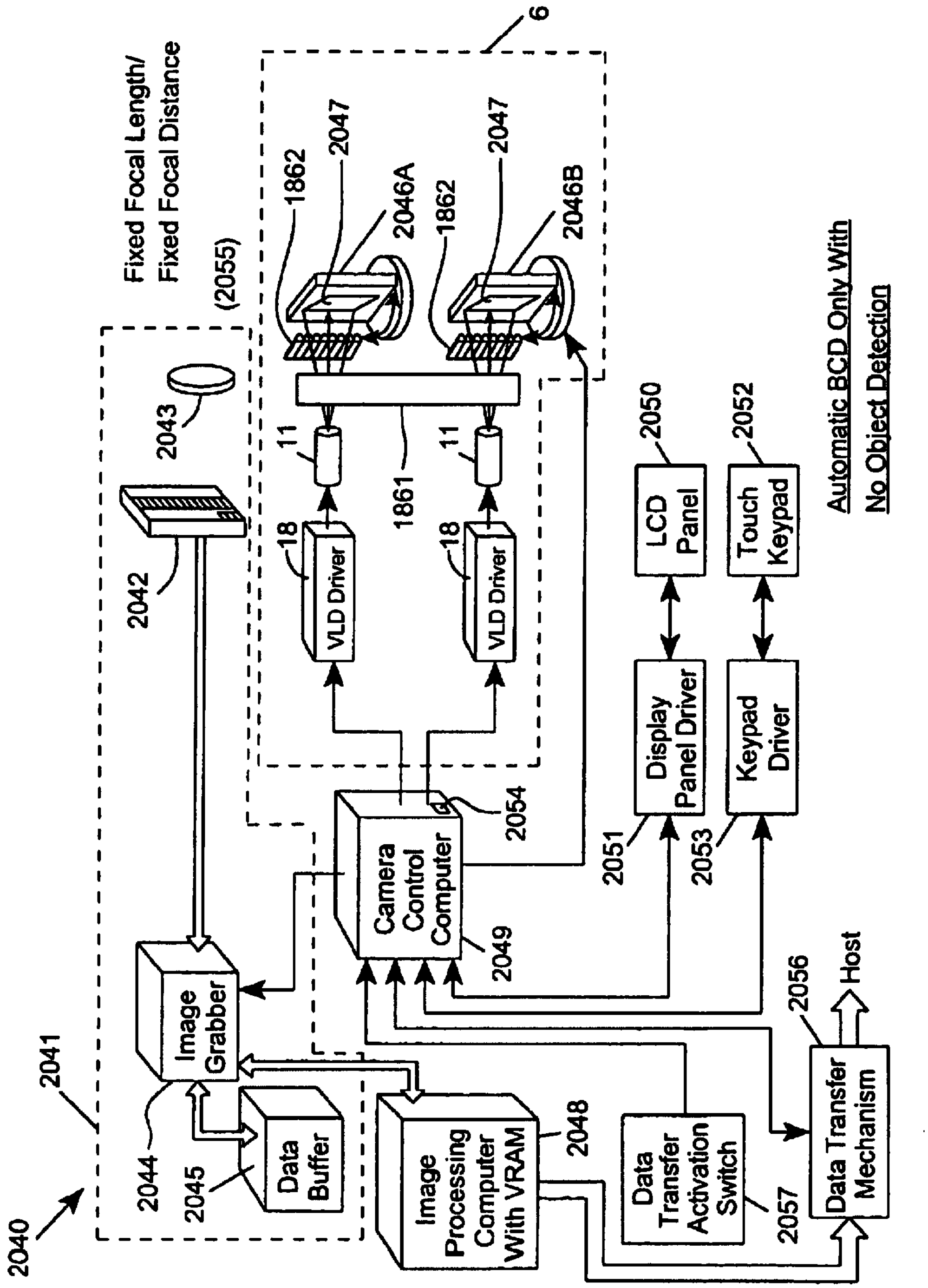
FIG. 53A5

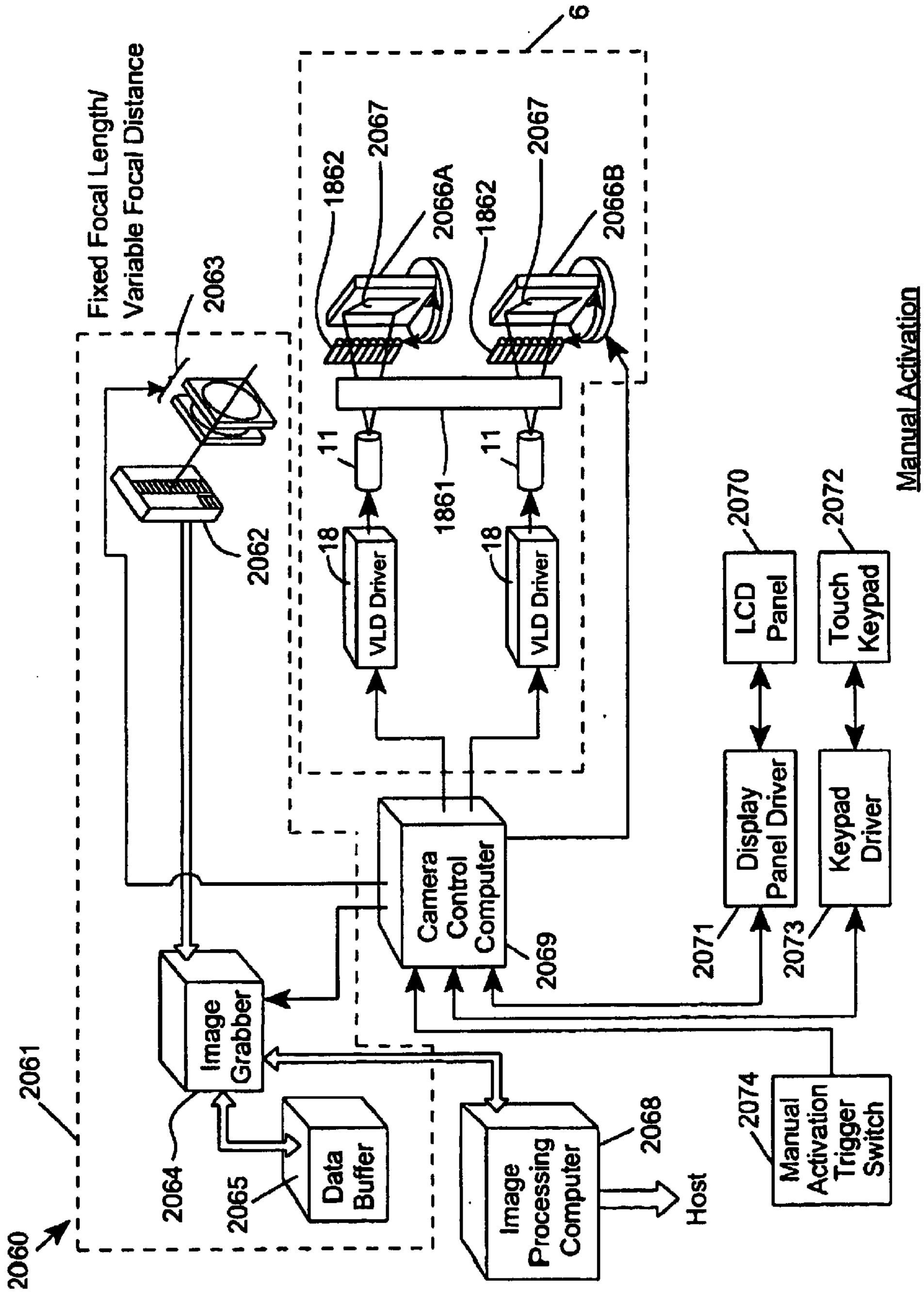
FIG. 53B1

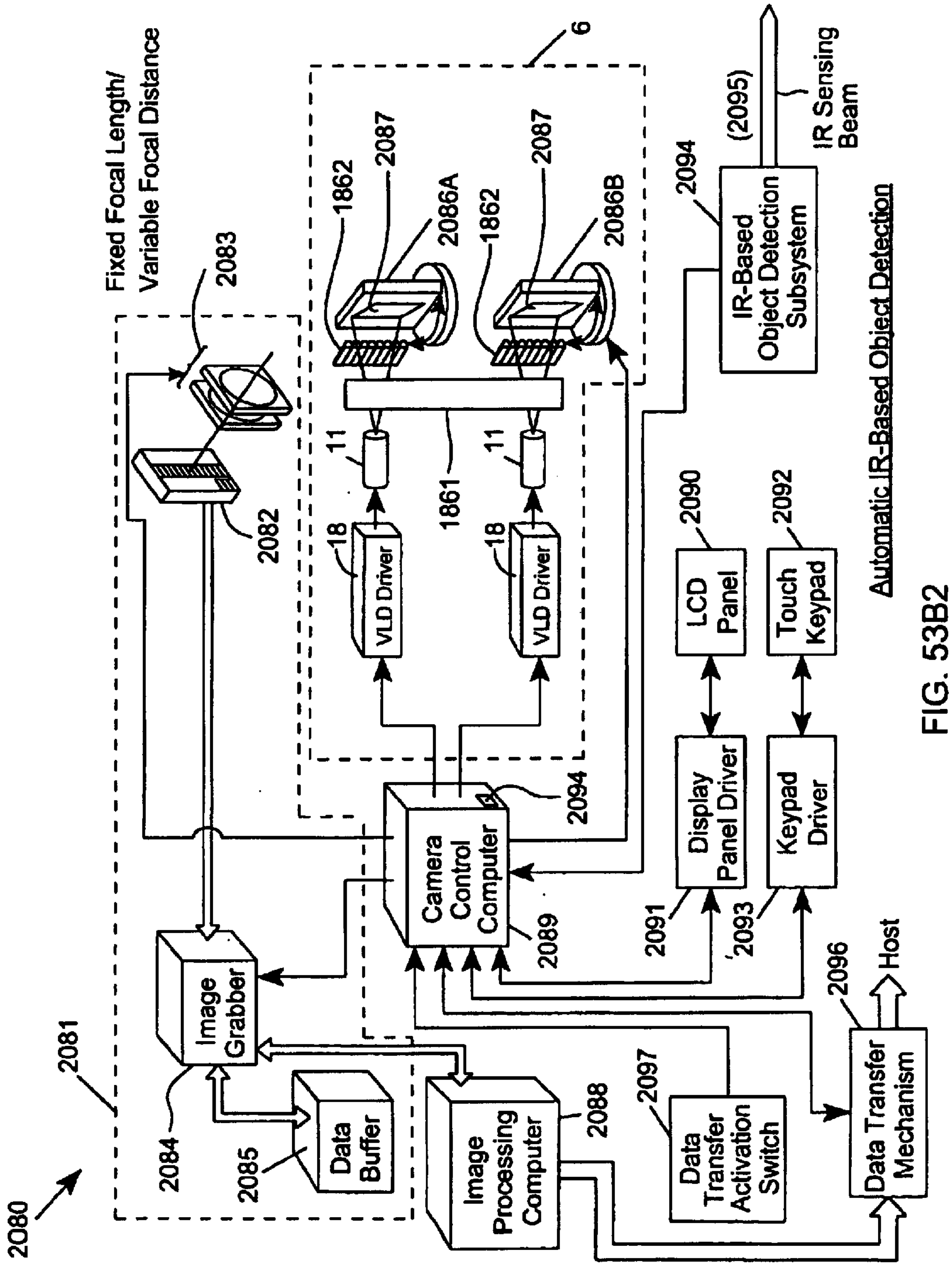
FIG. 53B2

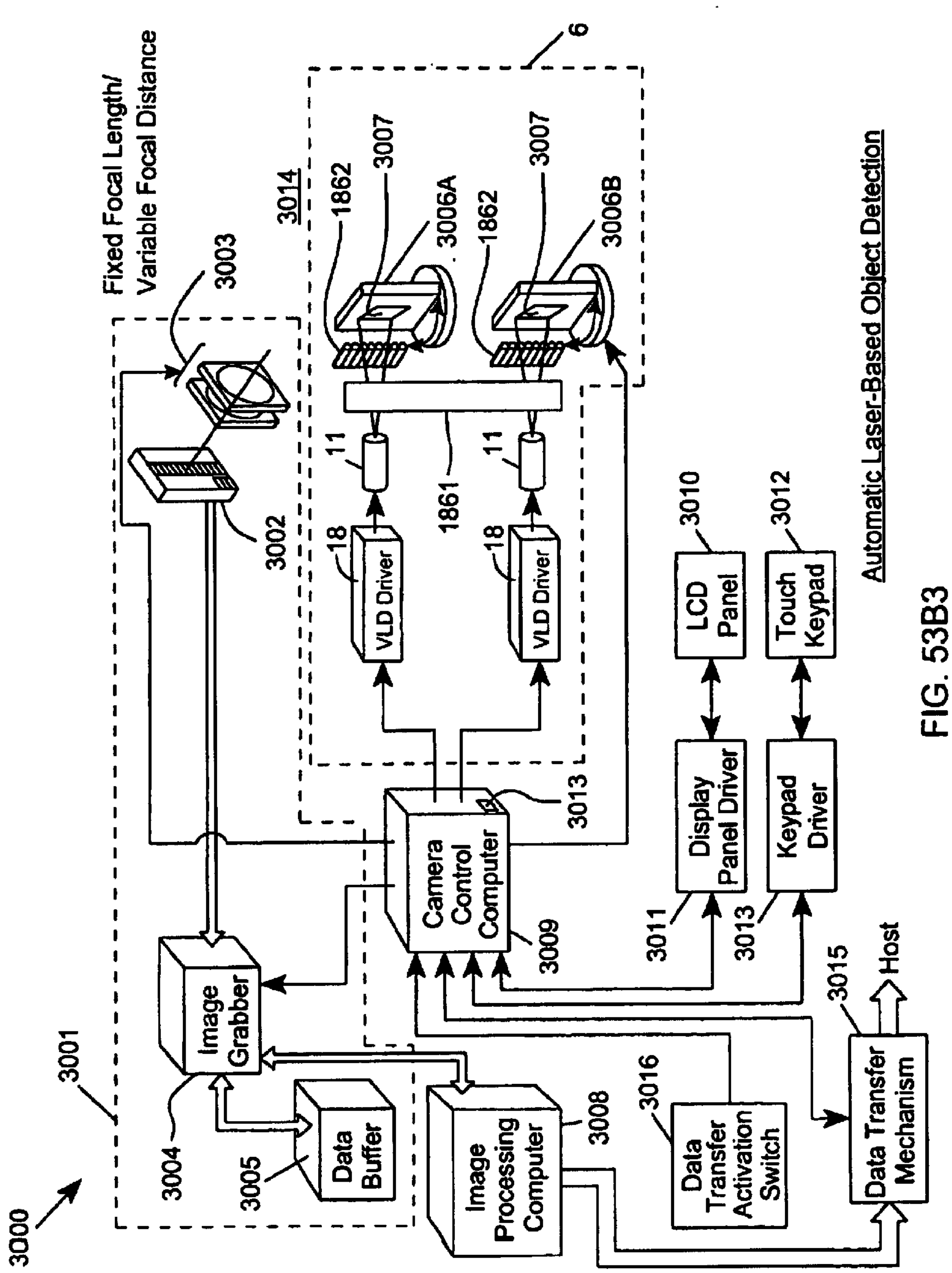
FIG. 53B3

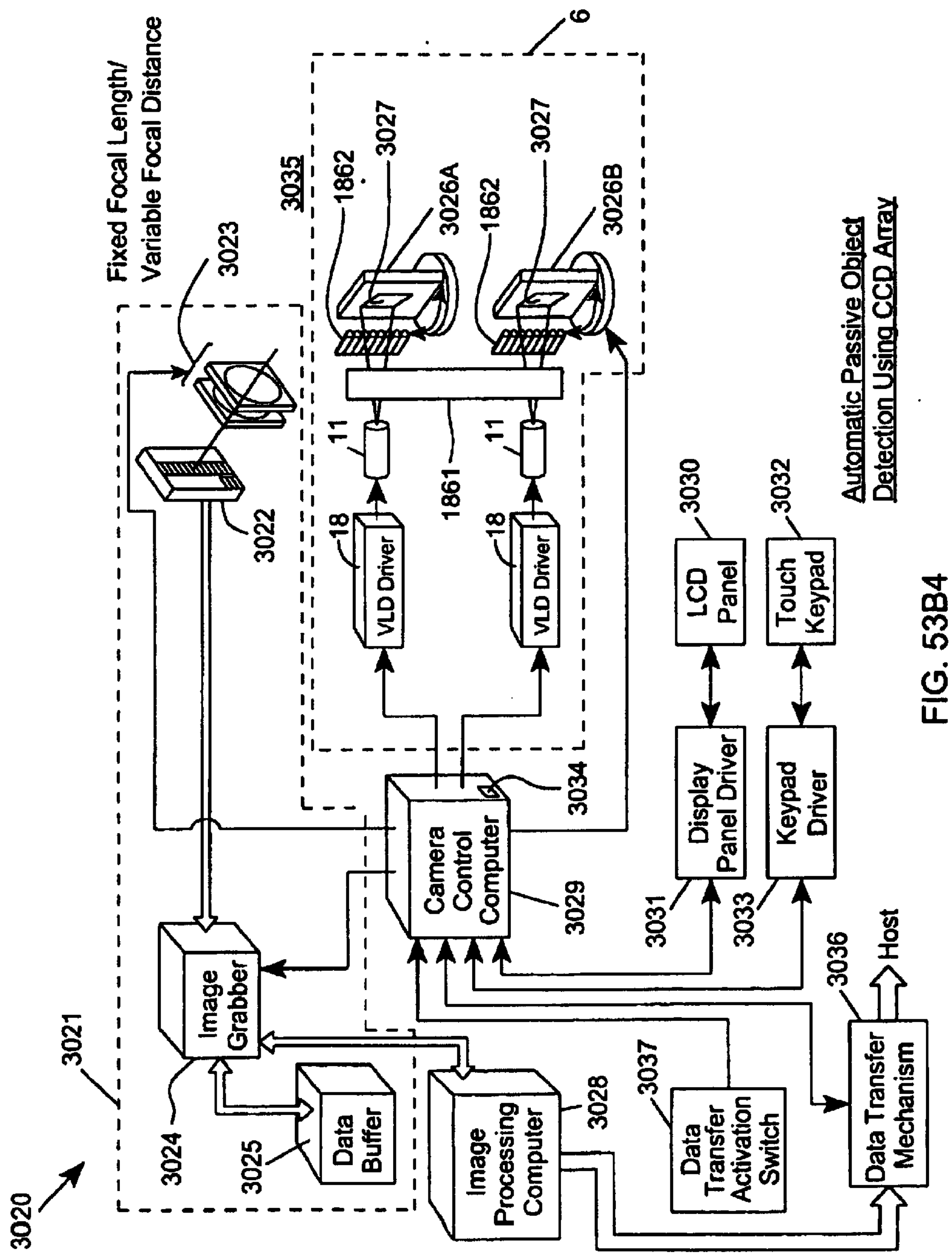
FIG. 53B4

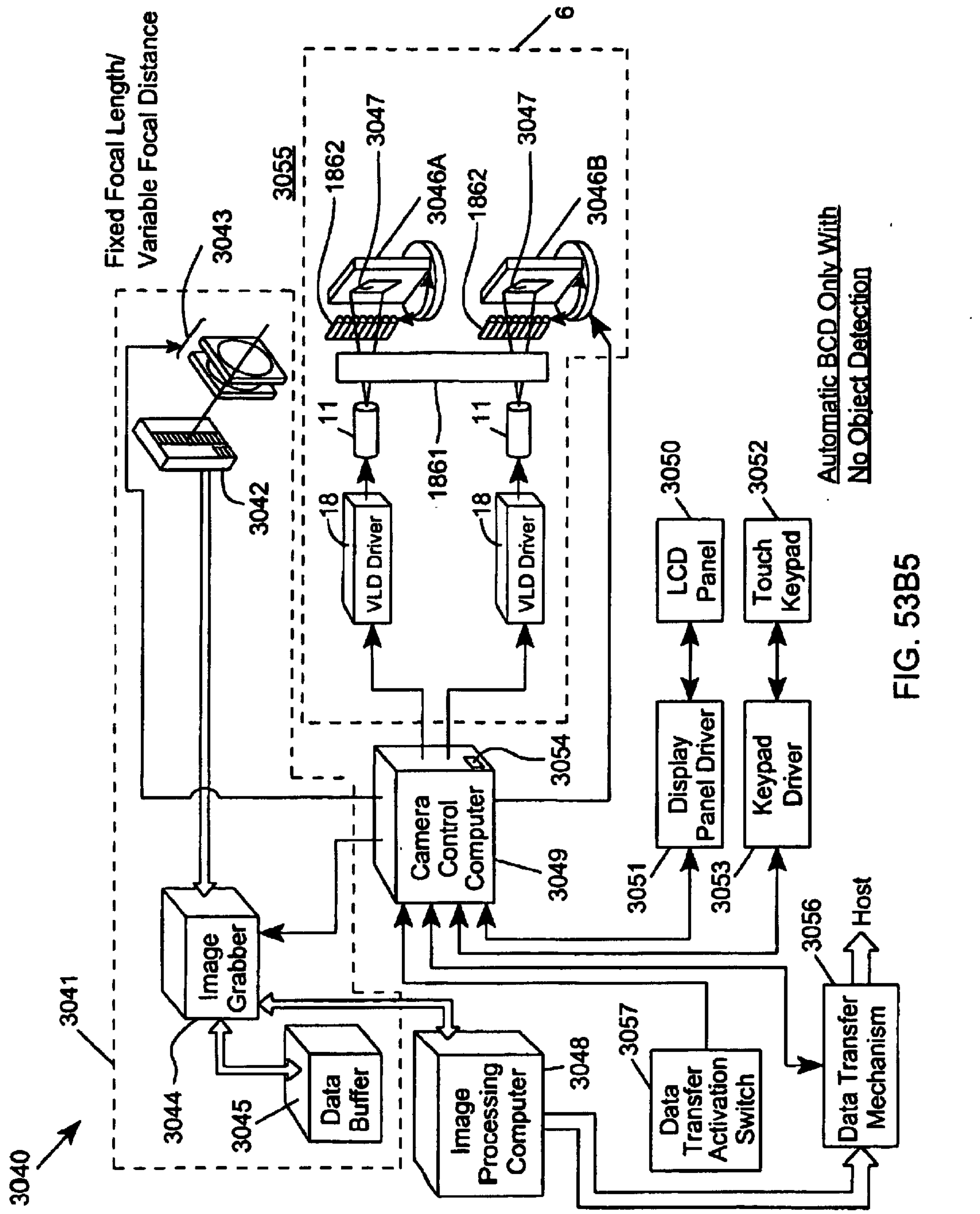
FIG. 53B5

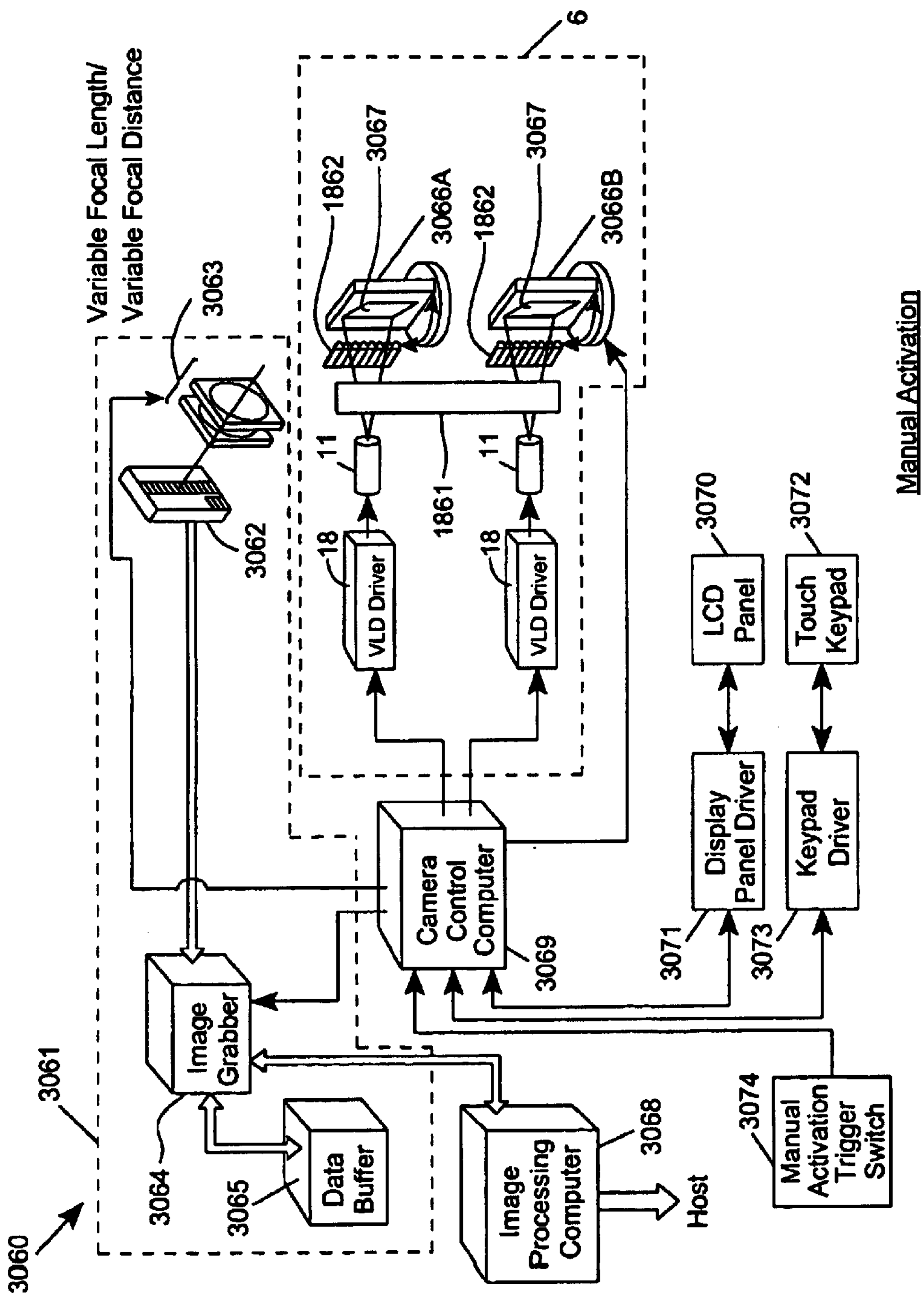
FIG. 53C1

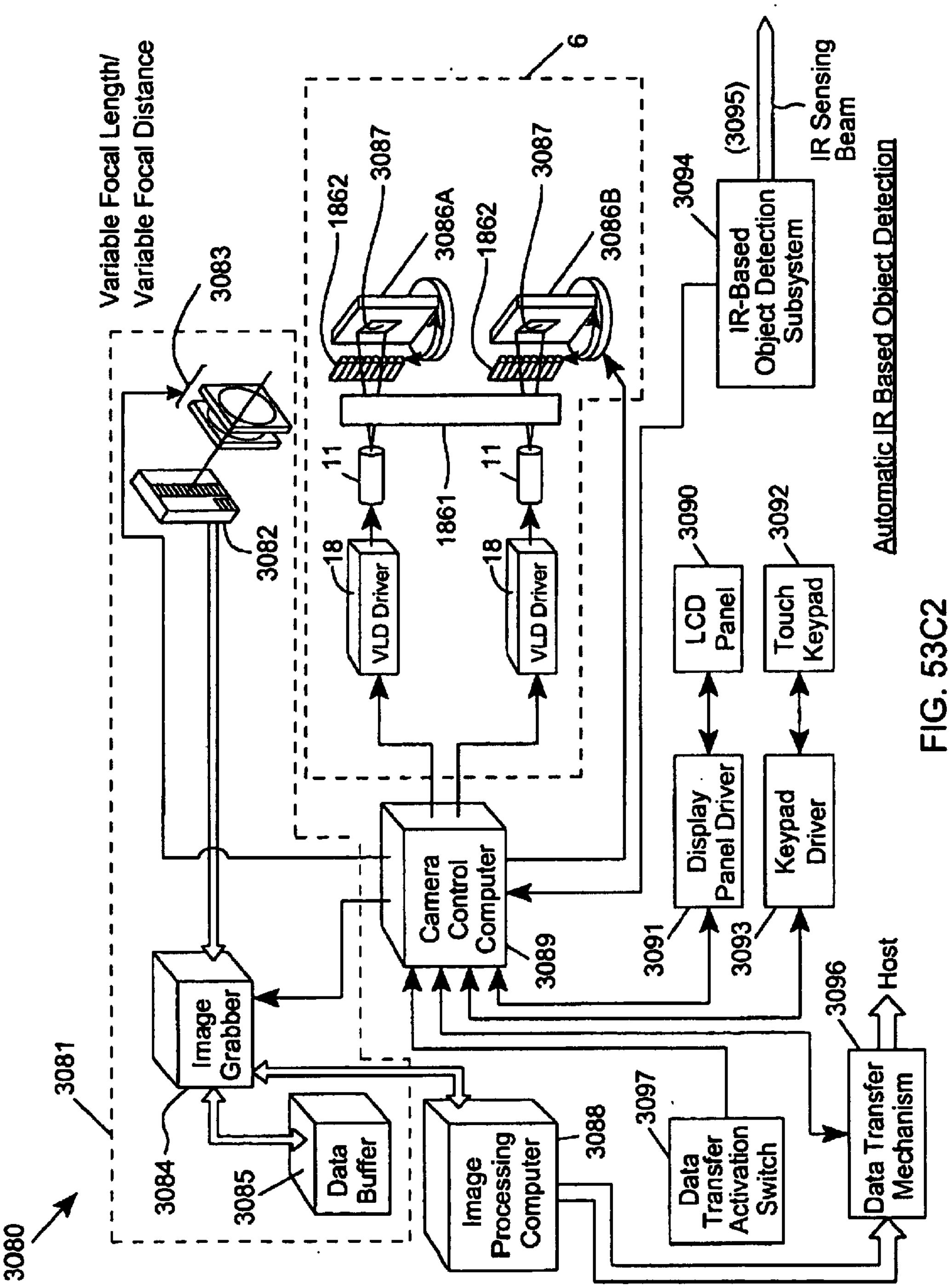
FIG. 53C2

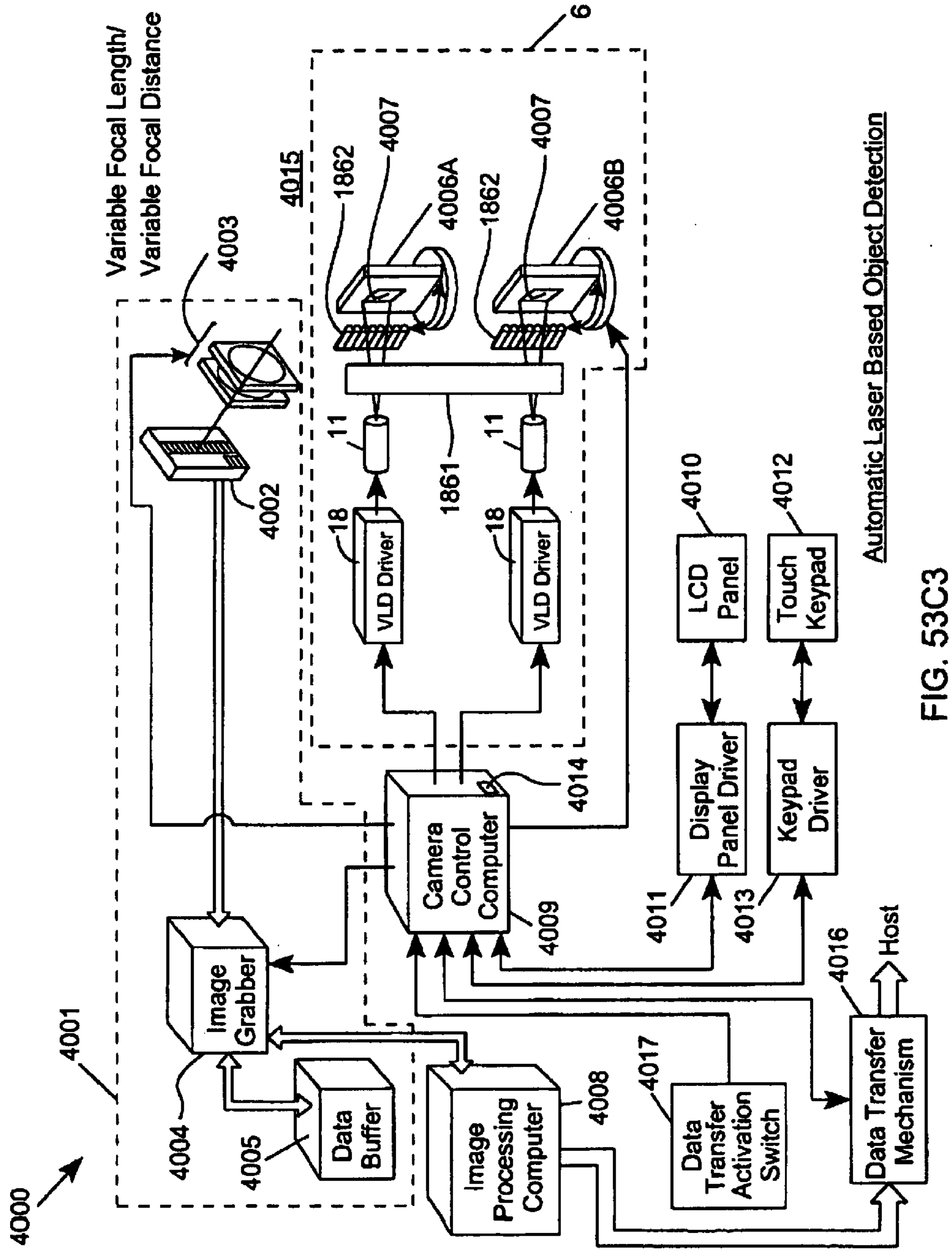
FIG. 53C3

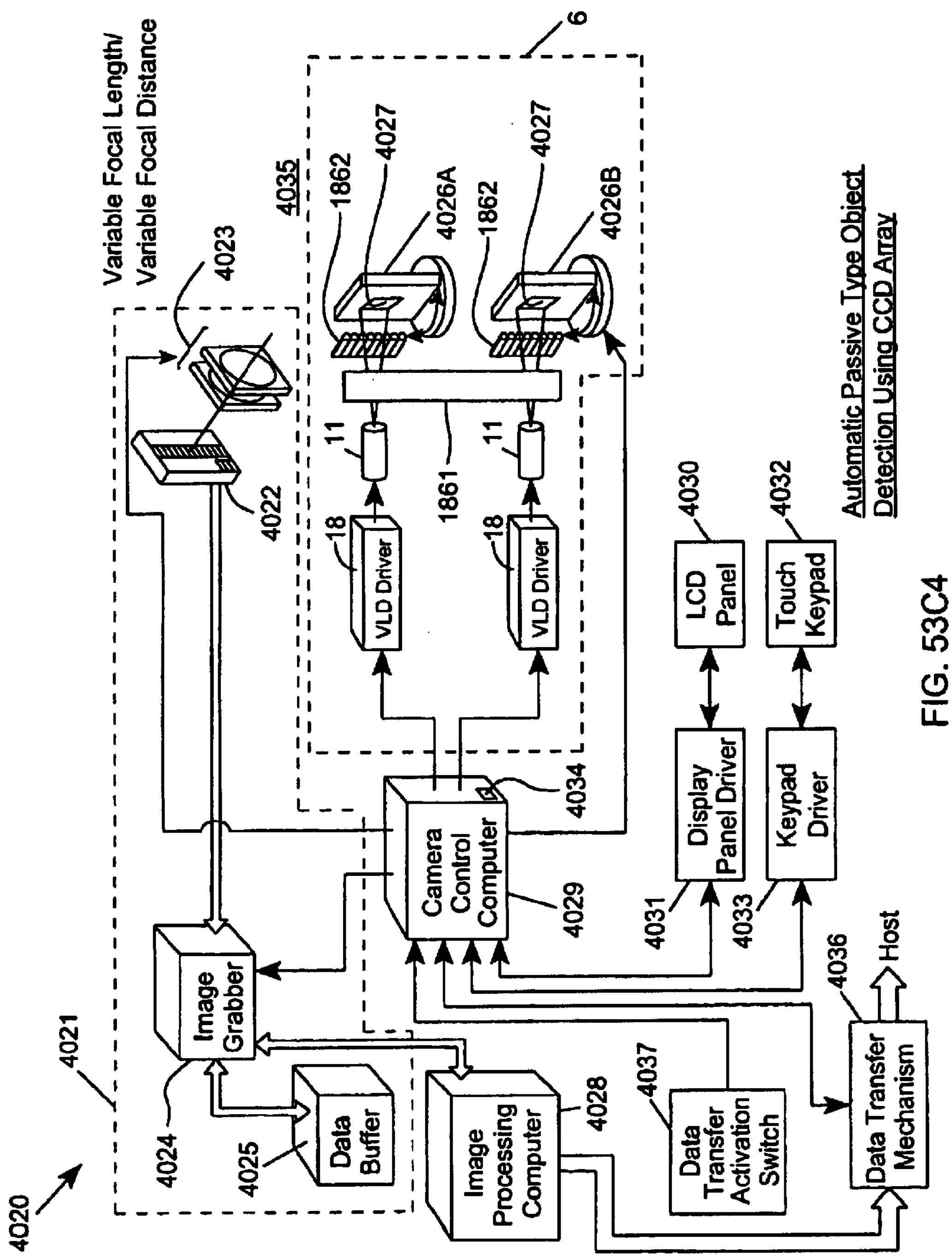
FIG. 53C4

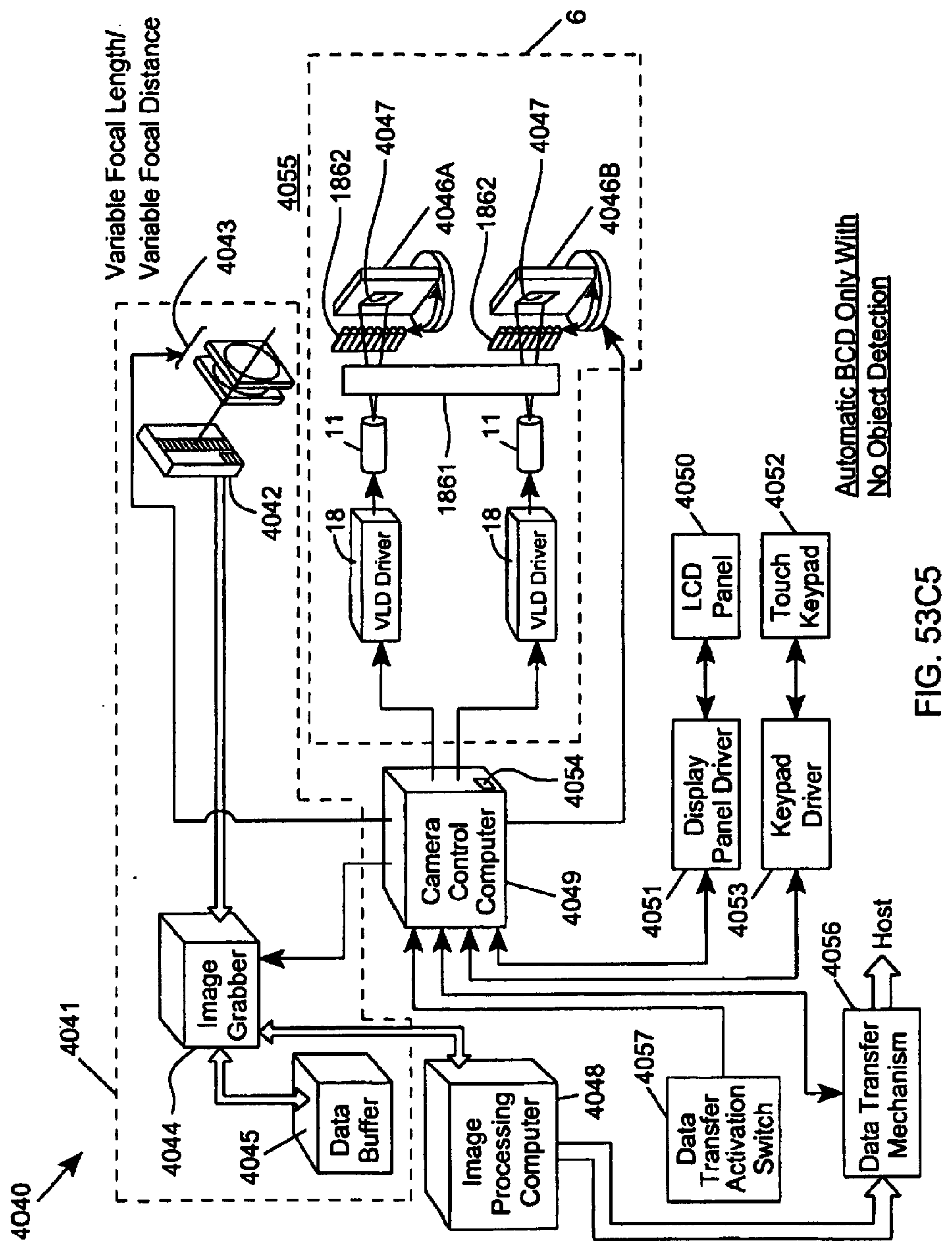
FIG. 53C5

DM
Fig. 1I7A-7B

HS Optical Shutter
Fig. 1I14A-14B

MLLD

Fig. 1I15A-15B

Etalon (Temp. Phase Mod.)
Fig. 1I17A-17B

Mode Hopping
Fig. 1I19A-19B

Micro-oscillating
Spatial Intensity
Modulation Panels
Fig. 1I21A-21D

EO or Mechanically
Rotating Iris

Fig. 1I23A-23B

E-optical Shutter
Before IFD Lens
Fig. 1I24A

"Airport Security System"

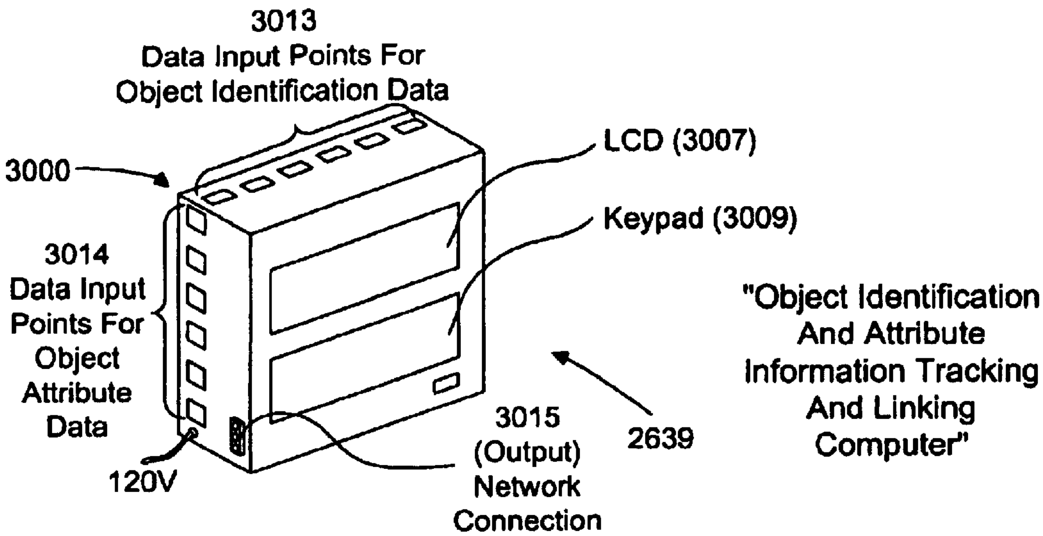
FIG. 68C1
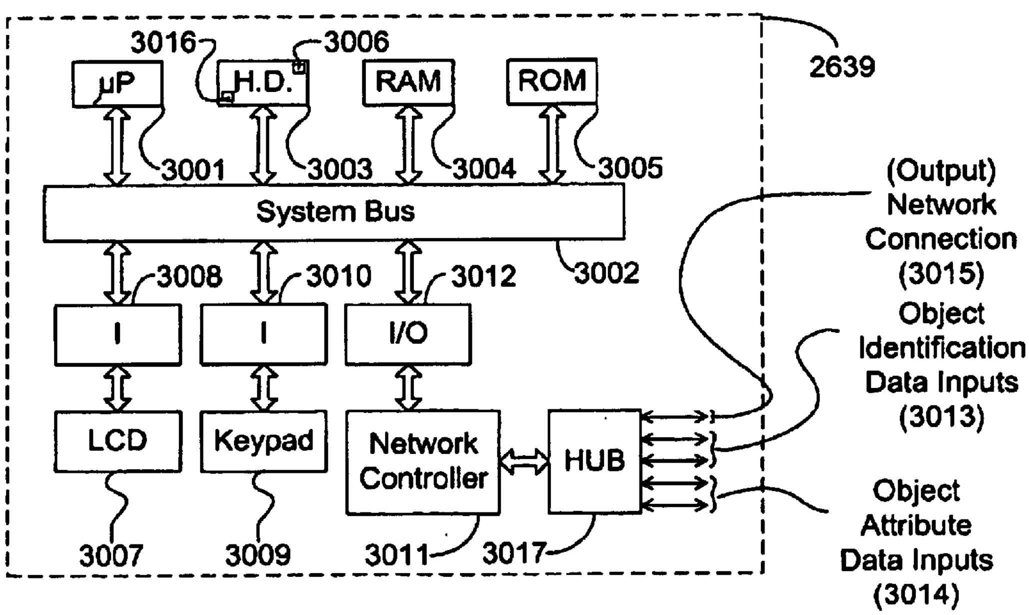
FIG. 68C2

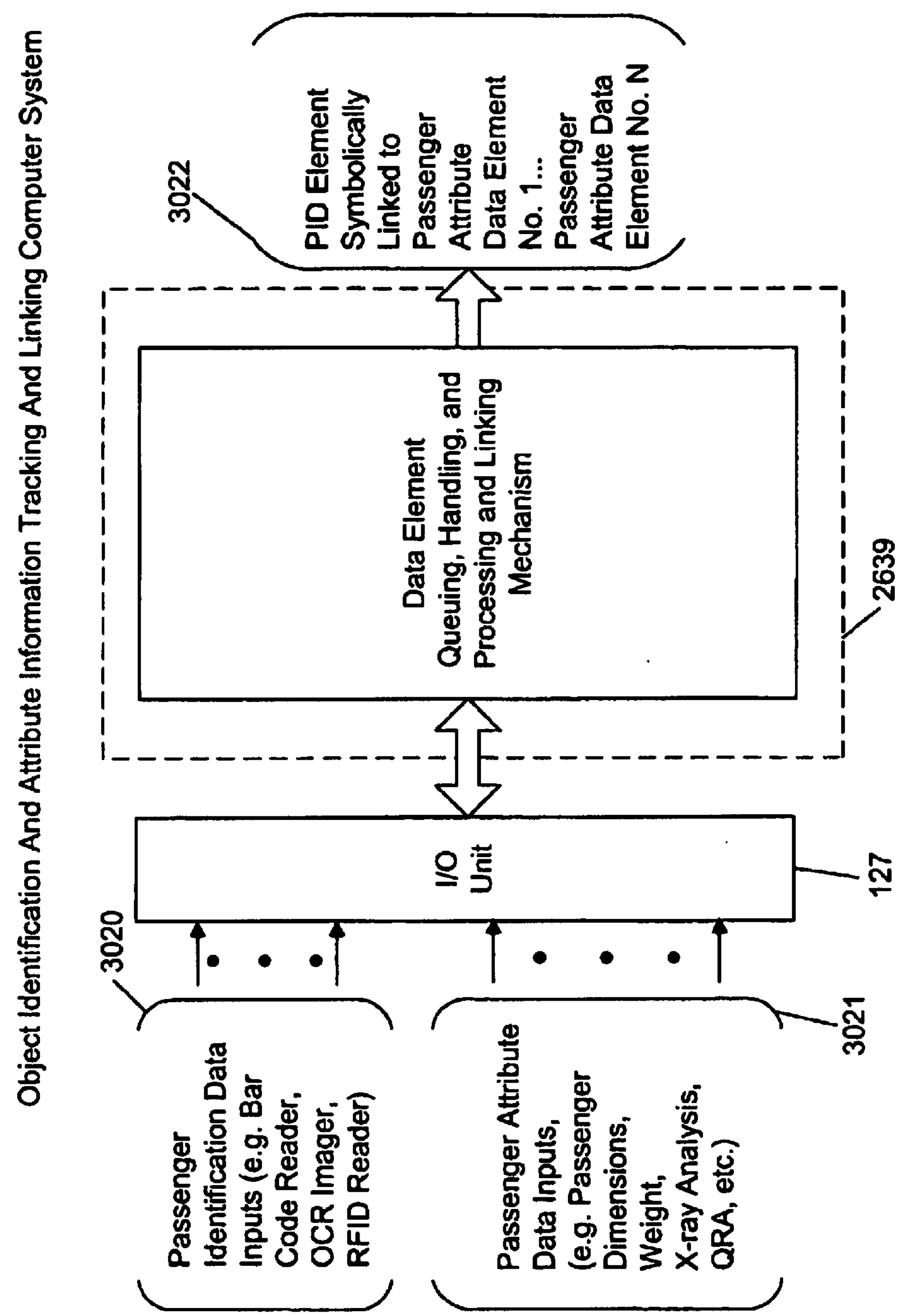
FIG. 68C3

Data Element Queuing, Handling, And Processing Subsystem Employed In The Object Identification And Attribute Acquisition System Of The Present Invention. (131)
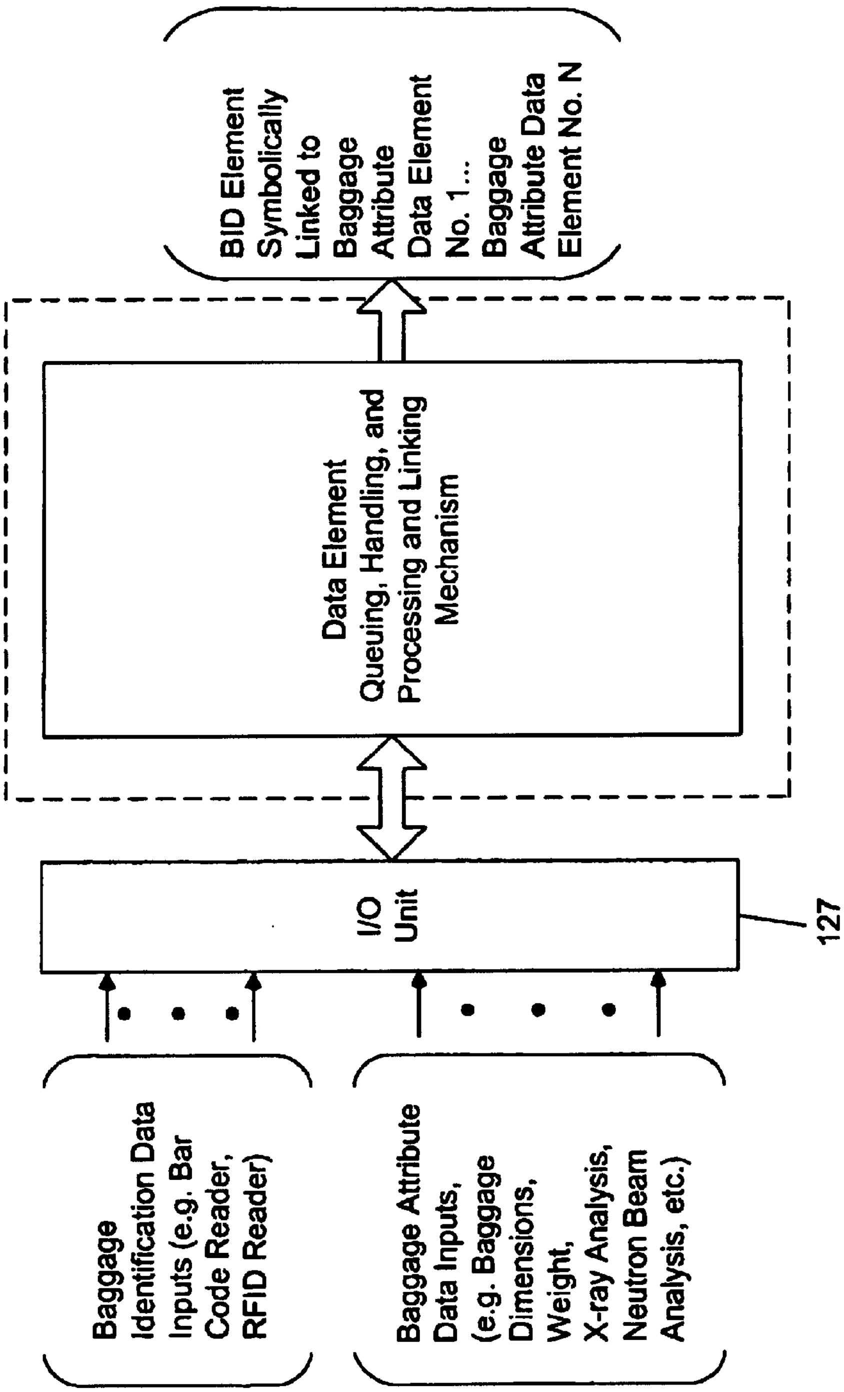
FIG. 68C4

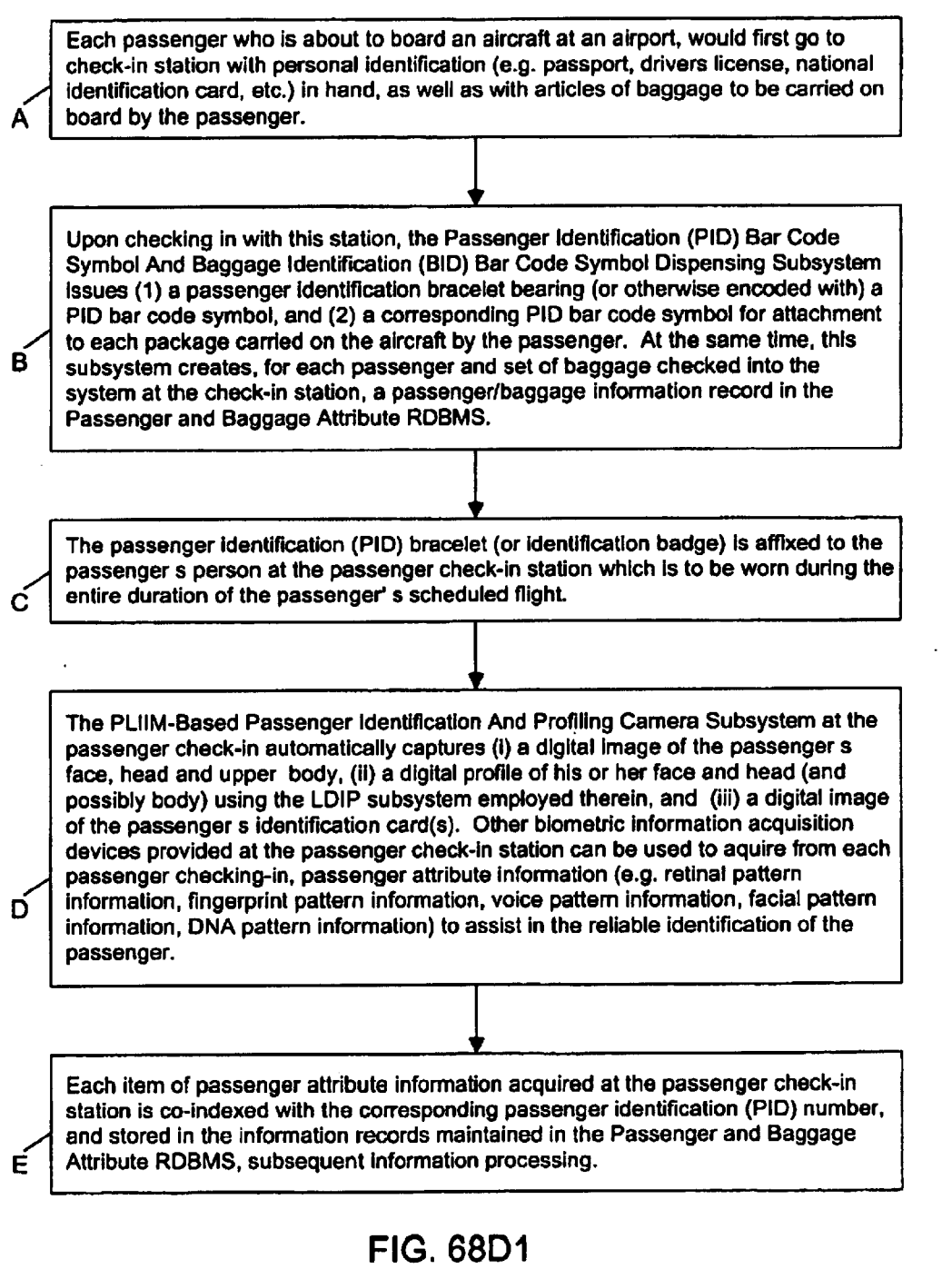

A — Each passenger who is about to board an aircraft at an airport, would first go to check-in station with personal identification (e.g. passport, drivers license, national identification card, etc.) in hand, as well as with articles of baggage to be carried on board by the passenger.

↓

B — Upon checking in with this station, the Passenger Identification (PID) Bar Code Symbol And Baggage Identification (BID) Bar Code Symbol Dispensing Subsystem issues (1) a passenger identification bracelet bearing (or otherwise encoded with) a PID bar code symbol, and (2) a corresponding PID bar code symbol for attachment to each package carried on the aircraft by the passenger. At the same time, this subsystem creates, for each passenger and set of baggage checked into the system at the check-in station, a passenger/baggage information record in the Passenger and Baggage Attribute RDBMS.

↓

C — The passenger identification (PID) bracelet (or identification badge) is affixed to the passenger s person at the passenger check-in station which is to be worn during the entire duration of the passenger' s scheduled flight.

↓

D — The PLIIM-Based Passenger Identification And Profiling Camera Subsystem at the passenger check-in automatically captures (i) a digital image of the passenger s face, head and upper body, (ii) a digital profile of his or her face and head (and possibly body) using the LDIP subsystem employed therein, and (iii) a digital image of the passenger s identification card(s). Other biometric information acquisition devices provided at the passenger check-in station can be used to aquire from each passenger checking-in, passenger attribute information (e.g. retinal pattern information, fingerprint pattern information, voice pattern information, facial pattern information, DNA pattern information) to assist in the reliable identification of the passenger.

↓

E — Each item of passenger attribute information acquired at the passenger check-in station is co-indexed with the corresponding passenger identification (PID) number, and stored in the information records maintained in the Passenger and Baggage Attribute RDBMS, subsequent information processing.

FIG. 68D1

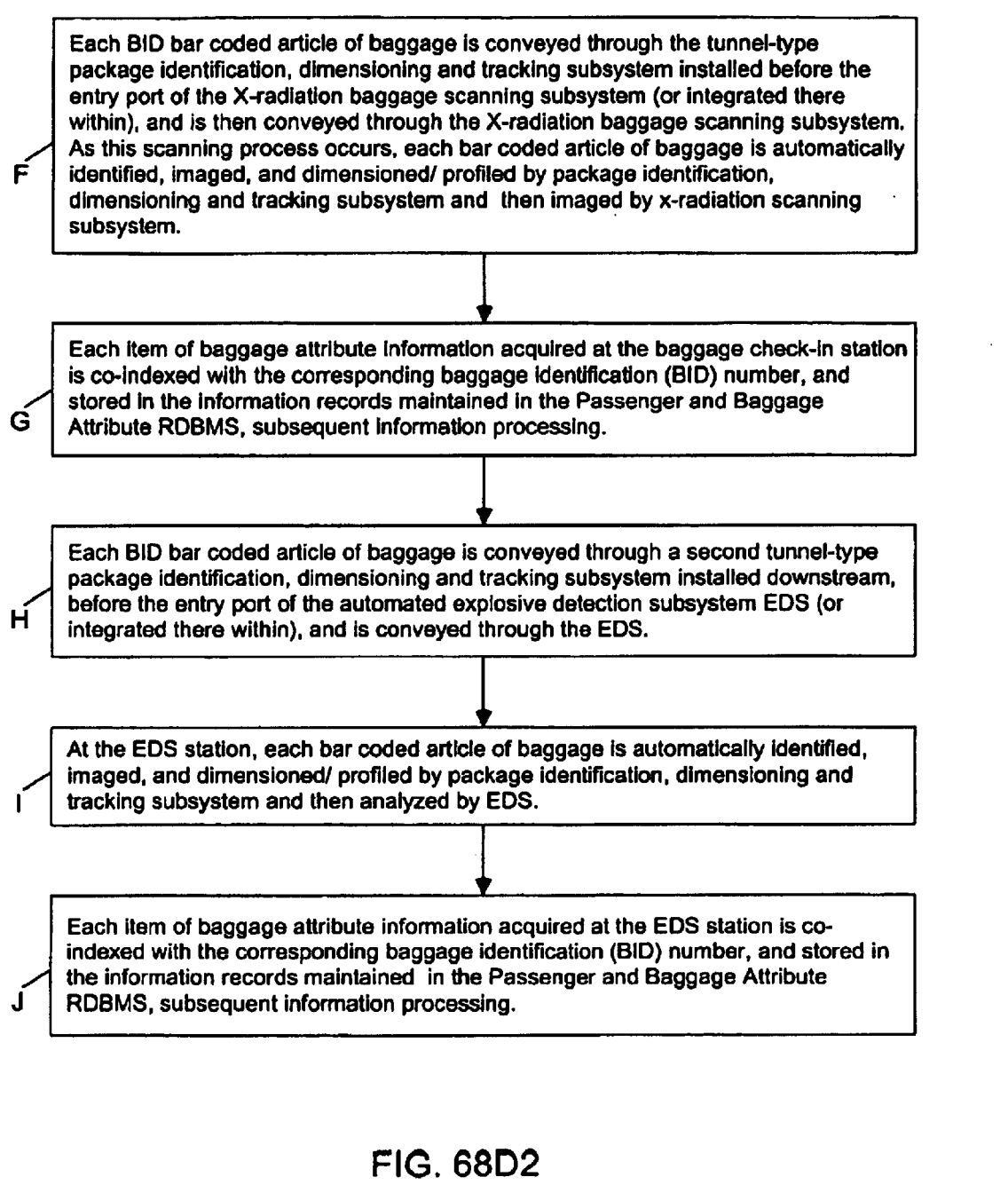

F: Each BID bar coded article of baggage is conveyed through the tunnel-type package identification, dimensioning and tracking subsystem installed before the entry port of the X-radiation baggage scanning subsystem (or integrated there within), and is then conveyed through the X-radiation baggage scanning subsystem. As this scanning process occurs, each bar coded article of baggage is automatically identified, imaged, and dimensioned/ profiled by package identification, dimensioning and tracking subsystem and then imaged by x-radiation scanning subsystem.

G: Each item of baggage attribute information acquired at the baggage check-in station is co-indexed with the corresponding baggage identification (BID) number, and stored in the information records maintained in the Passenger and Baggage Attribute RDBMS, subsequent information processing.

H: Each BID bar coded article of baggage is conveyed through a second tunnel-type package identification, dimensioning and tracking subsystem installed downstream, before the entry port of the automated explosive detection subsystem EDS (or integrated there within), and is conveyed through the EDS.

I: At the EDS station, each bar coded article of baggage is automatically identified, imaged, and dimensioned/ profiled by package identification, dimensioning and tracking subsystem and then analyzed by EDS.

J: Each item of baggage attribute information acquired at the EDS station is co-indexed with the corresponding baggage identification (BID) number, and stored in the information records maintained in the Passenger and Baggage Attribute RDBMS, subsequent information processing.

FIG. 68D2

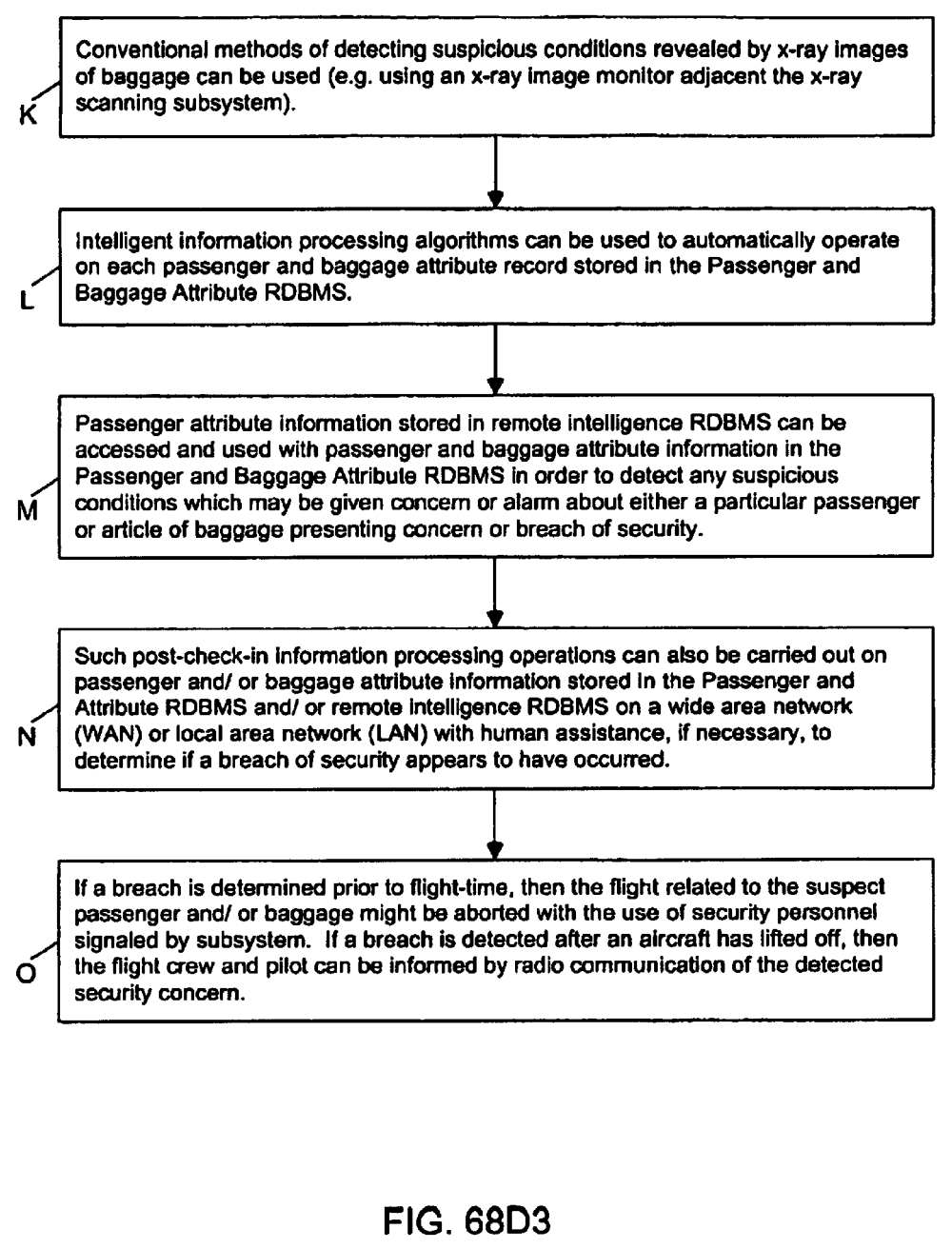

K — Conventional methods of detecting suspicious conditions revealed by x-ray images of baggage can be used (e.g. using an x-ray image monitor adjacent the x-ray scanning subsystem).

↓

L — Intelligent information processing algorithms can be used to automatically operate on each passenger and baggage attribute record stored in the Passenger and Baggage Attribute RDBMS.

↓

M — Passenger attribute information stored in remote intelligence RDBMS can be accessed and used with passenger and baggage attribute information in the Passenger and Baggage Attribute RDBMS in order to detect any suspicious conditions which may be given concern or alarm about either a particular passenger or article of baggage presenting concern or breach of security.

↓

N — Such post-check-in information processing operations can also be carried out on passenger and/ or baggage attribute information stored in the Passenger and Attribute RDBMS and/ or remote intelligence RDBMS on a wide area network (WAN) or local area network (LAN) with human assistance, if necessary, to determine if a breach of security appears to have occurred.

↓

O — If a breach is determined prior to flight-time, then the flight related to the suspect passenger and/ or baggage might be aborted with the use of security personnel signaled by subsystem. If a breach is detected after an aircraft has lifted off, then the flight crew and pilot can be informed by radio communication of the detected security concern.

FIG. 68D3

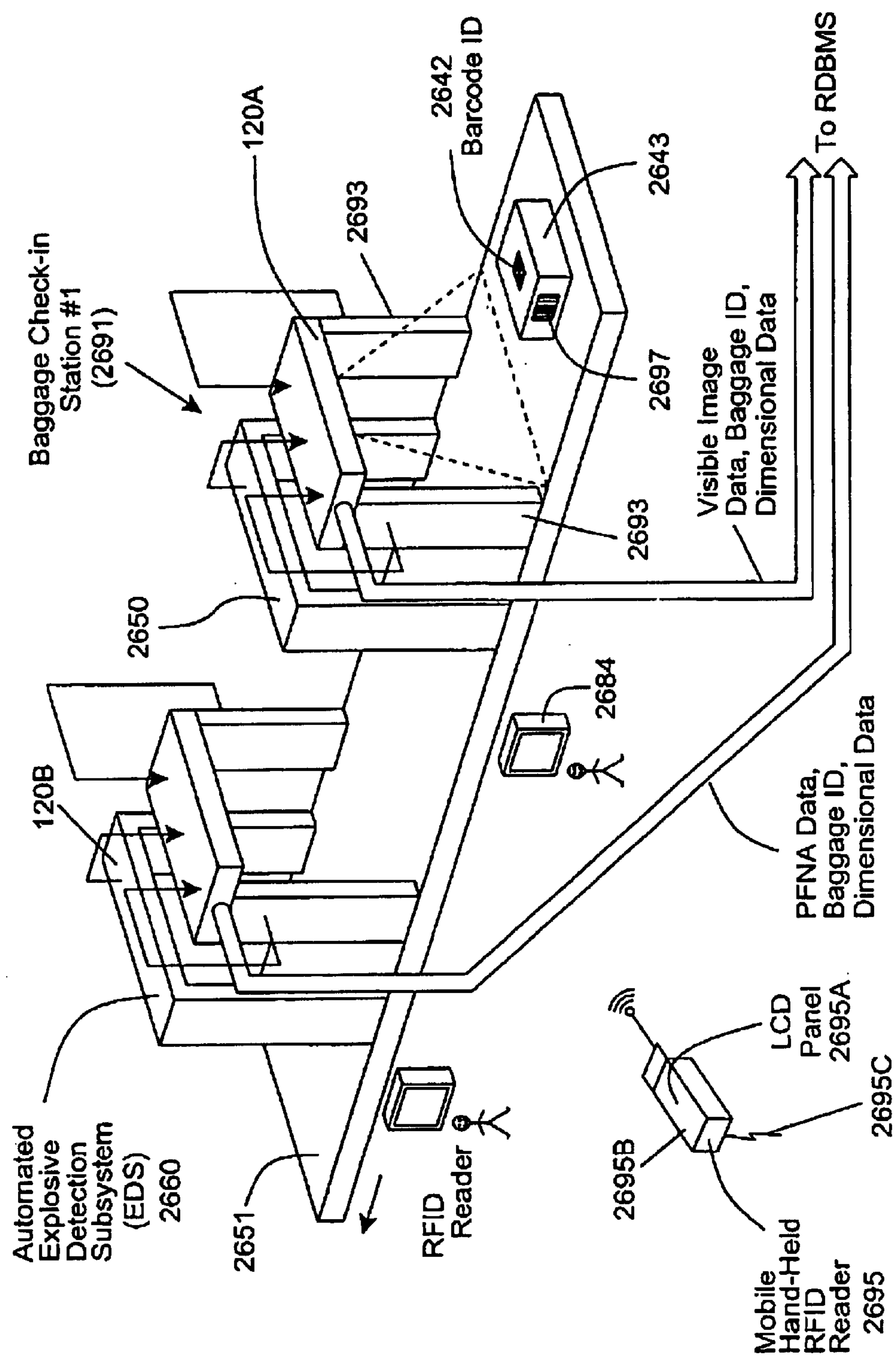
FIG. 69A1

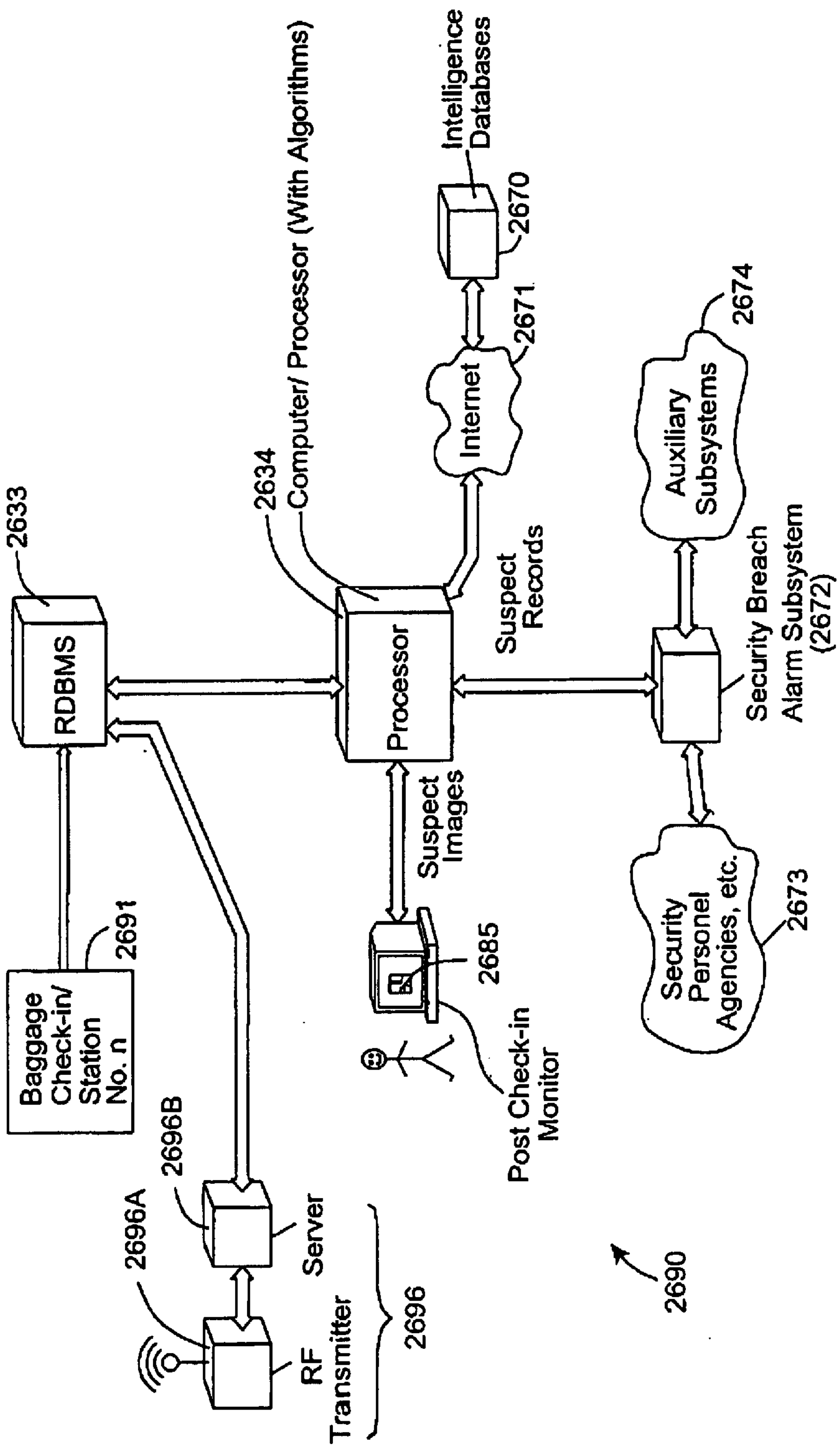
FIG. 69A2

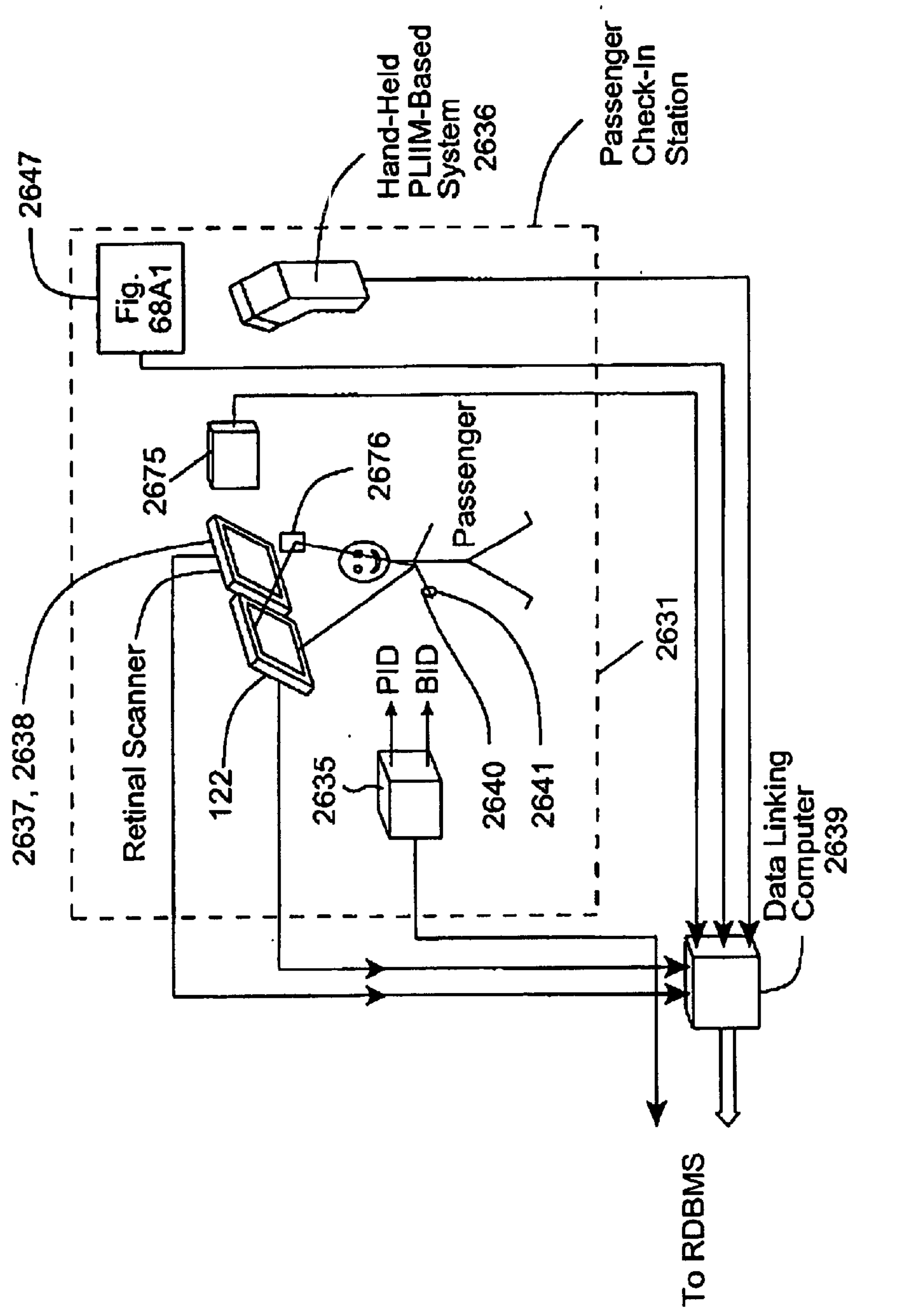
FIG. 69A3

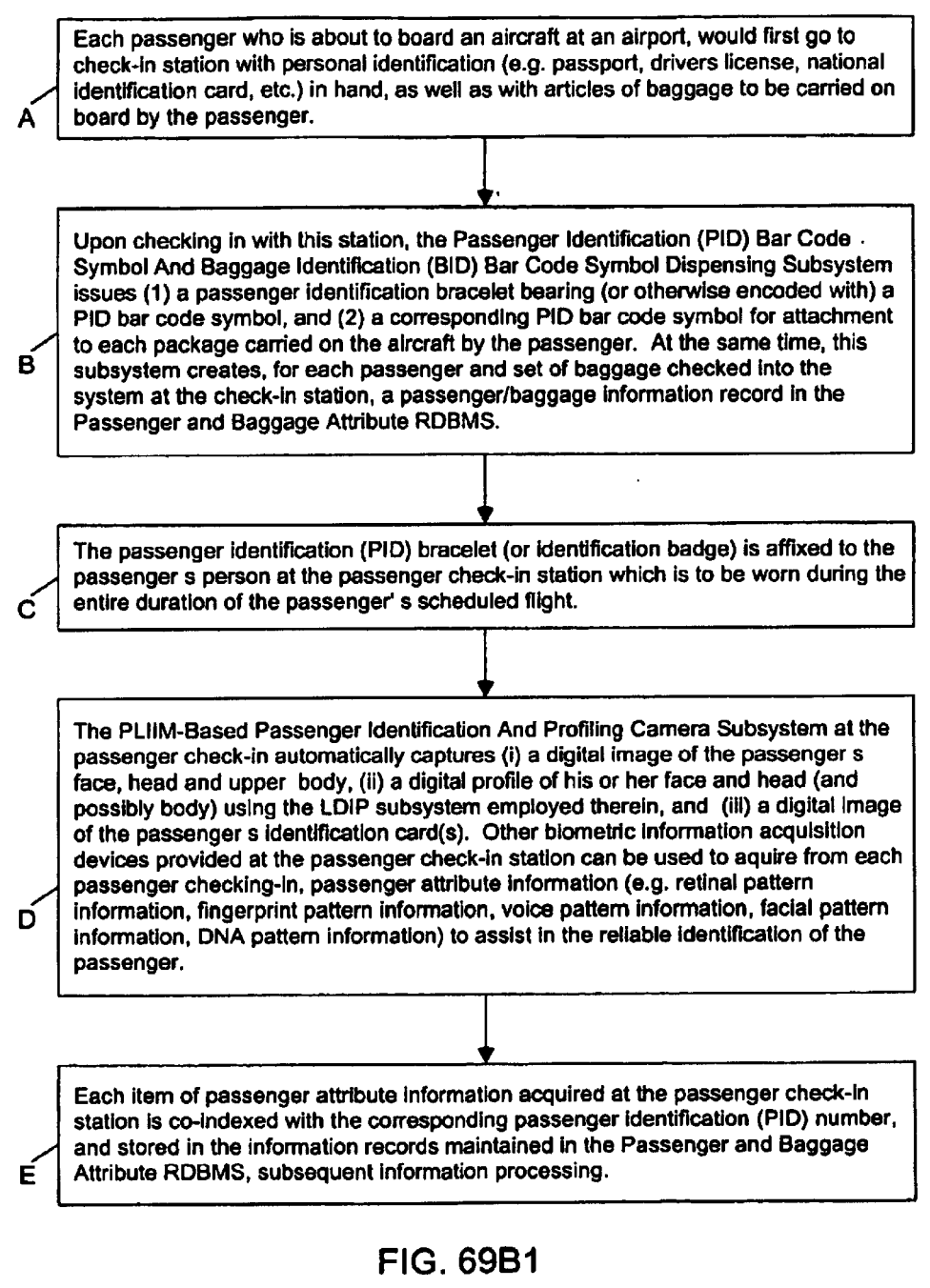

A — Each passenger who is about to board an aircraft at an airport, would first go to check-in station with personal identification (e.g. passport, drivers license, national identification card, etc.) in hand, as well as with articles of baggage to be carried on board by the passenger.

B — Upon checking in with this station, the Passenger Identification (PID) Bar Code Symbol And Baggage Identification (BID) Bar Code Symbol Dispensing Subsystem issues (1) a passenger identification bracelet bearing (or otherwise encoded with) a PID bar code symbol, and (2) a corresponding PID bar code symbol for attachment to each package carried on the aircraft by the passenger. At the same time, this subsystem creates, for each passenger and set of baggage checked into the system at the check-in station, a passenger/baggage information record in the Passenger and Baggage Attribute RDBMS.

C — The passenger identification (PID) bracelet (or identification badge) is affixed to the passenger s person at the passenger check-in station which is to be worn during the entire duration of the passenger' s scheduled flight.

D — The PLIIM-Based Passenger Identification And Profiling Camera Subsystem at the passenger check-in automatically captures (i) a digital image of the passenger s face, head and upper body, (ii) a digital profile of his or her face and head (and possibly body) using the LDIP subsystem employed therein, and (iii) a digital image of the passenger s identification card(s). Other biometric information acquisition devices provided at the passenger check-in station can be used to aquire from each passenger checking-in, passenger attribute information (e.g. retinal pattern information, fingerprint pattern information, voice pattern information, facial pattern information, DNA pattern information) to assist in the reliable identification of the passenger.

E — Each item of passenger attribute information acquired at the passenger check-in station is co-indexed with the corresponding passenger identification (PID) number, and stored in the information records maintained in the Passenger and Baggage Attribute RDBMS, subsequent information processing.

FIG. 69B1

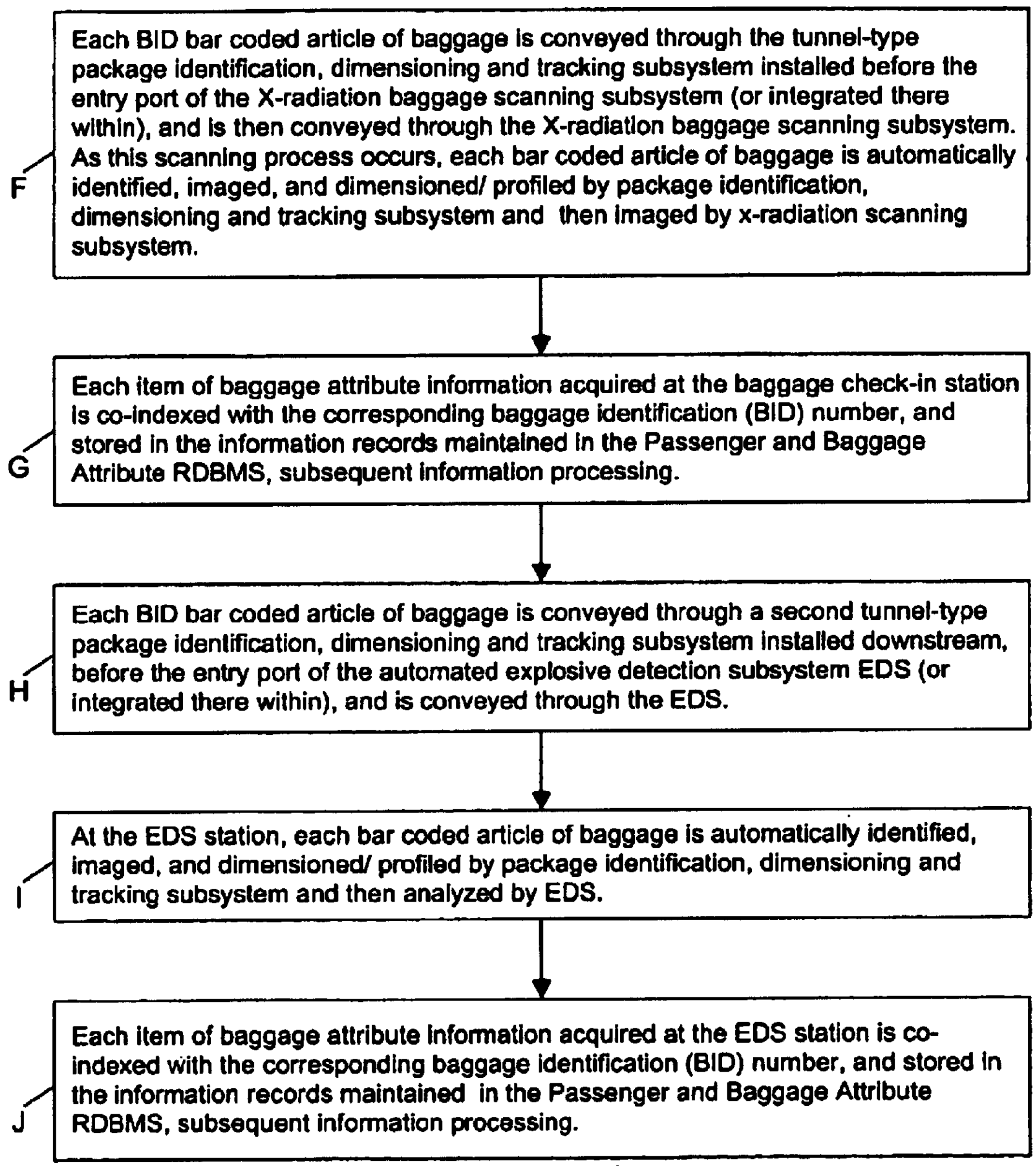
FIG. 69B2

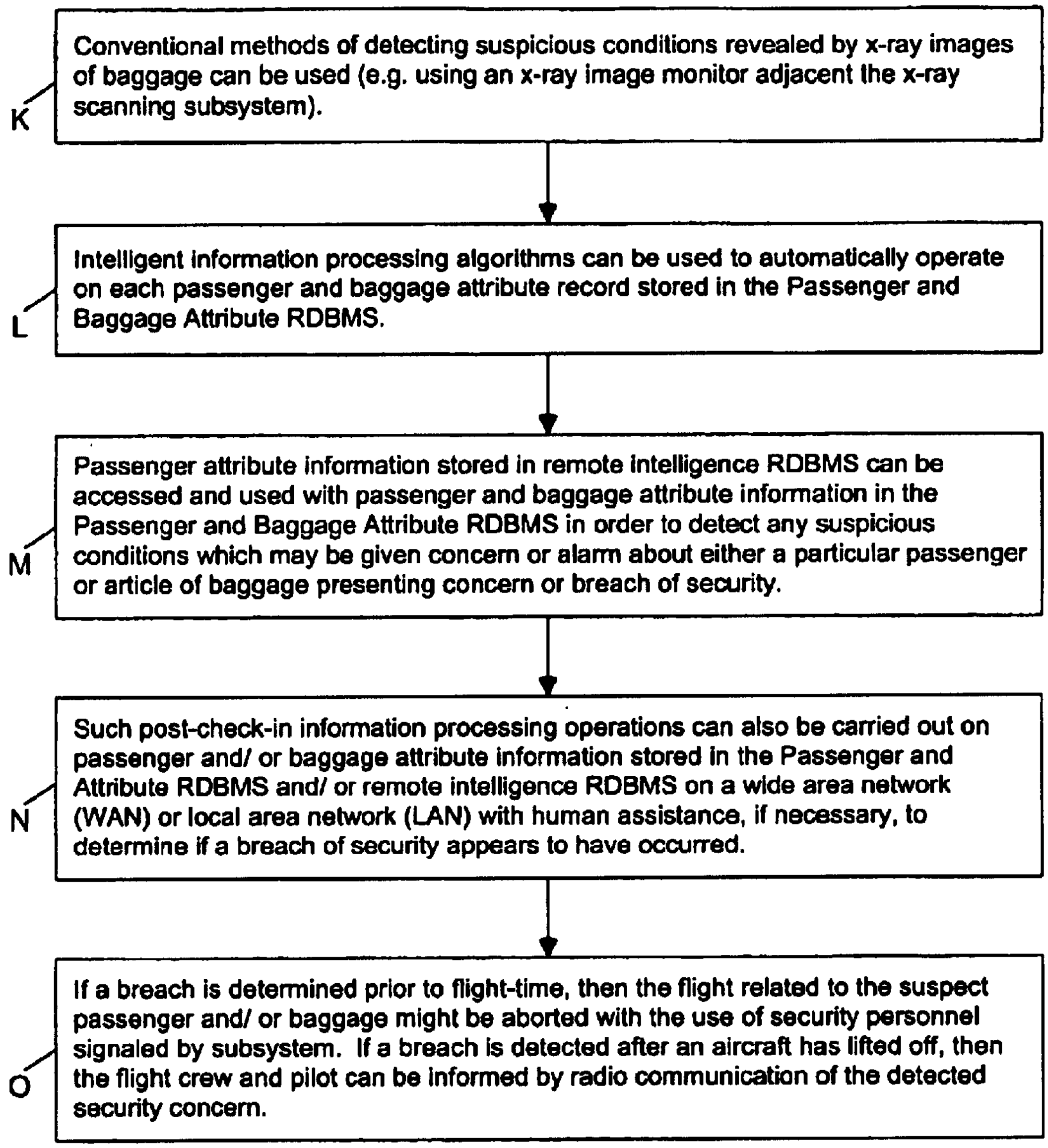
FIG. 69B3

Automatic Vehicle Classification (AVC)

System Of Present Invention

* Employing Overhead And Lateral Profiling And Imaging Techniques

METHOD OF SPECKLE-NOISE PATTERN REDUCTION AND APPARATUS THEREFORE BASED ON REDUCING THE TEMPORAL-COHERENCE OF THE PLANAR LASER ILLUMINATION BEAM BEFORE IT ILLUMINATES THE TARGET OBJECT BY APPLYING TEMPORAL PHASE MODULATION TECHNIQUES DURING THE TRANSMISSION OF THE PLIB TOWARDS THE TARGET

CROSS-REFERENCE TO RELATED U.S. APPLICATIONS

This is a Continuation-in-Part of: copending application Ser. No. 09/999,687 filed Oct. 31, 2001; copending application Ser. No. 09/954,477 filed Sep. 17, 2001; copending application Ser. No. 09/883,130 filed Jun. 15, 2001, which is a Continuation-in-Part of application Ser. No. 09/781,665 filed Feb. 12, 2001; copending application Ser. No. 09/780,027 filed Feb. 9, 2001; copending application Ser. No. 09/721,885 filed Nov. 24, 2000; application Ser. No. 09/327,756 filed Jun. 7, 1999 now abandoned; and International Application Serial No. PCT/US00/15624 filed Jun. 7, 2000, published as WIPO WO 00/75856 A1; each said application being commonly owned by Assignee, Metrologic Instruments, Inc., of Blackwood, N.J., and incorporated herein by reference as if fully set forth herein in its entirety.

BACKGROUND OF THE INVENTION

1. Field of Invention

The present invention relates generally to improved methods of and apparatus for illuminating moving as well as stationary objects, such as parcels, during image formation and detection operations, and also to improved methods of and apparatus and instruments for acquiring and analyzing information about the physical attributes of such objects using such improved methods of object illumination, and digital image analysis.

2. Brief Description of the State of Knowledge in the Art

The use of image-based bar code symbol readers and scanners is well known in the field of auto-identification. Examples of image-based bar code symbol reading/scanning systems include, for example, hand—hand scanners, point-of-sale (POS) scanners, and industrial-type conveyor scanning systems.

Presently, most commercial image-based bar code symbol readers are constructed using charge-coupled device (CCD) image sensing/detecting technology. Unlike laser-based scanning technology, CCD imaging technology has particular illumination requirements which differ from application to application.

Most prior art CCD-based image scanners, employed in conveyor-type package identification systems, require high-pressure sodium, metal halide or halogen lamps and large, heavy and expensive parabolic or elliptical reflectors to produce sufficient light intensities to illuminate the large depth of field scanning fields supported by such industrial scanning systems. Even when the light from such lamps is collimated or focused using such reflectors, light strikes the target object other than where the imaging optics of the CCD-based camera are viewing. Since only a small fraction of the lamps output power is used to illuminate the CCD camera's field of view, the total output power of the lamps must be very high to obtain the illumination levels required along the field of view of the CCD camera The balance of the output illumination power is simply wasted in the form of heat.

While U.S. Pat. No. 4,963,756 to Quan et al disclose a prior art CCD-based hand-held image scanner using a laser source and Scheimpflug optics for focusing a planar laser illumination beam reflected off a bar code symbol onto a 2-D CCD image detector, U.S. Pat. No. 5,192,856 to Schaham discloses a CCD-based hand-held image scanner which uses a LED and a cylindrical lens to produce a planar beam of LED-based illumination for illuminating a bar code symbol on an object, and cylindrical optics mounted in front a linear CCD image detector for projecting a narrow a field of view about the planar beam of illumination, thereby enabling collection and focusing of light reflected off the bar code symbol onto the linear CCD image detector.

Also, in U.S. Provisional Application No. 60/190,273 entitled "Coplanar Camera" filed Mar. 17, 2000, by Chaleff et al., and published by WIPO on Sep. 27, 2001 as part of WIPO Publication No. WO 01/72028 A1, both being incorporated herein by reference, there is disclosed a CCD camera system which uses an array of LEDs and a single apertured Fresnel-type cylindrical lens element to produce a planar beam of illumination for illuminating a bar code symbol on an object, and a linear CCD image detector mounted behind the apertured Fresnel-type cylindrical lens element so as to provide the linear CCD image detector with a field of view that is arranged with the planar extent of planar beam of LED-based illumination.

However, most prior art CCD-based hand-held image scanners use an array of light emitting diodes (LEDs) to flood the field of view of the imaging optics in such scanning systems. A large percentage of the output illumination from these LED sources is dispersed to regions other than the field of view of the scanning system. Consequently, only a small percentage of the illumination is actually collected by the imaging optics of the system, Examples of prior art CCD hand-held image scanners employing LED illumination arrangements are disclosed in U.S. Pat. No. Re. 36,528, U.S. Pat. Nos. 5,777,314, 5,756,981, 5,627,358, 5,484,994, 5,786,582, and 6,123,261 to Roustaei, each assigned to Symbol Technologies, Inc. and incorporated herein by reference in its entirety. In such prior art CCD-based hand-held image scanners, an array of LEDs are mounted in a scanning head in front of a CCD-based image sensor that is provided with a cylindrical lens assembly. The LEDs are arranged at an angular orientation relative to a central axis passing through the scanning head so that a fan of light is emitted through the light transmission aperture thereof that expands with increasing distance away from the LEDs. The intended purpose of this LED illumination arrangement is to increase the "angular distance" and "depth of field" of CCD-based bar code symbol readers. However, even with such improvements in LED illumination techniques, the working distance of such hand-held CCD scanners can only be extended by using more LEDs within the scanning head of such scanners to produce greater illumination output therefrom, thereby increasing the cost, size and weight of such scanning devices.

Similarly, prior art "hold-under" and "hands-free presentation" type CCD-based image scanners suffer from shortcomings and drawbacks similar to those associated with prior art CCD-based hand-held image scanners.

Recently, there have been some technological advances made involving the use of laser illumination techniques in CCD-based image capture systems to avoid the shortcomings and drawbacks associated with using sodium-vapor illumination equipment, discussed above. In particular, U.S. Pat. No. 5,988,506 (assigned to Galore Scantec Ltd.), incorporated herein by reference, discloses the use of a cylindrical lens to generate from a single visible laser diode (VLD) a narrow focused line of laser light which fans out an angle sufficient to fully illuminate a code pattern at a working distance. As disclosed, mirrors can be used to fold the laser illumination beam towards the code pattern to be illuminated in the working range of the system. Also, a horizontal linear lens array consisting of lenses is mounted before a linear CCD image array, to receive diffused reflected laser light from the code symbol surface. Each single lens in the linear lens array forms its own image of the code line illuminated by the laser illumination beam. Also, subaperture diaphragms are required in the CCD array plane to (i) differentiate image fields, (ii) prevent diffused reflected laser light from passing through a lens and striking the image fields of neighboring lenses, and (iii) generate partially-overlapping fields of view from each of the neighboring elements in the lens array. However, while avoiding the use of external sodium vapor illumination equipment, this prior art laser-illuminated CCD-based image capture system suffers from several significant shortcomings and drawbacks. In particular, it requires very complex image forming optics which makes this system design difficult and expensive to manufacture, and imposes a number of undesirable constraints which are very difficult to satisfy when constructing an auto-focus/auto-zoom image acquisition and analysis system for use in demanding applications.

When detecting images of target objects illuminated by a coherent illumination source (e.g. a VLD), "speckle" (i.e. substrate or paper) noise is typically modulated onto the laser illumination beam during reflection/scattering, and ultimately speckle-noise patterns are produced at the CCD image detection array, severely reducing the signal-to-noise (SNR) ratio of the CCD camera system. In general, speckle-noise patterns are generated whenever the phase of the optical field is randomly modulated. The prior art system disclosed in U.S. Pat. No. 5,988,506 fails to provide any way of, or means for reducing speckle-noise patterns produced at its CCD image detector thereof, by its coherent laser illumination source.

The problem of speckle-noise patterns in laser scanning systems is mathematically analyzed in the twenty-five (25) slide show entitled "Speckle Noise and Laser Scanning Systems" by Sasa Kresic-Juric, Emanuel Marom and Leonard Bergstein, of Symbol Technologies, Holtsville, N.Y., published at http://www.ima.umn.edu/industrial/99-2000/kresic/sld001.htm, and incorporated herein by reference. Notably, Slide 11/25 of this WWW publication summaries two generally well known methods of reducing speckle-noise by superimposing statistically independent (time-varying) speckle-noise patterns: (1) using multiple laser beams to illuminate different regions of the speckle-noise scattering plane (i.e. object); or (2) using multiple laser beams with different wavelengths to illuminate the scattering plane. Also, the celebrated textbook by J. C. Dainty, et al, entitled "Laser Speckle and Related Phenomena" (Second edition), published by Springer-Verlag, 1994, incorporated herein by reference, describes a collection of techniques which have been developed by others over the years in effort to reduce speckle-noise patterns in diverse application environments.

However, the prior art generally fails to disclose, teach or suggest how such prior art speckle-reduction techniques might be successfully practiced in laser illuminated CCD-based camera systems.

Thus, there is a great need in the art for an improved method of and apparatus for illuminating the surface of objects during image formation and detection operations, and also an improved method of and apparatus for producing digital images using such improved methods object illumination, while avoiding the shortcomings and drawbacks of prior art illumination, imaging and scanning systems and related methodologies.

OBJECTS AND SUMMARY OF THE PRESENT INVENTION

Accordingly, a primary object of the present invention is to provide an improved method of and system for illuminating the surface of objects during image formation and detection operations and also improved methods of and systems for producing digital images using such improved methods object illumination, while avoiding the shortcomings and drawbacks of prior art systems and methodologies.

Another object of the present invention is to provide such an improved method of and system for illuminating the surface of objects using a linear array of laser light emitting devices configured together to produce a substantially planar beam of laser illumination which extends in substantially the same plane as the field of view of the linear array of electronic image detection cells of the system, along at least a portion of its optical path within its working distance.

Another object of the present invention is to provide such an improved method of and system for producing digital images of objects using a visible laser diode array for producing a planar laser illumination beam for illuminating the surfaces of such objects, and also an electronic image detection array for detecting laser light reflected off the illuminated objects during illumination and imaging operations.

Another object of the present invention is to provide an improved method of and system for illuminating the surfaces of object to be imaged, using an array of planar laser illumination modules which employ VLDs that are smaller, and cheaper, run cooler, draw less power, have longer lifetimes, and require simpler optics (i.e. because the spectral bandwidths of VLDs are very small compared to the visible portion of the electromagnetic spectrum).

Another object of the present invention is to provide such an improved method of and system for illuminating the surfaces of objects to be imaged, wherein the VLD concentrates all of its output power into a thin laser beam illumination plane which spatially coincides exactly with the field of view of the imaging optics of the system, so very little light energy is wasted.

Another object of the present invention is to provide a planar laser illumination and imaging (PLIIM) system, wherein the working distance of the system can be easily extended by simply changing the beam focusing and imaging optics, and without increasing the output power of the visible laser diode (VLD) sources employed therein.

Another object of the present invention is to provide a planar laser illumination and imaging system, wherein each planar laser illumination beam is focused so that the minimum width thereof (e.g. 0.6 mm along its non-spreading direction) occurs at a point or plane which is the farthest object distance at which the system is designed to capture images.

Another object of the present invention is to provide a planar laser illumination and imaging system, wherein a fixed focal length imaging subsystem is employed, and the laser beam focusing technique of the present invention helps compensate for decreases in the power density of the incident planar illumination beam due to the fact that the width of the planar laser illumination beam increases for increasing distances away from the imaging subsystem.

Another object of the present invention is to provide a planar laser illumination and imaging system, wherein a variable focal length (i.e. zoom) imaging subsystem is employed, and the laser beam focusing technique of the present invention helps compensate for (i) decreases in the power density of the incident illumination beam due to the fact that the width of the planar laser illumination beam (i.e. beamwidth) along the direction of the beam's planar extent increases for increasing distances away from the imaging subsystem, and (ii) any $1/r^2$ type losses that would typically occur when using the planar laser illumination beam of the present invention.

Another object of the present invention is to provide a planar laser illumination and imaging system, wherein scanned objects need only be illuminated along a single plane which is coplanar with a planar section of the field of view of the image formation and detection module being used in the PLIIM system.

Another object of the present invention is to provide a planar laser illumination and imaging system, wherein low-power, light-weight, high-response, ultra-compact, high-efficiency solid-state illumination producing devices, such as visible laser diodes (VLDs), are used to selectively illuminate ultra-narrow sections of a target object during image formation and detection operations, in contrast with high-power, low-response, heavy-weight, bulky, low-efficiency lighting equipment (e.g. sodium vapor lights) required by prior art illumination and image detection systems.

Another object of the present invention is to provide a planar laser illumination and imaging system, wherein the planar laser illumination technique enables modulation of the spatial and/or temporal intensity of the transmitted planar laser illumination beam, and use of simple (i.e. substantially monochromatic) lens designs for substantially monochromatic optical illumination and image formation and detection operations.

Another object of the present invention is to provide a planar laser illumination and imaging system, wherein special measures are undertaken to ensure that (i) a minimum safe distance is maintained between the VLDs in each PLIM and the user's eyes using a light shield, and (ii) the planar laser illumination beam is prevented from directly scattering into the FOV of the image formation and detection module within the system housing.

Another object of the present invention is to provide a planar laser illumination and imaging system, wherein the planar laser illumination beam and the field of view of the image formation and detection module do not overlap on any optical surface within the PLIIM system.

Another object of the present invention is to provide a planar laser illumination and imaging system, wherein the planar laser illumination beams are permitted to spatially overlap with the FOV of the imaging lens of the PLIIM only outside of the system housing, measured at a particular point beyond the light transmission window, through which the FOV is projected.

Another object of the present invention is to provide a planar laser illumination (PLIM) system for use in illuminating objects being imaged.

Another object of the present invention is to provide a planar laser illumination and imaging system, wherein the monochromatic imaging module is realized as an array of electronic image detection cells (e.g. CCD).

Another object of the present invention is to provide a planar laser illumination and imaging system, wherein the planar laser illumination arrays (PLIAs) and the image formation and detection (IFD) module (i.e. camera module) are mounted in strict optical alignment on an optical bench such that there is substantially no relative motion, caused by vibration or temperature changes, is permitted between the imaging lens within the IFD module and the VLD/cylindrical lens assemblies within the PLIAs.

Another object of the present invention is to provide a planar laser illumination and imaging system, wherein the imaging module is realized as a photographic image recording module.

Another object of the present invention is to provide a planar laser illumination and imaging system, wherein the imaging module is realized as an array of electronic image detection cells (e.g. CCD) having short integration time settings for performing high-speed image capture operations.

Another object of the present invention is to provide a planar laser illumination and imaging system, wherein a pair of planar laser illumination arrays are mounted about an image formation and detection module having a field of view, so as to produce a substantially planar laser illumination beam which is coplanar with the field of view during object illumination and imaging operations.

Another object of the present invention is to provide a planar laser illumination and imaging system, wherein an image formation and detection module projects a field of view through a first light transmission aperture formed in the system housing, and a pair of planar laser illumination arrays project a pair of planar laser illumination beams through second set of light transmission apertures which are optically isolated from the first light transmission aperture to prevent laser beam scattering within the housing of the system.

Another object of the present invention is to provide a planar laser illumination and imaging system, the principle of Gaussian summation of light intensity distributions is employed to produce a planar laser illumination beam having a power density across the width the beam which is substantially the same for both far and near fields of the system.

Another object of the present invention is to provide an improved method of and system for producing digital images of objects using planar laser illumination beams and electronic image detection arrays.

Another object of the present invention is to provide an improved method of and system for producing a planar laser illumination beam to illuminate the surface of objects and electronically detecting light reflected off the illuminated objects during planar laser beam illumination operations.

Another object of the present invention is to provide a hand-held laser illuminated image detection and processing device for use in reading bar code symbols and other character strings.

Another object of the present invention is to provide an improved method of and system for producing images of objects by focusing a planar laser illumination beam within the field of view of an imaging lens so that the minimum width thereof along its non-spreading direction occurs at the farthest object distance of the imaging lens.

Another object of the present invention is to provide planar laser illumination modules (PLIMs) for use in electronic imaging systems, and methods of designing and manufacturing the same.

Another object of the present invention is to provide a Planar Laser Illumination Module (PLIM) for producing substantially planar laser beams (PLIBs) using a linear diverging lens having the appearance of a prism with a relatively sharp radius at the apex, capable of expanding a laser beam in only one direction.

Another object of the present invention is to provide a planar laser illumination module (PLIM) comprising an optical arrangement employs a convex reflector or a concave lens to spread a laser beam radially and also a cylindrical-concave reflector to converge the beam linearly to project a laser line.

Another object of the present invention is to provide a planar laser illumination module (PLIM) comprising a visible laser diode (VLD), a pair of small cylindrical (i.e. PCX and PCV) lenses mounted within a lens barrel of compact construction, permitting independent adjustment of the lenses along both translational and rotational directions, thereby enabling the generation of a substantially planar laser beam therefrom.

Another object of the present invention is to provide a multi-axis VLD mounting assembly embodied within planar laser illumination array (PLIA) to achieve a desired degree of uniformity in the power density along the PLIB generated from said PLIA.

Another object of the present invention is to provide a multi-axial VLD mounting assembly within a PLIM so that (1) the PLIM can be adjustably tilted about the optical axis of its VLD, by at least a few degrees measured from the horizontal reference plane as shown in FIG. 1B4, and so that (2) each VLD block can be adjustably pitched forward for alignment with other VLD beams.

Another object of the present invention is to provide planar laser illumination arrays (PLIAs) for use in electronic imaging systems, and methods of designing and manufacturing the same.

Another object of the present invention is to provide a unitary object attribute (i.e. feature) acquisition and analysis system completely contained within in a single housing of compact lightweight construction (e.g. less than 40 pounds).

Another object of the present invention is to provide such a unitary object attribute acquisition and analysis system, which is capable of (1) acquiring and analyzing in real-time the physical attributes of objects such as, for example, (i) the surface reflectivity characteristics of objects, (ii) geometrical characteristics of objects, including shape measurement, (iii) the motion (i.e. trajectory) and velocity of objects, as well as (iv) bar code symbol, textual, and other information-bearing structures disposed thereon, and (2) generating information structures representative thereof for use in diverse applications including, for example, object identification, tracking, and/or transportation/routing operations.

Another object of the present invention is to provide such a unitary object attribute acquisition and analysis system, wherein a multi-wavelength (i.e. color-sensitive) Laser Doppler Imaging and Profiling (LDIP) subsystem is provided for acquiring and analyzing (in real-time) the physical attributes of objects such as, for example, (i) the surface reflectivity characteristics of objects, (ii) geometrical characteristics of objects, including shape measurement, and (iii) the motion (i.e. trajectory) and velocity of objects.

Another object of the present invention is to provide such a unitary object attribute acquisition and analysis system, wherein an image formation and detection (i.e. camera) subsystem is provided having (i) a planar laser illumination and imaging (PLIIM) subsystem, (ii) intelligent auto-focus/auto-zoom imaging optics, and (iii) a high-speed electronic image detection array with height/velocity-driven photo-integration time control to ensure the capture of images having constant image resolution (i.e. constant dpi) independent of package height.

Another object of the present invention is to provide such a unitary object attribute acquisition and analysis system, wherein an advanced image-based bar code symbol decoder is provided for reading 1-D and 2-D bar code symbol labels on objects, and an advanced optical character recognition (OCR) processor is provided for reading textual information, such as alphanumeric character strings, representative within digital images that have been captured and lifted from the system.

Another object of the present invention is to provide such a unitary object attribute acquisition and analysis system for use in the high-speed parcel, postal and material handling industries.

Another object of the present invention is to provide such a unitary object attribute acquisition and analysis system, which is capable of being used to identify, track and route packages, as well as identify individuals for security and personnel control applications.

Another object of the present invention is to provide such a unitary object attribute acquisition and analysis system which enables bar code symbol reading of linear and two-dimensional bar codes, OCR-compatible image lifting, dimensioning, singulation, object (e.g. package) position and velocity measurement, and label-to-parcel tracking from a single overhead-mounted housing measuring less than or equal to 20 inches in width, 20 inches in length, and 8 inches in height.

Another object of the present invention is to provide such a unitary object attribute acquisition and analysis system which employs a built-in source for producing a planar laser illumination beam that is coplanar with the field of view (FOV) of the imaging optics used to form images on an electronic image detection array, thereby eliminating the need for large, complex, high-power power consuming sodium vapor lighting equipment used in conjunction with most industrial CCD cameras.

Another object of the present invention is to provide such a unitary object attribute acquisition and analysis system, wherein the all-in-one (i.e. unitary) construction simplifies installation, connectivity, and reliability for customers as it utilizes a single input cable for supplying input (AC) power and a single output cable for outputting digital data to host systems.

Another object of the present invention is to provide such a unitary object attribute acquisition and analysis system, wherein such systems can be configured to construct multi-sided tunnel-type imaging systems, used in airline baggage-handling systems, as well as in postal and parcel identification, dimensioning and sortation systems.

Another object of the present invention is to provide such a unitary object attribute acquisition and analysis system, for use in (i) automatic checkout solutions installed within retail shopping environments (e.g. supermarkets), (ii) security and people analysis applications, (iii) object and/or material identification and inspection systems, as well as (iv) diverse portable, in-counter and fixed applications in virtual any industry.

Another object of the present invention is to provide such a unitary object attribute acquisition and analysis system in the form of a high-speed object identification and attribute acquisition system, wherein the PLIIM subsystem projects a field of view through a first light transmission aperture formed in the system housing, and a pair of planar laser illumination beams through second and third light transmission apertures which are optically isolated from the first light transmission aperture to prevent laser beam scattering within the housing of the system, and the LDIP subsystem projects a pair of laser beams at different angles through a fourth light transmission aperture.

Another object of the present invention is to provide a fully automated unitary-type package identification and measuring system contained within a single housing or enclosure, wherein a PLIIM-based scanning subsystem is used to read bar codes on packages passing below or near the system, while a package dimensioning subsystem is used to capture information about attributes (i.e. features) about the package prior to being identified.

Another object of the present invention is to provide such an automated package identification and measuring system, wherein Laser Detecting And Ranging (LADAR) based scanning methods are used to capture two-dimensional range data maps of the space above a conveyor belt structure, and two-dimensional image contour tracing techniques and corner point reduction techniques are used to extract package dimension data therefrom.

Another object of the present invention is to provide such a unitary system, wherein the package velocity is automatically computed using package range data collected by a pair of amplitude-modulated (AM) laser beams projected at different angular projections over the conveyor belt.

Another object of the present invention is to provide such a system in which the lasers beams having multiple wavelengths are used to sense packages having a wide range of reflectivity characteristics.

Another object of the present invention is to provide an improved image-based hand-held scanners, body-wearable scanners, presentation-type scanners, and hold-under scanners which embody the PLIIM subsystem of the present invention.

Another object of the present invention is to provide a planar laser illumination and imaging (PLIIM) system which employs high-resolution wavefront control methods and devices to reduce the power of speckle-noise patterns within digital images acquired by the system.

Another object of the present invention is to provide such a PLIIM-based system, in which planar laser illumination beams (PLIBs) rich in spectral-harmonic components on the time-frequency domain are optically generated using principles based on wavefront spatio-temporal dynamics.

Another object of the present invention is to provide such a PLIIM-based system, in which planar laser illumination beams (PLIBs) rich in spectral-harmonic components on the time-frequency domain are optically generated using principles based on wavefront non-linear dynamics.

Another object of the present invention is to provide such a PLIIM-based system, in which planar laser illumination beams (PLIBs) rich in spectral-harmonic components on the spatial-frequency domain are optically generated using principles based on wavefront spatio-temporal dynamics.

Another object of the present invention is to provide such a PLIIM-based system, in which planar laser illumination beams (PLIBs) rich in spectral-harmonic components on the spatial-frequency domain are optically generated using principles based on wavefront non-linear dynamics.

Another object of the present invention is to provide such a PLIIM-based system, in which planar laser illumination beams (PLIBs) rich in spectral-harmonic components are optically generated using diverse electro-optical devices including, for example, micro-electro-mechanical devices (MEMs) (e.g. deformable micro-mirrors), optically-addressed liquid crystal (LC) light valves, liquid crystal (LC) phase modulators, micro-oscillating reflectors (e.g. mirrors or spectrally-tuned polarizing reflective CLC film material), micro-oscillating refractive-type phase modulators, micro-oscillating diffractive-type micro-oscillators, as well as rotating phase modulation discs, bands, rings and the like.

Another object of the present invention is to provide a novel planar laser illumination and imaging (PLIIM) system and method which employs a planar laser illumination array (PLIA) and electronic image detection array which cooperate to effectively reduce the speckle-noise pattern observed at the image detection array of the PLIIM system by reducing or destroying either (i) the spatial and/or temporal coherence of the planar laser illumination beams (PLIBs) produced by the PLIAs within the PLIIM system, or (ii) the spatial and/or temporal coherence of the planar laser illumination beams (PLIBs) that are reflected/scattered off the target and received by the image formation and detection (IFD) subsystem within the PLIIM system.

Another object of the present invention is to provide a first generalized method of speckle-noise pattern reduction and particular forms of apparatus therefor based on reducing the spatial-coherence of the planar laser illumination beam before it illuminates the target object by applying spatial phase modulation techniques during the transmission of the PLIB towards the target.

Another object of the present invention is to provide such a method and apparatus, based on the principle of spatially phase modulating the transmitted planar laser illumination beam (PLIB) prior to illuminating a target object (e.g. package) therewith so that the object is illuminated with a spatially coherent-reduced planar laser beam and, as a result, numerous substantially different time-varying speckle-noise patterns are produced and detected over the photo-integration time period of the image detection array (in the IFD subsystem), thereby allowing these speckle-noise patterns to be temporally averaged and possibly spatially averaged over the photo-integration time period and the RMS power of observable speckle-noise pattern reduced.

Another object of the present invention is to provide a novel method of and apparatus for reducing the power of speckle-noise patterns observable at the electronic image detection array of a PLIIM-based system, wherein the method involves modulating the spatial phase of the composite-type "transmitted" planar laser illumination beam (PLIB) prior to illuminating an object (e.g. package) therewith so that the object is illuminated with a spatially coherent-reduced laser beam and, as a result, numerous time-varying (random) speckle-noise patterns are produced and detected over the photo-integration time period of the image detection array in the IFD subsystem, thereby allowing these speckle-noise patterns to be temporally averaged and/or spatially averaged and the observable speckle-noise pattern reduced.

Another object of the present invention is to provide such a method of and apparatus for reducing the power of speckle-noise patterns observable at the electronic image detection array of a PLIIM-based system, wherein (i) the spatial phase of the transmitted PLIB is modulated along the planar extent thereof according to a spatial phase modulation function (SPMF) so as to modulate the phase along the wavefront of the PLIB and produce numerous substantially different time-varying speckle-noise patterns to occur at the image detection array of the IFD Subsystem during the photo-integration time period of the image detection array thereof, and also (ii) the numerous time-varying speckle-noise patterns produced at the image detection array are temporally and/or spatially averaged during the photo-integration time period thereof, thereby reducing the speckle-noise patterns observed at the image detection array.

Another object of the present invention is to provide such a method of and apparatus for reducing the power of speckle-noise patterns observable at the electronic image detection array of a PLIIM-based system, wherein the spatial phase modulation techniques that can be used to carry out the method include, for example: mechanisms for moving the relative position/motion of a cylindrical lens array and laser diode array, including reciprocating a pair of rectilinear cylindrical lens arrays relative to each other, as well as rotating a cylindrical lens array ring structure about each PLIM employed in the PLIIM-based system; rotating phase modulation discs having multiple sectors with different refractive indices to effect different degrees of phase delay along the wavefront of the PLIB transmitted (along different optical paths) towards the object to be illuminated; acousto-optical Bragg-type cells for enabling beam steering using ultrasonic waves; ultrasonically-driven deformable mirror structures; a LCD-type spatial phase modulation panel; and other spatial phase modulation devices.

Another object of the present invention is to provide such a method and apparatus, wherein the transmitted planar laser illumination beam (PLIB) is spatially phase modulated along the planar extent thereof according to a (random or periodic) spatial phase modulation function (SPMF) prior to illumination of the target object with the PLIB, so as to modulate the phase along the wavefront of the PLIB and produce numerous substantially different time-varying speckle-noise pattern at the image detection array, and temporally and spatially average these speckle-noise patterns at the image detection array during the photo-integration time period thereof to reduce the RMS power of observable speckle-pattern noise.

Another object of the present invention is to provide such a method and apparatus, wherein the spatial phase modulation techniques that can be used to carry out the first generalized method of despeckling include, for example: mechanisms for moving the relative position/motion of a cylindrical lens array and laser diode array, including reciprocating a pair of rectilinear cylindrical lens arrays relative to each other, as well as rotating a cylindrical lens array ring structure about each PLIM employed in the PLIIM-based system; rotating phase modulation discs having multiple sectors with different refractive indices to effect different degrees of phase delay along the wavefront of the PLIB transmitted (along different optical paths) towards the object to be illuminated; acousto-optical Bragg-type cells for enabling beam steering using ultrasonic waves; ultrasonically-driven deformable mirror structures; a LCD-type spatial phase modulation panel; and other spatial phase modulation devices.

Another object of the present invention is to provide such a method and apparatus, wherein a pair of refractive, cylindrical lens arrays are micro-oscillated relative to each other in order to spatial phase modulate the planar laser illumination beam prior to target object illumination.

Another object of the present invention is to provide such a method and apparatus, wherein a pair of light diffractive (e.g. holographic) cylindrical lens arrays are micro-oscillated relative to each other in order to spatial phase modulate the planar laser illumination beam prior to target object illumination.

Another object of the present invention is to provide such a method and apparatus, wherein a pair of reflective elements are micro-oscillated relative to a stationary refractive cylindrical lens array in order to spatial phase modulate a planar laser illumination beam prior to target object illumination.

Another object of the present invention is to provide such a method and apparatus, wherein the planar laser illumination (PLIB) is micro-oscillated using an acoustic-optic modulator in order to spatial phase modulate the PLIB prior to target object illumination.

Another object of the present invention is to provide such a method and apparatus, wherein the planar laser illumination (PLIB) is micro-oscillated using a piezo-electric driven deformable mirror structure in order to spatial phase modulate said PLIB prior to target object illumination.

Another object of the present invention is to provide such a method and apparatus, wherein the planar laser illumination (PLIB) is micro-oscillated using a refractive-type phase-modulation disc in order to spatial phase modulate said PLIB prior to target object illumination.

Another object of the present invention is to provide such a method and apparatus, wherein the planar laser illumination (PLIB) is micro-oscillated using a phase-only type LCD-based phase modulation panel in order to spatial phase modulate said PLIB prior to target object illumination.

Another object of the present invention is to provide such a method and apparatus, wherein the planar laser illumination (PLIB) is micro-oscillated using a refractive-type cylindrical lens array ring structure in order to spatial phase modulate said PLIB prior to target object illumination.

Another object of the present invention is to provide such a method and apparatus, wherein the planar laser illumination (PLIB) is micro-oscillated using a diffractive-type cylindrical lens array ring structure in order to spatial intensity modulate said PLIB prior to target object illumination.

Another object of the present invention is to provide such a method and apparatus, wherein the planar laser illumination (PLIB) is micro-oscillated using a reflective-type phase modulation disc structure in order to spatial phase modulate said PLIB prior to target object illumination.

Another object of the present invention is to provide such a method and apparatus, wherein a planar laser illumination (PLIB) is micro-oscillated using a rotating polygon lens structure which spatial phase modulates said PLIB prior to target object illumination.

Another object of the present invention is to provide a second generalized method of speckle-noise pattern reduction and particular forms of apparatus therefor based on reducing the temporal coherence of the planar laser illumination beam before it illuminates the target object by applying temporal intensity modulation techniques during the transmission of the PLIB towards the target.

Another object of the present invention is to provide such a method and apparatus, based on the principle of temporal intensity modulating the transmitted planar laser illumination beam (PLIB) prior to illuminating a target object (e.g. package) therewith so that the object is illuminated with a spatially coherent-reduced planar laser beam and, as a result, numerous substantially different time-varying speckle-noise patterns are produced and detected over the photo-integration time period of the image detection array (in the IFD subsystem), thereby allowing these speckle-noise patterns to be temporally averaged and possibly spatially averaged over the photo-integration time period and the RMS power of observable speckle-noise pattern reduced.

Another object of the present invention is to provide a novel method of and apparatus for reducing the power of speckle-noise patterns observable at the electronic image detection array of a PLIIM-based system, wherein the method involves modulating the temporal intensity of the composite-type "transmitted" planar laser illumination beam (PLIB) prior to illuminating an object (e.g. package) therewith so that the object is illuminated with a temporally coherent-reduced laser beam and, as a result, numerous time-varying (random) speckle-noise patterns are produced and detected over the photo-integration time period of the image detection array in the IFD subsystem, thereby allowing these speckle-noise patterns to be temporally averaged and/or spatially averaged and the observable speckle-noise pattern reduced.

Another object of the present invention is to provide such a method and apparatus, wherein the transmitted planar laser illumination beam (PLIB) is temporal intensity modulated prior to illuminating a target object (e.g. package) therewith so that the object is illuminated with a temporally coherent-reduced planar laser beam and, as a result, numerous substantially different time-varying speckle-noise patterns are produced and detected over the photo-integration time period of the image detection array (in the IFD subsystem), thereby allowing these speckle-noise patterns to be temporally averaged and/or spatially averaged and the observable speckle-noise patterns reduced.

Another object of the present invention is to provide a novel method of and apparatus for reducing the power of speckle-noise patterns observable at the electronic image detection array of a PLIIM-based system, based on temporal intensity modulating the transmitted PLIB prior to illuminating an object therewith so that the object is illuminated with a temporally coherent-reduced laser beam and, as a result, numerous time-varying (random) speckle-noise patterns are produced at the image detection array in the IFD subsystem over the photo-integration time period thereof, and the numerous time-varying speckle-noise patterns are temporally and/or spatially averaged during the photo-integration time period, thereby reducing the RMS power of speckle-noise pattern observed at the image detection array.

Another object of the present invention is to provide such a method of and apparatus for reducing the power of speckle-noise patterns observable at the electronic image detection array of a PLIIM-based system, wherein (i) the transmitted PLIB is temporal-intensity modulated according to a temporal intensity modulation (e.g. windowing) function (TIMF) causing the phase along the wavefront of the transmitted PLIB to be modulated and numerous substantially different time-varying speckle-noise patterns produced at image detection array of the IFD Subsystem, and (ii) the numerous time-varying speckle-noise patterns produced at the image detection array are temporally and/or spatially averaged during the photo-integration time period thereof, thereby reducing the RMS power of RMS speckle-noise patterns observed (i.e. detected) at the image detection array.

Another object of the present invention is to provide such a method of and apparatus for reducing the power of speckle-noise patterns observable at the electronic image detection array of a PLIIM-based system, wherein temporal intensity modulation techniques which can be used to carry out the method include, for example: visible mode-locked laser diodes (MLLDs) employed in the planar laser illumination array; electro-optical temporal intensity modulation panels (i.e. shutters) disposed along the optical path of the transmitted PLIB; and other temporal intensity modulation devices.

Another object of the present invention is to provide such a method and apparatus, wherein temporal intensity modulation techniques which can be used to carry out the first generalized method include, for example: mode-locked laser diodes (MLLDs) employed in a planar laser illumination array; electrically-passive optically-reflective cavities affixed external to the VLD of a planar laser illumination module (PLIM; electro-optical temporal intensity modulators disposed along the optical path of a composite planar laser illumination beam; laser beam frequency-hopping devices; internal and external type laser beam frequency modulation (FM) devices; and internal and external laser beam amplitude modulation (AM) devices.

Another object of the present invention is to provide such a method and apparatus, wherein the planar laser illumination beam is temporal intensity modulated prior to target object illumination employing high-speed beam gating/shutter principles.

Another object of the present invention is to provide such a method and apparatus, wherein the planar laser illumination beam is temporal intensity modulated prior to target object illumination employing visible mode-locked laser diodes (MLLDs).

Another object of the present invention is to provide such a method and apparatus, wherein the planar laser illumination beam is temporal intensity modulated prior to target object illumination employing current-modulated visible laser diodes (VLDs) operated in accordance with temporal intensity modulation functions (TIMFS) which exhibit a spectral harmonic constitution that results in a substantial reduction in the RMS power of speckle-pattern noise observed at the image detection array of PLIIM-based systems.

Another object of the present invention is to provide a third generalized method of speckle-noise pattern reduction and particular forms of apparatus therefor based on reducing the temporal-coherence of the planar laser illumination beam before it illuminates the target object by applying temporal phase modulation techniques during the transmission of the PLIB towards the target.

Another object of the present invention is to provide such a method and apparatus, based on the principle of temporal phase modulating the transmitted planar laser illumination beam (PLIB) prior to illuminating a target object (e.g. package) therewith so that the object is illuminated with a temporal coherent-reduced planar laser beam and, as a result, numerous substantially different time-varying speckle-noise patterns are produced and detected over the photo-integration time period of the image detection array (in the IFD subsystem), thereby allowing these speckle-noise patterns to be temporally averaged and possibly spatially averaged over the photo-integration time period and the RMS power of observable speckle-noise pattern reduced.

Another object of the present invention is to provide a novel method of and apparatus for reducing the power of speckle-noise patterns observable at the electronic image detection array of a PLIIM-based system, wherein the method involves modulating the temporal phase of the composite-type "transmitted" planar laser illumination beam (PLIB) prior to illuminating an object (e.g. package) therewith so that the object is illuminated with a temporal coherent-reduced laser beam and, as a result, numerous time-varying (random) speckle-noise patterns are produced and detected over the photo-integration time period of the image detection array in the IFD subsystem, thereby allowing these speckle-noise patterns to be temporally averaged and/or spatially averaged and the observable speckle-noise pattern reduced.

Another object of the present invention is to provide such a method and apparatus, wherein temporal phase modulation techniques which can be used to carry out the third generalized method include, for example: an optically-reflective cavity (i.e. etalon device) affixed to external portion of each VLD; a phase-only LCD temporal intensity modulation panel; and fiber optical arrays.

Another object of the present invention is to provide such a method and apparatus, wherein the planar laser illumination beam is temporal phase modulated prior to target object illumination employing photon trapping, delaying and releasing principles within an optically reflective cavity (i.e. etalon) externally affixed to each visible laser diode within the planar laser illumination array.

Another object of the present invention is to provide such a method and apparatus, wherein the planar laser illumination (PLIB) is temporal phase modulated using a phase-only type LCD-based phase modulation panel prior to target object illumination.

Another object of the present invention is to provide such a method and apparatus, wherein the planar laser illumination beam (PLIB) is temporal phase modulated using a high-density fiber-optic array prior to target object illumination.

Another object of the present invention is to provide a fourth generalized method of speckle-noise pattern reduction and particular forms of apparatus therefor based on reducing the temporal coherence of the planar laser illumination beam before it illuminates the target object by applying temporal frequency modulation techniques during the transmission of the PLIB towards the target.

Another object of the present invention is to provide such a method and apparatus, based on the principle of temporal frequency modulating the transmitted planar laser illumination beam (PLIB) prior to illuminating a target object (e.g. package) therewith so that the object is illuminated with a spatially coherent-reduced planar laser beam and, as a result, numerous substantially different time-varying speckle-noise patterns are produced and detected over the photo-integration time period of the image detection array (in the IFD subsystem), thereby allowing these speckle-noise patterns to be temporally averaged and possibly spatially averaged over the photo-integration time period and the RMS power of observable speckle-noise pattern reduced.

Another object of the present invention is to provide a novel method of and apparatus for reducing the power of speckle-noise patterns observable at the electronic image detection array of a PLIIM-based system, wherein the method involves modulating the temporal frequency of the composite-type "transmitted" planar laser illumination beam (PLIB) prior to illuminating an object (e.g. package) therewith so that the object is illuminated with a temporally coherent-reduced laser beam and, as a result, numerous time-varying (random) speckle-noise patterns are produced and detected over the photo-integration time period of the image detection array in the IFD subsystem, thereby allowing these speckle-noise patterns to be temporally averaged and/or spatially averaged and the observable speckle-noise pattern reduced.

Another object of the present invention is to provide such a method and apparatus, wherein techniques which can be used to carry out the third generalized method include, for example: junction-current control techniques for periodically inducing VLDs into a mode of frequency hopping, using thermal feedback; and multi-mode visible laser diodes (VLDs) operated just above their lasing threshold.

Another object of the present invention is to provide such a method and apparatus, wherein the planar laser illumination beam is temporal frequency modulated prior to target object illumination employing drive-current modulated visible laser diodes (VLDs) into modes of frequency hopping and the like.

Another object of the present invention is to provide such a method and apparatus, wherein the planar laser illumination beam is temporal frequency modulated prior to target object illumination employing multi-mode visible laser diodes (VLDs) operated just above their lasing threshold.

Another object of the present invention is to provide such a method of and apparatus for reducing the power of speckle-noise patterns observable at the electronic image detection array of a PLIIM-based system, wherein the spatial intensity modulation techniques that can be used to carry out the method include, for example: mechanisms for moving the relative position/motion of a spatial intensity modulation array (e.g. screen) relative to a cylindrical lens array and/or a laser diode array, including reciprocating a pair of rectilinear spatial intensity modulation arrays relative to each other, as well as rotating a spatial intensity modulation array ring structure about each PLIM employed in the PLIIM-based system; a rotating spatial intensity modulation disc; and other spatial intensity modulation devices.

Another object of the present invention is to provide a fifth generalized method of speckle-noise pattern reduction and particular forms of apparatus therefor based on reducing the spatial-coherence of the planar laser illumination beam before it illuminates the target object by applying spatial intensity modulation techniques during the transmission of the PLIB towards the target.

Another object of the present invention is to provide such a method and apparatus, wherein the wavefront of the transmitted planar laser illumination beam (PLIB) is spatially intensity modulated prior to illuminating a target object (e.g. package) therewith so that the object is illuminated with a spatially coherent-reduced planar laser beam and, as a result, numerous substantially different time-varying speckle-noise patterns are produced and detected over the photo-integration time period of the image detection array (in the IFD subsystem), thereby allowing these speckle-noise patterns to be temporally averaged and possibly spatially averaged over the photo-integration time period and the RMS power of observable speckle-noise pattern reduced.

Another object of the present invention is to provide such a method and apparatus, wherein spatial intensity modulation techniques can be used to carry out the fifth generalized method including, for example: a pair of comb-like spatial filter arrays reciprocated relative to each other at a high-speeds; rotating spatial filtering discs having multiple sectors with transmission apertures of varying dimensions and different light transmittivity to spatial intensity modulate the transmitted PLIB along its wavefront; a high-speed LCD-type spatial intensity modulation panel; and other spatial intensity modulation devices capable of modulating the spatial intensity along the planar extent of the PLIB wavefront.

Another object of the present invention is to provide such a method and apparatus, wherein a pair of spatial intensity modulation (SIM) panels are micro-oscillated with respect to the cylindrical lens array so as to spatial-intensity modulate the planar laser illumination beam (PLIB) prior to target object illumination.

Another object of the present invention is to provide a sixth generalized method of speckle-noise pattern reduction and particular forms of apparatus therefor based on reducing the spatial-coherence of the planar laser illumination beam after it illuminates the target by applying spatial intensity modulation techniques during the detection of the reflected/scattered PLIB.

Another object of the present invention is to provide a novel method of and apparatus for reducing the power of speckle-noise patterns observable at the electronic image detection array of a PLIIM-based system, wherein the method is based on spatial intensity modulating the composite-type "return" PLIB produced by the composite PLIB illuminating and reflecting and scattering off an object so that the return PLIB detected by the image detection array (in the IFD subsystem) constitutes a spatially coherent-reduced laser beam and, as a result, numerous time-varying speckle-noise patterns are detected over the photo-integration time period of the image detection array (in the IFD subsystem), thereby allowing these time-varying speckle-noise patterns to be temporally and spatially-averaged and the RMS power of the observed speckle-noise patterns reduced.

Another object of the present invention is to provide such a method of and apparatus for reducing the power of speckle-noise patterns observable at the electronic image detection array of a PLIIM-based system, wherein (i) the return PLIB produced by the transmitted PLIB illuminating and reflecting/scattering off an object is spatial-intensity modulated (along the dimensions of the image detection elements) according to a spatial-intensity modulation function (SIMF) so as to modulate the phase along the wavefront of the composite return PLIB and produce numerous substantially different time-varying speckle-noise patterns at the image detection array in the IFD Subsystem, and also (ii) temporally and spatially average the numerous time-varying speckle-noise patterns produced at the image detection array during the photo-integration time period thereof, thereby reducing the RMS power of the speckle-noise patterns observed at the image detection array.

Another object of the present invention is to provide such a method and apparatus, wherein the composite-type "return" PLIB (produced when the transmitted PLIB illuminates and reflects and/or scatters off the target object) is spatial intensity modulated, constituting a spatially coherent-reduced laser light beam and, as a result, numerous time-varying speckle-noise patterns are detected over the photo-integration time period of the image detection array in the IFD subsystem, thereby allowing these time-varying speckle-noise patterns to be temporally and/or spatially averaged and the observable speckle-noise pattern reduced.

Another object of the present invention is to provide such a method and apparatus, wherein the return planar laser illumination beam is spatial-intensity modulated prior to detection at the image detector.

Another object of the present invention is to provide such a method and apparatus, wherein spatial intensity modulation techniques which can be used to carry out the sixth generalized method include, for example: high-speed electro-optical (e.g. ferro-electric, LCD, etc.) dynamic spatial filters, located before the image detector along the optical axis of the camera subsystem; physically rotating spatial filters, and any other spatial intensity modulation element arranged before the image detector along the optical axis of the camera subsystem, through which the received PLIB beam may pass during illumination and image detection operations for spatial intensity modulation without causing optical image distortion at the image detection array.

Another object of the present invention is to provide such a method of and apparatus for reducing the power of speckle-noise patterns observable at the electronic image detection array of a PLIIM-based system, wherein spatial intensity modulation techniques which can be used to carry out the method include, for example: a mechanism for physically or photo-electronically rotating a spatial intensity modulator (e.g. apertures, irises, etc.) about the optical axis of the imaging lens of the camera module; and any other axially symmetric, rotating spatial intensity modulation element arranged before the entrance pupil of the camera module, through which the received PLIB beam may enter at any angle or orientation during illumination and image detection operations.

Another object of the present invention is to provide a seventh generalized method of speckle-noise pattern reduction and particular forms of apparatus therefor based on reducing the temporal coherence of the planar laser illumination beam after it illuminates the target by applying temporal intensity modulation techniques during the detection of the reflected/scattered PLIB.

Another object of the present invention is to provide such a method and apparatus, wherein the composite-type "return" PLIB (produced when the transmitted PLIB illuminates and reflects and/or scatters off the target object) is temporal intensity modulated, constituting a temporally coherent-reduced laser beam and, as a result, numerous time-varying (random) speckle-noise patterns are detected over the photo-integration time period of the image detection array (in the IFD subsystem), thereby allowing these time-varying speckle-noise patterns to be temporally and/or spatially averaged and the observable speckle-noise pattern reduced. This method can be practiced with any of the PLIM-based systems of the present invention disclosed herein, as well as any system constructed in accordance with the general principles of the present invention.

Another object of the present invention is to provide such a method and apparatus, wherein temporal intensity modulation techniques which can be used to carry out the method include, for example: high-speed temporal modulators such as electro-optical shutters, pupils, and stops, located along the optical path of the composite return PLIB focused by the IFD subsystem; etc.

Another object of the present invention is to provide such a method and apparatus, wherein the return planar laser illumination beam is temporal intensity modulated prior to image detection by employing high-speed light gating/switching principles.

Another object of the present invention is to provide a seventh generalized speckle-noise pattern reduction method of the present invention, wherein a series of consecutively captured digital images of an object, containing speckle-pattern noise, are buffered over a series of consecutively different photo-integration time periods in the hand-held PLIIM-based imager, and thereafter spatially corresponding pixel data subsets defined over a small window in the captured digital images are additively combined and averaged so as to produce spatially corresponding pixels data subsets in a reconstructed image of the object, containing speckle-pattern noise having a substantially reduced level of RMS power.

Another object of the present invention is to provide such a generalized method, wherein a hand-held linear-type PLIIM-based imager is manually swept over the object (e.g. 2-D bar code or other graphical indicia) to produce a series of consecutively captured digital 1-D (i.e. linear) images of an object over a series of photo-integration time periods of the PLIIM-Based Imager, such that each linear image of the object includes a substantially different speckle-noise pattern which is produced by natural oscillatory micro-motion of the human hand relative to the object during manual sweeping operations of the hand-held imager.

Another object of the present invention is to provide such a generalized method, wherein a hand-held linear-type PLIIM-based imager is manually swept over the object (e.g. 2-D bar code or other graphical indicia) to produce a series of consecutively captured digital 1-D (i.e. linear) images of an object over a series of photo-integration time periods of the PLIIM-Based Imager, such that each linear image of the object includes a substantially different speckle-noise pattern which is produced the forced oscillatory micro-movement of the hand-held imager relative to the object during manual sweeping operations of the hand-held imager.

Another object of the present invention is to provide "hybrid" despeckling methods and apparatus for use in conjunction with PLIIM-based systems employing linear (or area) electronic image detection arrays having vertically-elongated image detection elements, i.e. having a high height-to-width (H/W) aspect ratio.

Another object of the present invention is to provide a PLIIM-based system with an integrated speckle-pattern noise reduction subsystem, wherein a micro-oscillating cylindrical lens array micro-oscillates a planar laser illumination beam (PLIB) laterally along its planar extent to produce spatial-incoherent PLIB components and optically combines and projects said spatially-incoherent PLIB components onto the same points on the surface of an object to be illuminated, and wherein a micro-oscillating light reflecting structure micro-oscillates the PLB components transversely along the direction orthogonal to said planar extent, and a linear (1D) image detection array with vertically-elongated image detection elements detects time-varying speckle-noise patterns produced by the spatially-incoherent components reflected/scattered off the illuminated object.

Another object of the present invention is to provide PLIIM-based system with an integrated speckle-pattern noise reduction subsystem, wherein a first micro-oscillating light reflective element micro-oscillates a planar laser illumination beam (PLIB) laterally along its planar extent to produce spatially-incoherent PLIB components, a second micro-oscillating light reflecting element micro-oscillates the spatially-incoherent PLIB components transversely along the direction orthogonal to said planar extent, and wherein a stationary cylindrical lens array optically combines and projects said spatially-incoherent PLIB components onto the same points on the surface of an object to be illuminated, and a linear (1D) image detection array with vertically-elongated image detection elements detects time-varying speckle-noise patterns produced by the spatially incoherent components reflected/scattered off the illuminated object.

Another object of the present invention is to provide PLIIM-based system with an integrated speckle-pattern noise reduction subsystem, wherein an acousto-optic Bragg cell micro-oscillates a planar laser illumination beam (PLIB) laterally along its planar extent to produce spatially-incoherent PLIB components, a stationary cylindrical lens array optically combines and projects said spatially-incoherent PLIB components onto the same points on the surface of an object to be illuminated, and wherein a micro-oscillating light reflecting structure micro-oscillates the spatially-incoherent PLIB components transversely along the direction orthogonal to said planar extent, and a linear (1D) image detection array with vertically-elongated image detection elements detects time-varying speckle-noise patterns produced by spatially incoherent PLIB components reflected/scattered off the illuminated object.

Another object of the present invention is to provide PLIIM-based system with an integrated speckle-pattern noise reduction subsystem, wherein a high-resolution deformable mirror (DM) structure micro-oscillates a planar laser illumination beam (PLIB) laterally along its planar extent to produce spatially-incoherent PLIB components, a micro-oscillating light reflecting element micro-oscillates the spatially-incoherent PLIB components transversely along the direction orthogonal to said planar extent, and wherein a stationary cylindrical lens array optically combines and projects the spatially-incoherent PLIB components onto the same points on the surface of an object to be illuminated, and a linear (1D) image detection array with vertically-elongated image detection elements detects time-varying speckle-noise patterns produced by said spatially incoherent PLIB components reflected/scattered off the illuminated object.

Another object of the present invention is to provide PLIM-based system with an integrated speckle-pattern noise reduction subsystem, wherein a micro-oscillating cylindrical lens array micro-oscillates a planar laser illumination beam (PLIB) laterally along its planar extent to produce spatially-incoherent PLIB components which are optically combined and projected onto the same points on the surface of an object to be illuminated, and a micro-oscillating light reflective structure micro-oscillates the spatially-incoherent PLIB components transversely along the direction orthogonal to said planar extent as well as the field of view (FOV) of a linear (1D) image detection array having vertically-elongated image detection elements, whereby said linear CCD detection array detects time-varying speckle-noise patterns produced by the spatially incoherent PLIB components reflected/scattered off the illuminated object.

Another object of the present invention is to provide PLIIM-based system with an integrated speckle-pattern noise reduction subsystem, wherein a micro-oscillating cylindrical lens array micro-oscillates a planar laser illumination beam (PLIB) laterally along its planar extent and produces spatially-incoherent PLIB components which are optically combined and project onto the same points of an object to be illuminated, a micro-oscillating light reflective structure micro-oscillates transversely along the direction orthogonal to said planar extent, both PLIB and the field of view (FOV) of a linear (1D) image detection array having vertically-elongated image detection elements, and a PLIB/FOV folding mirror projects the micro-oscillated PLIB and FOV towards said object, whereby said linear image detection array detects time-varying speckle-noise patterns produced by the spatially incoherent PLIB components reflected/scattered off the illuminated object.

Another object of the present invention is to provide PLIIM-based system with an integrated speckle-pattern noise reduction subsystem, wherein a phase-only LCD-based phase modulation panel micro-oscillates a planar laser illumination beam (PLIB) laterally along its planar extent and produces spatially-incoherent PLIB components, a stationary cylindrical lens array optically combines and projects the spatially-incoherent PLIB components onto the same points on the surface of an object to be illuminated, and wherein a micro-oscillating light reflecting structure micro-oscillates the spatially-incoherent PLIB components transversely along the direction orthogonal to said planar extent, and a linear (1D) CCD image detection array with vertically-elongated image detection elements detects time-varying speckle-noise patterns produced by the spatially incoherent PLIB components reflected/scattered off the illuminated object.

Another object of the present invention is to provide PLIIM-based system with an integrated speckle-pattern noise reduction subsystem, wherein a multi-faceted cylindrical lens array structure rotating about its longitudinal axis within each PLIM micro-oscillates a planar laser illumination beam (PLIB) laterally along its planar extent and produces spatially-incoherent PLIB components therealong, a stationary cylindrical lens array optically combines and projects the spatially-incoherent PLIB components onto the same points on the surface of an object to be illuminated, and wherein a micro-oscillating light reflecting structure micro-oscillates the spatially-incoherent PLIB components transversely along the direction orthogonal to said planar extent, and a linear (1D) image detection array with vertically-elongated image detection elements detects time-varying speckle-noise patterns produced by the spatially incoherent PLIB components reflected/scattered off the illuminated object.

Another object of the present invention is to provide PLIIM-based system with an integrated speckle-pattern noise reduction subsystem, wherein a multi-faceted cylindrical lens array structure within each PLIM rotates about its longitudinal and transverse axes, micro-oscillates a planar laser illumination beam (PLIB) laterally along its planar extent as well as transversely along the direction orthogonal to said planar extent, and produces spatially-incoherent PLIB components along said orthogonal directions, and wherein a stationary cylindrical lens array optically combines and projects the spatially-incoherent PLIB components onto the same points on the surface of an object to be illuminated, and a linear (1D) image detection array with vertically-elongated image detection elements detects time-varying speckle-noise patterns produced by the spatially incoherent PLIB components reflected/scattered off the illuminated object.

Another object of the present invention is to provide PLIIM-based system with an integrated hybrid-type speckle-pattern noise reduction subsystem, wherein a high-speed temporal intensity modulation panel temporal intensity modulates a planar laser illumination beam (PLIB) to produce temporally-incoherent PLIB components along its planar extent, a stationary cylindrical lens array optically combines and projects the temporally-incoherent PLIB components onto the same points on the surface of an object to be illuminated, and wherein a micro-oscillating light reflecting element micro-oscillates the PLIB transversely along the direction orthogonal to said planar extent to produce spatially-incoherent PLIB components along said transverse direction, and a linear (1D) image detection array with vertically-elongated image detection elements detects time-varying speckle-noise patterns produced by the temporally and spatially incoherent PLIB components reflected/scattered off the illuminated object.

Another object of the present invention is to provide PLIIM-based system with an integrated hybrid-type speckle-pattern noise reduction subsystem, wherein an optically-reflective cavity (i.e. etalon) externally attached to each VLD in the system temporal phase modulates a planar laser illumination beam (PLIB) to produce temporally-incoherent PLIB components along its planar extent, a stationary cylindrical lens array optically combines and projects the temporally-incoherent PLIB components onto the same points on the surface of an object to be illuminated, and wherein a micro-oscillating light reflecting element micro-oscillates the PLIB transversely along the direction orthogonal to said planar extent to produce spatially-incoherent PLIB components along said transverse direction, and a linear (1D) image detection array with vertically-elongated image detection elements detects time-varying speckle-noise patterns produced by the temporally and spatially incoherent PLIB components reflected/scattered off the illuminated object.

Another object of the present invention is to provide PLIIM-based system with an integrated hybrid-type speckle-pattern noise reduction subsystem, wherein each visible mode locked laser diode (MLLD) employed in the PLIM of the system generates a high-speed pulsed (i.e. temporal intensity modulated) planar laser illumination beam (PLIB) having temporally-incoherent PLIB components along its planar extent, a stationary cylindrical lens array optically combines and projects the temporally-incoherent PLIB components onto the same points on the surface of an object to be illuminated, and wherein a micro-oscillating light reflecting element micro-oscillates PLIB transversely along the direction orthogonal to said planar extent to produce spatially-incoherent PLIB components along said transverse direction, and a linear (1D) image detection array with vertically-elongated image detection elements detects time-varying speckle-noise patterns produced by the temporally and spatially incoherent PLIB components reflected/scattered off the illuminated object.

Another object of the present invention is to provide PLIIM-based system with an integrated hybrid-type speckle-pattern noise reduction subsystem, wherein the visible laser diode (VLD) employed in each PLIM of the system is continually operated in a frequency-hopping mode so as to temporal frequency modulate the planar laser illumination beam (PLIB) and produce temporally-incoherent PLIB components along its planar extent, a stationary cylindrical lens array optically combines and projects the temporally-incoherent PLIB components onto the same points on the surface of an object to be illuminated, and wherein a micro-oscillating light reflecting element micro-oscillates the PLIB transversely along the direction orthogonal to said planar extent and produces spatially-incoherent PLIB components along said transverse direction, and a linear (1D) image detection array with vertically-elongated image detection elements detects time-varying speckle-noise patterns produced by the temporally and spatial incoherent PLIB components reflected/scattered off the illuminated object.

Another object of the present invention is to provide PLIIM-based system with an integrated hybrid-type speckle-pattern noise reduction subsystem, wherein a pair of micro-oscillating spatial intensity modulation panels modulate the spatial intensity along the wavefront of a planar laser illumination beam (PLIB) and produce spatially-incoherent PLIB components along its planar extent, a stationary cylindrical lens array optically combines and projects the spatially-incoherent PLIB components onto the same points on the surface of an object to be illuminated, and wherein a micro-oscillating light reflective structure micro-oscillates said PLIB transversely along the direction orthogonal to said planar extent and produces spatially-incoherent PLIB components along said transverse direction, and a linear (1D) image detection array having vertically-elongated image detection elements detects time-varying speckle-noise patterns produced by the spatially incoherent PLIB components reflected/scattered off the illuminated object.

Another object of the present invention is to provide method of and apparatus for mounting a linear image sensor chip within a PLIIM-based system to prevent misalignment between the field of view (FOV) of said linear image sensor chip and the planar laser illumination beam (PLIB) used therewith, in response to thermal expansion or cycling within said PLIIM-based system.

Another object of the present invention is to provide a novel method of mounting a linear image sensor chip relative to a heat sinking structure to prevent any misalignment between the field of view (FOV) of the image sensor chip and the PLIA produced by the PLIA within the camera subsystem, thereby improving the performance of the PLIIM-based system during planar laser illumination and imaging operations.

Another object of the present invention is to provide a camera subsystem wherein the linear image sensor chip employed in the camera is rigidly mounted to the camera body of a PLIIM-based system via a novel image sensor mounting mechanism which prevents any significant misalignment between the field of view (FOV) of the image detection elements on the linear image sensor chip and the planar laser illumination beam (PLIB) produced by the PLIA used to illuminate the FOV thereof within the IFD module (i.e. camera subsystem).

Another object of the present invention is to provide a novel method of automatically controlling the output optical power of the VLDs in the planar laser illumination array of a PLIIM-based system in response to the detected speed of objects transported along a conveyor belt, so that each digital image of each object captured by the PLIIM-based system has a substantially uniform "white" level, regardless of conveyor belt speed, thereby simplifying the software-based image processing operations which need to subsequently carried out by the image processing computer subsystem.

Another object of the present invention is to provide such a method, wherein camera control computer in the PLIIM-based system performs the following operations: (i) computes the optical power (measured in milliwatts) which each VLD in the PLIIM-based system must produce in order that each digital image captured by the PLIIM-based system will have substantially the same "white" level, regardless of conveyor belt speed; and (2) transmits the computed VLD optical power value(s) to the micro-controller associated with each PLIA in the PLIIM-based system.

Another object of the present invention is to provide a novel method of automatically controlling the photo-integration time period of the camera subsystem in a PLIIM-based imaging and profiling system, using object velocity computations in its LDIP subsystem, so as to ensure that each pixel in each image captured by the system has a substantially square aspect ratio, a requirement of many conventional optical character recognition (OCR) programs.

Another object of the present invention is to provide a novel method of and apparatus for automatically compensating for viewing-angle distortion in PLIIM-based linear imaging and profiling systems which would otherwise occur when images of object surfaces are being captured as object surfaces, arranged at skewed viewing angles, move past the coplanar PLIB/FOV of such PLIIM-based linear imaging and profiling systems, configured for top and side imaging operations.

Another object of the present invention is to provide a novel method of and apparatus for automatically compensating for viewing-angle distortion in PLIIM-based linear imaging and profiling systems by way of dynamically adjusting the line rate of the camera (i.e. IFD) subsystem, in automatic response to real-time measurement of the object surface gradient (i.e. slope) computed by the camera control computer using object height data captured by the LDIP subsystem.

Another object of the present invention is to provide a PLIIM-based linear imager, wherein speckle-pattern noise is reduced by employing optically-combined planar laser illumination beams (PLIB) components produced from a multiplicity of spatially-incoherent laser diode sources.

Another object of the present invention is to provide a PLIIM-based hand-supportable linear imager, wherein a multiplicity of spatially-incoherent laser diode sources are optically combined using a cylindrical lens array and projected onto an object being illuminated, so as to achieve a greater the reduction in RMS power of observed speckle-pattern noise within the PLIIM-based linear imager.

Another object of the present invention is to provide such a hand-supportable PLIIM-based linear imager, wherein a pair of planar laser illumination arrays (PLIAs) are mounted within its hand-supportable housing and arranged on opposite sides of a linear image detection array mounted therein having a field of view (FOV), and wherein each PLIA comprises a plurality of planar laser illumination modules (PLIMs), for producing a plurality of spatially-incoherent planar laser illumination beam (PLIB) components.

Another object of the present invention is to provide such a hand-supportable PLIIM-based linear imager, wherein each spatially-incoherent PLIB component is arranged in a coplanar relationship with a portion of the FOV of the linear image detection array, and an optical element (e.g. cylindrical lens array) is mounted within the hand-supportable housing, for optically combining and projecting the plurality of spatially-incoherent PLIB components through its light transmission window in coplanar relationship with the FOV, and onto the same points on the surface of an object to be illuminated.

Another object of the present invention is to provide such a hand-supportable PLIIM-based linear imager, wherein by virtue of such operations, the linear image detection array detects time-varying speckle-noise patterns produced by the spatially-incoherent PLIB components reflected/scattered off the illuminated object, and the time-varying speckle-noise patterns are time-averaged at the linear image detection array during the photo-integration time period thereof so as to reduce the RMS power of speckle-pattern noise observable at the linear image detection array.

Another object of the present invention is to provide a PLIIM-based systems embodying speckle-pattern noise reduction subsystems comprising a linear (1D) image sensor with vertically-elongated image detection elements, a pair of planar laser illumination modules (PLIMs), and a 2-D PLIB micro-oscillation mechanism arranged therewith for enabling both lateral and transverse micro-movement of the planar laser illumination beam (PLIB).

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating cylindrical lens array and a micro-oscillating PLIB reflecting mirror configured together as an optical assembly for the purpose of micro-oscillating the PLIB laterally along its planar extent as well as transversely along the direction orthogonal thereto, so that during illumination operations, the PLIB is spatial phase modulated along the planar extent thereof as well as along the direction orthogonal thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a stationary PLIB folding mirror, a micro-oscillating PLIB reflecting element, and a stationary cylindrical lens array configured together as an optical assembly as shown for the purpose of micro-oscillating the PLIB laterally along its planar extent as well as transversely along the direction orthogonal thereto, so that during illumination operations, the PLIB transmitted from each PLIM is spatial phase modulated along the planar extent thereof as well as along the direction orthogonal thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating cylindrical lens array and a micro-oscillating PLIB reflecting element configured together as shown as an optical assembly for the purpose of micro-oscillating the PLIB laterally along its planar extent as well as transversely along the direction orthogonal thereto, so that during illumination operations, the PLIB transmitted from each PLIM is spatial phase modulated along the planar extent thereof as well as along the direction orthogonal (i.e. transverse) thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating high-resolution deformable mirror structure, a stationary PLIB reflecting element and a stationary cylindrical lens array configured together as an optical assembly as shown for the purpose of micro-oscillating the PLIB laterally along its planar extent as well as transversely along the direction orthogonal thereto, so that during illumination operation, the PLIB transmitted from each PLIM is spatial phase modulated along the planar extent thereof as well as along the direction orthogonal (i.e. transverse) thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating cylindrical lens array structure for micro-oscillating the PLIB laterally along its planar extend, a micro-oscillating PLIB/FOV refraction element for micro-oscillating the PLIB and the field of view (FOV) of the linear image sensor transversely along the direction orthogonal to the planar extent of the PLIB, and a stationary PLIB/FOV folding mirror configured together as an optical assembly as shown for the purpose of micro-oscillating the PLIB laterally along its planar extent while micro-oscillating both the PLIB and FOV of the linear image sensor transversely along the direction orthogonal thereto, so that during illumination operation, the PLIB transmitted from each PLIM is spatial phase modulated along the planar extent thereof as well as along the direction orthogonal (i.e. transverse) thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating cylindrical lens array structure for micro-oscillating the PLIB laterally along its planar extend, a micro-oscillating PLIB/FOV reflection element for micro-oscillating the PLIB and the field of view (FOV) of the linear image sensor transversely along the direction orthogonal to the planar extent of the PLIB, and a stationary PLIB/FOV folding mirror configured together as an optical assembly as shown for the purpose of micro-oscillating the PLIB laterally along its planar extent while micro-oscillating both the PLIB and FOV of the linear image sensor transversely along the direction orthogonal thereto, so that during illumination operation, the PLIB transmitted from each PLIM is spatial phase modulated along the planar extent thereof as well as along the direction orthogonal thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a phase-only LCD phase modulation panel, a stationary cylindrical lens array, and a micro-oscillating PLIB reflection element, configured together as an optical assembly as shown for the purpose of micro-oscillating the PLIB laterally along its planar extent while micro-oscillating the PLIB transversely along the direction orthogonal thereto, so that during illumination operation, the PLIB transmitted from each PLIM is spatial phase modulated along the planar extent thereof as well as along the direction orthogonal (i.e. transverse) thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating multi-faceted cylindrical lens array structure, a stationary cylindrical lens array, and a micro-oscillating PLIB reflection element configured together as an optical assembly as shown, for the purpose of micro-oscillating the PLIB laterally along its planar extent while micro-oscillating the PLIB transversely along the direction orthogonal thereto, so that during illumination operation, the PLIB transmitted from each PLIM is spatial phase modulated along the planar extent thereof as well as along the direction orthogonal thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating multi-faceted cylindrical lens array structure (adapted for micro-oscillation about the optical axis of the VLD's laser illumination beam and along the planar extent of the PLIB) and a stationary cylindrical lens array, configured together as an optical assembly as shown, for the purpose of micro-oscillating the PLIB laterally along its planar extent while micro-oscillating the PLIB transversely along the direction orthogonal thereto, so that during illumination operation, the PLIB transmitted from each PLIM is spatial phase modulated along the planar extent thereof as well as along the direction orthogonal thereto, causing the phase along the wavefront of each transmitted PLIB to be modulated in two orthogonal dimensions and numerous substantially different time-varying speckle-noise patterns to be produced at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a temporal-intensity modulation panel, a stationary cylindrical lens array, and a micro-oscillating PLIB reflection element configured together as an optical assembly as shown, for the purpose of temporal intensity modulating the PLIB uniformly along its planar extent while micro-oscillating the PLIB transversely along the direction orthogonal thereto, so that during illumination operations, the PLIB transmitted from each PLIM is spatial phase modulated along the planar extent thereof during micro-oscillation along the direction orthogonal thereto, thereby producing numerous substantially different time-varying speckle-noise patterns at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a temporal-intensity modulation panel, a stationary cylindrical lens array, and a micro-oscillating PLIB reflection element configured together as an optical assembly as shown, for the purpose of temporal intensity modulating the PLIB uniformly along its planar extent while micro-oscillating the PLIB transversely along the direction orthogonal thereto, so that during illumination operations, the PLIB transmitted from each PLIM is spatial phase modulated along the planar extent thereof during micro-oscillation along the direction orthogonal thereto, thereby producing numerous substantially different time-varying speckle-noise patterns at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a visible mode-locked laser diode (MLLD), a stationary cylindrical lens array, and a micro-oscillating PLIB reflection element configured together as an optical assembly as shown, for the purpose of producing a temporal intensity modulated PLIB while micro-oscillating the PLIB transversely along the direction orthogonal to its planar extent, so that during illumination operations, the PLIB transmitted from each PLIM is spatial phase modulated along the planar extent thereof during micro-oscillation along the direction orthogonal thereto, thereby producing numerous substantially different time-varying speckle-noise patterns at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a visible laser diode (VLD) driven into a high-speed frequency hopping mode, a stationary cylindrical lens array, and a micro-oscillating PLIB reflection element configured together as an optical assembly as shown, for the purpose of producing a temporal frequency modulated PLIB while micro-oscillating the PLIB transversely along the direction orthogonal to its planar extent, so that during illumination operations, the PLIB transmitted from each PLIM is spatial phase modulated along the planar extent thereof during micro-oscillation along the direction orthogonal thereto, thereby producing numerous substantially different time-varying speckle-noise patterns at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a PLIIM-based system embodying an speckle-pattern noise reduction subsystem, comprising (i) an image formation and detection (IFD) module mounted on an optical bench and having a linear (1D) image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a micro-oscillating spatial intensity modulation array, a stationary cylindrical lens array, and a micro-oscillating PLIB reflection element configured together as an optical assembly as shown, for the purpose of producing a spatial intensity modulated PLIB while micro-oscillating the PLIB transversely along the direction orthogonal to its planar extent, so that during illumination operations, the PLIB transmitted from each PLIM is spatial phase modulated along the planar extent thereof during micro-oscillation along the direction orthogonal thereto, thereby producing numerous substantially different time-varying speckle-noise patterns at the vertically-elongated image detection elements of the IFD Subsystem during the photo-integration time period thereof, so that these numerous time-varying speckle-noise patterns can be temporally and spatially averaged during the photo-integration time period of the image detection array, thereby reducing the RMS power level of speckle-noise patterns observed at the image detection array.

Another object of the present invention is to provide a based hand-supportable linear imager which contains within its housing, a PLIIM-based image capture and processing engine comprising a dual-VLD PLIA and a 1-D (i.e. linear) image detection array with vertically-elongated image detection elements and configured within an optical assembly that operates in accordance with the first generalized method of speckle-pattern noise reduction of the present invention, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a manually-activated PLIIM-based hand-supportable linear imager configured with (i) a linear-type image formation and detection (IFD) module having a linear image detection array with vertically-elongated image detection elements and fixed focal length/fixed focal distance image formation optics, (ii) a manually-actuated trigger switch for manually activating the planar laser illumination arrays (driven by a set of VLD driver circuits), the linear-type image formation and detection (IFD) module, the image frame grabber, the image data buffer, and the image processing computer, via the camera control computer, upon manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and fixed focal length/fixed focal distance image formation optics, (ii) an IR-based object detection subsystem within its hand-supportable housing for automatically activating upon detection of an object in its IR-based object detection field, the planar laser illumination arrays (driven by a set of VLD driver circuits), the linear-type image formation and detection (IFD) module, as well as the image frame grabber, the image data buffer, and the image processing computer, via the camera control computer, (ii) a manually-activatable switch for enabling transmission of symbol character data to a host computer system upon decoding a bar code symbol within a captured image frame, and (iii) a LCD display panel and a data entry keypad for supporting diverse types of transactions using the PLIIM-based hand-supportable imager.

Another object of the present invention is to provide automatically-activated PLIIM-based hand-supportable linear imager configured with (i) a linear-type image formation and detection (IFD) module having a linear image detection array with vertically-elongated image detection elements and fixed focal length/fixed focal distance image formation optics, (ii) a laser-based object detection subsystem within its hand-supportable housing for automatically activating the planar laser illumination arrays into a full-power mode of operation, the linear-type image formation and detection (IFD) module, the image frame grabber, the image data buffer, and the image processing computer, via the camera control computer, upon automatic detection of an object in its laser-based object detection field, (iii) a manually-activatable switch for enabling transmission of symbol character data to a host computer system upon decoding a bar code symbol within a captured image frame; and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and fixed focal length/fixed focal distance image formation optics, (ii) an ambient-light driven object detection subsystem within its hand-supportable housing for automatically activating the planar laser illumination arrays (driven by a set of VLD driver circuits), the linear-type image formation and detection (IFD) module, the image frame grabber, the image data buffer, and the image processing computer, via the camera control computer, upon automatic detection of an object via ambient-light detected by object detection field enabled by the image sensor within the IFD module, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and fixed focal length/fixed focal distance image formation optics, (ii) an automatic bar code symbol detection subsystem within its hand-supportable housing for automatically activating the image processing computer for decode-processing upon automatic detection of an bar code symbol within its bar code symbol detection field enabled by the image sensor within the IFD module, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager.

Another object of the present invention is to provide a manually-activated PLIIM-based hand-supportable linear imager configured with (i) a linear-type image formation and detection (IFD) module having a linear image detection array with vertically-elongated image detection elements and fixed focal length/variable focal distance image formation optics, (ii) a manually-actuated trigger switch for manually activating the planar laser illumination arrays (driven by a set of VLD driver circuits), the linear-type image formation and detection (IFD) module, the image frame grabber, the image data buffer, and the image processing computer, via the camera control computer, upon manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and fixed focal length/variable focal distance image formation optics, (ii) an IR-based object detection subsystem within its hand-supportable housing for automatically activating upon detection of an object in its IR-based object detection field, the planar laser illumination arrays (driven by a set of VLD driver circuits), the linear-type image formation and detection (IFD) module, as well as the image frame grabber, the image data buffer, and the image processing computer, via the camera control computer, (ii) a manually-activatable switch for enabling transmission of symbol character data to a host computer system upon decoding a bar code symbol within a captured image frame, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and fixed focal length/variable focal distance image formation optics, (ii) a laser-based object detection subsystem within its hand-supportable housing for automatically activating the planar laser illumination arrays into a full-power mode of operation, the linear-type image formation and detection (IFD) module, the image frame grabber, the image data buffer, and the image processing computer, via the camera control computer, upon automatic detection of an object in its laser-based object detection field, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and fixed focal length/variable focal distance image formation optics, (ii) an ambient-light driven object detection subsystem within its hand-supportable housing for automatically activating the planar laser illumination arrays (driven by a set of VLD driver circuits), the linear-type image formation and detection (IFD) module, the image frame grabber, the image data buffer, and the image processing computer, via the camera control computer, upon automatic detection of an object via ambient-light detected by object detection field enabled by the image sensor within the IFD module, and (iii) a manually-activatable switch for enabling transmission of symbol character data to a host computer system upon decoding a bar code symbol within a captured image frame.

Another object of the present invention is to provide an automatically-activated PLIIM-based hand-supportable linear imager configured with (i) a linear-type image formation and detection (IFD) module having a linear image detection array with vertically-elongated image detection elements and fixed focal length/variable focal distance image formation optics, (ii) an automatic bar code symbol detection subsystem within its hand-supportable housing for automatically activating the image processing computer for decode-processing upon automatic detection of an bar code symbol within its bar code symbol detection field enabled by the image sensor within the IFD module, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager.

Another object of the present invention is to provide a manually-activated PLIIM-based hand-supportable linear imager configured with (i) a linear-type image formation and detection (IFD) module having a linear image detection array with vertically-elongated image detection elements and variable focal length/variable focal distance image formation optics, (ii) a manually-actuated trigger switch for manually activating the planar laser illumination arrays (driven by a set of VLD driver circuits), the linear-type image formation and detection (IFD) module, the image frame grabber, the image data buffer, and the image processing computer, via the camera control computer, upon manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and variable focal length/variable focal distance image formation optics, (ii) an IR-based object detection subsystem within its hand-supportable housing for automatically activating upon detection of an object in its IR-based object detection field, the planar laser illumination arrays (driven by a set of VLD driver circuits), the linear-type image formation and detection (IFD) module, as well as the image frame grabber, the image data buffer, and the image processing computer, via the camera control computer, (ii) a manually-activatable switch for enabling transmission of symbol character data to a host computer system upon decoding a bar code symbol within a captured image frame, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and variable focal length/variable focal distance image formation optics, (ii) a laser-based object detection subsystem within its hand-supportable housing for automatically activating the planar laser illumination arrays into a full-power mode of operation, the linear-type image formation and detection (IFD) module, the image frame grabber, the image data buffer, and the image processing computer, via the camera control computer, upon automatic detection of an object in its laser-based object detection field, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and variable focal length/variable focal distance image formation optics, (ii) an ambient-light driven object detection subsystem within its hand-supportable housing for automatically activating the planar laser illumination arrays (driven by a set of VLD driver circuits), the linear-type image formation and detection (IFD) module, the image frame grabber, the image data buffer, and the image processing computer, via the camera control computer, upon automatic detection of an object via ambient-light detected by object detection field enabled by the image sensor within the IFD module, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a linear image detection array with vertically-elongated image detection elements and variable focal length/variable focal distance image formation optics, (ii) an automatic bar code symbol detection subsystem within its hand-supportable housing for automatically activating the image processing computer for decode-processing upon automatic detection of an bar code symbol within its bar code symbol detection field enabled by the image sensor within the IFD module, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager.

Another object of the present invention is to provide a PLIIM-based image capture and processing engine for use in a hand-supportable imager.

Another object of the present invention is to provide a PLIIM-based image capture and processing engine for use in the hand-supportable imagers, presentation scanners, and the like, comprising PLIAs, and IFD (i.e. camera) subsystem and associated optical components mounted on an optical-bench/multi-layer PC board, contained between the upper and lower portions of the engine housing.

Another object of the present invention is to provide a PLIIM-based hand-supportable linear imager which contains within its housing, a PLIIM-based image capture and processing engine comprising a dual-VLD PLIA and a linear image detection array with vertically-elongated image detection elements configured within an optical assembly that provides a despeckling mechanism which operates in accordance with the first generalized method of speckle-pattern noise reduction.

Another object of the present invention is to provide a PLIIM-based hand-supportable linear imager which contains within its housing, a PLIIM-based image capture and processing engine comprising a dual-VLD PLIA and a linear image detection array having vertically-elongated image detection elements configured within an optical assembly which provides a despeckling mechanism that operates in accordance with the first generalized method of speckle-pattern noise reduction.

Another object of the present invention is to provide a PLIIM-based image capture and processing engine for use in the hand-supportable imagers, presentation scanners, and the like, comprising a dual-VLD PLIA and a linear image detection array having vertically-elongated image detection elements configured within an optical assembly which employs high-resolution deformable mirror (DM) structure which provides a despeckling mechanism that operates in accordance with the first generalized method of speckle-pattern noise reduction.

Another object of the present invention is to provide a PLIIM-based image capture and processing engine for use in the hand-supportable imagers, presentation scanners, and the like, comprising a dual-VLD PLIA and a linear image detection array having vertically-elongated image detection elements configured within an optical assembly that employs a high-resolution phase-only LCD-based phase modulation panel which provides a despeckling mechanism that operates in accordance with the first generalized method of speckle-pattern noise reduction.

Another object of the present invention is to provide PLIIM-based image capture and processing engine for use in the hand-supportable imagers, presentation scanners, and the like, comprising a dual-VLD PLIA and a linear image detection array having vertically-elongated image detection elements configured within an optical assembly that employs a rotating multi-faceted cylindrical lens array structure which provides a despeckling mechanism that operates in accordance with the first generalized method of speckle-pattern noise reduction.

Another object of the present invention is to provide a PLIIM-based image capture and processing engine for use in the hand-supportable imagers, presentation scanners, and the like, comprising a dual-VLD PLIA and a linear image detection array having vertically-elongated image detection elements configured within an optical assembly that employs a high-speed temporal intensity modulation panel (i.e. optical shutter) which provides a despeckling mechanism that operates in accordance with the second generalized method of speckle-pattern noise reduction.

Another object of the present invention is to provide a PLIIM-based image capture and processing engine for use in the hand-supportable imagers, presentation scanners, and the like, comprising a dual-VLD PLIA and a linear image detection array having vertically-elongated image detection elements configured within an optical assembly that employs visible mode-locked laser diode (MLLDs) which provide a despeckling mechanism that operates in accordance with the second method generalized method of speckle-pattern noise reduction.

Another object of the present invention is to provide a PLIIM-based image capture and processing engine for use in the hand-supportable imagers, presentation scanners, and the like, comprising a dual-VLD PLIA and a linear image detection array having vertically-elongated image detection elements configured within an optical assembly that employs an optically-reflective temporal phase modulating structure (i.e. etalon) which provides a despeckling mechanism that operates in accordance with the third generalized method of speckle-pattern noise reduction.

Another object of the present invention is to provide a PLIIM-based image capture and processing engine for use in the hand-supportable imagers, presentation scanners, and the like, comprising a dual-VLD PLIA and a linear image detection array having vertically-elongated image detection elements configured within an optical assembly that employs a pair of reciprocating spatial intensity modulation panels which provide a despeckling mechanism that operates in accordance with the fifth method generalized method of speckle-pattern noise reduction.

Another object of the present invention is to provide a PLIIM-based image capture and processing engine for use in the hand-supportable imagers, presentation scanners, and the like, comprising a dual-VLD PLIA and a linear image detection array having vertically-elongated image detection elements configured within an optical assembly that employs spatial intensity modulation aperture which provides a despeckling mechanism that operates in accordance with the sixth method generalized method of speckle-pattern noise reduction.

Another object of the present invention is to provide a PLIIM-based image capture and processing engine for use in the hand-supportable imagers, presentation scanners, and the like, comprising a dual-VLD PLIA and a linear image detection array having vertically-elongated image detection elements configured within an optical assembly that employs a temporal intensity modulation aperture which provides a despeckling mechanism that operates in accordance with the seventh generalized method of speckle-pattern noise reduction.

Another object of the present invention is to provide a hand-supportable imager having a housing containing a PLIIM-based image capture and processing engine comprising a dual-VLD PLIA, and a 2-D (area-type) image detection array configured within an optical assembly that employs a micro-oscillating cylindrical lens array which provides a despeckling mechanism that operates in accordance with the first generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and an area image detection array configured within an optical assembly which employs a micro-oscillating light reflective element that provides a despeckling mechanism that operates in accordance with the first generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and a 2-D image detection array configured within an optical assembly that employs an acousto-electric Bragg cell structure which provides a despeckling mechanism that operates in accordance with the first generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and a 2-D image detection array configured within an optical assembly that employs a high spatial-resolution piezo-electric driven deformable mirror (DM) structure which provides a despeckling mechanism that operates in accordance with the first generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and a 2-D image detection array configured within an optical assembly that employs a spatial-only liquid crystal display (PO-LCD) type spatial phase modulation panel which provides a despeckling mechanism that operates in accordance with the first generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and a 2-D image detection array configured within an optical assembly that employs a visible mode locked laser diode (MLLD) which provides a despeckling mechanism that operates in accordance with the second generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and a 2-D image detection array configured within an optical assembly that employs an electrically-passive optically-reflective cavity (i.e. etalon) which provides a despeckling mechanism that operates in accordance with the third method generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and a 2-D image detection array configured within an optical assembly that employs a pair of micro-oscillating spatial intensity modulation panels which provide a despeckling mechanism that operates in accordance with the fifth method generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and a 2-D image detection array configured within an optical assembly that employs a electro-optical or mechanically rotating aperture (i.e. iris) disposed before the entrance pupil of the IFD module, which provides a despeckling mechanism that operates in accordance with the sixth method generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a hand-supportable imager having a housing containing a PLIIM-based image capture and processing engine comprising a dual-VLD PLIA and a 2-D image detection array configured within an optical assembly that employs a high-speed electro-optical shutter disposed before the entrance pupil of the IFD module, which provides a despeckling mechanism that operates in accordance with the seventh generalized method of speckle-pattern noise reduction, and which also has integrated with its housing, a LCD display panel for displaying images captured by said engine and information provided by a host computer system or other information supplying device, and a manual data entry keypad for manually entering data into the imager during diverse types of information-related transactions supported by the PLIIM-based hand-supportable imager.

Another object of the present invention is to provide a manually-activated PLIIM-based hand-supportable linear imager configured with (i) a linear-type (i.e. 1D) image formation and detection (IFD) module having a fixed focal length/fixed focal distance image formation optics with a field of view (FOV), (ii) a manually-actuated trigger switch for manually activating the planar laser illumination array (to producing a PLIB in coplanar arrangement with said FOV), the linear-type image formation and detection (IFD) module, the image frame grabber, the image data buffer, and the image processing computer, via the camera control computer, upon response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a fixed focal length/fixed focal distance image formation optics with a field of view (FOV), (ii) an IR-based object detection subsystem within its hand-supportable housing for automatically activating upon detection of an object in its IR-based object detection field, the planar laser illumination array (to produce a PLIB in coplanar arrangement with said FOV), the linear-type image formation and detection (IFD) module, as well as the image frame grabber, the image data buffer, and the image processing computer, via the camera control computer, (ii) a manually-activatable switch for enabling transmission of symbol character data to a host computer system upon decoding a bar code symbol within a captured image frame, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a fixed focal length/fixed focal distance image formation optics with a field of view (FOV), (ii) a laser-based object detection subsystem within its hand-supportable housing for automatically activating the planar laser illumination array into a full-power mode of operation (to produce a PLIB in coplanar arrangement with said FOV), the linear-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system upon decoding a bar code symbol within a captured image frame; and (iv) a LCD display panel and a data entry keypad for supporting diverse types of transactions using the PLIIM-based hand-supportable imager.

Another object of the present invention is to provide an automatically-activated PLIIM-based hand-supportable linear imager shown configured with (i) a linear-type image formation and detection (IFD) module having a fixed focal length/fixed focal distance image formation optics with a field of view (FOV), (ii) an ambient-light driven object detection subsystem within its hand-supportable housing for automatically activating the planar laser illumination array (to produce a PLIB in coplanar arrangement with said FOV), the area-type image formation and detection (IFD) module, the image frame grabber, the image data buffer, and the image processing computer, via the camera control computer, upon automatic detection of an object via ambient-light detected by object detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a fixed focal length/fixed focal distance image formation optics with a field of view (FOV), (ii) an automatic bar code symbol detection subsystem within its hand-supportable housing for automatically activating the planar laser illumination array (to produce a PLIB in coplanar arrangement with said FOV), the image processing computer for decode-processing in response to the automatic detection of an bar code symbol within its bar code symbol detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide a manually-activated PLIIM-based hand-supportable linear imager configured with (i) a linear-type image formation and detection (IFD) module having a fixed focal length/variable focal distance image formation optics with a field of view (FOV), (ii) a manually-actuated trigger switch for manually activating the planar laser illumination (to produce a planar laser illumination beam (PLIB) in coplanar arrangement with said FOV), the linear-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a fixed focal length/variable focal distance image formation optics with a field of view (FOV), (ii) an IR-based object detection subsystem within its hand-supportable housing for automatically activating in response to the detection of an object in its IR-based object detection field, the planar laser illumination array (to produce a PLIB in coplanar arrangement with said FOV), the linear-type image formation and detection (IFD) module, as well as the image frame grabber, the image data buffer, and the image processing computer, via the camera control computer, (ii) a manually-activatable switch for enabling transmission of symbol character data to a host computer system in response to decoding a bar code symbol within a captured image frame, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a fixed focal length/variable focal distance image formation optics with a field of view (FOV), (ii) a laser-based object detection subsystem within its band-supportable housing for automatically activating the planar laser illumination array into a full-power mode of operation (to produce a PLIB in coplanar arrangement with said FOV), the a linear-type image formation and detection (IFD) module, the image frame grabber, the image data buffer, and the image processing computer, via the camera control computer, upon automatic detection of an object in its laser-based object detection field, (iii) a manually-activatable switch for enabling transmission of symbol character data to a host computer system in response to the decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a fixed focal length/variable focal distance image formation optics with a field of FOV, (ii) an ambient-light driven object detection subsystem within its hand-supportable housing for automatically activating the planar laser illumination array (to produce a PLIB in coplanar arrangement with said FOV), the area-type image formation and detection (IFD) module, the image frame grabber, the image data buffer, and the image processing computer, via the camera control computer, in response to the automatic detection of an object via ambient-light detected by object detection field enabled by the image sensor within the IFD module, and (iii) a manually-activatable switch for enabling transmission of symbol character data to a host computer system upon decoding a bar code symbol within a captured image frames.

Another object of the present invention is to provide an automatically-activated PLIIM-based hand-supportable linear imager configured with (i) a linear-type image formation and detection (IFD) module having a fixed focal length/variable focal distance image formation optics with a field of view (FOV), (ii) an automatic bar code symbol detection subsystem within its hand-supportable housing for automatically activating the planar laser illumination array (to produce a PLIB in coplanar arrangement with said FOV), the image processing computer for decode-processing in response to the automatic detection of an bar code symbol within its bar code symbol detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide a manually-activated PLIIM-based hand-supportable linear imager configured with (i) a linear-type image formation and detection (IFD) module having a variable focal length/variable focal distance image formation optics with a field of FOV, (ii) a manually-actuated trigger switch for manually activating the planar laser illumination array (to produce a PLIB in coplanar arrangement with said FOV), the linear-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a variable focal length/variable focal distance image formation optics with a field of view (FOV), (ii) an IR-based object detection subsystem within its hand-supportable housing for automatically activating in response to the detection of an object in its IR-based object detection field, the planar laser illumination array (to produce a PLIB in coplanar arrangement with said FOV), the linear-type image formation and detection (IFD) module, as well as the image frame grabber, the image data buffer, and the image processing computer, via the camera control computer, (ii) a manually-activatable switch for enabling transmission of symbol character data to a host computer system in response to decoding a bar code symbol within a captured image frame, and (iii) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a variable focal length/variable focal distance image formation optics and a field of view, (ii) a laser-based object detection subsystem within its hand-supportable housing for automatically activating the planar laser illumination array into a full-power mode of operation (to produce a PLIB in coplanar arrangement with said FOV), the linear-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a variable focal length/variable focal distance image formation optics with a field of view (FOV), (ii) an ambient-light driven object detection subsystem within its hand-supportable housing for automatically activating the planar laser illumination array (to produce a PLIB in coplanar arrangement with said FOV) the linear-type image formation and detection (IFD) module, the image frame grabber, the image data buffer, and the image processing computer, via the camera control computer, in response to the automatic detection of an object via ambient-light detected by object detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable linear imager configured with (i) a linear-type image formation and detection (IFD) module having a variable focal length/variable focal distance image formation optics with a field of view (FOV), (ii) an automatic bar code symbol detection subsystem within its hand-supportable housing for automatically activating the planar laser illumination array (to produce a PLIB in coplanar arrangement with said FOV) the linear-type image formation and detection (IFD) module, the image frame grabber, the image data buffer, the image processing computer for decode-processing in response to the automatic detection of an bar code symbol within its bar code symbol detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide a manually-activated PLIIM-based hand-supportable area imager configured with (i) an area-type (i.e. 2D) image formation and detection (IFD) module having a fixed focal length/fixed focal distance image formation optics with a field of field of view (FOV), (ii) a manually-actuated trigger switch for manually activating the planar laser illumination array (to produce a PLIB in coplanar arrangement with said FOV), the area-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a fixed focal length/fixed focal distance image formation optics with a FOV, (ii) an IR-based object detection subsystem within its hand-supportable housing for automatically activating in response to the detection of an object in its IR-based object detection field, the planar laser illumination array (to produce a PLIB in coplanar arrangement with said FOV), the area-type image formation and detection (IFD) module, as well as the image frame grabber, the image data buffer, and the image processing computer, via the camera control computer, (ii) a manually-activatable switch for enabling transmission of symbol character data to a host computer system in response to decoding a bar code symbol within a captured image frame, and (iii) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a fixed focal length/fixed focal distance image formation optics with a FOV, (ii) a laser-based object detection subsystem within its hand-supportable housing for automatically activating the planar laser illumination array into a full-power mode of operation (to produce a PLIB in coplanar arrangement with said FOV), the area-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system in response to decoding a bar code symbol within a captured image frame; and (iv) a LCD display panel and a data entry keypad for supporting diverse types of transactions using the PLIIM-based hand-supportable imager.

Another object of the present invention is to provide an automatically-activated PLIIM-based hand-supportable area imager shown configured with (i) a area-type image formation and detection (IFD) module having a fixed focal length/fixed focal distance image formation optics with a FOV, (ii) an ambient-light driven object detection subsystem within its hand-supportable housing for automatically activating the planar laser illumination array (to produce a PLIB in coplanar arrangement with said FOV), the area-type image formation and detection (IFD) module, the image frame grabber, the image data buffer, and the image processing computer, via the camera control computer, in response to the automatic detection of an object via ambient-light detected by object detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a fixed focal length/fixed focal distance image formation optics with a FOV, (ii) an automatic bar code symbol detection subsystem within its hand-supportable housing for automatically activating the planar laser illumination array (to produce a PLIB in coplanar arrangement with said FOV), the area-type image formation and detection (IFD) module, the image frame grabber, the image data buffer, and the image processing computer, via the image processing computer for decode-processing upon automatic detection of an bar code symbol within its bar code symbol detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide a manually-activated PLIIM-based hand-supportable area imager configured with (i) an area-type image formation and detection (IFD) module having a fixed focal length/variable focal distance image formation optics with a FOV, (ii) a manually-actuated trigger switch for manually activating the planar laser illumination array (to produce a PLIB in coplanar arrangement with said FOV), the area-type image formation and detection (IFD) module, the image frame grabber, the image data buffer, and the image processing computer, via the camera control computer, upon manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a fixed focal length/variable focal distance image formation optics with a FOV, (ii) an IR-based object detection subsystem within its hand-supportable housing for automatically activating, in response to the detection of an object in its IR-based object detection field, the planar laser illumination array (to produce a PLIB in coplanar arrangement with said FOV), the area-type image formation and detection (IFD) module, the image frame grabber, the image data buffer, and the image processing computer, via the camera control computer, (ii) a manually-activatable switch for enabling transmission of symbol character data to a host computer system in response to decoding a bar code symbol within a captured image frame, and (iii) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a fixed focal length/variable focal distance image formation optics with a FOV, (ii) a laser-based object detection subsystem within its hand-supportable housing for automatically activating the planar laser illumination array into a full-power mode of operation (to produce a PLIB in coplanar arrangement with said FOV), the area-type image formation and detection (IFD) module, the image frame grabber, the image data buffer, and the image processing computer, via, the camera control computer, in response to the automatic detection of an object in its laser-based object detection field, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a fixed focal length/variable focal distance image formation optics with a FOV, (ii) an ambient-light driven object detection subsystem within its hand-supportable housing for automatically activating the planar laser illumination array (to produce a PLIB in coplanar arrangement with said FOV), the area-type image formation and detection (IFD) module, the image frame grabber, the image data buffer, and the image processing computer, via the camera control computer, upon automatic detection of an object via ambient-light detected by object detection field enabled by the image sensor within the IFD module, and (iii) a manually-activatable switch for enabling transmission of symbol character data to a host computer system upon decoding a bar code symbol within a captured image frame.

Another object of the present invention is to provide an automatically-activated PLIIM-based hand-supportable area imager configured with (i) an area-type image formation and detection (IFD) module having a fixed focal length/variable focal distance image formation optics with a FOV, (ii) an automatic bar code symbol detection subsystem within its hand-supportable housing for automatically activating the planar laser illumination array (to produce a PLIB in coplanar arrangement with said FOV), the area-type image formation and detection (IFD) module, the image frame grabber, the image data buffer, and the image processing computer for decode-processing of image data in response to the automatic detection of an bar code symbol within its bar code symbol detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide a manually-activated PLIIM-based hand-supportable area imager configured with (i) an area-type image formation and detection (IFD) module having a variable focal length/variable focal distance image formation optics with a FOV, (ii) a manually-actuated trigger switch for manually activating the planar laser illumination array (to produce a PLIB in coplanar arrangement with said FOV), the area-type image formation and detection (IFD) module, the image frame grabber, the image data buffer, and the image processing computer, via the camera control computer, in response to manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a variable focal length/variable focal distance image formation optics with a FOV, (ii) an IR-based object detection subsystem within its hand-supportable housing for automatically activating in response to the detection of an object in its IR-based object detection field, the planar laser illumination arrays (to produce a PLIB in coplanar arrangement with said FOV), the area-type image formation and detection (IFD) module, as well as the image frame grabber, the image data buffer, and the image processing computer, via the camera control computer, (ii) a manually-activatable switch for enabling transmission of symbol character data to a host computer system in response to decoding a bar code symbol within a captured image frame, and (iii) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a variable focal length/variable focal distance image formation optics with a FOV, (ii) a laser-based object detection subsystem within its hand-supportable housing for automatically activating the planar laser illumination array into a full-power mode of operation (to produce a PLIB in coplanar arrangement with said FOV), the area-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a variable focal length/variable focal distance image formation optics with a FOV, (ii) an ambient-light driven object detection subsystem within its hand-supportable housing for automatically activating the planar laser illumination array (to produce a PLIB in coplanar arrangement with said FOV), the area-type image formation and detection (IFD) module, the image frame grabber, the image data buffer, and the image processing computer, via the camera control computer, in response to the automatic detection of an object via ambient-light detected by object detection field enabled by the image sensor within the IFD module, (iii) a manually-activatable switch for enabling transmission of symbol character data to a host computer system in response to the decoding a bar code symbol within a captured image frame, and (iv) a LCD display panel and a data entry keypad for supporting diverse types of transactions using the PLIIM-based hand-supportable imager.

Another object of the present invention is to provide an automatically-activated PLIIM-based hand-supportable area imager configured with (i) an area-type image formation and detection (IFD) module having a variable focal length/variable focal distance image formation optics with a FOV, (ii) an automatic bar code symbol detection subsystem within its hand-supportable housing for automatically activating the planar laser illumination array (to produce a PLIB in coplanar arrangement with said FOV), the area-type image formation and detection (IFD) module, the image frame grabber, the image data buffer, and the image processing computer for decode-processing of image data in response to the automatic detection of an bar code symbol within its bar code symbol detection field enabled by the image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager.

Another object of the present invention is to provide a LED-based PLIM for use in PLIIM-based systems having short working distances (e.g. less than 18 inches or so), wherein a linear-type LED, an optional focusing lens and a cylindrical lens element are mounted within compact barrel structure, for the purpose of producing a spatially-incoherent planar light illumination beam (PLIB) therefrom.

Another object of the present invention is to provide an optical process carried within a LED-based PLIM, wherein (1) the focusing lens focuses a reduced size image of the light emitting source of the LED towards the farthest working distance in the PLIIM-based system, and (2) the light rays associated with the reduced-sized image are transmitted through the cylindrical lens element to produce a spatially-incoherent planar light illumination beam (PLIB).

Another object of the present invention is to provide an LED-based PLIM for use in PLIIM-based systems having short working distances, wherein a linear-type LED, a focusing lens, collimating lens and a cylindrical lens element are mounted within compact barrel structure, for the purpose of producing a spatially-incoherent planar light illumination beam (PLIB) therefrom.

Another object of the present invention is to provide an optical process carried within an LED-based PLIM, wherein (1) the focusing lens focuses a reduced size image of the light emitting source of the LED towards a focal point within the barrel structure, (2) the collimating lens collimates the light rays associated with the reduced size image of the light emitting source, and (3) the cylindrical lens element diverges the collimated light beam so as to produce a spatially-incoherent planar light illumination beam (PLIOB).

Another object of the present invention is to provide an LED-based PLIM chip for use in PLIIM-based systems having short working distances, wherein a linear-type light emitting diode (LED) array, a focusing-type microlens array, collimating type microlens array, and a cylindrical-type microlens array are mounted within the IC package of the PLIM chip, for the purpose of producing a spatially-incoherent planar light illumination beam (PLIB) therefrom.

Another object of the present invention is to provide an LED-based PLIM, wherein (1) each focusing lenslet focuses a reduced size image of a light emitting source of an LED towards a focal point above the focusing-type microlens array, (2) each collimating lenslet collimates the light rays associated with the reduced size image of the light emitting source, and (3) each cylindrical lenslet diverges the collimated light beam so as to produce a spatially-incoherent planar light illumination beam (PLIB) component, which collectively produce a composite PLIB from the LED-based PLIM.

Another object of the present invention is to provide a novel method of and apparatus for measuring, in the field, the pitch and yaw angles of each slave Package Identification (PID) unit in the tunnel system, as well as the elevation (i.e. height) of each such PID unit, relative to the local coordinate reference frame symbolically embedded within the local PID unit.

Another object of the present invention is to provide such apparatus realized as angle-measurement (e.g. protractor) devices integrated within the structure of each slave and master PID housing and the support structure provided to support the same within the tunnel system, enabling the taking of such field measurements (i.e. angle and height readings) so that the precise coordinate location of each local coordinate reference frame (symbolically embedded within each PID unit) can be precisely determined, relative to the master PID unit.

Another object of the present invention is to provide such apparatus, wherein each angle measurement device is integrated into the structure of the PID unit by providing a pointer or indicating structure (e.g. arrow) on the surface of the housing of the PID unit, while mounting angle-measurement indicator on the corresponding support structure used to support the housing above the conveyor belt of the tunnel system.

Another object of the present invention is to provide a novel planar laser illumination and imaging module which employs a planar laser illumination array (PLIA) comprising a plurality of visible laser diodes having a plurality of different characteristic wavelengths residing within different portions of the visible band.

Another object of the present invention is to provide such a novel PLIIM, wherein the visible laser diodes within the PLIA thereof are spatially arranged so that the spectral components of each neighboring visible laser diode (VLD) spatially overlap and each portion of the composite PLIB along its planar extent contains a spectrum of different characteristic wavelengths, thereby imparting multi-color illumination characteristics to the composite PLIB.

Another object of the present invention is to provide such a novel PLIIM, wherein the multi-color illumination characteristics of the composite PLIB reduce the temporal coherence of the laser illumination sources in the PLIA, thereby reducing the RMS power of the speckle-noise pattern observed at the image detection array of the PLIIM.

Another object of the present invention is to provide a novel planar laser illumination and imaging module (PLIIM) which employs a planar laser illumination array (PLIA) comprising a plurality of visible laser diodes (VLDs) which exhibit high “mode-hopping” spectral characteristics which cooperate on the time domain to reduce the temporal coherence of the laser illumination sources operating in the PLIA and produce numerous substantially different time-varying speckle-noise patterns during each photo-integration time period, thereby reducing the RMS power of the speckle-noise pattern observed at the image detection array in the PLIIM.

Another object of the present invention is to provide a novel planar laser illumination and imaging module (PLIIM) which employs a planar laser illumination array (PLIA) comprising a plurality of visible laser diodes (VLDs) which are “thermally-driven” to exhibit high “mode-hopping” spectral characteristics which cooperate on the time domain to reduce the temporal coherence of the laser illumination sources operating in the PLIA, and thereby reduce the speckle noise pattern observed at the image detection array in the PLIIM accordance with the principles of the present invention.

Another object of the present invention is to provide a unitary (PLIIM-based) object identification and attribute acquisition system, wherein the various information signals are generated by the LDIP subsystem, and provided to a camera control computer, and wherein the camera control computer generates digital camera control signals which are provided to the image formation and detection (IFD subsystem (i.e. “camera”) so that the system can carry out its diverse functions in an integrated manner, including (1) capturing digital images having (i) square pixels (i.e. 1:1 aspect ratio) independent of package height or velocity, (ii) significantly reduced speckle-noise levels, and (iii) constant image resolution measured in dots per inch (dpi) independent of package height or velocity and without the use of costly telecentric optics employed by prior art systems, (2) automatic cropping of captured images so that only regions of interest reflecting the package or package label require image processing by the image processing computer, and (3) automatic image lifting operations.

Another object of the present invention is to provide a novel bioptical-type planar laser illumination and imaging (PLIIM) system for the purpose of identifying products in supermarkets and other retail shopping environments (e.g. by reading bar code symbols thereon), as well as recognizing the shape, texture and color of produce (e.g. fruit, vegetables, etc.) using a composite multi-spectral planar laser illumination beam containing a spectrum of different characteristic wavelengths, to impart multi-color illumination characteristics thereto.

Another object of the present invention is to provide such a bioptical-type PLIIM-based system, wherein a planar laser illumination array (PLIA) comprising a plurality of visible laser diodes (VLDs) which intrinsically exhibit high “mode-hopping" spectral characteristics which cooperate on the time domain to reduce the temporal coherence of the laser illumination sources operating in the PLIA, and thereby reduce the speckle-noise pattern observed at the image detection array of the PLIIM-based system.

Another object of the present invention is to provide a bioptical PLIIM-based product dimensioning, analysis and identification system comprising a pair of PLIIM-based package identification and dimensioning subsystems, wherein each PLIIM-based subsystem produces multi-spectral planar laser illumination, employs a 1-D CCD image detection array, and is programmed to analyze images of objects (e.g. produce) captured thereby and determine the shape/geometry, dimensions and color of such products in diverse retail shopping environments; and Another object of the present invention is to provide a bioptical PLIM-based product dimensioning, analysis and identification system comprising a pair of PLIM-based package identification and dimensioning subsystems, wherein each subsystem employs a 2-D CCD image detection array and is programmed to analyze images of objects (e.g. produce) captured thereby and determine the shape/geometry, dimensions and color of such products in diverse retail shopping environments.

Another object of the present invention is to provide a unitary object identification and attribute acquisition system comprising: a LADAR-based package imaging, detecting and dimensioning subsystem capable of collecting range data from objects on the conveyor belt using a pair of multi-wavelength (i.e. containing visible and IR spectral components) laser scanning beams projected at different angular spacings; a PLIIM-based bar code symbol reading subsystem for producing a scanning volume above the conveyor belt, for scanning bar codes on packages transported therealong; an input/output subsystem for managing the inputs to and outputs from the unitary system; a data management computer, with a graphical user interface (GUI), for realizing a data element queuing, handling and processing subsystem, as well as other data and system management functions; and a network controller, operably connected to the I/O subsystem, for connecting the system to the local area network (LAN) associated with the tunnel-based system, as well as other packet-based data communication networks supporting various network protocols (e.g. Ethernet, AppleTalk, etc).

Another object of the present invention is to provide a real-time camera control process carried out within a camera control computer in a PLIIM-based camera system, for intelligently enabling the camera system to zoom in and focus upon only the surfaces of a detected package which might bear package identifying and/or characterizing information that can be reliably captured and utilized by the system or network within which the camera subsystem is installed.

Another object of the present invention is to provide a real-time camera control process for significantly reducing the amount of image data captured by the system which does not contain relevant information, thus increasing the package identification performance of the camera subsystem, while using less computational resources, thereby allowing the camera subsystem to perform more efficiently and productivity.

Another object of the present invention is to provide a camera control computer for generating real-time camera control signals that drive the zoom and focus lens group translators within a high-speed auto-focus/auto-zoom digital camera subsystem so that the camera automatically captures digital images having (1) square pixels (i.e. 1:1 aspect ratio) independent of package height or velocity, (2) significantly reduced speckle-noise levels, and (3) constant image resolution measured in dots per inch (dpi) independent of package height or velocity.

Another object of the present invention is to provide an auto-focus/auto-zoom digital camera system employing a camera control computer which generates commands for cropping the corresponding slice (i.e. section) of the region of interest in the image being captured and buffered therewithin, or processed at an image processing computer.

Another object of the present invention is to provide a novel method of and apparatus for performing automatic recognition of graphical intelligence contained in 2-D images captured from arbitrary 3-D object surfaces.

Another object of the present invention is to provide such apparatus in the form of a PLIIM-based object identification and attribute acquisition system which is capable of performing a novel method of recognizing graphical intelligence (e.g. symbol character strings and/or bar code symbols) contained in high-resolution 2-D images lifted from arbitrary moving 3-D object surfaces, by constructing high-resolution 3-D images of the object from (i) linear 3-D surface profile maps drawn by the LDIP subsystem in the PLIIM-based profiling and imaging system, and (ii) high-resolution linear images lifted by the PLIIM-based linear imaging subsystem thereof.

Another object of the present invention is to provide such a PLIIM-based object identification and attribute acquisition system, wherein the method of graphical intelligence recognition employed therein is carried out in an image processing computer associated with the PLIIM-based object identification and attribute acquisition system, and involves (i) producing 3-D polygon-mesh surface models of the moving target object, (ii) projecting pixel rays in 3-D space from each pixel in each captured high-resolution linear image, and (iii) computing the points of intersection between these pixel rays and the 3-D polygon-mesh model so as to produce a high-resolution 3-D image of the target object.

Another object of present invention is to provide a method of recognizing graphical intelligence recorded on planar substrates that have been physically distorted as a result of either (i) application of the graphical intelligence to an arbitrary 3-D object surface, or (ii) deformation of a 3-D object on which the graphical intelligence has been rendered.

Another object of the present invention is to provide such a method, which is capable of "undistorting" any distortions imparted to the graphical intelligence while being carried by the arbitrary 3-D object surface due to, for example, non-planar surface characteristics.

Another object of the present invention is to provide a novel method of recognizing graphical intelligence, originally formatted for application onto planar surfaces, but applied to non-planar surfaces or otherwise to substrates having surface characteristics which differ from the surface characteristics for which the graphical intelligence was originally designed without spatial distortion.

Another object of the present invention is to provide a novel method of recognizing bar coded baggage identification tags as well as graphical character encoded labels which have been deformed, bent or otherwise physically distorted.

Another object of the present invention is to provide a tunnel-type object identification and attribute acquisition (PIAD) system comprising a plurality of PLIIM-based package identification (PID) units arranged about a high-speed package conveyor belt structure, wherein the PID units are integrated within a high-speed data communications network having a suitable network topology and configuration.

Another object of the present invention is to provide such a tunnel-type PIAD system, wherein the top PID unit includes a LDIP subsystem, and functions as a master PID unit within the tunnel system, whereas the side and bottom PID units (which are not provided with a LDIP subsystem) function as slave PID units and are programmed to receive package dimension data (e.g. height, length and width coordinates) from the master PID unit, and automatically convert (i.e. transform) on a real-time basis these package dimension coordinates into their local coordinate reference frames for use in dynamically controlling the zoom and focus parameters of the camera subsystems employed in the tunnel-type system.

Another object of the present invention is to provide such a tunnel-type system, wherein the camera field of view (FOV) of the bottom PID unit is arranged to view packages through a small gap provided between sections of the conveyor belt structure.

Another object of the present invention is to provide a CCD camera-based tunnel system comprising auto-zoom/auto-focus CCD camera subsystems which utilize a "package-dimension data" driven camera control computer for automatic controlling the camera zoom and focus characteristics on a real-time manner.

Another object of the present invention is to provide such a CCD camera-based tunnel-type system, wherein the package-dimension data driven camera control computer involves (i) dimensioning packages in a global coordinate reference system, (ii) producing package coordinate data referenced to the global coordinate reference system, and (iii) distributing the package coordinate data to local coordinate references frames in the system for conversion of the package coordinate data to local coordinate reference frames, and subsequent use in automatic camera zoom and focus control operations carried out upon the dimensioned packages.

Another object of the present invention is to provide such a CCD camera-based tunnel-type system, wherein a LDIP subsystem within a master camera unit generates (i) package height, width, and length coordinate data and (ii) velocity data, referenced with respect to the global coordinate reference system $R_{global}$, and these package dimension data elements are transmitted to each slave camera unit on a data communication network, and once received, the camera control computer within the slave camera unit uses its preprogrammed homogeneous transformation to converts there values into package height, width, and length coordinates referenced to its local coordinate reference system.

Another object of the present invention is to provide such a CCD camera-based tunnel-type system, wherein a camera control computer in each slave camera unit uses the converted package dimension coordinates to generate real-time camera control signals which intelligently drive its camera's automatic zoom and focus imaging optics to enable the intelligent capture and processing of image data containing information relating to the identify and/or destination of the transported package.

Another object of the present invention is to provide a bioptical PLIIM-based product identification, dimensioning and analysis (PIDA) system comprising a pair of PLIIM-based package identification systems arranged within a compact POS housing having bottom and side light transmission apertures, located beneath a pair of imaging windows.

Another object of the present invention is to provide such a bioptical PLIIM-based system for capturing and analyzing color images of products and produce items, and thus enabling, in supermarket environments, "produce recognition" on the basis of color as well as dimensions and geometrical form.

Another object of the present invention is to provide such a bioptical system which comprises: a bottom PLIIM-based unit mounted within the bottom portion of the housing; a side PLIIM-based unit mounted within the side portion of the housing; an electronic product weigh scale mounted beneath the bottom PLIIM-based unit; and a local data communication network mounted within the housing, and establishing a high-speed data communication link between the bottom and side units and the electronic weigh scale.

Another object of the present invention is to provide such a bioptical PLIIM-based system, wherein each PLIIM-based subsystem employs (i) a plurality of visible laser diodes (VLDs) having different color producing wavelengths to produce a multi-spectral planar laser illumination beam (PLIB) from the side and bottom imaging windows, and also (ii) a 1-D (linear-type) CCD image detection array for capturing color images of objects (e.g. produce) as the objects are manually transported past the imaging windows of the bioptical system, along the direction of the indicator arrow, by the user or operator of the system (e.g. retail sales clerk).

Another object of the present invention is to provide such a bioptical PLIIM-based system, wherein the PLIIM-based subsystem installed within the bottom portion of the housing, projects an automatically swept PLIB and a stationary 3-D FOV through the bottom light transmission window.

Another object of the present invention is to provide such a bioptical PLIIM-based system, wherein each PLIIM-based subsystem comprises (i) a plurality of visible laser diodes (VLDs) having different color producing wavelengths to produce a multi-spectral planar laser illumination beam (PLIB) from the side and bottom imaging windows, and also (ii) a 2-D (area-type) CCD image detection array for capturing color images of objects (e.g. produce) as the objects are presented to the imaging windows of the bioptical system by the user or operator of the system (e.g. retail sales clerk).

Another object of the present invention is to provide a miniature planar laser illumination module (PLIM) on a semiconductor chip that can be fabricated by aligning and mounting a micro-sized cylindrical lens array upon a linear array of surface emit lasers (SELs) formed on a semiconductor substrate, encapsulated (i.e. encased) in a semiconductor package provided with electrical pins and a light transmission window, and emitting laser emission in the direction normal to the semiconductor substrate.

Another object of the present invention is to provide such a miniature planar laser illumination module (PLIM) on a semiconductor, wherein the laser output therefrom is a planar laser illumination beam (PLIB) composed of numerous (e.g. 100–400 or more) spatially incoherent laser beams emitted from the linear array of SELs.

Another object of the present invention is to provide such a miniature planar laser illumination module (PLIM) on a semiconductor, wherein each SEL in the laser diode array can be designed to emit coherent radiation at a different characteristic wavelengths to produce an array of laser beams which are substantially temporally and spatially incoherent with respect to each other.

Another object of the present invention is to provide such a PLIM-based semiconductor chip, which produces a temporally and spatially coherent-reduced planar laser illumination beam (PLIB) capable of illuminating objects and producing digital images having substantially reduced speckle-noise patterns observable at the image detector of the PLIIM-based system in which the PLIM is employed.

Another object of the present invention is to provide a PLIM-based semiconductor which can be made to illuminate objects outside of the visible portion of the electromagnetic spectrum (e.g. over the UV and/or IR portion of the spectrum).

Another object of the present invention is to provide a PLIM-based semiconductor chip which embodies laser mode-locking principles so that the PLIB transmitted from the chip is temporal intensity-modulated at a sufficiently high rate so as to produce ultra-short planes of light ensuring substantial levels of speckle-noise pattern reduction during object illumination and imaging applications.

Another object of the present invention is to provide a PLIM-based semiconductor chip which contains a large number of VCSELs (i.e. real laser sources) fabricated on semiconductor chip so that speckle-noise pattern levels can be substantially reduced by an amount proportional to the square root of the number of independent laser sources (real or virtual) employed therein.

Another object of the present invention is to provide such a miniature planar laser illumination module (PLIM) on a semiconductor chip which does not require any mechanical parts or components to produce a spatially and/or temporally coherence reduced PLIB during system operation.

Another object of the present invention is to provide a novel planar laser illumination and imaging module (PLIIM) realized on a semiconductor chip comprising a pair of micro-sized (diffractive or refractive) cylindrical lens arrays mounted upon a pair of linear arrays of surface emitting lasers (SELs) fabricated on opposite sides of a linear image detection array.

Another object of the present invention is to provide a PLIIM-based semiconductor chip, wherein both the linear image detection array and linear SEL arrays are formed a common semiconductor substrate, and encased within an integrated circuit package having electrical connector pins, a first and second elongated light transmission windows disposed over the SEL arrays, and a third light transmission window disposed over the linear image detection array.

Another object of the present invention is to provide such a PLIIM-based semiconductor chip, which can be mounted on a mechanically oscillating scanning element in order to sweep both the FOV and coplanar PLIB through a 3-D volume of space in which objects bearing bar code and other machine-readable indicia may pass.

Another object of the present invention is to provide a novel PLIIM-based semiconductor chip embodying a plurality of linear SEL arrays which are electronically-activated to electro-optically scan (i.e. illuminate) the entire 3-D FOV of the image detection array without using mechanical scanning mechanisms.

Another object of the present invention is to provide such a PLIIM-based semiconductor chip, wherein the miniature 2D VLD/CCD camera can be realized by fabricating a 2-D array of SEL diodes about a centrally located 2-D area-type image detection array, both on a semiconductor substrate and encapsulated within a IC package having a centrally-located light transmission window positioned over the image detection array, and a peripheral light transmission window positioned over the surrounding 2-D array of SEL diodes.

Another object of the present invention is to provide such a PLIIM-based semiconductor chip, wherein light focusing lens element is aligned with and mounted over the centrally-located light transmission window to define a 3D field of view (FOV) for forming images on the 2-D image detection array, whereas a 2-D array of cylindrical lens elements is aligned with and mounted over the peripheral light transmission window to substantially planarize the laser emission from the linear SEL arrays (comprising the 2-D SEL array) during operation.

Another object of the present invention is to provide such a PLIIM-based semiconductor chip, wherein each cylindrical lens element is spatially aligned with a row (or column) in the 2-D CCD image detection array, and each linear array of SELs in the 2-D SEL array, over which a cylindrical lens element is mounted, is electrically addressable (i.e. activatable) by laser diode control and drive circuits which can be fabricated on the same semiconductor substrate.

Another object of the present invention is to provide such a PLIIM-based semiconductor chip which enables the illumination of an object residing within the 3D FOV during illumination operations, and the formation of an image strip on the corresponding rows (or columns) of detector elements in the image detection array.

Another object of the present invention is to provide a Data Element Queuing, Handling, Processing And Linking Mechanism for integration in an Object Identification and Attribute Acquisition System, wherein a programmable data element tracking and linking (i.e. indexing) module is provided for linking (1) object identity data to (2) corresponding object attribute data (e.g. object dimension-related data, object-weight data, object-content data, object-interior data, etc.) in both singulated and non-singulated object transport environments.

Another object of the present invention is to provide a Data Element Queuing, Handling, Processing And Linking Mechanism for integration in an Object Identification and Attribute Acquisition System, wherein the Data Element Queuing, Handling, Processing And Linking Mechanism can be easily programmed to enable underlying functions required by the object detection, tracking, identification and attribute acquisition capabilities specified for the Object Identification and Attribute Acquisition System.

Another object of the present invention is to provide a Data-Element Queuing, Handling And Processing Subsystem for use in the PLIIM-based system, wherein object identity data element inputs (e.g. from a bar code symbol reader, RFID reader, or the like) and object attribute data element inputs (e.g. object dimensions, weight, x-ray analysis, neutron beam analysis, and the like) are supplied to a Data Element Queuing, Handling, Processing And Linking Mechanism contained therein via an I/O unit so as to generate as output, for each object identity data element supplied as input, a combined data element comprising an object identity data element, and one or more object attribute data elements (e.g. object dimensions, object weight, x-ray analysis, neutron beam analysis, etc.) collected by the I/O unit of the system.

Another object of the present invention is to provide a stand-alone, Object Identification And Attribute Information Tracking And Linking Computer System for use in diverse systems generating and collecting streams of object identification information and object attribute information.

Another object of the present invention is to provide such a stand-alone Object Identification And Attribute Information Tracking And Linking Computer for use at passenger and baggage screening stations alike.

Another object of the present invention is to provide such an Object Identification And Attribute Information Tracking And Linking Computer having a programmable data element queuing, handling and processing and linking subsystem, wherein each object identification data input (e.g. from a bar code reader or RFID reader) is automatically attached to each corresponding object attribute data input (e.g. object profile characteristics and dimensions, weight, X-ray images, etc.) generated in the system in which the computer is installed.

Another object of the present invention is to provide such an Object Identification And Attribute Information Tracking And Linking Computer System, realized as a compact computing/network communications device having a set of comprises: a housing of compact construction; a computing platform including a microprocessor, system bus, an associated memory architecture (e.g. hard-drive, RAM, ROM and cache memory), and operating system software, networking software, etc.; a LCD display panel mounted within the wall of the housing, and interfaced with the system bus by interface drivers; a membrane-type keypad also mounted within the wall of the housing below the LCD panel, and interfaced with the system bus by interface drivers; a network controller card operably connected to the microprocessor by way of interface drivers, for supporting high-speed data communications using any one or more networking protocols (e.g. Ethernet, Firewire, USB, etc.); a first set of data input port connectors mounted on the exterior of the housing, and configurable to receive "object identity" data from an object identification device (e.g. a bar code reader and/or an RFID reader) using a networking protocol such as Ethernet; a second set of the data input port connectors mounted on the exterior of the housing, and configurable to receive "object attribute" data from external data generating sources (e.g. an LDIP Subsystem, a PLIIM-based imager, an x-ray scanner, a neutron beam scanner, MRI scanner and/or a QRA scanner) using a networking protocol such as Ethernet; a network connection port for establishing a network connection between the network controller and the communication medium to which the Object Identification And Attribute Information Tracking And Linking Computer System is connected; data element queuing, handling, processing and linking software stored of the hard-drive, for enabling the automatic queuing, handling, processing, linking and transporting of object identification (ID) and object attribute data elements generated within the network and/or system, to a designated database for storage and subsequent analysis; and a networking hub (e.g. Ethernet hub) operably connected to the first and second sets of data input port connectors, the network connection port, and also the network controller card, so that all networking devices connected through the networking hub can send and receive data packets and support high-speed digital data communications.

Another object of the present invention is to provide such an Object Identification And Attribute Information Tracking And Linking Computer which can be programmed to receive two different streams of data input, namely: (i) passenger identification data input (e.g. from a bar code reader or RFID reader) used at the passenger check-in and screening station; and (ii) corresponding passenger attribute data input (e.g. passenger profile characteristics and dimensions, weight, X-ray images, etc.) generated at the passenger check-in and screening station, and wherein each passenger attribute data input is automatically attached to each corresponding passenger identification data element input, so as to produce a composite linked output data element comprising the passenger identification data element symbolically linked to corresponding passenger attribute data elements received at the system.

Another object of the present invention is to provide a Data Element Queuing, Handling, Processing And Linking Mechanism which automatically receives object identity data element inputs (e.g. from a bar code symbol reader, RFID-tag reader, or the like) and object attribute data element inputs (e.g. object dimensions, object weight, x-ray images, Pulsed Fast Neutron Analysis (PFNA) image data captured by a PFNA scanner by Ancore, and QRA image data captured by a QRA scanner by Quantum Magnetics, Inc.), and automatically generates as output, for each object identity data element supplied as input, a combined data element comprising (i) an object identity data element, and (ii) one or more object attribute data elements (e.g. object dimensions, object weight, x-ray analysis, neutron beam analysis, etc.) collected and supplied to the data element queuing, handling and processing subsystem.

Another object of the present invention is to provide a software-based system configuration manager (i.e. system configuration "wizard" program) which can be integrated (i) within the Object Identification And Attribute Acquisition Subsystem of the present invention, as well as (ii) within the Stand-Alone Object Identification And Attribute Information Tracking And Linking Computer System of the present invention.

Another object of the present invention is to provide such a system configuration manager, which assists the system engineer or technician in simply and quickly configuring and setting-up an Object Identity And Attribute Information Acquisition System, as well as a Stand-Alone Object Identification And Attribute Information Tracking And Linking Computer System, using a novel graphical-based application programming interface (API).

Another object of the present invention is to provide such a system configuration manager, wherein its API enables a systems configuration engineer or technician having minimal programming skill to simply and quickly perform the following tasks: (1) specify the object detection, tracking, identification and attribute acquisition capabilities (i.e. functionalities) which the system or network being designed and configured should possess; (2) determine the configuration of hardware components required to build the configured system or network; and (3) determine the configuration of software components required to build the configured system or network, so that it will possess the object detection, tracking, identification, and attribute-acquisition capabilities.

Another object of the present invention is to provide a system and method for configuring an object identification and attribute acquisition system of the present invention for use in a PLIIM-based system or network, wherein the method employs a graphical user interface (GUI) which presents queries about the various object detection, tracking, identification and attribute-acquisition capabilities to be imparted to the PLIIM-based system during system configuration, and wherein the answers to the queries are used to assist in the specification of particular capabilities of the Data Element Queuing, Handling and Processing Subsystem during system configuration process.

Another object of the present invention is to provide an Internet-based remote monitoring, configuration and service (RMCS) system and method which is capable of monitoring, configuring and servicing PLIIM-based networks, systems and subsystems of the present invention using any Internet-based client computing subsystem.

Another object of the present invention is to provide an Internet-based remote monitoring, configuration and service (RMCS) system and associated method which enables a systems or network engineer or service technician to use any Internet-enabled client computing machine to remotely monitor, configure and/or service any PLIIM-based network, system or subsystem of the present invention in a time-efficient and cost-effective manner.

Another object of the present invention is to provide such an RMCS system and method, which enables an engineer, service technician or network manager, while remotely situated from the system or network installation requiring service, to use any Internet-enabled client machine to: (1) monitor a robust set of network, system and subsystem parameters associated with any tunnel-based network installation (i.e. linked to the Internet through an ISP or NSP); (2) analyze these parameters to trouble-shoot and diagnose performance failures of networks, systems and/or subsystems performing object identification and attribute acquisition functions; (3) reconfigure and/or tune some of these parameters to improve network, system and/or subsystem performance; (4) make remote service calls and repairs where possible over the Internet; and (5) instruct local service technicians on how to repair and service networks, systems and/or subsystems performing object identification and attribute acquisition functions.

Another object of the present invention is to provide such an Internet-based RMCS system and method, wherein the simple network management protocol (SNMP) is used to enable network management and communication between (i) SNMP agents, which are built into each node (i.e. object identification and attribute acquisition system) in the PLIIM-based network, and (ii) SNMP managers, which can be built into a LAN http/Servlet Server as well as any Internet-enabled client computing machine functioning as the network management station (NMS) or management console.

Another object of the present invention is to provide an Internet-based remote monitoring, configuration and service (RMCS) system and associated method, wherein servlets in an HTML-encoded RMCS management console are used to trigger SNMP agent operations within devices managed within a tunnel-based LAN.

Another object of the present invention is to provide an Internet-based remote monitoring, configuration and service (RMCS) system and associated method, wherein a servlet embedded in the RMCS management console can simultaneously invoke multiple methods on the server side of the network, to monitor (i.e. read) particular variables (e.g. parameters) in each object identification and attribute acquisition subsystem, and then process these monitored parameters for subsequent storage in a central MIB in the and/or display.

Another object of the present invention is to provide an Internet-based remote monitoring, configuration and service (RMCS) system and associated method, wherein a servlet embedded in the RMCS management console can invoke a method on the server side of the network, to control (i.e. write) particular variables (e.g. parameters) in a particular device being managed within the tunnel-based LAN.

Another object of the present invention is to provide an Internet-based remote monitoring, configuration and service (RMCS) system and associated method, wherein a servlet embedded in the RMCS management console can invoke a method on the server side of the network, to control (i.e. write) particular variables (e.g. parameters) in a particular device being managed within the tunnel-based LAN.

Another object of the present invention is to provide an Internet-based remote monitoring, configuration and service (RMCS) system and associated method, wherein a servlet embedded in the RMCS management console can invoke a method on the server side of the network, to determine which variables a managed device supports and to sequentially gather information from variable tables for processing and storage in a central MIB in database.

Another object of the present invention is to provide an Internet-based remote monitoring, configuration and service (RMCS) system and associated method, wherein a servlet embedded in the RMCS management console can invoke a method on the server side of the network, to detect and asynchronously report certain events to the RCMS management console.

Another object of the present invention is to provide a PLIIM-based object identification and attribute acquisition system, in which FTP service is provided to enable the uploading of system and application software from an FTP site, as well as downloading of diagnostic error tables maintained in a central management information database.

Another object of the present invention is to provide a PLIIM-based object identification and attribute acquisition system, in which SMTP service is provided to system to issue an outgoing-mail message to a remote service technician.

Another object of the present invention is to provide a novel methods of and systems for securing airports, bus terminals, ocean piers, and like passenger transportation terminals employing co-indexed passenger and baggage attribute information and post-collection information processing techniques.

Another object of the present invention is to provide novel methods of and systems for securing commercial/industrial facilities, educational environments, financial institutions, gaming centers and casinos, hospitality environments, retail environments, and sport stadiums.

Another object of the present invention is to provide novel methods of and systems for providing loss prevention, secured access to physical spaces, security checkpoint validation, baggage and package control, boarding verification, student identification, time/attendance verification, and turnstile traffic monitoring.

Another object of the present invention is to provide an improved airport security screening method, wherein streams of baggage identification information and baggage attribute information are automatically generated at the baggage screening subsystem thereof, and each baggage attribute data is automatically attached to each corresponding baggage identification data element, so as to produce a composite linked data element comprising the baggage identification data element symbolically linked to corresponding baggage attribute data element(s) received at the system, and wherein the composite linked data element is transported to a database for storage and subsequent processing, or directly to a data processor for immediate processing.

Another object of the present invention is to provide an improved airport security system comprising (i) a passenger screening station or subsystem including a PLIIM-based passenger facial and body profiling identification subsystem, a hand-held PLIIM-based imager, and a data element queuing, handling and processing (i.e. linking) computer, (ii) a baggage screening subsystem including a PLIIM-based object identification and attribute acquisition subsystem, a x-ray scanning subsystem, and a neutron-beam explosive detection subsystems (EDS), (iii) a Passenger and Baggage Attribute Relational Database Management Subsystems (RDBMS) for storing co-indexed passenger identity and baggage attribute data elements (i.e. information files), and (iv) automated data processing subsystems for operating on co-indexed passenger and baggage data elements (i.e. information files) stored therein, for the purpose of detecting breaches of security during and after passengers and baggage are checked into an airport terminal system.

Another object of the present invention is to provide a PLIIM-based (and/or LDIP-based) passenger biometric identification subsystem employing facial and 3-D body profiling/recognition techniques.

Another object of the present invention is to provide an x-ray parcel scanning-tunnel system, wherein the interior space of packages, parcels, baggage or the like, are automatically inspected by x-radiation beams to produce x-ray images which are automatically linked to object identity information by the object identity and attribute acquisition subsystem embodied within the x-ray parcel scanning-tunnel system.

Another object of the present invention is to provide a Pulsed Fast Neutron Analysis (PFNA) parcel scanning-tunnel system, wherein the interior space of packages, parcels, baggage or the like, are automatically inspected by neutron-beams to produce neutron-beam images which are automatically linked to object identity information by the object identity and attribute acquisition subsystem embodied within the PFNA parcel scanning-tunnel system.

Another object of the present invention is to provide a Quadrupole Resonance (QR) parcel scanning-tunnel system, wherein the interior space of packages, parcels, baggage or the like, are automatically inspected by low-intensity electromagnetic radio waves to produce digital images which are automatically linked to object identity information by the object identity and attribute acquisition subsystem embodied within the PLIIM-equipped QR parcel scanning-tunnel system.

Another object of the present invention is to provide a x-ray cargo scanning-tunnel system, wherein the interior space of cargo containers, transported by tractor trailer, rail, or other by other means, are automatically inspected by x-radiation energy beams to produce x-ray images which are automatically linked to cargo container identity information by the object identity and attribute acquisition subsystem embodied within the system.

Another object of the present invention is to provide a "horizontal-type" 3-D PLIIM-based CAT scanning system capable of producing 3-D geometrical models of human beings, animals, and other objects, for viewing on a computer graphics workstation, wherein a single planar laser illumination beam (PLIB) and a single amplitude modulated (AM) laser scanning beam are controllably transported horizontally through the 3-D scanning volume disposed above the support platform of the system so as to optically scan the object under analysis and capture linear images and range-profile maps thereof relative to a global coordinate reference system, for subsequent reconstruction in the computer workstation using computer-assisted tomographic (CAT) techniques to generate a 3-D geometrical model of the object.

Another object of the present invention is to provide a "horizontal-type" 3-D PLIIM-based CAT scanning system capable of producing 3-D geometrical models of human beings, animals, and other objects, for viewing on a computer graphics workstation, wherein a three orthogonal planar laser illumination beams (PLIBs) and three orthogonal amplitude modulated (AM) laser scanning beams are controllably transported horizontally through the 3-D scanning volume disposed above the support platform of the system so as to optically scan the object under analysis and capture linear images and range-profile maps thereof relative to a global coordinate reference system, for subsequent reconstruction in the computer workstation using computer-assisted tomographic (CAT) techniques to generate a 3-D geometrical model of the object.

Another object of the present invention is to provide a "vertical-type" 3-D PLIIM-based CAT scanning system capable of producing 3-D geometrical models of human beings, animals, and other objects, for viewing on a computer graphics workstation, wherein a three orthogonal planar laser illumination beams (PLIBs) and three orthogonal amplitude modulated (AM) laser scanning beams are controllably transported vertically through the 3-D scanning volume disposed above the support platform of the system so as to optically scan the object under analysis and capture linear images and range-profile maps thereof relative to a global coordinate reference system, for subsequent reconstruction in the computer workstation using computer-assisted tomographic (CAT) techniques to generate a 3-D geometrical model of the object.

Another object of the present invention is to provide a hand-supportable mobile-type PLIIM-based 3-D digitization device capable of producing 3-D digital data models and 3-D geometrical models of laser scanned objects, for display and viewing on a LCD view finder integrated with the housing (or on the display panel of a computer graphics workstation), wherein a single planar laser illumination beam (PLIB) and a single amplitude modulated (AM) laser scanning beam are transported through the 3-D scanning volume of the scanning device so as to optically scan the object under analysis and capture linear images and range-profile maps thereof relative to a coordinate reference system symbolically embodied within the scanning device, for subsequent reconstruction therein using computer-assisted tomographic (CAT) techniques to generate a 3-D geometrical model of the object for display, viewing and use in diverse applications.

Another object of the present invention is to provide a transportable PLIIM-based 3-D digitization device ("3-D digitizer") capable of producing 3-D digitized data models of scanned objects, for viewing on a LCD view finder integrated with the device housing (or on the display panel of an external computer graphics workstation), wherein the object under analysis is controllably rotated through a single planar laser illumination beam (PLIB) and a single amplitude modulated (AM) laser scanning beam generated by the 3-D digitization device so as to optically scan the object and automatically capture linear images and range-profile maps thereof relative to a cordite reference system symbolically embodied within the 3-D digitization device, for subsequent reconstruction therein using computer-assisted tomographic (CAT) techniques to generate a 3-D digitized data model of the object for display, viewing and use in diverse applications.

Another object of the present invention is to provide a transportable PLIIM-based 3-D digitizer having optically-isolated light transmission windows for transmitting laser beams from a PLIIM-based object identification subsystem and an LDIP-based object detection and profiling/dimensioning subsystem embodied within the transportable housing of the 3-D digitizer.

Another object of the present invention is to provide a transportable PLIIM-based 3-D digitization device ("3-D digitizer") capable of producing 3-D digitized data models of scanned objects, for viewing on a LCD view finder integrated with the device housing (or on the display panel of an external computer graphics workstation), wherein a single planar laser illumination beam (PLIB) and a single amplitude modulated (AM) laser scanning beam are generated by the 3-D digitization device and automatically swept through the 3-D scanning volume in which the object under analysis resides so as to optically scan the object and automatically capture linear images and range-profile maps thereof relative to a coordinate reference system symbolically embodied within the 3-D digitization device, for subsequent reconstruction therein using computer-assisted tomographic (CAT) techniques to generate a 3-D digitized data model of the object for display, viewing and use in diverse applications.

Another object of the present invention is to provide an automatic vehicle identification (AVI) system constructed using a pair of PLIIM-based imaging and profiling subsystems taught herein.

Another object of the present invention is to provide an automatic vehicle identification (AVI) system constructed using only a single PLIIM-based imaging and profiling subsystem taught herein, and an electronically-switchable PLIB/FOV direction module attached to the PLIIM-based imaging and profiling subsystem.

Another object of the present invention is to provide an automatic vehicle classification (AVC) system constructed using a several PLIIM-based imaging and profiling subsystems taught herein, mounted overhead and laterally along the roadway passing through the AVC system.

Another object of the present invention is to provide an automatic vehicle identification and classification (AVIC) system constructed using PLIIM-based imaging and profiling subsystems taught herein.

Another object of the present invention is to provide a PLIIM-based object identification and attribute acquisition system of the present invention, in which a high-intensity ultra-violet germicide irradiator (UVGI) unit is mounted for irradiating germs and other microbial agents, including viruses, bacterial spores and the like, while parcels, mail and other objects are being automatically identified by bar code reading and/or image lift and OCR processing by the system.

As will be described in greater detail in the Detailed Description of the Illustrative Embodiments set forth below, such objectives are achieved in novel methods of and systems for illuminating objects (e.g. bar coded packages, textual materials, graphical indicia, etc.) using planar laser illumination beams (PLIBs) having substantially-planar spatial distribution characteristics that extend through the field of view (FOV) of image formation and detection modules (e.g. realized within a CCD-type digital electronic camera, or a 35 mm optical-film photographic camera) employed in such systems.

In the illustrative embodiments of the present invention, the substantially planar light illumination beams are preferably produced from a planar laser illumination beam array (PLIA) comprising a plurality of planar laser illumination modules (PLIMs). Each PLIM comprises a visible laser diode (VLD), a focusing lens, and a cylindrical optical element arranged therewith. The individual planar laser illumination beam components produced from each PLIM are optically combined within the PLIA to produce a composite substantially planar laser illumination beam having substantially uniform power density characteristics over the entire spatial extent thereof and thus the working range of the system, in which the PLIA is embodied.

Preferably, each planar laser illumination beam component is focused so that the minimum beam width thereof occurs at a point or plane which is the farthest or maximum object distance at which the system is designed to acquire images. In the case of both fixed and variable focal length imaging systems, this inventive principle helps compensate for decreases in the power density of the incident planar laser illumination beam due to the fact that the width of the planar laser illumination beam increases in length for increasing object distances away from the imaging subsystem.

By virtue of the novel principles of the present invention, it is now possible to use both VLDs and high-speed electronic (e.g. CCD or CMOS) image detectors in conveyor, hand-held, presentation, and hold-under type imaging applications alike, enjoying the advantages and benefits that each such technology has to offer, while avoiding the shortcomings and drawbacks hitherto associated therewith.

These and other objects of the present invention will become apparent hereinafter and in the claims to Invention.

BRIEF DESCRIPTION OF THE DRAWINGS

For a more complete understanding of the present invention, the following Detailed Description of the Illustrative Embodiment should be read in conjunction with the accompanying Drawings, wherein:

FIG. 1B1 is a schematic representation of the first illustrative embodiment of the PLIIM-based system of the present invention shown in FIG. 1A, wherein the field of view of the image formation and detection (IFD) module is folded in the downwardly imaging direction by the field of view folding mirror so that both the folded field of view and resulting stationary planar laser illumination beams produced by the planar illumination arrays are arranged in a substantially coplanar relationship during object illumination and image detection operations;

FIG. 1B2 is a schematic representation of the PLIIM-based system shown in FIG. 1A, wherein the linear image formation and detection module is shown comprising a linear array of photo-electronic detectors realized using CCD technology, each planar laser illumination array is shown comprising an array of planar laser illumination modules;

FIG. 1B3 is an enlarged view of a portion of the planar laser illumination beam (PLIB) and magnified field of view (FOV) projected onto an object during conveyor-type illumination and imaging applications shown in FIG. 1B1, illustrating that the height dimension of the PLIB is substantially greater than the height dimension of the magnified field of view (FOV) of each image detection element in the linear CCD image detection array so as to decrease the range of tolerance that must be maintained between the PLIB and the FOV;

FIG. 1B4 is a schematic representation of an illustrative embodiment of a planar laser illumination array (PLIA), wherein each PLIM mounted therealong can be adjustably tilted about the optical axis of the VLD, a few degrees measured from the horizontal plane;

FIG. 1B5 is a schematic representation of a PLIM mounted along the PLIA shown in FIG. 1B4, illustrating that each VLD block can be adjustably pitched forward for alignment with other VLD beams produced from the PLIA;

FIG. 1C is a schematic representation of a first illustrative embodiment of a single-VLD planar laser illumination module (PLIM) used to construct each planar laser illumination array shown in FIG. 1B. wherein the planar laser illumination beam emanates substantially within a single plane along the direction of beam propagation towards an object to be optically illuminated;

FIG. 1D is a schematic diagram of the planar laser illumination module of FIG. 1C, shown comprising a visible laser diode (VLD), a light collimating focusing lens, and a cylindrical-type lens element configured together to produce a beam of planar laser illumination;

FIG. 1E1 is a plan view of the VLD, collimating lens and cylindrical lens assembly employed in the planar laser illumination module of FIG. 1C, showing that the focused laser beam from the collimating lens is directed on the input side of the cylindrical lens, and the output beam produced therefrom is a planar laser illumination beam expanded (i.e. spread out) along the plane of propagation;

FIG. 1E2 is an elevated side view of the VLD, collimating focusing lens and cylindrical lens assembly employed in the planar laser illumination module of FIG. 1C, showing that the laser beam is transmitted through the cylindrical lens without expansion in the direction normal to the plane of propagation, but is focused by the collimating focusing lens at a point residing within a plane located at the farthest object distance supported by the PLIIM system;

FIG. 1G1 is a schematic representation of an exemplary realization of the PLIIM-based system of FIG. 1A, shown comprising a linear image formation and detection (IFD) module, a pair of planar laser illumination arrays, and a field of view (FOV) folding mirror for folding the fixed field of view of the linear image formation and detection module in a direction that is coplanar with the plane of laser illumination beams produced by the planar laser illumination arrays;

FIG. 1G2 is a plan view schematic representation of the PLIIM-based system of FIG. 1G1, taken along line 1G2—1G2 therein, showing the spatial extent of the fixed field of view of the linear image formation and detection module in the illustrative embodiment of the present invention;

FIG. 1G3 is an elevated end view schematic representation of the PLIIM-based system of FIG. 1G1, taken along line 1G3—1G3 therein, showing the fixed field of view of the linear image formation and detection module being folded in the downwardly imaging direction by the field of view folding mirror, the planar laser illumination beam produced by each planar laser illumination module being directed in the imaging direction such that both the folded field of view and planar laser illumination beams are arranged in a substantially coplanar relationship during object illumination and image detection operations;

FIG. 1G4 is an elevated side view schematic representation of the PLIIM-based system of FIG. 1G1, taken along line 1G4—1G4 therein, showing the field of view of the image formation and detection module being folded in the downwardly imaging direction by the field of view folding mirror, and the planar laser illumination beam produced by each planar laser illumination module being directed alone the imaging direction such that both the folded field of view and stationary planar laser illumination beams are arranged in a substantially coplanar relationship during object illumination and image detection operations;

FIG. 1G5 is an elevated side view of the PLIIM-based system of FIG. 1G1, showing the spatial limits of the fixed field of view (FOV) of the image formation and detection module when set to image the tallest packages moving on a conveyor belt structure, as well as the spatial limits of the fixed FOV of the image formation and detection module when set to image objects having height values close to the surface height of the conveyor belt structure;

FIG. 1G6 is a perspective view of a first type of light shield which can be used in the PLIIM-based system of FIG. 1G1, to visually block portions of planar laser illumination beams which extend beyond the scanning field of the system, and could pose a health risk to humans if viewed thereby during system operation;

FIG. 1G7 is a perspective view of a second type of light shield which can be used in the PLIIM-based system of FIG. 1G1, to visually block portions of planar laser illumination beams which extend beyond the scanning field of the system, and could pose a health risk to humans if viewed thereby during system operation;

FIG. 1G8 is a perspective view of one planar laser illumination array (PLIA) employed in the PLIIM-based system of FIG. 1G1, showing an array of visible laser diodes (VLDs), each mounted within a VLD mounting block, wherein a focusing lens is mounted and on the end of which there is a v-shaped notch or recess, within which a cylindrical lens element is mounted, and wherein each such VLD mounting block is mounted on an L-bracket for mounting within the housing of the PLIIM-based system;

FIG. 1G9 is an elevated end view of one planar laser illumination array (PLIA) employed in the PLIIM-based system of FIG. 1G1, taken along line 1G9—1G9 thereof;

FIG. 1G10 is an elevated side view of one planar laser illumination array (PLIA) employed in the PLIIM-based system of FIG. 1G1, taken along line 1G10—1G10 therein, showing a visible laser diode (VLD) and a focusing lens mounted within a VLD mounting block, and a cylindrical lens element mounted at the end of the VLD mounting block, so that the central axis of the cylindrical lens element is substantially perpendicular to the optical axis of the focusing lens;

FIG. 1G11 is an elevated side view of one of the VLD mounting blocks employed in the PLIIM-based system of FIG. 1G1, taken along a viewing direction which is orthogonal to the central axis of the cylindrical lens element mounted to the end portion of the VLD mounting block;

FIG. 1G12 is an elevated plan view of one of VLD mounting blocks employed in the PLIIM-based system of FIG. 1G1, taken along a viewing direction which is parallel to the central axis of the cylindrical lens element mounted to the VLD mounting block;

FIG. 1G13 is an elevated side view of the collimating lens element installed within each VLD mounting block employed in the PLIIM-based system of FIG. 1G1;

FIG. 1G14 is an axial view of the collimating lens element installed within each VLD mounting block employed in the PLIIM-based system of FIG. 1G1;

FIG. 1G15A is an elevated plan view of one of planar laser illumination modules (PLIMs) employed in the PLIIM-based system of FIG. 1G1, taken along a viewing direction which is parallel to the central axis of the cylindrical lens element mounted in the VLD mounting block thereof, showing that the cylindrical lens element expands (i.e. spreads out) the laser beam along the direction of beam propagation so that a substantially planar laser illumination beam is produced, which is characterized by a plane of propagation that is coplanar with the direction of beam propagation;

FIG. 1G15B is an elevated plan view of one of the PLIMs employed in the PLIIM-based system of FIG. 1G1, taken along a viewing direction which is perpendicular to the central axis of the cylindrical lens element mounted within the axial bore of the VLD mounting block thereof, showing that the focusing lens planar focuses the laser beam to its minimum beam width at a point which is the farthest distance at which the system is designed to capture images, while the cylindrical lens element does not expand or spread out the laser beam in the direction normal to the plane of propagation of the planar laser illumination beam;

FIG. 1G16A is a perspective view of a second illustrative embodiment of the PLIM of the present invention, wherein a first illustrative embodiment of a Powell-type linear diverging lens is used to produce the planar laser illumination beam (PLIB) therefrom;

FIG. 1G16B is a perspective view of a third illustrative embodiment of the PLIM of the present invention, wherein a generalized embodiment of a Powell-type linear diverging lens is used to produce the planar laser illumination beam (PLIB) therefrom;

FIG. 1G17A is a perspective view of a fourth illustrative embodiment of the PLIM of the present invention, wherein a visible laser diode (VLD) and a pair of small cylindrical lenses are all mounted within a lens barrel permitting independent adjustment of these optical components along translational and rotational directions, thereby enabling the generation of a substantially planar laser beam (PLIB) therefrom, wherein the first cylindrical lens is a PCX-type lens having a plano (i.e. flat) surface and one outwardly cylindrical surface with a positive focal length and its base and the edges cut according to a circular profile for focusing the laser beam, and the second cylindrical lens is a PCV-type lens having a plano (i.e. flat) surface and one inward cylindrical surface having a negative focal length and its base and edges cut according to a circular profile, for use in spreading (i.e. diverging or planarizing) the laser beam;

FIG. 1G17B is a cross-sectional view of the PLIM shown in FIG. 1G17A illustrating that the PCX lens is capable of undergoing translation in the x direction for focusing;

FIG. 1G17C is a cross-sectional view of the PLIM shown in FIG. 1G17A illustrating that the PCX lens is capable of undergoing rotation about the x axis to ensure that it only effects the beam along one axis;

FIG. 1G17D is a cross-sectional view of the PLIM shown in FIG. 1G17A illustrating that the PCV lens is capable of undergoing rotation about the x axis to ensure that it only effects the beam along one axis;

FIG. 1G17E is a cross-sectional view of the PLIM shown in FIG. 1G17A illustrating that the VLD requires rotation about the y axis for aiming purposes;

FIG. 1G17F is a cross-sectional view of the PLIM shown in FIG. 1G17A illustrating that the VLD requires rotation about the x axis for desmiling purposes;

FIG. 1H1 is a geometrical optics model for the imaging subsystem employed in the linear-type image formation and detection module in the PLIIM system of the first generalized embodiment shown in FIG. 1A;

FIG. 1H2 is a geometrical optics model for the imaging subsystem and linear image detection array employed in the linear-type image detection array of the image formation and detection module in the PLIIM system of the first generalized embodiment shown in FIG. 1A;

FIG. 1H3 is a graph, based on thin lens analysis, showing that the image distance at which light is focused through a thin lens is a function of the object distance at which the light originates;

FIG. 1H4 is a schematic representation of an imaging subsystem having a variable focal distance lens assembly, wherein a group of lens can be controllably moved along the optical axis of the subsystem, and having the effect of changing the image distance to compensate for a change in object distance, allowing the image detector to remain in place;

FIG. 1H5 is schematic representation of a variable focal length (zoom) imaging subsystem which is capable of changing its focal length over a given range, so that a longer focal length produces a smaller field of view at a given object distance;

FIG. 1H6 is a schematic representation illustrating (i) the projection of a CCD image detection element (i.e. pixel) onto the object plane of the image formation and detection (IFD) module (i.e. camera subsystem) employed in the PLIIM systems of the present invention, and (ii) various optical parameters used to model the camera subsystem;

FIG. 1I1 is a schematic representation of the PLIIM system of FIG. 1A embodying a first generalized method of reducing the RMS power of observable speckle-noise patterns, wherein the planar laser illumination beam (PLIB) produced from the PLIIM system is spatial phase modulated along its wavefront according to a spatial phase modulation function (SIMF) prior to object illumination, so that the object (e.g. package) is illuminated with a spatially coherent-reduced planar laser beam and, as a result, numerous substantially different time-varying speckle-noise patterns are produced and detected over the photo-integration time period of the image detection array, thereby allowing the speckle-noise patterns to be temporally and spatially averaged over the photo-integration time over the image detection elements and the RMS power of the observable speckle-noise pattern reduced at the image detection array;

FIG. 1I2A is a schematic representation of the PLIM system of FIG. 1I1, illustrating the first generalized speckle-noise pattern reduction method of the present invention applied to the planar laser illumination array (PLIA) employed therein, wherein numerous substantially different speckle-noise patterns are produced at the image detection array during the photo-integration time period thereof using spatial phase modulation techniques to modulate the phase along the wavefront of the PLIB, and temporally and spatially averaged at the image detection array during the photo-integration time period thereof, thereby reducing the RMS power of speckle-noise patterns observed at the image detection array;

FIG. 1I2B is a high-level flow chart setting forth the primary steps involved in practicing the first generalized method of reducing the RMS power of observable speckle-noise patterns in PLIIM-based Systems, illustrated in FIGS. 1I1 and 1I2A;

FIG. 1I3A is a perspective view of an optical assembly comprising a planar laser illumination array (PLIA) with a pair of refractive-type cylindrical lens arrays, and an electronically-controlled mechanism for micro-oscillating the cylindrical lens arrays using two pairs of ultrasonic transducers arranged in a push-pull configuration so that transmitted planar laser illumination beam (PLIB) is spatial phase modulated along its wavefront producing numerous (i.e. many) substantially different time-varying speckle-noise patterns at the image detection array of the IFD Subsystem during the photo-integration time period thereof, and enabling numerous time-varying speckle-noise patterns produced at the image detection array to be temporally and/or spatially averaged during the photo-integration time period thereof, thereby reducing the speckle-noise patterns observed at the image detection array;

FIG. 1I3B is a perspective view of the pair of refractive-type cylindrical lens arrays employed in the optical assembly shown in FIG. 1I3A;

FIG. 1I3C is a perspective view of the dual array support frame employed in the optical assembly shown in FIG. 1I3A;

FIG. 1I3D is a schematic representation of the dual refractive-type cylindrical lens array structure employed in FIG. 1I3A, shown configured between two pairs of ultrasonic transducers (or flexural elements driven by voice-coil type devices) operated in a push-pull mode of operation, so that at least one cylindrical lens array is constantly moving when the other array is momentarily stationary during lens array direction reversal;

FIG. 1I3E is a geometrical model of a subsection of the optical assembly shown in FIG. 1I3A, illustrating the first order parameters involved in the PLIB spatial phase modulation process, which are required for there to be a difference in phase along wavefront of the PLIB so that each speckle-noise pattern viewed by a pair of cylindrical lens elements in the imaging optics becomes uncorrelated with respect to the original speckle-noise pattern;

FIG. 1I3F is a pictorial representation of a string of numbers imaged by the PLIIM-based system of the present invention without the use of the first generalized speckle-noise reduction techniques of the present invention;

FIG. 1I3G is a pictorial representation of the same string of numbers (shown in FIG. 1G13B1) imaged by the PLIIM-based system of the present invention using the first generalized speckle-noise reduction technique of the present invention, and showing a significant reduction in speckle-noise patterns observed in digital images captured by the electronic image detection array employed in the PLIIM-based system of the present invention provided with the apparatus of FIG. 1I3A;

FIG. 1I4A is a perspective view of an optical assembly comprising a pair of (holographically-fabricated) diffractive-type cylindrical lens arrays, and an electronically-controlled mechanism for micro-oscillating a pair of cylindrical lens arrays using a pair of ultrasonic transducers arranged in a push-pull configuration so that the composite planar laser illumination beam is spatial phase modulated along its wavefront, producing numerous substantially different time-varying speckle-noise patterns at the image detection array of the IFD Subsystem during the photo-integration time period thereof, so that the numerous time-varying speckle-noise patterns produced at the image detection array can be temporally and spatially averaged during the photo-integration time period thereof, thereby reducing the speckle-noise patterns observed at the image detection array;

FIG. 1I4B is a perspective view of the refractive-type cylindrical lens arrays employed in the optical assembly shown in FIG. 1I4A;

FIG. 1I4C is a perspective view of the dual array support frame employed in the optical assembly shown in FIG. 1I4A;

FIG. 1I4D is a schematic representation of the dual refractive-type cylindrical lens array structure employed in FIG. 1I4A, shown configured between a pair of ultrasonic transducers (or flexural elements driven by voice-coil type devices) operated in a push-pull mode of operation;

FIG. 1I5A is a perspective view of an optical assembly comprising a PLIA with a stationary refractive-type cylindrical lens array, and an electronically-controlled mechanism for micro-oscillating a pair of reflective-elements pivotally connected to each other at a common pivot point, relative to a stationary reflective element (e.g. mirror element) and the stationary refractive-type cylindrical lens array so that the transmitted PLIB is spatial phase modulated along its wavefront, producing numerous substantially different time-varying speckle-noise patterns produced at the image detection array of the IFD Subsystem during the photo-integration time period thereof, so that the numerous time-varying speckle-noise patterns produced at the image detection array can be temporally and spatially averaged during the photo-integration time period thereof, thereby reducing the speckle-noise patterns observed at the image detection array;

FIG. 1I5B is a enlarged perspective view of the pair of micro-oscillating reflective elements employed in the optical assembly shown in FIG. 1I5A;

FIG. 1I5C is a schematic representation, taken along an elevated side view of the optical assembly shown in FIG. 1I5A, showing the optical path which the laser illumination beam produced thereby travels towards the target object to be illuminated;

FIG. 1I5D is a schematic representation of one micro-oscillating reflective element in the pair employed in FIG. 1I5D, shown configured between a pair of ultrasonic transducers operated in a push-pull mode of operation, so as to undergo micro-oscillation;

FIG. 1I6A is a perspective view of an optical assembly comprising a PLIA with refractive-type cylindrical lens array, and an electro-acoustically controlled PLIB micro-oscillation mechanism realized by an acousto-optical (i.e. Bragg Cell) beam deflection device, through which the planar laser illumination beam (PLIB) from each PLIM is transmitted and spatial phase modulated along its wavefront, in response to acoustical signals propagating through the electro-acoustical device, causing each PLIB to be micro-oscillated (i.e. repeatedly deflected) and producing numerous substantially different time-varying speckle-noise patterns at the image detection array of the IFD Subsystem during the photo-integration time period thereof, which are temporally and spatially averaged during the photo-integration time period thereof, thereby reducing the RMS power of speckle-noise patterns observed at the image detection array;

FIG. 1I6B is a schematic representation, taken along the cross-section of the optical assembly shown in FIG. 1I6A, showing the optical path which each laser beam within the PLIM travels on its way towards a target object to be illuminated;

FIG. 1I7A is a perspective view of an optical assembly comprising a PLIA with a stationary cylindrical lens array, and an electronically-controlled PLIB micro-oscillation mechanism realized by a piezo-electrically driven deformable mirror (DM) structure and a stationary beam folding mirror are arranged in front of the stationary cylindrical lens array (e.g. realized refractive, diffractive and/or reflective principles), wherein the surface of the DM structure is periodically deformed at frequencies in the 100 kHz range and at few microns amplitude causing the reflective surface thereof to exhibit moving ripples aligned along the direction that is perpendicular to planar extent of the PLIB (i.e. along laser beam spread) so that the transmitted PLIB is spatial phase modulated along its wavefront, producing numerous substantially different time-varying speckle-noise patterns at the image detection array of the IFD Subsystem during the photo-integration time period thereof, which are temporally and spatially averaged during the photo-integration time period thereof, thereby reducing the RMS power of speckle-noise patterns observed at the image detection array;

FIG. 1I7B is an enlarged perspective view of the stationary beam folding mirror structure employed in the optical assembly shown in FIG. 1I7A;

FIG. 1I7C is a schematic representation, taken along an elevated side view of the optical assembly shown in FIG. 1I7A, showing the optical path which the laser illumination beam produced thereby travels towards the target object to be illuminated while undergoing phase modulation by the piezo-electrically driven deformable mirror structure;

FIG. 1I8A is a perspective view of an optical assembly comprising a PLIA with a stationary refractive-type cylindrical lens array, and a PLIB micro-oscillation mechanism realized by a refractive-type phase-modulation disc that is rotated about its axis through the composite planar laser illumination beam so that the transmitted PLIB is spatial phase modulated along its wavefront as it is transmitted through the phase modulation disc, producing numerous substantially different time-varying speckle-noise patterns at the image detection array during the photo-integration time period thereof, which are temporally and spatially averaged during the photo-integration time period thereof, thereby reducing the RMS power of speckle-noise patterns observed at the image detection array;

FIG. 1I8B is an elevated side view of the refractive-type phase-modulation disc employed in the optical assembly shown in FIG. 1I8A;

FIG. 1I8C is a plan view of the optical assembly shown in FIG. 1I8A, showing the resulting micro-oscillation of the PLIB components caused by the phase modulation introduced by the refractive-type phase modulation disc rotating in the optical path of the PLIB;

FIG. 1I8D is a schematic representation of the refractive-type phase-modulation disc employed in the optical assembly shown in FIG. 1I8A, showing the numerous sections of the disc, which have refractive indices that vary sinusoidally at different angular positions along the disc;

FIG. 1I8E is a schematic representation of the rotating phase-modulation disc and stationary cylindrical lens array employed in the optical assembly shown in FIG. 1I8A, showing that the electric field components produced from neighboring elements in the cylindrical lens array are optically combined and projected into the same points of the surface being illuminated, thereby contributing to the resultant electric field intensity at each detector element in the image detection array of the IFD Subsystem;

FIG. 1I8F is a schematic representation of an optical assembly for reducing the RMS power of speckle-noise patterns in PLIIM-based systems, shown comprising a PLIA, a backlit transmissive-type phase-only LCD (PO-LCD) phase modulation panel, and a cylindrical lens array positioned closely thereto arranged as shown so that each planar laser illumination beam (PLIB) is spatial phase modulated along its wavefront as it is transmitted through the PO-LCD phase modulation panel, producing numerous substantially different time-varying speckle-noise patterns at the image detection array of the IFD Subsystem during the photo-integration time period of the image detection array thereof, which are temporally and spatially averaged during the photo-integration time period thereof, thereby reducing the RMS power of speckle-noise patterns observed at the image detection array;

FIG. 1I8G is a plan view of the optical assembly shown in FIG. 1I8F, showing the resulting micro-oscillation of the PLIB components caused by the phase modulation introduced by the phase-only type LCD-based phase modulation panel disposed along the optical path of the PLIB;

FIG. 1I9A is a perspective view of an optical assembly comprising a PLIA and a PLIB phase modulation mechanism realized by a refractive-type cylindrical lens array ring structure that is rotated about its axis through a transmitted PLIB so that the transmitted PLIB is spatial phase modulated along its wavefront, producing numerous substantially different time-varying speckle-noise patterns at the image detection array of the IFD Subsystem during the photo-integration time period thereof, which are temporally and spatially averaged during the photo-integration time period thereof, thereby reducing the RMS power of the speckle-noise patterns observed at the image detection array;

FIG. 1I9B is a plan view of the optical assembly shown in FIG. 1I9A, showing the resulting micro-oscillation of the PLIB components caused by the phase modulation introduced by the cylindrical lens ring structure rotating about each PLIA in the PLIIM-based system;

FIG. 1I10A is a perspective view of an optical assembly comprising a PLIA, and a PLIB phase-modulation mechanism realized by a diffractive-type (e.g. holographic) cylindrical lens array ring structure that is rotated about its axis through the transmitted PLIB so the transmitted PLIB is spatial phase modulated along its wavefront, producing numerous substantially different time-varying speckle-noise patterns at the image detection array of the IFD Subsystem during the photo-integration time period thereof, which are temporally and spatially averaged during the photo-integration time period thereof, thereby reducing the speckle-noise patterns observed at the image detection array;

FIG. 1I10B is a plan view of the optical assembly shown in FIG. 1I10A, showing the resulting micro-oscillation of the PLIB components caused by the phase modulation introduced by the cylindrical lens ring structure rotating about each PLIA in the PLIIM-based system;

FIG. 1I11A is a perspective view of a PLIIM-based system as shown in FIG. 1I1 embodying a pair of optical assemblies, each comprising a PLIB phase-modulation mechanism stationarily mounted between a pair of PLIAs towards which the PLIAs direct a PLIB, wherein the PLIB phase-modulation mechanism is realized by a reflective-type phase modulation disc structure having a cylindrical surface with (periodic or random) surface irregularities, rotated about its axis through the PLIB so as to spatial phase modulate the transmitted PLIB along its wavefront, producing numerous substantially different time-varying speckle-noise patterns at the image detection array of the IFD Subsystem during the photo-integration time period thereof, so that the numerous time-varying speckle-noise patterns can be temporally and spatially averaged during the photo-integration time period thereof, thereby reducing the RMS power of speckle-noise patterns observed at the image detection array;

FIG. 1I11B is an elevated side view of the PLIIM-based system shown in FIG. 1I11A;

FIG. 1I11C is an elevated side view of one of the optical assemblies shown in FIG. 1I11A, schematically illustrating how the individual beam components in the PLIB are directed onto the rotating reflective-type phase modulation disc structure and are phase modulated as they are reflected thereoff in a direction of coplanar alignment with the field of view (FOV) of the IFD subsystem of the PLIIM-based system;

FIG. 1I12A is a perspective view of an optical assembly comprising a PLIA and stationary cylindrical lens array, wherein each planar laser illumination module (PLIM) employed therein includes an integrated phase-modulation mechanism realized by a multi-faceted (refractive-type) polygon lens structure having an array of cylindrical lens surfaces symmetrically arranged about its circumference so that while the polygon lens structure is rotated about its axis, the resulting PLIB transmitted from the PLIA is spatial phase modulated along its wavefront, producing numerous substantially different time-varying speckle-noise patterns at the image detection array of the IFD Subsystem during the photo-integration time period thereof, so that the numerous time-varying speckle-noise patterns produced at the image detection array can be temporally and spatially averaged during the photo-integration time period thereof, thereby reducing the speckle-noise patterns observed at the image detection array;

FIG. 1I12B is a perspective exploded view of the rotatable multi-faceted polygon lens structure employed in each PLIM in the PLIA of FIG. 1I12A, shown rotatably supported within an apertured housing by a upper and lower sets of ball bearings, so that while the polygon lens structure is rotated about its axis, the focused laser beam generated from the VLD in the PLIM is transmitted through a first aperture in the housing and then into the polygon lens structure via a first cylindrical lens element, and emerges from a second cylindrical lens element as a planarized laser illumination beam (PLIB) which is transmitted through a second aperture in the housing, wherein the second cylindrical lens element is diametrically opposed to the first cylindrical lens element;

FIG. 1I12C is a plan view of one of the PLIMs employed in the PLIA shown in FIG. 1I12A, wherein a gear element is fixed attached to the upper portion of the polygon lens element so as to rotate the same a high angular velocity during operation of the optically-based speckle-pattern noise reduction assembly;

FIG. 1I12D is a perspective view of the optically-based speckle-pattern noise reduction assembly of FIG. 1I12A, wherein the polygon lens element in each PLIM is rotated by an electric motor, operably connected to the plurality of polygon lens elements by way of the intermeshing gear elements connected to the same, during the generation of component PLIBs from each of the PLIMS in the PLIA, FIG. 1I13 is a schematic of the PLIIM system of FIG. 1A embodying a second generalized method of reducing the RMS power of observable speckle-noise patterns, wherein the planar laser illumination beam (PLIB) produced from the PLIIM system is temporal intensity modulated by a temporal intensity modulation function (TIMF) prior to object illumination, so that the target object (e.g. package) is illuminated with a temporally coherent-reduced laser beam and, as a result, numerous substantially different time-varying speckle-noise patterns are produced and detected over the photo-integration time period of the image detection array, thereby allowing the speckle-noise patterns to be temporally averaged over the photo-integration time period and/or spatially averaged over the image detection element and the observable speckle-noise pattern reduced;

FIG. 1I13A is a schematic representation of the PLIIM-based system of FIG. 1I13, illustrating the second generalized speckle-noise pattern reduction method of the present invention applied to the planar laser illumination array (PLIA) employed therein, wherein numerous substantially different speckle-noise patterns are produced at the image detection array during the photo-integration time period thereof using temporal intensity modulation techniques to modulate the temporal intensity of the wavefront of the PLIB, and temporally and spatially averaged at the image detection array during the photo-integration time period thereof, thereby reducing the RMS power of speckle-noise patterns observed at the image detection array;

FIG. 1I13B is a high-level flow chart setting forth the primary steps involved in practicing the second generalized method of reducing observable speckle-noise patterns in PLIIM-based systems, illustrated in FIGS. 1I13 and 1I13A;

FIG. 1I14A is a perspective view of an optical assembly comprising a PLIA with a cylindrical lens array, and an electronically-controlled PLIB modulation mechanism realized by a high-speed laser beam temporal intensity modulation structure (e.g. electro-optical gating or shutter device) arranged in front of the cylindrical lens array, wherein the transmitted PLIB is temporally intensity modulated according to a temporal intensity modulation (e.g. windowing) function (TIMF), producing numerous substantially different time-varying speckle-noise patterns at image detection array of the IFD Subsystem during the photo-integration time period thereof, which are temporally and spatially averaged during the photo-integration time period thereof, thereby reducing the RMS power of speckle-noise patterns observed at the image detection array;

FIG. 1I14B is a schematic representation, taken along the cross-section of the optical assembly shown in FIG. 1I14A, showing the optical path which each optically-gated PLIB component within the PLIB travels on its way towards the target object to be illuminated;

FIG. 1I15A is a perspective view of an optical assembly comprising a PLIA embodying a plurality of visible mode-locked laser diodes (MLLDs), arranged in front of a cylindrical lens array, wherein the transmitted PLIB is temporal intensity modulated according to a temporal-intensity modulation (e.g. windowing) function (TIMF), temporal intensity of numerous substantially different speckle-noise patterns are produced at the image detection array of the IFD subsystem during the photo-integration time period thereof, which are temporally and spatially averaged during the photo-integration time period of the image detection array, thereby reducing the RMS power of speckle-noise patterns observed at the image detection array;

FIG. 1I15B is a schematic diagram of one of the visible MLLDs employed in the PLIM of FIG. 1I15A, show comprising a multimode laser diode cavity referred to as the active layer (e.g. InGaAsP) having a wide emission-bandwidth over the visible band, a collimating lenslet having a very short focal length, an active mode-locker under switched control (e.g. a temporal-intensity modulator), a passive-mode locker (i.e. saturable absorber) for controlling the pulse-width of the output laser beam, and a mirror which is 99% reflective and 1% transmissive at the operative wavelength of the visible MLLD;

FIG. 1I15C is a perspective view of an optical assembly comprising a PLIA embodying a plurality of visible laser diodes (VLDs), which are driven by a digitally-controlled programmable drive-current source and arranged in front of a cylindrical lens array, wherein the transmitted PLIB from the PLIA is temporal intensity modulated according to a temporal-intensity modulation function (TIMF) controlled by the programmable drive-current source, modulating the temporal intensity of the wavefront of the transmitted PLIB and producing numerous substantially different speckle-noise patterns at the image detection array of the IFD subsystem during the photo-integration time period thereof, which are temporally and spatially averaged during the photo-integration time period of the image detection array, thereby reducing the RMS power of speckle-noise patterns observed at the image detection array;

FIG. 1I15D is a schematic diagram of the temporal intensity modulation (TIM) controller employed in the optical subsystem of FIG. 1I15E, shown comprising a plurality of VLDs, each arranged in series with a current source and a potentiometer digitally-controlled by a programmable micro-controller in operable communication with the camera control computer of the PLIIM-based system;

FIG. 1I15E is a schematic representation of an exemplary triangular current waveform transmitted across the junction of each VLD in the PLIA of FIG. 1I15C, controlled by the micro-controller, current source and digital potentiometer associated with the VLD;

FIG. 1I15F is a schematic representation of the light intensity output from each VLD in the PLIA of FIG. 1I15C, in response to the triangular electrical current waveform transmitted across the junction of the VLD;

FIG. 1I16 is a schematic of the PLIIM system of FIG. 1A embodying a third generalized method of reducing the RMS power of observable speckle-noise patterns, wherein the planar laser illumination beam (PLIB) produced from the PLIIM system is temporal phase modulated by a temporal phase modulation function (TPMF) prior to object illumination, so that the target object (e.g. package) is illuminated with a temporally coherent-reduced laser beam and, as a result, numerous substantially different time-varying speckle-noise patterns are produced and detected over the photo-integration time period of the image detection array, thereby allowing the speckle-noise patterns to be temporally averaged over the photo-integration time period and/or spatially averaged over the image detection element and the observable speckle-noise pattern reduced;

FIG. 1I16A is a schematic representation of the PLIIM-based system of FIG. 1I16, illustrating the third generalized speckle-noise pattern reduction method of the present invention applied to the planar laser illumination array (PLIA) employed therein, wherein numerous substantially different speckle-noise patterns are produced at the image detection array during the photo-integration time period thereof using temporal phase modulation techniques to modulate the temporal phase of the wavefront of the PLIB (i.e. by an amount exceeding the coherence time length of the VLD), and temporally and spatially averaged at the image detection array during the photo-integration time period thereof, thereby reducing the RMS power of speckle-noise patterns observed at the image detection array;

FIG. 1I16B is a high-level flow chart setting forth the primary steps involved in practicing the third generalized method of reducing observable speckle-noise patterns in PLIIM-based systems, illustrated in FIGS. 1I16 and 1I16A;

FIG. 1I17A is a perspective view of an optical assembly comprising a PLIA with a cylindrical lens array, and an electrically-passive PLIB modulation mechanism realized by a high-speed laser beam temporal phase modulation structure (e.g. optically reflective wavefront modulating cavity such as an etalon) arranged in front of each VLD within the PLIA, wherein the transmitted PLIB is temporal phase modulated according to a temporal phase modulation function (TPMF), modulating the temporal phase of the wavefront of the transmitted PLIB (i.e. by an amount exceeding the coherence time length of the VLD) and producing numerous substantially different time-varying speckle-noise patterns at image detection array of the IFD Subsystem during the photo-integration time period thereof, which are temporally and spatially averaged during the photo-integration time period thereof, thereby reducing the speckle-noise patterns observed at the image detection array;

FIG. 1I17B is a schematic representation, taken along the cross-section of the optical assembly shown in FIG. 1I17A, showing the optical path which each temporally-phased PLIB component within the PLIB travels on its way towards the target object to be illuminated;

FIG. 1I17C is a schematic representation of an optical assembly for reducing the RMS power of speckle-noise patterns in PLIIM-based systems, shown comprising a PLIA, a backlit transmissive-type phase-only LCD (PO-LCD) phase modulation panel, and a cylindrical lens array positioned closely thereto arranged as shown so that the wavefront of each planar laser illumination beam (PLIB) is temporal phase modulated as it is transmitted through the PO-LCD phase modulation panel, thereby producing numerous substantially different time-varying speckle-noise patterns at the image detection array of the IFD Subsystem during the photo-integration time period of the image detection array thereof, which are temporally and spatially averaged during the photo-integration time period thereof, thereby reducing the RMS power of speckle-noise patterns observed at the image detection array;

FIG. 1I17D is a schematic representation of an optical assembly for reducing the RMS power of speckle-noise patterns in PLIIM-based systems, shown comprising a PLIA, a high-density fiber optical array panel, and a cylindrical lens array positioned closely thereto arranged as shown so that the wavefront of each planar laser illumination beam (PLIB) is temporal phase modulated as it is transmitted through the fiber optical array panel, producing numerous substantially different time-varying speckle-noise patterns at the image detection array of the IFD Subsystem during the photo-integration time period of the image detection array thereof, which are temporally and spatially averaged during the photo-integration time period thereof, thereby reducing the RMS power of speckle-noise patterns observed at the image detection array;

FIG. 1I17E is a plan view of the optical assembly shown in FIG. 1I17D, showing the optical path of the PLIB components through the fiber optical array panel during the temporal phase modulation of the wavefront of the PLIB;

FIG. 1I18 is a schematic of the PLIIM system of FIG. 1A embodying a fourth generalized method of reducing the RMS power of observable speckle-noise patterns, wherein the planar laser illumination beam (PLIB) produced from the PLIIM system is temporal frequency modulated by a temporal frequency modulation function (TFMF) prior to object illumination, so that the target object (e.g. package) is illuminated with a temporally coherent-reduced laser beam and, as a result, numerous substantially different time-varying speckle-noise patterns are produced and detected over the photo-integration time period of the image detection array, thereby allowing the speckle-noise patterns to be temporally averaged over the photo-integration time period and/or spatially averaged over the image detection element and the observable speckle-noise pattern reduced;

FIG. 1I18A is a schematic representation of the PLIIM-based system of FIG. 1I18, illustrating the fourth generalized speckle-noise pattern reduction method of the present invention applied to the planar laser illumination array (PLIA) employed therein, wherein numerous substantially different speckle-noise patterns are produced at the image detection array during the photo-integration time period thereof using temporal frequency modulation techniques to modulate the phase along the wavefront of the PLIB, and temporally and spatially averaged at the image detection array during the photo-integration time period thereof, thereby reducing the RMS power of speckle-noise patterns observed at the image detection array;

FIG. 1I18B is a high-level flow chart setting forth the primary steps involved in practicing the fourth generalized method of reducing observable speckle-noise patterns in PLIIM-based systems, illustrated in FIGS. 1I18 and 1I18A;

FIG. 1I19A is a perspective view of an optical assembly comprising a PLIA embodying a plurality of visible laser diodes (VLDs), each arranged behind a cylindrical lens, and driven by electrical currents which are modulated by a high-frequency modulation signal so that (i) the transmitted PLIB is temporally frequency modulated according to a temporal frequency modulation function (TFMF), modulating the temporal frequency characteristics of the PLIB and thereby producing numerous substantially, different speckle-noise patterns at image detection array of the IFD Subsystem during the photo-integration time period thereof, which are temporally and spatially averaged at the image detection during the photo-integration time period thereof, thereby reducing the RMS power of observable speckle-noise patterns;

FIG. 1I19B is a plan, partial cross-sectional view of the optical assembly shown in FIG. 1I19B;

FIG. 1I19C is a schematic representation of a PLIIM-based system employing a plurality of multi-mode laser diodes;

FIG. 1I20 is a schematic representation of the PLIIM-based system of FIG. 1A embodying a fifth generalized method of reducing the RMS power of observable speckle-noise patterns, wherein the planar laser illumination beam (PLIB) transmitted towards the target object to be illuminated is spatial intensity modulated by a spatial intensity modulation function (SIMF), so that the object (e.g. package) is illuminated with spatially coherent-reduced laser beam and, as a result, numerous substantially different time-varying speckle-noise patterns are produced and detected over the photo-integration time period of the image detection array, thereby allowing the numerous speckle-noise patterns to be temporally averaged over the photo-integration time period and spatially averaged over the image detection element and the RMS power of the observable speckle-noise pattern reduced;

FIG. 1I20A is a schematic representation of the PLIIM-based system of FIG. 1I20, illustrating the fifth generalized speckle-noise pattern reduction method of the present invention applied at the IFD Subsystem employed therein, wherein numerous substantially different speckle-noise patterns are produced at the image detection array during the photo-integration time period thereof using spatial intensity modulation techniques to modulate the spatial intensity along the wavefront of the PLIB, and temporally and spatially averaged at the image detection array during the photo-integration time period thereof, thereby reducing the RMS power of speckle-noise patterns observed at the image detection array;

FIG. 1I20B is a high-level flow chart setting forth the primary steps involved in practicing the fifth generalized method of reducing the RMS power of observable speckle-noise patterns in PLIIM-based systems, illustrated in FIGS. 1I20 and 1I20A;

FIG. 1I21A is a perspective view of an optical assembly comprising a planar laser illumination array (PLIA) with a refractive-type cylindrical lens array, and an electronically-controlled mechanism for micro-oscillating before the cylindrical lens array, a pair of spatial intensity modulation panels with elements parallely arranged at a high spatial frequency, having grey-scale transmittance measures, and driven by two pairs of ultrasonic transducers arranged in a push-pull configuration so that the transmitted planar laser illumination beam (PLIB) is spatially intensity modulated along its wavefront thereby producing numerous (i.e. many) substantially different time-varying speckle-noise patterns at the image detection array of the IFD Subsystem during the photo-integration time period thereof, which can be temporally and spatially averaged at the image detection array during the photo-integration time period thereof, thereby reducing the RMS power of the speckle-noise patterns observed at the image detection array;

FIG. 1I21B is a perspective view of the pair of spatial intensity modulation panels employed in the optical assembly shown in FIG. 1I21A;

FIG. 1I21C is a perspective view of the spatial intensity modulation panel support frame employed in the optical assembly shown in FIG. 1I21A;

FIG. 1I21D is a schematic representation of the dual spatial intensity modulation panel structure employed in FIG. 1I21A, shown configured between two pairs of ultrasonic transducers (or flexural elements driven by voice-coil type devices) operated in a push-pull mode of operation, so that at least one spatial intensity modulation panel is constantly moving when the other panel is momentarily stationary during modulation panel direction reversal;

FIG. 1I22 is a schematic representation of the PLIIM-based system of FIG. 1A embodying a sixth generalized method of reducing the RMS power of observable speckle-noise patterns, wherein the planar laser illumination beam (PLIB) reflected/scattered from the illuminated object and received at the IFD Subsystem is spatial intensity modulated according to a spatial intensity modulation function (SIMF), so that the object (e.g. package) is illuminated with a spatially coherent-reduced laser beam and, as a result, numerous substantially different time-varying (random)

Figure 1A:
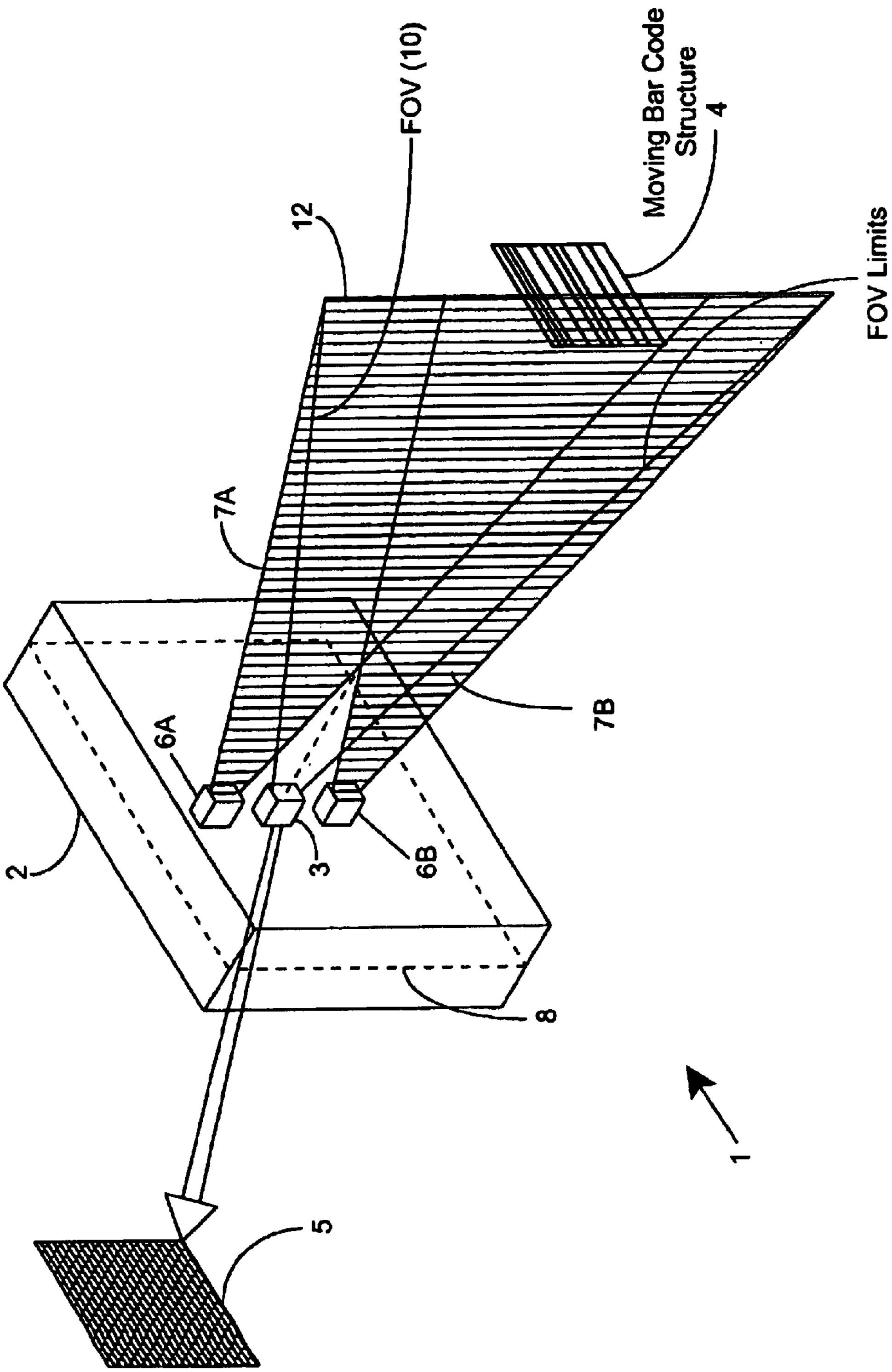
FIG. 1A is a schematic representation of a first generalized embodiment of the planar laser illumination and (electronic) imaging (PLIIM) system of the present invention, wherein a pair of planar laser illumination arrays (PLIAs) are mounted on opposite sides of a linear (i.e. 1-dimensional) type image formation and detection (IFD) module (i.e. camera subsystem) having a fixed focal length imaging lens, a fixed focal distance and fixed field of view, such that the planar illumination array produces a stationary (i.e. non-scanned) plane of laser beam illumination which is disposed substantially coplanar with the field of view of the image formation and detection module during object illumination and image detection operations carried out by the PLIIM-based system on a moving bar code symbol or other graphical structure.
Figure 1F:
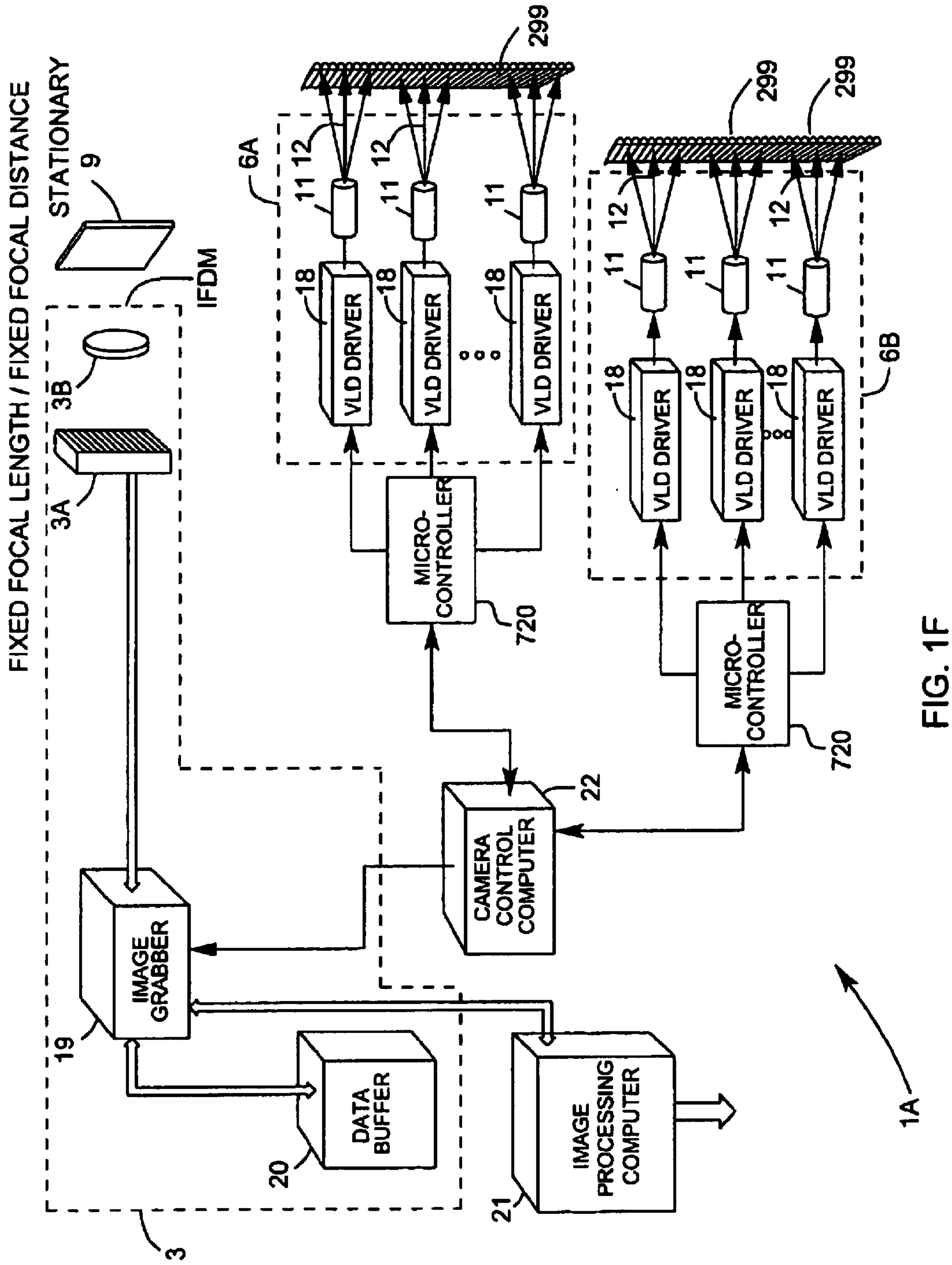
FIG. 1F is a block schematic diagram of the PLIIM-based system shown in FIG. 1A, comprising a pair of planar laser illumination arrays (driven by a set of digitally-programmable VLD driver circuits that can drive the VLDs in a high-frequency pulsed-mode of operation), a linear-type image formation and detection (IFD) module or camera subsystem, a stationary field of view (FOV) folding mirror, an image frame grabber, an image data buffer, an image processing computer, and a camera control computer.
Figure 112B:
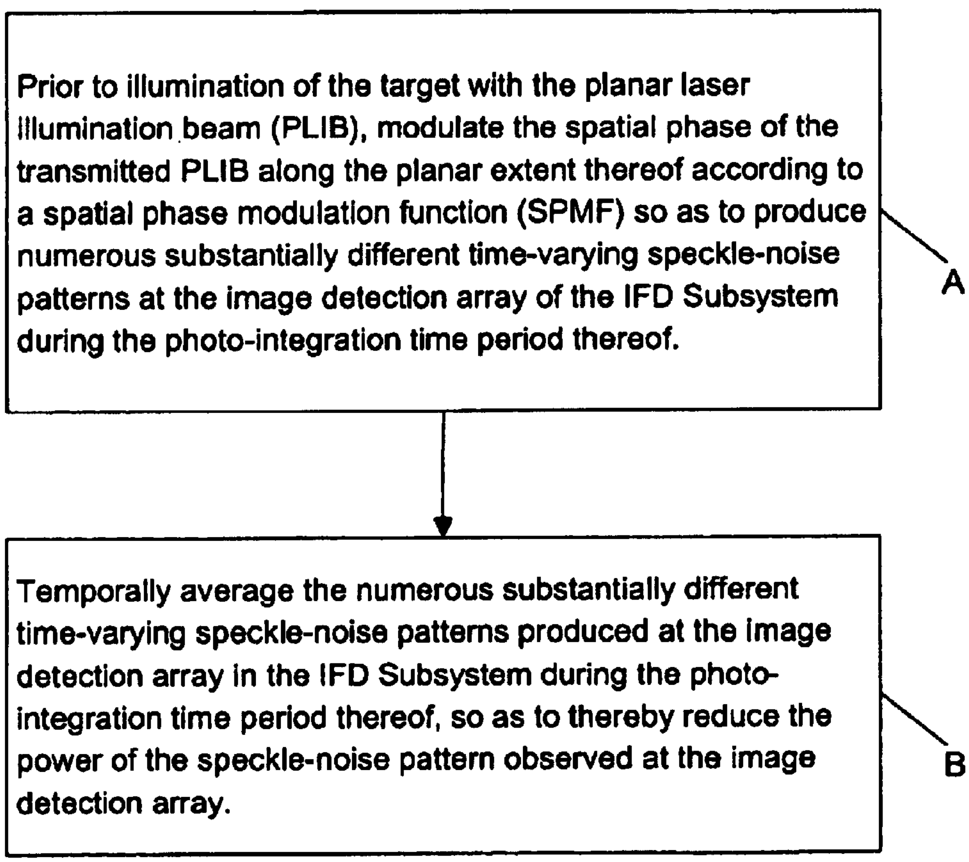
Figure 113F:
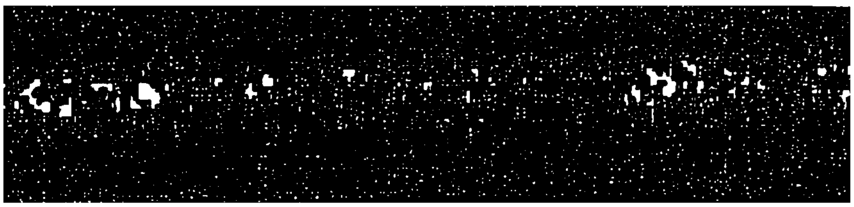
Figure 113G:
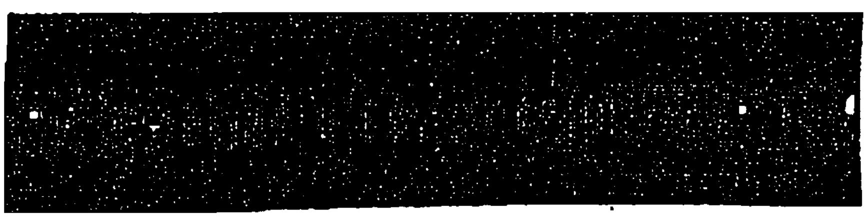
Figure 115A:
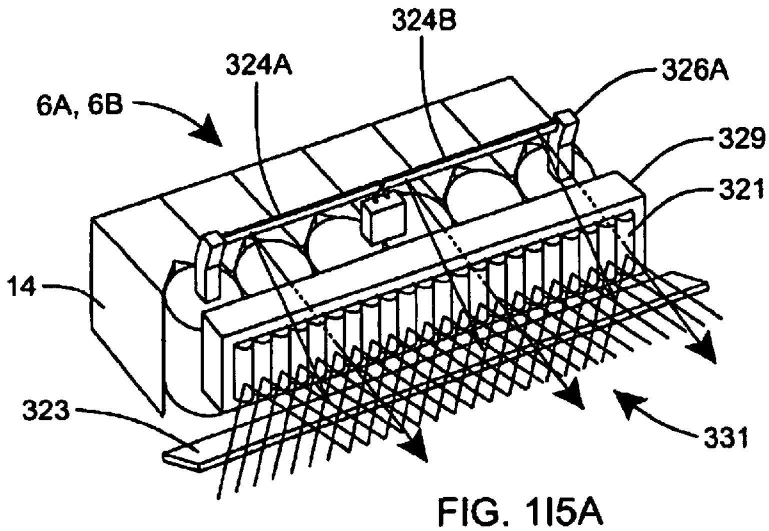
Figure 115B:
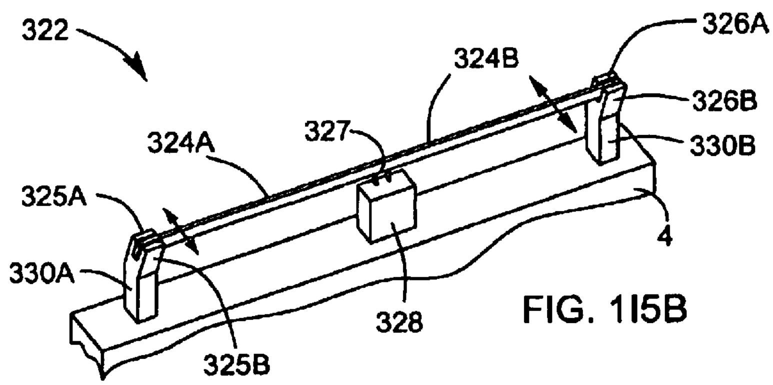
Figure 115C:
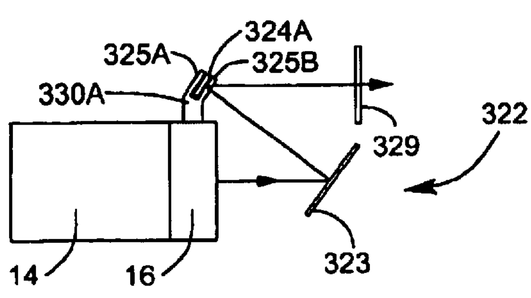
Figure 115D:
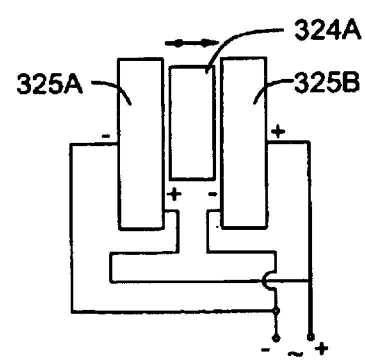
Figure 116A:
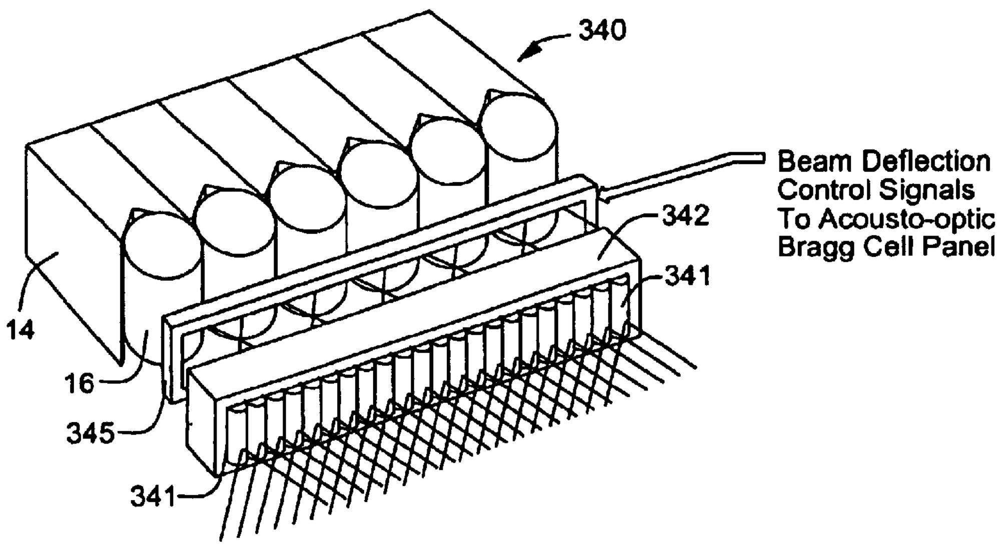
Figure 116B:
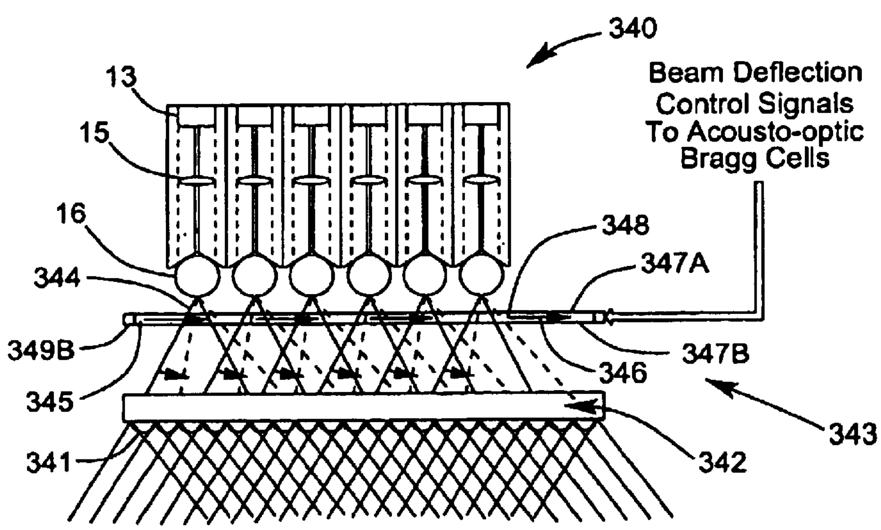
Figure 118F:
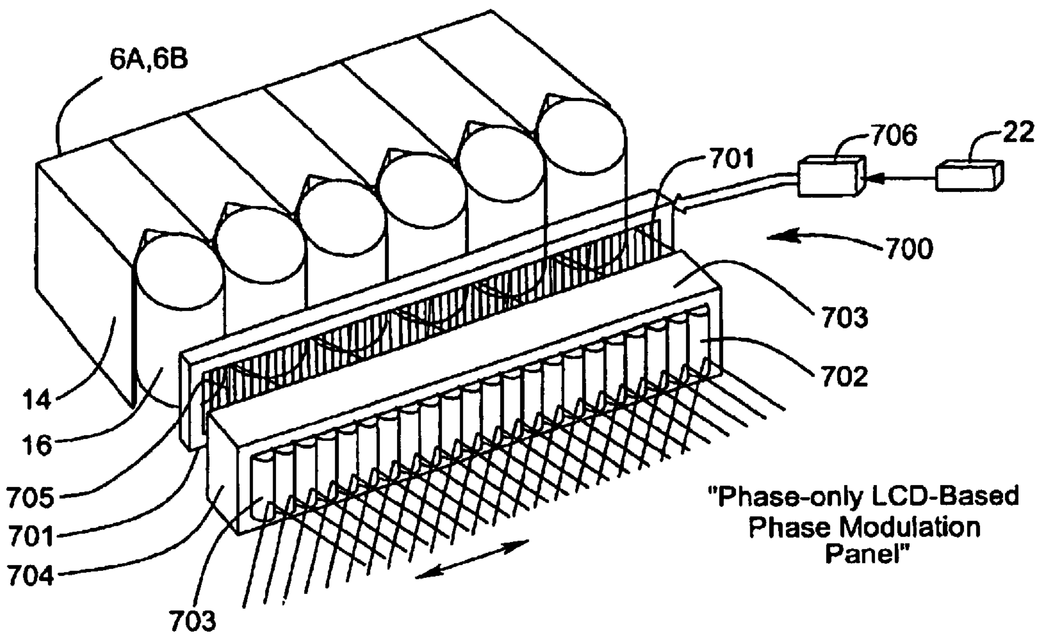
Figure 118G:
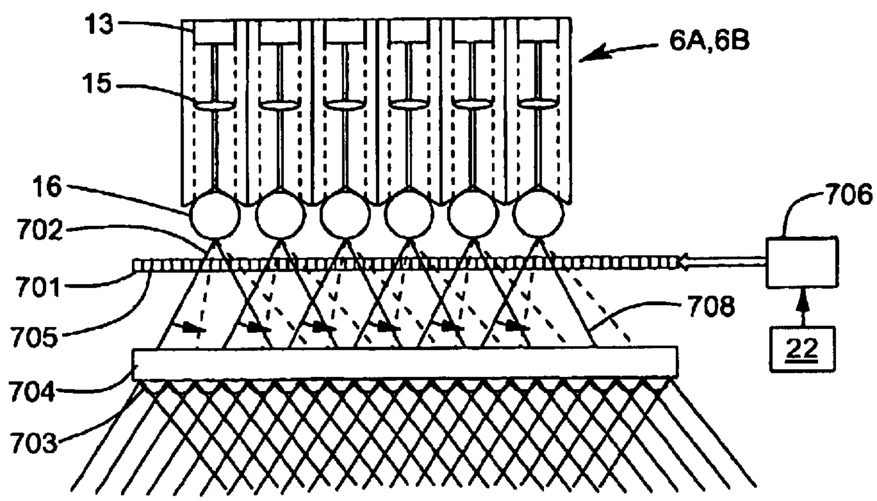
Figure 119B:
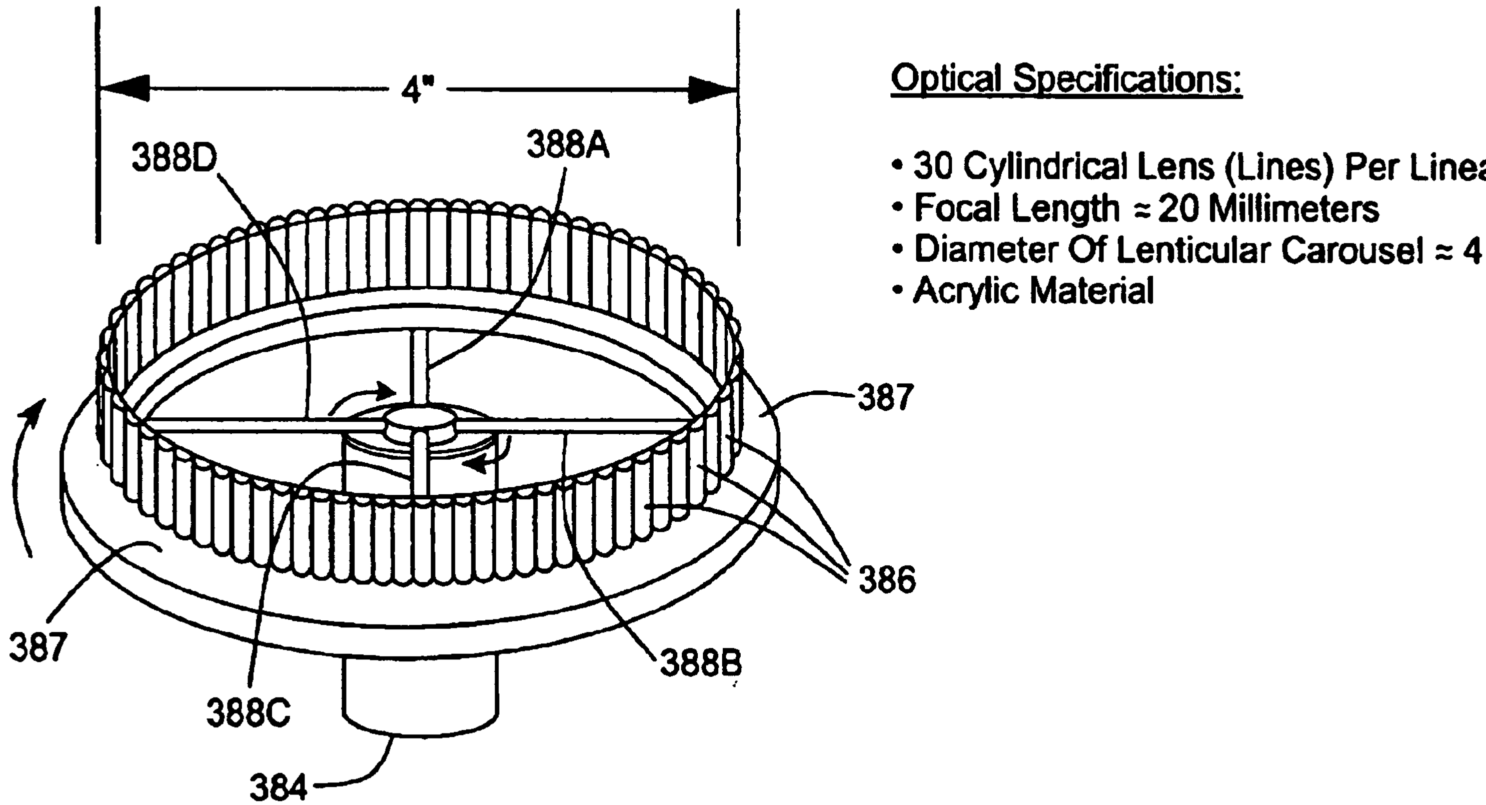
Figure 1N:
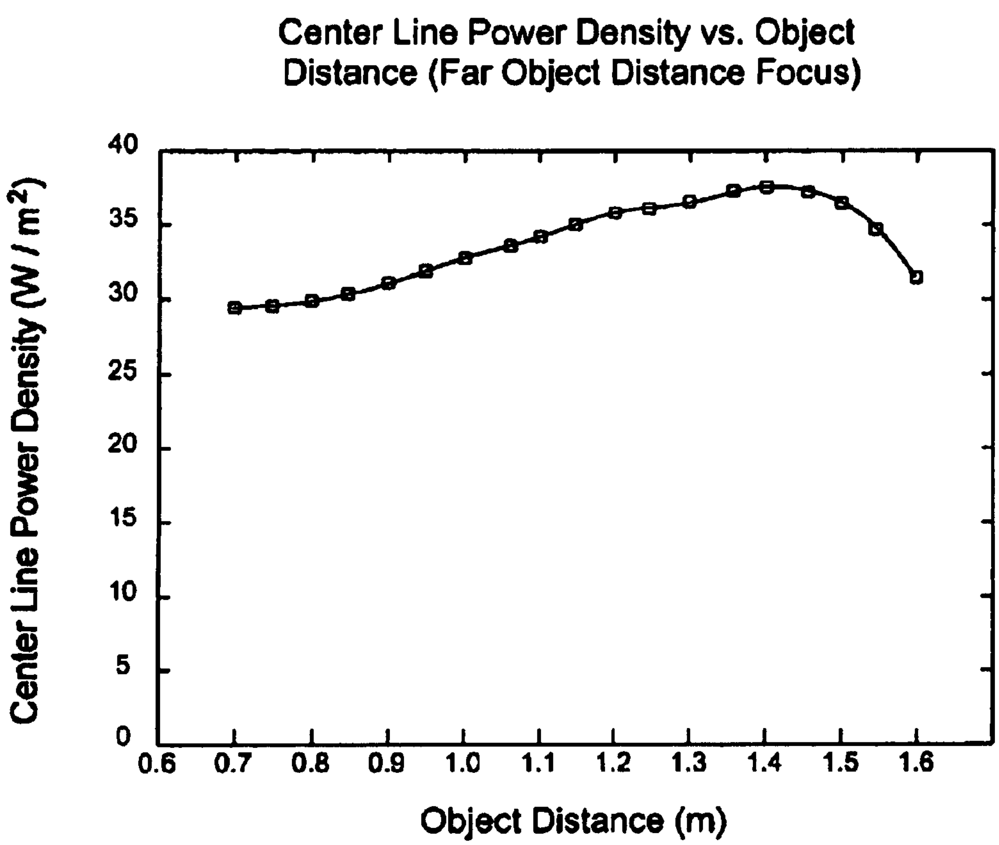
Figure 10:
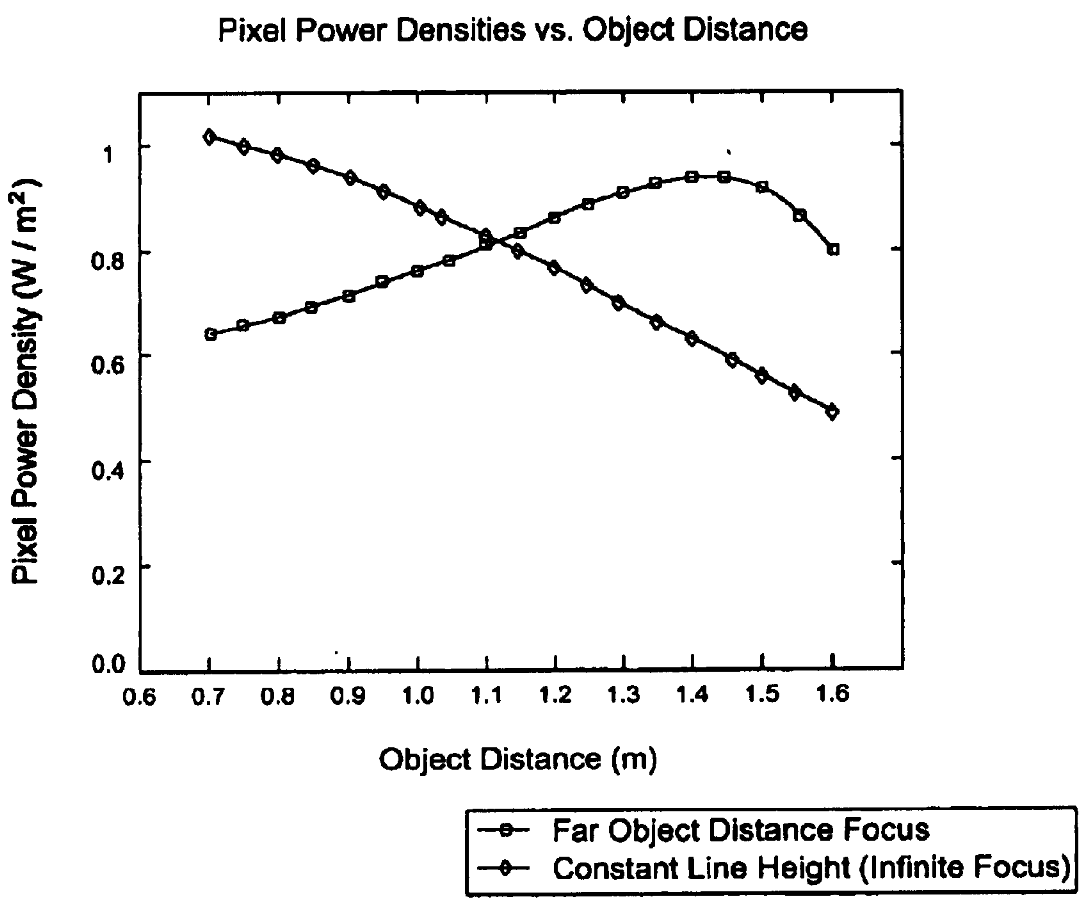
Figure 1T:
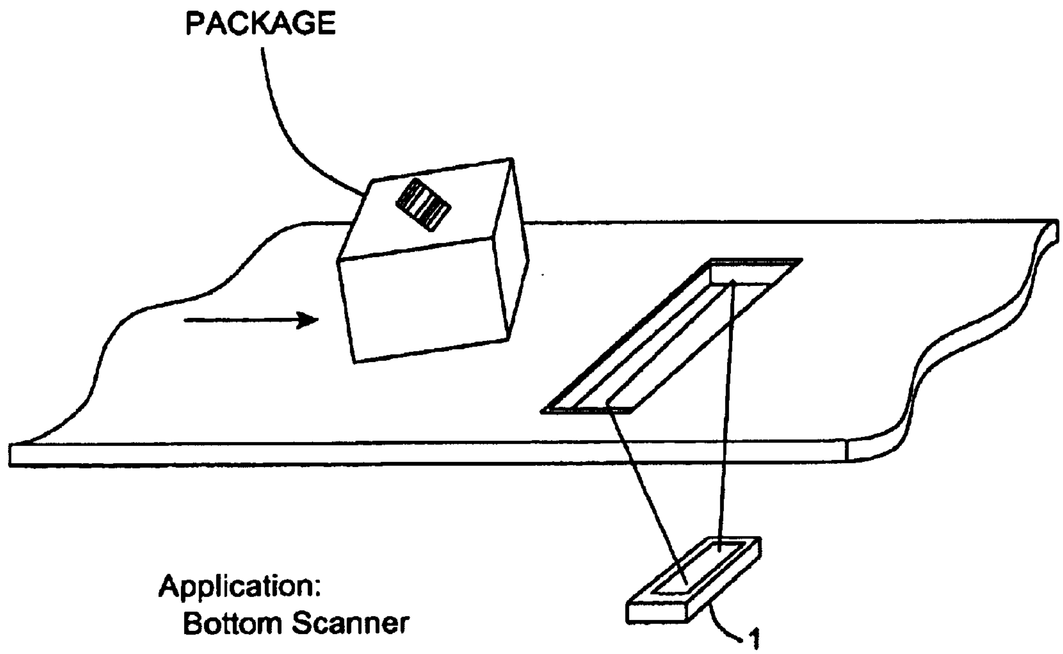
Figure 1U:
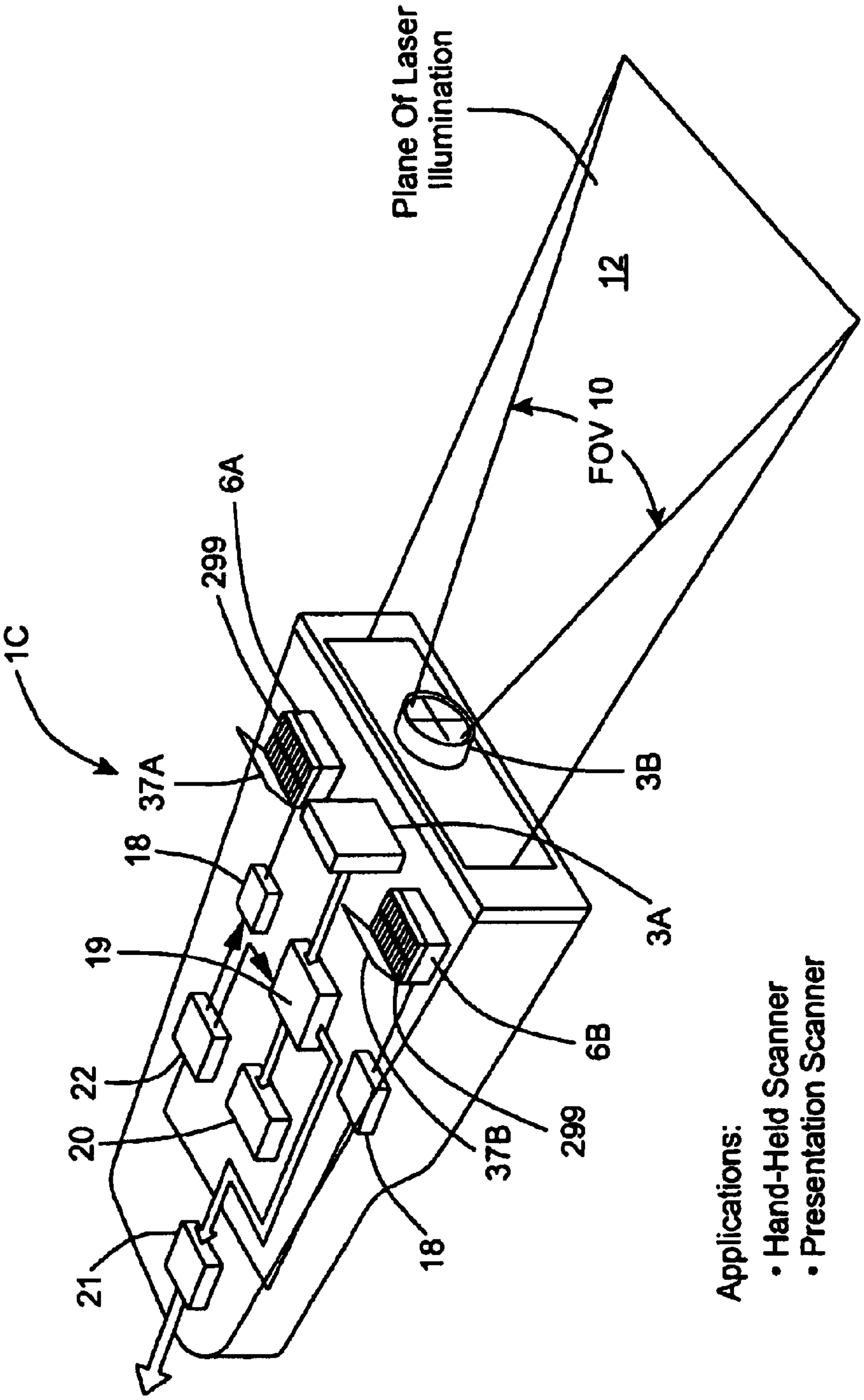
Figure 2A:
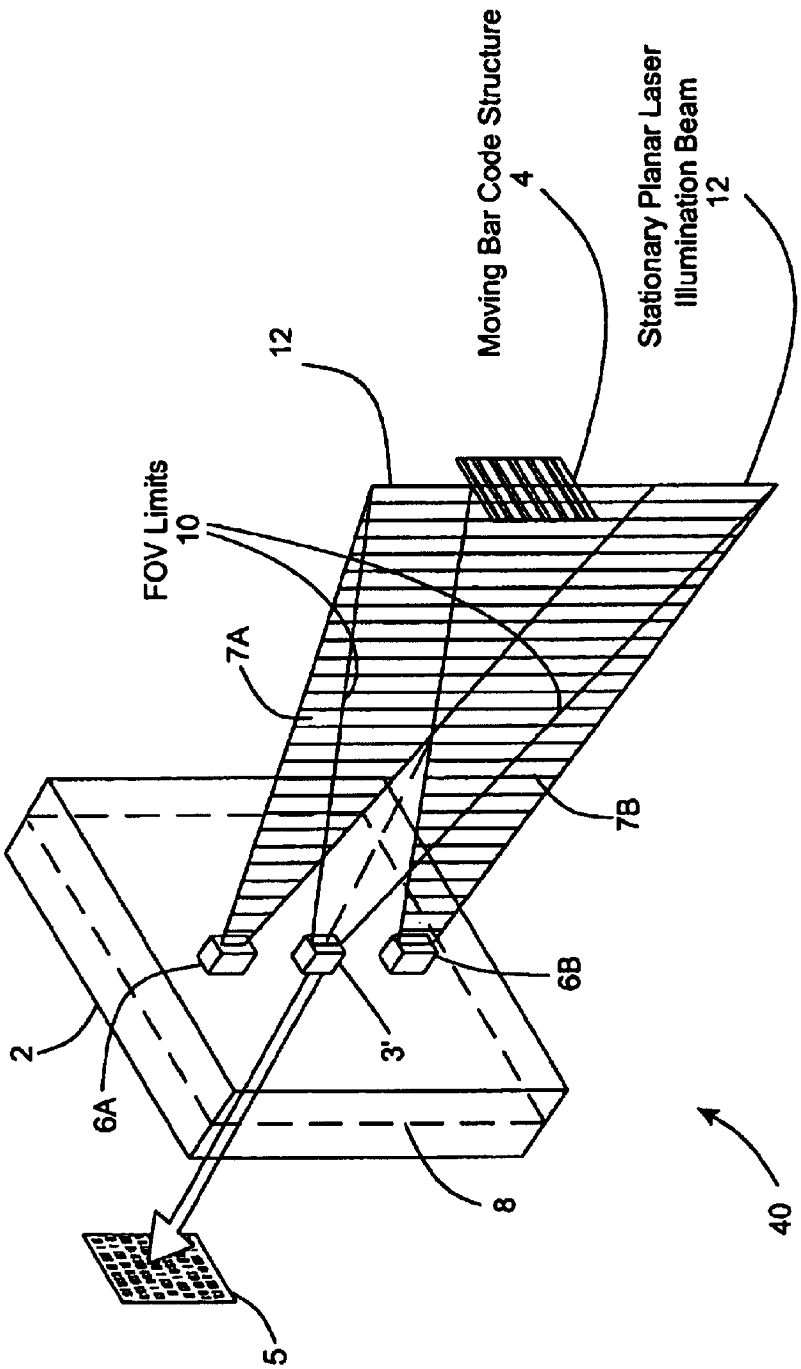
Figure 2G:
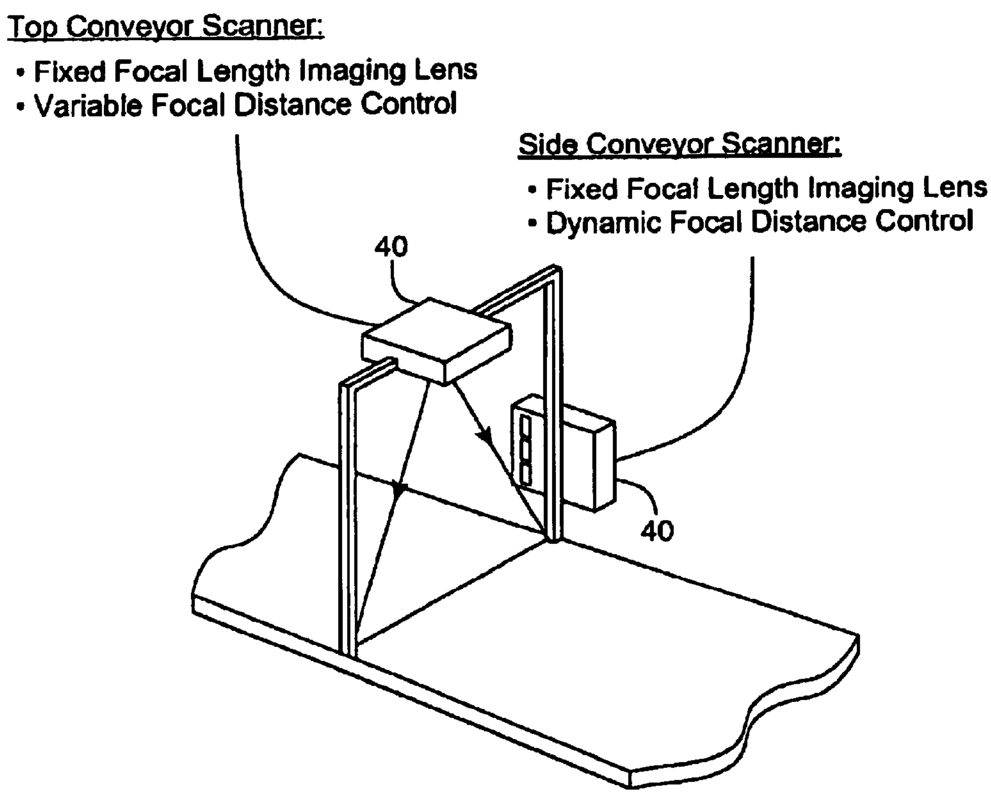
Figure 2H:
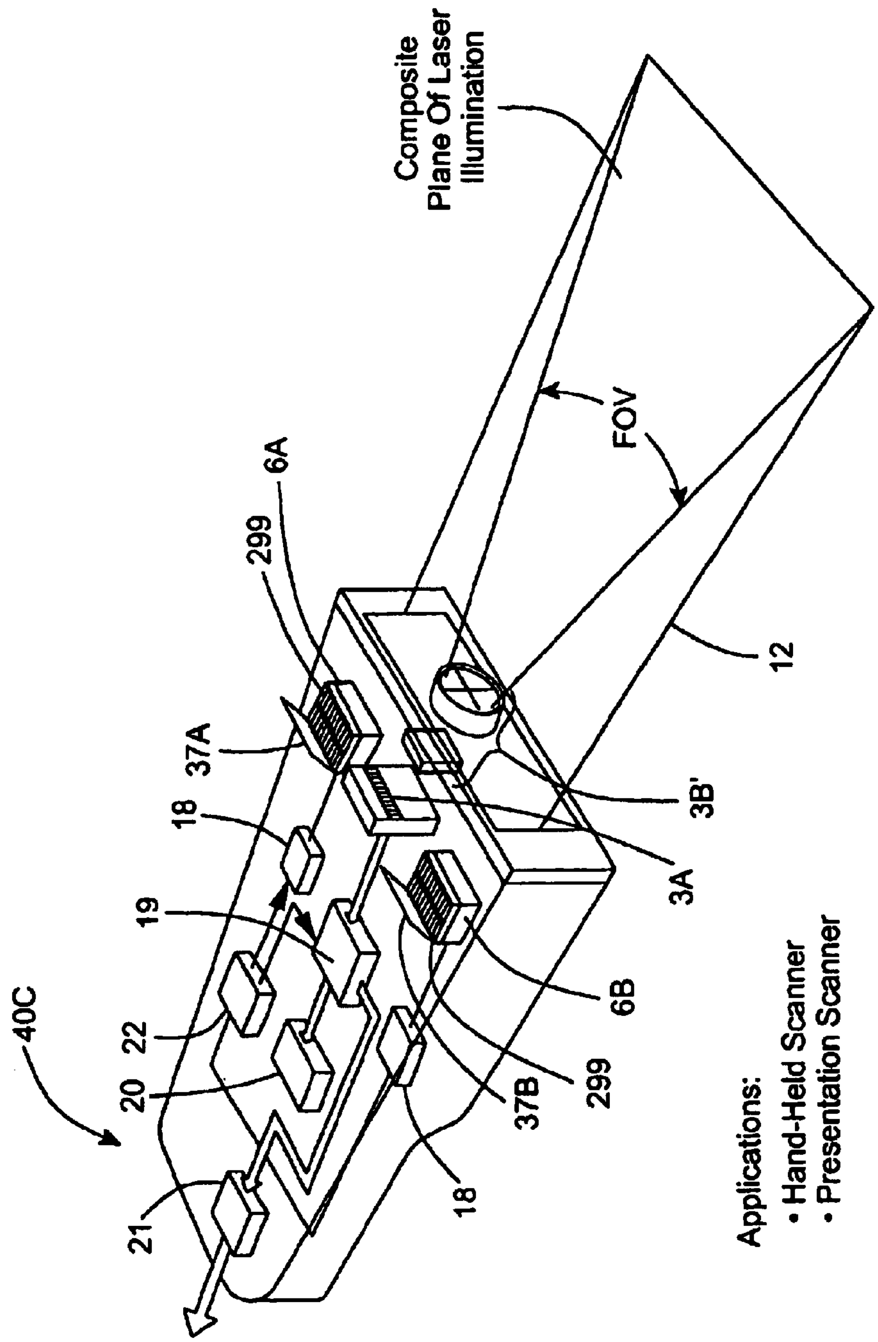
Figure 3A:
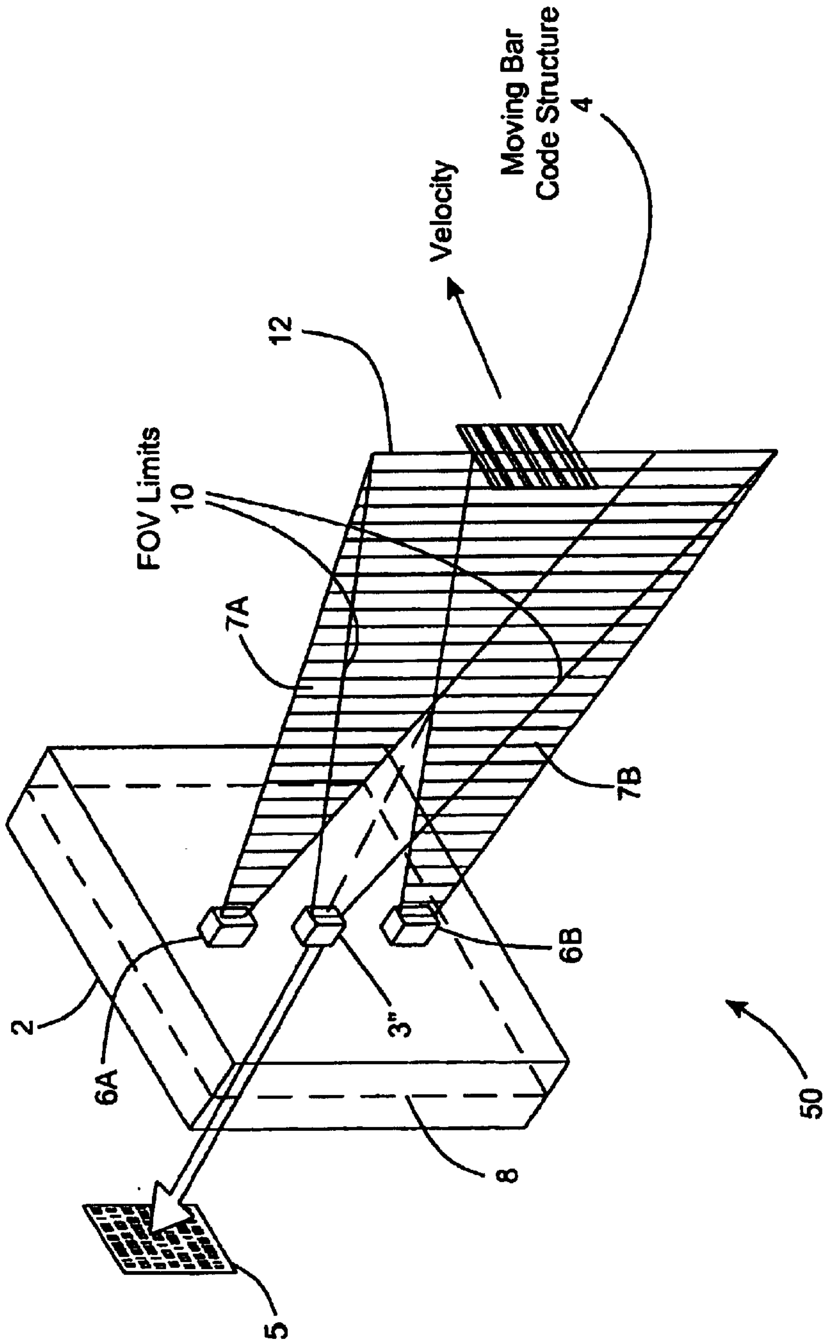
Figure 4A:
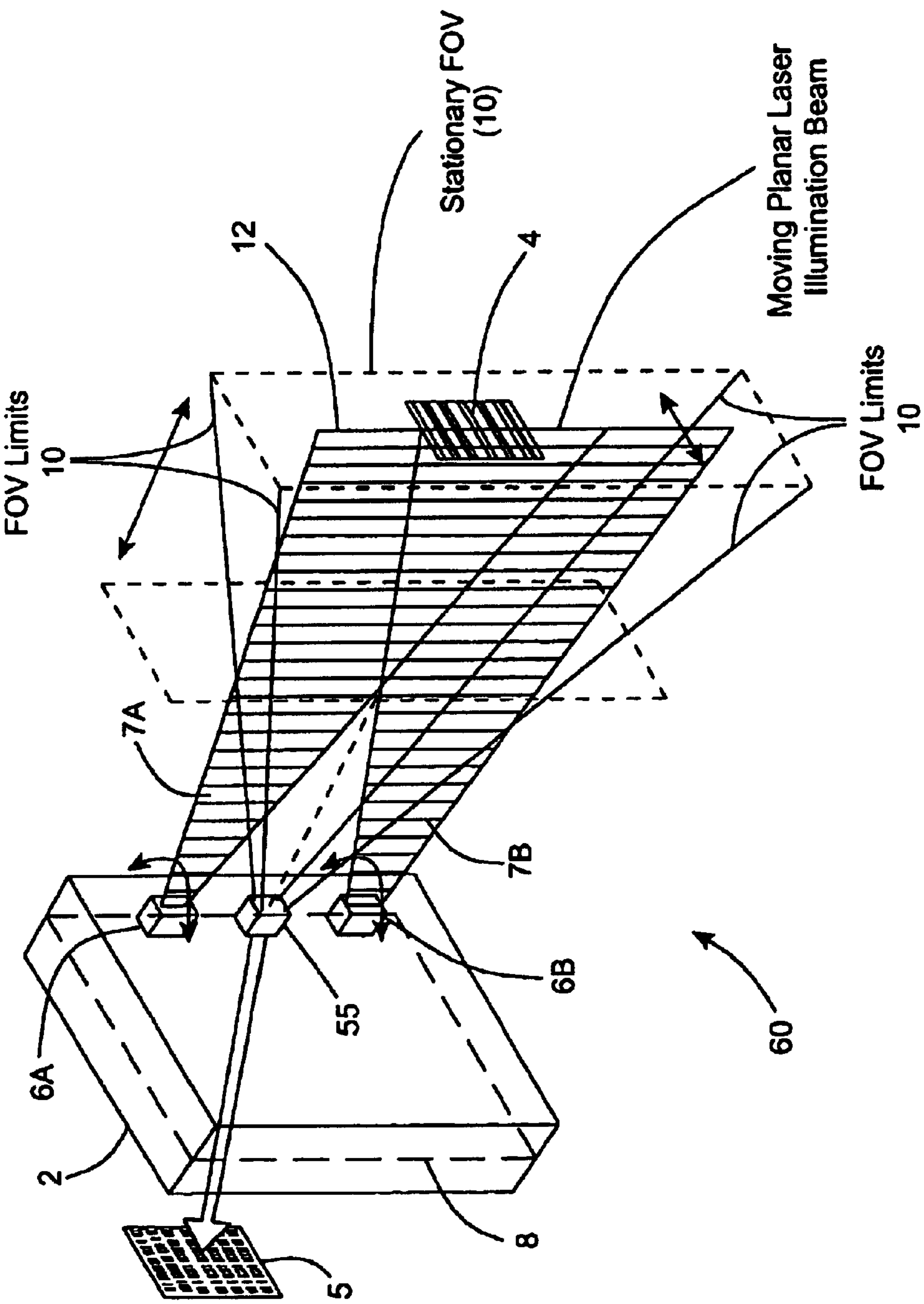
Figure 4D:
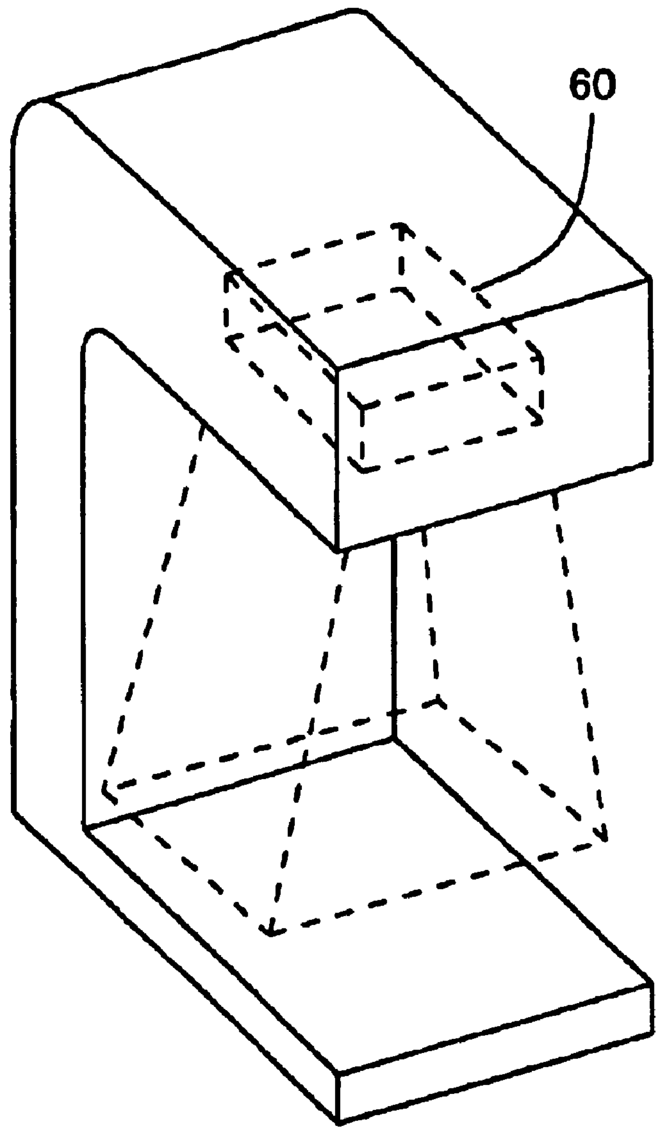
Figure 5A:
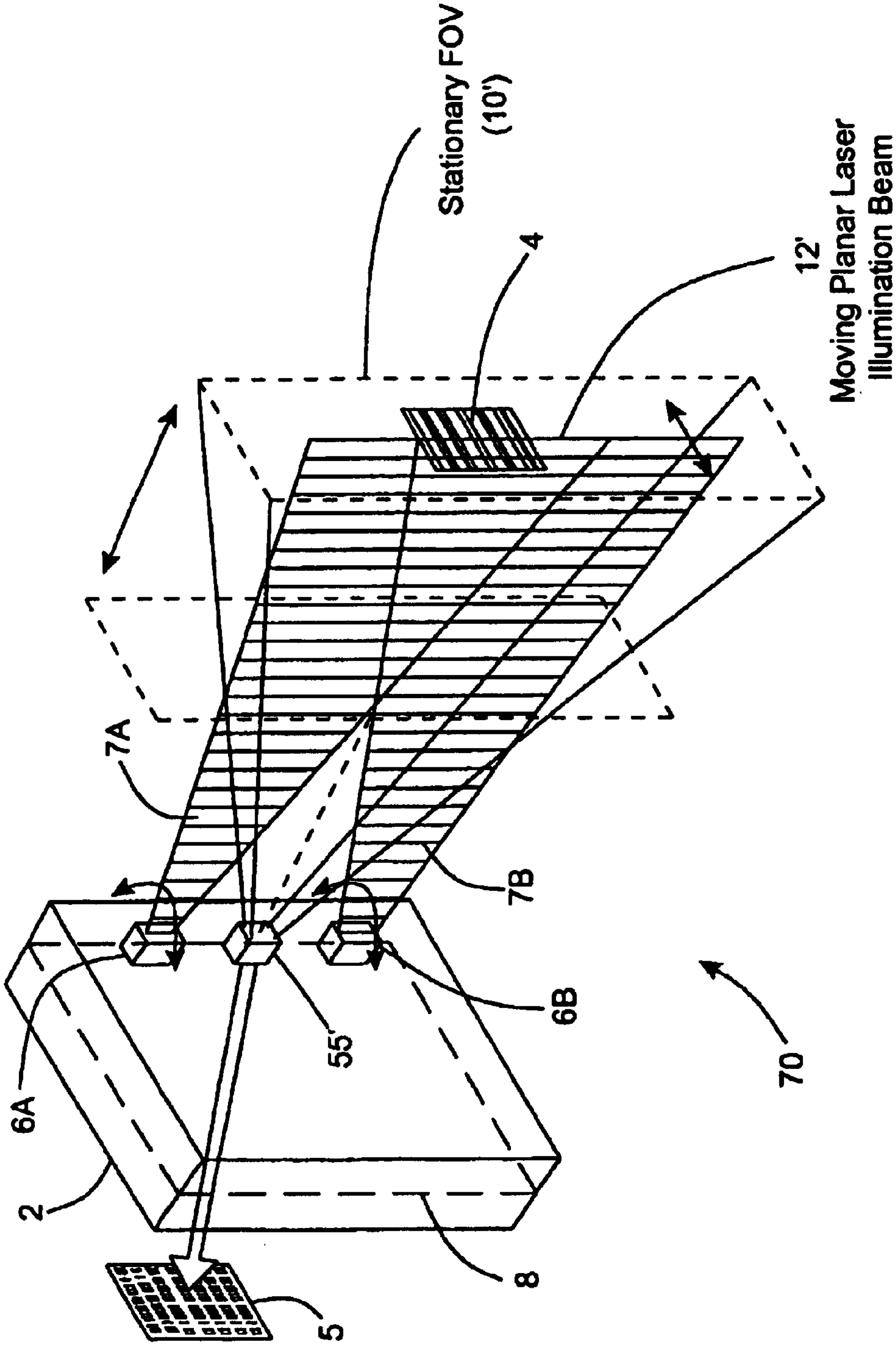
Figure 5D:
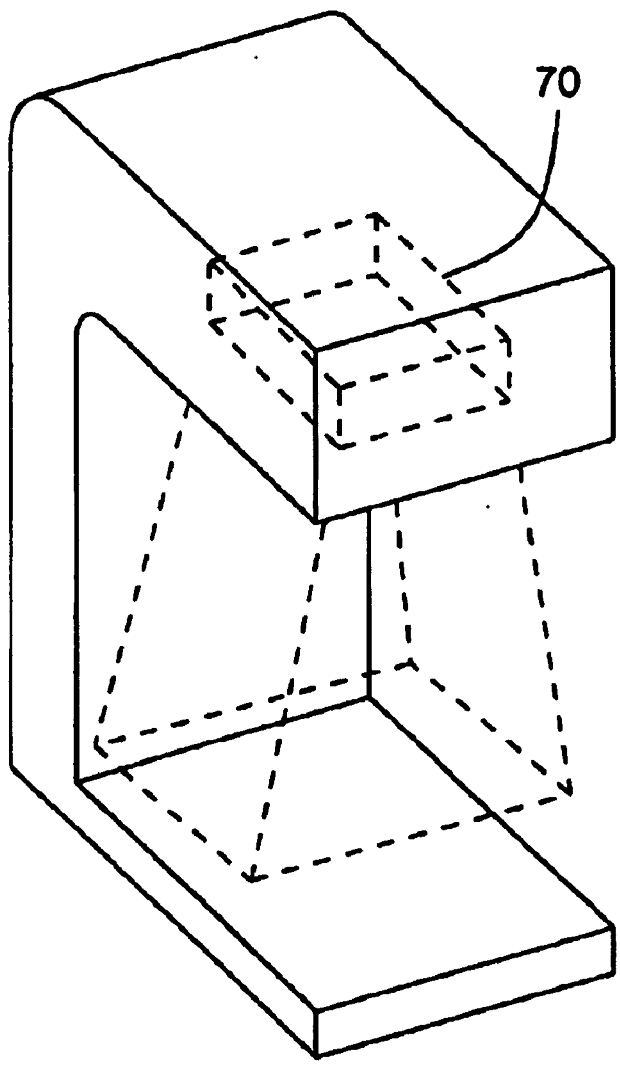
Figure 6A:
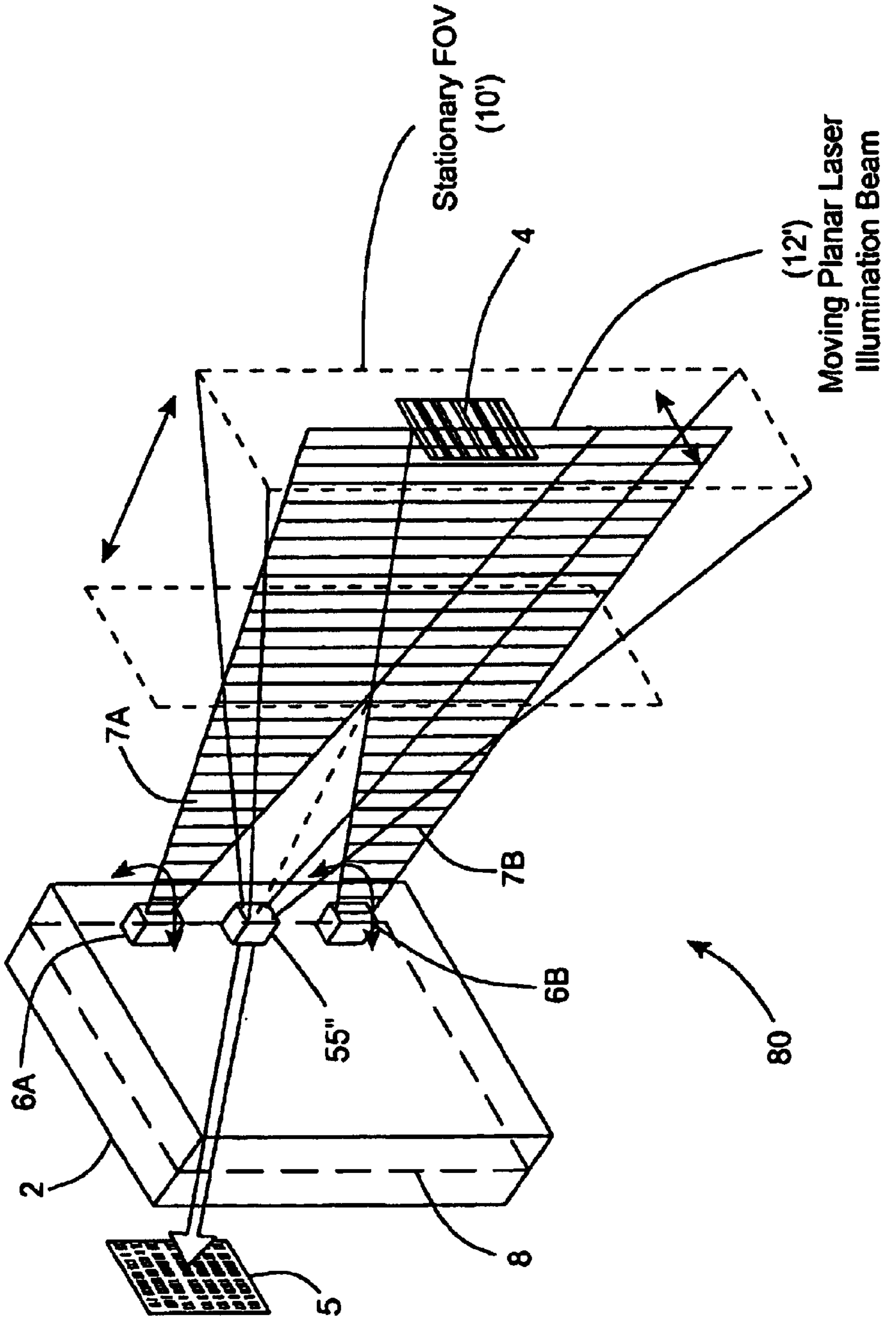
Figure 7A:
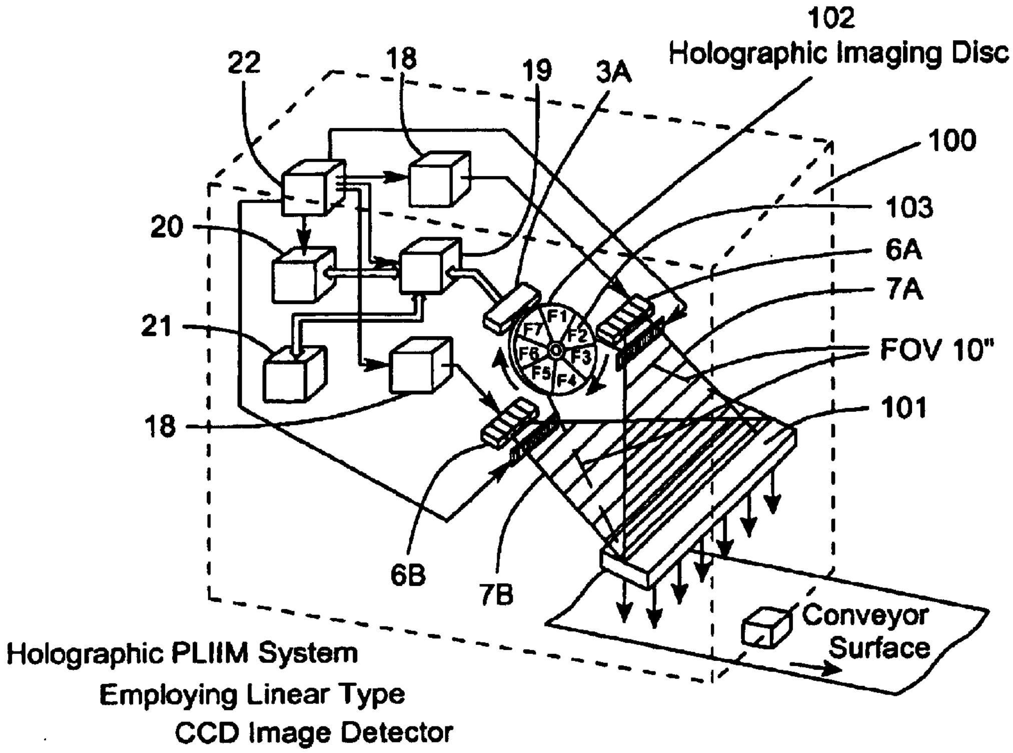
Figure 10:
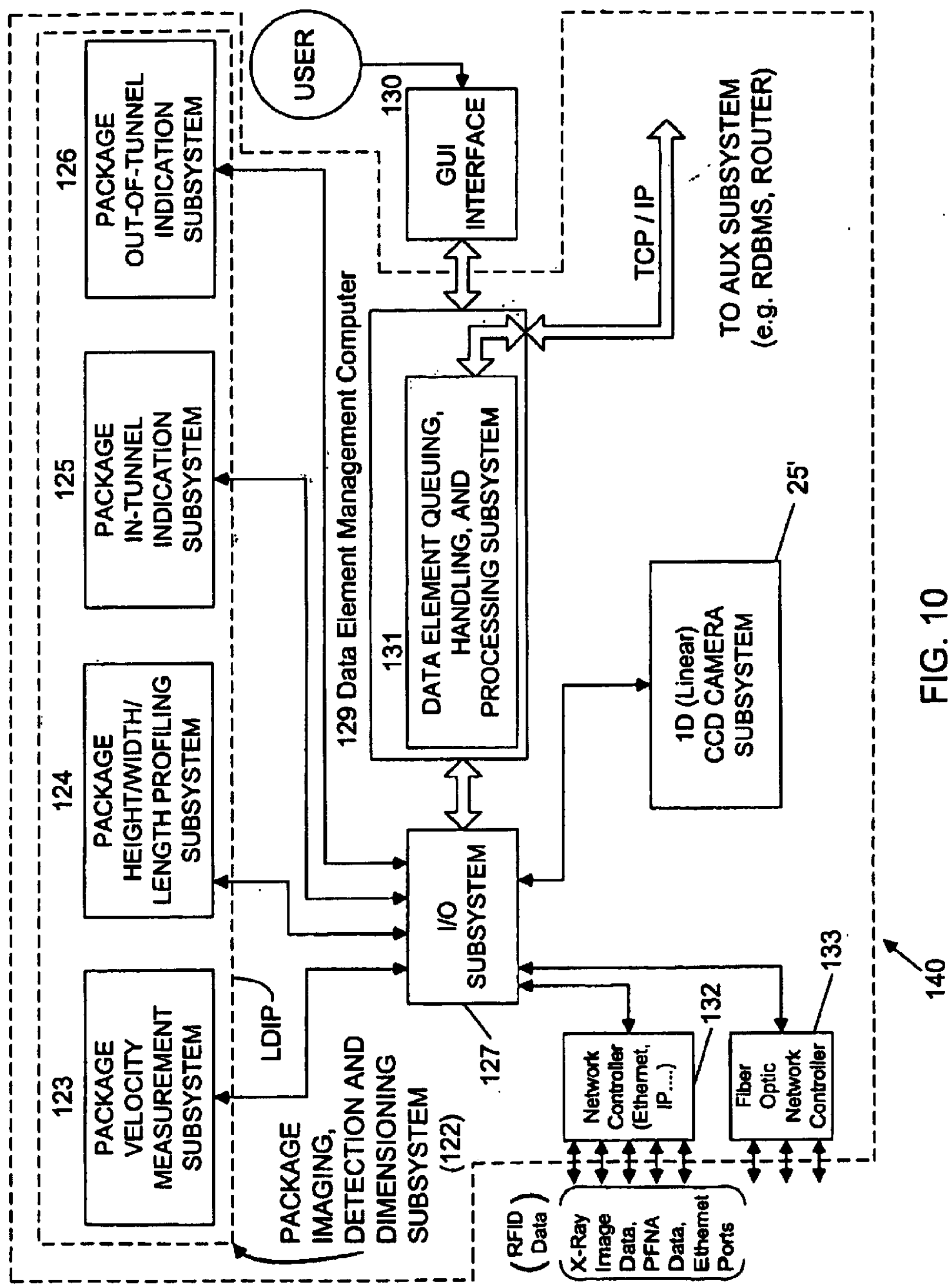
Figure 10A:
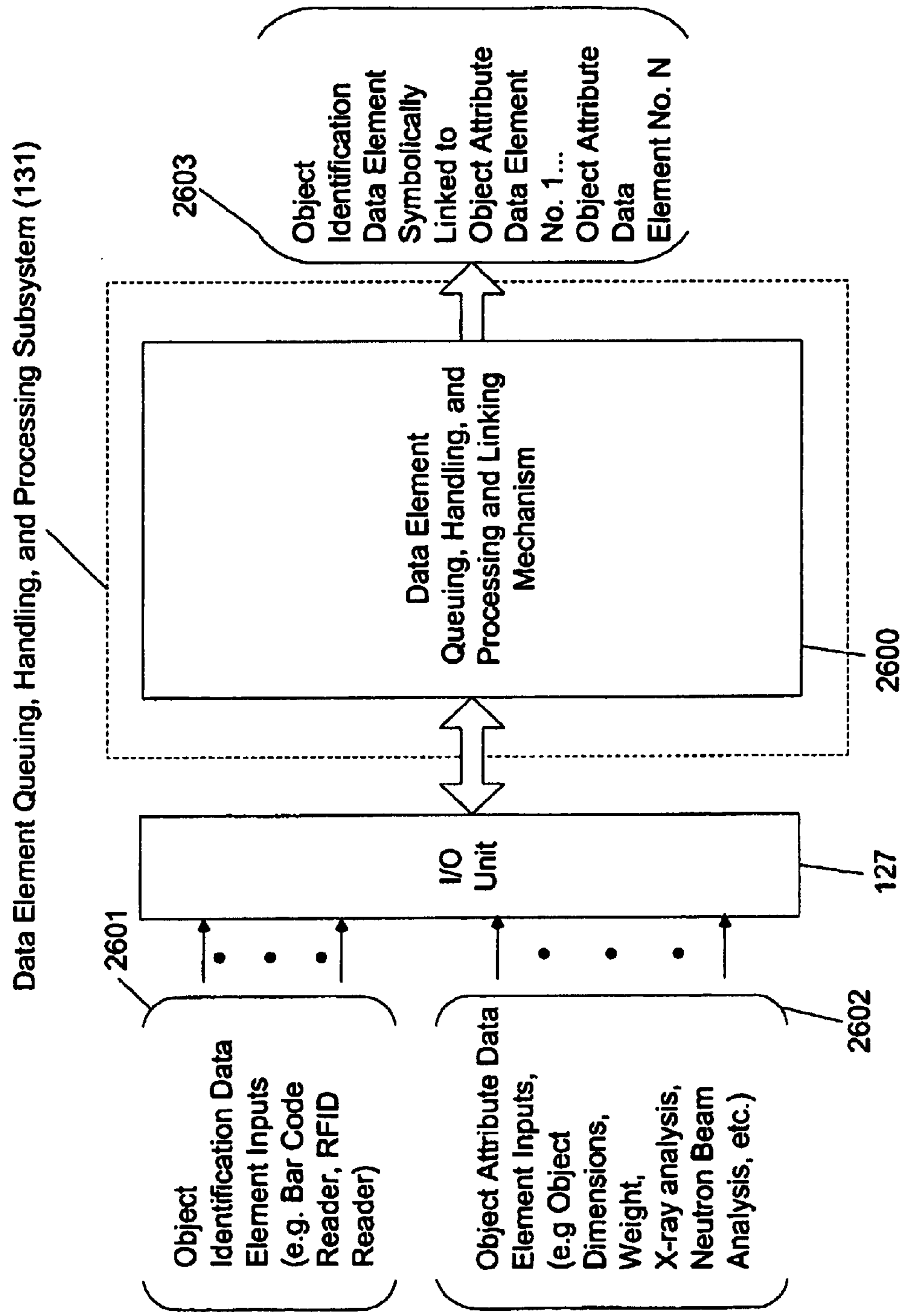
Figures 1, 10B:
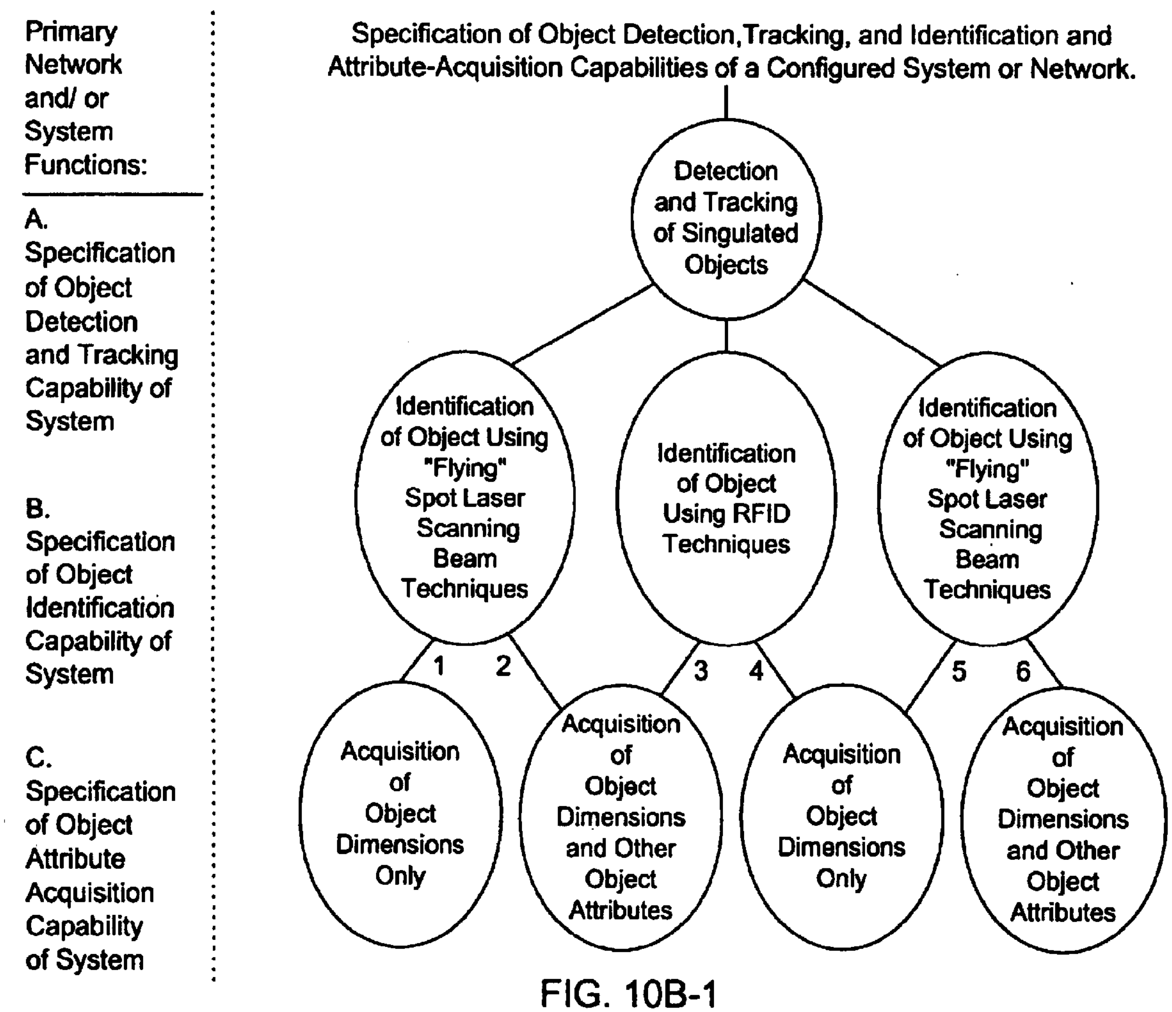
Figures 2, 10B:
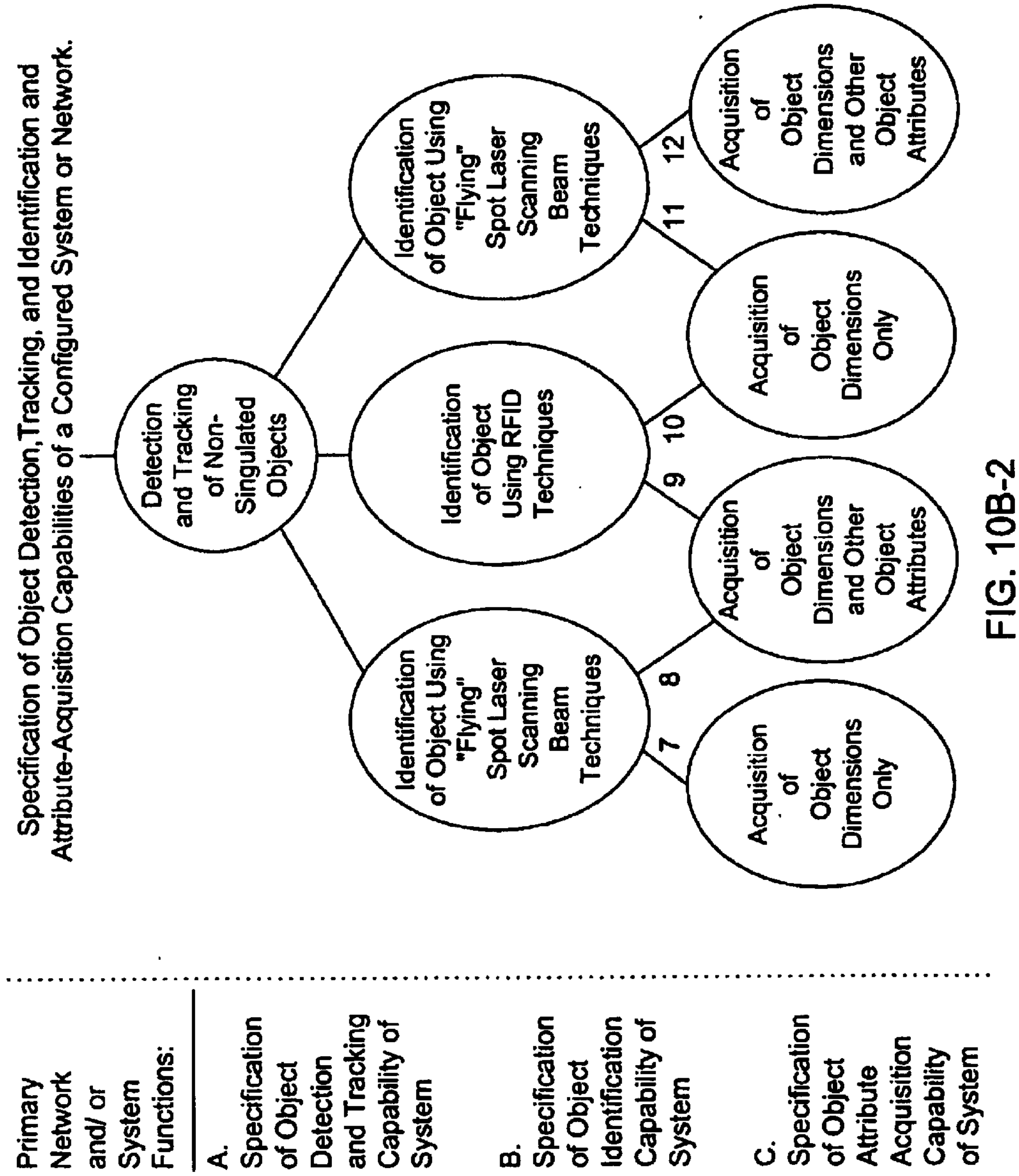
Figure 12A:
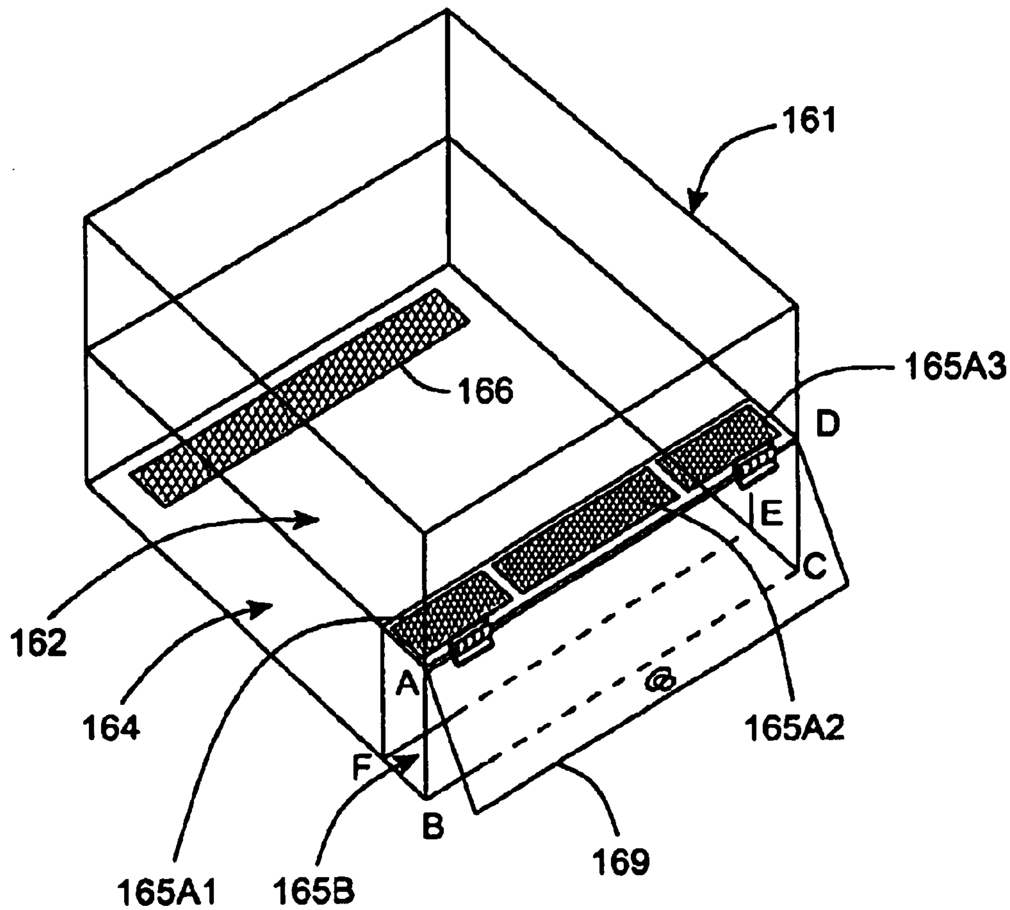
Figure 12B:
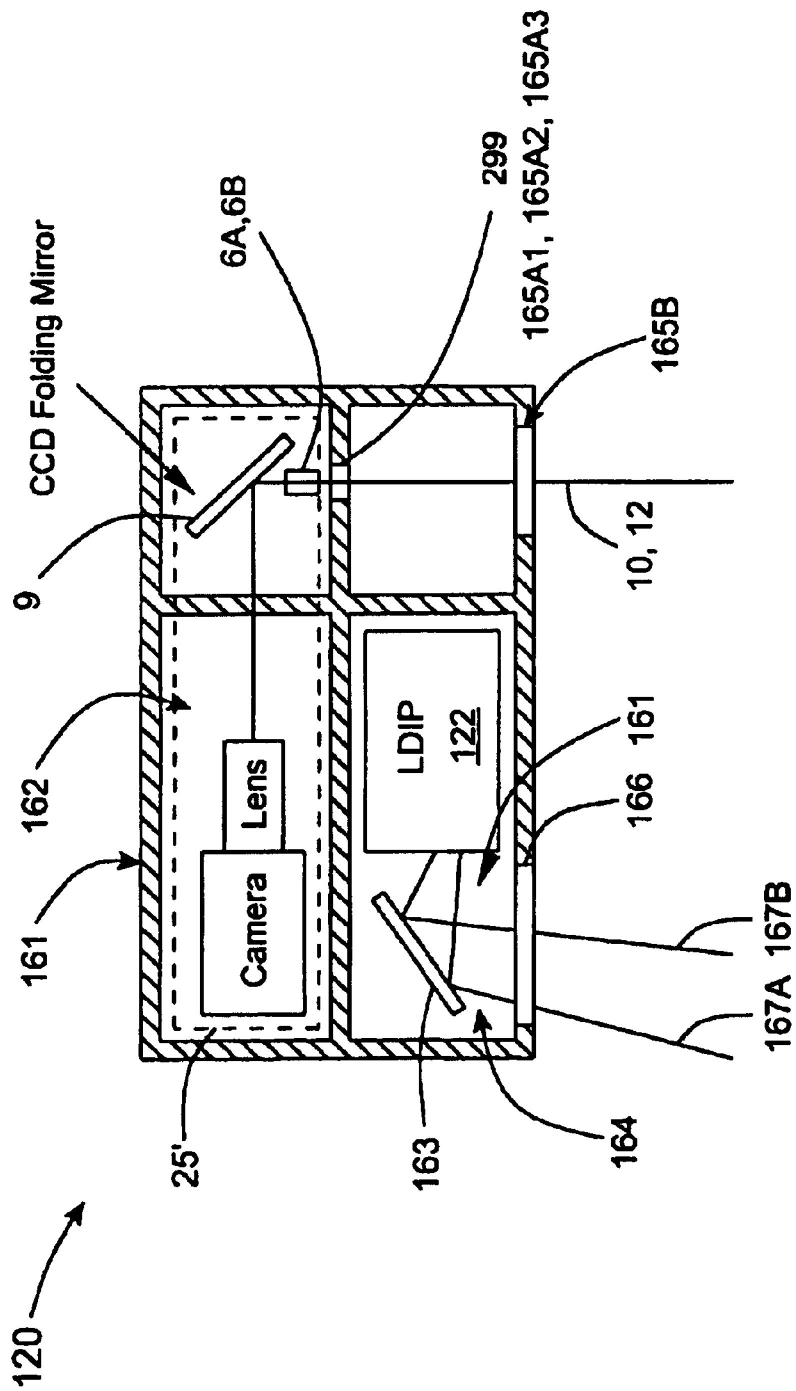
Figure 17:
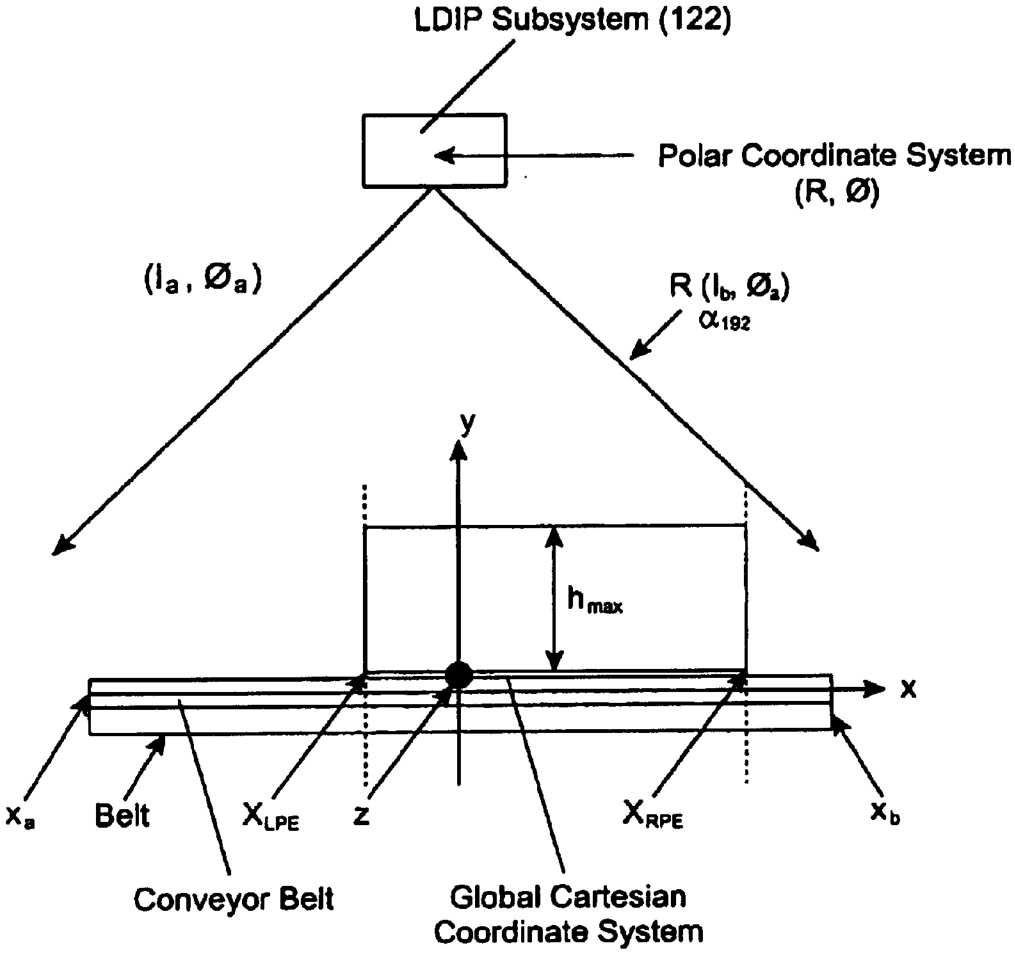
Figure 17A:
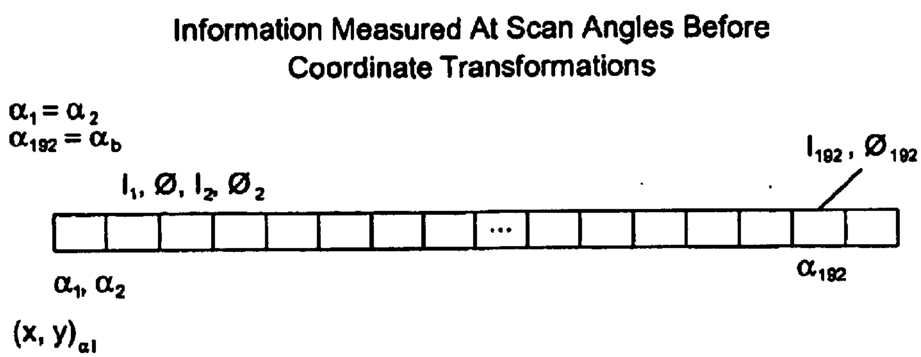
Figure 17B:
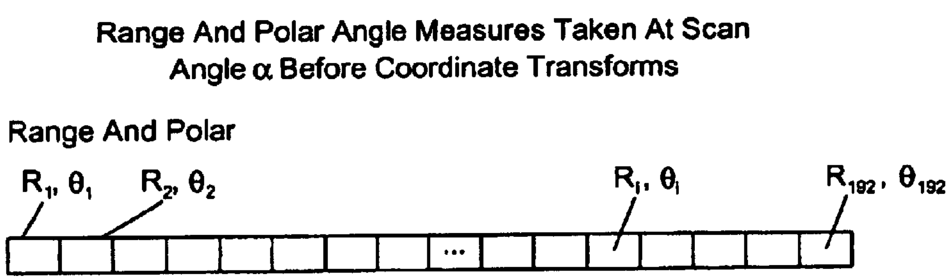
Figure 20:
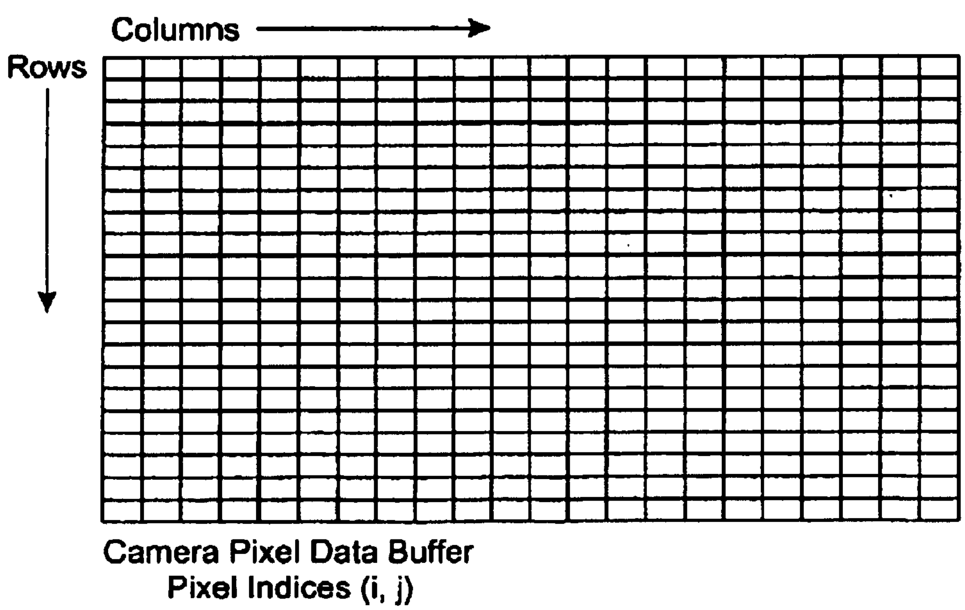
Figure 22A:
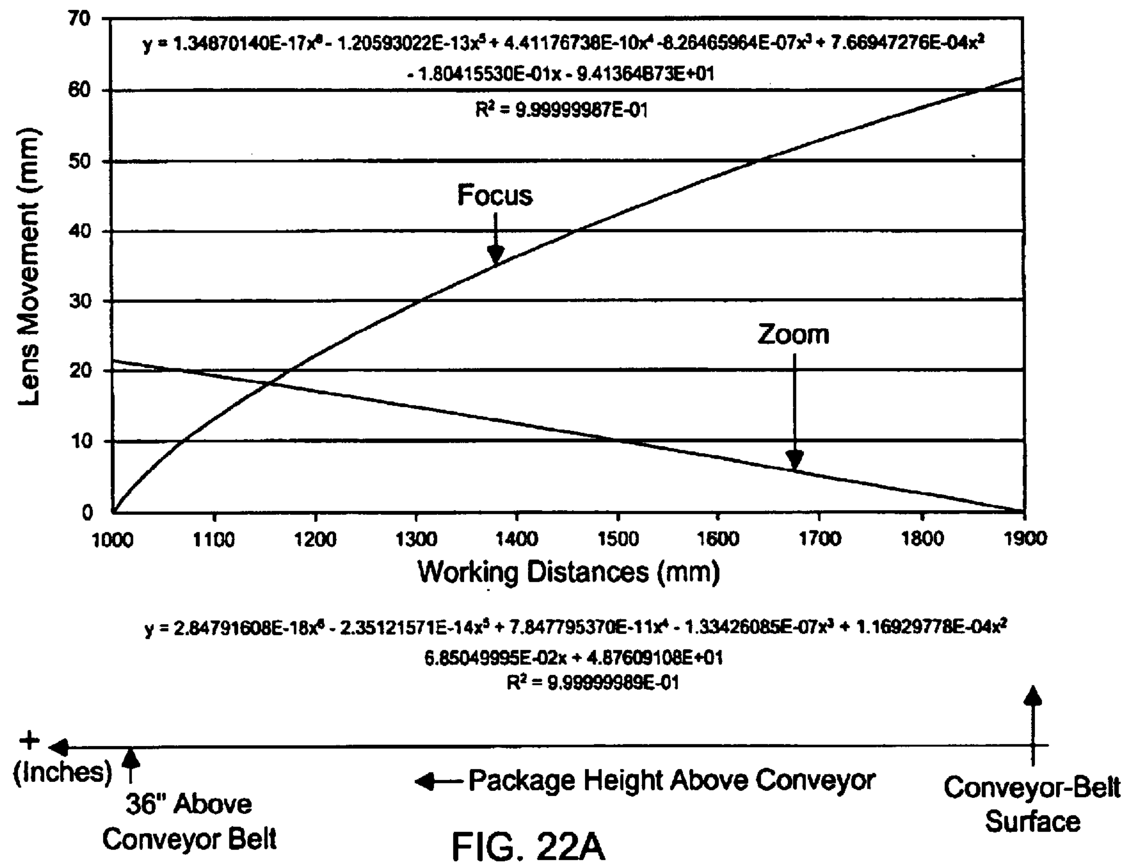
Figure 22B:
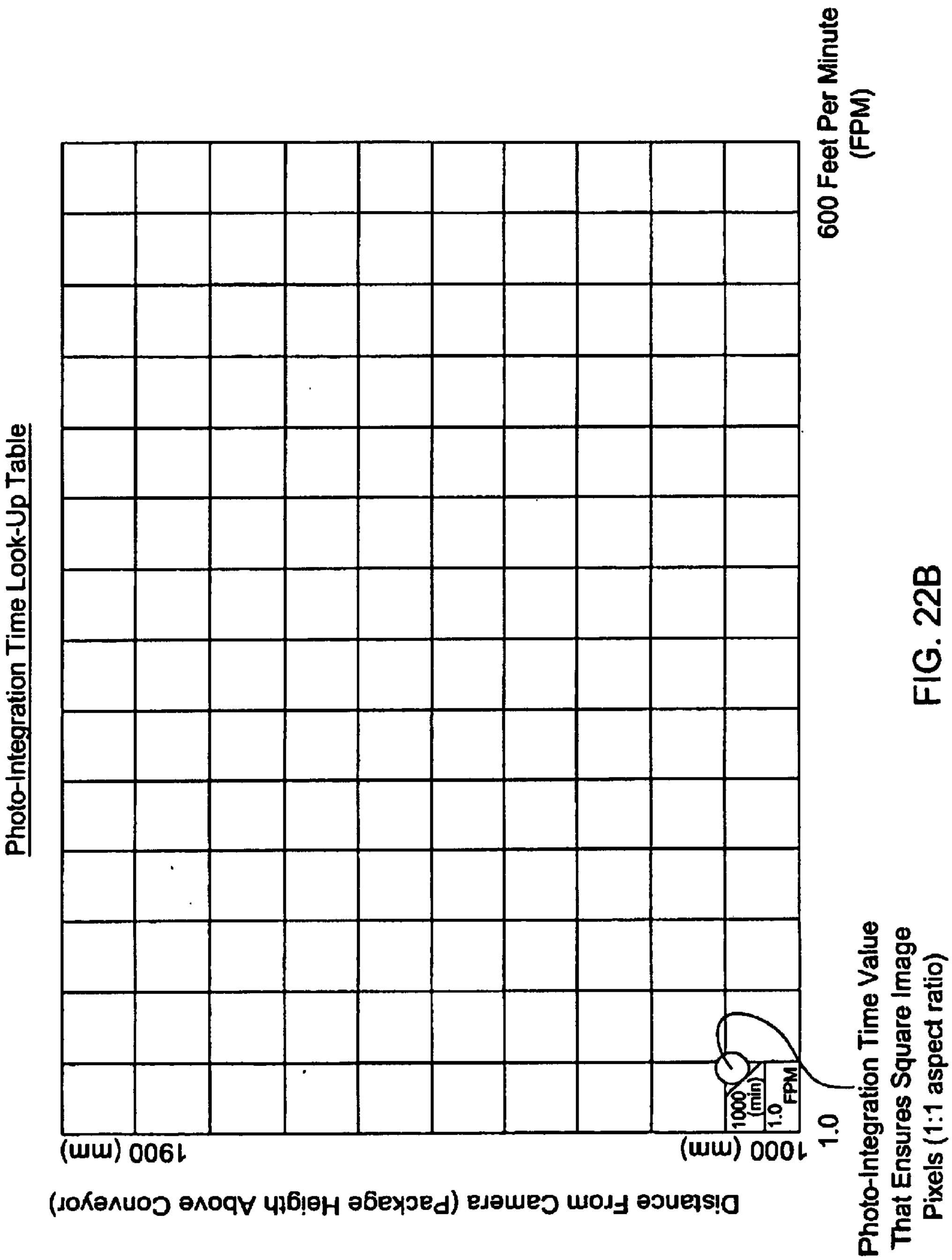
Figure 23A:
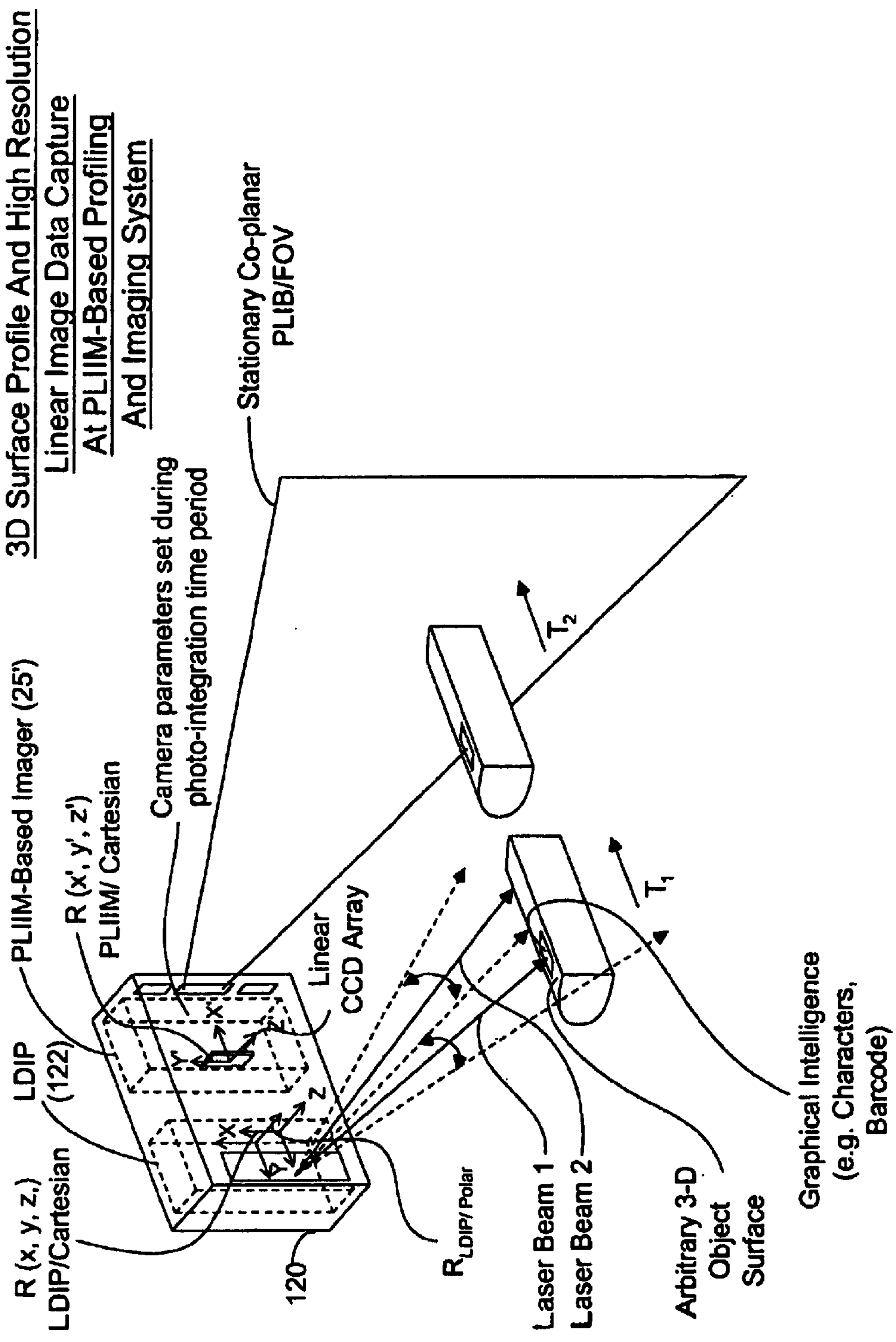
Figure 23B:
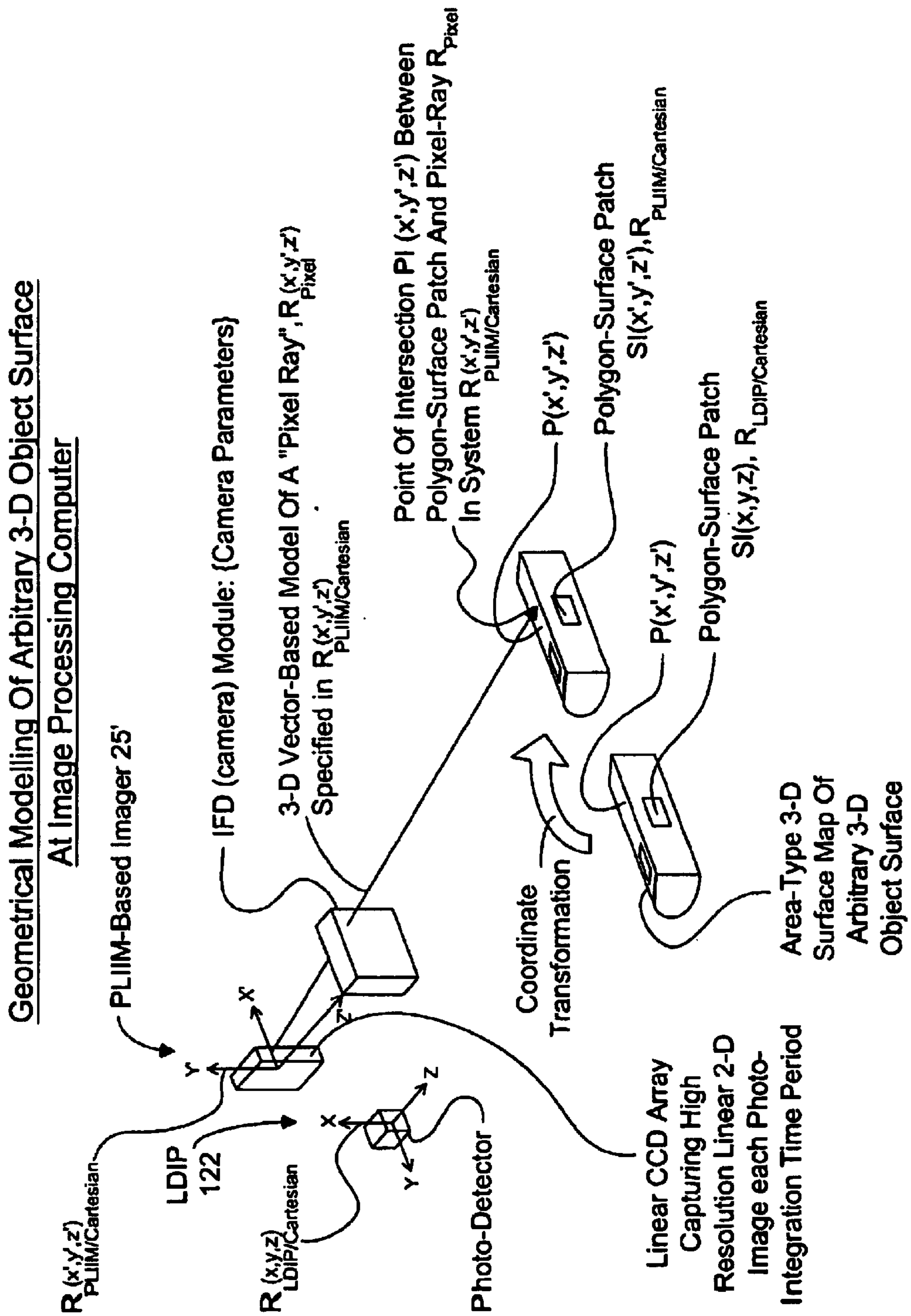
Figure 24:
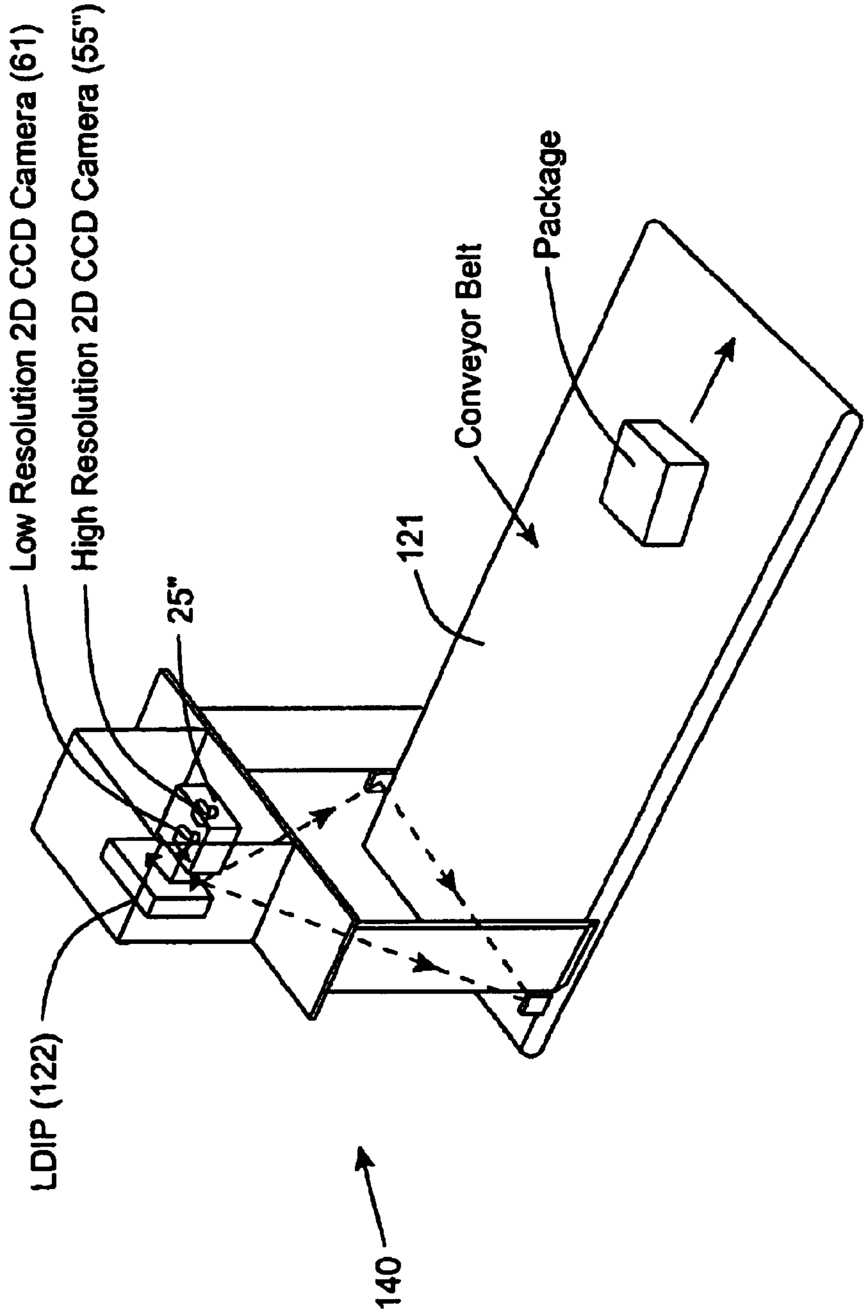
Figure 25:
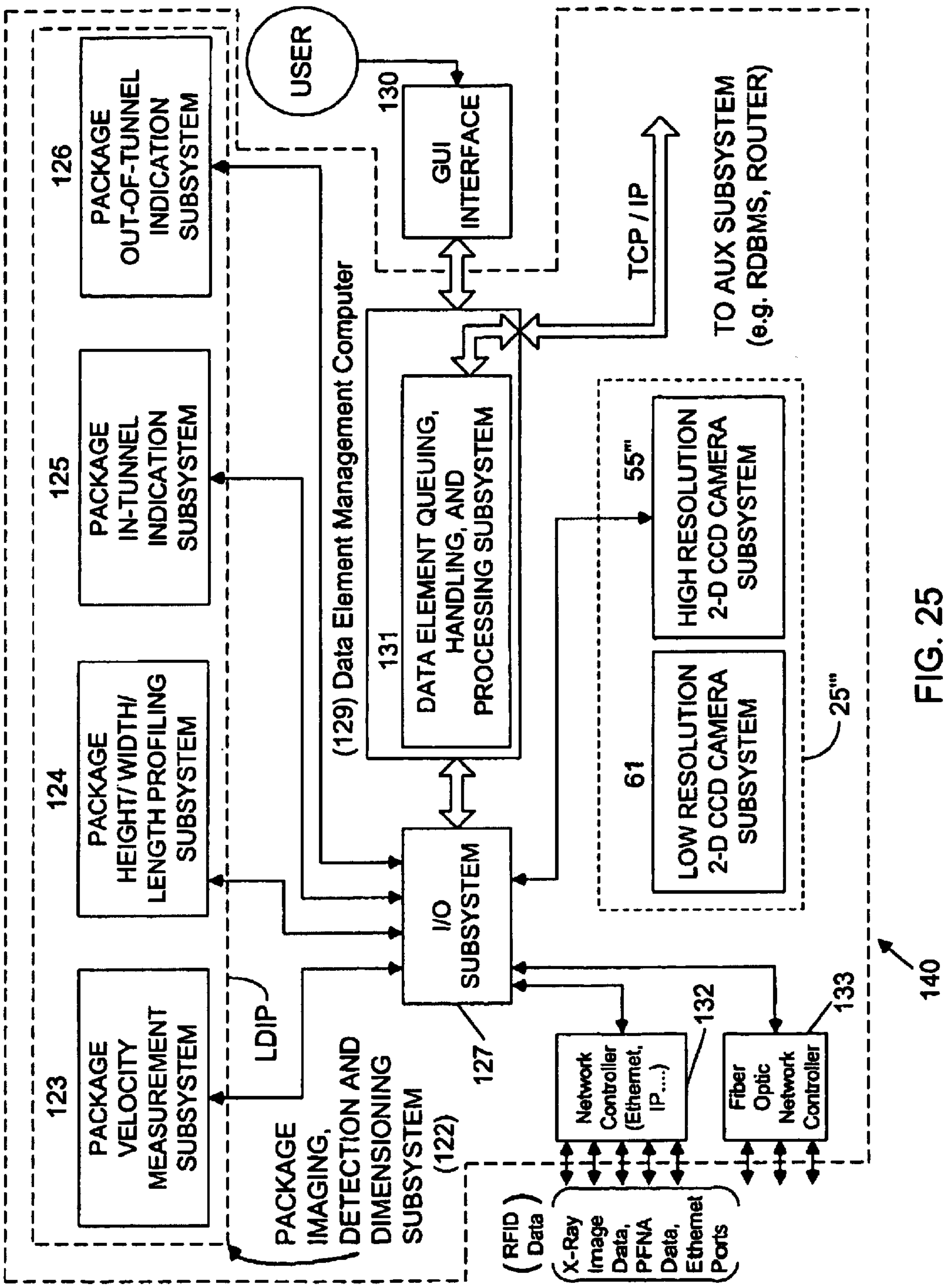
Figure 25A:
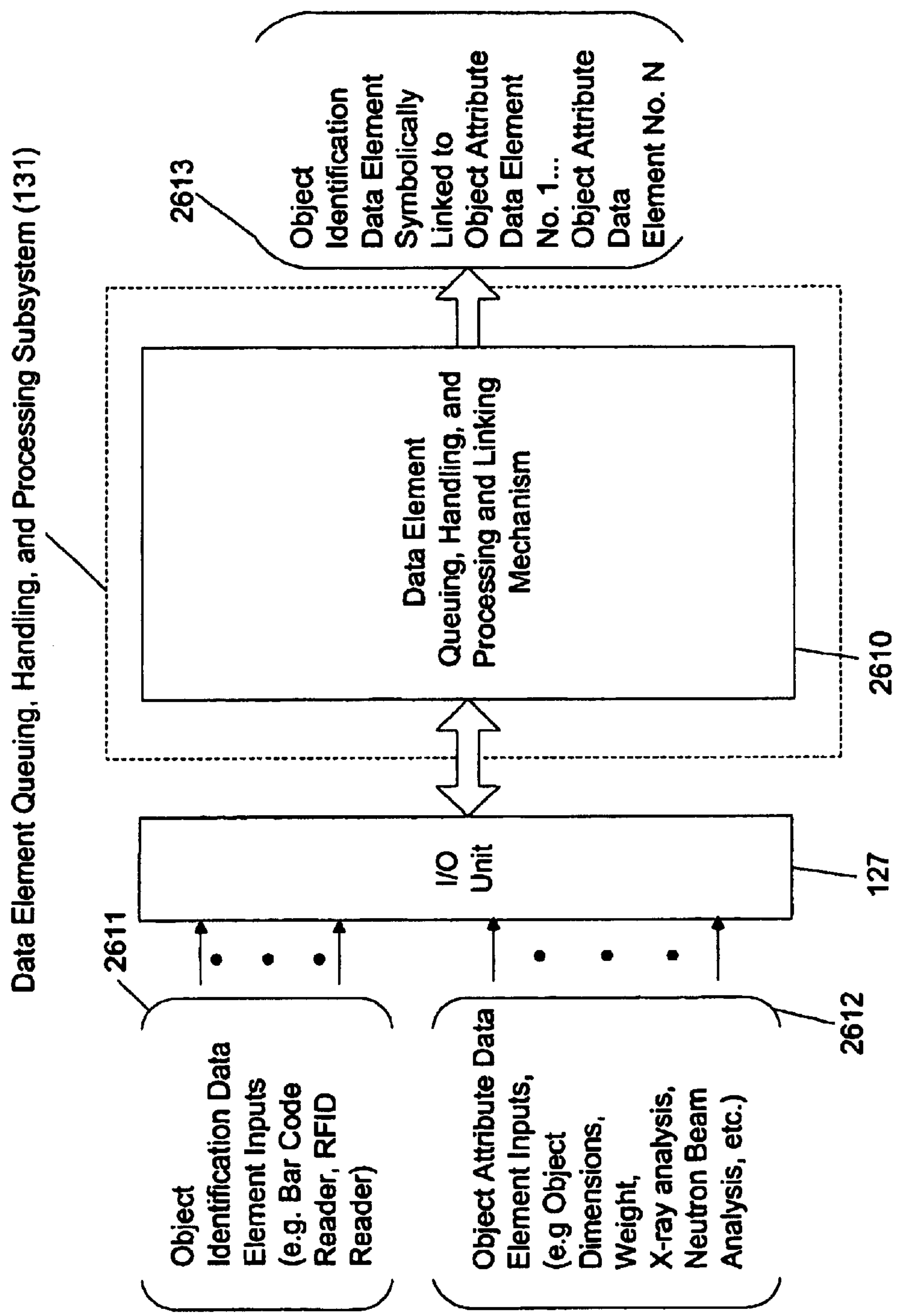
Figures 1, 25B:
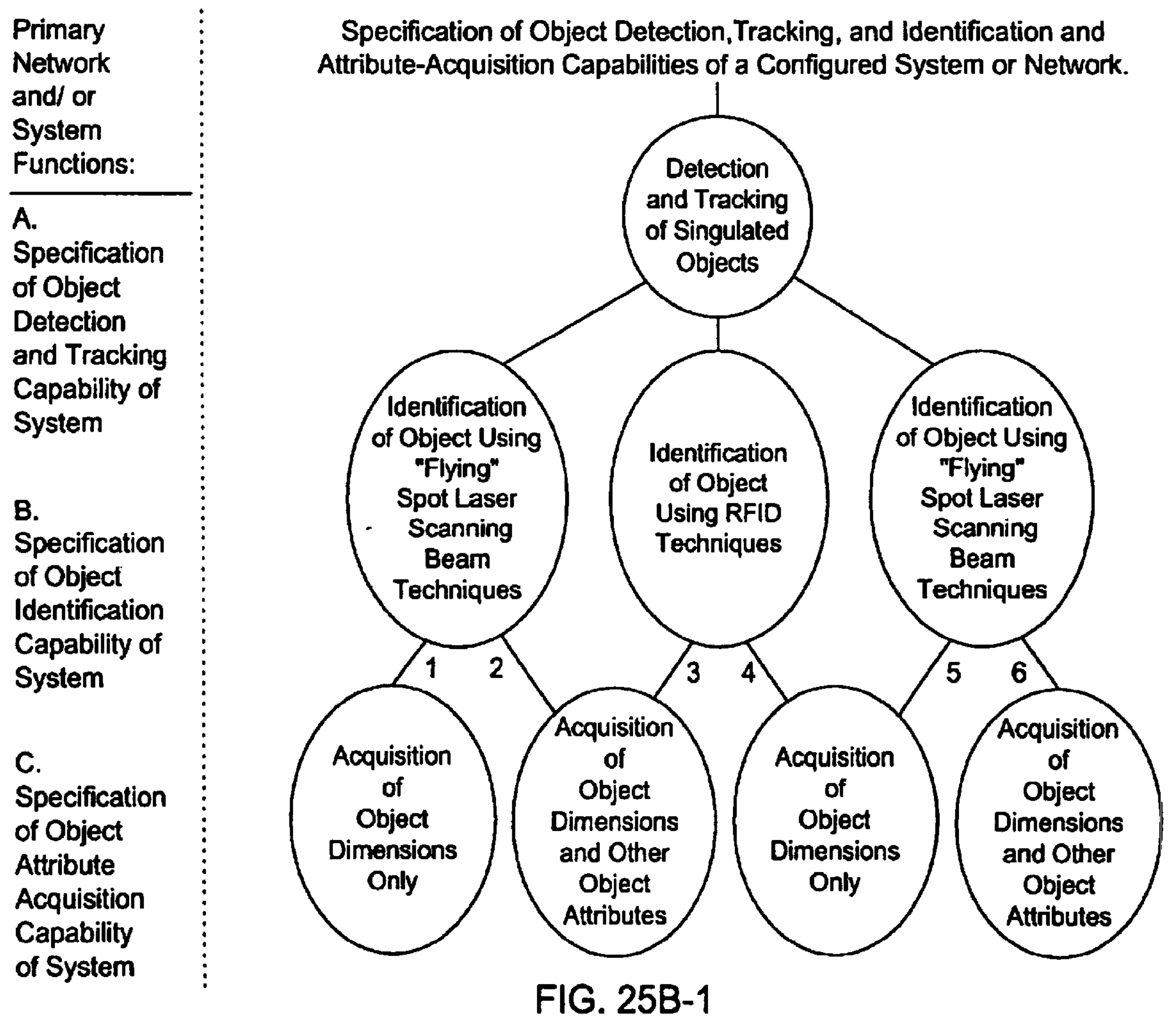
Figures 2, 25B:
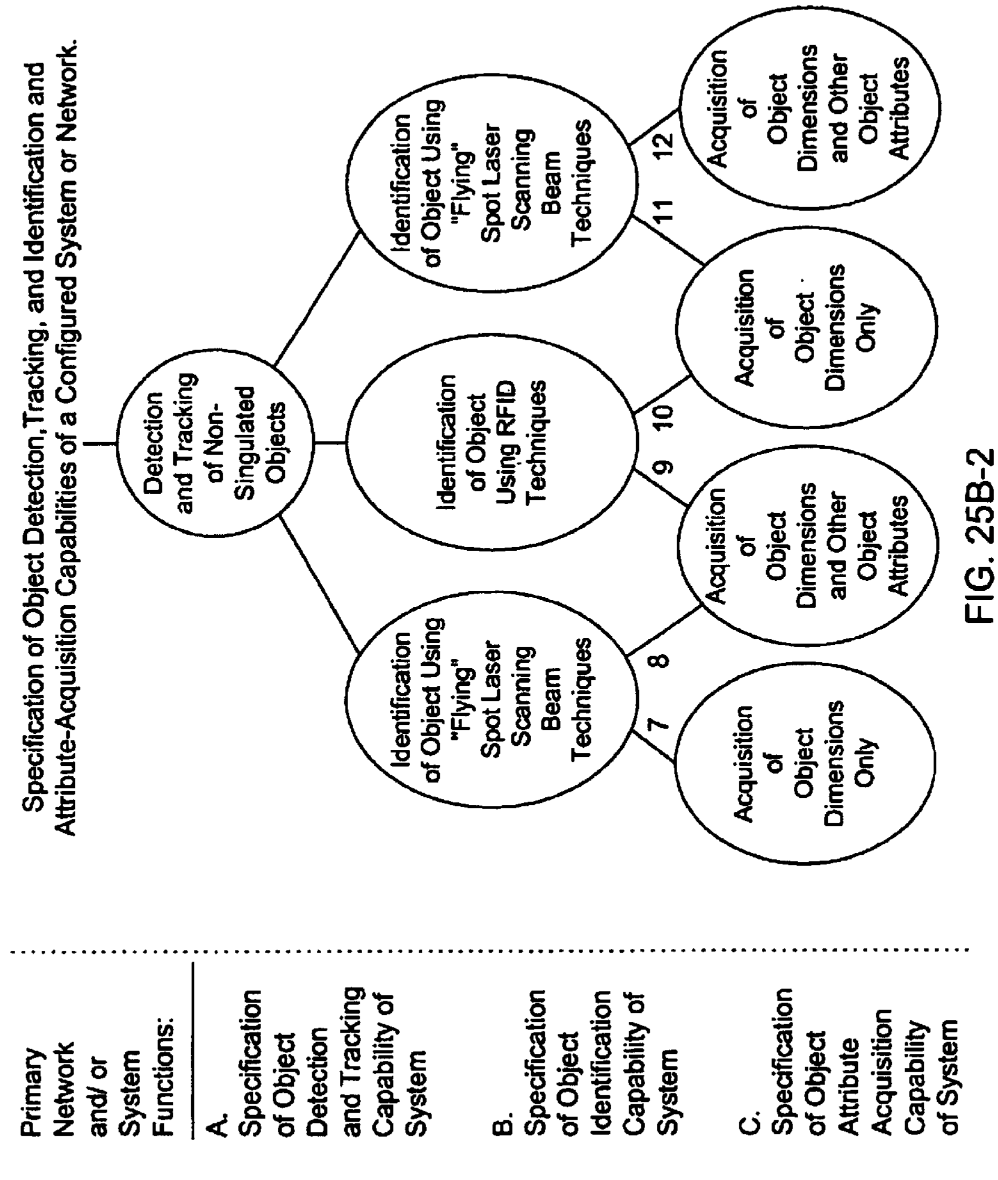
Figures 1, 30:
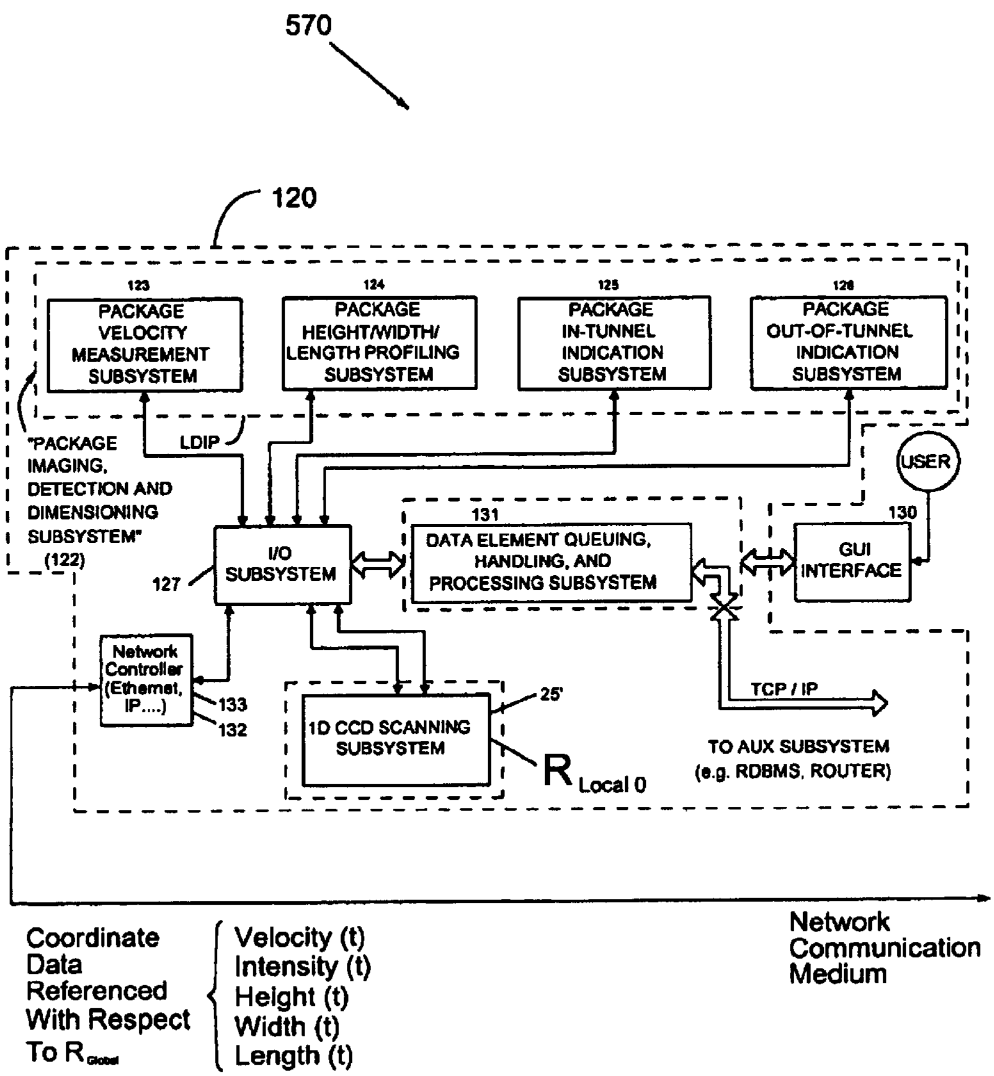
Figures 2, 30:
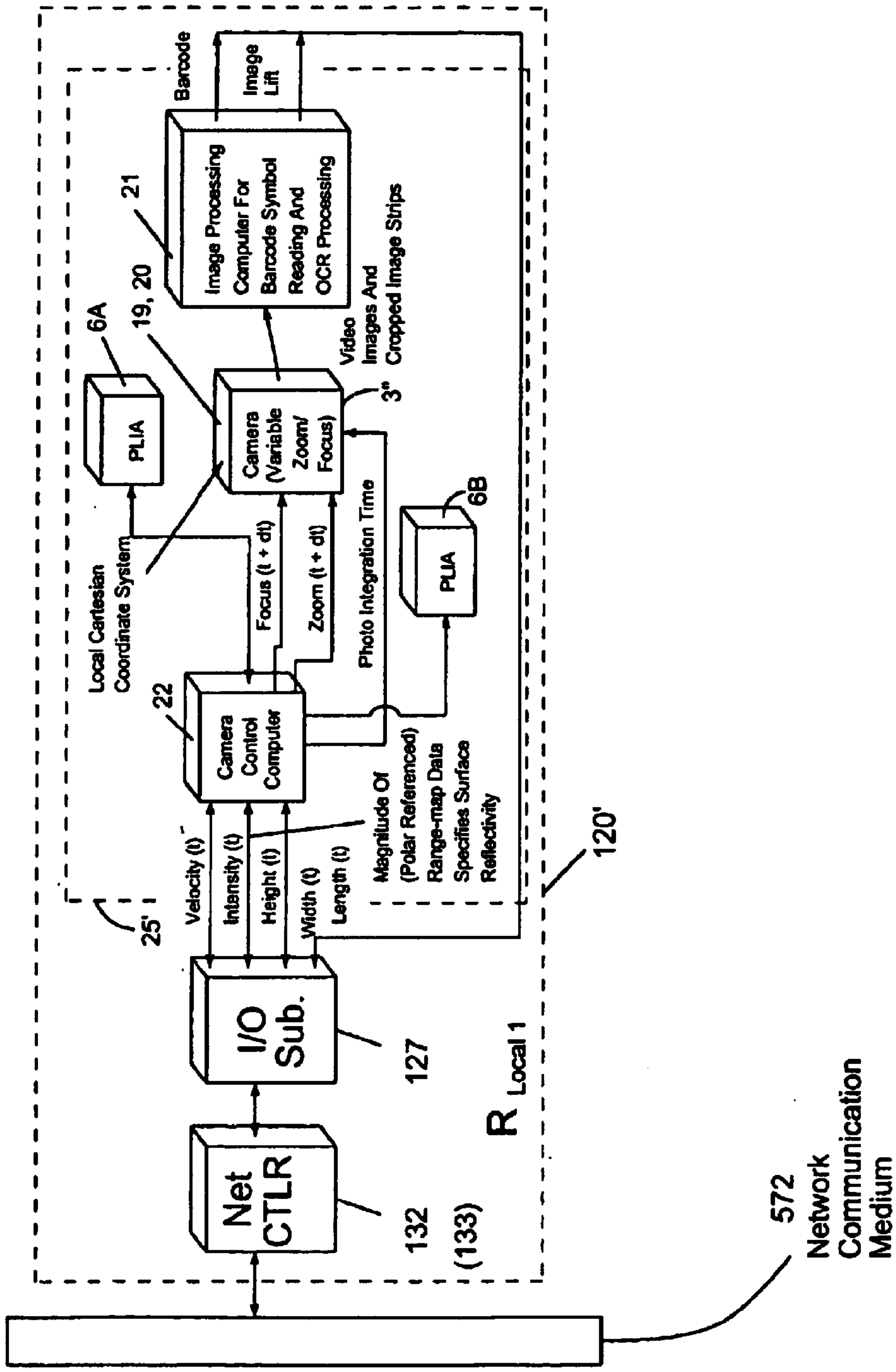
Figures 3, 30:
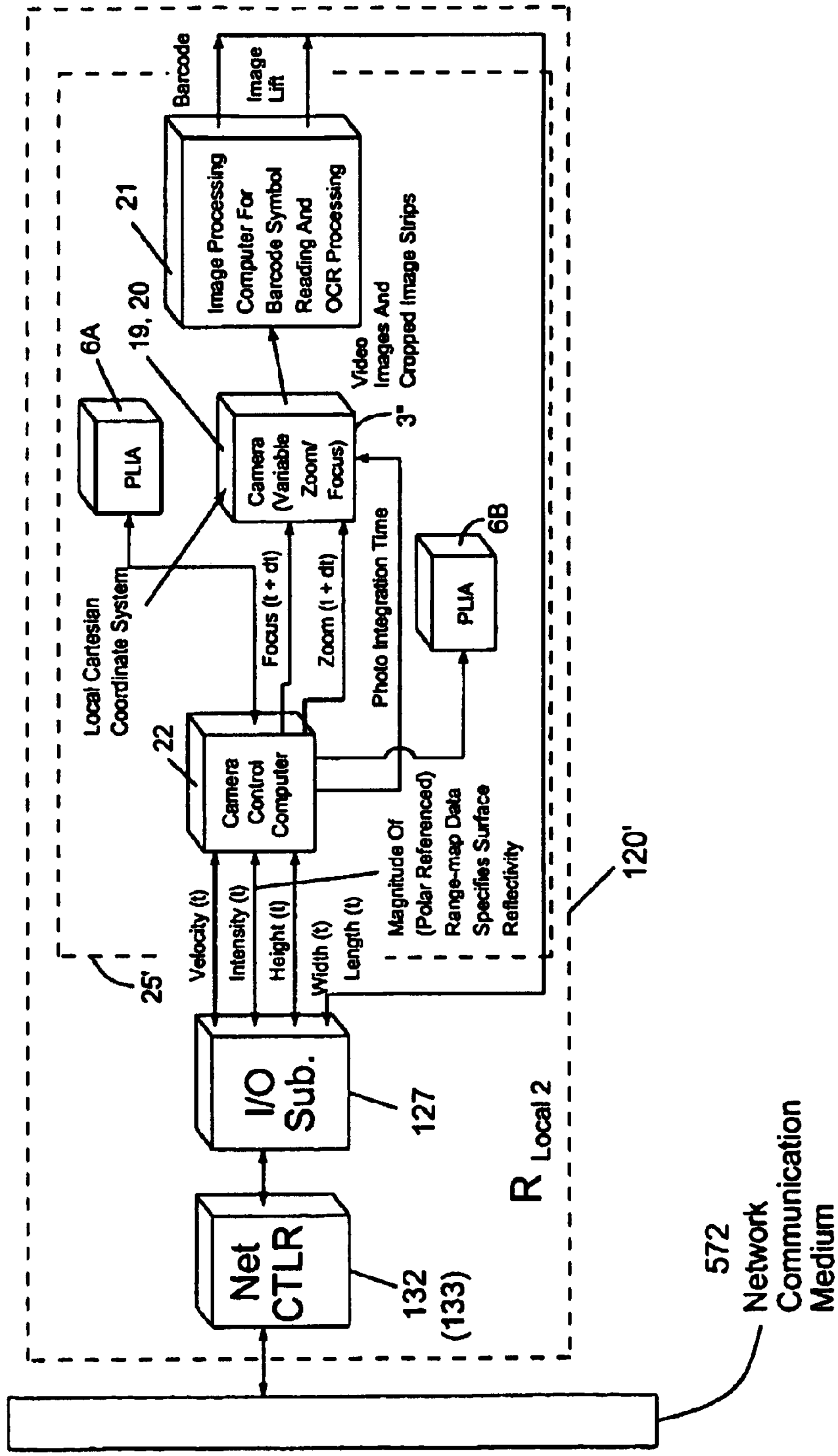
Figures 4, 30:
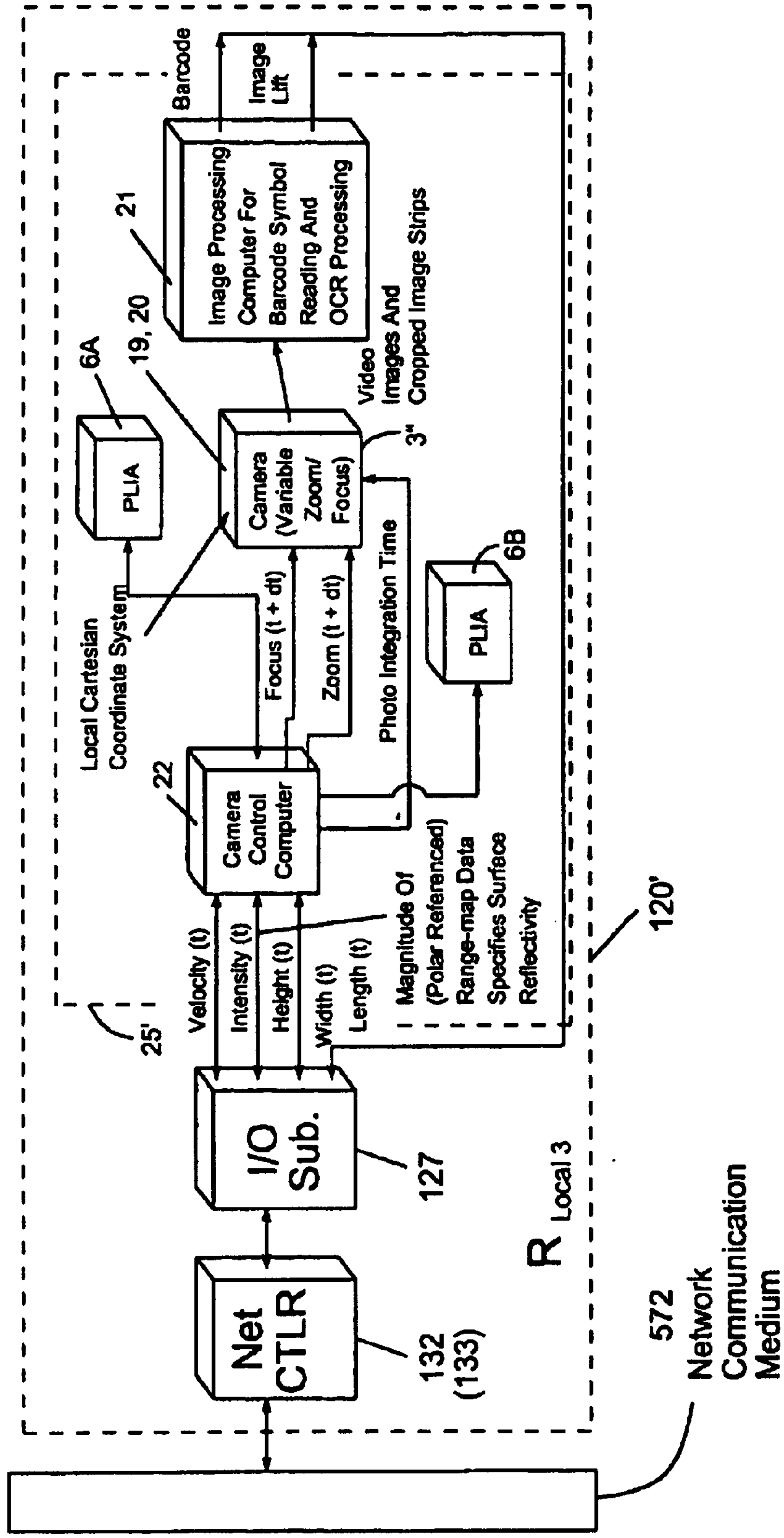

speckle-noise patterns are produced and detected over the photo-integration time period of the image detection array, thereby allowing the speckle-noise patterns to be temporally averaged over the photo-integration time period and spatially averaged over the image detection element and the observable speckle-noise pattern reduced;

FIG. 1I22A is a schematic representation of the PLIIM-based system of FIG. 1I20, illustrating the sixth generalized speckle-noise pattern reduction method of the present invention applied at the IFD Subsystem employed therein, wherein numerous substantially different speckle-noise patterns are produced at the image detection array during the photo-integration time period thereof by spatial intensity modulating the wavefront of the received/scattered PLIB, and the time-varying speckle-noise patterns are temporally and spatially averaged at the image detection array during the photo-integration time period thereof, to thereby reduce the RMS power of speckle-noise patterns observed at the image detection array;

FIG. 1I22B is a high-level flow chart setting forth the primary steps involved in practicing the sixth generalized method of reducing observable speckle-noise patterns in PLIIM-based systems, illustrated in FIGS. 1I20 and 1I21A;

FIG. 1I23A is a schematic representation of a first illustrative embodiment of the PLIIM-based system shown in FIG. 1I20, wherein an electro-optical mechanism is used to generate a rotating maltese-cross aperture (or other spatial intensity modulation plate) disposed before the pupil of the IFD Subsystem, so that the wavefront of the return PLIB is spatial-intensity modulated at the IFD subsystem in accordance with the principles of the present invention;

FIG. 1I23B is a schematic representation of a second illustrative embodiment of the system shown in FIG. 1I20, wherein an electro-mechanical mechanism is used to generate a rotating maltese-cross aperture (or other spatial intensity modulation plate) disposed before the pupil of the IFD Subsystem, so that the wavefront of the return PLIB is spatial intensity modulated at the IFD subsystem in accordance with the principles of the present invention;

FIG. 1I24 is a schematic representation of the PLIIM-based system of FIG. 1A illustrating the seventh generalized method of reducing the RMS power of observable speckle-noise patterns, wherein the wavefront of the planar laser illumination beam (PLIB) reflected/scattered from the illuminated object and received at the IFD Subsystem is temporal intensity modulated according to a temporal-intensity modulation function (TIMF), thereby producing numerous substantially different time-varying (random) speckle-noise patterns which are detected over the photo-integration time period of the image detection array, thereby reducing the RMS power of observable speckle-noise patterns;

FIG. 1I24A is a schematic representation of the PLIIM-based system of FIG. 1I24, illustrating the seventh generalized speckle-noise pattern reduction method of the present invention applied at the IFD Subsystem employed therein, wherein numerous substantially different time-varying speckle-noise patterns are produced at the image detection array during the photo-integration time period thereof by modulating the temporal intensity of the wavefront of the received/scattered PLIB, and the time-varying speckle-noise patterns are temporally and spatially averaged at the image detection array during the photo-integration time period thereof, thereby reducing the RMS power of speckle-noise patterns observed at the image detection array;

FIG. 1I24B is a high-level flow chart setting forth the primary steps involved in practicing the seventh generalized method of reducing observable speckle-noise patterns in PLIM-based systems, illustrated in FIGS. 1I24 and 1I24A;

FIG. 1I24C is a schematic representation of an illustrative embodiment of the PLIM-based system shown in FIG. 1I24, wherein is used to carry out wherein a high-speed electro-optical temporal intensity modulation panel, mounted before the imaging optics of the IFD subsystem, is used to temporal intensity modulate the wavefront of the return PLIB at the IFD subsystem in accordance with the principles of the present invention;

FIG. 1I24D is a flow chart of the eight generalized speckle-noise pattern reduction method of the present invention applied at the IFD Subsystem of a hand-held (linear or area type) PLIIM-based imager of the present invention, shown in FIGS. 1V4, 2H, 2I5, 3I, 3J5, and 4E, wherein a series of consecutively captured digital images of an object, containing speckle-pattern noise, are captured and buffered over a series of consecutively different photo-integration time periods in the hand-held PLIIM-based imager, and thereafter spatially corresponding pixel data subsets defined over a small window in the captured digital images are additively combined and averaged so as to produce spatially corresponding pixels data subsets in a reconstructed image of the object, containing speckle-pattern noise having a substantially reduced level of RMS power;

FIG. 1I24E is a schematic illustration of step A in the speckle-pattern noise reduction method of FIG. 1I24D, carried out within a hand-held linear-type PLIIM-based imager of the present invention;

FIG. 1I24F is a schematic illustration of steps B and C in the speckle-pattern noise reduction method of FIG. 1I24D, carried out within a hand-held linear-type PLIIM-based imager of the present invention;

FIG. 1I24G is a schematic illustration of step A in the speckle-pattern noise reduction method of FIG. 1I24D, carried out within a hand-held area-type PLIIM-based imager of the present invention;

FIG. 1I24H is a schematic illustration of steps B and C in the speckle-pattern noise reduction method of FIG. 1I24D, carried out within a hand-held area-type PLIIM-based imager of the present invention;

FIG. 1I24I is a flow chart of the ninth generalized speckle-noise pattern reduction method of the present invention applied at the IFD Subsystem of a linear type PLIIM-based imager of the present invention shown in FIGS. 1V4, 2H, 2I5, 3I, 3J5, and 4E and FIGS. 39A through 51C, wherein linear image detection arrays having vertically-elongated image detection elements are used in order to enable spatial averaging of spatially and temporally varying speckle-noise patterns produced during each photo-integration time period of the image detection array, thereby reducing speckle-pattern noise power observed during imaging operations;

FIG. 1I25A1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating cylindrical lens array as shown in FIGS. 1I4A through 1I4D and a micro-oscillating PLIB reflecting mirror configured together as an optical assembly for the purpose of micro-oscillating the PLIB laterally along its planar extent as well as transversely along the direction orthogonal thereto, so that during illumination operations, the PLIB wavefront is spatial phase modulated along the planar extent thereof as well as along the direction orthogonal thereto, causing numerous substantially different time-varying speckle-noise patterns to be produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25A2 is an elevated side view of the PLIIM-based system of FIG. 1I25A1, showing the optical path traveled by the planar laser illumination beam (PLIB) produced from one of the PLIMs during object illumination operations, as the PLIB is micro-oscillated in orthogonal dimensions by the 2-D PLIB micro-oscillation mechanism, in relation to the field of view (FOV) of each image detection element employed in the IFD subsystem of the PLIIM-based system;

FIG. 1I25B1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a stationary PLIB folding mirror, a micro-oscillating PLIB reflecting element, and a stationary cylindrical lens array as shown in FIGS. 1I5A through 1I5D configured together as an optical assembly as shown for the purpose of micro-oscillating the PLIB laterally along its planar extent as well as transversely along the direction orthogonal thereto, so that during illumination operations, the PLIB transmitted from each PLIM is spatial phase modulated along the planar extent thereof as well as along the direction orthogonal thereto, causing numerous substantially different time-varying speckle-noise patterns to be produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25B2 is an elevated side view of the PLIIM-based system of FIG. 1I25B1, showing the optical path traveled by the PLIB produced from one of the PLIMs during object illumination operations, as the PLIB is micro-oscillated in orthogonal dimensions by the 2-D PLIB micro-oscillation mechanism in relation to the field of view (FOV) of each image detection element in the IFD subsystem of the PLIIM-based system;

FIG. 1I25C1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating cylindrical lens array as shown in FIGS. 1I6A through 1I6B and a micro-oscillating PLIB reflecting element configured together as shown as an optical assembly for the purpose of micro-oscillating the PLIB laterally along its planar extent as well as transversely along the direction orthogonal thereto, so that during illumination operations, the PLIB transmitted from each PLIM is spatial phase modulated along the planar extent thereof as well as along the direction orthogonal (i.e. transverse) thereto, causing numerous substantially different time-varying speckle-noise patterns to be produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25C2 is an elevated side view of the PLIIM-based system of FIG. 1I25C1, showing the optical path traveled by the PLIB produced from one of the PLIMs during object illumination operations, as the PLIB is micro-oscillated in orthogonal dimensions by the 2-D PLIB micro-oscillation mechanism, in relation to the field of view (FOV) of each image detection element in the IFD subsystem of the PLIIM-based system;

FIG. 1I25D1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating high-resolution deformable mirror structure as shown in FIGS. 1I7A through 1I7C, a stationary PLIB reflecting element and a stationary cylindrical lens array configured together as an optical assembly as shown for the purpose of micro-oscillating the PLIB laterally along its planar extent as well as transversely along the direction orthogonal thereto, so that during illumination operation, the PLIB transmitted from each PLIM is spatial phase modulated along the planar extent thereof as well as along the direction orthogonal (i.e. transverse) thereto, causing numerous substantially different time-varying speckle-noise patterns to be produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25D2 is an elevated side view of the PLIIM-based system of FIG. 1I25D1, showing the optical path traveled by the PLIB produced from one of the PLIMs during object illumination operations, as the PLIB is micro-oscillated in orthogonal dimensions by the 2-D PLIB micro-oscillation mechanism in relation to the field of view (FOV) of each image detection element in the IFD subsystem of the PLIM-based system;

FIG. 1I25E1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating cylindrical lens array structure as shown in FIGS. 1I3A through 1I4D for micro-oscillating the PLIB laterally along its planar extend, a micro-oscillating PLIB/FOV refraction element for micro-oscillating the PLIB and the field of view (FOV) of the linear CCD image sensor transversely along the direction orthogonal to the planar extent of the PLIB, and a stationary PLIB/FOV folding mirror configured together as an optical assembly as shown for the purpose of micro-oscillating the PLIB laterally along its planar extent while micro-oscillating both the PLIB and FOV of the linear CCD image sensor transversely along the direction orthogonal thereto, so that during illumination operation, the PLIB transmitted from each PLIM is spatial phase modulated along the planar extent thereof as well as along the direction orthogonal (i.e. transverse) thereto, causing numerous substantially different time-varying speckle-noise patterns to be produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25E2 is an elevated side view of the PLIIM-based system of FIG. 1I25E1, showing the optical path traveled by the PLIB produced from one of the PLIMs during object illumination operations, as the PLIB is micro-oscillated in orthogonal dimensions by the 2-D PLIB micro-oscillation mechanism, in relation to the field of view (FOV) of each image detection element in the IFD subsystem of the PLIIM-based system;

FIG. 1I25F1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating cylindrical lens array structure as shown in FIGS. 1I3A through 1I4D for micro-oscillating the PLIB laterally along its planar extend, a micro-oscillating PLIB/FOV reflection element for micro-oscillating the PLIB and the field of view (FOV)of the linear CCD image sensor transversely along the direction orthogonal to the planar extent of the PLIB, and a stationary PLIB/FOV folding mirror configured together as an optical assembly as shown for the purpose of micro-oscillating the PLIB laterally along its planar extent while micro-oscillating both the PLIB and FOV of the linear CCD image sensor transversely along the direction orthogonal thereto, so that during illumination operation, the PLIB transmitted from each PLIM is spatial phase modulated along the planar extent thereof as well as along the direction orthogonal thereto, causing numerous substantially different time-varying speckle-noise patterns to be produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25F2 is an elevated side view of the PLIIM-based system of FIG. 1I25F1, showing the optical path traveled by the PLIB produced from one of the PLIMs during object illumination operations, as the PLIB is micro-oscillated in orthogonal dimensions by the 2-D PLIB micro-oscillation mechanism in relation to the field of view (FOV) of each image detection element in the IFD subsystem of the PLIIM-based system;

FIG. 1I25G1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a phase-only LCD phase modulation panel as shown in FIGS. 1I8F and 1IG, a stationary cylindrical lens array, and a micro-oscillating PLIB reflection element, configured together as an optical assembly as shown for the purpose of micro-oscillating the PLIB laterally along its planar extent while micro-oscillating the PLIB transversely along the direction orthogonal thereto, so that during illumination operations, the PLIB transmitted from each PLIM is spatial phase modulated along the planar extent thereof as well as along the direction orthogonal (i.e. transverse) thereto, causing numerous substantially different time-varying speckle-noise patterns are produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25G2 is an elevated side view of the PLIIM-based system of FIG. 1I25G1, showing the optical path traveled by the PLIB produced from one of the PLIMs during object illumination operations, as the PLIB is micro-oscillated in orthogonal dimensions by the 2-D PLIB micro-oscillation mechanism, in relation to the field of view (FOV) of each image detection element in the IFD subsystem of the PLIIM-based system;

FIG. 1I25H1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating multi-faceted cylindrical lens array structure as shown in FIGS. 1I12A and 1I12B, a stationary cylindrical lens array, and a micro-oscillating PLIB reflection element configured together as an optical assembly as shown, for the purpose of micro-oscillating the PLIB laterally along its planar extent while micro-oscillating the PLIB transversely along the direction orthogonal thereto, so that during illumination operations, the PLIB transmitted from each PLIM is spatial phase modulated along the planar extent thereof as well as along the direction orthogonal thereto, causing numerous substantially different time-varying speckle-noise patterns are produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25H2 is an elevated side view of the PLIIM-based system of FIG. 1I25H1, showing the optical path traveled by the PLIB produced from one of the PLIMs during object illumination operations, as the PLIB is micro-oscillated in orthogonal dimensions by the 2-D PLIB micro-oscillation mechanism, in relation to the field of view (FOV) of each image detection element in the IFD subsystem of the PLIIM-based system;

FIG. 1I25I1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a 2-D PLIB micro-oscillation mechanism arranged with each PLIM, and employing a micro-oscillating multi-faceted cylindrical lens array structure as generally shown in FIGS. 1I12A and 1I12B (adapted for micro-oscillation about the optical axis of the VLD's laser illumination beam and along the planar extent of the PLIB) and a stationary cylindrical lens array, configured together as an optical assembly as shown, for the purpose of micro-oscillating the PLIB laterally along its planar extent while micro-oscillating the PLIB transversely along the direction orthogonal thereto, so that during illumination operations, the PLIB transmitted from each PLIM is spatial phase modulated along the planar extent thereof as well as along the direction orthogonal thereto, causing numerous substantially different time-varying speckle-noise patterns to be produced at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25I2 is a perspective view of one of the PLIMs in the PLIIM-based system of FIG. 1I25I1, showing in greater detail that its multi-faceted cylindrical lens array structure micro-oscillates about the optical axis of the laser beam produced by the VLD, as the multi-faceted cylindrical lens array structure micro-oscillates about its longitudinal axis during laser beam illumination operations;

FIG. 1I25I3 is a view of the PLIM employed in FIG. 1I25I2, taken along line 1I25I2–1I25I3 thereof;

FIG. 1I25J1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a temporal intensity modulation panel as shown in FIGS. 1I14A and 1I14B, a stationary cylindrical lens array, and a micro-oscillating PLIB reflection element configured together as an optical assembly as shown, for the purpose of temporal intensity modulating the PLIB uniformly along its planar extent while micro-oscillating the PLIB transversely along the direction orthogonal thereto, so that during illumination operations, the PLIB transmitted from each PLIIM is temporal intensity modulated along the planar extent thereof and temporal phase modulated during micro-oscillation along the direction orthogonal thereto, thereby producing numerous substantially different time-varying speckle-noise patterns at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25J2 is an elevated side view of the PLIIM-based system of FIG. 1I25J1, showing the optical path traveled by the PLIB produced from one of the PLIMs during object illumination operations, as the PLIB is modulated by the PLIB modulation mechanism, in relation to the field of view (FOV) of each image detection element in the IFD subsystem of the PLIIM-based system;

FIG. 1I25K1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing an optically-reflective external cavity (i.e. etalon) as shown in FIGS. 1I17A and 1I17B, a stationary cylindrical lens array, and a micro-oscillating PLIB reflection element configured together as an optical assembly as shown, for the purpose of temporal phase modulating the PLIB uniformly along its planar extent while micro-oscillating the PLIB transversely along the direction orthogonal thereto, so that during illumination operations, the PLIB transmitted from each PLIM is temporal phase modulated along the planar extent thereof and spatial phase modulated during micro-oscillation along the direction orthogonal thereto, thereby producing numerous substantially different time-varying speckle-noise patterns at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25K2 is an elevated side view of the PLIIM-based system of FIG. 1I25K1, showing the optical path traveled by the PLIB produced from one of the PLIMs during object illumination operations as the PLIB is modulated by the PLIB modulation mechanism, in relation to the field of view (FOV) of each image detection element in the IFD subsystem of the PLIIM-based system;

FIG. 1I25L1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a visible mode-locked laser diode (MLLD) as shown in FIGS. 1I15A and 1I15B, a stationary cylindrical lens array, and a micro-oscillating PLIB reflection element configured together as an optical assembly as shown, for the purpose of producing a temporal intensity modulated PLIB while micro-oscillating the PLIB transversely along the direction orthogonal to its planar extent, so that during illumination operations, the PLIB transmitted from each PLIM is temporal intensity modulated along the planar extent thereof and spatial phase modulated during micro-oscillation along the direction orthogonal thereto, thereby producing numerous substantially different time-varying speckle-noise patterns at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25L2 is an elevated side view of the PLIIM-based system of FIG. 1I25L1, showing the optical path traveled by the PLIB produced from one of the PLIMs during object illumination operations, as the PLIB is modulated by the PLIB modulation mechanism, in relation to the field of view (FOV) of each image detection element in the IFD subsystem of the PLIIM-based system;

FIG. 1I25M1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a visible laser diode (VLD) driven into a high-speed frequency hopping mode (as shown in FIGS. 1I19A and 1I19B), a stationary cylindrical lens array, and a micro-oscillating PLIB reflection element configured together as an optical assembly as shown, for the purpose of producing a temporal frequency modulated PLIB while micro-oscillating the PLIB transversely along the direction orthogonal to its planar extent, so that during illumination operations, the PLIB transmitted from each PLIM is temporal frequency modulated along the planar extent thereof and spatial-phase modulated during micro-oscillation along the direction orthogonal thereto, thereby producing numerous substantially different time-varying speckle-noise patterns at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25M2 is an elevated side view of the PLIIM-based system of FIG. 1I25M1, showing the optical path traveled by the PLIB produced from one of the PLIMs during object illumination operations, as the PLIB is modulated by the PLIB modulation mechanism, in relation to the field of view (FOV) of each image detection element in the IFD subsystem of the PLIIM-based system;

FIG. 1I25N1 is a perspective view of a PLIIM-based system of the present invention embodying an speckle-pattern noise reduction subsystem, comprising (i) an image formation and detection (IFD) module mounted on an optical bench and having a linear (1D) CCD image sensor with vertically-elongated image detection elements characterized by a large height-to-width (H/W) aspect ratio, (ii) a pair of planar laser illumination modules (PLIMs) mounted on the optical bench on opposite sides of the IFD module, and (iii) a hybrid-type PLIB modulation mechanism arranged with each PLIM, and employing a micro-oscillating spatial intensity modulation array as shown in FIGS. 1I21A through 1I21D, a stationary cylindrical lens array, and a micro-oscillating PLIB reflection element configured together as an optical assembly as shown, for the purpose of producing a spatial intensity modulated PLIB while micro-oscillating the PLIB transversely along the direction orthogonal to its planar extent, so that during illumination operations, the PLIB transmitted from each PLIM is spatial intensity modulated along the planar extent thereof and spatial phase modulated during micro-oscillation along the direction orthogonal thereto, thereby producing numerous substantially different time-varying speckle-noise patterns at the vertically-elongated image detection elements of the IFD Subsystem during the photo-integration time period thereof, which are temporally and spatially averaged during the photo-integration time period of the image detection array, thereby reducing the RMS power level of speckle-noise patterns observed at the image detection array;

FIG. 1I25N2 is an elevated side view of the PLIIM-based system of FIG. 1I25N2, showing the optical path traveled by the PLIB produced from one of the PLIMs during object illumination operations, as the PLIB is modulated by the PLIB modulation mechanism, in relation to the field of view (FOV) of each image detection element in the IFD subsystem of the PLIIM-based system;

FIG. 1K1 is a schematic representation illustrating how the field of view of a PLIIM-based system can be fixed to substantially match the scan field width thereof (measured at the top of the scan field) at a substantial distance above a conveyor belt;

FIG. 1K2 is a schematic representation illustrating how the field of view of a PLIIM-based system can be fixed to substantially match the scan field width of a low profile scanning field located slightly above the conveyor belt surface, by fixing the focal length of the imaging subsystem during the optical design stage;

FIG. 1L1 is a schematic representation illustrating how an arrangement of field of view (FOV) beam folding mirrors can be used to produce an expanded FOV that matches the geometrical characteristics of the scanning application at hand when the FOV emerges from the system housing;

FIG. 1L2 is a schematic representation illustrating how the fixed field of view (FOV) of an imaging subsystem can be expanded across a working space (e.g. conveyor belt structure) by rotating the FOV during object illumination and imaging operations;

FIG. 1M1 shows a data plot of pixel power density $E_{pix}$ versus object distance (r) calculated using the arbitrary but reasonable values $E_0$=1 W/m$^2$, f=80 mm and F=4.5, demonstrating that, in a counter-intuitive manner, the power density at the pixel (and therefore the power incident on the pixel, as its area remains constant) actually increases as the object distance increases;

FIG. 1M2 is a data plot of laser beam power density versus position along the planar laser beam width showing that the total output power in the planar laser illumination beam of the present invention is distributed along the width of the beam in a roughly Gaussian distribution;

FIG. 1M3 shows a plot of beam width length L versus object distance r calculated using a beam fan/spread angle θ=50°, demonstrating that the planar laser illumination beam width increases as a function of increasing object distance;

FIG. 1M4 is a typical data plot of planar laser beam height h versus image distance r for a planar laser illumination beam of the present invention focused at the farthest working distance in accordance with the principles of the present invention, demonstrating that the height dimension of the planar laser beam decreases as a function of increasing object distance;

FIG. 1N is a data plot of planar laser beam power density $E_0$ at the center of its beam width, plotted as a function of object distance, demonstrating that use of the laser beam focusing technique of the present invention, wherein the height of the planar laser illumination beam is decreased as the object distance increases, compensates for the increase in beam width in the planar laser illumination beam, which occurs for an increase in object distance, thereby yielding a laser beam power density on the target object which increases as a function of increasing object distance over a substantial portion of the object distance range of the PLIIM-based system;

FIG. 1O is a data plot of pixel power density $E_0$ vs. object distance, obtained when using a planar laser illumination beam whose beam height decreases with increasing object distance, and also a data plot of the "reference" pixel power density plot $E_{pix}$ vs. object distance obtained when using a planar laser illumination beam whose beam height is substantially constant (e.g. 1 mm) over the entire portion of the object distance range of the PLIIM-based system;

FIG. 1P1 is a schematic representation of the composite power density characteristics associated with the planar laser illumination array in the PLIIM-based system of FIG. 1G1, taken at the "near field region" of the system, and resulting from the additive power density contributions of the individual visible laser diodes in the planar laser illumination array;

FIG. 1P2 is a schematic representation of the composite power density characteristics associated with the planar laser illumination array in the PLIIM-based system of FIG. 1G1, taken at the "far field region" of the system, and resulting from the additive power density contributions of the individual visible laser diodes in the planar laser illumination array;

FIG. 1Q1 is a schematic representation of second illustrative embodiment of the PLIIM-based system of the present invention shown in FIG. 1A, shown comprising a linear image formation and detection module, and a pair of planar laser illumination arrays arranged in relation to the image formation and detection module such that the field of view thereof is oriented in a direction that is coplanar with the plane of the stationary planar laser illumination beams (PLIBs) produced by the planar laser illumination arrays (PLIAs) without using any laser beam or field of view folding mirrors;

FIG. 1Q2 is a block schematic diagram of the PLIIM-based system shown in FIG. 1Q1, comprising a linear image formation and detection module, a pair of planar laser illumination arrays, an image frame grabber, an image data buffer, an image processing computer, and a camera control computer;

FIG. 1R1 is a schematic representation of third illustrative embodiment of the PLIIM-based system of the present invention shown in FIG. 1A, shown comprising a linear image formation and detection module having a field of view, a pair of planar laser illumination arrays for producing first and second stationary planar laser illumination beams, and a pair of stationary planar laser beam folding mirrors arranged so as to fold the optical paths of the first and second planar laser illumination beams such that the planes of the first and second stationary planar laser illumination beams are in a direction that is coplanar with the field of view of the image formation and detection (IFD) module or subsystem;

FIG. 1R2 is a block schematic diagram of the PLIIM-based system shown in FIG. 1P1, comprising a linear image formation and detection module, a stationary field of view folding mirror, a pair of planar illumination arrays, a pair of stationary planar laser illumination beam folding mirrors, an image frame grabber, an image data buffer, an image processing computer, and a camera control computer;

FIG. 1S1 is a schematic representation of fourth illustrative embodiment of the PLIIM-based system of the present invention shown in FIG. 1A. shown comprising a linear image formation and detection module having a field of view (FOV), a stationary field of view (FOV) folding mirror for folding the field of view of the image formation and detection module, a pair of planar laser illumination arrays for producing first and second stationary planar laser illumination beams, and a pair of stationary planar laser illumination beam folding mirrors for folding the optical paths of the first and second stationary planar laser illumination beams so that planes of first and second stationary planar laser illumination beams are in a direction that is coplanar with the field of view of the image formation and detection module;

FIG. 1S2 is a block schematic diagram of the PLIIM-based system shown in FIG. 1S1, comprising a linear-type image formation and detection (IFD) module, a stationary field of view folding mirror, a pair of planar laser illumination arrays, a pair of stationary planar laser beam folding mirrors, an image frame grabber, an image data buffer, an image processing computer, and a camera control computer;

FIG. 1T is a schematic representation of an under-the-conveyor-belt package identification system embodying the PLIIM-based subsystem of FIG. 1A;

FIG. 1U is a schematic representation of a hand-supportable bar code symbol reading system embodying the PLIIM-based system of FIG. 1A;

FIG. 1V1 is a schematic representation of second generalized embodiment of the PLIIM-based system of the present invention, wherein a pair of planar laser illumination arrays (PLIAs) are mounted on opposite sides of a linear type image formation and detection (IFD) module having a field of view, such that the planar laser illumination arrays produce a plane of laser beam illumination (i.e. light) which is disposed substantially coplanar with the field of view of the image formation and detection module, and that the planar laser illumination beam and the field of view of the image formation and detection module move synchronously together while maintaining their coplanar relationship with each other as the planar laser illumination beam and FOV are automatically scanned over a 3-D region of space during object illumination and image detection operations;

FIG. 1V2 is a schematic representation of first illustrative embodiment of the PLIIM-based system of the present invention shown in FIG. 1V1, shown comprising an image formation and detection module having a field of view (FOV), a field of view (FOV) folding/sweeping mirror for folding the field of view of the image formation and detection module, a pair of planar laser illumination arrays for producing first and second planar laser illumination beams, and a pair of planar laser beam folding/sweeping mirrors, jointly or synchronously movable with the FOV folding/sweeping mirror, and arranged so as to fold and sweep the optical paths of the first and second planar laser illumination beams so that the folded field of view of the image formation and detection module is synchronously moved with the planar laser illumination beams in a direction that is coplanar therewith as the planar laser illumination beams are scanned over a 3-D region of space under the control of the camera control computer;

FIG. 1V3 is a block schematic diagram of the PLIIM-based system shown in FIG. 1V1, comprising a pair of planar laser illumination arrays, a pair of planar laser beam folding/sweeping mirrors, a linear-type image formation and detection module, a field of view folding/sweeping mirror, an image frame grabber, an image data buffer, an image processing computer, and a camera control computer;

FIG. 1V4 is a schematic representation of an over-the-conveyor-belt package identification system embodying the PLIIM-based system of FIG. 1V1;

FIG. 2A is a schematic representation of a third generalized embodiment of the PLIIM-based system of the present invention, wherein a pair of planar laser illumination arrays (PLIAs) are mounted on opposite sides of a linear (i.e. 1-dimensional) type image formation and detection (IFD) module having a fixed focal length imaging lens, a variable focal distance and a fixed field of view (FOV) so that the planar laser illumination arrays produce a plane of laser beam illumination which is disposed substantially coplanar with the field view of the image formation and detection module during object illumination and image detection operations carried out on bar code symbol structures and other graphical indicia which may embody information within its structure;

FIG. 2B1 is a schematic representation of a first illustrative embodiment of the PLIIM-based system shown in FIG. 2A, comprising an image formation and detection module having a field of view (FOV), and a pair of planar laser illumination arrays for producing first and second stationary planar laser illumination beams in an imaging direction that is coplanar with the field of view of the image formation and detection module;

FIG. 2B2 is a schematic representation of the PLIIM-based system of the present invention shown in FIG. 2B1, wherein the linear image formation and detection module is shown comprising a linear array of photo-electronic detectors realized using CCD technology, and each planar laser illumination array is shown comprising an array of planar laser illumination modules;

FIG. 2C1 is a block schematic diagram of the PLIIM-based system shown in FIG. 2B1, comprising a pair of planar illumination arrays, a linear-type image formation and detection module, an image frame grabber, an image data buffer, an image processing computer, and a camera control computer;

FIG. 2C2 is a schematic representation of the linear type image formation and detection (IFD) module employed in the PLIIM-based system shown in FIG. 2B1, wherein an imaging subsystem having a fixed focal length imaging lens, a variable focal distance and a fixed field of view is arranged on an optical bench, mounted within a compact module housing, and responsive to focus control signals generated by the camera control computer of the PLIIM-based system;

FIG. 2D1 is a schematic representation of the second illustrative embodiment of the PLIIM-based system of the present invention shown in FIG. 2A, shown comprising a linear image formation and detection module, a stationary field of view (FOV) folding mirror for folding the field of view of the image formation and detection module, and a pair of planar laser illumination arrays arranged in relation to the image formation and detection module such that the folded field of view is oriented in an imaging direction that is coplanar with the stationary planes of laser illumination produced by the planar laser illumination arrays;

FIG. 2D2 is a block schematic diagram of the PLIIM-based system shown in FIG. 2D1, comprising a pair of planar laser illumination arrays (PLIAs), a linear-type image formation and detection module, a stationary field of view of folding mirror, an image frame grabber, an image data buffer, an image processing computer, and a camera control computer;

FIG. 2D3 is a schematic representation of the linear type image formation and detection module (IFD) module employed in the PLIIM-based system shown in FIG. 2D1, wherein an imaging subsystem having a fixed focal length imaging lens, a variable focal distance and a fixed field of view is arranged on an optical bench, mounted within a compact module housing, and responsive to focus control signals generated by the camera control computer of the PLIIM-based system;

FIG. 2E1 is a schematic representation of the third illustrative embodiment of the PLIIM-based system of the present invention shown in FIG. 1A, shown comprising an image formation and detection module having a field of view (FOV), a pair of planar laser illumination arrays for producing first and second stationary planar laser illumination beams, a pair of stationary planar laser beam folding mirrors for folding the stationary (i.e. non-swept) planes of the planar laser illumination beams produced by the pair of planar laser illumination arrays, in an imaging direction that is coplanar with the stationary plane of the field of view of the image formation and detection module during system operation;

FIG. 2E2 is a block schematic diagram of the PLIIM-based system shown in FIG. 2B1, comprising a pair of planar laser illumination arrays, a linear image formation and detection module, a pair of stationary planar laser illumination beam folding mirrors, an image frame grabber, an image data buffer, an image processing computer, and a camera control computer;

FIG. 2E3 is a schematic representation of the linear image formation and detection (IFD) module employed in the PLIIM-based system shown in FIG. 2B1, wherein an imaging subsystem having fixed focal length imaging lens, a variable focal distance and a fixed field of view is arranged on an optical bench, mounted within a compact module housing, and responsive to focus control signals generated by the camera control computer of the PLIIM-based system;

FIG. 2F1 is a schematic representation of the fourth illustrative embodiment of the PLIIM-based system of the present invention shown in FIG. 2A, shown comprising a linear image formation and detection module having a field of view (FOV), a stationary field of view (FOV) folding mirror, a pair of planar laser illumination arrays for producing first and second stationary planar laser illumination beams, and a pair of stationary planar laser beam folding mirrors arranged so as to fold the optical paths of the first and second stationary planar laser illumination beams so that these planar laser illumination beams are oriented in an imaging direction that is coplanar with the folded field of view of the linear image formation and detection module;

FIG. 2F2 is a block schematic diagram of the PLIIM-based system shown in FIG. 2F1, comprising a pair of planar illumination arrays, a linear image formation and detection module, a stationary field of view (FOV) folding mirror, a pair of stationary planar laser illumination beam folding mirrors, an image frame grabber, an image data buffer, an image processing computer, and a camera control computer;

FIG. 2F3 is a schematic representation of the linear-type image formation and detection (IFD) module employed in the PLIIM-based system shown in FIG. 2F1, wherein an imaging subsystem having a fixed focal length imaging lens, a variable focal distance and a fixed field of view is arranged on an optical bench, mounted within a compact module housing, and responsive to focus control signals generated by the camera control computer of the PLIIM-based system;

FIG. 2G is a schematic representation of an over-the-conveyor belt package identification system embodying the PLIIM-based system of FIG. 2A;

FIG. 2H is a schematic representation of a hand-supportable bar code symbol reading system embodying the PLIIM-based system of FIG. 2A;

FIG. 2I1 is a schematic representation of the fourth generalized embodiment of the PLIIM-based system of the present invention, wherein a pair of planar laser illumination arrays (PLIAs) are mounted on opposite sides of a linear image formation and detection (IFD) module having a fixed focal length imaging lens, a variable focal distance and fixed field of view (FOV), so that the planar illumination arrays produces a plane of laser beam illumination which is disposed substantially coplanar with the field view of the image formation and detection module and synchronously moved therewith while the planar laser illumination beams are automatically scanned over a 3-D region of space during object illumination and imaging operations;

FIG. 2I2 is a schematic representation of the first illustrative embodiment of the PLIIM-based system of the present invention shown in FIG. 2I1, shown comprising an image formation and detection module (i.e. camera) having a field of view (FOV), a FOV folding/sweeping mirror, a pair of planar laser illumination arrays for producing first and second planar laser illumination beams, and a pair of planar laser beam folding/sweeping mirrors, jointly movable with the FOV folding/sweeping mirror, and arranged so that the field of view of the image formation and detection module is coplanar with the folded planes of first and second planar laser illumination beams, and the coplanar FOV and planar laser illumination beams are synchronously moved together while the planar laser illumination beams and FOV are scanned over a 3-D region of space containing a stationary or moving bar code symbol or other graphical structure (e.g. text) embodying information;

FIG. 2I3 is a block schematic diagram of the PLIIM-based system shown in FIGS. 2I1 and 2I2, comprising a pair of planar illumination arrays, a linear image formation and detection module, a field of view (FOV) folding/sweeping mirror, a pair of planar laser illumination beam folding/sweeping mirrors jointly movable therewith, an image frame grabber, an image data buffer, an image processing computer, and a camera control computer;

FIG. 2I4 is a schematic representation of the linear type image formation and detection (IFD) module employed in the PLIIM-based system shown in FIGS. 2I1 and 2I2, wherein an imaging subsystem having a fixed focal length imaging lens, a variable focal distance and a fixed field of view is arranged on an optical bench, mounted within a compact module housing, and responsive to focus control signals generated by the camera control computer of the PLIIM-based system;

FIG. 2I5 is a schematic representation of a hand-supportable bar code symbol reader embodying the PLIIM-based system of FIG. 2I1;

FIG. 2I6 is a schematic representation of a presentation-type bar code symbol reader embodying the PLIIM-based system of FIG. 2I1;

FIG. 3A is a schematic representation of a fifth generalized embodiment of the PLIIM-based system of the present invention, wherein a pair of planar laser illumination arrays (PLIAs) are mounted on opposite sides of a linear image formation and detection (IFD) module having a variable focal length imaging lens, a variable focal distance and a variable field of view, so that the planar laser illumination arrays produce a stationary plane of laser beam illumination (i.e. light) which is disposed substantially coplanar with the field view of the image formation and detection module during object illumination and image detection operations carried out on bar code symbols and other graphical indicia by the PLIIM-based system of the present invention;

FIG. 3B1 is a schematic representation of the first illustrative embodiment of the PLIIM-based system of the present invention shown in FIG. 3A, shown comprising an image formation and detection module, and a pair of planar laser illumination arrays arranged in relation to the image formation and detection module such that the stationary field of view thereof is oriented in an imaging direction that is coplanar with the stationary plane of laser illumination produced by the planar laser illumination arrays, without using any laser beam or field of view folding mirrors.

Figure 3H:
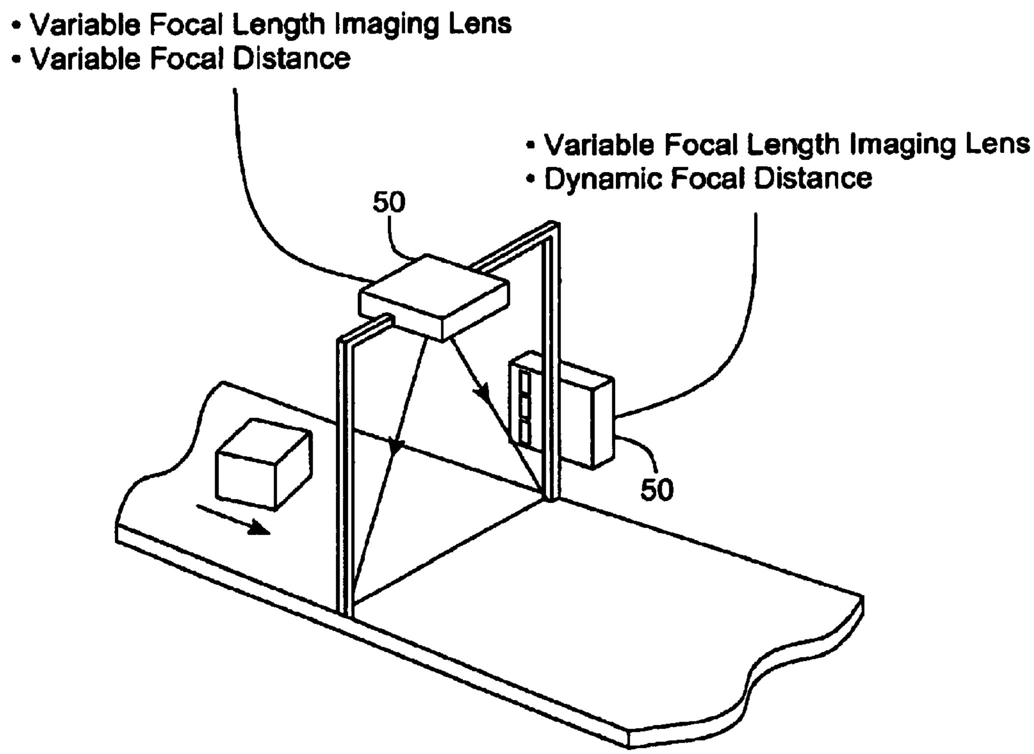
Figure 3I:
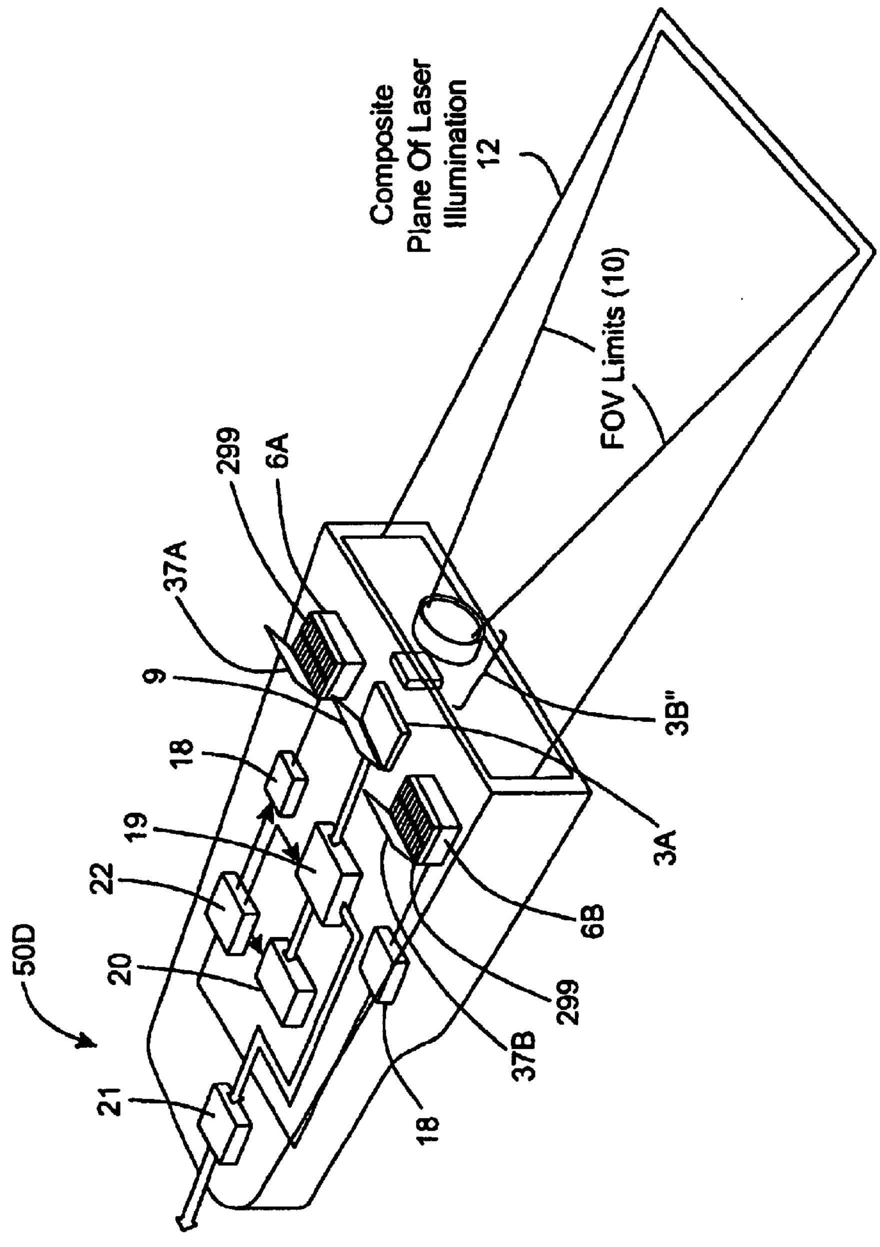
Figure 4E:
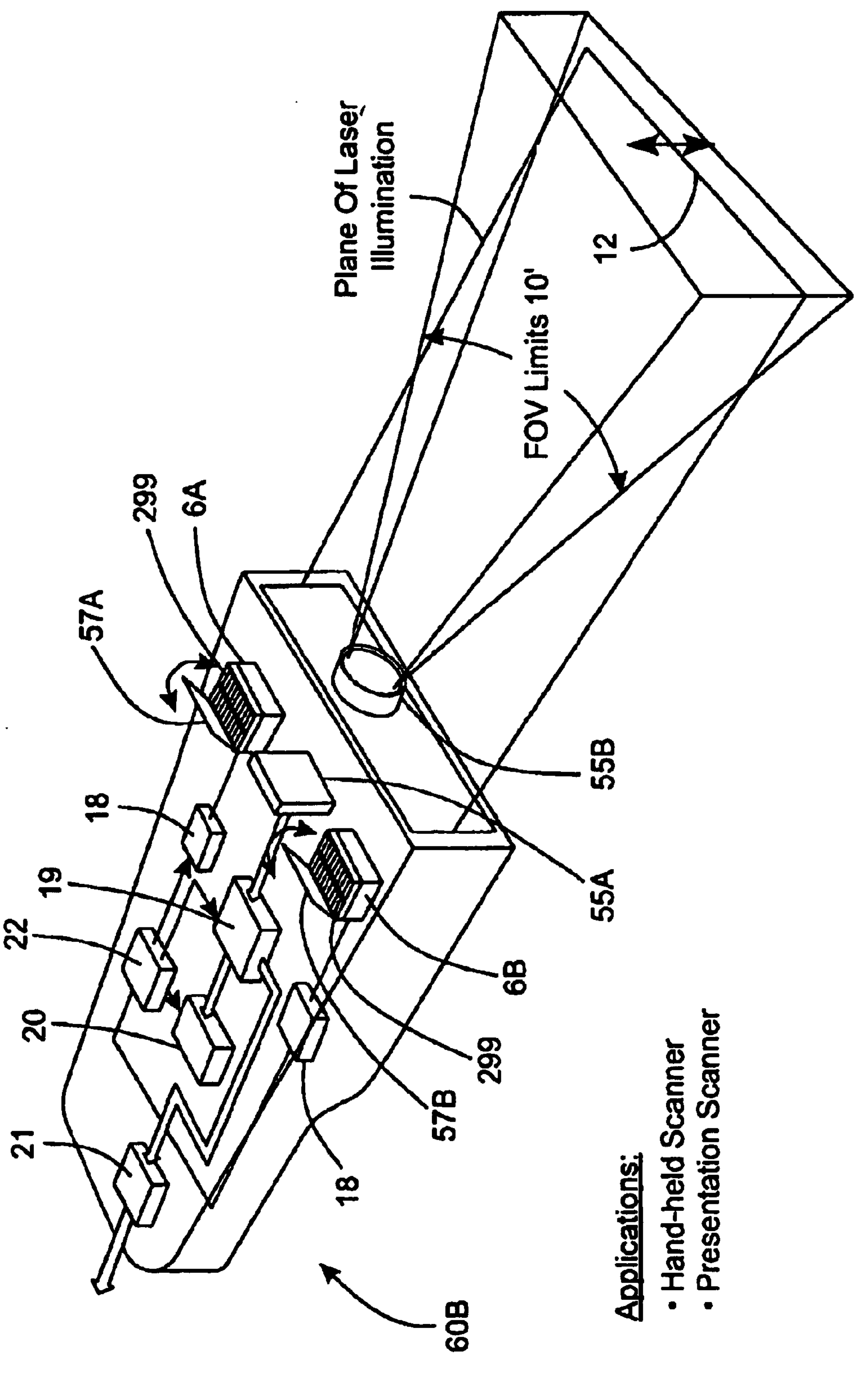
Figure 7B:
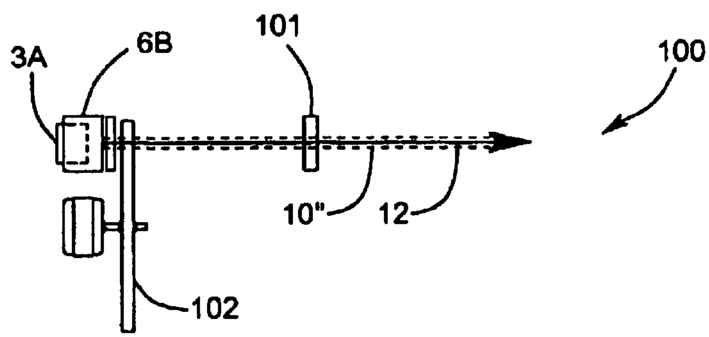
Figure 8A:
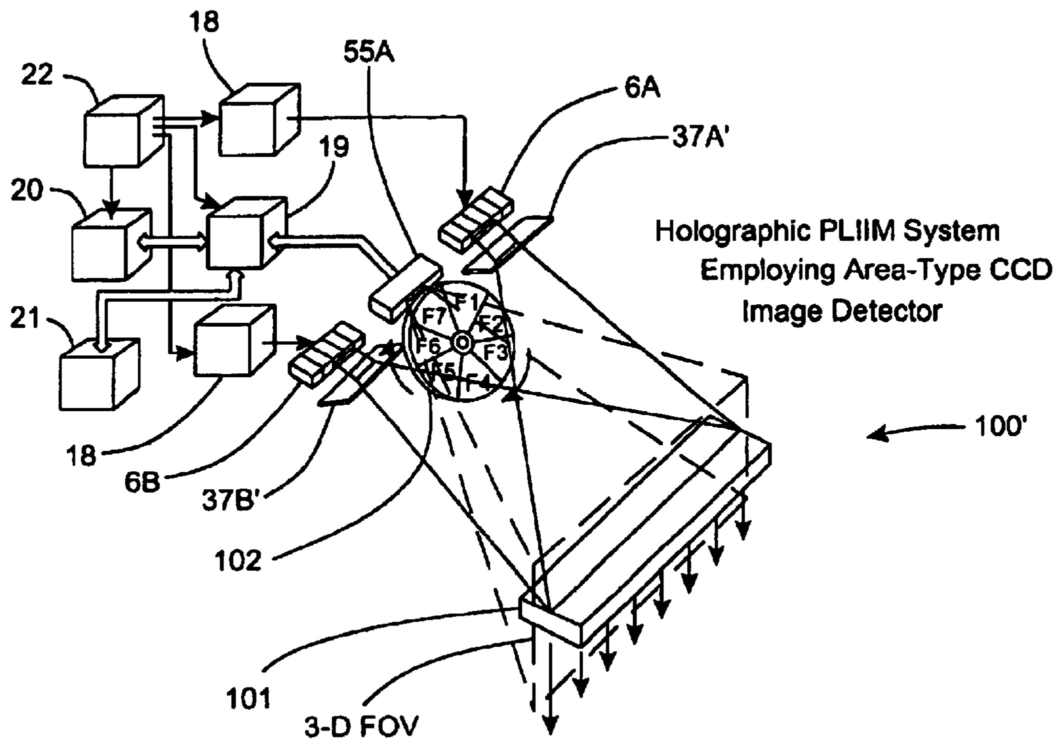
Figure 8B:
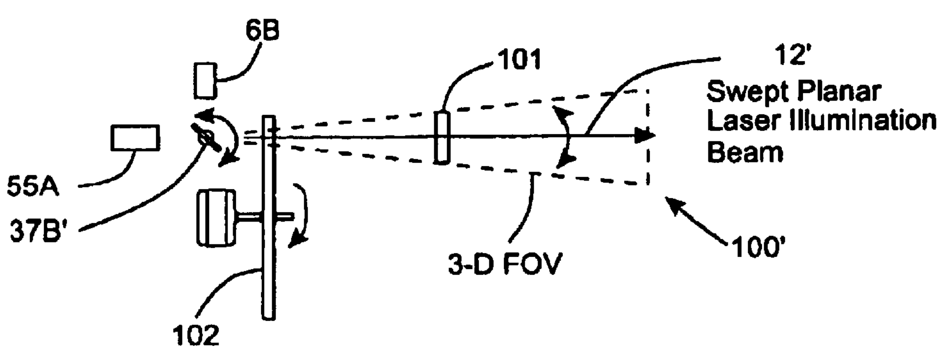
Figure 9:
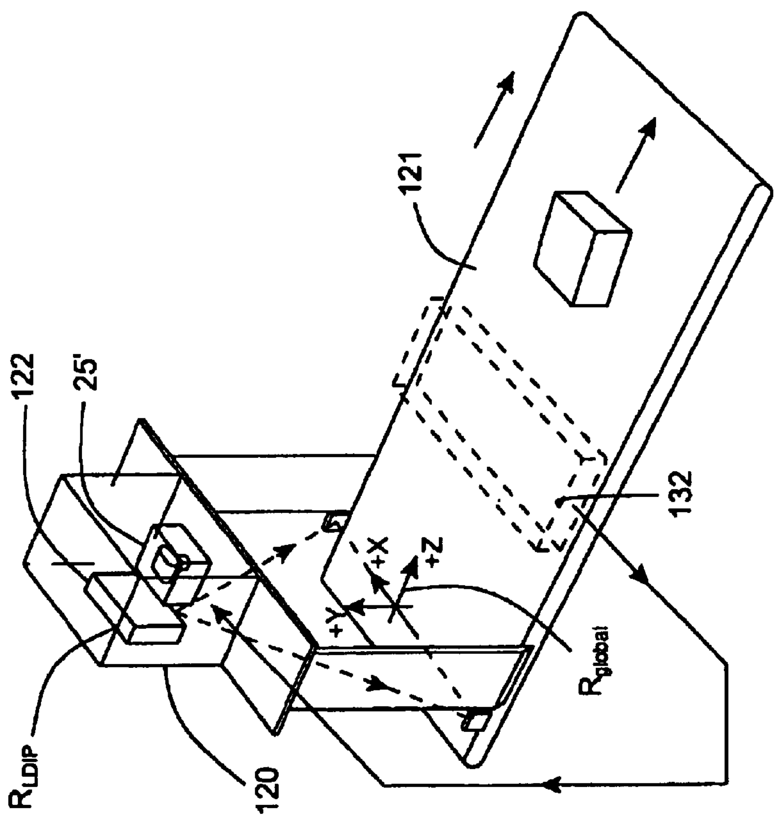
Figure 10C:
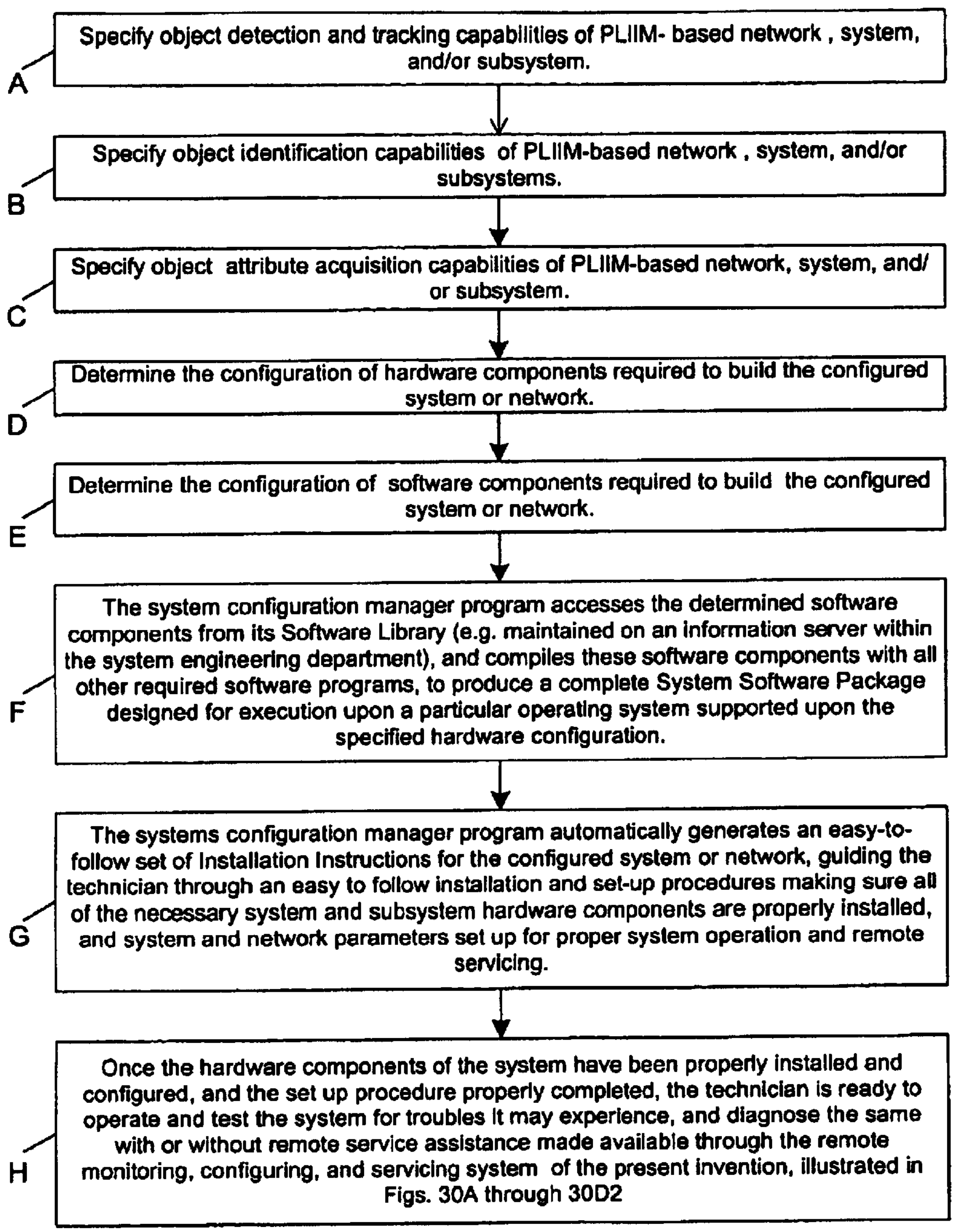
Figure 11:
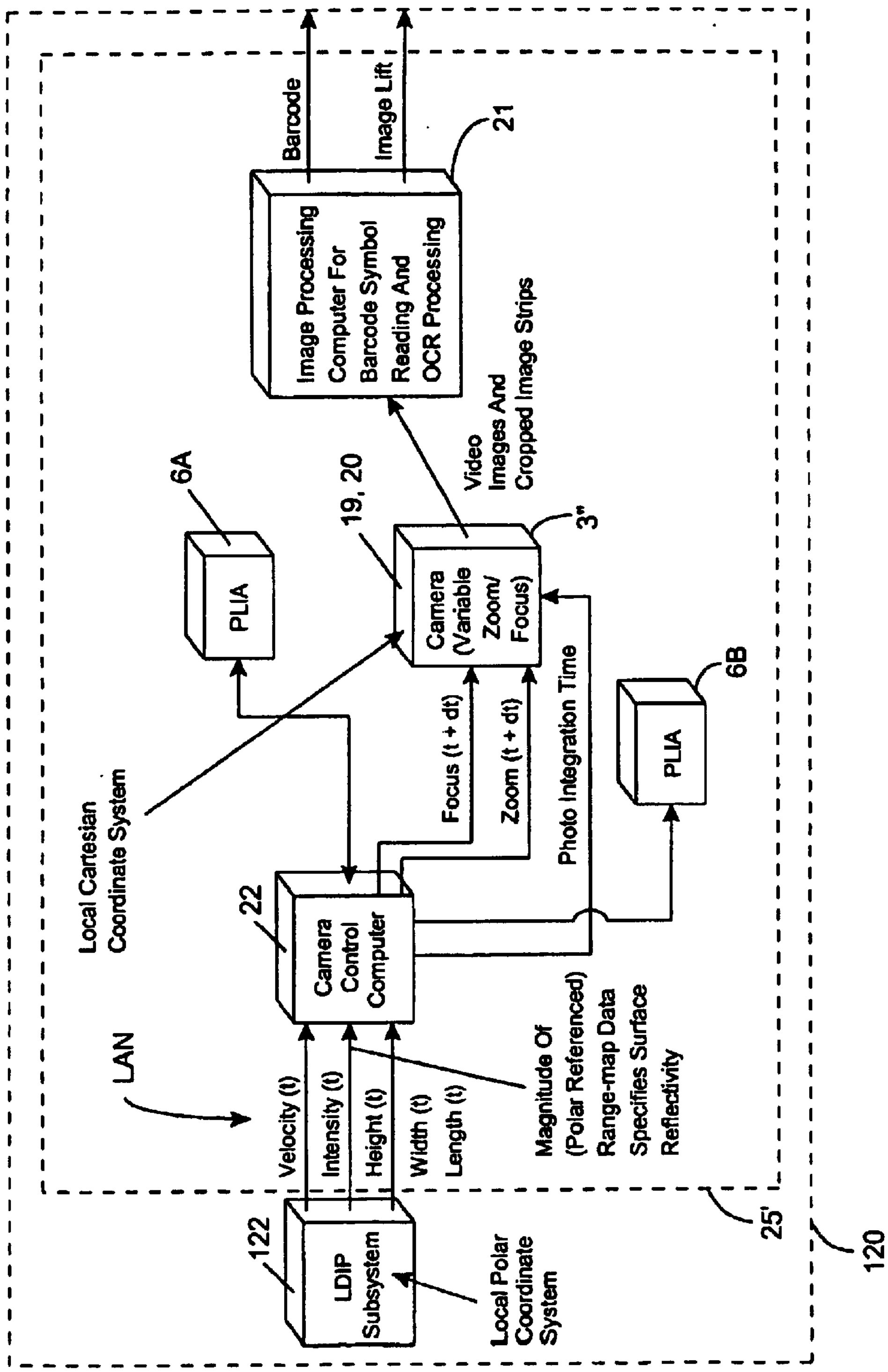
Figure 12C:
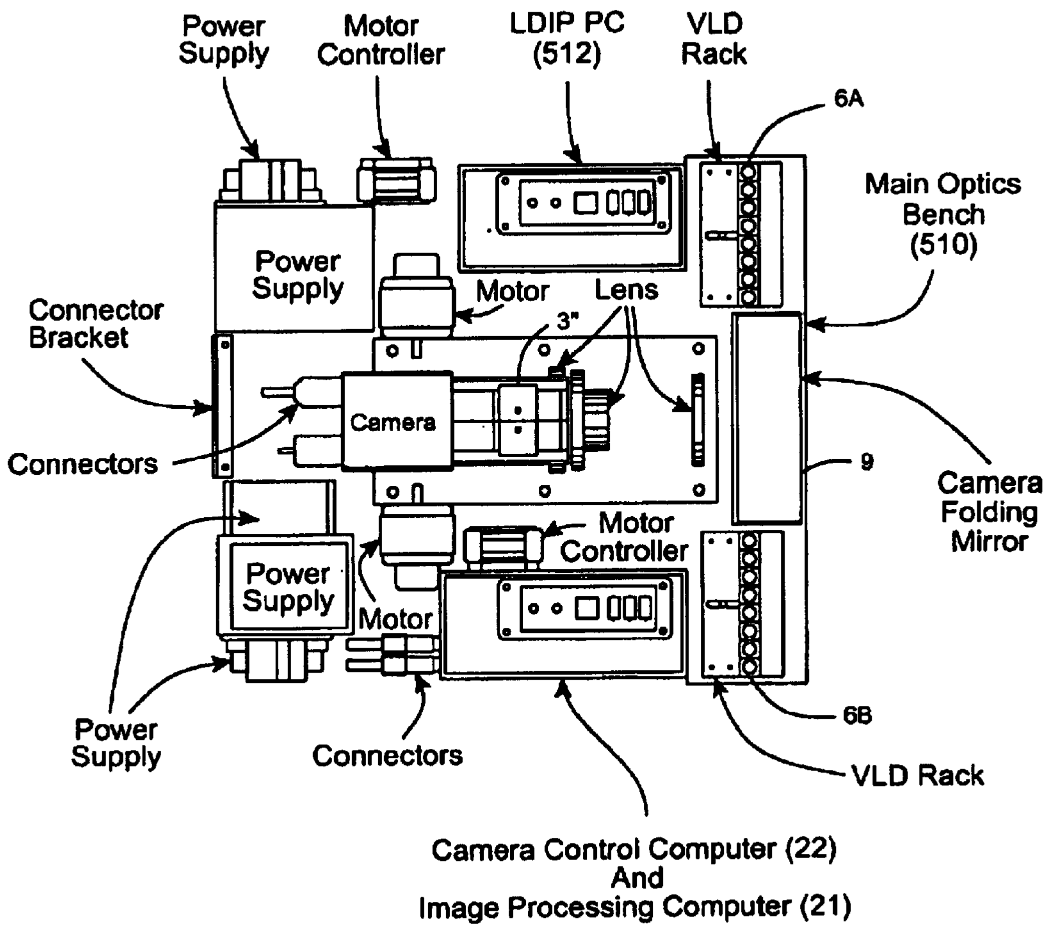
Figure 12D:
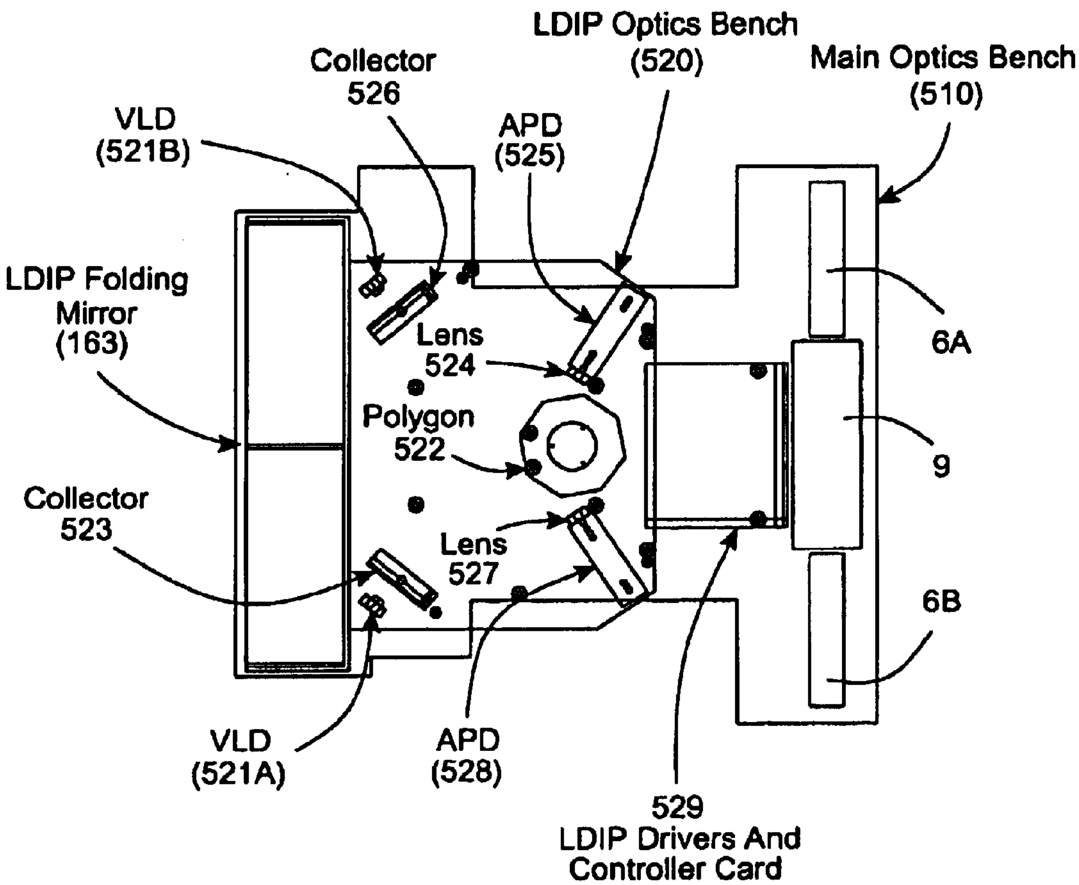
Figure 12E:
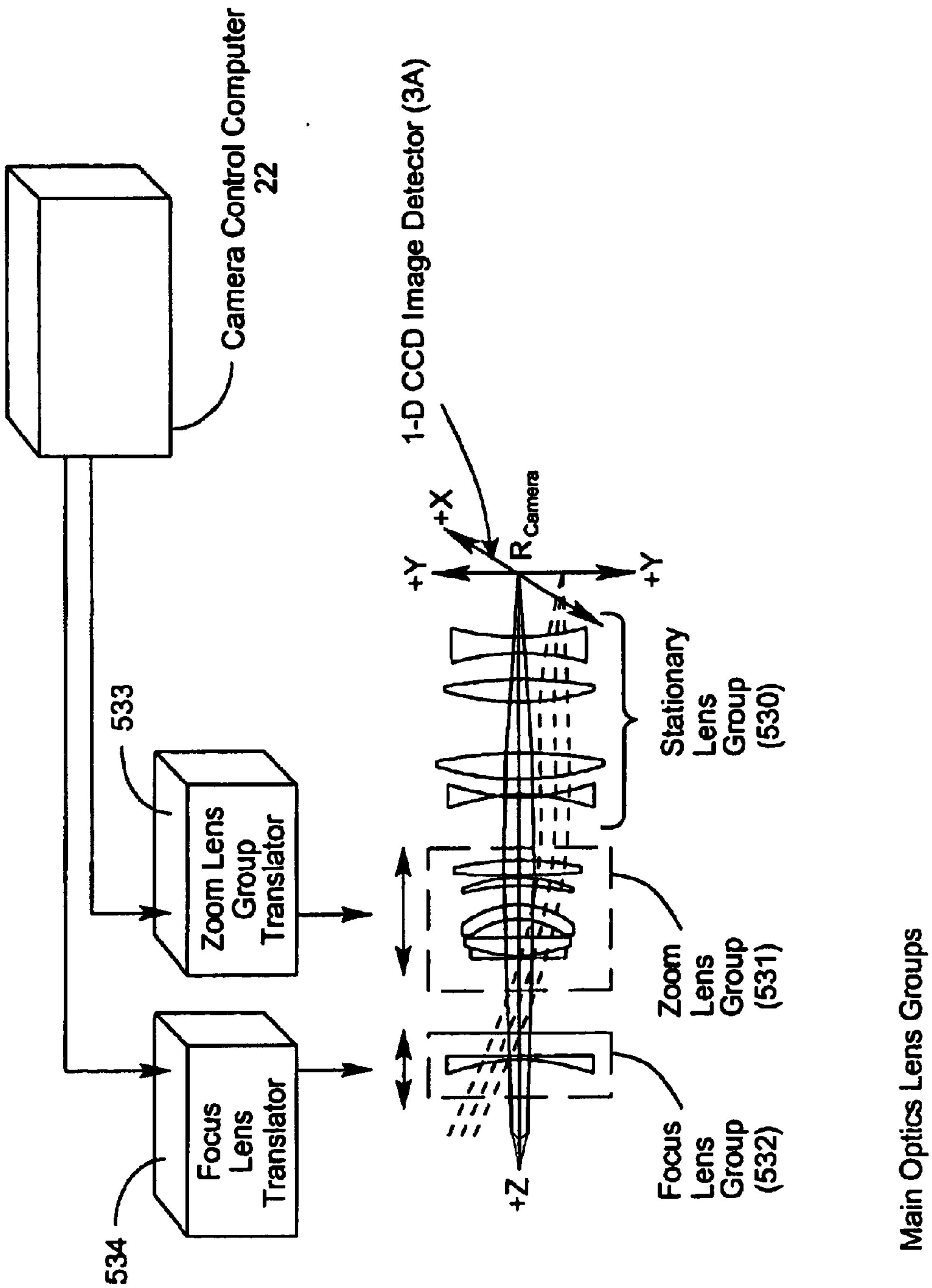
Figure 13A:
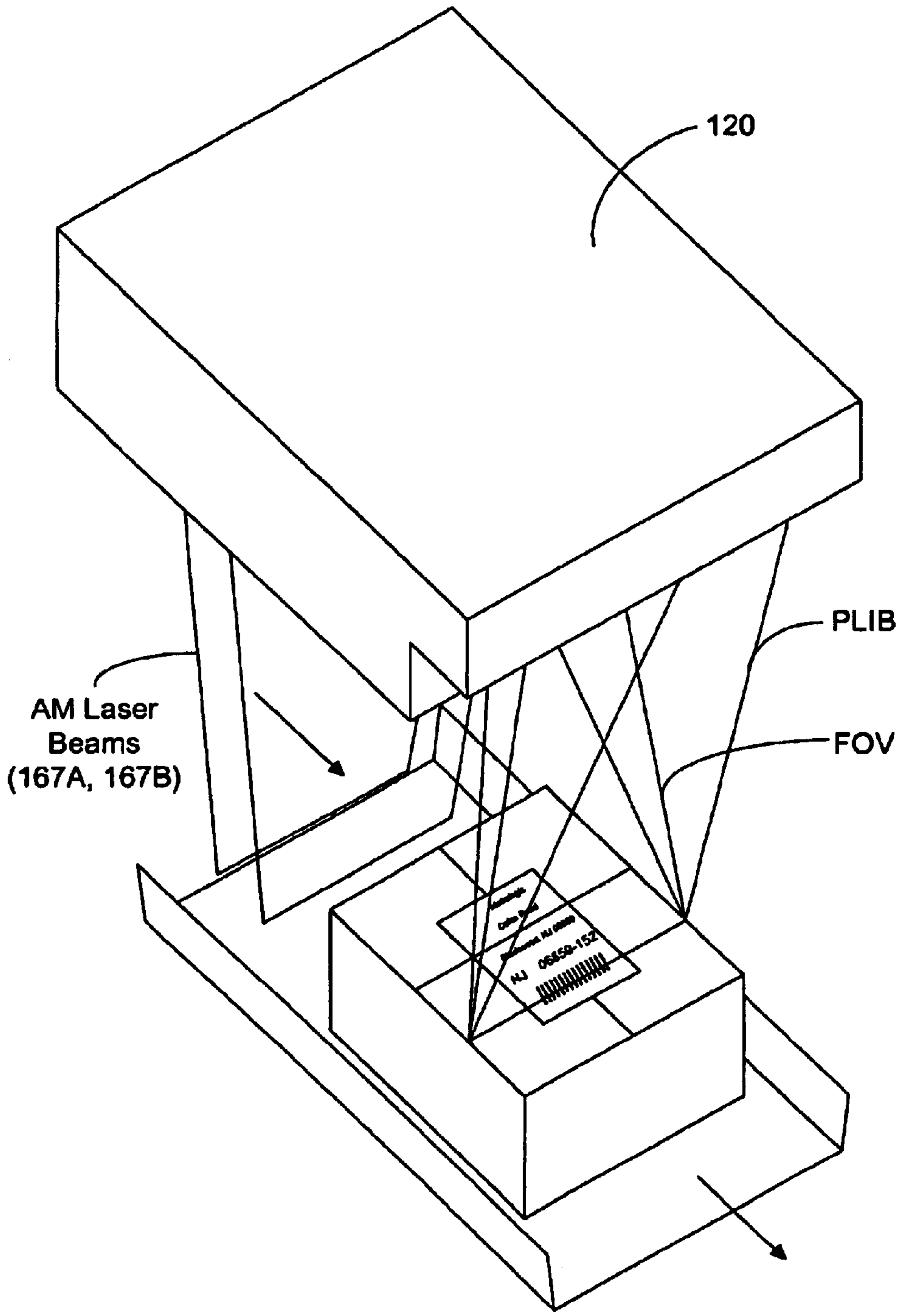
Figure 13B:
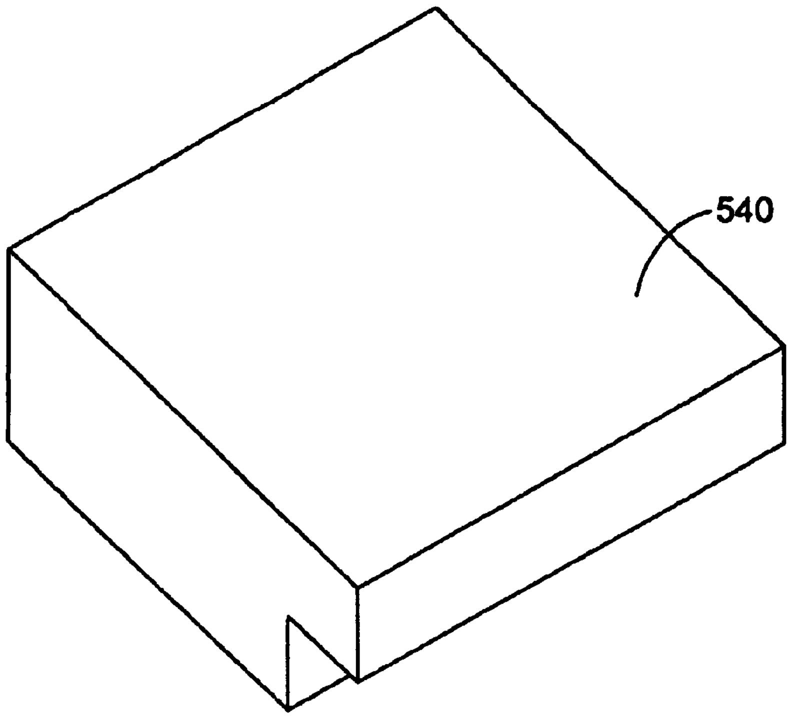
Figure 13C:
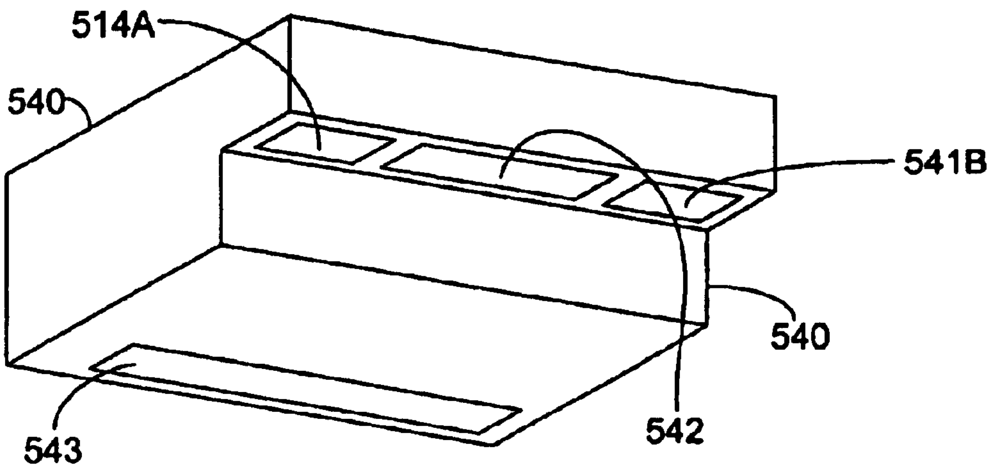
Figure 14:
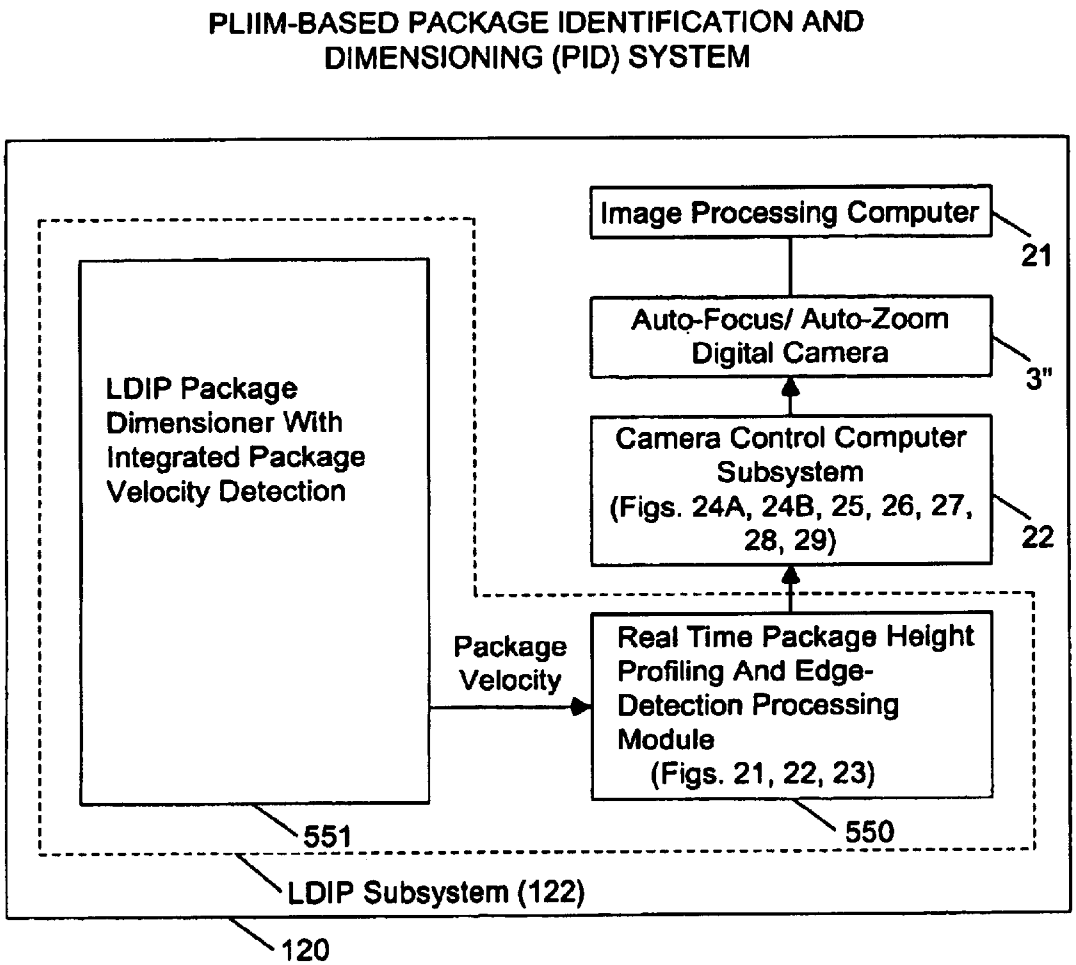
Figure 15:
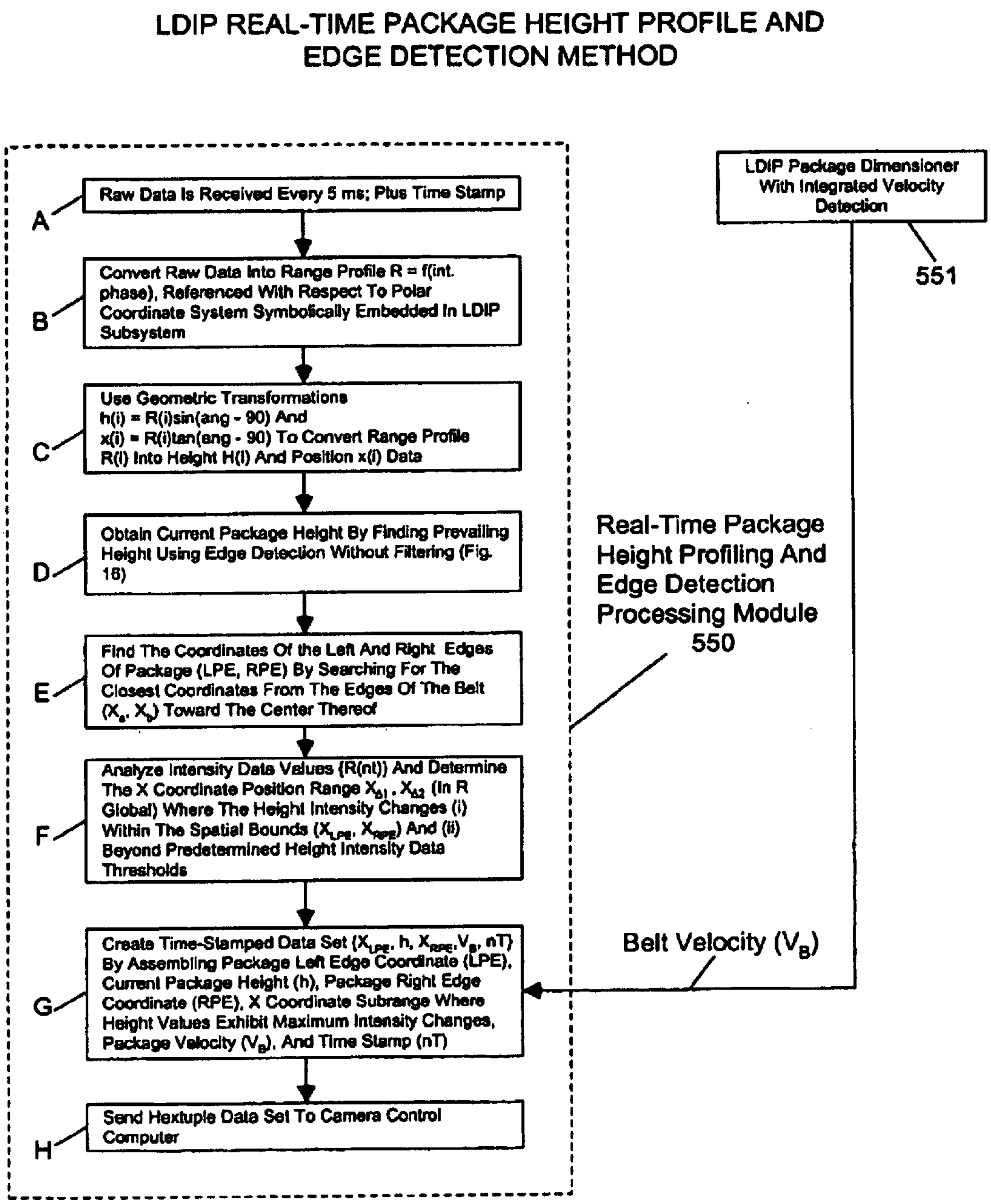
Figure 16:
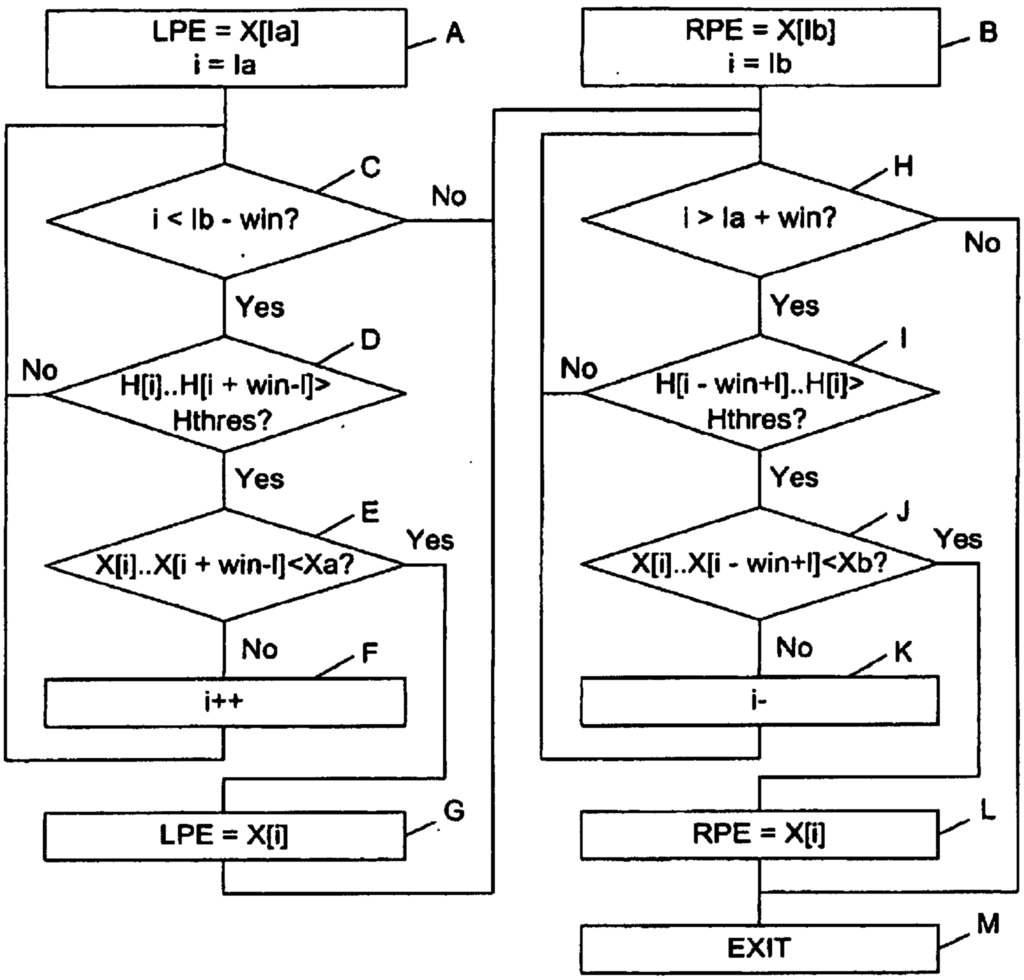
Figure 17C:
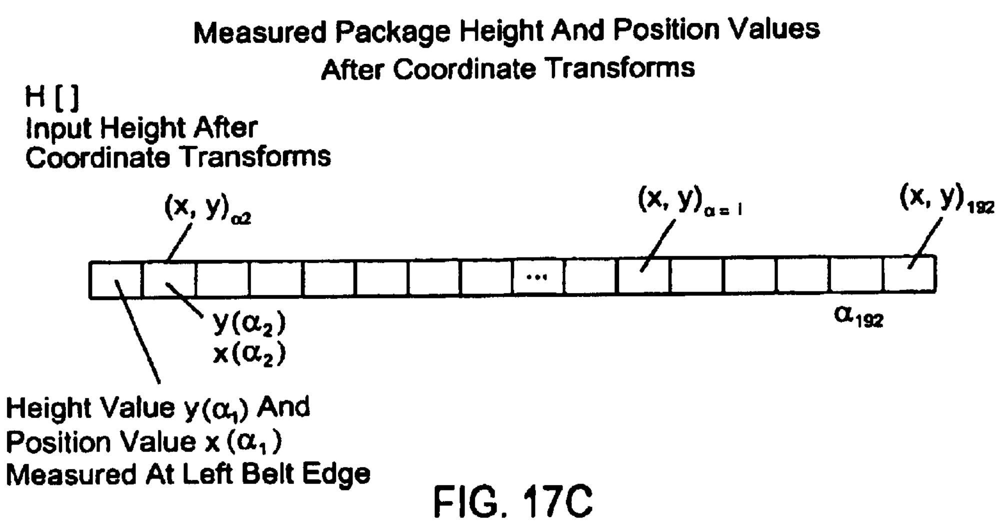
Figure 19:
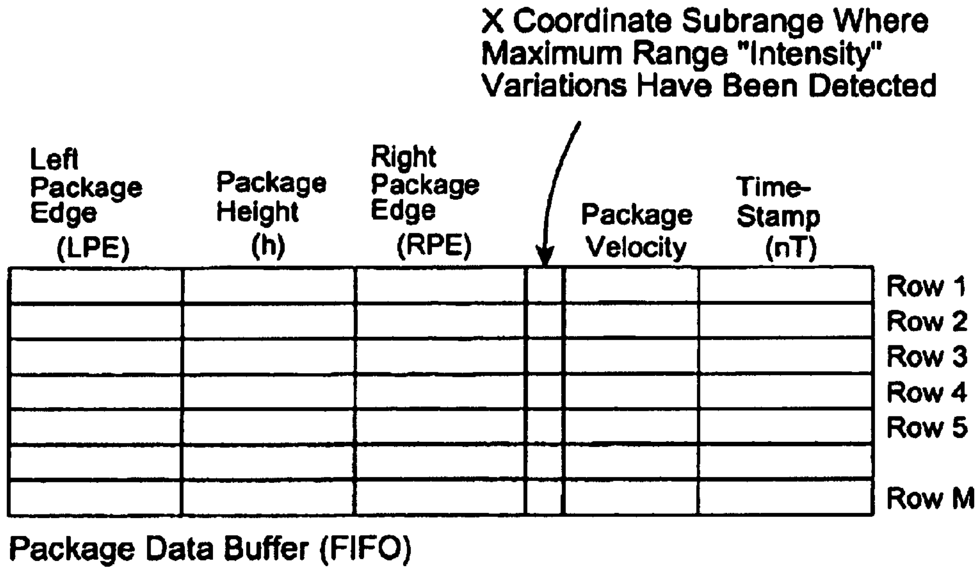
Figure 26:
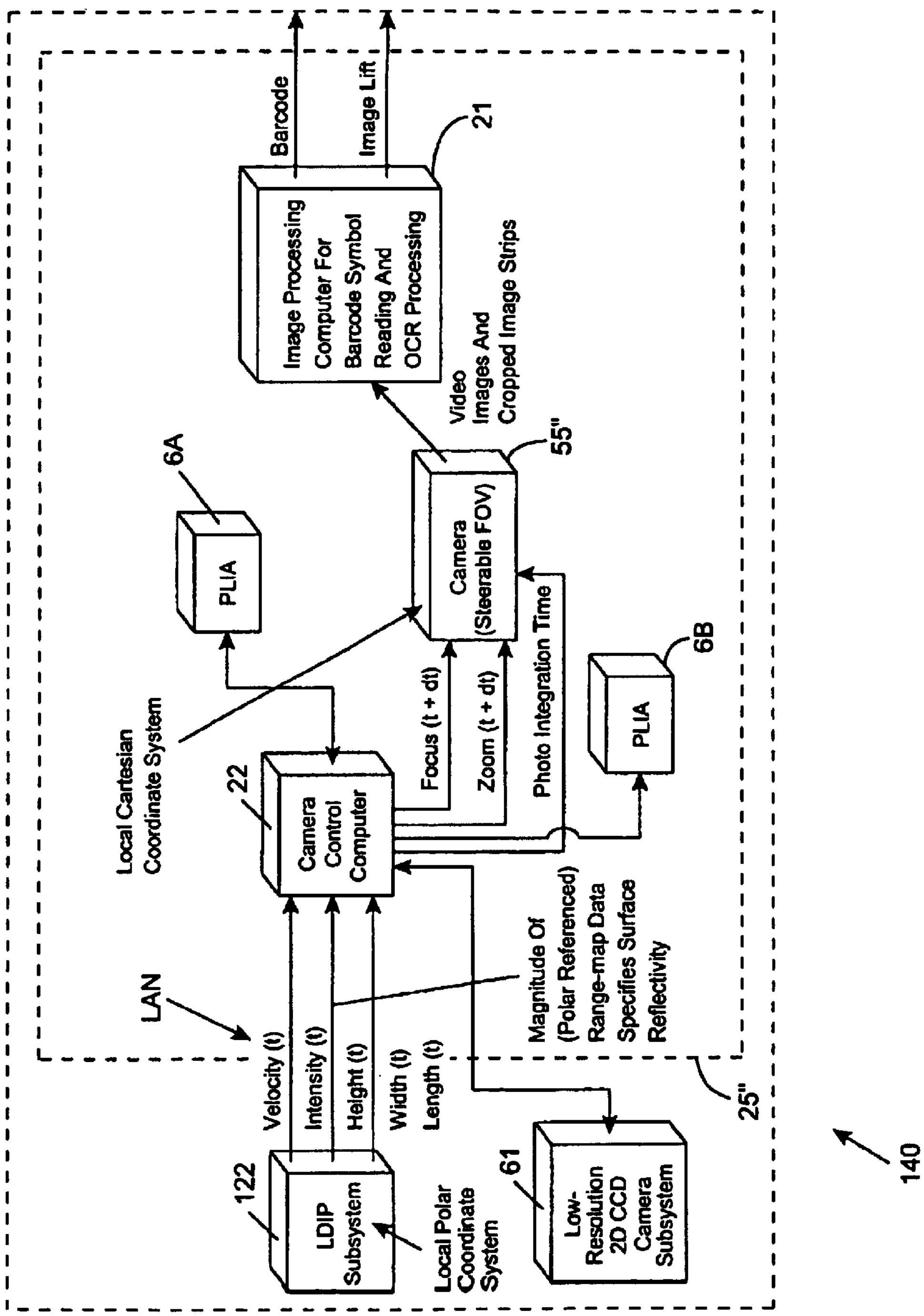
Figure 27:
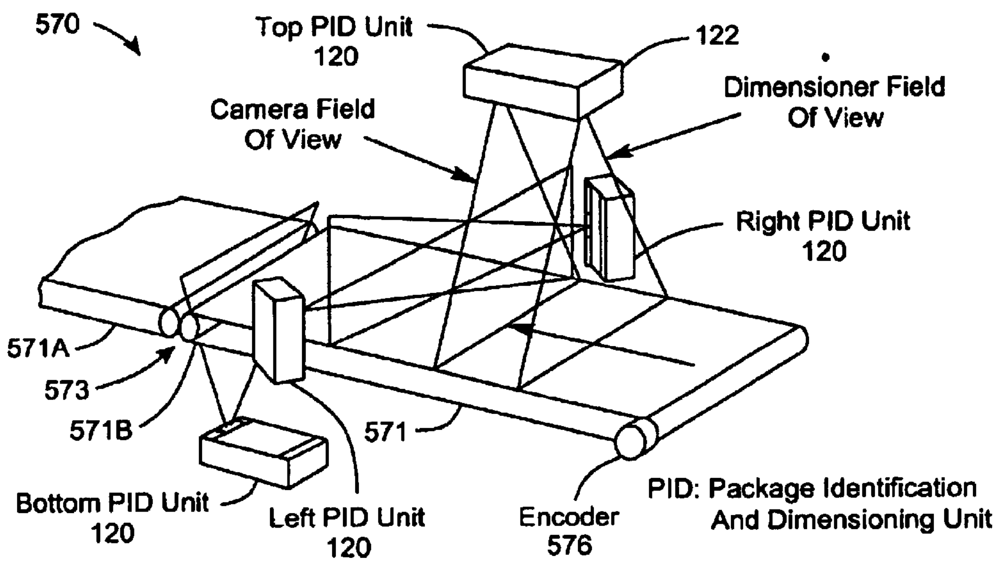
Figure 28:
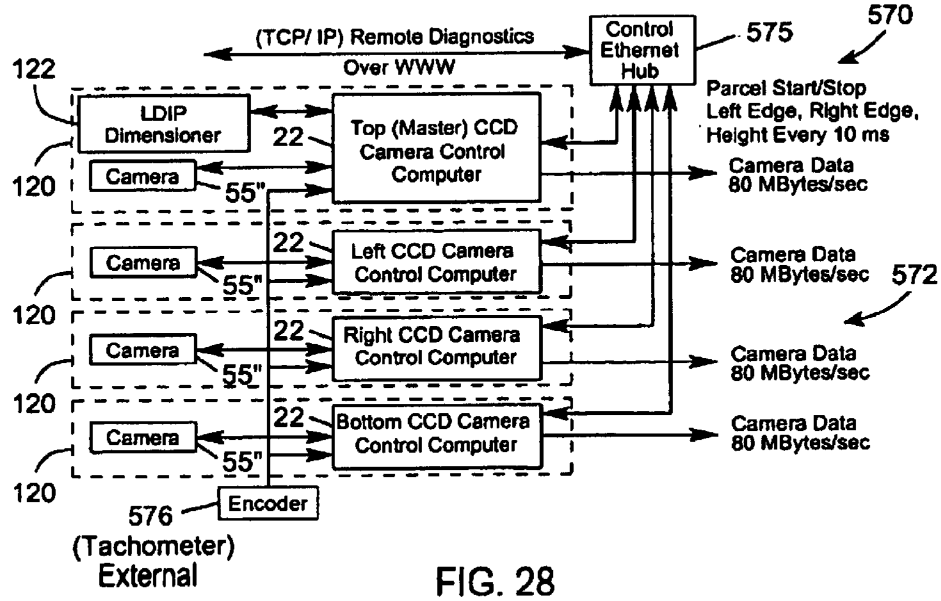
Figure 29:
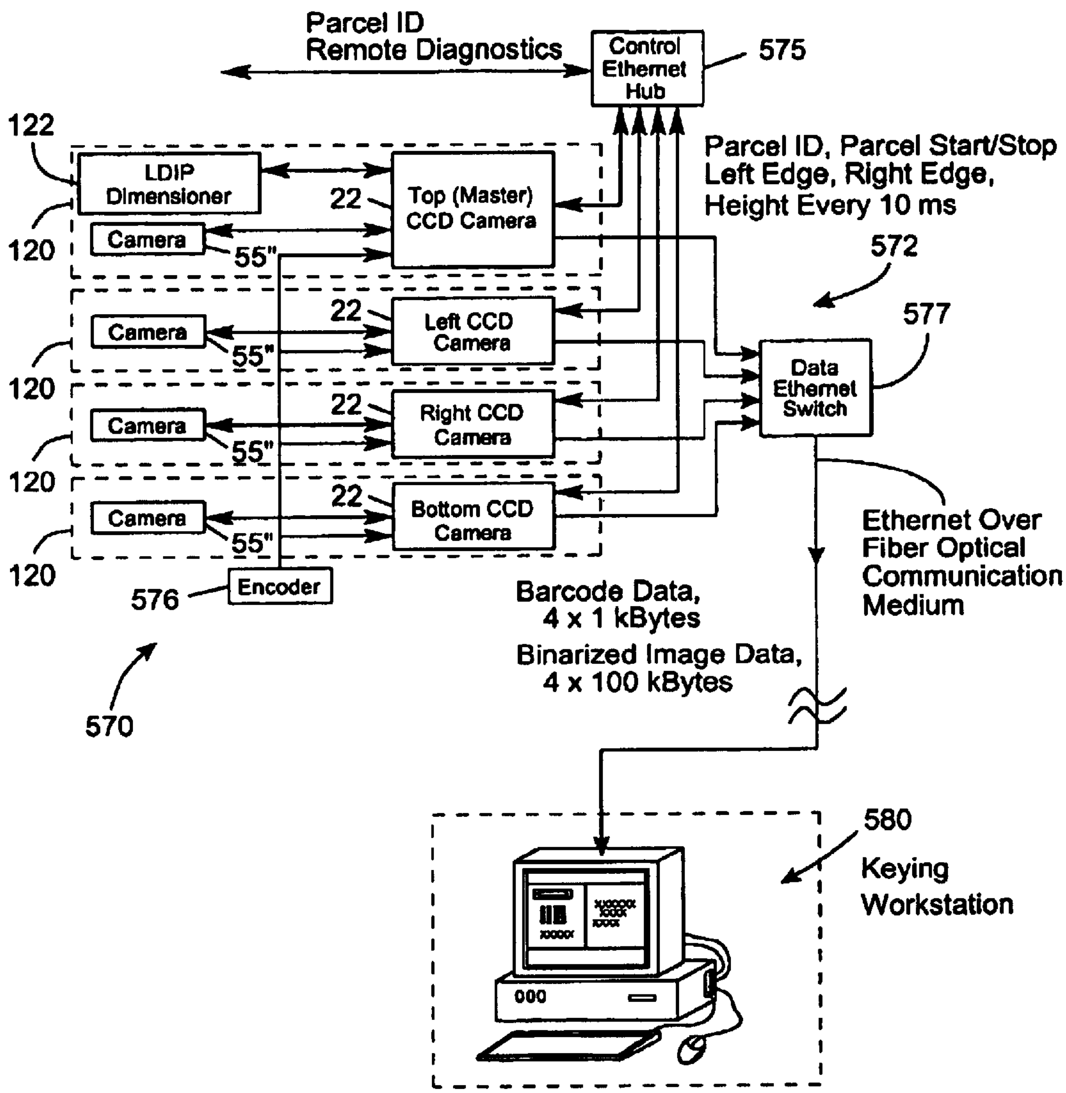
Figure 30A:
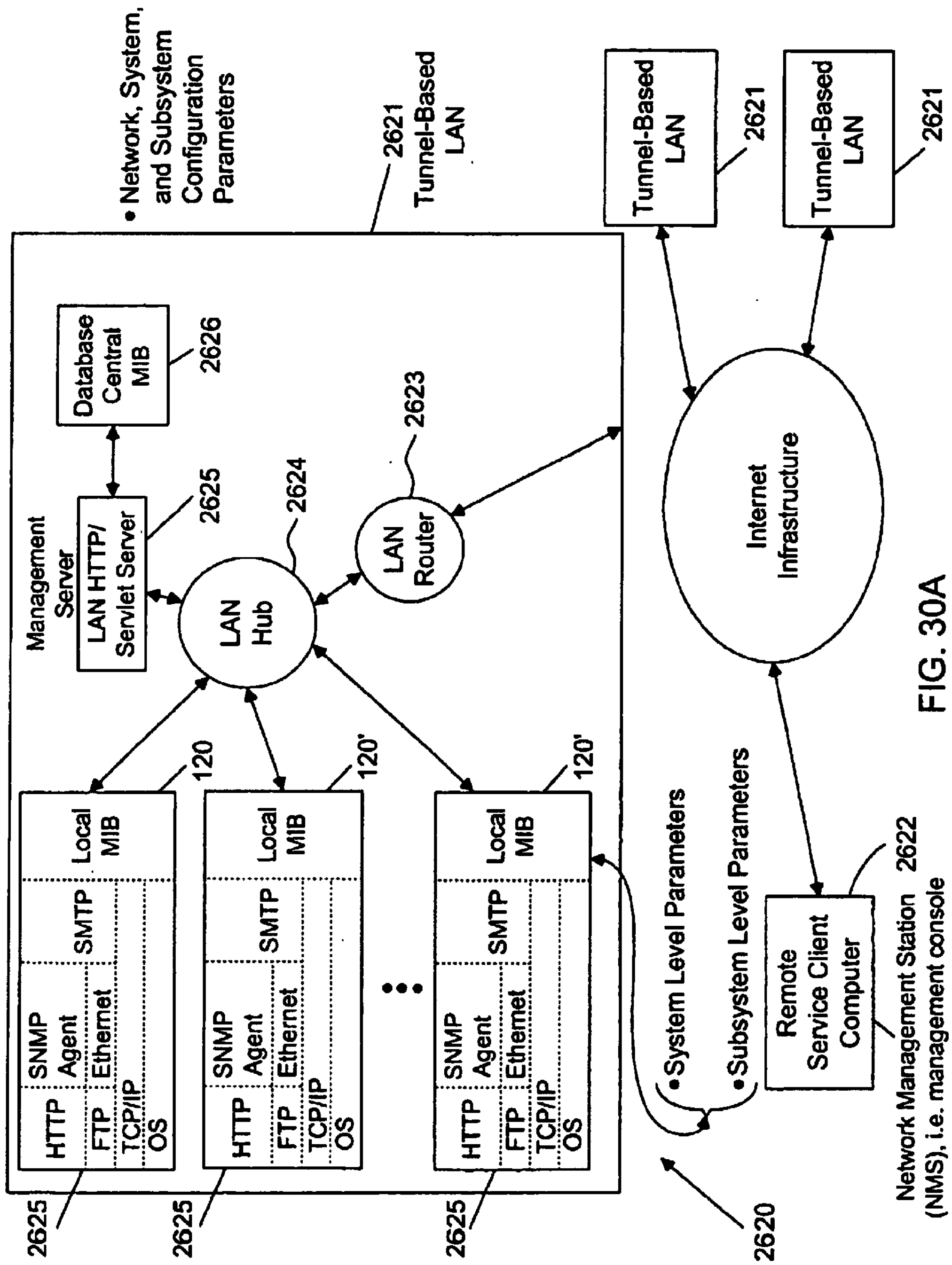
Figure 30B:
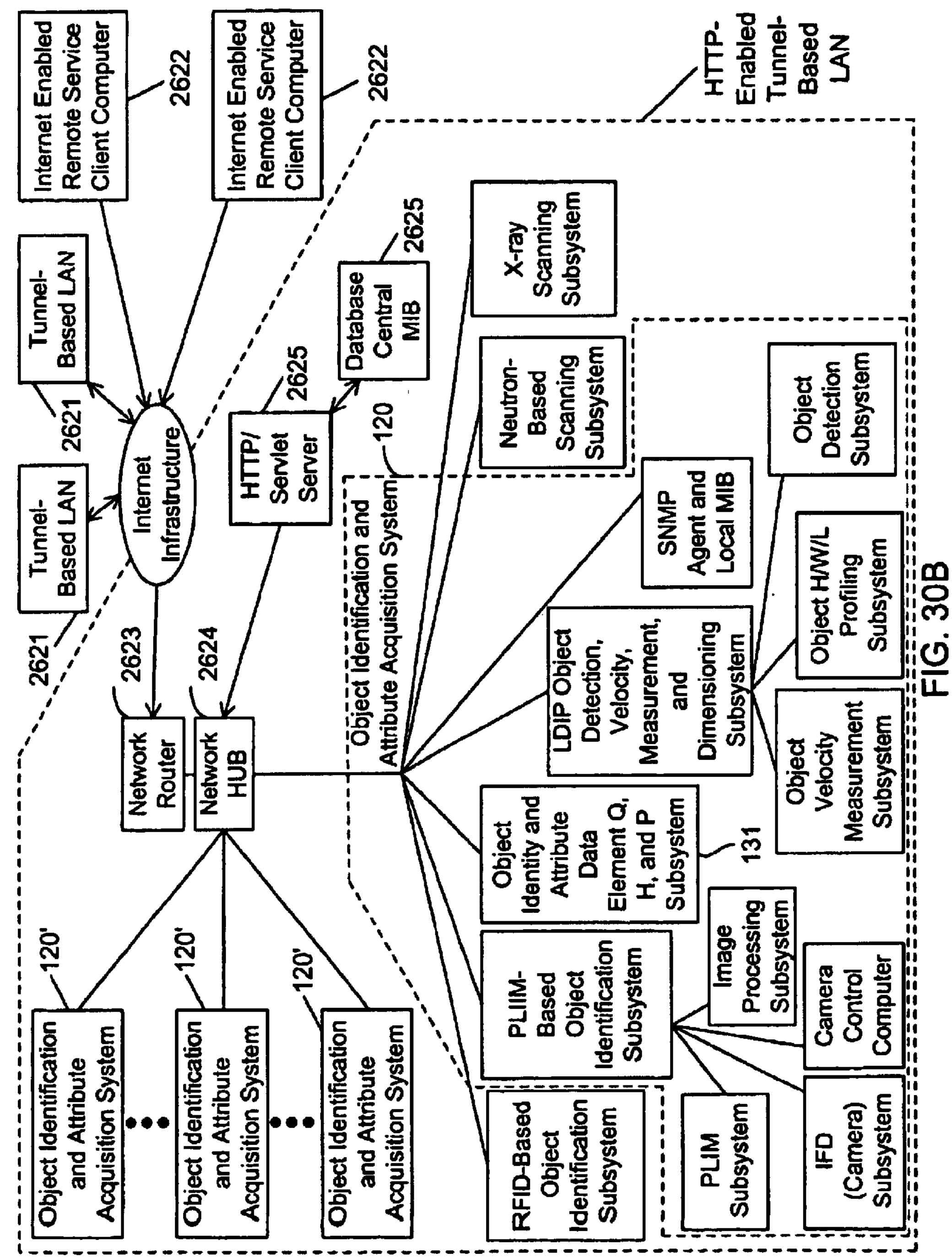
Figure 31:
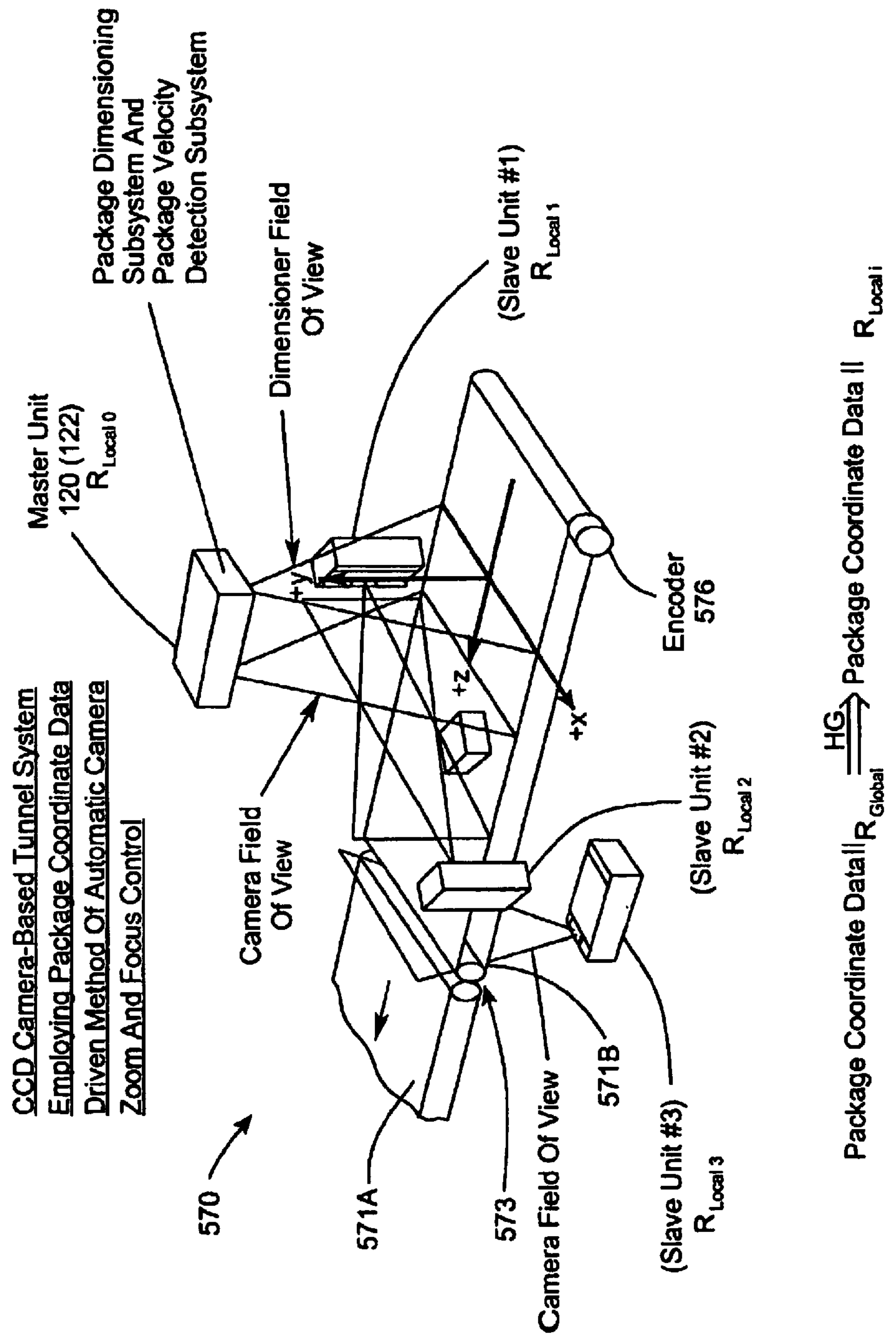
Figure 31A:
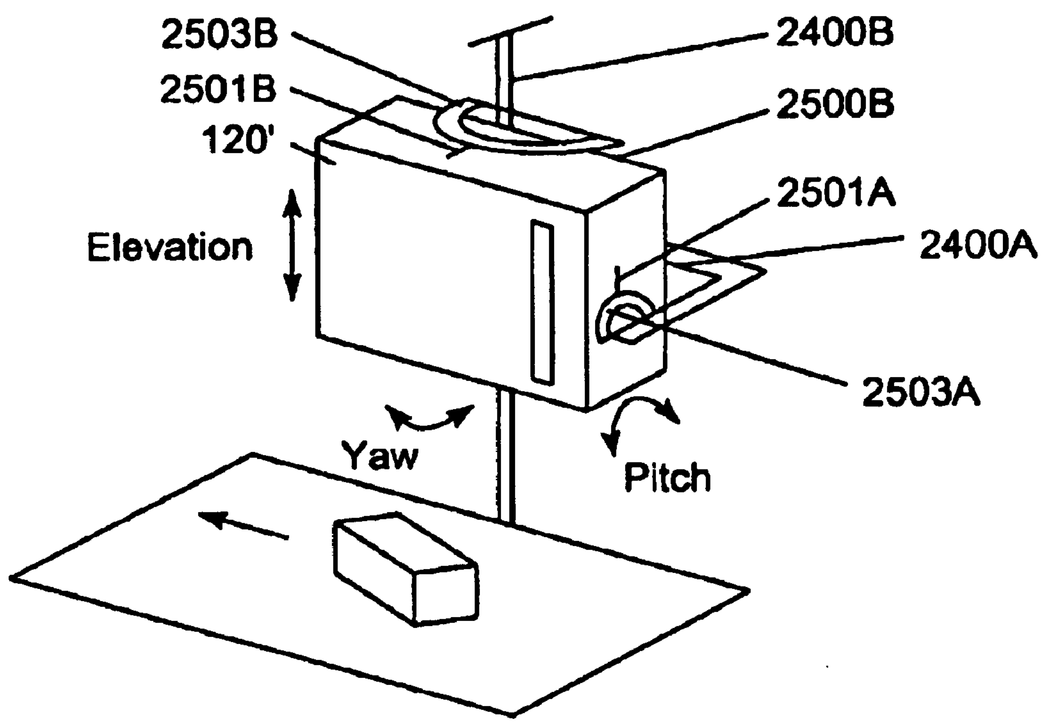
Figure 32A:
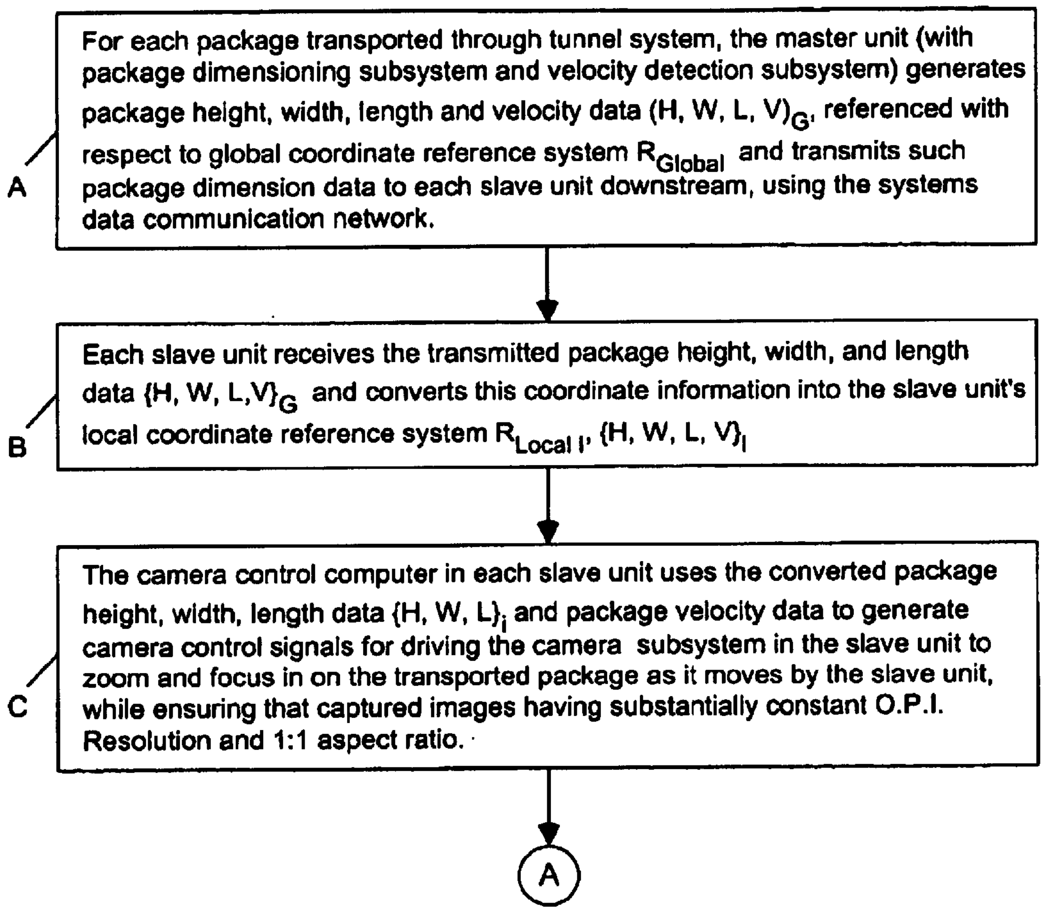
Figure 32B:
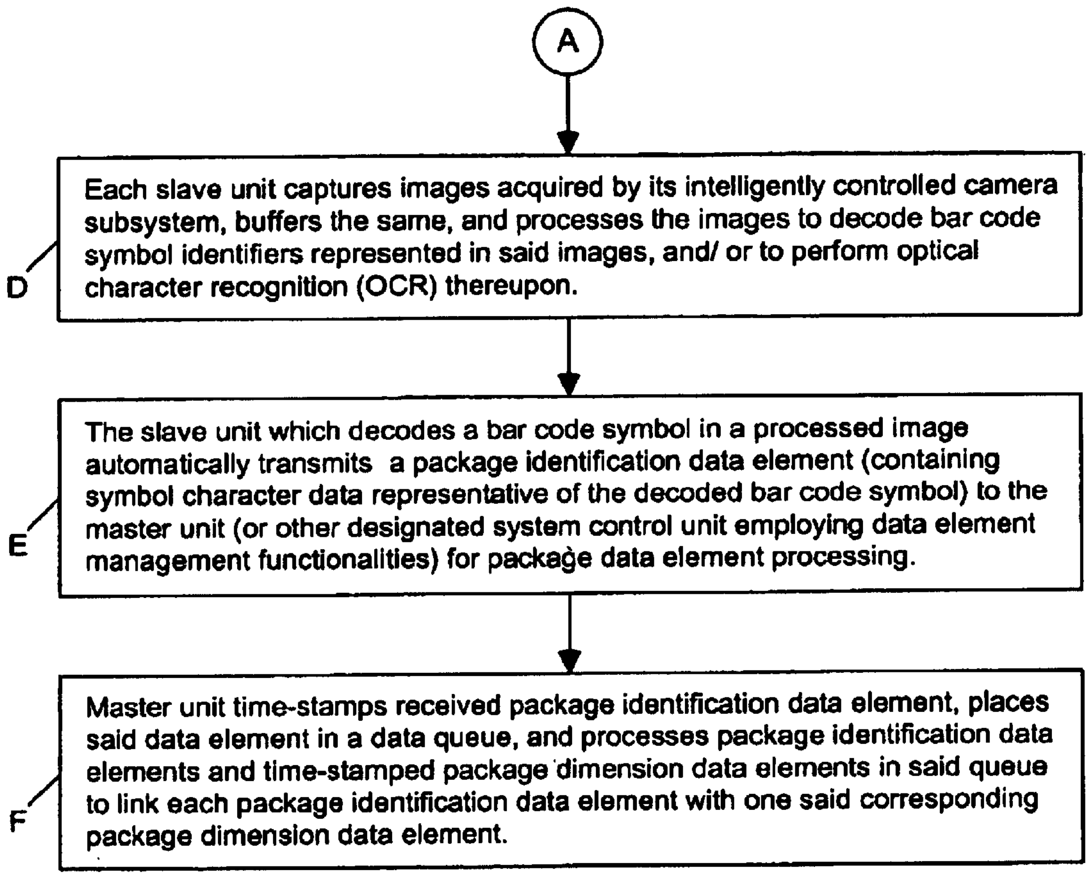
Figure 33A:
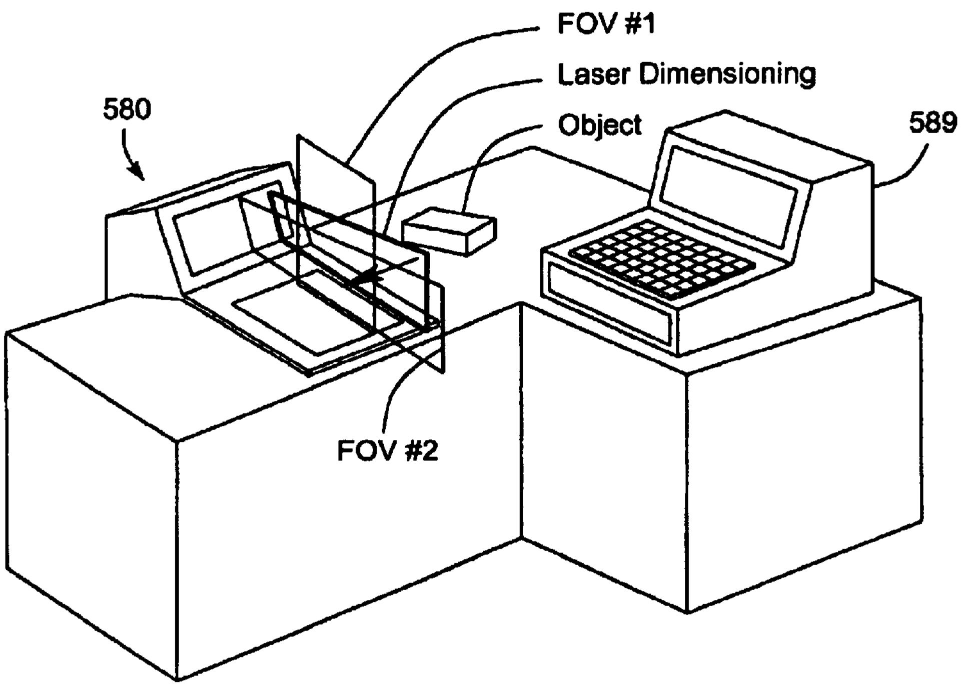
Figure 33B:
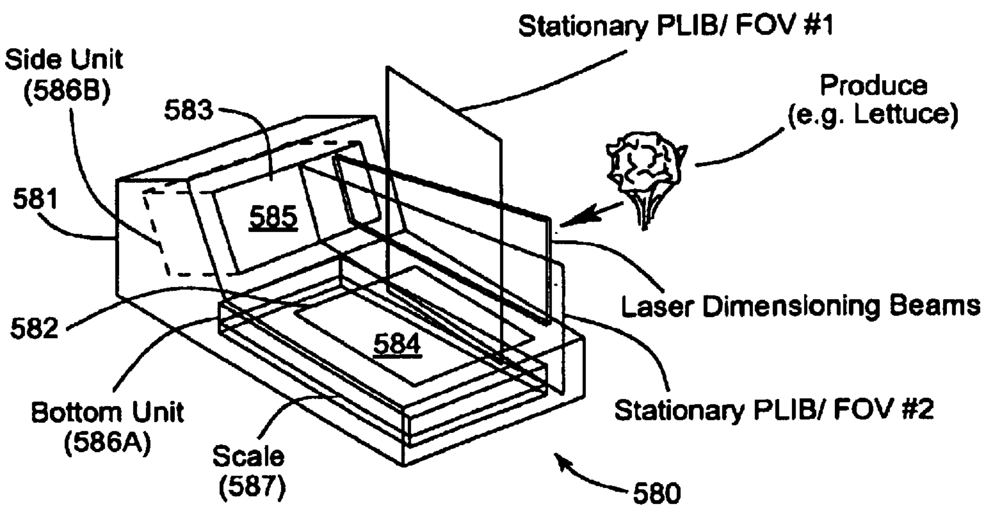
Figure 34A:
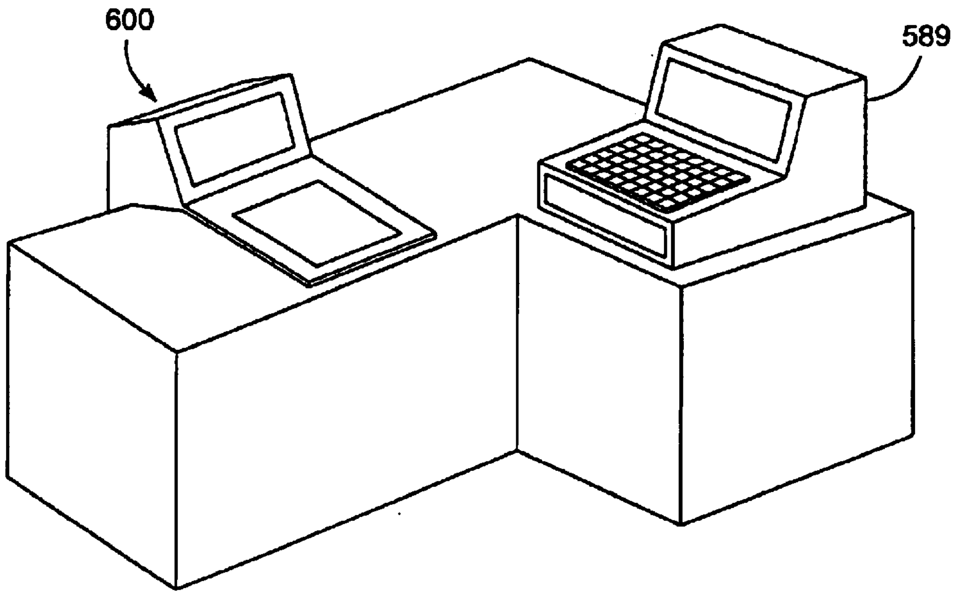
Figure 34B:
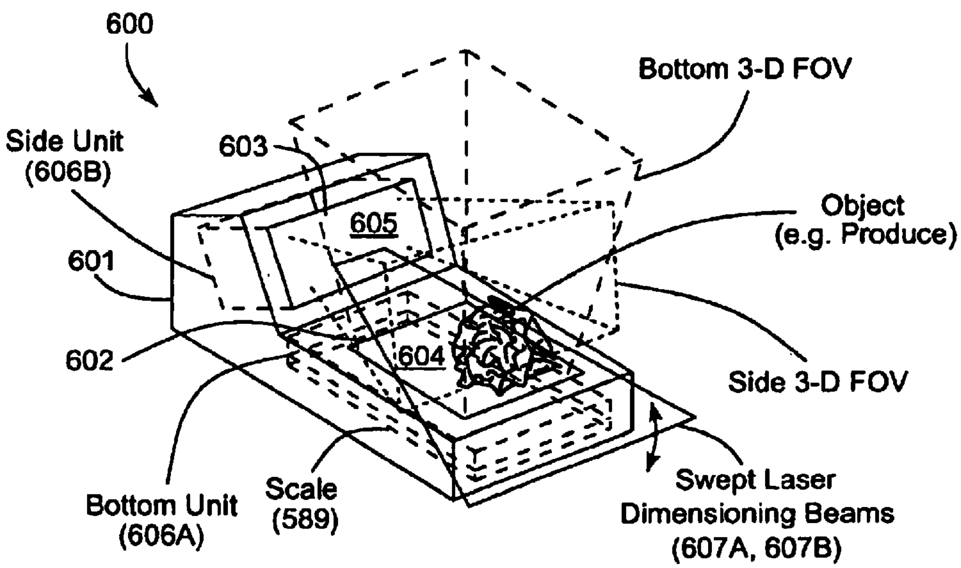
Figure 35A:
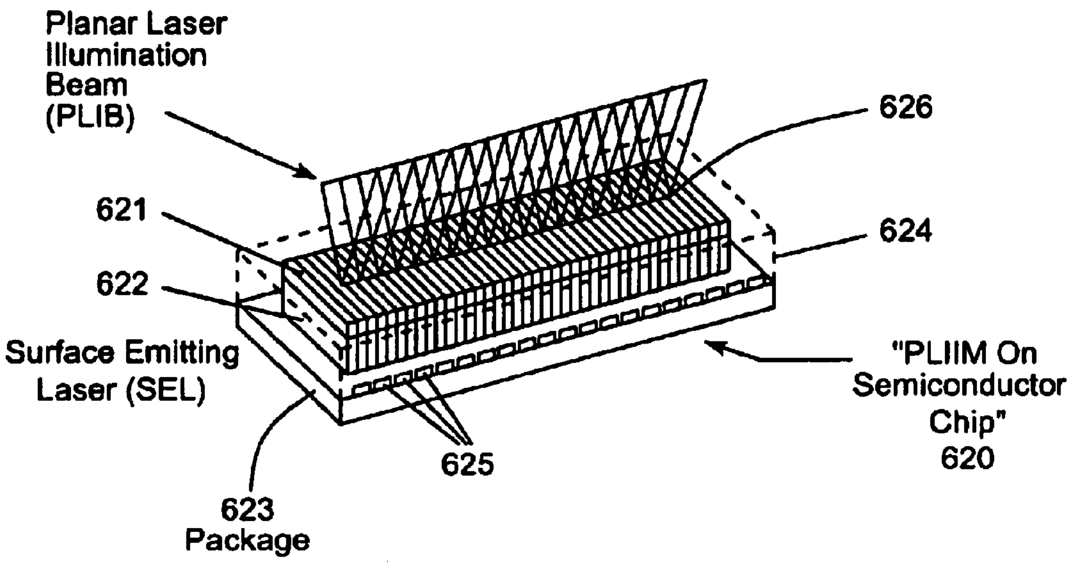
Figure 35B:
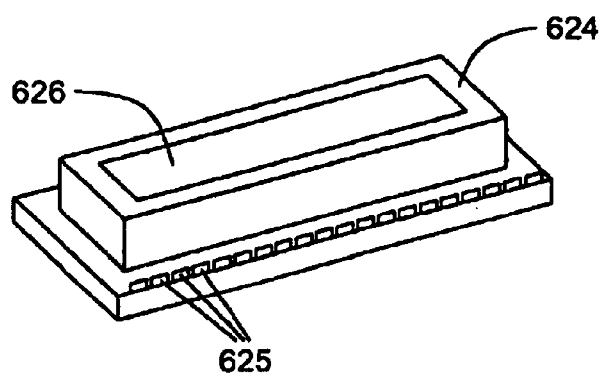
Figure 36A:
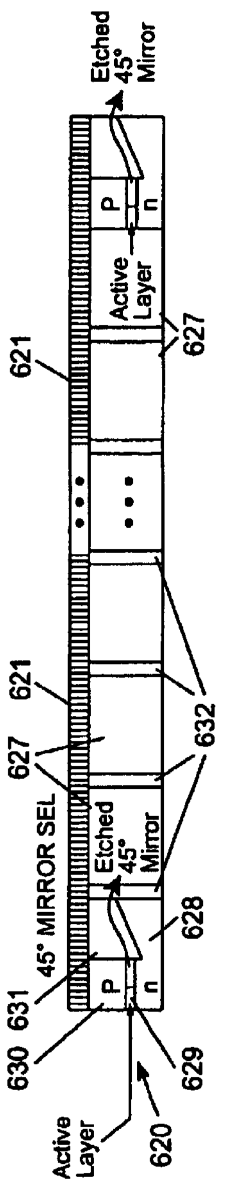
Figure 36B:
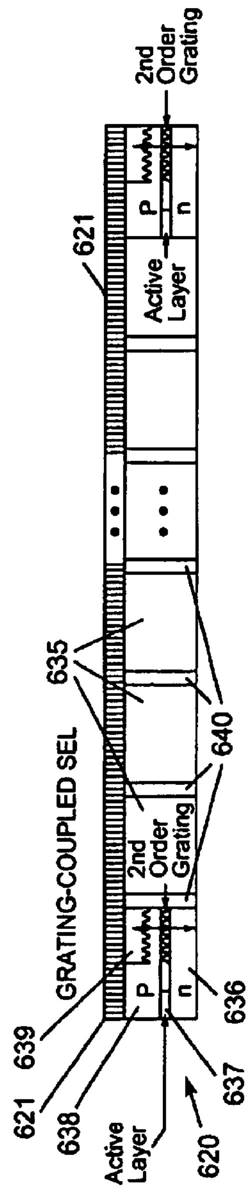
Figure 36C:
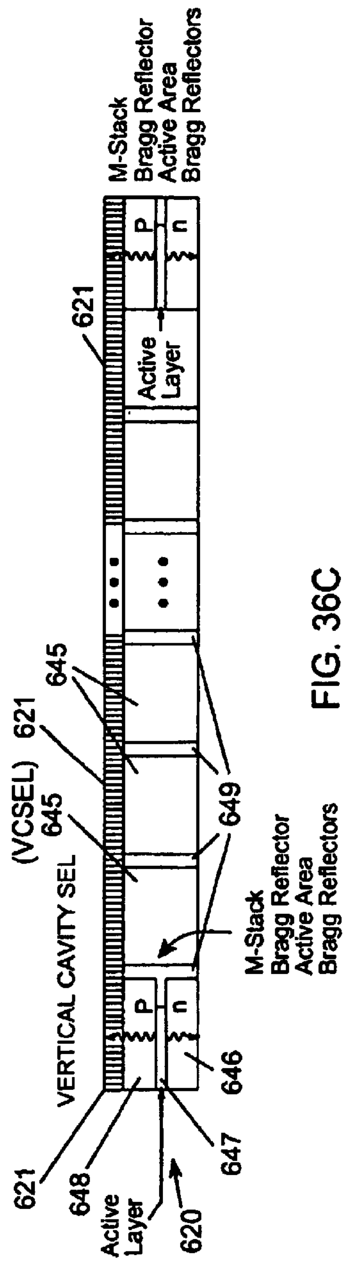
Figure 37:
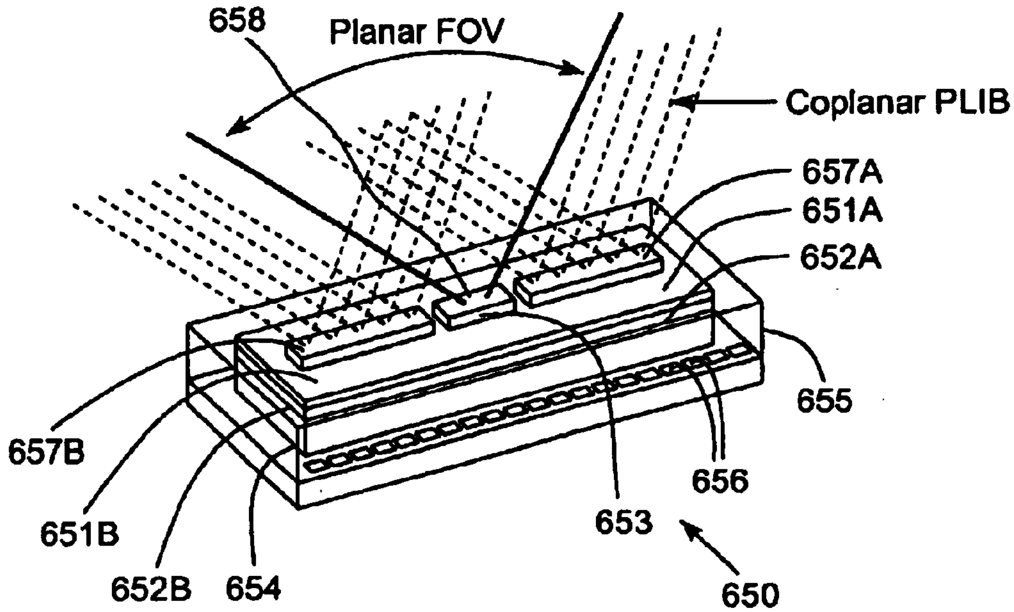
Figure 38A:
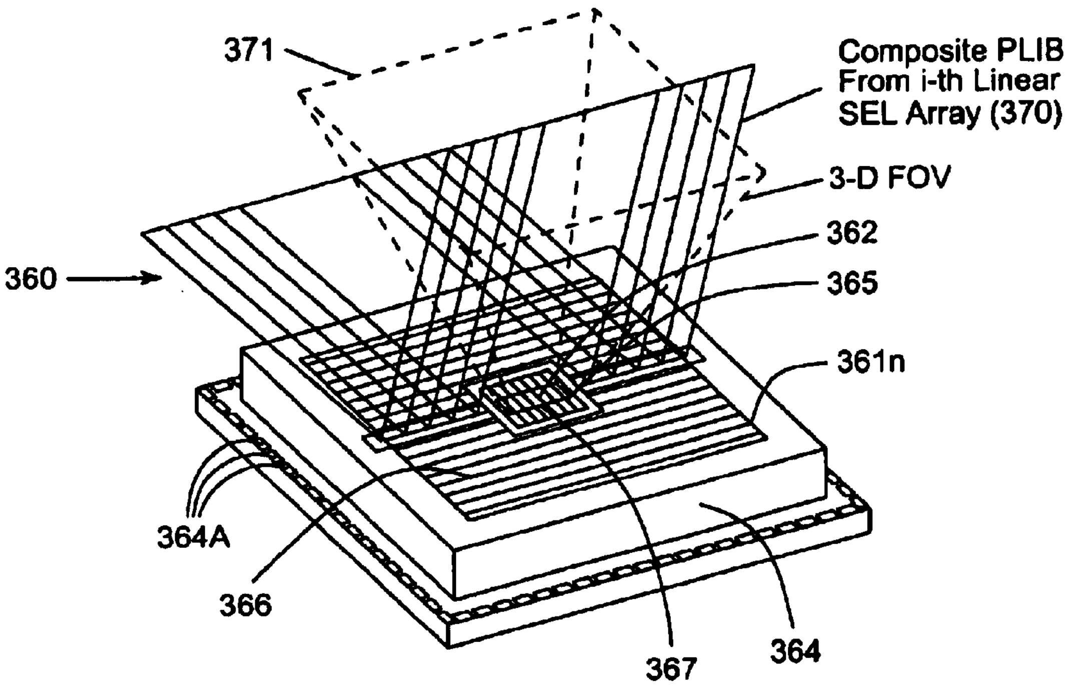
Figure 38B:
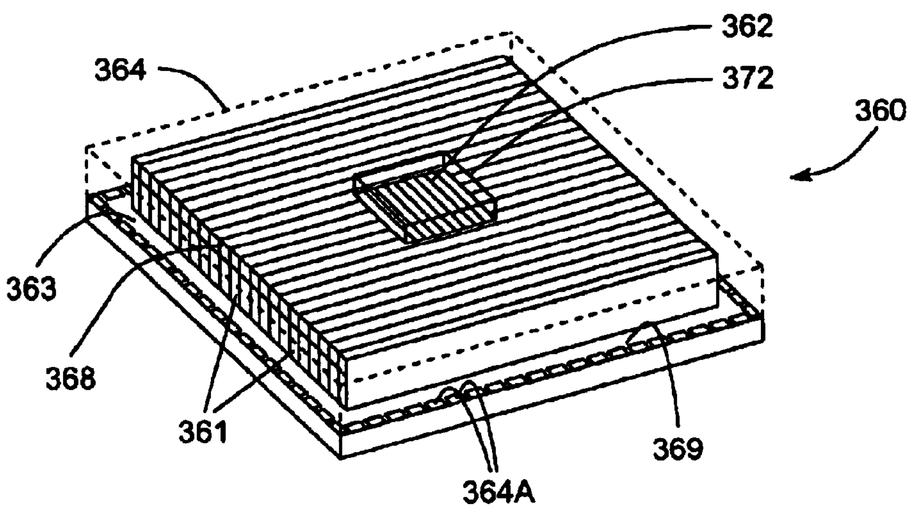
Figure 39A:
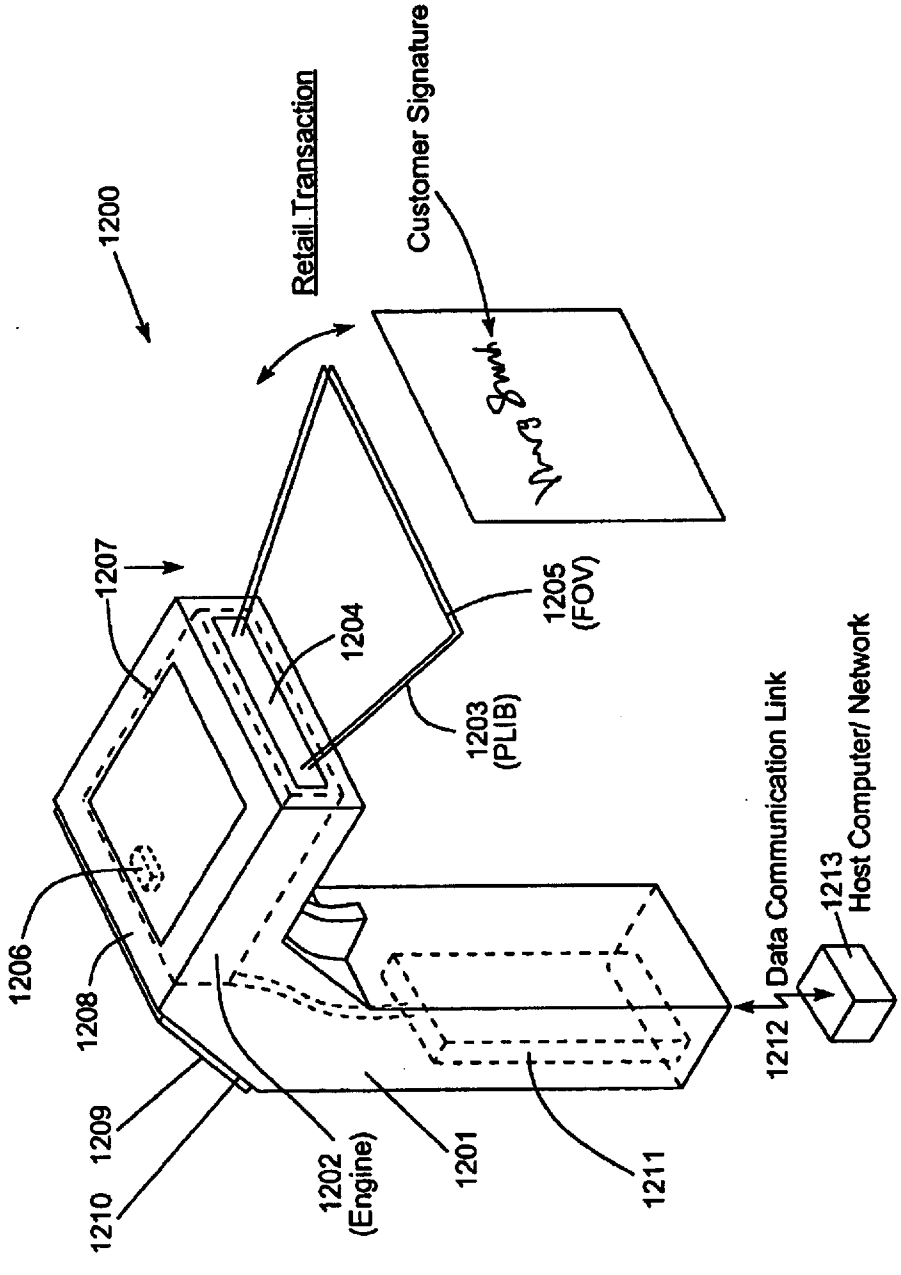
Figure 39B:
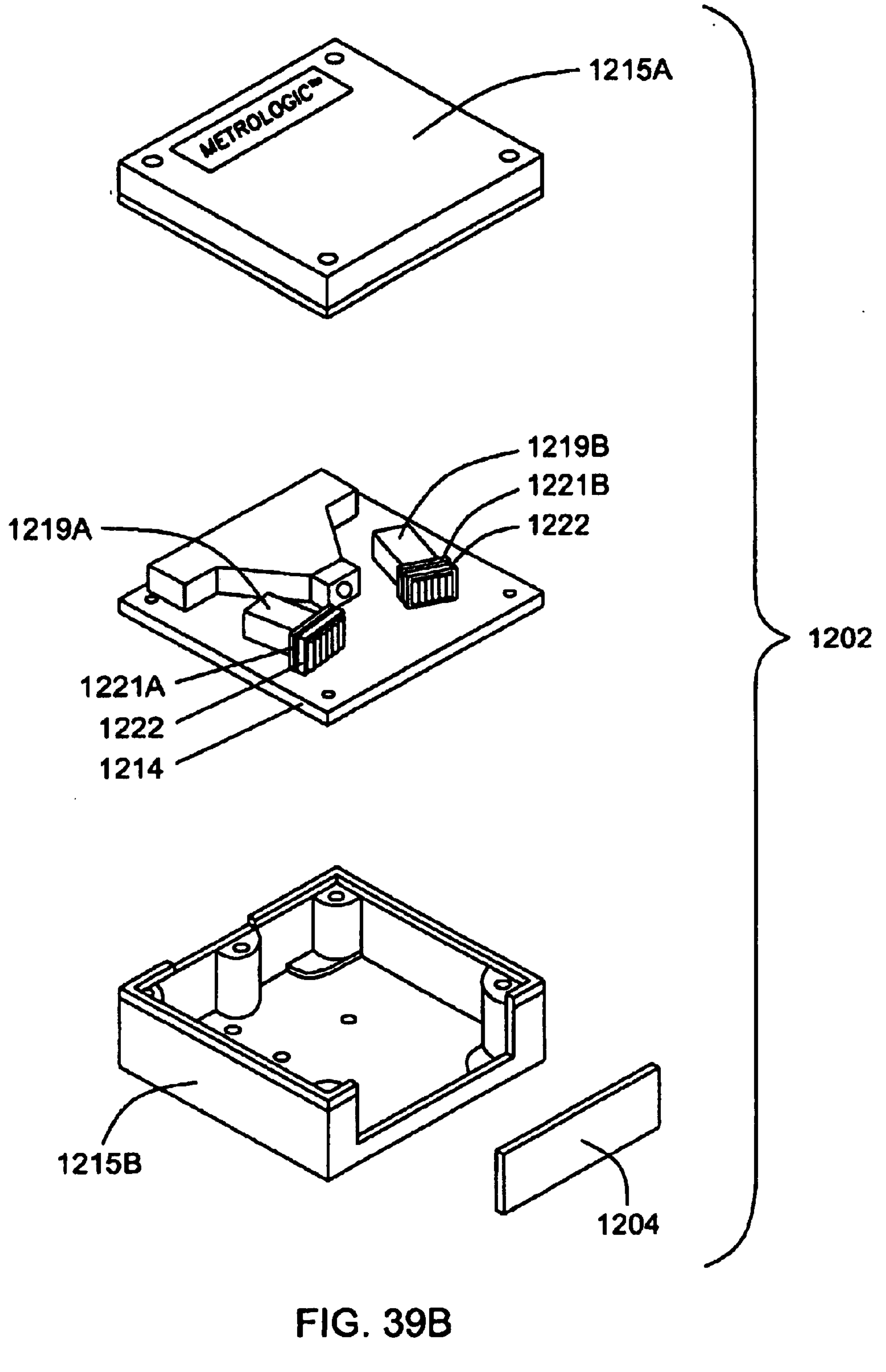
Figure 39C:
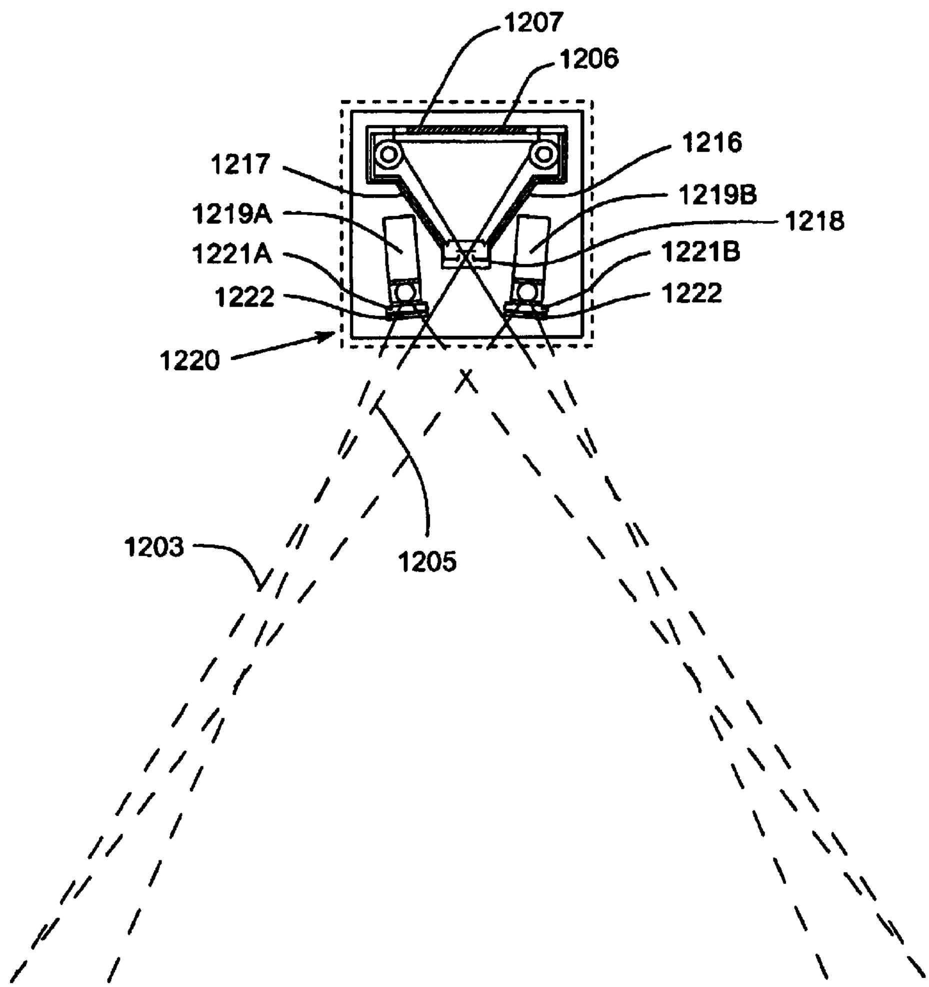
Figure 39D:
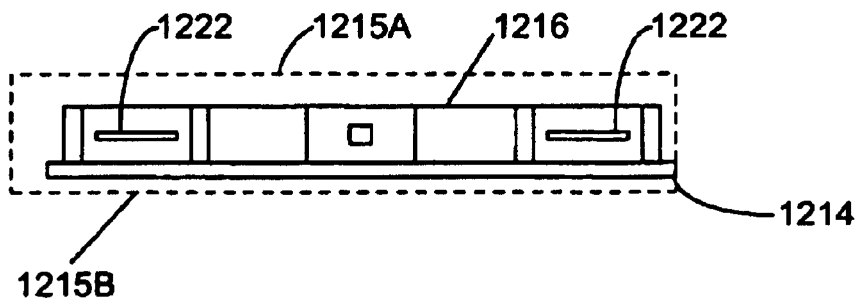
Figure 39E:
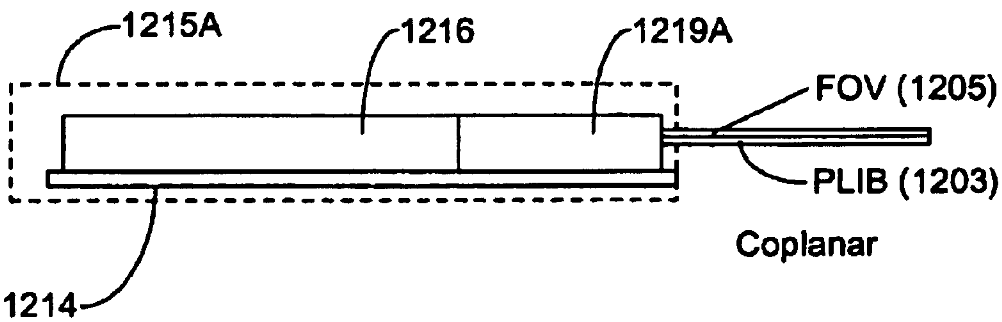
Figure 41A:
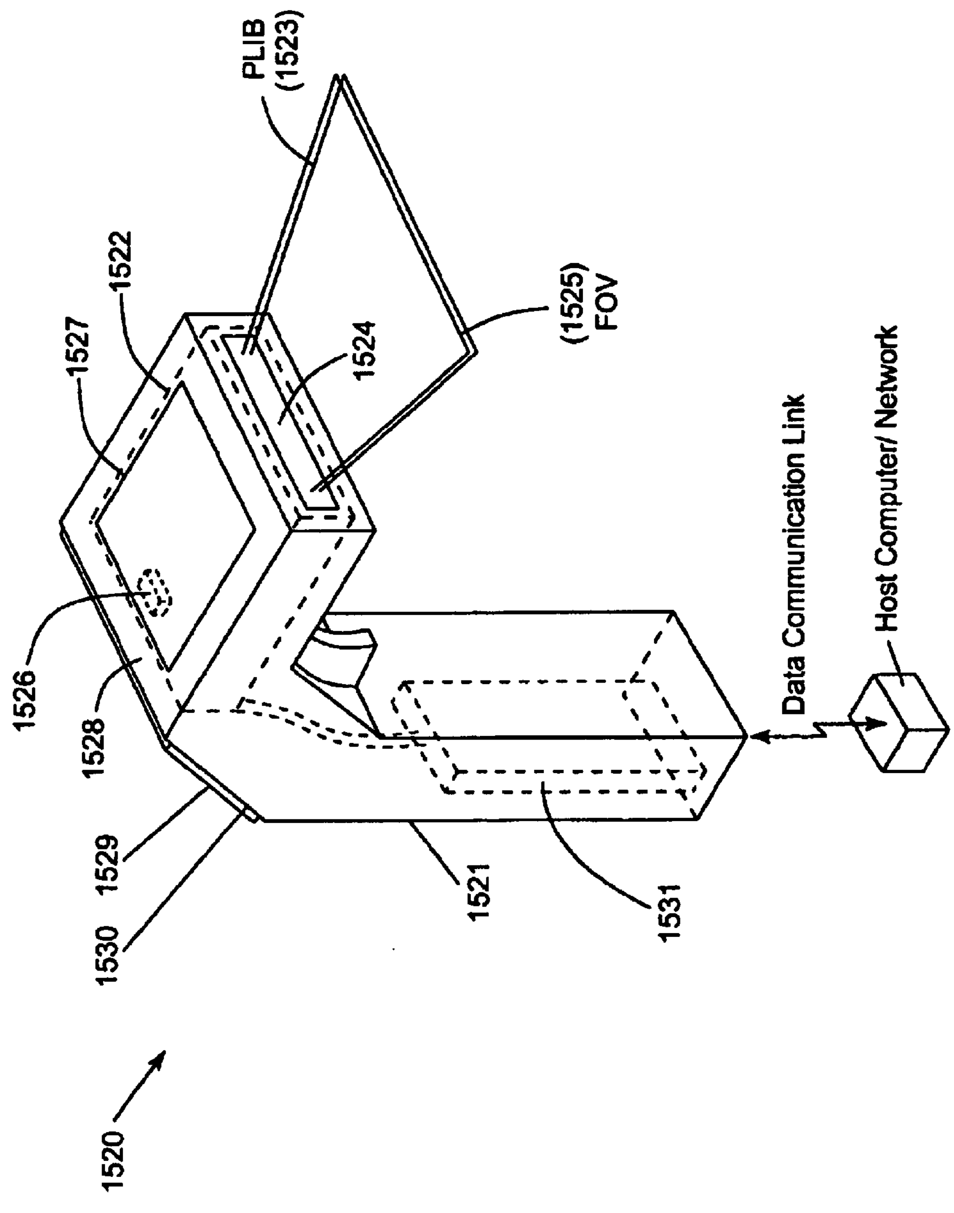
Figure 41B:
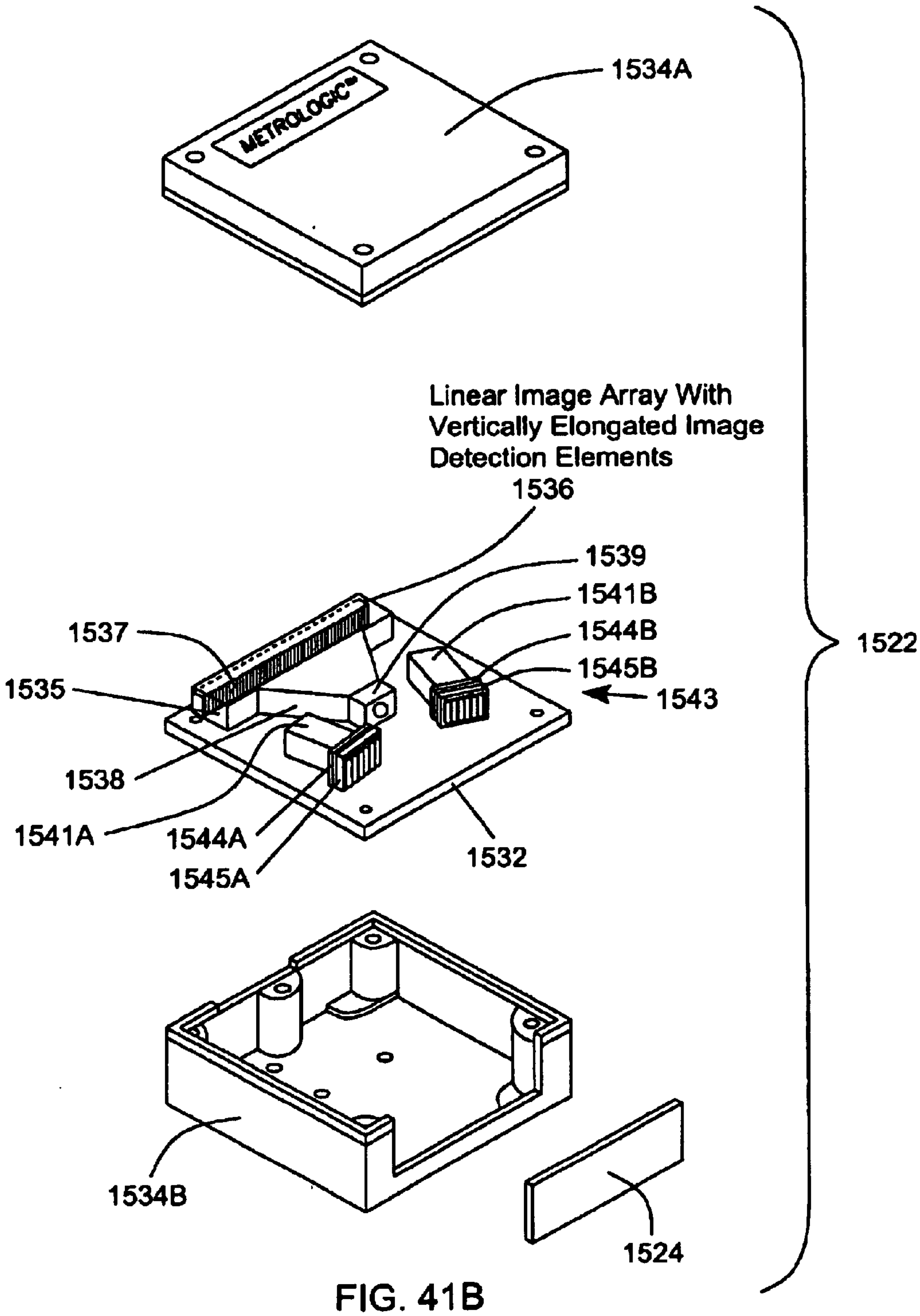
Figure 41C:
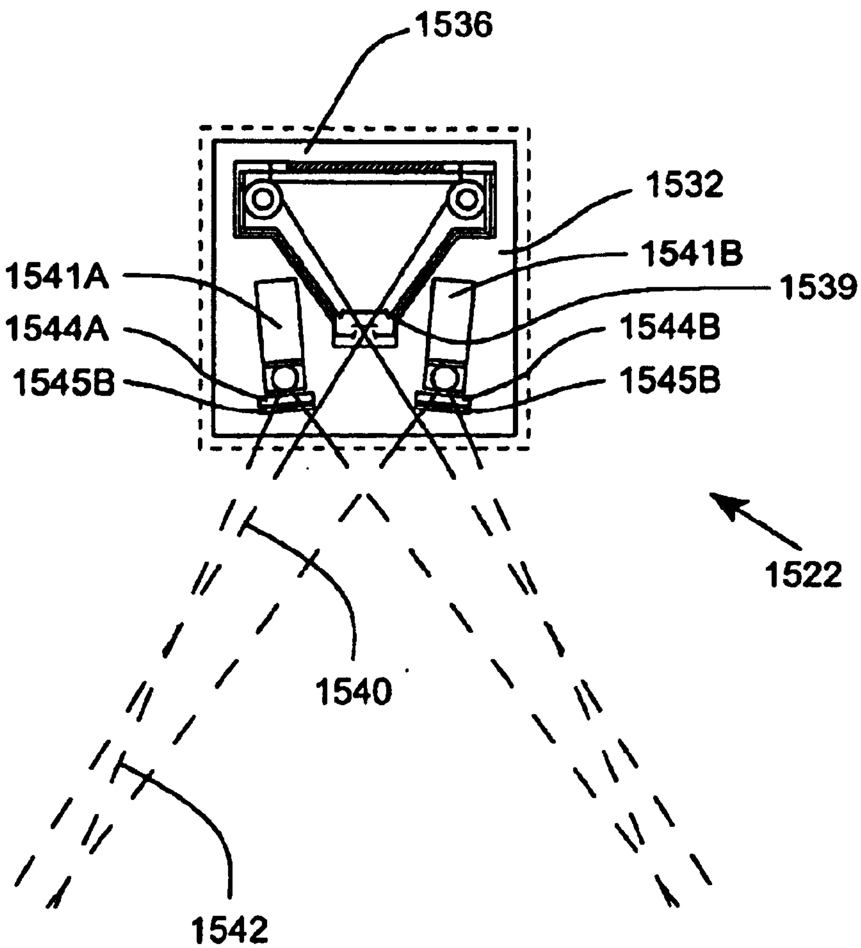
Figure 41D:
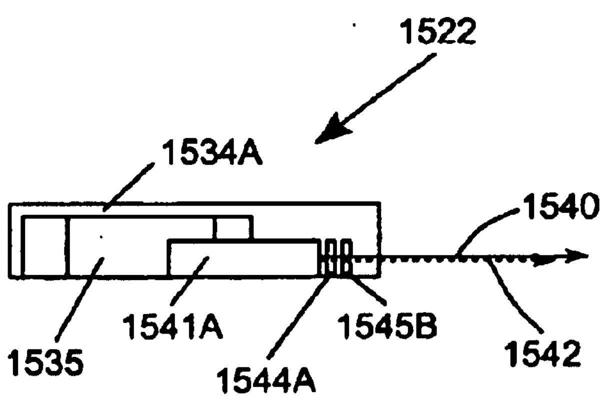
Figure 42:
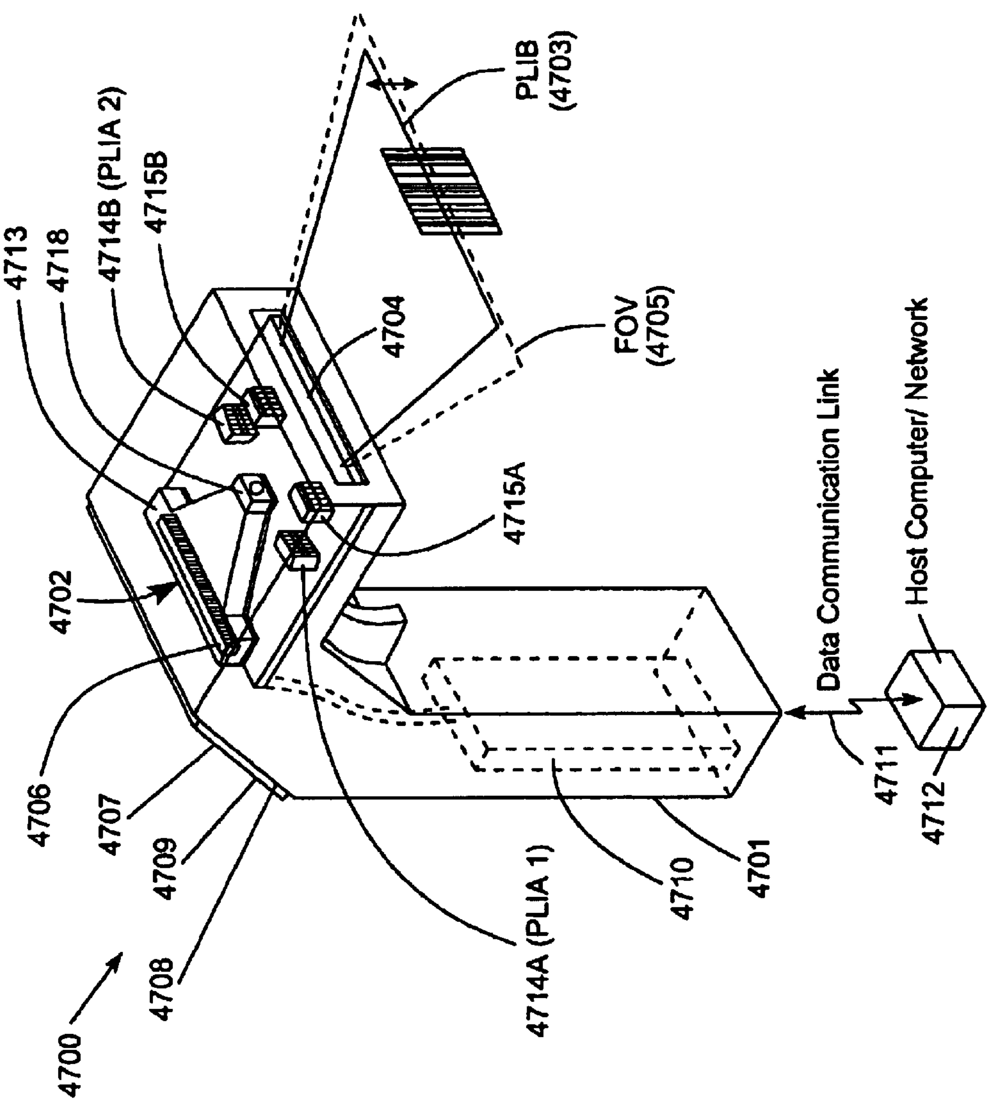
Figure 42A:
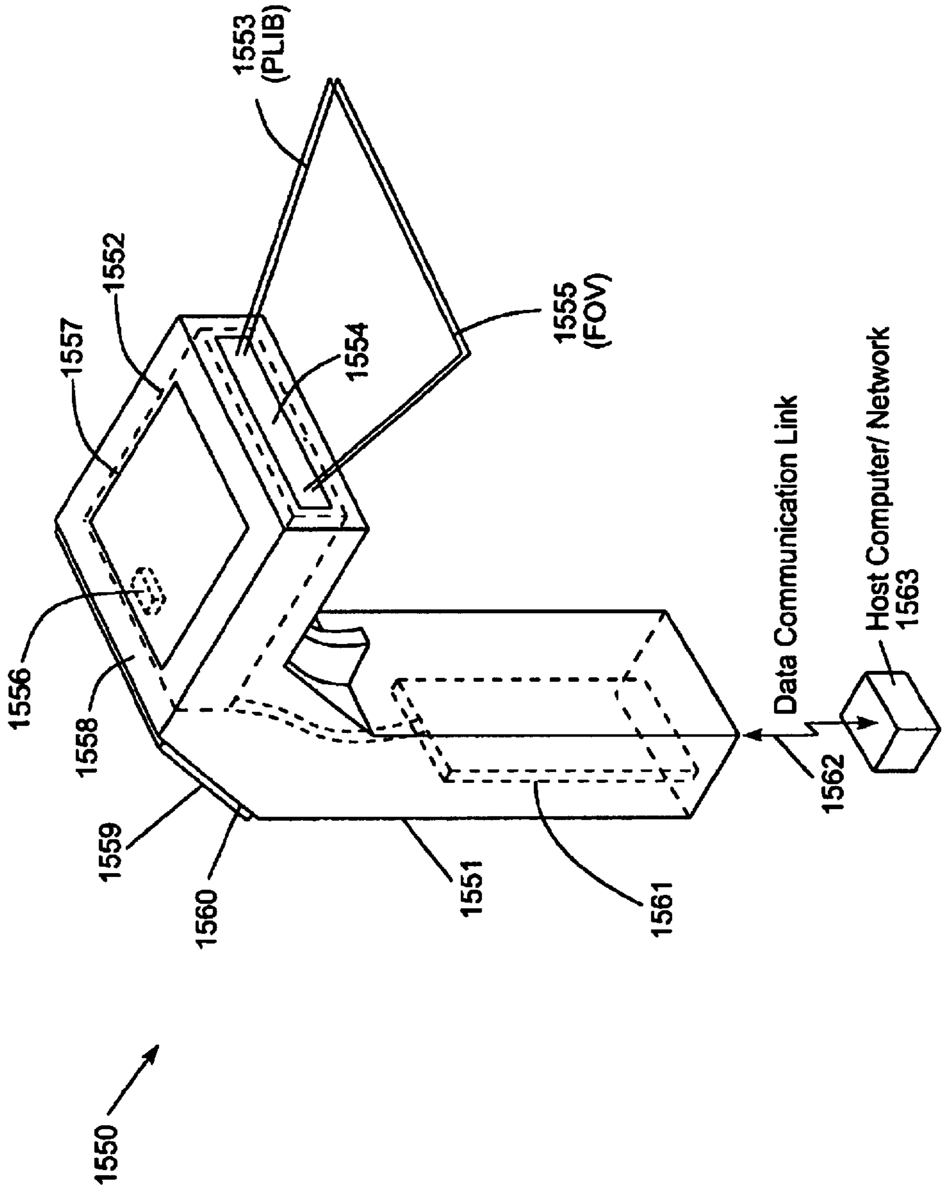
Figure 42B:
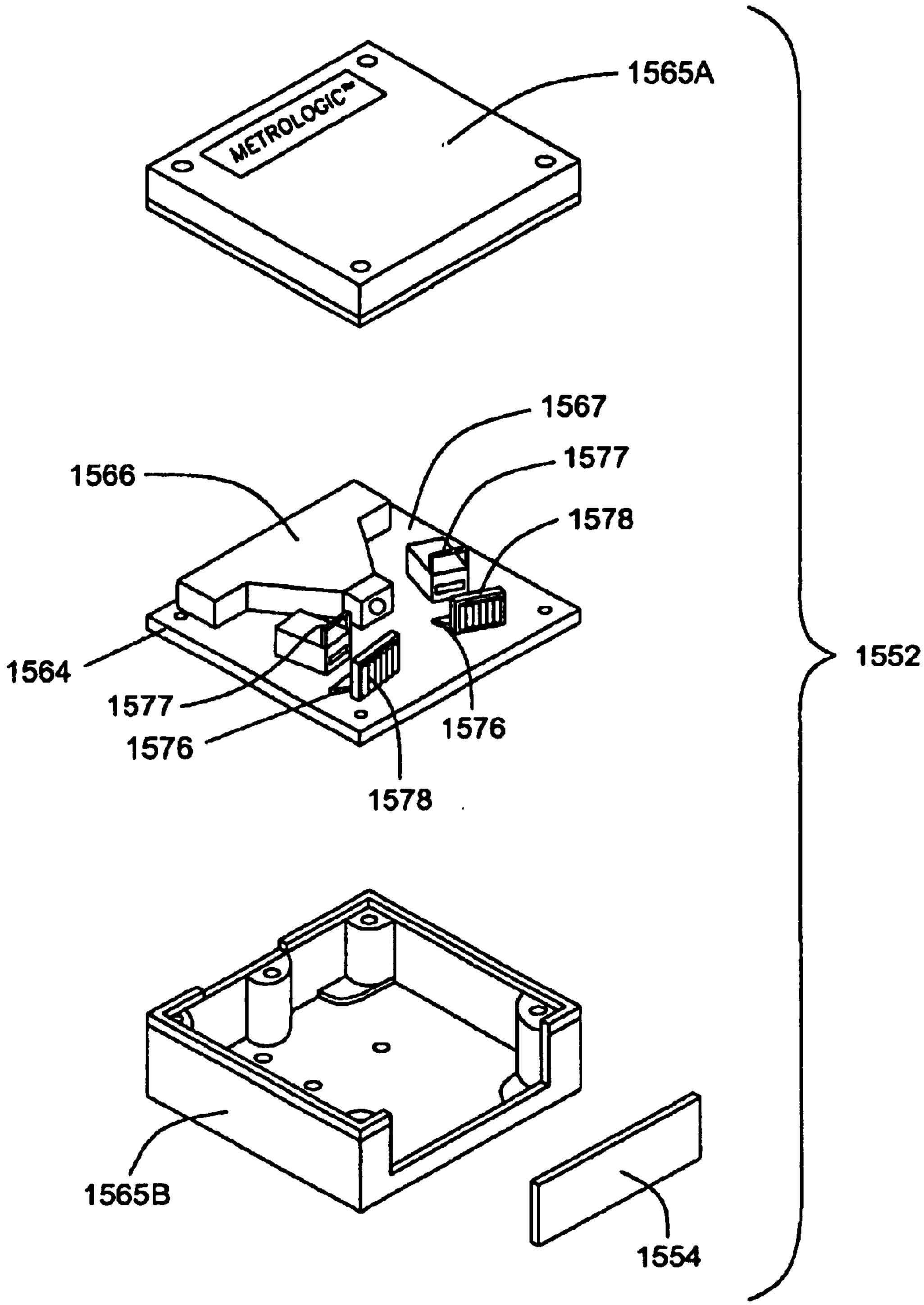
Figure 42C:
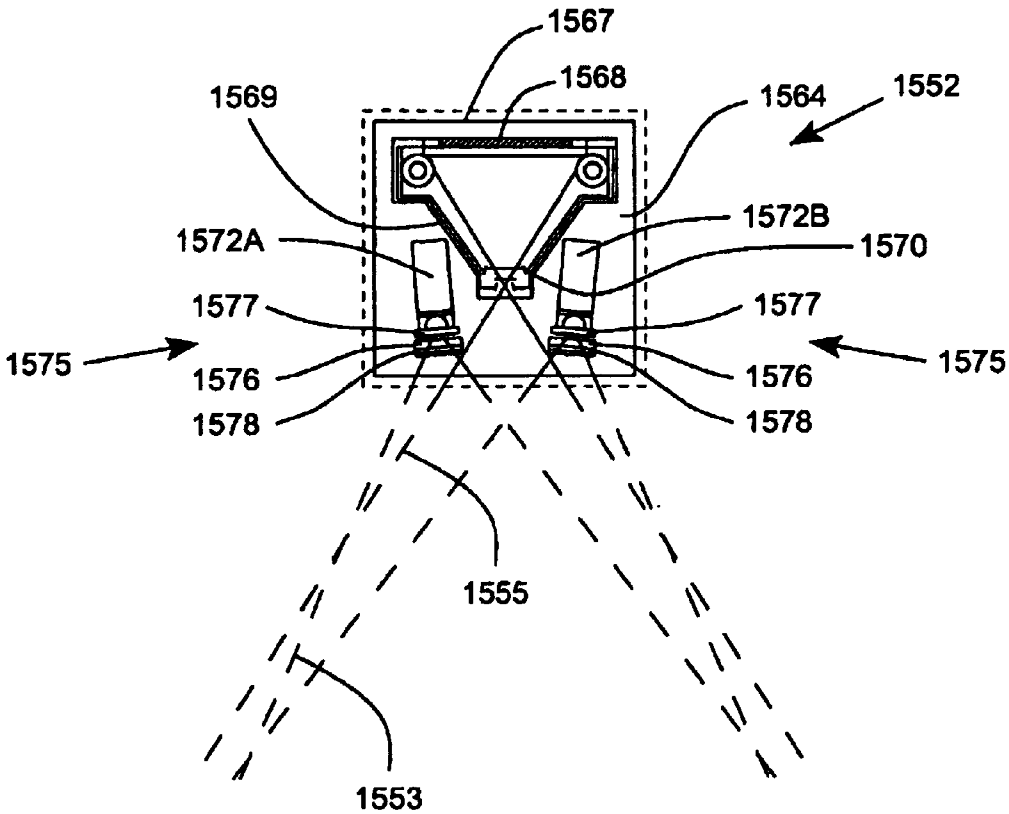
Figure 42D:
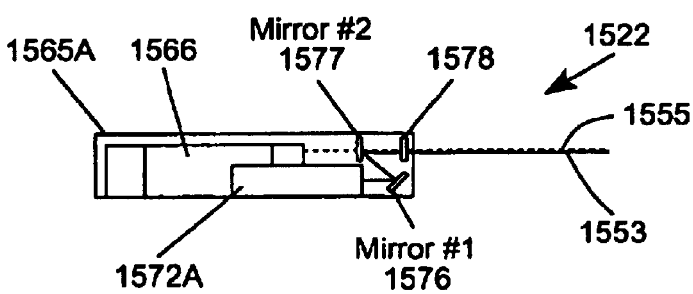
Figure 43A:
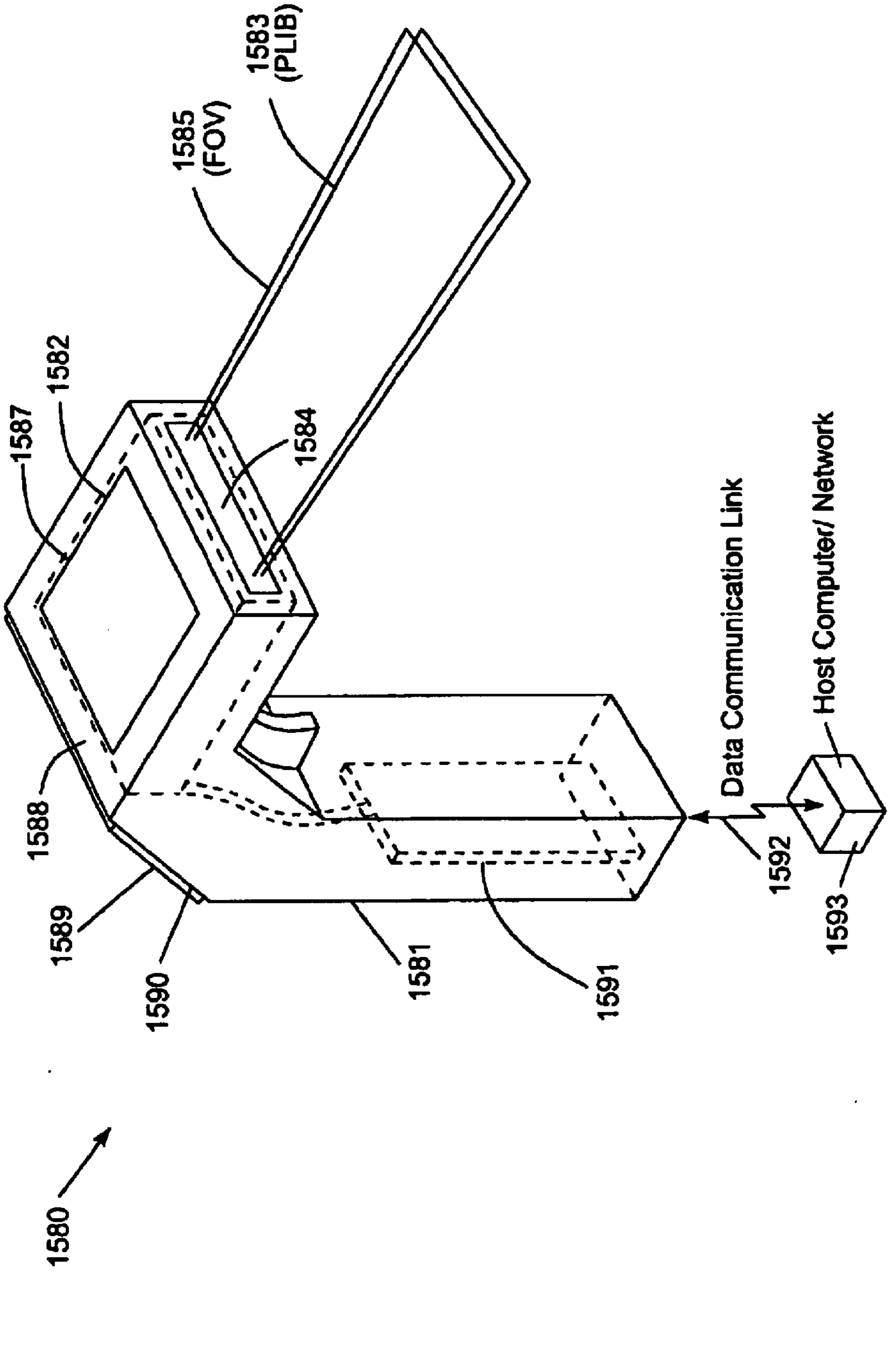
Figure 43B:
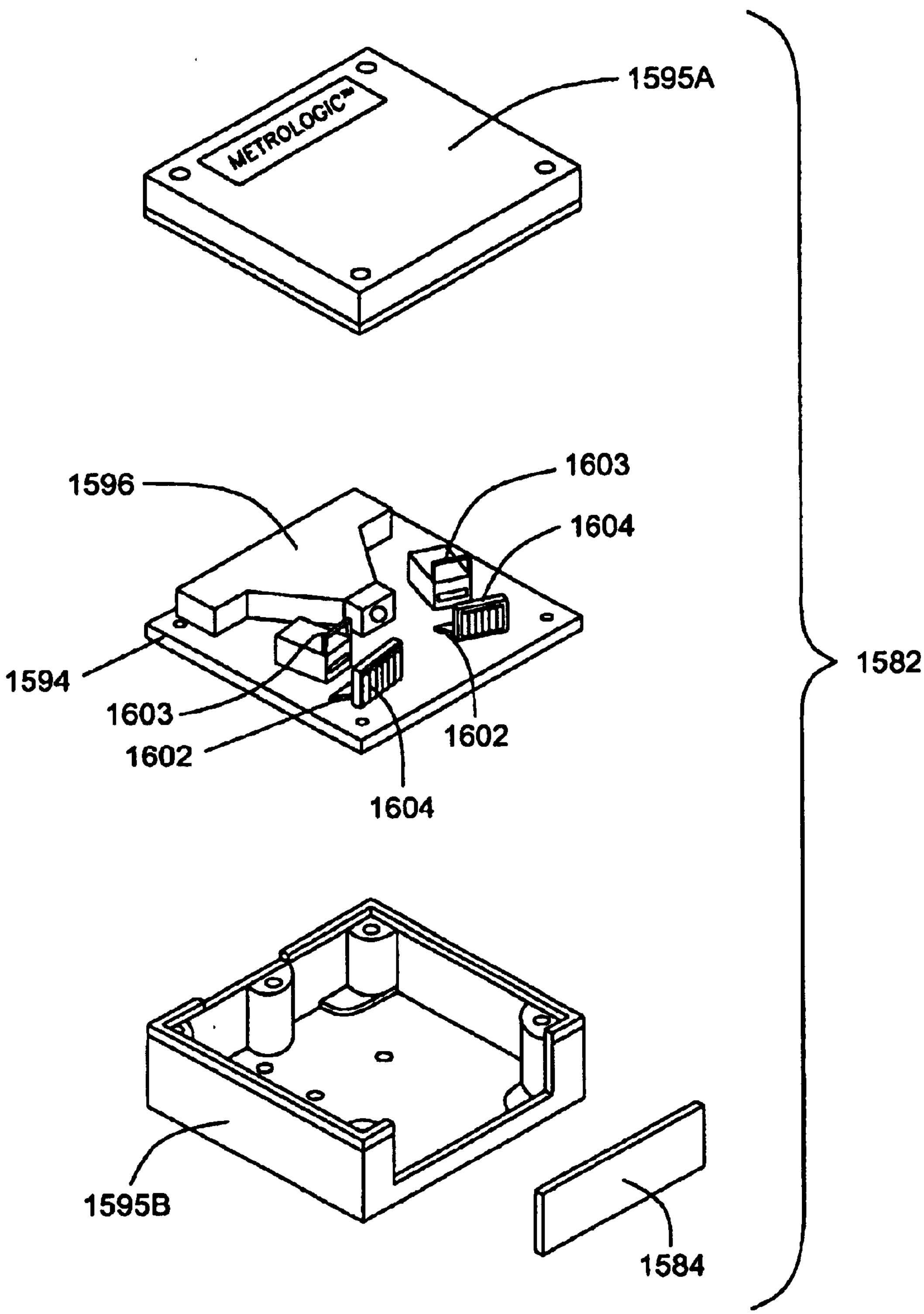
Figure 43C:
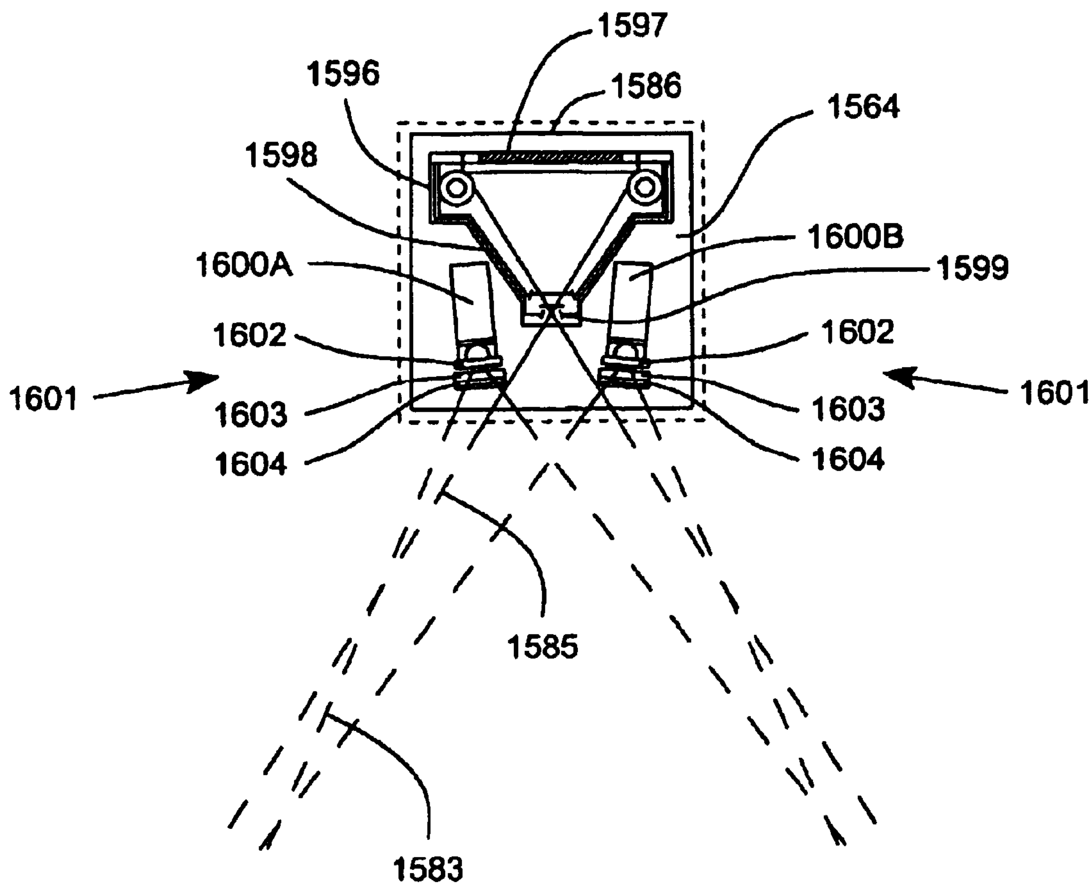
Figure 43D:
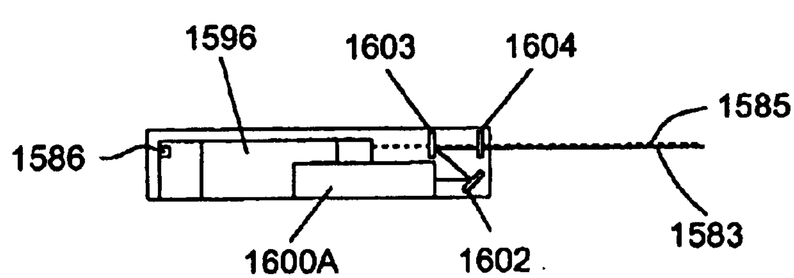
Figure 44A:
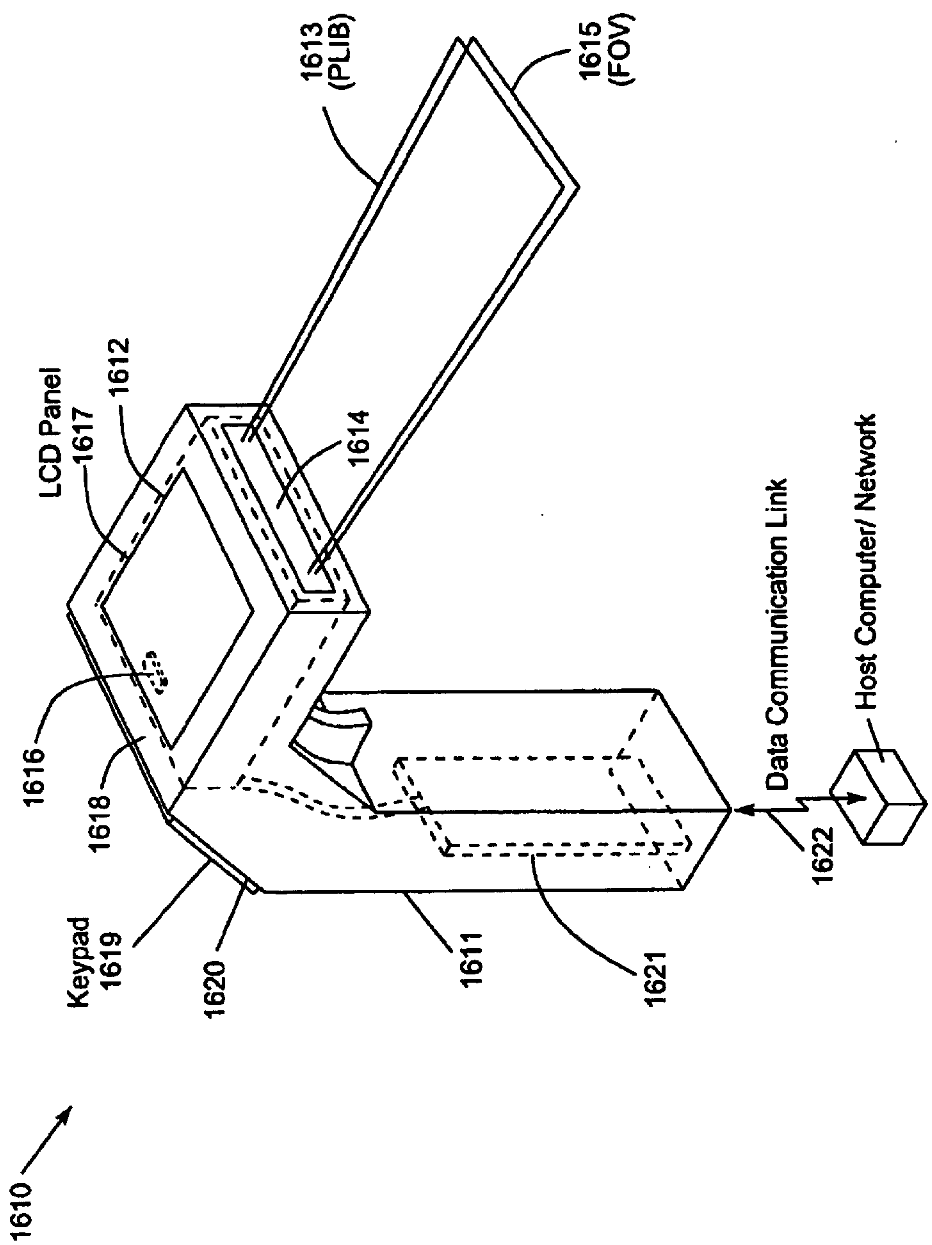
Figure 44B:
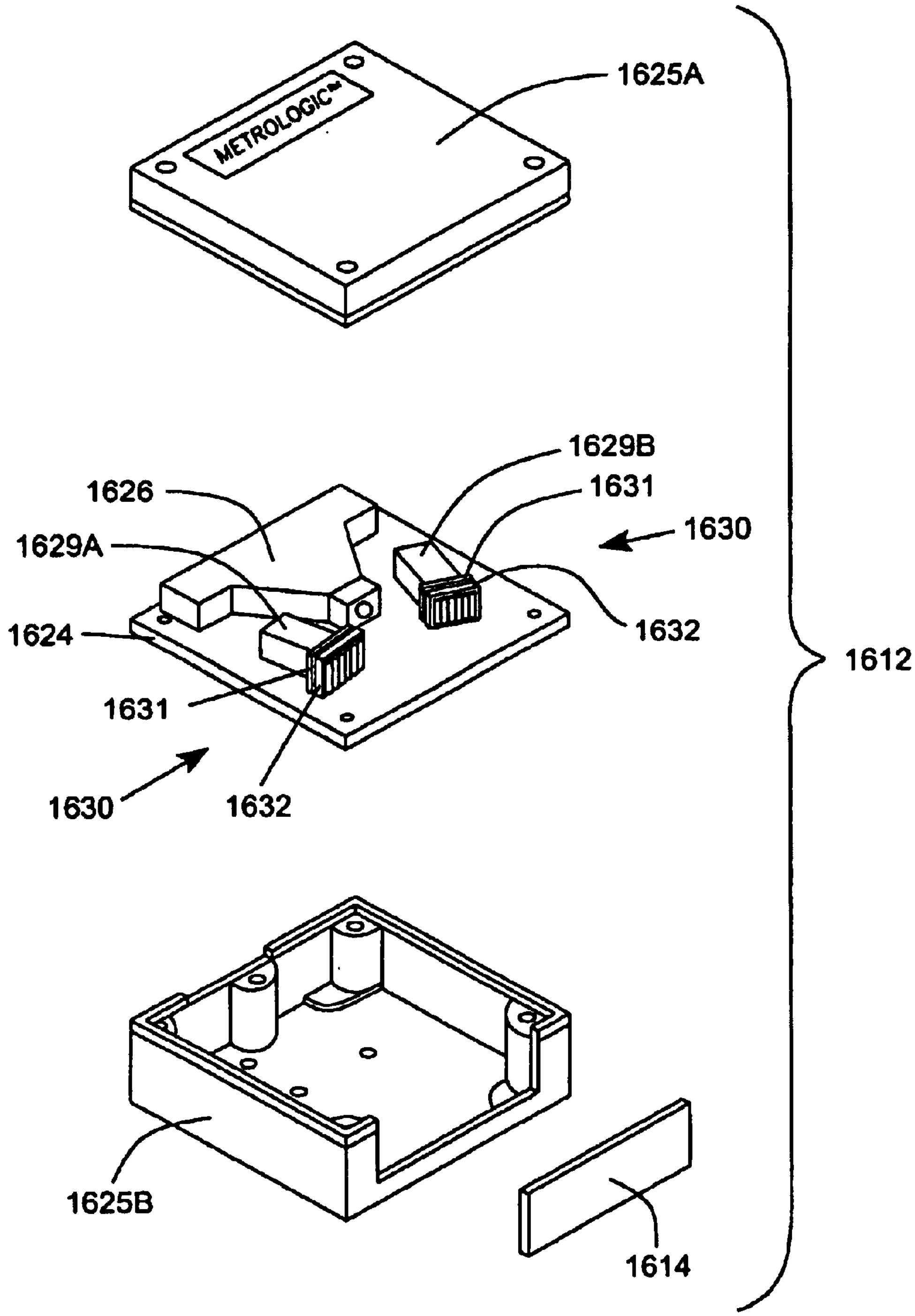
Figure 44C:
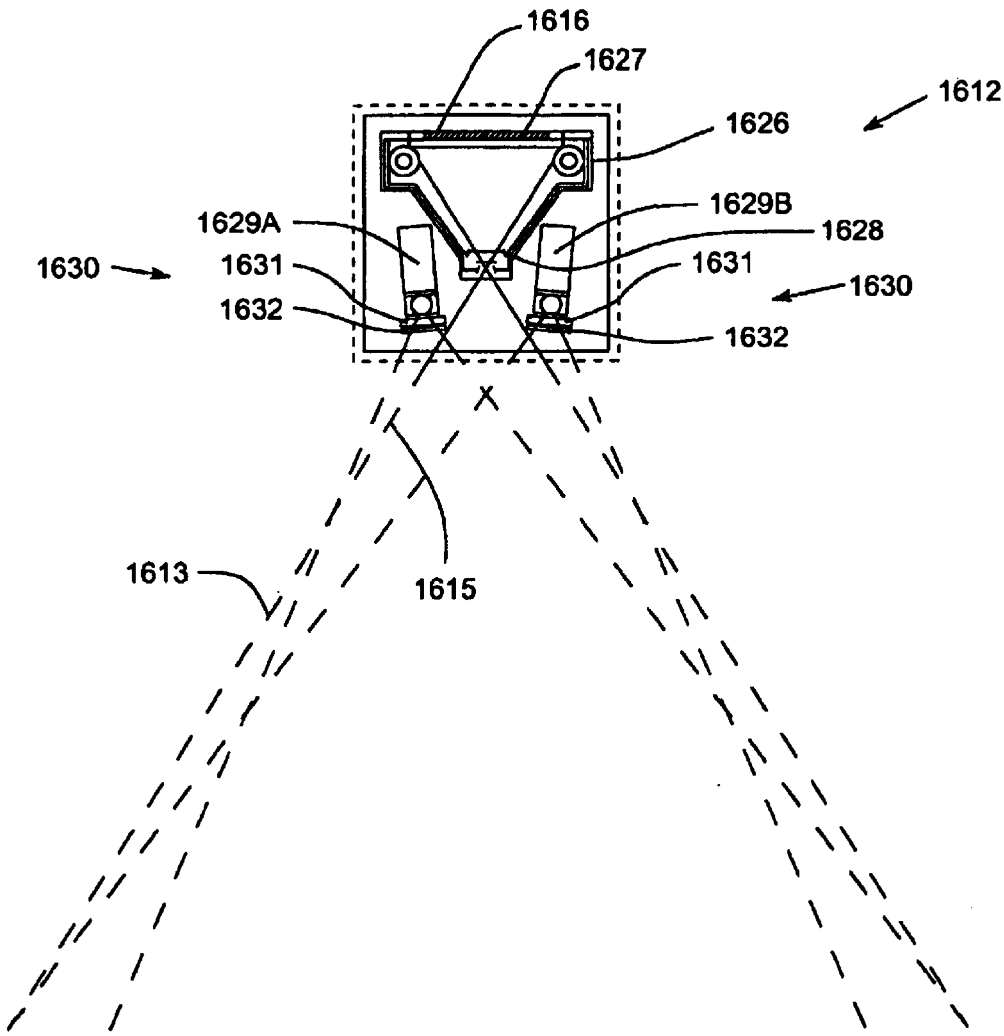
Figure 45A:
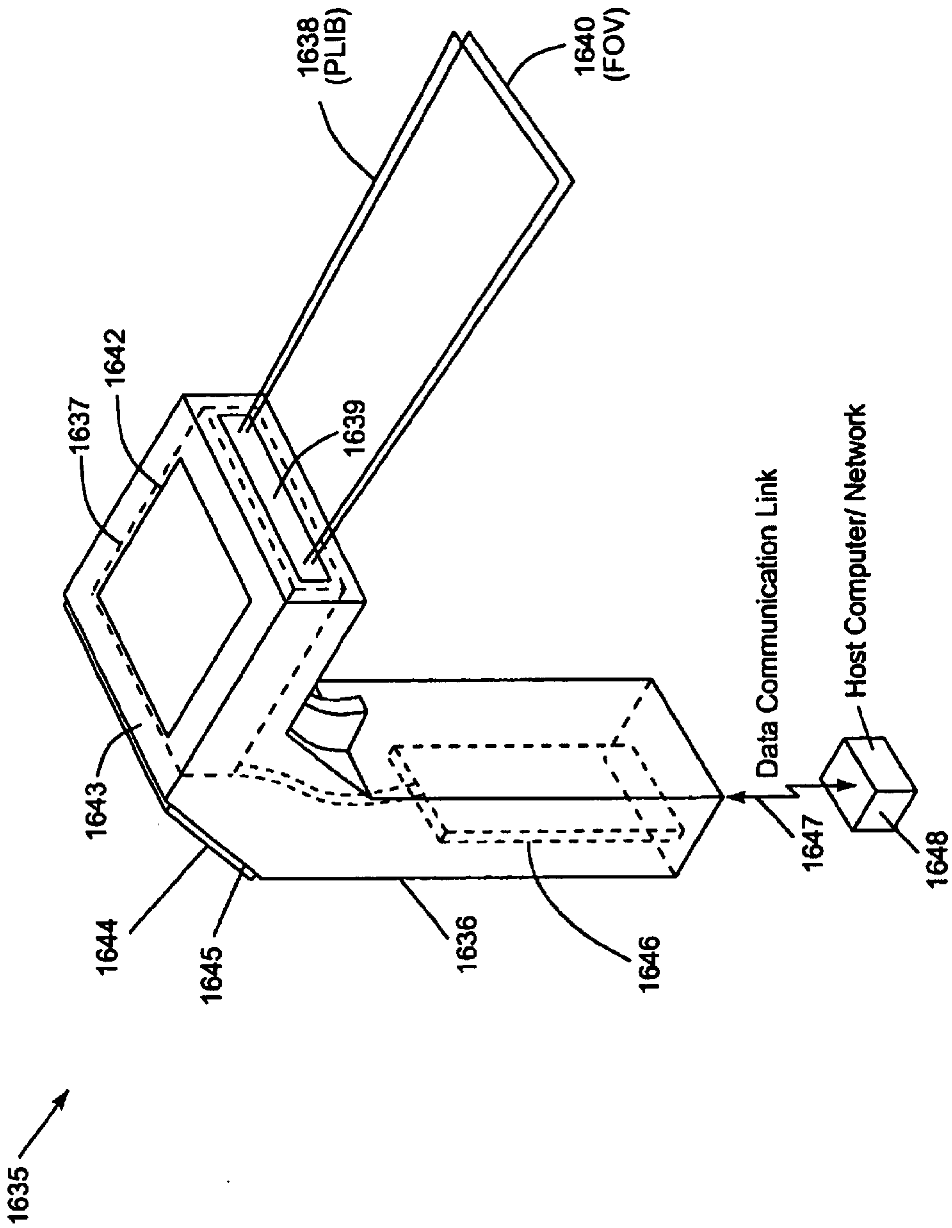
Figure 45B:
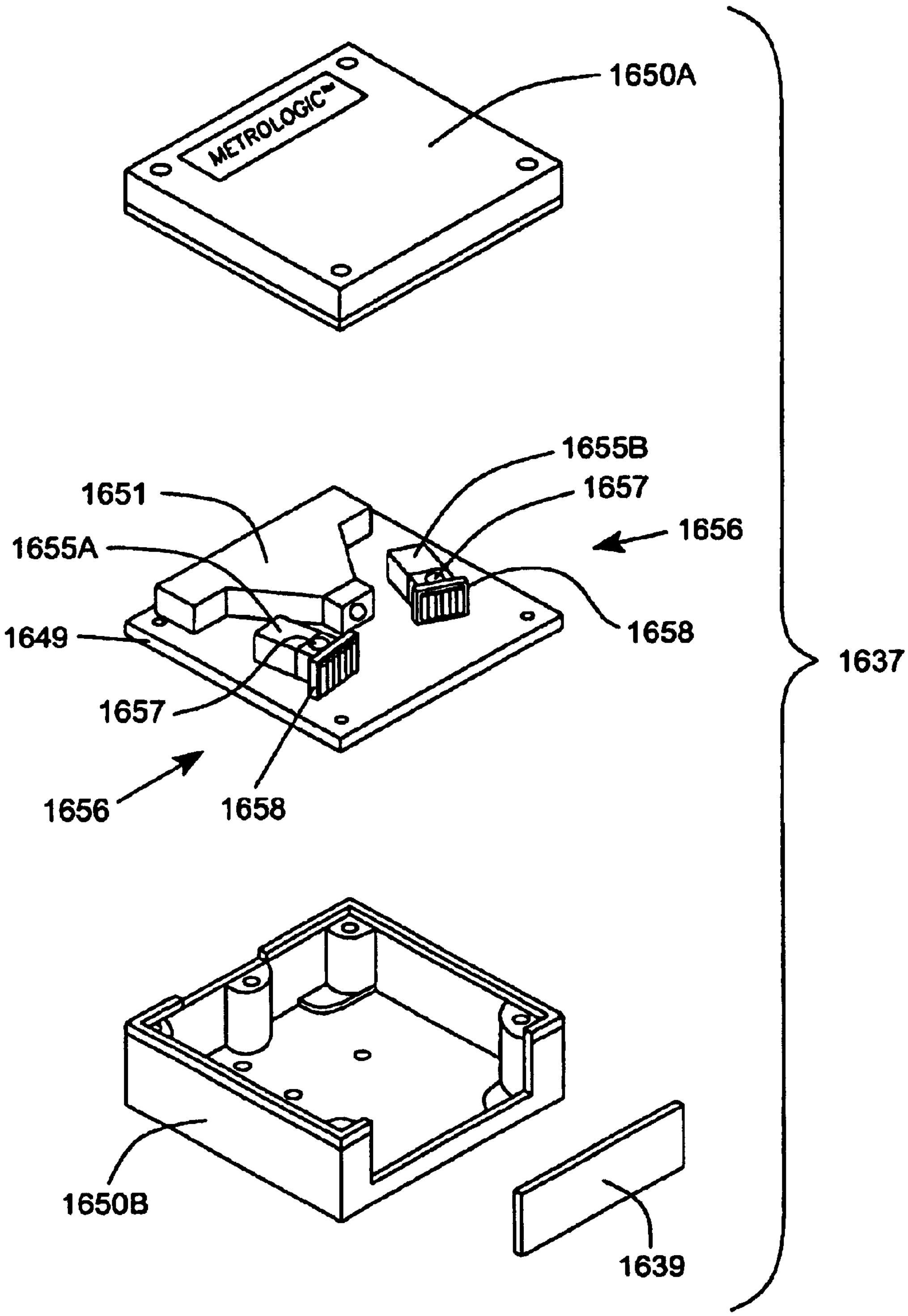
Figure 45C:
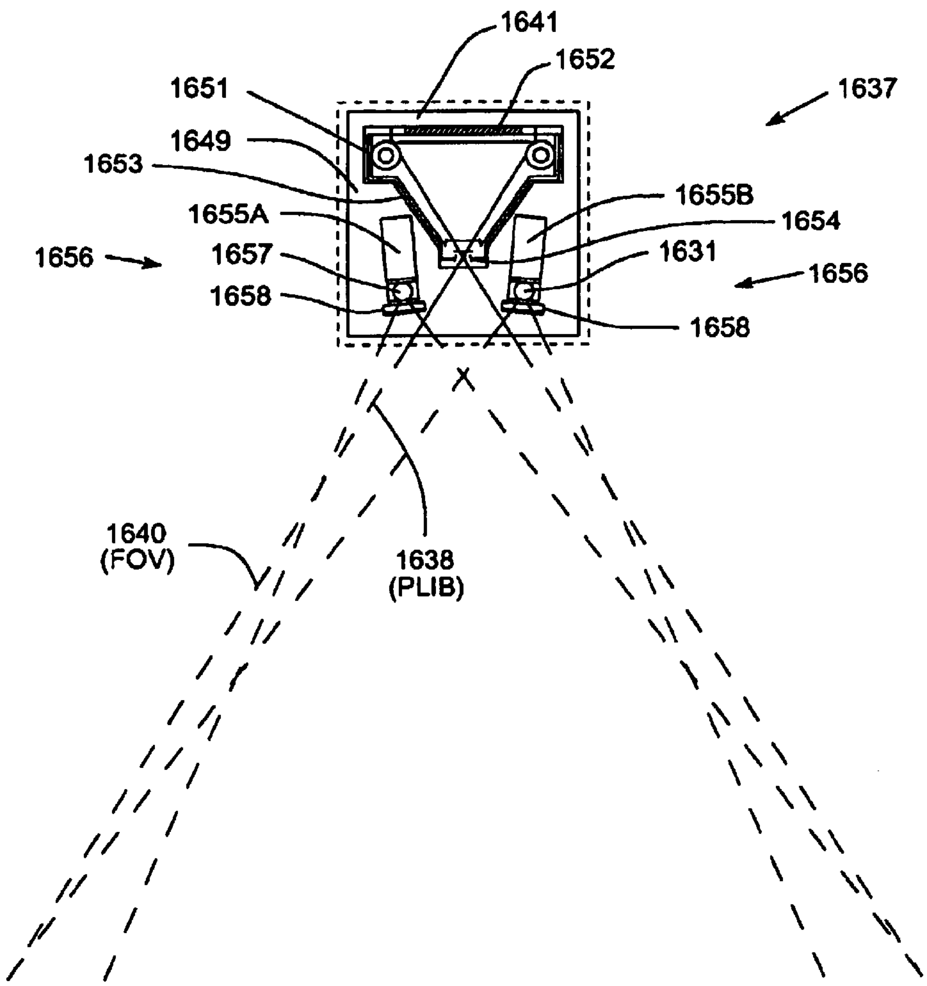
Figure 46A:
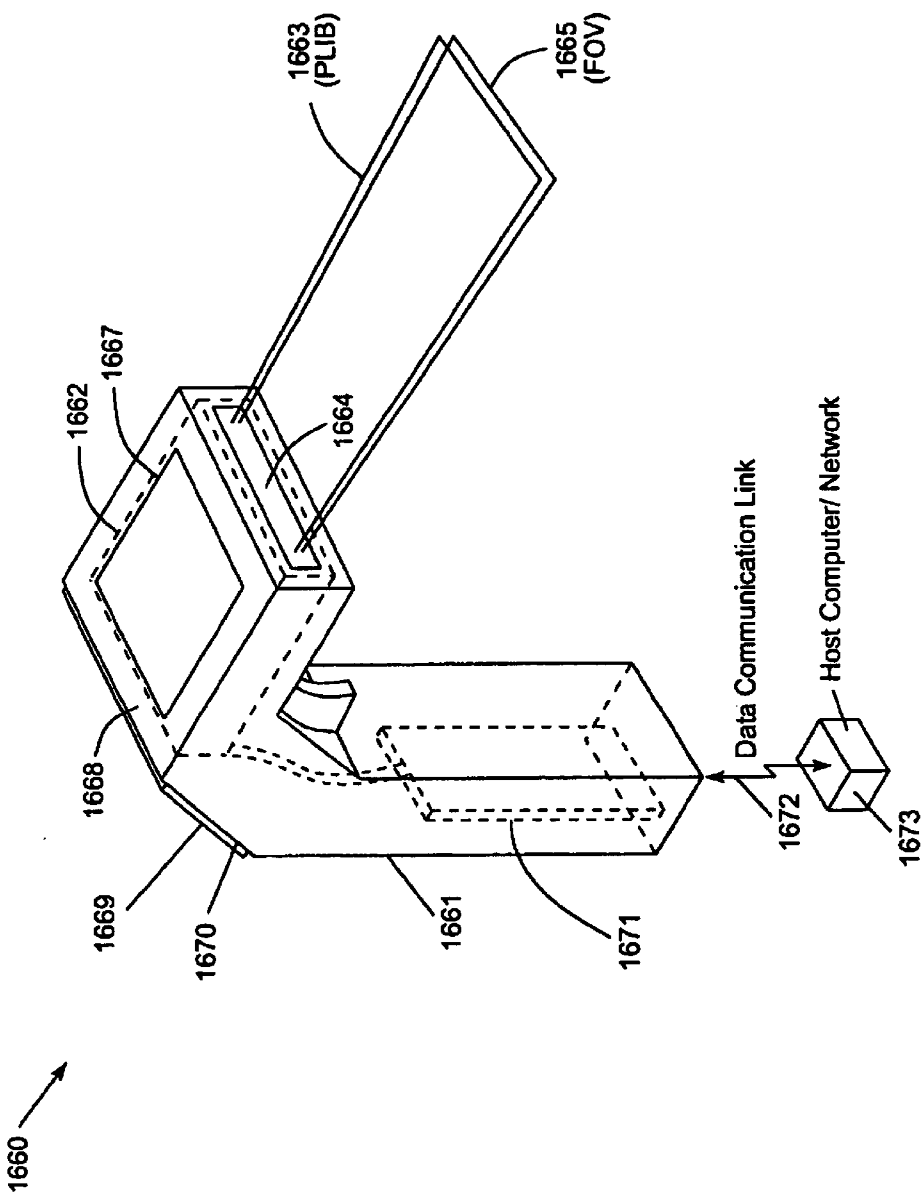
Figure 46B:
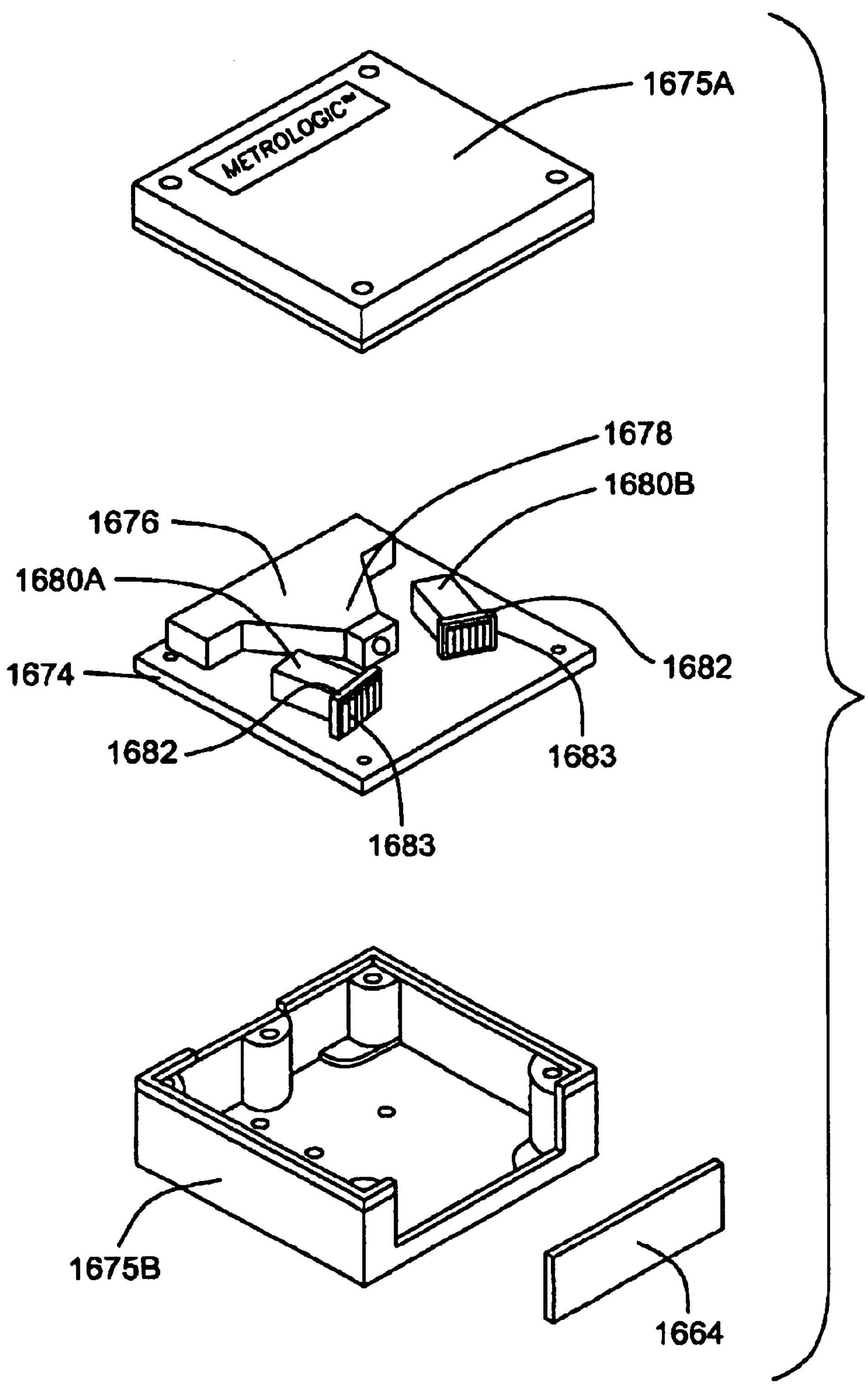
Figure 46C:
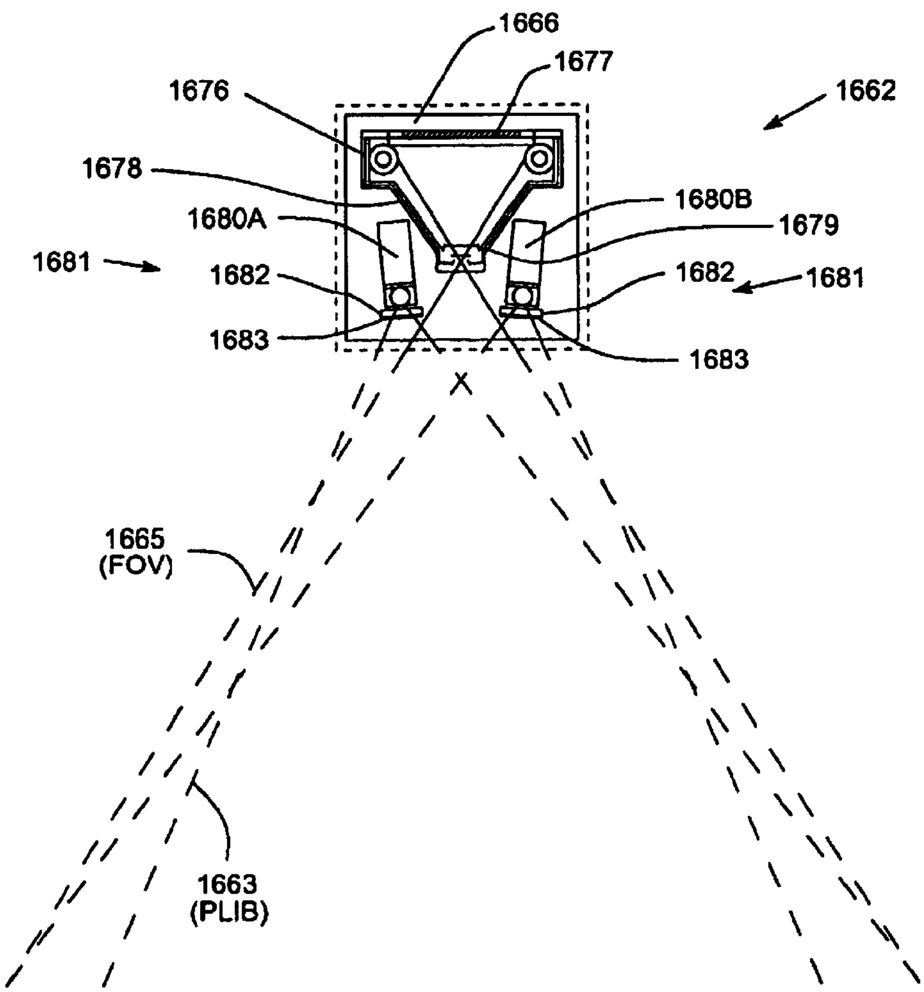
Figure 47A:
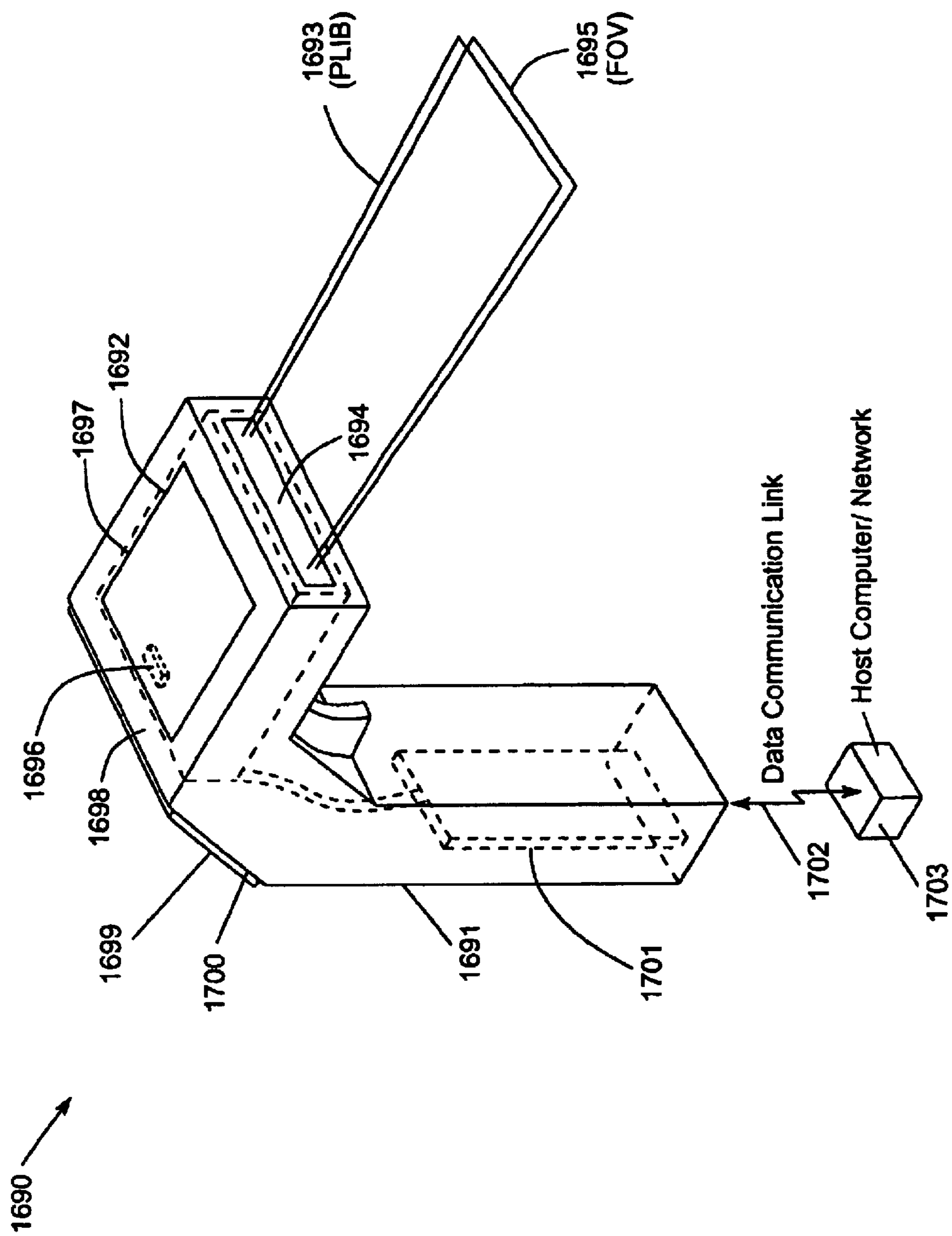
Figure 47B:
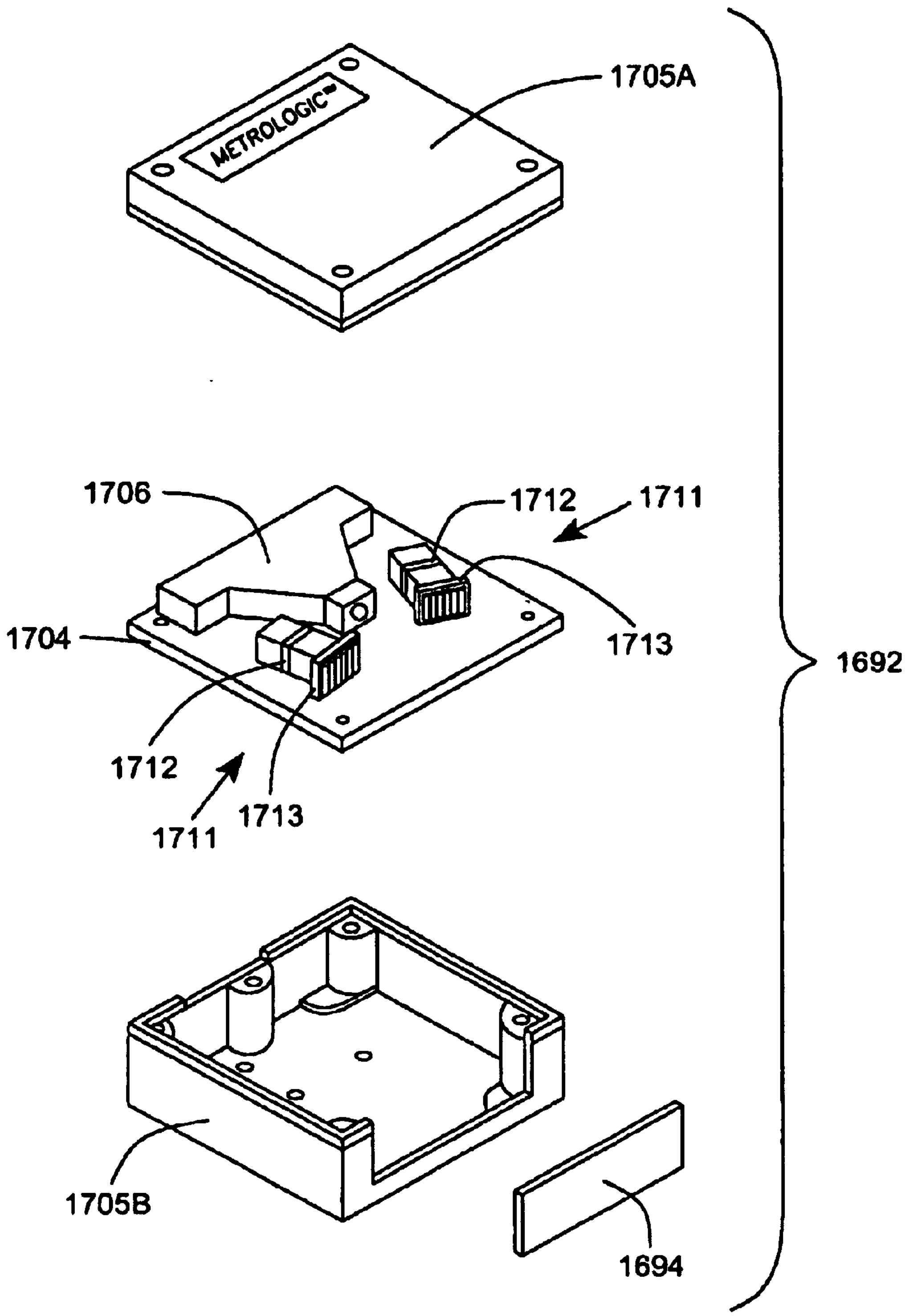
Figure 47C:
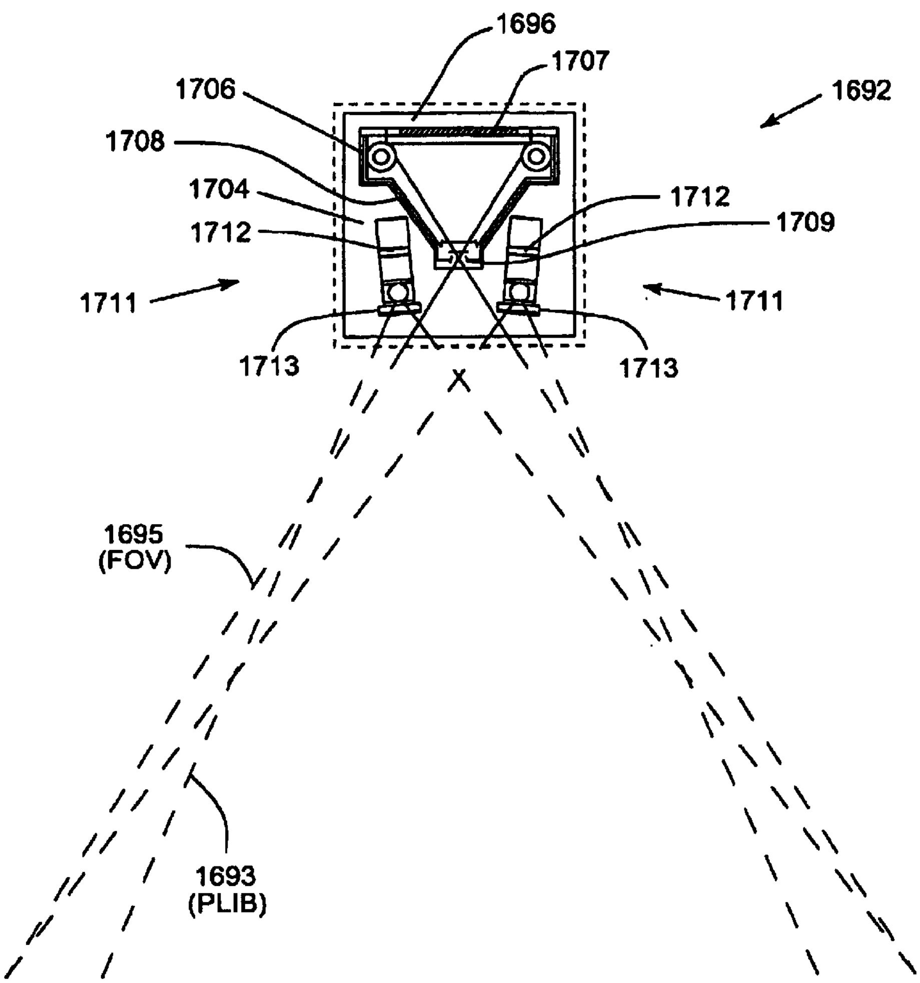
Figure 48A:
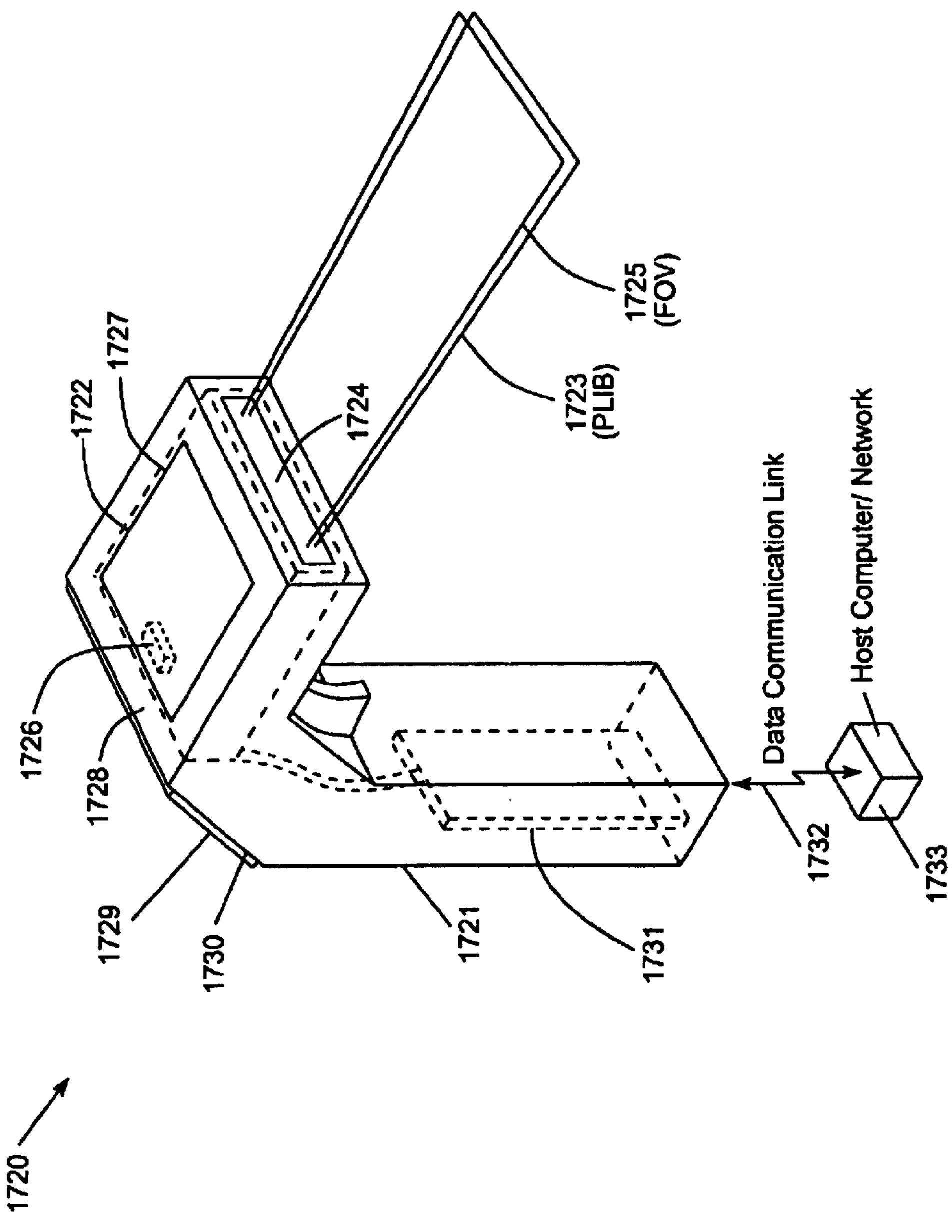
Figure 48B:
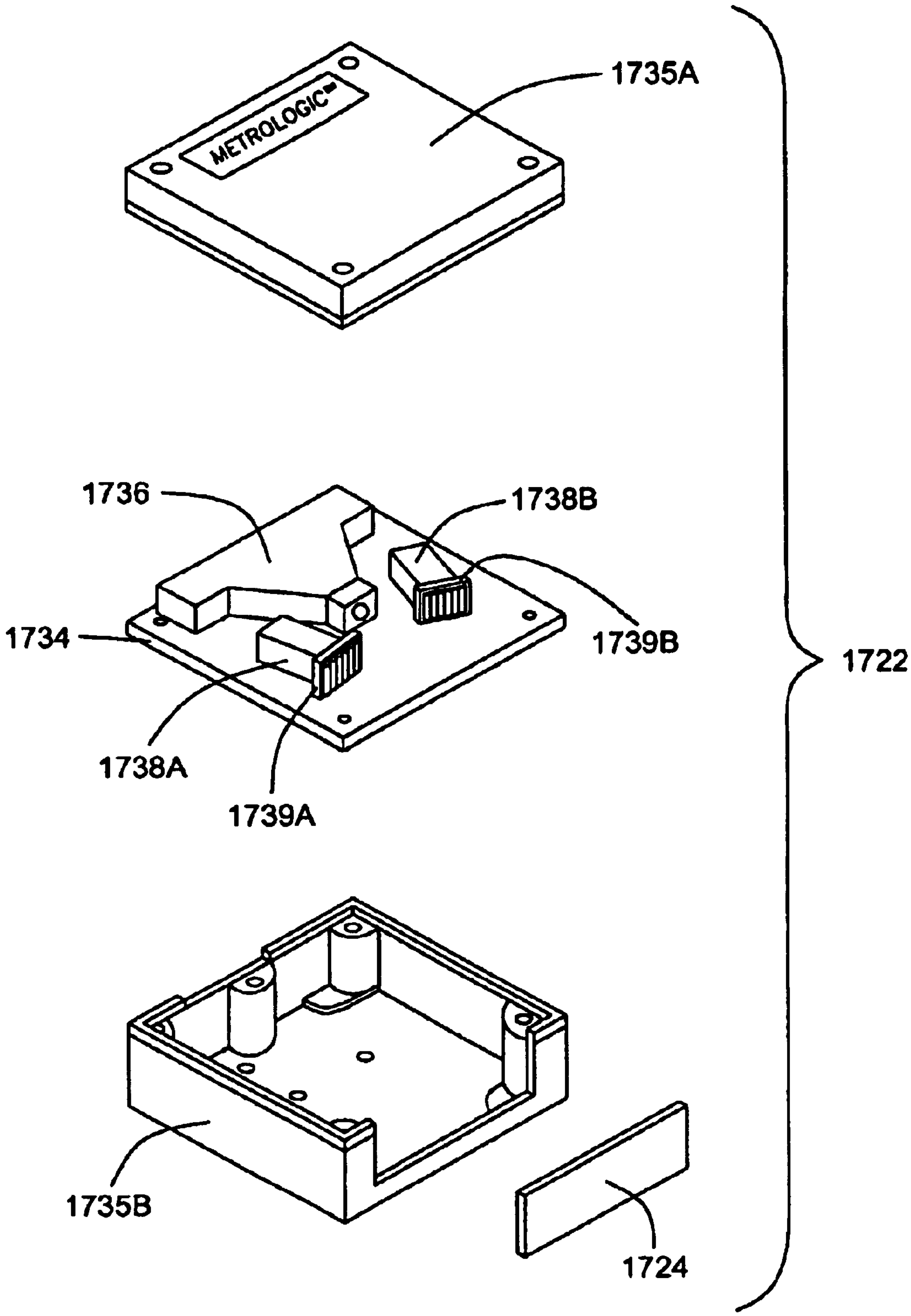
Figure 48C:
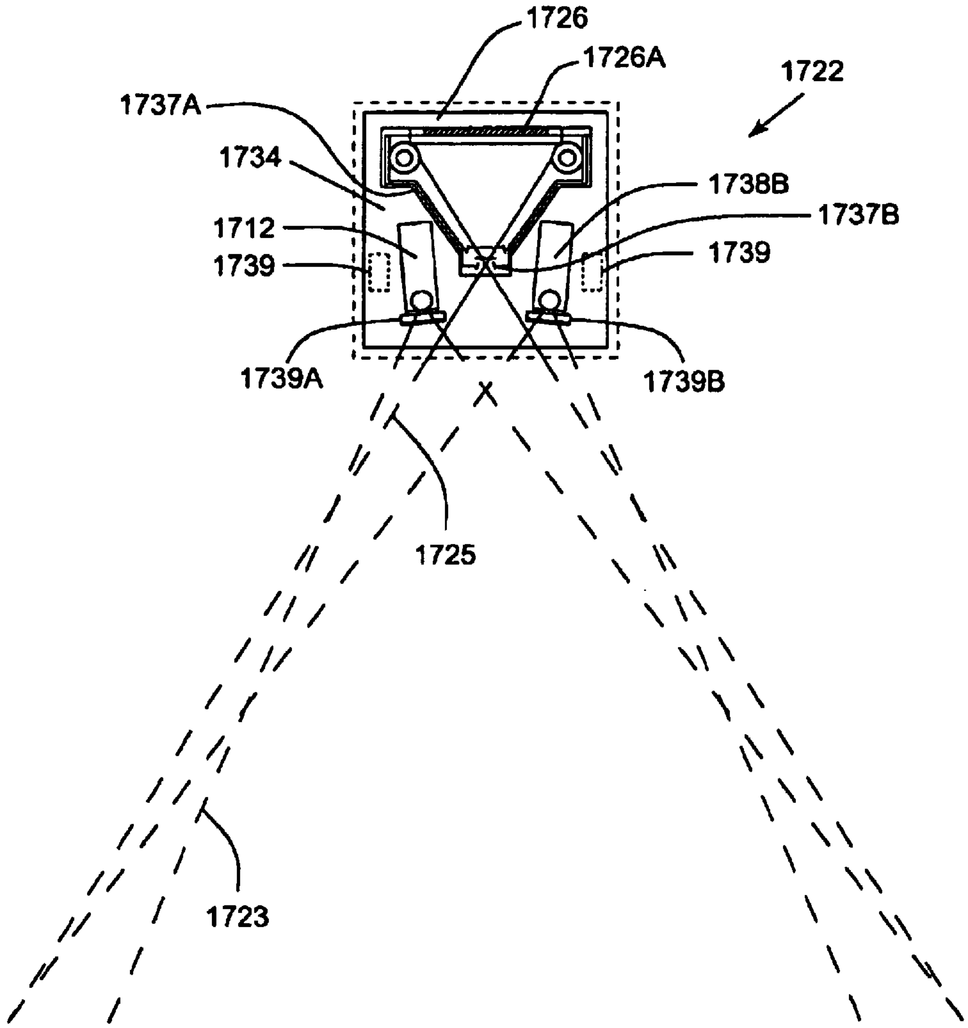
Figure 49A:
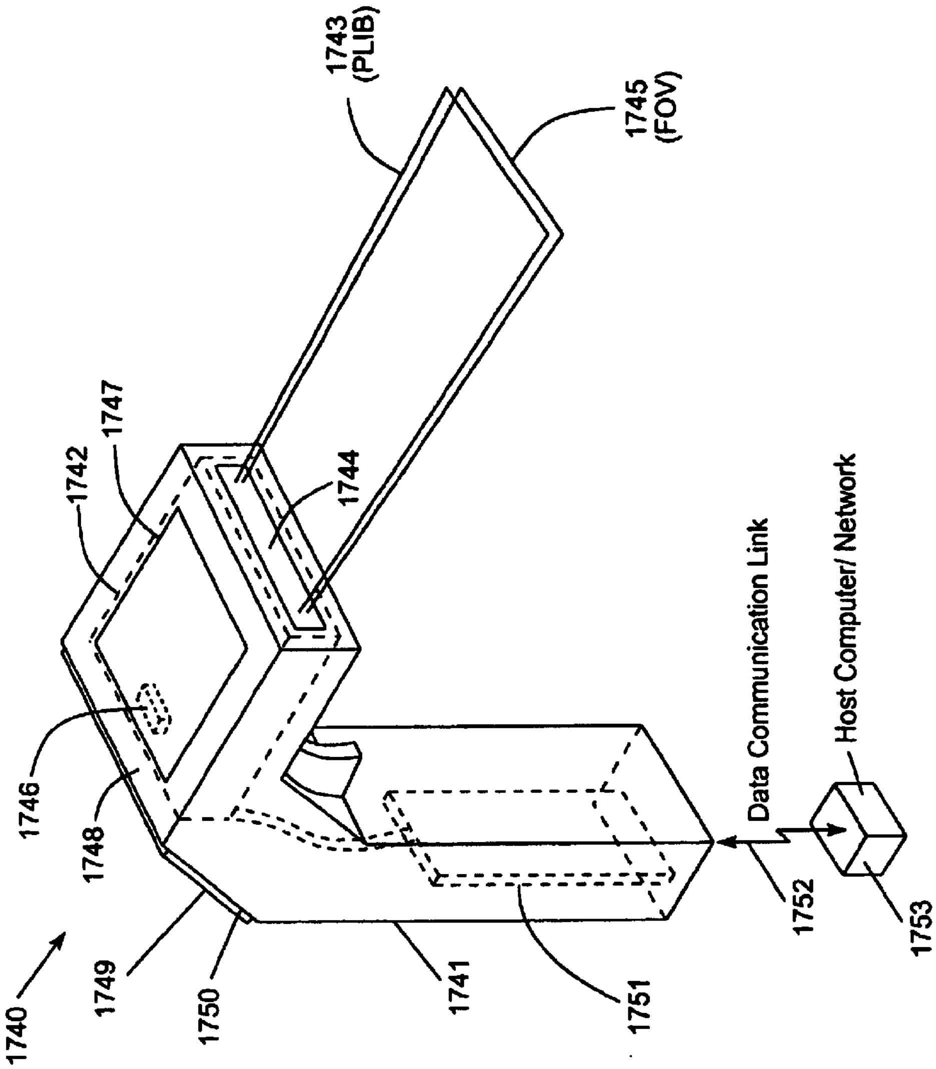
Figure 49B:
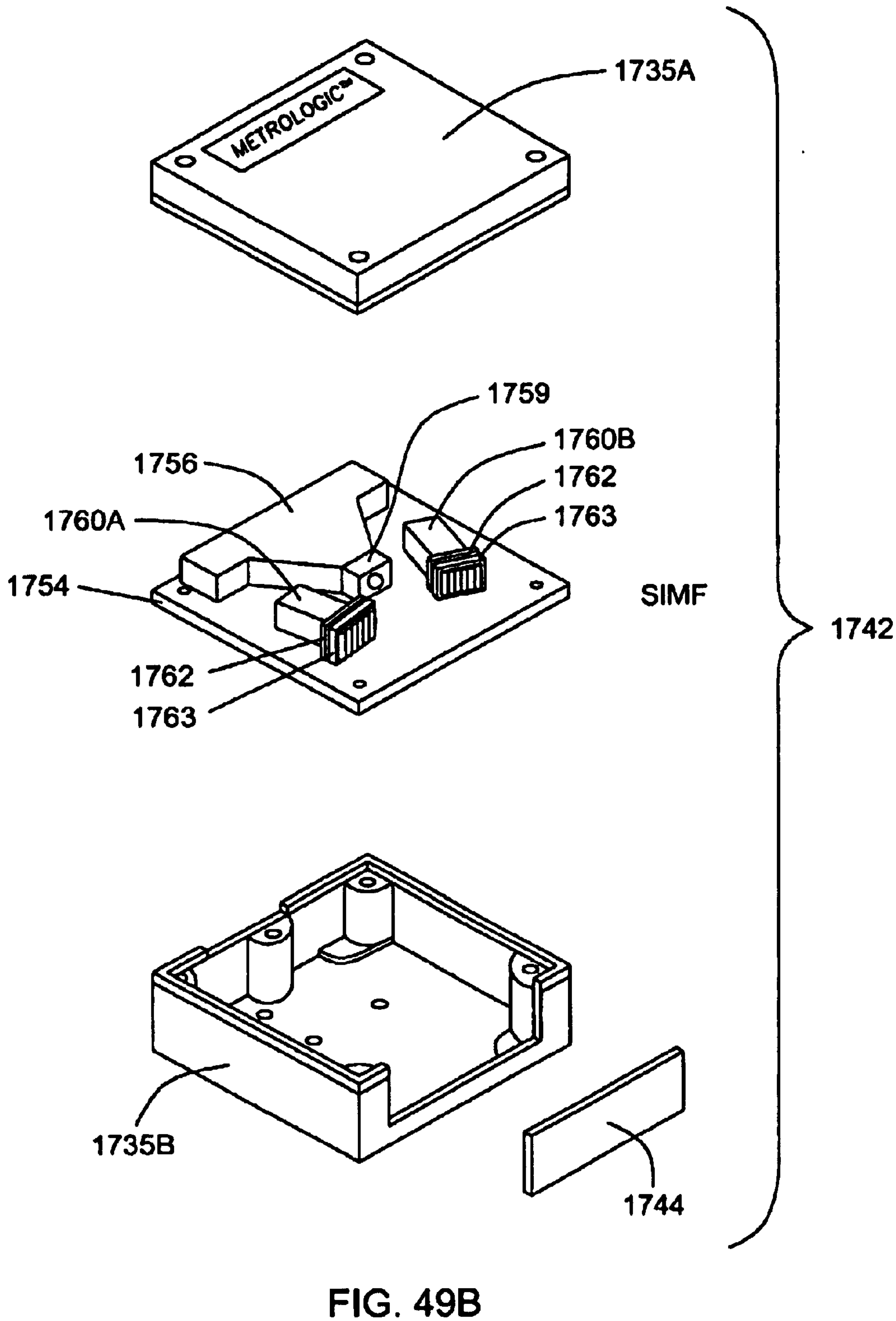
Figure 49C:
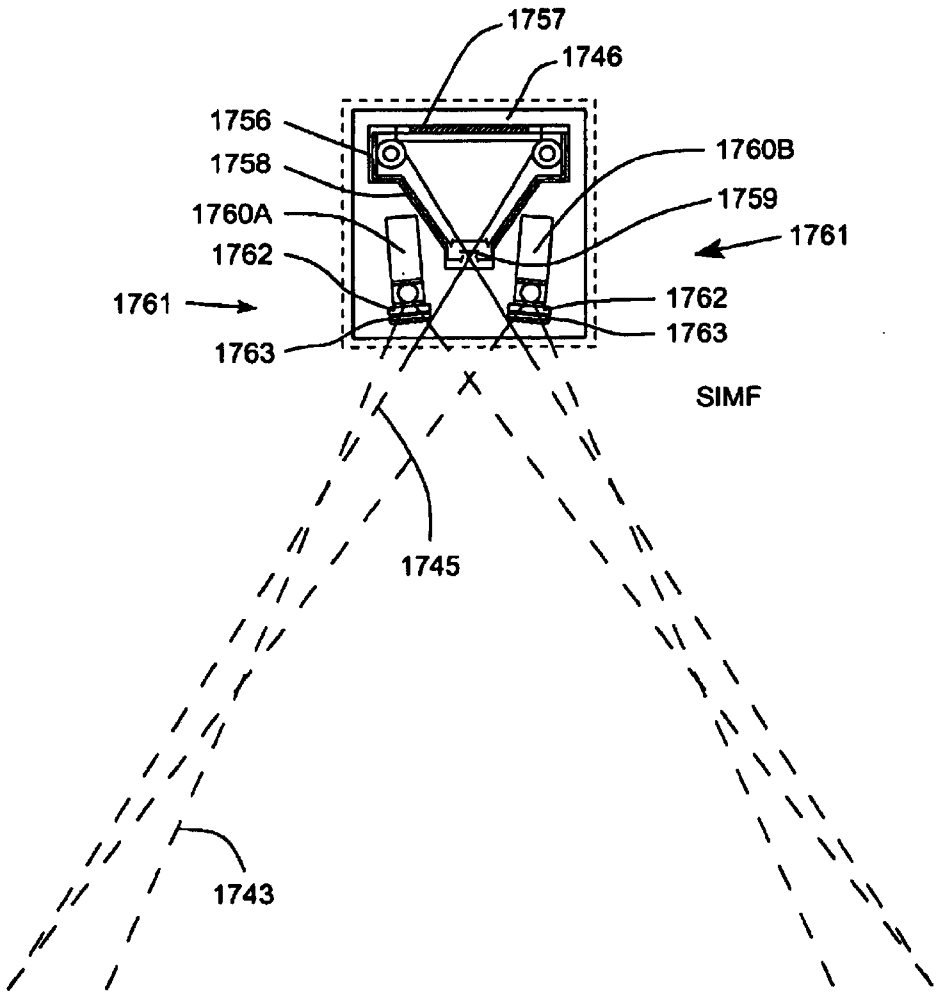
Figure 50A:
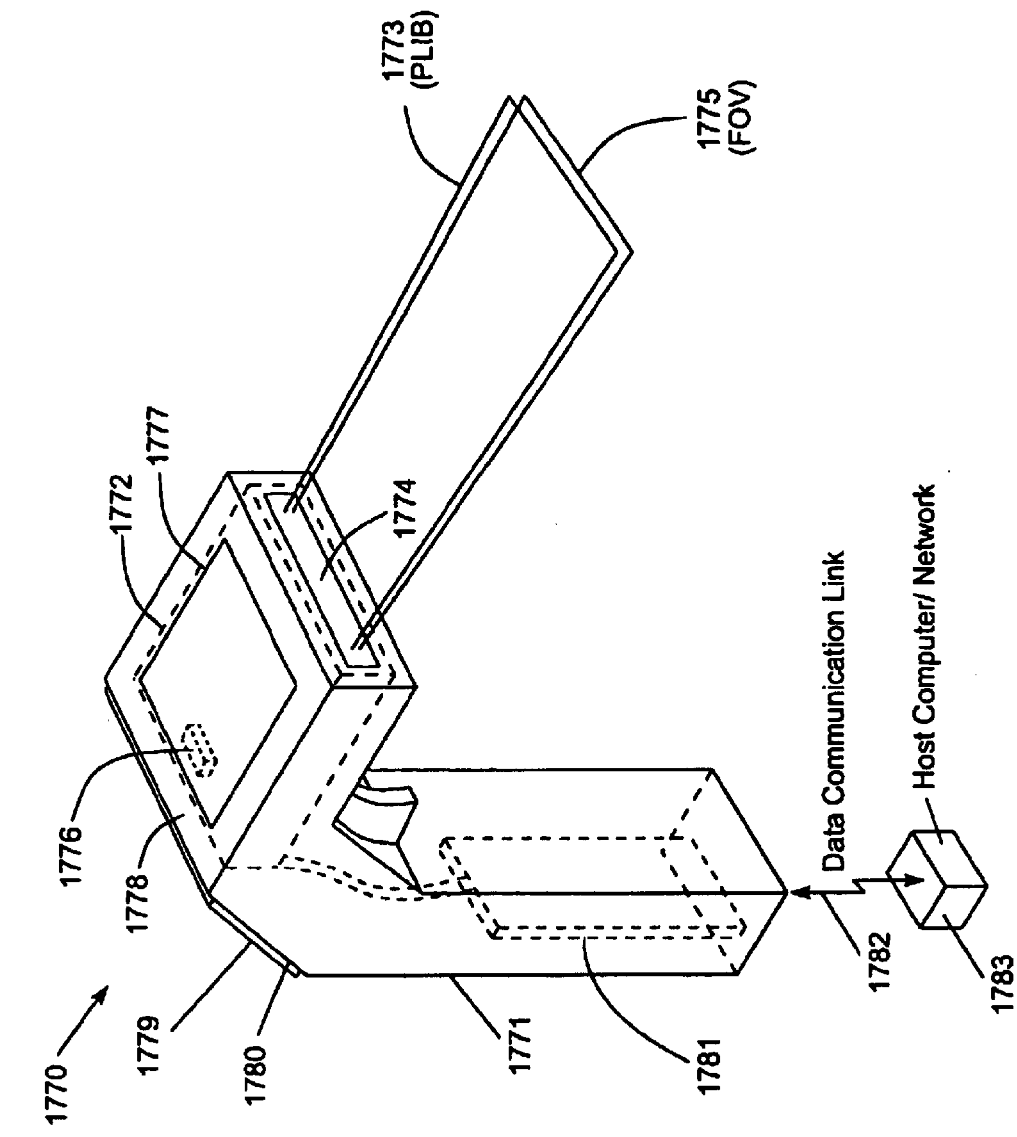
Figure 50B:
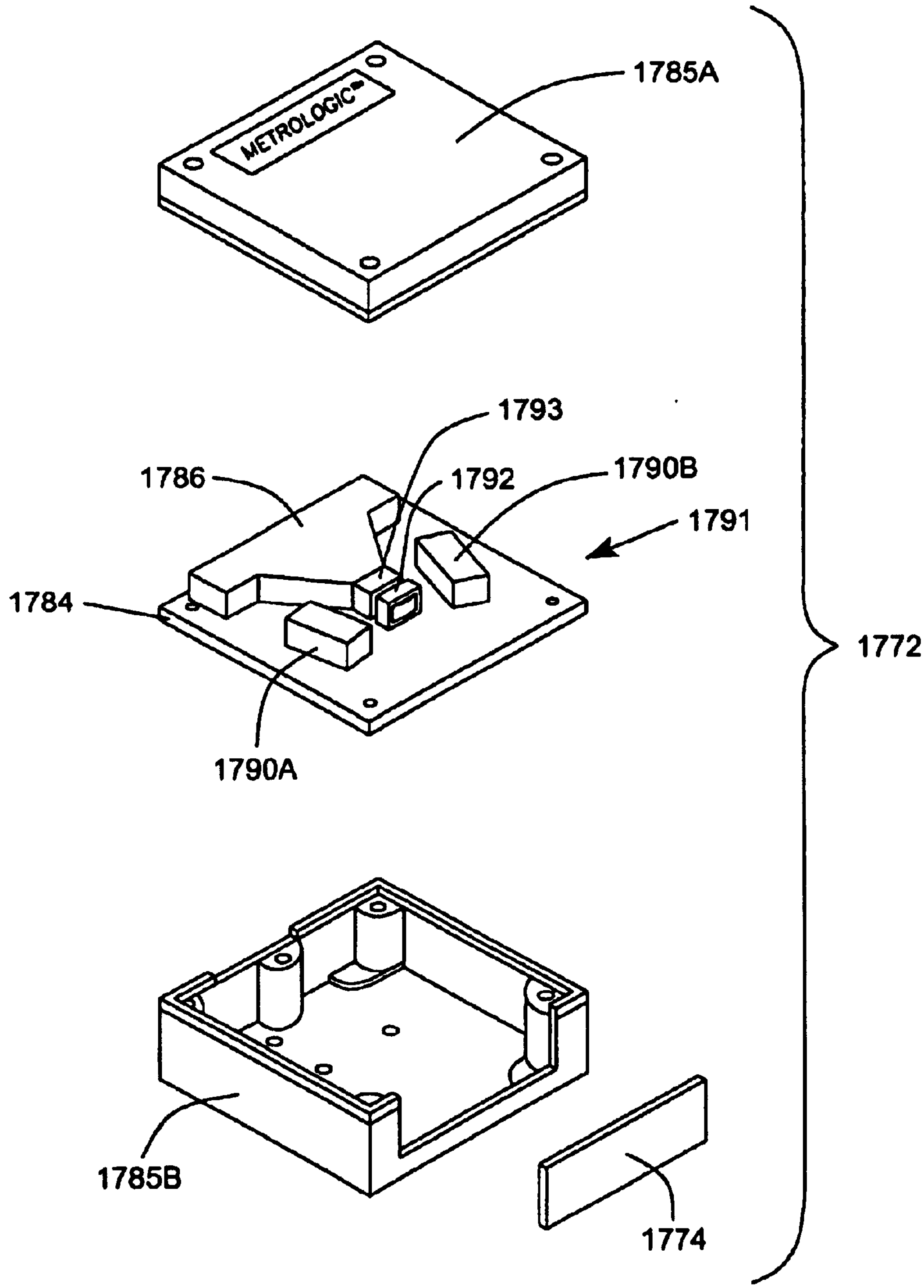
Figure 50C:
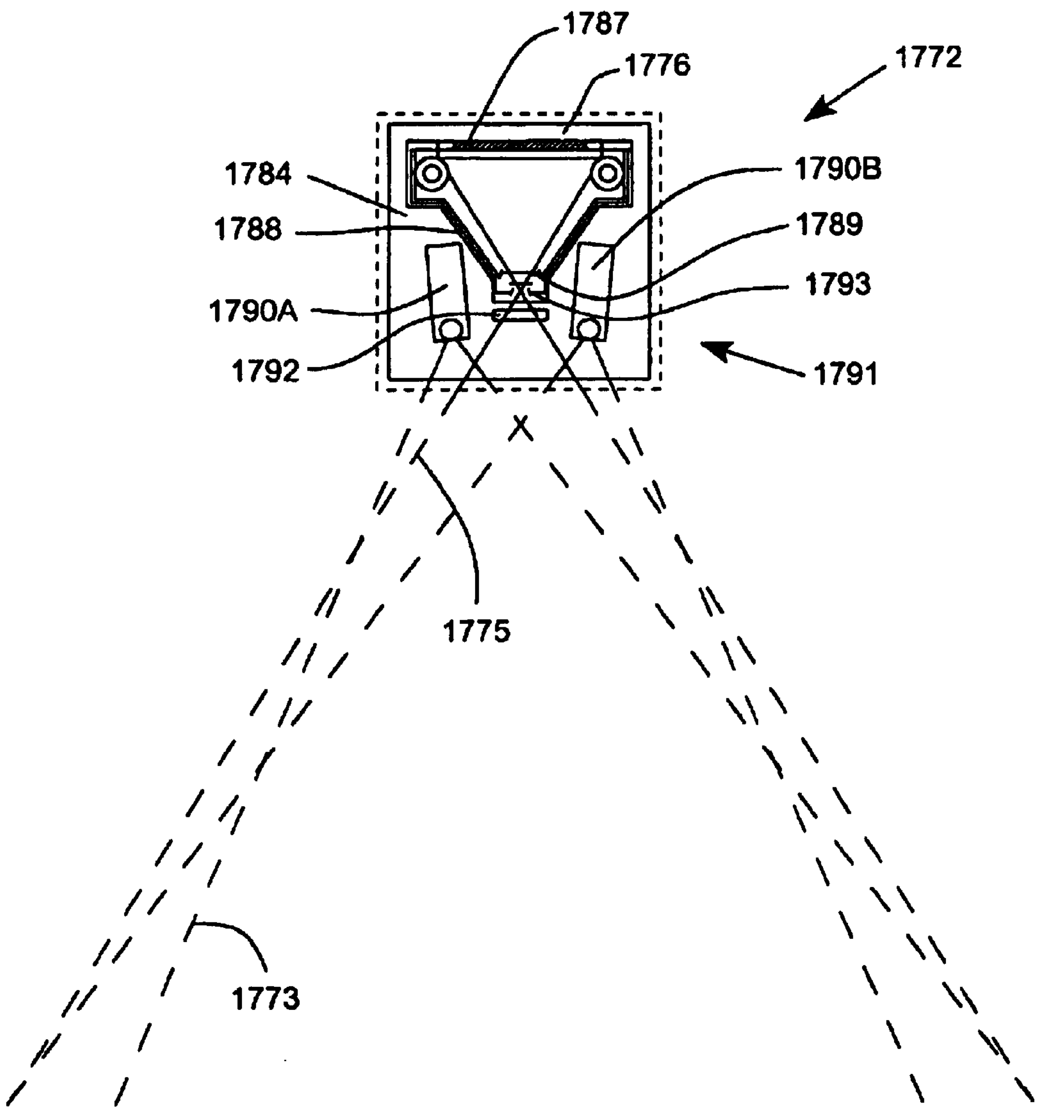
Figure 51A:
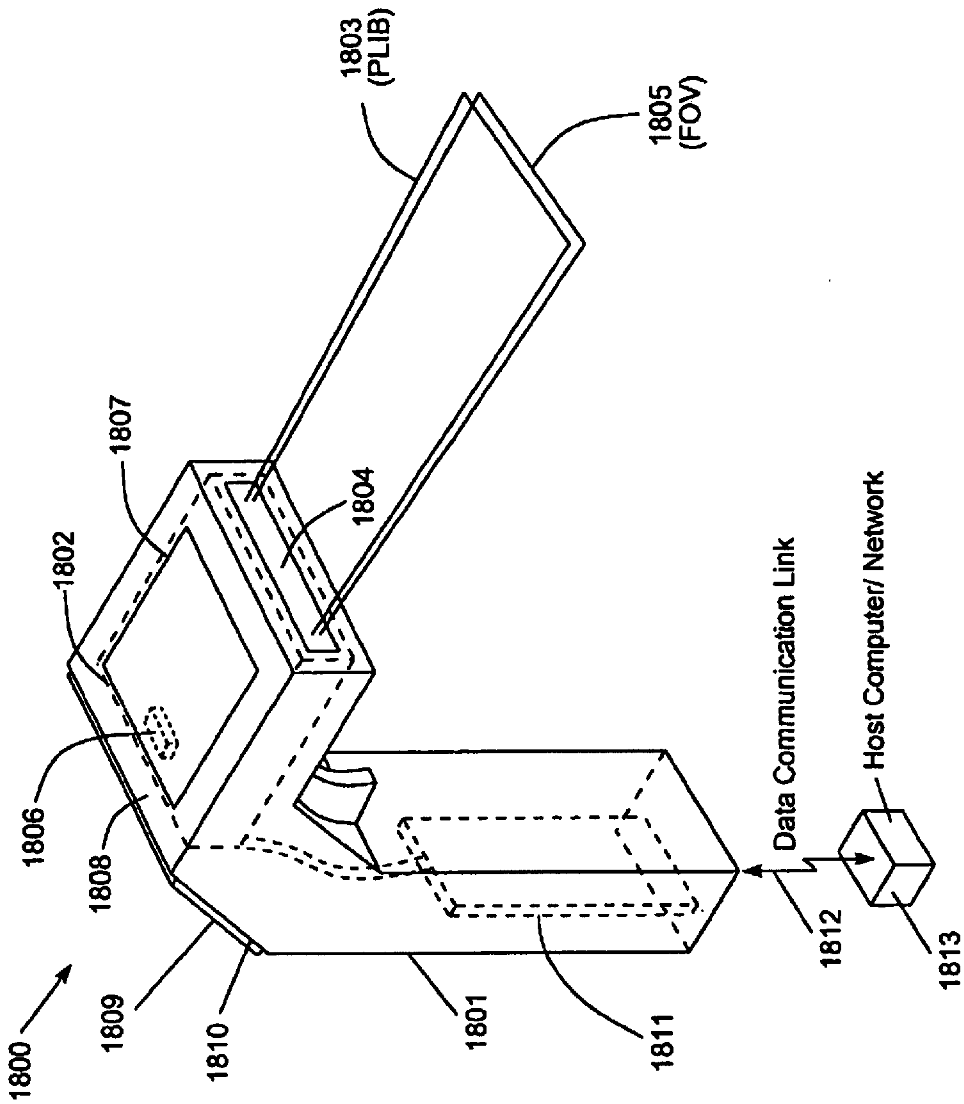
Figure 51B:
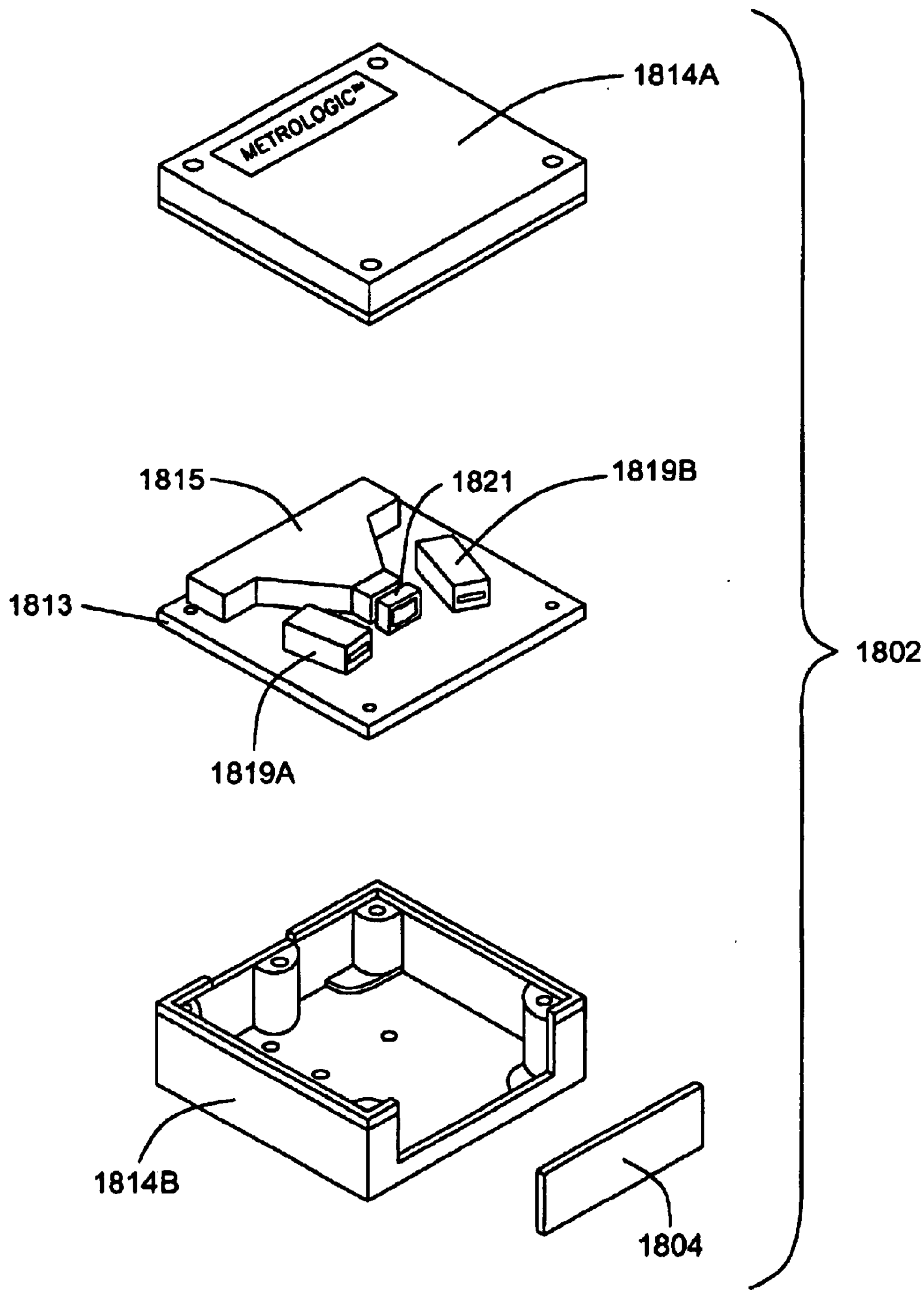
Figure 51C:
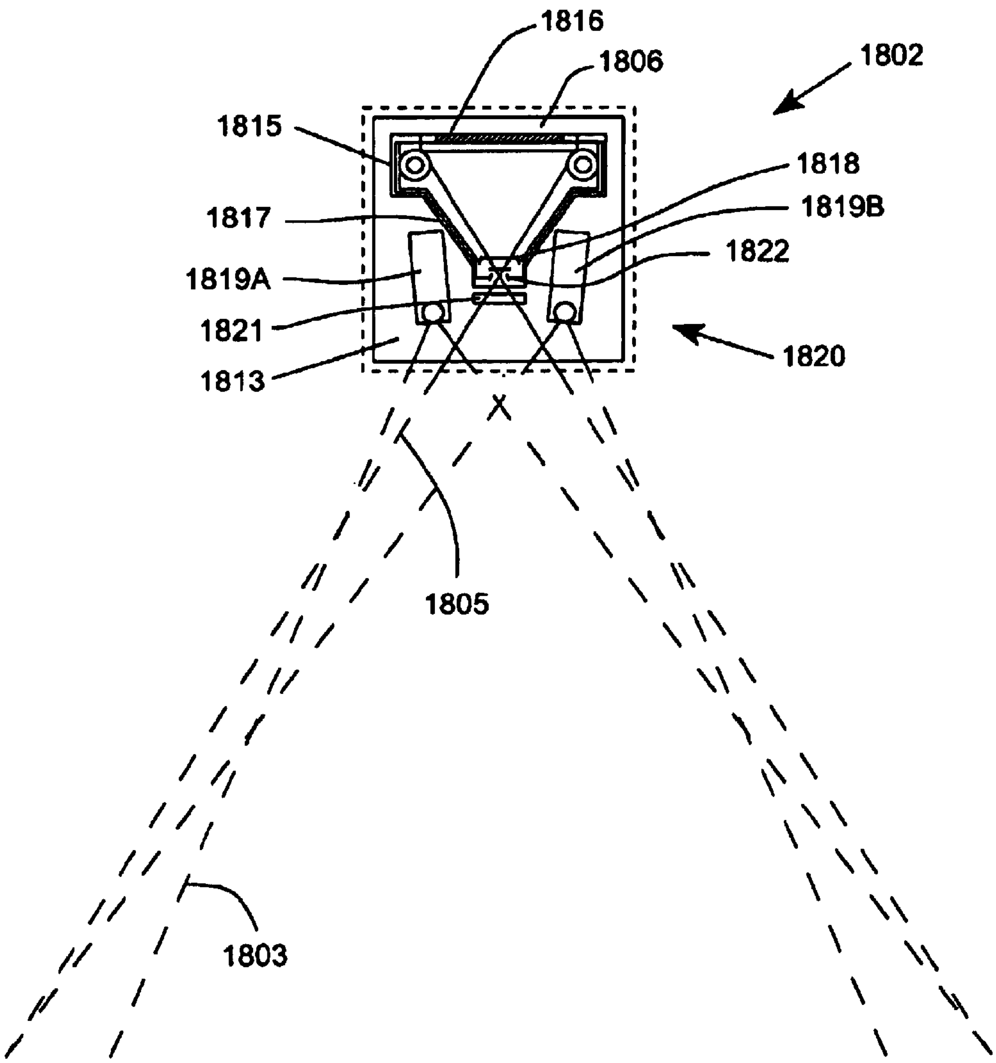
Figure 52:
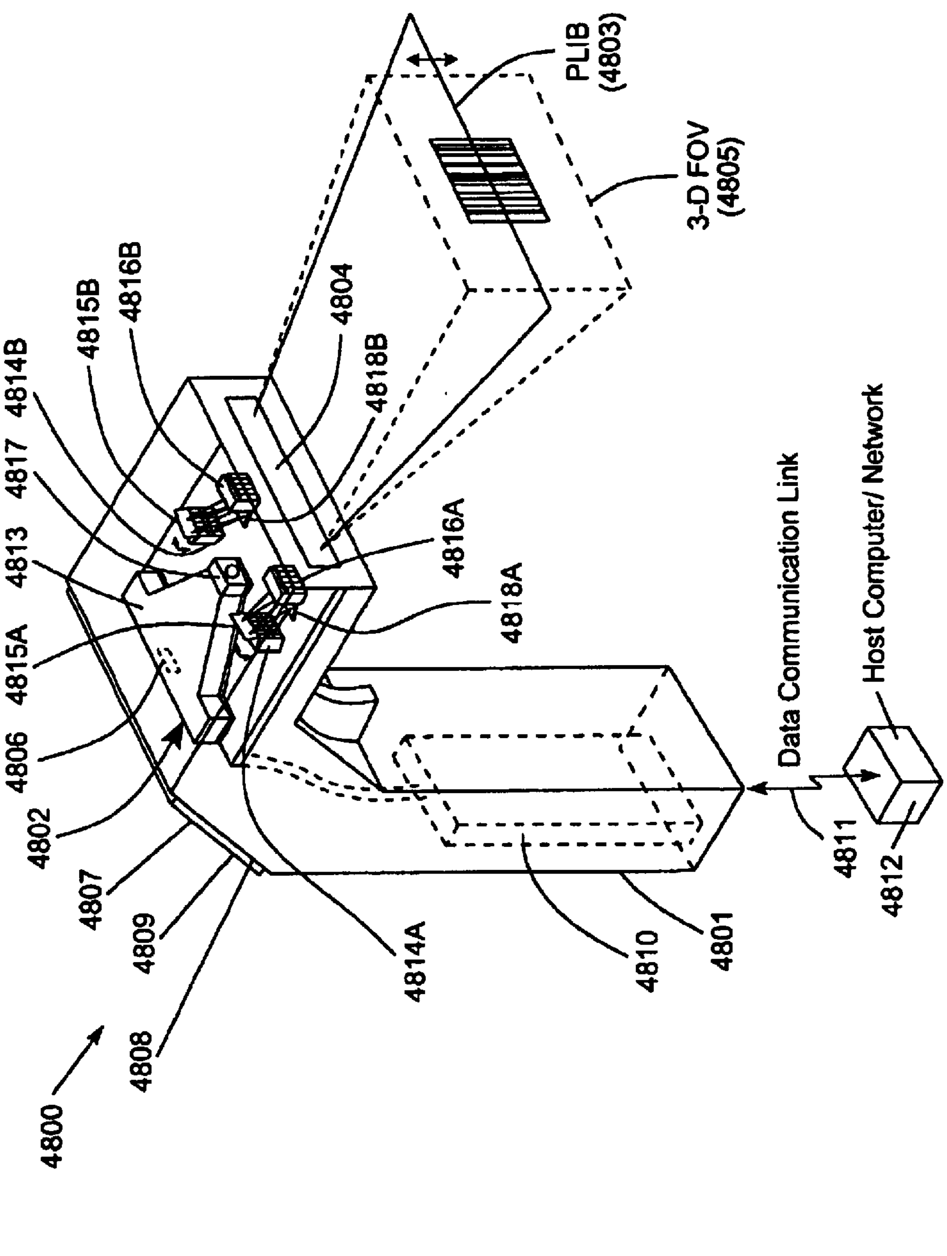
Figure 52A:
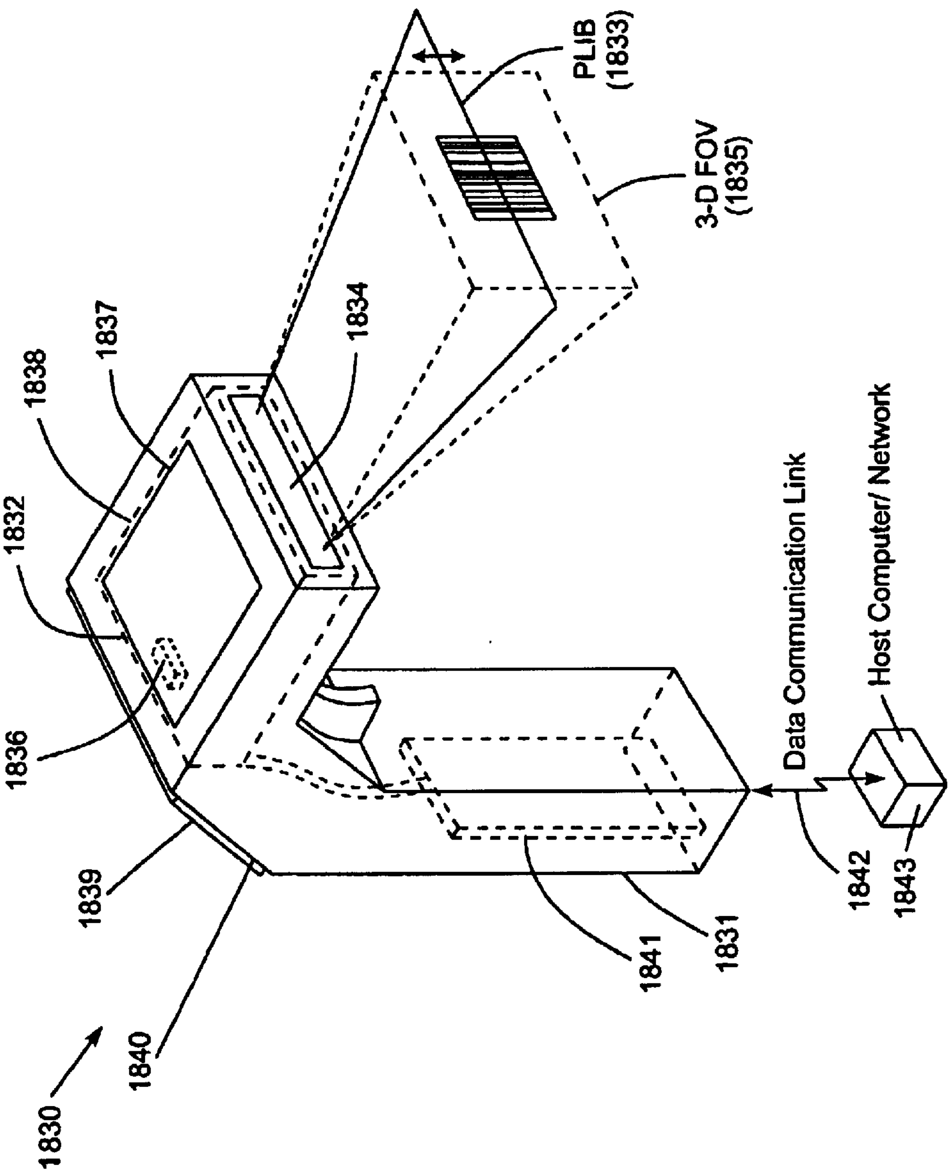
Figure 52B:
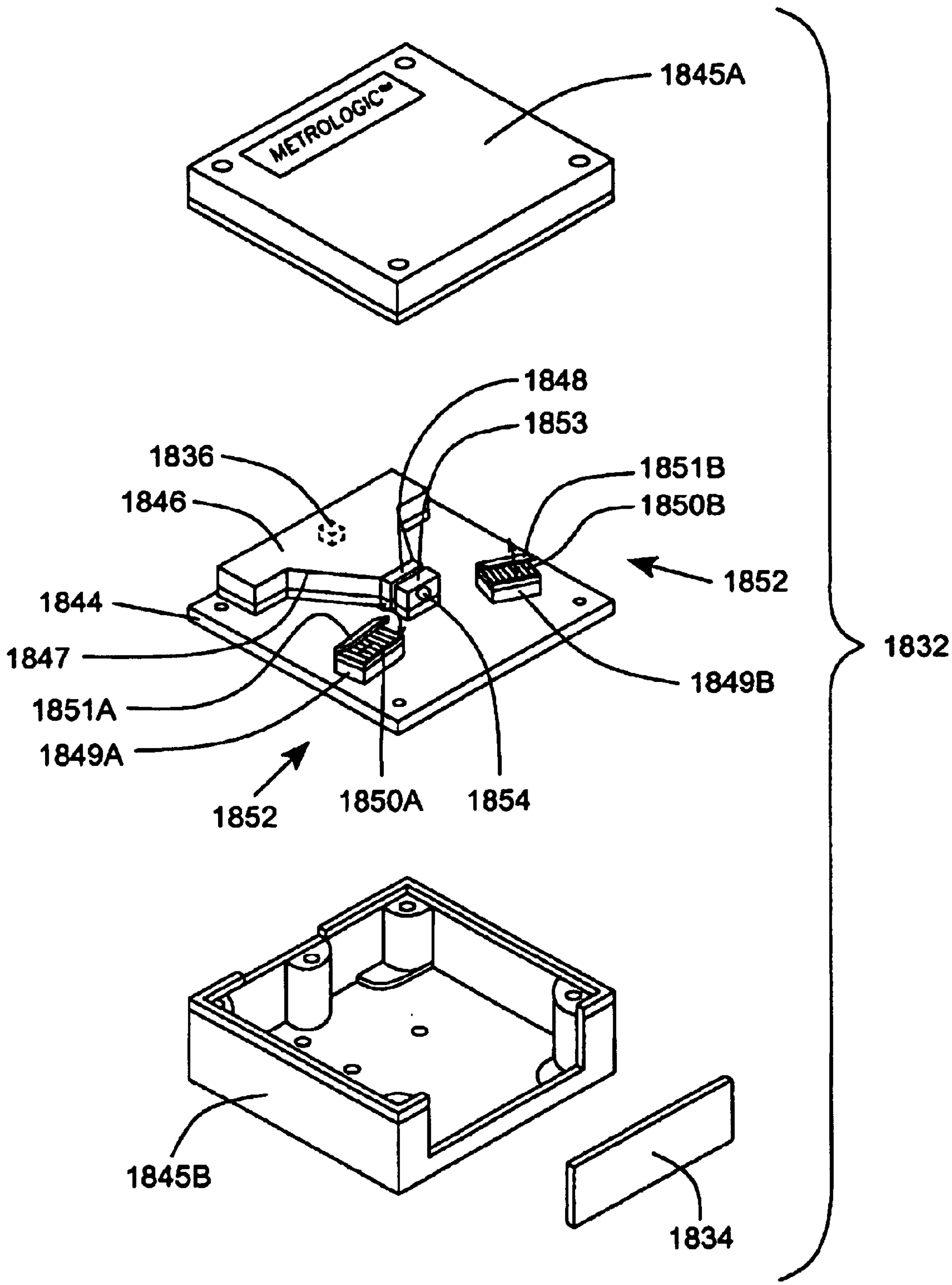
Figure 54A:
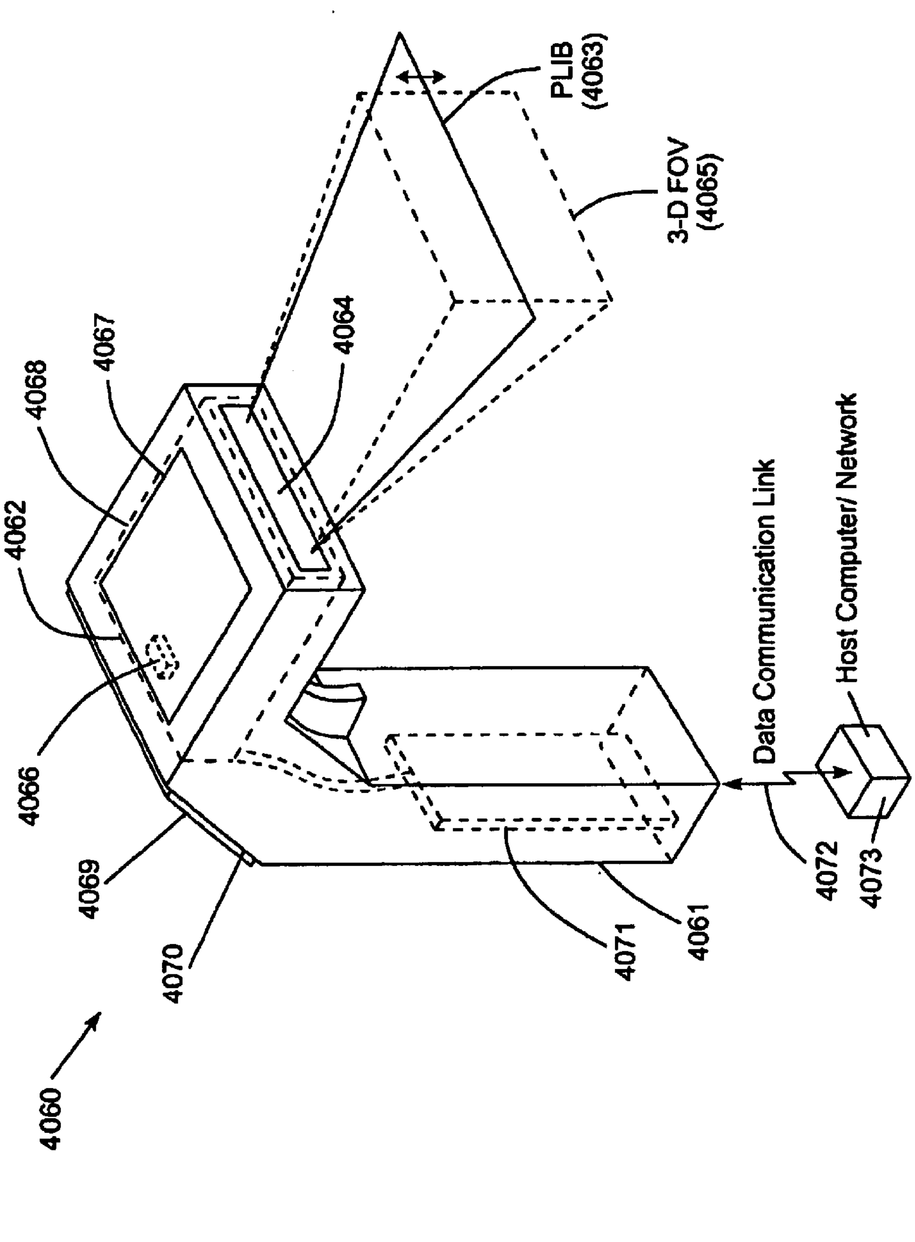
Figure 54B:
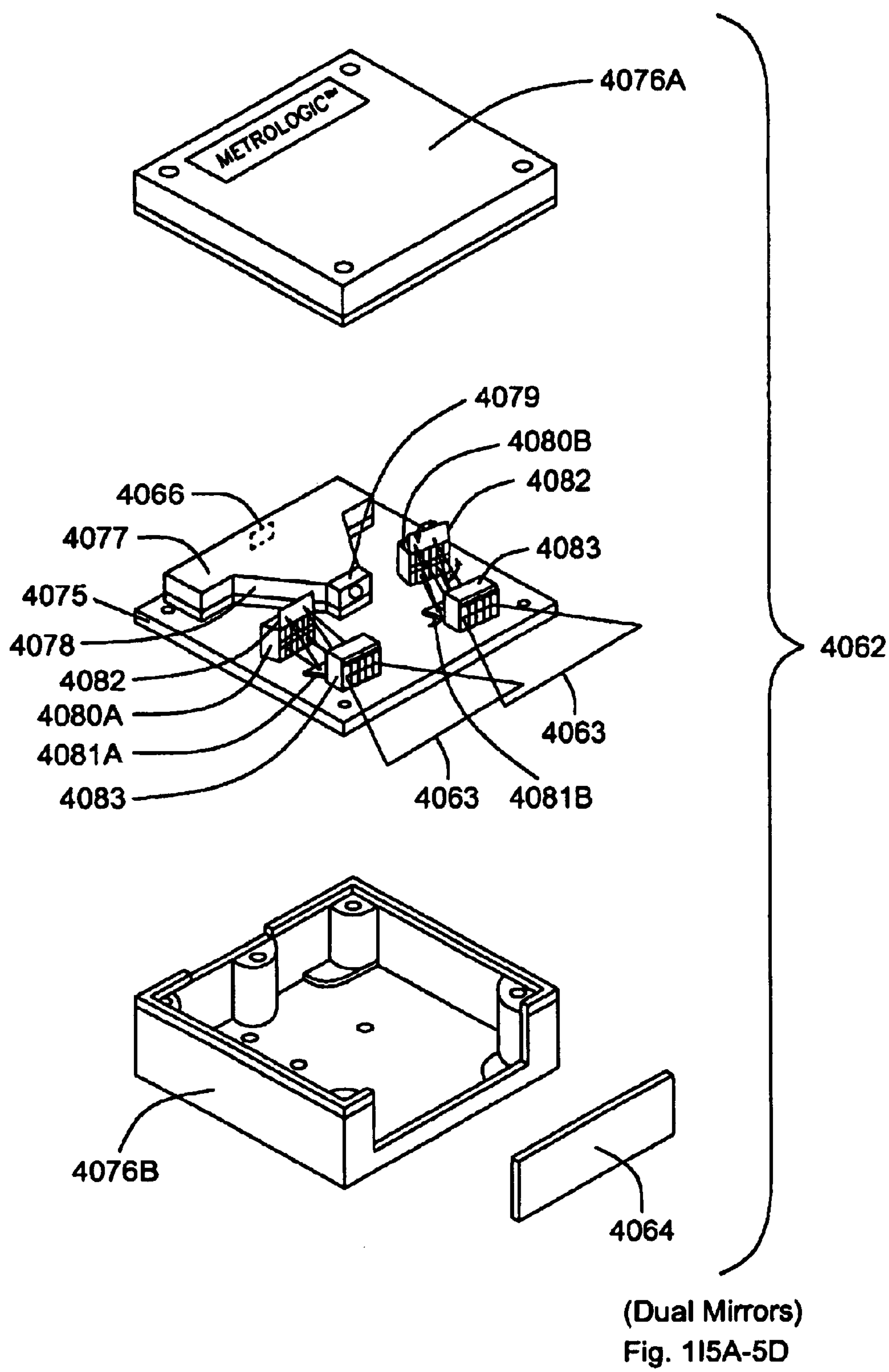
Figure 55A:
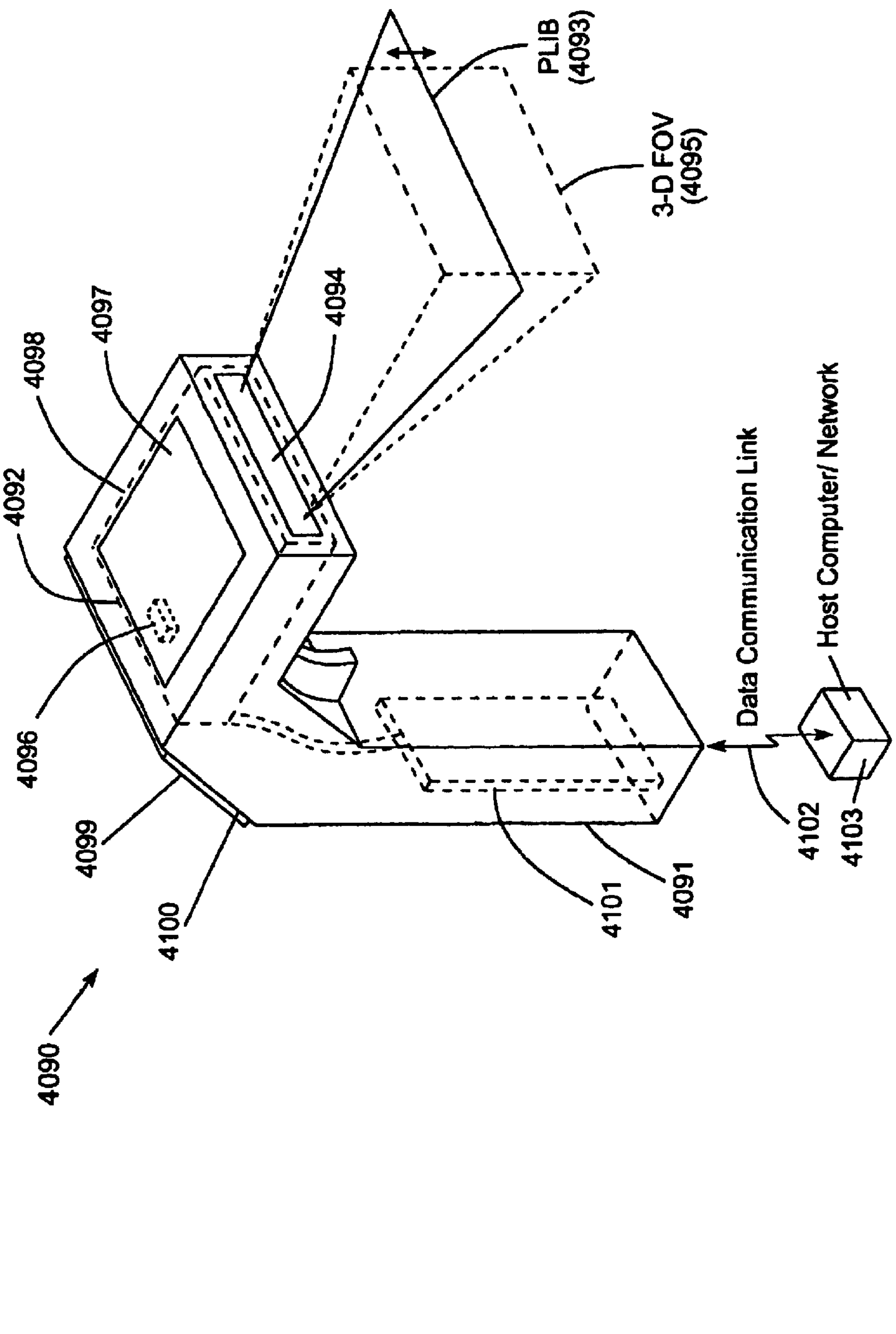
Figure 55B:
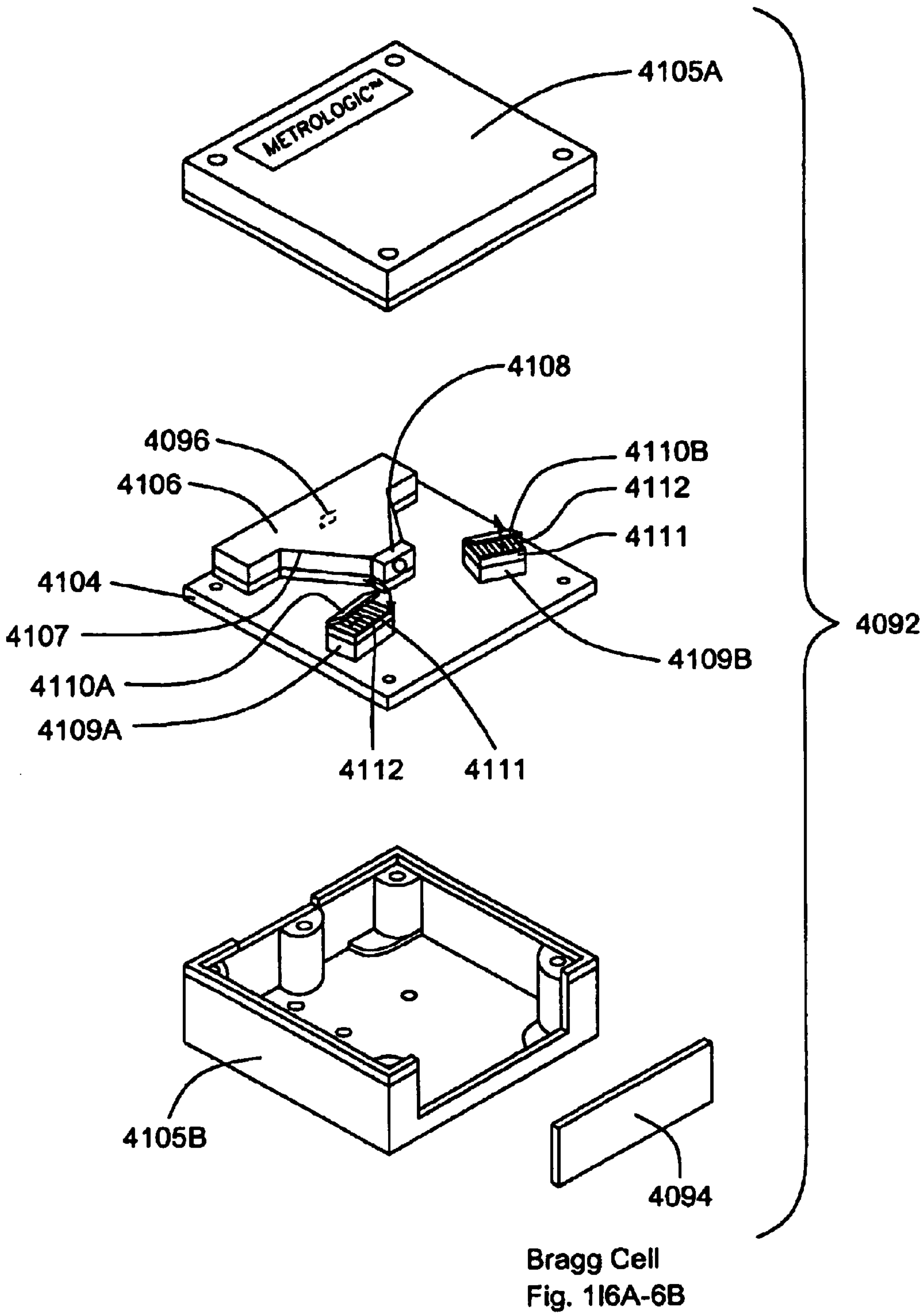
Figure 56A:
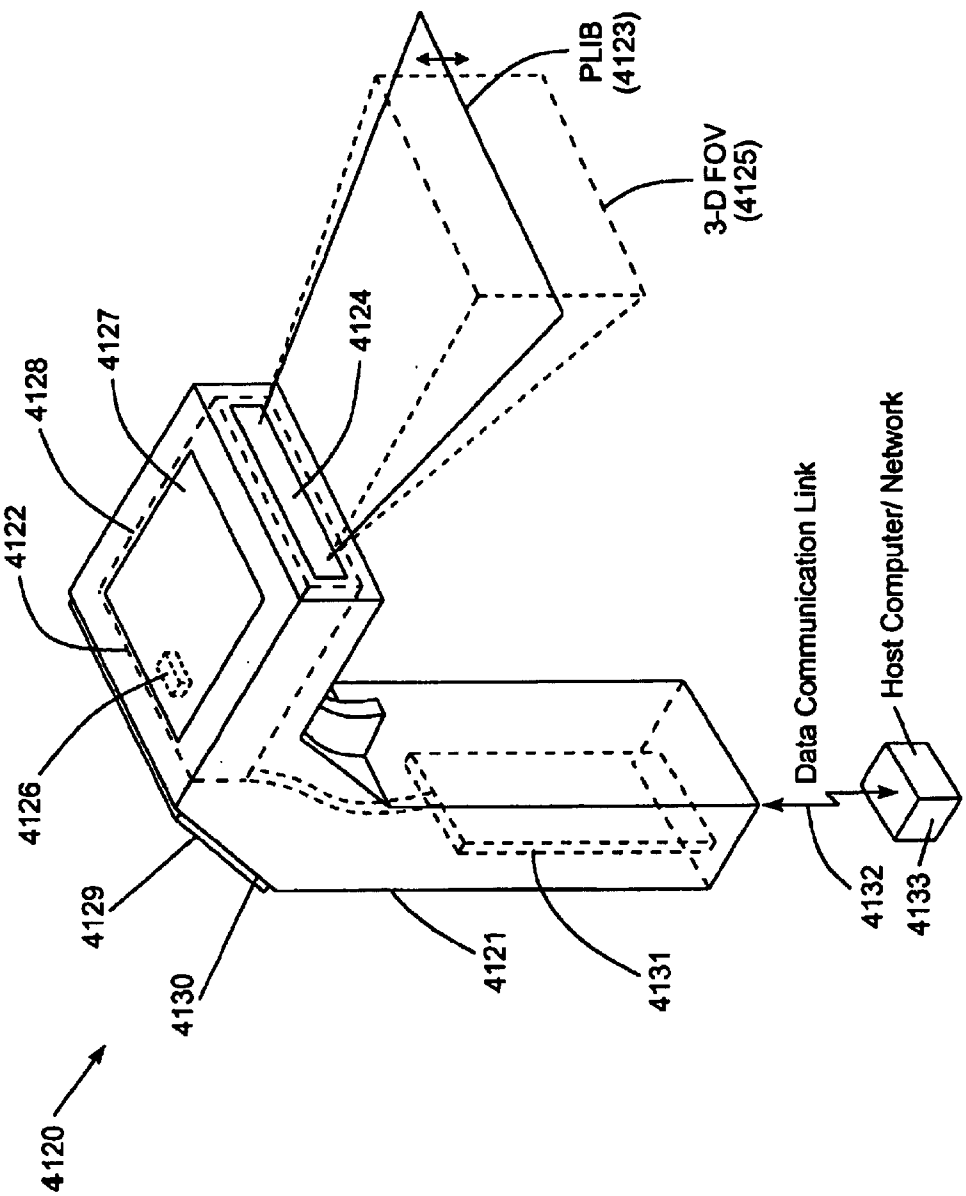
Figure 56B:
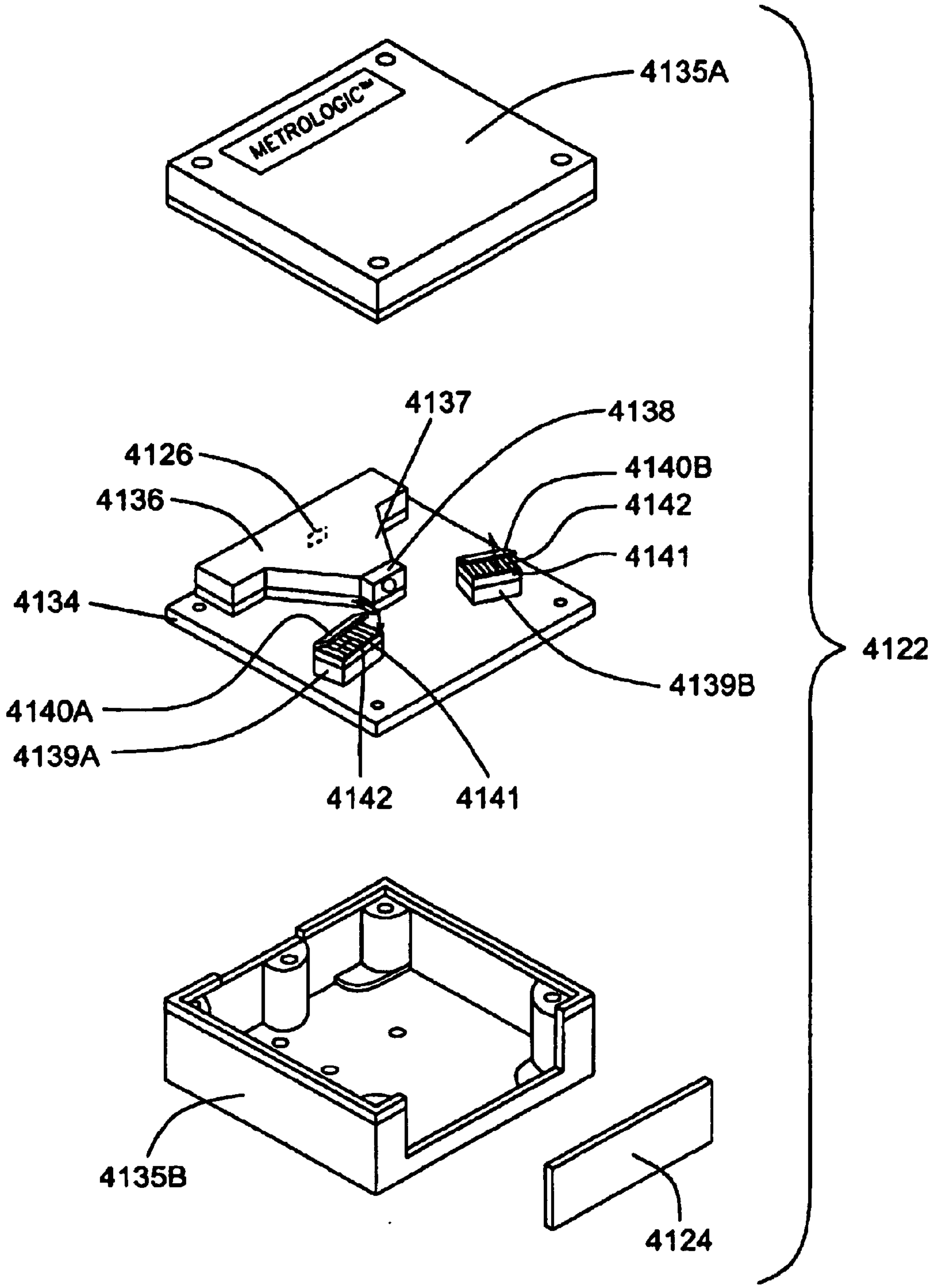
Figure 57A:
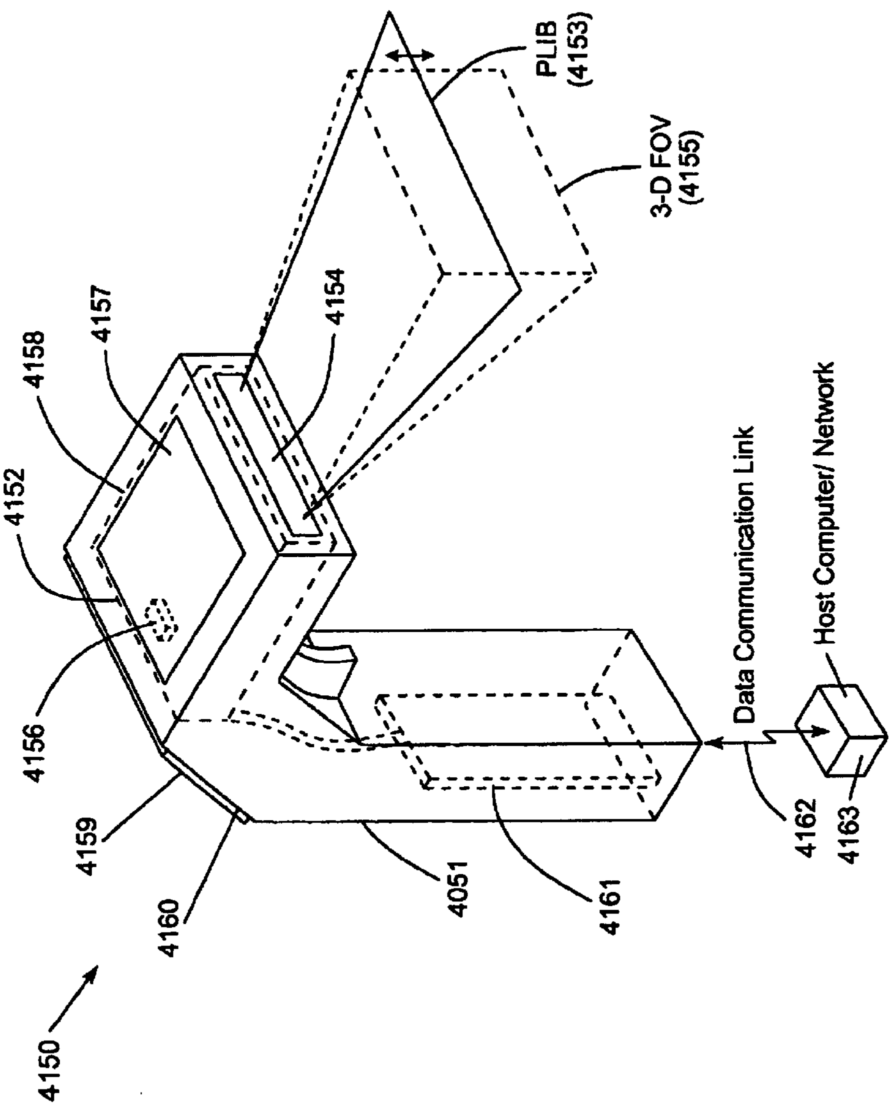
Figure 57B:
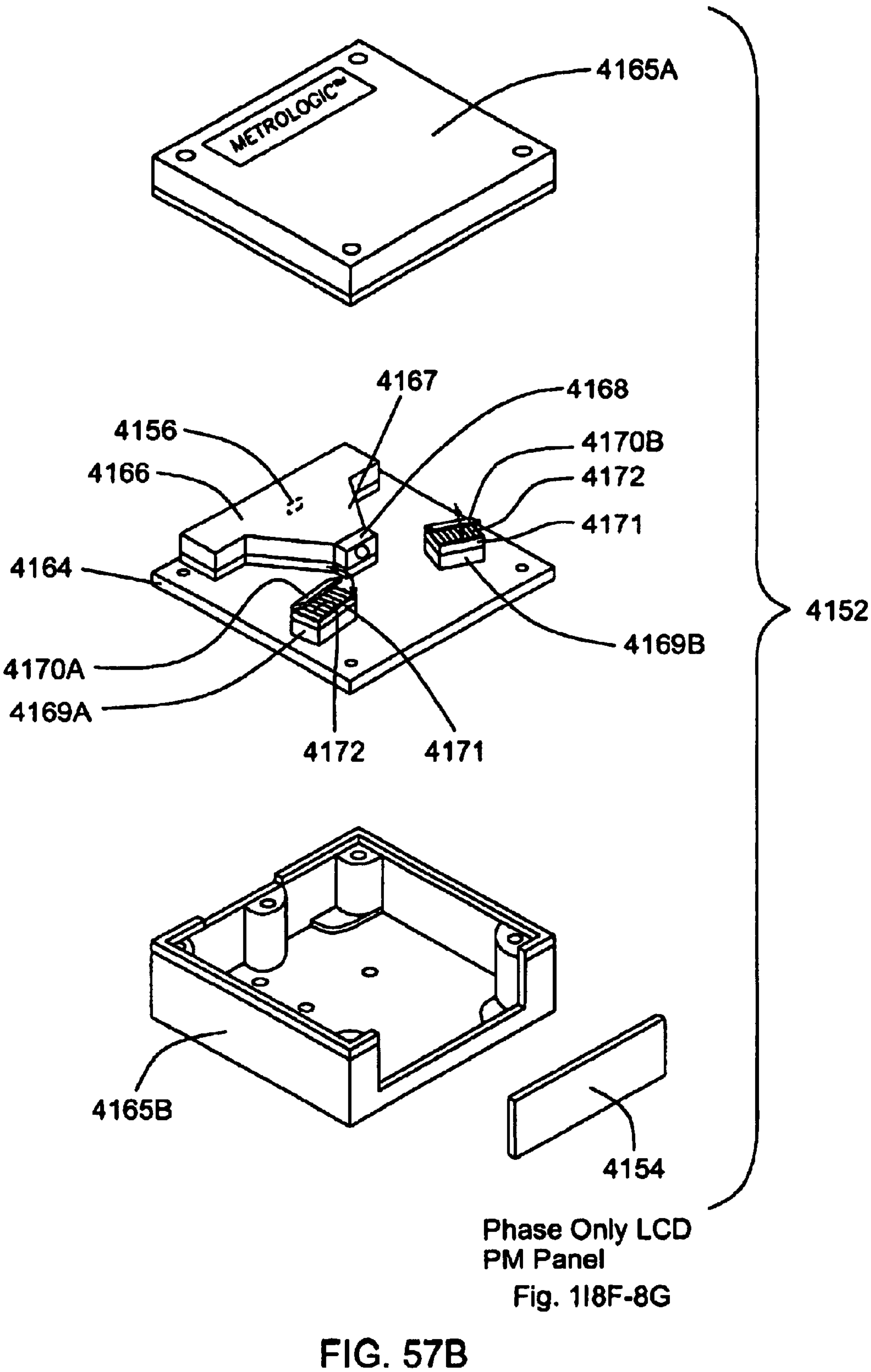
Figure 58A:
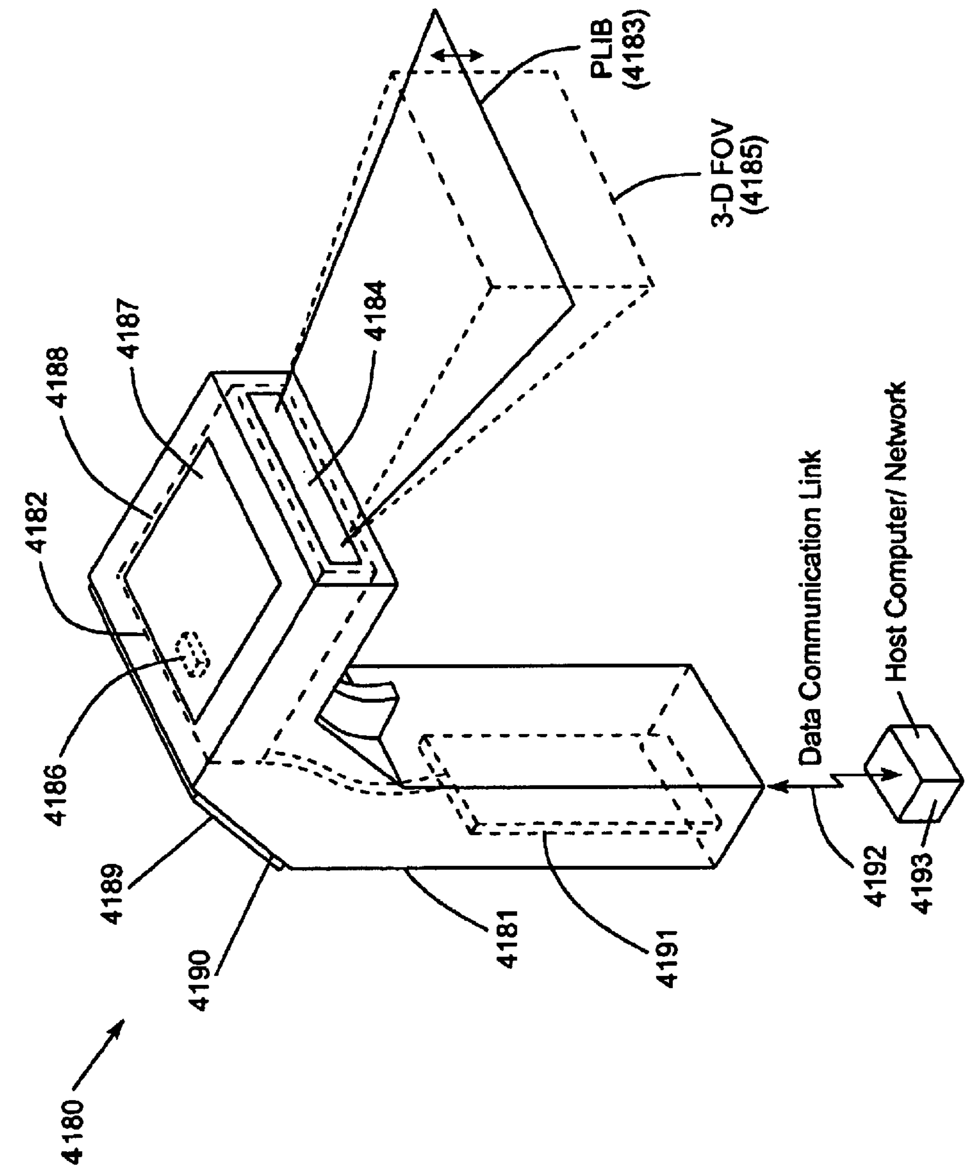
Figure 58B:
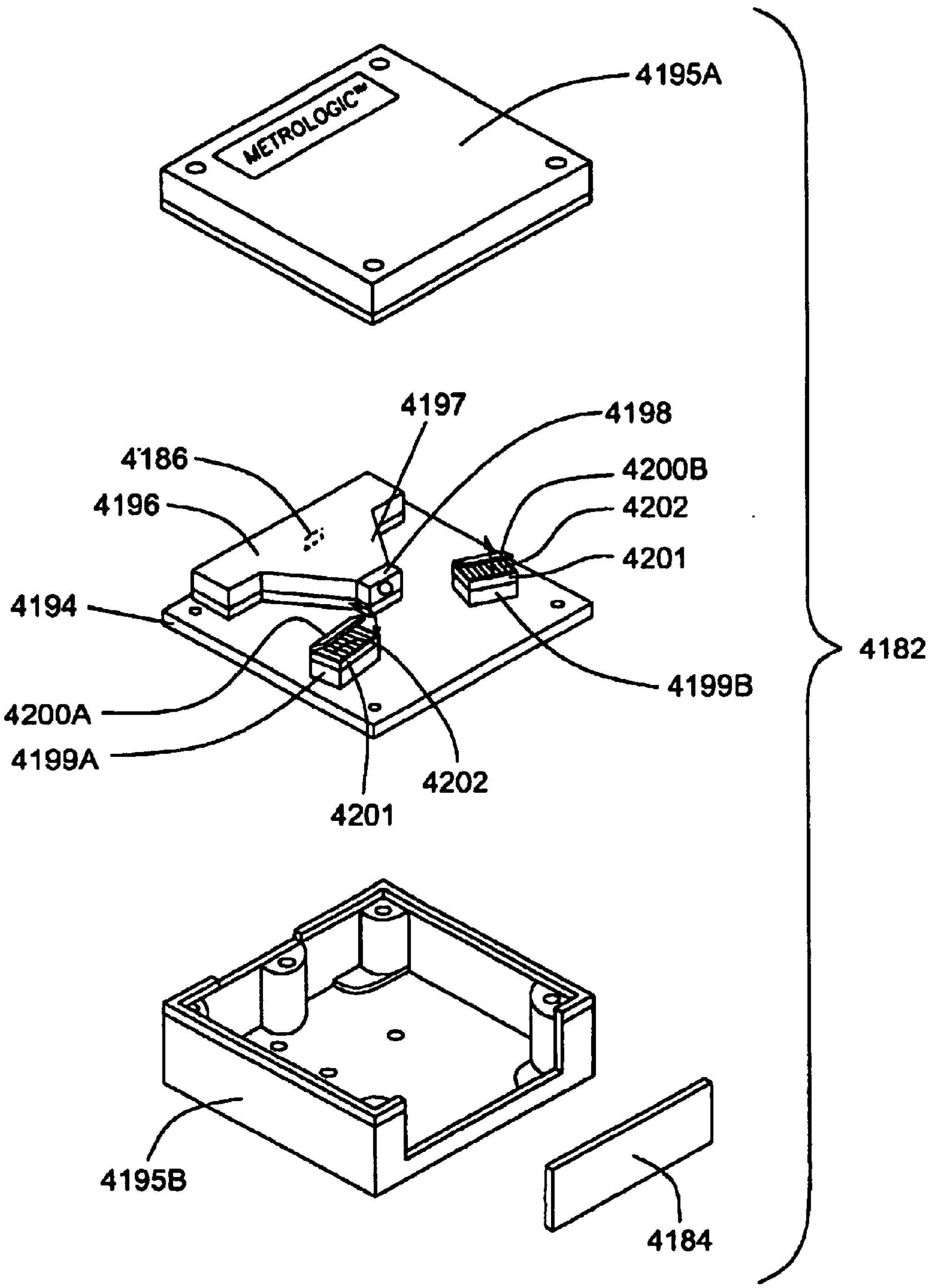
Figure 59A:
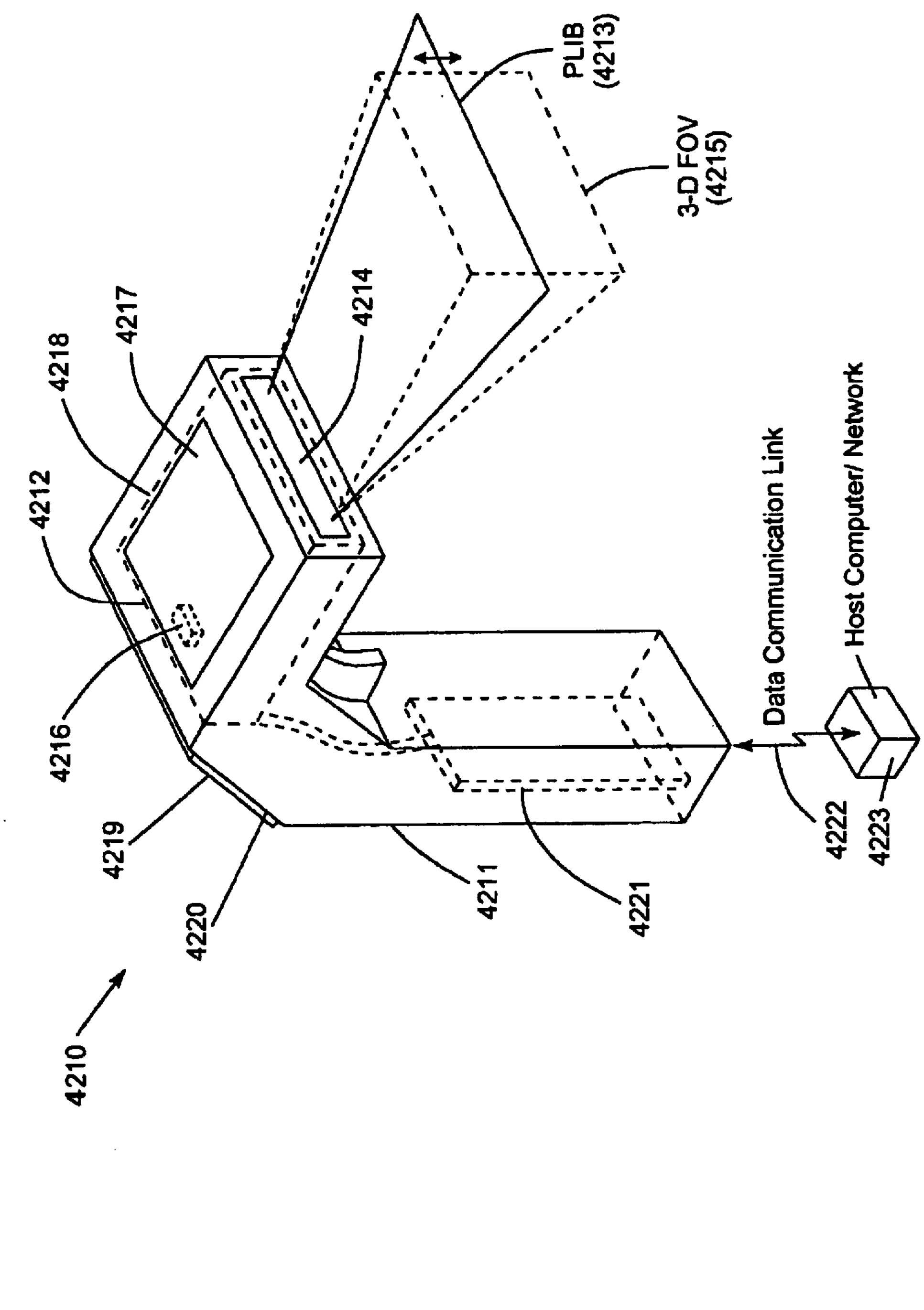
Figure 59B:
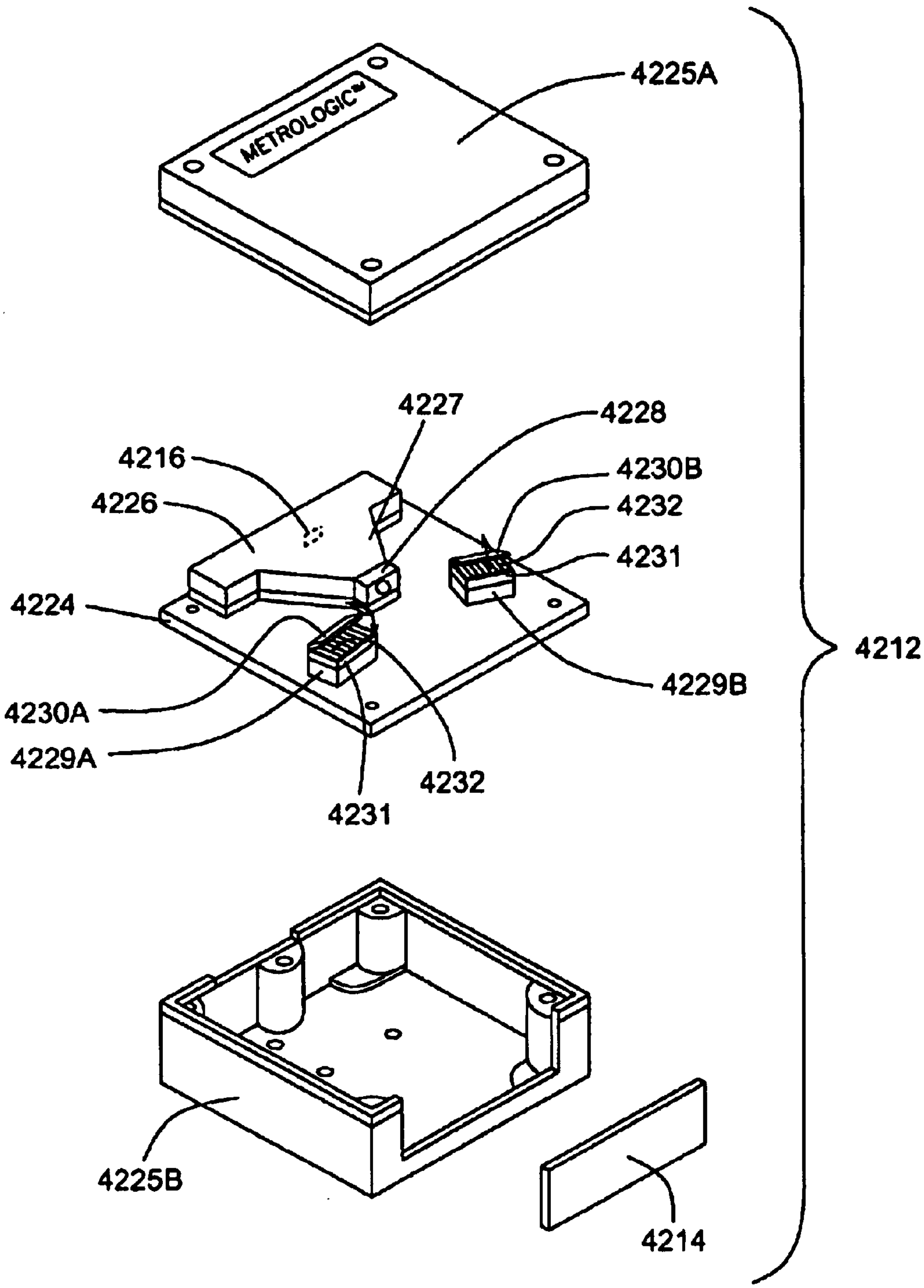
Figure 60A:
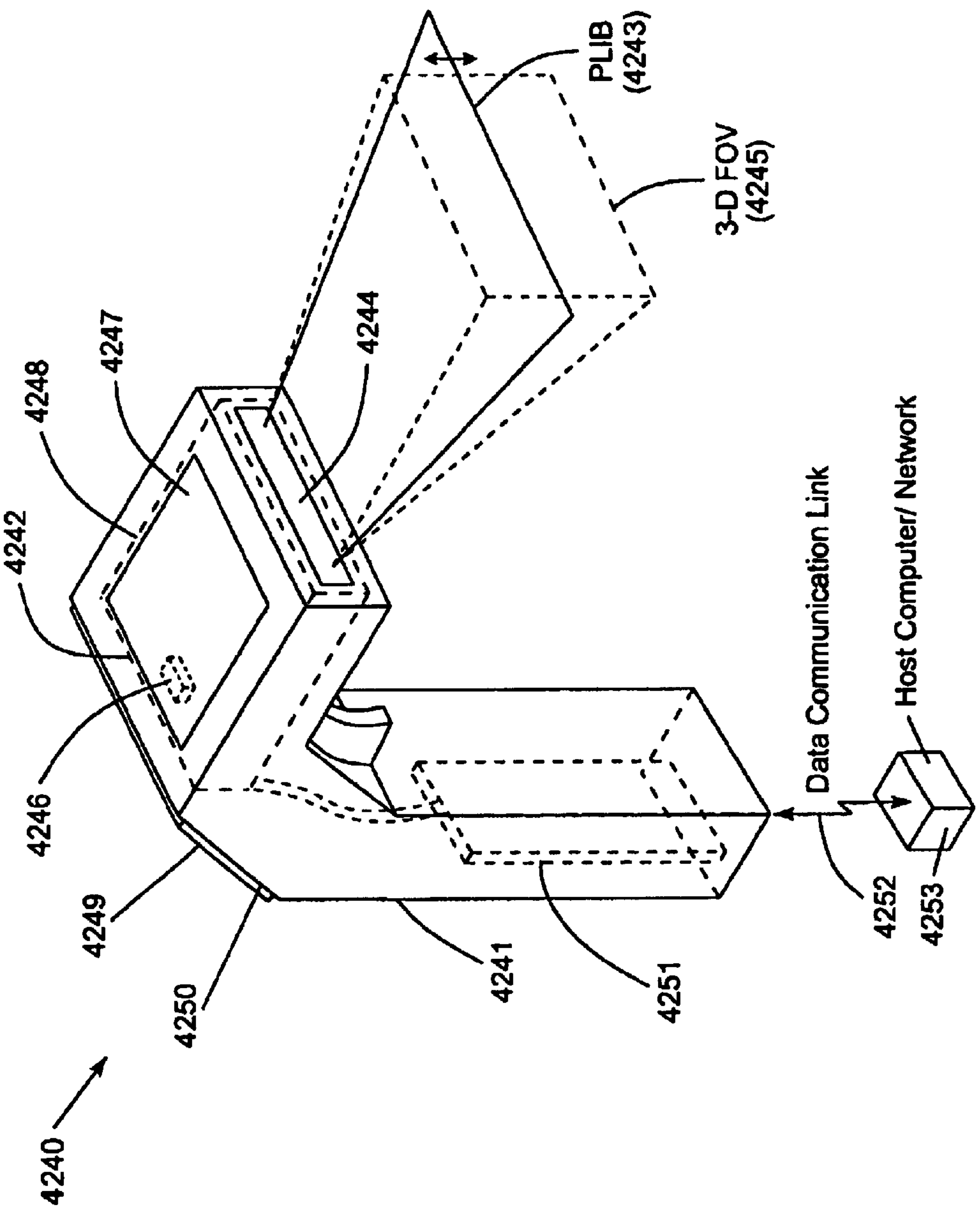
Figure 60B:
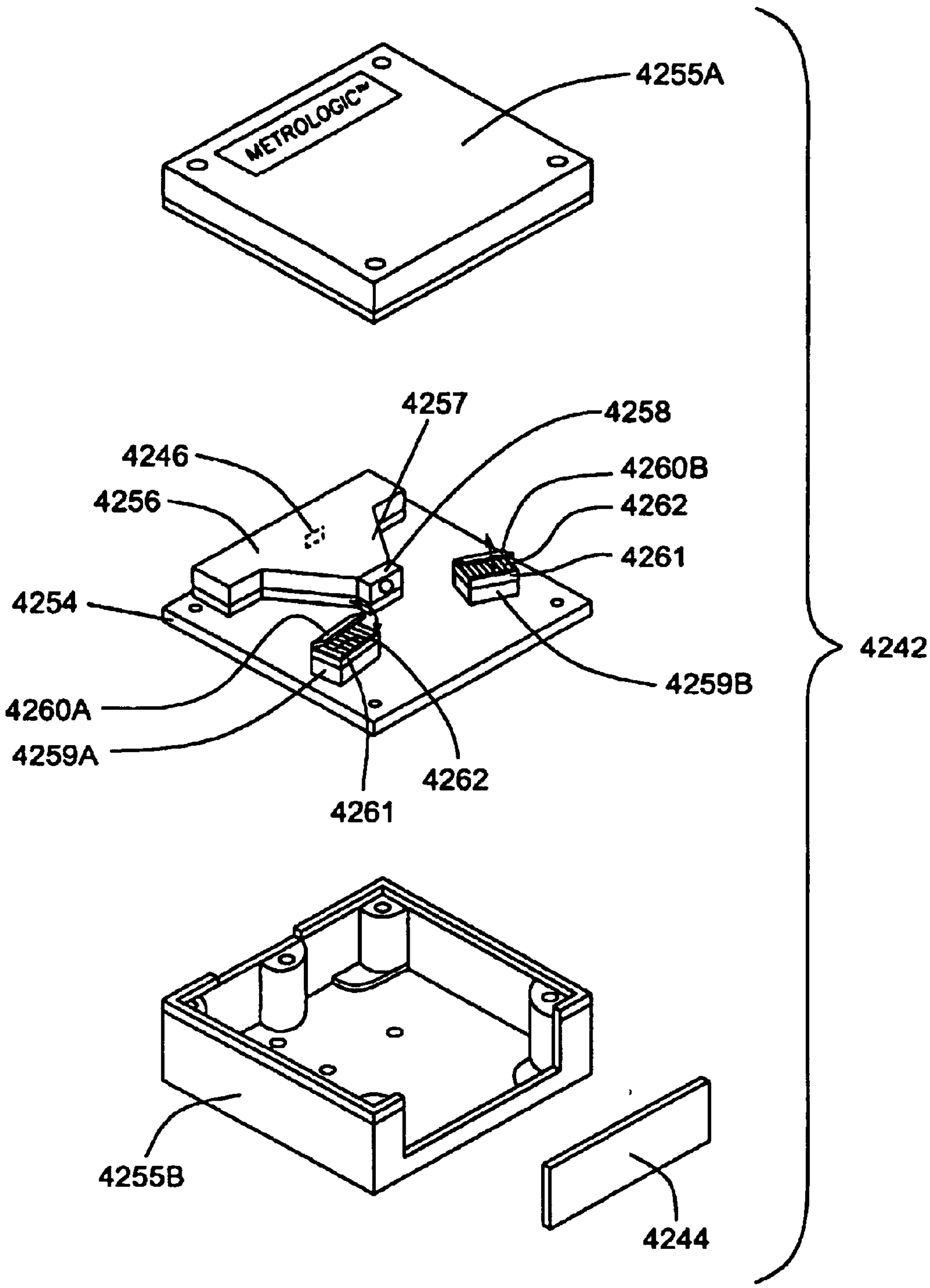
Figure 61A:
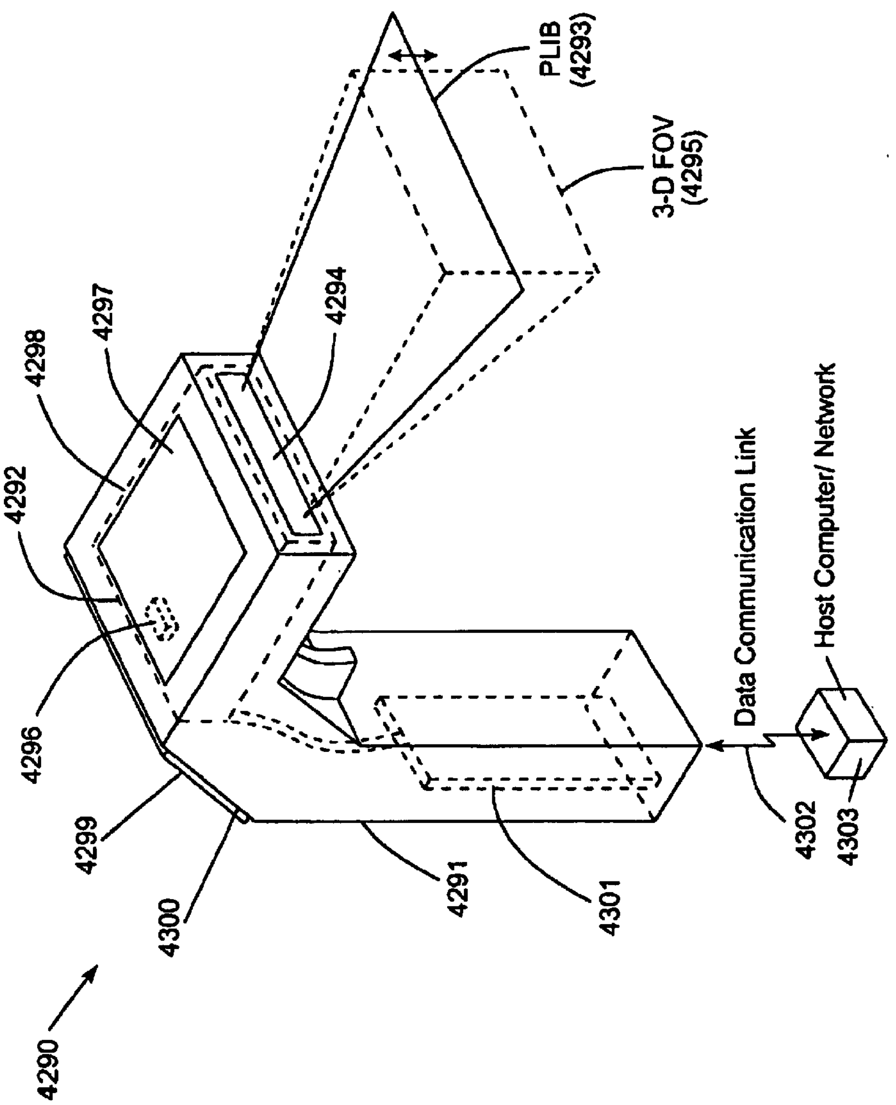
Figure 61B:
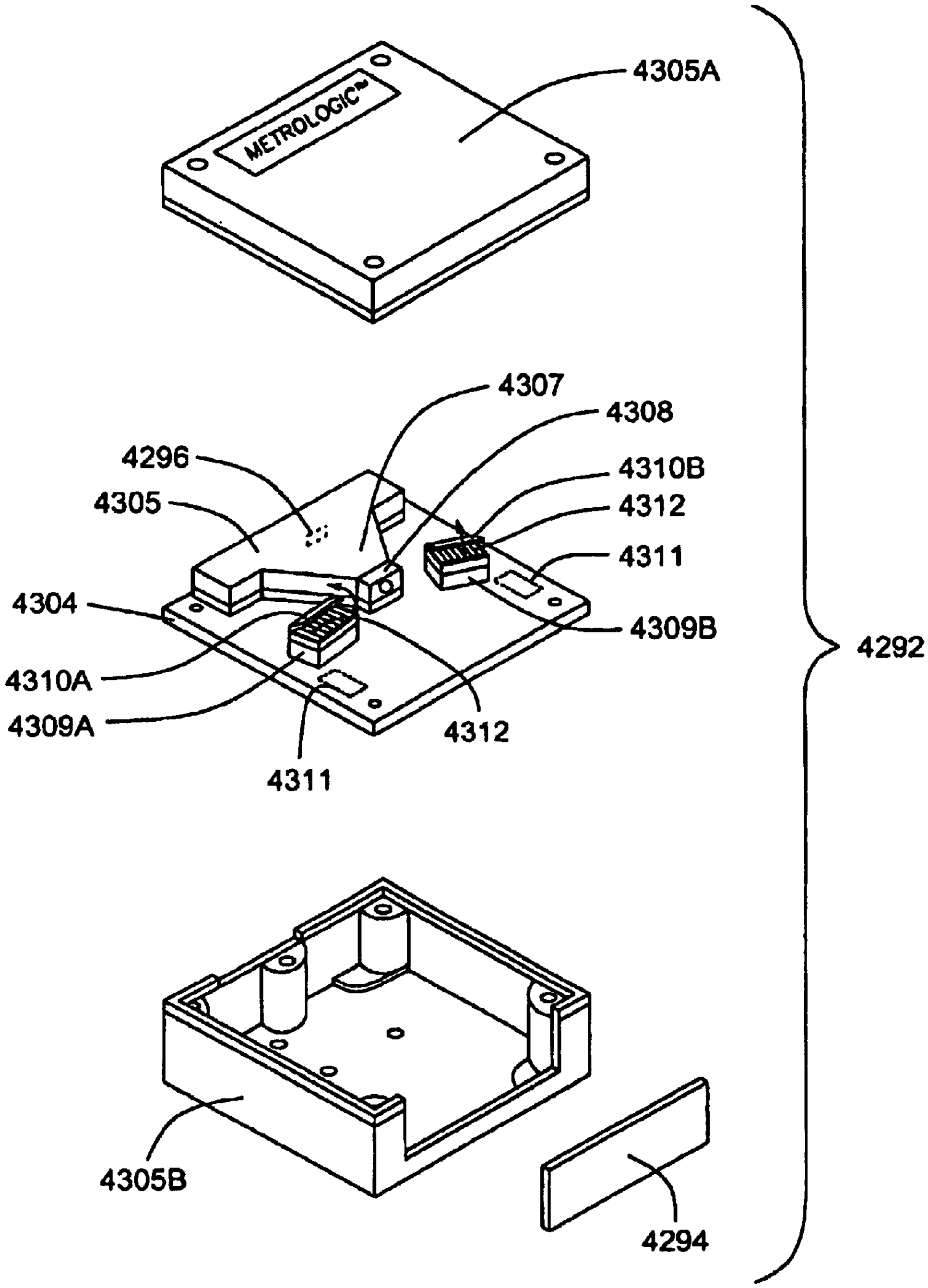
Figure 62A:
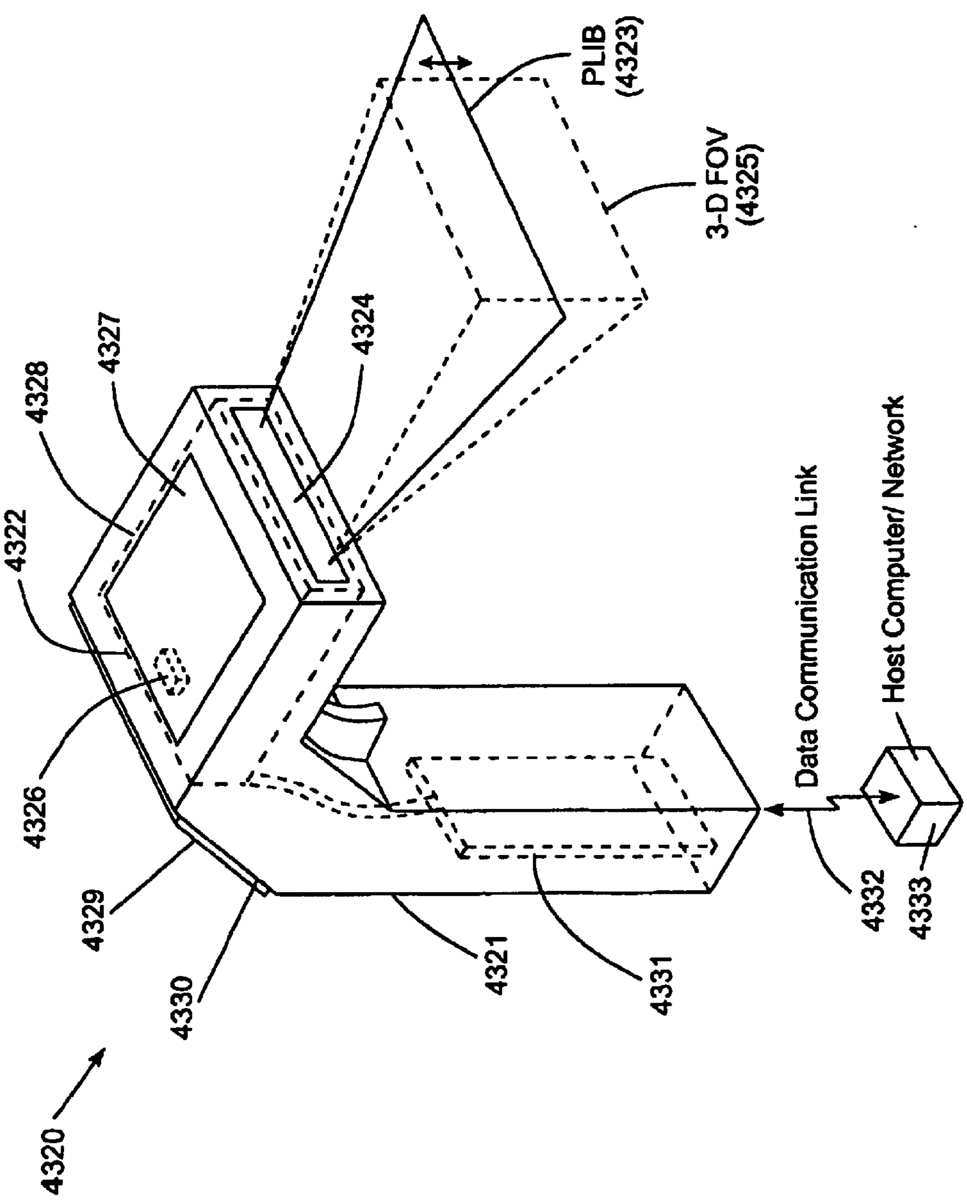
Figure 62B:
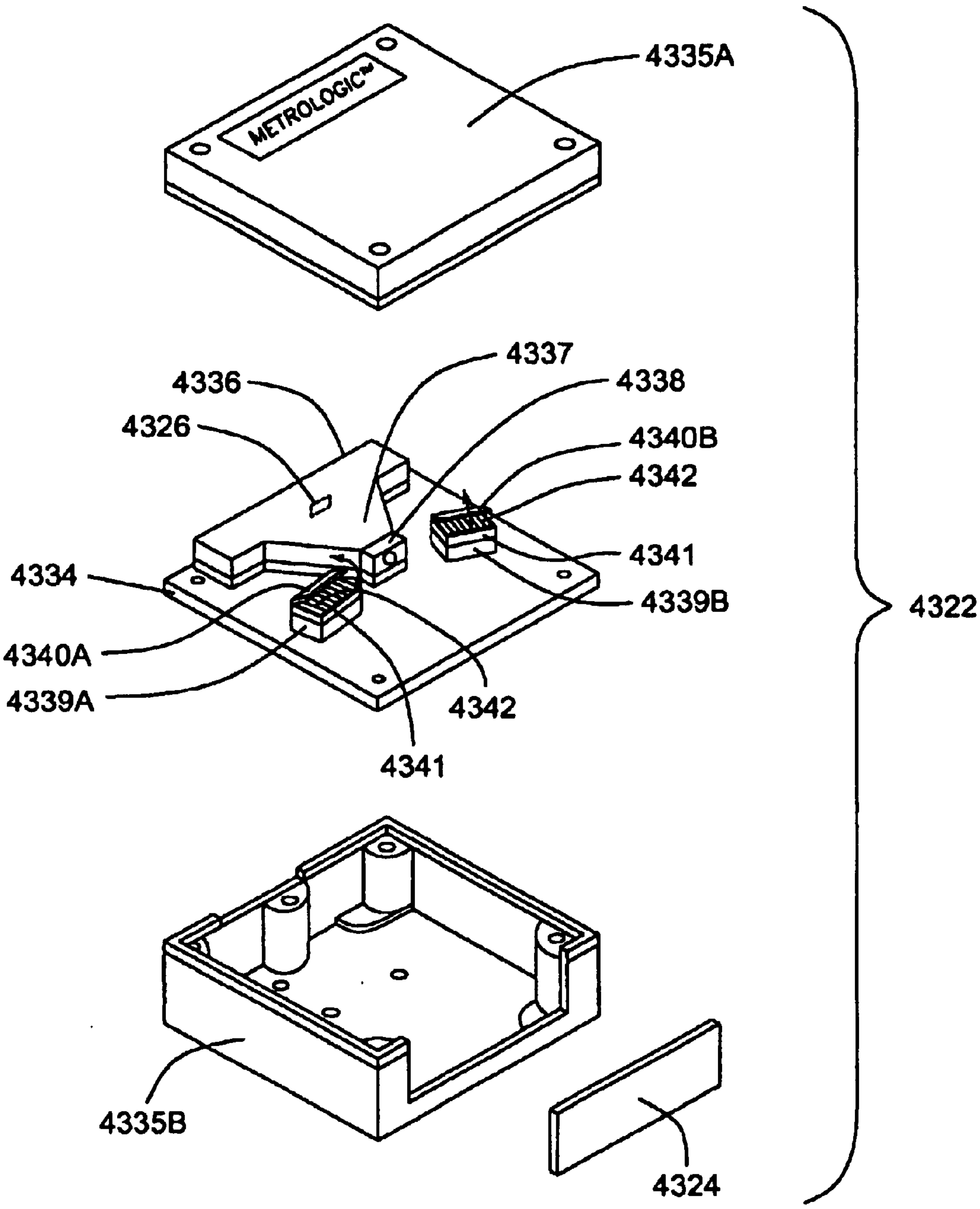
Figure 63A:
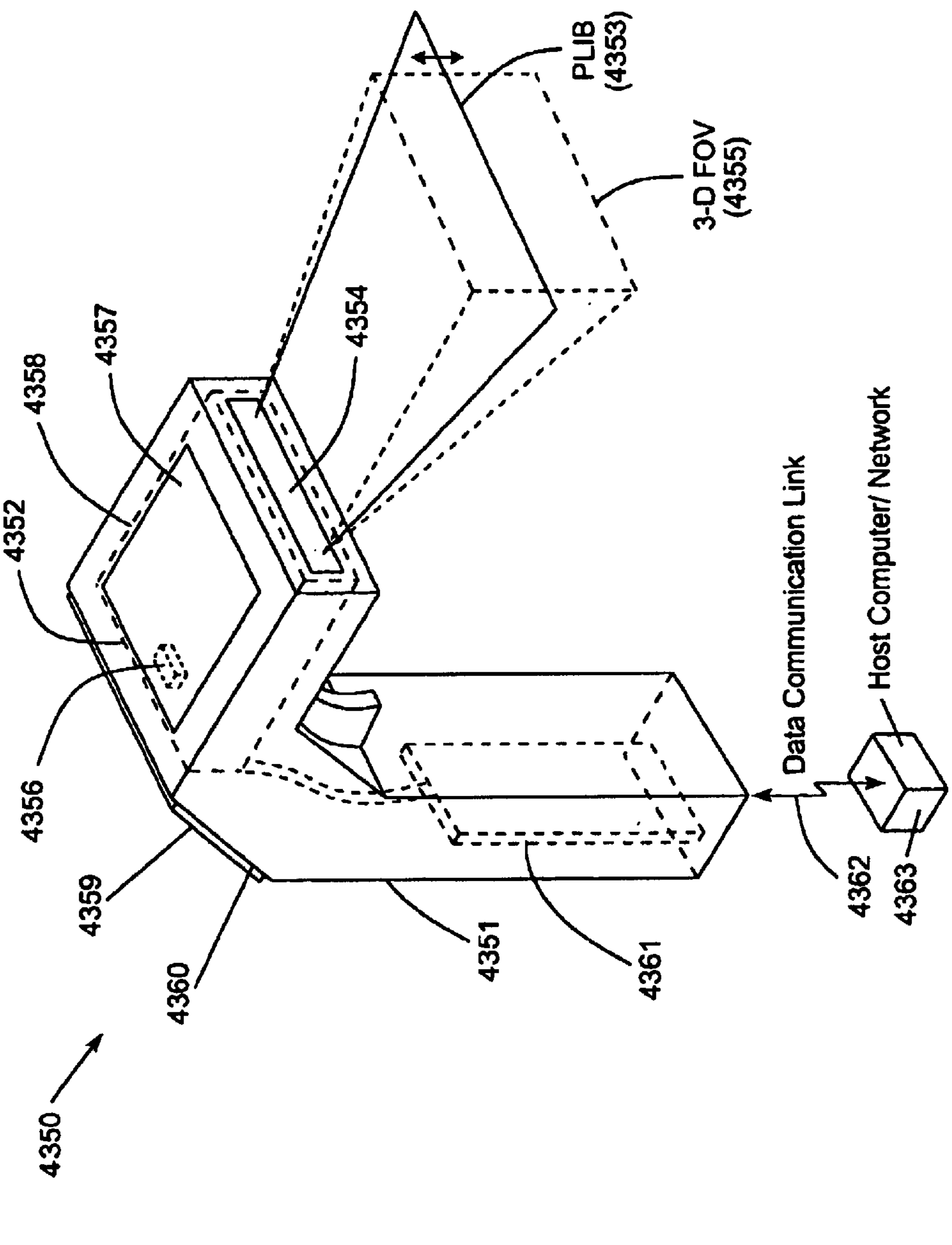
Figure 63B:
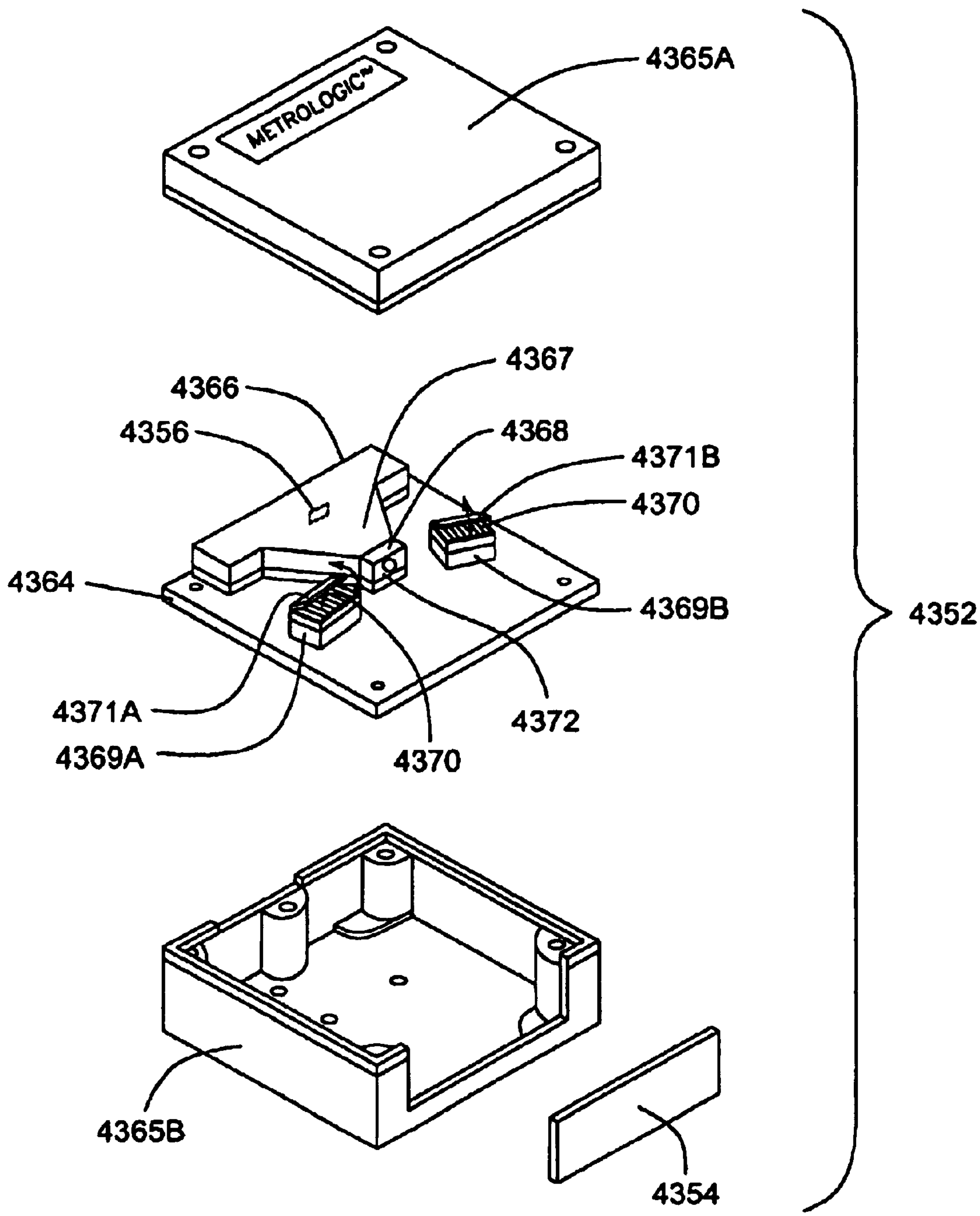
Figure 64A:
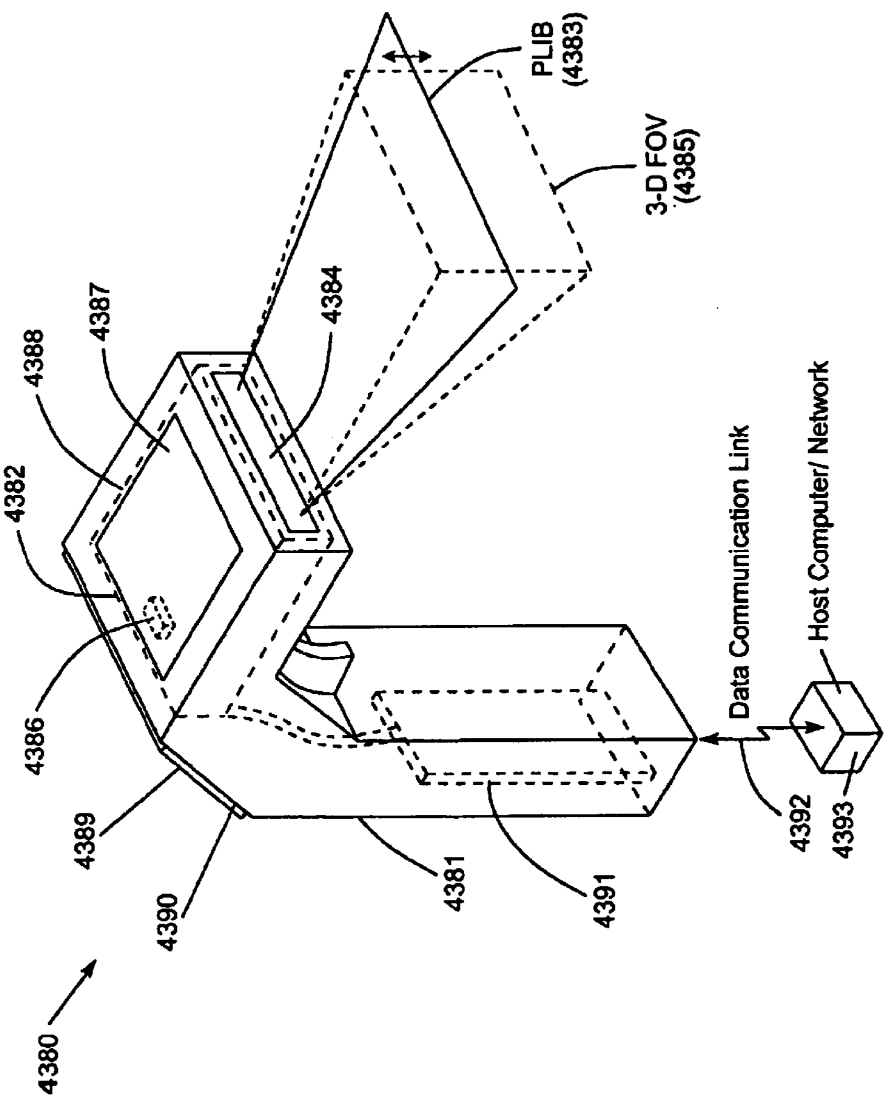
Figure 64B:
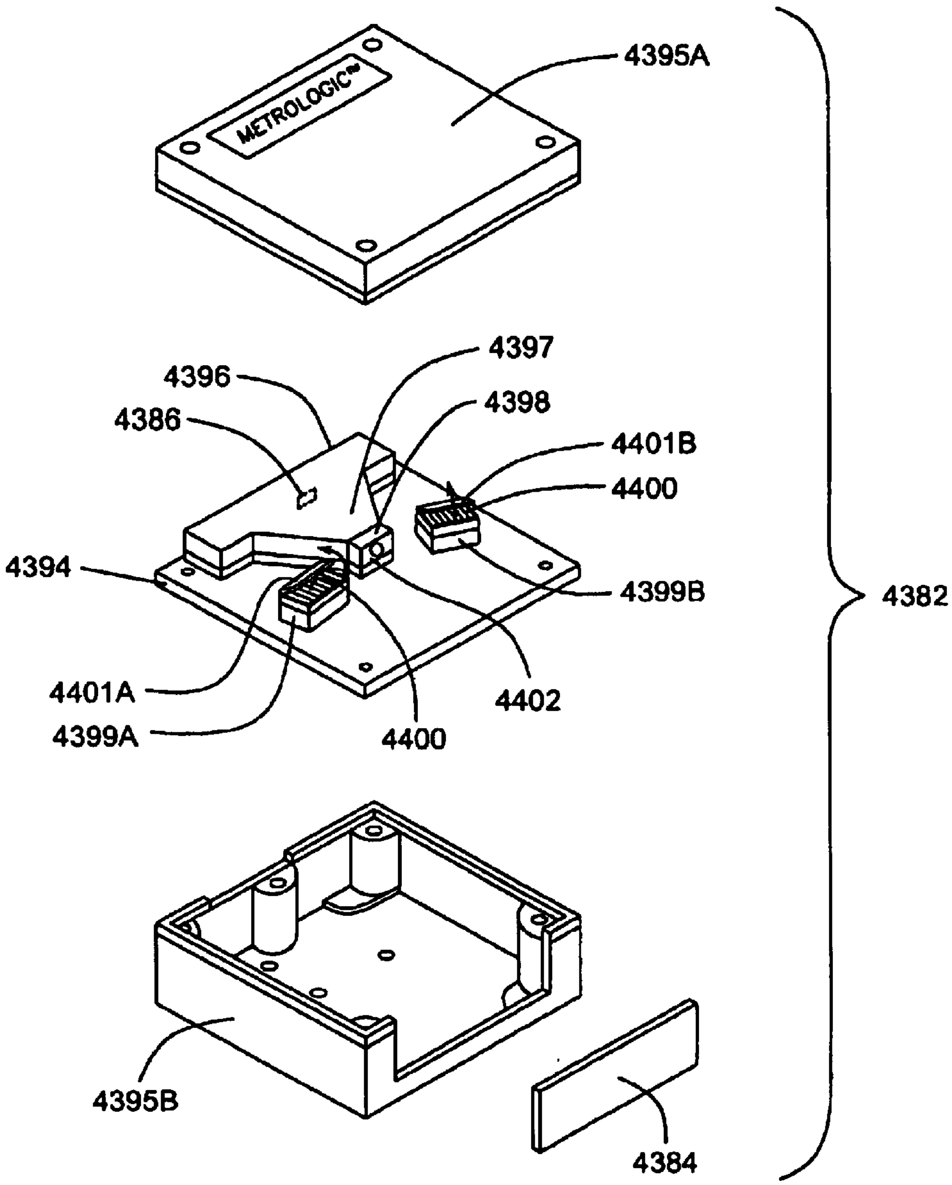
Figure 65A:
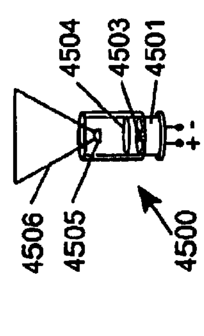
Figure 65B:
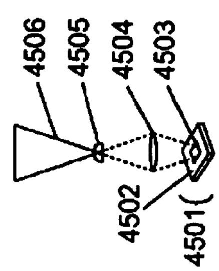
Figure 66A:
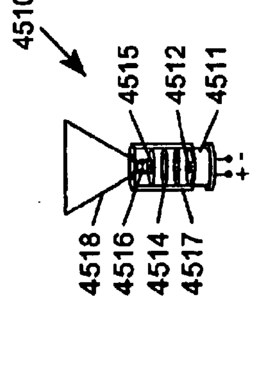
Figure 66B:
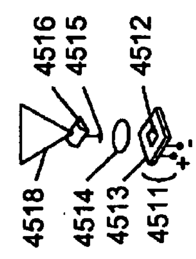
Figure 67A:
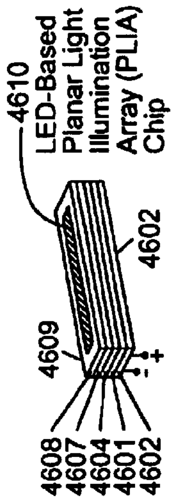
Figure 67B:
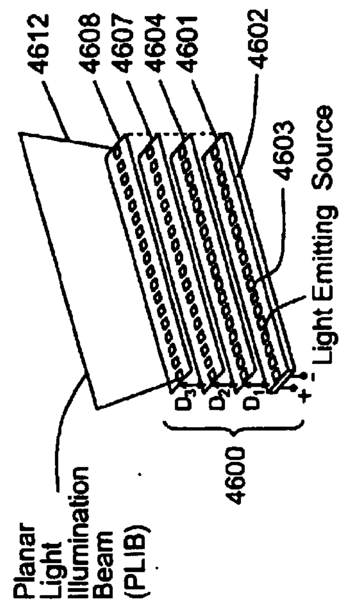
Figure 67C:
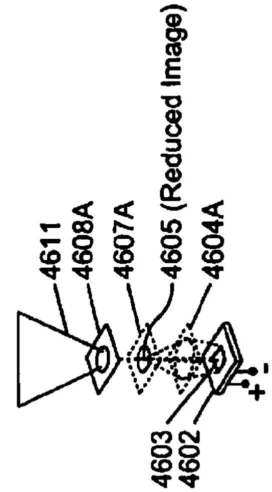
Figures 1, 68:
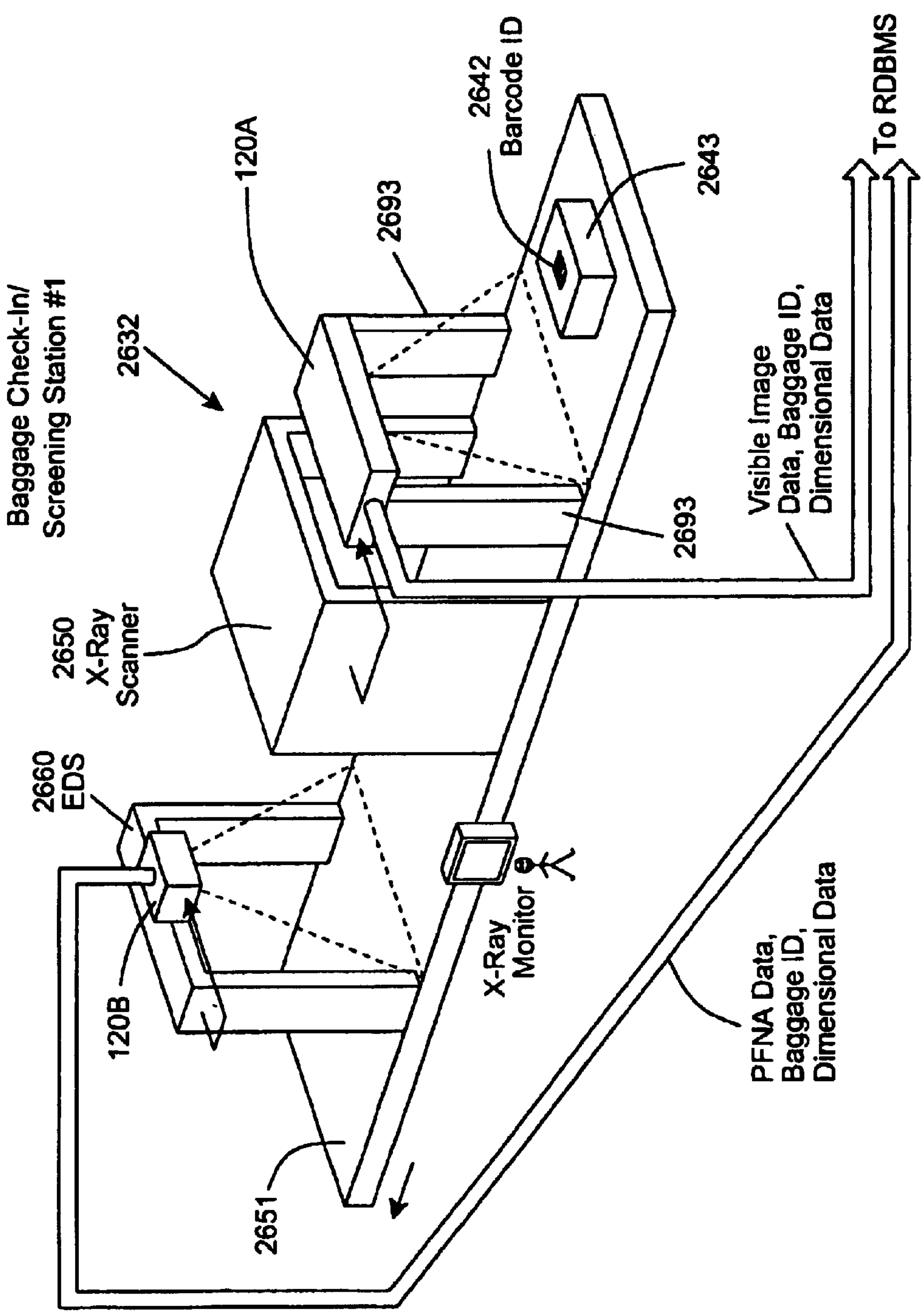
Figures 2, 68:
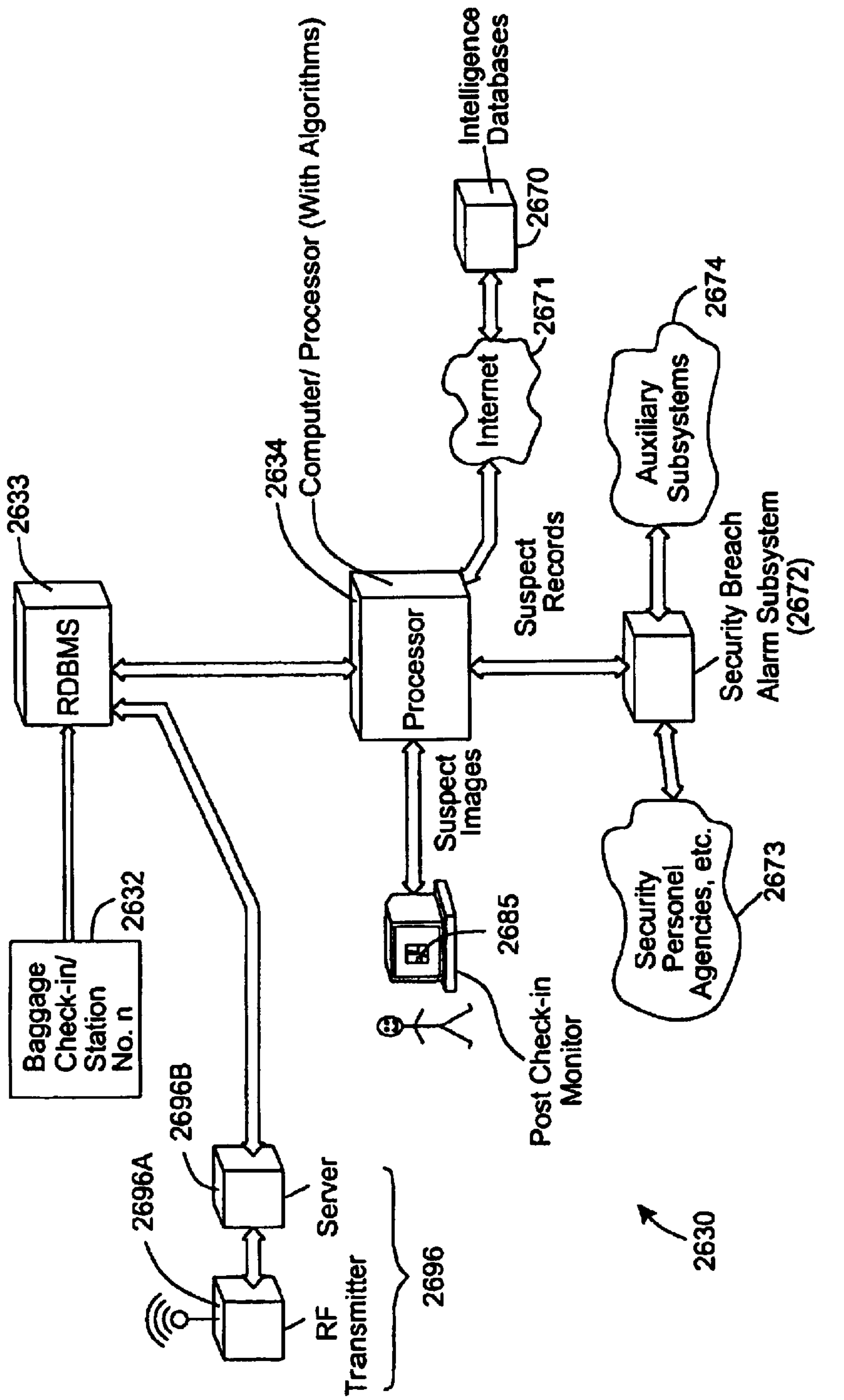
Figures 3, 68:
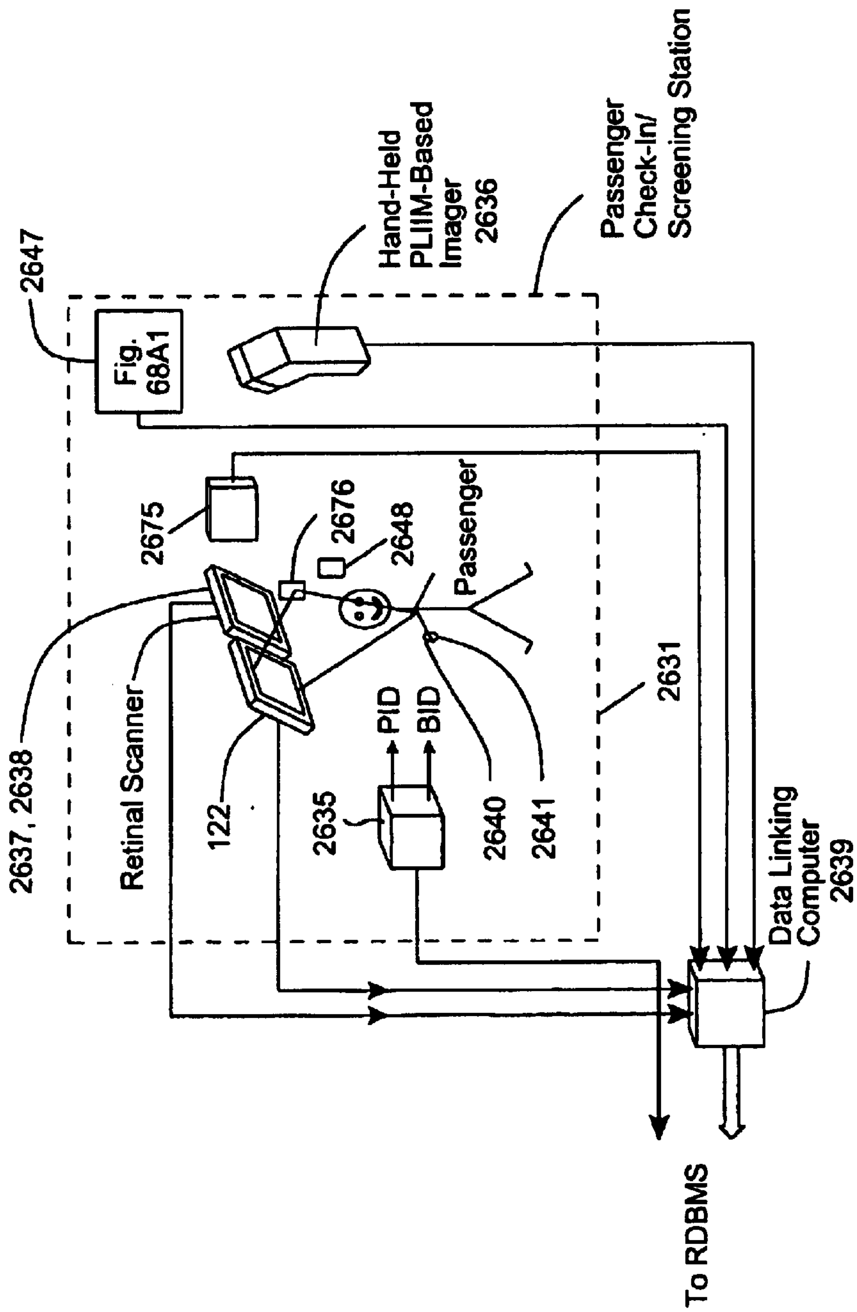
Figure 68A:
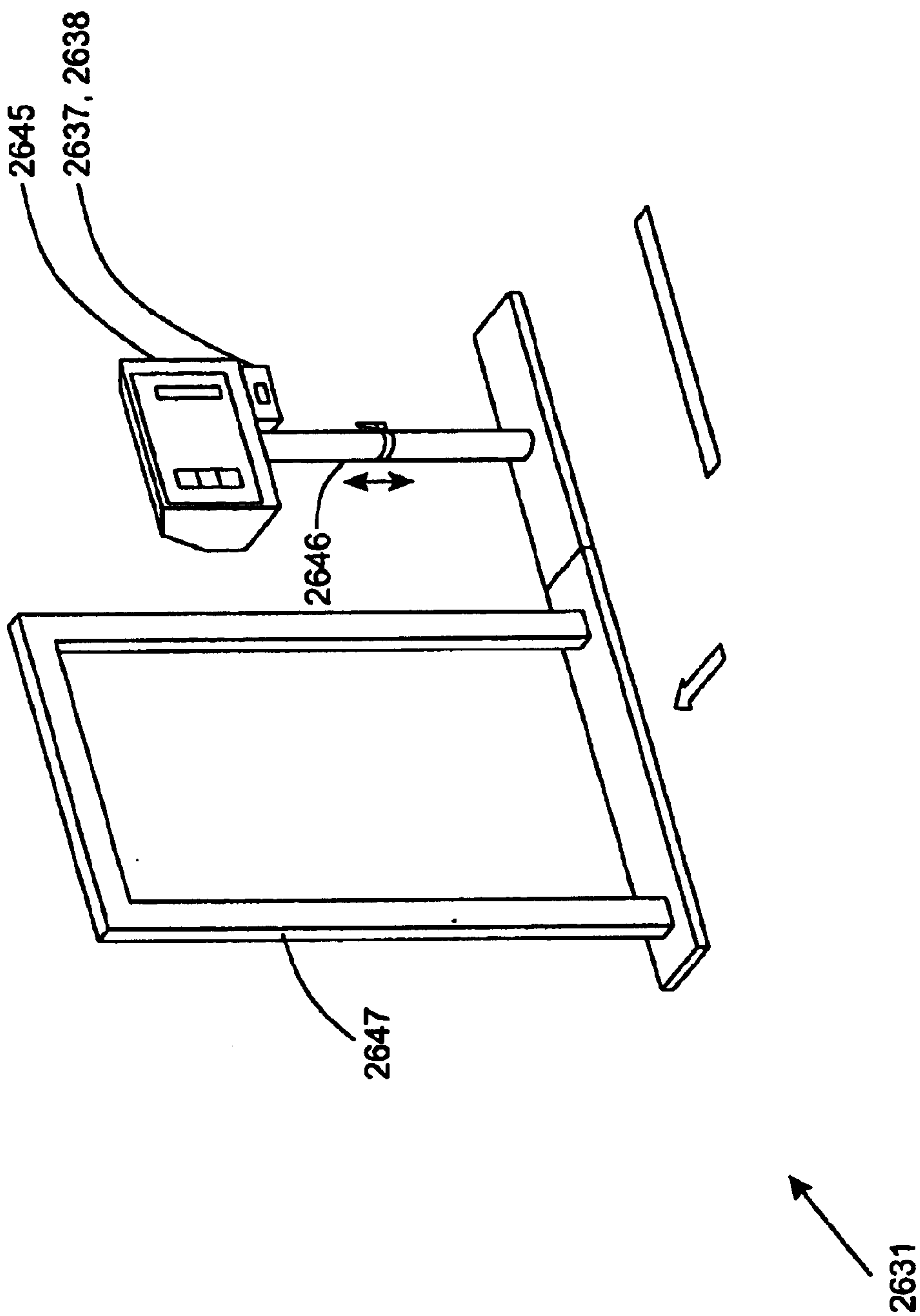
Figure 68B:
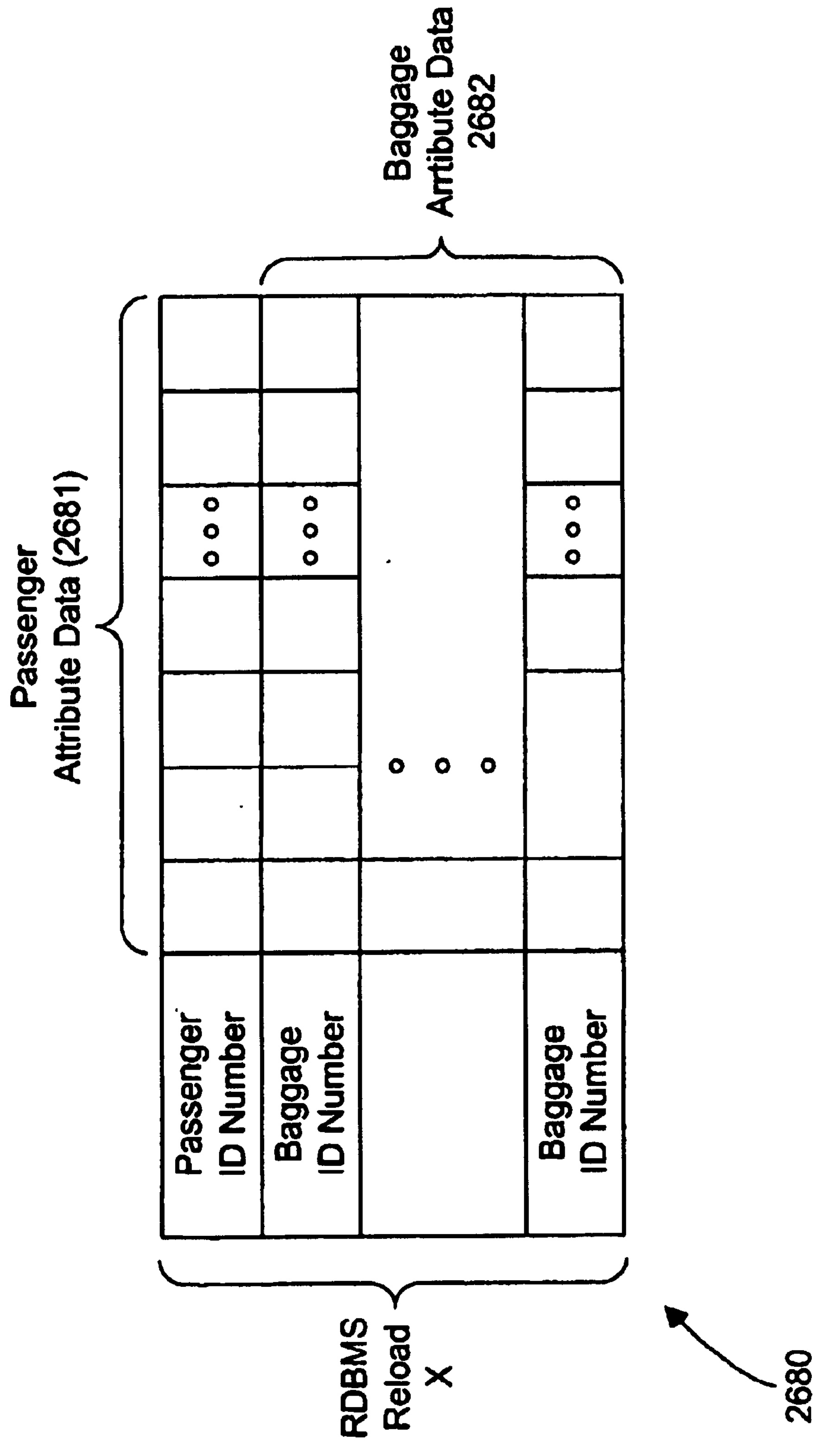
Figure 70A:
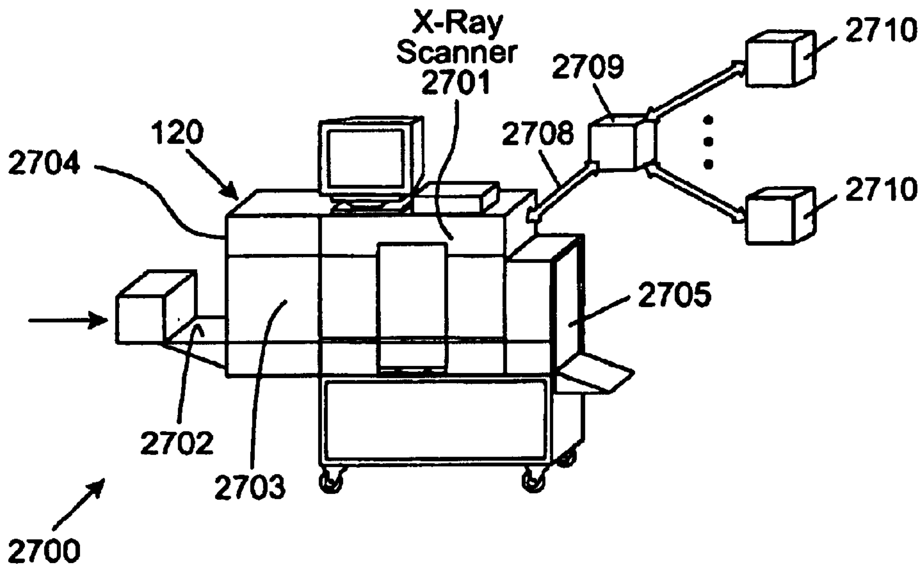
Figure 70B:
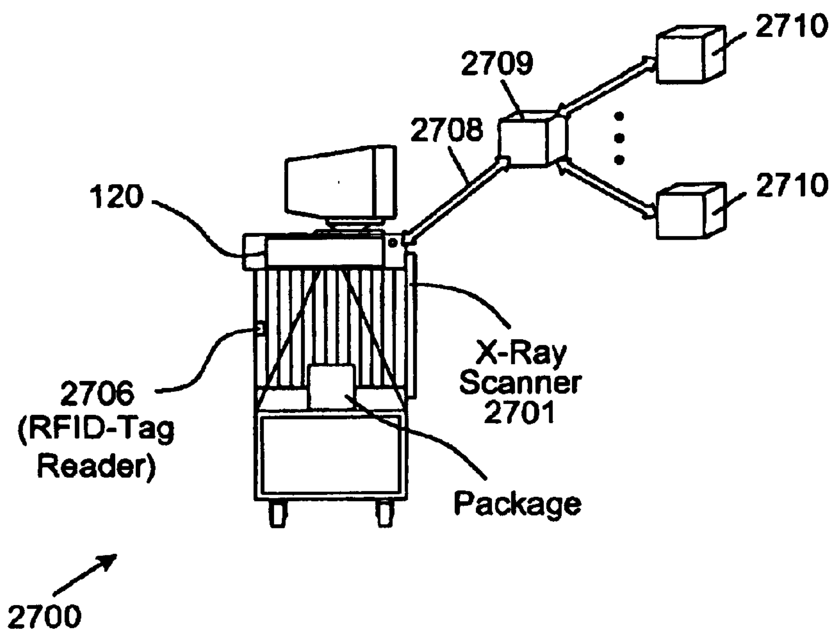
Figure 71A:
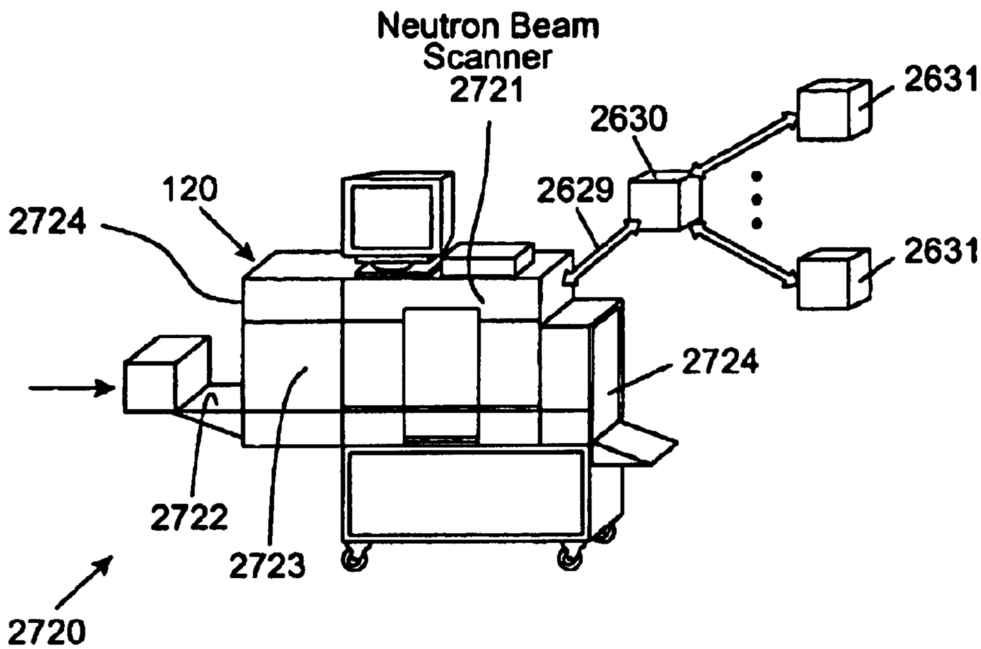
Figure 71B:
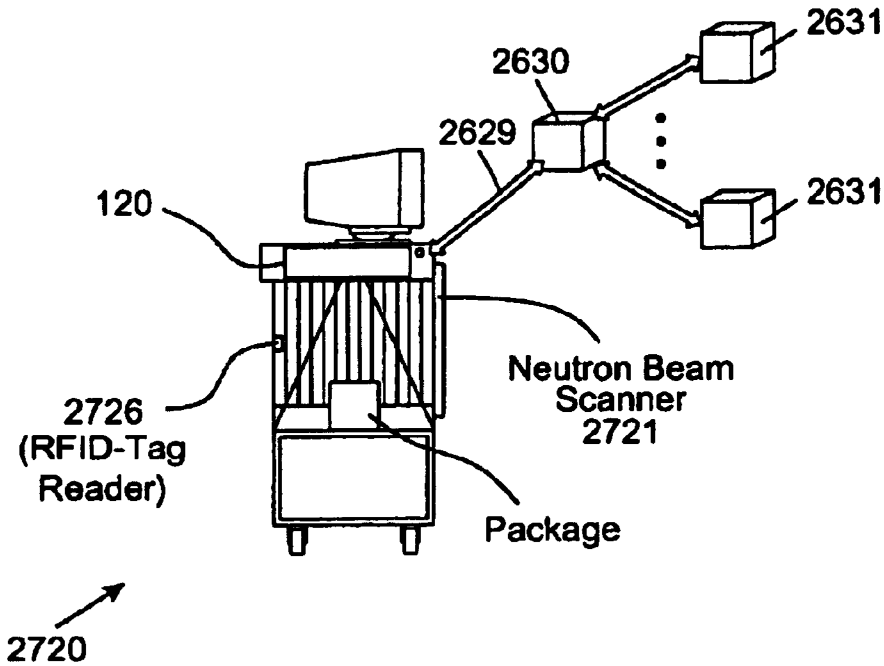
Figure 72A:
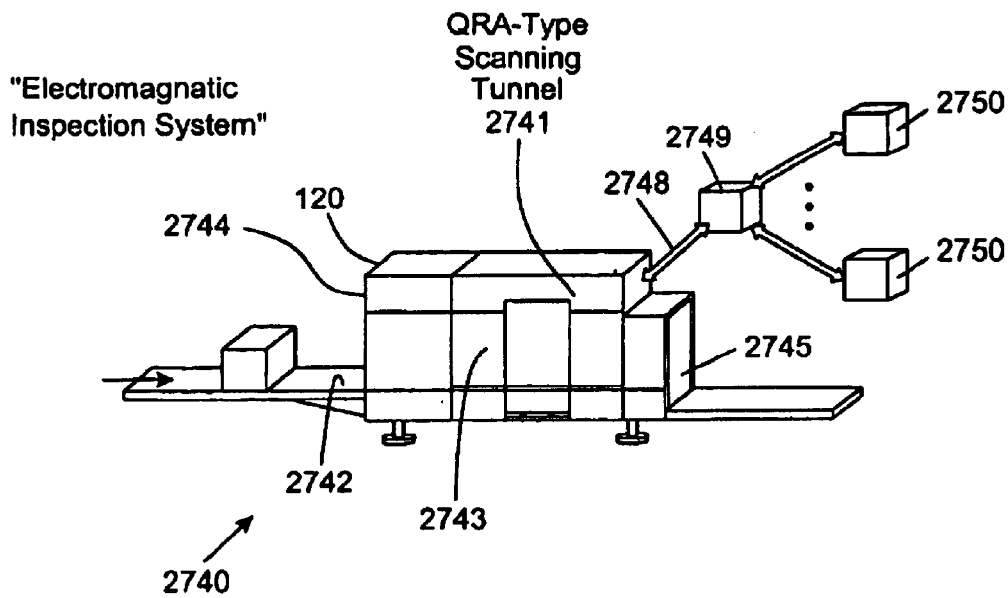
Figure 72B:
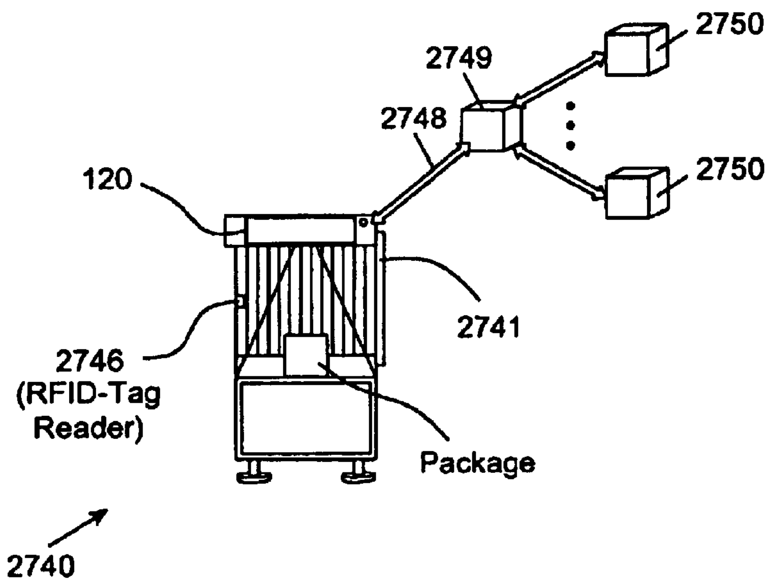
Figure 73:
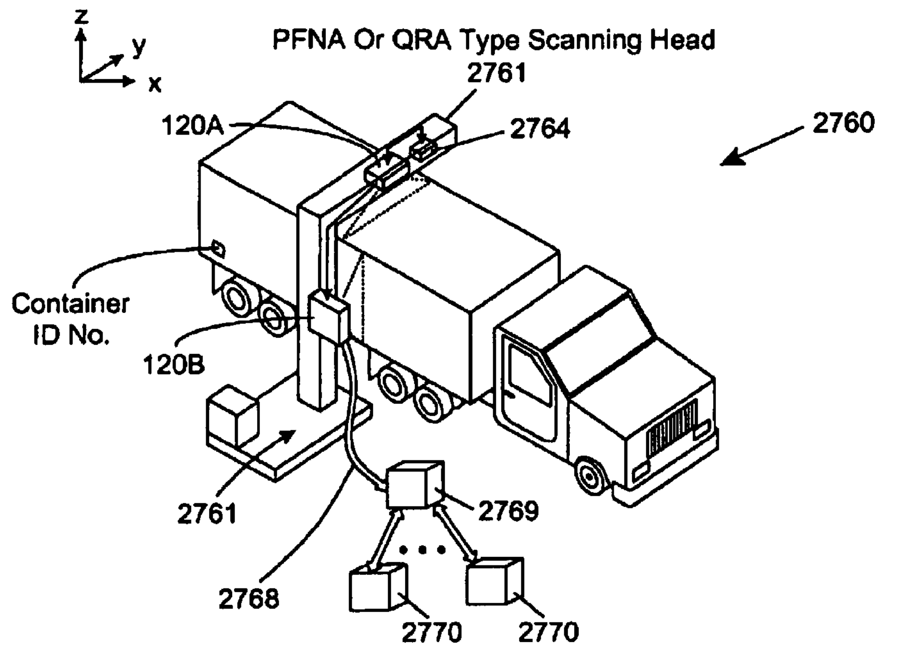
Figure 74:
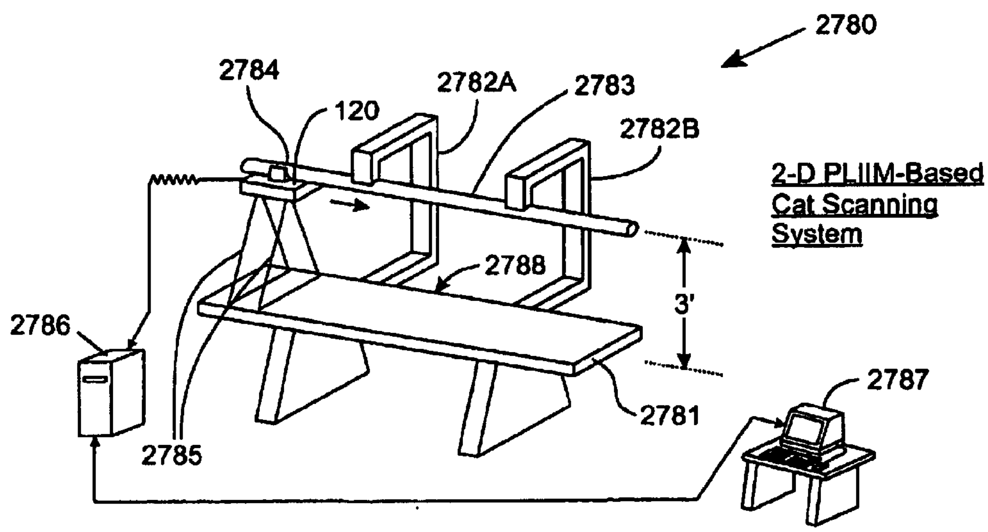
Figure 75:
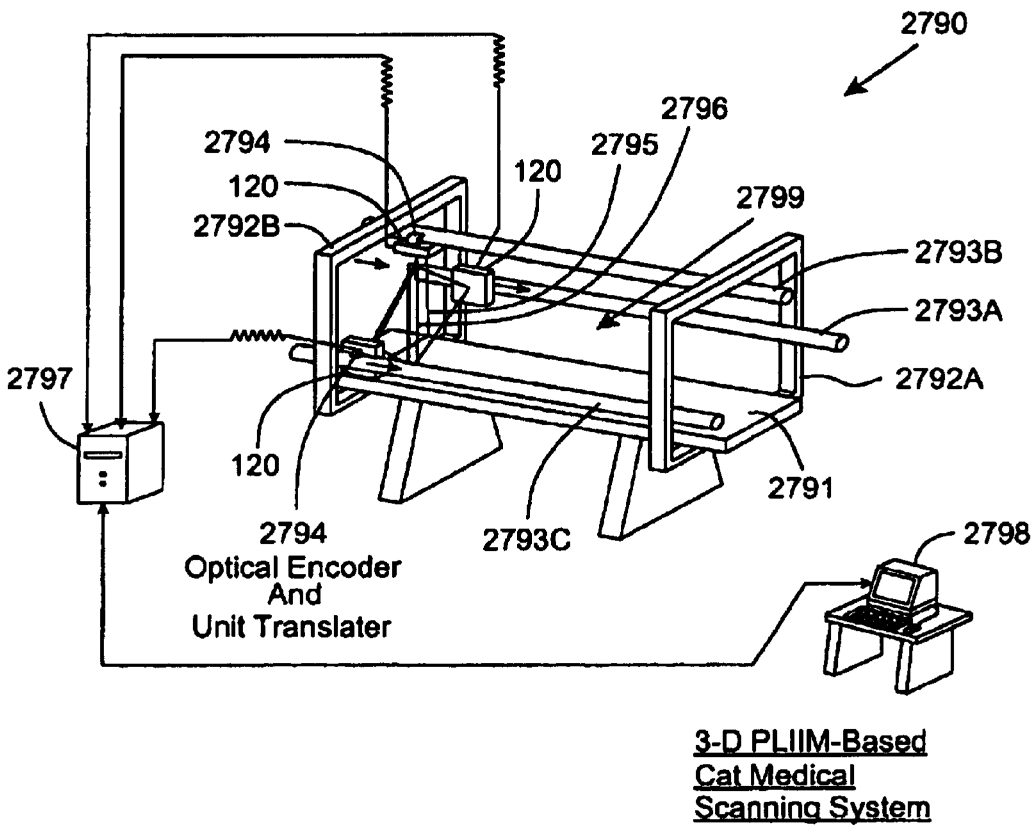
Figure 76:
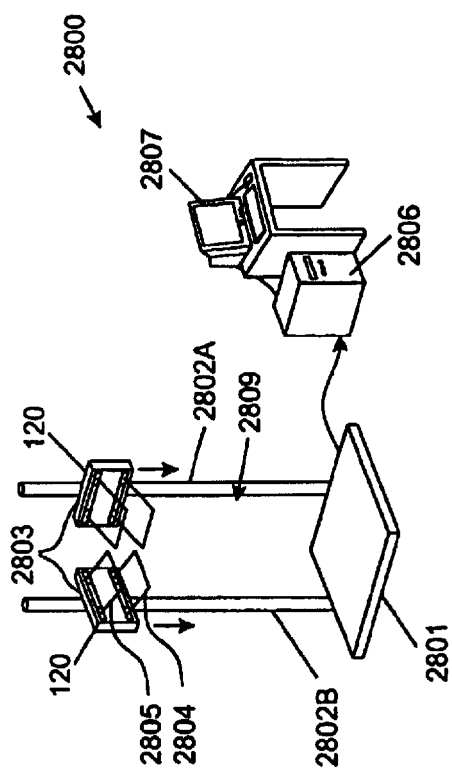
Figure 77B:
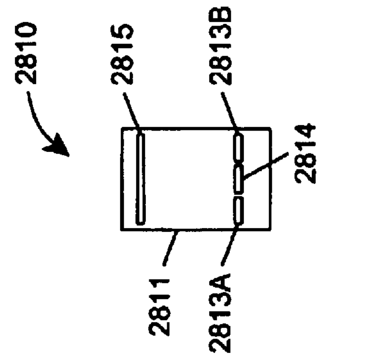
Figure 77A:
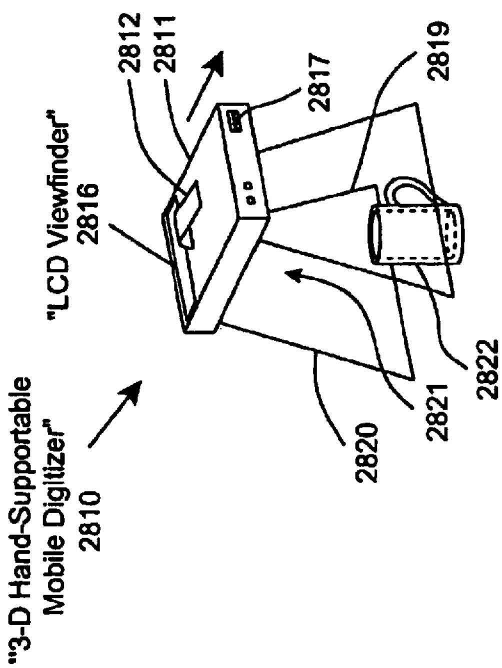
Figure 78A:
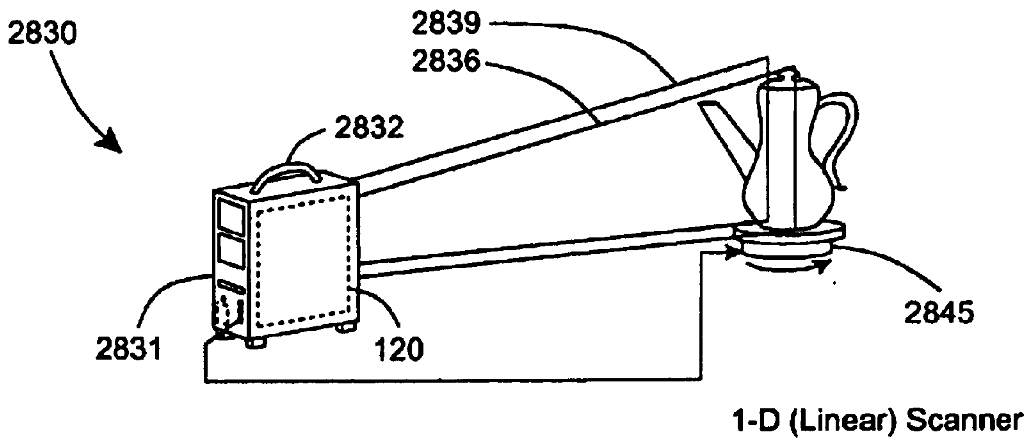
Figure 78B:
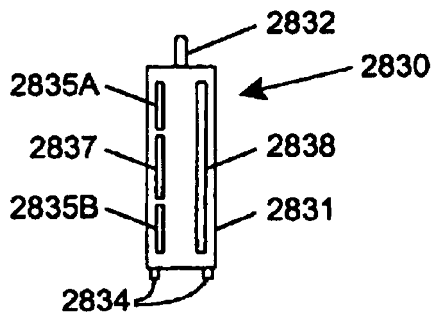
Figure 78C:
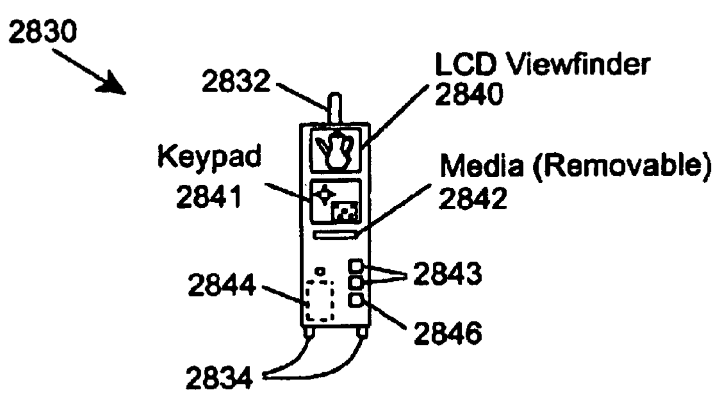
Figure 79A:
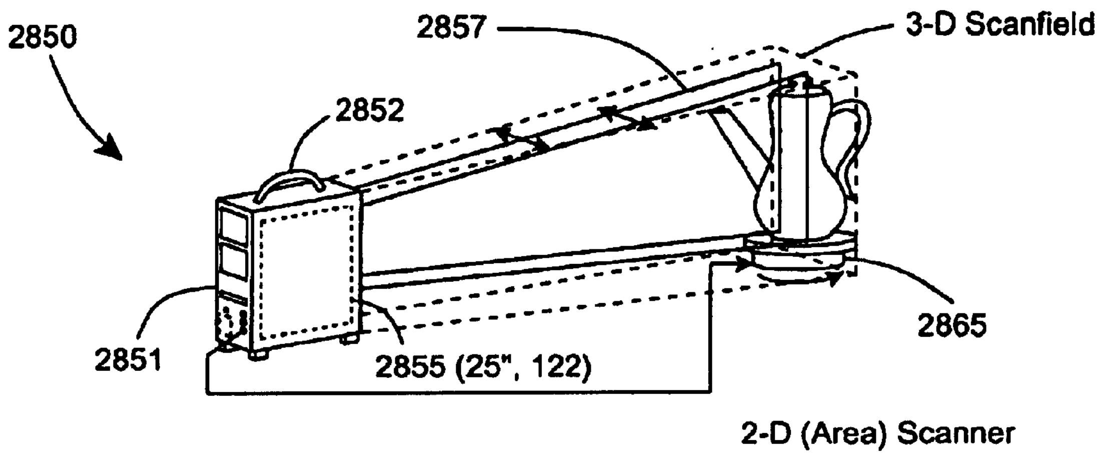
Figure 79B:
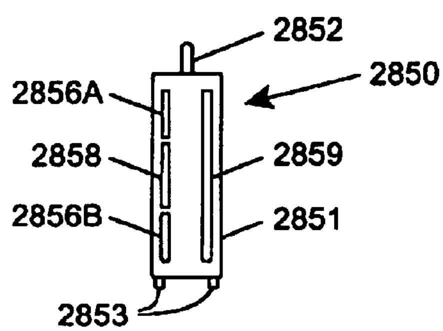
Figure 79C:
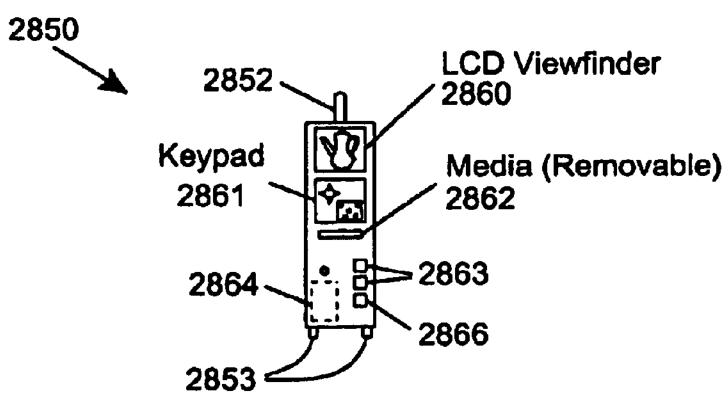
Figure 80:
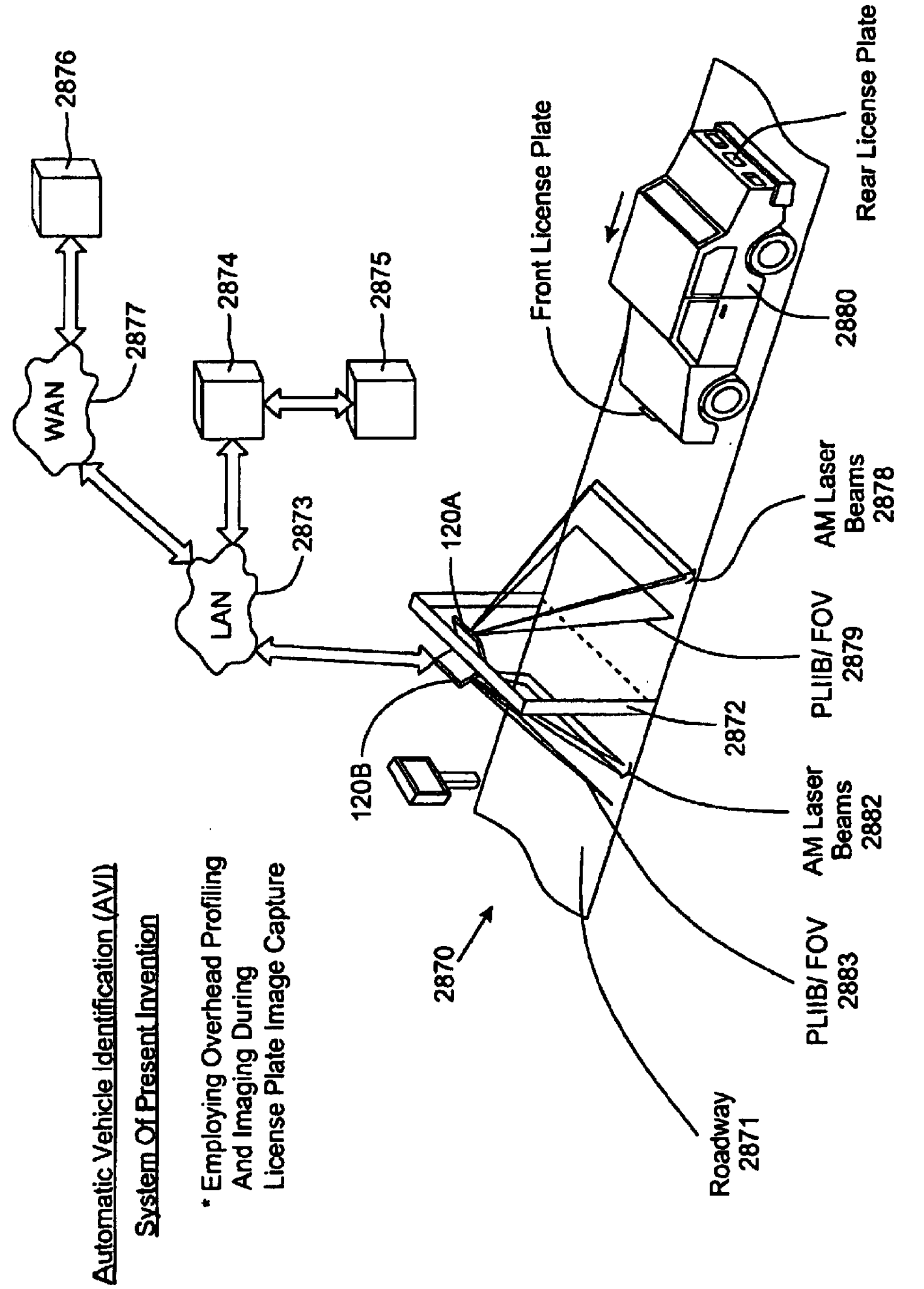
Figure 81A:
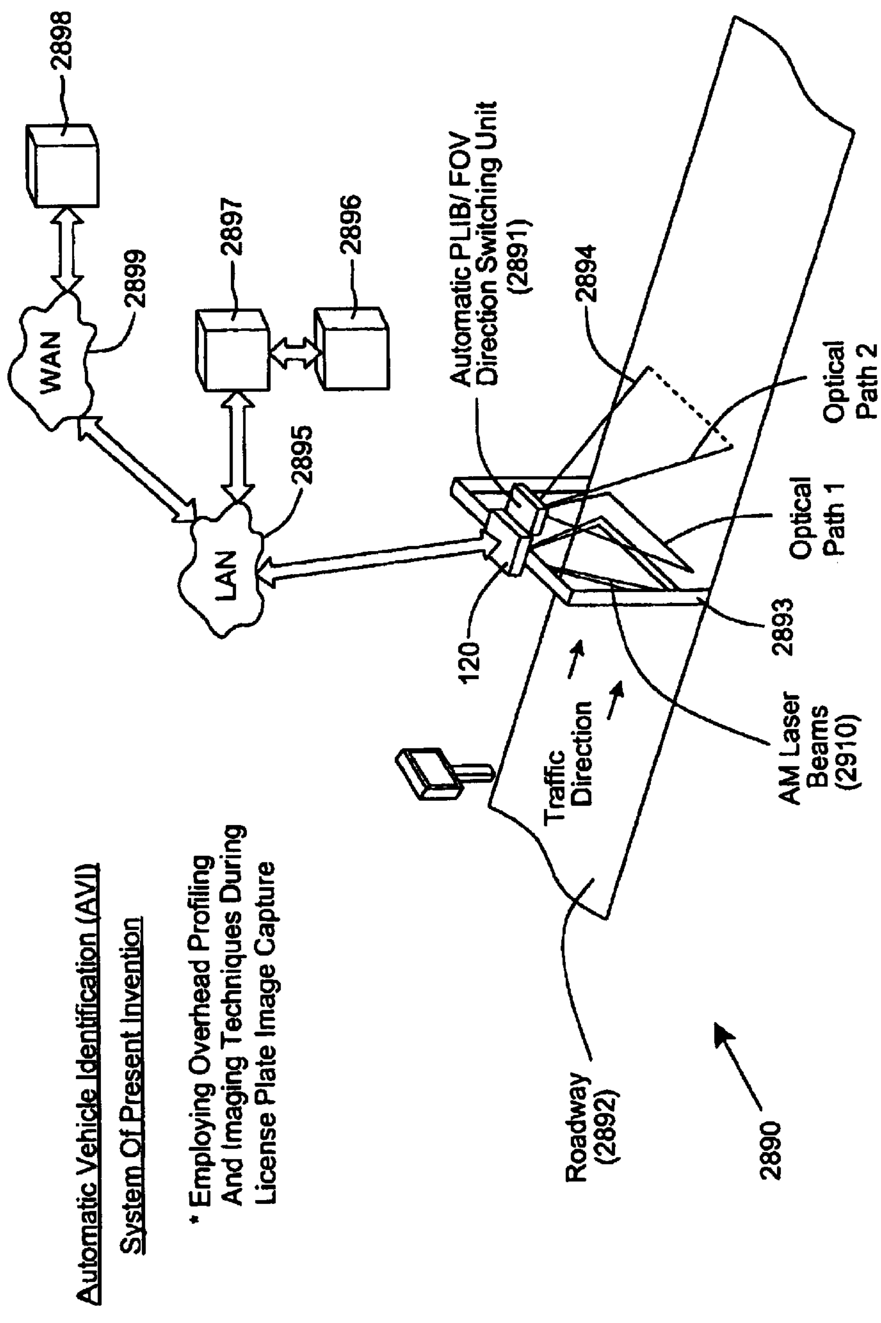
Figure 81B:
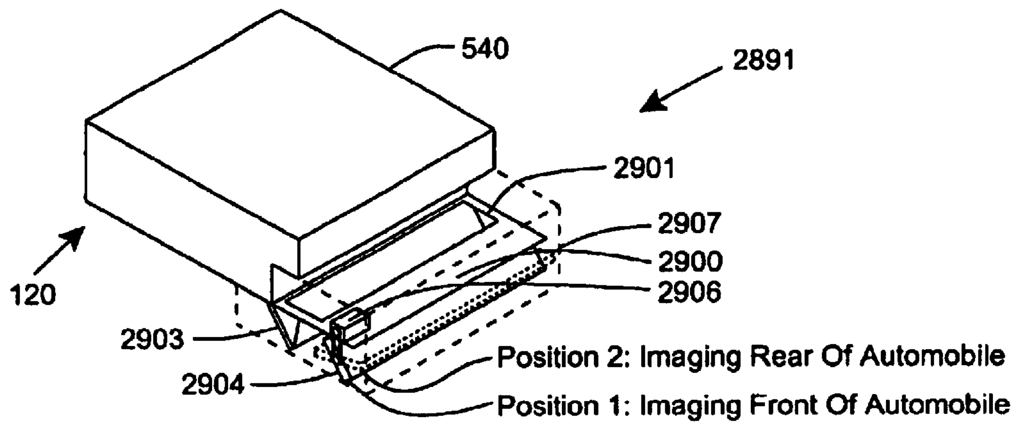
Figure 81C:
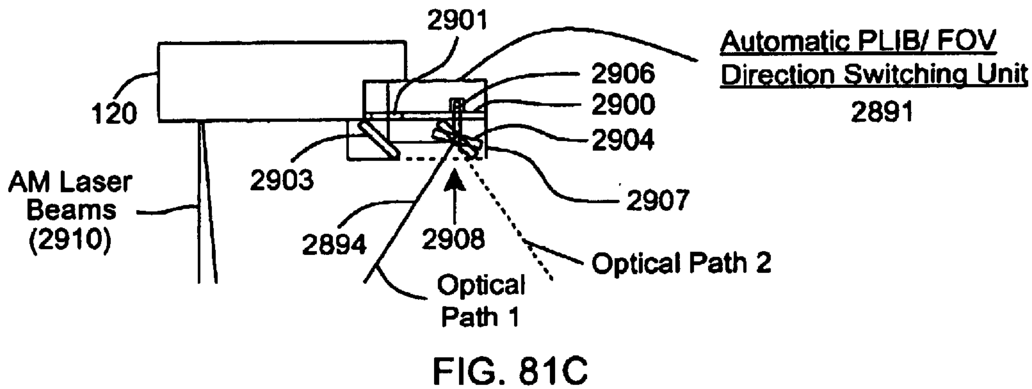
Figure 81D:
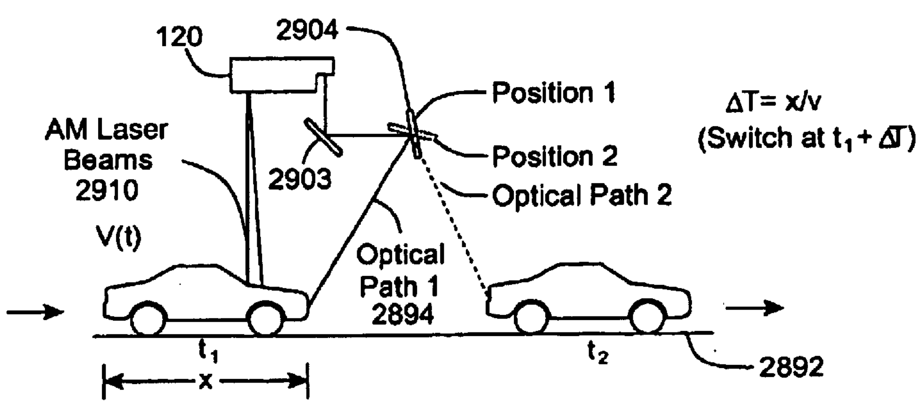
Figure 82:
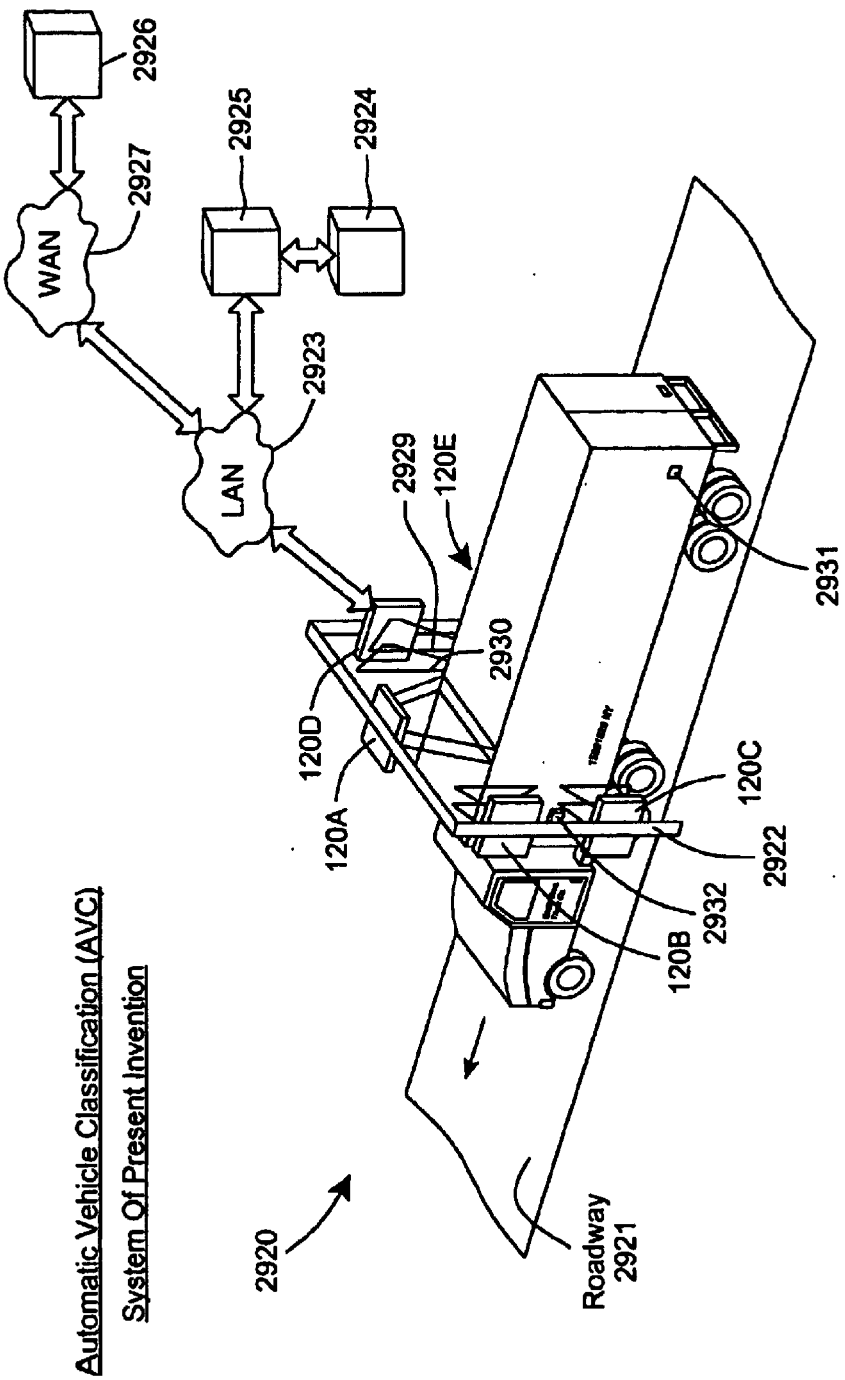
Figure 83:
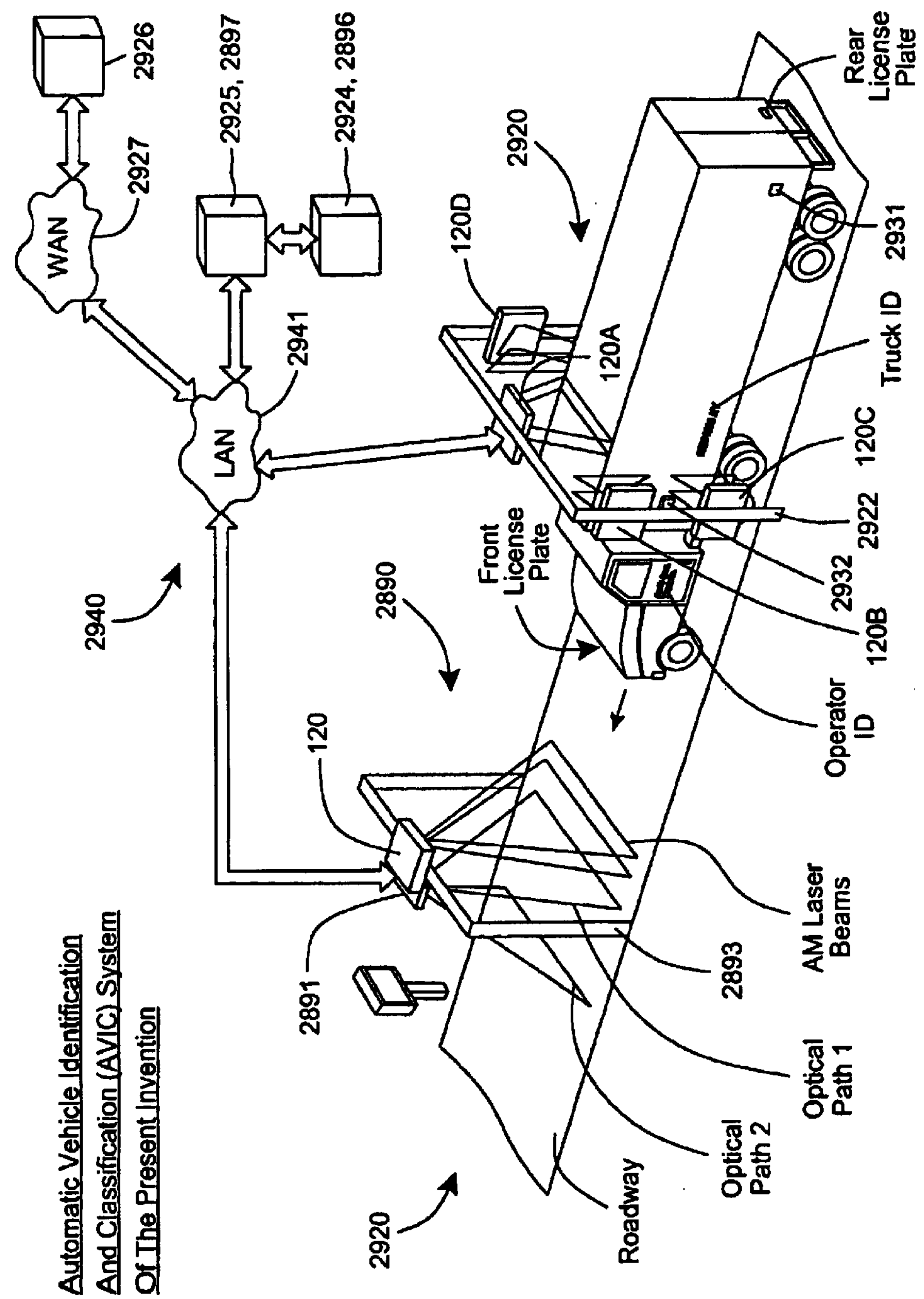
Figure 84A:
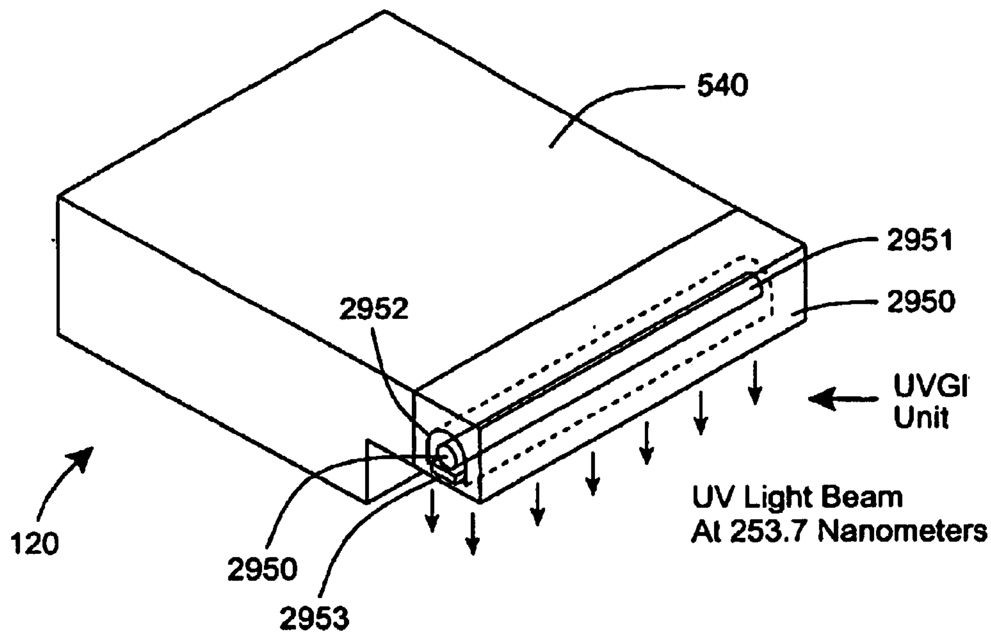
Figure 84B:
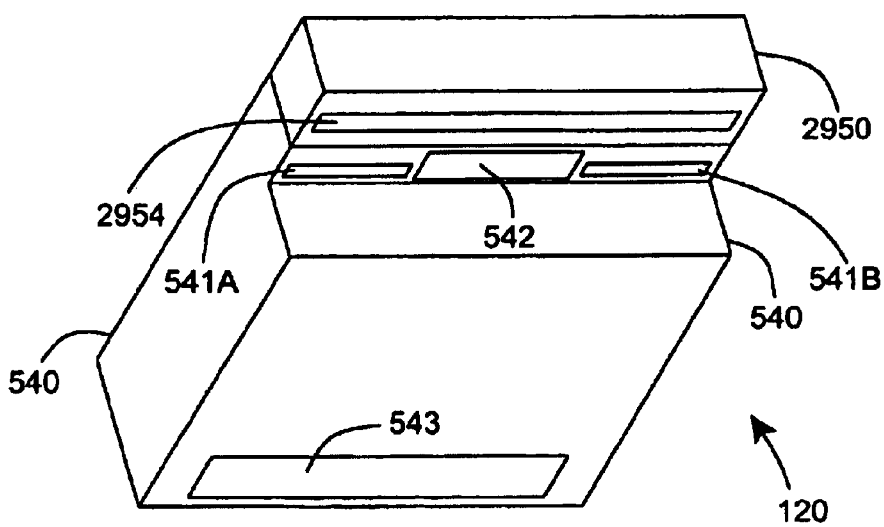

FIG. 3B2 is a schematic representation of the first illustrative embodiment of the PLIIM-based system shown in FIG. 3B1, wherein the linear image formation and detection module is shown comprising a linear array of photo-electronic detectors realized using CCD technology, and each planar laser illumination array is shown comprising an array of planar laser illumination modules;

FIG. 3C1 is a block schematic diagram of the PLIIM-based shown in FIG. 3B1, comprising a pair of planar laser illumination arrays, a linear image formation and detection module, an image frame grabber, an image data buffer, an image processing computer, and a camera control computer;

FIG. 3C2 is a schematic representation of the linear type image formation and detection (IFD) module employed in the PLIIM-based system shown in FIG. 3B1, wherein an imaging subsystem having a 3-D variable focal length imaging lens, a variable focal distance and a variable field of view is arranged on an optical bench, mounted within a compact module housing, and responsive to zoom and focus control signals generated by the camera control computer of the PLIIM-based system;

FIG. 3D1 is a schematic representation of a first illustrative implementation of the IFD camera subsystem contained in the image formation and detection (IFD) module employed in the PLIIM-based system of FIG. 3B1, shown comprising a stationary lens system mounted before a stationary linear image detection array, a first movable lens system for large stepped movements relative to the stationary lens system during image zooming operations, and a second movable lens system for smaller stepped movements relative to the first movable lens system and the stationary lens system during image focusing operations;

FIG. 3D2 is an perspective partial view of the second illustrative implementation of the camera subsystem shown in FIG. 3C2, wherein the first movable lens system is shown comprising an electrical rotary motor mounted to a camera body, an arm structure mounted to the shaft of the motor, a slidable lens mount (supporting a first lens group) slidably mounted to a rail structure, and a linkage member pivotally connected to the slidable lens mount and the free end of the arm structure so that, as the motor shaft rotates, the slidable lens mount moves along the optical axis of the imaging optics supported within the camera body, and wherein the linear CCD image sensor chip employed in the camera is rigidly mounted to the camera body of a PLIIM-based system via a novel image sensor mounting mechanism which prevents any significant misalignment between the field of view (FOV) of the image detection elements on the linear CCD (or CMOS) image sensor chip and the planar laser illumination beam (PLIB) produced by the PLIA used to illuminate the FOV thereof within the IFD module (i.e. camera subsystem);

FIG. 3D3 is an elevated side view of the camera subsystem shown in FIG. 3D2;

FIG. 3D4 is a first perspective view of sensor heat sinking structure and camera PC board subassembly shown disattached from the camera body of the IFD module of FIG. 3D2, showing the IC package of the linear CCD image detection array (i.e. image sensor chip) rigidly mounted to the heat sinking structure by a releasable image sensor chip fixture subassembly integrated with the heat sinking structure, preventing relative movement between the image sensor chip and the back plate of the heat sinking structure during thermal cycling, while the electrical connector pins of the image sensor chip are permitted to pass through four sets of apertures formed through the heat sinking structure and establish secure electrical connection with a matched electrical socket mounted on the camera PC board which, in turn, is mounted to the heat sinking structure in a manner which permits relative expansion and contraction between the camera PC board and heat sinking structure during thermal cycling;

FIG. 3D5 is a perspective view of the sensor heat sinking structure employed in the camera subsystem of FIG. 3D2, shown disattached from the camera body and camera PC board, to reveal the releasable image sensor chip fixture subassembly, including its chip fixture plates and spring-biased chip clamping pins, provided on the heat sinking structure of the present invention to prevent relative movement between the image sensor chip and the back plate of the heat sinking structure so that no significant misalignment will occur between the field of view (FOV) of the image detection elements on the image sensor chip and the planar laser illumination beam (PLIB) produced by the PLIA within the camera subsystem during thermal cycling;

FIG. 3D6 is a perspective view of the multi-layer camera PC board used in the camera subsystem of FIG. 3D2, shown disattached from the heat sinking structure and the camera body, and having an electrical socket adapted to receive the electrical connector pins of the image sensor chip which are passed through the four sets of apertures formed in the back plate of the heat sinking structure, while the image sensor chip package is rigidly fixed to the camera system body, via its heat sinking structure, in accordance with the principles of the present invention;

FIG. 3D7 is an elevated, partially cut-away side view of the camera subsystem of FIG. 3D2, showing that when the linear image sensor chip is mounted within the camera system in accordance with the principles of the present invention, the electrical connector pins of the image sensor chip are passed through the four sets of apertures formed in the back plate of the heat sinking structure, while the image sensor chip package is rigidly fixed to the camera system body, via its heat sinking structure, so that no significant relative movement between the image sensor chip and the heat sinking structure and camera body occurs during thermal cycling, thereby preventing any misalignment between the field of view (FOV) of the image detection elements on the image sensor chip and the planar laser illumination beam (PLIB) produced by the PLIA within the camera subsystem during planar laser illumination and imaging operations;

FIG. 3E1 is a schematic representation of the second illustrative embodiment of the PLIIM-based system of the present invention shown in FIG. 3A, shown comprising a linear image formation and detection module, a pair of planar laser illumination arrays, and a stationary field of view (FOV) folding mirror arranged in relation to the image formation and detection module such that the stationary field of view thereof is oriented in an imaging direction that is coplanar with the stationary plane of laser illumination produced by the planar laser illumination arrays, without using any planar laser illumination beam folding mirrors;

FIG. 3E2 is a block schematic diagram of the PLIIM-based system shown in FIG. 3E1, comprising a pair of planar illumination arrays, a linear image formation and detection module, a stationary field of view (FOV) folding mirror, an image frame grabber, an image data buffer, an image processing computer, and a camera control computer;

FIG. 3E3 is a schematic representation of the linear type image formation and detection module (IFDM) employed in the PLIIM-based system shown in FIG. 3E1, wherein an imaging subsystem having a variable focal length imaging lens, a variable focal distance and a variable field of view is arranged on an optical bench, mounted within a compact module housing, and responsive to zoom and focus control signals generated by the camera control computer of the PLIIM-based system;

FIG. 3E4 is a schematic representation of an exemplary realization of the PLIIM-based system of FIG. 3E1, shown comprising a compact housing, linear-type image formation and detection (i.e. camera) module, a pair of planar laser illumination arrays, and a field of view (FOV) folding mirror for folding the field of view of the image formation and detection module in a direction that is coplanar with the plane of composite laser illumination beam produced by the planar laser illumination arrays;

FIG. 3E5 is a plan view schematic representation of the PLIIM-based system of FIG. 3E4, taken along line 3E5—3E5 therein, showing the spatial extent of the field of view of the image formation and detection module in the illustrative embodiment of the present invention;

FIG. 3E6 is an elevated end view schematic representation of the PLIIM-based system of FIG. 3E4, taken along line 3E6—3E6 therein, showing the field of view of the linear image formation and detection module being folded in the downwardly imaging direction by the field of view folding mirror, and the planar laser illumination beam produced by each planar laser illumination module being directed in the imaging direction such that both the folded field of view and planar laser illumination beams are arranged in a substantially coplanar relationship during object illumination and imaging operations;

FIG. 3E7 is an elevated side view schematic representation of the PLIIM-based system of FIG. 3E4, taken along line 3E7—3E7 therein, showing the field of view of the linear image formation and detection module being folded in the downwardly imaging direction by the field of view folding mirror, and the planar laser illumination beam produced by each planar laser illumination module being directed along the imaging direction such that both the folded field of view and stationary planar laser illumination beams are arranged in a substantially coplanar relationship during object illumination and image detection operations;

FIG. 3E8 is an elevated side view of the PLIIM-based system of FIG. 3E4, showing the spatial limits of the variable field of view (FOV) of its linear image formation and detection module when controllably adjusted to image the tallest packages moving on a conveyor belt structure, as well as the spatial limits of the variable FOV of the linear image formation and detection module when controllably adjusted to image objects having height values close to the surface height of the conveyor belt structure;

FIG. 3F1 is a schematic representation of the third illustrative embodiment of the PLIIM-based system of the present invention shown in FIG. 3A, shown comprising a linear image formation and detection module having a field of view (FOV), a pair of planar laser illumination arrays for producing first and second stationary planar laser illumination beams, a pair of stationary planar laser illumination beam folding mirrors arranged relative to the planar laser illumination arrays so as to fold the stationary planar laser illumination beams produced by the pair of planar illumination arrays in an imaging direction that is coplanar with stationary field of view of the image formation and detection module during illumination and imaging operations;

FIG. 3F2 is a block schematic diagram of the PLIIM-based system shown in FIG. 3F1, comprising a pair of planar illumination arrays, a linear image formation and detection module, a pair of stationary planar laser illumination beam folding mirrors, an image frame grabber, an image data buffer, an image processing computer, and a camera control computer;

FIG. 3F3 is a schematic representation of the linear type image formation and detection (IFD) module employed in the PLIIM-based system shown in FIG. 3F1, wherein an imaging subsystem having a variable focal length imaging lens, a variable focal distance and a variable field of view is arranged on an optical bench, mounted within a compact module housing, and is responsive to zoom and focus control signals generated by the camera control computer of the PLIIM-based system during illumination and imaging operations;

FIG. 3G1 is a schematic representation of the fourth illustrative embodiment of the PLIIM-based system of the present invention shown in FIG. 3A, shown comprising a linear image formation and detection (i.e. camera) module having a field of view (FOV), a pair of planar laser illumination arrays for producing first and second stationary planar laser illumination beams, a stationary field of view (FOV) folding mirror for folding the field of view of the image formation and detection module, and a pair of stationary planar laser beam folding mirrors arranged so as to fold the optical paths of the first and second planar laser illumination beams such that stationary planes of first and second planar laser illumination beams are in an imaging direction which is coplanar with the field of view of the image formation and detection module during illumination and imaging operations;

FIG. 3G2 is a block schematic diagram of the PLIIM system shown in FIG. 3G1, comprising a pair of planar illumination arrays, a linear image formation and detection module, a stationary field of view (FOV) folding mirror, a pair of stationary planar laser illumination beam folding mirrors, an image frame grabber, an image data buffer, an image processing computer, and a camera control computer;

FIG. 3G3 is a schematic representation of the linear type image formation and detection module (IFDM) employed in the PLIIM-based system shown in FIG. 3G1, wherein an imaging subsystem having a variable focal length imaging lens, a variable focal distance and a variable field of view is arranged on an optical bench, mounted within a compact module housing, and responsive to zoom and focus control signals generated by the camera control computer of the PLIIM system during illumination and imaging operations;

FIG. 3H is a schematic representation of over-the-conveyor and side-of-conveyor belt package identification systems embodying the PLIIM-based system of FIG. 3A;

FIG. 3I is a schematic representation of a hand-supportable bar code symbol reading device embodying the PLIIM-based system of FIG. 3A;

FIG. 3J1 is a schematic representation of the sixth generalized embodiment of the PLIIM-based system of the present invention, wherein a pair of planar laser illumination arrays (PLIAs) are mounted on opposite sides of a linear image formation and detection (IFD) module having a variable focal length imaging lens, a variable focal distance and a variable field of view, so that the planar illumination arrays produce a plane of laser beam illumination which is disposed substantially coplanar with the field view of the image formation and detection module and synchronously moved therewith as the planar laser illumination beams are scanned across a 3-D region of space during object illumination and image detection operations;

FIG. 3J2 is a schematic representation of the first illustrative embodiment of the PLIIM-based system of the present invention shown in FIG. 3J1, shown comprising an image formation and detection module having a field of view (FOV), a pair of planar laser illumination arrays for producing first and second planar laser illumination beams, a field of view folding/sweeping mirror for folding and sweeping the field of view of the image formation and detection module, and a pair of planar laser beam folding/sweeping mirrors jointly movable with the FOV folding/sweeping mirror and arranged so as to fold the optical paths of the first and second planar laser illumination beams so that the field of view of the image formation and detection module is in an imaging direction that is coplanar with the planes of first and second planar laser illumination beams during illumination and imaging operations;

FIG. 3J3 is a block schematic diagram of the PLIIM-based system shown in FIGS. 3J1 and 3J2, comprising a pair of planar illumination arrays, a linear image formation and detection module, a field of view folding/sweeping mirror, a pair of planar laser illumination beam folding/sweeping mirrors, an image frame grabber, an image data buffer, an image processing computer, and a camera control computer;

FIG. 3J4 is a schematic representation of the linear type image formation and detection (IFD) module employed in the PLIIM-based system shown in FIGS. 3J1 and J2, wherein an imaging subsystem having a variable focal length imaging lens, a variable focal distance and a variable field of view is arranged on an optical bench, mounted within a compact module housing, and responsive to zoom and focus control signals generated by the camera control computer of the PLIIM system during illumination and imaging operations;

FIG. 3J5 is a schematic representation of a hand-held bar code symbol reading system embodying the PLIIM-based subsystem of FIG. 3J1;

FIG. 3J6 is a schematic representation of a presentation-type hold-under bar code symbol reading system embodying the PLIIM subsystem of FIG. 3J1;

FIG. 4A is a schematic representation of a seventh generalized embodiment of the PLIIM-based system of the present invention, wherein a pair of planar laser illumination arrays (PLIAs) are mounted on opposite sides of an area (i.e. 2-dimensional) type image formation and detection module (IFDM) having a fixed focal length camera lens, a fixed focal distance and fixed field of view projected through a 3-D scanning region, so that the planar laser illumination arrays produce a plane of laser illumination which is disposed substantially coplanar with sections of the field view of the image formation and detection module while the planar laser illumination beam is automatically scanned across the 3-D scanning region during object illumination and imaging operations carried out on a bar code symbol or other graphical indicia by the PLIIM-based system;

FIG. 4B1 is a schematic representation of the first illustrative embodiment of the PLIIM-based system of the present invention shown in FIG. 4A, shown comprising an area-type image formation and detection module having a field of view (FOV) projected through a 3-D scanning region, a pair of planar laser illumination arrays for producing first and second planar laser illumination beams, and a pair of planar laser beam folding/sweeping mirrors for folding and sweeping the planar laser illumination beams so that the optical paths of these planar laser illumination beams are oriented in an imaging direction that is coplanar with a section of the field of view of the image formation and detection module as the planar laser illumination beams are swept through the 3-D scanning region during object illumination and imaging operations;

FIG. 4B2 is a schematic representation of PLIIM-based system shown in FIG. 4B1, wherein the linear image formation and detection module is shown comprising an area (2-D) array of photo-electronic detectors realized using CCD technology, and each planar laser illumination array is shown comprising an array of planar laser illumination modules (PLIMs);

FIG. 4B3 is a block schematic diagram of the PLIIM-based system shown in FIG. 4B1, comprising a pair of planar illumination arrays, an area-type image formation and detection module, a pair of planar laser illumination beam (PLIB) sweeping mirrors, an image frame grabber, an image data buffer, an image processing computer, and a camera control computer;

FIG. 4C1 is a schematic representation of the second illustrative embodiment of the PLIIM system of the present invention shown in FIG. 4A, comprising a area image-type formation and detection module having a field of view (FOV), a pair of planar laser illumination arrays for producing first and second planar laser illumination beams, a stationary field of view folding mirror for folding and projecting the field of view through a 3-D scanning region, and a pair of planar laser beam folding/sweeping mirrors for folding and sweeping the planar laser illumination beams so that the optical paths of these planar laser illumination beams are oriented in an imaging direction that is coplanar with a section of the field of view of the image formation and detection module as the planar laser illumination beams are swept through the 3-D scanning region during object illumination and imaging operations;

FIG. 4C2 is a block schematic diagram of the PLIIM-based system shown in FIG. 4C1, comprising a pair of planar illumination arrays, an area-type image formation and detection module, a movable field of view folding mirror, a pair of planar laser illumination beam sweeping mirrors jointly or otherwise synchronously movable therewith, an image frame grabber, an image data buffer, an image processing computer, and a camera control computer;

FIG. 4D is a schematic representation of presentation-type holder-under bar code symbol reading system embodying the PLIIM-based subsystem of FIG. 4A;

FIG. 4E is a schematic representation of hand-supportable-type bar code symbol reading system embodying the PLIIM-based subsystem of FIG. 4A;

FIG. 5A is a schematic representation of an eighth generalized embodiment of the PLIIM-based system of the present invention, wherein a pair of planar laser illumination arrays (PLIAs) are mounted on opposite sides of an area (i.e. 2-D) type image formation and detection (IFD) module having a fixed focal length imaging lens, a variable focal distance and a fixed field of view (FOV) projected through a 3-D scanning region, so that the planar laser illumination arrays produce a plane of laser beam illumination which is disposed substantially coplanar with sections of the field view of the image formation and detection module as the planar laser illumination beams are automatically scanned through the 3-D scanning region during object illumination and image detection operations carried out on a bar code symbol or other graphical indicia by the PLIIM-based system;

FIG. 5B1 is a schematic representation of the first illustrative embodiment of the PLIIM-based system shown in FIG. 5A, shown comprising an image formation and detection module having a field of view (FOV) projected through a 3-D scanning region, a pair of planar laser illumination arrays for producing first and second planar laser illumination beams, and a pair of planar laser beam folding/sweeping mirrors for folding and sweeping the planar laser illumination beams so that the optical paths of these planar laser illumination beams are oriented in an imaging direction that is coplanar with a section of the field of view of the image formation and detection module as the planar laser illumination beams are swept through the 3-D scanning region during object illumination and imaging operations;

FIG. 5B2 is a schematic representation of the first illustrative embodiment of the PLIIM-based system shown in FIG. 5B1, wherein the linear image formation and detection module is shown comprising an area (2-D) array of photo-electronic detectors realized using CCD technology, and each planar laser illumination array is shown comprising an array of planar laser illumination modules;

FIG. 5B3 is a block schematic diagram of the PLIIM-based system shown in FIG. 5B1, comprising a short focal length imaging lens, a low-resolution image detection array and associated image frame grabber, a pair of planar laser illumination arrays, a high-resolution area-type image formation and detection module, a pair of planar laser beam folding/sweeping mirrors, an associated image frame grabber, an image data buffer, an image processing computer, and a camera control computer;

FIG. 5B4 is a schematic representation of the area-type image formation and detection (IFD) module employed in the PLIIM-based system shown in FIG. 5B1, wherein an imaging subsystem having a fixed length imaging lens, a variable focal distance and fixed field of view is arranged on an optical bench, mounted within a compact module housing, and responsive to focus control signals generated by the camera control computer of the PLIIM-based system during illumination and imaging operations;

FIG. 5C1 is a schematic representation of the second illustrative embodiment of the PLIIM-based system of the present invention shown in FIG. 5A, shown comprising an image formation and detection module, a stationary FOV folding mirror for folding and projecting the FOV through a 3-D scanning region, a pair of planar laser illumination arrays, and pair of planar laser beam folding/sweeping mirrors for folding and sweeping the planar laser illumination beams so that the optical paths of these planar laser illumination beams are oriented in an imaging direction that is coplanar with a section of the field of view of the image formation and detection module as the planar laser illumination beams are swept through the 3-D scanning region during object illumination and imaging operations;

FIG. 5C2 is a schematic representation of the second illustrative embodiment of the PLIM-based system shown in FIG. 5A, wherein the linear image formation and detection module is shown comprising an area (2-D) array of photo-electronic detectors realized using CCD technology, and each planar laser illumination array is shown comprising an array of planar laser illumination modules (PLIMs);

FIG. 5C3 is a block schematic diagram of the PLIIM-based system shown in FIG. 5C1, comprising a pair of planar laser illumination arrays, an area-type image formation and detection module, a stationary field of view (FOV) folding mirror, a pair of planar laser illumination beam folding and sweeping mirrors, an image frame grabber, an image data buffer, an image processing computer, and a camera control computer;

FIG. 5C4 is a schematic representation of the area-type image formation and detection (IFD) module employed in the PLIIM-based system shown in FIG. 5C1, wherein an imaging subsystem having a fixed length imaging lens, a variable focal distance and fixed field of view is arranged on an optical bench, mounted within a compact module housing, and responsive to focus control signals generated by the camera control computer of the PLIIM-based system during illumination and imaging operations;

FIG. 5D is a schematic representation of a presentation-type hold-under bar code symbol reading system embodying the PLIIM-based subsystem of FIG. 5A;

FIG. 6A is a schematic representation of a ninth generalized embodiment of the PLIIM-based system of the present invention, wherein a pair of planar laser illumination arrays (PLIAs) are mounted on opposite sides of an area type image formation and detection (IFD) module having a variable focal length imaging lens, a variable focal distance and variable field of view projected through a 3-D scanning region, so that the planar laser illumination arrays produce a plane of laser beam illumination which is disposed substantially coplanar with sections of the field view of the image formation and detection module as the planar laser illumination beams are automatically scanned through the 3-D scanning region during object illumination and image detection operations carried out on a bar code symbol or other graphical indicia by the PLIIM-based system;

FIG. 6B1 is a schematic representation of the first illustrative embodiment of the PLIIM-based system of the present invention shown in FIG. 6A, shown comprising an area-type image formation and detection module, a pair of planar laser illumination arrays for producing first and second planar laser illumination beams, a pair of planar laser illumination arrays for producing first and second planar laser illumination beams, and a pair of planar laser beam folding/sweeping mirrors for folding and sweeping the planar laser illumination beams so that the optical paths of these planar laser illumination beams are oriented in an imaging direction that is coplanar with a section of the field of view of the image formation and detection module as the planar laser illumination beams are swept through the 3-D scanning region during object illumination and imaging operations;

FIG. 6B2 is a schematic representation of a first illustrative embodiment of the PLIIM-based system shown in FIG. 6B1, wherein the area image formation and detection module is shown comprising an area array of photo-electronic detectors realized using CCD technology, and each planar laser illumination array is shown comprising an array of planar laser illumination modules;

FIG. 6B3 is a schematic representation of the first illustrative embodiment of the PLIIM-based system of the present invention shown in FIG. 6B1, shown comprising a pair of planar illumination arrays, an area-type image formation and detection module, a pair of planar laser beam folding/sweeping mirrors, an image frame grabber, an image data buffer, an image processing computer, and a camera control computer;

FIG. 6B4 is a schematic representation of the area-type (2-D) image formation and detection (IFD) module employed in the PLIIM-based system shown in FIG. 6B1, wherein an imaging subsystem having a variable length imaging lens, a variable focal distance and variable field of view is arranged on an optical bench, mounted within a compact module housing, and responsive to zoom and focus control signals generated by the camera control computer of the PLIIM-based system during illumination and imaging operations;

FIG. 6C1 is a schematic representation of the second illustrative embodiment of the PLIIM-based system of the present invention shown in FIG. 6A, shown comprising an area-type image formation and detection module, a stationary FOV folding mirror for folding and projecting the FOV through a 3-D scanning region, a pair of planar laser illumination arrays, and pair of planar laser beam folding/sweeping mirrors for folding and sweeping the planar laser illumination beams so that the optical paths of these planar laser illumination beams are oriented in an imaging direction that is coplanar with a section of the field of view of the image formation and detection module as the planar laser illumination beams are swept through the 3-D scanning region during object illumination and imaging operations;

FIG. 6C2 is a schematic representation of a second illustrative embodiment of the PLIIM-based system shown in FIG. 6C1, wherein the area-type image formation and detection module is shown comprising an area array of photo-electronic detectors realized using CCD technology, and each planar laser illumination array is shown comprising an array of planar laser illumination modules;

FIG. 6C3 is a schematic representation of the second illustrative embodiment of the PLIIM-based system of the present invention shown in FIG. 6C1, shown comprising a pair of planar laser illumination arrays, an area-type image formation and detection module, a stationary field of view (FOV) folding mirror, a pair of planar laser illumination beam folding and sweeping mirrors, an image frame grabber, an image data buffer, an image processing computer, and a camera control computer;

FIG. 6C4 is a schematic representation of the area-type image formation and detection (IFD) module employed in the PLIIM-based system shown in FIG. 5C1, wherein an imaging subsystem having a variable length imaging lens, a variable focal distance and variable field of view is arranged on an optical bench, mounted within a compact module housing, and responsive to zoom and focus control signals generated by the camera control computer of the PLIIM-based system during illumination and imaging operations;

FIG. 6C5 is a schematic representation of a presentation-type hold-under bar code symbol reading system embodying the PLIIM-based system of FIG. 6A;

FIG. 6D1 is a schematic representation of an exemplary realization of the PLIIM-based system of FIG. 6A, shown comprising an area-type image formation and detection module, a stationary field of view (FOV) folding mirror for folding and projecting the FOV through a 3-D scanning region, a pair of planar laser illumination arrays, and pair of planar laser beam folding/sweeping mirrors for folding and sweeping the planar laser illumination beams so that the optical paths of these planar laser illumination beams are oriented in an imaging direction that is coplanar with a section of the field of view of the image formation and detection module as the planar laser illumination beams are swept through the 3-D scanning region during object illumination and imaging operations;

FIG. 6D2 is a plan view schematic representation of the PLIIM-based system of FIG. 6D1, taken along line 6D2—6D2 in FIG. 6D1, showing the spatial extent of the field of view of the image formation and detection module in the illustrative embodiment of the present invention;

FIG. 6D3 is an elevated end view schematic representation of the PLIIM-based system of FIG. 6D1, taken along line 6D3—6D3 therein, showing the FOV of the area-type image formation and detection module being folded by the stationary FOV folding mirror and projected downwardly through a 3-D scanning region, and the planar laser illumination beams produced from the planar laser illumination arrays being folded and swept so that the optical paths of these planar laser illumination beams are oriented in a direction that is coplanar with a section of the FOV of the image formation and detection module as the planar laser illumination beams are swept through the 3-D scanning region during object illumination and imaging operations;

FIG. 6D4 is an elevated side view schematic representation of the PLIIM-based system of FIG. 6D1, taken along line 6D4—6D4 therein, showing the FOV of the area-type image formation and detection module being folded and projected downwardly through the 3-D scanning region, while the planar laser illumination beams are swept through the 3-D scanning region during object illumination and imaging operations;

FIG. 6D5 is an elevated side view of the PLIIM-based system of FIG. 6D1, showing the spatial limits of the variable field of view (FOV) provided by the area-type image formation and detection module when imaging the tallest package moving on a conveyor belt structure must be imaged, as well as the spatial limits of the FOV of the image formation and detection module when imaging objects having height values close to the surface height of the conveyor belt structure;

FIG. 6E1 is a schematic representation of a tenth generalized embodiment of the PLIIM-based system of the present invention, wherein a 3-D field of view and a pair of planar laser illumination beams are controllably steered about a 3-D scanning region;

FIG. 6E2 is a schematic representation of the PLIIM-based system shown in FIG. 6E1, shown comprising an area-type (2D) image formation and detection module, a pair of planar laser illumination arrays, a pair of x and y axis field of view (FOV) folding mirrors arranged in relation to the image formation and detection module, and a pair of planar laser illumination beam sweeping mirrors arranged in relation to the pair of planar laser beam illumination mirrors, such that the planes of laser illumination are coplanar with a planar section of the 3-D field of view of the image formation and detection module as the planar laser illumination beams are automatically scanned across a 3-D region of space during object illumination and image detection operations;

FIG. 6E3 is a schematic representation of the PLIIM-based system shown in FIG. 6E1, shown, comprising an area-type image formation and detection module, a pair of planar laser illumination arrays, a pair of x and y axis FOV folding mirrors arranged in relation to the image formation and detection module, and a pair planar laser illumination beam sweeping mirrors arranged in relation to the pair of planar laser beam illumination mirrors, an image frame grabber, an image data buffer, an image processing computer, and a camera control computer;

FIG. 6E4 is a schematic representation showing a portion of the PLIIM-based system in FIG. 6E1, wherein the 3-D field of view of the image formation and detection module is steered over the 3-D scanning region of the system using the x and y axis FOV folding mirrors, working in cooperation with the planar laser illumination beam folding mirrors which sweep the pair of planar laser illumination beams in accordance with the principles of the present invention;

FIG. 7A is a schematic representation of a first illustrative embodiment of the hybrid holographic/CCD PLIIM-based system of the present invention, wherein (i) a pair of planar laser illumination arrays are used to generate a composite planar laser illumination beam for illuminating a target object, (ii) a holographic-type cylindrical lens is used to collimate the rays of the planar laser illumination beam down onto the a conveyor belt surface, and (iii) a motor-driven holographic imaging disc, supporting a plurality of transmission-type volume holographic optical elements (HOE) having different focal lengths, is disposed before a linear (1-D) CCD image detection array, and functions as a variable-type imaging subsystem capable of detecting images of objects over a large range of object (i.e. working) distances while the planar laser illumination beam illuminates the target object;

FIG. 7B is an elevated side view of the hybrid holographic/CCD PLIIM-based system of FIG. 7A, showing the coplanar relationship between the planar laser illumination beam(s) produced by the planar laser illumination arrays of the PLIIM system, and the variable field of view (FOV) produced by the variable holographic-based focal length imaging subsystem of the PLIIM system;

FIG. 8A is a schematic representation of a second illustrative embodiment of the hybrid holographic/CCD PLIIM-based system of the present invention, wherein (i) a pair of planar laser illumination arrays are used to generate a composite planar laser illumination beam for illuminating a target object, (ii) a holographic-type cylindrical lens is used to collimate the rays of the planar laser illumination beam down onto the a conveyor belt surface, and (iii) a motor-driven holographic imaging disc, supporting a plurality of transmission-type volume holographic optical elements (HOE) having different focal lengths, is disposed before an area (2-D) type CCD image detection array, and functions as a variable-type imaging subsystem capable of detecting images of objects over a large range of object (i.e. working) distances while the planar laser illumination beam illuminates the target object;

FIG. 8B is an elevated side view of the hybrid holographic/CCD-based PLIIM-based system of FIG. 8A, showing the coplanar relationship between the planar laser illumination beam(s) produced by the planar laser illumination arrays of the PLIIM-based system, and the variable field of view (FOV) produced by the variable holographic-based focal length imaging subsystem of the PLIIM-based system;

FIG. 9 is a perspective view of a first illustrative embodiment of the unitary, intelligent, object identification and attribute acquisition of the present invention, wherein packages, arranged in a singulated or non-singulated configuration, are transported along a high-speed conveyor belt, detected and dimensioned by the LADAR-based imaging, detecting and dimensioning (LDIP) subsystem of the present invention, weighed by an electronic weighing scale, and identified by an automatic PLIIM-based bar code symbol reading system employing a 1-D (i.e. linear) type CCD scanning array, below which a variable focus imaging lens is mounted for imaging bar coded packages transported therebeneath in a fully automated manner;

FIG. 10 is a schematic block diagram illustrating the system architecture and subsystem components of the unitary object identification and attribute acquisition system of FIG. 9, shown comprising a LADAR-based package (i.e. object) imaging, detecting and dimensioning (LDIP) subsystem (i.e. including its integrated package velocity computation subsystem, package height/width/length profiling subsystem, the package (i.e. object) detection and tracking subsystem (comprising package-in-tunnel indication subsystem and a package-out-of-tunnel indication subsystem), a PLIIM-based (linear CCD) bar code symbol reading subsystem, data-element queuing, handling and processing subsystem, the input/output (unit) subsystem, an I/O port for a graphical user interface (GUI), network interface controller (for supporting networking protocols such as Ethernet, IP, etc.), all of which are integrated together as a fully working unit contained within a single housing of ultra-compact construction;

FIG. 10A is schematic representation of the Data-Element Queuing, Handling And Processing (Q, H & P) Subsystem employed in the PLIIM-based system of FIG. 10, illustrating that object identity data element inputs (e.g. from a bar code symbol reader, RFID reader, or the like) and object attribute data element inputs (e.g. object dimensions, weight, x-ray analysis, neutron beam analysis, and the like) are supplied to the Data Element Queuing, Handling, Processing And Linking Mechanism via the I/O unit so as to generate as output, for each object identity data element supplied as input, a combined data element comprising an object identity data element, and one or more object attribute data elements (e.g. object dimensions, object weight, x-ray analysis, neutron beam analysis, etc.) collected by the I/O unit of the system;

FIG. 10B is a tree structure representation illustrating the various object detection, tracking, identification and attribute-acquisition capabilities which may be imparted to the PLIIM-based system of FIG. 10 during system configuration, and also that at each of the three primary levels of the tree structure representation, the PLIIM-based system can use a system configuration wizard to assist in the specification of particular capabilities of the Data Element Queuing, Handling and Processing Subsystem thereof in response to answers provided during system configuration process;

FIG. 10C is a flow chart illustrating the steps involved in configuring the Data Element Queuing, Handling and Processing Subsystem of the present invention using the system configuration wizard schematically depicted in FIG. 10B;

FIG. 11 is a schematic representation of a portion of the unitary PLIIM-based object identification and attribute acquisition system of FIG. 9, showing in greater detail the interface between its PLIIM-based subsystem and LDIP subsystem, and the various information signals which are generated by the LDIP subsystem and provided to the camera control computer, and how the camera control computer generates digital camera control signals which are provided to the image formation and detection (i.e. camera) subsystem so that the unitary system can carry out its diverse functions in an integrated manner, including (1) capturing digital images having (i) square pixels (i.e. 1:1 aspect ratio) independent of package height or velocity, (ii) significantly reduced speckle-noise pattern levels, and (iii) constant image resolution measured in dots per inch (dpi) independent of package height or velocity and without the use of costly telecentric optics employed by prior art systems, (2) automatic cropping of captured images so that only regions of interest reflecting the package or package label are either transmitted to or processed by the image processing computer (using 1-D or 2-D bar code symbol decoding or optical character recognition (OCR) image processing algorithms), and (3) automatic image-lifting operations for supporting other package management operations carried out by the end-user;

FIG. 12A is a perspective view of the housing for the unitary object identification and attribute acquisition system of FIG. 9, showing the construction of its housing and the spatial arrangement of its two optically-isolated compartments, with all internal parts removed therefrom for purposes of illustration;

FIG. 12B is a first cross-sectional view of the unitary PLIIM-based object identification and attribute acquisition system of FIG. 9, showing the PLIIM-based subsystem and subsystem components contained within a first optically-isolated compartment formed in the upper deck of the unitary system housing, and the LDIP subsystem contained within a second optically-isolated compartment formed in the lower deck, below the first optically-isolated compartment;

FIG. 12C is a second cross-sectional view of the unitary object identification and attribute acquisition system of FIG. 9, showing the spatial layout of the various optical and electro-optical components mounted on the optical bench of the PLIIM-based subsystem installed within the first optically-isolated cavity of the system housing;

FIG. 12D is a third cross-sectional view of the unitary PLIIM-based object identification and attribute acquisition system of FIG. 9, showing the spatial layout of the various optical and electro-optical components mounted on the optical bench of the LDIP subsystem installed within the second optically-isolated cavity of the system housing;

FIG. 12E is a schematic representation of an illustrative implementation of the image formation and detection subsystem contained in the image formation and detection (IFD) module employed in the PLIIM-based system of FIG. 9, shown comprising a stationary lens system mounted before the stationary linear (CCD-type) image detection array, a first movable lens system for stepped movement relative to the stationary lens system during image zooming operations, and a second movable lens system for stepped movements relative to the first movable lens system and the stationary lens system during image focusing operations;

FIG. 13A is a first perspective view of an alternative housing design for use with the unitary PLIIM-based object identification and attribute acquisition subsystem of the present invention, wherein the housing has the same light transmission apertures provided in the housing design shown in FIGS. 12A and 12B, but has no housing panels disposed about the light transmission apertures through which PLIBs and the FOV of the PLIIM-based subsystem extend, thereby providing a region of space into which an optional device can be mounted for carrying out a speckle-pattern noise reduction solution in accordance with the principles of the present invention;

FIG. 13B is a second perspective view of the housing design shown in FIG. 13A;

FIG. 13C is a third perspective view of the housing design shown in FIG. 13A, showing the different sets of optically-isolated light transmission apertures formed in the underside surface of the housing;

FIG. 14 is a schematic representation of the unitary PLIIM-based object identification and attribute acquisition system of FIG. 13, showing the use of a "Real-Time" Package Height Profiling And Edge Detection Processing Module within the LDIP subsystem to automatically process raw data received by the LDIP subsystem and generate, as output, time-stamped data sets that are transmitted to a camera control computer which automatically processes the received time-stamped data sets and generates real-time camera control signals that drive the focus and zoom lens group translators within a high-speed auto-focus/auto-zoom digital camera subsystem so that the camera subsystem automatically captures digital images having (1) square pixels (i.e. 1:1 aspect ratio) independent of package height or velocity, (2) significantly reduced speckle-noise levels, and (3) constant image resolution measured in dots per inch (dpi) independent of package height or velocity;

FIG. 15 is a flow chart describing the primary data processing operations that are carried out by the Real-Time Package Height Profile And Edge Detection Processing Module within the LDIP subsystem employed in the PLIIM-based system shown in FIGS. 13 and 14, wherein each sampled row of raw range data collected by the LDIP subsystem is processed to produce a data set (i.e. containing data elements representative of the current time-stamp, the package height, the position of the left and right edges of the package edges, the coordinate subrange where height values exhibit maximum range intensity variation and the current package velocity) which is then transmitted to the camera control computer for processing and generation of real-time camera control signals that are transmitted to the auto-focus/auto-zoom digital camera subsystem;

FIG. 16 is a flow chart describing the primary data processing operations that are carried out by the Real-Time Package Edge Detection Processing Method performed by the Real-Time Package Height Profiling And Edge Detection Processing Module within the LDIP subsystem of PLIIM-based system shown in FIGS. 13 and 14;

FIG. 17 is a schematic representation of the LDIP Subsystem embodied in the unitary PLIIM-based subsystem of FIGS. 13 and 14, shown mounted above a conveyor belt structure;

FIG. 17A is a data structure used in the Real-Time Package Height Profiling Method of FIG. 15 to buffer sampled range intensity ($I_i$) and phase angle ($\phi_i$) data samples collected at various scan angles ($\alpha_I$) by LDIP Subsystem during each LDIP scan cycle and before application of coordinate transformations;

FIG. 17B is a data structure used in the Real-Time Package Edge Detection Method of FIG. 16, to buffer range ($R_i$) and polar angle ($\O_i$) dated samples collected at each scan angle ($\alpha_I$) by the LDIP Subsystem during each LDIP scan cycle, and before application of coordinate transformations;

FIG. 17C is a data structure used in the method of FIG. 15 to buffer package height ($y_i$) and position ($x_i$) data samples computed at each scan angle ($\alpha_I$) by the LDIP subsystem during each LDIP scan cycle, and after application of coordinate transformations;

FIGS. 18A, 18B-1 and 18B-2, taken together, set forth a real-time camera control process that is carried out within the camera control computer employed within the PLIIM-based systems of FIG. 11, wherein the camera control computer automatically processes the received time-stamped data sets and generates real-time camera control signals that drive the focus and zoom lens group translators within a high-speed auto-focus/auto-zoom digital camera subsystem (i.e. the IFD module) so that the camera subsystem automatically captures digital images having (1) square pixels (i.e. 1:1 aspect ratio) independent of package height or velocity, (2) significantly reduced speckle-noise levels, and (3) constant image resolution measured in dots per inch (DPI) independent of package height or velocity;

FIGS. 18C1 and 18C2, taken together, set forth a flow chart setting forth the steps of a method of computing the optical power which must be produced from each VLD in a PLIIM-based system, based on the computed speed of the conveyor belt above which the PLIIM-based is mounted, so that the control process carried out by the camera control computer in the PLIIM-based system captures digital images having a substantially uniform "white" level, regardless of conveyor belt speed, thereby simplifying image processing operations;

FIG. 18D is a flow chart illustrating the steps involved in computing the compensated line rate for correcting viewing-angle distortion occurring in images of object surfaces captured as object surfaces move past a linear-type PLIIM-based imager at a non-zero skewed angle;

FIG. 18E1 is a schematic representation of a linear PLIIM-based imager mounted over the surface of a conveyor belt structure, specifying the slope or surface gradient (i.e. skew angle θ) of a top surfaces of a transported package defined with respect to the top planar surface of the conveyor belt structure;

FIG. 18E2 is a schematic representation of a linear PLIIM-based imager mounted on the side of a conveyor belt structure, specifying the slope or surface gradient (i.e. angle ϕ) of the side surface of a transported package defined with respect to the edge of the conveyor belt structure;

FIG. 19 is a schematic representation of the Package Data Buffer structure employed by the Real-Time Package Height Profiling And Edge Detection Processing Module illustrated in FIG. 14, wherein each current raw data set received by the Real-Time Package Height Profiling And Edge Detection Processing Module is buffered in a row of the Package Data Buffer, and each data element in the raw data set is assigned a fixed column index and variable row index which increments as the raw data set is shifted one index unit as each new incoming raw data set is received into the Package Data Buffer;

FIG. 20, is a schematic representation of the Camera Pixel Data Buffer structure employed by the Auto-Focus/Auto-Zoom digital camera subsystem shown in FIG. 14, wherein each pixel element in each captured image frame is stored in a storage cell of the Camera Pixel Data Buffer, which is assigned a unique set of pixel indices (i,j);

FIG. 21 is a schematic representation of an exemplary Zoom and Focus Lens Group Position Look-Up Table associated with the Auto-Focus/Auto-Zoom digital camera subsystem used by the camera control computer of the illustrative embodiment, wherein for a given package height detected by the Real-Time Package Height Profiling And Edge Detection Processing Module, the camera control computer uses the Look-Up Table to determine the precise positions to which the focus and zoom lens groups must be moved by generating and supplying real-time camera control signals to the focus and zoom lens group translators within a high-speed auto-focus/auto-zoom digital camera subsystem (i.e. the IFD module) so that the camera subsystem automatically captures focused digital images having (1) square pixels,(i.e. 1:1 aspect ratio) independent of package height or velocity, (2) significantly reduced speckle-noise levels, and (3) constant image resolution measured in dots per inch (DPI) independent of package height or velocity;

FIG. 22A is a graphical representation of the focus and zoom lens movement characteristics associated with the zoom and lens groups employed in the illustrative embodiment of the Auto-focus/auto-zoom digital camera subsystem, wherein for a given detected package height, the position of the focus and zoom lens group relative to the camera's working distance is obtained by finding the points along these characteristics at the specified working distance (i.e. detected package height);

FIG. 22B is a schematic representation of an exemplary Photo-integration Time Period Look-Up Table associated with CCD image detection array employed in the auto-focus/auto-zoom digital camera subsystem of the PLIIM-based system, wherein for a given detected package height and package velocity the camera control computer uses the Look-Up Table to determine the precise photo-integration time period for the CCD image detection elements employed within the auto-focus/auto-zoom digital camera subsystem (i.e. the IFD module) so that the camera subsystem automatically captures focused digital images having (1) square pixels (i.e. 1:1 aspect ratio) independent of package height or velocity, (2) significantly reduced speckle-noise levels, and (3) constant image resolution measured in dots per inch (DPI) independent of package height or velocity;

FIG. 23A is a schematic representation of the PLIIM-based object identification and attribute acquisition system of FIGS. 9 through 22B, shown performing Steps 1 through Step 5 of the novel method of graphical intelligence recognition taught in FIGS. 23C1 through 23C, whereby graphical intelligence (e.g. symbol character strings and/or bar code symbols) embodied or contained in 2-D images captured from arbitrary 3-D surfaces on a moving target object is automatically recognized by processing high-resolution 3-D images of the object that have been constructed from linear 3-D surface profile maps captured by the LDIP subsystem in the PLIIM-based profiling and imaging system, and high-resolution linear images captured by the PLIIM-based linear imaging subsystem thereof;

FIG. 23B is a schematic representation of the process of geometrical modeling of arbitrary moving 3-D object surfaces, carried out in an image processing computer associated with the PLIIM-based object identification and attribute acquisition system shown in FIG. 23A, wherein pixel rays emanating from high-resolution linear images are projected in 3-D space and the points of intersection between these pixel rays and a 3-D polygon-mesh model of the moving target object are computed, and these computed points of intersection used to produce a high-resolution 3-D image of the target object;

FIG. 23C1 through 23C5, taken together, set forth a flow chart illustrating the steps involved in carrying out the novel method of graphical intelligence recognition of the present invention, depicted in FIGS. 23A and 23B;

FIG. 24 is a perspective view of a unitary, intelligent, object identification and attribute acquisition system constructed in accordance with the second illustrated embodiment of the present invention, wherein packages, arranged in a non-singulated or singulated configuration, are transported along a high speed conveyor belt, detected and dimensioned by the LADAR-based imaging, detecting and dimensioning (LDIP) subsystem of the present invention, weighed by a weighing scale, and identified by an automatic PLIIM-based bar code symbol reading system employing a 2-D (i.e. area) type CCD-based scanning array below which a light focusing lens is mounted for imaging bar coded packages transported therebeneath and decode processing these images to read such bar code symbols in a fully automated manner;

FIG. 25 is a schematic block diagram illustrating the system architecture and subsystem components of the unitary package (i.e. object) identification and dimensioning system shown in FIG. 24, namely its LADAR-based package (i.e. object) imaging, detecting and dimensioning (LDIP) subsystem (with its integrated package velocity computation subsystem, package height/width/length profiling subsystem, and package (i.e. object) detection and tracking (comprising a package-in-tunnel indication subsystem and the package-out-of-tunnel indication subsystem), the PLIIM-based (linear CCD) bar code symbol reading subsystem, the data-element queuing, handling and processing subsystem, the input/output subsystem, an I/O port for a graphical user interface (GUI), and a network interface controller (for supporting networking protocols such as Ethernet, IP, etc.), all of which are integrated together as a working unit contained within a single housing of ultra-compact construction;

FIG. 25A is schematic representation of the Data-Element Queuing, Handling And Processing (Q, H & P) Subsystem employed in the PLIIM-based system of FIG. 25, illustrating that object identity data element inputs (e.g. from a bar code symbol reader, RFID reader, or the like) and object attribute data element inputs (e.g. object dimensions, weight, x-ray analysis, neutron beam analysis, and the like) are supplied to the Data Element Queuing, Handling, Processing And Linking Mechanism via the I/O unit so as to generate as output, for each object identity data element supplied as input, a combined data element comprising an object identity data element, and one or more object attribute data elements (e.g. object dimensions, object weight, x-ray analysis, neutron beam analysis, etc.) collected by the I/O unit of the system;

FIG. 25B is a tree structure representation illustrating the various object detection, tracking, identification and attribute-acquisition capabilities which may be imparted to the object identification and attribute acquisition system of FIG. 25 during system configuration, and also that at each of the three primary levels of the tree structure representation, the system can use its novel application programming interface (API), as a system configuration programming wizard, to assist in the specification of system capabilities and subsequent programming of the Data Element Queuing, Handling and Processing Subsystem thereof to enable the same;

FIG. 25C is a flow chart illustrating the steps involved in configuring the Data Element Queuing, Handling and Processing Subsystem of the present invention using the system configuration programming wizard schematically depicted in FIG. 25B;

FIG. 26 is a schematic representation of a portion of the unitary object identification and attribute acquisition system of FIG. 24 showing in greater detail the interface between its PLIIM-based subsystem and LDIP subsystem, and the various information signals which are generated by the LDIP subsystem and provided to the camera control computer, and how the camera control computer generates digital camera control signals which are provided to the image formation and detection (IFD) subsystem (i.e. "camera") so that the unitary system can carry out its diverse functions in an integrated manner, including (1) capturing digital images having (i) square pixels (i.e. 1:1 aspect ratio) independent of package height or velocity, (ii) significantly reduced speckle-noise pattern levels, and (iii) constant image resolution measured in dots per inch (DPI) independent of package height or velocity and without the use of costly telecentric optics employed by prior art systems, (2) automatic cropping of captured images so that only regions of interest reflecting the package or package label are transmitted to the image processing computer (for 1-D or 2-D bar code symbol decoding or optical character recognition (OCR) image processing), and (3) automatic image-lifting operations for supporting other package management operations carried out by the end-user;

FIG. 27 is a schematic representation of the four-sided tunnel-type object identification and attribute acquisition (PID) system constructed by arranging about a high-speed package conveyor belt subsystem, one PLIIM-based PID unit (as shown in FIG. 9) and three modified PLIIM-based PID units (without the LDIP Subsystem), wherein the LDIP subsystem in the top PID unit is configured as the master unit to detect and dimension packages transported along the belt, while the bottom PID unit is configured as a slave unit to view packages through a small gap between conveyor belt sections and the side PID units are configured as slave units to view packages from side angles slightly downstream from the master unit, and wherein all of the PID units are operably connected to an Ethernet control hub (e.g. contained within one of the slave units) of a local area network (LAN) providing high-speed data packet communication among each of the units within the tunnel system;

FIG. 28 is a schematic system diagram of the tunnel-type system shown in FIG. 27, embedded within a first-type LAN having an Ethernet control hub (e.g. contained within one of the slave units);

FIG. 29 is a schematic system diagram of the tunnel-type system shown in FIG. 27, embedded within a second-type LAN having an Ethernet control hub and an Ethernet data switch (e.g. contained within one of the slave units), and a fiber-optic (FO) based network, to which a keying-type computer workstation is connected at a remote distance within a package counting facility;

FIGS. 30-1 through 30-4, taken together, set forth a schematic representation of the camera-based object identification and attribute acquisition subsystem of FIG. 27, illustrating the system architecture of the slave units in relation to the master unit, and that (1) the package height, width, and length coordinates data and velocity data elements (computed by the LDIP subsystem within the master unit) are produced by the master unit and defined with respect to the global coordinate reference system, and (2) these package dimension data elements are transmitted to each slave unit on the data communication network, converted into the package height, width, and length coordinates, and used to generate real-time camera control signals which intelligently drive the camera subsystem within each slave unit, and (3) the package identification data elements generated by any one of the slave units are automatically transmitted to the master slave unit for time-stamping, queuing, and processing to ensure accurate package dimension and identification data element linking operations in accordance with the principles of the present invention;

FIG. 30A is a schematic representation of the Internet-based remote monitoring, configuration and service (RMCS) system and method of the present invention which is capable of monitoring, configuring and servicing PLIIM-based networks, systems and subsystems of the present invention using an Internet-based client computing subsystem;

FIG. 30B is a table listing parameters associated with a PLIIM-based network of the present invention and the systems and subsystems embodied therein which can be remotely monitored, configured and managed using the RMCS system and method illustrated in FIG. 30A;

FIG. 30C is a table listing network and system configuration parameters employed in the tunnel-based LAN system shown in FIG. 30B, and monitorable and/or configurable parameters in each of the subsystems within the system of the tunnel-based LAN system;

FIGS. 30D1 and 30D2, taken together, set forth a flow chart illustrating the steps involved in the RMCS method of the illustrative embodiment carried out over the infrastructure of the Internet using an Internet-based client computing machine;

FIG. 31 is a schematic representation of the tunnel-type system of FIG. 27, illustrating that package dimension data (i.e. height, width, and length coordinates) is (i) centrally computed by the master unit and referenced to a global coordinate reference frame, (ii) transmitted over the data network to each slave unit within the system, and (iii) converted to the local coordinate reference frame of each slave unit for use by its camera control computer to drive its automatic zoom and focus imaging optics in an intelligent, real-time manner in accordance with the principles of the present invention;

FIG. 31A is a schematic representation of one of the slave units in the tunnel system of FIG. 31, showing the angle measurement (i.e. protractor) devices of the present invention integrated into the housing and support structure of each slave unit, thereby enabling technicians to measure the pitch and yaw angle of the local coordinate system symbolically embedded within each slave unit;

FIGS. 32A and 32B, taken together, provide a high-level flow chart describing the primary steps involved in carrying out the novel method of controlling local vision-based camera subsystems deployed within a tunnel-based system, using real-time package dimension data centrally computed with respect to a global/central coordinate frame of reference, and distributed to local package identification units over a high-speed data communication network;

FIG. 33A is a schematic representation of a first illustrative embodiment of the bioptical PLIIM-based product dimensioning, analysis and identification system of the present invention, comprising a pair of PLIIM-based object identification and attribute acquisition subsystems, wherein each PLIIM-based subsystem employs visible laser diodes (VLDs) having different color producing wavelengths to produce a multi-spectral planar laser illumination beam (PLIB), and a 1-D (linear-type) CCD image detection array within the compact system housing to capture images of objects (e.g. produce) that are processed in order to determine the shape/geometry, dimensions and color of such products in diverse retail shopping environments;

FIG. 33B is a schematic representation of the bioptical PLIIM-based product dimensioning, analysis and identification system of FIG. 33A, showing its PLIIM-based subsystems and 2-D scanning volume in greater detail;

FIGS. 33C1 and 33C2, taken together, set forth a system block diagram illustrating the system architecture of the bioptical PLIIM-based product dimensioning, analysis and identification system of the first illustrative embodiment shown in FIGS. 33A and 33B;

FIG. 34A is a schematic representation of a second illustrative embodiment of the bioptical PLIIM-based product dimensioning, analysis and identification system of the present invention, comprising a pair of PLIIM-based object identification and attribute acquisition subsystems, wherein each PLIIM-based subsystem employs visible laser diodes (VLDs) having different color producing wavelengths to produce a multi-spectral planar laser illumination beam (PLIB), and a 2-D (area-type) CCD image detection array within the compact system housing to capture images of objects (e.g. produce) that are processed in order to determine the shape/geometry, dimensions and color of such products in diverse retail shopping environments;

FIG. 34B is a schematic representation of the bioptical PLIIM-based product dimensioning, analysis and identification system of FIG. 34A, showing its PLIIM-based subsystems and 3-D scanning volume in greater detail;

FIG. 34C is a system block diagram illustrating the system architecture of the bioptical PLIIM-based product dimensioning, analysis and identification system of the second illustrative embodiment shown in FIGS. 34A and 34B;

FIG. 35A is a first perspective view of the planar laser illumination module (PLIM) realized on a semiconductor chip, wherein a micro-sized (diffractive or refractive) cylindrical lens array is mounted upon a linear array of surface emitting lasers (SELs) fabricated on a semiconductor substrate, and encased within an integrated circuit (IC) package, so as to produce a planar laser illumination beam (PLIB) composed of numerous (e.g. 100–400) spatially incoherent laser beam components emitted from said linear array of SELs in accordance with the principles of the present invention;

FIG. 35B is a second perspective view of an illustrative embodiment of the PLIM semiconductor chip of FIG. 35A, showing its semiconductor package provided with electrical connector pins and an elongated light transmission window, through which a planar laser illumination beam is generated and transmitted in accordance with the principles of the present invention;

FIG. 36A is a cross-sectional schematic representation of the PLIM-based semiconductor chip of the present invention, constructed from "45 degree mirror" surface emitting lasers (SELs);

FIG. 36B is a cross-sectional schematic representation of the PLIM-based semiconductor chip of the present invention, constructed from "grating-coupled" SELs;

FIG. 36C is a cross-sectional schematic representation of the PLIM-based semiconductor chip of the present invention, constructed from "vertical cavity" SELs, or VCSELs;

FIG. 37 is a schematic perspective view of a planar laser illumination and imaging module (PLIIM) of the present invention realized on a semiconductor chip, wherein a pair of micro-sized (diffractive or refractive) cylindrical lens arrays are mounted upon a pair of linear arrays of surface emitting lasers (SELs) (of corresponding length characteristics) fabricated on opposite sides of a linear CCD image detection array, and wherein both the linear CCD image detection array and linear SEL arrays are formed a common semiconductor substrate, encased within an integrated circuit (IC) package, and collectively produce a composite planar laser illumination beam (PLIB) that is transmitted through a pair of light transmission windows formed in the IC package and aligned substantially within the planar field of view (FOV) provided by the linear CCD image detection array in accordance with the principles of the present invention;

FIG. 38A is a schematic representation of a CCD/VLD PLIIM-based semiconductor chip of the present invention, wherein a plurality of electronically-activatable linear SEL arrays are used to electro-optically scan (i.e. illuminate) the entire 3-D FOV of CCD image detection array contained within the same integrated circuit package, without using mechanical scanning mechanisms;

FIG. 38B is a schematic representation of the CCD/VLD PLIIM-based semiconductor chip of FIG. 38A, showing a 2D array of surface emitting lasers (SELs) formed about an area-type CCD image detection array on a common semiconductor substrate, with a field of view (FOV) defining lens element mounted over the 2D CCD image detection array and a 2D array of cylindrical lens elements mounted over the 2D array of SELs;

FIG. 39A is a perspective view of a first illustrative embodiment of the PLIIM-based hand-supportable linear imager of the present invention which contains within its housing, (1) a PLIIM-based image capture and processing engine comprising a dual-VLD PLIA and a 1-D (i.e. linear) image detection array with vertically-elongated image detection elements and configured within an optical assembly that operates in accordance with the first generalized method of speckle-pattern noise reduction illustrated in FIGS. 1I1A through 1I3D, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 39B is an exploded perspective view of the PLIIM-based image capture and processing engine employed in the hand-supportable linear imager of FIG. 39A, showing its PLIAs, IFD module (i.e. camera subsystem) and associated optical components mounted on an optical-bench/multi-layer PC board, for containment between the upper and lower portions of the engine housing;

FIG. 39C is a plan view of the optical-bench/multi-layer PC board contained within the PLIIM-based image capture and processing engine of FIG. 39B, showing the field of view of the IFD module in a spatially-overlapping coplanar relation with respect to the PLIBs generated by the PLIAs employed therein;

FIG. 39D is an elevated front view of the PLIIM-based image capture and processing engine of FIG. 39B, showing the PLIAs mounted on opposite sides of its IFD module;

FIG. 39E is an elevated side view of the PLIIM-based image capture and processing engine of FIG. 39B, showing the field of view of its IFD module spatially-overlapping and coextensive (i.e. coplanar) with the PLIBs generated by the PLIAs employed therein;

FIG. 40A1 is a block schematic diagram of a manually-activated version of the PLIIM-based hand-supportable linear imager of FIG. 39A, shown configured with (i) a linear-type image formation and detection (IFD) module having a linear image detection array with vertically-elongated image detection elements and fixed focal length/fixed focal distance image formation optics, (ii) a manually-actuated trigger switch for manually activating the planar laser illumination array (driven by a set of VLD driver circuits), the linear-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager;

FIG. 40A2 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and fixed focal length/fixed focal distance image formation optics, (ii) an IR-based object detection subsystem within its hand-supportable housing for automatically activating in response to the detection of an object in its IR-based object detection field, the planar laser illumination arrays (driven by a set of VLD driver circuits), the linear-type image formation and detection (IFD) module, as well as the image frame grabber, the image data buffer, and the image processing computer, via the camera control computer, (ii) a manually-activatable switch for enabling transmission of symbol character data to a host computer system in response to the decoding a bar code symbol within a captured image frame, and (iii) a LCD display panel and a data entry keypad for supporting diverse types of transactions using the PLIIM-based hand-supportable imager;

FIG. 40A3 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and fixed focal length/fixed focal distance image formation optics, (ii) a laser-based object detection subsystem within its hand-supportable housing for automatically activating the planar laser illumination arrays into a full-power mode of operation, the linear-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager;

FIG. 40A4 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and fixed focal length/fixed focal distance image formation optics, (ii) an ambient-light driven object detection subsystem within its hand-supportable housing for automatically activating the planar laser illumination arrays (driven by a set of VLD driver circuits), the linear-type image formation and detection (IFD) module, the image frame grabber, the image data buffer, and the image processing computer, via the camera control computer, in response to the automatic detection of an object via ambient-light detected by object detection field enabled by the CCD image sensor within the IFD module, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager;

FIG. 40A5 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and fixed focal length/fixed focal distance image formation optics, (ii) an automatic bar code symbol detection subsystem within its hand-supportable housing for automatically activating the image processing computer for decode-processing in response to the automatic detection of an bar code symbol within its bar code symbol detection field enabled by the CCD image sensor within the IFD module, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager;

FIG. 40B1 is a block schematic diagram of a manually-activated version of the PLIIM-based hand-supportable linear imager of FIG. 39A, shown configured with (i) a linear-type image formation and detection (IFD) module having a linear image detection array with vertically-elongated image detection elements and fixed focal length/variable focal distance image formation optics, (ii) a manually-actuated trigger switch for manually activating the planar laser illumination array (driven by a set of VLD driver circuits), the linear-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager;

FIG. 40B2 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and fixed focal length/variable focal distance image formation optics, (ii) an IR-based object detection subsystem within its hand-supportable housing for automatically activating in response to the detection of an object in its IR-based object detection field, the planar laser illumination array (driven by a set of VLD driver circuits), the linear-type image formation and detection (IFD) module, as well as the image frame grabber, the image data buffer, and the image processing computer, via the camera control computer, (iii) a manually-activatable switch for enabling transmission of symbol character data to a host computer system in response decoding a bar code symbol within a captured image frame, and (iv) a LCD display panel and a data entry keypad for supporting diverse types of transactions using the PLIIM-based hand-supportable imager;

FIG. 40B3 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and fixed focal length/variable focal distance image formation optics, (ii) a laser-based object detection subsystem within its hand-supportable housing for automatically activating the planar laser illumination array into a full-power mode of operation, the linear-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager;

FIG. 40B4 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and fixed focal length/variable focal distance image formation optics, (ii) an ambient-light driven object detection subsystem within its hand-supportable housing for automatically activating the planar laser illumination array (driven by a set of VLD driver circuits), the linear-type image formation and detection (IFD) module, the image frame grabber, the image data buffer, and the image processing computer, via the camera control computer, in response to the automatic detection of an object via ambient-light detected by object detection field enabled by the CCD image sensor within the IFD module, and (iii) a manually-activatable switch for enabling transmission of symbol character data to a host computer system in response to decoding a bar code symbol within a captured image frame;

FIG. 40B5 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and fixed focal length/variable focal distance image formation optics, (ii) an automatic bar code symbol detection subsystem within its hand-supportable housing for automatically activating the image processing computer for decode-processing in response to the automatic detection of an bar code symbol within its bar code symbol detection field enabled by the CCD image sensor within the IFD module, (iii) a manually-activatable switch for enabling transmission of symbol character data to a host computer system in response to the decoding a bar code symbol within a captured image frame, and (iv) a LCD display panel and a data entry keypad for supporting diverse types of transactions using the PLIIM-based hand-supportable imager;

FIG. 40C1 is a block schematic diagram of a manually-activated version of the PLIIM-based hand-supportable linear imager of FIG. 39A, shown configured with (i) a linear-type image formation and detection (IFD) module having a linear image detection array with vertically-elongated image detection elements and variable focal length/variable focal distance image formation optics, (ii) a manually-actuated trigger switch for manually activating the planar laser illumination array (driven by a set of VLD driver circuits), the linear-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager;

FIG. 40C2 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and variable focal length/variable focal distance image formation optics, (ii) an IR-based object detection subsystem within its hand-supportable housing for automatically activating upon detection of an object in its IR-based object detection field, the planar laser illumination array (driven by a set of VLD driver circuits), the linear-type image formation and detection (IFD) module, as well as the image frame grabber, the image data buffer, and the image processing computer, via the camera control computer, (ii) a manually-activatable switch for enabling transmission of symbol character data to a host computer system in response to decoding a bar code symbol within a captured image frame, and (iii) a LCD display panel and a data entry keypad for supporting diverse types of transactions using the PLIIM-based hand-supportable imager;

FIG. 40C3 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and variable focal length/variable focal distance image formation optics, (ii) a laser-based object detection subsystem within its hand-supportable housing for automatically activating the planar laser illumination array into a full-power mode of operation, the linear-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager;

FIG. 40C4 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and variable focal length/variable focal distance image formation optics, (ii) an ambient-light driven object detection subsystem within its hand-supportable housing for automatically activating the planar laser illumination array (driven by a set of VLD driver circuits), the linear-type image formation and detection (IFD) module, the image frame grabber, the image data buffer, and the image processing computer, via the camera control computer, in response to the automatic detection of an object via ambient-light detected by object detection field enabled by the CCD image sensor within the IFD module, (iii) a manually-activatable switch for enabling transmission of symbol character data to a host computer system in response to the decoding a bar code symbol within a captured image frame, and (iv) a LCD display panel and a data entry keypad for supporting diverse types of transactions using the PLIIM-based hand-supportable imager;

FIG. 40C5 is a block schematic diagram of an automatically-activated version of the PLIIM-based hand-supportable linear imager of FIG. 39A, shown configured with (i) a linear-type image formation and detection (IFD) module having a linear image detection array with vertically-elongated image detection elements and variable focal length/variable focal distance image formation optics, (ii) an automatic bar code symbol detection subsystem within its hand-supportable housing for automatically activating the image processing computer for decode-processing in response to the automatic detection of an bar code symbol within its bar code symbol detection field enabled by the CCD image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based band-supportable imager;

FIG. 41A is a perspective view of a second illustrative embodiment of the PLIIM-based hand-supportable linear imager of the present invention which contains within its housing, (1) a PLIIM-based image capture and processing engine comprising a dual-VLD PLIA and a linear CCD image detection array with vertically-elongated image detection elements configured within an optical assembly which employs an acousto-optical Bragg-cell panel and a cylindrical lens array to provide a despeckling mechanism which operates in accordance with the first generalized method of speckle-pattern noise reduction illustrated in FIGS. 1I6A and 1I6B;

FIG. 41B is an exploded perspective view of the PLIIM-based image capture and processing engine employed in the hand-supportable imager of FIG. 41A, showing its PLIAs, IFD (i.e. camera subsystem) and associated optical components mounted on an optical-bench/multi-layer PC board, for containment between the upper and lower portions of the engine housing;

FIG. 41C is a plan view of the optical-bench/multi-layer PC board contained within the PLIIM-based image capture and processing engine of FIG. 41B, showing the field of view of the IFD module in a spatially-overlapping relation with respect to the PLIBs generated by the PLIAs employed therein;

FIG. 41D is an elevated front view of the PLIIM-based image capture and processing engine of FIG. 41B, showing the PLIAs mounted on opposite sides of its IFD module;

FIG. 42 is schematic representation of a hand-supportable planar laser illumination and imaging (PLIIM) device employing a linear image detection array and optically-combined planar laser illumination beams (PLIBs) produced from a multiplicity of laser diode sources to achieve a reduction in speckle-pattern noise power in said imaging device;

FIG. 42A is a perspective view of a third illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly which provides a despeckling mechanism that operates in accordance with the first generalized method of speckle-pattern noise reduction illustrated in FIGS. 1I15A and 1I15D, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 42B is an exploded perspective view of the PLIIM-based image capture and processing engine employed in the hand-supportable imager of FIG. 42A, showing its PLIAs, IFD (i.e. camera) subsystem and associated optical components mounted on an optical-bench/multi-layer PC board, for containment between the upper and lower portions of the engine housing;

FIG. 42C is a plan view of the optical-bench/multi-layer PC board contained within the PLIIM-based image capture and processing engine of FIG. 42B, showing the field of view of the IFD module in a spatially-overlapping (i.e. coplanar) relation with respect to the PLIBs generated by the PLIAs employed therein;

FIG. 42D is an elevated front view of the PLIIM-based image capture and processing engine of FIG. 42B, showing the PLIAs mounted on opposite sides of its IFD module;

FIG. 43A is a perspective view of a fourth illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly which employs high-resolution deformable mirror (DM) structure and a cylindrical lens array to provide a despeckling mechanism that operates in accordance with the first generalized method of speckle-pattern noise reduction illustrated in FIGS. 1I7A through 1I7C, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 43B is an exploded perspective view of the PLIIM-based image capture and processing engine employed in the hand-supportable imager of FIG. 43A, showing its PLIAs, IFD (i.e. camera) subsystem and associated optical components mounted on an optical-bench/multi-layer PC board, for containment between the upper and lower portions of the engine housing;

FIG. 43C is a plan view of the optical-bench/multi-layer PC board contained within the PLIIM-based image capture and processing engine of FIG. 43B, showing the field of view of the IFD module in a spatially-overlapping relation with respect to the PLIBs generated by the PLIAs employed therein;

FIG. 43D is an elevated front view of the PLIIM-based image capture and processing engine of FIG. 43B, showing the PLIAs mounted on opposite sides of its IFD module;

FIG. 44A is a perspective view of a fifth illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly that employs a high-resolution phase-only LCD-based phase modulation panel and cylindrical lens array to provide a despeckling mechanism that operates in accordance with the first generalized method of speckle-pattern noise reduction illustrated in FIGS. 1I8F and 1I8F, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 44B is an exploded perspective view of the PLIIM-based image capture and processing engine employed in the hand-supportable imager of FIG. 44A, showing its PLIAs, IFD (i.e. camera) subsystem and associated optical components mounted on an optical-bench/multi-layer PC board, for containment between the upper and lower portions of the engine housing;

FIG. 44C is a plan view of the optical-bench/multi-layer PC board contained within the PLIIM-based image capture and processing engine of FIG. 44B, showing the field of view of the IFD module in a spatially-overlapping relation with respect to the PLIBs generated by the PLIAs employed therein;

FIG. 45A is a perspective view of a sixth illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly that employs a rotating multi-faceted cylindrical lens array structure and cylindrical lens array to provide a despeckling mechanism that operates in accordance with the first generalized method of speckle-pattern noise reduction illustrated in FIGS. 1I12A and 1I12B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 45B is an exploded perspective view of the PLIIM-based image capture and processing engine employed in the hand-supportable imager of FIG. 45A, showing its PLIAs, IFD (i.e. camera) subsystem and associated optical components mounted on an optical-bench/multi-layer PC board, for containment between the upper and lower portions of the engine housing;

FIG. 45C is a plan view of the optical-bench/multi-layer PC board contained within the PLIIM-based image capture and processing engine of FIG. 45B, showing the field of view of the IFD module in a spatially-overlapping relation with respect to the PLIBs generated by the PLIAs employed therein;

FIG. 46A is a perspective view of a seventh illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly that employs a high-speed temporal intensity modulation panel (i.e. optical shutter) to provide a despeckling mechanism that operates in accordance with the second generalized method of speckle-pattern noise reduction illustrated in FIGS. 1I14A and 1I14B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 46B is an exploded perspective view of the PLIIM-based image capture and processing engine employed in the hand-supportable imager of FIG. 46A, showing its PLIAs, IFD (i.e. camera) subsystem and associated optical components mounted on an optical-bench/multi-layer PC board, for containment between the upper and lower portions of the engine housing;

FIG. 46C is a plan view of the optical-bench/multi-layer PC board contained within the PLIIM-based image capture and processing engine of FIG. 46B, showing the field of view of the IFD module in a spatially-overlapping relation with respect to the PLIBs generated by the PLIAs employed therein;

FIG. 47A is a perspective view of an eighth illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly that employs visible mode-locked laser diode (MLLDs) and cylindrical lens array to provide a despeckling mechanism that operates in accordance with the second generalized method of speckle-pattern noise reduction illustrated in FIGS. 1I15C and 1I15D, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 47B is an exploded perspective view of the PLIIM-based image capture and processing engine employed in the hand-supportable imager of FIG. 47A, showing its PLIAs, IFD (i.e. camera) subsystem and associated optical components mounted on an optical-bench/multi-layer PC board, for containment between the upper and lower portions of the engine housing;

FIG. 47C is a plan view of the optical-bench/multi-layer PC board contained within the PLIIM-based image capture and processing engine of FIG. 47B, showing the field of view of the IFD module in a spatially-overlapping relation with respect to the PLIBs generated by the PLIAs employed therein;

FIG. 48A is a perspective view of a ninth illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly that employs an optically-reflective temporal phase modulating structure (e.g. extra-cavity Fabry-Perot etalon) and cylindrical lens array to provide a despeckling mechanism that operates in accordance with the third generalized method of speckle-pattern noise reduction illustrated in FIGS. 1I17A and 1I17B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 48B is an exploded perspective view of the PLIIM-based image capture and processing engine employed in the hand-supportable imager of FIG. 48A, showing its PLIAs, IFD (i.e. camera) subsystem and associated optical components mounted on an optical-bench/multi-layer PC board, for containment between the upper and lower portions of the engine housing;

FIG. 48C is a plan view of the optical-bench/multi-layer PC board contained within the PLIIM-based image capture and processing engine of FIG. 49B, showing the field of view of the IFD module in a spatially-overlapping relation with respect to the PLIBs generated by the PLIAs employed therein;

FIG. 49A is a perspective view of a tenth illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly that employs a pair of reciprocating spatial intensity modulation panels and cylindrical lens array to provide a despeckling mechanism that operates in accordance with the fifth method generalized method of speckle-pattern noise reduction illustrated in FIGS. 1I21A and 1I21D, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 49B is an exploded perspective view of the PLIIM-based image capture and processing engine employed in the hand-supportable imager of FIG. 49A, showing its PLIAs, IFD (i.e. camera) subsystem and associated optical components mounted on an optical-bench/multi-layer PC board, for containment between the upper and lower portions of the engine housing;

FIG. 49C is a plan view of the optical-bench/multi-layer PC board contained within the PLIIM-based image capture and processing engine of FIG. 49B, showing the field of view of the IFD module in a spatially-overlapping relation with respect to the PLIBs generated by the PLIAs employed therein;

FIG. 50A is a perspective view of an eleventh illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly that employs spatial intensity modulation aperture which provides a despeckling mechanism that operates in accordance with the sixth generalized method of speckle-pattern noise reduction illustrated in FIGS. 1I22A and 1I22B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 50B is an exploded perspective view of the PLIIM-based image capture and processing engine employed in the hand-supportable imager of FIG. 50A, showing its PLIAs, IFD module (i.e. camera) subsystem and associated optical components mounted on an optical-bench/multi-layer PC board, for containment between the upper and lower portions of the engine housing;

FIG. 50C is a plan view of the optical-bench/multi-layer PC board contained within the PLIIM-based image capture and processing engine of FIG. 50B, showing the field of view of the IFD module in a spatially-overlapping relation with respect to the PLIBs generated by the PLIAs employed therein;

FIG. 51A is a perspective view of a twelfth illustrative embodiment of the PLIIM-based hand-supportable linear imager of the present invention which contains within its housing, (1) a PLIIM-based image capture and processing engine comprising a dual-VLD PLIA and a linear CCD image detection array having vertically-elongated image detection elements configured within an optical assembly that employs a temporal intensity modulation aperture which provides a despeckling mechanism that operates in accordance with the seventh generalized method of speckle-pattern noise reduction illustrated in FIG. 1I24C, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 51B is an exploded perspective view of the PLIIM-based image capture and processing engine employed in the hand-supportable imager of FIG. 51A, showing its PLIAs, IFD (i.e. camera) subsystem and associated optical components mounted on an optical-bench/multi-layer PC board, for containment between the upper and lower portions of the engine housing;

FIG. 51C is a plan view of the optical-bench/multi-layer PC board contained within the PLIIM-based image capture and processing engine of FIG. 51B, showing the field of view of the IFD module in a spatially-overlapping relation with respect to the PLIBs generated by the PLIAs employed therein;

FIG. 52 is schematic representation of a hand-supportable planar laser illumination and imaging (PLIIM) device employing an area-type image detection array and optically-combined planar laser illumination beams (PLIBs) produced from a multiplicity of laser diode sources to achieve a reduction in speckle-pattern noise power in said imaging device;

FIG. 52A is a perspective view of a first illustrative embodiment of the PLIIM-based hand-supportable area-type imager of the present invention which contains within its housing, (1) a PLIIM-based image capture and processing engine comprising a dual-VLD PLIA, and a CCD 2-D (area-type) image detection array configured within an optical assembly that employs a micro-oscillating cylindrical lens array which provides a despeckling mechanism that operates in accordance with the first generalized method of speckle-pattern noise reduction illustrated in FIGS. 1I3A through 1I3D, and which also has integrated with its housing, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 52B is an exploded perspective view of the PLIIM-based image capture and processing engine employed in the hand-supportable imager of FIG. 52A, showing its PLIAs, IFD module (i.e. camera subsystem) and associated optical components mounted on an optical-bench/multi-layer PC board, for containment between the upper and lower portions of the engine housing;

FIG. 53A1 is a block schematic diagram of a manually-activated version of the PLIIM-based hand-supportable area imager of FIG. 52A, shown configured with (i) an area-type image formation and detection (IFD) module having a fixed focal length/fixed focal distance image formation optics, (ii) a manually-actuated trigger switch for manually activating the planar laser illumination array (driven by a set of VLD driver circuits), the area-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager;

FIG. 53A2 is a block schematic diagram of an automatically-activated version of the PLIIM-based hand-supportable area imager of FIG. 52A, shown configured with (i) an area-type image formation and detection (IFD) module having a fixed focal length/fixed focal distance image formation optics, (ii) an IR-based object detection subsystem within its hand-supportable housing for automatically activating in response to the detection of an object in its IR-based object detection field, the planar laser illumination arrays (driven by a set of VLD driver circuits), the area-type image formation and detection (IFD) module, as well as the image frame grabber, the image data buffer, and the image processing computer, via the camera control computer, (ii) a manually-activatable switch for enabling transmission of symbol character data to a host computer system in response to the decoding of a bar code symbol within a captured image frame, and (iii) a LCD display panel and a data entry keypad for supporting diverse types of transactions using the PLIIM-based hand-supportable imager;

FIG. 53A3 is a block schematic diagram of an automatically-activated version of the PLIIM-based hand-supportable area imager of FIG. 52A, shown configured with (i) an area-type image formation and detection (IFD) module having a fixed focal length/fixed focal distance image formation optics, (ii) a laser-based object detection subsystem within its hand-supportable housing for automatically activating the planar laser illumination arrays into a full-power mode of operation, the area-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system in response to the decoding of a bar code symbol within a captured image frame; and (iv) a LCD display panel and a data entry keypad for supporting diverse types of transactions using the PLIIM-based hand-supportable imager;

FIG. 53A4 is a block schematic diagram of an automatically-activated version of the PLIIM-based hand-supportable area imager of FIG. 52A, shown configured with (i) an area-type image formation and detection (IFD) module having a fixed focal length/fixed focal distance image formation optics, (ii) an ambient-light driven object detection subsystem within its hand-supportable housing for automatically activating the planar laser illumination arrays (driven by a set of VLD driver circuits), the area-type image formation and detection (IFD) module, the image frame grabber, the image data buffer, and the image processing computer, via the camera control computer, in response to the automatic detection of an object via ambient-light detected by object detection field enabled by the CCD image sensor within the IFD module, (iii) a manually-activatable switch for enabling transmission of symbol character data to a host computer system in response to the decoding of a bar code symbol within a captured image frame, and (iv) a LCD display panel and a data entry keypad for supporting diverse types of transactions using the PLIIM-based hand-supportable imager;

FIG. 53A5 is a block schematic diagram of an automatically-activated version of the PLIIM-based hand-supportable area imager of FIG. 52A, shown configured with (i) an area-type image formation and detection (IFD) module having a fixed focal length/fixed focal distance image formation optics, (ii) an automatic bar code symbol detection subsystem within its hand-supportable housing for automatically activating the image processing computer for decode-processing upon automatic detection of an bar code symbol within its bar code symbol detection field enabled by the CCD image sensor within the IFD module, (iii) a manually-activatable switch for enabling transmission of symbol character data to a host computer system upon decoding a bar code symbol within a captured image frame, and (iv) a LCD display panel and a data entry keypad for supporting diverse types of transactions using the PLIIM-based hand-supportable imager;

FIG. 53B1 is a block schematic diagram of a manually-activated version of the PLIIM-based hand-supportable area imager of FIG. 52A, shown configured with (i) an area-type image formation and detection (IFD) module having a fixed focal length/variable focal distance image formation optics, (ii) a manually-actuated trigger switch for manually activating the planar laser illumination array (driven by a set of VLD driver circuits), the area-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager;

FIG. 53B2 is a block schematic diagram of an automatically-activated version of the PLIIM-based hand-supportable area imager of FIG. 52A, shown configured with (i) an area-type image formation and detection (IFD) module having a fixed focal length/variable focal distance image formation optics, (ii) an IR-based object detection subsystem within its hand-supportable housing for automatically activating in response to the detection of an object in its IR-based object detection field, the planar laser illumination array (driven by a set of VLD driver circuits), the area-type image formation and detection (IFD) module, as well as the image frame grabber, the image data buffer, and the image processing computer, via the camera control computer, (ii) a manually-activatable switch for enabling transmission of symbol character data to a host computer system in response to the decoding of a bar code symbol within a captured image frame, and (iii) a LCD display panel and a data entry keypad for supporting diverse types of transactions using the PLIIM-based hand-supportable imager;

FIG. 53B3 is a block schematic diagram of an automatically-activated version of the PLIIM-based hand-supportable area imager of FIG. 52A, shown configured with (i) an area-type image formation and detection (IFD) module having a fixed focal length/variable focal distance image formation optics, (ii) a laser-based object detection subsystem within its hand-supportable housing for automatically activating the planar laser illumination array into a full-power mode of operation, the area-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system in response to the decoding of a bar code symbol within a captured image frame, and (iv) a LCD display panel and a data entry keypad for supporting diverse types of transactions using the PLIIM-based hand-supportable imager;

FIG. 53B4 is a block schematic diagram of an automatically-activated version of the PLIIM-based hand-supportable area imager of FIG. 52A, shown configured with (i) an area-type image formation and detection (IFD) module having a fixed focal length/variable focal distance image formation optics, (ii) an ambient-light driven object detection subsystem within its hand-supportable housing for automatically activating the planar laser illumination array (driven by a set of VLD driver circuits), the area-type image formation and detection (IFD) module, the image frame grabber, the image data buffer, and the image processing computer, via the camera control computer, in response to the automatic detection of an object via ambient-light detected by object detection field enabled by the CCD image sensor within the IFD module, and (iii) a manually-activatable switch for enabling transmission of symbol character data to a host computer system in response to the decoding of a bar code symbol within a captured image frame;

FIG. 53B5 is a block schematic diagram of an automatically-activated version of the PLIIM-based hand-supportable area imager of FIG. 52A, shown configured with (i) an area-type image formation and detection (IFD) module having a fixed focal length/variable focal distance image formation optics, (ii) an automatic bar code symbol detection subsystem within its hand-supportable housing for automatically activating the planar laser illumination arrays (driven by a set of VLD driver circuits), the area-type image formation and detection (IFD) module, the image frame grabber, the image data buffer, and the image processing computer for decode-processing in response to the automatic detection of an bar code symbol within its bar code symbol detection field enabled by the CCD image sensor within the IFD module, (iii) a manually-activatable switch for enabling transmission of symbol character data to a host computer system in response to the decoding of a bar code symbol within a captured image frame, and (iv) a LCD display panel and a data entry keypad for supporting diverse types of transactions using the PLIIM-based hand-supportable imager;

FIG. 53C1 is a block schematic diagram of a manually-activated version of the PLIIM-based hand-supportable area imager of FIG. 52A, shown configured with (i) an area-type image formation and detection (IFD) module having a variable focal length/variable focal distance image formation optics, (ii) a manually-actuated trigger switch for manually activating the planar laser illumination array (driven by a set of VLD driver circuits), the area-type image formation and detection (IFD) module, the image frame grabber, the image data buffer, and the image processing computer, via the camera control computer, in response to the manual activation of the trigger switch, and capturing images of objects (i.e. bearing bar code symbols and other graphical indicia) through the fixed focal length/fixed focal distance image formation optics, and (iii) a LCD display panel and a data entry keypad for supporting diverse types of transactions using the PLIIM-based hand-supportable imager;

FIG. 53C2 is a block schematic diagram of an automatically-activated version of the PLIIM-based hand-supportable area imager of FIG. 52A, shown configured with (i) a area-type image formation and detection (IFD) module having a variable focal length/variable focal distance image formation optics, (ii) an IR-based object detection subsystem within its hand-supportable housing for automatically activating upon detection of an object in its IR-based object detection field, the planar laser illumination array (driven by a set of VLD driver circuits), the area-type image formation and detection (IFD) module, as well as the image frame grabber, the image data buffer, and the image processing computer, via the camera control computer, (ii) a manually-activatable switch for enabling transmission of symbol character data to a host computer system in response to the decoding a bar code symbol within a captured image frame, and (iii) a LCD display panel and a data entry keypad for supporting diverse types of transactions using the PLIIM-based hand-supportable imager;

FIG. 53C3 is a block schematic diagram of an automatically-activated version of the PLIIM-based hand-supportable area imager of FIG. 52A, shown configured with (i) an area-type image formation and detection (IFD) module having a variable focal length/variable focal distance image formation optics, (ii) a laser-based object detection subsystem within its hand-supportable housing for automatically activating the planar laser illumination array into a full-power mode of operation, the area-type image formation and detection (IFD) module, the image frame grabber, the image data buffer, and the image processing computer, via the camera control computer, in response to the automatic detection of an object in its laser-based object detection field, (iii) a manually-activatable switch for enabling transmission of symbol character data to a host computer system in response to the decoding a bar code symbol within a captured image frame, and (iv) a LCD display panel and a data entry keypad for supporting diverse types of transactions using the PLIIM-based hand-supportable imager;

FIG. 53C4 is a block schematic diagram of an automatically-activated version of the PLIIM-based hand-supportable area imager of FIG. 52A system, shown configured with (i) an area-type image formation and detection (IFD) module having a variable focal length/variable focal distance image formation optics, (ii) an ambient-light driven object detection subsystem within its hand-supportable housing for automatically activating the planar laser illumination arrays (driven by a set of VLD driver circuits), the area-type image formation and detection (IFD) module, the image frame grabber, the image data buffer, and the image processing computer, via the camera control computer, in response to the automatic detection of an object via ambient-light detected by object detection field enabled by the CCD image sensor within the IFD module, (iii) a manually-activatable switch for enabling transmission of symbol character data to a host computer system in response to the decoding of a bar code symbol within a captured image frame, and (iv) a LCD display panel and a data entry keypad for supporting diverse types of transactions using the PLIIM-based hand-supportable imager;

FIG. 53C5 is a block schematic diagram of an automatically-activated version of the PLIIM-based hand-supportable area imager of FIG. 52A system, shown configured with (i) an area-type image formation and detection (IFD) module having a variable focal length/variable focal distance image formation optics, (ii) an automatic bar code symbol detection subsystem within its hand-supportable housing for automatically activating the planar laser illumination arrays (driven by a set of VLD driver circuits), the area-type image formation and detection (IFD) module, the image frame grabber, the image data buffer, and the image processing computer for decode-processing in response to the automatic detection of an bar code symbol within its bar code symbol detection field enabled by the CCD image sensor within the IFD module, (iii) a manually-activatable switch for enabling transmission of symbol character data to a host computer system in response to decoding a bar code symbol within a captured image frame, and (iv) a LCD display panel and a data entry keypad for supporting diverse types of transactions using the PLIIM-based hand-supportable imager;

FIG. 54A is a perspective view of a second illustrative embodiment of the PLIIM-based hand-supportable area imager of the present invention which contains within its housing, (1) a PLIIM-based image capture and processing engine comprising a dual-VLD PLIA and a area CCD image detection array configured within an optical assembly which employs a micro-oscillating light reflective element and a cylindrical lens array to provide a despeckling mechanism that operates in accordance with the first generalized method of speckle-pattern noise reduction illustrated in FIGS. 1I5A through 1I5D, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 54B is an exploded perspective view of the PLIIM-based image capture and processing engine employed in the hand-supportable area imager of FIG. 54A, showing its PLIAs, IFD module (i.e. camera subsystem) and associated optical components mounted on an optical-bench/multi-layer PC board, for containment between the upper and lower portions of the engine housing;

FIG. 55A is a perspective view of a third illustrative embodiment of the PLIIM-based hand-supportable area imager of the present invention which contains within its housing, a PLIIM-based image capture and processing engine comprising a dual-VLD PLIA and a 2-D CCD image detection array configured within an optical assembly that employs an acousto-electric Bragg cell structure and a cylindrical lens array to provide a despeckling mechanism that operates in accordance with the first generalized method of speckle-pattern noise reduction illustrated in FIGS. 1I6A and 1I6B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 55B is an exploded perspective view of the PLIIM-based image capture and processing engine employed in the hand-supportable area imager of FIG. 55A, showing its PLIAs, IFD (i.e. camera) subsystem and associated optical components mounted on an optical-bench/multi-layer PC board, for containment between the upper and lower portions of the engine housing;

FIG. 56A is a perspective view of a fourth illustrative embodiment of the PLIIM-based hand-supportable area imager of the present invention which contains within its housing, (1) a PLIIM-based image capture and processing engine comprising a dual-VLD PLIA and a 2-D CCD image detection array configured within an optical assembly that employs a high spatial-resolution piezo-electric driven deformable mirror (DM) structure and a cylindrical lens array to provide a despeckling mechanism that operates in accordance with the first generalized method of speckle-pattern noise reduction illustrated in FIGS. 1I7A and 1I7C, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 56B is an exploded perspective view of the PLIIM-based image capture and processing engine employed in the hand-supportable area imager of FIG. 56A, showing its PLIAs, (2) IFD (i.e. camera) subsystem and associated optical components mounted on an optical-bench/multi-layer PC board, for containment between the upper and lower portions of the engine housing;

FIG. 57A is a perspective view of a fifth illustrative embodiment of the PLIIM-based hand-supportable area imager of the present invention which contains within its housing, (1) a PLIIM-based image capture and processing engine comprising a dual-VLD PLIA and a 2-D CCD image detection array configured within an optical assembly that employs a spatial-only liquid crystal display (PO-LCD) type spatial phase modulation panel and cylindrical lens array to provide a despeckling mechanism that operates in accordance with the first generalized method of speckle-pattern noise reduction illustrated in FIGS. 1I8F and 1I8G, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 57B is an exploded perspective view of the PLIIM-based image capture and processing engine employed in the hand-supportable area imager of FIG. 57A, showing its PLIAs, IFD module (i.e. camera subsystem) and associated optical components mounted on an optical-bench/multi-layer PC board, for containment between the upper and lower portions of the engine housing;

FIG. 58A is a perspective view of a sixth illustrative embodiment of the PLIIM-based hand-supportable area imager of the present invention which contains within its housing, a PLIIM-based image capture and processing engine comprising a dual-VLD PLIA and a 2-D CCD image detection array configured within an optical assembly that employs a high-speed optical shutter and cylindrical lens array to provide a despeckling mechanism that operates in accordance with the second generalized method of speckle-pattern noise reduction illustrated in FIGS. 1I14A and 1I14B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 58B is an exploded perspective view of the PLIIM-based image capture and processing engine employed in the hand-supportable area imager of FIG. 58A, showing its PLIAs, IFD (i.e. camera) subsystem and associated optical components mounted on an optical-bench/multi-layer PC board, for containment between the upper and lower portions of the engine housing;

FIG. 59A is a perspective view of a seventh illustrative embodiment of the PLIIM-based hand-supportable area imager of the present invention which contains within its housing, a PLIIM-based image capture and processing engine comprising a dual-VLD PLIA and a 2-D CCD image detection array configured within an optical assembly that employs a visible mode locked laser diode (MLLD) and cylindrical lens array to provide a despeckling mechanism that operates in accordance with the second generalized method of speckle-pattern noise reduction illustrated in FIGS. 1I15A and 1I15B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 59B is an exploded perspective view of the PLIIM-based image capture and processing engine employed in the hand-supportable area imager of FIG. 58A, showing its PLIAs, IFD module (i.e. camera subsystem) and associated optical components mounted on an optical-bench/multi-layer PC board, for containment between the upper and lower portions of the engine housing;

FIG. 60A is a perspective view of a eighth illustrative embodiment of the PLIIM-based hand-supportable area imager of the present invention which contains within its housing, (1) a PLIIM-based image capture and processing engine comprising a dual-VLD PLIA and a 2-D CCD image detection array configured within an optical assembly that employs an electrically-passive optically-reflective external cavity (i.e. etalon) and cylindrical lens array to provide a despeckling mechanism that operates in accordance with the third method generalized method of speckle-pattern noise reduction illustrated in FIGS. 1I17A and 1I17B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 60B is an exploded perspective view of the PLIIM-based image capture and processing engine employed in the hand-supportable imager of FIG. 60A, showing its PLIAs, IFD module (i.e. camera subsystem) and associated optical components mounted on an optical-bench/multi-layer PC board, for containment between the upper and lower portions of the engine housing;

FIG. 61A is a perspective view of a ninth illustrative embodiment of the PLIIM-based hand-supportable area imager of the present invention which contains within its housing, (1) a PLIIM-based image capture and processing engine comprising a dual-VLD PLIA and a 2-D CCD image detection array configured within an optical assembly that employs an mode-hopping VLD drive circuitry and a cylindrical lens array to provide a despeckling mechanism that operates in accordance with the fourth generalized method of speckle-pattern noise reduction illustrated in FIGS. 1I19A and 1I19B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 61B is an exploded perspective view of the PLIIM-based image capture and processing engine employed in the hand-supportable area imager of FIG. 61A, showing its PLIAs, IFD (i.e. camera) subsystem and associated optical components mounted on an optical-bench/multi-layer PC board, for containment between the upper and lower portions of the engine housing;

FIG. 62A is a perspective view of a tenth illustrative embodiment of the PLIIM-based hand-supportable area imager of the present invention which contains within its housing, (1) a PLIIM-based image capture and processing engine comprising a dual-VLD PLIA and a 2-D CCD image detection array configured within an optical assembly that employs a pair of micro-oscillating spatial intensity modulation panels and cylindrical lens array to provide a despeckling mechanism that operates in accordance with the fifth method generalized method of speckle-pattern noise reduction illustrated in FIGS. 1I21A and 1I21D, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 62B is an exploded perspective view of the PLIIM-based image capture and processing engine employed in the hand-supportable area imager of FIG. 62A, showing its PLIAs, IFD module (i.e. camera subsystem) and associated optical components mounted on an optical-bench/multi-layer PC board, for containment between the upper and lower portions of the engine housing;

FIG. 63A is a perspective view of a eleventh illustrative embodiment of the PLIIM-based hand-supportable area imager of the present invention which contains within its housing, (1) a PLIIM-based image capture and processing engine comprising a dual-VLD PLIA and a 2-D CCD image detection array configured within an optical assembly that employs a electro-optical or mechanically rotating aperture (i.e. iris) disposed before the entrance pupil of the IFD module, to provide a despeckling mechanism that operates in accordance with the sixth method generalized method of speckle-pattern noise reduction illustrated in FIGS. 1I23A and 1I23B, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 63B is an exploded perspective view of the PLIIM-based image capture and processing engine employed in the hand-supportable area imager of FIG. 62A, showing its PLIAs, IFD module (i.e. camera subsystem) and associated optical components mounted on an optical-bench/multi-layer PC board, for containment between the upper and lower portions of the engine housing;

FIG. 64A is a perspective view of a twelfth illustrative embodiment of the PLIIM-based hand-supportable area imager of the present invention which contains within its housing, (1) a PLIIM-based image capture and processing engine comprising a dual-VLD PLIA and a 2-D CCD image detection array configured within an optical assembly that employs a high-speed electro-optical shutter disposed before the entrance pupil of the IFD module, to provide a despeckling mechanism that operates in accordance with the seventh generalized method of speckle-pattern noise reduction illustrated in FIGS. 1I24A–1I24C, (2) a LCD display panel for displaying images captured by said engine and information provided by a host computer system or other information supplying device, and (3) a manual data entry keypad for manually entering data into the imager during diverse types of information-related transactions supported by the PLIIM-based hand-supportable imager;

FIG. 64B is an exploded perspective view of the PLIIM-based image capture and processing engine employed in the hand-supportable area imager of FIG. 64A, showing its PLIAs, IFD module (i.e. camera subsystem) and associated optical components mounted on an optical-bench/multi-layer PC board, for containment between the upper and lower portions of the engine housing;

FIG. 65A is a perspective view of a first illustrative embodiment of an LED-based PLIM for best use in PLIIM-based systems having relatively short working distances (e.g. less than 18 inches or so), wherein a linear-type LED, an optional focusing lens element and a cylindrical lens element are each mounted within compact barrel structure, for the purpose of producing a spatially-incoherent planar light illumination beam (PLIB) therefrom;

FIG. 65B is a schematic presentation of the optical process carried within the LED-based PLIM shown in FIG. 65A, wherein (1) the focusing lens focuses a reduced-size image of the light emitting source of the LED towards the farthest working distance in the PLIIM-based system, and (2) the light rays associated with the reduced-size of the image LED source are transmitted through the cylindrical lens element to produce a spatially-incoherent planar light illumination beam (PLIB), as shown in FIG. 65A;

FIG. 66A is a perspective view of a second illustrative embodiment of an LED-based PLIM for best use in PLIIM-based systems having relatively short working distances, wherein a linear-type LED, a focusing lens element, collimating lens element and a cylindrical lens element are each mounted within compact barrel structure, for the purpose of producing a spatially-incoherent planar light illumination beam (PLIB) therefrom;

FIG. 66B is a schematic presentation of the optical process carried within the LED-based PLIM shown in FIG. 66A, wherein (1) the focusing lens element focuses a reduced-size image of the light emitting source of the LED towards a focal point within the barrel structure, (2) the collimating lens element collimates the light rays associated with the reduced-size image of the light emitting source, and (3) the cylindrical lens element diverges (i.e. spreads) the collimated light beam so as to produce a spatially-incoherent planar light illumination beam (PLIB), as shown in FIG. 66A;

FIG. 67A is a perspective view of a third illustrative embodiment of an LED-based PLIM chip for best use in PLIIM-based systems having relatively short working distances, wherein a linear-type light emitting diode (LED) array, a focusing-type microlens array, collimating type microlens array, and a cylindrical-type microlens array are each mounted within the IC package of the PLIM chip, for the purpose of producing a spatially-incoherent planar light illumination beam (PLIB) therefrom;

FIG. 67B is a schematic representation of the optical process carried within the LED-based PLIM shown in FIG. 67A, wherein (1) each focusing lenslet focuses a reduced-size image of a light emitting source of an LED towards a focal point above the focusing-type microlens array, (2) each collimating lenslet collimates the light rays associated with the reduced-size image of the light emitting source, and (3) each cylindrical lenslet diverges the collimated light beam so as to produce a spatially-incoherent planar light illumination beam (PLIB) component, as shown in FIG. 66A, which collectively produce a composite spatially-incoherent PLIB from the LED-based PLIM;

FIG. 67C is a schematic representation of the optical process carried out by a single LED in the LED array of FIG. 67B1;

FIGS. 68-1 through 68-3, taken together, set forth a schematic block system diagram of a first illustrative embodiment of the airport security system of the present invention shown comprising (i) a passenger screening station or subsystem including PLIIM-based passenger facial and body profiling identification subsystem, hand-held PLIIM-based imagers, and a data element linking and tracking computer, (ii) a baggage screening subsystem including PLIIM-based object identification and attribute acquisition subsystem, a x-ray scanning subsystem, and a neutron-beam explosive detection subsystems (EDS), (iii) a Passenger and Baggage Attribute Relational Database Management Subsystems (RDBMS) for storing co-indexed passenger identity and baggage attribute data elements (i.e. information files), and (iv) automated data processing subsystems for operating on co-indexed passenger and baggage data elements (i.e. information files) stored therein, for the purpose of detecting breaches of security during and after passengers and baggage are checked into an airport terminal system;

FIG. 68A is a schematic representation of a PLIIM-based (and/or LDIP-based) passenger biometric identification subsystem employing facial and 3-D body profiling/recognition techniques, and a metal-detection subsystem, employed at a passenger screening station in the airport security system of the present invention shown in FIG. 68A;

FIG. 68B is a schematic representation of an exemplary passenger and baggage database record created and maintained within the Passenger and Baggage RDBMS employed in the airport security system of FIG. 68A;

FIG. 68C1 is a perspective view of the Object Identification And Attribute Information Tracking And Linking Computer of the present invention, employed at the passenger check-in and screening station in the airport security system of FIG. 68A;

FIG. 68C2 is a schematic representation of the hardware computing and network communications platform employed in the realization of the Object Identification And Attribute Information Tracking And Linking Computer of FIG. 68C1;

FIG. 68C3 is a schematic block representation of the Object Identification And Attribute Information Tracking And Linking Computer of FIG. 68C1, showing its input and output unit and its programmable data element queuing, handling and processing and linking subsystem, and illustrating, in the passenger screening application of FIG. 68A, that each passenger identification data input (e.g. from a bar code reader or RFID reader) is automatically attached to each corresponding passenger attribute data input (e.g. passenger profile characteristics and dimensions, weight, X-ray images, etc.) generated at the passenger check-in and screening station;

FIG. 68C4 a schematic block representation of the Data Element Queuing, Handling, and Processing Subsystem employed in the Object Identification and Attribute Acquisition System at the baggage screening station in FIG. 68A, showing its input and output unit and its programmable data element queuing, handling and processing and linking subsystem, and illustrating, in the baggage screening application of FIG. 68A, that each baggage identification data input (e.g. from a bar code reader or RFID reader) is automatically attached to each corresponding baggage attribute data input (e.g. baggage profile characteristics and dimensions, weight, X-ray images, PFNA images, QRA images, etc.) generated at the baggage screening station(s) provided along the baggage handling system;

FIGS. 68D1 through 68D3, taken together, set forth a flow chart illustrating the steps involved in a first illustrative embodiment of the airport security method of the present invention carried out using the airport security system shown in FIG. 68A;

FIGS. 69A1 through 69A3 set forth a schematic block system diagram of a second illustrative embodiment of the airport security system of the present invention shown comprising (i) a passenger screening station or subsystem including PLIIM-based object identification and attribute acquisition subsystem, (ii) a baggage screening subsystem including PLIIM-based object identification and attribute acquisition subsystem, an RDID object identification subsystem, a x-ray scanning subsystem, and pulsed fast neutron analysis (PFNA) explosive detection subsystems (EDS), (iii) a internetworked passenger and baggage attribute relational database management subsystems (RDBMS), and (iv) automated data processing subsystems for operating on co-indexed passenger and baggage data elements stored therein, for the purpose of detecting breaches of security during and after passengers and baggage are checked into an airport terminal system;

FIGS. 69B1 through 69B3, taken together, set forth a flow chart illustrating the steps involved in a second illustrative embodiment of the airport security method of the present invention carried out using the airport security system shown in FIGS. 69A1 through 69A3;

FIG. 70A is a perspective view of a PLIIM-equipped x-ray parcel scanning-tunnel system of the present invention operably connected to a RDBMS which is in data communication with one or more remote intelligence RDBMSs connected to the infrastructure of the Internet, wherein the interior space of packages, parcels, baggage or the like, are automatically inspected by x-radiation beams to produce x-ray images which are automatically linked to object identity information by the PLIIM-based object identity and attribute acquisition subsystem embodied within the PLIIM-equipped x-ray parcel scanning-tunnel system;

FIG. 70B is an elevated end view of the PLIIM-equipped x-ray parcel scanning-tunnel system of the present invention shown in FIG. 70A;

FIG. 71A is a perspective view of a PLIIM-equipped Pulsed Fast Neutron Analysis (PFNA) parcel scanning-tunnel system of the present invention operably connected to a RDBMS which is in data communication with one or more remote intelligence RDBMSs operably connected to the infrastructure of the Internet, wherein the interior space of packages, parcels, baggage or the like, are automatically inspected by neutron-beams to produce neutron-beam images which are automatically linked to object identity information by the PLIIM-based object identity and attribute acquisition subsystem embodied within the PLIIM-equipped PFNA parcel scanning-tunnel system;

FIG. 71B is an elevated end view of the PLIIM-equipped PFNA parcel scanning-tunnel system of the present invention shown in FIG. 71A;

FIG. 72A is a perspective view of a PLIIM-equipped Quadrupole Resonance (QR) parcel scanning-tunnel system of the present invention operably connected to a RDBMS which is in data communication with one or more remote intelligence RDBMSs connected to the infrastructure of the Internet, wherein the interior space of packages, parcels, baggage or the like, are automatically inspected by low-intensity electromagnetic radio waves to produce digital images which are automatically linked to object identity information by the PLIIM-based object identity and attribute acquisition subsystem embodied within the PLIIM-equipped QR parcel scanning-tunnel system;

FIG. 72B is an elevated end view of the PLIIM-equipped QR parcel scanning-tunnel system shown in FIG. 72A;

FIG. 73 is a perspective view of a PLIIM-equipped x-ray cargo scanning-tunnel system of the present invention operably connected to a RDBMS which is in data communication with one or more remote intelligence RDBMSs operably connected to the infrastructure of the Internet, wherein the interior space of cargo containers, transported by tractor trailer, rail, or other by other means, are automatically inspected by x-radiation energy beams to produce x-ray images which are automatically linked to cargo container identity information by the PLIIM-based object identity and attribute acquisition subsystem embodied within the system;

FIG. 74 is a perspective view of a "horizontal-type" 2-D PLIIM-based CAT scanning system of the present invention capable of producing 3-D geometrical models of human beings, animals, and other objects, for viewing on a computer graphics workstation, wherein a single planar laser illumination beam (PLIB) and a single amplitude modulated (AM) laser scanning beam are controllably transported horizontally through the 3-D scanning volume disposed above the support platform of the system so as to optically scan the object under analysis and capture linear images and range-profile maps thereof relative to a global coordinate reference system, for subsequent reconstruction in the computer workstation using computer-assisted tomographic (CAT) techniques to generate a 3-D geometrical model of the object;

FIG. 75 is a perspective view of a "horizontal-type" 3-D PLIIM-based CAT scanning system of the present invention capable of producing 3-D geometrical models of human beings, animals, and other objects, for viewing on a computer graphics workstation, wherein a three orthogonal planar laser illumination beams (PLIBs) and three orthogonal amplitude modulated (AM) laser scanning beams are controllably transported horizontally through the 3-D scanning volume disposed above the support platform of the system so as to optically scan the object under analysis and capture linear images and range-profile maps thereof relative to a global coordinate reference system, for subsequent reconstruction in the computer workstation using computer-assisted tomographic (CAT) techniques to generate a 3-D geometrical model of the object;

FIG. 76 is a perspective view of a "vertical-type" 3-D PLIIM-based CAT scanning system of the present invention capable of producing 3-D geometrical models of human beings, animals, and other objects, for viewing on a computer graphics workstation, wherein a three orthogonal planar laser illumination beams (PLIBs) and three orthogonal amplitude modulated (AM) laser scanning beams are controllably transported vertically through the 3-D scanning volume disposed above the support platform of the system so as to optically scan the object under analysis and capture linear images and range-profile maps thereof relative to a global coordinate reference system, for subsequent reconstruction in the computer workstation using computer-assisted tomographic (CAT) techniques to generate a 3-D geometrical model of the object;

FIG. 77A is a schematic presentation of a hand-supportable mobile-type PLIIM-based 3-D digitization device of the present invention capable of producing 3-D digital data models and 3-D geometrical models of laser scanned objects, for display and viewing on a LCD view finder integrated with the housing (or on the display panel of a computer graphics workstation), wherein a single planar laser illumination beam (PLIB) and a single amplitude modulated (AM) laser scanning beam are transported through the 3-D scanning volume of the scanning device so as to optically scan the object under analysis and capture linear images and range-profile maps thereof relative to a coordinate reference system symbolically embodied within the scanning device, for subsequent reconstruction therein using computer-assisted tomographic (CAT) techniques to generate a 3-D geometrical model of the object for display, viewing and use in diverse applications;

FIG. 77B is a plan view of the bottom side of the hand-supportable mobile-type 3-D digitization device of FIG. 77A, showing light transmission apertures formed in the underside of its hand-supportable housing;

FIG. 78A is a schematic presentation of a transportable PLIIM-based 3-D digitization device ("3-D digitizer") of the present invention capable of producing 3-D digitized data models of scanned objects, for viewing on a LCD view finder integrated with the device housing (or on the display panel of an external computer graphics workstation), wherein the object under analysis is controllably rotated through a single planar laser illumination beam (PLIB) and a single amplitude modulated (AM) laser scanning beam generated by the 3-D digitization device so as to optically scan the object and automatically capture linear images and range-profile maps thereof relative to a coordinate reference system symbolically embodied within the 3-D digitization device, for subsequent reconstruction therein using computer-assisted tomographic (CAT) techniques to generate a 3-D digitized data model of the object for display, viewing and use in diverse applications;

FIG. 78B is an elevated frontal side view of the transportable PLIIM-based 3-D digitizer shown in FIG. 78A, showing the optically-isolated light transmission windows for the PLIIM-based object identification subsystem and the LDIP-based object detection and profiling/dimensioning subsystem embodied within the transportable housing of the 3-D digitizer;

FIG. 78C is an elevated rear side view of the transportable PLIIM-based 3-D digitizer shown in FIG. 78A, showing the LCD viewfinder, touch-type control pad, and removable media port provided within the rear panel of the transportable housing of the 3-D digitizer;

FIG. 79A is a schematic presentation of a transportable PLIIM-based 3-D digitization device ("3-D digitizer") of the present invention capable of producing 3-D digitized data models of scanned objects, for viewing on a LCD view finder integrated with the device housing (or on the display panel of an external computer graphics workstation), wherein a single planar laser illumination beam (PLIB) and a single amplitude modulated (AM) laser scanning beam are generated by the 3-D digitization device and automatically swept through the 3-D scanning volume in which the object under analysis resides so as to optically scan the object and automatically capture linear images and range-profile maps thereof relative to a coordinate reference system symbolically embodied within the 3-D digitization device, for subsequent reconstruction therein using computer-assisted tomographic (CAT) techniques to generate a 3-D digitized data model of the object for display, viewing and use in diverse applications;

FIG. 79B is an elevated frontal side view of the transportable PLIIM-based 3-D digitizer shown in FIG. 79A, showing the optically-isolated light transmission windows for the PLIIM-based object identification subsystem and the LDIP-based object detection and profiling/dimensioning subsystem embodied within the transportable housing of the 3-D digitizer;

FIG. 79C is an elevated rear side view of the transportable PLIIM-based 3-D digitizer shown in FIG. 79A, showing the LCD viewfinder, touch-type control pad, and removable media port provided within the rear panel of the transportable housing of the 3-D digitizer;

FIG. 80 is a schematic representation of a second illustrative embodiment of the automatic vehicle identification (AVI) system of the present invention constructed using a pair of PLIIM-based imaging and profiling subsystems taught herein;

FIG. 81A is a schematic representation of a first illustrative embodiment of the automatic vehicle identification (AVI) system of the present invention constructed using only a single PLIIM-based imaging and profiling subsystem taught herein;

FIG. 81B is a perspective view of the PLIIM-based imaging and profiling subsystem employed in the AVI system of FIG. 81A, showing the electronically-switchable PLIB/FOV direction module attached to the PLIIM-based imaging and profiling subsystem;

FIG. 81C is an elevated side view of the PLIIM-based imaging and profiling subsystem employed in the AVI system of FIG. 81A, showing the electronically-switchable PLIB/FOV direction module attached to the PLIIM-based imaging and profiling subsystem;

FIG. 81D is a schematic representation of the operation of AVI system shown in FIGS. 81A through 81C;

FIG. 82 is a schematic representation of the automatic vehicle classification (AVC) system of the present invention constructed using a several PLIIM-based imaging and profiling subsystems taught herein, shown mounted overhead and laterally along the roadway passing through the AVC system;

FIG. 83 is a schematic representation of the automatic vehicle identification and classification (AVIC) system of the present invention constructed using PLIIM-based imaging and profiling subsystems taught herein;

FIG. 84A is a first perspective view of the PLIIM-based object identification and attribute acquisition system of the present invention, in which a high-intensity ultra-violet germicide irradiator (UVGI) unit is mounted for irradiating germs and other microbial agents, including viruses, bacterial spores and the like, while parcels, mail and other objects are being automatically identified by bar code reading and/or image lift and OCR processing by the system; and FIG. 84B is a second perspective view of the PLIIM-based object identification and attribute acquisition system of FIG. 84A, showing the light transmission aperture formed in the high-intensity ultra-violet germicide irradiator (UVGI) unit mounted to the housing of the system.

DETAILED DESCRIPTION OF THE ILLUSTRATIVE EMBODIMENTS OF THE PRESENT INVENTION

Referring to the figures in the accompanying Drawings, the preferred embodiments of the Planar Light Illumination and Imaging (PLIIM) System of the present invention will be described in great detail, wherein like elements will be indicated using like reference numerals.

Overview of the Planar Laser Illumination and Imaging (PLIIM) System of the Present Invention In accordance with the principles of the present invention, an object (e.g. a bar coded package, textual materials, graphical indicia, etc.) is illuminated by a substantially planar light illumination beam (PLIB), preferably a planar laser illumination beam, having substantially-planar spatial distribution characteristics along a planar direction which passes through the field of view (FOV) of an image formation and detection module (e.g. realized within a CCD-type digital electronic camera, a 35 mm optical-film photographic camera, or on a semiconductor chip as shown in FIGS. 37 through 38B hereof), along substantially the entire working (i.e. object) distance of the camera, while images of the illuminated target object are formed and detected by the image formation and detection (i.e. camera) module.

This inventive principle of coplanar light illumination and image formation is embodied in two different classes of the PLIIM-based systems, namely: (1) in PLIIM systems shown in FIGS. 1A, 1V1, 2A, 2I1, 3A, and 3J1, wherein the image formation and detection modules in these systems employ linear-type (1-D) image detection arrays; and (2) in PLIIM-based systems shown in FIGS. 4A, 5A and 6A, wherein the image formation and detection modules in these systems employ area-type (2-D) image detection arrays. Such image detection arrays can be realized using CCD, CMOS or other technologies currently known in the art or to be developed in the distance future. Among these illustrative systems, those shown in FIGS. 1A, 2A and 3A each produce a planar laser illumination beam that is neither scanned nor deflected relative to the system housing during planar laser illumination and image detection operations and thus can be said to use "stationary" planar laser illumination beams to read relatively moving bar code symbol structures and other graphical indicia. Those systems shown in FIGS. 1V1, 2I1, 3J1, 4A, 5A and 6A, each produce a planar laser illumination beam that is scanned (i.e. deflected) relative to the system housing during planar laser illumination and image detection operations and thus can be said to use "moving" planar laser illumination beams to read relatively stationary bar code symbol structures and other graphical indicia.

In each such system embodiments, it is preferred that each planar laser illumination beam is focused so that the minimum beam width thereof (e.g. 0.6 mm along its non-spreading direction, as shown in FIG. 1I2) occurs at a point or plane which is the farthest or maximum working (i.e. object) distance at which the system is designed to acquire images of objects, as best shown in FIG. 1I2. Hereinafter, this aspect of the present invention shall be deemed the "Focus Beam At Farthest Object Distance (FBAFOD)" principle.

In the case where a fixed focal length imaging subsystem is employed in the PLIIM-based system, the FBAFOD principle helps compensate for decreases in the power density of the incident planar laser illumination beam due to the fact that the width of the planar laser illumination beam increases in length for increasing object distances away from the imaging subsystem.

In the case where a variable focal length (i.e. zoom) imaging subsystem is employed in the PLIIM-based system, the FBAFOD principle helps compensate for (i) decreases in the power density of the incident planar illumination beam due to the fact that the width of the planar laser illumination beam increases in length for increasing object distances away from the imaging subsystem, and (ii) any $1/r^2$ type losses that would typically occur when using the planar laser planar illumination beam of the present invention.

By virtue of the present invention, scanned objects need only be illuminated along a single plane which is coplanar with a planar section of the field of view of the image formation and detection module (e.g. camera) during illumination and imaging operations carried out by the PLIIM-based system. This enables the use of low-power, light-weight, high-response, ultra-compact, high-efficiency solid-state illumination producing devices, such as visible laser diodes (VLDs), to selectively illuminate ultra-narrow sections of an object during image formation and detection operations, in contrast with high-power, low-response, heavy-weight, bulky, low-efficiency lighting equipment (e.g. sodium vapor lights) required by prior art illumination and image detection systems. In addition, the planar laser illumination techniques of the present invention enables high-speed modulation of the planar laser illumination beam, and use of simple (i.e. substantially-monochromatic wavelength) lens designs for substantially-monochromatic optical illumination and image formation and detection operations.

As will be illustrated in greater detail hereinafter, PLIIM-based systems embodying the "planar laser illumination" and "FBAFOD" principles of the present invention can be embodied within a wide variety of bar code symbol reading and scanning systems, as well as image-lift and optical character, text, and image recognition systems and devices well known in the art.

In general, bar code symbol reading systems can be grouped into at least two general scanner categories, namely: industrial scanners; and point-of-sale (POS) scanners.

An industrial scanner is a scanner that has been designed for use in a warehouse or shipping application where large numbers of packages must be scanned in rapid succession. Industrial scanners include conveyor-type scanners, and hold-under scanners. These scanner categories will be described in greater detail below.

Conveyor scanners are designed to scan packages as they move by on a conveyor belt. In general, a minimum of six conveyors (e.g. one overhead scanner, four side scanners, and one bottom scanner) are necessary to obtain complete coverage of the conveyor belt and ensure that any label will be scanned no matter where on a package it appears. Conveyor scanners can be further grouped into top, side, and bottom scanners which will be briefly summarized below.

Top scanners are mounted above the conveyor belt and look down at the tops of packages transported therealong. It might be desirable to angle the scanner's field of view slightly in the direction from which the packages approach or that in which they recede depending on the shapes of the packages being scanned. A top scanner generally has less severe depth of field and variable focus or dynamic focus requirements compared to a side scanner as the tops of packages are usually fairly flat, at least compared to the extreme angles that a side scanner might have to encounter during scanning operations.

Side scanners are mounted beside the conveyor belt and scan the sides of packages transported therealong. It might be desirable to angle the scanner's field of view slightly in the direction from which the packages approach or that in which they recede depending on the shapes of the packages being scanned and the range of angles at which the packages might be rotated.

Side scanners generally have more severe depth of field and variable focus or dynamic focus requirements compared to a top scanner because of the great range of angles at which the sides of the packages may be oriented with respect to the scanner (this assumes that the packages can have random rotational orientations; if an apparatus upstream on the on the conveyor forces the packages into consistent orientations, the difficulty of the side scanning task is lessened). Because side scanners can accommodate greater variation in object distance over the surface of a single target object, side scanners can be mounted in the usual position of a top scanner for applications in which package tops are severely angled.

Bottom scanners are mounted beneath the conveyor and scans the bottoms of packages by looking up through a break in the belt that is covered by glass to keep dirt off the scanner. Bottom scanners generally do not have to be variably or dynamically focused because its working distance is roughly constant, assuming that the packages are intended to be in contact with the conveyor belt under normal operating conditions. However, boxes tend to bounce around as they travel on the belt, and this behavior can be amplified when a package crosses the break, where one belt section ends and another begins after a gap of several inches. For this reason, bottom scanners must have a large depth of field to accommodate these random motions, to which a variable or dynamic focus system could not react quickly enough.

Hold-under scanners are designed to scan packages that are picked up and held underneath it. The package is then manually routed or otherwise handled, perhaps based on the result of the scanning operation. Hold-under scanners are generally mounted so that its viewing optics are oriented in downward direction, like a library bar code scanner. Depth of field (DOF) is an important characteristic for hold-under scanners, because the operator will not be able to hold the package perfectly still while the image is being acquired.

Point-of-sale (POS) scanners are typically designed to be used at a retail establishment to determine the price of an item being purchased. POS scanners are generally smaller than industrial scanner models, with more artistic and ergonomic case designs. Small size, low weight, resistance to damage from accident drops and user comfort, are all major design factors for POS scanner. POS scanners include hand-held scanners, hands-free presentation scanners and combination-type scanners supporting both hands-on and hands-free modes of operation. These scanner categories will be described in greater detail below.

Hand-held scanners are designed to be picked up by the operator and aimed at the label to be scanned.

Hands-free presentation scanners are designed to remain stationary and have the item to be scanned picked up and passed in front of the scanning device. Presentation scanners can be mounted on counters looking horizontally, embedded flush with the counter looking vertically, or partially embedded in the counter looking vertically, but having a "tower" portion which rises out above the counter and looks horizontally to accomplish multiple-sided scanning. If necessary, presentation scanners that are mounted in a counter surface can also include a scale to measure weights of items.

Some POS scanners can be used as handheld units or mounted in stands to serve as presentation scanners, depending on which is more convenient for the operator based on the item that must be scanned.

Various generalized embodiments of the PLIIM system of the present invention will now be described in great detail, and after each generalized embodiment, various applications thereof will be described.

First Generalized Embodiment of the PLIIM-Based System of the Present Invention

The first generalized embodiment of the PLIIM-based system of the present invention 1 is illustrated in FIG. 1A. As shown therein, the PLIIM-based system 1 comprises: a housing 2 of compact construction; a linear (i.e. 1-dimensional) type image formation and detection (IFD) module 3 including a 1-D electronic image detection array 3A, and a linear (1-D) imaging subsystem (LIS) 3B having a fixed focal length, a fixed focal distance, and a fixed field of view (FOV), for forming a 1-D image of an illuminated object 4 located within the fixed focal distance and FOV thereof and projected onto the 1-D image detection array 3A, so that the 1-D image detection array 3A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 3, such that each planar laser illumination array 6A and 6B produces a plane of laser beam illumination 7A, 7B which is disposed substantially coplanar with the field view of the image formation and detection module 3 during object illumination and image detection operations carried out by the PLIIM-based system.

An image formation and detection (IFD) module 3 having an imaging lens with a fixed focal length has a constant angular field of view (FOV), that is, the imaging subsystem can view more of the target object's surface as the target object is moved further away from the IFD module. A major disadvantage to this type of imaging lens is that the resolution of the image that is acquired, expressed in terms of pixels or dots per inch (dpi), varies as a function of the distance from the target object to the imaging lens. However, a fixed focal length imaging lens is easier and less expensive to design and produce than a zoom-type imaging lens which will be discussed in detail hereinbelow with reference to FIGS. 3A through 3J4.

The distance from the imaging lens 3B to the image detecting (i.e. sensing) array 3A is referred to as the image distance. The distance from the target object 4 to the imaging lens 3B is called the object distance. The relationship between the object distance (where the object resides) and the image distance (at which the image detection array is mounted) is a function of the characteristics of the imaging lens, and assuming a thin lens, is determined by the thin (imaging) lens equation (1) defined below in greater detail. Depending on the image distance, light reflected from a target object at the object distance will be brought into sharp focus on the detection array plane. If the image distance remains constant and the target object is moved to a new object distance, the imaging lens might not be able to bring the light reflected off the target object (at this new distance) into sharp focus. An image formation and detection (IFD) module having an imaging lens with fixed focal distance cannot adjust its image distance to compensate for a change in the target's object distance; all the component lens elements in the imaging subsystem remain stationary. Therefore, the depth of field (DOF) of the imaging subsystems alone must be sufficient to accommodate all possible object distances and orientations. Such basic optical terms and concepts will be discussed in more formal detail hereinafter with reference to FIGS. 1J1 and 1J6.

In accordance with the present invention, the planar laser illumination arrays 6A and 6B, the linear image formation and detection (IFD) module 3, and any non-moving FOV and/or planar laser illumination beam folding mirrors employed in any particular system configuration described herein, are fixedly mounted on an optical bench 8 or chassis so as to prevent any relative motion (which might be caused by vibration or temperature changes) between: (i) the image forming optics (e.g. imaging lens) within the image formation and detection module 3 and any stationary FOV folding mirrors employed therewith; and (ii) each planar laser illumination array (i.e. VLD/cylindrical lens assembly) 6A, 6B and any planar laser illumination beam folding mirrors employed in the PLIIM system configuration. Preferably, the chassis assembly should provide for easy and secure alignment of all optical components employed in the planar laser illumination arrays 6A and 6B as well as the image formation and detection module 3, as well as be easy to manufacture, service and repair. Also, this PLIIM-based system 1 employs the general "planar laser illumination" and "focus beam at farthest object distance (FBAFOD)" principles described above. Various illustrative embodiments of this generalized PLIIM-based system will be described below.

First Illustrative Embodiment of the PLIIM-Based System of the Present Invention Shown in FIG. 1A The first illustrative embodiment of the PLIIM-based system 1A of FIG. 1A is shown in FIG. 1B1. As illustrated therein, the field of view of the image formation and detection module 3 is folded in the downwardly direction by a field of view (FOV) folding mirror 9 so that both the folded field of view 10 and resulting first and second planar laser illumination beams 7A and 7B produced by the planar illumination arrays 6A and 6B, respectively, are arranged in a substantially coplanar relationship during object illumination and image detection operations. One primary advantage of this system design is that it enables a construction having an ultra-low height profile suitable, for example, in unitary object identification and attribute acquisition systems of the type disclosed in FIGS. 17–22, wherein the image-based bar code symbol reader needs to be installed within a compartment (or cavity) of a housing having relatively low height dimensions. Also, in this system design, there is a relatively high degree of freedom provided in where the image formation and detection module 3 can be mounted on the optical bench of the system, thus enabling the field of view (FOV) folding technique disclosed in FIG. 1L1 to practiced in a relatively easy manner.

The PLIIM system 1A illustrated in FIG. 1B1 is shown in greater detail in FIGS. 1B2 and IB3. As shown therein, the linear image formation and detection module 3 is shown comprising an imagine subsystem 3B, and a linear array of photo-electronic detectors 3A realized using high-speed CCD technology (e.g. Dalsa IT-P4 Linear Image Sensors, from Dalsa, Inc. located on the WWW at http://www.dalsa.com). As shown, each planar laser illumination array 6A, 6B comprises a plurality of planar laser illumination modules (PLIMs) 11A through 11F, closely arranged relative to each other, in a rectilinear fashion. For purposes of clarity, each PLIM is indicated by reference numeral. As shown in FIGS. 1K1 and 1K2, the relative spacing of each PLIM is such that the spatial intensity distribution of the individual planar laser beams superimpose and additively provide a substantially uniform composite spatial intensity distribution for the entire planar laser illumination array 6A and 6B.

In FIG. 1B3, greater focus is accorded to the planar light illumination beam (PLIB) and the magnified field of view (FOV) projected onto an object during conveyor-type illumination and imaging applications, as shown in FIG. 1B1. As shown in FIG. 1B3, the height dimension of the PLIB is substantially greater than the height dimension of the magnified field of view (FOV) of each image detection element in the linear CCD image detection array so as to decrease the range of tolerance that must be maintained between the PLIB and the FOV. This simplifies construction and maintenance of such PLIIM-based systems. In FIGS. 1B4 and 1B5, an exemplary mechanism is shown for adjustably mounting each VLD in the PLIA so that the desired beam profile characteristics can be achieved during calibration of each PLIA. As illustrated in FIG. 1B4, each VLD block in the illustrative embodiment is designed to tilt plus or minus 2 degrees relative to the horizontal reference plane of the PLIA. Such inventive features will be described in greater detail hereinafter.

FIG. 1C is a schematic representation of a single planar laser illumination module (PLIM) 11 used to construct each planar laser illumination array 6A, 6B shown in FIG. 1B2. As shown in FIG. 1C, the planar laser illumination beam emanates substantially within a single plane along the direction of beam propagation towards an object to be optically illuminated.

As shown in FIG. 1D, the planar laser illumination module of FIG. 1C comprises: a visible laser diode (VLD) 13 supported within an optical tube or block 14; a light collimating (i.e. focusing) lens 15 supported within the optical tube 14; and a cylindrical-type lens element 16 configured together to produce a beam of planar laser illumination 12. As shown in FIG. 1E, a focused laser beam 17 from the focusing lens 15 is directed on the input side of the cylindrical lens element 16, and a planar laser illumination beam 12 is produced as output therefrom.

As shown in FIG. 1F, the PLIIM-based system 1A of FIG. 1A comprises: a pair of planar laser illumination arrays 6A and 6B, each having a plurality of PLIMs 11A through 11F, and each PLIM being driven by a VLD driver circuit 18 controlled by a micro-controller 720 programmable (by camera control computer 22) to generate diverse types of drive-current functions that satisfy the input power and output intensity requirements of each VLD in a real-time manner; linear-type image formation and detection module 3; field of view (FOV) folding mirror 9, arranged in spatial relation with the image formation and detection module 3; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer, including image-based bar code symbol decoding software such as, for example, SwiftDecode™ Bar Code Decode Software, from Omniplanar, Inc., of Princeton, N.J. (http://www.omniplanar.com); and a camera control computer 22 operably connected to the various components within the system for controlling the operation thereof in an orchestrated manner.

Detailed Description of an Exemplary Realization of the PLIIM-Based System Shown in FIG. 1B1 Through 1F

Referring now to FIGS. 1G1 through 1N2, an exemplary realization of the PLIIM-based system shown in FIGS. 1B1 through 1F will now be described in detail below.

As shown in FIGS. 1G1 and 1G2, the PLIIM system 25 of the illustrative embodiment is contained within a compact housing 26 having height, length and width dimensions 45", 21.7", and 19.7" to enable easy mounting above a conveyor belt structure or the like. As shown in FIG. 1G1, the PLIIM-based system comprises an image formation and detection module 3, a pair of planar laser illumination arrays 6A, 6B, and a stationary field of view (FOV) folding structure (e.g. mirror, refractive element, or diffractive element) 9, as shown in FIGS. 1B1 and 1B2. The function of the FOV folding mirror 9 is to fold the field of view (FOV) of the image formation and detection module 3 in a direction that is coplanar with the plane of laser illumination beams 7A and 7B produced by the planar illumination arrays 6A and 6B respectively. As shown, components 6A, 6B, 3 and 9 are fixedly mounted to an optical bench 8 supported within the compact housing 26 by way of metal mounting brackets that force the assembled optical components to vibrate together on the optical bench. In turn, the optical bench is shock mounted to the system housing using techniques which absorb and dampen shock forces and vibration. The 1-D CCD imaging array 3A can be realized using a variety of commercially available high-speed line-scan camera systems such as, for example, the Piranha Model Nos. CT-P4, or CL-P4 High-Speed CCD Line Scan Camera, from Dalsa, Inc. USA—http://www.dalsa.com. Notably, image frame grabber 17, image data buffer (e.g. VRAM) 20, image processing computer 21, and camera control computer 22 are realized on one or more printed circuit (PC) boards contained within a camera and system electronic module 27 also mounted on the optical bench, or elsewhere in the system housing 26.

In general, the linear CCD image detection array (i.e. sensor) 3A has a single row of pixels, each of which measures from several μm to several tens of μm along each dimension. Square pixels are most common, and most convenient for bar code scanning applications, but different aspect ratios are available. In principle, a linear CCD detection array can see only a small slice of the target object it is imaging at any given time. For example, for a linear CCD detection array having 2000 pixels, each of which is 10 μm square, the detection array measures 2 cm long by 10 μm high. If the imaging lens 3B in front of the linear detection array 3A causes an optical magnification of 10×, then the 2 cm length of the detection array will be projected onto a 20 cm length of the target object. In the other dimension, the 10 μm height of the detection array becomes only 100 μm when projected onto the target. Since any label to be scanned will typically measure more than a hundred μm or so in each direction, capturing a single image with a linear image detection array will be inadequate. Therefore, in practice, the linear image detection array employed in each of the PLIIM-based systems shown in FIGS. 1A through 3J6 builds up a complete image of the target object by assembling a series of linear (1-D) images, each of which is taken of a different slice of the target object. Therefore, successful use of a linear image detection array in the PLIIM-based systems shown in FIGS. 1A through 3J6 requires relative movement between the target object and the PLIIM system. In general, either the target object is moving and the PLIIM system is stationary, or else the field of view of the PLIIM-based system is swept across a relatively stationary target object, as shown in FIGS. 3J1 through 3J4. This makes the linear image detection array a natural choice for conveyor scanning applications.

As shown in FIG. 1G1, the compact housing 26 has a relatively long light transmission window 28 of elongated dimensions for projecting the FOV of the image formation and detection (IFD) module 3 through the housing towards a predefined region of space outside thereof, within which objects can be illuminated and imaged by the system components on the optical bench 8. Also, the compact housing 26 has a pair of relatively short light transmission apertures 29A and 29B closely disposed on opposite ends of light transmission window 28, with minimal spacing therebetween, as shown in FIG. 1G1, so that the FOV emerging from the housing 26 can spatially overlap in a coplanar manner with the substantially planar laser illumination beams projected through transmission windows 29A and 29B, as close to transmission window 28 as desired by the system designer, as shown in FIGS. 1G3 and 1G4. Notably, in some applications, it is desired for such coplanar overlap between the FOV and planar laser illumination beams to occur very close to the light transmission windows 20, 29A and 29B (i.e. at short optical throw distances), but in other applications, for such coplanar overlap to occur at large optical throw distances.

In either event, each planar laser illumination array 6A and 6B is optically isolated from the FOV of the image formation and detection module 3. In the preferred embodiment, such optical isolation is achieved by providing a set of opaque wall structures 30A 30B about each planar laser illumination array, from the optical bench 8 to its light transmission window 29A or 29B, respectively. Such optical isolation structures prevent the image formation and detection module 3 from detecting any laser light transmitted directly from the planar laser illumination arrays 6A, 6B within the interior of the housing. Instead, the image formation and detection module 3 can only receive planar laser illumination that has been reflected off an illuminated object, and focused through the imaging subsystem of module 3.

As shown in FIG. 1G3, each planar laser illumination array 6A, 6B comprises a plurality of planar laser illumination modules 11A through 11F, each individually and adjustably mounted to an L-shaped bracket 32 which, in turn, is adjustably mounted to the optical bench. As shown, a stationary cylindrical lens array 299 is mounted in front of each PLIA (6A, 6B) adjacent the illumination window formed within the optics bench 8 of the PLIIM-based system. The function performed by cylindrical lens array 299 is to optically combine the individual PLIB components produced from the PLIMs constituting the PLIA, and project the combined PLIB components onto points along the surface of the object being illuminated. By virtue of this inventive feature, each point on the object surface being imaged will be illuminated by different sources of laser illumination located at different points in space (i.e. by a source of spatially coherent-reduced laser illumination), thereby reducing the RMS power of speckle-pattern noise observable at the linear image detection array of the PLIIM-based system.

As mentioned above, each planar laser illumination module 11 must be rotatably adjustable within its L-shaped bracket so as permit easy yet secure adjustment of the position of each PLIM 11 along a common alignment plane extending within L-bracket portion 32A thereby permitting precise positioning of each PLIM relative to the optical axis of the image formation and detection module 3. Once properly adjusted in terms of position on the L-bracket portion 32A, each PLIM can be securely locked by an allen or like screw threaded into the body of the L-bracket portion 32A. Also, L-bracket portion 32B, supporting a plurality of PLIMs 11A through 11B, is adjustably mounted to the optical bench 8 and releasably locked thereto so as to permit precise lateral and/or angular positioning of the L-bracket 32B relative to the optical axis and FOV of the image formation and detection module 3. The function of such adjustment mechanisms is to enable the intensity distributions of the individual PLIMs to be additively configured together along a substantially singular plane, typically having a width or thickness dimension on the orders of the width and thickness of the spread or dispersed laser beam within each PLIM. When properly adjusted, the composite planar laser illumination beam will exhibit substantially uniform power density characteristics over the entire working range of the PLIIM-based system, as shown in FIGS. 1K1 and 1K2.

In FIG. 1G3, the exact position of the individual PLIMs 11A through 11F along its L-bracket 32A is indicated relative to the optical axis of the imaging lens 3B within the image formation and detection module 3. FIG. 1G3 also illustrates the geometrical limits of each substantially planar laser illumination beam produced by its corresponding PLIM, measured relative to the folded FOV 10 produced by the image formation and detection module 3. FIG. 1G4, illustrates how, during object illumination and image detection operations, the FOV of the image formation and detection module 3 is first folded by FOV folding mirror 19, and then arranged in a spatially overlapping relationship with the resulting/composite planar laser illumination beams in a coplanar manner in accordance with the principles of the present invention.

Notably, the PLIIM-based system of FIG. 1G1 has an image formation and detection module with an imaging subsystem having a fixed focal distance lens and a fixed focusing mechanism. Thus, such a system is best used in either hand-held scanning applications, and/or bottom scanning applications where bar code symbols and other structures can be expected to appear at a particular distance from the imaging subsystem. In FIG. 1G5, the spatial limits for the FOV of the image formation and detection module are shown for two different scanning conditions, namely: when imaging the tallest package moving on a conveyor belt structure; and when imaging objects having height values close to the surface of the conveyor belt structure. In a PLIIM-based system having a fixed focal distance lens and a fixed focusing mechanism, the PLIIM-based system would be capable of imaging objects under one of the two conditions indicated above, but not under both conditions. In a PLIIM-based system having a fixed focal length lens and a variable focusing mechanism, the system can adjust to image objects under either of these two conditions.

In order that PLLIM-based subsystem 25 can be readily interfaced to and an integrated (e.g. embedded) within various types of computer-based systems, as shown in FIGS. 9 through 34C, subsystem 25 also comprises an I/O subsystem 500 operably connected to camera control computer 22 and image processing computer 21, and a network controller 501 for enabling high-speed data communication with others computers in a local or wide area network using packet-based networking protocols (e.g. Ethernet, AppleTalk, etc.) well known in the art.

In the PLIIM-based system of FIG. 1G1, special measures are undertaken to ensure that (i) a minimum safe distance is maintained between the VLDs in each PLIM and the user's eyes, and (ii) the planar laser illumination beam is prevented from directly scattering into the FOV of the image formation and detection module, from within the system housing, during object illumination and imaging operations. Condition (i) above can be achieved by using a light shield 32A or 32B shown in FIGS. 1G6 and 1G7, respectively, whereas condition (ii) above can be achieved by ensuring that the planar laser illumination beam from the PLIAs and the field of view (FOV) of the imaging lens (in the IFD module) do not spatially overlap on any optical surfaces residing within the PLIIM-based system. Instead, the planar laser illumination beams are permitted to spatially overlap with the FOV of the imaging lens only outside of the system housing, measured at a particular point beyond the light transmission window 28, through which the FOV 10 is projected to the exterior of the system housing, to perform object imaging operations.

Detailed Description of the Planar Laser Illumination Modules (PLIMs) Employed in the Planar Laser Illumination Arrays (PLIAs) of the Illustrative Embodiments Referring now to FIGS. 1G8 through 1I2, the construction of each PLIM 14 and 15 used in the planar laser illumination arrays (PLIAs) will now be described in greater detail below.

As shown in FIG. 1G8, each planar laser illumination array (PLIA) 6A, 6B employed in the PLIIM-based system of FIG. 1G1, comprises an array of planar laser illumination modules (PLIMs) 11 mounted on the L-bracket structure 32, as described hereinabove. As shown in FIGS. 1G9 through 1G11, each PLIM of the illustrative embodiment disclosed herein comprises an assembly of subcomponents: a VLD mounting block 14 having a tubular geometry with a hollow central bore 14A formed entirely therethrough, and a v-shaped notch 14B formed on one end thereof; a visible laser diode (VLD) 13 (e.g. Mitsubishi ML1XX6 Series high-power 658 nm AlGaInP semiconductor laser) axially mounted at the end of the VLD mounting block, opposite the v-shaped notch 14B, so that the laser beam produced from the VLD 13 is aligned substantially along the central axis of the central bore 14A; a cylindrical lens 16, made of optical glass (e.g. borosilicate) or plastic having the optical characteristics specified, for example, in FIGS. 1G1 and 1G2, and fixedly mounted within the V-shaped notch 14B at the end of the VLD mounting block 14, using an optical cement or other lens fastening means, so that the central axis of the cylindrical lens 16 is oriented substantially perpendicular to the optical axis of the central bore 14A; and a focusing lens 15, made of central glass (e.g. borosilicate) or plastic having the optical characteristics shown, for example, in FIGS. 1H and 1H2, mounted within the central bore 14A of the VLD mounting block 14 so that the optical axis of the focusing lens 15 is substantially aligned with the central axis of the bore 14A, and located at a distance from the VLD which causes the laser beam output from the VLD 13 to be converging in the direction of the cylindrical lens 16. Notably, the function of the cylindrical lens 16 is to disperse (i.e. spread) the focused laser beam from focusing lens 15 along the plane in which the cylindrical lens 16 has curvature, as shown in FIG. 1I1 while the characteristics of the planar laser illumination beam (PLIB) in the direction transverse to the propagation plane are determined by the focal length of the focusing lens 15, as illustrated in FIGS. 1I1 and 1I2.

As will be described in greater detail hereinafter, the focal length of the focusing lens 15 within each PLIM hereof is preferably selected so that the substantially planar laser illumination beam produced from the cylindrical lens 16 is focused at the farthest object distance in the field of view of the image formation and detection module 3, as shown in FIG. 1I2, in accordance with the "FBAFOD" principle of the present invention. As shown in the exemplary embodiment of FIGS. 1I1 and 1I2, wherein each PLIM has maximum object distance of about 61 inches (i.e. 155 centimeters), and the cross-sectional dimension of the planar laser illumination beam emerging from the cylindrical lens 16, in the non-spreading (height) direction, oriented normal to the propagation plane as defined above, is about 0.15 centimeters and ultimately focused down to about 0.06 centimeters at the maximal object distance (i.e. the farthest distance at which the system is designed to capture images). The behavior of the height dimension of the planar laser illumination beam is determined by the focal length of the focusing lens 15 embodied within the PLIM. Proper selection of the focal length of the focusing lens 15 in each PLIM and the distance between the VLD 13 and the focusing lens 15B indicated by reference No. (D), can be determined using the thin lens equation (1) below and the maximum object distance required by the PLIIM-based system, typically specified by the end-user. As will be explained in greater detail hereinbelow, this preferred method of VLD focusing helps compensate for decreases in the power density of the incident planar laser illumination beam (on target objects) due to the fact that the width of the planar laser illumination beam increases in length for increasing distances away from the imaging subsystem (i.e. object distances).

After specifying the optical components for each PLIM, and completing the assembly thereof as described above, each PLIM is adjustably mounted to the L-bracket position 32A by way of a set of mounting/adjustment screws turned through fine-threaded mounting holes formed thereon. In FIG. 1G10, the plurality of PLIMs 11A through 11F are shown adjustably mounted on the L-bracket at positions and angular orientations which ensure substantially uniform power density characteristics in both the near and far field portions of the planar laser illumination field produced by planar laser illumination arrays (PLIAs) 6A and 6B cooperating together in accordance with the principles of the present invention. Notably, the relative positions of the PLIMs indicated in FIG. 1G9 were determined for a particular set of a commercial VLDs 13 used in the illustrative embodiment of the present invention, and, as the output beam characteristics will vary for each commercial VLD used in constructing each such PLIM, it is therefore understood that each such PLIM may need to be mounted at different relative positions on the L-bracket of the planar laser illumination array to obtain, from the resulting system, substantially uniform power density characteristics at both near and far regions of the planar laser illumination field produced thereby.

While a refractive-type cylindrical lens element 16 has been shown mounted at the end of each PLIM of the illustrative embodiments, it is understood each cylindrical lens element can be realized using refractive, reflective and/or diffractive technology and devices, including reflection and transmission type holographic optical elements (HOEs) well know in the art and described in detail in International Application No. WO 99/57579 published on Nov. 11, 1999, incorporated herein by reference. As used hereinafter and in the claims, the terms "cylindrical lens", "cylindrical lens element" and "cylindrical optical element (COE)" shall be deemed to embrace all such alternative embodiments of this aspect of the present invention.

The only requirement of the optical element mounted at the end of each PLIM is that it has sufficient optical properties to convert a focusing laser beam transmitted therethrough, into a laser beam which expands or otherwise spreads out only along a single plane of propagation, while the laser beam is substantially unaltered (i.e. neither compressed or expanded) in the direction normal to the propagation plane.

Alternative Embodiments of the Planar Laser Illumination Module (PLIM) of the Present Invention There are means for producing substantially planar laser beams (PLIBs) without the use of cylindrical optical elements. For example, U.S. Pat. No. 4,826,299 to Powell, incorporated herein by reference, discloses a linear diverging lens which has the appearance of a prism with a relatively sharp radius at the apex, capable of expanding a laser beam in only one direction. In FIG. 1G16A, a first type Powell lens 16A is shown embodied within a PLIM housing by simply replacing the cylindrical lens element 16 with a suitable Powell lens 16A taught in U.S. Pat. No. 4,826,299. In this alternative embodiment, the Powell lens 16A is disposed after the focusing/collimating lens 15' and VLD 13. In FIG. 1G16B, generic Powell lens 16B is shown embodied within a PLIM housing along with a collimating/focusing lens 15' and VLD 13. The resulting PLIMs can be used in any PLIIM-based system of the present invention.

Alternatively, U.S. Pat. No. 4,589,738 to Ozaki discloses an optical arrangement which employs a convex reflector or a concave lens to spread a laser beam radially and then a cylindrical-concave reflector to converge the beam linearly to project a laser line. Like the Powell lens, the optical arrangement of U.S. Pat. No. 4,589,738 can be readily embodied within the PLIM of the present invention, for use in a PLIIM-based system employing the same.

In FIGS. 1G17 through 1G17D, there is shown an alternative embodiment of the PLIM of the present invention 729, wherein a visible laser diode (VLD) 13, and a pair of small cylindrical (i.e. PCX and PCV) lenses 730 and 731 are both mounted within a lens barrel 732 of compact construction. As shown, the lens barrel 732 permits independent adjustment of the lenses along both translational and rotational directions, thereby enabling the generation of a substantially planar laser beam therefrom. The PCX-type lens 730 has one plano surface 730A and a positive cylindrical surface 730B with its base and the edges cut in a circular profile. The function of the PCX-type lens 730 is laser beam focusing. The PCV-type lens 731 has one plano surface 731A and a negative cylindrical surface 731B with its base and edges cut in a circular profile. The function of the PCX-type lens 730 is laser beam spreading (i.e. diverging or planarizing).

As shown in FIGS. 1G17B and 1G17C, the PCX lens 730 is capable of undergoing translation in the x direction for focusing, and rotation about the x axis to ensure that it only effects the beam along one axis. Set-type screws or other lens fastening mechanisms can be used to secure the position of the PCX lens within its barrel 732 once its position has been properly adjusted during calibration procedure.

As shown in FIG. 1G17D, the PCV lens 731 is capable of undergoing rotation about the x axis to ensure that it only effects the beam along one axis. FIGS. 1G17E and 1G17F illustrate that the VLD 13 requires rotation about the y and x axes, for aiming and desmiling the planar laser illumination beam produced from the PLIM. Set-type screws or other lens fastening mechanisms can be used to secure the position and alignment of the PCV-type lens 731 within its barrel 732 once its position has been properly adjusted during calibration procedure. Likewise, set-type screws or other lens fastening mechanisms can be used to secure the position and alignment of the VLD 13 within its barrel 732 once its position has been properly adjusted during calibration procedure.

In the illustrative embodiments, one or more PLIMs 729 described above can be integrated together to produce a PLIA in accordance with the principles of the present invention. Such the PLIMs associated with the PLIA can be mounted along a common bracket, having PLIM-based multi-axial alignment and pitch mechanisms as illustrated in FIGS. 1B4 and 1B5 and described below.

Multi-Axis VLD Mounting Assembly Embodied Within Planar Laser Illumination (PLIA) of the Present Invention In order to achieve the desired degree of uniformity in the power density along the PLIB generated from a PLIIM-based system of the present invention, it will be helpful to use the multi-axial VLD mounting assembly of FIGS. 1B4 and 1B in each-PLIA employed therein. As shown in FIG. 1B4, each PLIM is mounted along its PLIA so that (1) the PLIM can be adjustably tilted about the optical axis of its VLD 13, by at least a few degrees measured from the horizontal reference plane as shown in FIG. 1B4, and so that (2) each VLD block can be adjustably pitched forward for alignment with other VLD beams, as illustrated in FIG. 1B5. The tilt-adjustment function can be realized by any mechanism that permits the VLD block to be releasably tilted relative to a base plate or like structure 740 which serves as a reference plane, from which the tilt parameter is measured. The pitch-adjustment function can be realized by any mechanism that permits the VLD block to be releasably pitched relative to a base plate or like structure which serves as a reference plane, from which the pitch parameter is measured. In a preferred embodiment, such flexibility in VLD block position and orientation can be achieved using a three axis gimbel-like suspension, or other pivoting mechanism, permitting rotational adjustment of the VLD block 14 about the X, Y and Z principle axes embodied therewithin. Set-type screws or other fastening mechanisms can be used to secure the position and alignment of the VLD block 14 relative to the PLIA base plate 740 once the position and orientation of the VLD block has been properly adjusted during a VLD calibration procedure.

Detailed Description of the Image Formation and Detection Module Employed in the PLIIM-Based System of the First Generalized Embodiment of the Present Invention In FIG. 1J1, there is shown a geometrical model (based on the thin lens equation) for the simple imaging subsystem 3B employed in the image formation and detection module 3 in the PLIIM-based system of the first generalized embodiment shown in FIG. 1A. As shown in FIG. 1J1, this simple imaging system 3B consists of a source of illumination (e.g. laser light reflected off a target object) and an imaging lens. The illumination source is at an object distance $r_0$ measured from the center of the imaging lens. In FIG. 1J1, some representative rays of light have been traced from the source to the front lens surface. The imaging lens is considered to be of the converging type which, for ordinary operating conditions, focuses the incident rays from the illumination source to form an image which is located at an image distance $r_i$ on the opposite side of the imaging lens. In FIG. 1J1, some representative rays have also been traced from the back lens surface to the image. The imaging lens itself is characterized by a focal length f, the definition of which will be discussed in greater detail hereinbelow.

For the purpose of simplifying the mathematical analysis, the imaging lens is considered to be a thin lens, that is, idealized to a single surface with no thickness. The parameters f, $r_0$ and $r_i$, all of which have units of length, are related by the "thin lens" equation (1) set forth below:

$$\frac{1}{f} = \frac{1}{r_0} + \frac{1}{r_i} \tag{1}$$

This equation may be solved for the image distance, which yields expression (2)

$$r_i = \frac{fr_0}{r_0 - f} \tag{2}$$

If the object distance $r_0$ goes to infinity, then expression (2) reduces to $r_i$=f. Thus, the focal length of the imaging lens is the image distance at which light incident on the lens from an infinitely distant object will be focused. Once f is known, the image distance for light from any other object distance can be determined using (2).

Field of View of the Imaging Lens and Resolution of the Detected Image

The basic characteristics of an image detected by the IFD module 3 hereof may be determined using the technique of ray tracing, in which representative rays of light are drawn from the source through the imaging lens and to the image. Such ray tracing is shown in FIG. 1J2. A basic rule of ray tracing is that a ray from the illumination source that passes through the center of the imaging lens continues undeviated to the image. That is, a ray that passes through the center of the imaging lens is not refracted. Thus, the size of the field of view (FOV) of the imaging lens may be determined by tracing rays (backwards) from the edges of the image detection/sensing array through the center of the imaging lens and out to the image plane as shown in FIG. 1J2, where d is the dimension of a pixel, n is the number of pixels on the image detector array in this direction, and W is the dimension of the field of view of the imaging lens. Solving for the FOV dimension W, and substituting for $r_i$ using expression (2) above yields expression (3) as follows:

$$W = \frac{dn(r_0 - f)}{f} \tag{3}$$

Now that the size of the field of view is known, the dpi resolution of the image is determined. The dpi resolution of the image is simply the number of pixels divided by the dimension of the field of view. Assuming that all the dimensions of the system are measured in meters, the dots per inch (dpi) resolution of the image is given by the expression (4) as follows:

$$dpi = \frac{f}{39.37d(r_0 - f)} \tag{4}$$

Working Distance and Depth of Field of the Imaging Lens

Light returning to the imaging lens that emanates from object surfaces slightly closer to and farther from the imaging lens than object distance $r_0$ will also appear to be in good focus on the image. From a practical standpoint, "good focus" is decided by the decoding software 21 used when the image is too blurry to allow the code to be read (i.e. decoded), then the imaging subsystem is said to be "out of focus". If the object distance $r_0$ at which the imaging subsystem is ideally focused is known, then it can be calculated theoretically the closest and farthest "working distances" of the PLIIM-based system, given by parameters $r_{near}$ and $r_{far}$, respectively, at which the system will still function. These distance parameters are given by expression (5) and (6) as follows:

$$r_{near} = \frac{fr_0(f + DF)}{f^2 + DFr_0} \tag{5}$$

$$r_{far} = \frac{fr_0(f - DF)}{f^2 - DFr_0} \tag{6}$$

where D is the diameter of the largest permissible "circle of confusion" on the image detection array. A circle of confusion is essentially the blurred out light that arrives from points at image distances other than object distance $r_0$. When the circle of confusion becomes too large (when the blurred light spreads out too much) then one will lose focus. The value of parameter D for a given imaging subsystem is usually estimated from experience during system design, and then determined more precisely, if necessary, later through laboratory experiment.

Another optical parameter of interest is the total depth of field $\Delta r$, which is the difference between distances $r_{far}$, and $r_{near}$; this parameter is the total distance over which the imaging system will be able to operate when focused at object distance $r_0$. This optical parameter may be expressed by equation (7) below:

$$\Delta r = \frac{2Df^2Fr_0(r_0 - f)}{f^4 - D^2F^2r_0^2} \tag{7}$$

It should be noted that the parameter $\Delta r$ is generally not symmetric about $r_0$; the depth of field usually extends farther towards infinity from the ideal focal distance than it does back towards the imaging lens.

Modeling a Fixed Focal Length Imaging Subsystem Used in the Image Formation and Detection Module of the Present Invention A typical imaging (i.e. camera) lens used to construct a fixed focal-length image formation and detection module of the present invention might typically consist of three to fifteen or more individual optical elements contained within a common barrel structure. The inherent complexity of such an optical module prevents its performance from being described very accurately using a "thin lens analysis", described above by equation (1). However, the results of a thin lens analysis can be used as a useful guide when choosing an imaging lens for a particular PLIIM-based system application.

A typical imaging lens can focus light (illumination) originating anywhere from an infinite distance away, to a few feet away. However, regardless of the origin of such illumination, its rays must be brought to a sharp focus at exactly the same location (e.g. the film plane or image detector), which (in an ordinary camera) does not move. At first glance, this requirement may appear unusual because the thin lens equation (1) above states that the image distance at which light is focused through a thin lens is a function of the object distance at which the light originates, as shown in FIG. 1J3. Thus, it would appear that the position of the image detector would depend on the distance at which the object being imaged is located. An imaging subsystem having a variable focal distance lens assembly avoids this difficulty because several of its lens elements are capable of movement relative to the others. For a fixed focal length imaging lens, the leading lens element(s) can move back and forth a short distance, usually accomplished by the rotation of a helical barrel element which converts rotational motion into purely linear motion of the lens elements. This motion has the effect of changing the image distance to compensate for a change in object distance, allowing the image detector to remain in place, as shown in the schematic optical diagram of FIG. 1J4.

Modeling a Variable Focal Length (Zoom) Imaging Lens Used in the Image Formation and Detection Module of the Present Invention As shown in FIG. 1J5, a variable focal length (zoom) imaging subsystem has an additional level of internal complexity. A zoom-type imaging subsystem is capable of changing its focal length over a given range; a longer focal length produces a smaller field of view at a given object distance. Consider the case where the PLIIM-based system needs to illuminate and image a certain object over a range of object distances, but requires the illuminated object to appear the same size in all acquired images. When the object is far away, the PLIIM-based system will generate control signals that select a long focal length, causing the field of view to shrink (to compensate for the decrease in apparent size of the object due to distance). When the object is close, the PLIIM-based system will generate control signals that select a shorter focal length, which widens the field of view and preserves the relative size of the object. In many bar code scanning applications, a zoom-type imaging subsystem in the PLIIM-based system (as shown in FIGS. 3A through 3J5) ensures that all acquired images of bar code symbols have the same dpi image resolution regardless of the position of the bar code symbol within the object distance of the PLIIM-based system.

As shown in FIG. 1J5, a zoom-type imaging subsystem has two groups of lens elements which are able to undergo relative motion. The leading lens elements are moved to achieve focus in the same way as for a fixed focal length lens. Also, there is a group of lenses in the middle of the barrel which move back and forth to achieve the zoom, that is, to change the effective focal length of all the lens elements acting together.

Several Techniques for Accommodating the Field of View (FOV) of a PLIIM System to Particular End-User Environments In many applications, a PLIIM system of the present invention may include an imaging subsystem with a very long focal length imaging lens (assembly), and this PLIIM-based system must be installed in end-user environments having a substantially shorter object distance range, and/or field of view (FOV) requirements or the like. Such problems can exist for PLIIM systems employing either fixed or variable focal length imaging subsystems. To accommodate a particular PLIIM-based system for installation in such environments, three different techniques illustrated in FIGS. 1K1–1K2, 1L1 and 1L2 can be used.

In FIGS. 1K1 and 1K2, the focal length of the imaging lens 3B can be fixed and set at the factory to produce a field of view having specified geometrical characteristics for particular applications. In FIG. K1, the focal length of the image formation and detection module 3 is fixed during the optical design stage so that the fixed field of view (FOV) thereof substantially matches the scan field width measured at the top of the scan field, and thereafter overshoots the scan field and extends on down to the plane of the conveyor belt 34. In this FOV arrangement, the dpi image resolution will be greater for packages having a higher height profile above the conveyor belt, and less for envelope-type packages with low height profiles. In FIG. 1K2, the focal length of the image formation and detection module 3 is fixed during the optical design stage so that the fixed field of view thereof substantially matches the plane slightly above the conveyor belt 34 where envelope-type packages are transported. In this FOV arrangement, the dpi image resolution will be maximized for envelope-type packages which are expected to be transported along the conveyor belt structure, and this system will be unable to read bar codes on packages having a height-profile exceeding the low-profile scanning field of the system.

In FIG. 1L, a FOV beam folding mirror arrangement is used to fold the optical path of the imaging subsystem within the interior of the system housing so that the FOV emerging from the system housing has geometrical characteristics that match the scanning application at hand. As shown, this technique involves mounting a plurality of FOV folding mirrors 9A through 9E on the optical bench of the PLIIM system to bounce the FOV of the imaging subsystem 3B back and forth before the FOV emerges from the system housing. Using this technique, when the FOV emerges from the system housing, it will have expanded to a size appropriate for covering the entire scan field of the system. This technique is easier to practice with image formation and detection modules having linear image detectors, for which the FOV folding mirrors only have to expand in one direction as the distance from the imaging subsystem increases. In FIG. 1L, this direction of FOV expansion occurs in the direction perpendicular to the page. In the case of area-type PLIIM-based systems, as shown in FIGS. 4A through 6F4, the FOV folding mirrors have to accommodate a 3-D FOV which expands in two directions. Thus an internal folding path is easier to arrange for linear-type PLIIM-based systems.

In FIG. 1L2, the fixed field of view of an imaging subsystem is expanded across a working space (e.g. conveyor belt structure) by using a motor 35 to controllably rotate the FOV 10 during object illumination and imaging operations. When designing a linear-type PLIIM-based system for industrial scanning applications, wherein the focal length of the imaging subsystem is fixed, a higher dpi image resolution will occasionally be required. This implies using a longer focal length imaging lens, which produces a narrower FOV and thus higher dpi image resolution. However, in many applications, the image formation and detection module in the PLIIM-based system cannot be physically located far enough away from the conveyor belt (and within the system housing) to enable the narrow FOV to cover the entire scanning field of the system. In this case, a FOV folding mirror 9F can be made to rotate, relative to stationary for folding mirror 9G, in order to sweep the linear FOV from side to side over the entire width of the conveyor belt, depending on where the bar coded package is located. Ideally, this rotating FOV folding mirror 9F would have only two mirror positions, but this will depend on how small the FOV is at the top of the scan field. The rotating FOV folding mirror can be driven by motor 35 operated under the control of the camera control computer 22, as described herein.

Method of Adjusting the Focal Characteristics of Planar Laser Illumination Beams Generated by Planar Laser Illumination Arrays Used in Conjunction with Image Formation and Detection Modules Employing Fixed Focal Length Imaging Lenses In the case of a fixed focal length camera lens, the planar laser illumination beam 7A, 7B is focused at the farthest possible object distance in the PLIIM-based system. In the case of fixed focal length imaging lens, this focus control technique of the present invention is not employed to compensate for decrease in the power density of the reflected laser beam as a function of $1/r^2$ distance from the imaging subsystem, but rather to compensate for a decrease in power density of the planar laser illumination beam on the target object due to an increase in object distance away from the imaging subsystem.

It can be shown that laser return light that is reflected by the target object (and measured/detected at any arbitrary point in space) decreases in intensity as the inverse square of the object distance. In the PLIIM-based system of the present invention, the relevant decrease in intensity is not related to such "inverse square" law decreases, but rather to the fact that the width of the planar laser illumination beam increases as the object distance increases. This "beam-width/object-distance" law decrease in light intensity will be described in greater detail below.

Using a thin lens analysis of the imaging subsystem, it can be shown that when any form of illumination having a uniform power density $E_0$ (i.e. power per unit area) is directed incident on a target object surface and the reflected laser illumination from the illuminated object is imaged through an imaging lens having a fixed focal length f and f-stop F, the power density $E_{pix}$ (measured at the pixel of the image detection array and expressed as a function of the object distance r) is provided by the expression (8) set forth below:

$$E_{pix} = \frac{E_0}{8F}\left(1 - \frac{f}{r}\right)^2 \tag{8}$$

FIG. 1M1 shows a plot of pixel power density $E_{pix}$ vs. object distance r calculated using the arbitrary but reasonable values $E_0$=1 W/m$^2$, f=80 mm and F=4.5. This plot demonstrates that, in a counter-intuitive manner, the power density at the pixel (and therefore the power incident on the pixel, as its area remains constant) actually increases as the object distance increases. Careful analysis explains this particular optical phenomenon by the fact that the field of view of each pixel on the image detection array increases slightly faster with increases in object distances than would be necessary to compensate for the $1/r^2$ return light losses. A more analytical explanation is provided below.

The width of the planar laser illumination beam increases as object distance r increases. At increasing object distances, the constant output power from the VLD in each planar laser illumination module (PLIM) is spread out over a longer beam width, and therefore the power density at any point along the laser beam width decreases. To compensate for this phenomenon, the planar laser illumination beam of the present invention is focused at the farthest object distance so that the height of the planar laser illumination beam becomes smaller as the object distance increases; as the height of the planar laser illumination beam becomes narrower towards the farthest object distance, the laser beam power density increases at any point along the width of the planar laser illumination beam. The decrease in laser beam power density due to an increase in planar laser beam width and the increase in power density due to a decrease in planar laser beam height, roughly cancel each other out, resulting in a power density which either remains approximately constant or increases as a function of increasing object distance, as the application at hand may require.

Also, as shown in conveyor application of FIG. 1B3, the height dimension of the planar laser illumination beam (PLIB) is substantially greater than the height dimension of the magnified field of view (FOV) of each image detection element in the linear CCD image detection array. The reason for this condition between the PLIB and the FOV is to decrease the range of tolerance which must be maintained when the PLIB and the FOV are aligned in a coplanar relationship along the entire working distance of the PLIIM-based system.

When the laser beam is fanned (i.e. spread) out into a substantially planar laser illumination beam by the cylindrical lens element employed within each PLIM in the PLIIM system, the total output power in the planar laser illumination beam is distributed along the width of the beam in a roughly Gaussian distribution, as shown in the power vs. position plot of FIG. 1M2. Notably, this plot was constructed using actual data gathered with a planar laser illumination beam focused at the farthest object distance in the PLIIM system. For comparison purposes, the data points and a Gaussian curve fit are shown for the planar laser beam widths taken at the nearest and farthest object distances. To avoid having to consider two dimensions simultaneously (i.e. left-to-right along the planar laser beam width dimension and near-to-far through the object distance dimension), the discussion below will assume that only a single pixel is under consideration, and that this pixel views the target object at the center of the planar laser beam width.

For a fixed focal length imaging lens, the width L of the planar laser beam is a function of the fan/spread angle θ induced by (i) the cylindrical lens element in the PLIM and (ii) the object distance r, as defined by the following expression (9):

$$L = 2r\tan\frac{\theta}{2} \tag{9}$$

FIG. 1M3 shows a plot of beam width length L versus object distance r calculated using θ=50°, demonstrating the planar laser beam width increases as a function of increasing object distance.

The height parameter of the planar laser illumination beam "h" is controlled by adjusting the focusing lens 15 between the visible laser diode (VLD) 13 and the cylindrical lens 16, shown in FIGS. 1I1 and 1I2. FIG. 1M4 shows a typical plot of planar laser beam height h vs. image distance r for a planar laser illumination beam focused at the farthest object distance in accordance with the principles of the present invention. As shown in FIG. 1M4, the height dimension of the planar laser beam decreases as a function of increasing object distance.

Assuming a reasonable total laser power output of 20 mW from the VLD 13 in each PLIM 11, the values shown in the plots of FIGS. 1M3 and 1M4 can be used to determine the power density $E_0$ of the planar laser beam at the center of its beam width, expressed as a function of object distance. This measure, plotted in FIG. 1N, demonstrates that the use of the laser beam focusing technique of the present invention, wherein the height of the planar laser illumination beam is decreased as the object distance increases, compensates for the increase in beam width in the planar laser illumination beam, which occurs for an increase in object distance. This yields a laser beam power density on the target object which increases as a function of increasing object distance over a substantial portion of the object distance range of the PLIIM system.

Finally, the power density $E_0$ plot shown in FIG. 1N can be used with expression (1) above to determine the power density on the pixel, $E_{pix}$. This $E_{pix}$ plot is shown in FIG. 1O. For comparison purposes, the plot obtained when using the beam focusing method of the present invention is plotted in FIG. 1O against a "reference" power density plot $E_{pix}$ which is obtained when focusing the laser beam at infinity, using a collimating lens (rather than a focusing lens 15) disposed after the VLD 13, to produce a collimated-type planar laser illumination beam having a constant beam height of 1 mm over the entire portion of the object distance range of the system. Notably, however, this non-preferred beam collimating technique, selected as the reference plot in FIG. 1O, does not compensate for the above-described effects associated with an increase in planar laser beam width as a function of object distance. Consequently, when using this non-preferred beam focusing technique, the power density of the planar laser illumination beam produced by each PLIM decreases as a function of increasing object distance.

Therefore, in summary, where a fixed or variable focal length imaging subsystem is employed in the PLIIM system hereof, the planar laser beam focusing technique of the present invention described above helps compensate for decreases in the power density of the incident planar illumination beam due to the fact that the width of the planar laser illumination beam increases for increasing object distances away from the imaging subsystem.

Producing a Composite Planar Laser Illumination Beam Having Substantially Uniform Power Density Characteristics in Near and Far Fields, by Additively Combining the Individual Gaussian Power Density Distributions of Planar Laser Illumination Beams Produced by Planar Laser Illumination Beam Modules (PLIMS) in Planar Laser Illumination Arrays (PLIAs)

Having described the best known method of focusing the planar laser illumination beam produced by each VLD in each PLIM in the PLIIM-based system hereof, it is appropriate at this juncture to describe how the individual Gaussian power density distributions of the planar laser illumination beams produced a PLIA 6A, 6B are additively combined to produce a composite planar laser illumination beam having substantially uniform power density characteristics in near and far fields, as illustrated in FIGS. 1P1 and 1P2.

When the laser beam produced from the VLD is transmitted through the cylindrical lens, the output beam will be spread out into a laser illumination beam extending in a plane along the direction in which the lens has curvature. The beam size along the axis which corresponds to the height of the cylindrical lens will be transmitted unchanged. When the planar laser illumination beam is projected onto a target surface, its profile of power versus displacement will have an approximately Gaussian distribution. In accordance with the principles of the present invention, the plurality of VLDs on each side of the IFD module are spaced out and tilted in such a way that their individual power density distributions add up to produce a (composite) planar laser illumination beam having a magnitude of illumination which is distributed substantially uniformly over the entire working depth of the PLIIM-based system (i.e. along the height and width of the composite planar laser illumination beam).

The actual positions of the PLIMs along each planar laser illumination array are indicated in FIG. 1G3 for the exemplary PLIIM-based system shown in FIGS. 1G1 through 1I2. The mathematical analysis used to analyze the results of summing up the individual power density functions of the PLIMs at both near and far working distances was carried out using the Matlab™ mathematical modeling program by Mathworks, Inc. (http://www.mathworks.com). These results are set forth in the data plots of FIGS. 1P1 and 1P2. Notably, in these data plots, the total power density is greater at the far field of the working range of the PLIIM system. This is because the VLDs in the PLIMs are focused to achieve minimum beam width thickness at the farthest object distance of the system, whereas the beam height is somewhat greater at the near field region. Thus, although the far field receives less illumination power at any given location, this power is concentrated into a smaller area, which results in a greater power density within the substantially planar extent of the planar laser illumination beam of the present invention.

When aligning the individual planar laser illumination beams (i.e. planar beam components) produced from each PLIM, it will be important to ensure that each such planar laser illumination beam spatially coincides with a section of the FOV of the imaging subsystem, so that the composite planar laser illumination beam produced by the individual beam components spatially coincides with the FOV of the imaging subsystem throughout the entire working depth of the PLIIM-based system.

Methods of Reducing the RMS Power of Speckle-Noise Patterns Observed at the Linear Image Detection Array of a PLIIM-Based System When Illuminating Objects Using a Planar Laser Illumination Beam In the PLIIM-based systems disclosed herein, seven (7) general classes of techniques and apparatus have been developed to effectively destroy or otherwise substantially reduce the spatial and/or temporal coherence of the laser illumination sources used to generate planar laser illumination beams (PLIBs) within such systems, and thus enable time-varying speckle-noise patterns to be produced at the image detection array thereof and temporally (and possibly spatially) averaged over the photo-integration time period thereof, thereby reducing the RMS power of speckle-noise patterns observed (i.e. detected) at the image detection array.

In general, the root mean square (RMS) power of speckle-noise patterns in PLIIM-based systems can be reduced by using any combination of the following techniques: (1) by using a multiplicity of real laser (diode) illumination sources in the planar laser illumination arrays (PLIIM) of the PLIIM-based system and cylindrical lens array 299 after each PLIA to optically combine and project the planar laser beam components from these real illumination sources onto the target object to be illuminated, as illustrated in the various embodiments of the present invention disclosed herein; and/or (2) by employing any of the seven generalized speckle-pattern noise reduction techniques of the present invention described in detail below which operate by generating independent virtual sources of laser illumination to effectively reduce the spatial and/or temporal coherence of the composite PLIB either transmitted to or reflected from the target object being illuminated. Notably, the speckle-noise reduction coefficient of the PLIIM-based system will be proportional to the square root of the number of statistically independent real and virtual sources of laser illumination created by the speckle-noise pattern reduction techniques employed within the PLIIM-based system.

In FIGS. 1I1 through 1I12D, a first generalized method of speckle-noise pattern reduction in accordance with the principles of the present invention and particular forms of apparatus therefor are schematically illustrated. This generalized method involves reducing the spatial coherence of the PLIB before it illuminates the target (i.e. object) by applying spatial phase modulation techniques during the transmission of the PLIB towards the target.

In FIGS. 1I13 through 1I15C, a second generalized method of speckle-noise pattern reduction in accordance with the principles of the present invention and particular forms of apparatus therefor are schematically illustrated. This generalized method involves reducing the temporal coherence of the PLIB before it illuminates the target (i.e. object) by applying temporal intensity modulation techniques during the transmission of the PLIB towards the target.

In FIGS. 1I16 through 1I17E, a third generalized method of speckle-noise pattern reduction in accordance with the principles of the present invention and particular forms of apparatus therefor are schematically illustrated. This generalized method involves reducing the temporal coherence of the PLIB before it illuminates the target (i.e. object) by applying temporal phase modulation techniques during the transmission of the PLIB towards the target.

In FIGS. 1I18 through 1I19C, a fourth generalized method of speckle-noise pattern reduction in accordance with the principles of the present invention and particular forms of apparatus therefor are schematically illustrated. This generalized method involves reducing the spatial coherence of the PLIB before it illuminates the target (i.e. object) by applying temporal frequency modulation (e.g. compounding/complexing) during transmission of the PLIB towards the target.

In FIGS. 1I20 through 1I21D, a fifth generalized method of speckle-noise pattern reduction in accordance with the principles of the present invention and particular forms of apparatus therefor are schematically illustrated. This generalized method involves reducing the spatial coherence of the PLIB before it illuminates the target (i.e. object) by applying spatial intensity modulation techniques during the transmission of the PLIB towards the target.

In FIGS. 1I22 through 1I23B, a sixth generalized method of speckle-noise pattern reduction in accordance with the principles of the present invention and particular forms of apparatus therefor are schematically illustrated. This generalized method involves reducing the spatial coherence of the PLIB after the transmitted PLIB reflects and/or scatters off the illuminated the target (i.e. object) by applying spatial intensity modulation techniques during the detection of the reflected/scattered PLIB.

In FIGS. 124 through 1I24C, an seventh generalized method of speckle-noise pattern reduction in accordance with the principles of the present invention and particular forms of apparatus therefor are schematically illustrated. This generalized method involves reducing the temporal coherence of the PLIB after the transmitted PLIB reflects and/or scatters off the illuminated the target (i.e. object) by applying temporal intensity modulation techniques during the detection of the reflected/scattered PLIB.

In FIGS. 1I24D through 1I24H, a eighth generalized method of speckle-noise pattern reduction in accordance with the principles of the present invention and particular forms of apparatus therefor are schematically illustrated. This generalized method involves consecutively detecting numerous images containing substantially different time-varying speckle-noise patterns over a consecutive series of photo-integration time periods in the PLIIM-based system, and then processing these images in order temporally and spatially average the time-varying speckle-noise patterns, thereby reducing the RMS power of speckle-pattern noise observable at the image detection array thereof.

In FIG. 1I24I, an eighth generalized method of speckle-noise pattern reduction in accordance with the principles of the present invention and particular forms of apparatus therefor are schematically illustrated. This generalized method involves spatially averaging numerous spatially (and time) varying speckle-noise patterns over the entire surface of each image detection element in the image detection array of a PLIIM-based system during each photo-integration time period thereof, thereby reducing the RMS power level of speckle-pattern noise observed at the PLIIM-based subsystem.

In FIGS. 1I25A through 1I25N2, various "hybrid" despeckling methods and apparatus are disclosed for use in conjunction with PLIIM-based systems employing linear (or area) electronic image detection arrays having elongated image detection elements with a high height-to-width (H/W) aspect ratio.

Notably, each of the generalized methods of speckle-noise pattern reduction to be described below are assumed to satisfy the general conditions under which the random "speckle-noise" process is Gaussian in character. These general conditions have been clearly identified by J. C. Dainty, et al, in page 124 of "Laser Speckle and Related Phenomena", supra, and are restated below for the sake of completeness: (i) that the standard deviation of the surface height fluctuations in the scattering surface (i.e. target object) should be greater than λ, thus ensuring that the phase of the scattered wave is uniformly distributed in the range 0 to 2π; and (ii) that a great many independent scattering centers (on the target object) should contribute to any given point in the image detected at the image detector.

First Generalized Method of Speckle-Noise Pattern Reduction and Particular Forms of Apparatus Therefor Based on Reducing the Spatial-Coherence of the Planar Laser Illumination Beam Before it Illuminates the Target Object by Applying Spatial Phase Modulation Techniques During the Transmission of the PLIB Towards the Target Referring to FIGS. 1I1 through 1I11C, the first generalized method of speckle-noise pattern reduction and particular forms of apparatus therefor will be described. This generalized method is based on the principle of spatially modulating the "transmitted" planar laser illumination beam (PLIB) prior to illuminating a target object (e.g. package) therewith so that the object is illuminated with a spatially coherent-reduced planar laser beam and, as a result, numerous substantially different time-varying speckle-noise patterns are produced and detected over the photo-integration time period of the image detection array (in the IFD subsystem), thereby allowing these speckle-noise patterns to be temporally averaged and possibly spatially averaged over the photo-integration time period and the RMS power of observable speckle-noise pattern reduced. This method can be practiced with any of the PLIM-based systems of the present invention disclosed herein, as well as any system constructed in accordance with the general principles of the present invention.

Whether any significant spatial averaging can occur in any particular embodiment of the present invention will depend on the relative dimensions of: (i) each element in the image detection array; and (ii) the physical dimensions of the speckle blotches in a given speckle-noise pattern which will depend on the standard deviation of the surface height fluctuations in the scattering surface or target object, and the wavelength of the illumination source λ. As the size of each image detection element is made larger, the image resolution of the image detection array will decrease, with an accompanying increase in spatial averaging. Clearly, there is a tradeoff to be decided upon in any given application. Such spatial averaging techniques, embraced by the Ninth Generalized Speckle-Pattern Noise Reduction Method Of The Present Invention, will be described in greater detail hereinbelow with reference to FIG. 1I24D As illustrated at Block A in FIG. 1I2B, the first step of the first generalized method shown in FIGS. 1I1 through 1I11C involves spatially phase modulating the transmitted planar laser illumination beam (PLIB) along the planar extent thereof according to a (random or periodic) spatial phase modulation function (SPMF) prior to illumination of the target object with the PLIB, so as to modulate the phase along the wavefront of the PLIB and produce numerous substantially different time-varying speckle-noise pattern at the image detection array of the IFD Subsystem during the photo-integration time period thereof. As indicated at Block B in FIG. 1I2B, the second step of the method involves temporally and spatially averaging the numerous substantially different speckle-noise patterns produced at the image detection array in the IFD Subsystem during the photo-integration time period thereof.

When using the first generalized method, the target object is repeatedly illuminated with laser light apparently originating from different points (i.e. virtual illumination sources) in space over the photo-integration period of each detector element in the linear image detection array of the PLIIM system, during which reflected laser illumination is received at the detector element. As the relative phase delays between these virtual illumination sources are changing over the photo-integration time period of each image detection element, these virtual sources are effectively rendered spatially incoherent with each other. On a time-average basis, these time-varying speckle-noise patterns are temporally (and possibly spatially) averaged during the photo-integration time period of the image detection elements, thereby reducing the RMS power of the speckle-noise pattern (i.e. level) observed thereat. As speckle noise patterns are roughly uncorrelated at the image detection array, the reduction in speckle-noise power should be proportional to the square root of the number of independent virtual laser illumination sources contributing to the illumination of the target object and formation of the image frame thereof. As a result of the present invention, image-based bar code symbol decoders and/or OCR processors operating on such digital images can be processed with significant reductions in error.

The first generalized method above can be explained in terms of Fourier Transform optics. When spatial phase modulating the transmitted PLIB by a periodic or random spatial phase modulation function (SPMF), while satisfying conditions (i) and (ii) above, a spatial phase modulation process occurs on the spatial domain. This spatial phase modulation process is equivalent to mathematically multiplying the transmitted PLIB by the spatial phase modulation function. This multiplication process on the spatial domain is equivalent on the spatial-frequency domain to the convolution of the Fourier Transform of the spatial phase modulation function with the Fourier Transform of the transmitted PLIB. On the spatial-frequency domain, this convolution process generates spatially-incoherent (i.e. statistically-uncorrelated) spectral components which are permitted to spatially-overlap at each detection element of the image detection array (i.e. on the spatial domain) and produce time-varying speckle-noise patterns which are temporally (and possibly) spatially averaged during the photo-integration time period of each detector element, to reduce the RMS power of the speckle-noise pattern observed at the image detection array.

In general, various types of spatial phase modulation techniques can be used to carry out the first generalized method including, for example: mechanisms for moving the relative position/motion of a cylindrical lens array and laser diode array, including reciprocating a pair of rectilinear cylindrical lens arrays relative to each other, as well as rotating a cylindrical lens array ring structure about each PLIM employed in the PLIIM-based system; rotating phase modulation discs having multiple sectors with different refractive indices to effect different degrees of phase delay along the wavefront of the PLIB transmitted (along different optical paths) towards the object to be illuminated; acousto-optical Bragg-type cells for enabling beam steering using ultrasonic waves; ultrasonically-driven deformable mirror structures; a LCD-type spatial phase modulation panel; and other spatial phase modulation devices. Several of these spatial light modulation (SLM) mechanisms will be described in detail below.

Apparatus of the Present Invention for Micro-Oscillating a Pair of Refractive Cylindrical Lens Arrays to Spatial Phase Modulate the Planar Laser Illumination Beam Prior to Target Object Illumination In FIGS. 1I3A through 1I3D, there is shown an optical assembly 300 for use in any PLIIM-based system of the present invention. As shown, the optical assembly 300 comprises a PLIA 6A, 6B with a pair of refractive-type cylindrical lens arrays 301A and 301B, and an electronically-controlled mechanism 302 for micro-oscillating the pair cylindrical lens arrays 301A and 301B along the planar extent of the PLIB. In accordance with the first generalized method, the pair of cylindrical lens arrays 301A and 301B are micro-oscillated, relative to each other (out of phase by 90 degrees) using two pairs of ultrasonic (or other motion-imparting) transducers 303A, 303B, and 304A, 304B arranged in a push-pull configuration. The individual beam components within the PLIB 305 which are transmitted through the cylindrical lens arrays are micro-oscillated (i.e. moved) along the planar extent thereof by an amount of distance $\Delta x$ or greater at a velocity v(t) which causes the spatial phase along the wavefronts of the transmitted PLIB to be modulated and numerous (e.g. 25 or more) substantially different time-varying speckle-noise patterns generated at the image detection array of the IFD Subsystem during the photo-integration time period thereof. The numerous time-varying speckle-noise patterns produced at the image detection array are temporally (and possibly spatially) averaged during the photo-integration time period thereof, thereby reducing the RMS power of speckle-noise patterns observed at the image detection array.

As shown in FIG. 1I3C, an array support frame 305 with a light transmission window 306 and accessories 307A and 307B for mounting pairs of ultrasonic transducers 303A, 303B and 304A, 304B, is used to mount the pair of cylindrical lens arrays 301A and 301B in a relative reciprocating manner, and thus permitting micro-oscillation in accordance with the principles of the present invention. In 1I3D, the pair of cylindrical lens arrays 301A and 301B are shown configured between pairs of ultrasonic transducers 303A, 303B and 304A, 304B (or flexural elements driven by voice-coil type devices) operated in a push-pull mode of operation. By employing dual cylindrical lens arrays in this optically assembly, the transmitted PLIB is spatial phase modulated in a continual manner during object illumination operations. The function of cylindrical lens array 301B is to optically combine the spatial phase modulated PLIB components so that each point on the surface of the target object being illuminated by numerous spatial-phase delayed PLIB components. By virtue of this optical assembly design, when one cylindrical lens array is momentarily stationary during beam direction reversal, the other cylindrical lens array is moving in an independent manner, thereby causing the transmitted PLIB 307 to be spatial phase modulated even at times when one cylindrical lens array is reversing its direction (i.e. momentarily at rest). In an alternative embodiment, one of the cylindrical lens arrays can be mounted stationary relative to the PLIA, while the other cylindrical lens array is micro-oscillated relative to the stationary cylindrical lens array.

In the illustrative embodiment, each cylindrical lens array 301A and 301B is realized as a lenticular screen having 64 cylindrical lenslets per inch. For a speckle-noise power reduction of five (5×), it was determined experimentally that about 25 or more substantially different speckle-noise patterns must be generated during a photo-integration time period of $1/10000^{th}$ second, and that a 125 micron shift ($\Delta x$) in the cylindrical lens arrays was required, thereby requiring an array velocity of about 1.25 meters/second. Using a sinusoidal function to drive each cylindrical lens array, the array velocity is described by the equation $V=A\omega\sin(\omega t)$, where $A=3\times10^{-3}$ meters and $\omega=370$ radians/second (i.e. 60 Hz) providing about a peak array velocity of about 1.1 meter/second. Notably, one can increase the number of substantially different speckle-noise patterns produced during the photo-integration time period of the image detection array by either (i) increasing the spatial period of each cylindrical lens array, and/or (ii) increasing the relative velocity cylindrical lens array(s) and the PLIB transmitted therethrough during object illumination operations. Increasing either of this parameters will have the effect of increasing the spatial gradient of the spatial phase modulation function (SPMF) of the optical assembly, causing steeper transitions in phase delay along the wavefront of the PLIB, as the cylindrical lens arrays move relative to the PLIB being transmitted therethrough. Expectedly, this will generate more components with greater magnitude values on the spatial-frequency domain of the system, thereby producing more independent virtual spatially-incoherent illumination sources in the system. This will tend to reduce the RMS power of speckle-noise patterns observed at the image detection array.

Conditions for Producing Uncorrelated Time-Varying Speckle-Noise Pattern Variations at the Image Detection Array of the IFD Module (i.e. Camera Subsystem)

In general, each method of speckle-noise reduction according to the present invention requires modulating the either the phase, intensity, or frequency of the transmitted PLIB (or reflected/received PLIB) so that numerous substantially different time-varying speckle-noise patterns are generated at the image detection array each photo-integration time period/interval thereof. By achieving this general condition, the planar laser illumination beam (PLIB), either transmitted to the target object, or reflected therefrom and received by the IFD subsystem, is rendered partially coherent or coherent-reduced in the spatial and/or temporal sense. This ensures that the speckle-noise patterns produced at the image detection array are statistically uncorrelated, and therefore can be temporally and possibly spatially averaged at each image detection element during the photo-integration time period thereof, thereby reducing the RMS power of the speckle-patterns observed at the image detection array. The amount of RMS power reduction that is achievable at the image detection array is, therefore, dependent upon the number of substantially different time-varying speckle-noise patterns that are generated at the image detection array during its photo-integration time period thereof. For any particular speckle-noise reduction apparatus of the present invention, a number parameters will factor into determining the number of substantially different time-varying speckle-noise patterns that must be generated each photo-integration time period, in order to achieve a particular degree of reduction in the RMS power of speckle-noise patterns at the image detection array.

Referring to FIG. 1I3E, a geometrical model of a subsection of the optical assembly of FIG. 1I3A is shown. This simplified model illustrates the first order parameters involved in the PLIB spatial phase modulation process, and also the relationship among such parameters which ensures that at least one cycle of speckle-noise pattern variation will be produced at the image detection array of the IFD module (i.e. camera subsystem). As shown, this simplified model is derived by taking a simple case example, where only two virtual laser illumination sources (such as those generated by two cylindrical lenslets) are illuminating a target object. In practice, there will be numerous virtual laser beam sources by virtue of the fact that the cylindrical lens array has numerous lenslets (e.g. 64 lenslets/inch) and cylindrical lens array is micro-oscillated at a particular velocity with respect to the PLIB as the PLIB is being transmitted therethrough.

In the simplified case shown in FIG. 1I3E, wherein spatial phase modulation techniques are employed, the speckle-noise pattern viewed by the pair of cylindrical lens elements of the imaging array will become uncorrelated with respect to the original speckle-noise pattern (produced by the real laser illumination source) when the difference in phase among the wavefronts of the individual beam components is on the order of ½ of the laser illumination wavelength λ. For the case of a moving cylindrical lens array, as shown in FIG. 1I3A, this decorrelation condition occurs when:

$$\Delta x > \lambda D/2P$$

wherein, Δx is the motion of the cylindrical lens array, λ is the characteristic wavelength of the laser illumination source, D is the distance from the laser diode (i.e. source) to the cylindrical lens array, and P is the separation of the lenslets within the cylindrical lens array. This condition ensures that one cycle of speckle-noise pattern variation will occur at the image detection array of the IFD Subsystem for each movement of the cylindrical lens array by distance Δx. This implies that, for the apparatus of FIG. 1I3A, the time-varying speckle-noise patterns detected by the image detection array of IFD subsystem will become statistically uncorrelated or independent (i.e. substantially different) with respect to the original speckle-noise pattern produced by the real laser illumination sources, when the spatial gradient in the phase of the beam wavefront is greater than or equal to λ/2P.

Conditions for Temporally Averaging Time-Varying Speckle-Noise Patterns at the Image Detection Array of the IFD Subsystem in Accordance with the Principles of the Present Invention To ensure additive cancellation of the uncorrelated time-varying speckle-noise patterns detected at the (coherent) image detection array, it is necessary that numerous substantially different (i.e. uncorrelated) time-varying speckle-noise patterns are generated during each the photo-integration time period. In the case of optical system of FIG. 1I3A, the following parameters will influence the number of substantially different time-varying speckle-noise patterns generated at the image detection array during each photo-integration time period thereof: (i) the spatial period of each refractive cylindrical lens array: (ii) the width dimension of each cylindrical lenslet; (iii) the length of each lens array; (iv) the velocity thereof; and (v) the number of real laser illumination sources employed in each planar laser illumination array in the PLIIM-based system. Parameters (1) through (iv) will factor into the specification of the spatial phase modulation function (SPMF) of the system. In general, if the system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I3A, the number of substantially different time-varying speckle-noise pattern samples which need to be generated per each photo-integration time interval of the image detection array can be experimentally determined without undue experimentation. However, it should be noted that this minimum sampling parameter threshold is expressed on the time domain, and that expectedly, the lower threshold for this sample number at the image detection (i.e. observation) end of the PLIIM-based system, for a particular degree of speckle-noise power reduction, can be expressed mathematically in terms of (i) the spatial gradient of the spatial phase modulated PLIB, and (ii) the photo-integration time period of the image detection array of the PLIIM-based system.

By ensuring that these two conditions are satisfied to the best degree possible (at the planar laser illumination subsystem and the camera subsystem) will ensure optimal reduction in speckle-noise patterns observed at the image detector of the PLIIM-based system of the present invention. In general, the reduction in the RMS power of observable speckle-noise patterns will be proportional to the square root of the number of statistically uncorrelated real and virtual illumination sources created by the speckle-noise reduction technique of the present invention. FIGS. 1I3F and 1I3G illustrate that significant mitigation in speckle-noise patterns can be achieved when using the particular apparatus of FIG. 1I3A in accordance with the first generalized speckle-noise pattern reduction method illustrated in FIGS. 1I1 through 1I2B.

Apparatus of the Present Invention for Micro-Oscillating a Pair of Light Diffractive (e.g. Holographic) Cylindrical Lens Arrays to Spatial Phase Modulate the Planar Laser Illumination Beam Prior to Target Object Illumination In FIG. 1I4A, there is shown an optical assembly 310 for use in any PLIIM-based system of the present invention. As shown, the optical assembly 310 comprises a PLIA 6A, 6B with a pair of (holographically-fabricated) diffractive-type cylindrical lens arrays 311A and 311B, and an electronically-controlled PLIB micro-oscillation mechanism 312 for micro-oscillating the cylindrical lens arrays 311A and 311B along the planar extent of the PLIB. In accordance with the first generalized method, the pair of cylindrical lens arrays 311A and 311B are micro-oscillated, relative to each other (out of phase by 90 degrees) using two pairs of ultrasonic transducers 313A, 313B and 314A, 314B arranged in a push-pull configuration. The individual beam components within the transmitted PLIB 315 are micro-oscillated (i.e. moved) along the planar extent thereof by an amount of distance Δx or greater at a velocity v(t) which causes the spatial phase along the wavefront of the transmitted PLIB to be spatially modulated, causing numerous substantially different (i.e. uncorrelated) time-varying speckle-noise patterns to be generated at the image detection array of the IFD Subsystem during the photo-integration time period thereof. The numerous time-varying speckle-noise patterns produced at the image detection array are temporally (and possibly spatially) averaged during the photo-integration time period thereof, thereby reducing the RMS power of speckle-noise patterns observed at the image detection array.

As shown in FIG. 1I4C, an array support frame 316 with a light transmission window 317 and recesses 318A and 318B is used to mount the pair of cylindrical lens arrays 311A and 311B in a relative reciprocating manner, and thus permitting micro-oscillation in accordance with the principles of the present invention. In 1I4D, the pair of cylindrical lens arrays 311A and 311B are shown configured between a pair of ultrasonic transducers 313A, 313B and 314A, 314B (or flexural elements driven by voice-coil type devices) mounted in recesses 318A and 318B, respectively, and operated in a push-pull mode of operation. By employing dual cylindrical lens arrays in this optically assembly, the transmitted PLIB 315 is spatial phase modulated in a continual manner during object illumination operations. By virtue of this optical assembly design, when one cylindrical lens array is momentarily stationary during beam direction reversal, the other cylindrical lens array is moving in an independent manner, thereby causing the transmitted PLIB to be spatial phase modulated even when the cylindrical lens array is reversing its direction.

In the case of optical system of FIG. 1I4A, the following parameters will influence the number of substantially different time-varying speckle-noise patterns generated at the image detection array during each photo-integration time period thereof: (i) the spatial period of (each) HOE cylindrical lens array; (ii) the width dimension of each HOE; (iii) the length of each HOE lens array; (iv) the velocity thereof; and (v) the number of real laser illumination sources employed in each planar laser illumination array in the PLIIM-based system. Parameters (1) through (iv) will factor into the specification of the spatial phase modulation function (SPMF) of this speckle-noise reduction subsystem design. In general, if the PLIIM-based system requires an increase in reduction in the RMS power of speckle-noise at its image detection array, then the system must generate more uncorrelated time-varying speckle-noise patterns for time averaging over each photo-integration time period thereof. Adjustment of the above-described parameters should enable the designer to achieve the degree of speckle-noise power reduction desired in the application at detection array can hand.

For a desired reduction in speckle-noise pattern power in the system of FIG. 1I4A, the number of substantially different time-varying speckle-noise pattern samples which need to be generated per each photo-integration time interval of the image be experimentally determined without undue experimentation. However, for a particular degree of speckle-noise power reduction, it is expected that the lower threshold for this sample number at the image detection array can be expressed mathematically in terms of (i) the spatial gradient of the spatial phase modulated PLIB, and (ii) the photo-integration time period of the image detection array of the PLIIM-based system.

Apparatus of the Present Invention for Micro-Oscillating a Pair of Reflective Elements Relative to a Stationary Refractive Cylindrical Lens Array to Spatial Phase Modulate a Planar Laser Illumination Beam Prior to Target Object Illumination In FIG. 1I5A, there is shown an optical assembly 320 for use in any PLIIM-based system of the present invention. As shown, the optical assembly comprises a PLIA 6A, 6B with a stationary (refractive-type or diffractive-type) cylindrical lens array 321, and an electronically-controlled micro-oscillation mechanism 322 for micro-oscillating a pair of reflective-elements 324A and 324B along the planar extent of the PLIB, relative to a stationary refractive-type cylindrical lens array 321 and a stationary reflective element (i.e. mirror element) 323. In accordance with the first generalized method, the pair of reflective elements 324A and 324B are micro-oscillated relative to each other (at 90 degrees out of phase) using two pairs of ultrasonic transducers 325A, 325B and 326A, 326B arranged in a push-pull configuration. The transmitted PLIB is micro-oscillated (i.e. move) along the planar extent thereof (i) by an amount of distance $\Delta x$ or greater at a velocity v(t) which causes the spatial phase along the wavefront of the transmitted PLIB to be modulated and numerous substantially different time-varying speckle-noise patterns generated at the image detection array of the IFD Subsystem during the photo-integration time period thereof. The numerous time-varying speckle-noise patterns are temporally and possibly spatially averaged during the photo-integration time period thereof, thereby reducing the RMS power of the speckle-noise patterns observed at the image detection array.

As shown in FIG. 1I5B, a planar mirror 323 reflects the PLIB components towards a pair of reflective elements 324A and 324B which are pivotally connected to a common point 327 on support post 328. These reflective elements 324A and 324B are reciprocated and micro-oscillate the incident PLIB components along the planar extent thereof in accordance with the principles of the present invention. These micro-oscillated PLIB components are transmitted through a cylindrical lens array so that they are optically combined and numerous phase-delayed PLIB components are projected onto the same points on the surface of the object being illuminated. As shown in FIG. 1I5D, the pair of reflective elements 324A and 324B are configured between two pairs of ultrasonic transducers 325A, 325B and 326A, 326B (or flexural elements driven by voice-coil type devices) supported on posts 330A, 330B operated in a push-pull mode of operation. By employing dual reflective elements in this optical assembly, the transmitted PLIB 331 is spatial phase modulated in a continual manner during object illumination operations. By virtue of this optical assembly design, when one reflective element is momentarily stationary while reversing its direction, the other reflective element is moving in an independent manner, thereby causing the transmitted PLIB 331 to be continually spatial phase modulated.

In the case of optical system of FIG. 1I5A, the following parameters will influence the number of substantially different time-varying speckle-noise patterns generated at the image detection array during each photo-integration time period thereof: (i) the spatial period of the cylindrical lens array; (ii) the width dimension of each cylindrical lenslet; (iii) the length of each HOE lens array; (iv) the length and angular velocity of the reflector elements; and (v) the number of real laser illumination sources employed in each planar laser illumination array in the PLIIM-based system. Parameters (1) through (iv) will factor into the specification of the spatial phase modulation function (SPMF) of this speckle-noise reduction subsystem design. In general, if the system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I5A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial phase modulated PLIB, and (ii) the photo-integration time period of the image detection array of the PLIIM-based system.

Apparatus of the Present Invention for Micro-Oscillating the Planar Laser Illumination Beam (PLIB) Using an Acoustic-Optic Modulator to Spatial Phase Modulate Said PLIB Prior to Target Object Illumination In FIG. 1I6A, there is shown an optical assembly 340 for use in any PLIIM-based system of the present invention. As shown, the optical assembly 340 comprises a PLIA 6A, 6B with a cylindrical lens array 341, and an acousto-optical (i.e. Bragg Cell) beam deflection mechanism 343 for micro-oscillating the PLIB 343 prior to illuminating the target object. In accordance with the first generalized method, the PLIB 344 is micro-oscillated by an acousto-optical (i.e. Bragg Cell) beam deflection device 345 as acoustical waves (signals) 346 propagate through the electro-acoustical device transverse to the direction of transmission of the PLIB 344. This causes the beam components of the composite PLIB 344 to be micro-oscillated (i.e. moved) the along the planar extent thereof by an amount of distance $\Delta x$ or greater at a velocity v(t). Such a micro-oscillation movement causes the spatial phase along the wavefront of the transmitted PLIB to be modulated and numerous substantially different time-varying speckle-noise patterns generated at the image detection array during the photo-integration time period thereof. The numerous time-varying speckle-noise patterns are temporally and possibly spatially averaged at the image detection array during each the photo-integration time period thereof. As shown, the acousto-optical beam deflective panel 345 is driven by control signals supplied by electrical circuitry under the control of camera control computer 22.

In the illustrative embodiment, beam deflection panel 345 is made from an ultrasonic cell comprising: a pair of spaced-apart optically transparent panels 346A and 346B, containing an optically transparent, ultrasonic-wave carrying fluid, e.g. toluene (i.e. $CH_3$ $C_6$ $H_5$) 348; a pair of end panels 348A and 348B cemented to the side and end panels to contain the ultrasonic wave carrying fluid 348 within the cell structure formed thereby; an array of piezoelectric transducers 349 mounted through end wall 349A; and an ultrasonic-wave dampening material 350 disposed at the opposing end wall panel 349B, on the inside of the cell, to avoid reflections of the ultrasonic wave at the end of the cell. Electronic drive circuitry is provided for generating electrical drive signals for the acoustical wave cell 345 under the control of the camera control computer 22. In the illustrative embodiment, these electrical drives signals are provided to the piezoelectric transducers 349 and result in the generation of an ultrasonic wave that propagates at a phase velocity through the cell structure, from one end to the other. This causes a modulation of the refractive index of the ultrasonic wave carrying fluid 348, and thus a modulation of the spatial phase along the wavefront of the transmitted PLIB, thereby causing the same to be periodically swept across the cylindrical lens array 341. The micro-oscillated PLIB components are optically combined as they are transmitted through the cylindrical lens array 341 and numerous phase-delayed PLIB components are projected onto the same points of the surface of the object being illuminated. After reflecting from the object and being modulated by the micro-structure thereof, the received PLIB produces numerous substantially different time-varying speckle-noise patterns on the image detection array of the PLIIM-based system during the photo-integration time period thereof. These time-varying speckle-noise patterns are temporally and spatially averaged at the image detection array, thereby reducing the power of speckle-noise patterns observable at the image detection array.

In the case of optical system of FIG. 1I6A, the following parameters will influence the number of substantially different time-varying speckle-noise patterns generated at the image detection array during each photo-integration time period thereof: (i) the spatial frequency of the cylindrical lens array; (ii) the width dimension of each lenslet; (iii) the temporal and velocity characteristics of the acoustical wave 348 propagating through the acousto-optical cell structure 345; (iv) the optical density characteristics of the ultrasonic wave carrying fluid 348; and (v) the number of real laser illumination sources employed in each planar laser illumination array in the PLIIM-based system. Parameters (1) through (iv) will factor into the specification of the spatial phase modulation function (SPMF) of this speckle-noise reduction subsystem design. In general, if the system requires an increase in reduction in the RMS power of speckle-noise at its image detection array, then the system must generate more uncorrelated time-varying speckle-noise patterns for averaging over each photo-integration time period thereof.

One can expect an increase the number of substantially different speckle-noise patterns produced during the photo-integration time period of the image detection array by either: (i) increasing the spatial period of each cylindrical lens array; (ii) the temporal period and rate of repetition of the acoustical waveform propagating along the cell structure 345; and/or (iii) increasing the relative velocity between the stationary cylindrical lens array and the PLIB transmitted therethrough during object illumination operations, by increasing the velocity of the acoustical wave propagating through the acousto-optical cell 345. Increasing either of these parameters should have the effect of increasing the spatial gradient of the spatial phase modulation function (SPMF) of the optical assembly, e.g. by causing steeper transitions in phase delay along the wavefront of the composite PLIB, as it is transmitted through cylindrical lens array 341 in response to the propagation of the acoustical wave along the cell structure 345. Expectedly, this should generate more components with greater magnitude values on the spatial-frequency domain of the system, thereby producing more independent virtual spatially-incoherent illumination sources in the system. This should tend to reduce the RMS power of speckle-noise patterns observed at the image detection array.

For a desired reduction in speckle-noise pattern power in the system of FIG. 1I6A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this "sample number" at the image detection array can be expressed mathematically in terms of (i) the spatial gradient of the spatial phase modulated PLIB and/or the time derivative of the phase modulated PLIB, and (ii) the photo-integration time period of the image detection array of the PLIIM-based system.

Apparatus of the Present Invention for Micro-Oscillating the Planar Laser Illumination Beam (PLIB) Using a Piezo-Electric Driven Deformable Mirror Structure to Spatial Phase Modulate Said PLIB Prior to Target Object Illumination In FIG. 1I7A, there is shown an optical assembly 360 for use in any PLIIM-based system of the present invention. As shown, the optical assembly 360 comprises a PLIA 6A, 6B with a cylindrical lens array 361 (supported within a frame 362), and an electromechanical PLIB micro-oscillation mechanism 363 for micro-oscillating the PLIB prior to transmission to the target object to be illuminated. In accordance with the first generalize method, the PLIB components produced by PLIA 6A, 6B are reflected off a piezo-electrically driven deformable mirror (DM) structure 364 arranged in front of the PLIA, while being micro-oscillated along the planar extent of the PLIBs. These micro-oscillated PLIB components are reflected back towards a stationary beam folding mirror 365 mounted (above the optical path of the PLIB components) by support posts 366A, 366B and 366C, reflected thereoff and transmitted through cylindrical lens array 361 (e.g. operating according to refractive, diffractive and/or reflective principles). These micro-oscillated PLIB components are optically combined by the cylindrical lens array so that numerous phase-delayed PLIB components are projected onto the same points on the surface of the object being illuminated. During PLIB transmission, in the case of an illustrative embodiment involving a high-speed tunnel scanning system, the surface of the DM structure 364 (Δx) is periodically deformed at frequencies in the 100 kHz range and at few microns amplitude, to produce moving ripples aligned along the direction that is perpendicular to planar extent of the PLIB (i.e. along its beam spread). These moving ripples cause the beam components within the PLIB 367 to be micro-oscillated (i.e. moved) along the planar extent thereof by an amount of distance Δx or greater at a velocity v(t) which modules the spatial phase among the wavefront of the transmitted PLIB and produces numerous substantially different time-varying speckle-noise patterns at the image detection array during the photo-integration time period thereof. These numerous substantially different time-varying speckle-noise patterns are temporally and possibly spatially averaged during each photo-integration time period of the image detection array. FIG. 1I7A shows the optical path which the PLIB travels while undergoing spatial phase modulation by the piezo-electrically driven DM structure 364 during target object illumination operations.

In the case of optical system of FIG. 1I7A, the following parameters will influence the number of substantially different time-varying speckle-noise patterns generated at the image detection array during each photo-integration time period thereof: (i) the spatial period of the cylindrical lens array; (ii) the width dimension of each lenslet; (iii) the temporal and velocity characteristics of the surface deformations produced along the DM structure 364; and (v) the number of real laser illumination sources employed in each planar laser illumination array in the PLIIM-based system. Parameters (1) through (iv) will factor into the specification of the spatial phase modulation function (SPMF) of this speckle-noise reduction subsystem design.

In general, if the system requires an increase in reduction in the RMS power of speckle-noise at its image detection array, then the system must generate more uncorrelated time-varying speckle-noise patterns for averaging over each photo-integration time period thereof. Notably, one can expect an increase the number of substantially different speckle-noise patterns produced during the photo-integration time period of the image detection array by either: (i) increasing the spatial period of each cylindrical lens array; (ii) the spatial gradient of the surface deformations produced along the DM structure 364; and/or (iii) increasing the relative velocity between the stationary cylindrical lens array and the PLIB transmitted therethrough during object illumination operations, by increasing the velocity of the surface deformations along the DM structure 364. Increasing either of these parameters should have the effect of increasing the spatial gradient of the spatial phase modulation function (SPMF) of the optical assembly, causing steeper transitions in phase delay along the wavefront of the composite PLIB, as it is transmitted through cylindrical lens array in response to the propagation of the acoustical wave along the cell. Expectedly, this should generate more components with greater magnitude values on the spatial-frequency domain of the system, thereby producing more independent virtual spatially-incoherent illumination sources in the system. This should tend to reduce the RMS power of speckle-noise patterns observed at the image detection array.

For a desired reduction in speckle-noise pattern power in the system of FIG. 1I7A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this "sample number" at the image detection array can be expressed mathematically in terms of (i) the spatial gradient of the spatial phase modulated PLIB and/or the time derivative of the phase modulated PLIB, and (ii) the photo-integration time period of the image detection array of the PLIIM-based system.

Apparatus of the Present Invention for Micro-Oscillating the Planar Laser Illumination Beam (PLIB) Using a Refractive-Type Phase-Modulation Disc to Spatial Phase Modulate Said PLIB Prior to Target Object Illumination In FIG. 1I8A, there is shown an optical assembly 370 for use in any PLIIM-based system of the present invention. As shown, the optical assembly 370 comprises a PLIA 6A, 6B with cylindrical lens array 371, and an optically-based PLIB micro-oscillation mechanism 372 for micro-oscillating the PLIB 373 transmitted towards the target object prior to illumination. In accordance with the first generalize method, the PLIB micro-oscillation mechanism 372 is realized by a refractive-type phase-modulation disc 374, rotated by an electric motor 375 under the control of the camera control computer 22. As shown in FIGS. 1I8B and 1I8D, the PLIB form PLIA 6A is transmitted perpendicularly through a sector of the phase modulation disc 374, as shown in FIG. 1I8D. As shown in FIG. 1I8D, the disc comprises numerous sections 376, each having refractive indices that vary sinusoidally at different angular positions along the disc. Preferably, the light transmittivity of each sector is substantially the same, as only spatial phase modulation is the desired light control function to be performed by this subsystem. Also, to ensure that the spatial phase along the wavefront of the PLIB is modulated along its planar extent, each PLIA 6A, 6B should be mounted relative to the phase modulation disc so that the sectors 376 move perpendicular to the plane of the PLIB during disc rotation. As shown in FIG. 1I8D, this condition can be best achieved by mounting each PLIA 6A, 6B as close to the outer edge of its phase modulation disc as possible where each phase modulating sector moves substantially perpendicularly to the plane of the PLIB as the disc rotates about its axis of rotation.

During system operation, the refractive-type phase-modulation disc 374 is rotated about its axis through the composite PLIB 373 so as to modulate the spatial phase along the wavefront of the PLIB and produce numerous substantially different time-varying speckle-noise patterns at the image detection array of the IFD Subsystem during the photo-integration time period thereof. These numerous time-varying speckle-noise patterns are temporally and possibly spatially averaged during each photo-integration time period of the image detection array. As shown in FIG. 1I8E, the electric field components produced from the rotating refractive disc sections 371 and its neighboring cylindrical lenslet 371 are optically combined by the cylindrical lens array and projected onto the same points on the surface of the object being illuminated, thereby contributing to the resultant time-varying (uncorrelated) electric field intensity produced at each detector element in the image detection array of the IFD Subsystem.

In the case of optical system of FIG. 1I8A, the following parameters will influence the number of substantially different time-varying speckle-noise patterns generated at the image detection array during each photo-integration time period thereof: (i) the spatial period of the cylindrical lens array; (ii) the width dimension of each lenslet; (iii) the length of the lens array in relation to the radius of the phase modulation disc 374; (iv) the tangential velocity of the phase modulation elements passing through the PLIB; and (v) the number of real laser illumination sources employed in each planar laser illumination array in the PLIIM-based system. Parameters (1) through (iv) will factor into the specification of the spatial phase modulation function (SPMF) of this speckle-noise reduction subsystem design. In general, if the system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I8A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial phase modulated PLIB, and (ii) the photo-integration time period of the image detection array of the PLIIM-based system.

Apparatus of the Present Invention for Micro-Oscillating the Planar Laser Illumination Beam (PLIB) Using a Phase-Only Type LCD-Based Phase Modulation Panel to Spatial Phase Modulate Said PLIB Prior to Target Object Illumination As shown in FIGS. 1I8F and 1I8G, the general phase modulation principles embodied in the apparatus of FIG. 1I8A can be applied in the design the optical assembly for reducing the RMS power of speckle-noise patterns observed at the image detection array of a PLIIM-based system. As shown in FIGS. 1I8F and 1I8G, optical assembly 700 comprises: a backlit transmissive-type phase-only LCD (PO-LCD) phase modulation panel 701 mounted slightly beyond a PLIA 6A, 6B to intersect the composite PLIB 702; and a cylindrical lens array 703 supported in frame 704 and mounted closely to, or against phase modulation panel 701. The phase modulation panel 701 comprises an array of vertically arranged phase modulating elements or strips 705, each made from birefrigent liquid crystal material. In the illustrative embodiment, phase modulation panel 701 is constructed from a conventional backlit transmission-type LCD panel. Under the control of camera control computer 22, programmed drive voltage circuitry 706 supplies a set of phase control voltages to the array 705 so as to controllably vary the drive voltage applied across the pixels associated with each predefined phase modulating element 705. Each phase modulating element 705 is assigned a particular phase coding so that periodic or random micro-shifting of PLIB 708 is achieved along its planar extent prior to transmission through cylindrical lens array 703. During system operation, the phase-modulation panel 701 is driven by applying control voltages across each element 705 so as to modulate the spatial phase along the wavefront of the PLIB, to cause each PLIB component to micro-oscillate as it is transmitted therethrough. These micro-oscillated PLIB components are then transmitted through cylindrical lens array so that they are optically combined and numerous phase-delayed PLIB components are projected 703 onto the same points of the surface of the object being illuminated. This illumination process results in producing numerous substantially different time-varying speckle-noise patterns at the image detection array (of the accompanying IFD subsystem) during the photo-integration time period thereof. These time-varying speckle-noise patterns are temporally and possibly spatially averaged thereover, thereby reducing the RMS power of speckle-noise patterns observed at the image detection array.

In the case of optical system of FIG. 1I8F, the following parameters will influence the number of substantially different time-varying speckle-noise patterns generated at the image detection array during each photo-integration time period thereof: (i) the spatial period of the cylindrical lens array 703; (ii) the width dimension of each lenslet thereof; (iii) the length of the lens array in relation to the radius of the phase modulation panel 701; (iv) the speed at which the birefringence of each modulation element 705 is electrically switched during the photo-integration time period of the image detection array; and (v) the number of real laser illumination sources employed in each planar laser illumination array (PLIA) in the PLIIM-based system. Parameters (1) through (iv) will factor into the specification of the spatial phase modulation function (SPMF) of this speckle-noise reduction subsystem design. In general, if the system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I8F, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial phase modulated PLIB, and (ii) the photo-integration time period of the image detection array of the PLIIM-based system.

Apparatus of the Present Invention for Micro-Oscillating the Planar Laser Illumination Beam (PLIB) Using a Refractive-Type Cylindrical Lens Array Ring Structure to Spatial Phase Modulate Said PLIB Prior to Target Object Illumination In FIG. 1I9A, there is shown a pair of optical assemblies 380A and 380B for use in any PLIIM-based system of the present invention. As shown, each optical assembly 380 comprises a PLIA 6A, 6B with a PLIB phase-modulation mechanism 381 realized by a refractive-type cylindrical lens array ring structure 382 for micro-oscillating the PLIB prior to illuminating the target object. The lens array ring structure 382 can be made from a lenticular screen material having cylindrical lens elements (CLEs) or cylindrical lenslets arranged with a high spatial period (e.g. 64 CLEs per inch). The lenticular screen material can be carefully heated to soften the material so that it may be configured into a ring geometry, and securely held at its bottom end within a groove formed within support ring 382, as shown in FIG. 1I9B. In accordance with the first generalized method, the refractive-type cylindrical lens array ring structure 382 is rotated by a high-speed electric motor 384 about its axis through the PLIB 383 produced by the PLIA 6A, 6B. The function of the rotating cylindrical lens array ring structure 382 is to module the phase along the wavefront of the PLIB, producing numerous phase-delayed PLIB components which are optically combined, which are projected onto the same points of the surface of the object being illuminated. This illumination process produces numerous substantially different time-varying speckle-noise patterns at the image detection array of the IFD Subsystem during the photo-integration time period thereof, so that the numerous time-varying speckle-noise patterns are temporally and spatially averaged during the photo-integration time period of the image detection array.

As shown in FIG. 1I9B, the cylindrical lens ring structure 382 comprises a cylindrically-configured array of cylindrical lens 386 mounted perpendicular to the surface of an annulus structure 387, connected to the shaft of electric motor 384 by way of support arms 388A, 388B, 388C and 388D. The cylindrical lenslets should face radially outwardly, as shown in FIG. 1I9B. As shown in FIG. 1I9A, the PLIA 6A, 6B is stationarily mounted relative to the rotor of the motor 384 so that the PLIB 383 produced therefrom is oriented substantially perpendicular to the axis of rotation of the motor, and is transmitted through each cylindrical lens element 386 in the ring structure 382 at an angle which is substantially perpendicular to the longitudinal axis of each cylindrical lens element 386. The composite PLIB 389 produced from optical assemblies 380A and 380B is spatially coherent-reduced and yields images having reduced speckle-noise patterns in accordance with the present invention.

In the case of the optical system of FIG. 1I9A, the following parameters will influence the number of substantially different time-varying speckle-noise patterns generated at the image detection array during each photo-integration time period thereof: (i) the spatial period of the cylindrical lens elements in the lens array ring structure; (ii) the width dimension of each cylindrical lens element; (iii) the circumference of the cylindrical lens array ring structure; (iv) the tangential velocity thereof at the point where the PLIB intersects the transmitted PLIB; and (v) the number of real laser illumination sources employed in each planar laser illumination array in the PLIIM-based system. Parameters (1) through (iv) will factor into the specification of the spatial phase modulation function (SPMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I9A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial phase modulated PLIB, and (ii) the photo-integration time period of the image detection array of the PLIIM-based system.

Apparatus of the Present Invention for Micro-Oscillating the Planar Laser Illumination Beam (PLIB) Using a Diffractive-Type Cylindrical Lens Array Ring Structure to Spatial Intensity Modulate Said PLIB Prior to Target Object Illumination In FIG. 1I10A, there is shown a pair of optical assemblies 390A and 390B for use in any PLIIM-based system of the present invention. As shown, each optical assembly 390 comprises a PLIA 6A, 6B with a PLIB phase-modulation mechanism 391 realized by a diffractive (i.e. holographic) type cylindrical lens array ring structure 392 for micro-oscillating the PLIB 393 prior to illuminating the target object. The lens array ring structure 392 can be made from a strip of holographic recording material 392A which has cylindrical lenses elements holographically recorded therein using conventional holographic recording techniques. This holographically recorded strip 392A is sandwiched between an inner and outer set of glass cylinders 392B and 392C, and sealed off from air or moisture on its top and bottom edges using a glass sealant. The holographically recorded cylindrical lens elements (CLEs) are arranged about the ring structure with a high spatial period (e.g. 64 CLEs per inch). HDE construction techniques disclosed in copending U.S. application Ser. No. 09/071,512, incorporated herein by reference, can be used to manufacture the HDE ring structure 312. The ring structure 392 is securely held at its bottom end within a groove formed within annulus support structure 397, as shown in FIG. 1I10B. As shown therein, the cylindrical lens ring structure 392 is mounted perpendicular to the surface of an annulus structure 397 connected to the shaft of electric motor 394 by way of support arms 398A, 398B, 398C, and 398D. As shown in FIG. 1I10A, the PLIA 6A, 6B is stationarily mounted relative to the rotor of the motor 394 so that the PLIB 393 produced therefrom is oriented substantially perpendicular to the axis of rotation of the motor 394, and is transmitted through each holographically-recorded cylindrical lens element (HDE) 396 in the ring structure 392 at an angle which is substantially perpendicular to the longitudinal axis of each cylindrical lens element 396.

In accordance with the first Generalized method, the cylindrical lens array ring structure 392 is rotated by a high-speed electric motor 394 about its axis as the composite PLIB is transmitted from the PLIA 6A through the rotating cylindrical lens array ring structure. During the transmission process, the phase along the wavefront of the PLIB is spatial phase modulated. The function of the rotating cylindrical lens array ring structure 392 is to module the phase along the wavefront of the PLIB producing spatial phase modulated PLIB components which are optically combined and projected onto the same points of the surface of the object being illuminated. This illumination process produces numerous substantially different time-varying speckle-noise patterns at the image detection array of the IFD Subsystem during the photo-integration time period thereof. These time-varying speckle-noise patterns are temporally and spatially averaged at the image detector during each photo-integration time, thereby reducing the RMS power of speckle-noise patterns observed at the image detection array.

In the case of optical system of FIG. 1I10A, the following parameters will influence the number of substantially different time-varying speckle-noise patterns generated at the image detection array during each photo-integration time period thereof: (i) the spatial period of the cylindrical lens elements in the lens array ring structure; (ii) the width dimension of each cylindrical lens element; (iii) the circumference of the cylindrical lens array ring structure; (iv) the tangential velocity thereof at the point where the PLIB intersects the transmitted PLIB; and (v) the number of real laser illumination sources employed in each planar laser illumination array in the PLIIM-based system. Parameters (1) through (iv) will factor into the specification of the spatial phase modulation function (SPMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I9A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial phase modulated PLIB, and (ii) the photo-integration time period of the image detection array of the PLIIM-based system.

Apparatus of the Present Invention for Micro-Oscillating the Planar Laser Illumination Beam (PLIB Using a Reflective-Type Phase Modulation Disc Structure to Spatial Phase Modulate Said PLIB Prior to Target Object Illumination In FIGS. 1I11A through 1I11C, there is shown a PLIIM-based system 400 embodying a pair of optical assemblies 401A and 401B, each comprising a reflective-type phase-modulation mechanism 402 mounted between a pair of PLIAs 6A1 and 6A2, and towards which the PLIAs 6B1 and 6B2 direct a pair of composite PLIBs 402A and 402B. In accordance with the first generalized method, the phase-modulation mechanism 402 comprises a reflective-type PLIB phase-modulation disc structure 404 having a cylindrical surface 405 with randomly or periodically distributed relief (or recessed) surface discontinuities that function as "spatial phase modulation elements". The phase modulation disc 404 is rotated by a high-speed electric motor 407 about its axis so that, prior to illumination of the target object, each PLIB 402A and 402B is reflected off the phase modulation surface of the disc 404 as a composite PLIB 409 (i.e. in a direction of coplanar alignment with the field of view (FOV) of the IFD subsystem), spatial phase modulates the PLIB and causing the PLIB 409 to be micro-oscillated along its planar extent. The function of each rotating phase-modulation disc 404 is to module the phase along the wavefront of the PLIB, producing numerous phase-delayed PLIB components which are optically combined and projected onto the same points of the surface of the object being illuminated. This produces numerous substantially different time-varying speckle-noise patterns at the image detection array during each photo-integration time period (i.e. interval) thereof. The time-varying speckle-noise patterns are temporally and spatially averaged at the image detection array during the photo-integration time period thereof, thereby reducing the RMS power of the speckle-noise patterns observe at the image detection array. As shown in FIG. 1I11B, the reflective phase-modulation disc 404, while spatially-modulating the PLIB, does not effect the coplanar relationship maintained between the transmitted PLIB 409 and the field of view (FOV) of the IFD Subsystem.

In the case of optical system of FIG. 1I11A, the following parameters will influence the number of substantially different time-varying speckle-noise patterns generated at the image detection array during each photo-integration time period thereof: (i) the spatial period of the spatial phase modulating elements arranged on the surface 405 of each disc structure 404; (ii) the width dimension of each spatial phase modulating element on surface 405; (iii) the circumference of the disc structure 404; (iv) the tangential velocity on surface 405 at which the PLIB reflects thereoff; and (v) the number of real laser illumination sources employed in each planar laser illumination array in the PLIIM-based system. Parameters (1) through (iv) will factor into the specification of the spatial phase modulation function (SPMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I11A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial phase modulated PLIB, and (ii) the photo-integration time period of the image detection array of the PLIIM-based system.

Apparatus of the Present Invention for Producing a Micro-Oscillating Planar Laser Illumination (PLIB) Using a Rotating Polygon Lens Structure which Spatial Phase Modulates Said PLIB Prior to Target Object Illumination In FIG. 1I12A, there is shown an optical assembly 417 for use in any PLIIM-based system of the present invention. As shown, the optical assembly 417 comprises a PLIA 6A', 6B' and stationary cylindrical lens array 341 maintained within frame 342, wherein each planar laser illumination module (PLIM) 11' employed therein includes an integrated phase-modulation mechanism. In accordance with the first generalized method, the PLIB micro-oscillation mechanism is realized by a multi-faceted (refractive-type) polygon lens structure 16' having an array of cylindrical lens surfaces 16A' symmetrically arranged about its circumference. As shown in FIG. 1I12C, each cylindrical lens surface 16A' is diametrically opposed from another cylindrical lens surface arranged about the polygon lens structure so that as a focused laser beam is provided as input on one cylindrical lens surface, a planarized laser beam exits another (different) cylindrical lens surface diametrically opposed to the input cylindrical lens surface.

As shown in FIG. 1I12B, the multi-faceted polygon lens structure 16' employed in each PLIM 11' is rotatably supported within housing 418A (comprising housing halves 418A1 and 418A2). A pair of sealed upper and lower ball bearing sets 418B1 and 418B2 are mounted within the upper and lower end portions of the polygon lens structure 16' and slidably secured within upper and lower raceways 418C1 and 418C2 formed in housing halves 418A1 and 418A2, respectively. As shown, housing half 418A1 has an input light transmission aperture 418D1 for passage of the focused laser beam from the VLD, whereas housing half 418A2 has an elongated output light transmission aperture 418D2 for passage of a component PLIB. As shown, the polygon lens structure 16' is rotatably supported within the housing when housing halves 418A1 and 418A2 are brought physically together and interconnected by screws, ultrasonic welding, or other suitable fastening techniques.

As shown in FIG. 1I12C, a gear element 418E is fixed attached to the upper portion of each polygon lens structure 16' in the PLIA. Also, as shown in FIG. 1I12D, each neighboring gear element is intermeshed and one of these gear elements is directly driven by an electric motor 418H so that the plurality of polygon lens structures 16' are simultaneously rotated and a plurality of component PLIBs 419A are generated from their respective PLIMs during operation of the speckle-pattern noise reduction assembly 417, and a composite PLIB 418B is produced from cylindrical lens array 341.

In accordance with the first generalized method of speckle-pattern noise reduction, each polygon lens structure is rotated about its axis during system operation. During system operation, each polygon lens structure 16' is rotated about its axis, and the composite PLIB transmitted from the PLIA 6A', 6B' is spatial phase modulated along the planar extent thereof, producing numerous phase-delayed PLIB components. The function of the cylindrical lens array 341 is to optically combine these numerous phase-delayed PLIB components and project the same onto the points of the object being illuminated. This causes the phase along the wavefront of the transmitted PLIB to be modulated and numerous substantially different time-varying speckle-noise patterns produced at the image detection array of the IFD Subsystem during the photo-integration time period thereof. The numerous time-varying speckle-noise patterns produced at the image detection array are temporally and spatially averaged during the photo-integration time period thereof, thereby reducing the RMS power of speckle-noise patterns observed at the image detection array.

In the case of optical system of FIG. 1I12A, the following parameters will influence the number of substantially different time-varying speckle-noise patterns generated at the image detection array during each photo-integration time period thereof: (i) the spatial period of the cylindrical lens surfaces; (ii) the width dimension of each cylindrical lens surface; (iii) the circumference of the polygon lens structure; (iv) the tangential velocity of the cylindrical lens surfaces through which focused laser beam are transmitted; and (v) the number of real laser illumination sources employed in each planar laser illumination array (PLIA) in the PLIIM-based system. Parameters (1) through (iv) will factor into the specification of the spatial phase modulation function (SPMF) of this speckle-noise reduction subsystem design. In general, if the system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I12A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial phase modulated PLIB, and (ii) the photo-integration time period of the image detection array of the PLIIM-based system.

Second Generalized Method of Speckle-Noise Pattern Reduction and Particular Forms of Apparatus Therefor Based on Reducing the Temporal Coherence of the Planar Laser Illumination Beam (PLIB) Before it Illuminates the Target Object by Applying Temporal Intensity Modulation Techniques During the Transmission of the PLIB Towards the Target Referring to FIGS. 1I13 through 1I15F, the second generalized method of speckle-noise pattern reduction and particular forms of apparatus therefor will be described. This generalized method is based on the principle of temporal intensity modulating the "transmitted" planar laser illumination beam (PLIB) prior to illuminating a target object (e.g. package) therewith so that the object is illuminated with a temporally coherent-reduced planar laser beam and, as a result, numerous substantially different time-varying speckle-noise patterns are produced and detected over the photo-integration time period of the image detection array (in the IFD subsystem). These speckle-noise patterns are temporally averaged and/or spatially averaged and the observable speckle-noise patterns reduced. This method can be practiced with any of the PLIIM-based systems of the present invention disclosed herein, as well as any system constructed in accordance with the general principles of the present invention.

As illustrated at Block A in FIG. 1I13B, the first step of the second generalized method shown in FIGS. 1I13 through 1I13A involves modulating the temporal intensity of the transmitted planar laser illumination beam (PLIB) along the planar extent thereof according to a (random or periodic) temporal-intensity modulation function (TIMF) prior to illumination of the target object with the PLIB. This causes numerous substantially different time-varying speckle-noise patterns to be produced at the image detection array during the photo-integration time period thereof. As indicated at Block B in FIG. 1I13B, the second step of the method involves temporally and spatially averaging the numerous time-varying speckle-noise patterns detected during each photo-integration time period of the image detection array in the IFD Subsystem, thereby reducing the RMS power of the speckle-noise patterns observed at the image detection array.

When using the second generalized method, the target object is repeatedly illuminated with planes of laser light apparently originating at different moments in time (i.e. from different virtual illumination sources) over the photo-integration period of each detector element in the image detection array of the PLIIM-based system. As the relative phase delays between these virtual illumination sources are changing over the photo-integration time period of each image detection element, these virtual illumination sources are effectively rendered temporally incoherent (or temporally coherent-reduced) with respect to each other. On a time-average basis, virtual illumination sources produce these time-varying speckle-noise patterns which are temporally and spatially averaged during the photo-integration time period of the image detection elements, thereby reducing the RMS power of the observed speckle-noise patterns. As speckle-noise patterns are roughly uncorrelated at the image detector, the reduction in speckle noise amplitude should be proportional to the square root of the number of independent real and virtual laser illumination sources contributing to the illumination of the target object and formation of the image frames thereof. As a result of the method of the present invention, image-based bar code symbol decoders and/or OCR processors operating on such digital images can be processed with significant reductions in error.

The second generalized method above can be explained in terms of Fourier Transform optics. When temporally modulating the transmitted PLIB by a periodic or random temporal intensity modulation (TIMF) function, while satisfying conditions (i) and (ii) above, a temporal intensity modulation process occurs on the time domain. This temporal intensity modulation process is equivalent to mathematically multiplying the transmitted PLIB by the temporal intensity modulation function. This multiplication process on the time domain is equivalent on the time-frequency domain to the convolution of the Fourier Transform of the temporal intensity modulation function with the Fourier Transform of the transmitted PLIB. On the time-frequency domain, this convolution process generates temporally-incoherent (i.e. statistically-uncorrelated) spectral components which are permitted to spatially-overlap at each detection element of the image detection array (i.e. on the spatial domain) and produce time-varying speckle-noise patterns which are temporally and spatially averaged during the photo-integration time period of each detector element, to reduce the RMS power of speckle-noise patterns observed at the image detection array.

In general, various types of temporal intensity modulation techniques can be used to carry out the first generalized method including, for example: mode-locked laser diodes (MLLDs) employed in the planar laser illumination array; electro-optical temporal intensity modulators disposed along the optical path of the composite planar laser illumination beam; internal and external type laser beam frequency modulation (FM) devices; internal and external laser beam amplitude modulation (AM) devices; etc. Several of these temporal intensity modulation mechanisms will be described in detail below.

Electro-Optical Apparatus of the Present Invention for Temporal Intensity Modulating the Planar Laser Illumination (PLIB) Beam Prior to Target Object Illumination Employing High-Speed Beam Gating/Shutter Principles In FIGS. 1I14A through 1I14B, there is shown an optical assembly 420 for use in any PLIIM-based system of the present invention. As shown, the optical assembly 420 comprises a PLIA 6A, 6B with a refractive-type cylindrical lens array 421 (e.g. operating according to refractive, diffractive and/or reflective principles) supported in frame 822, and an electrically-active temporal intensity modulation panel 423 (e.g. high-speed electro-optical gating/shutter device) arranged in front of the cylindrical lens array 421. Electronic driver circuitry 424 is provided to drive the temporal intensity modulation panel 43 under the control of camera control computer 22. In the illustrative embodiment, electronic driver circuitry 424 can be programmed to produce an output PLIB 425 consisting of a periodic light pulse train, wherein each light pulse has an ultra-short time duration and a rate of repetition (i.e. temporal characteristics) which generate spectral harmonics (i.e. components) on the time-frequency domain. These spectral harmonics, when optically combined by cylindrical lens array 421, and projected onto a target object, illuminate the same points on the surface thereof, and reflect/scatter therefrom, resulting in the generation of numerous time-varying speckle-patterns at the image detection array during each photo-integration time period thereof in the PLIIM-based system.

During system operation, the PLIB 424 is temporal intensity modulated according to a (random or periodic) temporal-intensity modulation (e.g. windowing) function (TIMF) so that numerous substantially different time-varying speckle-noise patterns are produced at the image detection array during the photo-integration time period thereof. The time-varying speckle-noise patterns detected at the image detection array are temporally and spatially averaged during each photo-integration time period thereof, thus reducing the RMS power of the speckle-noise patterns observed at the image detection array.

In the case of optical system of FIG. 1I14A, the following parameters will influence the number of substantially different time-varying speckle-noise patterns generated during each photo-integration lime period: (i) the time duration of each light pulse in the output PLIB 425; (ii) the rate of repetition of the light pulses in the output PLIB; and (iii) the number of real laser illumination sources employed in each planar laser illumination array in the PLIIM-based system. Parameters (i) and (ii) will factor into the specification of the temporal intensity modulation function (TIMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I14A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the temporal derivative of the temporal intensity modulated PLIB, and (ii) the photo-integration time period of the image detection array of the PLIIM-based system.

Electro-Optical Apparatus of the Present Invention for Temporal Intensity Modulating the Planar Laser Illumination Beam (PLIB) Prior to Target Object Illumination Employing Visible Mode-Locked Laser Diodes (MLLDs)

In FIGS. 1I15A through 1I15B, there is shown an optical assembly 440 for use in any PLIIM-based system of the present invention. As shown, the optical assembly 440 comprises a cylindrical lens array 441 (e.g. operating according to refractive, diffractive and/or reflective principles), mounted in front of a PLIA 6A, 6B embodying a plurality of visible mode-locked visible diodes (MLLDs) 13'. In accordance with the second generalized method of the present invention, each visible MLLD 13' is configured and tuned to produce ultra-short pulses of light having a time duration and at occurring at a rate of repetition (i.e. frequency) which causes the transmitted PLIB 443 to be temporal-intensity modulated according to a (random or periodic) temporal intensity modulation function (TIMF) prior to illumination of the target object with the PLIB. This causes numerous substantially different time-varying speckle-noise patterns produced at the image detection array during the photo-integration time period thereof. These numerous time-varying speckle-noise patterns are temporally and spatially averaged during each photo-integration time period of the image detection array in the IFD Subsystem, thereby reducing the RMS power of the speckle-noise patterns observed at the image detection array.

As shown in FIG. 1I15B, each MLLD 13' employed in the PLIA of FIG. 1I15A comprises: a multi-mode laser diode cavity 444 referred to as the active layer (e.g. InGaAsP) having a wide emission-bandwidth over the visible band, and suitable time-bandwidth product for the application at hand; a collimating lenslet 445 having a very short focal length; an active mode-locker 446 (e.g. temporal-intensity modulator) operated under switched electronic control of a TIM controller 447; a passive-mode locker (i.e. saturable absorber) 448 for controlling the pulse-width of the output laser beam; and a mirror 449, affixed to the passive-mode locker 447, having 99% reflectivity and 1% transmittivity at the operative wavelength band of the visible MLLD. The multi-mode diode laser diode 13' generates (within its primary laser cavity) numerous modes of oscillation at different optical wavelengths within the time-bandwidth product of the cavity. The collimating lenslet 445 collimates the divergent laser output from the diode cavity 444, has a very short local length and defines the aperture of the optical system. The collimated output from the lenslet 445 is directed through the active mode locker 446, disposed at a very short distance away (e.g. 1 millimeter). The active mode locker 446 is typically realized as a high-speed temporal intensity modulator which is electronically-switched between optically transmissive and optically opaque states at a switching frequency equal to the frequency ($f_{MLB}$) of the mode-locked laser beam pulses to be produced at the output of each MLLD. This laser beam pulse frequency $f_{MLB}$ is governed by the following equation: $f_{MLB}=c/2L$, where c is the speed of light, and L is the total length of the MLLD, as defined in FIG. 1I15B. The partially transmission mirror 449, disposed a short distance (e.g. 1 millimeter) away from the active mode locker 446, is characterized by a reflectivity of about 99%, and a transmittance of about 1% at the operative wavelength band of the MLLD. The passive mode locker 448, applied to the interior surface of the mirror 449, is a photo-bleachable saturatable material which absorbs photons at the operative wavelength band. When the passive mode blocker 448 is totally absorbed (i.e. saturated), it automatically transmits the absorbed photons as a burst (i.e. pulse) of output laser light from the visible MLLD. After the burst of photons are emitted, the passive mode blocker 448 quickly recovers for the next photon absorption/saturation/release cycle. Notably, absorption and recovery time characteristics of the passive mode blocker 448 controls the time duration (i.e. width) of the optical pulses produced from the visible MLLD. In typical high-speed package scanning applications requiring a relatively short photo-integration time period (e.g. $10^{-4}$ sec), the absorption and recovery time characteristics of the passive mode blocker 448 can be on the order of femtoseconds. This will ensure that the composite PLIB 443 produced from the MLLD-based PLIA contains higher order spectral harmonics (i.e. components) with sufficient magnitude to cause a significant reduction in the temporal coherence of the PLIB and thus in the power-density spectrum of the speckle-noise pattern observed at the image detection array of the IFD Subsystem. For further details regarding the construction of MLLDs, reference should be made to "Diode Laser Arrays" (1994), by D. Botez and D. R. Scifres, supra, incorporated herein by reference.

In the case of optical system of FIG. 1I15A, the following parameters will influence the number of substantially different time-varying speckle-noise patterns generated during each photo-integration time period: (i) the time duration of each light pulse in the output PLIB 443; (ii) the rate of repetition of the light pulses in the output PLIB; and (iii) the number of real laser illumination sources employed in each planar laser illumination array in the PLIIM-based system. Parameters (i) and (ii) will factor into the specification of the temporal intensity modulation function (TIMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I15C, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the temporal derivative of the temporal intensity modulated PLIB, and (ii) the photo-integration time period of the image detection array of the PLIIM-based system.

Electro-Optical Apparatus of the Present Invention for Temporal Intensity Modulating the Planar Laser Illumination Beam (PLIB) Prior to Target Object Illumination Employing Current-Modulated Visible Laser Diodes (VLDs)

There are other techniques for reducing speckle-noise patterns by temporal intensity modulating PLIBs produced by PLIAs according to the principles of the present invention. A straightforward approach to temporal intensity modulating the PLIB would be to either (i) modulate the diode current driving the VLDs of the PLIA in a non-linear mode of operation, or (ii) use an external optical modulator to temporal intensity modulate the PLIB in a non-linear mode of operation. By operating VLDs in a non-linear manner, high order spectral harmonics can be produced which, in cooperation with a cylindrical lens array, cooperate to generate substantially different time-varying speckle-noise patterns during each photo-integration time period of the image detection array of the PLIIM-based system.

In principal, non-linear amplitude modulation (AM) techniques can be employed with the first approach (i) above, whereas the non-linear AM, frequency modulation (FM), or temporal phase modulation (PM) techniques can be employed with the second approach (ii) above. The primary purpose of applying such non-linear laser modulation techniques is to introduce spectral side-bands into the optical spectrum of the planar laser illumination beam (PLIB). The spectral harmonics in this side-band spectra are determined by the sum and difference frequencies of the optical carrier frequency and the modulation frequency(ies) employed. If the PLIB is temporal intensity modulated by a periodic temporal intensity modulation (time-windowing) function (e.g. 100% AM), and the time period of this time windowing function is sufficiently high, then two points on the target surface will be illuminated by light of different optical frequencies (i.e. uncorrelated virtual laser illumination sources) carried within pulsed-periodic PLIB. In general, if the difference in optical frequencies in the pulsed-periodic PLIB is large (i.e. caused by compressing the time duration of its constituent light pulses) compared to the inverse of the photo-integration time period of the image detection array, then observed the speckle-noise pattern will appear to be washed out (i.e. additively cancelled) by the beating of the two optical frequencies at the image detection array. To ensure that the uncorrelated speckle-noise patterns detected at the image detection array can additively average (i.e. cancel) out during the photo-integration time period of the image detection array, the rate of light pulse repetition in the transmitted PLIB should be increased to the point where numerous time-varying speckle-patterns are produced thereat, while the time duration (i.e. duty cycle) of each light pulse in the pulsed PLIB is compressed so as to impart greater magnitude to the higher order spectral harmonics comprising the periodic-pulsed PLIB generated by the application of such non-linear modulation techniques.

In FIG. 1I15C, there is shown an optical subsystem 760 for despeckling which comprises a plurality of visible laser diodes (VLDs) 13 and a plurality of cylindrical lens elements 16 arranged in front of a cylindrical lens array 441 supported within a frame 442. Each VLD is driven by a digitally-controlled temporal intensity modulation (TIM) controller 761 so that the PLIB transmitted from the PLIA is temporal intensity modulated according to a temporal-intensity modulation function (TIMF) that is controlled by the programmable drive-current source. This temporal intensity modulation of the transmitted PLIB modulates the temporal phase along the wavefront of the transmitted PLIB, producing numerous substantially different speckle-noise patterns at the image detection array of the IFD subsystem during the photo-integration time period thereof. In turn, these time-varying speckle-patterns are temporally and spatially averaged during the photo-integration time period of the image detection array, thus reducing the RMS power of speckle-noise patterns observed at the image detection array.

As shown in FIG. 1I15D, the temporal intensity modulation (TIM) controller 751 employed in optical subsystem 760 in FIG. 1I15E, comprises: a programmable current source for driving each VLD, which is realized by a voltage source 762, and a digitally-controllable potentiometer 763 configured in series with each VLD 13 in the PLIA; and a programmable microcontroller 764 in operable communication with the camera control computer 22. The function of the microcontroller 764 is to receive timing/synchronization signals and control data from the camera control computer 22 in order to precisely control the amount of current flowing through each VLD at each instant in time. FIG. 1I15E graphically illustrates an exemplary triangular current waveform which might be transmitted across the junction of each VLD in the PLIA of FIG. 1I15C, as the current waveform is being controlled by the microcontroller 764, voltage source 762 and digitally-controllable potentiometer 763 associated with the VLD 13. FIG. 1I15F graphically illustrates the light intensity output from each VLD in the PLIA of FIG. 1I15C, generated in response to the triangular electrical current waveform transmitted across the junction of the VLD.

Notably, the current waveforms generated by the microcontroller 764 can be quite diverse in character, in order to produce temporal intensity modulation functions (TIMF) which exhibit a spectral harmonic constitution that results in a substantial reduction in the RMS power of speckle-pattern noise observed at the image detection array of PLIIM-based systems.

In accordance with the second generalized method of the present invention, each VLD 13 is preferably driven in a non-linear manner by a time-varying electrical current produced by a high-speed VLD drive current modulation circuit, referred to as the TIM controller 761 in FIGS. 1I15C and 1I15D. In the illustrative embodiment shown in FIGS. 1I15C through 1I15F, the electrical current flowing through each VLD 13 is controlled by the digitally-controllable potentiometer 763 configured in electrical series therewith, and having an electrical resistance value R programmably set under the control of microcontroller 753. Notably, microcontroller 764 automatically responds to timing/synchronization signals and control data periodically received from the camera control computer 22 prior to the capture of each line of digital image data by the PLIIM-based system. The VLD drive current supplied to each VLD in the PLIA effectively modulates the amplitude of the output planar laser illumination beam (PLIB) component. Preferably, the depth of amplitude modulation (AM) of each output PLIB component will be close or equal to 100% in order to increase the magnitude of the higher order spectral harmonics generated during the AM process. Increasing the rate of change of the amplitude modulation of the laser beam (i.e. its pulse repetition frequency) will result in the generation of higher-order spectral components in the composite PLIB. Shortening the width of each optical pulse in the output pulse train of the transmitted PLIB will increase the magnitude of the higher-order spectral harmonics present therein during object illumination operations.

In the case of optical system of FIG. 1I15C, the following parameters will influence the number of substantially different time-varying speckle-noise patterns generated during each photo-integration time period: (i) the time duration of each light pulse in the output PLIB 443; (ii) the rate of repetition of the light pulses in the output PLIB; and (iii) the number of real laser illumination sources employed in each planar laser illumination array in the PLIIM-based system. Parameters (i) and (ii) will factor into the specification of the temporal intensity modulation function (TIMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I14A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the temporal derivative of the temporal intensity modulated PLIB, and (ii) the photo-integration time period of the image detection array of the PLIIM-based system.

Notably, both external-type and internal-type laser modulation devices can be used to generate higher order spectral harmonics within transmitted PLIBs. Internal-type laser modulation devices, employing laser current and/or temperature control techniques, modulate the temporal intensity of the transmitted PLIB in a non-linear manner (i.e. zero PLIB power, full PLIB power) by controlling the current of the VLDs producing the PLIB. In contrast, external-type laser modulation devices, employing high-speed optical-gating and other light control devices, modulate the temporal intensity of the transmitted PLIB in a non-linear manner (i.e. zero PLIB power, full PLIB power) by directly controlling temporal intensity of luminous power in the transmitted PLIB. Typically, such external-type techniques will require additional heat management apparatus. Cost and spatial constraints will factor in which techniques to use in a particular application.

Third Generalized Method of Speckle-Noise Pattern Reduction and Particular Forms of Apparatus Therefor Based on Reducing the Temporal-Coherence of the Planar Laser Illumination Beam (PLIB) Before it Illuminates the Target Object by Applying Temporal Phase Modulation Techniques During the Transmission of the PLIB Towards the Target Referring to FIGS. 1I16 through 1I17E, the third generalized method of speckle-noise pattern reduction and particular forms of apparatus therefor will be described. This generalized method is based on the principle of temporal phase modulating the "transmitted" planar laser illumination beam (PLIB) prior to illuminating a target object therewith so that the object is illuminated with a temporally coherent reduced planar laser beam and, as a result, numerous time-varying (random) speckle-noise patterns are produced and detected over the photo-integration time period of the image detection array (in the IFD subsystem), thereby allowing these speckle-noise patterns to be temporally averaged and/or spatially averaged and the observable speckle-noise pattern reduced. This method can be practiced with any of the PLIM-based systems of the present invention disclosed herein, as well as any system constructed in accordance with the general principles of the present invention.

As illustrated at Block A in FIG. 1I16B, the first step of the third generalized method shown in FIGS. 1I16 through 1I16A involves temporal phase modulating the transmitted PLIB along the entire extent thereof according to a (random or periodic) temporal phase modulation function (TPMF) prior to illumination of the target object with the PLIB, so as to produce numerous substantially different time-varying speckle-noise pattern at the image detection array of the IFD Subsystem during the photo-integration time period thereof. As indicated at Block B in FIG. 1I16B, the second step of the method involves temporally and spatially averaging the numerous substantially different speckle-noise patterns produced at the image detection array during the photo-integration time period thereof, thereby reducing the RMS power of speckle-noise patterns observed at the image detection array.

When using the third generalized method, the target object is repeatedly illuminated with laser light apparently originating from different moments (i.e. virtual illumination sources) in time over the photo-integration period of each detector element in the linear image detection array of the PLIIM system, during which reflected laser illumination is received at the detector element. As the relative phase delays between these virtual illumination sources are changing over the photo-integration time period of each image detection element, these virtual sources are effectively rendered temporally incoherent with each other. On a time-average basis, these time-varying speckle-noise patterns are temporally and spatially averaged during the photo-integration time period of the image detection elements, thereby reducing the RMS power of speckle-noise patterns observed thereat. As speckle-noise patterns are roughly uncorrelated at the image detection array, the reduction in speckle-noise power should be proportional to the square root of the number of independent virtual laser illumination sources contributing to the illumination of the target object and formation of the images frame thereof. As a result of the present invention, image-based bar code symbol decoders and/or OCR processors operating on such digital images can be processed with significant reductions in error.

The third generalized method above can be explained in terms of Fourier Transform optics. When temporal intensity modulating the transmitted PLIB by a periodic or random temporal phase modulation function (TPMF), while satisfying conditions (i) and (ii) above, a temporal phase modulation process occurs on the temporal domain. This temporal phase modulation process is equivalent to mathematically multiplying the transmitted PLIB by the temporal phase modulation function. This multiplication process on the temporal domain is equivalent on the temporal-frequency domain to the convolution of the Fourier Transform of the temporal phase modulation function with the Fourier Transform of the composite PLIB. On the temporal-frequency domain, this convolution process generates temporally-incoherent (i.e. statistically-uncorrelated or independent) spectral components which are permitted to spatially-overlap at each detection element of the image detection array (i.e. on the spatial domain) and produce time-varying speckle-noise patterns which are temporally and spatially averaged during the photo-integration time period of each detector element, to reduce the speckle-noise pattern observed at the image detection array.

In general, various types of spatial light modulation techniques can be used to carry out the third generalized method including, for example: an optically resonant cavity (i.e. etalon device) affixed to external portion of each VLD; a phase-only LCD (PO-LCD) temporal intensity modulation panel; and fiber optical arrays. Several of these temporal phase modulation mechanisms will be described in detail below.

Electrically-Passive Optical Apparatus of the Present Invention for Temporal Phase Modulating the Planar Laser Illumination Beam (PLIB) Prior to Target Object Illumination Employing Photon Trapping, Delaying and Releasing Principles Within an Optically-Reflective Cavity (i.e. Etalon) Externally Affixed to Each Visible Laser Diode Within the Planar Laser Illumination Array (PLIA)

In FIGS. 1I17A through 1I17B, there is shown an optical assembly 430 for use in any PLIIM-based system of the present invention. As shown, the optical assembly 430 comprises a PLIA 6A, 6B with a refractive-type cylindrical lens array 431 (e.g. operating according to refractive, diffractive and/or reflective principles) supported within frame 432, and an electrically-passive temporal phase modulation device (i.e. etalon) 433 realized as an external optically reflective cavity) affixed to each VLD 13 of the PLIA 6A, 6B.

The primary principle of this temporal phase modulation technique is to delay portions of the laser light (i.e. photons) emitted by each laser diode 13 by times longer than the inherent temporal coherence length of the laser diode. In this embodiment, this is achieved by employing photon trapping, delaying and releasing principles within an optically reflective cavity. Typical laser diodes have a coherence length of a few centimeters (cm). Thus, if some of the laser illumination can be delayed by the time of flight of a few centimeters, then it will be incoherent with the original laser illumination. The electrically-passive device 433 shown in FIG. 1I17B can be realized by a pair of parallel, reflective surfaces (e.g. plates, films or layers) 436A and 436B, mounted to the output of each VLD 13 in the PLIA 6A, 6B. If one surface is essentially totally reflective (e.g. 97% reflective) and the other about 94% reflective, then about 3% of the laser illumination (i.e. photons) will escape the device through the partially reflective surface of the device on each round trip. The laser illumination will be delayed by the time of flight for one round trip between the plates. If the plates 436A and 436B are separated by a space 437 of several centimeters length, then this delay will be greater than the coherence time of the laser source. In the illustrative embodiment of FIGS. 1I17A and 1I17B, the emitted light (i.e. photons) will make about thirty (30) trips between the plates. This has the effect of mixing thirty (30) photon distribution samples from the laser source, each sample residing outside the coherence time thereof, thus destroying or substantially reducing the temporal coherence of the laser beams produced from the laser illumination sources in the PLIA of the present invention. A primary advantage of this technique is that it employs electrically-passive components which might be manufactured relatively inexpensively in a mass-production environment. Suitable components for constructing such electrically-passive temporal phase modulation devices 433 can be obtained from various commercial vendors.

During operation, the transmitted PLIB 434 is temporal phase modulated according to a (random or periodic) temporal phase modulation function (TPMF) so that the phase along the wavefront of the PLIB is modulated and numerous substantially different time-varying speckle-noise patterns are produced at the image detection array during the photo-integration time period thereof. The time-varying speckle-noise patterns detected at the image detection array are temporally and spatially averaged during each photo-integration time period thereof, thus reducing the RMS power of the speckle-noise patterns observed at the image detection array.

In the case of optical system of FIG. 1I17A, the following parameters will influence the number of substantially different time-varying speckle-noise patterns generated during each photo-integration time period: (i) the spacing between reflective surfaces (e.g. plates, films or layers) 436A and 436B; (ii) the reflection coefficients of these reflective surfaces; and (iii) the number of real laser illumination sources employed in each planar laser illumination array in the PLIIM-based system. Parameters (i) and (ii) will factor into the specification of the temporal phase modulation function (TPMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I17A, the number of substantially different time-varying speckle-noise pattern samples which need to be generated per each photo-integration time interval can be experimentally determined without undue experimentation. However, for a particular degree of speckle-noise power reduction, it is expected that the lower threshold for this sample number at the image detection array can be expressed mathematically in terms of (i) the time derivative of the temporal phase modulated PLIB, and (ii) the photo-integration time period of the image detection array of the PLIIM-based system.

Apparatus of the Present Invention for Temporal Phase Modulating the Planar Laser Illumination Beam (PLIB) Using a Phase-Only LCD-Based (PO-LCD) Temporal Phase Modulation Panel Prior to Target Object Illumination As shown in FIG. 1I17C, the general phase modulation principles embodied in the apparatus of FIG. 1I8A can be applied in the design the optical assembly for reducing the RMS power of speckle-noise patterns observed at the image detection array of a PLIIM-based system. As shown in FIG. 1I17C, optical assembly 800 comprises: a backlit transmissive-type phase-only LCD (PO-LCD) temporal phase modulation panel 701 mounted slightly beyond a PLIA 6A, 6B to intersect the composite PLIB 702; and a cylindrical lens array 703 supported in frame 704 and mounted closely to, or against phase modulation panel 701. In the illustrative embodiment, the phase modulation panel 701 comprises an array of vertically arranged phase modulating elements or strips 705, each made from birefrigent liquid crystal material which is capable of imparting a phase delay at each control point along the PLIB wavefront, which is greater than the coherence length of the VLDs using in the PLIA. Under the control of camera control computer 22, programmed drive voltage circuitry 706 supplies a set of phase control voltages to the array 705 so as to controllably vary the drive voltage applied across the pixels associated with each predefined phase modulating element 705.

During system operation, the phase-modulation panel 701 is driven by applying substantially the same control voltage across each element 705 in the phase modulation panel 701 so that the temporal phase along the entire wavefront of the PLIB is modulated by substantially the same amount of phase delay. These temporally-phase modulated PLIB components are optically combined by the cylindrical lens array 703, and projected 703 onto the same points on the surface of the object being illuminated. This illumination process results in producing numerous substantially different time-varying speckle-noise patterns at the image detection array (of the accompanying IFD subsystem) during the photo-integration time period thereof. These time-varying speckle-noise patterns are temporally and possibly spatially averaged thereover, thereby reducing the RMS power of speckle-noise patterns observed at the image detection array.

In the case of optical system of FIG. 1I17C, the following parameters will influence the number of substantially different time-varying speckle-noise patterns generated during each photo-integration time period: (i) the number of phase modulating elements in the array; (ii) the amount of temporal phase delay introduced at each control point along the wavefront; (iii) the rate at which the temporal phase delay changes; and (iv) the number of real laser illumination sources employed in each planar laser illumination array in the PLIIM-based system. Parameters (1) through (iv) will factor into the specification of the temporal phase modulation function (TPMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I17C, the number of substantially different time-varying speckle-noise pattern samples which need to be generated per each photo-integration time interval can be experimentally determined without undue experimentation. However, for a particular degree of speckle-noise power reduction, it is expected that the lower threshold for this sample number at the image detection array can be expressed mathematically in terms of (i) the time derivative of the temporal phase modulated PLIB, and (ii) the photo-integration time period of the image detection array of the PLIIM-based system.

Apparatus of the Present Invention for Temporal Phase Modulating the Planar Laser Illumination (PLIB) Using a High-Density Fiber-Optic Array Prior to Target Object Illumination As shown in FIGS. 1I17D and 1I17E, temporal phase modulation principles can be applied in the design of an optical assembly for reducing the RMS power of speckle-noise patterns observed at the image detection array of a PLIIM-based system. As shown in FIGS. 1I17C and 1I17C, optical assembly 810 comprises: a high-density fiber optic array 811 mounted slightly beyond a PLIA 6A, 6B, wherein each optical fiber element intersects a portion of a PLIB component 812 (at a particular phase control point) and transmits a portion of the PLIB component therealong while introducing a phase delay greater than the temporal coherence length of the VLDs, but different than the phase delay introduced at other phase control points; and a cylindrical lens array 703 characterized by a high spatial frequency, and supported in frame 704 and either mounted closely to or optically interfaced with the fiber optic array (FOA) 811, for the purpose of optically combining the differently phase-delayed PLIB subcomponents and projecting these optical combined components onto the same points on the target object to be illuminated. Preferably, the diameter of the individual fiber optical elements in the FOA 811 is sufficiently small to form a tightly packed fiber optic bundle with a rectangular form factor having a width dimension about the same size as the width of the cylindrical lens array 703, and a height dimension high enough to intercept the entire heightwise dimension of the PLIB components directed incident thereto by the corresponding PLIA. Preferably, the FOA 811 will have hundreds, if not thousands of phase control points at which different amounts of phase delay can be introduced into the PLIB. The input end of the fiber optic array can be capped with an optical lens element to optimize the collection of light rays associated with the incident PLIB components, and the coupling of such rays to the high-density array of optical fibers embodied therewithin. Preferably, the output end of the fiber optic array is optically coupled to the cylindrical lens array to minimize optical losses during PLIB propagation from the FOA through the cylindrical lens array.

During system operation, the FOA 811 modulates the temporal phase along the wavefront of the PLIB by introducing (i.e. causing) different phase delays along different phase control points along the PLIB wavefront, and these phase delays are greater than the coherence length of the VLDs employed in the PLIA. The cylindrical lens array optically combines numerous phase-delayed PLIB subcomponents and projects them onto the same points on the surface of the object being illuminated, causing such points to be illuminated by a temporal coherence reduced PLIB. This illumination process results in producing numerous substantially different time-varying speckle-noise patterns at the image detection array (of the accompanying IFD subsystem) during the photo-integration time period thereof. These time-varying speckle-noise patterns are temporally and possibly spatially averaged thereover, thereby reducing the RMS power of speckle-noise patterns observed at the image detection array.

In the case of optical system of FIG. 1I17C, the following parameters will influence the number of substantially different time-varying speckle-noise patterns generated at the image detection array during each photo-integration time period thereof: (i) the number and diameter of the optical fibers employed in the FOA; (ii) the amount of phase delay introduced by fiber optical element, in comparison to the coherence length of the corresponding VLD; (iii) the spatial period of the cylindrical lens array; (iv) the number of temporal phase control points along the PLIB; and (v) the number of real laser illumination sources employed in each planar laser illumination array in the PLIIM-based system. Parameters (1) through (v) will factor into the specification of the temporal phase modulation function (TPMF) of this speckle-noise reduction subsystem design. In general, if the system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I17C, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the time derivative of the temporal phase modulated PLIB, and (ii) the photo-integration time period of the image detection array of the PLIIM-based system.

Figures 1, 18A:
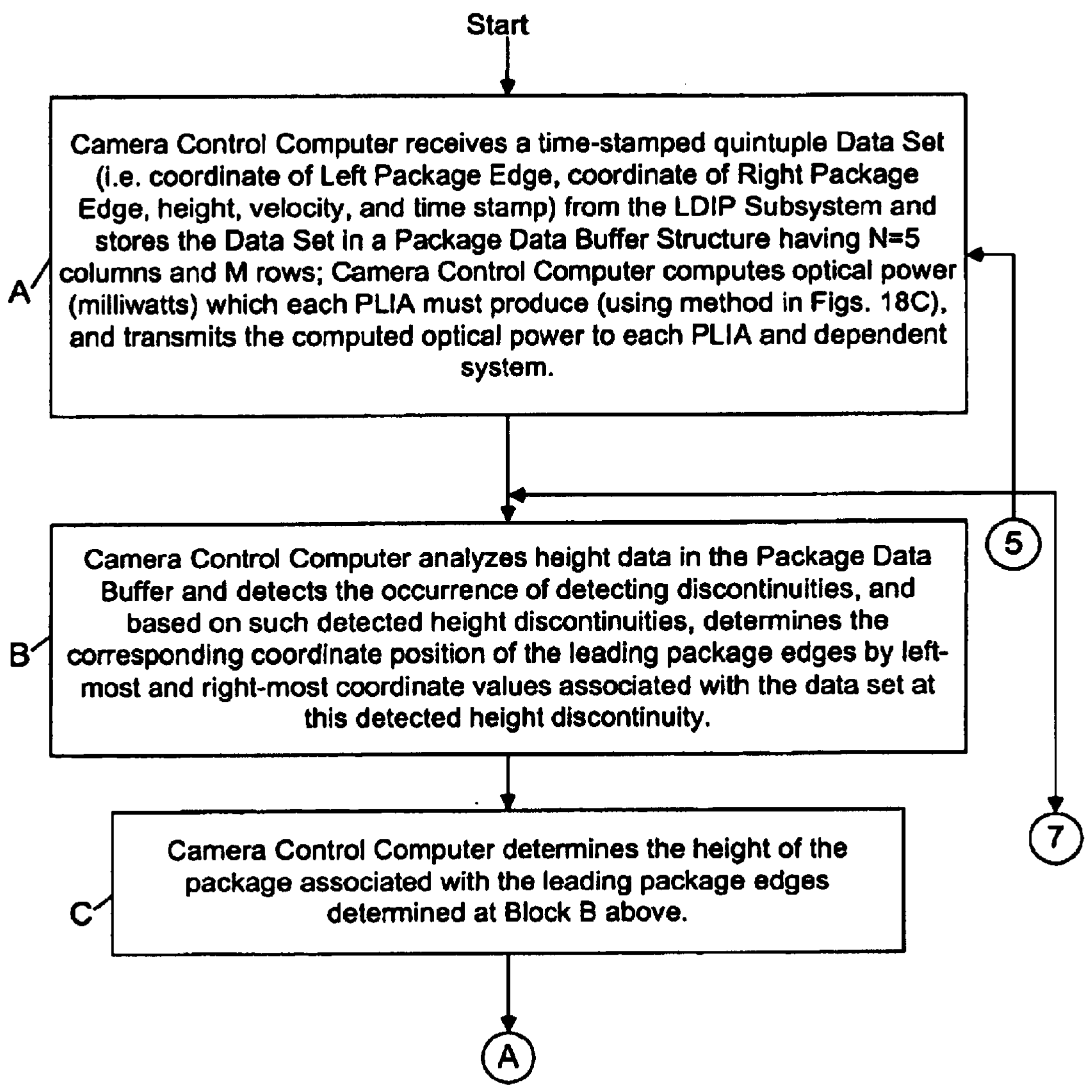
Figures 2, 18A:
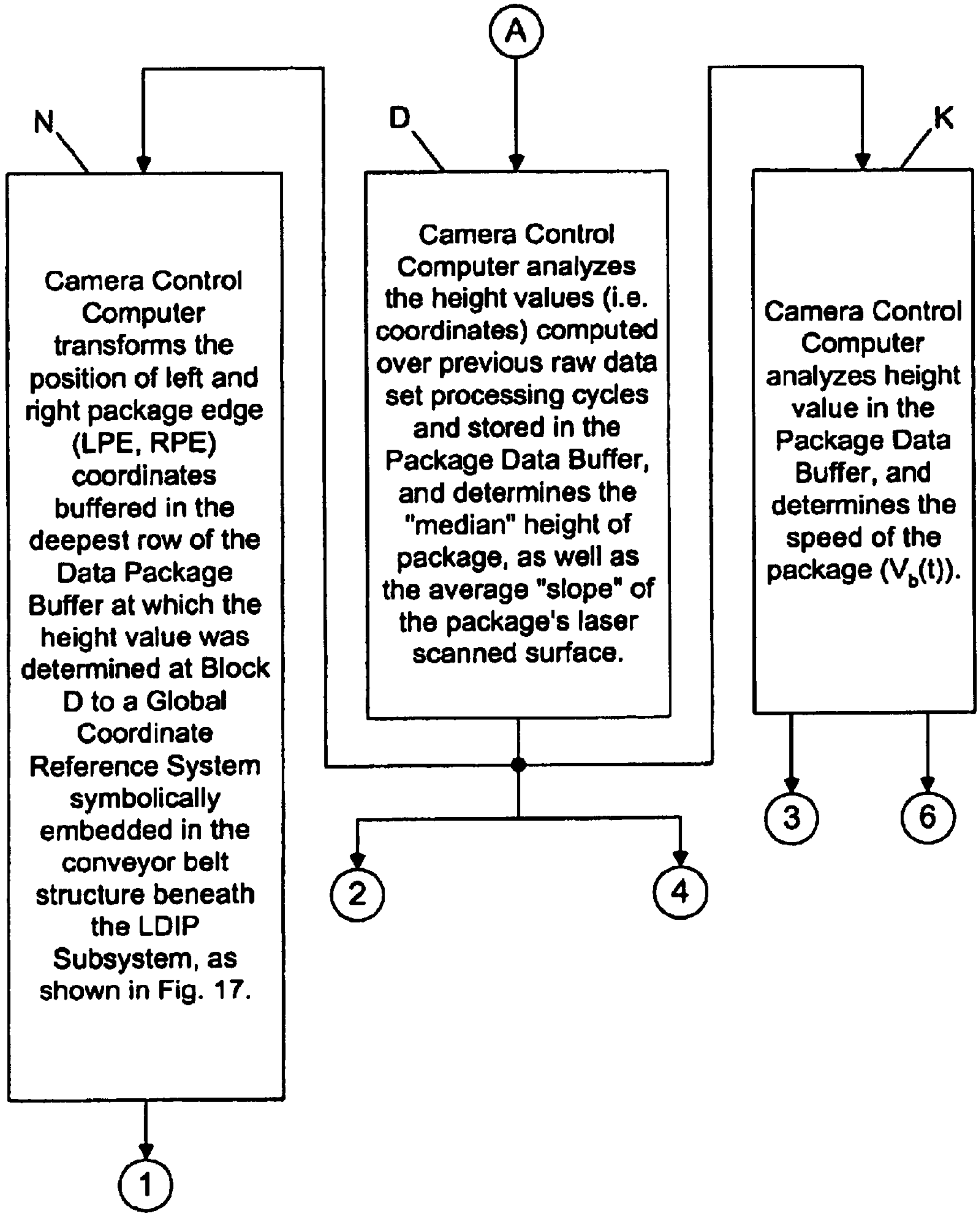

Fourth Generalized Method of Speckle-Noise Pattern Reduction and Particular Forms of Apparatus Therefor Based on Reducing the Temporal Coherence of the Planar Laser Illumination Beam (PLIB) Before it Illuminates the Target Object by Applying Temporal Frequency Modulation Techniques During the Transmission of the PLIB Towards the Target Referring to FIGS. 1I18A through 1I19C, the fourth generalized method of speckle-noise pattern reduction and particular forms of apparatus therefor will be described. This generalized method is based on the principle of temporal frequency modulating the “transmitted” planar laser illumination beam (PLIB) prior to illuminating a target object therewith so that the object is illuminated with a temporally coherent reduced planar laser beam and, as a result, numerous time-varying (random) speckle-noise patterns are produced and detected over the photo-integration time period of the image detection array (in the IFD subsystem), thereby allowing these speckle-noise patterns to be temporally averaged and/or spatially averaged and the observable speckle-noise pattern reduced. This method can be practiced with any of the PLIM-based systems of the present invention disclosed herein, as well as any system constructed in accordance with the general principles of the present invention.

Figures 1, 18B:
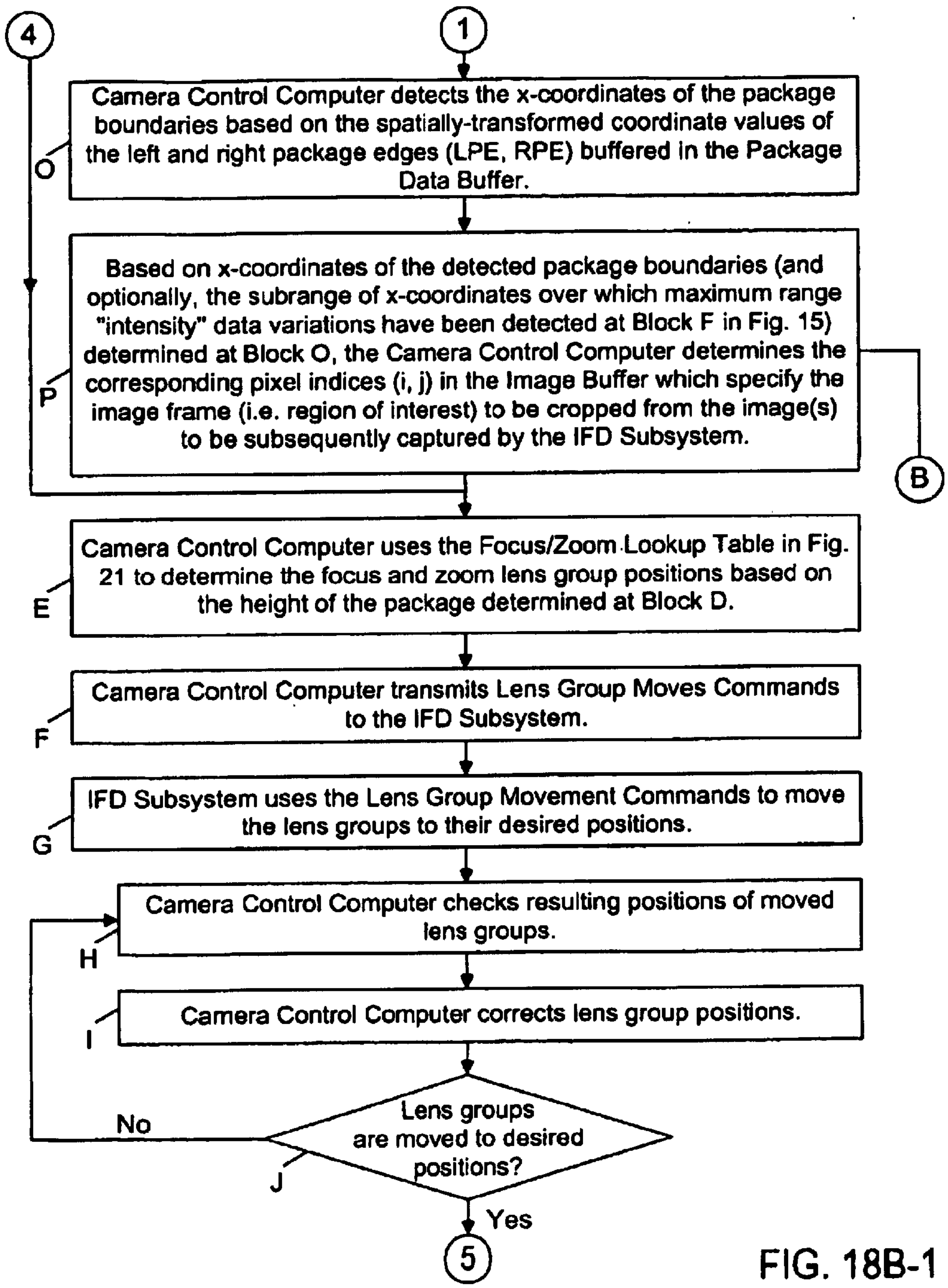
Figures 2, 18B:
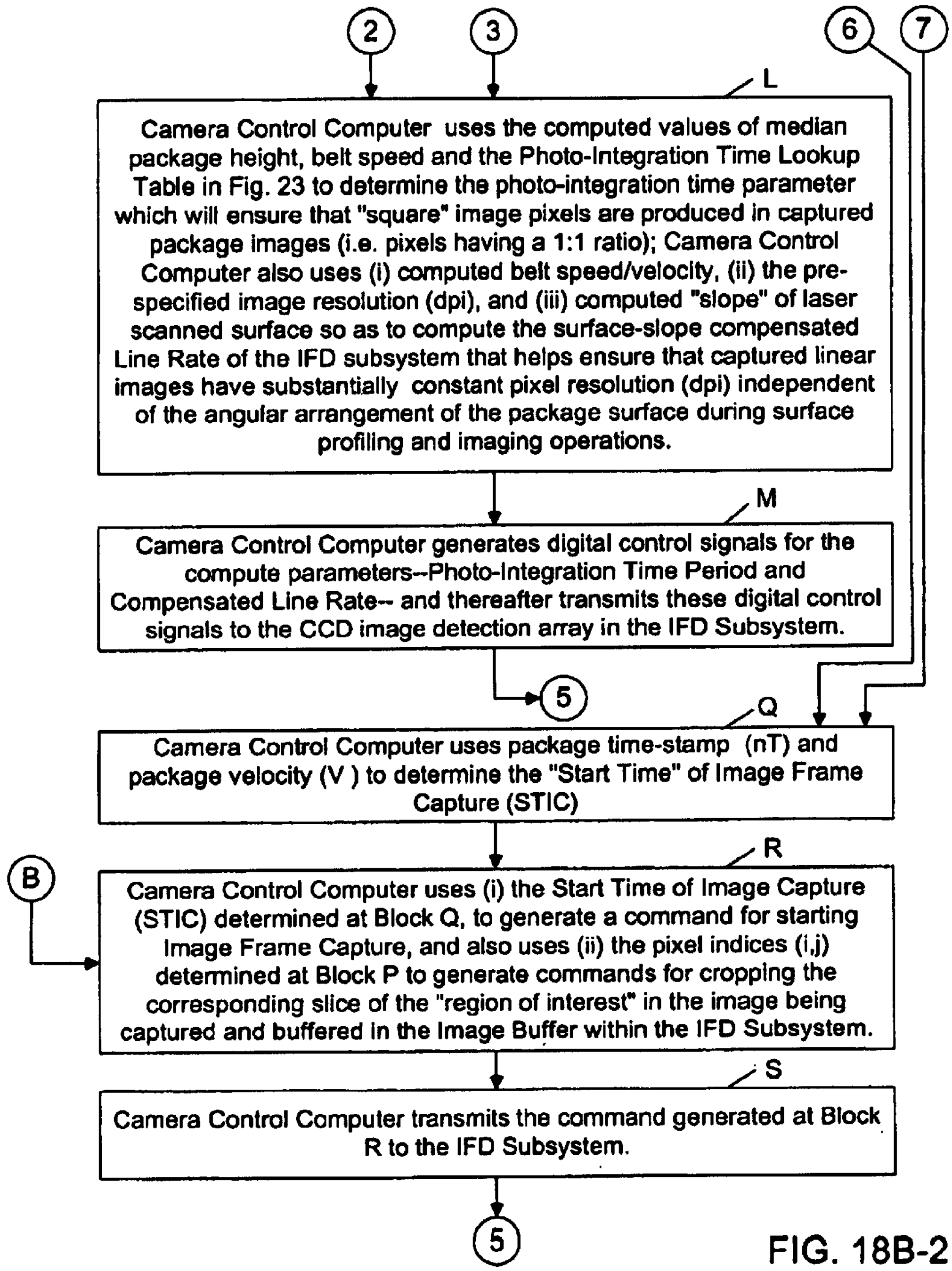

As illustrated at Block A in FIG. 1I18B, the first step of the fourth generalized method shown in FIGS. 1I18 through 1I18A involves modulating the temporal frequency of the transmitted PLIB along the entire extent thereof according to a (random or periodic) temporal frequency modulation function (TFMF) prior to illumination of the target object with the PLIB, so as to produce numerous substantially different time-varying speckle-noise pattern at the image detection array of the IFD Subsystem during the photo-integration time period thereof. As indicated at Block B in FIG. 1I18B, the second step of the method involves temporally and spatially averaging the numerous substantially different speckle-noise patterns produced at the image detection array during the photo-integration time period thereof, thereby reducing the RMS power of speckle-noise patterns observed at the image detection array.

When using the fourth generalized method, the target object is repeatedly illuminated with laser light apparently originating from different moments (i.e. virtual illumination sources) in time over the photo-integration period of each detector element in the linear image detection array of the PLIIM system, during which reflected laser illumination is received at the detector element. As the relative phase delays between these virtual illumination sources are changing over the photo-integration time period of each image detection element, these virtual illumination sources are effectively rendered temporally incoherent with each other. On a time-average basis, these virtual illumination sources produce time-varying speckle-noise patterns which are temporally and spatially averaged during the photo-integration time period of the image detection elements, thereby reducing the RMS power of speckle-noise patterns observed thereat. As speckle-noise patterns are roughly uncorrelated at the image detection array, the reduction in speckle-noise power should be proportional to the square root of the number of independent virtual laser illumination sources contributing to the illumination of the target object and formation of the images frame thereof. As a result of the present invention, image-based bar code symbol decoders and/or OCR processors operating on such digital images can be processed with significant reductions in error.

The fourth generalized method above can be explained in terms of Fourier Transform optics. When temporal intensity modulating the transmitted PLIB by a periodic or random temporal frequency modulation function (TFMF), while satisfying conditions (i) and (ii) above, a temporal frequency modulation process occurs on the temporal domain. This temporal modulation process is equivalent to mathematically multiplying the transmitted PLIB by the temporal frequency modulation function. This multiplication process on the temporal domain is equivalent on the temporal-frequency domain to the convolution of the Fourier Transform of the temporal frequency modulation function with the Fourier Transform of the composite PLIB. On the temporal-frequency domain, this convolution process generates temporally-incoherent (i.e. statistically-uncorrelated or independent) spectral components which are permitted to spatially-overlap at each detection element of the image detection array (i.e. on the spatial domain) and produce time-varying speckle-noise patterns which are temporally and spatially averaged during the photo-integration time period of each detector element, to reduce the speckle-noise pattern observed at the image detection array.

In general, various types of spatial light modulation techniques can be used to carry out the third generalized method including, for example: junction-current control techniques for periodically inducing VLDs into a mode of frequency hopping, using thermal feedback; and multi-mode visible laser diodes (VLDs) operated just above their lasing threshold. Several of these temporal frequency modulation mechanisms will be described in detail below.

Electro-Optical Apparatus of the Present Invention for Temporal Frequency Modulating the Planar Laser Illumination Beam (PLIB) Prior to Target Object Illumination Employing Drive-Current Modulated Visible Laser Diodes (VLDs)

In FIGS. 1I19A and 1I19B, there is shown an optical assembly 450 for use in any PLIIM-based system of the present invention. As shown, the optical assembly 450 comprises a stationary cylindrical lens array 451 (e.g. operating according to refractive, diffractive and/or reflective principles), supported in a frame 452 and mounted in front of a PLIA 6A, 6B embodying a plurality of drive-current modulated visible laser diodes (VLDs) 13. In accordance with the second generalized method of the present invention, each VLD 13 is driven in a non-linear manner by an electrical time-varying current produced by a high-speed VLD drive current modulation circuit 454. In the illustrative embodiment, the VLD drive current modulation circuit 454 is supplied with DC power from a DC power source 403 and operated under the control of camera control computer 22. The VLD drive current supplied to each VLD effectively modulates the amplitude of the output laser beam 456. Preferably, the depth of amplitude modulation (AM) of each output laser beam will be close to 100% in order to increase the magnitude of the higher order spectral harmonics generated during the AM process. As mentioned above, increasing the rate of change of the amplitude modulation of the laser beam will result in higher order optical components in the composite PLIB.

In alternative embodiments, the high-speed VLD drive current modulation circuit 454 can be operated (under the control of camera control computer 22 or other programmed microprocessor) so that the VLD drive currents generated by VLD drive current modulation circuit 454 periodically induce "spectral mode-hopping" within each VLD numerous time during each photo-integration time interval of the PLIIM-based system. This will cause each VLD to generate multiple spectral components within each photo-integration time period of the image detection array.

Optionally, the optical assembly 450 may further comprise a VLD temperature controller 456, operably connected to the camera controller 22, and a plurality of temperature control elements 457 mounted to each VLD. The function of the temperature controller 456 is to control the junction temperature of each VLD. The camera control computer 22 can be programmed to control both VLD junction temperature and junction current so that each VLD is induced into modes of spectral hopping for a maximal percentage of time during the photo-integration time period of the image detector. The result of such spectral mode hopping is to cause temporal frequency modulation of the transmitted PLIB 458, thereby enabling the generation of numerous time-varying speckle-noise patterns at the image detection array, and the temporal and spatial averaging of these patterns during the photo-integration time period of the array to reduce the RMS power of speckle-noise patterns observed at the image detection array.

Notably, in some embodiments, it may be preferred that the cylindrical lens array 451 be realized using light diffractive optical materials so that each spectral component within the transmitted PLIB will be diffracted at slightly different angles dependent on its optical wavelength, causing the PLIB to undergo micro-movement during target illumination operations. In some applications, such as the one shown in FIGS. 1I25M1 and 1I25M2, such wavelength dependent movement can be used to modulate the spatial phase of the PLIB wavefront along directions either within the plane of the PLIB or orthogonal thereto, depending on how the diffractive-type cylindrical lens array is designed. In such applications, both temporal frequency modulation and spatial phase modulation of the PLIB wavefront would occur, thereby creating a hybrid-type despeckling scheme.

Electro-Optical Apparatus of the Present Invention for Temporal Frequency Modulating the Planar Laser Illumination Beam (PLIB) Prior to Target Object Illumination Employing Multi Mode Visible Laser Diodes (VLDs) Operated Just Above Their Lasing Threshold In FIG. 1I19C, there is shown an optical assembly 450 for use in any PLIIM-based system of the present invention. As shown, the optical assembly 450 comprises a stationary cylindrical lens array 451 (e.g. operating according to refractive, diffractive and/or reflective principles), supported in a frame 452 and mounted in front of a PLIA 6A, 6B embodying a plurality of "multi-mode" type visible laser diodes (VLDs) operated just above their lasing threshold so that each multi-mode VLD produces a temporal coherence-reduced laser beam. The result of producing temporal coherence-reduced PLIBs from each PLIA using this method is that numerous time-varying speckle-noise patterns are produced at the image detection array during target illumination operations. Therefore these speckle-patterns are temporally and spatially averaged at the image detection array during the photo-integration time period thereof, thereby reducing the RMS power of observed speckle-noise patterns.

Fifth Generalized Method of Speckle-Noise Pattern Reduction and Particular Forms of Apparatus Therefor Based on Reducing the Spatial Coherence of the Planar Laser Illumination Beam (PLIB) Before it Illuminates the Target Object by Applying Spatial Intensity Modulation Techniques During the Transmission of the PLIB Towards the Target Referring to FIGS. 1I20 through 1I21D, the fifth generalized method of speckle-noise pattern reduction and particular forms of apparatus therefor will be described. This generalized method is based on the principle of modulating the spatial intensity of the wavefront of the "transmitted" planar laser illumination beam (PLIB) prior to illuminating a target object (e.g. package) therewith so that the object is illuminated with a spatially coherent-reduced planar laser beam. As a result, numerous substantially different time-varying speckle-noise patterns are produced and detected over the photo-integration time period of the image detection array (in the IFD subsystem). These speckle-noise patterns are temporally averaged and possibly spatially averaged over the photo-integration time period and the RMS power of observable speckle-noise pattern reduced. This method can be practiced with any of the PLIM-based systems of the present invention disclosed herein, as well as any system constructed in accordance with the general principles of the present invention.

As illustrated at Block A in FIG. 1I20B, the first step of the fifth generalized method shown in FIGS. 1I20 and 1I20A involves modulating the spatial intensity of the transmitted planar laser illumination beam (PLIB) along the planar extent thereof according to a (random or periodic) spatial intensity modulation function (SIMF) prior to illumination of the target object with the PLIB, so as to produce numerous substantially different time-varying speckle-noise pattern at the image detection array of the IFD Subsystem during the photo-integration time period thereof. As indicated at Block B in FIG. 1I20B, the second step of the method involves temporally and spatially averaging the numerous substantially different speckle-noise patterns produced at the image detection array in the IFD Subsystem during the photo-integration time period thereof.

When using the fifth generalized method, the target object is repeatedly illuminated with laser light apparently originating from different points (i.e. virtual illumination sources) in space over the photo-integration period of each detector element in the linear image detection array of the PLIIM system, during which reflected laser illumination is received at the detector element. As the relative phase delays between these virtual illumination sources are changing over the photo-integration time period of each image detection element, these virtual illumination sources are effectively rendered spatially incoherent with each other. On a time-average basis, these virtual illumination sources produce time-varying speckle-noise patterns which are temporally (and possibly spatially) averaged during the photo-integration time period of the image detection elements, thereby reducing the RMS power of the speckle-noise pattern (i.e. level) observed thereat. As speckle noise patterns are roughly uncorrelated at the image detection array, the reduction in speckle-noise power should be proportional to the square root of the number of independent virtual laser illumination sources contributing to the illumination of the target object and formation of the image frame thereof. As a result of the present invention, image-based bar code symbol decoders and/or OCR processors operating on such digital images can be processed with significant reductions in error.

The fifth generalized method above can be explained in terms of Fourier Transform optics. When spatial intensity modulating the transmitted PLIB by a periodic or random spatial intensity modulation function (SIMF), while satisfying conditions (i) and (ii) above, a spatial intensity modulation process occurs on the spatial domain. This spatial intensity modulation process is equivalent to mathematically multiplying the transmitted PLIB by the spatial intensity modulation function. This multiplication process on the spatial domain is equivalent on the spatial-frequency domain to the convolution of the Fourier Transform of the spatial intensity modulation function with the Fourier Transform of the transmitted PLIB. On the spatial-frequency domain, this convolution process generates spatially-incoherent (i.e. statistically-uncorrelated) spectral components which are permitted to spatially-overlap at each detection element of the image detection array (i.e. on the spatial domain) and produce time-varying speckle-noise patterns which are temporally (and possibly) spatially averaged during the photo-integration time period of each detector element, to reduce the RMS power of the speckle-noise pattern observed at the image detection array.

In general, various types of spatial intensity modulation techniques can be used to carry out the fifth generalized method including, for example: a pair of comb-like spatial intensity modulating filter arrays reciprocated relative to each other at a high-speeds; rotating spatial filtering discs having multiple sectors with transmission apertures of varying dimensions and different light transmittivity to spatial intensity modulate the transmitted PLIB along its wavefront; a high-speed LCD-type spatial intensity modulation panel; and other spatial intensity modulation devices capable of modulating the spatial intensity along the planar extent of the PLIB wavefront. Several of these spatial light intensity modulation mechanisms will be described in detail below.

Apparatus of the Present Invention for Micro-Oscillating a Pair of Spatial Intensity Modulation (SIM) Panels with Respect to the Cylindrical Lens Arrays so as to Spatial Intensity Modulate the Wavefront of the Planar Laser Illumination Beam (PLIB) Prior to Target Object Illumination In FIGS. 1I21 through 1I21D, there is shown an optical assembly 730 for use in any PLIIM-based system of the present invention. As shown, the optical assembly 730 comprises a PLIA 6A with a pair of spatial intensity modulation (SIM) panels 731A and 731B, and an electronically-controlled mechanism 732 for micro-oscillating SIM panels 731A and 731B, behind a cylindrical lens array 733 mounted within a support frame 734 with the SIM panels. Each SIM panel comprises an array of light intensity modifying elements 735, each having a different light transmittivity value (e.g. measured against a grey-scale) to impart a different degree of intensity modulation along the wavefront of the composite PLIB 738 transmitted through the SIM panels. The width dimensions of each SIM element 735, and their spatial periodicity, may be determined by the spatial intensity modulation requirements of the application at hand. In some embodiments, the width of each SIM element 735 may be random or aperiodically arranged along the linear extent of each SIM panel. In other embodiments, the width of the SIM elements may be similar and periodically arranged along each SIM panel. As shown in FIG. 1I19C, support frame 734 has a light transmission window 740, and mounts the SIM panels 731A and 731B in a relative reciprocating manner, behind the cylindrical lens array 733, and two pairs of ultrasonic (or other motion) transducers 736A, 736B, and 737A, 737B arranged (90 degrees out of phase) in a push-pull configuration, as shown in FIG. 1I21D.

In accordance with the fifth generalized method, the SIM panels 731A and 731B are micro-oscillated, relative to each other (out of phase by 90 degrees) using motion transducers 736A, 736B, and 737A, 737B. During operation of the mechanism, the individual beam components within the composite PLIB 738 are transmitted through the reciprocating SIM panels 731A and 731B, and micro-oscillated (i.e. moved) along the planar extent thereof by an amount of distance $\Delta x$ or greater at a velocity v(t) which causes the spatial intensity along the wavefronts of the transmitted PLIB 739 to be modulated. The cylindrical lens array 733 optically combines numerous phase modulated PLIB components and projects them onto the same points on the surface of the target object to be illuminated. This coherence-reduced illumination process causes numerous substantially different time-varying speckle-noise patterns to be generated at the image detection array of the PLIIM-based during the photo-integration time period thereof. The time-varying speckle-noise patterns produced at the image detection array are temporally and spatially averaged during the photo-integration time period thereof, thereby reducing the RMS power of speckle-noise patterns observed at the image detection array.

In the case of optical system of FIG. 1I21A, the following parameters will influence the number of substantially different time-varying speckle-noise patterns generated at the image detection array during each photo-integration time period thereof: (i) the spatial frequency and light transmittance values of the SIM panels 731A, 731B; (ii) the length of the cylindrical lens array 733 and the SIM panels; (iii) the relative velocities thereof; and (iv) the number of real laser illumination sources employed in each planar laser illumination array in the PLIIM-based system. In general, if a system requires an increase in reduction in speckle-noise at the image detection array, then the system must generate more uncorrelated time-varying speckle-noise patterns for averaging over each photo-integration time period of the image detection array employed in the system. Parameters (1) through (iii) will factor into the specification of the spatial intensity modulation function (SIMF) of this speckle-noise reduction subsystem design. In general, if the system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I21A, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial intensity modulated PLIB, and (ii) the photo-integration time period of the image detection array of the PLIIM-based system.

Sixth Generalized Method of Speckle-Noise Pattern Reduction and Particular Forms of Apparatus Therefor Based on Reducing the Spatial-Coherence of the Planar Laser Illumination Beam (PLIB) After it Illuminates the Target by Applying Spatial Intensity Modulation Techniques During the Detection of the Reflected/Scattered PLIB Referring to FIGS. 1I22 through 1I23B, the sixth generalized method of speckle-noise pattern reduction and particular forms of apparatus therefor will be described. This generalized method is based on the principle of spatial-intensity modulating the composite-type "return" PLIB produced when the transmitted PLIB illuminates and reflects and/or scatters off the target object. The return PLIB constitutes a spatially coherent-reduced laser beam and, as a result, numerous time-varying speckle-noise patterns are detected over the photo-integration time period of the image detection array in the IFD subsystem. These time-varying speckle-noise patterns are temporally and/or spatially averaged and the RMS power of observable speckle-noise patterns significantly reduced. This method can be practiced with any of the PLIM-based systems of the present invention disclosed herein, as well as any system constructed in accordance with the general principles of the present invention.

As illustrated at Block A in FIG. 1I23B, the first step of the sixth generalized method shown in FIGS. 1I22 through 1I23A involves spatially modulating the received PLIB along the planar extent thereof according to a (random or periodic) spatial-intensity modulation function (SIMF) after illuminating the target object with the PLIB, so as to produce numerous substantially different time-varying speckle-noise patterns during each photo-integration time period of the image detection array of the PLIIM-based system. As indicated at Block B in FIG. 1I22B, the second step of the method involves temporally and spatially averaging these time-varying speckle-noise patterns during the photo-integration time period of the image detection array, thus reducing the RMS power of speckle-noise patterns observed at the image detection array.

When using the sixth generalized method, the image detection array in the PLIIM-based system repeatedly detects laser light apparently originating from different points in space (i.e. from different virtual illumination sources) over the photo-integration period of each detector element in the image detection array. As the relative phase delays between these virtual illumination sources are changing over the photo-integration time period of each image detection element, these virtual illumination sources are effectively rendered spatially incoherent (or spatially coherent-reduced) with respect to each other. On a time-average basis, these virtual illumination sources produce time-varying speckle-noise patterns which are temporally and spatially averaged during the photo-integration time period of the image detection array, thereby reducing the RMS power of speckle-noise patterns observed thereat. As speckle noise patterns are roughly uncorrelated at the image detector, the reduction in speckle-noise power should be proportional to the square root of the number of independent real and virtual laser illumination sources contributing to formation of the image frames of the target object. As a result of the present invention, image-based bar code symbol decoders and/or OCR processors operating on such digital images can be processed with significant reductions in error.

The sixth generalized method above can be explained in terms of Fourier Transform optics. When spatially modulating a return PLIB by a periodic or random spatial modulation (i.e. windowing) function, while satisfying conditions (i) and (ii) above, a spatial intensity modulation process occurs on the spatial domain. This spatial intensity modulation process is equivalent to mathematically multiplying the composite return PLIB by the spatial intensity modulation function (SIMF). This multiplication process on the spatial domain is equivalent on the spatial-frequency domain to the convolution of the Fourier Transform of the spatial intensity modulation function with the Fourier Transform of the return PLIB. On the spatial-frequency domain, this equivalent convolution process generates spatially-incoherent (i.e. statistically-uncorrelated) spectral components which are permitted to spatially-overlap at each detection element of the image detection array (i.e. on the spatial domain) and produce time-varying speckle-noise patterns which are temporally and spatially averaged during the photo-integration time period of each detector element, to reduce the RMS power of speckle-noise patterns observed at the image detection array.

In general, various types of spatial intensity modulation techniques can be used to carry out the sixth generalized method including, for example: high-speed electro-optical (e.g. ferro-electric, LCD, etc.) dynamic spatial filters, located before the image detector along the optical axis of the camera subsystem; physically rotating spatial filters, and any other spatial intensity modulation element arranged before the image detector along the optical axis of the camera subsystem, through which the received PLIB beam may pass during illumination and image detection operations for spatial intensity modulation without causing optical image distortion at the image detection array. Several of these spatial intensity modulation mechanisms will be described in detail below.

Apparatus of the Present Invention for Spatial-Intensity Modulating the Return Planar Laser Illumination Beam (PLIB) Prior to Detection at the Image Detector In FIG. 1I22A, there is shown an optical assembly 460 for use at the IFD Subsystem in any PLIIM-based system of the present invention. As shown, the optical assembly 460 comprises an electro-optical mechanism 460 mounted before the pupil of the IFD Subsystem for the purpose of generating a rotating a spatial intensity modulation structure (e.g. maltese-cross aperture) 461. The return PLIB 462 is spatial intensity modulated at the IFD subsystem in accordance with the principles of the present invention, with introducing significant image distortion at the image detection array. The electro-optical mechanism 460 can be realized using a high-speed liquid crystal (LC) spatial intensity modulation panel 463 which is driven by a LCD driver circuit 464 so as to realize a maltese-cross aperture (or other spatial intensity modulation structure) before the camera pupil that rotates about the optical axis of the IFD subsystem during object illumination and imaging operations. In the illustrative embodiment, the maltese-cross aperture pattern has 100% transmittivity, against an optically opaque background. Preferably, the physical dimensions and angular velocity of the maltese-cross aperture 461 will be sufficient to achieve a spatial intensity modulation function (SIMF) suitable for speckle-noise pattern reduction in accordance with the principles of the present invention.

In FIG. 1I22B, there is shown a second optical assembly 470 for use at the IFD Subsystem in any PLIIM-based system of the present invention. As shown, the optical assembly 470 comprises an electro-mechanical mechanism 471 mounted before the pupil of the IFD Subsystem for the purpose of generating a rotating maltese-cross aperture 472, so that the return PLIB 473 is spatial intensity modulated at the IFD subsystem in accordance with the principles of the present invention. The electromechanical mechanism 471 can be realized using a high-speed electric motor 474, with appropriate gearing 475, and a rotatable maltese-cross aperture stop 476 mounted within a support mount 477. In the illustrative embodiment, the maltese-cross aperture pattern has 100% transmittivity, against an optically opaque background. As a motor drive circuit 478 supplies electrical power to the electrical motor 474, the motor shaft rotates, turning the gearing 475, and thus the maltese-cross aperture stop 476 about the optical axis of the IFD subsystem. Preferably, the maltese-cross aperture 476 will be driven to an angular velocity which is sufficient to achieve the spatial intensity modulation function required for speckle-noise pattern reduction in accordance with the principles of the present invention.

In the case of the optical systems of FIGS. 1I23A and 1I23B, the following parameters will influence the number of substantially different time-varying speckle-noise patterns generated at the image detection array during each photo-integration time period thereof: (i) the spatial dimensions and relative physical position of the apertures used to form the spatial intensity modulation structure 461, 472; (ii) the angular velocity of the apertures in the rotating structures; and (iii) the number of real laser illumination sources employed in each planar laser illumination array in the PLIIM-based system. Parameters (i) through (ii) will factor into the specification of the spatial intensity modulation function (SIMF) of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the systems of FIGS. 1I23A and 1I23B, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the spatial gradient of the spatial intensity modulated PLIB, and (ii) the photo-integration time period of the image detection array of the PLIIM-based system.

Seventh Generalized Method of Speckle-Noise Pattern Reduction and Particular Forms of Apparatus Therefor Based on Reducing the Temporal Coherence of the Planar Laser Illumination Beam (PLIB) After it Illuminates the Target by Applying Temporal Intensity Modulation Techniques During the Detection of the Reflected/Scattered PLIB Referring to 1I24 through 1I24C, the seventh generalized method of speckle-noise pattern reduction and particular forms of apparatus therefor will be described. This generalized method is based on the principle of temporal intensity modulating the composite-type "return" PLIB produced when the transmitted PLIB illuminates and reflects and/or scatters off the target object. The return PLIB constitutes a temporally coherent-reduced laser beam. As a result, numerous time-varying (random) speckle-noise patterns are produced and detected over the photo-integration time period of the image detection array (in the IFD subsystem). These time-varying speckle-noise patterns are temporally and/or spatially averaged and the observable speckle-noise patterns significantly reduced. This method can be practiced with any of the PLIM-based systems of the present invention disclosed herein, as well as any system constructed in accordance with the general principles of the present invention.

As illustrated at Block A in FIG. 1I24B, the first step of the seventh generalized method shown in FIGS. 1I24 and 1I24A involves modulating the temporal phase of the received PLIB along the planar extent thereof according to a (random or periodic) temporal intensity modulation function (TIMF) after illuminating the target object with the PLIB, so as to produce numerous substantially different time-varying speckle-noise patterns during each photo-integration time period of the image detection array of the PLIIM-based system. As indicated at Block B in FIG. 1I24B, the second step of the method involves temporally and spatially averaging these time-varying speckle-noise patterns during the photo-integration time period of the image detection array, thus reducing the RMS power of speckle-noise patterns observed at the image detection array.

When using the seventh generalized method, the image detector of the IFD subsystem repeatedly detects laser light apparently originating from different moments in space (i.e. virtual illumination sources) over the photo-integration period of each detector element in the image detection array of the PLIIM system. As the relative phase delays between these virtual illumination sources are changing over the photo-integration time period of each image detection element, these virtual illumination sources are effectively rendered temporally incoherent with each other. On a time-average basis, these virtual illumination sources produce time-varying speckle-noise patterns which can be temporally and spatially averaged during the photo-integration time period of the image detection elements, thereby reducing the speckle-noise pattern (i.e. level) observed thereat. As speckle noise patterns are roughly uncorrelated at the image detector, the reduction in speckle-noise power should be proportional to the square root of the number of independent real and virtual laser illumination sources contributing to formation of the image frames of the target object. As a result of the present invention, image-based bar code symbol decoders and/or OCR processors operating on such digital images can be processed with significant reductions in error.

In general, various types of temporal intensity modulation techniques can be used to carry out the method including, for example: high-speed temporal intensity modulators such as electro-optical shutters, pupils, and stops, located along the optical path of the composite return PLIB focused by the IFD subsystem; etc.

Electro-Optical Apparatus of the Present Invention for Temporal Intensity Modulating the Planar Laser Illumination Beam (PLIB) Prior to Detecting Images by Employing High-Speed Light Gating/Switching Principles In FIG. 1I24C, there is shown an optical assembly 480 for use in any PLIIM-based system of the present invention. As shown, the optical assembly 480 comprises a high-speed electro-optical temporal intensity modulation panel (e.g. high-speed electro-optical gating/switching panel) 481, mounted along the optical axis of the IFD Subsystem, before the imaging optics thereof. A suitable high-speed temporal intensity modulation panel 481 for use in carrying out this particular embodiment of the present invention might be made using liquid crystal, ferro-electric or other high-speed light control technology. During operation, the received PLIB is temporal intensity modulated as it is transmitted through the temporal intensity modulation panel 481. During temporal intensity modulation process at the IFD subsystem, numerous substantially different time-varying speckle-noise patterns are produced. These speckle-noise patterns are temporally and spatially averaged at the image detection array 3A during each photo-integration time period thereof, thereby reducing the RMS power of speckle-noise patterns observed at the image detection array.

The time characteristics of the temporal intensity modulation function (TIMF) created by the temporal intensity modulation panel 481 will be selected in accordance with the principles of the present invention. Preferably, the time duration of the light transmission window of the TIMF will be relatively short, and repeated at a relatively high rate with respect to the inverse of the photo-integration time period of the image detector so that many spectral-harmonics will be generated during each such time period, thus producing many time-varying speckle-noise patterns at the image detection array. Thus, if a particular imaging application at hand requites a very short photo-integration time period, then it is understood that the rate of repetition of the light transmission window of the TIMP (and thus the rate of switching/gating electro-optical panel 481) will necessarily become higher in order to generate sufficiently weighted spectral components on the time-frequency domain required to reduce the temporal coherence of the received PLIB falling incident at the image detection array.

In the case of the optical system of FIG. 1I24C, the following parameters will influence the number of substantially different time-varying speckle-noise patterns generated at the image detection array during each photo-integration time period thereof: (i) the time duration of the light transmission window of the TIMF realized by temporal intensity modulation panel 481; (ii) the rate of repetition of the light duration window of the TIMF; and (iii) the number of real laser illumination sources employed in each planar laser illumination array in the PLIIM-based system. Parameters (i) through (ii) will factor into the specification of the TIMF of this speckle-noise reduction subsystem design. In general, if the PLIIM-based system requires an increase in reduction in the RMS power of speckle-noise at its image detection array, then the system must generate more uncorrelated time-varying speckle-noise patterns for averaging over each photo-integration time period thereof. Adjustment of the above-described parameters should enable the designer to achieve the degree of speckle-noise power reduction desired in the application at hand.

For a desired reduction in speckle-noise pattern power in the system of FIG. 1I24C, the number of substantially different time-varying speckle-noise pattern samples which need to be generated per each photo-integration time interval of the image detection array can be experimentally determined without undue experimentation. However, for a particular degree of speckle-noise power reduction, it is expected that the lower threshold for this sample number at the image detection array can be expressed mathematically in terms of (i) the time derivative of the temporal phase modulated PLIB, and (ii) the photo-integration time period of the image detection array of the PLIIM-based system.

While the speckle-noise pattern reduction (i.e. despeckling) techniques described above have been described in conjunction with the system of FIG. 1A for purposes of illustration, it is understood that that any of these techniques can be used in conjunction with any of the PLIIM-based systems of the present invention, and are hereby embodied therein by reference thereto as if fully explained in conjunction with its structure, function and operation.

Eighth Generalized Method of Speckle-Noise Pattern Reduction and Particular Forms of Apparatus Therefor Applied at the Image Formation and Detection Subsystem of a Hand-Held (Linear or Area Type) PLIIM-Based Imager of the Present Invention, Based on Temporally Averaging Many Speckle-Pattern Noise Containing Images Captured Over Numerous Photo-Integration Time Periods Referring to FIGS. 1I24D through 1I24H, the eighth generalized method of speckle-noise pattern reduction and particular forms of apparatus therefor will be described. This generalized method is illustrated in the flow chart of FIG. 1I24D. As shown in the flow chart of FIG. 1I24D, the method involves performing the following steps: at Block A, consecutively capturing and buffering a series of digital images of an object, containing speckle-pattern noise, over a series of consecutively different photo-integration time periods; at Block B, storing these digital images in buffer memory; and at Block C, additively combining and averaging spatially corresponding pixel data subsets defined over a small window in the captured digital images so as to produce spatially corresponding pixels data subsets in a reconstructed image of the object, containing speckle-pattern noise having a substantially reduced level of RMS power. This method can be practiced with any PLIIM-based system of the present invention including, for example, any of the hand-held (linear or area type) PLIIM-based imagers shown in FIGS. 1V4, 2H, 2I5, 3I, 3J5, and 4E, as well as with conveyor, presentation, and other stationary-type PLIIM-based imagers. For purposes of illustration, this generalized method will be described in connection with a hand-held linear-type imager and also hand-held area-type imager of the present invention.

Speckle-Pattern Noise Reduction Method of FIG. 1I24D, Carried Out Within a Hand-Held Linear-Type PLIIM-Based Imager of the Present Invention As illustrated at in FIG. 1I24E the first step in the eighth generalized method involves sweeping a hand-held linear-type PLIIM-based imager over an object (e.g. 2-D bar code or other graphical indicia) to produce a series of consecutively captured digital 1-D (i.e. linear) images of an object over a series of photo-integration time periods of the PLIIM-Based Imager. Notably, each digital linear image of the object includes a substantially different speckle-noise pattern which is produced by natural oscillatory micro-motion of the human hand relative to the object during manual sweeping operations of the hand-held imager, and/or the forced oscillatory micro-movement of the hand-held imager relative to the object during manual sweeping operations of the hand-held imager. Once captured, these digital images are stored in buffer memory within the hand-held linear imager.

Natural oscillatory micro-motion of the human hand relative to the object during manual sweeping operations of the hand-held imager will produce slight motion to the imager relative to the object. For example, when using a PLIIM-based imager having a linear image detector with 14 micron wide pixels, an angular movement of the hand-supported housing by an amount of 0.5 millirad will cause the image of the object to shift by approximately one pixel, although it is understood that this amount of shift may vary depending on the object distance. Similarly, displacement of the hand-held imager by 14 microns will cause the image of the object to shift by one pixel as well. By virtue of these small shifts at the image plane, an entirely different speckle pattern will be induced in each digital image. Therefore, even though the consecutively captured images will be equally noisy in terms of speckle, the noise that is produced will originate from speckle patterns that are statistically independent from one another.

Notably, forced oscillatory micro-movement of the hand-held imager shown in FIG. 124IE can also be used to produce are statistically independent speckle-noise patterns in consecutively generated images. Such forced oscillatory micro-movement can be achieved by providing within the housing of the hand-held imager, an electromechanical mechanism which is designed to cause the optical bench of the PLIIM-based engine therein to micro-oscillate in both x and y directions during imaging operations. The mechanism should be engineered so that the amplitude of such micro-oscillations cause each captured image to shift by one or more pixels, and the small shifts produced at the image plane induce an entirely different speckle pattern in each captured image.

As illustrated at FIG. 1I24F, the third step in the eighth generalized method involves using a relatively small (e.g. 3×3) windowed image processing filter to additively combine and average the pixel data in the series of consecutively captured digital linear images so as to produce a reconstructed digital linear image having a speckle noise pattern with reduced RMS power. As an alternative to the use of standard averaging techniques described above, one may use other pixel data filtering techniques based possibility on reiterative principles to generate the pixel data constituting the reconstructed digital linear image with reduced speckle-pattern noise power. Such pixel data filtering, techniques may be derived from or carried out using software-based speckle-noise reduction tools employed in conventional synthetic aperture radar (SAR) and ultrasonic image processing systems described, for example, in Chapter 6 of "Understanding Synthetic Aperture Radar Images," by Chris Oliver and Shaun Quegan, published by Artech House Publishers, ISBN 0-89006-850-X, incorporated herein by reference.

Speckle-Pattern Noise Reduction Method of FIG. 1I24D, Carried Out Within a Hand-Held Area-Type PLIIM-Based Imager of the Present Invention As illustrated at in FIG. 1I24G the first step in the eighth generalized method involves sweeping a hand-held area (2-D) type PLIIM-based imager over an object (e.g. 2-D bar code or other graphical indicia) to produce a series of consecutively captured digital 2-D images of an object over a series of photo-integration time periods of the PLIIM-Based Imager. Notably, each digital 2-D image of the object includes a substantially different speckle-noise pattern which is produced by natural oscillatory micro-motion of the human hand relative to the object during manual sweeping operations of the hand-held imager, and/or the forced oscillatory micro-movement of the hand-held imager relative to the object during manual sweeping operations of the hand-held imager. Once captured, these digital images are stored in buffer memory within the hand-held linear imager.

Natural oscillatory micro-motion of the human hand relative to the object during manual sweeping operations of the hand-held area imager will produce slight motion to the imager relative to the object, as described above. Also, forced oscillatory micro-movement of the hand-held area imager shown in FIG. 124IG can also be used to produce are statistically independent speckle-noise patterns in consecutively generated images. Such forced oscillatory micro-movement can be achieved by providing within the housing of the hand-held imager, an electromechanical mechanism which is designed to cause the optical bench of the PLIIM-based engine therein to micro-oscillate in both x and y directions during imaging operations. The mechanism should be engineered so that the amplitude of such micro-oscillations cause each captured image to shift by one or more pixels, and the small shifts produced at the image plane induce an entirely different speckle pattern in each captured image.

As illustrated at FIG. 1I24H, the third step in the eighth generalized method involves using a relatively small (e.g. 3×3) windowed image processing filter to additively combine and average the pixel data in the series of consecutively captured digital 2-D images so as to produce a reconstructed digital 2-D image having a speckle noise pattern with reduced RMS power. As an alternative to the use of standard averaging techniques described above, one may use other pixel data filtering techniques based possibility on reiterative principles to generate the pixel data constituting the reconstructed digital 2-D image with reduced speckle-pattern noise power. Such pixel data filtering techniques may be derived from or carried out using software-based speckle-noise reduction tools employed in conventional synthetic aperture radar (SAR) and ultrasonic image processing systems described, for example, in Chapter 6 of "Understanding Synthetic Aperture Radar Images," by Chris Oliver and Shaun Quegan published by Artech House Publishers, ISBN 0-89006-850-X, incorporated herein by reference.

Ninth Generalized Method of Speckle-Noise Pattern Reduction and Particular Forms of Apparatus Therefor Applied at the Image Formation and Detection Subsystem of a Hand-Held Linear-Type PLIIM-Based Imager of the Present Invention, Based on Spatially Averaging Many Speckle-Patter Noise Detected Over Each Photo-Integration Time Period Referring to 1I24I, the ninth generalized speckle-noise pattern reduction method of the present invention will now be described. Notably, this generalized method can be practiced at the camera (i.e. IFD) subsystem of virtually any type PLIIM-based imager of the present invention, but will be as explained in detail hereinafter, is best applied in hand-supportable type PLIIM-based imagers as illustrated, for example, in FIGS. 1V4, 2H, 2I5, 3I, and 3J5 and FIGS. 39A through 51C.

As indicated at Block A in FIG. 1I24I, the first step in the ninth generalized method involves producing, during each photo-integration time period of a PLIIM-Based Imager, numerous substantially different spatially-varying speckle noise pattern elements (i.e. different speckle noise pattern elements located on different points) on each image detection element in the image detection array employed in the PLIIM-based Imager. Then at Block B in FIG. 1I24I, the second step of the method involves spatially (and temporally) averaging the numerous spatially-varying speckle-noise pattern elements over the entire available surface area of each image detection element during the photo-integration time period thereof, thereby reducing the RMS power of speckle-pattern noise observed in said linear PLIIM-based Imager.

This generalized method is based on the principle of producing numerous spatially and temporally varying (random) speckle-noise patterns over each photo-integration time period of the image detection array (in the IFD subsystem), using any of the eight generalized methods described above. Then during each photo-integration time period, these spatially-varying (and temporally varying) speckle-noise patterns are spatially (and temporally) averaged over the surface area of each image detection element in the image detection array so that RMS power of observable speckle-noise patterns is significantly reduced, In general, this method can be used by itself, although it is expected that better results will be obtained when the method is practiced with other generalized methods of the present invention. Below, the theoretical principles underlying this generalized despeckling method will be described below.

In the case where the minimum speckle size is roughly equal to the typical speckle size in a PLIIM-based linear imaging system, the typical speckle size is given by the equation d=(1.22) (λ) (F/# of the IFD module). Based on this assumption, the speckle pattern noise process occurring in a linear-type PLIIM-based systems can be modeled by applying a one-dimensional analysis across the narrow dimension of each image detection element extending along the linear extent of a linear CCD image detection array. Using a simple sinusoidal approximation to the speckle intensity variation, a simple estimate of the Peak Speckle Noise Percentage is given by the equation:

$$N_{Peak\ Speckle} = \frac{d}{\pi H} = \frac{1.22\lambda(F/\#)}{\pi H}$$

where H is the height of each detector element in the linear image detection array employed in the linear PLIIM-based imaging system. Notably, the accuracy of the above equation significantly decreases around or below the operating condition where H/d=1, (i.e. where the size of the speckle noise pattern element is equal to the size of the detector element in the linear image detection array employed in the linear PLIIM-based imaging system). Thus, the above model best holds for the case where the size of each speckle noise pattern element is smaller than the size of each detector element in the linear image detection array.

From the above equation, it is important to note that the Peak Speckle Noise Percentage in a linear PLIIM-based imaging system equation is directly proportional to the F/# of the IFD module (i.e. camera subsystem) and inversely proportional to the height of the detector elements H. Accordingly, it is an object of the present invention to reduce the peak speckle noise percentage (as well as the RMS value thereof) in linear type PLIIM-based imaging systems by (i) reducing the F/# parameter of its IFD module (e.g. by increasing the camera aperture), or (ii) increasing the height H of each detector element in the linear image detection array employed in the PLIIM-based system. The effect of implementing such design criteria in a linear PLIIM-based system is that it will cause more individual speckles to occur on the same image detection element (corresponding to a particular image pixel) during each photo-integration time period of the linear PLIIM-based system, thereby enabling a significantly increased level of spatial averaging to occur in such systems employing image detection arrays having vertically-elongated image detection elements, as shown in FIGS. 39A through 51C and elsewhere throughout the present disclosure. To further appreciate this discovery, several PLIIM-based system designs will be considered below.

For the case of a hand-supportable PLIIM-based linear imager as disclosed in FIGS. 39A through 51C in particular, consider that the F/# is 40 and laser illumination wavelength is 650 nm. In such system designs, the Peak Speckle Noise Percentage is 18% when the height H of the detector elements in the image detection array is 56 um. However, the Peak Speckle Noise Percentage is significantly reduced 5% when the height H of the detector elements in the image detection array is 200 um. While these speckle noise calculation figures have not yet been matched with empirical measurements (and may be difficult to verify due to other factors present), the relative differences in such speckle noise figures should hold.

For the case of an overhead-mounted conveyor belt PLIIM-based linear imager as disclosed in FIGS. 9 through 22B in particular, consider using F/7 and H/d=1.26. In such system designs, the Peak Speckle Noise Percentage is 25% when the height H of the detector elements in the linear image detection array is 7 um. However, to reduce the Peak Speckle Noise Percentage 5% will require that the height H of the detector elements in the linear image detection array be increased to 35 microns, sacrificing a great deal of image resolution in the object-motion direction.

Thus, from this analysis, it appears that the spatial-averaging based despeckling method described above (involving elongation of the detector element height H in the linear image detection array) will be difficult to practice in high-speed overhead conveyor-type imaging applications where image resolution is a key requirement, but easy to practice in hand-supportable linear imaging applications described above.

In summary, when designing and constructing a linear-type PLIIM-based imaging system, the principles of the present invention disclosed herein teach choosing (i) a linear image detection array having the tallest possible image detection elements (i.e. having the greatest possible H value) and (ii) image formation optics in the IFD (i.e. camera) subsystem having the lowest possible F/# that does not go so far as to increase the aberrations of the linear-type PLIIM-based imaging system to a point of diminishing returns by blurring the optical signal received thereby. Such design considerations will help to minimize the RMS power of speckle-pattern noise observable at the image detection array employed in PLIIM-based imaging systems. Notably, one advantage in using this despeckling technique in linear-type PLIIM-based systems is that increasing the height or vertical dimension of the image detection elements in the linear image detection array will not adversely effect the resolution of the PLIIM-based system. In contrast, when applying this despeckling technique in area (i.e. 2-D) type PLIIM-based imaging systems, increasing any one of the image detection element dimensions H and/or W to reduce speckle-pattern noise (through spatial averaging) will reduce the image resolution achievable by the 2-D PLIIM-based imaging system.

In each of the hand-supportable PLIIM-based imaging systems shown in FIGS. 1I25A1 through 1I25N2 and described below, the ninth generalized (spatial-averaging) despeckling technique is applied by employing a linear image detection array with vertically-elongated detection elements having a height dimension H that results in a significant reduction in the speckle noise power. Also, an additional despeckling mechanism is embodied within each such PLIIM-based imaging system as will be described in greater detail below.

PLIIM-Based System With an Integrated Speckle-Pattern Noise Reduction Subsystem, Wherein a Micro-Oscillating Cylindrical Lens Array Micro-Oscillates a Planar Laser Illumination Beam (PLIB Laterally Along its Planar Extent to Produce Spatial-Incoherent PLIB Components and Optically Combines and Projects Said Spatially-Incoherent PLIB Component Onto the Same Points on an Object to be Illuminated, and Wherein a Micro-Oscillating Light Reflecting Structure Micro-Oscillates the PLIB Components Transversely Along the Direction Orthogonal to Said Planar Extent, and a Linear (1D) CCD Image Detection Array with Vertically-Elongated Image Detection Elements Detects Time-Varying Speckle-Noise Patterns Produced by the Spatially Incoherence Components Reflected/Scattered Off the Illuminated Object In FIGS. 1I25A1 and 1I25A2, there is shown a PLIIM-based system of the present invention 860 having an speckle-pattern noise reduction subsystem embodied therewithin, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench on opposite sides of the IFD module 861; and (iii) a 2-D PLIB micro-oscillation mechanism 866 arranged with each PLIM 865A and 865B in an integrated manner.

As shown, the 2-D PLIB micro-oscillation mechanism 866 comprises: a micro-oscillating cylindrical lens array 867 as shown in FIGS. 1I3A through 1I3D, and a micro-oscillating PLIB reflecting mirror 868 configured therewith. As shown in FIG. 1I25A2, each PLIM 865A and 865B is pitched slightly relative to the optical axis of the IFD module 861 so that the PLIB 869 is transmitted perpendicularly through cylindrical lens array 867, whereas the FOV of the image detection array 863 is disposed at a small acute angle so that the PLIB and FOV converge on the micro-oscillating mirror element 868 so that the PLIB and FOV maintain a coplanar relationship as they are jointly micro-oscillated in planar and orthogonal directions during object illumination operations. As shown, these optical components are configured together as an optical assembly for the purpose of micro-oscillating the PLIB 869 laterally along its planar extent as well as transversely along the direction orthogonal thereto, so that during illumination operations, the PLIB 870 is spatial phase modulated along the planar extent thereof as well as along the direction orthogonal thereto. This causes the phase along the wavefront of each transmitted PLIB to be modulated in two orthogonal dimensions and numerous substantially different time-varying speckle-noise patterns to be produced at the vertically-elongated image detection elements 864 during the photo-integration time period thereof. During object illumination operations, these numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated Speckle-Pattern Noise Reduction Subsystem, Wherein a First Micro-Oscillating Light Reflective Element Micro-Oscillates a Planar Laser Illumination Beam (PLIB) Laterally Along its Planar Extent to Produce Spatially Incoherent PLIB Components, a Second Micro-Oscillating Light Reflecting Element Micro-Oscillates the Spatially-Incoherent PLIB Components Transversely Along the Direction Orthogonal to Said Planar Extent, and Wherein a Stationary Cylindrical Lens Array Optically Combines and Projects Said Spatially-Incoherent PLIB Components onto the Same Points on the Surface of an Object to be Illuminated, and a Linear (1D) CCD Image Detection Array with Vertically-Elongated Image Detection Elements Detects Time-Varying Speckle-Noise Patterns Produced by Spatial Incoherent Components Reflected/Scattered Off the Illuminated Object In FIGS. 1I25B1 and 1I25B2, there is shown a PLIIM-based system of the present invention 875 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench 862 on opposite sides of the IFD module; and (iii) a 2-D PLIB micro-oscillation mechanism 876 arranged with each PLIM in an integrated manner.

As shown, the 2-D PLIB micro-oscillation mechanism 876 comprises: a stationary PLIB folding mirror 877, a micro-oscillating PLIB reflecting element 878, and a stationary cylindrical lens array 879 as shown in FIGS. 1I5A through 1I5D. These optical component are configured together as an optical assembly as shown for the purpose of micro-oscillating the PLIB 880 laterally along its planar extent as well as transversely along the direction orthogonal thereto, so that during illumination operations, the PLIB 881 transmitted from each PLIM is spatial phase modulated along the planar extent thereof as well as along the direction orthogonal thereto. This causes the spatial phase along the wavefront of each transmitted PLIB to be modulated in two orthogonal dimensions and numerous substantially different time-varying speckle-noise patterns to be produced at the vertically-elongated image detection elements 864 during the photo-integration time period thereof. During object illumination operations, these numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated Speckle-Pattern Noise Reduction Subsystem, Wherein an Acousto-Optic Bragg Cell Micro-Oscillates a Planar Laser Illumination Beam (PLIB) Laterally Along its Planar Extent to Produce Spatially Incoherent PLIB Components, a Stationary Cylindrical Lens Array Optically Combines and Projects Said Spatially Incoherent PLIB Components onto the Same Points on the Surface on an Object to be Illuminated, and Wherein a Micro-Oscillating Light Reflecting Structure Micro-Oscillates the Spatially Incoherent PLIB Components Transversely Along the Direction Orthogonal to Said Planar Extent, and a Linear (1D) CCD Image Detection Array with Vertically-Elongated Image Detection Elements Detects Time-Varying Speckle-Noise Patterns Produced by Spatially Incoherent PLIB Components Reflected/Scattered Off the Illuminated Object In FIGS. 1I25C1 and 1I25C2, there is shown a PLIIM-based system of the present invention 885 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench on opposite sides of the IFD module; and (iii) a 2-D PLIB micro-oscillation mechanism 886 arranged with each PLIM in an integrated manner.

As shown, the 2-D PLIB micro-oscillation mechanism 886 comprises: an acousto-optic Bragg cell panel 887 micro-oscillates a planar laser illumination beam (PLIB) 888 laterally along its planar extent to produce spatially incoherent PLIB components, as shown in FIGS. 1I6A through 1I6B; a stationary cylindrical lens array 889 optically combines and projects said spatially incoherent PLIB components onto the same points on the surface of an object to be illuminated; and a micro-oscillating PLIB reflecting element 890 for micro-oscillating the PLIB components in a direction orthogonal to the planar extent of the PLIB. As shown in FIG. 1I25C2, each PLIM 865A and 865B is pitched slightly relative to the optical axis of the IFD module 861 so that the PLIB 888 is transmitted perpendicularly through the Bragg cell panel 887 and the cylindrical lens array 889, whereas the FOV of the image detection array 863 is disposed at a small acute angle, relative to PLIB 888, so that the PLIB and FOV converge on the micro-oscillating mirror element 890. The PLIB and FOV maintain a coplanar relationship as they are jointly micro-oscillated in planar and orthogonal directions during object illumination operations. These optical elements are configured together as shown as an optical assembly for the purpose of micro-oscillating the PLIB laterally along its planar extent as well as transversely along the direction orthogonal thereto, so that during illumination operations, the PLIB transmitted from each PLIM is spatial phase modulated along the planar extent thereof as well as along the direction orthogonal (i.e. transverse) thereto. This causes the phase along the wavefront of each transmitted PLIB to be modulated in two orthogonal dimensions and numerous substantially different time-varying speckle-noise patterns to be produced at the vertically-elongated image detection elements 864 during the photo-integration time period thereof. During target illumination operations, these numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated Speckle-Pattern Noise Reduction Subsystem, Wherein a High-Resolution Deformable Mirror (DM) Structure Micro-Oscillates a Planar Laser Illumination Beam (PLIB) Laterally Along its Planar Extent to Produce Spatially Incoherent PLIB Components, a Micro-Oscillating Light Reflecting Element Micro-Oscillates the Spatially Incoherent PLIB Components Transversely Along the Direction Orthogonal to Said Planar Extent, and Wherein a Stationary Cylindrical Lens Array Optically Combines and Projects the Spatially Incoherent PLIB Components onto the Same Points on the Surface of an Object to be Illuminated, and a Linear (1D) CCD Image Detection Array with Vertically-Elongated Image Detection Elements Detects Time-Varying Speckle-Noise Patterns Produced by Said Spatially Incoherent PLIB Components Reflected/Scattered Off the Illuminated Object In FIGS. 1I25D1 and 1I25D2, there is shown a PLIIM-based system of the present invention 895 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench 862 on opposite sides of the IFD module; and (iii) a 2-D PLIB micro-oscillation mechanism 896 arranged with each PLIM in an integrated manner.

As shown, the 2-D PLIB micro-oscillation mechanism 896 comprises: a stationary PLIB reflecting element 897; a micro-oscillating high-resolution deformable mirror (DM) structure 898 as shown in FIGS. 1I7A through 1I7C; and a stationary cylindrical lens array 899. These optical components are configured together as an optical assembly as shown for the purpose of micro-oscillating the PLIB 900 laterally along its planar extent as well as transversely along the direction orthogonal thereto, so that during illumination operations, the PLIB transmitted from each PLIM is spatial phase modulated along the planar extent thereof as well as along the direction orthogonal (i.e. transverse) thereto. This causes the spatial phase along the wavefront of each transmitted PLIB to be modulated in two orthogonal dimensions and numerous substantially different time-varying speckle-noise patterns to be produced at the vertically-elongated image detection elements 864 during the photo-integration time period thereof. During target illumination operations, these numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated Speckle-Pattern Noise Reduction Subsystem, Wherein a Micro-Oscillating Cylindrical Lens Array Micro-Oscillates a Planar Laser Illumination Beam (PLIB) Laterally Along its Planar Extent to Produce Spatially Incoherent PLIB Components Which are Optically Combined and Projected onto the Same Points on the Surface of an Object to be Illuminated, and a Micro-Oscillating Light Reflective Structure Micro-Oscillates the Spatially Incoherent PLIB Components Transversely Along the Direction Orthogonal to Said Planar Extent as Well as the Field of View (FOV) of a Linear (1D) CCD Image Detection Array Having Vertically-Elongated Image Detection Elements, Whereby Said Linear CCD Image Detection Array Detects Time-Varying Speckle-Noise Patterns Produced by the Spatially Incoherent PLIB Components Reflected/Scattered Off the Illuminated Object In FIGS. 1I25E1 and 1I25E2, there is shown a PLIIM-based system of the present invention 905 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench 862 on opposite sides of the IFD module; and (iii) a 2-D PLIB micro-oscillation mechanism 906 arranged with each PLIM in an integrated manner.

As shown, the 2-D PLIB micro-oscillation mechanism 906 comprises: a micro-oscillating cylindrical lens array structure 907 as shown in FIGS. 1I4A through 1I4D for micro-oscillating the PLIB 908 laterally along its planar extent; a micro-oscillating PLIB/FOV refraction element 909 for micro-oscillating the PLIB and the field of view (FOV) of the linear CCD image sensor 863 transversely along the direction orthogonal to the planar extent of the PLIB; and a stationary PLIB/FOV folding mirror 910 for folding jointly the micro-oscillated PLIB and FOV towards the object to be illuminated and imaged in accordance with the principles of the present invention. These optical components are configured together as an optical assembly as shown for the purpose of micro-oscillating the PLIB laterally along its planar extent while micro-oscillating both the PLIB and FOV of the linear CCD image sensor transversely along the direction orthogonal thereto. During illumination operations, the PLIB transmitted from each PLIM is spatial phase modulated along the planar extent thereof as well as along the direction orthogonal (i.e. transverse) thereto, causing the phase along the wavefront of each transmitted PLIB to be modulated in two orthogonal dimensions and numerous substantially different time-varying speckle-noise patterns to be produced at the vertically-elongated image detection elements 864 during the photo-integration time period thereof. These numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated Speckle-Pattern Noise Reduction Subsystem, Wherein a Micro-Oscillating Cylindrical Lens Array Micro-Oscillates a Planar Laser Illumination Beam (PLIB) Laterally Along its Planar Extent and Produces Spatially Incoherent PLIB Components Which are Optically Combined and Project Onto the Same Points on the Surface of an Object to be Illuminated, a Micro-Oscillating Light Reflective Structure Micro-Oscillates Transversely Along the Direction Orthogonal to Said Planar Extent, Both PLIB and the Field of View (FOV) of a Linear (1D) CCD Image Detection Array Having Vertically-Elongated Image Detection Elements, and a PLIB/FOV Folding Mirror Projects the Micro-Oscillated PLIB and FOV Towards Said Object, Whereby Said Linear CCD Image Detection Array Detects Time-Varying Speckle-Noise Patterns Produced by the Spatially Incoherent PLIB Components Reflected/Scattered Off the Illuminated Object In FIGS. 1I25F1 and 1I25F2, there is shown a PLIIM-based system of the present invention 915 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench 862 on opposite sides of the IFD module 861; and (iii) a 2-D PLIB micro-oscillation mechanism 916 arranged with each PLIM in an integrated manner.

As shown, the 2-D PLIB micro-oscillation mechanism 916 comprises: a micro-oscillating cylindrical lens array structure 917 as shown in FIGS. 1I4A through 1I4D for micro-oscillating the PLIB 918 laterally along its planar extent; a micro-oscillating PLIB/FOV reflection element 919 for micro-oscillating the PLIB and the field of view (FOV) 921 of the linear CCD image sensor (collectively 920) transversely along the direction orthogonal to the planar extent of the PLIB; and a stationary PLIB/FOV folding mirror 921 for jointing folding the micro-oscillated PLIB and the FOV towards the object to be illuminated and imaged in accordance with the principles of the present invention. These optical components are configured together as an optical assembly as shown for the purpose of micro-oscillating the PLIB laterally along its planar extent while micro-oscillating both the PLIB and FOV of the linear CCD image sensor 863 transversely along the direction orthogonal thereto. During illumination operations, the PLIB transmitted from each PLIM 922 is spatial phase modulated along the planar extent thereof as well as along the direction orthogonal thereto. This causes the phase along the wavefront of each transmitted PLIB to be modulated in two orthogonal dimensions and numerous substantially different time-varying speckle-noise patterns to be produced at the vertically-elongated image detection elements 864 during the photo-integration time period thereof. These numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated Speckle-Pattern Noise Reduction Subsystem, Wherein a Phase-Only LCD-Based Phase Modulation Panel Micro-Oscillates a Planar Laser Illumination Beam (PLIB) Laterally Along its Planar Extent and Produces Spatially Incoherent PLIB Components, a Stationary Cylindrical Lens Array Optically Combines and Projects Spatially Incoherent PLIB Components Onto the Same Points on the Surface of an Object to be Illuminated, and Wherein a Micro-Oscillating Light Reflecting Structure Micro-Oscillates the Spatially Incoherent PLIB Components Transversely Along the Direction Orthogonal to Said Planar Extent, and a Linear (1D) CCD Image Detection Array with Vertically-Elongated Image Detection Elements Detects Time-Varying Speckle-Noise Patterns Produced by the Spatially Incoherent PLIB Components Reflected/Scattered Off the Illuminated Object In FIGS. 1I25G1 and 1I25G2, there is shown a PLIIM-based system of the present invention 925 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench 862 on opposite sides of the IFD module 861; and (iii) a 2-D PLIB micro-oscillation mechanism 926 arranged with each PLIM in an integrated manner.

As shown, 2-D PLIB micro-oscillation mechanism 926 comprises: a phase-only LCD phase modulation panel 927 for micro-oscillating PLIB 928 as shown in FIGS. 1I8F and 1IG; a stationary cylindrical lens array 929; and a micro-PLIB reflection element 930. As shown in FIG. 1I25G2, each PLIM 865A and 865B is pitched slightly relative to the optical axis of the IFD module 861 so that the PLIB 928 is transmitted perpendicularly through phase modulation panel 927, whereas the FOV of the image detection array 863 is disposed at a small acute angle so that the PLIB and FOV converge on the micro-oscillating mirror element 930 so that the PLIB and FOV (collectively 931) maintain a coplanar relationship as they are jointly micro-oscillated in planar and orthogonal directions during object illumination operations. These optical components are configured together as an optical assembly as shown for the purpose of micro-oscillating the PLIB laterally along its planar extent while micro-oscillating the PLIB transversely along the direction orthogonal thereto. During illumination operations, the PLIB transmitted from each PLIM is spatial phase modulated along the planar extent thereof as well as along the direction orthogonal (i.e. transverse) thereto. This causes the phase along the wavefront of each transmitted PLIB to be modulated in two orthogonal dimensions and numerous substantially different time-varying speckle-noise patterns to be produced at the vertically-elongated image detection elements 864 during the photo-integration time period thereof. These numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated Speckle-Pattern Noise Reduction Subsystem, Wherein a Multi-Faceted Cylindrical Lens Array Structure Rotating About its Longitudinal Axis Within Each PLIM Micro-Oscillates a Planar Laser Illumination Beam (PLIB) Laterally Along its Planar Extent and Produces Spatially Incoherent PLIB Components Therealong, a Stationary Cylindrical Lens Array Optically Combines and Projects the Spatially Incoherent PLIB Components Onto the Same Points on the Surface of an Object to be Illuminated, and Wherein a Micro-Oscillating Light Reflecting Structure Micro-Oscillates the Spatially Incoherent PLIB Components Transversely Along the Direction Orthogonal to Said Planar Extent, and a Linear (1D) CCD Image Detection Array With Vertically-Elongated Image Detection Elements Detects Time-Varying Speckle-Noise Patterns Produced by the Spatially Incoherent PLIB Components Reflected/Scattered Off the Illuminated Object In FIGS. 1I25H1 and 1I25H2, there is shown a PLIIM-based system of the present invention 935 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 964 characterized by a large height-to-width (H/W) aspect ratio; (ii) a PLIA comprising a pair of planar laser illumination modules (PLIMs) 865A' and 865B' mounted on the optical bench 862 on opposite sides of the IFD module 861; and (iii) a 2-D PLIB micro-oscillation mechanism 936 arranged with each PLIM in an integrated manner.

As shown, the 2-D PLIB micro-oscillation mechanism 936 comprises: a micro-oscillating multi-faceted cylindrical lens array structure 937 as shown in FIGS. 1I12A and 1I12B, for micro-oscillating PLIB 938 produced therefrom along its planar extent as the cylindrical lens array structure 937 rotates about its axis of rotation; a stationary cylindrical lens array 939; and a micro-oscillating PLIB reflection element 940. As shown in FIG. 1I25H2, each PLIM 865A and 865B is pitched slightly relative to the optical axis of the IFD module 861 so that the PLIB is transmitted perpendicularly through cylindrical lens array 939, whereas the FOV of the image detection array 863 is disposed at a small acute angle relative to the cylindrical lens array 939 so that the PLIB and FOV converge on the micro-oscillating mirror element 940 and the PLIB and FOV maintain a coplanar relationship as they are jointly micro-oscillated in planar and orthogonal directions during object illumination operations. As shown, these optical elements are configured together as an optical assembly as shown, for the purpose of micro-oscillating the PLIB laterally along its planar extent while micro-oscillating the PLIB transversely along the direction orthogonal thereto. During illumination operations, the PLIB 938 transmitted from each PLIM 865A' and 865B' is spatial phase modulated along the planar extent thereof as well as along the direction orthogonal thereto, causing the phase along the wavefront of each transmitted PLIB to be modulated in two orthogonal dimensions and numerous substantially different time-varying speckle-noise patterns to be produced at the vertically-elongated image detection elements 864 during the photo-integration time period thereof. These numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated Speckle-Pattern Noise Reduction Subsystem, Wherein a Multi-Faceted Cylindrical Lens Array Structure Within Each PLIM Rotates About its Longitudinal and Transverse Axes, Micro-Oscillates a Planar Laser Illumination Beam (PLIB) Laterally Along its Planar Extent as Well as Transversely Along the Direction Orthogonal to Said Planar Extent, and Produces Spatially Incoherent PLIB Components Along Said Orthogonal Directions, and Wherein a Stationary Cylindrical Lens Array Optically Combines and Projects the Spatially Incoherent PLIB Components PLIB Onto the Same Points on the Surface of an Object to be Illuminated, and a Linear (1D) CCD Image Detection Array With Vertically-Elongated Image Detection Elements Detects Time-Varying Speckle-Noise Patterns Produced by the Spatial Incoherent PLIB Components Reflected/Scattered Off the Illuminated Object In FIGS. 1I25I1 through 1I25I3, there is shown a PLIIM-based system of the present invention 945 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench on opposite sides of the IFD module; and (iii) a 2-D PLIB micro-oscillation mechanism 946 arranged with each PLIM in an integrated manner.

As shown, the 2-D PLIB micro-oscillation mechanism 946 comprises: a micro-oscillating multi-faceted cylindrical lens array structure 947 as generally shown in FIGS. 1I12A and 1I12B (adapted for micro-oscillation about the optical axis of the VLD's laser illumination beam as well as along the planar extent of the PLIB); and a stationary cylindrical lens array 948. As shown in FIGS. 1I25I2 and 1I25I3, the multi-faceted cylindrical lens array structure 947 is rotatably mounted within a housing portion 949 having a light transmission aperture 950 through which the PLIB exits, so that the structure 947 can rotate about its axis, while the housing portion 949 is micro-oscillated about an axis that is parallel with the optical axis of the focusing lens 15 within the PLIM 865A, 865B. Rotation of structure 947 can be achieved using an electrical motor with or without the use of a gearing mechanism, whereas micro-oscillation of the housing portion 949 can be achieved using any electromechanical device known in the art. As shown, these optical components are configured together as an optical assembly, for the purpose of micro-oscillating the PLIB 951 laterally along its planar extent while micro-oscillating the PLIB transversely along the direction orthogonal thereto. During illumination operations, the PLIB transmitted from each PLIM is spatial phase modulated along the planar extent thereof as well as along the direction orthogonal thereto. This causes the phase along the wavefront of each transmitted PLIB to be modulated in two orthogonal dimensions and numerous substantially different time-varying speckle-noise patterns to be produced at the vertically-elongated image detection elements 863 during the photo-integration time period thereof. These numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated "Hybrid-Type" Speckle-Pattern Noise Reduction Subsystem, Wherein a High-Speed Temporal Intensity Modulation Panel Temporal Intensity Modulates a Planar Laser Illumination Beam (PLIB) to Produce Temporally Incoherent PLIB Components Along its Planar Extent, a Stationary Cylindrical Lens Array Optically Combines and Projects the Temporally Incoherent PLIB Components Onto the Same Points on the Surface of an Object to be Illuminated, and Wherein a Micro-Oscillating Light Reflecting Element Micro-Oscillates the PLIB Transversely Along the Direction Orthogonal to Said Planar Extent to Produce Spatially Incoherent PLIB Components Along Said Transverse Direction, and a Linear (1D) CCD Image Detection Array With Vertically-Elongated Image Detection Elements Detects Time-Varying Speckle-Noise Patterns Produced by the Temporally and Spatially Incoherent PLIB Components Reflected/Scattered Off the Illuminated Object In FIGS. 1I25J1 and 1I25J2, there is shown a PLIIM-based system of the present invention 955 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench on opposite sides of the IFD module; and (iii) a hybrid-type PLIB modulation mechanism 956 arranged with each PLIM.

As shown, PLIB modulation mechanism 955 comprises: a temporal intensity modulation panel (i.e. high-speed optical shutter) 957 as shown in FIGS. 1I14A and 1I14B; a stationary cylindrical lens array 958; and a micro-oscillating PLIB reflection element 959. As shown in FIG. 1I25J2, each PLIM 865A and 865B is pitched slightly relative to the optical axis of the IFD module 861 so that the PLIB 960 is transmitted perpendicularly through temporal intensity modulation panel 957, whereas the FOV of the image detection array 863 is disposed at a small acute angle relative to PLIB 960 so that the PLIB and FOV (collectively 961) converge on the micro-oscillating mirror element 959 and the PLIB and FOV maintain a coplanar relationship as they are jointly micro-oscillated in planar and orthogonal directions during object illumination operations. As shown, these optical elements are configured together as an optical assembly, for the purpose of temporal intensity modulating the PLIB 960 uniformly along its planar extent while micro-oscillating PLIB 960 transversely along the direction orthogonal thereto. During illumination operations, the PLIB transmitted from each PLIM is temporal intensity modulated along the planar extent thereof and spatial phase modulated during micro-oscillation along the direction orthogonal thereto, thereby producing numerous substantially different time-varying speckle-noise patterns at the vertically-elongated image detection elements 864 during the photo-integration time period thereof. These numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated "Hybrid-Type" Speckle-Pattern Noise Reduction Subsystem, Wherein an Optically-Reflective Cavity Externally Attached to Each VLD in the System Temporal Phase Modulates a Planar Laser Illumination Beam (PLIB) to Produce Temporally Incoherent PLIB Components Along its Planar Extent, a Stationary Cylindrical Lens Array Optically Combines and Projects the Temporally Incoherent PLIB Components Onto the Same Points on the Surface of an Object to be Illuminated, and Wherein a Micro-Oscillating Light Reflecting Element Micro-Oscillates the PLIB Transversely Along the Direction Orthogonal to Said Planar Extent to Produce Spatially Incoherent PLIB Components Along Said Transverse Direction, and a Linear (1D) CCD Image Detection Array With Vertically-Elongated Image Detection Elements Detects Time-Varying Speckle-Noise Patterns Produced by the Temporally and Spatially Incoherent PLIB Components Reflected/Scattered Off the Illuminated Object In FIGS. 1I25K1 and 1I25K2, there is shown a PLIIM-based system of the present invention 965 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A" and 865B" mounted on the optical bench 862 on opposite sides of the IFD module 861; and (iii) a hybrid-type PLIB modulation mechanism 966 arranged with each PLIM.

As shown, PLIB modulation mechanism 966 comprises an optically-reflective cavity (i.e. etalon) 967 attached external to each VLD 13 as shown in FIGS. 1I17A and 1I17B; a stationary cylindrical lens array 968; and a micro-oscillating PLIB reflection element 969. As shown, these optical components are configured together as an optical assembly, for the purpose of temporal intensity modulating the PLIB 970 uniformly along its planar extent while micro-oscillating the PLIB transversely along the direction orthogonal thereto. As shown in FIG. 1I25K2, each PLIM 865A" and 865B" is pitched slightly relative to the optical axis of the IFD module 961 so that the PLIB 970 is transmitted perpendicularly through cylindrical lens array 968, whereas the FOV of the image detection array 863 is disposed at a small acute angle so that the PLIB and FOV converge on the micro-oscillating mirror element 968 so that the PLIB and FOV (collectively 971) maintain a coplanar relationship as they are jointly micro-oscillated in planar and orthogonal directions during object illumination operations. During illumination operations, the PLIB transmitted from each PLIM is temporal phase modulated along the planar extent thereof and spatial phase modulated during micro-oscillation along the direction orthogonal thereto, thereby producing numerous substantially different time-varying speckle-noise patterns at the vertically-elongated image detection elements of the IFD Subsystem during the photo-integration time period thereof. These numerous time-varying speckle-noise patterns are temporally and spatially averaged during the photo-integration time period of the image detection array, thereby reducing the RMS power level of speckle-noise patterns observed at the image detection array.

PLIIM-Based System With an Integrated "Hybrid-Type" Speckle-Pattern Noise Reduction Subsystem, Wherein Each Visible Mode Locked Laser Diode (MLLD) Employed in the PLIM of the System Generates a High-Speed Pulsed (i.e. Temporal Intensity Modulated) Planar Laser Illumination Beam (PLIB) Having Temporally Incoherent PLIB Components Along its Planar Extent, a Stationary Cylindrical Lens Array Optically Combines and Projects the Temporally Incoherent PLIB Components Onto the Same Points on the Surface of an Object to be Illuminated, and Wherein a Micro-Oscillating Light Reflecting Element Micro-Oscillates PLIB Transversely Along the Direction Orthogonal to Said Planar Extent to Produce Spatially Incoherent PLIB Components Along Said Transverse Direction, and a Linear (1D) CCD Image Detection Array with Vertically-Elongated Image Detection Elements Detects Time-Varying Speckle-Noise Patterns Produced by the Temporally and Spatially Incoherent PLIB Components Reflected/Scattered Off the Illuminated Object In FIGS. 1I25L1 and 1I25L2, there is shown a PLIIM-based system of the present invention 975 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench on opposite sides of the IFD module; and (iii) a hybrid-type PLIB modulation mechanism 976 arranged with each PLIM in an integrated manner.

As shown, the PLIB modulation mechanism 976 comprises: a visible mode-locked laser diode (MLLD) 977 as shown in FIGS. 1I15A and 1I15D; a stationary cylindrical lens array 978; and a micro-oscillating PLIB reflection element 979. As shown in FIG. 1I25L2, each PLIM 865A and 865B is pitched slightly relative to the optical axis of the IFD module 861 so that the PLIB 980 is transmitted perpendicularly through cylindrical lens array 978, whereas the FOV of the image detection array 863 is disposed at a small acute angle, relative to PLIB 980, so that the PLIB and FOV converge on the micro-oscillating mirror element 868 so that the PLIB and FOV (collectively 981) maintain a coplanar relationship as they are jointly micro-oscillated in planar and orthogonal directions during object illumination operations. As shown, these optical components are configured together as an optical assembly, for the purpose of producing a temporal intensity modulated PLIB while micro-oscillating the PLIB transversely along the direction orthogonal to its planar extent. During illumination operations, the PLIB transmitted from each PLIM is temporal intensity modulated along the planar extent thereof and spatial phase modulated during micro-oscillation along the direction orthogonal thereto, thereby producing numerous substantially different time-varying speckle-noise patterns at the vertically-elongated image detection elements 864 during the photo-integration time period thereof. These numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated "Hybrid-Type" Speckle-Pattern Noise Reduction Subsystem, Wherein the Visible Laser Diode (VLD) Employed in Each PLIM of the System Is Continually Operated in a Frequency-Hopping Mode so as to Temporal Frequency Modulate the Planar Laser Illumination Beam (PLIB) and Produce Temporally Incoherent PLIB Components Along its Planar Extent, a Stationary Cylindrical Lens Array Optically Combines and Projects the Temporally Incoherent PLIB Components Onto the Same Points on the Surface of an Object to be Illuminated, and Wherein a Micro-Oscillating Light Reflecting Element Micro-Oscillates the PLIB Transversely Along the Direction Orthogonal to Said Planar Extent and Produces Spatially Incoherent PLIB Components Along Said Transverse Direction, and a Linear (1D) CCD Image Detection Array With Vertically-Elongated Image Detection Elements Detects Time-Varying Speckle-Noise Patterns Produced by the Temporally and Spatial Incoherent PLIB Components Reflected/Scattered Off the Illuminated Object In FIGS. 1I25M1 and 1I25M2, there is shown a PLIIM-based system of the present invention 985 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench on opposite sides of the IFD module; and (iii) a hybrid-type PLIB modulation mechanism 986 arranged with each PLIM in an integrated manner.

As shown, PLIB modulation mechanism 986 comprises: a visible laser diode (VLD) 13 continuously driven into a high-speed frequency hopping mode (as shown in FIGS. 1I16A and 1I15B); a stationary cylindrical lens array 986; and a micro-oscillating PLIB reflection element 987. As shown in FIG. 1I25M2, each PLIM 865A and 865B is pitched slightly relative to the optical axis of the IFD module 861 so that the PLIB 988 is transmitted perpendicularly through cylindrical lens array 986, whereas the FOV of the image detection array 863 is disposed at a small acute angle, relative to PLIB 988, so that the PLIB and FOV (collectively 988) converge on the micro-oscillating mirror element 987 so that the PLIB and FOV maintain a coplanar relationship as they are jointly micro-oscillated in planar and orthogonal directions during object illumination operations. As shown, these optical components are configured together as an optical assembly as shown, for the purpose of producing a temporal frequency modulated PLIB while micro-oscillating the PLIB transversely along the direction orthogonal to its planar extent. During illumination operations, the PLIB transmitted from each PLIM is temporal frequency modulated along the planar extent thereof and spatial intensity modulated during micro-oscillation along the direction orthogonal thereto, thereby producing numerous substantially different time-varying speckle-noise patterns at the vertically-elongated image detection elements 864 during the photo-integration time period thereof. These numerous time-varying speckle-noise patterns are temporally and spatially averaged during the photo-integration time period of the image detection array 863, thereby reducing the RMS power level of speckle-noise patterns observed at the image detection array.

PLIIM-Based System With an Integrated "Hybrid-Type" Speckle-Pattern Noise Reduction Subsystem, Wherein a Pair of Micro-Oscillating Spatial Intensity Modulation Panels Spatial Intensity Modulate a Planar Laser Illumination Beam (PLIB) and Produce Spatially Incoherent PLIB Components Along its Planar Extent, a Stationary Cylindrical Lens Array Optically Combines and Projects the Spatially Incoherent PLIB Components Onto the Same Points on the Surface of an Object to be Illuminated, and Wherein a Micro-Oscillating Light Reflective Structure Micro-Oscillates Said PLIB Transversely Along the Direction Orthogonal to Said Planar Extent and Produces Spatially Incoherent PLIB Components Along Said Transverse Direction, and a Linear (1D) CCD Image Detection Array Having Vertically-Elongated Image Detection Elements Detects Time-Varying Speckle-Noise Patterns Produced by the Spatially Incoherent PLIB Components Reflected/Scattered Off the Illuminated Object In FIGS. 1I25N1 and 1I25N2, there is shown a PLIIM-based system of the present invention 995 having speckle-pattern noise reduction capabilities embodied therein, which comprises: (i) an image formation and detection (IFD) module 861 mounted on an optical bench 862 and having a linear (1D) CCD image sensor 863 with vertically-elongated image detection elements 864 characterized by a large height-to-width (H/W) aspect ratio; (ii) a PLIA comprising a pair of planar laser illumination modules (PLIMs) 865A and 865B mounted on the optical bench on opposite sides of the IFD module; and (iii) a hybrid-type PLIB modulation mechanism 996 arranged with each PLIM in an integrated manner.

As shown, the PLIB modulation mechanism 996 comprises a micro-oscillating spatial intensity modulation array 997 as shown in FIGS. 1I221A through 1I21D; a stationary cylindrical lens array 998; and a micro-oscillating PLIB reflection element 999. As shown in FIG. 1I25N2, each PLIM 865A and 865B is pitched slightly relative to the optical axis of the IFD module 861 so that the PLIB 1000 is transmitted perpendicularly through cylindrical lens array 998, whereas the FOV of the image detection array 863 is disposed at a small acute angle, relative to PLIB 1000, so that the PLIB and FOV (collectively 1001) converge on the micro-oscillating mirror element 999 so that the PLIB and FOV maintain a coplanar relationship as they are jointly micro-oscillated in planar and orthogonal directions during object illumination operations. As shown, these optical components are configured together as an optical assembly, for the purpose of producing a spatial intensity modulated PLIB while micro-oscillating the PLIB transversely along the direction orthogonal to its planar extent. During illumination operations, the PLIB transmitted from each PLIM is spatial intensity modulated along the planar extent thereof and spatial phase modulated during micro-oscillation along the direction orthogonal thereto, thereby producing numerous substantially different time-varying speckle-noise patterns at the vertically-elongated image detection elements of the IFD Subsystem during the photo-integration time period thereof. These numerous time-varying speckle-noise patterns are temporally and spatially averaged during the photo-integration time period of the image detection array, thereby reducing the RMS power level of speckle-noise patterns observed at the image detection array;

Notably, in this embodiment, it may be preferred that the cylindrical lens array 998 may be realized using light diffractive optical materials so that each spectral component within the transmitted PLIB 1001 will be diffracted at slightly different angles dependent on its optical wavelength. For example, using this technique, the PLIB 1000 can be made to undergo micro-movement along the transverse direction (or planar extent of the PLIB) during target illumination operations. Therefore, such wavelength-dependent PLIB movement can be used to modulate the spatial phase of the PLIB wavefront along directions extending either within the plane of the PLIB or along a direction orthogonal thereto, depending on how the diffractive-type cylindrical lens array is designed. In such applications, both temporal frequency modulation as well as spatial phase modulation of the PLIB wavefront would occur, thereby creating a hybrid-type despeckling scheme.

Advantages of Using Linear Image Detection Arrays Having Vertically-Elongated Image Detection Elements If the heights of the PLIB and the FOV of the linear image detection array are comparable in size in a PLIIM-based system, then only a slight misalignment of the PLIB and the FOV is required to displace the PLIB from the FOV, rendering a dark image at the image detector in the PLIIM-based system. To use this PLIB/FOV alignment technique successfully, the mechanical parts required for positioning the CCD linear image sensor and the VLDs of the PLIA must be extremely rugged in construction, which implies additional size, weight, and cost of manufacture.

The PLIB/FOV misalignment problem described above can be solved using the PLIIM-based imaging engine design shown in FIGS. 1I25A2 through 1I25N2. In this novel design, the linear image detector 863 with its vertically-elongated image detection elements 864 is used in conjunction with a PLIB having a height that is substantially smaller than the height dimension of the magnified field of view (FOV) of each image detection element in the linear image detector 863. This condition between the PLIB and the FOV reduces the tolerance on the degree of alignment that must be maintained between the FOV of the linear image sensor and the plane of the PLIB during planar laser illumination and imaging operations. It also avoids the need to increase the output power of the VLDs in the PLIA, which might either cause problems from a safety and laser class standpoint, or require the use of more powerful VLDs which are expensive to procure and require larger heat sinks to operate properly. Thus using the PLIIM-based imaging engine design shown in FIGS. 1I25A2 through 1I25N2, the PLIB and FOV thereof can move slightly with respect to each other during system operation without "loosing alignment" because the FOV of the image detection elements spatially encompasses the entire PLIB, while providing significant spatial tolerances on either side of the PLIB. By the term "alignment", it is understood that the FOV of the image detection array and the principal plane of the PLIB sufficiently overlap over the entire width and depth of object space (i.e. working distance) such that the image obtained is bright enough to be useful in whatever application at hand (e.g. bar code decoding, OCR software processing, etc.).

A notable advantage derived when using this PLIB/FOV alignment method is that no sacrifice in laser intensity is required. In fact, because the FOV is guaranteed to receive all of the laser light from the illuminating PLIB, whether stationary or moving relative to the target object, the total output power of the PLIB may be reduced if necessary or desired in particular applications.

In the illustrative embodiments described above, each PLIIM-based system is provided with an integrated despeckling mechanism, although it is clearly understood that the PLIB/FOV alignment method described above can be practiced with or without such despeckling techniques.

In a first illustrative embodiment, the PLIB/FOV alignment method may be practiced using a linear CCD image detection array (i.e. sensor) with, for example, 10 micron tall image detection elements (i.e. pixels) and image forming optics having a magnification factor of say, for example, 15×. In this first illustrative embodiment, the height of the FOV of the image detection elements on the target object would be about 150 microns. In order for the height of the PLIB to be significantly smaller than this FOV height dimension, e.g. by a factor of five, the height of the PLIB would have to be focused to about 30 microns.

In a second alternative embodiment, using a linear CCD image detector with image detection elements having a 200 micron height dimension and equivalent optics (having a magnification factor 15×), the height dimension for the FOV would be 3000 microns. In this second alternative embodiment, a PLIB focused to 750 microns (rather than 30 microns in the first illustrative embodiment above) would provide the same amount of return signal at the linear image detector, but with angular tolerances which are almost 20 times as large as those obtained in the first illustrative embodiment. In view of the fact that it can be quite difficult to focus a planarized laser beam to a few microns thickness over an extended depth of field, the second illustrative embodiment would be preferred over the first illustrative embodiment.

In view of the fact that linear CCD image detectors with 200 micron tall image detection elements are generally commercially available in lengths of only one or two thousand image detection elements (i.e. pixels), the PLIB/FOV alignment method described above would be best applicable to PLIIM-based hand-held imaging applications as illustrated, for example, in FIGS. 1I25A2 through 1I25N2. In view of the fact that most industrial-type imaging systems require linear image sensors having six to eight thousand image detection elements, the PLIB/FOV alignment method illustrated in FIG. 1B3 would be best applicable to PLIIM-based conveyor-mounted/industrial imaging systems as illustrated, for example, in FIGS. 9 through 32A. Depending on the optical path lengths required in the PLIIM-based POS imaging systems shown in FIGS. 33A through 34C, either of these PLIB/FOV alignment methods may be used with excellent results.

Second Alternative Embodiment of the PLIIM-Based System of the Present Invention Shown in FIG. 1A In FIG. 1Q1, the second illustrative embodiment of the PLIIM-based system of FIG. 1A, indicated by reference numeral 1B, is shown comprising: a 1-D type image formation and detection (IFD) module 3', as shown in FIG. 1B1; and a pair of planar laser illumination arrays 6A and 6B. As shown, these arrays 6A and 6B are arranged in relation to the image formation and detection module 3 so that the field of view thereof is oriented in a direction that is coplanar with the planes of laser illumination produced by the planar illumination arrays, without using any laser beam or field of view folding mirrors. One primary advantage of this system architecture is that it does not require any laser beam or FOV folding mirrors, employs the few optical surfaces, and maximizes the return of laser light, and is easy to align. However, it is expected that this system design will most likely require a system housing having a height dimension which is greater than the height dimension required by the system design shown in FIG. 1B1.

As shown in FIG. 1Q2, PLIIM-based system of FIG. 1Q1 comprises: planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA and projecting the combined PLIB components onto points along the surface of the object being illuminated; linear-type image formation and detection module 3 having an imaging subsystem with a fixed focal length imaging lens, a fixed focal distance, and a fixed field of view, and 1-D image detection array (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner. Preferably, the PLIIM-based system of FIGS. 1P1 and 102 is realized using the same or similar construction techniques shown in FIGS. 1G1 through 1I2, and described above.

Third Alternative Embodiment of the PLIIM-Based System of the Present Invention Shown in FIG. 1A In FIG. 1R1, the third illustrative embodiment of the PLIIM-based system of FIG. 1A, indicated by reference numeral 1C, is shown comprising: a 1-D type image formation and detection (IFD) module 3 having a field of view (FOV), as shown in FIG. 1B1; a pair of planar laser illumination arrays 6A and 6B for producing first and second planar laser illumination beams; and a pair of planar laser beam folding mirrors 37A and 37B arranged. The function of the planar laser illumination beam folding mirrors 37A and 37B is to fold the optical paths of the first and second planar laser illumination beams produced by the pair of planar illumination arrays 37A and 37B such that the field of view (FOV) of the image formation and detection module 3 is aligned in a direction that is coplanar with the planes of first and second planar laser illumination beams during object illumination and imaging operations. One notable disadvantage of this system architecture is that it requires additional optical surfaces which can reduce the intensity of outgoing laser illumination and therefore reduce slightly the intensity of returned laser illumination reflected off target objects. Also this system design requires a more complicated beam/FOV adjustment scheme. This system design can be best used when the planar laser illumination beams do not have large apex angles to provide sufficiently uniform illumination. In this system embodiment, the PLIMs are mounted on the optical bench as far back as possible from the beam folding mirrors, and cylindrical lenses with larger radiuses will be employed in the design of each PLIM.

As shown in FIG. 1R2, PLIIM-based system 1C shown in FIG. 1R1 comprises: planar laser illumination arrays 6A and 6B, each having a plurality of planar laser illumination modules (PLIMs) 6A, 6B, and each PLIM being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module having an imaging subsystem with a fixed focal length imaging lens, a fixed focal distance, and a fixed field of view, and 1-D image detection array (e.g. Piranha Model Nos. CT-P4, or CL-P4 High-Speed CCD Line Scan Camera, from Dalsa, Inc. USA—http://www.dalsacom) for detecting 1-D line images formed thereon by the imaging subsystem; pair of planar laser beam folding mirrors 37A and 37B arranged so as to fold the optical paths of the first and second planar laser illumination beams produced by the pair of planar illumination arrays 6A and 6B; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner. Preferably, the PLIIM system of FIGS. 1Q1 and 1Q2 is realized using the same or similar construction techniques shown in FIGS. 1G1 through 1I2, and described above.

Fourth Illustrative Embodiment of the PLIIM-Based System of the Present Invention Shown in FIG. 1A In FIG. 1S1, the fourth illustrative embodiment of the PLIIM-based system of FIG. 1A, indicated by reference numeral 1D, is shown comprising: a 1-D type image formation and detection (IFD) module 3 having a field of view (FOV), as shown in FIG. 1B1; a pair of planar laser illumination arrays 6A and 6B for producing first and second planar laser illumination beams; a field of view folding mirror 9 for folding the field of view (FOV) of the image formation and detection module 3 about 90 degrees downwardly; and a pair of planar laser beam folding mirrors 37A and 37B arranged so as to fold the optical paths of the first and second planar laser illumination beams produced by the pair of planar illumination arrays 6A and 6B such that the planes of first and second planar laser illumination beams 7A and 7B are in a direction that is coplanar with the field of view of the image formation and detection module 3. Despite inheriting most of the disadvantages associated with the system designs shown in FIGS. 1B1 and 1R1, this system architecture allows the length of the system housing to be easily minimized, at the expense of an increase in the height and width dimensions of the system housing.

As shown in FIG. 1S2, PLIIM-based system 1D shown in FIG. 1S1 comprises: planar laser illumination arrays (PLIAs) 6A and 6B, each having a plurality of planar laser illumination modules (PLIMs) 11A through 11F, and each PLIM being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3 having an imaging subsystem with a fixed focal length imaging lens, a fixed focal distance, and a fixed field of view, and 1-D image detection array (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem; a field of view folding mirror 9 for folding the field of view (FOV) of the image formation and detection module 3; a pair of planar laser beam folding mirrors 9 and 3 arranged so as to fold the optical paths of the first and second planar laser illumination beams produced by the pair of planar illumination arrays 37A and 37B; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner. Preferably, the PLIIM-based system of FIGS. 1S1 and 1S2 is realized using the same or similar construction techniques shown in FIGS. 1G1 through 1I2, and described above.

Applications for the First Generalized Embodiment of the PLIIM-Based System of the Present Invention, and the Illustrative Embodiments Thereof Fixed focal distance type PLIIM-based systems shown in FIGS. 1B1 through 1U are ideal for applications in which there is little variation in the object distance, such as in a conveyor-type bottom scanner applications. As such scanning systems employ a fixed focal length imaging lens, the image resolution requirements of such applications must be examined carefully to determine that the image resolution obtained is suitable for the intended application. Because the object distance is approximately constant for a bottom scanner application (i.e. the bar code almost always is illuminated and imaged within the same object plane), the dpi resolution of acquired images will be approximately constant. As image resolution is not a concern in this type of scanning applications, variable focal length (zoom) control is unnecessary, and a fixed focal length imaging lens should suffice and enable good results.

A fixed focal distance PLIIM system generally takes up less space than a variable or dynamic focus model because more advanced focusing methods require more complicated optics and electronics, and additional components such as motors. For this reason, fixed focus PLIIM-based systems are good choices for handheld and presentation scanners as indicated in FIG. 1U, wherein space and weight are always critical characteristics. In these applications, however, the object distance can vary over a range from several to a twelve or more inches, and so the designer must exercise care to ensure that the scanner's depth of field (DOF) alone will be sufficient to accommodate all possible variations in target object distance and orientation. Also, because a fixed focus imaging subsystem implies a fixed focal length camera lens, the variation in object distance implies that the dots per inch resolution of the image will vary as well. The focal length of the imaging lens must be chosen so that the angular width of the field of view (FOV) is narrow enough that the dpi image resolution will not fall below the minimum acceptable value anywhere within the range of object distances supported by the PLIIM-based system.

Second Generalized Embodiment of the Planar Laser Illumination and Electronic Imaging System of the Present Invention The second generalized embodiment of the PLIIM-based system of the present invention 11 is illustrated in FIGS. 1V1 and 1V3. As shown in FIG. 1V1, the PLIIM-based system 1' comprises: a housing 2 of compact construction; a linear (i.e. 1-dimensional) type image formation and detection (IFD) module 3'; and a pair of planar laser illumination arrays (PLIAs) 6A and 6B mounted on opposite sides of the IFD module 3'. During system operation, laser illumination arrays 6A and 6B each produce a planar beam of laser illumination 12' which synchronously moves and is disposed substantially coplanar with the field of view (FOV) of the image formation and detection module 3', so as to scan a bar code symbol or other graphical structure 4 disposed stationary within a 3-D scanning region.

As shown in FIGS. 1V2 and 1V3, the PLIIM-based system of FIG. 1V1 comprises: an image formation and detection module 3' having an imaging subsystem 3B' with a fixed focal length imaging lens, a fixed focal distance, and a fixed field of view, and a 1-D image detection array 3 (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem; a field of view sweeping mirror 9 operably connected to a motor mechanism 38 under control of camera control computer 22, for folding and sweeping the field of view of the image formation and detection module 3; a pair of planar laser illumination arrays 6A and 6B for producing planar laser illumination beams (PLIBs) 7A and 7B, wherein each VLD 11 is driven by a VLD drive circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; a pair of planar laser illumination beam folding/sweeping mirrors 37A and 37B operably connected to motor mechanisms 39A and 39B, respectively, under control of camera control computer 22, for folding and sweeping the planar laser illumination beams 7A and 7B, respectively, in synchronism with the FOV being swept by the FOV folding and sweeping mirror 9; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

An image formation and detection (IFD) module 3 having an imaging lens with a fixed focal length has a constant angular field of view (FOV); that is, the farther the target object is located from the IFD module, the larger the projection dimensions of the imaging subsystem's FOV become on the surface of the target object. A disadvantage to this type of imaging lens is that the resolution of the image that is acquired, in terms of pixels or dots per inch, varies as a function of the distance from the target object to the imaging lens. However, a fixed focal length imaging lens is easier and less expensive to design and produce than the alternative, a zoom-type imaging lens which will be discussed in detail hereinbelow with reference to FIGS. 3A through 3J4.

Each planar laser illumination module 6A through 6B in PLIIM-based system 1' is driven by a VLD driver circuit 18 under the camera control computer 22. Notably, laser illumination beam folding/sweeping mirror 37A' and 38B', and FOV folding/sweeping mirror 9' are each rotatably driven by a motor-driven mechanism 38, 39A, and 39B, respectively, operated under the control of the camera control computer 22. These three mirror elements can be synchronously moved in a number of different ways. For example, the mirrors 37A', 37B' and 9' can be jointly rotated together under the control of one or more motor-driven mechanisms, or each mirror element can be driven by a separate driven motor which is synchronously controlled to enable the planar laser illumination beams 7A, 7B and FOV 10 to move together in a spatially-coplanar manner during illumination and detection operations within the PLIIM-based system.

In accordance with the present invention, the planar laser illumination arrays 6A and 6B, the linear image formation and detection module 3, the folding/sweeping FOV mirror 9', and the planar laser illumination beam folding/sweeping mirrors 37A' and 37B' employed in this generalized system embodiment, are fixedly mounted on an optical bench or chassis 8 so as to prevent any relative motion (which might be caused by vibration or temperature changes) between: (i) the image forming optics (e.g. imaging lens) within the image formation and detection module 3 and the FOV folding/sweeping mirror 9' employed therewith; and (ii) each planar laser illumination module (i.e. VLD/cylindrical lens assembly) and the planar laser illumination beam folding/sweeping mirrors 37A' and 37B' employed in this PLIIM system configuration. Preferably, the chassis assembly should provide for easy and secure alignment of all optical components employed in the planar laser illumination arrays 6A' and 6B', beam folding/sweeping mirrors 37A' and 37B', the image formation and detection module 3 and FOV folding/sweeping mirror 9', as well as be easy to manufacture, service and repair. Also, this generalized PLIIM-based system embodiment 1' employs the general "planar laser illumination" and "focus beam at farthest object distance (FBAFOD)" principles described above.

Applications for the Second Generalized Embodiment of the PLIIM System of the Present Invention The fixed focal length PLIIM-based system shown in FIGS. 1V1–1V3 has a 3-D fixed field of view which, while spatially-aligned with a composite planar laser illumination beam 12 in a coplanar manner, is automatically swept over a 3-D scanning region within which bar code symbols and other graphical indicia 4 may be illuminated and imaged in accordance with the principles of the present invention. As such, this generalized embodiment of the present invention is ideally suited for use in hand-supportable and hands-free presentation type bar code symbol readers shown in FIGS. 1V4 and 1V5, respectively, in which rasterlike-scanning (i.e. up and down) patterns can be used for reading 1-D as well as 2-D bar code symbologies such as the PDF 147 symbology. In general, the PLIIM-based system of this generalized embodiment may have any of the housing form factors disclosed and described in Applicants' copending U.S. application Ser. No. 09/204,176 entitled filed Dec. 3, 1998 and Ser. No. 09/452,976 filed Dec. 2, 1999, and WIPO Publication No. WO 00/33239 published Jun. 8, 2000, incorporated herein by reference. The beam sweeping technology disclosed in copending application Ser. No. 08/931,691 filed Sep. 16, 1997, incorporated herein by reference, can be used to uniformly sweep both the planar laser illumination beam and linear FOV in a coplanar manner during illumination and imaging operations.

Third Generalized Embodiment of the PLIIM-Based System of the Present Invention

The third generalized embodiment of the PLIIM-based system of the present invention 40 is illustrated in FIG. 2A. As shown therein, the PLIIM system 40 comprises: a housing 2 of compact construction; a linear (i.e. 1-dimensional) type image formation and detection (IFD) module 3' including a 1-D electronic image detection array 3A, a linear (1-D) imaging subsystem (LIS) 3B' having a fixed focal length, a variable focal distance, and a fixed field of view (FOV), for forming a 1-D image of an illuminated object located within the fixed focal distance and FOV thereof and projected onto the 1-D image detection array 3A, so that the 1-D image detection array 3A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 3', such that each planar laser illumination array 6A and 6B produces a composite plane of laser beam illumination 12 which is disposed substantially coplanar with the field view of the image formation and detection module 3' during object illumination and image detection operations carried out by the PLIIM-based system.

In accordance with the present invention, the planar laser illumination arrays 6A and 6B, the linear image formation and detection module 3', and any non-moving FOV and/or planar laser illumination beam folding mirrors employed in any configuration of this generalized system embodiment, are fixedly mounted on an optical bench or chassis so as to prevent any relative motion (which might be caused by vibration or temperature changes) between: (i) the image forming optics (e.g. imaging lens) within the image formation and detection module 3' and any stationary FOV folding mirrors employed therewith; and (ii) each planar laser illumination module (i.e. VLD/cylindrical lens assembly) and any planar laser illumination beam folding mirrors employed in the PLIIM system configuration. Preferably, the chassis assembly should provide for easy and secure alignment of all optical components employed in the planar laser illumination arrays 6A and 6B as well as the image formation and detection module 3', as well as be easy to manufacture, service and repair. Also, this generalized PLIIM-based system embodiment 40 employs the general "planar laser illumination" and "focus beam at farthest object distance (FBAFOD)" principles described above. Various illustrative embodiments of this generalized PLIIM-based system will be described below.

An image formation and detection (IFD) module 3 having an imaging lens with variable focal distance, as employed in the PLIIM-based system of FIG. 2A, can adjust its image distance to compensate for a change in the target's object distance; thus, at least some of the component lens elements in the imaging subsystem are movable, and the depth of field of the imaging subsystems does not limit the ability of the imaging subsystem to accommodate possible object distances and orientations. A variable focus imaging subsystem is able to move its components in such a way as to change the image distance of the imaging lens to compensate for a change in the target's object distance, thus preserving good focus no matter where the target object might be located. Variable focus can be accomplished in several ways, namely: by moving lens elements; moving imager detector/sensor; and dynamic focus. Each of these different methods will be summarized below for sake of convenience.

Use of Moving Lens Elements in the Image Formation and Detection Module

The imaging subsystem in this generalized PLIIM-based system embodiment can employ an imaging lens which is made up of several component lenses contained in a common lens barrel. A variable focus type imaging lens such as this can move one or more of its lens elements in order to change the effective distance between the lens and the image sensor, which remains stationary. This change in the image distance compensates for a change in the object distance of the target object and keeps the return light in focus. The position at which the focusing lens element(s) must be in order to image light returning from a target object at a given object distance is determined by consulting a lookup table, which must be constructed ahead of time, either experimentally or by design software, well known in the optics art.

Use of an Moving Image Detection Array in the Image Formation and Detection Module The imaging subsystem in this generalized PLIIM-based system embodiment can be constructed so that all the lens elements remain stationary, with the imaging detector/sensor array being movable relative to the imaging lens so as to change the image distance of the imaging subsystem. The position at which the image detector/sensor must be located to image light returning from a target at a given object distance is determined by consulting a lookup table, which must be constructed ahead of time, either experimentally or by design software, well known in the art.

Use of Dynamic Focal Distance Control in the Image Formation and Detection Module The imaging subsystem in this generalized PLIIM-based system embodiment can be designed to embody a "dynamic" form of variable focal distance (i.e. focus) control, which is an advanced form of variable focus control. In conventional variable focus control schemes, one focus (i.e. focal distance) setting is established in anticipation of a given target object. The object is imaged using that setting, then another setting is selected for the next object image, if necessary. However, depending on the shape and orientation of the target object, a single target object may exhibit enough variation in its distance from the imaging lens to make it impossible for a single focus setting to acquire a sharp image of the entire object. In this case, the imaging subsystem must change its focus setting while the object is being imaged. This adjustment does not have to be made continuously; rather, a few discrete focus settings will generally be sufficient. The exact number will depend on the shape and orientation of the package being imaged and the depth of field of the imaging subsystem used in the IFD module.

It should be noted that dynamic focus control is only used with a linear image detection/sensor array, as used in the system embodiments shown in FIGS. 2A through 3J4. The reason for this limitation is quite clear: an area-type image detection array captures an entire image after a rapid number of exposures to the planar laser illumination beam, and although changing the focus setting of the imaging subsystem might clear up the image in one part of the detector array, it would induce blurring in another region of the image, thus failing to improve the overall quality of the acquired image.

First Illustrative Embodiment of the PLIIM-Based System Shown in FIG. 2A

The first illustrative embodiment of the PLIIM-based system of FIG. 2A, indicated by reference numeral 40A, is shown in FIG. 2B1. As illustrated therein, the field of view of the image formation and detection module 3' and the first and second planar laser illumination beams 7A and 7B produced by the planar illumination arrays 6A and 6B, respectively, are arranged in a substantially coplanar relationship during object illumination and image detection operations.

The PLIIM-based system illustrated in FIG. 2B1 is shown in greater detail in FIG. 2B2. As shown therein, the linear image formation and detection module 3' is shown comprising an imaging subsystem 3B', and a linear array of photoelectronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images (e.g. 6000 pixels, at a 60 MHZ scanning rate) formed thereon by the imaging subsystem 3B', providing an image resolution of 200 dpi or 8 pixels/mm, as the image resolution that results from a fixed focal length imaging lens is the function of the object distance (i.e. the longer the object distance, the lower the resolution). The imaging subsystem 3B' has a fixed focal length imaging lens (e.g. 80 mm Pentax lens, F4.5), a fixed field of view (FOV), and a variable focal distance imaging capability (e.g. 36" total scanning range), and an auto-focusing image plane with a response time of about 20–30 milliseconds over about 5 mm working range.

As shown, each planar laser illumination array (PLIA) 6A, 6B comprises a plurality of planar laser illumination modules (PLIMs) 11A through 11F, closely arranged relative to each other, in a rectilinear fashion. As taught hereinabove, the relative spacing and orientation of each PLIM 11 is such that the spatial intensity distribution of the individual planar laser beams 7A, 7B superimpose and additively produce composite planar laser illumination beam 12 having a substantially uniform power density distribution along the widthwise dimensions of the laser illumination beam, throughout the entire working range of the PLIIM-based system.

As shown in FIG. 2C1, the PLIIM system of FIG. 2B1 comprises: planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3A; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 2C2 illustrates in greater detail the structure of the IFD module 3' used in the PLIIM-based system of FIG. 2B1. As shown, the IFD module 3' comprises a variable focus fixed focal length imaging subsystem 3B' and a 1-D image detecting array 3A mounted along an optical bench 30 contained within a common lens barrel (not shown). The imaging subsystem 3B' comprises a group of stationary lens elements 3B' mounted along the optical bench before the image detecting array 3A, and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis with an optical element translator 3C in response to a first set of control signals 3E generated by the camera control computer 22, while the entire group of focal lens elements remain stationary. Alternatively, focal distance control can also be provided by moving the entire group of focal lens elements back and forth with translator 3C in response to a first set of control signals 3E generated by the camera control computer, while the 1-D image detecting array 3A remains stationary. In customized applications, it is possible for the individual lens elements in the group of focusing lens elements 3B' to be moved in response to control signals generated by the camera control computer 22. Regardless of the approach taken, an IFD module 3' with variable focus fixed focal length imaging can be realized in a variety of ways, each being embraced by the spirit of the present invention.

Second Illustrative Embodiment of the PLIIM-Based System of the Present Invention Shown in FIG. 2A The second illustrative embodiment of the PLIIM-based system of FIG. 2A, indicated by reference numeral 40B, is shown in FIG. 2D1 as comprising: an image formation and detection module 3' having an imaging subsystem 3B' with a fixed focal length imaging lens, a variable focal distance and a fixed field of view, and a linear array of photoelectronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B'; a field of view folding mirror 9 for folding the field of view of the image formation and detection module 3'; and a pair of planar laser illumination arrays 6A and 6B arranged in relation to the image formation and detection module 3' such that the field of view thereof folded by the field of view folding mirror 9 is oriented in a direction that is coplanar with the composite plane of laser illumination 12 produced by the planar illumination arrays, during object illumination and image detection operations, without using any laser beam folding mirrors.

One primary advantage of this system design is that it enables a construction having an ultra-low height profile suitable, for example, in unitary object identification and attribute acquisition systems of the type disclosed in FIGS. 17–22, wherein the image-based bar code symbol reader needs to be installed within a compartment (or cavity) of a housing having relatively low height dimensions. Also, in this system design, there is a relatively high degree of freedom provided in where the image formation and detection module 3' can be mounted on the optical bench of the system, thus enabling the field of view (FOV) folding technique disclosed in FIG. 1L1 to be practiced in a relatively easy manner.

As shown in FIG. 2D2, the PLIIM-based system of FIG. 2D1 comprises: planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3'; a field of view folding mirror 9 for folding the field of view of the image formation and detection module 3'; an image frame grabber 19 operably connected to the linear-type image formation and detection module 3', for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 2D2 illustrates in greater detail the structure of the IFD module 3' used in the PLIIM-based system of FIG. 2D1. As shown, the IFD module 3' comprises a variable focus fixed focal length imaging subsystem 3B' and a 1-D image detecting array 3A mounted along an optical bench 3D contained within a common lens barrel (not shown). The imaging subsystem 3B' comprises a group of stationary lens elements 3A' mounted along the optical bench before the image detecting array 3A', and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis with a translator 3E, in response to a first set of control signals 3E generated by the camera control computer 22, while the entire group of focal lens elements remain stationary. Alternatively, focal distance control can also be provided by moving the entire group of focal lens elements 3B' back and forth with translator 3C in response to a first set of control signals 3E generated by the camera control computer 22, while the 1-D image detecting array 3A remains stationary. In customized applications, it is possible for the individual lens elements in the group of focusing lens elements 3B' to be moved in response to control signals generated by the camera control computer. Regardless of the approach taken, an IFD module 3' with variable focus fixed focal length imaging can be realized in a variety of ways, each being embraced by the spirit of the present invention.

Third Illustrative Embodiment of the PLIIM-Based System of the Present Invention Shown in FIG. 2A The second illustrative embodiment of the PLIIM-based system of FIG. 2A, indicated by reference numeral 40C, is shown in FIG. 2D1 as comprising: an image formation and detection module 3' having an imaging subsystem 3B' with a fixed focal length imaging lens, a variable focal distance and a fixed field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B'; a pair of planar laser illumination arrays 6A and 6B for producing first and second planar laser illumination beams 7A, 7B, and a pair of planar laser beam folding mirrors 37A and 37B for folding the planes of the planar laser illumination beams produced by the pair of planar illumination arrays 6A and 6B, in a direction that is coplanar with the plane of the field of view of the image formation and detection during object illumination and image detection operations.

The primary disadvantage of this system architecture is that it requires additional optical surfaces (i.e. the planar laser beam folding mirrors) which reduce outgoing laser light and therefore the return laser light slightly. Also this embodiment requires a complicated beam/FOV adjustment scheme. Thus, this system design can be best used when the planar laser illumination beams do not have large apex angles to provide sufficiently uniform illumination. Notably, in this system embodiment, the PLIMs are mounted on the optical bench 8 as far back as possible from the beam folding mirrors 37A, 37B, and cylindrical lenses 16 with larger radiuses will be employed in the design of each PLIM 11.

As shown in FIG. 2E2, the PLIIM-based system of FIG. 2E1 comprises: planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3'; a field of view folding mirror 9 for folding the field of view of the image formation and detection module 3'; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 2E3 illustrates in greater detail the structure of the IFD module 3' used in the PLIIM-based system of FIG. 2E1. As shown, the IFD module 3' comprises a variable focus fixed focal length imaging subsystem 3B' and a 1-D image detecting array 3A mounted along an optical bench 3D contained within a common lens barrel (not shown). The imaging subsystem 3B' comprises a group of stationary lens elements 3A1 mounted along the optical bench before the image detecting array 3A, and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis in response to a first set of control signals 3E generated by the camera control computer 22, while the entire group of focal lens elements 3B' remain stationary. Alternatively, focal distance control can also be provided by moving the entire group of focal lens elements 3B' back and forth with translator 3C in response to a first set of control signals 3E generated by the camera control computer 22, while the 1-D image detecting array 3A remains stationary. In customized applications, it is possible for the individual lens elements in the group of focusing lens elements 3B' to be moved in response to control signals generated by the camera control computer 22. Regardless of the approach taken, an IFD module 3' with variable focus fixed focal length imaging can be realized in a variety of ways, each being embraced by the spirit of the present invention.

Fourth Illustrative Embodiment of the PLIIM-Based System of the Present Invention Shown in FIG. 2A The fourth illustrative embodiment of the PLIIM-based system of FIG. 2A, indicated by reference numeral 40D, is shown in FIG. 2F1 as comprising: an image formation and detection module 3' having an imaging subsystem 3B' with a fixed focal length imaging lens, a variable focal distance and a fixed field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B'; a field of view folding mirror 9 for folding the FOV of the imaging subsystem 3B'; a pair of planar laser illumination arrays 6A and 6B for producing first and second planar laser illumination beams; and a pair of planar laser beam folding mirrors 37A and 37B arranged in relation to the planar laser illumination arrays 6A and 6B so as to fold the optical paths of the first and second planar laser illumination beams 7A, 7B in a direction that is coplanar with the folded FOV of the image formation and detection module 3', during object illumination and image detection operations.

As shown in FIG. 2F2, the PLIIM system 40D of FIG. 2F1 further comprises: planar laser illumination arrays 6A and 6B, each having a plurality of planar laser illumination modules 11A through 11B, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3'; a field of view folding mirror 9 for folding the field of view of the image formation and detection module 3'; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 2F3 illustrates in greater detail the structure of the IFD module 3' used in the PLIIM-based system of FIG. 2F1. As shown, the IFD module 3' comprises a variable focus fixed focal length imaging subsystem 3B' and a 1-D image detecting array 3A mounted along an optical bench 3D contained within a common lens barrel (not shown). The imaging subsystem 3B' comprises a group of stationary lens elements 3A1 mounted along the optical bench 3D before the image detecting array 3A, and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis with translator 3C in response to a first set of control signals 3E generated by the camera control computer 22, while the entire group of focal lens elements 3B' remain stationary. Alternatively, focal distance control can also be provided by moving the entire group of focal lens elements 3B' back and forth with translator 3C in response to a first set of control signals 3E generated by the camera control computer 22, while the 1-D image detecting array 3A remains stationary. In customized applications, it is possible for the individual lens elements in the group of focusing lens elements 3B' to be moved in response to control signals generated by the camera control computer 22. Regardless of the approach taken, an IFD module with variable focus fixed focal length imaging can be realized in a variety of ways, each being embraced by the spirit of the present invention.

Applications for the Third Generalized Embodiment of the PLIIM-Based System of the Present Invention, and the Illustrative Embodiments Thereof As the PLIIM-based systems shown in FIGS. 2A through 2F3 employ an IFD module 3' having a linear image detecting array and an imaging subsystem having variable focus (i.e. focal distance) control, such PLIIM-based systems are good candidates for use in a conveyor top scanner application, as shown in FIG. 2G, as the variation in target object distance can be up to a meter or more (from the imaging subsystem). In general, such object distances are too great a range for the depth of field (DOF) characteristics of the imaging subsystem alone to accommodate such object distance parameter variations during object illumination and imaging operations. Provision for variable focal distance control is generally sufficient for the conveyor top scanner application shown in FIG. 2G, as the demands on the depth of field and variable focus or dynamic focus control characteristics of such PLIIM-based system are not as severe in the conveyor top scanner application, as they might be in the conveyor side scanner application, also illustrated in FIG. 2G.

Notably, by adding dynamic focusing functionality to the imaging subsystem of any of the embodiments shown in FIGS. 2A through 2F3, the resulting PLIIM-based system becomes appropriate for the conveyor side-scanning application discussed above, where the demands on the depth of field and variable focus or dynamic focus requirements are greater compared to a conveyor top scanner application.

Fourth Generalized Embodiment of the PLIIM System of the Present Invention

The fourth generalized embodiment of the PLIIM-based system 40' of the present invention is illustrated in FIGS. 2I1 and 2I2. As shown in FIG. 2I1, the PLIIM-based system 40' comprises: a housing 2 of compact construction; a linear (i.e. 1-dimensional) type image formation and detection (IFD) module 3'; and a pair of planar laser illumination arrays (PLIAs) 6A and 6B mounted on opposite sides of the IFD module 3'. During system operation, laser illumination arrays 6A and 6B each produce a moving planar laser illumination beam 12' which synchronously moves and is disposed substantially coplanar with the field of view (FOV) of the image formation and detection module 3', so as to scan a bar code symbol or other graphical structure 4 disposed stationary within a 3-D scanning region.

As shown in FIGS. 2I2 and 2I3, the PLIIM-based system of FIG. 2I1 comprises: an image formation and detection module 3' having an imaging subsystem 3B' with a fixed focal length imaging lens, a variable focal distance and a fixed field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B'; a field of view folding and sweeping mirror 9' for folding and sweeping the field of view 10 of the image formation and detection module 3'; a pair of planar laser illumination arrays 6A and 6B for producing planar laser illumination beams 7A and 7B, wherein each VLD 11 is driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; a pair of planar laser illumination beam sweeping mirrors 37A' and 37B' for folding and sweeping the planar laser illumination beams 7A and 7B, respectively, in synchronism with the FOV being swept by the FOV folding and sweeping mirror 9'; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner. As shown in FIG. 2F2, each planar laser illumination module 11A through 11F, is driven by a VLD driver circuit 18 under the camera control computer 22. Notably, laser illumination beam folding/sweeping mirrors 37A' and 37B', and FOV folding/sweeping mirror 9' are each rotatably driven by a motor-driven mechanism 39A, 39B, 38, respectively, operated under the control of the camera control computer 22. These three mirror elements can be synchronously moved in a number of different ways. For example, the mirrors 37A', 37B' and 9' can be jointly rotated together under the control of one or more motor-driven mechanisms, or each mirror element can be driven by a separate driven motor which are synchronously controlled to enable the composite planar laser illumination beam and FOV to move together in a spatially-coplanar manner during illumination and detection operations within the PLIIM system.

FIG. 2I4 illustrates in greater detail the structure of the IFD module 3' used in the PLIIM-based system of FIG. 2I1. As shown, the IFD module 3' comprises a variable focus fixed focal length imaging subsystem 3B' and a 1-D image detecting array 3A mounted along an optical bench 3D contained within a common lens barrel (not shown). The imaging subsystem 3B' comprises a group of stationary lens elements 3A1 mounted along the optical bench before the image detecting array 3A, and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis in response to a first set of control signals 3E generated by the camera control computer 22, while the entire group of focal lens elements 3B' remain stationary. Alternatively, focal distance control can also be provided by moving the entire group of focal lens elements 3B' back and forth with a translator 3C in response to a first set of control signals 3E generated by the camera control computer 22, while the 1-D image detecting array 3A remains stationary. In customized applications, it is possible for the individual lens elements in the group of focusing lens elements 3B' to be moved in response to control signals generated by the camera control computer 22. Regardless of the approach taken, an IFD module 3' with variable focus fixed focal length imaging can be realized in a variety of ways, each being embraced by the spirit of the present invention.

In accordance with the present invention, the planar laser illumination arrays 6A and 6B, the linear image formation and detection module 3', the folding/sweeping FOV mirror 9', and the planar laser illumination beam folding/sweeping mirrors 37A' and 37B' employed in this generalized system embodiment, are fixedly mounted on an optical bench or chassis 8 so as to prevent any relative motion (which might be caused by vibration or temperature changes) between: (i) the image forming optics (e.g. imaging lens) within the image formation and detection module 3' and the FOV folding/sweeping mirror 9' employed therewith; and (ii) each planar laser illumination module (i.e. VLD/cylindrical lens assembly) and the planar laser illumination beam folding/sweeping mirrors 37A' and 37B' employed in this PLIIM-based system configuration. Preferably, the chassis assembly should provide for easy and secure alignment of all optical components employed in the planar laser illumination arrays 6A and 6B, beam folding/sweeping mirrors 37A' and 37B', the image formation and detection module 3' and FOV folding/sweeping mirror 9', as well as be easy to manufacture, service and repair. Also, this generalized PLIIM system embodiment 40' employs the general "planar laser illumination" and "focus beam at farthest object distance (FBAFOD)" principles described above.

Applications for the Fourth Generalized Embodiment of the PLIIM-Based System of the Present Invention As the PLIIM-based systems shown in FIGS. 2I1 through 2I4 employ (i) an IFD module having a linear image detecting array and an imaging subsystem having variable focus (i.e. focal distance) control, and (ii) a mechanism for automatically sweeping both the planar (2-D) FOV and planar laser illumination beam through a 3-D scanning field in an "up and down" pattern while maintaining the inventive principle of "laser-beam/FOV coplanarity" disclosed herein, such PLIIM-based systems are good candidates for use in a hand-held scanner application, shown in FIG. 2I5, and the hands-free presentation scanner application illustrated in FIG. 2I6. The provision of variable focal distance control in these illustrative PLIIM-based systems is most sufficient for the hand-held scanner application shown in FIG. 2I5, and presentation scanner application shown in FIG. 2I6, as the demands placed on the depth of field and variable focus control characteristics of such systems will not be severe.

Fifth Generalized Embodiment of the PLIIM-Based System of the Present Invention

The fifth generalized embodiment of the PLIIM-based system of the present invention, indicated by reference numeral 50, is illustrated in FIG. 3A. As shown therein, the PLIIM system 50 comprises: a housing 2 of compact construction; a linear (i.e. 1-dimensional) type image formation and detection (IFD) module 3" including a 1-D electronic image detection array 3A, a linear (1-D) imaging subsystem (LIS) 3B" having a variable focal length, a variable focal distance, and a variable field of view (FOV), for forming a 1-D image of an illuminated object located within the fixed focal distance and FOV thereof and projected onto the 1-D image detection array 3A, so that the 1-D image detection array 3A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 3", such that each planar laser illumination array 6A and 6B produces a plane of laser beam illumination 7A, 7B which is disposed substantially coplanar with the field view of the image formation and detection module 3" during object illumination and image detection operations carried out by the PLIIM-based system.

In the PLIIM-based system of FIG. 3A, the linear image formation and detection (IFD) module 3" has an imaging lens with a variable focal length (i.e. a zoom-type imaging lens) 3B1, that has a variable angular field of view (FOV); that is, the farther the target object is located from the IFD module, the larger the projection dimensions of the imaging subsystem's FOV become on the surface of the target object. A zoom imaging lens is capable of changing its focal length, and therefore its angular field of view (FOV) by moving one or more of its component lens elements. The position at which the zooming lens element(s) must be in order to achieve a given focal length is determined by consulting a lookup table, which must be constructed ahead of time either experimentally or by design software, in a manner well known in the art. An advantage to using a zoom lens is that the resolution of the image that is acquired, in terms of pixels or dots per inch, remains constant no matter what the distance from the target object to the lens. However, a zoom camera lens is more difficult and more expensive to design and produce than the alternative, a fixed focal length camera lens.

The image formation and detection (IFD) module 3" in the PLIIM-based system of FIG. 3A also has an imaging lens 3B2 with variable focal distance, which can adjust its image distance to compensate for a change in the target's object distance. Thus, at least some of the component lens elements in the imaging subsystem 3B2 are movable, and the depth of field (DOF) of the imaging subsystem does not limit the ability of the imaging subsystem to accommodate possible object distances and orientations. This variable focus imaging subsystem 3B2 is able to move its components in such a way as to change the image distance of the imaging lens to compensate for a change in the target's object distance, thus preserving good image focus no matter where the target object might be located. This variable focus technique can be practiced in several different ways, namely: by moving lens elements in the imaging subsystem; by moving the image detection/sensing array relative to the imaging lens; and by dynamic focus control. Each of these different methods has been described in detail above.

In accordance with the present invention, the planar laser illumination arrays 6A and 6B the image formation and detection module 3" are fixedly mounted on an optical bench or chassis assembly 8 so as to prevent any relative motion between (i) the image forming optics (e.g. camera lens) within the image formation and detection module 3" and (ii) each planar laser illumination module (i.e. VLD/cylindrical lens assembly) employed in the PLIIM-based system which might be caused by vibration or temperature changes. Preferably, the chassis assembly should provide for easy and secure alignment of all optical components employed in the planar laser illumination arrays 6A and 6B as well as the image formation and detection module 3", as well as be easy to manufacture, service and repair. Also, this PLIIM-based system employs the general "planar laser illumination" and "FBAFOD" principles described above.

First Illustrative Embodiment of the PLIIM-Based System of the Present Invention Shown in FIG. 3B1

The first illustrative embodiment of the PLIIM-Based system of FIG. 3A, indicated by reference numeral 50A, is shown in FIG. 3B1. As illustrated therein, the field of view of the image formation and detection module 3" and the first and second planar laser illumination beams 7A and 7B produced by the planar illumination arrays 6A and 6B, respectively, are arranged in a substantially coplanar relationship during object illumination and image detection operations.

The PLIIM-based system 50A illustrated in FIG. 3B1 is shown in greater detail in FIG. 3B2. As shown therein, the linear image formation and detection module 3" is shown comprising an imaging subsystem 3B", and a linear array of photo-electronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B". The imaging subsystem 3B" has a variable focal length imaging lens, a variable focal distance and a variable field of view. As shown, each planar laser illumination array 6A, 6B comprises a plurality of planar laser illumination modules (PLIMs) 11A through 11F, closely arranged relative to each other, in a rectilinear fashion. As taught hereinabove, the relative spacing of each PLIM 11 in the illustrative embodiment is such that the spatial intensity distribution of the individual planar laser beams superimpose and additively provide a composite planar case illumination beam having substantially uniform composite spatial intensity distribution for the entire planar laser illumination array 6A and 6B.

As shown in FIG. 3C1, the PLIIM-based system 50A of FIG. 3B1 comprises: planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3"; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 3C2 illustrates in greater detail the structure of the IFD module 3" used in the PLIIM-based system of FIG. 3B1. As shown, the IFD module 3" comprises a variable focus variable focal length imaging subsystem 3B" and a 1-D image detecting array 3A mounted along an optical bench 3D contained within a common lens barrel (not shown). In general, the imaging subsystem 3B' comprises: a first group of focal lens elements 3A1 mounted stationary relative to the image detecting array 3A; a second group of lens elements 3B2, functioning as a focal lens assembly, movably mounted along the optical bench in front of the first group of stationary lens elements 3A1; and a third group of lens elements 3B1, functioning as a zoom lens assembly, movably mounted between the second group of focal lens elements and the first group of stationary focal lens elements 3A1. In a non-customized application, focal distance control can also be provided by moving the second group of focal lens elements 3B2 back and forth with translator 3C1 in response to a first set of control signals generated by the camera control computer 22, while the 1-D image detecting array 3A remains stationary. Alternatively, focal distance control can be provided by moving the 1-D image detecting array 3A back and forth along the optical axis with translator 3C1 in response to a first set of control signals 3E2 generated by the camera control computer 22, while the second group of focal lens elements 3B2 remain stationary. For zoom control (i.e. variable focal length control), the focal lens elements in the third group 3B2 are typically moved relative to each other with translator 3C1 in response to a second set of control signals 3E2 generated by the camera control computer 22. Regardless of the approach taken in any particular illustrative embodiment an IFD module with variable focus variable focal length imaging can be realized in a variety of ways, each being embraced by the spirit of the present invention.

A first preferred implementation of the image formation and detection (IFD) subsystem of FIG. 3C2 is shown in FIG. 3D1. As shown in FIG. 3D1, IFD subsystem 3" comprises: an optical bench 3D having a pair of rails, along which mounted optical elements are translated; a linear CCD-type image detection array 3A (e.g. Piranha Model Nos. CT-P4, or CL-P4 High-Speed CCD Line Scan Camera, from Dalsa, Inc. USA—http://www.dalsa.com) fixedly mounted to one end of the optical bench; a system of stationary lenses 3A1 fixedly mounted before the CCD-type linear image detection array 3A; a first system of movable lenses 3B1 slidably mounted to the rails of the optical bench 3D by a set of ball bearings, and designed for stepped movement relative to the stationary lens subsystem 3A1 with translator 3C1 in automatic response to a first set of control signals 3E1 generated by the camera control computer 22; and a second system of movable lenses 3B2 slidably mounted to the rails of the optical bench by way of a second set of ball bearings, and designed for stepped movements relative to the first system of movable lenses 3B with translator 3C2 in automatic response to a second set of control signals 3D2 generated by the camera control computer 22. As shown in FIG. 3D, a large stepper wheel 42 driven by a zoom stepper motor 43 engages a portion of the zoom lens system 3B1 to move the same along the optical axis of the stationary lens system 3A1 in response to control signals 3C1 generated from the camera control computer 22. Similarly, a small stepper wheel 44 driven by a focus stepper motor 46 engages a portion of the focus lens system 3B2 to move the same along the optical axis of the stationary lens system 3A1 in response to control signals 3E2 generated from the camera control computer 22.

A second preferred implementation of the IFD subsystem of FIG. 3C2 is shown in FIGS. 3D2 and 3D3. As shown in FIGS. 3D2 and 3D3, IFD subsystem 3" comprises: an optical bench (i.e. camera body) 400 having a pair of side rails 401A and 401B, along which mounted optical elements are translated; a linear CCD-type image detection array 3A (e.g. Piranha Model Nos. CT-P4, or CL-P4 High-Speed CCD Line Scan Camera, from Dalsa, Inc. USA—http://www.dalsa.com) rigidly mounted to a heat sinking structure 1100 and the rigidly connected camera body 400, using the image sensor chip mounting arrangement illustrated in FIGS. 3D4 through 3D7, and described in detail hereinbelow; a system of stationary lenses 3A1 fixedly mounted before the CCD-type linear image detection array 3A; a first movable (zoom) lens system 402 including a first electrical rotary motor 403 mounted to the camera body 400, an arm structure 404 mounted to the shaft of the motor 403, a first lens mounting fixture 405 (supporting a zoom lens group) 406 slidably mounted to camera body on first rail structure 401A, and a first linkage member 407 pivotally connected to a first slidable lens mount 408 and the free end of the first arm structure 404 so that as the first motor shaft rotates, the first slidable lens mount 405 moves along the optical axis of the imaging optics supported within the camera body; a second movable (focus) lens system 410 including a second electrical rotary motor 411 mounted to the camera body 400, a second arm structure 412 mounted to the shaft of the second motor 411, a second lens mounting fixture 413 (supporting a focal lens group 414) slidably mounted to the camera body on a second rail structure 401B, and a second linkage member 415 pivotally connected to a second slidable lens mount 416 and the free end of the second arm structure 412 so that as the second motor shaft rotates, the second slidable lens mount 413 moves along the optical axis of the imaging optics supported within the camera body. Notably, the first system of movable lenses 406 are designed to undergo relative small stepped movement relative to the stationary lens subsystem 3A1 in automatic response to a first set of control signals 3E1 generated by the camera control computer 22 and transmitted to the first electrical motor 403. The second system of movable lenses 414 are designed to undergo relatively larger stepped movements relative to the first system of movable lenses 406 in automatic response to a second set of control signals 3D2 generated by the camera control computer 22 and transmitted to the second electrical motor 411.

Method of and Apparatus for Mounting a Linear Image Sensor Chip Within a PLIIM-Based System to Prevent Misalignment Between the Field of View (FOV) of Said Linear Image Sensor Chip and the Planar Laser Illumination Beam (PLIB) Used Therewith, in Response to Thermal Expansion or Cycling Within Said PLIIM-Based System When using a planar laser illumination beam (PLIB) to illuminate the narrow field of view (FOV) of a linear image detection array, even the smallest of misalignment errors between the FOV and the PLIB can cause severe errors in performance within the PLIIM-based system. Notably, as the working/object distance of the PLIIM-based system is made longer, the sensitivity of the system to such FOV/PLIB misalignment errors markedly increases. One of the major causes of such FOV/PLIB misalignment errors is thermal cycling within the PLIIM-based system. As materials used within the PLIIM-based system expand and contract in response to increases and decreases in ambient temperature, the physical structures which serve to maintain alignment between the FOV and PLIB move in relation to each other. If the movement between such structures becomes significant, then the PLIB may not illuminate the narrow field of view (FOV) of the linear image detection array, causing dark levels to be produced in the images captured by the system without planar laser illumination. In order to mitigate such misalignment problems, the camera subsystem (i.e. IFD module) of the present invention is provided with a novel linear image sensor chip mounting arrangement which helps maintain precise alignment between the FOV of the linear image sensor chip and the PLIB used to illuminate the same. Details regarding this mounting arrangement will be described below with reference to FIGS. 3D4 through 3D7.

As shown in FIG. 3D3, the camera subsystem further comprises: heat sinking structure 1100 to which the linear image sensor chip 3A and camera body 400 are rigidly mounted; a camera PC electronics board 1101 for supporting a socket 1108 into which the linear image sensor chip 3A is connected, and providing all of the necessary functions required to operate the linear CCD image sensor chip 3A, and capture high-resolution linear digital images therefrom for buffering, storage and processing.

As best illustrated in FIG. 3D4, the package of the image sensor chip 3A is rigidly mounted and thermally coupled to the back plate 1102 of the heat sinking structure 1100 by a releasable image sensor chip fixture subassembly 1103 which is integrated with the heat sinking structure 1100. The primary function of this image sensor chip fixture subassembly 1103 is to prevent relative movement between the image sensor chip 3A and the heat sinking structure 1100 and camera body 400 during thermal cycling within the PLIIM-based system. At the same time, the image sensor chip fixture subassembly 1103 enables the electrical connector pins 1104 of the image sensor chip to pass freely through four sets of apertures 1105A through 1105D formed through the back plate 1102 of the heat sinking structure, as shown in FIG. 3D5, and establish secure electrical connection with electrical contacts 1107 contained within a matched electrical socket 1108 mounted on the camera PC electronics board 1101, shown in greater detail in FIG. 3D6. As shown in FIGS. 3D4 and 3D7, the camera PC electronics board 1101 is mounted to the heat sinking structure 1100 in a manner which permits relative expansion and contraction between the camera PC electronics board 1101 and heat sinking structure 1100 during thermal cycling. Such mounting techniques may include the use of screws or other fastening devices known in the art.

As shown in FIG. 3D5, the releasable image sensor chip fixture subassembly 1103 comprises a number of subcomponents integrated on the heat sinking structure 1100, namely: a set of chip fixture plates 1109, mounted at about 45 degrees with respect to the back plate 1102 of the heat sinking structure, adapted to clamp one side edge of the package of the linear image sensor chip 3A as it is pushed down into chip mounting slot 1110 (provided by clearing away a rectangular volume of space otherwise occupied by heat exchanging fins 1111 protruding from the back plate 1102), and permit the electrical connector pins 1104 extending from the image sensor chip 3A to pass freely through apertures 1105A through 1105D formed through the back plate 1102; and a set of spring-biased chip clamping pins 1112A and 1112B, mounted opposite the chip fixture plates 1109A and 1109B, for releasably clamping the opposite side of the package of the linear image sensor chip 3A when it is pushed down into place within the chip mounting slot 1110, and securely and rigidly fixing the package of the linear image sensor chip 3A (and thus image detection elements therewithin) relative to the heat sinking structure 1100 and thus the camera body 400 and all of the optical lens components supported therewithin.

As shown in FIG. 3D7, when the linear image sensor chip 3A is mounted within its chip mounting slot 1110, in accordance with the principles of the present invention, the electrical connector pins 1104 of the image sensor chip are freely passed through the four sets of apertures 1105A through 1105D formed in the back plate of the heat sinking structure, while the image sensor chip package 3A is rigidly fixed to the camera system body, via its heat sinking structure. When so mounted, the image sensor chip 3A is not permitted to undergo any significant relative movement with respect to the heat sinking structure and camera body 400 during thermal cycling. However, the camera PC electronics board 1101 may move relative to the heat sinking structure and camera body 400, in response to thermal expansion and contraction during cycling. The result is that the image sensor chip mounting technique of the present invention prevents any misalignment between the field of view (FOV) of the image sensor chip and the PLIA produced by the PLIA within the camera subsystem, thereby improving the performance of the PLIIM-based system during planar laser illumination and imaging operations.

Method of Adjusting the Focal Characteristics of the Planar Laser Illumination Beams (PLIBs) Generated by Planar Laser Illumination Arrays (PLIAs) Used in Conjunction With Image Formation and Detection (IFD) Modules Employing Variable Focal Length (Zoom) Imaging Lenses Unlike the fixed focal length imaging lens case, there occurs a significant a $1/r^2$ drop-off in laser return light intensity at the image detection array when using a zoom (variable focal length) imaging lens in the PLIIM-based system hereof. In PLIIM-based system employing an imaging subsystem having a variable focal length imaging lens, the area of the imaging subsystem's field of view (FOV) remains constant as the working distance increases. Such variable focal length control is used to ensure that each image formed and detected by the image formation and detection (IFD) module 3" has the same number of "dots per inch" (DPI) resolution, regardless of the distance of the target object from the IFD module 3". However, since module's field of view does not increase in size with the object distance, equation (8) must be rewritten as the equation (10) set forth below $$E_{ccd}^{zoom} = \frac{E_0 f^2 s^2}{8 d^2 F^2 r^2} \quad (10)$$

where $s^2$ is the area of the field of view and $d^2$ is the area of a pixel on the image detecting array. This expression is a strong function of the object distance, and demonstrates $1/r^2$ drop off of the return light. If a zoom lens is to be used, then it is desirable to have a greater power density at the farthest object distance than at the nearest, to compensate for this loss. Again, focusing the beam at the farthest object distance is the technique that will produce this result.

Therefore, in summary, where a variable focal length (i.e. zoom) imaging subsystem is employed in the PLIIM-based system, the planar laser beam focusing technique of the present invention described above helps compensate for (i) decreases in the power density of the incident illumination beam due to the fact that the width of the planar laser illumination beam increases for increasing distances away from the imaging subsystem, and (ii) any $1/r^2$ type losses that would typically occur when using the planar laser planar illumination beam of the present invention.

Second Illustrative Embodiment of the PLIIM-Based System of the Present Invention Shown in FIG. 3A The second illustrative embodiment of the PLIIM-based system of FIG. 3A, indicated by reference numeral 50B, is shown in FIG. 3E1 as comprising: an image formation and detection module 3" having an imaging subsystem 3B with a variable focal length imaging tens, a variable focal distance and a variable field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B"; a field of view folding mirror 9 for folding the field of view of the image formation and detection module 3"; and a pair of planar laser illumination arrays 6A and 6B arranged in relation to the image formation and detection module 3" such that the field of view thereof folded by the field of view folding mirror 9 is oriented in a direction that is coplanar with the composite plane of laser illumination 12 produced by the planar illumination arrays, during object illumination and image detection operations, without using any laser beam folding mirrors.

As shown in FIG. 3E2, the PLIIM-based system of FIG. 3E1 comprises: planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3A; a field of view folding mirror 9' for folding the field of view of the image formation and detection module 3"; an image frame grabber 19 operably connected to the linear-type image formation and detection module 3", for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21 operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 3E3 illustrates in greater detail the structure of the IFD module 3" used in the PLIIM-based system of FIG. 3E1. As shown, the IFD module 3" comprises a variable focus variable focal length imaging subsystem 3B" and a 1-D image detecting array 3A mounted along an optical bench 3D contained within a common lens barrel (not shown). In general, the imaging subsystem 3B" comprises: a first group of focal lens elements 3A1 mounted stationary relative to the image detecting array 3A; a second group of lens elements 3B2, functioning as a focal lens assembly, movably mounted along the optical bench in front of the first group of stationary lens elements 3A; and a third group of lens elements 3B1, functioning as a zoom lens assembly, movably mounted between the second group of focal lens elements and the first group of stationary focal lens elements 3B2. In a non-customized application, focal distance control can also be provided by moving the second group of focal lens elements 3B2 back and forth with translator 3C2 in response to a first set of control signals 3E2 generated by the camera control computer 22, while the 1-D image detecting array 3A remains stationary. Alternatively, focal distance control can be provided by moving the 1-D image detecting array 3A back and forth along the optical axis with translator 3C2 in response to a first set of control signals 3E2 generated by the camera control computer 22, while the second group of focal lens elements 3B2 remain stationary. For zoom control (i.e. variable focal length control), the focal lens elements in the third group 3B1 are typically moved relative to each other with translator 3C1 in response to a second set of control signals 3E1 generated by the camera control computer 22. Regardless of the approach taken in any particular illustrative embodiment, an IFD module 3" with variable focus variable focal length imaging can be realized in a variety of ways, each being embraced by the spirit of the present invention.

Detailed Description of an Exemplary Realization of the PLIIM-Based System Shown in FIG. 3E1 Through 3E3

Referring now to FIGS. 3E4 through 3E8, an exemplary realization of the PLIIM-based system, indicated by reference numeral 50B, shown in FIGS. 3E1 through 3E3 will now be described in detail below.

As shown in FIGS. 3E41 and 3E5, an exemplary realization of the PLIIM-based system 50B shown in FIGS. 3E1–3E3 is indicated by reference numeral 25' contained within a compact housing 2 having height, length and width dimensions of about 4.5", 21.7" and 19.7", respectively, to enable easy mounting above a conveyor belt structure or the like. As shown in FIG. 3E4, 3E5 and 3E6, the PLIIM-based system comprises a linear image formation and detection module 3", a pair of planar laser illumination arrays 6A, and 6B, and a field of view (FOV) folding structure (e.g. mirror, refractive element, or diffractive element) 9. The function of the FOV folding mirror 9 is to fold the field of view (FOV) 10 of the image formation and detection module 3" in an imaging direction that is coplanar with the plane of laser illumination beams (PLIBs) 7A and 7B produced by the planar illumination arrays 6A and 6B. As shown, these components are fixedly mounted to an optical bench 8 supported within the compact housing 2 so that these optical components are forced to oscillate together. The linear CCD imaging array 3A can be realized using a variety of commercially available high-speed line-scan camera systems such as, for example, the Piranha Model Nos. CT-P4, or CL-P4 High-Speed CCD Line Scan Camera, from Dalsa, Inc. USA—http://www.dalsa.com. Notably, image frame grabber 19, image data buffer (e.g. VRAM) 20, image processing computer 21, and camera control computer 22 are realized on one or more printed circuit (PC) boards contained within a camera and system electronic module 27 also mounted on the optical bench, or elsewhere in the system housing 2.

As shown in FIG. 3E6, a stationary cylindrical lens array 299 is mounted in front of each PLIA (6A, 6B) adjacent the illumination window formed within the optics bench 8 of the PLIIM-based system 25'. The function performed by cylindrical lens array 299 is to optically combine the individual PLIB components produced from the PLIMs constituting the PLIA, and project the combined PLIB components onto points along the surface of the object being illuminated. By virtue of this inventive feature, each point on the object surface being imaged will be illuminated by different sources of laser illumination located at different points in space (i.e. spatially coherent-reduced laser illumination), thereby reducing the RMS power of speckle-pattern noise observable at the linear image detection array of the PLIIM-based system.

While this system design requires additional optical surfaces (i.e. planar laser beam folding mirrors) which complicates laser-beam/FOV alignment, and attenuates slightly the intensity of collected laser return light, this system design will be beneficial when the FOV of the imaging subsystem cannot have a large apex angle, as defined as the angular aperture of the imaging lens (in the zoom lens assembly), due to the fact that the IFD module 3" must be mounted on the optical bench in a backed-off manner to the conveyor belt (or maximum object distance plane), and a longer focal length lens (or zoom lens with a range of longer focal lengths) is chosen.

One notable advantage of this system design is that it enables a construction having an ultra-low height profile suitable, for example, in unitary object identification and attribute acquisition systems of the type disclosed in FIGS. 17–22, wherein the image-based bar code symbol reader needs to be installed within a compartment (or cavity) of a housing having relatively low height dimensions. Also, in this system design, there is a relatively high degree of freedom provided in where the image formation and detection module 3" can be mounted on the optical bench of the system, thus enabling the field of view (FOV) folding technique disclosed in FIG. 1L1 to be practiced in a relatively easy manner.

As shown in FIG. 3E4, the compact housing 2 has a relatively long light transmission window 28 of elongated dimensions for the projecting the FOV 10 of the image formation and detection module 3" through the housing towards a predefined region of space outside thereof, within which objects can be illuminated and imaged by the system components on the optical bench. Also, the compact housing 2 has a pair of relatively short light transmission apertures 30A and 30B, closely disposed on opposite ends of light transmission window 28, with minimal spacing therebetween, as shown in FIG. 3E4. Such spacing is to ensure that the FOV emerging from the housing 2 can spatially overlap in a coplanar manner with the substantially planar laser illumination beams projected through transmission windows 29A and 29B, as close to transmission window 28 as desired by the system designer, as shown in FIGS. 3E6 and 3E7. Notably, in some applications, it is desired for such coplanar overlap between the FOV and planar laser illumination beams to occur very close to the light transmission windows 28, 29A and 29B (i.e. at short optical throw distances), but in other applications, for such coplanar overlap to occur at large optical throw distances.

In either event, each planar laser illumination array 6A and 6B is optically isolated from the FOV of the image formation and detection module 3" to increase the signal-to-noise ratio (SNR) of the system. In the preferred embodiment, such optical isolation is achieved by providing a set of opaque wall structures 30A, 30B about each planar laser illumination array, extending from the optical bench 8 to its light transmission window 29A or 29B, respectively. Such optical isolation structures prevent the image formation and detection module 3" from detecting any laser light transmitted directly from the planar laser illumination arrays 6A and 6B within the interior of the housing. Instead, the image formation and detection module 3" can only receive planar laser illumination that has been reflected off an illuminated object, and focused through the imaging subsystem 3B" of the IFD module 3".

Notably, the linear image formation and detection module of the PLIIM-based system of FIG. 3E4 has an imaging subsystem 3B" with a variable focal length imaging lens, a variable focal distance, and a variable field of view. In FIG. 3E8, the spatial limits for the FOV of the image formation and detection module are shown for two different scanning conditions, namely: when imaging the tallest package moving on a conveyor belt structure; and when imaging objects having height values close to the surface of the conveyor belt structure. In a PLIIM system having a variable focal length imaging lens and a variable focusing mechanism, the PLIIM system would be capable of imaging at either of the two conditions indicated above.

In order that PLLIM-based subsystem 25' can be readily interfaced to and an integrated (e.g. embedded) within various types of computer-based systems, as shown in FIGS. 9 through 34C, subsystem 25' also comprises an I/O subsystem 500 operably connected to camera control computer 22 and image processing computer 21, and a network controller 501 for enabling high-speed data communication with others computers in a local or wide area network using packet-based networking protocols (e.g. Ethernet, AppleTalk, etc.) well known in the art.

Third Illustrative Embodiment of the PLIIM-Based System of the Present Invention Shown in FIG. 3A The third illustrative embodiment of the PLIIM-based system of FIG. 3A, indicated by reference numeral 50C, is shown in FIG. 3F1 as comprising: an image formation and detection module 3" having an imaging subsystem 3B" with a variable focal length imaging lens, a variable focal distance and a variable field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B"; a pair of planar laser illumination arrays 6A and 6B for producing first and second planar laser illumination beams (PLIBs) 7A and 7B, respectively; and a pair of planar laser beam folding mirrors 37A and 37B for folding the planes of the planar laser illumination beams produced by the pair of planar illumination arrays 6A and 6B, in a direction that is coplanar with the plane of the FOV of the image formation and detection module 3" during object illumination and imaging operations.

One notable disadvantage of this system architecture is that it requires additional optical surfaces (i.e. the planar laser beam folding mirrors) which reduce outgoing laser light and therefore the return laser light slightly. Also this system design requires a more complicated beam/FOV adjustment scheme than the direct-viewing design shown in FIG. 3B1. Thus, this system design can be best used when the planar laser illumination beams do not have large apex angles to provide sufficiently uniform illumination. Notably, in this system embodiment, the PLIMs are mounted on the optical bench as far back as possible from the beam folding mirrors 37A and 37B, and cylindrical lenses 16 with larger radiuses will be employed in the design of each PLIM 11A through 11P.

As shown in FIG. 3F2, the PLIIM-based system of FIG. 3F1 comprises: planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3A; a pair of planar laser illumination beam folding mirrors 37A and 37B, for folding the planar laser illumination beams 7A and 7B in the imaging direction; an image frame grabber 19 operably connected to the linear-type image formation and detection module 3", for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 3F3 illustrates in greater detail the structure of the IFD module 3" used in the PLIIM-based system of FIG. 3F1. As shown, the IFD module 3" comprises a variable focus variable focal length imaging subsystem 3B" and a 1-D image detecting array 3A mounted along an optical bench 3D contained within a common lens barrel (not shown). In general, the imaging subsystem 3B' comprises: a first group of focal lens elements 3A' mounted stationary relative to the image detecting array 3A; a second group of lens elements 3B2, functioning as a focal lens assembly, movably mounted along the optical bench 3D in front of the first group of stationary lens elements 3A1; and a third group of lens elements 3B1, functioning as a zoom lens assembly, movably mounted between the second group of focal lens elements and the first group of stationary focal lens elements 3A1. In a non-customized application, focal distance control can also be provided by moving the second group of focal lens elements 3B2 back and forth in response to a first set of control signals generated by the camera control computer, while the 1-D image detecting array 3A remains stationary. Alternatively, focal distance control can be provided by moving the 1-D image detecting array 3A back and forth along the optical axis with translator in response to a first set of control signals 3E2 generated by the camera control computer 22, while the second group of focal lens elements 3B2 remain stationary. For zoom control (i.e. variable focal length control), the focal lens elements in the third group 3B1 are typically moved relative to each other with translator 3C1 in response to a second set of control signals 3E1 generated by the camera control computer 22. Regardless of the approach taken in any particular illustrative embodiment, an IFD module with variable focus variable focal length imaging can be realized in a variety of ways, each being embraced by the spirit of the present invention.

Fourth Illustrative Embodiment of the PLIIM-Based System of the Present Invention Shown in FIG. 3A The fourth illustrative embodiment of the PLIIM-based system of FIG. 3A, indicated by reference numeral 50D, is shown in FIG. 3G1 as comprising: an image formation and detection module 3" having an imaging subsystem 3B" with a variable focal length imaging lens, a variable focal distance and a variable field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B"; a FOV folding mirror 9 for folding the FOV of the imaging subsystem in the direction of imaging; a pair of planar laser illumination arrays 6A and 6B for producing first and second planar laser illumination beams 7A, 7B; and a pair of planar laser beam folding mirrors 37A and 37B for folding the planes of the planar laser illumination beams produced by the pair of planar illumination arrays 6A and 6B, in a direction that is coplanar with the plane of the FOV of the image formation and detection module during object illumination and image detection operations.

As shown in FIG. 3G2, the PLIIM-based system of FIG. 3G1 comprises: planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; linear-type image formation and detection module 3"; a FOV folding mirror 9 for folding the FOV of the imaging subsystem in the direction of imaging; a pair of planar laser illumination beam folding mirrors 37A and 37B, for folding the planar laser illumination beams 7A and 7B in the imaging direction; an image frame grabber 19 operably connected to the linear-type image formation and detection module 3", for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer 20; and a camera control computer 22 operably connected to the various components within the system for controlling the operation thereof in an orchestrated manner.

FIG. 3G3 illustrates in greater detail the structure of the IFD module 3" used in the PLIIM-based system of FIG. 3G1. As shown, the IFD module 3" comprises a variable focus variable focal length imaging subsystem 3B" and a 1-D image detecting array 3A mounted along an optical bench 3D contained within a common lens barrel (not shown). In general, the imaging subsystem 3B' comprises: a first group of focal lens elements 3A1 mounted stationary relative to the image detecting array 3A; a second group of lens elements 3B2, functioning as a focal lens assembly, movably mounted along the optical bench in front of the first group of stationary lens elements 3A1; and a third group of lens elements 3B1, functioning as a zoom lens assembly, movably mounted between the second group of focal lens elements and the first group of stationary focal lens elements 3A1. In a non-customized application, focal distance control can also be provided by moving the second group of focal lens elements 3B2 back and forth with translator 3C2 in response to a first set of control signals 3E2 generated by the camera control computer 22, while the 1-D image detecting array 3A remains stationary. Alternatively, focal distance control can be provided by moving the 1-D image detecting array 3A back and forth along the optical axis in response to a first set of control signals 3E2 generated by the camera control computer 22, while the second group of focal lens elements 3B2 remain stationary. For zoom control (i.e. variable focal length control), the focal lens elements in the third group 3B1 are typically moved relative to each other with translator 3C1 in response to a second set of control signals 3C1 generated by the camera control computer 22. Regardless of the approach taken in any particular illustrative embodiment, an IFD module with variable focus variable focal length imaging can be realized in a variety of ways, each being embraced by the spirit of the present invention.

Applications for the Fifth Generalized Embodiment of the PLIIM-Based System of the Present Invention, and the Illustrative Embodiments Thereof As the PLIIM-based systems shown in FIGS. 3A through 3G3 employ an IFD module having a linear image detecting array and an imaging subsystem having variable focal length (zoom) and variable focus (i.e. focal distance) control mechanisms, such PLIIM-based systems are good candidates for use in the conveyor top scanner application shown in FIG. 3H, as variations in target object distance can be up to a meter or more (from the imaging subsystem) and the imaging subsystem provided therein can easily accommodate such object distance parameter variations during object illumination and imaging operations. Also, by adding dynamic focusing functionality to the imaging subsystem of any of the embodiments shown in FIGS. 3A through 3F3, the resulting PLIIM-based system will become appropriate for the conveyor side scanning application also shown in FIG. 3G, where the demands on the depth of field and variable focus or dynamic focus requirements are greater compared to a conveyor top scanner application.

Sixth Generalized Embodiment of the Planar Laser Illumination and Electronic Imaging (PLIIM-Based) System of the Present Invention The sixth generalized embodiment of the PLIIM-based system of FIG. 3A, indicated by reference numeral 50', is illustrated in FIGS. 3J1 and 3J2. As shown in FIG. 3J1, the PLIIM-based system 50' comprises: a housing 2 of compact construction; a linear (i.e. 1-dimensional) type image formation and detection (IFD) module 3"; and a pair of planar laser illumination arrays (PLIAs) 6A and 6B mounted on opposite sides of the IFD module 3". During system operation, laser illumination arrays 6A and 6B each produce a composite laser illumination beam 12 which synchronously moves and is disposed substantially coplanar with the field of view (FOV) of the image formation and detection module 3", so as to scan a bar code symbol or other graphical structure 4 disposed stationary within a 2-D scanning region.

As shown in FIGS. 3J2 and 3J3, the PLIIM-based system of FIG. 3J150' comprises: an image formation and detection module 3" having an imaging subsystem 3B" with a variable focal length imaging lens, a variable focal distance and a variable field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www.dalsa.com) for detecting 1-D line images formed thereon by the imaging subsystem 3B"; a field of view folding and sweeping mirror 9' for folding and sweeping the field of view of the image formation and detection module 3"; a pair of planar laser illumination arrays 6A and 6B for producing planar laser illumination beams 7A and 7B; a pair of planar laser illumination beam folding and sweeping mirrors 37A' and 37B' for folding and sweeping the planar laser illumination beams 7A and 7B, respectively, in synchronism with the FOV being swept by the FOV folding and sweeping mirror 9'; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

As shown in FIG. 3J3, each planar laser illumination module 11A through 11F is driven by a VLD driver circuit 18 under the camera control computer 22 in a manner well known in the art. Notably, laser illumination beam folding/sweeping mirror 37A' and 37B', and FOV folding/sweeping mirror 9' are each rotatably driven by a motor-driven mechanism 39A, 39B, and 38, respectively, operated under the control of the camera control computer 22. These three mirror elements can be synchronously moved in a number of different ways. For example, the mirrors 37A', 37B' and 9' can be jointly rotated together under the control of one or more motor-driven mechanisms, or each mirror element can be driven by a separate driven motor which are synchronously controlled to enable the planar laser illumination beams and FOV to move together during illumination and detection operations within the PLIIM system.

FIG. 3J4 illustrates in greater detail the structure of the IFD module 3" used in the PLIIM-based system of FIG. 3J1. As shown, the IFD module 3" comprises a variable focus variable focal length imaging subsystem 3B' and a 1-D image detecting array 3A mounted along an optical bench 3D contained within a common lens barrel (not shown). In general, the imaging subsystem 3B" comprises: a first group of focal lens elements 3B" mounted stationary relative to the image detecting array 3A1 a second group of lens elements 3B2, functioning as a focal lens assembly, movably mounted along the optical bench in front of the first group of stationary lens elements 3A1; and a third group of lens elements 3B1, functioning as a zoom lens assembly, movably mounted between the second group of focal lens elements and the first group of stationary focal lens elements 3A1. In a non-customized application, focal distance control can also be provided by moving the second group of focal lens elements 3B2 back and forth in response to a first set of control signals generated by the camera control computer, while the 1-D image detecting array 3A remains stationary. Alternatively, focal distance control can be provided by moving the 1-D image detecting array 3A back and forth along the optical axis with translator 3C2 in response to a first set of control signals 3E1 generated by the camera control computer 22, while the second group of focal lens elements 3B2 remain stationary. For zoom control (i.e. variable focal length control), the focal lens elements in the third group 3B1 are typically moved relative to each other with translator 3C1 in response to a second set of control signals 3E1 generated by the camera control computer 22. Regardless of the approach taken in any particular illustrative embodiment, an IFD module with variable focus variable focal length imaging can be realized in a variety of ways, each being embraced by the spirit of the present invention.

In accordance with the present invention, the planar laser illumination arrays 6A and 6B, the linear image formation and detection module 3", the folding/sweeping FOV mirror 9', and the planar laser illumination beam folding/sweeping mirrors 37A' and 37B' employed in this generalized system embodiment, are fixedly mounted on an optical bench or chassis 8 so as to prevent any relative motion (which might be caused by vibration or temperature changes) between: (i) the image forming optics (e.g. imaging lens) within the image formation and detection module 3" and the FOV folding/sweeping mirror 9' employed therewith; and (ii) each planar laser illumination module (i.e. VLD/cylindrical lens assembly) and the planar laser illumination beam folding/sweeping mirrors 37A' and 37B' employed in this PLIIM-based system configuration. Preferably, the chassis assembly should provide for easy and secure alignment of all optical components employed in the planar laser illumination arrays 6A and 6B, beam folding/sweeping mirrors 37A' and 37B', the image formation and detection module 3" and FOV folding/sweeping mirror 9', as well as be easy to manufacture, service and repair. Also, this generalized PLIIM system embodiment employs the general "planar laser illumination" and "focus beam at farthest object distance (FBAFOD)" principles described above.

Applications for the Sixth Generalized Embodiment of the PLIIM-Based System of the Present Invention As the PLIIM-based systems shown in FIGS. 3J1 through 3J4 employ (i) an IFD module having a linear image detecting array and an imaging subsystem having variable focal length (zoom) and variable focal distance control mechanisms, and also (ii) a mechanism for automatically sweeping both the planar (2-D) FOV and planar laser illumination beam through a 3-D scanning field in a raster-like pattern while maintaining the inventive principle of "laser-beam/FOV coplanarity" herein disclosed, such PLIIM systems are good candidates for use in a hand-held scanner application, shown in FIG. 3J5, and the hands-free presentation scanner application illustrated in FIG. 3J6. As such, these embodiments of the present invention are ideally suited for use in hand-supportable and presentation-type hold-under bar code symbol reading applications shown in FIGS. 3J5 and 3J6, respectively, in which raster—like ("up and down") scanning patterns can be used for reading 1-D as well as 2-D bar code symbologies such as the PDF 147 symbology. In general, the PLIIM-based system of this generalized embodiment may have any of the housing form factors disclosed and described in Applicant's copending U.S. application Ser. No. 09/204,176 filed Dec. 3, 1998, U.S. application Ser. No. 09/452,976 filed Dec. 2, 1999, and WIPO Publication No. WO 00/33239 published Jun. 8, 2000 incorporated herein by reference. The beam sweeping technology disclosed in copending application Ser. No. 08/931,691 filed Sep. 16, 1997, incorporated herein by reference, can be used to uniformly sweep both the planar laser illumination beam and linear FOV in a coplanar manner during illumination and imaging operations.

Seventh Generalized Embodiment of the PLIIM-Based System of the Present Invention The seventh generalized embodiment of the PLIIM-based system of the present invention, indicated by reference numeral 60, is illustrated in FIG. 4A. As shown therein, the PLIIM-based system 60 comprises: a housing 2 of compact construction; an area (i.e. 2-D) type image formation and detection (IFD) module 55 including a 2-D electronic image detection array 55A, and an area (2-D) imaging subsystem (LIS) 55B having a fixed focal length, a fixed focal distance, and a fixed field of view (FOV), for forming a 2-D image of an illuminated object located within the fixed focal distance and FOV thereof and projected onto the 2-D image detection array 55A, so that the 2-D image detection array 55A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 55, for producing first and second planes of laser beam illumination 7A and 7B that are folded and swept so that the planar laser illumination beams are disposed substantially coplanar with a section of the FOV of image formation and detection module 55 during object illumination and image detection operations carried out by the PLIIM system.

In accordance with the present invention, the planar laser illumination arrays 6A and 6B, the linear image formation and detection module 55, and any stationary FOV folding mirror employed in any configuration of this generalized system embodiment, are fixedly mounted on an optical bench or chassis so as to prevent any relative motion (which might be caused by vibration or temperature changes) between: (i) the image forming optics (e.g. imaging lens) within the image formation and detection module 55 and any stationary FOV folding mirror employed therewith; and (ii) each planar laser illumination module (i.e. VLD/cylindrical lens assembly) and each planar laser illumination beam folding/sweeping mirror employed in the PLIIM-based system configuration. Preferably, the chassis assembly should provide for easy and secure alignment of all optical components employed in the planar laser illumination arrays 6A and 6B as well as the image formation and detection module 55, as well as be easy to manufacture, service and repair. Also, this generalized PLIIM system embodiment employs the general "planar laser illumination" and "focus beam at farthest object distance (FBAFOD)" principles described above. Various illustrative embodiments of this generalized PLIIM system will be described below.

First Illustrative Embodiment of the PLIIM-Based System of the Present Invention Shown in FIG. 4A The first illustrative embodiment of the PLIIM-Based system of FIG. 4A, indicated by reference numeral 60A, is shown in FIG. 4B1 as comprising: an image formation and detection module (i.e. camera) 55 having an imaging subsystem 55B with a fixed focal length imaging lens, a fixed focal distance and a fixed field of view (FOV) of three-dimensional extent, and an area (2-D) array of photo-electronic detectors 55A realized using high-speed CCD technology (e.g. the Sony ICX085AL Progressive Scan CCD Image Sensor with Square Pixels for B/W Cameras, or the Kodak KAF-4202 Series 2032(H)×2044(V) Full-Frame CCD Image Sensor) for detecting 2-D arean images formed thereon by the imaging subsystem 55B; a pair of planar laser illumination arrays 6A and 6B for producing first and second planar laser illumination beams 7A and 7B; and a pair of planar laser illumination beam folding/sweeping mirrors 57A and 57B, arranged in relation to the planar laser illumination arrays 6A and 6B, respectively, such that the planar laser illumination beams 7A, 7B are folded and swept so that the planar laser illumination beams are disposed substantially coplanar with a section of the 3-D FOV 40' of image formation and detection module during object illumination and image detection operations carried out by the PLIIM-based system.

As shown in FIG. 4B3, the PLIIM-based system 60A of FIG. 4B1 comprises: planar laser illumination arrays (PLIAs) 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; area-type image formation and detection module 55; planar laser illumination beam folding/sweeping mirrors 57A and 57B; an image frame grabber 19 operably connected to area-type image formation and detection module 55, for accessing 2-D digital images of the object being illuminated by the planar laser illumination arrays 6A and 6B during image formation and detection operations; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

Second Illustrative Embodiment of the PLIIM-Based System of the Present Invention Shown in FIG. 4A The second illustrative embodiment of the PLIIM-based system of FIG. 4A, indicated by reference numeral 601, is shown in FIG. 4C1 as comprising: an image formation and detection module 55 having an imaging subsystem 55B with a fixed focal length imaging lens, a fixed focal distance and a fixed field of view, and an area (2-D) array of photo-electronic detectors 55A realized using CCD technology (e.g. the Sony ICX085AL Progressive Scan CCD Image Sensor with Square Pixels for B/W Cameras, or the Kodak KAF-4202 Series 2032(H)×2044(V) Full-Frame CCD Image Sensor) for detecting 2-D line images formed thereon by the imaging subsystem 55; a FOV folding mirror 9 for folding the FOV in the imaging direction of the system; a pair of planar laser illumination arrays 6A and 6B for producing first and second planar laser illumination beams 7A and 7B; and a pair of PLIB folding/sweeping mirrors 57A and 57B, arranged in relation to the planar laser illumination arrays 6A and 6B, respectively, such that the planar laser illumination beams (PLIBs) 7A, 7B are folded and swept so that the planar laser illumination beams are disposed substantially coplanar with a section of the FOV of the image formation and detection module during object illumination and image detection operations carried out by the PLIIM-based system.

In general, the arean image detection array 55B employed in the PLIIM systems shown in FIGS. 4A through 6F4 has multiple rows and columns of pixels arranged in a rectangular array. Therefore, arean image detection array is capable of sensing/detecting a complete 2-D image of a target object in a single exposure, and the target object may be stationary with respect to the PLIIM-based system. Thus, the image detection array 55D is ideally suited for use in hold-under type scanning systems However, the fact that the entire image is captured in a single exposure implies that the technique of dynamic focus cannot be used with an arean image detector.

As shown in FIG. 4C2, the PLIIM-based system of FIG. 4C1 comprises: planar laser illumination arrays 6A and 6B, each having a plurality of planar laser illumination modules 11A through 11B, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; area-type image formation and detection module 55B; FOV folding mirror 9; planar laser illumination beam folding/sweeping mirrors 57A and 57B; an image frame grabber 19 operably connected to area-type image formation and detection module 55, for accessing 2-D digital images of the object being illuminated by the planar laser illumination arrays 6A and 6B during image formation and detection operations; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof, including synchronous driving motors 58A and 68B, in an orchestrated manner.

Applications for the Seventh Generalized Embodiment of the PLIIM-Based System of the Present Invention, and the Illustrative Embodiments Thereof The fixed focal distance area-type PLIIM-based systems shown in FIGS. 4A through 4C2 are ideal for applications in which there is little variation in the object distance, such as in a 2-D hold-under scanner application as shown in FIG. 4D. A fixed focal distance PLIIM-based system generally takes up less space than a variable or dynamic focus model because more advanced focusing methods require more complicated optics and electronics, and additional components such as motors. For this reason, fixed focus PLIIM systems are good choices for the hands-free presentation and hand-held scanners applications illustrated in FIGS. 4D and 4E, respectively, wherein space and weight are always critical characteristics. In these applications, however, the object distance can vary over a range from several to twelve or more inches, and so the designer must exercise care to ensure that the scanner's depth of field (DOF) alone will be sufficient to accommodate all possible variations in target object distance and orientation. Also, because a fixed focus imaging subsystem implies a fixed focal length imaging lens, the variation in object distance implies that the dpi resolution of acquired images will vary as well, and therefore image-based bar code symbol decode-processing techniques must address such variations in image resolution. The focal length of the imaging lens must be chosen so that the angular width of the field of view (FOV) is narrow enough that the dpi image resolution will not fall below the minimum acceptable value anywhere within the range of object distances supported by the PLIIM system.

Eighth Generalized Embodiment of the PLIIM System of the Present Invention

The eighth generalized embodiment of the PLIIM system of the present invention 70 is illustrated in FIG. 5A. As shown therein, the PLIIM system 70 comprises: a housing 2 of compact construction; an area (i.e. 2-dimensional) type image formation and detection (IFD) module 55' including a 2-D electronic image detection array 55A, an area (2-D) imaging subsystem (LIS) 55B' having a fixed focal length, a variable focal distance, and a fixed field of view (FOV), for forming a 2-D image of an illuminated object located within the fixed focal distance and FOV thereof and projected onto the 2-D image detection array 55A, so that the 2-D image detection array 55A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 55', for producing first and second planes of laser beam illumination 7A and 7B such that the 3-D field of view 10' of the image formation and detection module 55' is disposed substantially coplanar with the planes of the first and second PLIBs 7A, 7B during object illumination and image detection operations carried out by the PLIIM system. While possible, this system configuration would be difficult to use when packages are moving by on a high-speed conveyor belt, as the planar laser illumination beams would have to sweep across the package very quickly to avoid blurring of the acquired images due to the motion of the package while the image is being acquired. Thus, this system configuration might be better suited for a hold-under scanning application, as illustrated in FIG. 5D, wherein a person picks up a package, holds it under the scanning system to allow the bar code to be automatically read, and then manually routes the package to its intended destination based on the result of the scan.

In accordance with the present invention, the planar laser illumination arrays 6A and 6B, the linear image formation and detection module 55', and any stationary FOV folding mirror employed in any configuration of this generalized system embodiment, are fixedly mounted on an optical bench or chassis 8 so as to prevent any relative motion (which might be caused by vibration or temperature changes) between: (i) the image forming optics (e.g. imaging lens) within the image formation and detection module 55' and any stationary FOV folding mirror employed therewith, and (ii) each planar laser illumination module (i.e. VLD/cylindrical lens assembly) 55' and each PLIB folding/sweeping mirror employed in the PLIIM-based system configuration. Preferably, the chassis assembly 8 should provide for easy and secure alignment of all optical components employed in the planar laser illumination arrays (PLIAs) 6A and 6B as well as the image formation and detection module 55', as well as be easy to manufacture, service and repair. Also, this generalized PLIIM-based system embodiment employs the general "planar laser illumination" and "focus beam at farthest object distance (FBAFOD)" principles described above. Various illustrative embodiments of this generalized PLIIM system will be described below.

First Illustrative Embodiment of the PLIIM-Based System Shown in FIG. 5A

The first illustrative embodiment of the PLIIM-based system of FIG. 5A, indicated by reference numeral, indicated by reference numeral 70A, is shown in FIGS. 5B1 and 5B2 as comprising: an image formation and detection module 55' having an imaging subsystem 55B' with a fixed focal length imaging lens, a variable focal distance and a fixed field of view (of 3-D spatial extent), and an area (2-D) array of photo-electronic detectors 55A realized using CCD technology (e.g. the Sony ICX085AL Progressive Scan CCD Image Sensor with Square Pixels for B/W Cameras, or the Kodak KAF-4202 Series 2032(H)×2044(V) Full-Frame CCD Image Sensor) for detecting 2-D images formed thereon by the imaging subsystem 55B'; a pair of planar laser illumination arrays 6A and 6B for producing first and second planar laser illumination beams 7A and 7B; and a pair of planar laser illumination beam folding/sweeping mirrors 57A and 57B, arranged in relation to the planar laser illumination arrays 6A and 6B, respectively, such that the planar laser illumination beams are folded and swept so that the planar laser illumination beams 7A, 7B are disposed substantially coplanar with a section of the 3-D FOV (10') of the image formation and detection module 55' during object illumination and imaging operations carried out by the PLIIM-based system.

As shown in FIG. 5B3, PLIIM-based system 70A comprises: planar laser illumination arrays 6A and 6B each having a plurality of planar laser illumination modules (PLIMs) 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; area-type image formation and detection module 55'; PLIB folding/sweeping mirrors 57A and 57B, driven by motors 58A and 58B, respectively; a high-resolution image frame grabber 19 operably connected to area-type image formation and detection module 55A, for accessing 2-D digital images of the object being illuminated by the planar laser illumination arrays (PLIAs) 6A and 6B during image formation and detection operations; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner. The operation of this system configuration is as follows. Images detected by the low-resolution area camera 61 are grabbed by the image frame grabber 62 and provided to the image processing computer 21 by the camera control computer 22. The image processing computer 21 automatically identifies and detects when a label containing a bar code symbol structure has moved into the 3-D scanning field, whereupon the high-resolution CCD detection array camera 55A is automatically triggered by the camera control computer 22. At this point, as the planar laser illumination beams 12' begin to sweep the 3-D scanning region, images are captured by the high-resolution array 55A and the image processing computer 21 decodes the detected bar code by a more robust bar code symbol decode software program.

FIG. 5B4 illustrates in greater detail the structure of the IFD module 55' used in the PLIIM-base system of FIG. 5B3. As shown, the IFD module 55' comprises a variable focus fixed focal length imaging subsystem 55B' and a 2-D image detecting array 55A mounted along an optical bench 55D contained within a common lens barrel (not shown). The imaging subsystem 55B' comprises a group of stationary lens elements 55B1' mounted along the optical bench before the image detecting array 55A, and a group of focusing lens elements 55B2' (having a fixed effective focal length) mounted along the optical bench in front of the stationary lens elements 55B1'. In a non-customized application, focal distance control can be provided by moving the 2-D image detecting array 55A back and forth along the optical axis with translator 55C in response to a first set of control signals 55E generated by the camera control computer 22, while the entire group of focal lens elements remain stationary. Alternatively, focal distance control can also be provided by moving the entire group of focal lens elements 55B2' back and forth with translator 55C in response to a first set of control signals 55E generated by the camera control computer, while the 2-D image detecting array 55A remains stationary. In customized applications, it is possible for the individual lens elements in the group of focusing lens elements 55B2' to be moved in response to control signals generated by the camera control computer 22. Regardless of the approach taken, an IFD module 55' with variable focus fixed focal length imaging can be realized in a variety of ways, each being embraced by the spirit of the present invention.

Second Illustrative Embodiment of the PLIIM-Based System of the Present Invention Shown in FIG. 5A The second illustrative embodiment of the PLIIM-based system of FIG. 5A is shown in FIGS. 5C1, 5C2 comprising: an image formation and detection module 55' having an imaging subsystem 55B' with a fixed focal length imaging lens, a variable focal distance and a fixed field of view, and an area (2-D) array of photo-electronic detectors 55A realized using CCD technology (e.g. the Sony ICX085AL Progressive Scan CCD Image Sensor with Square Pixels for B/W Cameras, or the Kodak KAF-4202 Series 2032(H)×2044(V) Full-Frame CCD Image Sensor) for detecting 2-D line images formed thereon by the imaging subsystem 55; a FOV folding mirror 9 for folding the FOV in the imaging direction of the system; a pair of planar laser illumination arrays 6A and 6B for producing first and second planar laser illumination beams 7A and 7B, wherein each VLD 11 is driven by a VLD driver circuit 18 embodying a digitally-programmable potentiometer (e.g. 763 as shown in FIG. 1I15D for current control purposes) and a microcontroller 764 bring provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; and a pair of planar laser illumination beam folding/sweeping mirrors 57A and 57B, arranged in relation to the planar laser illumination arrays 6A and 6B, respectively, such that the planar laser illumination beams are folded and swept so that the planar laser illumination beams are disposed substantially coplanar with a section of the FOV of the image formation and detection module 55' during object illumination and image detection operations carried out by the PLIIM-based system.

As shown in FIG. 5C3, the PLIIM-based system 70A of FIG. 5C1 is shown in slightly greater detail comprising: a low-resolution analog CCD camera 61 having (i) an imaging lens 61B having a short focal length so that the field of view (FOV) thereof is wide enough to cover the entire 3-D scanning area of the system, and its depth of field (DOF) is very large and does not require any dynamic focusing capabilities, and (ii) an area CCD image detecting array 61A for continuously detecting images of the 3-D scanning area formed by the imaging from ambient light reflected off target object in the 3-D scanning field; a low-resolution image frame grabber 62 for grabbing 2-D image frames from the 2-D image detecting array 61A at a video rate (e.g. 3-frames/second or so); planar laser illumination arrays 6A and 6B, each having a plurality of planar laser illumination modules 11A through 11F, and each planar laser illumination module being driven by a VLD driver circuit 18; area-type image formation and detection module 55'; FOV folding mirror 9; planar laser illumination beam folding/sweeping mirrors 57A and 57B, driven by motors 58A and 58B, respectively; an image frame grabber 19 operably connected to area-type image formation and detection module 55', for accessing 2-D digital images of the object being illuminated by the planar laser illumination arrays 6A and 6B during image formation and detection operations; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 5C4 illustrates in greater detail the structure of the IFD module 55' used in the PLIIM-based system of FIG. 5C1. As shown, the IFD module 55' comprises a variable focus fixed focal length imaging subsystem 55B' and a 2-D image detecting array 55A mounted along an optical bench 55D contained within a common lens barrel (not shown). The imaging subsystem 55B' comprises a group of stationary lens elements 55B1 mounted along the optical bench before the image detecting array 55A, and a group of focusing lens elements 55B2 (having a fixed effective focal length) mounted along the optical bench in front of the stationary lens elements 55B1. In a non-customized application, focal distance control can be provided by moving the 2-D image detecting array 55A back and forth along the optical axis with translator 55C in response to a first set of control signals 55E generated by the camera control computer 22, while the entire group of focal lens elements 55B1 remain stationary. Alternatively, focal distance control can also be provided by moving the entire group of focal lens elements 55B2 back and forth with the translator 55C in response to a first set of control signals 55E generated by the camera control computer, while the 2-D image detecting array 55A remains stationary. In customized applications, it is possible for the individual lens elements in the group of focusing lens elements 55B2 to be moved in response to control signals generated by the camera control computer. Regardless of the approach taken, the IFD module 55B' with variable focus fixed focal length imaging can be realized in a variety of ways, each being embraced by the spirit of the present invention.

Applications for the Eighth Generalized Embodiment of the PLIIM-Based System of the Present Invention, and the Illustrative Embodiments Thereof As the PLIIM-based systems shown in FIGS. 5A through 5C4 employ an IFD module having an arean image detecting array and an imaging subsystem having variable focus (i.e. focal distance) control, such PLIIM-based systems are good candidates for use in a presentation scanner application, as shown in FIG. 5D, as the variation in target object distance will typically be less than 15 or so inches from the imaging subsystem. In presentation scanner applications, the variable focus (or dynamic focus) control characteristics of such PLIIM-based system will be sufficient to accommodate for expected target object distance variations.

Ninth Generalized Embodiment of the PLIIM-Based System of the Present Invention

The ninth generalized embodiment of the PLIIM-based system of the present invention, indicated by reference numeral 80, is illustrated in FIG. 6A. As shown therein, the PLIIM-based system 80 comprises: a housing 2 of compact construction; an area (i.e. 2-dimensional) type image formation and detection (IFD) module 55' including a 2-D electronic image detection array 55A, an area (2-D) imaging subsystem (LIS) 55B" having a variable focal length, a variable focal distance, and a variable field of view (FOV) of 3-D spatial extent, for forming a 1-D image of an illuminated object located within the fixed focal distance and FOV thereof and projected onto the 2-D image detection array 55A, so that the 2-D image detection array 55A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 55", for producing first and second planes of laser beam illumination 7A and 7B such that the field of view of the image formation and detection module 55" is disposed substantially coplanar with the planes of the first and second planar laser illumination beams during object illumination and image detection operations carried out by the PLIIM system. While possible, this system configuration would be difficult to use when packages are moving by on a high-speed conveyor belt, as the planar laser illumination beams would have to sweep across the package very quickly to avoid blurring of the acquired images due to the motion of the package while the image is being acquired. Thus, this system configuration might be better suited for a hold-under scanning application, as illustrated in FIG. 5D, wherein a person picks up a package, holds it under the scanning system to allow the bar code to be automatically read, and then manually routes the package to its intended destination based on the result of the scan.

In accordance with the present invention, the planar laser illumination arrays (PLIAs) 6A and 6B, the linear image formation and detection module 55", and any stationary FOV folding mirror employed in any configuration of this generalized system embodiment, are fixedly mounted on an optical bench or chassis so as to prevent any relative motion (which might be caused by vibration or temperature changes) between: (i) the image forming optics (e.g. imaging lens) within the image formation and detection module 55" and any stationary FOV folding mirror employed therewith, and (ii) each planar laser illumination module (i.e. VLD/cylindrical lens assembly) and each PLIB folding/sweeping mirror employed in the PLIIM-based system configuration. Preferably, the chassis assembly should provide for easy and secure alignment of all optical components employed in the planar laser illumination arrays 6A and 6B as well as the image formation and detection module 55", as well as be easy to manufacture service and repair. Also, this generalized PLIIM-based system embodiment employs the general "planar laser illumination" and "focus beam at farthest object distance (FBAFOD)" principles described above. Various illustrative embodiments of this generalized PLIIM system will be described below.

First Illustrative Embodiment of the PLIIM-Based System of the Present Invention Shown in FIG. 6A The first illustrative embodiment of the PLIIM-based system of FIG. 6A, indicated by reference numeral 80A, is shown in FIGS. 6B1 and 6B2 as comprising: an area-type image formation and detection module 55" having an imaging subsystem 55B" with a variable focal length imaging lens, a variable focal distance and a variable field of view, and an area (2-D) array of photo-electronic detectors 55A realized using CCD technology (e.g. the Sony ICX085AL Progressive Scan CCD Image Sensor with Square Pixels for B/W Cameras, or the Kodak KAF-4202 Series 2032(H)×2044(V) Full-Frame CCD Image Sensor) for detecting 2-D line images formed thereon by the imaging subsystem 55A; a pair of planar laser illumination arrays 6A and 6B for producing first and second planar laser illumination beams 7A and 7B; and a pair of PLIB folding/sweeping mirrors 57A and 57B, arranged in relation to the planar laser illumination arrays 6A and 6B, respectively, such that the planar laser illumination beams are folded and swept so that the planar laser illumination beams are disposed substantially coplanar with a section of the FOV of image formation and detection module during object illumination and image detection operations carried out by the PLIIM-based system.

As shown in FIG. 6B3, the PLIIM-based system of FIG. 6B1 comprises: a low-resolution analog CCD camera 61 having (i) an imaging lens 61B having a short focal length so that the field of view (FOV) thereof is wide enough to cover the entire 3-D scanning area of the system, and its depth of field (DOF) is very large and does not require any dynamic focusing capabilities, and (ii) an area CCD image detecting array 61A for continuously detecting images of the 3-D scanning area formed by the imaging from ambient light reflected off target object in the 3-D scanning field; a low-resolution image frame grabber 62 for grabbing 2-D image frames from the 2-D image detecting array 61A at a video rate (e.g. 3-frames/second or so); planar laser illumination arrays 6A and 6B, each having a plurality of planar laser illumination modules 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; area-type image formation and detection module 55B; planar laser illumination beam folding/sweeping mirrors 57A and 57B; an image frame grabber 19 operably connected to area-type image formation and detection module 55", for accessing 2-D digital images of the object being illuminated by the planar laser illumination arrays 6A and 6B during image formation and detection operations; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 6B4 illustrates in greater detail the structure of the IFD module 55" used in the PLIIM-based system of FIG. 6B31, As shown, the IFD module 55" comprises a variable focus variable focal length imaging subsystem 55B" and a 2-D image detecting array 55A mounted along an optical bench 55D contained within a common lens barrel (not shown). In general, the imaging subsystem 55B" comprises: a first group of focal lens elements 55B1 mounted stationary relative to the image detecting array 55A; a second group of lens elements 55B2, functioning as a focal lens assembly, movably mounted along the optical bench in front of the first group of stationary lens elements 55B1; and a third group of lens elements 55B3, functioning as a zoom lens assembly, movably mounted between the second group of focal lens elements 55B2 and the first group of stationary focal lens elements 55B1. In a non-customized application, focal distance control can also be provided by moving the second group of focal lens elements 55B2 back and forth with translator 55C1 in response to a first set of control signals generated by the camera control computer, while the 2-D image detecting array 55A remains stationary. Alternatively, focal distance control can be provided by moving the 2-D image detecting array 55A back and forth along the optical axis in response to a first set of control signals 55E2 generated by the camera control computer 22, while the second group of focal lens elements 55B2 remain stationary. For zoom control (i.e. variable focal length control), the focal lens elements in the third group 55B3 are typically moved relative to each other with translator 55C2 in response to a second set of control signals 55E2 generated by the camera control computer 22. Regardless of the approach taken in any particular illustrative embodiment, an IFD module with variable focus variable focal length imaging can be realized in a variety of ways, each being embraced by the spirit of the present invention.

Second Illustrative Embodiment of the PLIIM-Based System of the Present Invention Shown in FIG. 6A The second illustrative embodiment of the PLIIM-based system of FIG. 6A, indicated by reference numeral 80B, is shown in FIGS. 6C1 and 6C2 as comprising: an image formation and detection module 55" having an imaging subsystem 55B" with a variable focal length imaging lens, a variable focal distance and a variable field of view, and an area (2-D) array of photo-electronic detectors 55A realized using CCD technology (e.g. the Sony ICX085AL Progressive Scan CCD Image Sensor with Square Pixels for B/W Cameras, or the Kodak KAF-4202 Series 2032(H)×2044(V)

Full-Frame CCD Image Sensor) for detecting 2-D line images formed thereon by the imaging subsystem 55B"; a FOV folding mirror 9 for folding the FOV in the imaging direction of the system; a pair of planar laser illumination arrays 6A and 6B for producing first and second planar laser illumination beams 7A and 7B; and a pair of planar laser illumination beam folding/sweeping mirrors 57A and 57B, arranged in relation to the planar laser illumination arrays (PLIAs) 6A and 6B, respectively, such that the planar laser illumination beams are folded and swept so that the planar laser illumination beams are disposed substantially coplanar with a section of the FOV of the image formation and detection module during object illumination and image detection operations carried out by the PLIIM system.

As shown in FIG. 6C3, the PLIIM-based system of FIGS. 6C1 and 6C2 comprises: a low-resolution analog CCD camera 61 having (i) an imaging lens 61B having a short focal length so that the field of view (FOV) thereof is wide enough to cover the entire 3-D scanning area of the system, and its depth of field (DOF) is very large and does not require any dynamic focusing capabilities, and (ii) an area CCD image detecting array 61A for continuously detecting images of the 3-D scanning area formed by the imaging from ambient light reflected off target object in the 3-D scanning field; a low-resolution image frame grabber 62 for grabbing 2-D image frames from the 2-D image detecting array 61A at a video rate (e.g. 30 frames/second or so); planar laser illumination arrays (PLIAs) 6A and 6B, each having a plurality of planar laser illumination modules (PLIMs) 11A through 11F, and each planar laser illumination module being driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; area-type image formation and detection module 55A; FOV folding mirror 9; PLIB folding/sweeping mirrors 57A and 57B; a high-resolution image frame grabber 19 operably connected to area-type image formation and detection module 55" for accessing 2-D digital images of the object being illuminated by the planar laser illumination arrays (PLIA) 6A and 6B during image formation and detection operations; an image data buffer (e.g. VRAM) 20 for buffering 2-D images received from the image frame grabbers 62 and 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

FIG. 6C4 illustrates in greater detail the structure of the IFD module 55" used in the PLIIM-based system of FIG. 6C1. As shown, the IFD module 55" comprises a variable focus variable focal length imaging subsystem 55B" and a 2-D image detecting array 55A mounted along an optical bench 55D contained within a common lens barrel (not shown). In general, the imaging subsystem 55B" comprises: a first group of focal lens elements 55B1 mounted stationary relative to the image detecting array 55A; a second group of lens elements 55B2, functioning as a focal lens assembly, movably mounted along the optical bench in front of the first group of stationary lens elements 55A1; and a third group of lens elements 55B3, functioning as a zoom lens assembly, movably mounted between the second group of focal lens elements 55B2 and the first group of stationary focal lens elements 55B1. In a non-customized application, focal distance control can also be provided by moving the second group of focal lens elements 55B2 back and forth with translator 55C1 in response to a first set of control signals 55E1 generated by the camera control computer 22, while the 2-D image detecting array 55A remains stationary. Alternatively, focal distance control can be provided by moving the 2-D image detecting array 55A back and forth along the optical axis with translator 55C1 in response to a first set of control signals 55A generated by the camera control computer 22, while the second group of focal lens elements 55B2 remain stationary. For zoom control (i.e. variable focal length control), the focal lens elements in the third group 55B3 are typically moved relative to each other with translator in response to a second set of control signals 55E2 generated by the camera control computer 22. Regardless of the approach taken in any particular illustrative embodiment, an IFD (i.e. camera) module with variable focus variable focal length imaging can be realized in a variety of ways, each being embraced by the spirit of the present invention.

Applications for the Ninth Generalized Embodiment of the PLIIM-Based System of the Present Invention As the PLIIM-based systems shown in FIGS. 6A through 6C4 employ an IFD module having an area-type image detecting array and an imaging subsystem having variable focal length (zoom) and variable focal distance (focus) control mechanism, such PLIIM-based systems are good candidates for use in presentation scanner applications, as shown in FIG. 6C5, as the variation in target object distance will typically be less than 15 or so inches from the imaging subsystem. In presentation scanner applications, the variable focus (or dynamic focus) control characteristics of such PLIIM system will be sufficient to accommodate for expected target object distance variations. All digital images acquired by this PLIIM-based system will have substantially the same dpi image resolution, regardless of the object's distance during illumination and imaging operations. This feature is useful in 1-D and 2-D bar code symbol reading applications.

Exemplary Realization of the PLIIM-Based System of the Present Invention, Wherein a Pair of Coplanar Laser Illumination Beams are Controllably Steered About a 3-D Scanning Region In FIGS. 6D1 through 6D5, there is shown an exemplary realization of the PLIIM-based system of FIG. 6A. As shown, PLIIM-based system 25" comprises: an image formation and detection module 55'; a stationary field of view (FOV) folding mirror 9 for folding and projecting the FOV through a 3-D scanning region; a pair of planar laser illumination arrays (PLIAs) 6A and 6B; and pair of PLIB folding/sweeping mirrors 57A and 57B for folding and sweeping the planar laser illumination beams so that the optical paths of these planar laser illumination beams are oriented in an imaging direction that is coplanar with a section of the field of view of the image formation and detection module 55" as the planar laser illumination beams are swept through the 3-D scanning region during object illumination and imaging operations. As shown in FIG. 6D3, the FOV of the area-type image formation and detection (IFD) module 55" is folded by the stationary FOV folding mirror 9 and projected downwardly through a 3-D scanning region. The planar laser illumination beams produced from the planar laser illumination arrays (PLIAs) 6A and 6B are folded and swept by mirror 57A and 57B so that the optical paths of these planar laser illumination beams are oriented in a direction that is coplanar with a section of the FOV of the image formation and detection module as the planar laser illumination beams are swept through the 3-D scanning region during object illumination and imaging operations. As shown in FIG. 6D5, PLIIM-based system 25" is capable of auto-zoom and auto-focus operations, and producing images having constant dpi resolution regardless of whether the images are of tall packages moving on a conveyor belt structure or objects having height values close to the surface height of the conveyor belt structure.

As shown in Rig. 6D2, a stationary cylindrical lens array 299 is mounted in front of each PLIA (6A, 6B) provided within the PLIIM-based subsystem 25". The function performed by cylindrical lens array 299 is to optically combine the individual PLIB components produced from the PLIMs constituting the PLIA, and project the combined PLIB components onto points along the surface of the object being illuminated. By virtue of this inventive feature, each point on the object surface being imaged will be illuminated by different sources of laser illumination located at different points in space (i.e. spatially coherent-reduced laser illumination), thereby reducing the RMS power of speckle-pattern noise observable at the linear image detection array of the PLIIM-based subsystem.

In order that PLLIM-based subsystem 25" can be readily interfaced to and integrated (e.g. embedded) within various types of computer-based systems, as shown in FIGS. 9 through 34C, subsystem 25" further comprises an I/O subsystem 500 operably connected to camera control computer 22 and image processing computer 21, and a network controller 501 for enabling high-speed data communication with other computers in a local or wide area network using packet-based networking protocols (e.g. Ethernet, AppleTalk, etc.) well know in the art.

Tenth Generalized Embodiment of the PLIIM-Based System of the Present Invention, Wherein a 3-D Field of View and a Pair of Planar Laser Illumination Beams are Controllably Steered About a 3-D Scanning Region Referring to FIGS. 6E1 through 6E4, the tenth generalized embodiment of the PLIIM-based system of the present invention 90 will now be described, wherein a 3-D field of view 101 and a pair of planar laser illumination beams (PLIBs) are controllably steered about a 3-D scanning region in order to achieve a greater region of scan coverage.

As shown in FIG. 6E2, PLIIM-based system of FIG. 6E1 comprises: an area-type image formation and detection module 55'; a pair of planar laser illumination arrays 6A and 6B; a pair of x and y axis field of view (FOV) sweeping mirrors 91A and 91B, driven by motors 92A and 92B, respectively, and arranged in relation to the image formation and detection module 55"; and a pair of x and y planar laser illumination beam (PLIB) folding and sweeping mirrors 57A and 57B, driven by motors 94A and 94B, respectively, so that the planes of the laser illumination beams 7A, 7B are coplanar with a planar section of the 3-D field of view (101) of the image formation and detection module 55" as the PLIBs and the FOV of the IFD module 55" are synchronously scanned across a 3-D region of space during object illumination and image detection operations.

As shown in FIG. 6E3, the PLIIM-based system of FIG. 6E2 comprises: area-type image formation and detection module 55" having an imaging subsystem 55B" with a variable focal length imaging lens, a variable focal distance and a variable field of view (FOV) of 3-D spatial extent, and an area (2-D) array of photo-electronic detectors 55A realized using CCD technology (e.g. the Sony ICX085AL Progressive Scan CCD Image Sensor with Square Pixels for B/W Cameras, or the Kodak KAF-4202 Series 2032(H)×2044(V) Full-Frame CCD Image Sensor) for detecting 2-D images formed thereon by the imaging subsystem 55A; planar laser illumination arrays, 6A, 6B, wherein each VLD 11 is driven by a VLD driver circuit 18 embodying a digitally-programmable potentiometer (e.g. 763 as shown in FIG. 1I15D for current control purposes) and a microcontroller 764 being provided for controlling the output optical power thereof; a stationary cylindrical lens array 299 mounted in front of each PLIA (6A, 6B) and ideally integrated therewith, for optically combining the individual PLIB components produced from the PLIMs constituting the PLIA, and projecting the combined PLIB components onto points along the surface of the object being illuminated; x and y axis FOV steering mirrors 91A and 91B; x and y axis PLIB sweeping mirrors 57A and 57B; an image frame grabber 19 operably connected to area-type image formation and detection module 55A, for accessing 2-D digital images of the object being illuminated by the planar laser illumination arrays (PLIAs) 6A and 6B during image formation and detection operations: an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner. Area-type image formation and detection module 55" can be realized using a variety of commercially available high-speed area-type CCD camera systems such as, for example, the KAF-4202 Series 2032(H×2044(V) Full-Frame CCD Image Sensor, from Eastman Kodak Company-Microelectronics Technology Division—Rochester, N.Y.

FIG. 6E4 illustrates a portion of the PLIIM-based system 90 shown in FIG. 6E1, wherein the 3-D field of view (FOV) of the image formation and detection module 55" is shown steered over the 3-D scanning region of the system using a pair of x and y axis FOV folding mirrors 91A and 91B, which work in cooperation with the x and y axis PLIB folding/steering mirrors 57A and 57B to steer the pair of planar laser illumination beams (PLIBs) 7A and 7B in a coplanar relationship with the 3-D FOV (101), in accordance with the principles of the present invention.

In accordance with the present invention, the planar laser illumination arrays 6A and 6B, the linear image formation and detection (IFD) module 55", FOV folding/sweeping mirrors 91A and 91B and PLIB folding/sweeping mirrors 57A and 57B employed in this system embodiment, are mounted on an optical bench or chassis so as to prevent any relative motion (which might be caused by vibration or temperature changes) between: (i) the image forming optics (e.g. imaging lens) within the image formation and detection module 55" and FOV folding/sweeping mirrors 91A, 91B employed therewith: and (ii) each planar laser illumination module (i.e. VLD/cylindrical lens assembly) and each PLIB folding/sweeping mirror 57A and 57B employed in the PLIIM-based system configuration. Preferably, the chassis assembly should provide for easy and secure alignment of all optical components employed in the planar laser illumination arrays 6A and 6B as well as the image formation and detection module 55" as well as be easy to manufacture, service and repair. Also, this PLIIM-based system embodiment employs the general "planar laser illumination beam" and "focus beam at farthest object distance (FBAFOD)" principles described above. Various illustrative embodiments of this generalized PLIIM-based system will be described below.

First Illustrative Embodiment of the Hybrid Holographic/CCD PLIIM-Based System of the Present Invention In FIG. 7A, a first illustrative embodiment of the hybrid holographic/CCD PLIIM-based system of the present invention 100 is shown, wherein a holographic-based imaging subsystem is used to produce a wide range of discrete field of views (FOVs), over which the system can acquire images of target objects using a linear image detection array having a 2-D field of view (FOV) that is coplanar with a planar laser illumination beam in accordance with the principles of the present invention. In this system configuration, it is understood that the PLIIM-based system will be supported over a conveyor belt structure which transports packages past the PLIIM-based system 100 at a substantially constant velocity so that lines of scan data can be combined together to construct 2-D images upon which decode image processing algorithms can be performed.

As illustrated in FIG. 7A, the hybrid holographic/CCD PLIIM-based system 100 comprises: (i) a pair of planar laser illumination arrays 6A and 6B for generating a pair of planar laser illumination beams 7A and 7B that produce a composite planar laser illumination beam 12 for illuminating a target object residing within a 3-D scanning volume; a holographic-type cylindrical lens 101 is used to collimate the rays of the planar laser illumination beam down onto the conveyor belt surface; and a motor-driven holographic imaging disc 102, supporting a plurality of transmission-type volume holographic optical elements (HOE) 103, as taught in U.S. Pat. No. 5,984,185, incorporated herein by reference. Each HOE 103 on the imaging disc 102 has a different focal length, which is disposed before a linear (1-D) CCD image detection array 3A. The holographic imaging disc 102 and image detection array 3A function as a variable-type imaging subsystem that is capable of detecting images of objects over a large range of object distances within the 3-D FOV (10") of the system while the composite planar laser illumination beam 12 illuminates the object.

As illustrated in FIG. 7A, the PLIIM-based system 100 further comprises: an image frame grabber 19 operably connected to linear-type image formation and detection module 3A, for accessing 1-D digital images of the object being illuminated by the planar laser illumination arrays 6A and 6B during object illumination and imaging operations; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer, and a camera control computer 22 operably connected to the various components within the system for controlling the operation thereof in an orchestrated manner.

As shown in FIG. 7B, a coplanar relationship exists between the planar laser illumination beam(s) produced by the planar laser illumination arrays 6A and 6B, and the variable field of view (FOV) 10" produced by the variable holographic-based focal length imaging subsystem described above. An advantage of this hybrid PLIIM-based system design is that it also enables the generation of a 3-D image-based scanning volume having multiple depths of focus by virtue of its holographic-based variable focal length imaging subsystem.

Second Illustrative Embodiment of the Hybrid Holographic/CCD PLIIM-Based System of the Present Invention In FIG. 8A, a second illustrative embodiment of the hybrid holographic/CCD PLIIM-based system of the present invention 100' is shown, wherein a holographic-based imaging subsystem is used to produce a wide range of discrete field of views (FOVs), over which the system can acquire images of target objects using an area-type image detection array having a 3-D field of view (FOV) that is coplanar with a planar laser illumination beam in accordance with the principles of the present invention. In this system configuration, it is understood that the PLIIM system 100' can used in a holder-over type scanning application, hand-held scanner application, or presentation-type scanner.

As illustrated in FIG. 8A, the hybrid holographic/CCD PLIIM-based system 101' comprises: (i) a pair of planar laser illumination arrays 6A and 6B for generating a pair of planar laser illumination beams (PLIBs) 7A and 7B; a pair of PLIB folding/sweeping mirrors 37A' and 37B' for folding and sweeping the planar laser illumination beams (PLIBs) through the 3-D field of view of the imaging subsystem; a holographic-type cylindrical lens 101 for collimating the rays of the planar laser illumination beam down onto the conveyor belt surface; and a motor-driven holographic imaging disc 102, supporting a plurality of transmission-type volume holographic optical elements (HOE) 103, as the disc is rotated about its rotational axis. Each HOE 103 on the imaging disc has a different focal length, and is disposed before an area (2-D) type CCD image detection array 55A. The holographic imaging disc 102 and image detection array 55A function as a variable-type imaging subsystem that is capable of detecting images of objects over a large range of object (i.e. working) distances within the 3-D FOV (10") of the system while the composite planar laser illumination beam 12 illuminates the object.

As illustrated in FIG. 8A, the PLIIM-based system 101' further comprises: an image frame grabber 19 operably connected to an area-type image formation and detection module 55", for accessing 2-D digital images of the object being illuminated by the planar laser illumination arrays 6A and 6B during object illumination and imaging operations; an image data buffer (e.g. VRAM) 20 for buffering 2-D images received from the image frame grabber 19; an image processing computer 21, operably connected to the image data buffer 20, for carrying out image processing algorithms (including bar code symbol decoding algorithms) and operators on digital images stored within the image data buffer; and a camera control computer 22 operably connected to the various components within the system for controlling the operation thereof in an orchestrated manner.

As shown in FIG. 8B, a coplanar relationship exists between the planar laser illumination beam(s) produced by the planar laser illumination arrays (PLIAs) 6A and 6B, and the variable field of view (FOV) 10" produced by the variable holographic-based focal length imaging subsystem described above. The advantage of this hybrid system design is that it enables the generation of a 3-D image-based scanning volume having multiple depths of focus by virtue of the holographic-based variable focal length imaging subsystem employed in the PLIIM system.

Application of Despeckling Methods and Mechanisms of Present Invention to Area-Type PLIIM-Based Imaging Systems and Devices Notably, in any area-type PLIIM-based system, a mechanism is provided to automatically sweep the PLIB through the 3-D field of view (FOV) of the system during each image capture period. In such systems, the photo-integration time period associated with each row of image detection elements in its 2D image detection array, should be relatively short in relation to the total time duration of each image capture period associated with the entire 2-D image detection array. This ensures that all rows of linear image data will be faithfully captured and buffered, without creating motion blur and other artifacts.

Any of the first through eight generalized methods of despeckling described above can be applied to an area-type PLIIM-based system. Any wavefront control techniques applied to the PLIB in connection with the realization of a particular despeckling technique described herein will enable time and (possibly a little spatial) averaging across each row of image detection elements (in the area image detection array) which corresponds to each linear image captured by the PLIB as it is being swept over the object surface within the 3-D FOV of the PLIIM-based system. In turn, this will enable a reduction in speckle-pattern noise along the horizontal direction (i.e. width dimension) of the image detection elements in the area image detection array.

Also, vertically-directed sweeping action of the PLIB over the object surface during each image capture period will produce temporally and spatially varying speckle noise pattern elements along that direction which can be both temporally and spatially averaged to a certain degree during each photo-integration time period of the area-type PLIIM-based imaging system, thereby helping to reduce the RMS power of speckle-pattern noise observed at the area image detection array in the PLIIM-based imaging system.

By applying the above teachings, each and every area-type PLIIM-based imaging system can benefit from the generalized despeckling methods of the present invention.

First Illustrative Embodiment of the Unitary Object Identification and Attribute Acquisition System of the Present Invention Embodying a PLIIM-Based Object Identification Subsystem and a LADAR-Based Imaging, Detecting and Dimensioning Subsystem Referring now to FIGS. 9, 10 and 11, a unitary object identification and attribute acquisition system of the first illustrated embodiment 120, installed above a conveyor belt structure in a tunnel system configuration, will now be described in detail.

As shown in FIG. 10, the unitary system 120 of the present invention comprises an integration of subsystems, contained within a single housing of compact construction supported above the conveyor belt of a high-speed conveyor subsystem 121, by way of a support frame or like structure. In the illustrative embodiment, the conveyor subsystem 121 has a conveyor belt width of at least 48 inches to support one or more package transport lanes along the conveyor belt. As shown in FIG. 10, the unitary system comprises four primary subsystem components, namely: (1) a LADAR-based package imaging, detecting and dimensioning subsystem 122 capable of collecting range data from objects on the conveyor belt using a pair of amplitude-modulated (AM) multi-wavelength (i.e. containing visible and IR spectral components) laser scanning beams projected at different angular spacings as taught in copending U.S. application Ser. No. 09/327,756 filed Jun. 7, 1999, supra, and International PCT Application No. PCT/US00/15624 filed Jun. 7, 2000, incorporated herein by reference, and now published as WIPO Publication No. WO 00/75856 A1, on Dec. 14, 2000; (2) a PLIIM-based bar code symbol reading (i.e. object identification) subsystem 25', as shown in FIGS. 3E4 through 3E8, for producing a 3-D scanning volume above the conveyor belt, for scanning bar codes on packages transported therealong; (3) an input/output subsystem 127 for managing the data inputs to and data outputs from the unitary system, including data inputs from subsystem 25'; (4) a data management computer 129 with a graphical user interface (GUI) 130, for realizing a data element queuing, handling and processing subsystem 131, as well as other data and system management functions; and (5) and a network controller 132, operably connected to the I/O subsystem 127, for connecting the system 120 to the local area network (LAN) associated with the tunnel-based system, as well as other packet-based data communication networks supporting various network protocols (e.g. Ethernet, IP, etc). Also, the network communication controller 132 enables the unitary system to receive, using Ethernet or like networking protocols, data inputs from a number of package-attribute input devices including, for example: weighing-in-motion subsystem 132, shown in FIG. 10 for weighing packages as they are transported along the conveyor belt; an RFID-tag reading (i.e. object identification) subsystem for reading RF tags on packages as they are transported along the conveyor belt; an externally mounted belt tachometer for measuring the instant velocity of the belt and package transported therealong; and various "object attribute" data producing subsystems, such as airport x-ray scanning systems, cargo x-ray scanners, PFNA-based explosive detection systems (EDS), Quadrupole Resonance Analysis (QRA) based or MRI-based screening systems for screening/analyzing the interior of objects to detect the presence of contraband, explosive material, biological warfare agents, chemical warfare agents, and/or dangerous or security threatening devices.

In the illustrative embodiment shown in FIGS. 9 through 11, this array of Ethernet data input/output ports is realized by a plurality of Ethernet connectors mounted on the exterior of the housing, and operably connected to an Ethernet hub mounted within the housing. In turn, the Ethernet hub is connected to the I/O unit 127, shown in FIG. 10. In the illustrative embodiment, each object attribute producing subsystem indicated above will also have a network controller, and a dynamically or statically assigned IP address on the LAN in which unitary system 120 is connected, so that each such subsystem is capable of transporting data packets using TCP/IP.

In addition, an optical filter (FO) network controller 133 may be provided within the unitary system 120 for supporting the Ethernet or other network protocol over a fiber optical cable communication medium. The advantage of fiber optical cable is that it can be run thousands of feet within and about an industrial work environment while supporting high information transfer rates (required for image lift and transfer operations) without information loss. The fiber-optic data communication interface supported by FO network controller 133 enables the tunnel-based system of FIG. 9 to be installed thousands of feet away from a keying station in a package routing hub (i.e. center), where lifted digital images and OCR (or barcode) data are simultaneously displayed on the display of a computer work station. Each bar code and/or OCR image processed by tunnel system 120 is indexed in terms of a probabilistic reliability measure, and if the measure falls below a predetermined threshold, then the lifted image and bar code and/or OCR data are simultaneously displayed for a human "key" operator to verify and correct file data, if necessary.

In the illustrative embodiment, the data management computer 129 employed in the object identification and attribute acquisition system 120 is realized as complete micro-computing system running operating system (OS) software (e.g. Microsoft NT, Unix, Solaris, Linux, or the like), and providing full support various protocols, including: Transmission Control Protocol/Internet Protocol (TCP/IP); File Transfer Protocol (FTP); HyperText Transport Protocol (HTTP); Simple Network Management Protocol (SNMP); and Simple Message Transport Protocol (SMTP). The function of these protocols in the object identification and attribute acquisition system 120, and networks built using the same, will be described in detail hereinafter with reference to FIGS. 30A through 30D2.

While a LADAR-based package imaging, detecting and dimensioning/profiling (i.e. LDIP) subsystem 122 is shown embodied within system 120, it is understood that other types of package imaging, detecting and dimensioning subsystems based on non-LADAR height/range data acquisition techniques (e.g. using structured laser illumination, CCD-imaging, and triangulation measurement techniques) may be used to realize the unitary package identification and attribute-acquisition system of the present invention.

As shown in FIG. 10, the LADAR-based object imaging, detecting and dimensioning/profiling (LDIP) subsystem 122 comprises an integration of subsystems, namely: an object velocity measurement subsystem 123, for measuring the velocity of transported packages by analyzing range-based height data maps generated by the different angularly displaced AM laser scanning beams of the subsystem, using the inventive methods disclosed in International PCT Application No. PCT/US00/15624 filed Dec. 7, 2000, supra; automatic package detection and tracking subsystem comprising (i) a package-in-the-tunnel (PITT) indication (i.e. detection) subsystem 125, for automatically detecting the presence of each package moving through the scanning volume by reflecting a portion of one of the laser scanning beams across the width of the conveyor belt in a retro-reflective manner and then analyzing the return signal using first derivative and thresholding techniques disclosed in International PCT Application No. PCT/US00/15624 filed Dec. 7, 2000, and (ii) a package-out-of-the-tunnel (POOT) indication (i.e. detection) subsystem 125, integrated within subsystem 122, realized using, for example, predictive techniques based on the output of the PITT indication subsystem 125, for automatically detecting the presence of packages moving out of the scanning volume; and a package (x-y) height, width and length (H/W/L) dimensioning (or profiling) subsystem 124, integrated within subsystem 122, for producing x,y,z profile data sets for detected packages, referenced against one or more coordinate reference systems symbolically embedded within subsystem 122, and/or unitary system 120.

The primary function of LDIP subsystem 122 is to measure dimensional (including profile) characteristics of objects (e.g. packages) passing through the scanning volume, and produce a package dimension data element for each dimensioned/profiled package. The primary function of PLIIM-based subsystem 25' is to automatically identify dimensioned/profiled packages by reading bar code symbols on thereon and produce a package identification data element representative of each identified package. The primary function of the I/O subsystem 127 is to transport package dimension data elements and package identification data elements to the data element queuing, handling and processing subsystem 131 for automatic linking (i.e. matching) operations.

In the illustrative embodiment of FIG. 9, the primary function of the data element queuing, handling and processing subsystem 131 in the illustrative is to automatically link (i.e. match) each package dimension data element with its corresponding package identification data element, and to transport such data element pairs to an appropriate host system for subsequent use (e.g. package routing subsystems, cost-recovery subsystems, etc.). As unitary system 120 has application beyond packages and parcels, and in fact, can be used in connection with virtually any type of object having an identity and attribute characteristics, it becomes important to understand that the data element queuing, handling and processing subsystem 131 of the present invention has a much broader role to play during the operation of the unitary system 120. As will be described in greater detail with reference to FIG. 10A, broader function to be performed by subsystem 130 is to automatically link object identity data elements with object attribute data elements, and to transport these linked data element sets to host systems, databases, and other systems adapted to use such correlated data.

By virtue of subsystem 25' and LDIP subsystem 122 being embodied within a single housing 121, an ultra-compact device is provided that can automatically detect, track, identify, acquire attributes (e.g. dimensions/profile characteristics) and link identity and attribute data elements associated with packages moving along a conveyor structure without requiring the use of any external peripheral input devices, such as tachometers, light-curtains, etc.

Data-Element Queuing, Handling and Processing (Q, H & P) Subsystem Integrated Within the PLIIM-Based Object Identification and Attribute Acquisition System of FIG. 10

In FIG. 10A, the Data-Element Queuing, Handling And Processing (QHP) Subsystem 131 employed in the PLIIM-based Object Identification and Attribute Acquisition System of FIG. 10, is illustrated in greater detail. As shown, the data element QHP subsystem 131 comprises a Data Element Queuing, Handling, Processing And Linking Mechanism 2600 which automatically receives object identity data element inputs 2601 (e.g. from a bar code symbol reader, RFID-tag reader, or the like) and object attribute data element inputs 2602 (e.g. object dimensions, object weight, x-ray images, Pulsed Fast Neutron Analysis (PFNA) image data captured by a PFNA scanner by Ancore, and QRA image data captured by a QRA scanner by Quantum Magnetics, Inc.) from the I/O unit 127, as shown in FIG. 10.

The primary functions of the a Data Element Queuing, Handling, Processing And Linking Mechanism 2600 are to queue, handle, process and link data elements (of information files) supplied by the I/O unit 127, and automatically generate as output, for each object identity data element supplied as input, a combined data element 2603 comprising (i) an object identity data element, and (ii) one or more object attribute data elements (e.g. object dimensions, object weight, x-ray analysis, neutron beam analysis, etc.) collected by the I/O unit of the unitary system 120 and supplied to the data element queuing, handling and processing subsystem 131 of the illustrative embodiment.

In the illustrative embodiment, each object identification data element is typically a complete information structure representative of a numeric or alphanumeric character string uniquely identifying the particular object under identification and analysis. Also, each object attribute data element is typically a complete information file associated, for example, with the information content of an optical, X-ray, PFNA or QRA image captured by an object attribute information producing subsystem. In the case where the size of the information content of a particular object attribute data element is substantially large, in comparison to the size of the data blocks transportable within the system, then each object attribute data element may be decomposed into one or more object attribute data elements, for linking with its corresponding object identification data elements. In this case, each combined data element 2603 will be transported to its intended data storage destination, where object attribute data elements corresponding to a particular object attribute (e.g. x-ray image) are reconstituted by a process of synthesis so that the entire object attribute data element can be stored in memory as a single data entity, and accessed for future analysis as required by the application at hand.

In general, Data Element Queuing, Handling, Processing And Linking Mechanism 2600 employed in the PLIIM-based Object Identification and Attribute Acquisition System of FIG. 10 is a programmable data element tracking and linking (i.e. indexing) module constructed from hardware and software components. Its primary function is to link (1) object identity data to (2) corresponding object attribute data (e.g. object dimension-related data, object-weight data, object-content data, object-interior data, etc.) in both singulated and non-singulated environments. Depending on the object detection, tracking, identification and attribute acquisition capabilities of the system configuration at hand, the Data Element Queuing, Handling, Processing And Linking Mechanism 2600 will need to be programmed in a different manner to enable the underlying functions required by its specified capabilities, indicated above.

For example, consider the case where one uses one or more object identification and attribute acquisition systems 120 to build a "singulated-type" tunnel-based package identification dimensioning system as taught in Applicant's WIPO Publication No. 99/49411, published Sep. 30, 1999, incorporated herein by reference. In this case, the Data Element Queuing, Handling, Processing And Linking Mechanism 2600 employed therein will need to be configured to accommodate the fact that object identification data elements and object attribute data elements (e.g. package dimension data elements) have been acquired from "singulated" packages moving along a conveyor belt structure. However, specification of this system capacity (i.e. singulation) is not sufficient to program the Data Element Queuing, Handling, Processing And Linking Mechanism 2600. Several other system capabilities, identified in FIG. 10B, require specification before the Data Element Queuing, Handling, Processing And Linking Mechanism 2600 can be properly programmed. At this juncture, it will be helpful to consider several different package identification and dimensioning systems and their system capabilities, in order to obtain a keener appreciation for the information requirements necessary to properly program Data Element Queuing, Handling, Processing And Linking Mechanism 2600 and enable the specified capabilities of the system configuration.

Consider the case, wherein one or more "flying-spot" laser scanning bar code readers are used to identify singulated packages or parcels by reading bar code symbols thereon with laser scanning beams, and wherein an LDIP Subsystem 122 is used to determine the coordinate dimensions of packages transported along a high-speed conveyor belt structure, as taught in the system shown in FIGS. 1 through 32B in Applicants' WIPO Publication No. 99/49411, supra. In this case, the Data Element Queuing, Handling, Processing And Linking Mechanism 2600 can be configured (via programming) to provide the subsystem structure shown in FIGS. 22A and 22B in said WIPO Publication No. 99/49411.

Consider a different case, wherein "image-based" bar code readers are used to identify singulated packages or parcels by reading bar code symbols represented in captured images, and wherein an LDIP Subsystem 122 is used to determine the coordinate dimensions of packages transported along a high-speed conveyor belt structure, as taught in the system shown in FIGS. 49 through 56 in Applicants' WIPO Publication No. 00/75856 published on Dec. 14, 2000, incorporated herein by reference. In this case, the Data Element Queuing, Handling, Processing And Linking Mechanism 2600 can be configured (via programming) to provide the subsystem structure generally shown in FIGS. 22 and 22A in said WIPO Publication No. 99/49411, wherein 1-D or 2-D image detection arrays (employed in the system) are modeling in a manner somewhat similar to a polygon-based bottom-type scanning subsystem shown in FIG. 28 in WIPO Publication No. 99/49411 where scanning occurs only at the surface of a conveyor belt structure.

Consider a more complicated case, wherein "flying-spot" laser scanning bar code readers are used to identify non-singulated packages by reading bar code symbols thereon with laser scanning beams, and wherein an LDIP Subsystem 122 is used to determine coordinate dimensions of packages, as taught in the system shown in FIGS. 47 through 59B in Applicants' WIPO Publication No. 99/49411. In this case, the Data Element Queuing, Handling, Processing And Linking Mechanism 2600 might be configured (via programming) to provide the subsystem structure shown in FIGS. 51 and 51A in said WIPO Publication No. 99/49411.

As shown above, system configurations having different object detection, tracking, identification and attribute-acquisition capabilities will necessitate different requirements in its Data Element Queuing, Handling, Processing And Linking Mechanism 2600, and such requirements can be satisfied by implementing appropriate data element queuing, handling and processing techniques in accordance with the principles of the present invention taught herein.

In FIG. 68C4, the Object Identification And Attribute Acquisition System 120 of the illustrative embodiment is shown used to automatically link (i) baggage identification information (i.e. collected by either a image-based bar code reader or an RFID-tag reader) with (ii) baggage attribute information (i.e. collected by an x-ray scanner, a PFNA scanner, QRA scanner or the like). In this application, the Data Element Queuing, Handling And Processing Subsystem 131 is programmed to receive two different streams of data input at its I/O unit 127, namely: (i) baggage identification data input (e.g. from a bar code reader or RFID reader) used at the baggage check-in or screening station of the airport security screening system shown in FIG. 68; and (ii) corresponding baggage attribute data input (e.g. baggage profile characteristics and dimensions, weight, X-ray images, PFNA images, QRA images, etc.) generated at the baggage check-in and screening station.

During operation of the system shown in FIG. 68, streams of baggage identification information and baggage attribute information are automatically generated at the baggage screening subsystem thereof. In accordance with the principles of the present invention, each baggage attribute data is automatically attached to each corresponding baggage identification data element, so as to produce a composite linked data element comprising the baggage identification data element symbolically linked to corresponding baggage attribute data element(s) received at the system. In turn, the composite linked data element is transported to a database for storage and subsequent processing, or directly to a data processor for immediate processing, as described in detail above.

Stand-Alone Object Identification and Attribute Information Tracking and Linking Computer System of the Present Invention As shown in FIGS. 68A, 68C1, 68C2 and 68C3, the Data Element QHP Subsystem 131 shown in FIG. 10A also can be realized as a stand-alone, Object Identification And Attribute Information Tracking And Linking Computer System 2639 for use in diverse systems generating and collecting streams of object identification information and object attribute information.

According to this alternative embodiment shown in FIGS. 68C1 and 68C2, the Object Identification And Attribute Information Tracking And Linking Computer System 2639 is realized as a compact computing/network communications device having a set of comprises a number of: a housing 3000 of compact construction; a computing platform including a microprocessor (e.g. 800 MHz Celeron processor from Intel) 3001, system bus 3002, an associated memory architecture (e.g. hard-drive 3003, RAM 3004, ROM 3005 and cache memory), and operating system software (e.g. Microsoft NT OS), networking software, etc. 3006; a LCD display panel 3007 mounted within the wall of the housing, and interfaced with the system bus 3002 by interface drivers 3008; a membrane-type keypad 3009 also mounted within the wall of the housing below the LCD panel, and interfaced with the system bus 3002 by interface drivers 3010; a network controller card 3011 operably connected to the microprocessor 3001 by way of interface drivers 3012, for supporting high-speed data communications using any one or more networking protocols (e.g. Ethernet, Firewire, USB, etc.); a first set of data input port connectors 3013 mounted on the exterior of the housing 3000, and configurable to receive "object identity" data input from an object identification device (e.g. a bar code reader and/or an RFID reader) using a networking protocol such as Ethernet; a second set of the data input port connectors 3014 mounted on the exterior of the housing 3000, and configurable to receive "object attribute" data input from external data generating sources (e.g. an LDIP Subsystem 131, a PLIIM-based imager 25', an x-ray scanner, a neutron beam scanner, MRI scanner and/or a QRA scanner) using a networking protocol such as Ethernet; a network connection port 3015 for establishing a network connection between the network controller 3011 and the communication medium to which the Object Identification And Attribute Information Tracking And Linking Computer System is connected; data element queuing, handling, processing and linking software 3016 stored on the hard-drive, for enabling the automatic queuing, handling, processing, linking and transporting of object identification (ID) and object attribute data elements generated within the network and/or system, to a designated database for storage and subsequent analysis; and a networking hub 3017 (e.g. Ethernet hub) operably connected to the first and second sets of data input port connectors 3013 and 3014, the network connection port 3015, and also the network controller card 3011, as shown in FIG. 68C2, so that all networking devices connected through the networking hub 3017 can send and receive data packets and support high-speed digital data communications.

As illustrated in FIG. 68C3, the Object Identification And Attribute Information Tracking And Linking Computer 2639 employed in the system of FIG. 68C1 is programmed to receive at its I/O unit 127 two different streams of data input, namely: (i) passenger identification data input 3020 (e.g. from a bar code reader or RFID reader) used at the passenger check-in and screening station; and (ii) corresponding passenger attribute data input 3021 (e.g. passenger profile characteristics and dimensions, weight, X-ray images, etc.) generated at the passenger check-in and screening station. During operation, each passenger attribute data input is automatically attached to each corresponding passenger identification data element input, so as to produce a composite linked output data element 3022 comprising the passenger identification data element symbolically linked to corresponding passenger attribute data elements received at the system. In turn, the composite linked output data element is automatically transported to a database for storage for subsequent processing, or to a data processor for immediate processing.

A Method of and Subsystem for Configuring and Setting-Up any Object Identity and Attribute Information Acquisition System or Network Employing the Data Element Queuing, Handling, and Processing Mechanism of the Present Invention The way in which Data Element Queuing, Handling And Processing Subsystem 131 will be programmed will depend on a number of factors, including the object detection, tracking, identification and attribute-acquisition capabilities required by or otherwise to be provided to the system or network under design and configuration.

To enable a system engineer or technician to quickly configure the Data Element Queuing, Handling, Processing And Linking Mechanism 2600, the present invention provides an software-based system configuration manager (i.e. system configuration "wizard" program) which can be integrated (i) within the Object Identification And Attribute Acquisition Subsystem of the present invention 120, as well as (ii) within the Stand-Alone Object Identification And Attribute Information Tracking And Linking Computer System of the present invention shown in FIGS. 68C1, 68C2 and 68C3.

As graphically illustrated in FIG. 10B, the system configuration manager of the present invention assists the system engineer or technician in simply and quickly configuring and setting-up the Object Identity And Attribute Information Acquisition System 120, as well as the Stand-Alone Object Identification And Attribute Information Tracking And Linking Computer System 2639 shown in FIGS. 68C1 through 68C3. In the illustrative embodiment, the system configuration manager employs a novel graphical-based application programming interface (API) which enables a systems configuration engineer or technician having minimal programming skill to simply and quickly perform the following tasks: (1) specify the object detection, tracking, identification and attribute acquisition capabilities (i.e. functionalities) which the system or network being designed and configured should possess, as indicated in Steps A, B and C in FIG. 10C; (2) determine the configuration of hardware components required to build the configured system or network, as indicated in Step D in FIG. 10C; and (3) determine the configuration of software components required to build the configured system or network, as indicated in Step E in FIG. 10C, so that it will possess the object detection, tracking, identification, and attribute-acquisition capabilities specified in Steps A, B, and C.

In the illustrative embodiment shown in FIGS. 10B and 10C, system configuration manager of the present invention enables the specification of the object detection, tracking, identification and attribute acquisition capabilities (i.e. functionalities) of the system or network by presenting a logically-ordered sequence of questions to the systems configuration engineer or technician, who has been assigned the task of configuring the Object Identification and Attribute Acquisition System or Network at hand. As shown in FIG. 10B, these questions are arranged into three predefined groups which correspond to the three primary functions of any object identity and attribute acquisition system or network being considered for configuration, namely: (1) the object detection and tracking capabilities and functionalities of the system or network; (2) the object identification capabilities and functionalities of the system or network; and (3) the object attribute acquisition capabilities and functionalities of the system or network. By answering the questions set forth at each of the three levels of the tree structure shown in FIG. 10B, a full specification of the object detection, tracking, identification and attribute-acquisition capabilities of the system will be provided. Such intelligence is then by the system configuration manager program to automatically select and configure appropriate hardware and software components into a physical realization of the system or network configuration design.

At the first (i.e. highest) level of the tree structure in FIG. 10B, the systems configuration manager presents a set of questions to the systems configuration engineer inquiring whether or not the system or network should be capable of detecting and tracking singulated objects, or non-singulated objects. As shown at Block A in FIG. 10C, this can be achieved by presenting a GUI display screen asking the following question, and providing a list of answers which correspond to the capabilities realizable by the software and hardware libraries on hand: "What kind of object detection and tracking capability will the configured system have (e.g. singulated object detection and tracking, or non-singulated object detection and tracking)?"

At the second (i.e. middle) level of the tree structure in FIG. 10B, the systems configuration manager presents a set of questions to the systems configuration engineer inquiring whether how objection identification will be carried out in the system or network. As shown at Block B in FIG. 10C, this can be achieved by presenting a GUI display screen asking the following question, and providing a list of answers which correspond to the capabilities realizable by the software and hardware libraries on hand: "What kind of object identification capability will the configured system employ (i.e. one employing "flying-spot" laser scanning techniques, image capture and processing techniques, and/or radio-frequency identification (RFID) techniques)?"

At the third (i.e. lowest) level of the tree structure in FIG. 10B, the systems configuration manager presents a set of questions to the systems configuration engineer inquiring whether what kinds of object attributes will be acquired either by the system or network or by any of the subsystems which are operably connected thereto. As shown at Block C in FIG. 10C, this can be achieved by presenting a GUI display screen asking the following question, and providing a list of answers which correspond to the capabilities realizable by the software and hardware libraries on hand: "What kind of object attribute information collection capabilities will the configured system have (e.g. object dimensioning only, or object dimensioning with other object attribute intelligence collection such as optical analysis, x-ray analysis, neutron-beam analysis, QRA, MRA, etc.)?"

As shown in FIG. 10B, there are twelve (12) primary "possible" lines of questioning in the illustrative embodiment which the system configuration manager program may conduct. Depending on the answers provided to these questions, schematically depicted in the tree structure of FIG. 10B, the subsystems which perform these functions in the system or network will have different hardware and software specifications (to be subsequently used to configure the network or system). Therefore, the systems configuration manager will automatically specify a different set of hardware and software components available in its software and hardware libraries which, when configured properly, are capable of carrying out the specified functionalities of the system or network.

As illustrated at Block D in FIG. 10C, the system configuration manager program analyzes the answers provided to the questions presented during Steps A, B and C, and based thereon, automatically determines the hardware components (available in its Hardware Library) that it will need to construct the hardware-aspects of the specified system configuration. This specified information is then used by technicians to physically build the system or network according to the specified system or network configuration.

As indicated at Block E in FIG. 10C, the system configuration manager program analyzes the answers provided to the above questions presented during Steps A, B and C, and based thereon, automatically determines the software components (available in its Software Library) that it will need to construct the software-aspects of the specified system or network configuration.

As indicated at Block F in FIG. 10C, the system configuration manager program thereafter accesses the determined software components from its Software Library (e.g. maintained on an information server within the system engineering department), and compiles these software components with all other required software programs, to produce a complete "System Software Package" designed for execution upon a particular operating system supported upon the specified hardware configuration. This System Software Package can be stored on either a CD-ROM disc and/or on FTP-enabled information server, from which the compiled System Software Package can be downloaded by an system configuration engineer or technician having a proper user identification and password. Alternatively, prior to shipment to the installation site, the compiled System Software Package can be installed on respective computing platforms within the appropriate unitary object identification and attribute acquisition systems, to simplify installation of the configured system or network in a plug-and-play, turn-key like manner.

As indicated at Block G in FIG. 10C, the systems configuration manager program will automatically generate an easy-to-follow set of Installation Instructions for the configured system or network, guiding the technician through an easy to follow installation and set-up procedures making sure all of the necessary system and subsystem hardware components are properly installed, and system and network parameters set up for proper system operation and remote servicing.

As indicated at Block H in FIG. 10C, once the hardware components of the system have been properly installed and configured, the set-up procedure properly completed, the technician is ready to operate and test the system for troubles it may experience, and diagnose the same with or without remote service assistance made available through the remote monitoring, configuring, and servicing system of the present invention, illustrated in FIGS. 30A through 30D2.

The Subsystem Architecture of Unitary PLIIM-Based Object Identification and Attribute Acquisition System of the Second Illustrative Embodiment of the Present Invention In FIG. 11, the subsystem architecture of unitary PLIIM-based object identification and attribute-acquisition (e.g. dimensioning) system 140 is schematically illustrated in greater detail. As shown, various information signals (e.g., Velocity(t), Intensity(t), Height(t), Width(t), Length(t)) are automatically generated by LDIP subsystem 122 mounted therein and provided to the camera control computer 22 embodied within its PLIIM-based subsystem 25'. Notably, the Intensity(t) data signal generated from LDIP subsystem 122 represents the magnitude component of the polar-coordinate referenced range-map data stream, and specifies the "surface reflectivity" characteristics of the scanned package. The function of the camera control computer 22 is to generate digital camera control signals which are provided to the IFD subsystem (i.e. "variable zoom/focus camera") 3" so that subsystem 25' can carry out its diverse functions in an integrated manner, including, but not limited to: (1) automatically capturing digital images having (i) square pixels (i.e. 1:1 aspect ratio) independent of package height or velocity, (ii) significantly reduced speckle-noise levels, and (iii) constant image resolution measured in dots per inch (DPI) independent of package height or velocity and without the use of costly telecentric optics employed by prior art systems; (2) automatically cropping captured digital images so that digital data concerning only "regions of interest" reflecting the spatial boundaries of a package wall surface or a package label are transmitted to the image processing computer 21 for (i) image-based bar code symbol decode-processing, and/or (ii) OCR-based image processing; and (3) automatic digital image-lifting operations for supporting other package management operations carried out by the end-user.

During system operation, the PLIIM-based subsystem 25' automatically generates and buffers digital images of target objects passing within the field of view (FOV) thereof. These images, image cropping indices, and possibly cropped image components, are then transmitted to image processing computer 21 for decode-processing and generation of package identification data representative of decoded bar code symbols on the scanned packages. Each such package identification data element is then provided to data management computer 129 via I/O subsystem 127 (as shown in FIG. 10) for linking with a corresponding package dimension data element, as described in hereinabove. Optionally, the digital images of packages passing beneath the PLIIM-based subsystem 25' can be acquired (i.e. lifted) and processed by image processing computer 21 in diverse ways (e.g. using OCR programs) to extract other relevant features of the package (e.g. identity of sender, origination address, identity of recipient, destination address, etc.) which might be useful in package identification, tracking, routing and/or dimensioning operations. Details regarding the cooperation of the LDIP subsystem 122, the camera control computer 22, the IFD Subsystem 3" and the image processing computer 21 will be described herein after with reference to FIGS. 20 through 29.

In FIGS. 12A and 12B, the physical construction and packaging of unitary system 120 is shown in greater detail. As shown, PLIIM-based subsystem 25' of FIGS. 3E1–3E8 and LDIP subsystem 122 are contained within specially-designed, dual-compartment system housing design 161 shown in FIGS. 12A and 12B to be described in detail below.

As shown in FIG. 12A, the PLIIM-based subsystem 25' is mounted within a first optically-isolated compartment 162 formed in system housing 161, whereas the LDIP subsystem 122 and associated beam folding mirror 163 are mounted within a second optically isolated compartment 164 formed therein below the first compartment 162. Both optically isolated compartments are realized using optically-opaque wall structures. As shown in FIG. 12A, a first set of spatially registered light transmission apertures 165A1, 165A2 and 165A3 are formed through the bottom panel of the first compartment 162, in spatial registration with the light transmission apertures 29A', 28', 29B' formed in subsystem 25'. Below light transmission apertures 165A1, 165A2 and 165A3, there is formed a completely open light transmission aperture 165B, defined by vertices EFBC, which permits laser light to exit and enter the first compartment 162 during system operation. A hingedly connected panel 169 is provided on the side opening of the system housing 161, defined by vertices ABCD. The function of this hinged panel 169 is to enable authorized personnel to access the interior of the housing and clean the glass windows provided over light transmission apertures 29A', 28', 29B'. This is an important consideration in most industrial scanning environments.

As shown in FIG. 12B, the LDIP subsystem 122 is mounted within the second compartment 164, along with beam folding mirror 163 directed towards a second light transmission aperture 166 formed in the bottom panel of the second compartment 164, in an optically-isolated manner from the first set of light transmission apertures 165A1, 165A2 and 165A3. The function of the beam folding mirror 163 is to enable the LDIP subsystem 122 to project its dual, angularly-spaced amplitude-modulated (AM) laser beams 167A/167B out of its housing, off beam folding mirror 163, and towards a target object to be dimensioned and profiled in accordance with the principles of invention detailed in copending U.S. application Ser. No. 09/327,756 filed Jun. 7, 1999, supra, and International PCT Application No. PCT/US00/15624, supra. Also, this light transmission aperture 166 enables reflected laser return light to be collected and detected off the illuminated target object.

As shown in FIG. 12B, a stationary cylindrical lens array 299 is mounted in front of each PLIA (6A, 6B) adjacent the illumination window formed within the optics bench 8 of the PLIIM-based subsystem 25'. The function performed by cylindrical lens array 299 is to optically combine the individual PLIB components produced from the PLIMs constituting the PLIA, and project the combined PLIB components onto points along the surface of the object being illuminated. By virtue of this inventive feature, each point on the object surface being imaged will be illuminated by different sources of laser illumination located at different points in space (i.e. spatially coherent-reduced laser illumination), thereby reducing the RMS power of speckle-pattern noise observable at the linear image detection array of the PLIIM-based subsystem.

As shown in FIG. 12C, various optical and electro-optical components associated with the unitary object identification and attribute acquisition system of FIG. 9 are mounted on a first optical bench 510 that is installed within the first optically-isolated cavity 162 of the system housing. As shown, these components include: the camera subsystem 3", its variable zoom and focus lens assembly, electric motors for driving the linear lens transport carriages associated with this subsystem, and the microcomputer for realizing the camera control computer 22; camera FOV folding mirror 9, power supplies; VLD racks 6A and 6B associated with the PLIAs of the system; microcomputer 512 employed in the LDIP subsystem 122; the microcomputer for realizing the camera control computer 22 and image processing computer 21; connectors, and the like.

As shown in FIG. 12D, various optical and electro-optical components associated with the unitary object identification and attribute acquisition system of FIG. 9 are mounted on a second optical bench 520 that is installed within the second optically-isolated cavity 164 of the system housing. As shown, these components include, for the LDIP subsystem 122: a pair of VLDs 521A and 521B for producing a pair of AM laser beams 167A and 167B for use by the subsystem; a motor-driven rotating polygon structure 522 for sweeping the pair of AM laser beams across the rotating polygon 522; a beam folding mirror 163 for folding the swept AM laser beams and directing the same out into the scanning field of the subsystem at different scanning angles, so enable the scanning of packages and other objects within its scanning field via AM laser beams 167A/167B; a first collector mirror 523 for collecting AM laser light reflected off a package scanned by the first AM laser beam, and first light focusing lens 524 for focusing this collected laser light to a first focal point; a first avalanche-type photo-detector 525 for detecting received laser light focused to the first focal point, and generating a first electrical signal corresponding to the received AM laser beam detected by the first avalanche-type photo-detector 525; a second collector mirror 526 for collecting AM laser light reflected off the package scanned by the second AM laser beam, and a second light focusing lens 527 for focusing collected laser light to a second focal point; a second avalanche-type photo-detector 528 for detecting received laser light focused to the second focal point, and generating a second electrical signal corresponding to the received AM laser beam detected by the second avalanche-type photo-detector 528; and a microcontroller and storage memory (e.g. hard-drive) 529 which, in cooperation with LDIP computer 512, provides the computing platform used in the LDIP subsystem 122 for carrying out the image processing, detection and dimensioning operations performed thereby. For further details concerning the LDIP subsystem 122, and its digital image processing operations, reference should be made to copending U.S. application Ser. No. 09/327,756 filed Jun. 7, 1999, supra, and International PCT Application No. PCT/US00/15624, supra.

As shown in FIG. 12E, the IFD subsystem 3" employed in unitary system 120 comprises: a stationary lens system 530 mounted before the stationary linear (CCD-type) image detection array 3A; a first movable lens system 531 for stepped movement relative to the stationary lens system during image zooming operations; and a second movable lens system 532 for stepped movements relative to the first movable lens system 531 and the stationary lens system 530 during image focusing operations. Notably, such variable zoom and focus capabilities that are driven by lens group translators 533 and 534, respectively, operate under the control of the camera control computer 22 in response to package height, length, width, velocity and range intensity information produced in real-time by the LDIP subsystem 122. The IFD (i.e. camera) subsystem 3" of the illustrative embodiment will be described in greater detail hereinafter with reference to the tables and graphs shown in FIGS. 21, 22 and 23.

In FIGS. 13A through 13C, there is shown an alternative system housing design 540 for use with the unitary object identification and attribute acquisition system of the present invention. As shown, the housing 540 has the same light transmission apertures of the housing design shown in FIGS. 12A and 12B, but has no housing panels disposed about the light transmission apertures 541A, 541B and 542, through which planar laser illumination beams (PLIBs) and the field of view (FOV) of the PLIIM-based subsystem extend, respectively. This feature of the present invention provides a region of space (i.e. housing recess) into which an optional device (not shown) can be mounted for carrying out a speckle-noise reduction solution within a compact box that fits within said housing recess, in accordance with the principles of the present invention. Light transmission aperture 543 enables the AM laser beams 167A/167B from the LDIP subsystem 122 to project out from the housing. FIGS. 13B and 13C provide different perspective views of this alternative housing design.

In FIG. 14, the system architecture of the unitary (PLIIM-based) object identification and attribute acquisition system 120 is shown in greater detail. As shown therein, the LDIP subsystem 122 embodied therein comprises: a Real-Time Object (e.g. Package) Height Profiling And Edge Detection Processing Module 550; and an LDIP Package Dimensioner 551 provided with an integrated object (e.g. package) velocity deletion module that computes the velocity of transported packages based on package range (i.e. height) data maps produced by the front end of the LDIP subsystem 122, as taught in greater detail in copending U.S. application No. U.S. application Ser. No. 09/327,756 filed Jun. 7, 1999, and International Application No. PCT/US00/15624, filed Jun. 7, 2000, published by WIPO on Dec. 14, 2000 under WIPO No. WO 00/75856 incorporated herein by reference in its entirety. The function of Real-Time Package Height Profiling And Edge Detection Processing Module 550 is to automatically process raw data received by the LDIP subsystem 122 and generate, as output, time-stamped data sets that are transmitted to the camera control computer 22. In turn, the camera control computer 22 automatically processes the received time-stamped data sets and generates real-time camera control signals that drive the focus and zoom lens group translators within a high-speed auto-focus/auto-zoom digital camera subsystem (i.e. the IFD module) 3" so that the image grabber 19 employed therein automatically captures digital images having (1) square pixels (i.e. 1:1 aspect ratio) independent of package height or velocity, (2) significantly reduced speckle-noise levels, and (3) constant image resolution measured in dots per inch (dpi) independent of package height or velocity. These digital images are then provided to the image processing computer 21 for various types of image processing described in detail hereinabove.

FIG. 15 sets forth a flow chart describing the primary data processing operations that are carried out by the Real-Time Package Height Profiling And Edge Detection Processing Module 550 within LDIP subsystem 122 employed in the PLIIM-based system 120.

As illustrated at Block A in FIG. 15, a row of raw range data collected by the LDIP subsystem 122 is sampled every 5 milliseconds, and time-stamped when received by the Real-Time Package Height Profiling And Edge Detection Processing Module 550.

As indicated at Block B, the Real-Time Package Height Profiling And Edge Detection Processing Module 550 converts the raw data set into range profile data R=f (int. phase), referenced with respect to a polar coordinate system symbolically embedded in the LDIP subsystem 122, as shown in FIG. 17.

At Block C, the Real-Time Package Height Profiling And Edge Detection Processing Module 550 uses geometric transformations (described at Block C) to convert the range profile data set R[i] into a height profile data set h[i] and a position data set x[i].

At Block D, the Real-Time Package Height Profiling And Edge Detection Processing Module 550 obtains current package height data values by finding the prevailing height using package edge detection without filtering, as taught in the method of FIG. 16.

At Block E, the Real-Time Package Height Profiling And Edge Detection Processing Module 550 finds the coordinates of the left and right package edges (LPE, RPE) by searching for the closest coordinates from the edges of the conveyor belt ($X_a$, $X_b$) towards the center thereof.

At Block F, the Real-Time Package Height Profiling And Edge Detection Processing Module 550 analyzes the data values {R(nT)} and determines the X coordinate position range $X_{\Delta 1}$, $X_{\Delta 2}$ (measured in R global) where the range intensity changes (i) within the spatial bounds ($X_{LPE}$, $X_{RPE}$), and (ii) beyond predetermined range intensity data thresholds.

At Block G in FIG. 15, the Real-Time Package Height Profiling And Edge Detection Processing Module 550 creates a time-stamped data set $\{X_{LPE}, h, X_{RPE}, V_B, nT\}$ by assembling the following six (6) information elements, namely: the coordinate of the left package edge (LPE); the current height value of the package (h); the coordinate of the right package edge (RPE); X coordinate subrange where height values exhibit maximum intensity changes and the height values within said subrange; package velocity ($V_b$); and the time-stamp (nT). Notably, the belt/package velocity measure $V_b$ is computed by the LDIP Package Dimensioner 551 within LDIP Subsystem 122, and employs integrated velocity detection techniques described in copending U.S. application Ser. No. U.S. application Ser. No. 09/327,756 filed Jun. 7, 1999, and International Application No. PCT/US00/15624, filed Jun. 7, 2000, published by WIPO on Dec. 14, 2000 under WIPO No. WO 00/75856 incorporated herein by reference in its entirety.

Thereafter, at Block H in FIG. 15, the Real-Time Package Height Profiling And Edge Detection Processing Module 550 transmits the assembled (hextuple) data set to the camera control computer 22 for processing and subsequent generation of real-time camera control signals that are transmitted to the Auto-Focus/Auto-Zoom Digital Camera Subsystem 3". These operations will be described in greater detail hereinafter.

FIG. 16 sets forth a flow chart describing the primary data processing operations that are carried out by the Real-Time Package Edge Detection Processing Method which is performed by the Real-Time Package Height Profiling And Edge Detection Processing Module 550 at Block D in FIG. 15. This routine is carried out each time a new raw range data set is received by the Real-Time Package Height Profiling And Edge Detection Processing Module, which occurs at a rate of about every 5 milliseconds or so in the illustrative embodiment. Understandably, this processing time may be lengthened and shortened as the applications at hand may require.

As shown at Block A in FIG. 16, this module commences by setting (i) the default value for x coordinate of the left package edge $X_{LPE}$ equal to the x coordinate of the left edge pixel of the conveyor belt, and (ii) the default pixel index i equal to location of left edge pixel of the conveyor belt $I_a$. As indicated at Block B, the module sets (i) the default value for the x coordinate of the right package edge $X_{RPE}$ equal to the x coordinate of the right edge pixel of the conveyor belt $I_b$, and (ii) the default pixel index i equal to the location of the right edge pixel of the conveyor belt $I_b$.

At Block C in FIG. 16, the module determines whether the search for left edge of the package reached the right edge of the belt ($I_b$) minus the search (i.e. detection) window size WIN. Notably, the size of the WIN parameter is set on the basis of the noise level present within the captured image data.

At Block D in FIG. 16, the module verifies whether the pixels within the search window satisfy the height threshold parameter, Hthres. In the illustrative embodiment, the height threshold parameter Hthres is set on the basis of a percentage of the expected package height of the packages, although it is understood that more complex height thresholding techniques can be used to improve performance of the method, as may be required by particular applications.

At Block E in FIG. 16, the module verifies whether the pixels within the search window are located to the right of the left belt edge.

At Block F in FIG. 16, the module slides the search window one (1) pixel location to the right direction.

At Block G in FIG. 16, the module sets: (i) the x-coordinate of the left edge of the package to equal the x-coordinate of the left most pixel in the search window WIN; (ii) the default x-coordinate of the package's right edge equal to the x-coordinate of the belt's right edge; and (iii) the default pixel location of the package's right edge equal to the pixel location of the belt's right edge.

At Block H in FIG. 16, the module verifies whether the search for right package edge reached the left edge of the belt, minus the size of the search window WIN.

At Block I in FIG. 16, the module verifies whether the pixels within search window WIN satisfy the height threshold Hthres.

As Block J in FIG. 16, the module verifies whether the pixels within search window are located to the left of the belt's right edge.

At Block K in FIG. 16, the module sides the search window one (1) pixel location to the left direction.

At Block L in FIG. 16, the module sets the RIGHT package x-coordinate to the x-coordinate of the right most pixel in the search window.

At Block M in FIG. 16, the package edge detection process is completed. The variables LPE and RPE (i.e. stored in its memory locations) contain the x coordinates of the left and right edges of the detected package. These coordinate values are returned to the process at Block D in the flow chart of FIG. 15.

Notably, the processes and operations specified in FIGS. 15 and 16 are carried out for each sampled row of raw data collected by the LDIP subsystem 122, and therefore, do not rely on the results computed by the computational-based package dimensioning processes carried out in the LDIP subsystem 122, described in great detail in copending U.S. application Ser. No. 09/327,756 filed Jun. 7, 1999, and incorporated herein reference in its entirety. This inventive feature enables ultra-fast response time during control of the camera subsystem.

As will be described in greater detail hereinafter, the camera control computer 22 controls the auto-focus/auto-zoom digital camera subsystem 3" in an intelligent manner using the real-time camera control process illustrated in FIGS. 18A, 18B-1 and 18B-2. A particularly important inventive feature of this camera process is that it only needs to operate on one data set at time a time, obtained from the LDIP Subsystem 122, in order to perform its complex array of functions. Referring to FIGS. 18A, 18B-1 and 18B-2, the real-time camera control process of the illustrative embodiment will now be described with reference to the data structures illustrated in FIGS. 19 and 20, and the data tables illustrated in FIGS. 21 and 23.

Real-Time Camera Control Process of the Present Invention

In the illustrative embodiment, the Real-time Camera Control Process 560 illustrated in FIGS. 18A, 18B-1 and 18B-2 is carried out within the camera control computer 21 of the PLIIM-based system 120 shown in FIG. 9. It is understood, however, that this control process can be carried out within any of the PLIIM-based systems disclosed herein, wherein there is a need to perform automated real-time object detection, dimensioning and identification operations.

This Real-time Camera Control Process provides each PLIIM-based camera subsystem of the present invention with the ability to intelligently zoom in and focus upon only the surfaces of a detected object (e.g. package) which might bear object identifying and/or characterizing information that can be reliably captured and utilized by the system or network within which the camera subsystem is installed. This inventive feature of the present invention significantly reduces the amount of image data captured by the system which does not contain relevant information. In turn, this increases the package identification performance of the camera subsystem, while using less computational resources, thereby allowing the camera subsystem to perform more efficiently and productivity.

As illustrated in FIGS. 18A, 18B-1 and 18B-2, the camera control process of the present invention has multiple control threads that are carried out simultaneously during each data processing cycle (i.e. each time a new data set is received from the Real-Time Package Height Profiling And Edge Detection Processing Module 550 within the LDIP subsystem 122). As illustrated in this flow chart, the data elements contained in each received data set are automatically processed within the camera control computer in the manner described in the flow chart, and at the end of each data set processing cycle, generates real-time camera control signals that drive the zoom and focus lens group translators powered by high-speed motors and quick-response linkage provided within high-speed auto-focus/auto-zoom digital camera subsystem (i.e. the IFD module) 3" so that the camera subsystem 3" automatically captures digital images having (1) square pixels (i.e. 1:1 aspect ratio) independent of package height or velocity, (2) significantly reduced speckle-noise levels, and (3) constant image resolution measured in dots per inch (DPI) independent of package height or velocity. Details of this control process will be described below.

As indicated at Block A in FIG. 18A, the camera control computer 22 receives a time-stamped hextuple data set from the LDIP subsystem 122 after each scan cycle completed by AM laser beams 167A and 167B. In the illustrative embodiment, this data set contains the following data elements: the coordinate of the left package edge (LPE); the current height value of the package (h); x coordinate subrange, and exhibit maximum intensity changes or variations (e.g. indicative of text or other graphic information markings) and the height values contained within said subrange; the coordinate of the right package edge (RPE); package velocity ($V_b$); and the time-stamp (nT). The data elements associated with each current data set are initially buffered in an input row (i.e. Row 1) of the Package Data Buffer illustrated in FIG. 19. Notably, the Package Data Buffer shown in FIG. 19 functions like a six column first-in-first-out (FIFO) data element queue. As shown, each data element in the raw data set is assigned a fixed column index and (variable) row index which increments as the raw data set is shifted one index unit as each new incoming raw data set is received into the Package Data Buffer. In the illustrative embodiment, the Package Data Buffer has M number of rows, sufficient in size to determine the spatial boundaries of a package scanned by the LDIP subsystem using real-time sampling techniques which will be described in detail below.

As indicated at Block A in FIG. 18A, in response to each Data Set received, the camera control computer 22 also performs the following operations: (i) computes the optical power (measured in milliwatts) which each VLD in the PLIIM-based system 25" (shown in FIGS. 3E1 through 3E8) must produce in order that each digital image captured by the PLIIM-based system will have substantially the same "white" level, regardless of conveyor belt speed; and (2) transmits the computed VLD optical power value(s) to the microcontroller 764 associated with each PLIA in the PLIIM-based system. The primary motivation for capturing images having a substantially the same "white" level is that this information level condition greatly simplifies the software-based image processing operations to be subsequently carried out by the image processing computer subsystem. Notably, the flow chart shown in FIGS. 18C1 and 18C2 describes the steps of a method of computing the optical power which must be produced from each VLD in the PLIIM-based system, to ensure the capture of digital images having a substantially uniform "white" level, regardless of conveyor belt speed. This method will be described below.

As indicated at Block A in FIG. 18C1, the camera control computer 22 computes the Line Rate of the linear CCD image detection array (i.e. sensor chip) 3A based on (i) the conveyor belt speed (computed by the LDIP subsystem 122), and (ii) the constant image resolution (i.e. in dots per inch) desired, using the following formula: Line Rate=[Belt Velocity]×[Resolution].

As indicated at Block B in FIG. 18C1, the camera control computer 22 then computes the photo-integration time period of the linear image detection array 3A required to produce digital images having a substantially uniform "white" level, regardless of conveyor belt speed. This step is carried out using the formula: Photo-Integration Time Period=1/Line Rate.

As indicated at Block C in FIG. 18C2, the camera control computer 22 then computes the optical power (e.g. milliwatts) which each VLD in the PLIIM-based system must illuminate in order to produce digital images having a substantially uniform "white" level, regardless of conveyor belt speed. This step is carried out using the formula: VLD Optical Power=Constant/Photo-Integration Time Period.

Once the VLD Optical Power is computed for each VLD in the system, the camera control computer 22 then transmits (i.e. broadcasts) this parameter value, as control data, to each PLIA microcontroller 764 associated with each PLIA, along with a global timing (i.e. synchronization) signal. The PLIA micro-controller 764 uses the global synchronization signal to determine when it should enable its associated VLDs to generate the particular level of optical power indicated by the currently received control data values. When the Optical Power value is received by the microcontroller 764, it automatically converts this value into a set of digital control signals which are then provided to the digitally-controlled potentimeters (763) associated with the VLDs so that the drive current running through the junction of each VLD is precisely controlled to produce the computed level of optical power to be used to illuminate the object (whose speed was factored into the VLD optical power calculation) during the subsequent image capture operations carried out by the PLIIM-based system.

In accordance with the principles of the present invention, as the speed of the conveyor belt and thus objects transported therealong will vary over time, the camera control process, running the control subroutine set forth in FIGS. 18C1 and 18C2, will dynamically program each PLIA microcontroller 764 within the PLIIM-based system so that the VLDs in each PLIA illuminate at optical power levels which ensure that captured digital images will automatically have a substantially uniform "white" level, independent of conveyor belt speed.

Notably, the intensity control method of the present invention described above enables the electronic exposure control (EEC) capability provided on most linear CCD image sensors to be disabled during normal operation so that image sensor's nominal noise pattern, otherwise distorted by the EEC aboard the imager sensor, can be used to perform offset correction on captured image data.

Returning now to Block B in FIG. 18A, the camera control computer 22 analyzes the height data in the Package Data Buffer and detects the occurrence of height discontinuities, and based on such detected height discontinuities, camera control computer 22 determines the corresponding coordinate positions of the leading package edges specified by the left-most and right-most coordinate values (LPE and RPE) contained in the data set in the Package Data Buffer at the which the detected height discontinuity occurred.

At Block C in FIG. 18A, the camera control computer 22 determines the height of the package associated with the leading package edges determined at Block B above.

At Block D in FIG. 18A, at this stage in the control process, the camera control computer 22 analyzes the height values (i.e. coordinates) buffered in the Package Data Buffer, and determines the current "median" height of the package. At this stage of the control process, numerous control "threads" are started, each carrying out a different set of control operations in the process. As indicated in the flow chart of FIGS. 18A, 18B-1 and 18B-2, each control thread can only continue when the necessary parameters involved in its operation have been determined (e.g. computed), and thus the control process along a given control thread must wait until all involved parameters are available before resuming its ultimate operation (e.g. computation of a particular intermediate parameter, or generation of a particular control command), before ultimately returning to the start Block A, at which point the next time-stamped data set is received from the Real-Time Package Height Profiling And Edge Detection Processing Module 550. In the illustrative embodiment, such data set input operations are carried out every 5 milliseconds, and therefore updated camera commands are generated and provided to the auto-focus/auto-zoom camera subsystem at substantially the same rate, to achieve real-time adaptive camera control performance required by demanding imaging applications.

As indicated at Blocks E, F, G H, I, A in FIGS. 18A, 18B-1 and 18B-2, a first control thread runs from Block D to Block A so as to reposition the focus and zoom lens groups within the auto-focus/auto-zoom digital camera subsystem each time a new data set is received from the Real-Time Package Height Profiling And Edge Detection Processing Module 550.

As indicated at Block E, the camera control computer 22 uses the Focus/Zoom Lens Group Position Lookup Table in FIG. 21 to determine the focus and zoom lens group positions based which will capture focused digital images having constant dpi resolution, independent of detected package height. This operation requires using the median height value determined at Block D, and looking up the corresponding focus and zoom lens group positions listed in the Focus/Zoom Lens Group Position Lookup Table of FIG. 21.

At Block F, the camera control computer 22 transmits the Lens Group Movement translates the focus and zoom lens group positions determined at Block E into Lens Group Movement Commands, which are then transmitted to the lens group position translators employed in the auto-focus/auto-zoom camera subsystem (i.e. IFD Subsystem) 3".

At Block G, the IFD Subsystem 3" uses the Lens Group Movement Commands to move the groups of lenses to their target positions within the IFD Subsystem.

Then at Block H, the camera control computer 22 checks the resulting positions achieved by the lens group position translators, responding to the transmitted Lens Group Movement Commands. At Blocks I and J, the camera control computer 22 automatically corrects the lens group positions which are required to capture focused digital images having constant dpi resolution, independent of detected package height. As indicated at by the control loop formed by Blocks H, I, J, H, the camera control computer 22 corrects the lens group positions until focused images are captured with constant dpi resolution, independent of detected package height, and when so achieved, automatically returns this control thread to Block A as shown in FIG. 18A.

As indicated at Blocks D, K, L, M in FIGS. 18A, 18B-1 and 18B-2, a second control thread runs from Block D in order to determine and set the optimal photo-integration time period ($\Delta T_{photo\text{-}integration}$) parameter which will ensure that digital images captured by the auto-focus/auto-zoom digital camera subsystem will have pixels of a square geometry (i.e. aspect ratio of 1:1) required by typical image-based bar code symbol decode processors and OCR processors. As indicated at Block K, the camera control computer analyzes the current median height value in the Data Package Buffer, and determines the speed of the package ($V_b$). At Block L, the camera control computer uses the computed values of average (i.e. median) package height, belt speed and Photo-Integration Time Look-Up Table in FIG. 22B, to determine the photo-integration time parameter ($\Delta T_{photo\text{-}integration}$) which will ensure that digital images captured by the auto-focus/auto-zoom digital camera subsystem will have pixels of a "square" geometry (i.e. aspect ratio of 1:1).

As indicated at Block I, the camera control computer 22 also uses (1) the computed belt speed/velocity, (2) the prespecified image resolution desired or required (dpi), and (3) the computed slope of the laser scanned surface so as to compute the compensated line rate of the camera (i.e. IFD) subsystem which helps ensure that the captured linear images have substantially constant pixel resolution (dpi) independent of the angular arrangement of the package surface during surface profiling and imaging operations. As indicated in the flow chart set forth in FIG. 18D, the above information elements (1), (2) and (3) defined above are used by the camera control computer 22 to dynamically adjust the Line Rate is of camera (i.e. IFD) subsystem in response to real-time measurements of the object surface gradient (i.e. slope) performed by the camera control computer 22 using object height data captured by the LDIP subsystem 122 and transmitted to the camera control computer 22.

Reference will now be made to FIGS. 18D and 18E1 and E2 in order to explain the camera line rate compensation operation of the present invention carried out at Block L in FIGS. 18B-1 and 18B-2. Notably, the primary purpose of this operation is to automatically compensate for viewing-angle distortion which would otherwise occur in images of object surfaces captured as the object surfaces move past the coplanar PLIB/FOV of PLIIM-based linear 25' at skewed viewing angles, defined by slope angles θ and ϕ in FIGS. 18E1 and 18E2, for the cases of top scanning and side scanning, respectively.

As indicated at Block A in FIG. 18D, the camera control computer 22 computes the Line Rate of the linear image detection array (dots/second) based on the computed Belt Velocity (inches/second) and the constant Image Resolution (dots/inch) desired, using the equation: Line Rate=(Belt Velocity)(Image Resolution). As indicated at Block B in FIG. 18D, the camera control computer 22 computes the Line Rate Compensation Factor, i.e. cosine (θ- or ϕ), where θ and ϕ are defined in FIGS. 18E1 and 18E2 respectively, as the computed gradient or slope of the package surface laser scanned by the AM laser beams powered by the LDIP subsystem 122, and is computed at Block D in FIG. 18A. As indicated at Block C in FIG. 18D, the camera control computer 22 computes the Compensated Line Rate for the IFD (i.e. camera) subsystem using the equation: Compensated Line Rate=(Line Rate)(Cos(θ or ϕ).

In a PLIIM-based linear imaging system, configured above a conveyor belt structure as shown in FIG. 18E1, the Line Rate of the linear image detection array in the camera subsystem will be dynamically adjusted in accordance with the principles of the present invention described above. In this case, the method employed at Block L in FIGS. 18B-1 and 18B-2 and detailed in FIG. 18D will provide a high level of compensation for viewing angle distortion presented when imaging (the plane of) a moving object surface disposed skewed at some slope angle θ measured relative to the planar surface of the conveyor belt. In this case, the difficulty will should not reside in line-rate compensation, but rather in dynamically focusing the image formation optics of the camera (IFD) subsystem in response to the geometrical characteristics of the top surfaces of packages measured by the LDIP subsystem (i.e. instrument) 122 on a real-time basis. For example, during illumination and imaging operations, a slanted or sloped top surface of a transported box or object must remain in focus under the camera subsystem. To achieve such focusing, the slope of the object's top surface should be within a certain value, across the entire conveyor belt. However, in the top scanning case, if the box is rotated along the direction of travel so that the slope of the top surface thereof is not substantially the same across the conveyor belt (i.e. the height values of the box vary across the width of the conveyor belt), then it will be difficult for the camera subsystem to focus on the entire top surface of the box, across the width of the conveyor belt. In such instances, the LDIP subsystem 122 in system 120 has the option (at Block L in FIGS. 18B-1 and 18B-2) of providing only a single height value to the camera control computer 22 (e.g. the average value of the height values of the box measured across the conveyor belt), and for this average value to be used by the camera control computer 22 to adjustably control the camera's zoom and focus characteristics. Alternatively, the LDIP subsystem 122 can transmit to the camera control computer 22, data representative of the actual slope and shape of the top surface of the box, and such data can be used to control the focusing optics of the camera subsystem in a more complicated manner permitted by the image forming optics used in the linear PLIIM-based imaging system.

For the case of side scanning shown in FIG. 18E2, the method of the present invention employed at Block L in FIGS. 18B-1 and 18B-2 and detailed in FIG. 18D will provide a high level of compensation for viewing angle distortion which will otherwise occur in images of object surfaces when viewing (the plane of) the moving object surface disposed skewed at some angle ϕ measured relative to the edge of the conveyor belt.

Referring back now to Block M in FIGS. 18B-1 and 18B-2, it is noted that the camera control computer 22 generates a digital control signals for the parameters (1) Photo-integration Time Period ($\Delta T_{photo\text{-}integration}$) found in the Photo-Integration Time Look-Up Table set forth in FIG. 1822B, and (2) the Compensated Line Rate parameter computed using the procedure set forth in FIG. 18D. Thereafter, the camera control computer 22 transmits these digital control signals to the CCD image detection array employed in the auto-focus/auto-zoom digital camera subsystem (i.e. the IFD Module). Thereafter, this control thread returns to Block A as indicated in FIG. 18A.

As indicated at Blocks D, N, O, P, R in FIGS. 18A, 18B-1 and 18B-2, a third control thread runs from Block D in order to determine the pixel indices (i,j) of a selected portion of a captured image which defines the "region of interest" (ROI) on a package bearing package identifying information (e.g. bar code label, textual information, graphics, etc.), and to use these pixel indices (i,j) to produce image cropping control commands which are sent to the image processing computer 21. In turn, these control commands are used by the image processing computer 21 to crop pixels in the ROI of captured images, transferred to image processing computer 21 for image-based bar code symbol decoding and/or OCR-based image processing. This ROI cropping function serves to selectively identify for image processing only those image pixels within the Camera Pixel Buffer of FIG. 20 having pixel indices (i,j) which spatially correspond to the (row, column) indices in the Package Data Buffer of FIG. 19.

As indicated at Block N in FIG. 18A, the camera control computer transforms the position of left and right package edge (LPE, RPE) coordinates (buffered in the row the Package Data Buffer at which the height value was found at Block D), from the local Cartesian coordinate reference system symbolically embedded within the LDIP subsystem shown in FIG. 17, to a global Cartesian coordinate reference system $R_{global}$ embedded, for example, within the center of the conveyor belt structure, beneath the LDIP subsystem 122, in the illustrative embodiment. Such coordinate frame conversions can be carried out using homogeneous transformations (HG) well known in the art.

At Block O in FIGS. 18B-1 and 18B-2, the camera control computer detects the x coordinates of the package boundaries based on the spatially transformed coordinate values of the left and right package edges (LPE, RPE) buffered in the Package Data Buffer, shown in FIG. 19.

At Block P in FIGS. 18B-1 and 18B-2, the camera control computer 22 determines the corresponding pixel indices (i,j) which specifies the portion of the image frame (i.e. a slice of the region of interest), to be effectively cropped from the image to be subsequently captured by the auto-focus/auto-zoom digital camera subsystem 3". This pixel indices specification operation involves using (i) the x coordinates of the detected package boundaries determined at Block O, and (ii) optionally, the subrange of x coordinates bounded within said detected package boundaries, over which maximum range "intensity" data variations have been detected by the module of FIG. 15. By using the x coordinate boundary information specified in item (i) above, the camera control computer 22 can determine which image pixels represent the overall detected package, whereas when using the x coordinate subrange information specified in item (ii) above, the camera control computer 22 can further determine which image pixels represent a bar code symbol label, handwritings typing, or other graphical indicia recorded on the surface of the detected package. Such additional information enables the camera control computer 22 to selectively crop only pixels representative of such information content, and inform the image processing computer 21 thereof, on a real-time scanline-by-scanline basis, thereby reducing the computational load on image processing computer 21 by use of such intelligent control operations.

Thereafter, this control thread dwells at Block R in FIGS. 18B-1 and 18B-2 until the other control threads terminating at Block Q have been executed, providing the necessary information to complete the operation specified at Block Q, and then proceed to Block R, as shown in FIGS. 18B-1 and 18B-2.

As indicated at Block Q in FIGS. 18B-1 and 18B-2, the camera control computer uses the package time stamp (nT) contained in the data set being currently processed by the camera control computer, as well as the package velocity ($V_b$) determined at Block K, to determine the "Start Time" of Image Frame Capture (STIC). The reference time is established by the package time stamp (nT). The Start Time when the image frame capture should begin is measured from the reference time, and is determined by (1) predetermining the distance Δz measured between (i) the local coordinate reference frame embedded in the LDIP subsystem and (ii) the local coordinate reference frame embedded within the auto-focus/auto-zoom camera subsystem, and dividing this predetermined (constant) distance measure by the package velocity ($V_b$). Then at Block R, the camera control computer 22 (i) uses the Start Time of Image Frame Capture determined at Block Q to generate a command for starting image frame capture, and (ii) uses the pixel indices (i,j) determined at Block P to generate commands for cropping the corresponding slice (i.e. section) of the region of interest in the image to be or being captured and buffered in the Image Buffer within the IFD Subsystem (i.e. auto-focus/auto-zoom digital camera subsystem).

Then at Block S, these real-time "image-cropping" commands are transmitted to the IFD Subsystem (auto-focus/auto-zoom digital camera subsystem) 3" and the control process returns to Block A to begin processing another incoming data set received from the Real-Time Package Height Profiling And Edge Detection Processing Module 550. This aspect of the inventive camera control process 560 effectively informs the image processing computer 21 to only process those cropped image pixels which the LDIP subsystem 122 has determined as representing graphical indicia containing information about either the identity, origin and/or destination of the package moving along the conveyor belt.

Alternatively, camera control computer 22 can use computed ROI pixel information to crop pixel data in captured images within the camera control computer 22 and then transfer such cropped images to the image processing computer 21 for subsequent processing.

Also, any one of the numerous methods of and apparatus for speckle-pattern noise reduction described in great detail hereinabove can be embodied within the unitary system 120 to provide an ultra-compact, ultra-lightweight system capable of high performance image acquisition and processing operation, undaunted by speckle-pattern noise which seriously degrades the performance of prior art systems attempting to illuminate objects using solid-state VLD devices, as taught herein.

Method of and System for Performing Automatic Recognition of Graphical Forms of Intelligence Contained in 2-D Images Captured From Arbitrary 3-D Surfaces of Object Surfaces Moving Relative to Said System As shown in FIG. 23A, the PLIIM-based object identification and attribute acquisition system 120 of the present invention further comprises a subprogram within its camera control computer 22. The subprogram enables the automated collection, processing and transmission (e.g. exportation) of data elements relating to the arbitrary 3-D surfaces of objects being transported beneath the light transmission apertures of the system 120. In the illustrative embodiment, such data elements include, for example: (i) linear 3-D surface profile maps captured by the LDIP subsystem 122 during each photo-integration time period of the PLIIM-based imager 25'; (ii) high-resolution linear images captured by the PLIIM-based imager 25' during each photo-integration time period; (iii) object velocity measurements captured by the LDIP subsystem 122 during each photo-integration time period; and (iv) IFD (i.e. camera) subsystem parameters captured by the PLIIM-based imager 25' during each photo-integration time period. After each photo-integration time period, these data elements are automatically transmitted to the image processing computer 21 for use in modeling the following geometrical objects: (i) the arbitrary 3-D object surface using a 3-D polygon-mesh surface model comprising a plurality of polygon-surface patches, whose vertices are specified by the x,y,z coordinates measured by the LDIP subsystem 122; (ii) each pixel in the high-resolution linear image thereof, using a pixel ray having vector representation; and (iii) the points of intersection between the pixel rays and particular polygon-surface patches at point of intersection (POI) coordinate locations p(x',y',z'). Once the points of intersection are computed, the pixel intensity value originally associated with each pixel is assigned to the newly computed point of intersection coordinates, so that when this newly computed set of pixel points are taken as a whole, they produce a high-resolution 3-D image of the object surface By the term "3D image of the object surface", one means that each pixel in the high-resolution image is specified by a pixel intensity value I(x',y',z') and three Cartesian coordinates x',y',z'. This inventive feature provides the PLIIM-based object identification and attribute acquisition system 120 (and 140) of the present invention with the capacity to produce high-resolution 3-D images of three-dimensional surfaces of virtually any object including natural objects (e.g. human faces) and synthetic objects (e.g. manufactured parts).

Notably, depending on the particular application at hand, the image processing computer 21 associated with system 120 (or 140) may be integrated into the system and contained within its housing 161 to provide a completely integrated solution. In other applications, it will be desirable that the image processing computer 21 is realized as a stand-alone computer, typically an image processing workstation, provided with sufficient computing and memory storage resources, and a graphical user interface (GUI).

In accordance with the principles of the present invention, the "computed" high-resolution 3-D images described above can be further processed in order to "unwarp" or "undistort" the effects which the object's arbitrary 3D surface characteristics may have had on any "graphical intelligence" carried by the object, as an intelligence carrying substrate, so that conventional OCR and bar code symbol recognition methods can be carried out without error occasioned by surface distortion of graphical intelligence rendered to the object's arbitrary 3D surface characteristics. Notably, as used herein the term "graphical intelligence" shall include symbolic character strings, bar code symbol structures, and like structures capable of carrying symbolic meaning or sense a natural or synthetic source of intelligence.

The 3-D image generation and graphical intelligence recognition capabilities of system 120 have been described in an overview manner above. It is appropriate at this juncture to now describe these inventive features in greater detail with reference to the method of graphical intelligence recognition shown in FIGS. 23A through 23C5.

As indicated at Block A in FIG. 23C1, the first step of method involves using the laser doppler imaging and profiling (LDIP) subsystem employed in the unitary PLIIM-based object imaging and profiling system, to (i) consecutively capture a series of linear 3-D surface profile maps on a targeted arbitrary (e.g. non-planar or planar) 3-D object surface bearing forms of graphical intelligence and (ii) measure the velocity of the arbitrary 3-D object surface. Notably, the polar coordinates of each point in the captured linear 3-D surface profile map are specified in a local polar coordinate system $R_{LDIP/polar}$, symbolically embedded within the LDIP subsystem.

As indicated at Block B in FIG. 23C1, the second step of method involves using coordinate transforms to automatically convert the polar coordinates of each point p(α, R) in the captured linear 3-D surface profile map into x,y,z Cartesian coordinates specified as p(x,y,z) in a local Cartesian coordinate system $R_{LDIP/Cartesion}$, symbolically embedded within the LDIP subsystem.

As indicated at Block C in FIG. 23C1, the third step of method involves using the PLIIM-based imager 25' to consecutively capture high-resolution linear 2-D images of the arbitrary 3-D object surface bearing forms of graphical intelligence (e.g. symbol character strings). As shown in FIG. 23A, (i) the x', y' coordinates of each pixel in each said captured high-resolution linear 2-D image is specified in local Cartesian coordinate system $R_{PLIM/Cartesian}$ symbolically embedded within the PLIIM-based imager, and (ii) the intensity value of the pixel I(x',y') is associated with the x', y' Cartesian coordinates of the image detection element in the linear image detection array at which the pixel is detected. Also, (iii) the planar laser illumination beam (PLIB) of the PLIIM-based imager is spaced from the amplitude modulated (AM) laser scanning beam of the LDIP subsystem is about D centimeters.

As indicated at Block D in FIG. 23C2, the fourth step of method involves capturing and buffering (at the PLIIM-based object imaging and profiling subsystem) the camera (IFD) parameters used to form and detect each linear high-resolution 2-D image captured during the corresponding photo-integration time period $\Delta T_k$, by the PLIIM-based imager.

As indicated at Block E in FIG. 23C2, the fifth step of method involves, at the end of each photo-integration time period $\Delta T_k$., using the unitary PLIIM-based object imaging and profiling system to transmit the following information elements to the Image Processing Computer for data storage and subsequent information processing:

(1) the converted coordinates x, y, z, of each point in the linear 3-D surface profile map of the arbitrary 3-D object surface captured during photo-integration time period $\Delta T_k$;

(2) the measured velocity(ies) of the arbitrary 3-D object surface during photo-integration time period $\Delta T_k$;

(3) the x', y' coordinates and intensity value I(x',y') of each pixel in each high-resolution linear 2-D image captured during photo-integration time period $\Delta T_k$ and specified in the local Cartesian coordinate system $R_{PLIIM/Cartesian}$; and (4) the captured camera (IFD) parameters used to form and detect each linear high-resolution 2-D image captured during the photo-integration time period $\Delta T_k$.

As indicated at Block F in FIG. 23C2, the sixth step of method involves receiving, at the Image Processing Computer, the data elements transmitted from the PLIIM-based profiling and imaging system during Step 5, buffer data elements (1) and (2) in a first FIFO buffer memory structure, and data elements (3) and (4) in a second FIFO buffer memory structure.

As indicated at Block G in FIG. 23C3, the seventh step of method involves using at the Image Processing Computer, the x, y, z coordinates associated with a consecutively captured series of linear 3-D surface profile maps (i.e. stored in first FIFO memory storage structure) in order to construct a 3-D polygon-mesh surface representation of said arbitrary 3-D object surface, represented by $S_{LDIP}$(x,y,z) and having (i) vertices specified by x,y,z in local coordinate reference system $R_{LDIP/Cartesian}$, and (ii) planar polygon surface patches $s_i$(x,y,z) and being defined by a set of said vertices.

As indicated at Block H in FIG. 23C3, the eighth step of method involves converting, at the Image Processing Computer, the x',y',z' coordinates of each vertex in the 3-D polygon-mesh surface representation into the local Cartesian coordinate reference system $R_{PLIM/Cartesian}$ symbolically embedded within the PLIIM-based imager.

As indicated at Block I in FIG. 23C3, the ninth step of method of involves specifying at the Image Processing Computer, the x',y',z' coordinates of each i-th planar polygon surface patch s(x,y,z) represented in the local Cartesian coordinate reference system $R_{PLIIM/Cartesian}$, so as to produce a set of corresponding polygon surface patch {$s_i$(x',y',z')} represented in system $R_{PLIIM/Cartesian}$.

As indicated at Block J in FIG. 23C3, the tenth step of method involves, at the Image Processing Computer, for a selected linear high-resolution 2-D image captured at photo-integration time period $\Delta T_k$ and spatially corresponding to one of the linear 3-D surface profile maps employed at Block G, use the camera (IFD) parameters used and recorded (i.e. captured) during the corresponding photo-integration time period in order to construct a 3-D vector-based "pixel ray" model specifying the optical formation of each pixel in the linear 2-D image, wherein a pixel ray reflected off a point on the arbitrary 3-D object surface is focused through the camera's image formation optics (i.e. configured by the camera parameters) and is detected at the pixel's detection element in the linear image detection array of the IFD (camera) subsystem.

As indicated at Block K in FIG. 23C4, the eleventh step of method involves performing at the Image Processing Computer, the following operation for each laser beam ray (producing one of the pixels in said selected linear 2-D image): (i) determining which polygon surface patch $s_i$(x',y',z') the pixel ray intersects; (ii) computing the x',y',z' coordinates of the point of intersection (POI) between the pixel ray and the polygon surface patch represented in Cartesian coordinate reference system $R_{PLIIM/Cartesian}$; and (iii) designating the computed set of points of intersection as {$p_i$(x',y',z')}.

As indicated at Block L in FIG. 23C4, the twelfth step of method involves at the Image Processing Computer, for each laser beam ray passing through a determined polygon surface patch s(x',y',z') at a computed point of intersection $p_i$(x',y',z'), assigning the intensity value I(x',y') of the pixel ray to the x', y', z' coordinates of the point of intersection. This produces a linear high-resolution 3-D image comprising a 2-D array of pixels, each said pixel having as its attributes (i) an Intensity value I(x',y',z') and (ii) coordinates x', y', z' specified in the local Cartesian coordinate reference system $R_{PLIIM/Cartesian}$.

As indicated at Block M in FIG. 23C4, the thirteenth step of method involves putting the computed linear high-resolution 3-D image in a third FIFO memory storage structure in the image processing computer.

As indicated at Block N in FIG. 23C4, the fourteenth step of method involves repeating steps one through six above to update the first and second FIFO data queues maintained in the image processing computer, and steps seven through thirteen to update the consecutively computed linear high-resolution 3-D image stored in the third FIFO memory storage structure.

As indicated at Block O in FIG. 23C4, the fifteenth step of method involves assembling, in an image buffer in the image processing computer, a set of consecutively computed linear high-resolution 3-D images retrieved from the third FIFO data storage device so as to construct an "area-type" high-resolution 3-D image of said arbitrary 3-D object surface.

As indicated at Block P in FIG. 23C5, the sixteenth step of method involves at the Image Processing Computer, mapping the intensity value I(x', y', z') of each pixel in the computed area-type 3-D image onto the x',y',z' coordinates of the points on a uniformly-spaced apart "grid" positioned perpendicular to the optical axis of the camera subsystem (i.e. to model the 2-D planar substrate on which the forms of graphical intelligence was originally rendered). Here, the mapping process involves using an intensity weighing function based on the x', y', z' coordinate values of each pixel in the area-type high-resolution 3-D image. This produces an area-type high-resolution 2-D image of the 2-D planar substrate surface bearing said forms of graphical intelligence (e.g. symbol character strings).

As indicated at Block Q in FIG. 23C5, the sixteenth step of the method involves at the Image Processing Computer, using said OCR algorithm to perform automated recognition of graphical intelligence contained in said area-type high-resolution 2-D image of said 2-D planar substrate surface so as to recognize said graphical intelligence and generate symbolic knowledge structures representative thereof.

As indicated at Block R in FIG. 23C5, the seventeenth step of the method involves repeating steps one through seventeen described above as often as required to recognize changes in graphical intelligence on the arbitrary moving 3-D object surface. The process continues by the camera control computer 22 collecting and transmitting the above-described data elements to the image processing computer 21 each passage of a photo-integration time period, during which the received elements are buffered in their respective data queues prior to processing in accordance with the scheme depicted in FIG. 23B.

In applications where the time is not a critical factor at the image processing computer, large volumes of 3-D profile and high-resolution 1-D image data can be first collected from the arbitrary 3-D object surface and then buffered at the image processing computer so that data for the entire arbitrary 3-D object surface is first collected and buffered for use in a batch-type implementation of the high-resolution 3-D image reconstruction process of the present invention depicted in FIGS. 23A and 23B.

Alternatively, portions of the high-resolution 3-D image of an arbitrary 3-D object surface can be generated in an incremental manner as new data is collected and received at the image processing computer 21. In such cases, after each predetermined time period (which may be substantially larger than the photo-integration time period of the camera) the polygon-surface patch model and the pixel rays used during point of intersection analysis illustrated in FIG. 23B, are automatically updated to reflect that a new part of the arbitrary 3-D object surface is being modeled and analyzed. In applications where graphical intelligence is recorded on planar substrates that have been physically distorted as a result of either (i) application of the graphical intelligence to an arbitrary 3-D object surface, or (ii) deformation of a 3-D object on which the graphical intelligence has been rendered, then the process steps illustrated at Blocks L through R in FIGS. 23C4 and 23C5 can be performed to "undistort" any distortions imparted to the graphical intelligence while being carried by the arbitrary 3-D object surface due to, for example, non-planar surface characteristics. By virtue of the present invention, graphical intelligence, originally formatted for application onto planar surfaces, can be applied to non-planar surfaces or otherwise to substrates having surface characteristics which differ from the surface characteristics for which the graphical intelligence was originally designed without spatial distortion. In practical terms, bar coded baggage identification tags as well as graphical character encoded labels which have been deformed, bent or otherwise distorted be easily recognized using the graphical intelligence recognition method of the present invention.

Second Illustrative Embodiment of the Unitary Object Identification and Attribute Acquisition System of the Present Invention Embodying a PLIIM-Based Subsystem of the Present Invention and a LADAR-Based Imaging, Detecting and Dimensioning/Profiling (LDIP) Subsystem Referring now to FIGS. 24, 25, 25A, 25B, 25C and 26, a unitary PLIIM-based object identification and attribute acquisition system of the second illustrated embodiment, indicated by reference numeral 140, will now be described in detail.

As shown in FIG. 24, the unitary PLIIM-based object identification and attribute acquisition system 140 comprises an integration of subsystems, contained within a single housing of compact construction supported above the conveyor belt of a high-speed conveyor subsystem 121, by way of a support frame or like structure. In the illustrative embodiment, the conveyor subsystem 141 has a conveyor belt width of at least 48 inches to support one or more package transport lanes along the conveyor belt. As shown in FIG. 25, the unitary PLIIM-based system 140 comprises four primary subsystem components, namely: a LADAR-based (i.e. LIDAR-based) object imaging, detecting and dimensioning subsystem 122 capable of collecting range data from objects (e.g. packages) on the conveyor belt using a pair of multi-wavelength (i.e. containing visible and IR spectral components) laser scanning beams projected at different angular spacing as taught in copending U.S. application Ser. No. 09/327,756 filed Jun. 7, 1999, supra, and International PCT Application No. PCT/US00/15624 filed Dec. 7, 2000, incorporated herein by reference; a PLIIM-based bar code symbol reading subsystem 25", shown in FIGS. 6D1 through 6D5, for producing a 3-D scanning volume above the conveyor belt, for scanning bar codes on packages transported therealong; an input/output subsystem 127 for managing the inputs to and outputs from the unitary system; and a network controller 132 for connecting to a local or wide area IP network, and supporting one or more networking protocols, such as, for example, Ethernet, AppleTalk etc.

Notably, network communication controller 132 also enables the unitary system 140 to receive, using Ethernet or like networking protocols, data inputs from a number of object attribute input devices including, for example: a weighing-in-motion subsystem 132, as shown in FIG. 10, for weighing packages as they are transported along the conveyor belt; an RFID-tag reading (i.e. object identification) subsystem for reading RF tags on objects and identifying the same as such objects are transported along the conveyor belt; an externally-mounted belt tachometer for measuring the instant velocity of the belt and objects transported therealong; and various other types of "object attribute" data producing subsystems such as, as for example, but not limited to: airport x-ray scanning systems; cargo x-ray scanners; PFNA-based explosive detection systems (EDS); and Quadrupole Resonance Analysis (QRA) based and/or MRI-based screening systems for screening/analyzing the interior of objects to detect the presence of contraband, explosive material, biological warfare agents, chemical warfare agents, and/or dangerous or security threatening devices.

In the illustrative embodiment shown in FIGS. 24 through 26, this array of Ethernet data input/output ports is realized by a plurality of Ethernet connectors mounted on the exterior of the housing, and operably connected to an Ethernet hub mounted within the housing. In turn, the Ethernet hub is connected to the I/O unit 127, shown in FIG. 25. In the illustrative embodiment, each object attribute producing subsystem indicated above will also have a network controller, and a dynamically or statically assigned IP address on the LAN in which unitary system 140 is connected, so that each such subsystem is capable of transporting data packets using TCP/IP.

The unitary PLIIM-based object identification and attribute acquisition system 140 further comprises: a high-speed fiber optic (FO) network controller 133 for connecting the subsystem 140 to a local or wide area IP network and supporting one or more networking protocols such as, for example, Ethernet, AppleTalk, etc.; and (4) a data management computer 129 with a graphical user interface (GUI) 130, for realizing a data element queuing, handling and processing subsystem 131, as well as other data and system management functions. As shown in FIG. 25, the package imaging, detecting and dimensioning subsystem 122 embodied within system 140 comprises the same integration of subsystems as shown in FIG. 10, and thus warrants no further discussion. It is understood, however, that other non-LADAR based package detection, imaging and dimensioning subsystems could be used to emulate the functionalities of the LDIP subsystem 122.

In the illustrative embodiment, the data management computer 129 employed in the object identification and attribute acquisition system 140 is realized as complete micro-computing system running operating system (OS) software (e.g. Microsoft NT, Unix, Solaris, Linux, or the like), and providing full support for various protocols, including: Transmission Control Protocol/Internet Protocol (TCP/IP); File Transfer Protocol (FTP); HyperText Transport Protocol (HTTP); Simple Network Management Protocol (SNMP); and Simple Message Transport Protocol (SMTP). The function of these protocols in the object identification and attribute acquisition system 140, and networks built using the same, will be described in detail hereinafter with reference to FIGS. 30A through 30D2.

As shown in FIG. 25, unitary system 140 comprises a PLIIM-based camera subsystem 25''' which includes a high-resolution 2D CCD camera subsystem 25'' similar in many ways to the subsystem shown in FIGS. 6D1 through 6E3, except that the 2-D CCD camera's 3-D field of view is automatically steered over a large scanning field, as shown in FIG. 6E4, in response to FOV steering control signals automatically generated by the camera control computer 22 as a low-resolution CCD area-type camera (640×640 pixels) 61 determines the x,y position coordinates of bar code labels on scanned packages. As shown in FIGS. 5B3, 5C3, 6B3, and 6C3, the components (61A, 61B and 62) associated with low-resolution CCD area-type camera 61 are easily integrated within the system architecture of PLIIM-based camera subsystems. In the illustrative embodiment, low-resolution camera 61 is controlled by a camera control process carried out within the camera control computer 22, by modifying the camera control process illustrated in FIGS. 18A, 18B-1 and 18B-2. The major difference with this modified camera control process is that it will include subprocesses that generate FOV steering control signals, in addition to zoom and focus control signals, discussed in great detail hereinabove.

In the illustrative embodiment, when the low-resolution CCD image detection array 61A detects a bar code symbol on a package label, the camera control computer 22 automatically (i) triggers into operation a high-resolution CCD image detector 55A and the planar laser illumination arrays (PLIA) 6A and 6B operably associated therewith, and (ii) generates FOV steering control signals for steering the FOV of camera subsystem 55'' and capturing 2-D images of packages within the 3-D field of view of the high-resolution image detection array 61A. The zoom and focal distance of the imaging subsystem employed in the high-resolution camera (i.e. IFD module) 55''' are automatically controlled by the camera control process running within the camera control computer 22 using, for example, package height coordinate and velocity information acquired by the LDIP subsystem 122. High-resolution image frames (i.e. scan data) captured by the 2-D image detector 55A are then provided to the image processing computer 21 for decode processing of bar code symbols on the detected package label, or OCR processing of textual information represented therein. In all other respects, the PLIIM-based system 140 shown in FIG. 24 is similar to PLIIM-based system 120 shown in FIG. 9. By embodying PLIIM-based camera subsystem 25'' and object detecting, tracking and dimensioning/profiling (LDIP) subsystem 122 within a single housing 141, an ultra-compact device is provided that uses a low-resolution CCD imaging device to detect package labels and dimension, identify and track packages moving along the package conveyor, and then uses such detected label information to activate a high-resolution CCD imaging device to acquire high-resolution images of the detected label for high performance decode-based image processing.

Notably, any one of the numerous methods of and apparatus for speckle-pattern noise reduction described in great detail hereinabove can be embodied within the unitary system 140 to provide an ultra-compact, ultra-lightweight system capable of high performance image acquisition and processing operation, undaunted by speckle-noise patterns which seriously degrade the performance of prior art systems attempting to illuminate objects using coherent radiation.

Data-Element Queuing, Handling and Processing (Q, H & P) Subsystem Integrated Within the PLIIM-Based Object Identification and Attribute Acquisition System of FIG. 25

In FIG. 25A, the Data-Element Queuing, Handling And Processing (QHP) Subsystem 131 employed in the PLIIM-based Object Identification and Attribute Acquisition System 140 of FIG. 25, is illustrated in greater detail. As shown, the data element QHP subsystem 131 comprises a Data Element Queuing, Handling, Processing And Linking Mechanism 2610 which automatically receives object identity data element inputs 2611 (e.g. from a bar code symbol reader, RFID-tag reader, or the like) and object attribute data element inputs 2612 (e.g. object dimensions, object weight, x-ray images, Pulsed Fast Neutron Analysis (PFNA) image data captured by a PFNA scanner by Ancore, and QRA image data captured by a QRA scanner by Quantum Magnetics, Inc.) from the I/O unit 127, as shown in FIG. 25.

The primary functions of the a Data Element Queuing, Handling, Processing And Linking Mechanism 2610 are to queue, handle, process and link data elements (of information files) 2611 and 2612 supplied by the I/O unit 127, and automatically generate as output, for each object identity data element supplied as input, a combined data element 2613 comprising (i) an object identity data element, and (ii) one or more object attribute data elements (e.g. object dimensions, object weight, x-ray analysis, neutron beam analysis, etc.) collected by the I/O unit of the unitary system 140 and supplied to the data element queuing, handling and processing subsystem 131 of the illustrative embodiment.

In the illustrative embodiment, each object identification data element is typically a complete information structure representative of a numeric or alphanumeric character string uniquely identifying the particular object under identification and analysis. Also, each object attribute data element is typically a complete information file associated, for example, with the information content of an optical, X-ray, PFNA or QRA image captured by an object attribute information producing subsystem. In the case where the size of the information content of a particular object attribute data element is substantially large, in comparison to the size of the data blocks transportable within the system, then each object attribute data element may be decomposed into one or more object attribute data elements, for linking with its corresponding object identification data elements. In this case, each combined data element 2613 will be transported to its intended data storage destination, where object attribute data elements corresponding to a particular object attribute (e.g. x-ray image) are reconstituted by a process of synthesis so that the entire object attribute data element can be stored in memory as a single data entity, and accessed for future analysis as required by the application at hand.

In general, Data Element Queuing, Handling, Processing And Linking Mechanism 2610 employed in the PLIIM-based Object Identification and Attribute Acquisition System 140 of FIG. 25 is a programmable data element tracking and linking (i.e. indexing) module constructed from hardware and software components. Its primary function is to link (1) object identity data to (2) corresponding object attribute data (e.g. object dimension-related data, object-weight data, object-content data, object-interior data, etc.) in both singulated and non-singulated environments. Depending on the object detection, tracking, identification and attribute acquisition capabilities of the system configuration at hand, the Data Element Queuing, Handling, Processing And Linking Mechanism 2610 will need to be programmed in a different manner to enable the underlying functions required by its specified capabilities, indicated above.

A Method of and Subsystem for Configuring and Setting-Up any Object Identity and Attribute Information Acquisition System or Network Employing the Data Element Queuing, Handling, and Processing Mechanism of the Present Invention The way in which Data Element Queuing, Handling And Processing Subsystem 131 will be programmed will depend on a number of factors, including the object detection, tracking, identification and attribute-acquisition capabilities required by or otherwise to be provided to the system or network under design and configuration.

To enable a system engineer or technician to quickly configure the Data Element Queuing, Handling, Processing And Linking Mechanism 2610, the present invention provides an software-based system configuration manager (i.e. system configuration "wizard" program) which is integrated within the Object Identification And Attribute Acquisition Subsystem of the present invention 140.

As graphically illustrated in FIG. 25B, the system configuration manager of the present invention assists the system engineer or technician in simply and quickly configuring and setting-up the Object Identity And Attribute Information Acquisition System 140. In the illustrative embodiment, the system configuration manager employs a novel graphical-based application programming interface (API) which enables a systems configuration engineer or technician having minimal programming skill to simply and quickly perform the following tasks: (1) specify the object detection, tracking, identification and attribute acquisition capabilities (i.e. functionalities) which the system or network being designed and configured should possess, as indicated in Steps A, B and C in FIG. 25C; (2) determine the configuration of hardware components required to build the configured system or network, as indicated in Step D in FIG. 25C; and (3) determine the configuration of software components required to build the configured system or network, as indicated in Step E in FIG. 25C, so that it will possess the object detection, tracking, identification, and attribute-acquisition capabilities specified in Steps A, B, and C.

In the illustrative embodiment shown in FIGS. 25B and 25C, system configuration manager of the present invention enables the specification of the object detection, tracking, identification and attribute acquisition capabilities (i.e. functionalities) of the system or network by presenting a logically-ordered sequence of questions to the systems configuration engineer or technician, who has been assigned the task of configuring the Object Identification and Attribute Acquisition System or Network at hand. As shown in FIG. 10B, these questions are arranged into three predefined groups which correspond to the three primary functions of any object identity and attribute acquisition system or network being considered for configuration, namely: (1) the object detection and tracking capabilities and functionalities of the system or network; (2) the object identification capabilities and functionalities of the system or network; and (3) the object attribute acquisition capabilities and functionalities of the system or network. By answering the questions set forth at each of the three levels of the tree structure shown in FIG. 10B, a full specification of the object detection, tracking, identification and attribute-acquisition capabilities of the system will be provided. Such intelligence is then by the system configuration manager program to automatically select and configure appropriate hardware and software components into a physical realization of the system or network configuration design.

At the first (i.e. highest) level of the tree structure in FIG. 25B, the systems configuration manager presents a set of questions to the systems configuration engineer inquiring whether or not the system or network should be capable of detecting and tracking singulated objects, or non-singulated objects. As shown at Block A in FIG. 25C, this can be achieved by presenting a GUI display screen asking the following question, and providing a list of answers which correspond to the capabilities realizable by the software and hardware libraries on hand: "What kind of object detection and tracking capability will the configured system have (e.g. singulated object detection and tracking, or non-singulated object detection and tracking)?"

At the second (i.e. middle) level of the tree structure in FIG. 25B, the systems configuration manager presents a set of questions to the systems configuration engineer inquiring whether how objection identification will be carried out in the system or network. As shown at Block B in FIG. 10C, this can be achieved by presenting a GUI display screen asking the following question, and providing a list of answers which correspond to the capabilities realizable by the software and hardware libraries on hand: "What kind of object identification capability will the configured system employ (i.e. one employing "flying-spot" laser scanning techniques, image capture and processing techniques, and/or radio-frequency identification (RFID) techniques)?"

At the third (i.e. lowest) level of the tree structure in FIG. 25B, the systems configuration manager presents a set of questions to the systems configuration engineer inquiring whether what kinds of object attributes will be acquired either by the system or network or by any of the subsystems which are operably connected thereto. As shown at Block C in FIG. 25C, this can be achieved by presenting a GUI display screen asking the following question, and providing a list of answers which correspond to the capabilities realizable by the software and hardware libraries on hand: "What kind of object attribute information collection capabilities will the configured system have (e.g. object dimensioning only, or object dimensioning with other object attribute intelligence collection such as optical analysis, x-ray analysis, neutron-beam analysis, QRA, MRA, etc.)?"

As shown in FIG. 25B, there are twelve (12) primary "possible" lines of questioning in the illustrative embodiment which the system configuration manager program may conduct. Depending on the answers provided to these questions, schematically depicted in the tree structure of FIG. 25B, the subsystems which perform these functions in the system or network will have different hardware and software specifications (to be subsequently used to configure the network or system). Therefore, the systems configuration manager will automatically specify a different set of hardware and software components available in its software and hardware libraries which, when configured properly, are capable of carrying out the specified functionalities of the system or network.

As illustrated at Block D in FIG. 25C, the system configuration manager program analyzes the answers provided to the questions presented during Steps A, B and C, and based thereon, automatically determines the hardware components (available in its Hardware Library) that it will need to construct the hardware-aspects of the specified system configuration. This specified information is then used by technicians to physically build the system or network according to the specified system or network configuration.

As indicated at Block E in FIG. 25C, the system configuration manager program analyzes the answers provided to the above questions presented during Steps A, B and C, and based thereon, automatically determines the software components (available in its Software Library) that it will need to construct the software-aspects of the specified system or network configuration.

As indicated at Block F in FIG. 25C, the system configuration manager program thereafter accesses the determined software components from its Software Library (e.g. maintained on an information server within the system engineering department), and compiles these software components with all other required software programs, to produce a complete "System Software Package" designed for execution upon a particular operating system supported upon the specified hardware configuration. This System Software Package can be stored on either a CD-ROM disc and/or on FTP-enabled information server, from which the compiled System Software Package can be downloaded by an system configuration engineer or technician having a proper user identification and password. Alternatively, prior to shipment to the installation site, the compiled System Software Package can be installed on respective computing platforms within the appropriate unitary object identification and attribute acquisition systems, to simplify installation of the configured system or network in a plug-and-play, turn-key like manner.

As indicated at Block G in FIG. 25C, the systems configuration manager program will automatically generate an easy-to-follow set of Installation Instructions for the configured system or network, guiding the technician through an easy to follow installation and set-up procedures making sure all of the necessary system and subsystem hardware components are properly installed, and system and network parameters set up for proper system operation and remote servicing.

As indicated at Block H in FIG. 25C, once the hardware components of the system have been properly installed and configured, the set-up procedure properly completed, the technician is ready to operate and test the system for troubles it may experience, and diagnose the same with or without remote service assistance made available through the remote monitoring, configuring, and servicing system of the present invention, illustrated in FIGS. 30A through 30D2.

Tunnel-Type Object Identification and Attribute Acquisition System of the Present Invention The PLIIM-based object identification and attribute acquisition systems and subsystems described hereinabove can be configured as building blocks to build more complex, more robust systems and networks designed for use in diverse types of object identification and attribute acquisition and management applications.

In FIG. 27, there is shown a four-sided tunnel-type object identification and attribute acquisition system 570 that has been constructed by (i) arranging, about a high-speed package conveyor belt subsystem 571, four PLIIM-based package identification and attribute acquisition (PID) units 120 of the type shown in FIGS. 13A through 26, and (ii) integrating these PID units within a high-speed data communications network 572 having a suitable network topology and configuration, as illustrated, for example, in FIGS. 28 and 29.

In this illustrative tunnel-type system, only the top PID unit 120 includes an LDIP subsystem 122 for object detection, tracking, velocity-detection and dimensioning/profiling functions, as this PID unit functions as a master PID unit within the tunnel system 570, whereas the side and bottom PID units 120 are not provided with a LDIP subsystem 122 and function as slave PID units. As such, the side and bottom PID units 120' are programmed to receive object dimension data (e.g. height, length and width coordinates) from the master PID unit 120 on a real-time basis, and automatically convert (i.e. transform) these object dimension coordinates into their local coordinate reference frames in order to use the same to dynamically control the zoom and focus parameters of the camera subsystems employed in the tunnel system. This centralized method of object dimensioning offers numerous advantages over prior art systems and will be described in greater detail with reference to FIGS. 30-1 through 32B.

As shown in FIG. 27, the camera field of view (FOV) of the bottom PID unit 120' of the tunnel system 570 is arranged to view packages through a small gap 573 provided between conveyor belt sections 571A and 571B. Notably, this arrangement is permissible by virtue of the fact that the camera's FOV and its coplanar PLIB jointly have thickness dimensions on the order of millimeters. As shown in FIG. 28, all of the PID units in the tunnel system are operably connected to an Ethernet control hub 575 (ideally contained in one of the slave PID units) associated with a local area network (LAN) embodied within the tunnel system. As shown, an external tachometer (i.e. encoder) 576 connected to the conveyor belt 571 provides tachometer input signals to each slave unit 120 and master unit 120, as a backup to the integrated object velocity detector provided within the LDIP subsystem 122. This is an optional feature which may have advantages in environments where, for example, the belt speed fluctuates frequently and by significant amounts in the case of conveyor-enabled tunnel systems.

FIG. 28 shows the tunnel-based system of FIG. 27 embedded within a first-type LAN having an Ethernet control hub 575, for communicating data packets to control the operation of units 120 in the LAN, but not for transferring camera data (e.g. 80 megabytes/sec) generated within each PID unit 120, 120'.

FIG. 29 shows the tunnel system of FIG. 27 embedded within a second-type LAN having an Ethernet control hub 575, an Ethernet data switch 577, and an encoder 576. The function of the Ethernet data switch 577 is to transfer data packets relating to camera data output, whereas the function of control hub 575 is the same as in the tunnel network system configuration of FIG. 28. The advantages of using the tunnel network configuration of FIG. 29 is that camera data can be transferred over the LAN, and when using fiber optical (FO) cable, camera data can be transferred over very long distances using FO-cable and the Ethernet networking protocol (i.e. "Ethernet over fiber"). As discussed hereinabove, the advantage of using the Ethernet protocol over fiber optical cable is that a "keying" workstation 580 can be located thousands of feet away from the physical location of the tunnel system 570, e.g. somewhere within a package routing facility, without compromising camera data integrity due to transmission loss and/or errors.

Real-Time Object Coordinate Data Driven Method of Camera Zoom and Focus Control in Accordance With the Principles of the Present Invention In FIGS. 30-1 through 32B, CCD camera-based tunnel system 570 of FIG. 27 is schematically illustrated employing a real-time method of automatic camera zoom and focus control in accordance with the principles of the present invention. As will be described in greater detail below, this real-time method is driven by object coordinate data and involves (i) dimensioning packages in a global coordinate reference system, (ii) producing object (e.g. package) coordinate data referenced to said global coordinate reference system, and (iii) distributing said object coordinate data to local coordinate references frames in the system for conversion of said object coordinate data to local coordinate reference frames and subsequent use automatic camera zoom and focus control operations upon said packages. This method of the present invention will now be described in greater detail below using the four-sided tunnel-based system 570 of FIG. 27, described above.

As shown in FIG. 30-1 through 30-4, the four-sided tunnel-type camera-based object identification and attribute acquisition system of FIG. 27 comprises: a single master PID unit 120 embodying a LDIP subsystem 122, mounted above the conveyor belt structure 571; three slave PID units 120', 120' and 120', mounted on the sides and bottom of the conveyor belt; and a high-speed data communications network 572 supporting a network protocol such as, for example, Ethernet protocol, and enabling high-speed packet-type data communications among the four PID units within the system. As shown, each PID unit is connected to the network communication medium of the network through its network controller 132 (133) in a manner well known in the computer networking arts.

As schematically illustrated in FIGS. 30-1 through 31, local coordinate reference systems are symbolically embodied within each of the PID units deployed in the tunnel-type system of FIG. 27, namely: local coordinate reference system $R_{local0}$ symbolically embodied within the master PID unit 120; local coordinate reference system $R_{local1}$ symbolically embodied within the first side PID unit 120'; local coordinate reference system $R_{local2}$ symbolically embodied within the second side PID unit 120'; and local coordinate reference system $R_{local3}$ symbolically embodied within the bottom PID unit 120'. In turn, each of these local coordinate reference systems is "referenced" with respect to a global coordinate reference system $R_{global}$ symbolically embodied within the conveyor belt structure. Object coordinate information specified (by vectors) in the global coordinate reference system can be readily converted to object coordinate information specified in any local coordinate reference system by way of a homogeneous transformation (HG) constructed for the global and the particular local coordinate reference system. Each homogeneous transformation can be constructed by specifying the point of origin and orientation of the x,y,z axes of the local coordinate reference system with respect to the point of origin and orientation of the x,y,z axes of the global coordinate reference system. Such details on homogeneous transformations are well known in the art.

To facilitate construction of each such homogeneous transformation between a particular local coordinate reference system (symbolically embedded within a particular slave PID unit 120') and the global coordinate reference system (symbolically embedded within the master PID unit 120), the present invention further provides a novel method of and apparatus for measuring, in the field, the pitch and yaw angles of each slave PID unit 120' in the tunnel system, as well as the elevation (i.e. height) of the PID unit, that is relative to the local coordinate reference frame symbolically embedded within the local PID unit. In the illustrative embodiment, shown in FIG. 31A, such apparatus is realized in the form of two different angle-measurement (e.g. protractor) devices 2500A and 2500B integrated within the structure of each slave and master PID housing and the support structure provided to support the same within the tunnel system. The purpose of such apparatus is to enable the taking of such field measurements (i.e. angle and height readings) so that the precise coordinate location of each local coordinate reference frame (symbolically embedded within each PID unit) can be precisely determined, relative to the master PID unit 120. Such coordinate information is then used to construct a set of "homogeneous transformations" which are used to convert globally acquired package dimension data at each local coordinate frame, into locally referenced object dimension data. In the illustrative embodiment, the master PID unit 120 is provided with an LDIP subsystem 122 for acquiring object dimension information on a real-time basis, and such information is broadcasted to each of the slave PID units 120' employed within the tunnel system. By providing such object dimension information to each PID unit in the system, and converting such information to the local coordinate reference system of each such PID unit, the optical parameters of the camera subsystem within each local PID unit are accurately controlled by its camera control computer 22 using such locally-referenced package dimension information, as will be described in greater detail below.

As illustrated in FIG. 31A, each angle measurement device 2500A and 2500B is integrated into the structure of the PID unit 120' (120) by providing a pointer or indicating structure (e.g. arrow) 2501A (2501B) on the surface of the housing of the PID unit, while mounting angle-measurement indicator 2503A (2503A) on the corresponding support structure 2504A (2400B) used to support the housing above the conveyor belt of the tunnel system. With this arrangement, to read the pitch or yaw angle, the technician only needs to see where the pointer 2501A (or 2501B) points against the angle-measurement indicator 2503A (2503B), and then visually determine the angle measure at that location which is the angle measurement to be recorded for the particular PID unit under analysis. As the position and orientation of each angle-measurement indicator 2503A (2503B) will be precisely mounted (e.g. welded) in place relative to the entire support system associated with the tunnel system, PID unit angle readings made against these indicators will be highly accurate and utilizable in computing the homogeneous transformations (e.g. during the set-up and calibration stage) and carried out at each slave PID unit 120' and possibly the master PID unit 120 if the LDIP subsystem 122 is not located within the master PID unit, which may be the case in some tunnel installations. To measure the elevation of each PID unit 120' (or 120), an arrow-like pointer 2501C is provided on the PID unit housing and is read against an elevation indicator 2503C mounted on one of the support structures.

Once the PID units have been installed within a given tunnel system, such information must be ascertained to (i) properly construct the homogeneous transformation expression between each local coordinate reference system and the global coordinate reference system, and (ii) subsequently program this mathematical construction within camera control computer 22 within each PID unit 120 (120'). Preferably, a PID unit support framework installed about the conveyor belt structure, can be used in the tunnel system to simplify installation and configuration of the PID units at particular predetermined locations and orientations required by the scanning application at hand. In accordance with such a method, the predetermined location and orientation position of each PID unit can be premarked or bar coded. Then, once a particular PID unit 120' has been installed, the location/orientation information of the PID unit can be quickly read in the field and programmed into the camera control computer 22 of each PID unit so that its homogeneous transformation (HG) expression can be readily constructed and programmed into the camera control compute for use during tunnel system operation. Notably, a hand-held bar code symbol reader, operably connected to the master PID unit, can be used in the field to quickly and accurately collect such unit position/orientation information (e.g. by reading bar code symbols pre-encoded with unit position/orientation information) and transmit the same to the master PID unit 120.

In addition, FIG. 30-1 through 30-4 illustrates that the LDIP subsystem 122 within the master unit 120 generates (i) package height, width, and length coordinate data and (ii) velocity data, referenced with respect to the global coordinate reference system $R_{global}$. These package dimension data elements are transmitted to each slave PID unit 120' on the data communication network, and once received, its camera control computer 22 converts there values into package height, width, and length coordinates referenced to its local coordinate reference system using its preprogrammable homogeneous transformation. The camera control computer 22 in each slave PID unit 120 uses the converted object dimension coordinates to generate real-time camera control signals which automatically drive its camera's automatic zoom and focus imaging optics in an intelligent, real-time manner in accordance with the principles of the present invention. The "object identification" data elements generated by the slave PID unit are automatically transmitted to the master PID unit 120 for time-stamping, queuing, and processing to ensure accurate object identity and object attribute (e.g. dimension/profile) data element linking operations in accordance with the principles of the present invention.

Referring to FIGS. 32A and 32B, the object-coordinate driven camera control method of the present invention will now be described in detail.

As indicated at Block A in FIG. 32A, Step A of the camera control method involves the master PID unit (with LDIP subsystem 122) generating an object dimension data element (e.g. containing height, width, length and velocity data $\{H,W,L,V\}_G$) for each object transported through tunnel system, and then using the system's data communications network, to transmit such object dimension data to each slave PID unit downstream the conveyor belt. Preferably, the coordinate information contained in each object dimension data element is referenced with respect to global coordinate reference system $R_{global}$, although it is understood that the local coordinate reference frame of the master PID unit may also be used as a central coordinate reference system in accordance with the principles of the present invention.

As indicated at Block B in FIG. 32A, Step B of the camera control method involves each slave unit receiving the transmitted object height, width and length data $\{H,W,L,V\}_G$ and converting this coordinate information into the slave unit's local coordinate reference system $R_{local\ 1}$, $\{H,W,L,V\}_i$.

As indicated at Block C in FIG. 32A, Step C of the camera control method involves the camera control computer in each slave unit using the converted object height, width, length data $\{H,W,L\}_i$ and package velocity data to generate camera control signals for driving the camera subsystem in the slave unit to zoom and focus in on the transported package as it moves by the slave unit, while ensuring that captured images having substantially constant d.p.i. resolution and 1:1 aspect ratio.

As indicated at Block D in FIG. 32B, Step D of the camera control method involves each slave unit capturing images acquired by its intelligently controlled camera subsystem, buffering the same, and processing the images so as to decode bar code symbol identifiers represented in said images, and/or to perform optical character recognition (OCR) thereupon.

As indicated at Block E in FIG. 32B, Step E of the camera control method involves the slave unit, which decoded a bar code symbol in a processed image, to automatically transmit an object identification data element (containing symbol character data representative of the decoded bar code symbol) to the master unit (or other designated system control unit employing data element management functionalities) for object data element processing.

As indicated at Block F in FIG. 32B, Step F of the camera control method involves the master unit time-stamping each received object identification data element, placing said data element in a data queue, and processing object identification data elements and time-stamped package dimension data elements in said queue so as to link each object identification data element with one said corresponding object dimension data element (i.e. object attribute data element).

The real-time camera zoom and focus control process described above has the advantage of requiring on only one LDIP object detection, tracking and dimensioning/profiling subsystem 122, yet enabling (i) intelligent zoom and focus control within each camera subsystem in the system, and (ii) precise cropping of "regions of interest" (ROI) in captured images. Such inventive features enable intelligent filtering and processing of image data streams and thus substantially reduce data processing requirements in the system.

The Internet-Based Remote Monitoring, Configuration and Service (RMCS) System and Method of the Present Invention In FIGS. 30A through 30D2, an Internet-based remote monitoring, configuration and service (RMCS) system and associated method of the present invention 2620 is schematically illustrated. The primary function of RMCS system and associated method 2620 is to enable a systems or network engineer or service technician to use any Internet-enabled client computing machine to remotely monitor configure and/or service any PLIIM-based network, system or subsystem of the present invention in a time-efficient and cost-effective manner.

In FIG. 30A, a plurality of different tunnel-based systems 2621 and their underlying LANs are schematically illustrated as being operably connected to the infrastructure of the Internet. In this figure, a remotely situated Internet-enabled client computer 2622 is shown having access to the infrastructure of the Internet by way of an Internet Service Provider (ISP) or Network Service Provider (NSP) as the case may be. As shown, each tunnel-based network (of systems) 2621 comprises: a LAN router 2623 with a SNMP agent; a LAN hub 2624 with a SNMP agent; a LAN http/Servlet Server 2625, functioning as the SNMP management server; a Database 2626 operably connected to the SNMP management server 2625, and functioning as a central Management Information Base (MIB); a master-type object identification and attribute acquisition system 120 with TCP/IP, FTP, HTTP, ETHERNET, SNMP, and SMTP dameons, and a local Management Information Base (MIB); and a plurality of "slave-type" object identification and attribute acquisition system, each indicated by reference number 120' and not provided with an LDIP subsystem 122 as described hereinabove, but provided with a TCP/IP, FTP, HTTP, ETHERNET, SNMP, and SMTP dameons, and a local management information base (MIB).

In the illustrative embodiment shown in FIGS. 30A through 30C, RMCS system 2620 is realized using the simple network management protocol (SNMP) that presently forms a key component to the Internet network management architecture used in the contemporary period. In the illustrative embodiment, SNMP is used to enable network management and communication between (i) SNMP agents, which are built into each node (i.e. object identification and attribute acquisition system 120, 120') in the tunnel-based LAN 2621, and (ii) SNMP managers, which can be built into LAN http/Servlet Server 2625 as well as any Internet-enabled client computing machine 2622 functioning as the network management station (NMS) or management console.

The SNMP-based RMCS system 2620 contains two primary elements, namely: a manager and agents. The manager is the console (e.g. GUI-based API) through which the network/system administrator performs network, system and subsystem management functions in each tunnel-based LAN installation, such as, for example: (1) checking configuration and performance statistics associated with the computing platform and the OS of each system 120, 120', as well as configuration and performance statistics associated with the LAN hub 2624, and LAN router 2623, and the LAN http/Servlet Server 2625; (2) monitoring configuration parameters and performance statistics of the network, systems and subsystems of the tunnel-based LAN using the "read" capabilities of SNMP agents; (3) configuring services provided at the network, system and subsystem level of the tunnel-based LAN using the "write" capabilities of SNMP agents; and (4) providing other levels of remote servicing using the read and/or write capabilities of SNMP agents built into each system 120 and 120', and other components of the tunnel-based LAN 2621.

SNMP Agents are the entities that interface to the actual "device" being managed. Examples of managed "devices" in a tunnel-based LAN which may contain managed "objects", include: network bridges; hubs; routers; network servers; Object Identification And Attribute Acquisition Systems 120, and 120'; the PLIIM-Based Object Identification Subsystem 25'; the IFD Module (i.e. Camera Subsystem): the Image Processing Computer; the Camera Control Computer; the RFID-Based Object Identification Subsystem; the Data Element Queuing, Handling And Processing (QHP) Subsystem 131; the LDIP-Based Object Identification, Velocity-Measurement, And Dimensioning Subsystem; the Object Velocity Measurement Subsystem; the Object H/W/L Profiling Subsystem; the Object Detection subsystem; an X-ray scanning subsystem; a Neutron-beam scanning subsystem; and any other object attribute producing subsystem configured with a particular system may include an object attribute code indicating the attributes which it generates during its operation.

Managed "objects" can include, for example: hardware and/or software based systems ubsystems, modules, and/or components thereof such as, for example, the PLIIM-based subsystem 25' and components therein (e.g. the linear image detection array in the IFD module), the LDIP subsystem 122 and components therein (e.g. the polygon scanning mechanism), PLIAs and PLIMs employed therein, the Camera Control Computer, and the like; configuration parameters at the network, system and subsystem level; performance statistics associated with the network, systems and subsystems employed therein; and other monitorable parameters (i.e. variables) that directly relate to the current operation of the device in question.

The managed objects are arranged in what is known as a virtual information database, called a Management Information Base (MIB). Such virtual information databases, or MIBs, can be maintained locally at each object identification and attribute acquisition system 120, 121', as well as centrally at a database server somewhere in the tunnel-based LAN, as shown in FIG. 30A. However, in each case, the MIB must be retrievable and modifiable. SNMP actually performs the data retrieval and modification operations. SNMP allows managers and agents to communicate for the purpose of accessing these objects whether they are stored locally or centrally.

The Structure of Management Information (SMI) in the manager/agent paradigm described above, organizes, names and describes information so that logical access can occur. The SMI states that each managed object must have a name, a syntax, and an encoding. The name, an object identifier (OID), uniquely identifies or names the MIB object in an abstract tree with an unnamed root; individual data items make up the leaves of the tree, and while the MIB tree has standardized branches, containing objects grouped by protocol (including TCP, IP, UDP, SNMP and others) and other categories (including "system" and "interfaces"). The syntax defines the data type, such as an integer or string of octets. The encoding describes how the information associated with the managed objects is serialized for transmission between machines.

The MIB tree is extensible by virtue of experimental and private branches which vendors, such as Metrologic Instruments, Inc., assignee of the present application, can define to include instances of its own products. As will be explained in greater detail below, an unique OID will be created and assigned to each MIB object to be managed within a device in the tunnel-based LAN in order to uniquely identify the MIB object in the MIB tree.

Management Information Bases (MIBs) are a collection of definitions, which define the properties of the managed object within the device (e.g. system 120, 120') to be managed. Every managed device keeps a database of values for each of the definitions written in the MIB. Collections of related managed objects are defined in specific MIB modules. The MIB is not the actual database itself; it is implementation dependant. The definition of the MIB conforms the SMI. One can think of the MIB as an information warehouse which can be local as well as central.

Interactions between the remote network management system (NMS) 2622, referred to as the RMCS management console, and managed devices in the tunnel-based LAN 2621, can be any of the four different types of commands:

(1) READS—commands used for monitoring managed devices, by the NMS reading variables maintained within the MIB of the managed devices;

(2) WRITES—commands used for controlling managed devices, by the NMS writing variables stored within the MIB of managed devices;

(3) TRANSVERSAL OPERATIONS—commands used NMSs to determine which variables a managed device supports and to sequentially gather information from variable tables (e.g. IP routing tables) in the managed devices; and (4) TRAPS—commands used by managed devices to asynchronously report certain events to the NMS.

As shown in FIG. 30A, the data management computer 129 employed within each object identification and attribute acquisition system 120, and 120' identification and attribute acquisition system 120 is realized as complete micro-computing system running operating system (OS) software (e.g. Microsoft NT, Unix, Solaris, Linux, or the like), and providing full support for various protocols, including: Transmission Control Protocol/Internet Protocol (TCP/IP); File Transfer Protocol (FTP); HyperText Transport Protocol (HTTP); Simple Network Management Protocol (SNMP) Agent; and Simple Message Transport Protocol (SMTP).

At the network level of a tunnel-based network, and thus of the RMCS system 2620, there is a set of network level parameters which serve to describe the configuration and state of each LAN on the Internet. At the system level thereof, there is a set of system level parameters which serve to describe the configuration and state of each system within a given network on the Internet. Similarly, at the subsystem level, thereof there is a set of subsystem level parameters which serve to describe the configuration and state of each subsystem within any given system within any given network on the Internet.

In FIG. 30B, the system and subsystem structure of an exemplary tunnel-based system 2621 is schematically illustrated in greater detail to show the environment in which the RMCS system and associated method thereof operates. In FIG. 30B, several object attribute data producing systems (e.g. neutron-based scanning subsystem and x-ray scanning subsystem) are shown as subsystems of the Object Identification And Attribute Acquisition System 120.

In FIG. 30C, a table is presented listing the network configuration parameters of the tunnel-based system, its system configuration parameters, its performance statistics, and the monitorable performance parameters and configuration for each subsystem within each system in the tunnel-based system.

In accordance with the present invention, such parameters identified above are used to create a MIB OID for each SNMP "object" within a "device" to be managed in each tunnel-based LAN 2621.

As shown in FIG. 30C, the network configuration parameters for each tunnel-based LAN 2621 might typically include, for example: router IP address; the number of nodes (i.e. systems) in LAN; passwords, and LAN location; name of customer facility; name of technical contact; the phone number of the technical contact; the domain name assigned to the LAN; the object identity (i.e. identification) codes (OIC) assigned to subsystems (e.g. bar code readers and RFID readers) within the tunnel-based system capable of identifying objects, and inherited by the systems and networks employing said subsystems; object attribute acquisition codes (OAAC) assigned to subsystems within systems and networks, capable of acquiring object attributes (e.g. by either generation or collection processes) and object attribute data producing devices (e.g. X-ray scanners, PFNA scanners, QRA scanners, and the like).

As shown in FIG. 30C, the system configuration parameters for each tunnel-based LAN 2621 might typically include, for example: system IP address, passwords; object identity codes OIC); object attribute acquisition codes (OAAC); etc.

As shown in FIG. 30C, each subsystem within each system in a specified tunnel-based LAN 2621 will have one or more monitorable and/or configurable parameters. For example, PLIIM-based object identification subsystem may include the following parameters: object identity code; and object attribute acquisition codes. The PLIM Subsystem may include the following parameters: VLD status; power VLD; TIM function; temperature, etc. The IFD module (Camera Subsystem) may include the parameter: Sensor Temperature. The Image Processing Computer may include the following parameters: processor load history; system up time; number of frames (pgs); bar code read rate; current line rate; etc. The Camera Control Computer may include the following parameters: number of frames dropped; number of focused zoom commands; number and kinds of motor control errors; etc. RFID-based object identification subsystem might include an object identity code as a parameter.

The data element queuing, handling and processing subsystem 131 might include object identity and attribute codes indicating the types of data elements which it is programmed to handle. The LDIP-based object identification, velocity-measurement, and dimensioning subsystem 122 might include the object identity codes indicating the types of object attributes which it generates during its operation. Object velocity measurement subsystem might include the following parameters: polygon RPM; polygon laser output X; channel X drift; channel X noise; trigger error events; instant lock reference drift; and temperature. The Object H/W/L profiling subsystem may include the object identity codes indicating the types of object attributes which it generates during its operation. The Object detection subsystem may include an object attribute code (e.g. non-singulation/singulation code) indicating the attributes which it generates during its operation. Also, an X-ray scanning subsystem, a Neutron-beam scanning subsystem, and any other object attribute producing subsystem configured with a particular system may include an object attribute code indicating the attributes which it generates during its operation.

In general, the RMCS management console can be realized in a variety of ways, depending on the requirements of the application at hand.

For example, a SNMP management console 2622 can be constructed so as to enable the querying of each SNMP agent in each device being managed in the network, as well as reading and writing variables associated with managed objects in the network. In this embodiment, the SNMP management console enables communication with each and every SNMP agent in the tunnel-based LAN in order to communicate for the purpose of accessing SNMP objects whether they are stored locally or centrally. One advantage of this object management technique is that it only depends on SNMP and its elements, and does not require the support of an http Server 2625 to serve a RMCS management console (GUI) to the service engineer or technician. However, such an SNMP management console is generally limited in terms of providing diagnostic and trouble-shooting tools which can be integrated into the management console, and thus the service engineer or technician with a more advanced level of monitoring, control and service required in industrial applications of the PLIIM-based object identification and attribute acquisition systems and networks of the present invention.

In an alternative embodiment of the present invention, the RMCS management console 2622 is realized by a GUI generated by one or more HTML-documents served from the LAN http/Servlet server 2625 during the practice of the RMCS method of the present invention. Preferably, the HTML-enabled RCMS management console (GUI) has a plurality of servlet-tags embedded within each HTML-encoded document of the GUI. These servlet tags are located beneath textual labels and/or graphical icons which identify particular "devices" and "objects" in a particular tunnel-based LAN which are to being managed by the RMCS system and method of the present invention. The compiled servlet code associated with each embedded servlet tag is loaded on the LAN http/Servlet Server 2625 in a manner well known in the Applet/Servlet arts. When the network administrator selects a particular servlet-tag on the RMCS management console GUI, viewed using an Internet-enabled browser program 2622, the browser program automatically executes (on the server side of the network) the servlet-code loaded on the Server 2626 at the URL specified by the selected servlet-tag. The executed servlet-code on the Server 2625 automatically invokes a method (i.e. process) which requests the SNMP agent on a particular system (or node) of the tunnel-based network to read or write variables at a particular SNMP MIB, or perform a transversal operation within a managed device.

In the illustrative embodiment, when executed by a servlet selected from the RMCS management console (GUI), a specified method may initiate one of three possible SNMP agent operations: (1) the RCMS management console sends a READ command to the SNMP agent enabling the reading of variables maintained within the MIB of any specified managed device in the tunnel-based LAN, in order to monitor the same; (2) the RCMS management console sends a WRITE command to the SNMP agent to write variables stored within the MIB of any managed device in the tunnel-based LAN, to control the same; (3) the RMCS management console sends a TRANSVERSAL OPERATION command to the SNMP agent to determine which variables a managed device supports and to sequentially gather information from variable tables (e.g. IP routing tables, bar code error rate tables, performance statistics tables, etc.) in any managed devices; and (4); and the RMCS management console sends a TRAP commands to the SNMP agent, requesting that the SNMP agent asynchronously report certain events to the RCMS management console (i.e. NMS).

Notably, there are several advantages to using servlets in an HTML-encoded RMCS management console to trigger SNMP agent operations within devices managed within the tunnel-based LAN. For example, a servlet embedded in the RMCS management console can simultaneously invoke multiple methods on the server side of the network, to monitor (i.e. read) particular variables (e.g. parameters) in each object identification and attribute acquisition subsystem 120, and 120', and then process these monitored parameters for subsequent storage in a central MIB in the 2626 and/or display. A servlet embedded in the RMCS management console can invoke a method on the server side of the network, to control (i.e. write) particular variables (e.g. parameters) in a particular device being managed within the tunnel-based LAN. A servlet embedded in the RMCS management console can invoke a method on the server side of the network, to control (i.e. write) particular variables (e.g. parameters) in a particular device being managed within the tunnel-based LAN. A servlet embedded in the RMCS management console can invoke a method on the server side of the network, to determine which variables a managed device supports and to sequentially gather information from variable tables for processing and storage in a central MIB in database 2626. Also, a servlet embedded in the RMCS management console can invoke a method on the server side of the network, to detect and asynchronously report certain events to the RCMS management console.

Notably, each object identification and attribute acquisition subsystem 120, and 120' in the tunnel-based LAN has an http server daemon, as well as SNMP, FTP, and SMTP. As such, in an alternative embodiment of the RMCS system and method of the present invention, it is possible to eliminate the use of the separate stand-alone http/Servlet server 2625 and backend database 2626, and instead designate one of the http servers on the subsystems 120 and 120' to serve as the LAN http/Servlet server, from which the RMCS management console (GUI) with its embedded servlets is served to the network administrator or system configuration engineer or technician.

The FTP service provided on each subsystem 120, and 120' (as well as on subsystem 140, 140' as well) enables the uploading of system and application software from an FTP site, as well as downloading of diagnostic error tables maintained in, for example, a central MIB database 2526. The FTP service can be launched from the RMCS management console by the system or network administrator or service technician. Also, the SMTP service provided on each subsystem 120, and 120' will enable the system 120, and 120' to issue an outgoing-mail message to the remote service technician stating, for example, "My name is iQ180, located at IP address 123.125.1.1; I have a system error problem, please fix me."

In the illustrative embodiment shown in FIGS. 30A through 30D2, the RMCS system 2620 enables an engineer, service technician or network manager, while remotely situated from the system or network installation requiring service, to use an Internet-enabled client machine to:

(1) monitor a robust set of network, system and subsystem parameters associated with any tunnel-based network installation (i.e. linked to the Internet through an ISP or NSP);

(2) analyze these parameters to trouble-shoot and diagnose performance failures of networks, systems and/or subsystems performing object identification and attribute acquisition functions;

(3) reconfigure and/or tune some of these parameters to improve network, system and/or subsystem performance;

(4) make remote service calls and repairs where possible over the Internet; and (5) instruct local service technicians on how to repair and service networks, systems and/or subsystems performing object identification and attribute acquisition functions.

In general, the RMCS method of the present invention is carried out over a globally-extensive switched-packet data communication network, such as the Internet. As illustrated at Block A in FIG. 30D1, the first step of the RCMS method of the illustrative embodiment involves using an Internet-enabled client computer 2622 to establish a network connection (i.e. via network router) with an http server 2625 in the tunnel-based LAN 2621 requiring remote monitoring, control and/or service.

As illustrated at Block B in FIG. 30D1, the second step of the method involves using the Internet-enabled client computer to access a RMCS management console from the http Server and display the same on the client computer.

As illustrated at Block C in FIG. 30D1, the third step of the method involves using the RMCS management console to display the network configuration parameters and use such parameters to establish a network connection with each system in the tunnel-based LAN, and to monitor the configuration parameters of each such system therein.

As illustrated at Block D in FIG. 30D1, the fourth step of the method involves using the RMCS management console to monitor the configuration and other monitorable parameters of each subsystem in the system.

As illustrated at Block E in FIG. 30D1, the fifth step of the method involves using the RMCS management console to run one or more diagnostic programs adapted to troubleshoot any performance problems with the system and/or network in which it operates.

As illustrated at Block F in FIG. 30D1, the sixth step of the method involves using information collected by the diagnostic program, and the RMCS management console to reconfigure (i.e. write) selected parameters in the system and instruct, by e-mail or other communication means, any hardware repairs that may be required at the LAN location.

As illustrated at Block G in FIG. 30D2, the seventh step of the method involves using the RMCS management console to rerun the diagnostic program on any troubled system in the tunnel-based LAN after parameter reconfiguration and/or hardware repair at the LAN location so as to test the performance of such systems, subsystems and the overall tunnel-based LAN.

As illustrated at Block H in FIG. 30D2, the eighth step of the method involves using the RMCS management console to monitor, from time to time, parameters of systems and subsystems in the tunnel-based LAN, so at to determine whether or not any of the systems and/or tunnel-based LAN requires servicing.

As illustrated at Block I in FIG. 30D2, the ninth step of the method involves using the RMCS management console to record, in a Customer Service RDBMS, all monitored parameter data and the results of executed diagnostic programs for future access, reference, and use during subsequent remote service calls over the Internet.

Notably, during parameter monitoring and diagnostic routines of the RMCS method described above at Blocks D and E, the RMCS management console will communicate with particular subsystems/modules within a given system to determine the states of a number of important parameters set within the each Object Identification and Attribute Acquisition System in the tunnel-based LAN Thus, remotely-situated client computer and accessed subsystems will communication and cooperate in various ways through their supporting systems to provide valuable levels of remote monitoring, configuration, and service including performance tuning.

Bioptical PLIIM-Based Product Dimensioning, Analysis and Identification System of the First Illustrative Embodiment of the Present Invention The numerous types of PLIIM-based camera systems disclosed hereinabove can be used as stand-alone devices, as well as components within resultant systems designed to carry out particular functions.

As shown in FIGS. 33A through 33C, a pair of PLIIM-based package identification (PID) systems 25' of FIGS. 3E4 through 3E8 are modified and arranged within a compact POS housing 581 having bottom and side light transmission apertures 582 and 583 (beneath bottom and side imaging windows 584 and 585, respectively), to produce a bioptical PLIIM-based product identification, dimensioning and analysis (PIDA) system 580 according to a first illustrative embodiment of the present invention. As shown in FIG. 33C, the bioptical PIDA system 580 comprises: a bottom PLIIM-based unit 586A mounted within the bottom portion of the housing 581; a side PLIIM-based unit 586B mounted within the side portion of the housing 581; an electronic product weigh scale 587, mounted beneath the bottom PLIIM-based unit 587A, in a conventional manner; and a local data communication network 588, mounted within the housing, and establishing a high-speed data communication link between the bottom and side units 586A and 586B, and the electronic weigh scale 587, and a host computer system (e.g. cash register) 589.

As shown in FIG. 33C, the bottom unit 586A comprises: a PLIIM-based PID subsystem 25' (without LDIP subsystem 122), installed within the bottom portion of the housing 587, for projecting a coplanar PLIB and 1-D FOV through the bottom light transmission aperture 582, on the side closest to the product entry side of the system indicated by the "arrow" (⇐) indicator shown in the figure drawing; a I/O subsystem 127 providing data, address and control buses, and establishing data ports for data input to and data output from the PLIIM-based PID subsystem 25'; and a network controller 132, operably connected to the I/O subsystem 127 and the communication medium of the local data communication network 588.

As shown in FIG. 33C, the side unit 586B comprises: a PLIIM-based PID subsystem 25' (with LDIP subsystem 122), installed within the side portion of the housing 581, for projecting (i) a coplanar PLIB and 1-D FOV through the side light transmission aperture 583, also on the side closest to the product entry side of the system indicated by the "arrow" (⇐) indicator shown in the figure drawing, and also (ii) a pair of AM laser beams, angularly spaced from each other, through the side light transmission aperture 583, also on the side closest to the product entry side of the system indicated by the "arrow" (⇐) indicator shown in the figure drawing, but closer to the arrow indicator than the coplanar PLIB and 1-D FOV projected by the subsystem, thus locating them slightly downstream from the AM laser beams used for product dimensioning and detection; a I/O subsystem 127 for establishing data ports for data input to and data output from the PLIIM-based PIB subsystem 25'; a network controller 132, operably connected to the I/O subsystem 127 and the communication medium of the local data communication network 588; and a system control computer 590, operably connected to the I/O subsystem 127, for (i) receiving package identification data elements transmitted over the local data communication network by either PLIIM-based PID subsystem 25', (ii) package dimension data elements transmitted over the local data communication network by the LDIP subsystem 122, and (iii) package weight data elements transmitted over the local data communication network by the electronic weigh scale 587. As shown, LDIP subsystem 122 includes an integrated package/object velocity measurement subsystem.

In order that the bioptical PLIIM-based PIDA system 580 is capable of capturing and analyzing color images, and thus enabling, in supermarket environments, "produce recognition" on the basis of color as well as dimensions and geometrical form, each PLIIM-based subsystem 25' employs (i) a plurality of visible laser diodes (VLDs) having different color producing wavelengths to produce a multi-spectral planar laser illumination beam (PLIB) from the side and bottom light transmission apertures 582 and 583, and also (ii) a 1-D (linear-type) CCD image detection array for capturing color images of objects (e.g. produce) as the objects are manually transported past the imaging windows 584 and 585 of the bioptical system, along the direction of the indicator arrow, by the user or operator of the system (e.g. retail sales clerk).

Any one of the numerous methods of and apparatus for speckle-noise reduction described in great detail hereinabove can be embodied within the bioptical system 580 to provide an ultra-compact system capable of high performance image acquisition and processing operation, undaunted by speckle-noise patterns which seriously degrade the performance of prior art systems attempting to illuminate objects using solid-state VLD devices, as taught herein.

Notably, the image processing computer 21 within each PLIIM-based subsystem 25' is provided with robust image processing software 582 that is designed to process color images captured by the subsystem and determine the shape/geometry, dimensions and color of scanned products in diverse retail shopping environments. In the illustrative embodiment, the IFD subsystem (i.e. "camera") 3" within the PLIIM-based subsystem 25" is capable of: (1) capturing digital images having (i) square pixels (i.e. 1:1 aspect ratio) independent of package height or velocity, (ii) significantly reduced speckle-noise levels, and (iii) constant image resolution measured in dots per inch (DPI) independent of package height or velocity and without the use of costly telecentric optics employed by prior art systems, (2) automatic cropping of captured images so that only regions of interest reflecting the package or package label are transmitted to either an image-processing based 1-D or 2-D bar code symbol decoder or an optical character recognition (OCR) image processor, and (3) automatic image lifting operations. Such functions are carried out in substantially the same manner as taught in connection with the tunnel-based system shown in FIGS. 27 through 32B.

In most POS retail environments, the sales clerk may pass either a UPC or UPC/EAN labeled product past the bioptical system, or an item of produce (e.g. vegetables, fruits, etc.). In the case of UPC labeled products, the image processing computer 21 will decode process images captured by the IFD subsystem 3' (in conjunction with performing OCR processing for reading trademarks, brandnames, and other textual indicia) as the product is manually moved past the imaging windows of the system in the direction of the arrow indicator. For each product identified by the system, a product identification data element will be automatically generated and transmitted over the data communication network to the system control/management computer 590, for transmission to the host computer (e.g. cash register computer) 589 and use in check-out computations. Any dimension data captured by the LDIP subsystem 122 while identifying a UPC or UPC/EAN labeled product, can be disregarded in most instances; although, in some instances, it might make good sense that such information is automatically transmitted to the system control/management computer 590, for comparison with information in a product information database so as to cross-check that the identified product is in fact the same product indicated by the bar code symbol read by the image processing computer 21. This feature of the bioptical system can be used to increase the accurately of product identification, thereby lowering scan error rates and improving consumer confidence in POS technology.

In the case of an item of produce swept past the light transmission windows of the bioptical system, the image processing computer 21 will automatically process images captured by the IFD subsystem 3" (using the robust produce identification software mentioned above), alone or in combination with produce dimension data collected by the LDIP subsystem 122. In the preferred embodiment, produce dimension data (generated by the LDIP subsystem 122) will be used in conjunction with produce identification data (generated by the image processing computer 21), in order to enable more reliable identification of produce items, prior to weigh in on the electronic weigh scale 587, mounted beneath the bottom imaging window 584. Thus, the image processing computer 21 within the side unit 586B (embodying the LDIP subsystem 122) can be designated as providing primary color images for produce recognition, and cross-correlation with produce dimension data generated by the LDIP subsystem 122. The image processing computer 21 within the bottom unit (without an LDIP subsystem) can be designated as providing secondary color images for produce recognition, independent of the analysis carried out within the side unit, and produce identification data generated by the bottom unit can be transmitted to the system control/management computer 590, for cross-correlation with produce identification and dimension data generated by the side unit containing the LDIP subsystem 122.

In alternative embodiments of the bioptical system described above, both the side and bottom units can be provided with an LDIP subsystem 122 for product/produce dimensioning operations. Also, it may be desirable to use a simpler set of image forming optics than that provided within IFD subsystem 3". Also, it may desirable to use PLIIM-based subsystems which have FOVs that are automatically swept across a large 3-D scanning volume definable between the bottom and side imaging windows 584 and 585. The advantage of this type of system design is that the product or item of produce can be presented to the bioptical system without the need to move the product or produce item past the bioptical system along a predetermined scanning/imaging direction, as required in the illustrative system of FIGS. 33A through 33C. With this modification in mind, reference is now made to FIGS. 34A through 34C in which an alternative bioptical vision-based product/produce identification system 600 is disclosed employing the PLIIM-based camera system disclosed in FIGS. 6D1 through 6E3.

Bioptical PLIIM-Based Product Identification, Dimensioning and Analysis System of the Second Illustrative Embodiment of the Present Invention As shown in FIGS. 34A through 34C, a pair of PLIIM-based package identification (PID) systems 25" of FIGS. 6D1 through 6E3 are modified and arranged within a compact POS housing 601 having bottom and side light transmission windows 602 and 603 (beneath bottom and side imaging windows 604 and 605, respectively), to produce a bioptical PLIIM-based product identification, dimensioning and analysis (PIDA) system 600 according to a second illustrative embodiment of the present invention. As shown in FIG. 34C, the bioptical PIDA system 600 comprises: a bottom PLIIM-based unit 606A mounted within the bottom portion of the housing 601; a side PLIIM-based unit 606B mounted within the side portion of the housing 601; an electronic product weigh scale 589, mounted beneath the bottom PLIIM-based unit 606A, in a conventional manner, and a local data communication network 588, mounted within the housing, and establishing a high-speed data communication link between the bottom and side units 606A and 606B, and the electronic weigh scale 589.

As shown in FIG. 34C, the bottom unit 606A comprises: a PLIIM-based PIB subsystem 25" (without LDIP subsystem 122), installed within the bottom portion of the housing 601, for projecting an automatically swept PLIB and a stationary 3-D FOV through the bottom light transmission window 602: a I/O subsystem 127 providing data, address and control buses, and establishing data ports for data input to and data output from the PLIIM-based PID subsystem 25"; and a network controller 132, operably connected to the I/O subsystem 127 and the communication medium of the local data communication network 588.

As shown in FIG. 34C, the side unit 606A comprises: a PLIIM-based PID subsystem 25" (with modified LDIP subsystem 122'), installed within the side portion of the housing 601, for projecting (i) an automatically swept PLIB and a stationary 3-D FOV through the bottom light transmission window 605, and also (ii) a pair of automatically swept AM laser beams 607A, 607B, angularly spaced from each other, through the side light transmission window 604; a I/O subsystem 127 for establishing data ports for data input to and data output from the PLIIM-based PID subsystem 25"; a network controller 132, operably connected to the I/O subsystem 127 and the communication medium of the local data communication network 588; and a system control data management computer 609, operably connected to the I/O subsystem 127, for (i) receiving package identification data elements transmitted over the local data communication network by either PLIIM-based PID subsystem 25", (ii) package dimension data elements transmitted over the local data communication network by the LDIP subsystem 122, and (iii) package weight data elements transmitted over the local data communication network by the electronic weigh scale 587. As shown, modified LDIP subsystem 122' is similar in nearly all respects to LDIP subsystem 122, except that its beam folding mirror 163 is automatically oscillated during dimensioning in order to swept the pair of AM laser beams across the entire 3-D FOV of the side unit of the system when the product or produce item is positioned at rest upon the bottom imaging window 604. In the illustrative embodiment, the PLIIM-based camera subsystem 25" is programmed to automatically capture images of its 3-D FOV to determine whether or not there is a stationary object positioned on the bottom imaging window 604 for dimensioning. When such an object is detected by this PLIIM-based subsystem, it either directly or indirectly automatically activates LDIP subsystem 122' to commence laser scanning operations within the 3-D FOV of the side unit and dimension the product or item of produce.

In order that the bioptical PLIIM-based PIDA system 600 is capable of capturing and analyzing color images, and thus enabling, in supermarket environments, "produce recognition" on the basis of color as well as dimensions and geometrical form, each PLIIM-based subsystem 25" employs (i) a plurality of visible laser diodes (VLDs) having different color producing wavelengths to produce a multi-spectral planar laser illumination beam (PLIB) from the bottom and side imaging windows 604 and 605, and also (ii) a 2-D (area-type) CCD image detection array for capturing color images of objects (e.g. produce) as the objects are presented to the imaging windows of the bioptical system by the user or operator of the system (e.g. retail sales clerk).

Any one of the numerous methods of and apparatus for speckle-noise reduction described in great detail hereinabove can be embodied within the bioptical system 600 to provide an ultra-compact system capable of high performance image acquisition and processing operation, undaunted by speckle-noise patterns which seriously degrade the performance of prior art systems attempting to illuminate objects using solid-state VLD devices, as taught herein.

Notably, the image processing computer 21 within each PLIIM-based subsystem 25" is provided with robust image processing software 610 that is designed to process color images captured by the subsystem and determine the shape/geometry, dimensions and color of scanned products in diverse retail shopping environments. In the illustrative embodiment, the IFD subsystem (i.e. "camera") 3" within the PLIIM-based subsystem 25" is capable of: (1) capturing digital images having (i) square pixels (i.e. 1:1 aspect ratio) independent of package height or velocity, (ii) significantly reduced speckle-noise levels, and (iii) constant image resolution measured in dots per inch (dpi) independent of package height or velocity and without the use of costly telecentric optics employed by prior art systems, (2) automatic cropping of captured images so that only regions of interest reflecting the package or package label are transmitted to either an image-processing based 1-D or 2-D bar code symbol decoder or an optical character recognition (OCR) image processor, and (3) automatic image lifting operations. Such functions are carried out in substantially the same manner as taught in connection with the tunnel-based system shown in FIGS. 27 through 32B.

In most POS retail environments, the sales clerk may pass either a UPC or UPC/EAN labeled product past the bioptical system, or an item of produce (e.g. vegetables, fruits, etc.). In the case of UPC labeled products, the image processing computer 21 will decode process images captured by the IFD subsystem 55" (in conjunction with performing OCR processing for reading trademarks, brandnames, and other textual indicia) as the product is manually presented to the imaging windows of the system. For each product identified by the system, a product identification data element will be automatically generated and transmitted over the data communication network to the system control/management computer 609, for transmission to the host computer (e.g. cash register computer) 589 and use in check-out computations. Any dimension data captured by the LDIP subsystem 122' while identifying a UPC or UPC/EAN labeled product, can be disregarded in most instances; although, in some instances, it might make good sense that such information is automatically transmitted to the system control/management computer 609, for comparison with information in a product information database so as to cross-check that the identified product is in fact the same product indicated by the bar code symbol read by the image processing computer 21. This feature of the bioptical system can be used to increase the accurately of product identification, thereby lowering scan error rates and improving consumer confidence in POS technology.

In the case of an item of produce presented to the imaging windows of the bioptical system, the image processing computer 21 will automatically process images captured by the IFD subsystem 55" (using the robust produce identification software mentioned above), alone or in combination with produce dimension data collected by the LDIP subsystem 122. In the preferred embodiment, produce dimension data (generated by the LDIP subsystem 122) will be used in conjunction with produce identification data (generated by the image processing computer 21), in order to enable more reliable identification of produce items, prior to weigh in on the electronic weigh scale 587, mounted beneath the bottom imaging window 604. Thus, the image processing computer 21 within the side unit 606B (embodying the LDIP subsystem') can be designated as providing primary color images for produce recognition, and cross-correlation with produce dimension data generated by the LDIP subsystem 122'. The image processing computer 21 within the bottom unit 606A (without LDIP subsystem 122') can be designated as providing secondary color images for produce recognition, independent of the analysis carried out within the side unit 606B, and produce identification data generated by the bottom unit can be transmitted to the system control/management computer 609, for cross-correlation with produce identification and dimension data generated by the side unit containing the LDIP subsystem 122'.

In alternative embodiments of the bioptical system described above, it may be desirable to use a simpler set of image forming optics than that provided within IFD subsystem 55".

PLIIM-Based Systems Employing Planar Laser Illumination Arrays (PLIAs) With Visible Laser Diodes Having Characteristic Wavelengths Residing Within Different Portions of the Visible Band Numerous illustrative embodiments of PLIIM-based imaging systems according to the principles of the present invention have been described in detail below. While the illustrative embodiments described above have made reference to the use of multiple VLDs to construct each PLIA, and that the characteristic wavelength of each such VLD is substantially similar, the present invention contemplates providing a novel planar laser illumination and imaging module (PLIIM) which employs a planar laser illumination array (PLIA) 6A, 6B comprising a plurality of visible laser diodes having a plurality of different characteristic wavelengths residing within different portions of the visible band. The present invention also contemplates providing such a novel PLIIM-based system, wherein the visible laser diodes within the PLIA thereof are spatially arranged so that the spectral components of each neighboring visible laser diode (VLD) spatially overlap and each portion of the composite planar laser illumination beam (PLIB) along its planar extent contains a spectrum of different characteristic wavelengths, thereby imparting multi-color illumination characteristics to the composite laser illumination beam. The multi-color illumination characteristics of the composite planar laser illumination beam will reduce the temporal coherence of the laser illumination sources in the PLIA, thereby reducing the speckle noise pattern produced at the image detection array of the PLIIM.

The present invention also contemplates providing a novel planar laser illumination and imaging module (PLIIM) which employs a planar laser illumination array (PLIA) comprising a plurality of visible laser diodes (VLDs) which intrinsically exhibit high "spectral mode hopping" spectral characteristics which cooperate on the time domain to reduce the temporal coherence of the laser illumination sources operating in the PLIA, and thereby reduce the speckle noise pattern produced at the image detection array in the PLIIM.

The present invention also contemplates providing a novel planar laser illumination and imaging module (PLIIM) which employs a planar laser illumination array (PLIA) 6A, 6B comprising a plurality of visible laser diodes (VLDs) which are "thermally-driven" to exhibit high "mode-hopping" spectral characteristics which cooperate on the time domain to reduce the temporal coherence of the laser illumination sources operating in the PLIA, and thereby reduce the speckle-noise pattern produced at the image detection array in the PLIIM accordance with the principles of the present invention.

In some instances, it may also be desirable to use VLDs having characteristics outside of the visible band, such as in the ultra-violet (UV) and infra-red (IR) regions. In such cases, PLIIM-based subsystems will be produced capable of illuminating objects with planar laser illumination beams having IR and/or UV energy characteristics. Such systems can prove useful in diverse industrial environments where dimensioning and/or imaging in such regions of the electromagnetic spectrum are required or desired.

Planar Laser Illumination Module (PLIM) Fabricated by Mounting a Micro-Sized Cylindrical Lens Array Upon a Linear Array of Surface Emitting Lasers (SELs) Formed on a Semiconductor Substrate Various types of planar laser illumination modules (PLIM) have been described in detail above. In general, each PLIM will employ a plurality of linearly arranged laser sources which collectively produce a composite planar laser illumination beam. In certain applications, such as hand-held imaging applications, it will be desirable to construct the hand-held unit as compact and as lightweight as possible. Also, in most applications, it will be desirable to manufacture the PLIMs as inexpensively as possible.

As shown in FIGS. 35A and 35B, the present invention addresses the above design criteria by providing a miniature planar laser illumination module (PLIM) on a semiconductor chip 620 that can be fabricated by aligning and mounting a micro-sized cylindrical lens array 621 upon a linear array of surface emitting lasers (SELs) 622 formed on a semiconductor substrate 623, encapsulated (i.e. encased) in a semiconductor package 624 provided with electrical pins 625, a light transmission window 626 and emitting laser emission in the direction normal to the substrate. The resulting semiconductor chip 620 is designed for installation in any of the PLIIM-based systems disclosed, taught or suggested by the present disclosure, and can be driven into operation using a low-voltage DC power supply. The laser output from the PLIM semiconductor chip 620 is a planar laser illumination beam (PLIB) composed of numerous (e.g. 100–400 or more) spatially incoherent laser beams emitted from the linear array of SELs 622 in accordance with the principles of the present invention.

Preferably, the power density characteristics of the composite PLIB produced from this semiconductor chip 620 should be substantially uniform across the planar extent thereof, i.e. along the working distance of the optical system in which it is employed. If necessary, during manufacture, an additional diffractive optical element (DOE) array can be aligned upon the linear array of SELs 620 prior to placement and alignment of the cylindrical lens array 621. The function of this additional DOE array would be to spatially filter (i.e. smooth out) laser emissions produced from the SEL array so that the composite PLIB exhibits substantially uniform power density characteristics across the planar extent thereof, as required during most illumination and imaging operations. In alternative embodiments, the optional DOE array and the cylindrical lens array can be designed and manufactured as a unitary optical element adapted for placement and mounting on the SEL array 622. While holographic recording techniques can be used to manufacture such diffractive optical lens arrays, it is understood that refractive optical elements can also be used in practice with equivalent results. Also, while end user requirements will typically specify PLIB power characteristics, currently available SEL array fabrication techniques and technology will determine the realizeability of such design specifications.

In general, there are various ways of realizing the PLIIM-based semiconductor chip of the present invention, wherein surface emitting laser (SEL) diodes produce laser emission in the direction normal to the substrate.

In FIG. 36A, a first illustrative embodiment of the PLIM-based semiconductor chip 620 is shown constructed from a plurality of "45 degree mirror" (SELs) 622'. As shown, each 45 degree mirror SEL 627 of the illustrative embodiment comprises: an n-doped quarter-wave GaAs/AlAs stack 628 functioning as the lower distributed Bragg reflector (DBR); an $In_{0.2}Ga_{0.8}As$/GaAs strained quantum well active region 629 in the center of a one-wave $Ga_{0.5}Al_{0.5}As$ spacer; and a p-doped upper GaAs/AlAs stack 630 (grown on a n+-GaAs substrate), functioning as the top DBR; a 45 degree slanted mirror 631 (etched in the n-doped layer) for reflecting laser emission output from the active region, in a direction normal to the surface of the substrate. Isolation regions 632 are formed between each SEL 627.

As shown in FIG. 36A, a linear array of 45 degree mirror SELs are formed upon the n-doped substrate, and then a micro-sized cylindrical lens array 621 (e.g. diffractive or refractive lens array) is (i) placed upon the SEL array, (ii) aligned with respect to SEL array so that the cylindrical lens array planarizes the output PLIB, and finally (iii) permanently mounted upon the SEL array to produce the monolithic PLIM device of the present invention. As shown in FIGS. 35A and 35B, the resulting assembly is then encapsulated within an IC package 624 having a light transmission window 626 through which the composite PLIB may project outwardly in direction substantially normal to the substrate, as well as connector pins 625 for connection to SEL array drive circuits described hereinabove. Preferably, the light transmission window 626 is provided with a narrowly-tuned band-pass spectral filter, permitting transmission of only the spectral components of the composite PLIB produced from the PLIM semiconductor chip.

In FIG. 36B, a second illustrative embodiment of the PLIM-based semiconductor chip is shown constructed from "grating-coupled" surface emitting laser (SELs) 635. As shown, each grating couple SEL 635 comprises: an n-doped GaAs/AlAs stack 636 functioning as the lower distributed Bragg reflector (DBR); an $In_{0.2}Ga_{0.8}As$/GaAs strained quantum well active region 637 in the center of a $Ga_{0.5}Al_{0.5}As$ spacer; and a p-doped upper GaAs/AlAs stack 638 (grown on a n+-GaAs substrate) functioning as the top DBR; and a 2$^{nd}$ order diffraction grating 639, formed in the p-doped layer, for coupling laser emission output from the active region, through the 2$^{nd}$ order grating, and in a direction normal to the surface of the substrate. Isolation regions 640 are formed between each SEL 635.

As shown in FIG. 36B, a linear array of grating-coupled SELs are formed upon the n-doped substrate, and then a micro-sized cylindrical lens array 621 (e.g. diffractive or refractive lens array) is (i) placed upon the SEL array, (ii) aligned with respect to SEL array so that the cylindrical lens array planarizes the output PLIB, and finally (iii) permanently mounted upon the SEL array to produce the monolithic PLIM device of the present invention. As shown in FIGS. 35A and 35B, the resulting assembly is then encapsulated within an IC package having a light transmission window 626 through which the composite PLIB may project outwardly in direction substantially normal to the substrate, as well as connector pins 625 for connection to SEL array drive circuits described hereinabove. Preferably, the light transmission window 626 is provided with a narrowly-tuned band-pass spectral filter, permitting transmission of only the spectral components of the composite PLIB produced from the PLIM semiconductor chip.

In FIG. 36C, a third illustrative embodiment of the PLIIM-based semiconductor chip 620 is shown constructed from "vertical cavity" (SELs), or VCSELs. As shown, each VCSEL comprises: an n-doped quarter-wave GaAs/AlAs stack 646 functioning as the lower distributed Bragg reflector (DBR); an $In_{0.2}Ga_{0.8}As$/GaAs strained quantum well active region 647 in the center of a one-wave $Ga_{0.5}Al_{0.5}As$ spacer; and a p-doped upper GaAs/AlAs stack 648 (grown on a n+-GaAs substrate), functioning as the top DBR, with the topmost layer is a half-wave-thick GaAs layer to provide phase matching for the metal contact; wherein laser emission from the active region is directed in opposite directions, normal to the surface of the substrate. Isolation regions 649 are provided between each VCSEL 645.

As shown in FIG. 36C, a linear array of VCSELs are formed upon the n-doped substrate, and then a micro-sized cylindrical lens array 621 (e.g. diffractive or refractive lens array) is (i) placed upon the SEL array, (ii) aligned with respect to SEL array so that the cylindrical lens array planarizes the output PLIB, and finally (iii) permanently mounted upon the SEL array to produce the monolithic PLIM device of the present invention. As shown in FIGS. 35A and 35B, the resulting assembly is then encapsulated within an IC package having a light transmission window 626 through which the composite PLIB may project outwardly in direction substantially normal to the substrate, as well as connector pins 625 for connection to SEL array drive circuits described hereinabove. Preferably, the light transmission window 626 is provided with a narrowly-tuned band-pass spectral filter, permitting transmission of only the spectral components of the composite PLIB produced from the PLIM semiconductor chip.

Each of the illustrative embodiments of the PLIM-based semiconductor chip described above can be constructed using conventional VCSEL array fabricating techniques well known in the art. Such methods may include, for example, slicing a SEL-type visible laser diode (VLD) wafer into linear VLD strips of numerous (e.g. 200–400) VLDs. Thereafter, a cylindrical lens array 621, made using from light diffractive or refractive optical material, is placed upon and spatially aligned with respect to the top of each VLD strip 622 for permanent mounting, and subsequent packaging within an IC package 624 having an elongated light transmission window 626 and electrical connector pins 625, as shown in FIGS. 35A and 35B. For details on such SEL array fabrication techniques, reference can be made to pages 368–413 in the textbook "Laser Diode Arrays" (1994), edited by Dan Botez and Don R. Scifres, and published by Cambridge University Press, under Cambridge Studies in Modern Optics, incorporated herein by reference.

Notably, each SEL in the laser diode array can be designed to emit coherent radiation at a different characteristic wavelengths to produce an array of coplanar laser illumination beams which are substantially temporally and spatially incoherent with respect to each other. This will result in producing from the PLIM-based semiconductor chip, a temporally and spatially coherent-reduced planar laser illumination beam (PLIB), capable of illuminating objects and producing digital images having substantially reduced speckle-noise patterns observable at the image detection array of the PLIIM-based system in which the PLIM-based semiconductor chip is used (i.e. when used in accordance with the principles of the invention taught herein).

The PLIM semiconductor chip of the present invention can be made to illuminate outside of the visible portion of the electromagnetic spectrum (e.g. over the UV and/or IR portion of the spectrum). Also, the PLIM semiconductor chip of the present invention can be modified to embody laser mode-locking principles, shown in FIGS. 1I15C and 1I15D and described in detail above, so that the PLIB transmitted from the chip is temporally-modulated at a sufficient high rate so as to produce ultra-short planes light ensuring substantial levels of speckle-noise pattern reduction during object illumination and imaging applications.

One of the primary advantages of the PLIM-based semiconductor chip of the present invention is that by providing a large number of VCSELs (i.e. real laser sources) on a semiconductor chip beneath a cylindrical lens array, speckle-noise pattern levels can be substantially reduced by an amount proportional to the square root of the number of independent laser sources (real or virtual) employed.

Another advantage of the PLIM-based semiconductor chip of the present invention is that it does not require any mechanical parts or components to produce a spatially and/or temporally coherence-reduced PLIB during system operation.

Also, during manufacture of the PLIM-based semiconductor chip of the present invention, the cylindrical lens array and the VCSEL array can be accurately aligned using substantially the same techniques applied in state-of-the-art photo-lithographic IC manufacturing processes. Also, de-smiling of the output PLIB can be easily corrected during manufacture by simply rotating the cylindrical lens array in front of the VLD strip.

Notably, one or more PLIM-based semiconductor chips of the present invention can be employed in any of the PLIIM-based systems disclosed, taught or suggested herein. Also, it is expected that the PLIM-based semiconductor chip of the present invention will find utility in diverse types of instruments and devices, and diverse fields of technical application.

Fabricating a Planar Laser Illumination and Imaging Module (PLIIM) by Mounting a Pair of Micro-Sized Cylindrical Lens Arrays Upon a Pair of Linear Arrays of Surface Emitting Lasers (SELs) Formed Between a Linear CCD Image Detection Array on a Common Semiconductor Substrate As shown in FIG. 37, the present invention further contemplates providing a novel planar laser illumination and imaging module (PLIIM) 650 realized on a semiconductor chip. As shown in FIG. 36, a pair of micro-sized (diffractive or refractive) cylindrical lens arrays 651A and 651B are mounted upon a pair of large linear arrays of surface emitting lasers (SELs) 652A and 652B fabricated on opposite sides of a linear CCD image detection array 653. Preferably, both the linear CCD image detection array 653 and linear SEL arrays 652A and 652B are formed a common semiconductor substrate 654, and encased within an integrated circuit package 655 having electrical connector pins 656, a first and second elongated light transmission windows 657A and 657B disposed over the SEL arrays 652A and 652B, respectively, and a third light transmission window 658 disposed over the linear CCD image detection array 653. Notably, SEL arrays 652A and 652B and linear CCD image detection array 653 must be arranged in optical isolation of each other to avoid light leaking onto the CCD image detector from within the IC package. When so configured, the PLIIM semiconductor chip 650 of the present invention produces a composite planar laser illumination beam (PLIB) composed of numerous (e.g. 400–700) spatially incoherent laser beams, aligned substantially within the planar field of view (FOV) provided by the linear CCD image detection array, in accordance with the principles of the present invention. This PLIIM-based semiconductor chip is powered by a low voltage/low power P.C. supply and can be used in any of the PLIIM-based systems and devices described above. In particular, this PLIIM-based semiconductor chip can be mounted on a mechanically oscillating scanning element in order to sweep both the FOV and coplanar PLIB through a 3-D volume of space in which objects bearing bar code and other machine-readable indicia may pass. This imaging arrangement can be adapted for use in diverse application environments.

Planar Laser Illumination and Imaging Module (PLIIM) Fabricated by Forming a 2D Array of Surface Emitting Lasers (SELs) About a 2D Area-Type CCD Image Detection Array on a Common Semiconductor Substrate, With a Field of View Defining Lens Element Mounted Over the 2D CCD Image Detection Array and a 2D Array of Cylindrical Lens Elements Mounted Over the 2D Array of SELs A shown in FIGS. 38A and 38B, the present invention also contemplates providing a novel 2D PLIIM-based semiconductor chip 360 embodying a plurality of linear SEL arrays 361A, 361B . . . , 361*n*, which are electronically-activated to electro-optically scan (i.e. illuminate) the entire 3-D FOV of a CCD image detection array 362 without using mechanical scanning mechanisms. As shown in FIG. 38B, the miniature 2D VLD/CCD camera 360 of the illustrative embodiment can be realized by fabricating a 2-D array of SEL diodes 361 about a centrally located 2-D area-type CCD image detection array 362, both on a semiconductor substrate 363 and encapsulated within a IC package 364 having connection pins 364, a centrally-located light transmission window 365 positioned over the CCD image detection array 362, and a peripheral light transmission window 366 positioned over the surrounding 2-D array of SEL diodes 361. As shown in FIG. 38B, a light focusing lens element 367 is aligned with and mounted beneath the centrally-located light transmission window 365 to define a 3D field of view (FOV) for forming images on the 2-D image detection array 362, whereas a 2-D array of cylindrical lens elements 368 is aligned with and mounted beneath the peripheral light transmission window 366 to substantially planarize the laser emission from the linear SEL arrays (comprising the 2-D SEL array 361) during operation. In the illustrative embodiment, each cylindrical lens element 368 is spatially aligned with a row (or column) in the 2-D SEL array 361. Each linear array of SELs 361*n* in the 2-D SEL array 361, over which a cylindrical lens element 366*n* is mounted, is electrically addressable (i.e. activatable) by laser diode control and drive circuits 369 which can be fabricated on the same semiconductor substrate. This way, as each linear SEL array is activated, a PLIB 370 is produced therefrom which is coplanar with a cross-sectional portion of the 3-D FOV 371 of the 2-D CCD image detection array. To ensure that laser light produced from the SEL array does not leak onto the CCD image detection array 362, a light buffering (isolation) structure 372 is mounted about the CCD array 362, and optically isolates the CCD array 362 from the SEL array 361 from within the IC package 364 of the PLIIM-based chip 360.

The novel optical arrangement shown in FIGS. 3A and 3B enables the illumination of an object residing within the 3D FOV during illumination operations, and formation of an image strip on the corresponding rows (or columns) of detector elements in the CCD array. Notably, beneath each cylindrical lens element 366*n* (within the 2-D cylindrical lens array 366), there can be provided another optical surface (structure) which functions to widen slightly the geometrical characteristics of the generated PLIB, thereby causing the laser beams constituting the PLIB to diverge slightly as the PLIB travels away from the chip package, ensuring that all regions of the 3D FOV 371 are illuminated with laser illumination, understandably at the expense of a decrease beam power density. Preferably, in this particular embodiment of the present invention, the 2-D cylindrical lens array 366 and FOV-defining optical focusing element 367 are fabricated on the same (plastic) substrate, and designed to produce laser illumination beams having geometrical and optical characteristics that provide optimum illumination coverage while satisfying illumination power requirements to ensuring that the signal-to-noise (SNR) at the CCD image detector 362 is sufficient for the application at hand.

One of the primary advantages of the PLIIM-based semiconductor chip design 360 shown in FIGS. 38A and 38B is that its linear SEL arrays 361*n* can be electronically-activated in order to electro-optically illuminate (i.e. scan) the entire 3-D FOV 371 of the CCD image detection array 362 without using mechanical scanning mechanisms. In addition to the providing a miniature 2D CCD camera with an integrated laser-based illumination system, this novel semiconductor chip 360 also has ultra-low power requirements and packaging constraints enabling its embodiment within diverse types of objects such, as for example, appliances, keychains, pens, wallets, watches, keyboards, portable bar code scanners, stationary bar code scanners, OCR devices, industrial machinery, medical instrumentation, office equipment, hospital equipment, robotic machinery, retail-based systems, and the like. Applications for PLIIM-based semiconductor chip 360 will only be limited by ones imagination. The SELs in the device may be provided with multi-wavelength characteristics, as well as tuned to operate outside the visible region of the electromagnetic spectrum (e.g. within the IR and UV bands). Also, the present invention contemplates embodying any of the speckle-noise pattern reduction techniques disclosed herein to enable its use in demanding applications where speckle-noise is intolerable. Preferably, the mode-locking techniques taught herein may be embodied within the PLIIM-based semiconductor chip 360 shown in FIGS. 38A and 38B so that it generates and repeated scans temporally coherent-reduced PLIBs over the 3D FOV of its CCD image detection array 362.

In FIG. 39A, there is shown a first illustrative embodiment of the PLIIM-based hand-supportable imager of the present invention 1200. As shown, the PLIIM-based imager 1200 comprises: a hand-supportable housing 1201; a PLIIM-based image capture and processing engine 1202 contained therein, for projecting a planar laser illumination beam (PLIB) 1203 through its imaging window 1204 in coplanar relationship with the field of view (FOV) 1205 of the linear image detection array 1206 employed in the engine; a LCD display panel 1207 mounted on the upper top surface 1208 of the housing in an integrated manner, for displaying, in a real-time manner, captured images, data being entered into the system, and graphical user interfaces (GUIs) required in the support of various types of information-based transactions; a data entry keypad 1209 mounted on the middle top surface of the housing 1210 for enabling the user to manually enter data into the imager required during the course of such information-based transactions; and an embedded-type computer and interface board 1211 contained within the handle of the housing, for carrying out image processing operations such as, for example, bar code symbol decoding operations, signature image processing operations, optical character recognition (OCR) operations, and the like, in a high-speed manner, as well as enabling a high-speed data communication interface 1212 with a digital communication network 1213, such as a LAN or WAN supporting a networking protocol such as TCP/IP, AppleTalk or the like.

Hand-Supportable Planar Laser Illumination and Imaging (PLIIM) Devices Employing Linear Image Detection Arrays and Optically-Combined Planar Laser Illumination Beams (PLIBS) Produced From a Multiplicity of Laser Diode Sources to Achieve a Reduction in Speckle-Pattern Noise Power in Said Devices In the PLIIM-based hand-supportable linear imager of FIG. 42, speckle-pattern noise is reduced by employing optically-combined planar laser illumination beams (PLIB) components produced from a multiplicity of spatially-incoherent laser diode sources. The greater the number of spatially-incoherent laser diode sources that are optically combined and projected onto points on the objects being illuminated, then greater the reduction in RMS power of observed speckle-pattern noise within the PLIIM-based imager.

As shown in FIG. 42, PLIIM-based imager 4700 comprises: a hand-supportable housing 4701; a PLIIM-based image capture and processing engine 4702 contained therein, for projecting a planar laser illumination beam (PLIB) 4701 through its imaging window 4704 in coplanar relationship with the field of view (FOV) 4705 of the linear image detection array 4706 (having vertically elongated image detection elements (H/W>>1) enabling spatial averaging of speckle pattern noise) employed in the engine; a LCD display panel 4707 mounted on the top surface 4708 of the housing in an integrated manner, for displaying, in a real-time manner, captured images, data being entered into the system, and graphical user interfaces (GUIs) required in the support of various types of information-based transactions; a data entry keypad 4709 also mounted on the top surface 4708 of the housing, for enabling the user to manually enter data into the imager required during the course of such information-based transactions; and an embedded-type computer and interface board 4710 contained within the housing, for carrying out image processing operations such as, for example, bar code symbol decoding operations, signature image processing operations, optical character recognition (OCR) operations, and the like, in a high-speed manner, as well as enabling a high-speed data communication interface 4711 with a digital communication network 4712, such as a LAN or WAN supporting a networking protocol such as TCP/IP, AppleTalk or the like.

As shown, the PLIIM-based image capture and processing engine 4702 includes: (1) a 1-D (i.e. linear) image formation and detection (IFD) module 4713; (2) a pair of planar laser illumination arrays (PLIAs) 4714A and 4714B; and (3) an optical element 4715A and 4715B mounted before PLIAs 4714A and 4714B, respectively, (e.g. cylindrical lens array). As shown, the linear IFD module is mounted within the hand-supportable housing and contains a linear image detection array 4706 and image formation optics 4718 with a field of view (FOV) projected through said light transmission window 4704 into an illumination and imaging field external to the hand-supportable housing. The PLIAs 4714A and 4714B are mounted within the hand-supportable housing and arranged on opposite sides of the linear image detection array 4706. Each PLIA comprises a plurality of planar laser illumination modules (PLIMs), each PLIM having its own visible laser diode (VLD), for producing a plurality of spatially-incoherent planar laser illumination beam (PLIB) components. Each spatially-incoherent PLIB component is arranged in a coplanar relationship with a portion of the FOV. Each optical element 4715A, 4715B is mounted within the hand-supportable housing, for optically combining and projecting the plurality of spatially-incoherent PLIB components through the light transmission window in coplanar relationship with the FOV, onto the same points on the surface of an object to be illuminated. By virtue of such operations, the linear image detection array detects time-varying and spatially-varying speckle-noise patterns produced by the spatially-incoherent PLIB components reflected/scattered off the illuminated object, and the time-varying and spatially-varying speckle-noise patterns are time-averaged and spatially-averaged at the linear image detection array 4706 during each photo-integration time period thereof so as to reduce the RMS power of speckle-pattern noise observable at the linear image detection array.

Below, a number of illustrative embodiments of hand-supportable PLIIM-based linear imagers are described. In such illustrative embodiments, image detection arrays with vertically-elongated image detection elements are employed in order to reduce speckle-pattern noise through spatial averaging, using the ninth generalized despeckling methodology of the present invention described in detail hereinabove. In addition, these linear imagers also embody despeckling mechanisms based on the principle of reducing either the temporal and/or spatial coherence of the PLIB either before or after object illumination operations. Collectively, these despeckling techniques provide robust solutions to speckle-pattern noise problems arising in hand-supportable linear-type PLIIM-based imaging systems.

First Illustrative Embodiment of the PLIIM-Based Hand-Supportable Linear Imager of the Present Invention Comprising Integrated Speckle-Pattern Noise Subsystem Operated in Accordance With the First Generalized Method of Speckle-Pattern Noise Reduction Illustrated in FIGS. 1I1A Through 1I3A As shown in FIG. 39B, the PLIIM-based image capture and processing engine 1202 comprises: an optical-bench/multi-layer PC board 1214 contained between the upper and lower portions of the engine housing 1215A and 1215B; an IFD (i.e. camera) subsystem 1216 mounted on the optical bench, and including 1-D (i.e. linear) CCD image detection array 1207 having vertically-elongated image detection elements 1216 and being contained within a light-box 1217 provided with image formation optics 1218, through which laser light collected from the illuminated object along the field of view (FOV) 1205 is permitted to pass; a pair of PLIMs (i.e. comprising a dual-VLD PLIA) 1219A and 1219B mounted on optical bench 1214 on opposite sides of the IFD module 1216, for producing the PLIB 1203 within the FOV 1205; and an optical assembly 1220 including a pair of micro-oscillating cylindrical lens arrays 1221A and 1221B, configured with PLIMs 1219A and 1219B, and a stationary cylindrical lens array 1222, to produce a despeckling mechanism that operates in accordance with the first generalized method of speckle-pattern noise reduction illustrated in FIGS. 1I1A through 1I3A. As shown in FIG. 39E, the field of view of the IFD module 1216 spatially-overlaps and is coextensive (i.e. coplanar) with the PLIBs 1203 that are generated by the PLIMs 1219A and 1219B employed therein.

In this illustrative embodiment, cylindrical lens array 1222 is stationary relative to reciprocating cylindrical lens array 1221A, 1221B and the spatial periodicity of the lenslets is higher than the spatial periodicity of lenslets therein in cylindrical lens arrays 1221A, 1221B. In the illustrative embodiment the physical spacing of cylindrical lens array 1221A, 1221B from its PLIM, and the spacing between cylindrical lens arrays 1221A and 1222 at each PLIM is on the order of about a few millimeters. In the illustrative embodiment, the focal length of each lenslet in the reciprocating cylindrical lens array 1221A, 1221B is about 0.085 inches, whereas the focal length of each lenslet in the stationary cylindrical lens array 1222 is about 0.010 inches. In the illustrative embodiment, the width-to-height dimensions of reciprocating cylindrical lens array is about 7×7 millimeters, whereas the width-to-height dimensions of each reciprocating cylindrical lens array is about 10×10 millimeters. In the illustrative embodiment, the rate of reciprocation of each cylindrical lens array relative to its stationary cylindrical lens array is about 67.0 Hz, with a maximum array displacement of about +/−0.085 millimeters. It is understood that in alternative embodiments of the present invention, such parameters will naturally vary in order to achieve the level of despeckling performance required by the application at hand.

System Control Architectures for PLIIM-Based Hand-Supportable Linear Imagers of the Present Invention Employing Linear-Type Image Formation and Detection (IFD) Modules Having a Linear Image Detection Array With Vertically-Elongated Image Detection Elements In general, there are a various types of system control architectures (i.e. schemes) that can be used in conjunction with any of the hand-supportable PLIIM-based linear-type imagers shown in FIGS. 39A through 39C and 41A through 51C, and described throughout the present Specification. Also, there are three principally different types of image forming optics schemes that can be used to construct each such PLIIM-based linear imager. Thus, it is possible to classify hand-supportable PLIIM-based linear imagers into least fifteen different system design categories based on such criteria. Below, these system design categories will be briefly described with reference to FIGS. 40A through 40C5.

System Control Architectures for PLIIM-Based Hand-Supportable Linear Imagers of the Present Invention Employing Linear-Type Image Formation and Detection (IFD) Modules Having a Linear Image Detection Array With Vertically-Elongated Image Detection Elements and Fixed Focal Length/Fixed Focal Distance Image Formation Optics In FIG. 40A1, there is shown a manually-activated version of the PLIIM-based linear imager as illustrated, for example, in FIGS. 39A through 39C and 41A through 51C. As shown in FIG. 40A1, the PLIIM-based linear imager 1225 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1228 having a linear image detection array 1229 with vertically-elongated image detection elements 1230, fixed focal length/fixed focal distance image formation optics 1231, an image frame grabber 1232, and an image data buffer 1233; an image processing computer 1234; a camera control computer 1235; a LCD panel 1236 and a display panel driver 1237; a touch-type or manually-keyed data entry pad 1238 and a keypad driver 1239; and a manually-actuated trigger switch 1240 for manually activating the planar laser illumination arrays, the linear-type image formation and detection (IFD) module, the image frame grabber, the image data buffer, and the image processing computer, via the camera control computer, in response to the manual activation of the trigger switch 1240. Thereafter, the system control program carried out within the camera control computer 1235 enables: (1) the automatic capture of digital images of objects (i.e. bearing bar code symbols and other graphical indicia) through the fixed focal length/fixed focal distance image formation optics 1231 provided within the linear imager; (2) the automatic decode-processing of the bar code symbol represented therein; (3) the automatic generation of symbol character data representative of the decoded bar code symbol; (4) the automatic buffering of the symbol character data within the hand-supportable housing or transmitting the same to a host computer system; and (5) thereafter the automatic deactivation of the subsystem components described above. When using a manually-actuated trigger switch 1240 having a single-stage operation, manually depressing the switch 1240 with a single pull-action will thereafter initiate the above sequence of operations with no further input required by the user.

In an alternative embodiment of the system design shown in FIG. 40A1, manually-actuated trigger switch 1240 would be replaced with a dual-position switch 1240' having a dual-positions (or stages of operation) so as to further embody the functionalities of both switch 1240 shown in FIG. 40A1 and transmission activation switch 1261 shown in FIG. 40A2. Also, the system would be further provided with a data transfer mechanism 1260 as shown in FIG. 40A2, for example, so that it embodies the symbol character data transmission functions described in greater detail in copending U.S. application Ser. No. 08/890,320, filed Jul. 9, 1997, and Ser. No. 09/513,601, filed Feb. 25, 2000, each said application being incorporated herein by reference in its entirety. In such an alternative embodiment, when the user pulls the dual-position switch 1240' to its first position, the camera control computer 1235 will automatically activate the following components: the planar laser illumination array 6 (driven by VLD driver circuits 18), the linear-type image formation and detection (IFD) module 1228, and the image processing computer 1234 so that (1) digital images of objects (i.e. bearing bar code symbols and other graphical indicia) are automatically and repeatedly captured, (2) bar code symbols represented therein are repeatedly decoded, and (3) symbol character data representative of each decoded bar code symbol is automatically generated in a cyclical manner (i.e. after each reading of each instance of the bar code symbol) and buffered in the data transmission mechanism 1260. Then, when the user further depresses the dual-position switch to its second position (i.e. complete depression or activation), the camera control computer 1235 enables the data transmission mechanism 1260 to transmit character data from the imager processing computer 1234 to a host computer system in response to the manual activation of the dual-position switch 1240' to its second position at about the same time as when a bar code symbol is automatically decoded and symbol character data representative thereof is automatically generated by the image processing computer 1234 and buffered in data transmission switch 1260. This dual-stage switching mechanism provides the user with an additional degree of control when trying to accurately read a bar code symbol from a bar code menu, on which two or more bar code symbols reside on a single line of a bar code menu, and width of the FOV of the hand-held imager spatially extends over these bar code symbols, making bar code selection challenging if not difficult.

In FIG. 40A2, there is shown an automatically-activated version of the PLIIM-based linear imager as illustrated, for example, in FIGS. 39A through 39C and 41A through 51C. As shown in FIG. 40A2, the PLIIM-based linear imager 1245 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1246 having a linear image detection array 1247 with vertically-elongated image detection elements 1248, fixed focal length/fixed focal distance image formation optics 1249, an image frame grabber 1250, and an image data buffer 1251; an image processing computer 1252; a camera control computer 1253; a LCD panel 1254 and a display panel driver 1255; a touch-type or manually-keyed data entry pad 1256 and a keypad driver 1257; an IR-based object detection subsystem 1258 within its hand-supportable housing for automatically activating, upon detection of an object in its IR-based object detection field 1259, the planar laser illumination arrays 6 (driven by VLD driver circuits 18), the linear-type image formation and detection (IFD) module 1246, and the image processing computer 1252, via the camera control computer 1253, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1260 and a manually-activatable data transmission switch 1261, integrated with the hand-supportable housing, for enabling the transmission of symbol character data from the imager processing computer 1252 to a host computer system, via the data transmission mechanism 1260, in response to the manual activation of the data transmission switch 1261 at about the same time as when a bar code symbol is automatically decoded and symbol character data representative thereof is automatically generated by the image processing computer 1252. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In FIG. 40A3, there is shown an automatically-activated version of the PLIIM-based linear imager as illustrated, for example, in FIGS. 39A through 39C and 41A through 51C. As shown in FIG. 40A3, the PLIIM-based linear imager 1265 comprises: a planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1266 having a linear image detection array 1267 with vertically-elongated image detection elements 1268, fixed focal length/fixed focal distance image formation optics 1269, an image frame grabber 1270 and an image data buffer 1271; an image processing computer 1272; a camera control computer 1273; a LCD panel 1274 and a display panel driver 1275; a touch-type or manually-keyed data entry pad 1276 and a keypad driver 1277; a laser-based object detection subsystem 1278 embodied within camera control computer for automatically activating the planar laser illumination arrays 6 into a full-power mode of operation, the linear-type image formation and detection (IFD) module 1266, and the image processing computer 1272, via the camera control computer 1273, in response to the automatic detection of an object in its laser-based object detection field 1279, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1280 and a manually-activatable data transmission switch 1281 for enabling the transmission of symbol character data from the imager processing computer to a host computer system, via the data transmission mechanism 1280, in response to the manual activation of the data transmission switch 1281 at about the same time as when a bar code symbol is automatically decoded and symbol character data representative thereof is automatically generated by the image processing computer 1272. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

Notably, in the illustrative embodiment of FIG. 40A3, the PLIIM-based system has an object detection mode, a bar code detection mode, and a bar code reading mode of operation, as taught in copending U.S. application Ser. No. 08/890,320, filed Jul. 9, 1997, and Ser. No. 09/513,601, filed Feb. 25, 2000, supra. During the object detection mode of operation of the system, the camera control computer 1293 transmits a control signal to the VLD drive circuitry 11, (optionally via the PLIA microcontroller), causing each PLIM to generate a pulsed-type planar laser illumination beam (PLIB) consisting of planar laser light pulses having a very low duty cycle (e.g. as low as 0.1%) and high repetition frequency (e.g. greater than 1 kHz), so as to function as a non-visible PLIB-based object sensing beam (and/or bar code detection beam, as the case may be). Then, when the camera control computer receives an activation signal from the laser-based object detection subsystem 1278 (i.e. indicative that an object has been detected by the non-visible PLIB-based object sensing beam), the system automatically advances to either: (i) its bar code detection state, where it increases the power level of the PLIB, collects image data and performs bar code detection operations, and therefrom, to its bar code symbol reading state, in which the output power of the PLIB is further increased, image data is collected and decode processed; or (ii) directly to its bar code symbol reading state, in which the output power of the PLIB is increased, image data is collected and decode processed. A primary advantage of using a pulsed high-frequency/low-duty-cycle PLIB as an object sensing beam is that it consumes minimal power yet enables image capture for automatic object and/or bar code detection purposes, without distracting the user by visibly blinking or flashing light beams which tend to detract from the user's experience. In yet alternative embodiments, however, it may be desirable to drive the VLD in each PLIM so that a visibly blinking PLIB-based object sensing beam (and/or bar code detection beam) is generated during the object detection (and bar code detection) mode of system operation. The visibly blinking PLIB-based object sensing beam will typically consist of planar laser light pulses having a moderate duty cycle (e.g. 25%) and low repetition frequency (e.g. less than 30 HZ). In this alternative embodiment of the present invention, the low frequency blinking nature of the PLIB-based object sensing beam (and/or bar code detection beam) would be rendered visually conspicuous, thereby facilitating alignment of the coplanar PLIB/FOV with the bar code symbol, or graphics being imaged in relatively bright imaging environments.

In FIG. 40A4, there is shown an automatically-activated version of the PLIIM-based linear imager as illustrated, for example, in FIGS. 39A through 39C and 41A through 51C. As shown in FIG. 40A4, the PLIIM-based linear imager 1285 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1286 having a linear image detection array 1287 with vertically-elongated image detection elements 1288, fixed focal length/fixed focal distance image formation optics 1289, an image frame grabber 1290 and an image data buffer 1291; an image processing computer 1292; a camera control computer 1293; a LCD panel 1294 and a display panel driver 1295; a touch-type or manually-keyed data entry pad 1296 and a keypad driver 1297; an ambient-light driven object detection subsystem 1298 embodied within the camera control computer 1293, for automatically activating the planar laser illumination arrays 6 (driven by VLD driver circuits 18), the linear-type image formation and detection (IFD) module 1286, and the image processing computer 1292, via the camera control computer 1293, upon automatic detection of an object via ambient-light detected by object detection field 1299 enabled by the linear image sensor 1287 within the IFD module 1286, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1300 and a manually-activatable data transmission switch 1301 for enabling the transmission of symbol character data from the imager processing computer 1292 to a host computer system, via the data transmission mechanism 1300, in response to the manual activation of the data transmission switch 1301 at about the same time as when a bar code symbol is automatically decoded and symbol character data representative thereof is automatically generated by the image processing computer 1292. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety. Notably, in some applications, the passive-mode objection detection subsystem 1298 employed in this system might require (i) using a different system of optics for collecting ambient light from objects during the object detection mode of the system, or (ii) modifying the light collection characteristics of the light collection system to permit increased levels of ambient light to be focused onto the CCD image detection array 1287 in the IFD module (i.e. subsystem). In other applications, the provision of image intensification optics on the surface of the CCD image detection array should be sufficient to form images of sufficient brightness to perform object detection and/or bar code detection operations.

In FIG. 40A5, there is shown an automatically-activated version of the PLIIM-based linear imager as illustrated, for example, in FIGS. 39A through 39C and 41A through 51C. As shown in FIG. 40A5, the PLIIM-based linear imager 1305 comprises: a planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1306 having a linear image detection array 1307 with vertically-elongated image detection elements 1308, fixed focal length/fixed focal distance image formation optics 1309, an image frame grabber 1310, and image data buffer 1311; an image processing computer 1312; a camera control computer 1313; a LCD panel 1314 and a display panel driver 1315; a touch-type or manually-keyed data entry pad 1316 and a keypad driver 1317; an automatic bar code symbol detection subsystem 1318 embodied within camera control computer 1313 for automatically activating the image processing computer for decode-processing in response to the automatic detection of a bar code symbol within its bar code symbol detection field by the linear image sensor within the IFD module 1306 so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1319 and a manually-activatable data transmission switch 1320 for enabling the transmission of symbol character data from the imager processing computer 1312 to a host computer system, via the data transmission mechanism 1319, in response to the manual activation of the data transmission switch 1320 at about the same time as when a bar code symbol is automatically decoded and symbol character data representative thereof is automatically generated. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

System Control Architectures for PLIIM-Based Hand-Supportable Linear Imagers of the Present Invention Employing Linear-Type Image Formation and Detection (IFD) Modules Having a Linear Image Detection Array With Vertically-Elongated Image Detection Elements and Fixed Focal Length/Variable Focal Distance Image Formation Optics In FIG. 40B1, there is shown a manually-activated version of the PLIIM-based linear imager as illustrated, for example, in FIGS. 39A through 39C and 41A through 51C. As shown in FIG. 40B1, the PLIIM-based linear imager 1325 comprises: a planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1326 having a linear image detection array 1328 with vertically-elongated image detection elements 1329, fixed focal length/variable focal distance image formation optics 1330, an image frame grabber 1331, and an image data buffer 1332; an image processing computer 1333; a camera control computer 1334; a LCD panel 1335 and a display panel driver 1336; a touch-type or manually-keyed data entry pad 1337 and a keypad driver 1338; and a manually-actuated trigger switch 1339 for manually activating the planar laser illumination arrays 6, the linear-type image formation and detection (IFD) module 1326, and the image processing computer 1333, via the camera control computer 1334, in response to manual activation of the trigger switch 1339. Thereafter, the system control program carried out within the camera control computer 1334 enables: (1) the automatic capture of digital images of objects (i.e. bearing bar code symbols and other graphical indicia) through the fixed focal length/fixed focal distance image formation optics 1330 provided within the linear imager; (2) decode-processing the bar code symbol represented therein; (3) generating symbol character data representative of the decoded bar code symbol; (4) buffering the symbol character data within the hand-supportable housing or transmitting the same to a host computer system; and (5) thereafter automatically deactivating the subsystem components described above. When using a manually-actuated trigger switch 1339 having a single-stage operation, manually depressing the switch 1339 with a single pull-action will thereafter initiate the above sequence of operations with no further input required by the user.

In an alternative embodiment of the system design shown in FIG. 40B1, manually-actuated trigger switch 1339 would be replaced with a dual-position switch 1339' having a dual-positions (or stages of operation) so as to further embody the functionalities of both switch 1339 shown in FIG. 40B1 and transmission activation switch 1356 shown in FIG. 40B2. Also, the system would be further provided with a data transfer mechanism 1355 as shown in FIG. 40B2, for example, so that it embodies the symbol character data transmission functions described in greater detail in copending U.S. application Ser. No. 08/890,320, filed Jul. 9, 1997, and Ser. No. 09/513,601, filed Feb. 25, 2000, each said application being incorporated herein by reference in its entirety. In such an alternative embodiment, when the user pulls the dual-position switch 1339' to its first position, the camera control computer 1348 will automatically activate the following components: the planar laser illumination array 6 (driven by VLD driver circuits 18), the linear-type image formation and detection (IFD) module 1341, and the image processing computer 1347 so that (1) digital images of objects (i.e. bearing bar code symbols and other graphical indicia) are automatically and repeatedly captured, (2) bar code symbols represented therein are repeatedly decoded, and (3) symbol character data representative of each decoded bar code symbol is automatically generated in a cyclical manner (i.e. after each reading of each instance of the bar code symbol) and buffered in the data transmission mechanism 1335. Then, when the user further depresses the dual-position switch to its second position (i.e. complete depression or activation), the camera control computer 1248 enables the data transmission mechanism 1355 to transmit character data from the imager processing computer 1347 to a host computer system in response to the manual activation of the dual-position switch 1339' to its second position at about the same time as when a bar code symbol is automatically decoded and symbol character data representative thereof is automatically generated by the image processing computer 1347 and buffered in data transmission mechanism 1355 This dual-stage switching mechanism provides the user with an additional degree of control when trying to accurately read a bar code symbol from a bar code menu, on which two or more bar code symbols reside on a single line of a bar code menu, and width of the FOV of the hand-held imager spatially extends over these bar code symbols, making bar code selection challenging if not difficult.

In FIG. 40B2, there is shown an automatically-activated version of the PLIIM-based linear imager as illustrated, for example, in FIGS. 39A through 39C and 41A through 51C. As shown in FIG. 40B2, the PLIIM-based linear imager 1340 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1341 having a linear image detection array 1342 with vertically-elongated image detection elements 1343, fixed focal length/variable focal distance image formation optics 1344, an image frame grabber 1345, and an image data buffer 1346; an image processing computer 1347; a camera control computer 1348; a LCD panel 1349 and a display panel driver 1350; a touch-type or manually-keyed data entry pad 1351 and a keypad driver 1352; an IR-based object detection subsystem 1353 within its hand-supportable housing for automatically activating upon detection of an object in its IR-based object detection field 1354, the planar laser illumination arrays 6 (driven by VLD driver circuits 18), the linear-type image formation and detection (IFD) module 1341, as well as the image processing computer 1347, via the camera control computer 1348, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1355 and a manually-activatable data transmission switch 1356 for enabling the transmission of symbol character data from the imager processing computer to a host computer system, via the data transmission mechanism 1355, in response to the manual activation of the data transmission switch 1356 at about the same time as when a bar code symbol is automatically decoded and symbol character data representative thereof is automatically generated from the image processing computer 1347. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In FIG. 40B3, there is shown an automatically-activated version of the PLIIM-based linear imager as illustrated, for example, in FIGS. 39A through 39C and 41A through 51C. As shown in FIG. 40B3, the PLIIM-based linear imager 1361 comprises: a planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1361 having a linear image detection array 1362 with vertically-elongated image detection elements 1363, fixed focal length/variable focal distance image formation optics 1364, an image frame grabber 1365, and an image data buffer 1366; an image processing computer 1367; a camera control computer 1368; a LCD panel 1369 and a display panel driver 1370; a touch-type or manually-keyed data entry pad 1371 and a keypad driver 1372; a laser-based object detection subsystem 1373 embodied within the camera control computer 1368 for automatically activating the planar laser illumination arrays 6 into a full-power mode of operation, the linear-type image formation and detection (IFD) module 1366, and the image processing computer 1367, via the camera control computer 1373, in response to the automatic detection of an object in its laser-based object detection field 1374, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1375 and a manually-activatable data transmission switch 1376 for enabling the transmission of symbol character data from the imager processing computer to a host computer system, via the data transmission mechanism 1375 in response to the manual activation of the data transmission switch 1376 at about the same time as when a bar code symbol is automatically decoded and symbol character data representative thereof is automatically generated by the image processing computer 1367. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In the illustrative embodiment of FIG. 40B3, the PLIIM-based system has an object detection mode, a bar code detection mode, and a bar code reading mode of operation, as taught in copending U.S. application Ser. No. 08/890,320, filed Jul. 9, 1997, and Ser. No. 09/513,601, filed Feb. 25, 2000, supra. During the object detection mode of operation of the system, the camera control computer 1368 transmits a control signal to the VLD drive circuitry 11, (optionally via the PLIA microcontroller), causing each PLIM to generate a pulsed-type planar laser illumination beam (PLIB) consisting of planar laser light pulses having a very low duty cycle (e.g. as low as 0.1%) and high repetition frequency (e.g. greater than 1 kHz), so as to function as a non-visible PLIB-based object sensing beam (and/or bar code detection beam, as the case may be). Then, when the camera control computer receives an activation signal from the laser-based object detection subsystem 1373 (i.e. indicative that an object has been detected by the non-visible PLIB-based object sensing beam), the system automatically advances to either: (i) its bar code detection state, where it increases the power level of the PLIB, collects image data and performs bar code detection operations, and therefrom, to its bar code symbol reading state, in which the output power of the PLIB is further increased, image data is collected and decode processed; or (ii) directly to its bar code symbol reading state, in which the output power of the PLIB is increased, image data is collected and decode processed. A primary advantage of using a pulsed high-frequency/low-duty-cycle PLIB as an object sensing beam is that it consumes minimal power yet enables image capture for automatic object and/or bar code detection purposes, without distracting the user by visibly blinking or flashing light beams which tend to detract from the user's experience. In yet alternative embodiments, however, it may be desirable to drive the VLD in each PLIM so that a visibly blinking PLIB-based object sensing beam (and/or bar code detection beam) is generated during the object detection (and bar code detection) mode of system operation. The visibly blinking PLIB-based object sensing beam will typically consist of planar laser light pulses having a moderate duty cycle (e.g. 25%) and low repetition frequency (e.g. less than 30 HZ). In this alternative embodiment of the present invention, the low frequency blinking nature of the PLIB-based object sensing beam (and/or bar code detection beam) would be rendered visually conspicuous, thereby facilitating alignment of the PLIB/FOV with the bar code symbol, or graphics being imaged in relatively bright imaging environments.

In FIG. 40B4, there is shown an automatically-activated version of the PLIIM-based linear imager as illustrated, for example, in FIGS. 39A through 39C and 41A through 51C. As shown in FIG. 40B4, the PLIIM-based linear imager 1380 comprises: a planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1381 having a linear image detection array 1382 with vertically-elongated image detection elements 1383, fixed focal length/variable focal distance image formation optics 1384, an image frame grabber 1385, and an image data buffer 1386; an image processing computer 1387; a camera control computer 1388; a LCD panel 1389 and a display panel driver 1390; a touch-type or manually-keyed data entry pad 1391 and a keypad driver 1392; an ambient-light driven object detection subsystem 1393 embodied within the camera control computer 1388 for automatically activating the planar laser illumination arrays 6 (driven by VLD driver circuits 18), the linear-type image formation and detection (IFD) module 1386, and the image processing computer 1387, via the camera control computer 1388, in response to the automatic detection of an object via ambient-light detected by object detection field 1394 enabled by the linear image sensor within the IFD module 1381, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1395 and a manually-activatable data transmission switch 1396 for enabling the transmission of symbol character data from the imager processing computer to a host computer system, via the data transmission mechanism 1395 in response to the manual activation of the data transmission switch 1395 at about the same time as when a bar code symbol is automatically decoded and symbol character data representative thereof is automatically generated by the image processing computer 1387. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety. Notably, in some applications, the passive-mode objection detection subsystem 1393 employed in this system might require (i) using a different system of optics for collecting ambient light from objects during the object detection mode of the system, or (ii) modifying the light collection characteristics of the light collection system to permit increased levels of ambient light to be focused onto the CCD image detection array 1382 in the IFD module (i.e. subsystem). In other applications, the provision of image intensification optics on the surface of the CCD image detection array should be sufficient to form images of sufficient brightness to perform object detection and/or bar code detection operations.

In FIG. 40B5, there is shown an automatically-activated version of the PLIIM-based linear imager as illustrated, for example, in FIGS. 39A through 39C and 41A through 51C. As shown in FIG. 40B5, the PLIIM-based linear imager 1400 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1401 having a linear image detection array 1402 with vertically-elongated image detection elements 1403, fixed focal length/variable focal distance image formation optics 14054, an image frame grabber 1405, and an image data buffer 1406; an image processing computer 1407; a camera control computer 1409, a LCD panel 1409 and a display panel driver 1410; a touch-type or manually-keyed data entry pad 1411 and a keypad driver 1412; an automatic bar code symbol detection subsystem 1413 embodied within camera control computer 1408 for automatically activating the image processing computer for decode-processing upon automatic detection of a bar code symbol within its bar code symbol detection field by the linear image sensor within the IFD module 1401 so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1414 and a manually-activatable data transmission switch 1415 for enabling the transmission of symbol character data from the imager processing computer to a host computer system, via the data transmission mechanism 1414, in response to the manual activation of the data transmission switch 1415 at about the same time as when a bar code symbol is automatically decoded and symbol character data representative thereof is automatically generated by the image processing computer 1407. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

System Control Architectures for PLIIM-Based Hand-Supportable Linear Imagers of the Present Invention Employing Linear-Type Image Formation and Detection (IFD) Modules Having a Linear Image Detection Array With Vertically-Elongated Image Detection Elements and Variable Focal Length/Variable Focal Distance Image Formation Optics In FIG. 40C1, there is shown a manually-activated version of the PLIIM-based linear imager as illustrated, for example, in FIGS. 39A through 39C and 41A through 51C. As shown in FIG. 40C1, the PLIIM-based linear imager 1420 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1421 having a linear image detection array 1422 with vertically-elongated image detection elements 1423, variable focal length/variable focal distance image formation optics 1424, an image frame grabber 1425, and an image data buffer 1426; an image processing computer 1427; a camera control computer 1428; a LCD panel 1429 and a display panel driver 1430; a touch-type or manually-keyed data entry pad 1431 and a keypad driver 1432; and a manually-actuated trigger switch 1433 for manually activating the planar laser illumination array 6, the linear-type image formation and detection (IFD) module 1421, and the image processing computer 1427, via the camera control computer 1428, in response to the manual activation of the trigger switch 1433. Thereafter, the system control program carried out within the camera control computer 1428 enables: (1) the automatic capture of digital images of objects (i.e. bearing bar code symbols and other graphical indicia) through the fixed focal length/fixed focal distance image formation optics 1424 provided within the linear imager; (2) decode-processing the bar code symbol represented therein; (3) generating symbol character data representative of the decoded bar code symbol; (4) buffering the symbol character data within the hand-supportable housing or transmitting the same to a host computer system; and (5) thereafter automatically deactivating the subsystem components described above. When using a manually-actuated trigger switch 1433 having a single-stage operation, manually depressing the switch 1433 with a single pull-action will thereafter initiate the above sequence of operations with no further input required by the user.

In an alternative embodiment of the system design shown in FIG. 40C1, manually-actuated trigger switch 1433 would be replaced with a dual-position switch 1433' having a dual-positions (or stages of operation) so as to further embody the functionalities of both switch 1433 shown in FIG. 40C1 and transmission activation switch 1451 shown in FIG. 40C2. Also, the system would be further provided with a data transmission mechanism 1450 as shown in FIG.

40C2, for example, so that it embodies the symbol character data transmission functions described in greater detail in copending U.S. application Ser. No. 08/890,320, filed Jul. 9, 1997, and Ser. No. 09/513,601, filed Feb. 25, 2000, each said application being incorporated herein by reference in its entirety. In such an alternative embodiment, when the user pulls the dual-position switch 1433' to its first position, the camera control computer 1428 will automatically activate the following components: the planar laser illumination array 6 (driven by VLD driver circuits 18), the linear-type image formation and detection (IFD) module 1421, and the image processing computer 1427 so that (1) digital images of objects (i.e. bearing bar code symbols and other graphical indicia) are automatically and repeatedly captured, (2) bar code symbols represented therein are repeatedly decoded, and (3) symbol character data representative of each decoded bar code symbol is automatically generated in a cyclical manner (i.e. after each reading of each instance of the bar code symbol) and buffered in the data transmission mechanism 1260. Then when the user further depresses the dual-position switch to its second position (i.e. complete depression or activation), the camera control computer 1428 enables the data transmission mechanism 1401 to transmit character data from the imager processing computer 1427 to a host computer system in response to the manual activation of the dual-position switch 1433' to its second position at about the same time as when a bar code symbol is automatically decoded and symbol character data representative thereof is automatically generated by the image processing computer 1427 and buffered in data transmission mechanism 1450. This dual-stage switching mechanism provides the user with an additional degree of control when trying to accurately read a bar code symbol from a bar code menu, on which two or more bar code symbols reside on a single line of a bar code menu, and width of the FOV of the hand-held imager spatially extends over these bar code symbols, making bar code selection challenging if not difficult.

In FIG. 40C2, there is shown an automatically-activated version of the PLIIM-based linear imager as illustrated, for example, in FIGS. 39A through 39C and 41A through 51C. As shown in FIG. 40C2, the PLIIM-based linear imager 1435 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1436 having a linear image detection array 1437 with vertically-elongated image detection elements 1438, variable focal length/variable focal distance image formation optics 1439, an image frame grabber 1440, and an image data buffer 1441; an image processing computer 1442; a camera control computer 1443; a LCD panel 1444 and a display panel driver 1445; a touch-type or manually-keyed data entry pad 1446 and a keypad driver 1447; an IR-based object detection subsystem 1448 within its hand-supportable housing for automatically activating upon detection of an object in its IR-based object detection field 1449, the planar laser illumination arrays 6 (driven by VLD driver circuits 18), the linear-type image formation and detection (IFD) module 1436, as well the image processing computer 1442, via the camera control computer 1443, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1450 and a manually-activatable data transmission switch 1451 for enabling the transmission of symbol character data from the imager processing computer to a host computer system, via the data transmission mechanism 1450, in response to the manual activation of the data transmission switch 1451 at about the same time as when a bar code symbol is automatically decoded and symbol character data representative thereof is automatically generated by the image processing computer 1442. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In FIG. 40C3, there is shown an automatically-activated version of the PLIIM-based linear imager as illustrated, for example, in FIGS. 39A through 39C and 41A through 51C. As shown in FIG. 40C3, the PLIIM-based linear imager 1455 comprises: a planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1456 having a linear image detection array 1457 with vertically-elongated image detection elements 1458, variable focal length/variable focal distance image formation optics 1459, an image frame grabber 1460, and an image data buffer 1461; an image processing computer 1462; a camera control computer 1463; a LCD panel 1464 and a display panel driver 1465; a touch-type or manually-keyed data entry pad 1466 and a keypad driver 1467; a laser-based object detection subsystem 1468 within its hand-supportable housing for automatically activating the planar laser illumination array 6 into a full-power mode of operation, the linear-type image formation and detection (IFD) module 1456, and the image processing computer 1462, via the camera control computer 1463, in response to the automatic detection of an object in its laser-based object detection field 1469, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1470 and a manually-activatable data transmission switch 1471 for enabling the transmission of symbol character data from the imager processing computer to a host computer system, via the data transmission mechanism 1470, in response to the manual activation of the data transmission switch 1471 at about the same time as when a bar code symbol is automatically decoded and symbol character data representative thereof is automatically generated by the image processing computer 1462. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In the illustrative embodiment of FIG. 40C3, the PLIIM-based system has an object detection mode, a bar code detection mode, and a bar code reading mode of operation, as taught in copending U.S. application Ser. No. 08/890,320, filed Jul. 9, 1997, and Ser. No. 09/513,601, filed Feb. 25, 2000, supra. During the object detection mode of operation of the system, the camera control computer 1463 transmits a control signal to the VLD drive circuitry 11, (optionally via the PLIA microcontroller), causing each PLIM to generate a pulsed-type planar laser illumination beam (PLIB) consisting of planar laser light pulses having a very low duty cycle (e.g. as low as 0.1%) and high repetition frequency (e.g. greater than 1 kHz), so as to function as a non-visible (i.e. invisible) PLIB-based object sensing beam (and/or bar code detection beam, as the case may be). Then, when the camera control computer receives an activation signal from the laser-based object detection subsystem 1468 (i.e. indicative that an object has been detected by the non-visible PLIB-based object sensing beam), the system automatically advances to either: (i) its bar code detection state, where it increases the power level of the PLIB, collects image data and performs bar code detection operations, and therefrom, to its bar code symbol reading state, in which the output power of the PLIB is further increased, image data is collected and decode processed; or (ii) directly to its bar code symbol reading state, in which the output power of the PLIB is increased, image data is collected and decode processed. A primary advantage of using a pulsed high-frequency/low-duty-cycle PLIB as an object sensing beam is that it consumes minimal power yet enables image capture for automatic object and/or bar code detection purposes, without distracting the user by visibly blinking or flashing light beams which tend to detract from the user's experience. In yet alternative embodiments, however, it may be desirable to drive the VLD in each PLIM so that a visibly blinking PLIB-based object sensing beam (and/or bar code detection beam) is generated during the object detection (and bar code detection) mode of system operation. The visibly blinking PLIB-based object sensing beam will typically consist of planar laser light pulses having a moderate duty cycle (e.g. 25%) and low repetition frequency (e.g. less than 30 HZ). In this alternative embodiment of the present invention, the low frequency blinking nature of the PLIB-based object sensing beam (and/or bar code detection beam) would be rendered visually conspicuous, thereby facilitating alignment of the PLIB/FOV with the bar code symbol, or graphics being imaged in relatively bright imaging environments.

In FIG. 40C4, there is shown an automatically-activated version of the PLIIM-based linear imager as illustrated, or example, in FIGS. 39A through 39C and 41A through 51C. As shown in FIG. 40C4, the PLIIM-based linear imager 1475 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1476 having a linear image detection array 1477 with vertically-elongated image detection elements 1478, variable focal length/variable focal distance image formation optics 1479, an image frame grabber 1480, and an image data buffer 1481; an image processing computer 1482; a camera control computer 1483; a LCD panel 1484 and a display panel driver 1485; a touch-type or manually-keyed data entry pad 1486 and a keypad driver 1487; an ambient-light driven object detection subsystem 1488 embodied within the camera control computer 1488, for automatically activating the planar laser illumination arrays 6 (driven by VLD driver circuits 18), the linear-type image formation and detection (IFD) module 1476, and the image processing computer 1482, via the camera control computer 1483, in response to the automatic detection of an object via ambient-light detected by object detection field 1489 enabled by the linear image sensor within the IFD 1476 so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1490 and a manually-activatable data transmission switch 1491 for enabling the transmission of symbol character data from the imager processing computer to a host computer system, via the data transmission mechanism 1490, in response to the manual activation of the data transmission switch 1491 at about the same time as when a bar code symbol is automatically decoded and symbol character data representative thereof is automatically generated by the image processing computer 1482. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety. Notably, in some applications, the passive-mode objection detection subsystem 1488 employed in this system might require (i) using a different system of optics for collecting ambient light from objects during the object detection mode of the system, or (ii) modifying the light collection characteristics of the light collection system to permit increased levels of ambient light to be focused onto the CCD image detection array 1477 in the IFD module (i.e. subsystem). In other applications, the provision of image intensification optics on the surface of the CCD image detection array should be sufficient to form images of sufficient brightness to perform object detection and/or bar code detection operations.

In FIG. 40C5, there is shown an automatically-activated version of the PLIIM-based linear imager as illustrated, for example, in FIGS. 39A through 39C and 41A through 51C. As shown in FIG. 40C5, the PLIIM-based linear imager 1495 comprises: planar laser illumination array (PLIA) 6, including a set of VLD driver circuits 18, PLIMs 11, and an integrated despeckling mechanism 1226 having a stationary cylindrical lens array 1227; a linear-type image formation and detection (IFD) module 1496 having a linear image detection array 1497 with vertically-elongated image detection element 1498, variable focal length/variable focal distance image formation optics 1499, an image frame grabber 1500, and an image data buffer 1501; an image processing computer 1502; a camera control computer 1503; a LCD panel 1504 and a display panel driver 1505; a touch-type or manually-keyed data entry pad 1506 and a keypad driver 1507; an automatic bar code symbol detection subsystem 1508 embodied within the camera control computer 1508 for automatically activating the image processing computer for decode-processing upon automatic detection of a bar code symbol within its bar code symbol detection field 1509 by the linear image sensor within the IFD module 1496 so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 1510 and a manually-activatable data transmission switch 1511 for enabling the transmission of symbol character data from the imager processing computer to a host computer system, via the data transmission mechanism 1510, in response to the manual activation of the data transmission switch 1511 at about the same time as when a bar code symbol is automatically decoded and symbol character data representative thereof is automatically generated by the image processing computer 1502. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

Second Illustrative Embodiment of the PLIIM-Based Hand-Supportable Linear Imager of the Present Invention Comprising Integrated Speckle-Pattern Noise Subsystem Operated in Accordance With the First Generalized Method of Speckle-Pattern Noise Reduction Illustrated in FIGS. 1I6A and 1I6B In FIG. 41A, there is shown a second illustrative embodiment of the PLIIM-based hand-supportable imager of the present invention. As shown, the PLIIM-based imager 1520 comprises: a hand-supportable housing 1521; a PLIIM-based image capture and processing engine 1522 contained therein, for projecting a planar laser illumination beam (PLIB) 1523 through its imaging window 1524 in coplanar relationship with the field of view (FOV) 1525 of the linear image detection array 1526 employed in the engine; a LCD display panel 1527 mounted on the upper top surface 1528 of the housing in an integrated manner, for displaying, in a real-time manner, captured images, data being entered into the system, and graphical user interfaces (GUIs) required in the support of various types of information-based transactions; a data entry keypad 1529 mounted on the middle top surface 1530 of the housing, for enabling the user to manually enter data into the imager required during the course of such information-based transactions; and an embedded-type computer and interface board 1531 contained within the housing, for carrying out image processing operations such as, for example, bar code symbol decoding operations, signature image processing operations, optical character recognition (OCR) operations, and the like, in a high-speed manner, as well as enabling a high-speed data communication interface with a digital communication network, such as a LAN or WAN supporting a networking protocol such as TCP/IP, AppleTalk or the like.

As shown in FIG. 41B, the PLIIM-based image capture and processing engine 1522 comprises: an optical-bench/multi-layer PC board 1532 contained between the upper and lower portions of the engine housing 1534A and 1534B; an IFD module (i.e. camera subsystem) 1535 mounted on the optical bench 1532, and including 1-D CCD image detection array 1536 having vertically-elongated image detection elements 1537 and being contained within a light-box 1538 provided with image formation optics 1539 through which light collected from the illuminated object along a field of view (FOV) 1540 is permitted to pass; a pair of PLIMs (i.e. PLIA) 1541A and 1541B mounted on optical bench 1532 on opposite sides of the IFD module 1535, for producing a PLIB 1542 within the FOV 1540; and an optical assembly 1543 including a pair of Bragg cell structures 1544A and 1544B, and a pair of stationary cylindrical lens arrays 1545A and 1545B closely configured with PLIMs 1541A and 1541B, respectively, to produce a despeckling mechanism that operates in accordance with the first generalized method of speckle-pattern noise reduction illustrated in FIGS. 1I6A through 1I6B. As shown in FIG. 41D, the field of view of the IFD module 1535 spatially-overlaps and is coextensive (i.e. coplanar) with the PLIBs that are generated by the PLIMs 1541A and 1541B employed therein.

In this illustrative embodiment, each cylindrical lens array 1545A (1545B) is stationary relative to its Bragg-cell panel 1544A (1544B). In the illustrative embodiment, the height-to-width dimensions of each Bragg cell structure is about 7×7 millimeters, whereas the width-to-height dimensions of stationary cylindrical lens array is about 10×10 millimeters. It is understood that in alternative embodiments, such parameters will naturally vary in order to achieve the level of despeckling performance required by the application at hand.

Third Illustrative Embodiment of the PLIIM-Based Hand-Supportable Linear Imager of the Present Invention Comprising Integrated Speckle-Pattern Noise Subsystem Operated in Accordance With the First Generalized Method of Speckle-Pattern Noise Reduction Illustrated in FIGS. 1I12G and 1I12H In FIG. 42A, there is shown a third illustrative embodiment of the PLIIM-based hand-supportable imager of the present invention. As shown, the PLIIM-based imager 1550 comprises: a hand-supportable housing 1551; a PLIIM-based image capture and processing engine 1552 contained therein, for projecting a planar laser illumination beam (PLIB) 1553 through its imaging window 1554 in coplanar relationship with the field of view (FOV) 1555 of the linear image detection array 1556 employed in the engine; a LCD display panel 1557 mounted on the upper top surface 1558 of the housing in an integrated manner, for displaying, in a real-time manner, captured images, data being entered into the system, and graphical user interfaces (GUIs) required in the support of various types of information-based transactions; a data entry keypad 1559 mounted on the middle top surface 1560 of the housing, for enabling the user to manually enter data into the imager required during the course of such information-based transactions; and an embedded-type computer and interface board 1561 contained within the housing, for carrying out image processing operations such as, for example, bar code symbol decoding operations, signature image processing operations, optical character recognition (OCR) operations, and the like, in a high-speed manner, as well as enabling a high-speed data communication interface 1562 with a digital communication network 1563, such as a LAN or WAN supporting a networking protocol such as TCP/IP, AppleTalk or the like.

As shown in FIG. 42B, the PLIIM-based image capture and processing engine 1552 comprises: an optical-bench/multi-layer PC board 1564 contained between the upper and lower portions of the engine housing 1565A and 1565B; an IFD (i.e. camera) subsystem 1566 mounted on the optical bench 1564, and including 1-D CCD image detection array 1567 having vertically-elongated image detection elements 1568 and being contained within a light-box 1569 provided with image formation optics 1570, through which light collected from the illuminated object along a field of view (FOV) 1571 is permitted to pass; a pair of PLIMs (i.e. single VLD PLIAs) 1572A and 1572B mounted on optical bench 1564 on opposite sides of the IFD module 1566, for producing a PLIB 1573 within the FOV; and an optical assembly 1575 configured with each PLIM, including a beam folding mirror 1576 mounted before the PLIM, a micro-oscillating mirror 1577 mounted above the PLIM, and a stationary cylindrical lens array 1578 mounted before the micro-oscillating mirror 1577, as shown, to produce a despeckling mechanism that operates in accordance with the first generalized method of speckle-pattern noise reduction illustrated in FIGS. 1I6A through 1I6B. As shown in FIG. 41D, the field of view of the IFD module 1566 spatially-overlaps and is coextensive (i.e. coplanar) with the PLIBs that are generated by the PLIMs 1572A and 1572B employed therein.

In this illustrative embodiment, the height to width dimensions of beam folding mirror 1576 is about 10×10 millimeters. The width-to-height dimensions of micro-oscillating mirror 1577 is a about 11×11 and the height to weight dimension of the cylindrical lens array 1578 is about 12×12 millimeters. It is understood that in alternative embodiments, such parameters will naturally vary in order to achieve the level of despeckling performance required by the application at hand.

Fourth Illustrative Embodiment of the PLIIM-Based Hand-Supportable Linear Imager of the Present Invention Comprising Integrated Speckle-Pattern Noise Subsystem Operated in Accordance With the First Generalized Method of Speckle-Pattern Noise Reduction Illustrated in FIGS. 1I7A Through 1I7C In FIG. 43A, there is shown a fourth illustrative embodiment of the PLIIM-based hand-supportable imager of the present invention. As shown, the PLIIM-based imager 1580 comprises: a hand-supportable housing 1581; a PLIIM-based image capture and processing engine 1582 contained therein, for projecting a planar laser illumination beam (PLIB) 1583 through its imaging window 1584 in coplanar relationship with the field of view (FOV) 1585 of the linear image detection array 1586 employed in the engine; a LCD display panel 1587 mounted on the upper top surface 1588 of the housing in an integrated manner, for displaying, in a real-time manner, captured images, data being entered into the system, and graphical user interfaces (GUIs) required in the support of various types of information-based transactions; a data entry keypad 1589 mounted on the middle top surface 1590 of the housing, for enabling the user to manually enter data into the imager required during the course of such information-based transactions; and an embedded-type computer and interface board 1591, contained within the housing, for carrying out image processing operations such as, for example, bar code symbol decoding operations, signature image processing operations, optical character recognition (OCR) operations, and the like, in a high-speed manner, as well as enabling a high-speed data communication interface 1592 with a digital communication network 1593, such as a LAN or WAN supporting a networking protocol such as TCP/IP, AppleTalk or the like.

As shown in FIG. 43B, the PLIIM-based image capture and processing engine 1582 comprises: an optical-bench/multi-layer PC board 1594, contained between the upper and lower portions of the engine housing 1595A and 1595B; an IFD (i.e. camera) subsystem 1596 mounted on the optical bench, and including 1-D CCD image detection array 1586 having vertically-elongated image detection elements 1597 and being contained within a light-box 1598 provided with image formation optics 1599, through which light collected from the illuminated object along the field of view (FOV) 1585 is permitted to pass; a pair of PLIMs (i.e. comprising a dual-VLD PLIA) 1600A and 1600B mounted on optical bench 1594 on opposite sides of the IFD module 1596, for producing the PLIB within the FOV; and an optical assembly 1601 configured with each PLIM, including a piezoelectric deformable mirror (DM) 1602 mounted before the PLIM, a beam folding mirror 1603 mounted above the PLIM, and a cylindrical lens array 1604 mounted before the beam folding mirror 1603, to produce a despeckling mechanism that operates in accordance with the first generalized method of speckle-pattern noise reduction illustrated in FIGS. 1I7A through 1I7C. As shown in FIG. 43D, the field of view of the IFD module 1596 spatially-overlaps and is coextensive (i.e. coplanar) with the PLIBs that are generated by the PLIMs 1600A and 1600B employed therein.

In this illustrative embodiment, the height to width dimensions of the DM structure 1602 is about 7×7 millimeters. The width-to-height dimensions of stationary cylindrical lens array 1604 is about 10×10 millimeters. It is understood that in alternative embodiments, such parameters will naturally vary in order to achieve the level of despeckling performance required by the application at hand.

Fifth Illustrative Embodiment of the PLIIM-Based Hand-Supportable Linear Imager of the Present Invention Comprising Integrated Speckle-Pattern Noise Subsystem Operated in Accordance With the First Generalized Method of Speckle-Pattern Noise Reduction Illustrated in FIGS. 1I8F Through 1I8G In FIG. 44A, there is shown a fifth illustrative embodiment of the PLIIM-based hand-supportable imager of the present invention. As shown, the PLIIM-based imager 1610 comprises: a hand-supportable housing 1611; a PLIIM-based image capture and processing engine 1612 contained therein, for projecting a planar laser illumination beam (PLIB) 1613 through its imaging window 1614 in coplanar relationship with the field of view (FOV) 1615 of the linear image detection array 1616 employed in the engine; a LCD display panel 1617 mounted on the upper top surface 1618 of the housing in an integrated manner, for displaying, in a real-time manner, captured images, data being entered into the system, and graphical user interfaces (GUIs) required in the support of various types of information-based transactions; a data entry keypad 1619 mounted on the middle top surface 1620 of the housing, for enabling the user to manually enter data into the imager required during the course of such information-based transactions; and an embedded-type computer and interface board 1621, contained within the housing, for carrying out image processing operations such as, for example, bar code symbol decoding operations, signature image processing operations, optical character recognition (OCR) operations, and the like, in a high-speed manner, as well as enabling a high-speed data communication interface 1622 with a digital communication network 1623, such as a LAN or WAN supporting a networking protocol such as TCP/IP, AppleTalk or the like.

As shown in FIG. 44B, the PLIIM-based image capture and processing engine 1612 comprises: an optical-bench/multi-layer PC board 1624, contained between the upper and lower portions of the engine housing 1625A and 1625B; an IFD (i.e. camera) subsystem 1626 mounted on the optical bench, and including 1-D CCD image detection array 1616 having vertically-elongated image detection elements 1627 and being contained within a light-box 1628 provided with image formation optics 1628, through which light collected from the illuminated object along field of view (FOV) 1613 is permitted to pass; a pair of PLIMs (i.e. comprising a dual-VLD PLIA) 1629A and 1629B mounted on optical bench 1624 on opposite sides of the IFD module, for producing PLIB 1613 within the FOV 1615; and an optical assembly 1630 configured with each PLIM, including a phase-only LCD-based phase modulation panel 1631 and a cylindrical lens array 1632 mounted before the PO-LCD phase modulation panel 1631 to produce a despeckling mechanism that operates in accordance with the first generalized method of speckle-pattern noise reduction illustrated in FIGS. 1I8A through 1I8B. As shown in FIG. 44D, the field of view of the IFD module 1626 spatially-overlaps and is coextensive (i.e. coplanar) with the PLIBs that are generated by the PLIMs 1629A and 1629B employed therein.

In this illustrative embodiment, the height to width dimensions of the PO-only LCD-based phase modulation panel 1631 is about 7×7 millimeters. The width-to-height dimensions of stationary cylindrical lens array 1632 is about 9×9 millimeters. It is understood that in alternative embodiments, such parameters will naturally vary in order to achieve the level of despeckling performance required by the application at hand.

Sixth Illustrative Embodiment of the PLIIM-Based Hand-Supportable Linear Imager of the Present Invention Comprising Integrated Speckle-Pattern Noise Subsystem Operated in Accordance With the First Generalized Method of Speckle-Pattern Noise Reduction Illustrated in FIGS. 1I12A Through 1I12B In FIG. 45A, there is shown a sixth illustrative embodiment of the PLIIM-based hand-supportable imager of the present invention. As shown, the PLIIM-based imager 1635 comprises: a hand-supportable housing 1636; a PLIIM-based image capture and processing engine 1637 contained therein, for projecting a planar laser illumination beam (PLIB) 1638 through its imaging window 1639 in coplanar relationship with the field of view (FOV) 1640 of the linear image detection array 1641 employed in the engine; a LCD display panel 1642 mounted on the upper top surface 1643 of the housing in an integrated manner, for displaying, in a real-time manner, captured images, data being entered into the system, and graphical user interfaces (GUIs) required in the support of various types of information-based transactions; a data entry keypad 1644 mounted on the middle top surface 1645 of the housing, for enabling the user to manually enter data into the imager required during the course of such information-based transactions; and an embedded-type computer and interface board 1646, contained within the housing, for carrying out image processing operations such as, for example, bar code symbol decoding operations, signature image processing operations, optical character recognition (OCR) operations, and the like, in a high-speed manner, as well as enabling a high-speed data communication interface 1647 with a digital communication network 1648, such as a LAN or WAN supporting a networking protocol such as TCP/IP, AppleTalk or the like.

As shown in FIG. 45B, the PLIIM-based image capture and processing engine 1642 comprises: an optical-bench/multi-layer PC board 1649, contained between the upper and lower portions of the engine housing 1650A and 1650B; an IFD module (i.e. camera subsystem) 1651 mounted on the optical bench, and including 1-D CCD image detection array 1641 having vertically-elongated image detection elements 1652 and being contained within a light-box 1653 provided with image formation optics 1654, through which light collected from the illuminated object along field of view (FOV) 1640 is permitted to pass; a pair of PLIMs (i.e. comprising a dual-VLD PLIA) 1655A and 1655B mounted on optical bench 1649 on opposite sides of the IFD module, for producing a PLIB within the FOV; and an optical assembly 1656 configured with each PLIM, including a rotating multi-faceted cylindrical lens array structure 1657 mounted before a cylindrical lens array 1658, to produce a despeckling mechanism that operates in accordance with the first generalized method of speckle-pattern noise reduction illustrated in FIGS. 1I12A through 1I12B. As shown in FIG. 45D, the field of view of the IFD module spatially-overlaps and is coextensive (i.e. coplanar) with the PLIBs that are generated by the PLIMs 1655A and 1655B employed therein.

Seventh Illustrative Embodiment of the PLIIM-Based Hand-Supportable Linear Imager of the Present Invention Comprising Integrated Speckle-Pattern Noise Subsystem Operated in Accordance With the Second Generalized Method of Speckle-Pattern Noise Reduction Illustrated in FIGS. 1I14A Through 1I14B In FIG. 46A, there is shown a seventh illustrative embodiment of the PLIIM-based hand-supportable imager of the present invention. As shown, the PLIIM-based imager 1660 comprises: a hand-supportable housing 1661; a PLIIM-based image capture and processing engine 1662 contained therein, for projecting a planar laser illumination beam (PLIB) 1663 through its imaging window 1664 in coplanar relationship with the field of view (FOV) 1665 of the linear image detection array 1666 employed in the engine; a LCD display panel 1667 mounted on the upper top surface 1668 of the housing in an integrated manner, for displaying, in a real-time manner, captured images, data being entered into the system, and graphical user interfaces (GUIs) required in the support of various types of information-based transactions; a data entry keypad 1669 mounted on the middle top surface 1670 of the housing, for enabling the user to manually enter data into the imager required during the course of such information-based transactions; and an embedded-type computer and interface board 1671, contained within the housing, for carrying out image processing operations such as, for example, bar code symbol decoding operations, signature image processing operations, optical character recognition (OCR) operations, and the like, in a high-speed manner, as well as enabling a high-speed data communication interface 1672 with a digital communication network 1673, such as a LAN or WAN supporting a networking protocol such as TCP/IP, AppleTalk or the like.

As shown in FIG. 46B, the PLIIM-based image capture and processing engine 1662 comprises: an optical-bench/multi-layer PC board 1674, contained between the upper and lower portions of the engine housing 1675A and 1675B; an IFD (i.e. camera) subsystem 1676 mounted on the optical bench, and including 1-D CCD image detection array 1666 having vertically-elongated image detection elements 1677 and being contained within a light-box 1678 provided with image formation optics 1679, through which light collected from the illuminated object along field of view (FOV) 1665 is permitted to pass; a pair of PLIMs (i.e. comprising a dual-VLD PLIA) 1680A and 1680B mounted on optical bench 1674 on opposite sides of the IFD module 1676, for producing PLIB 1663 within the FOV 1665; and an optical assembly 1681 configured with each PLIM, including a high-speed temporal intensity modulation panel 1682 mounted before a cylindrical lens array 1683, to produce a despeckling mechanism that operates in accordance with the second generalized method of speckle-pattern noise reduction illustrated in FIGS. 1I14A through 1I14B. As shown in FIG. 46D, the field of view of the IFD module 1678 spatially-overlaps and is coextensive (i.e. coplanar) with the PLIBs that are generated by the PLIMs 1680A and 1680B employed therein.

Notably, the PLIIM-based imager 1660 may be modified to include the use of visible mode locked laser diodes (MLLDs), in lieu of temporal intensity modulation 1682, so to produce a PLIB comprising an optical pulse train with ultra-short optical pulses repeated at a high rate, having numerous high-frequency spectral components which reduce the RMS power of speckle-noise patterns observed at the image detection array of the PLIIM-based system, as described in detail hereinabove.

Eighth Illustrative Embodiment of the PLIIM-Based Hand-Supportable Linear Imager of the Present Invention Comprising Integrated Speckle-Pattern Noise Subsystem Operated in Accordance With the Third Generalized Method of Speckle-Pattern Noise Reduction Illustrated in FIGS. 1I17A and 1I17B In FIG. 47A, there is shown a eighth illustrative embodiment of the PLIIM-based hand-supportable imager 1690 of the present invention. As shown, the PLIIM-based imager 1690 comprises: a hand-supportable housing 1691; a PLIIM-based image capture and processing engine 1692 contained therein, for projecting a planar laser illumination beam (PLIB) 1693 through its imaging window 1694 in coplanar relationship with the field of view (FOV) 1695 of the linear image detection array 1696 employed in the engine; a LCD display panel 1697 mounted on the upper top surface 1698 of the housing in an integrated manner, for displaying, in a real-time manner, captured images, data being entered into the system, and graphical user interfaces (GUIs) required in the support of various types of information-based transactions; a data entry keypad 1699 mounted on the middle top surface 1700 of the housing, for enabling the user to manually enter data into the imager required during the course of such information-based transactions; and an embedded-type computer and interface board 1701, contained within the housing, for carrying out image processing operations such as, for example, bar code symbol decoding operations, signature image processing operations, optical character recognition (OCR) operations, and the like, in a high-speed manner, as well as enabling a high-speed data communication interface 1702 with a digital communication network 1703, such as a LAN or WAN supporting a networking protocol such as TCP/IP, AppleTalk or the like.

As shown in FIG. 47B, the PLIIM-based image capture and processing engine 1692 comprises: an optical-bench/multi-layer PC board 1704, contained between the upper and lower portions of the engine housing 1705A and 1705B; an IFD (i.e. camera) subsystem 1706 mounted on the optical bench, and including 1-D CCD image detection array 1696 having vertically-elongated image detection elements 1707 and being contained within a light-box 1708 provided with image formation optics 1709, through which light collected from the illuminated object along field of view (FOV) 1695 is permitted to pass; a pair of PLIMs (i.e. comprising a dual-VLD PLIA) 1710A and 1710B mounted on optical bench 1706 on opposite sides of the IFD module 1706, for producing a PLIB 1693 within the FOV 1695; and an optical assembly 1711 configured with each PLIM, including an optically-reflective temporal phase modulating cavity (etalon) 1712 mounted to the outside of each VLD before a cylindrical lens array 1713, to produce a despeckling mechanism that operates in accordance with the third generalized method of speckle-pattern noise reduction illustrated in FIGS. 1I17A through 1I17B.

Ninth Illustrative Embodiment of the PLIIM-Based Hand-Supportable Linear Imager of the Present Invention Comprising Integrated Speckle-Pattern Noise Subsystem Operated in Accordance With the Fourth Generalized Method of Speckle-Pattern Noise Reduction Illustrated in FIGS. 1I19A and 1I19B In FIG. 48A, there is shown a ninth illustrative embodiment of the PLIIM-based hand-supportable imager 1720 of the present invention. As shown, the PLIIM-based imager 1720 comprises: a hand-supportable housing 1721; a PLIIM-based image capture and processing engine 1722 contained therein, for projecting a planar laser illumination beam (PLIB) 1723 through its imaging window 1724 in coplanar relationship with the field of view (FOV) 1725 of the linear image detection array 1726 employed in the engine; a LCD display panel 1727 mounted on the upper top surface 1728 of the housing in an integrated manner, for displaying, in a real-time manner, captured images, data being entered into the system, and graphical user interfaces (GUIs) required in the support of various types of information-based transactions; a data entry keypad 1729 mounted on the middle top surface 1730 of the housing, for enabling the user to manually enter data into the imager required during the course of such information-based transactions; and an embedded-type computer and interface board 1731, contained within the housing, for carrying out image processing operations such as, for example, bar code symbol decoding operations, signature image processing operations, optical character recognition (OCR) operations, and the like, in a high-speed manner, as well as enabling a high-speed data communication interface 1732 with a digital communication network 1733, such as a LAN or WAN supporting a networking protocol such as TCP/IP, AppleTalk or the like.

As shown in FIG. 48B, the PLIIM-based image capture and processing engine 1722 comprises: an optical-bench/multi-layer PC board 1734, contained between the upper and lower portions of the engine housing 1735A and 1735B; an IFD (i.e. camera) subsystem 1736 mounted on the optical bench, and including 1-D CCD image detection array 1726 having vertically-elongated image detection elements 1726A and being contained within a light-box 1737A provided with image formation optics 1737B, through which light collected from the illuminated object along field of view (FOV) 1725 is permitted to pass; a pair of PLIMs (i.e. comprising a dual-VLD PLIA) 1738A and 1738B mounted on optical bench 1734 on opposite sides of the IFD module 1736, for producing a PLIB 1723 within the FOV 1725; and an optical assembly configured with each PLIM, including a frequency mode hopping inducing circuit 1739A, and a cylindrical lens array 1739B, to produce a despeckling mechanism that operates in accordance with the fourth generalized method of speckle-pattern noise reduction illustrated in FIGS. 1I19A through 1I19B.

Tenth Illustrative Embodiment of the PLIIM-Based Hand-Supportable Linear Imager of the Present Invention Comprising Integrated Speckle-Pattern Noise Subsystem Operated in Accordance With the Fifth Generalized Method of Speckle-Pattern Noise Reduction Illustrated in FIGS. 1I21A and 1I21D In FIG. 49A, there is shown a tenth illustrative embodiment of the PLIIM-based hand-supportable imager of the present invention. As shown, the PLIIM-based imager 1740 comprises: a hand-supportable housing 1741; a PLIIM-based image capture and processing engine 1742 contained therein, for projecting a planar laser illumination beam (PLIB) 1743 through its imaging window 1744 in coplanar relationship with the field of view (FOV) 1745 of the linear image detection array 1746 employed in the engine; a LCD display panel 1747 mounted on the upper top surface 1748 of the housing in an integrated manner, for displaying, in a real-time manner, captured images, data being entered into the system, and graphical user interfaces (GUIs) required in the support of various types of information-based transactions; a data entry keypad 1749 mounted on the middle top surface of the housing 1750, for enabling the user to manually enter data into the imager required during the course of such information-based transactions; and an embedded-type computer and interface board 1751, contained within the housing, for carrying out image processing operations such as, for example, bar code symbol decoding operations, signature image processing operations, optical character recognition (OCR) operations, and the like, in a high-speed manner, as well as enabling a high-speed data communication interface 1752 with a digital communication network 1753, such as a LAN or WAN supporting a networking protocol such as TCP/IP, AppleTalk or the like.

As shown in FIG. 49B, the PLIIM-based image capture and processing engine 1742 comprises: an optical-bench/multi-layer PC board 1754, contained between the upper and lower portions of the engine housing 1755A and 1755B; an IFD (i.e. camera) subsystem 1756 mounted on the optical bench, and including 1-D CCD image detection array 1746 having vertically-elongated image detection elements 1757 and being contained within a light-box 1758 provided with image formation optics 1759, through which light collected from the illuminated object along field of view (FOV) 1745 is permitted to pass; a pair of PLIMs 1760A and 1760B (i.e. comprising a dual-VLD PLIA) mounted on optical bench 1756 on opposite sides of the IFD module, for producing a PLIB 1743 within the FOV 1745; and an optical assembly 1761 configured with each PLIM, including a spatial intensity modulation panel 1762 mounted before a cylindrical lens array 1763, to produce a despeckling mechanism that operates in accordance with the fifth generalized method of speckle-pattern noise reduction illustrated in FIGS. 1I21A through 1I21B.

Notably, spatial intensity modulation panel 1762 employed in optical assembly 1761 can be realized in various ways including, for example: reciprocating spatial intensity modulation arrays, in which electrically-passive spatial intensity modulation arrays or screens are reciprocated relative to each other at a high frequency; an electro-optical spatial intensity modulation panel having electrically addressable, vertically-extending pixels which are switched between transparent and opaque states at rates which exceed the inverse of the photo-integration time period of the image detection array employed in the PLIIM-based system; etc.

Eleventh Illustrative Embodiment of the PLIIM-Based Hand-Supportable Linear Imager of the Present Invention Comprising Integrated Speckle-Pattern Noise Subsystem Operated in Accordance With the Sixth Generalized Method of Speckle-Pattern Noise Reduction Illustrated in FIGS. 1I23A and 1I23B In FIG. 50A, there is shown an eleventh illustrative embodiment of the PLIIM-based hand-supportable imager of the present invention. As shown, the PLIIM-based imager 1770 comprises: a hand-supportable housing 1771; a PLIIM-based image capture and processing engine 1772 contained therein, for projecting a planar laser illumination beam (PLIB) 1773 through its imaging window 1774 in coplanar relationship with the field of view (FOV) 1775 of the linear image detection array 1776 employed in the engine; a LCD display panel 1777 mounted on the upper top surface 1778 of the housing in an integrated manner, for displaying, in a real-time manner, captured images, data being entered into the system, and graphical user interfaces (GUIs) required in the support of various types of information-based transactions; a data entry keypad 1779 mounted on the middle top surface 1780 of the housing, for enabling the user to manually enter data into the imager required during the course of such information-based transactions; and an embedded-type computer and interface board 1781, contained within the housing, for carrying out image processing operations such as, for example, bar code symbol decoding operations, signature image processing operations, optical character recognition (OCR) operations, and the like, in a high-speed manner, as well as enabling a high-speed data communication interface 1782 with a digital communication network 1783, such as a LAN or WAN supporting a networking protocol such as TCP/IP, AppleTalk or the like.

As shown in FIG. 50B, the PLIIM-based image capture and processing engine 1772 comprises: an optical-bench/multi-layer PC board 1784, contained between the upper and lower portions of the engine housing 1785A and 1785B; an IFD (i.e. camera) subsystem 1786 mounted on the optical bench, and including 1-D CCD image detection array 1776 having vertically-elongated image detection elements 1787 and being contained within a light-box 1788 provided with image formation optics 1789, through which light collected from the illuminated object along field of view (FOV) 1775 is permitted to pass; a pair of PLIMs 1790A and 1790B (i.e. comprising a dual-VLD PLIA) mounted on optical bench 1784 on opposite sides of the IFD module, for producing a PLIB within the FOV; and an optical assembly 1791 configured with each PLIM, including a spatial intensity modulation aperture 1792 mounted before the entrance pupil 1793 of the IFD module 1786, to produce a despeckling mechanism that operates in accordance with the sixth generalized method of speckle-pattern noise reduction illustrated in FIGS. 1I23A through 1I23B.

Twelfth Illustrative Embodiment of the PLIIM-Based Hand-Supportable Linear Imager of the Present Invention Comprising Integrated Speckle-Pattern Noise Subsystem Operated in Accordance With the Seventh Generalized Method of Speckle-Pattern Noise Reduction Illustrated in FIG. 1I25

In FIG. 51A, there is shown an twelfth illustrative embodiment of the PLIIM-based hand-supportable imager of the present invention. As shown, the PLIIM-based imager 1800 comprises: a hand-supportable housing 1801; a PLIIM-based image capture and processing engine 1802 contained therein, for projecting a planar laser illumination beam (PLIB) 1803 through its imaging window 1804 in coplanar relationship with the field of view (FOV) 1805 of the linear image detection array 1806 employed in the engine; a LCD display panel 1807 mounted on the upper top surface 1808 of the housing in an integrated manner, for displaying, in a real-time manner, captured images, data being entered into the system, and graphical user interfaces (GUIs) required in the support of various types of information-based transactions; a data entry keypad 1809 mounted on the middle top surface 1810 of the housing, for enabling the user to manually enter data into the imager required during the course of such information-based transactions; and an embedded-type computer and interface board 1811, contained within the housing, for carrying out image processing operations such as, for example, bar code symbol decoding operations, signature image processing operations, optical character recognition (OCR) operations, and the like, in a high-speed manner, as well as enabling a high-speed data communication interface 1812 with a digital communication network 1813, such as a LAN or WAN supporting a networking protocol such as TCP/IP, AppleTalk or the like.

As shown in FIG. 51B, the PLIIM-based image capture and processing engine 1802 comprises: an optical-bench/multi-layer PC board 1813, contained between the upper and lower portions of the engine housing 1814A and 1814B; an IFD (i.e. camera) subsystem 1815 mounted on the optical bench, and including 1-D CCD image detection array 1806 having vertically-elongated image detection elements 1816 and being contained within a light-box 1817 provided with image formation optics 1818, through which light collected from the illuminated object along field of view (FOV) 1805 is permitted to pass; a pair of PLIMs (i.e. comprising a dual-VLD PLIA) 1819A and 1819B mounted on optical bench 1813 on opposite sides of the IFD module, for producing a PLIB 1803 within the FOV 1805; and an optical assembly 1820 configured with each PLIM, including a temporal intensity modulation aperture 1821 mounted before the entrance pupil 1822 of the IFD module, to produce a despeckling mechanism that operates in accordance with the seventh generalized method of speckle-pattern noise reduction illustrated in FIG. 1I25.

Hand-Supportable Planar Laser Illumination and Imaging (PLIIM) Devices Employing Area-Type Image Detection Arrays and Optically-Combined Planar Laser Illumination Beams (PLIBs) Produced from a Multiplicity of Laser Diode Sources to Achieve a Reduction in Speckle-Pattern Noise Power in Said Devices In the hand-supportable area-type PLIIM-based imager 4800 as shown in of FIG. 52, speckle-pattern noise is reduced by employing optically-combined planar laser illumination beams (PLIB) components produced from a multiplicity of spatially-incoherent laser diode sources. The greater the number of spatially-incoherent laser diode sources that are optically combined and projected onto the objects being illuminated, then greater the reduction in RMS power of observed speckle-pattern noise within the PLIIM-based imager.

As shown in FIG. 52, PLIIM-based imager 4800 comprises: a hand-supportable housing 4801; a PLIIM-based image capture and processing engine 4802 contained therein, for projecting a planar laser illumination beam (PLIB) 4803 through its imaging window 4804 in coplanar relationship with at least a portion of the 3-D field of view (FOV) 4805 provided by the image forming optics associated with the area-type (i.e. 2-D) image detection array 4806 employed in the engine; a LCD display panel 4807 mounted on the upper surface 4808 of the housing in an integrated manner, for displaying, in a real-time manner, captured images, data being entered into the system, and graphical user interfaces (GUIs) required in the support of various types of information-based transactions; a data entry keypad 4809 mounted on the upper surface 4808 of the housing, for enabling the user to manually enter data into the imager required during the course of such information-based transactions; and an embedded-type computer and interface board 4810 contained within the housing, for carrying out image processing operations such as, for example, bar code symbol decoding operations, signature image processing operations, optical character recognition (OCR) operations, and the like, in a high-speed manner, as well as enabling a high-speed data communication interface 4811 with a digital communication network 4812, such as a LAN or WAN supporting a networking protocol such as TCP/IP, AppleTalk or the like.

As shown in FIG. 52, PLIIM-based image capture and processing engine 4802 includes: (1) a 2-D (i.e. area) type image formation and detection (IFD) module 4813; (2) a pair of planar laser illumination arrays (PLIAs) 4814A and 4814B; (3) A PLIB folding/sweeping mechanism 4815A and 4815B; and (4) an optical element 4816A and 4817B (e.g. cylindrical lens arrays). As shown, the area-type IFD module 4813 is mounted within the hand-supportable housing and contains area-type image detection array 4806 and image formation optics 4817 with a 3-D field of view (FOV) projected through said transmission window 4804 into an illumination and imaging field external to the hand-supportable housing. The PLIAs 4814A and 4814B are mounted within the hand-supportable housing and arranged on opposite sides of the area-type image detection array 4806. Each PLIA comprises a plurality of planar laser illumination modules (PLIMs), each having its own visible laser diode (VLD), for producing a plurality of spatially-incoherent planar laser illumination beam (PLIB) components which are folded towards beam sweeping mechanisms 4815A and 4815B by beam folding mirrors 4818A and 4818B, respectively. The PLIB folding/sweeping mechanisms 4815A and 4815B automatically sweep the PLIBs through the 3-D FOV of the 2-D image detection array. Each spatially-incoherent PLIB component is arranged in a coplanar relationship with at least a portion of the 3-D FOV during PLIB sweeping operations. The optical elements 4816A and 4816B are mounted within the hand-supportable housing, optically combine and project via beam sweeping mechanisms, the plurality of spatially-incoherent PLIB components through the light transmission window 4804 in coplanar relationship with a portion of the 3-D FOV (4805), onto the same points on the surface of an object to be illuminated. By virtue of such operations, the area image detection array (4806) detects time-varying speckle-noise patterns produced by the spatially-incoherent PLIB components reflected/scattered off the illuminated object, and the time-varying speckle-noise patterns are time-averaged at the detector elements of the area image detection array during the photo-integration time period thereof, thereby reducing the RMS power of speckle-pattern noise observable at the area-type image detection array 4806.

Below, a number of illustrative embodiments of hand-supportable PLIIM-based area-type imagers are described. In these illustrative embodiments, area-type image detection arrays with vertically-elongated image detection elements are not used to reduce speckle-pattern noise through spatial averaging as taught in the embodiment of FIG. 42, as this would result in a significant decrease in image resolution in the PLIIM-based system. However, these hand-supportable area-type imagers do embody despeckling mechanisms disclosed herein based on the principle of reducing either the temporal and/or spatial coherence of the PLIB either before or after object illumination operations, so as to provide robust solutions to speckle-pattern noise problems arising in hand-supportable area-type PLIIM-based imaging systems.

First Illustrative Embodiment of the PLIIM-Based Hand-Supportable Area Imager of the Present Invention Comprising Integrated Speckle-Pattern Noise Subsystem Operated in Accordance With the First Generalized Method of Speckle-Pattern Noise Reduction Illustrated in FIGS. 1I1A Through 1I3A In FIG. 52A, there is shown a first illustrative embodiment of the PLIIM-based hand-supportable area-type imager of the present invention. As shown, the hand-supportable area imager 1830 comprises: a hand-supportable housing 1831; a PLIIM-based image capture and processing engine 1832 contained therein, for projecting a planar laser illumination beam (PLIB) 1833 through its imaging window 1834 in coplanar relationship with the field of view (FOV) 1835 of the area image detection array 1836 employed in the engine; a LCD display panel 1837 mounted on the upper top surface 1838 of the housing in an integrated manner, for displaying, in a real-time manner, captured images, data being entered into the system, and graphical user interfaces (GUIs) required in the support of various types of information-based transactions; a data entry keypad 1839 mounted on the middle top surface 1840 of the housing, for enabling the user to manually enter data into the imager-required during the course of such information-based transactions; and an embedded-type computer and interface board 1841, contained within the housing, for carrying out image processing operations such as, for example, bar code symbol decoding operations, signature image processing operations, optical character recognition (OCR) operations, and the like, in a high-speed manner, as well as enabling a high-speed data communication interface 1842 with a digital communication network 1843, such as a LAN or WAN supporting a networking protocol such as TCP/IP, AppleTalk or the like.

As shown in FIG. 52B, the PLIIM-based image capture and processing engine 1832 comprises: an optical-bench/multi-layer PC board 1844, contained between the upper and lower portions of the engine housing 1845A and 1845B; an IFD (i.e. camera) subsystem 1846 mounted on the optical bench, and including 2-D area-type CCD image detection array 1836 contained within a light-box 1847 provided with image formation optics 1848, through which light collected from the illuminated object along 3-D field of view (FOV) 1835 is permitted to pass; a pair of PLIMs 1849A and 1849B (i.e. comprising a dual-VLD PLIA) mounted on optical bench 1844 on opposite sides of the IFD module 1846, for producing a PLIB within the 3-D FOV; a pair of cylindrical lens arrays 1850A and 1850B configured with PLIMs 1849A and 1849B, respectively; a pair of beam sweeping mirrors 1851A and 1851B for sweeping the planar laser illumination beams 1833, from cylindrical lens arrays 1850A and 1850B, respectively, across the 3-D FOV 1835; and an optical assembly 1852 including a temporal intensity modulation panel 1853 mounted before the entrance pupil 1854 of the IFD module, so as to produce a despeckling mechanism that operates in accordance with the seventh generalized method of speckle-pattern noise reduction illustrated in FIGS. 1I24 through 1I24C.

System Control Architectures for PLIIM-Based Hand-Supportable Area Imagers of the Present Invention Employing Area-Type Image Formation and Detection (IFD) Modules In general, there are a various types of system control architectures (i.e. schemes) that can be used in conjunction with any of the hand-supportable PLIIM-based area-type imagers shown in FIGS. 52A through 52B and 54A through 1I64B, and described throughout the present Specification. Also, there are three principally different types of image forming optics schemes that can be used to construct each such PLIIM-based area imager. Thus, it is possible to classify hand-supportable PLIIM-based area imagers into least fifteen different system design categories based on such criterion. Below, these system design categories will be briefly described with reference to FIGS. 53A1 through 53C5.

System Control Architectures for PLIIM-Based Hand-Supportable Area Imagers of the Present Invention Employing Area-Type Image Formation and Detection (IFD) Modules Having a Fixed Focal Length/Fixed Focal Distance Image Formation Optics In FIG. 53A1, there is shown a manually-activated version of a PLIIM-based area-type imager 1860 as illustrated, for example, in FIGS. 52A through 52B and 54A through 64B. As shown in FIG. 53A1, the PLIIM-based area imager 1860 comprises: a planar laser illumination array (PLIA) 6, including a set of VLD driver circuits 18, PLIMs 11, an integrated despeckling mechanism 1861 with a stationary cylindrical lens array 1862; an area-type image formation and detection (IFD) module 1863 having an area-type image detection array 1864, fixed focal length/fixed focal distance image formation optics 1865 for providing a fixed 3-D field of view (FOV), an image frame grabber 1866, and an image data buffer 1867; a pair of beam sweeping mechanisms 1868A and 1868B for sweeping the planar laser illumination beam 1869 produced from the PLIA across the 3-D FOV; an image processing computer 1870; a camera control computer 1871; a LCD panel 1872 and a display panel driver 1873; a touch-type or manually-keyed data entry pad 1874 and a keypad driver 1875; and a manually-actuated trigger switch 1876 for manually activating the planar laser illumination arrays, the area-type image formation and detection (IFD) module, and the image processing computer 1870, via the camera control computer 1871, upon manual activation of the trigger switch 1876. Thereafter, the system control program carried out within the camera control computer 1871 enables: (1) the automatic capture of digital images of objects (i.e. bearing bar code symbols and other graphical indicia) through the fixed focal length/fixed focal distance image formation optics 1865 provided within the area imager; (2) decode-processing of the bar code symbol represented therein; (3) generating symbol character data representative of the decoded bar code symbol; (4) buffering of the symbol character data within the hand-supportable housing or transmitting the same to a host computer system; and thereafter (5) automatically deactivating the subsystem components described above. When using a manually-actuated trigger switch 1876 having a single-stage operation, manually depressing the switch 1876 with a single pull-action will thereafter initiate the above sequence of operations with no further input required by the user.

In an alternative embodiment of the system design shown in FIG. 53A1, manually-actuated trigger switch 1876 would be replaced with a dual-position switch 1876' having a dual-positions (or stages of operation) so as to further embody the functionalities of both switch 1876 shown in FIG. 53A1 and transmission activation switch 1899 shown in FIG. 53A2. Also, the system would be further provided with a data transfer mechanism 1898 as shown in FIG. 53A2, for example, so that it embodies the symbol character data transmission functions described in greater detail in copending U.S. application Ser. No. 08/890,320, filed Jul. 9, 1997, and Ser. No. 09/513,601, filed Feb. 25, 2000, each said application being incorporated herein by reference in its entirety. In such an alternative embodiment, when the user pulls the dual-position switch 1876' to its first position, the camera control computer 1871 will automatically activate the following components: the planar laser illumination array 6 (driven by VLD driver circuits 18), the area-type image formation and detection (IFD) module 1844, and the image processing computer 1870 so that (1) digital images of objects (i.e. bearing bar code symbols and other graphical indicia) are automatically and repeatedly captured, (2) bar code symbols represented therein are repeatedly decoded, and (3) symbol character data representative of each decoded bar code symbol is automatically generated in a cyclical manner (i.e. after each reading of each instance of the bar code symbol) and buffered in the data transmission mechanism 1260. Then, when the user further depresses the dual-position switch to its second position (i.e. complete depression or activation), the camera control computer 1235 enables the data transmission mechanism 1898 to transmit character data from the imager processing computer 1870 to a host computer system in response to the manual activation of the dual-position switch 1876' to its second position at about the same time as when a bar code symbol is automatically decoded and symbol character data representative thereof is automatically generated by the image processing computer 1870 and buffered in data transmission switch 1898. This dual-stage switching mechanism provides the user with an additional degree of control when trying to accurately read a bar code symbol from a bar code menu, on which two or more bar code symbols reside on a single line of a bar code menu, and width of the FOV of the hand-held imager spatially extends over these bar code symbols, making bar code selection challenging if not difficult.

In FIG. 53A2, there is shown an automatically-activated version of the PLIIM-based area imager as illustrated, for example, in FIGS. 52A through 52B and 54A through 64B. As shown in FIG. 53A2, the PLIIM-based area imager 1880 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 1883 having an area-type image detection array 1884 and fixed focal length/fixed focal distance image formation optics 1885 for providing a fixed 3-D field of view (FOV), an image frame grabber 1886, and an image data buffer 1887; a pair of beam sweeping mechanisms 1888A and 1888B for sweeping the planar laser illumination beam 1889 produced from the PLIA across the 3-D FOV; an image processing computer 1890; a camera control computer 1891; a LCD panel 1892 and a display panel driver 1893; a touch-type or manually-keyed data entry pad 1894 and a keypad driver 1895; an IR-based object detection subsystem 1896 within its hand-supportable housing for automatically activating in response to the detection of an object in its IR-based object detection field 1897, the planar laser illumination array (driven by the VLD driver circuits), the area-type image formation and detection (IFD) module, as well as the image processing computer, via the camera control computer, so that (1) digital images of objects (i.e. bearing bar code symbols and other graphical indicia) are automatically captured, (2) bar code symbols represented therein are decoded, and (3) symbol character data representative of the decoded bar code symbol are automatically generated, and data transmission mechanism 1898 and a manually-activatable data transmission switch 1899 for enabling the transmission of symbol character data from the imager processing computer to a host computer system, via the data transmission mechanism 1998 in response to the manual activation of the data transmission switch 1899 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In FIG. 53A3, there is shown an automatically-activated version of the PLIIM-based area imager as illustrated, for example, in FIGS. 52A through 52B and 54A through 64B As shown in FIG. 53A3, the PLIIM-based area imager 2000 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 2001 having an area-type image detection array 2002 and fixed focal length/fixed focal distance image formation optics 2003 for providing a fixed 3-D field of view (FOV), an image frame grabber 2004, and an image data buffer 2005; a pair of beam sweeping mechanisms 2006A and 2006B for sweeping the planar laser illumination beam (PLIB) 2007 produced from the PLIA across the 3-D FOV; an image processing computer 2008; a camera control computer 2009; a LCD panel 2010 and a display panel driver 2011; a touch-type or manually-keyed data entry pad 2012 and a keypad driver 2013; a laser-based object detection subsystem 2014 embodied within the camera control computer for automatically activating the planar laser illumination arrays into a full-power mode of operation, the area-type image formation and detection (IFD) module, and the image processing computer, via the camera control computer, in response to the automatic detection of an object in its laser-based object detection field 2015, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 2016 and a manually-activatable data transmission switch 2017 for enabling the transmission of symbol character data from the imager processing computer to a host computer system, via the data transmission mechanism 2016 in response to the manual activation of the data transmission switch 2017 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In the illustrative embodiment of FIG. 40A3, the PLIIM-based system has an object detection mode, a bar code detection mode, and a bar code reading mode of operation, as taught in copending U.S. application Ser. No. 08/890,320, filed Jul. 9, 1997, and Ser. No. 09/513,601, filed Feb. 25, 2000, supra. During the object detection mode of operation of the system, the camera control computer 2009 transmits a control signal to the VLD drive circuitry 11, (optionally via the PLIA microcontroller), causing each PLIM to generate a pulsed-type planar laser illumination beam (PLIB) consisting of planar laser light pulses having a very low duty cycle (e.g. as low as 0.1%) and high repetition frequency (e.g. greater than 1 kHz), so as to function as a non-visible PLIB-based object sensing beam (and/or bar code detection beam, as the case may be). Then, when the camera control computer receives an activation signal from the laser-based object detection subsystem 2014 (i.e. indicative that an object has been detected by the non-visible PLIB-based object sensing beam), the system automatically advances to either: (i) its bar code detection state, where it increases the power level of the PLIB, collects image data and performs bar code detection operations, and therefrom, to its bar code symbol reading state, in which the output power of the PLIB is further increased, image data is collected and decode processed; or (ii) directly to its bar code symbol reading state, in which the output power of the PLIB is increased, image data is collected and decode processed. A primary advantage of using a pulsed high-frequency/low-duty-cycle PLIB as an object sensing beam is that it consumes minimal power yet enables image capture for automatic object and/or bar code detection purposes, without distracting the user by visibly blinking or flashing light beams which tend to detract from the user's experience. In yet alternative embodiments, however, it may be desirable to drive the VLD in each PLIM so that a visibly blinking PLIB-based object sensing beam (and/or bar code detection beam) is generated during the object detection (and bar code detection) mode of system operation. The visibly blinking PLIB-based object sensing beam will typically consist of planar laser light pulses having a moderate duty cycle (e.g. 25%) and low repetition frequency (e.g. less than 30 HZ). In this alternative embodiment of the present invention, the low frequency blinking nature of the PLIB-based object sensing beam (and/or bar code detection beam) would be rendered visually, conspicuous, thereby facilitating alignment of the PLIB/FOV with the bar code symbol, or graphics being imaged in relatively bright imaging environments.

In FIG. 53A4, there is shown an automatically-activated version of the PLIIM-based area imager as illustrated, for example, in FIGS. 52A through 52B and 54A through 64B.

As shown in FIG. 53A4, the PLIIM-based area imager 2020 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 2021 having an area-type image detection array 2022 and fixed focal length/fixed focal distance image formation optics 2023 for providing a fixed 3-D field of view (FOV), an image frame grabber 2024, and an image data buffer 2025; a pair of beam sweeping mechanisms 2026A and 2026B for sweeping the planar laser illumination beam (PLIB) 2027 produced from the PLIA across the 3-D FOV; an image processing computer 2028; a camera control computer 2029; a LCD panel 2030 and a display panel driver 2031; a touch-type or manually-keyed data entry pad 2032 and a keypad driver 2033; an ambient-light driven object detection subsystem 2034 within its hand-supportable housing for automatically activating the planar laser illumination array 6 (driven by VLD driver circuits), the area-type image formation and detection (IFD) module, and the image processing computer, via the camera control computer, in response to the automatic detection of an object via ambient-light detected by object detection field enabled by the area image sensor within the IFD module 2021, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 2035 and a manually-activatable data transmission switch 2036 for enabling the transmission of symbol character data from the imager processing computer to a host computer system, via the data transmission mechanism 2035, in response to the manual activation of the data transmission switch 2036 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety. Notably, in some applications, the passive-mode objection detection subsystem 2034 employed in this system might require (i) using a different system of optics for collecting ambient light from objects during the object detection mode of the system, or (ii) modifying the light collection characteristics of the light collection system to permit increased levels of ambient light to be focused onto the CCD image detection array 2022 in the IFD module (i.e. subsystem). In other applications, the provision of image intensification optics on the surface of the CCD image detection array should be sufficient to form images of sufficient brightness to perform object detection and/or bar code detection operations.

In FIG. 53A5, there is shown an automatically-activated version of the PLIIM-based area imager as illustrated, for example, in FIGS. 52A through 52B and 54A through 64B. As shown in FIG. 53A5, the PLIIM-based linear imager 2040 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 2041 having an area-type image detection array 2042 and fixed focal length/fixed focal distance image formation optics 2043 for providing a fixed 3-D field of view (FOV), an image frame grabber 2044, and an image data buffer 2045; a pair of beam sweeping mechanisms 2046A and 2046B for sweeping the planar laser illumination beam (PLIB) 2047 produced from the PLIA across the 3-D FOV; an image processing computer 2048; a camera control computer 2049; a LCD panel 2050 and a display panel driver 2051; a touch-type or manually-keyed data entry pad 2052 and a keypad driver 2053; an automatic bar code symbol detection subsystem 2054 within its hand-supportable housing for automatically activating the image processing computer for decode-processing upon automatic detection of a bar code symbol within its bar code symbol detection field 2055 by the area image sensor within the IFD module 2041 so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 2056 and a manually-activatable data transmission switch 2057 for enabling the transmission of symbol character data from the imager processing computer to a host computer system, via the data transmission mechanism 2056, in response to the manual activation of the data transmission switch 2057 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

System Control Architectures for PLIIM-Based Hand-Supportable Area Imagers of the Present Invention Employing Area-Type Image Formation and Detection (IFD) Modules Having Fixed Focal Length/Variable Focal Distance Image Formation Optics In FIG. 53B1, there is shown a manually-activated version of the PLIIM-based area imager as illustrated, for example, in FIG. FIGS. 52A through 52B and 54A through 64B. As shown in FIG. 53B1, the PLIIM-based linear imager 2060 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 2061 having an area-type image detection array 2062 and fixed focal length/variable focal distance image formation optics 2063 for providing a fixed 3-D field of view (FOV), an image frame grabber 2064, and an image data buffer 2065; a pair of beam sweeping mechanisms 2066A and 2066B for sweeping the planar laser illumination beam (PLIB) 2067 produced from the PLIA across the 3-D FOV; an image processing computer 2068; a camera control computer 2069; a LCD panel 2070 and a display panel driver 2071; a touch-type or manually-keyed data entry pad 2072 and a keypad driver 2073; and a manually-actuated trigger switch 2074 for manually activating the planar laser illumination arrays, the area-type image formation and detection (IFD) module, the image frame grabber, the image data buffer, and the image processing computer, via the camera control computer, upon manual activation of the trigger switch 2074. Thereafter, the system control program carried out within the camera control computer 2069 enables: (1) the automatic capture of digital images of objects (i.e. bearing bar code symbols and other graphical indicia) through the fixed focal length/fixed focal distance image formation optics 2063 provided within the area imager; (2) decode-processing the bar code symbol represented therein; (3) generating symbol character data representative of the decoded bar code symbol; (4) buffering the symbol character data within the hand-supportable housing or transmitting the same to a host computer system; and (5) thereafter automatically deactivating the subsystem components described above. When using a manually-actuated trigger switch 2074 having a single-stage operation, manually depressing the switch 2074 with a single pull-action will thereafter initiate the above sequence of operations with no further input required by the user.

In an alternative embodiment of the system design shown in FIG. 53B1, manually-actuated trigger switch 2074 would be replaced with a dual-position switch 2074' having a dual-positions (or stages of operation) so as to further embody the functionalities of both switch 2074 shown in FIG. 53B1 and transmission activation switch 2097 shown in FIG. 53A2. Also, the system would be further provided with a data transfer mechanism 2096 as shown in FIG. 53A2, for example, so that it embodies the symbol character data transmission functions described in greater detail in copending U.S. application Ser. No. 08/890,320, filed Jul. 9, 1997, and Ser. No. 09/513,601, filed Feb. 25, 2000, each said application being incorporated herein by reference in its entirety. In such an alternative embodiment, when the user pulls the dual-position switch 2074' to its first position, the camera control computer 2069 will automatically activate the following components: the planar laser illumination array 6 (driven by VLD driver circuits 18), the area-type image formation and detection (IFD) module 2062, and the image processing computer 2068 so that (1) digital images of objects (i.e. bearing bar code symbols and other graphical indicia) are automatically and repeatedly captured, (2) bar code symbols represented therein are repeatedly decoded, and (3) symbol character data representative of each decoded bar code symbol is automatically generated in a cyclical manner (i.e. after each reading of each instance of the bar code symbol) and buffered in the data transmission mechanism 2096 Then, when the user further depresses the dual-position switch to its second position (i.e. complete depression or activation), the camera control computer 2069 enables the data transmission mechanism 2096 to transmit character data from the imager processing computer 2068 to a host computer system in response to the manual activation of the dual-position switch 2074' to its second position at about the same time as when a bar code symbol is automatically decoded and symbol character data representative thereof is automatically generated by the image processing computer 2068 and buffered in data transmission switch 2074'. This dual-stage switching mechanism provides the user with an additional degree of control when trying to accurately read a bar code symbol from a bar code menu, on which two or more bar code symbols reside on a single line of a bar code menu, and width of the FOV of the hand-held imager spatially extends over these bar code symbols, making bar code selection challenging if not difficult.

In FIG. 53B2, there is shown an automatically-activated version of the PLIIM-based area imager as illustrated, for example, in FIGS. 52A through 52B and 54A through 64B. As shown in FIG. 53B2, the PLIIM-based area imager 2080 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 2081 having an area-type image detection array 2082 and fixed focal length/variable focal distance image formation optics 2083 for providing a fixed 3-D field of view (FOV), an image frame grabber 2084 and an image data buffer 2085; a pair of beam sweeping mechanisms 2086A and 2086B for sweeping the planar laser illumination beam (PLIB) 2087 produced from the PLIA across the 3-D FOV; an image processing computer 2088; a camera control computer 2089; a LCD panel 2090 and a display panel driver 2091; a touch-type or manually-keyed data entry pad 2092 and a keypad driver 2093; an IR-based object detection subsystem 2094 within its hand-supportable housing for automatically activating upon detection of an object in its IR-based object detection field 2095, the planar laser illumination array (driven by VLD driver circuits), the area-type image formation and detection (IFD) module, as well as and the image processing computer, via the camera control computer, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 2096 and a manually-activatable data transmission switch 2097 for enabling the transmission of symbol character data from the imager processing computer to a host computer system, via the data transmission mechanism 2096, in response to the manual activation of the data transmission switch 2097 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In FIG. 53B3, there is shown an automatically-activated version of the PLIIM-based area imager as illustrated, for example, in FIGS. 52A through 52B and 54A through 64B. As shown in FIG. 53B3, the PLIIM-based linear imager comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 3001 having an area-type image detection array 3002 and fixed focal length/variable focal distance image formation optics 3003 providing a fixed 3-D field of view (FOV, an image frame grabber 3004, and an image data buffer 3005; a pair of beam sweeping mechanisms 3006A and 3006B for sweeping the planar laser illumination beam (PLIB) 3007 produced from the PLIA across the 3-D FOV; an image processing computer 3008; a camera control computer 3009; a LCD panel 3010 and a display panel driver 3011; a touch-type or manually-keyed data entry pad 3012 and a keypad driver 3013; a laser-based object detection subsystem 3013 within its hand-supportable housing for automatically activating the planar laser illumination arrays into a full-power mode of operation, the area-type image formation and detection (IFD) module, and the image processing computer, via the camera control computer, upon automatic detection of an object in its laser-based object detection field 3014, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 3015 and a manually-activatable data transmission switch 3016 for enabling the transmission of symbol character data from the imager processing computer to a host computer system, via the data transmission mechanism 3015 in response to the manual activation of the data transmission switch 3016 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In the illustrative embodiment of FIG. 53B3, the PLIIM-based system has an object detection mode, a bar code detection mode, and a bar code reading mode of operation, as taught in copending U.S. application Ser. No. 08/890,320, filed Jul. 9, 1997, and Ser. No. 09/513,601, filed Feb. 25, 2000, supra. During the object detection mode of operation of the system, the camera control computer 3009 transmits a control signal to the VLD drive circuitry 11, (optionally via the PLIA microcontroller), causing each PLIM to generate a pulsed-type planar laser illumination beam (PLIB) consisting of planar laser light pulses having a very low duty cycle (e.g. as low as 0.1%) and high repetition frequency (e.g. greater than 1 kHz), so as to function as a non-visible PLIB-based object sensing beam (and/or bar code detection beam, as the case may be). Then, when the camera control computer receives an activation signal from the laser-based object detection subsystem 3013 (i.e. indicative that an object has been detected by the non-visible PLIB-based object sensing beam), the system automatically advances to either: (i) its bar code detection state, where it increases the power level of the PLIB, collects image data and performs bar code detection operations, and therefrom, to its bar code symbol reading state, in which the output power of the PLIB is further increased, image data is collected and decode processed; or (ii) directly to its bar code symbol reading state, in which the output power of the PLIB is increased, image data is collected and decode processed. A primary advantage of using a pulsed high-frequency/low-duty-cycle PLIB as an object sensing beam is that it consumes minimal power yet enables image capture for automatic object and/or bar code detection purposes, without distracting the user by visibly blinking or flashing light beams which tend to detract from the user's experience. In yet alternative embodiments, however, it may be desirable to drive the VLD in each PLIM so that a visibly blinking PLIB-based object sensing beam (and/or bar code detection beam) is generated during the object detection (and bar code detection) mode of system operation. The visibly blinking PLIB-based object sensing beam will typically consist of planar laser light pulses having a moderate duty cycle (e.g. 25%) and low repetition frequency (e.g. less than 30 HZ). In this alternative embodiment of the present invention, the low frequency blinking nature of the PLIB-based object sensing beam (and/or bar code detection beam) would be rendered visually conspicuous, thereby facilitating alignment of the PLIB/FOV with the bar code symbol, or graphics being imaged in relatively bright imaging environments.

In FIG. 53B4, there is shown an automatically-activated version of the PLIIM-based area imager as illustrated, for example, in FIGS. 52A through 52B and 54A through 64B. As shown in FIG. 53B4, the PLIIM-based area imager 3020 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 3021 having an area-type image detection array 3022 and fixed focal length/variable focal distance image formation optics 3023 for providing a fixed 3-D field of view (FOV), an image frame grabber 3024, and an image data buffer 3025; a pair of beam sweeping mechanisms 3026A and 3026B for sweeping the planar laser illumination beam (PLIB) 3027 produced from the PLIA across the 3-D FOV; an image processing computer 3028; a camera control computer 3029; a LCD panel 3030 and a display panel driver 3031; a touch-type or manually-keyed data entry pad 3032 and a keypad driver 3033; an ambient-light driven object detection subsystem 3034 within its hand-supportable housing for automatically activating the planar laser illumination array (driven by VLD driver circuits), the area-type image formation and detection (IFD) module, and the image processing computer, via the camera control computer, in response to the automatic detection of an object via ambient-light detected by object detection field 3035 enabled by the area image sensor 3022 within the IFD module, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 3036 and a manually-activatable data transmission switch 3037 for enabling the transmission of symbol character data from the imager processing computer to a host computer system, via the data transmission mechanism 3036, in response to the manual activation of the data transmission switch 3037 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety. Notably, in some applications, the passive-mode objection detection subsystem 3034 employed in this system might require (i) using a different system of optics for collecting ambient light from objects during the object detection mode of the system, or (ii) modifying the light collection characteristics of the light collection system to permit increased levels of ambient light to be focused onto the CCD image detection array 3022 in the IFD module (i.e. subsystem). In other applications, the provision of image intensification optics on the surface of the CCD image detection array should be sufficient to form images of sufficient brightness to perform object detection and/or bar code detection operations.

In FIG. 53B5, there is shown an automatically-activated version of the PLIIM-based area imager as illustrated, for example, in FIGS. 52A through 52B and 54A through 64B. As shown in FIG. 53B5, the PLIIM-based area imager 3040 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 3041 having an area-type image detection array 3042 and fixed focal length/variable focal distance image formation optics 3043 for providing a fixed 3-D field of view (FOV), an image frame grabber 3044, and an image data buffer 3045; a pair of beam sweeping mechanisms 3046A and 3046B for sweeping the planar laser illumination beam (PLIB) 3047 produced from the PLIA across the 3-D FOV; an image processing computer 3048; a camera control computer 3049; a LCD panel 3050 and a display panel driver 3051; a touch-type or manually-keyed data entry pad 3052 and a keypad driver 3053; an automatic bar code symbol detection subsystem 3054 within its hand-supportable housing for automatically activating the image processing computer for decode-processing upon automatic detection of a bar code symbol within its bar code symbol detection field 3055 by the linear image sensor 3042 within the IFD module so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 3056 and a manually-activatable data transmission switch 3057 for enabling the transmission of symbol character data from the imager processing computer to a host computer system, via the data transmission mechanism 3056, in response to the manual activation of the data transmission switch 3057 at about the same time as when a bar code symbol is automatically decoded and symbol character data representative thereof is automatically generated. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

System Control Architectures for PLIIM-Based Hand-Supportable Linear Imagers of the Present Invention Employing Area-Type Image Formation and Detection (IFD) Modules Having Variable Focal Length/Variable Focal Distance Image Formation Optics In FIG. 53C1, there is shown a manually-activated version of the PLIIM-based area imager as illustrated, for example, in FIGS. 52A through 52B and 54A through 64B. As shown in FIG. 53C1, the PLIIM-based area imager 3060 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 3061 having an area-type image detection array 3062 and variable focal length/variable focal distance image formation optics 3063 for providing a variable 3-D field of view (FOV), an image frame grabber 3064, and an image data buffer 3065; a pair of beam sweeping mechanisms 3066A and 3066B for sweeping the planar laser illumination beam (PLIB) 3067 produced from the PLIA across the 3-D FOV; an image processing computer 3068; a camera control computer 3069; a LCD panel 3070 and a display panel driver 3071; a touch-type or manually-keyed data entry pad 3072 and a keypad driver 3073; and a manually-actuated trigger switch 3074 for manually activating the planar laser illumination arrays, the area-type image formation and detection (IFD) module, and the image processing computer, via the camera control computer, in response to the manual activation of the trigger switch 3074. Thereafter, the system control program carried out within the camera control computer 3069 enables: (1) the automatic capture of digital images of objects (i.e. bearing bar code symbols and other graphical indicia) through the fixed focal length/fixed focal distance image formation optics 3063 provided within the area imager; (2) decode-processing the bar code symbol represented therein; (3) generating symbol character data representative of the decoded bar code symbol; (4) buffering the symbol character data within the hand-supportable housing or transmitting the same to a host computer system; and (5) thereafter automatically deactivating the subsystem components described above. When using a manually-actuated trigger switch 3074 having a single-stage operation, manually depressing the switch 3074 with a single pull-action will thereafter initiate the above sequence of operations with no further input required by the user.

In an alternative embodiment of the system design shown in FIG. 53C1, manually-actuated trigger switch 3074 would be replaced with a dual-position switch 3074' having a dual-positions (or stages of operation) so as to further embody the functionalities of both switch 3074' shown in FIG. 53C1 and transmission activation switch 3097 shown in FIG. 53C2. Also, the system would be further provided with a data transfer mechanism 3096 as shown in FIG. 53C2, for example, so that it embodies the symbol character data transmission functions described in greater detail in copending U.S. application Ser. No. 08/890,320, filed Jul. 9, 1997, and Ser. No. 09/513,601, filed Feb. 25, 2000, each said application being incorporated herein by reference in its entirety. In such an alternative embodiment, when the user pulls the dual-position switch 3074' to its first position, the camera control computer 3069 will automatically activate the following components: the planar laser illumination array 6 (driven by VLD driver circuits 18), the linear-type image formation and detection (IFD) module 3062, and the image processing computer 3068 so that (1) digital images of objects (i.e. bearing bar code symbols and other graphical indicia) are automatically and repeatedly captured, (2) bar code symbols represented therein are repeatedly decoded, and (3) symbol character data representative of each decoded bar code symbol is automatically generated in a cyclical manner (i.e. after each reading of each instance of the bar code symbol) and buffered in the data transmission mechanism 3096. Then, when the user further depresses the dual-position switch to its second position (i.e. complete depression or activation), the camera control computer 3069 enables the data transmission mechanism 3096 to transmit character data from the imager processing computer 3068 to a host computer system in response to the manual activation of the dual-position switch 3074' to its second position at about the same time as when a bar code symbol is automatically decoded and symbol character data representative thereof is automatically generated by the image processing computer 3068 and buffered in data transmission switch 3097. This dual-stage switching mechanism provides the user with an additional degree of control when trying to accurately read a bar code symbol from a bar code menu, on which two or more bar code symbols reside on a single line of a bar code menu, and width of the FOV of the hand-held imager spatially extends over these bar code symbols, making bar code selection challenging if not difficult.

In FIG. 53C2, there is shown an automatically-activated version of the PLIIM-based area imager as illustrated, for example, in FIGS. 52A through 52B and 54A through 64B. As shown in FIG. 53C2, the PLIIM-based area imager 3080 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 3081 having an area-type image detection array 3082 and variable focal length/variable focal distance image formation optics 3083 for providing a variable 3-D field of view (FOV), an image frame grabber 3084, and an image data buffer 3085; a pair of beam sweeping mechanisms 3086A and 3086B for sweeping the planar laser illumination beam (PLIB) 3087 produced from the PLIA across the 3-D FOV; an image processing computer 3088; a camera control computer 3089; a LCD panel 3090 and a display panel driver 3091: a touch-type or manually-keyed data entry pad 3092 and a keypad driver 3093; an IR-based object detection subsystem 3094 within its hand-supportable housing for automatically activating upon detection of an object in its IR-based object detection field 3095, the planar laser illumination array (driven by VLD driver circuits), the area-type image formation and detection (IFD) module, as well as and the image processing computer, via the camera control computer, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 3096 and a manually-activatable data transmission switch 3097 for enabling the transmission of symbol character data from the imager processing computer to a host computer system, via the data transmission mechanism 3096, in response to the manual activation of the data transmission switch 3097 at about the same time as when a bar code symbol is automatically decoded and symbol character data representative thereof is automatically generated. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In FIG. 53C3, there is shown an automatically-activated version of the PLIIM-based area imager as illustrated, for example, in FIGS. 52A through 52B and 54A through 64B. As shown in FIG. 53C3, the PLIIM-based area imager 4000 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 4001 having an area-type image detection array 4002 and variable focal length/variable focal distance image formation optics 4003 for providing a variable 3-D field of view (FOV), an image frame grabber 4004, and an image data buffer 4005; a pair of beam sweeping mechanisms 4006A and 4006B for sweeping the planar laser illumination beam (PLIB) 4007 produced from the PLIA across the 3-D FOV; an image processing computer 4008; a camera control computer 4009; a LCD panel 4010 and a display panel driver 4011; a touch-type or manually-keyed data entry pad 4012 and a keypad driver 4013; a laser-based object detection subsystem 4014 within its hand-supportable housing for automatically activating the planar laser illumination arrays into a full-power mode of operation, the area-type image formation and detection (IFD) module, and the image processing computer, via the camera control computer, in response to the automatic detection of an object in its laser-based object detection field 4015, so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 4016 and a manually-activatable data transmission switch 4017 for enabling the transmission of symbol character data from the imager processing computer to a host computer system, via the data transmission mechanism 4016, in response to the manual activation of the data transmission switch 4017 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

In the illustrative embodiment of FIG. 53C3, the PLIIM-based system has an object detection mode, a bar code detection mode, and a bar code reading mode of operation, as taught in copending U.S. application Ser. No. 08/890,320, filed Jul. 9, 1997, and Ser. No. 09/513,601, filed Feb. 25, 2000, supra. During the object detection mode of operation of the system, the camera control computer 4009 transmits a control signal to the VLD drive circuitry 11, (optionally via the PLIA microcontroller), causing each PLIM to generate a pulsed-type planar laser illumination beam (PLIB) consisting of planar laser light pulses having a very low duty cycle (e.g. as low as 0.1%) and high repetition frequency (e.g. greater than 1 kHz), so as to function as a non-visible PLIB-based object sensing beam (and/or bar code detection beam, as the case may be). Then, when the camera control computer receives an activation signal from the laser-based object detection subsystem 4014 (i.e. indicative that an object has been detected by the non-visible PLIB-based object sensing beam), the system automatically advances to either: (i) its bar code detection state, where it increases the power level of the PLIB, collects image data and performs bar code detection operations, and therefrom, to its bar code symbol reading state, in which the output power of the PLIB is further increased, image data is collected and decode processed; or (ii) directly to its bar code symbol reading state, in which the output power of the PLIB is increased, image data is collected and decode processed. A primary advantage of using a pulsed high-frequency/low-duty-cycle PLIB as an object sensing beam is that it consumes minimal power yet enables image capture for automatic object and/or bar code detection purposes, without distracting the user by visibly blinking or flashing light beams which tend to detract from the user's experience. In yet alternative embodiments, however, it may be desirable to drive the VLD in each PLIM so that a visibly blinking PLIB-based object sensing beam (and/or bar code detection beam) is generated during the object detection (and bar code detection) mode of system operation. The visibly blinking PLIB-based object sensing beam will typically consist of planar laser light pulses having a moderate duty cycle (e.g. 25%) and low repetition frequency (e.g. less than 30 HZ). In this alternative embodiment of the present invention, the low frequency blinking nature of the PLIB-based object sensing beam (and/or bar code detection beam) would be rendered visually conspicuous, thereby facilitating alignment of the PLIB/FOV with the bar code symbol, or graphics being imaged in relatively bright imaging environments.

In FIG. 53C4, there is shown an automatically-activated version of the PLIIM-based area imager as illustrated, for example, in FIGS. 52A through 52B and 54A through 64B. As shown in FIG. 53C4, the PLIIM-based area imager 4020 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 4021 having an area-type image detection array 4022 and variable focal length/variable focal distance image formation optics 4023 providing a variable 3-D field of view (FOV), an image frame grabber 4024, and an image data buffer 4025; a pair of beam sweeping mechanisms 4026A and 4026B for sweeping the planar laser illumination beam (PLIB) 4027 produced from the PLIA across the 3-D FOV; an image processing computer 4028; a camera control computer 4029; a LCD panel 4030 and a display panel driver 4031; a touch-type or manually-keyed data entry pad 4032 and a keypad driver 4033; an ambient-light driven object detection subsystem 4034 within its hand-supportable housing for automatically activating the planar laser illumination array (driven by VLD driver circuits), the area-type image formation and detection (IFD) module, and the image processing computer, via the camera control computer, in response to the automatic detection of an object via ambient-light detected by object detection field 4035 enabled by the area image sensor 4022 within the IFD module so that (1) digital images of objects (i.e. bearing bar code symbols and other graphical indicia) are automatically captured, (2) bar code symbols represented therein are decoded, and (3) symbol character data representative of the decoded bar code symbol are automatically generated; and data transmission mechanism 4036 and a manually-activatable data transmission switch 4037 for enabling the transmission of symbol character data from the imager processing computer to a host computer system, via the data transmission mechanism 4036, in response to the manual activation of the data transmission switch 4037 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety. Notably, in some applications, the passive-mode objection detection subsystem 4034 employed in this system might require (i) using a different system of optics for collecting ambient light from objects during the object detection mode of the system, or (ii) modifying the light collection characteristics of the light collection system to permit increased levels of ambient light to be focused onto the CCD image detection array 4022 in the IFD module (i.e. subsystem). In other applications, the provision of image intensification optics on the surface of the CCD image detection array should be sufficient to form images of sufficient brightness to perform object detection and/or bar code detection operations.

In FIG. 53C5, there is shown an automatically-activated version of the PLIIM-based area imager as illustrated, for example, in FIGS. 52A through 52B and 54A through 64B. As shown in FIG. 53C5, the PLIIM-based area imager 4040 comprises: planar laser illumination array (PLIA) 6, including a set of VLD driver circuits 18, PLIMs 11, an integrated despeckling mechanism 1861 having a stationary cylindrical lens array 1862; an area-type image formation and detection (IFD) module 4041 having an area-type image detection array 4042 and variable focal length/variable focal distance image formation optics 4043 for providing a variable 3-D field of view (FOV), an image frame grabber 4044, an image data buffer 4045; a pair of beam sweeping mechanisms 4046A and 4046B for sweeping the planar laser illumination beam (PLIB) 4047 produced from the PLIA across the 3-D FOV; an image processing computer 4048; a camera control computer 4049; a LCD panel 4050 and a display panel driver 4051; a touch-type or manually-keyed data entry pad 4052 and a keypad driver 4053; an automatic bar code symbol detection subsystem 4054 within its hand-supportable housing for automatically activating the image processing computer for decode-processing in response to the automatic detection of a bar code symbol within its bar code symbol detection field 4055 by the area image sensor 4042 within the IFD module so that (1) digital images of objects (i.e. bearing bar code symbols and other graphical indicia) are automatically captured, (2) bar code symbols represented therein are decoded, and (3) symbol character data representative of the decoded bar code symbol are automatically generated; and a data transmission mechanism 4056 and a manually-activatable data transmission switch 4057 for enabling the transmission of symbol character data from the imager processing computer to a host computer system, via the data transmission mechanism 4056, in response to the manual activation of the data transmission switch 4057 at about the same time as when a bar code symbol is automatically decoded and symbol character data representative thereof is automatically generated by the image processing computer. This manually-activated symbol character data transmission scheme is described in greater detail in copending U.S. application Ser. No. 08/890,320, filed Jul. 9, 1997, and Ser. No. 09/513,601, filed Feb. 25, 2000, each said application being incorporated herein by reference in its entirety.

Second Illustrative Embodiment of the PLIIM-Based Hand-Supportable Area Imager of the Present Invention Comprising Integrated Speckle-Pattern Noise Subsystem Operated in Accordance With the First Generalized Method of Speckle-Pattern Noise Reduction Illustrated in FIGS. 1I12G and 1I12H In FIG. 54A, there is shown a second illustrative embodiment of the PLIIM-based hand-supportable area imager of the present invention. As shown, the PLIIM-based imager 4060 comprises: a hand-supportable housing 4061; a PLIIM-based image capture and processing engine 4062 contained therein, for projecting a planar laser illumination beam (PLIB) 4063 through its imaging window 4064 in coplanar relationship with the 3-D field of view (FOV) 4065 of the area image detection array 4066 employed in the engine; a LCD display panel 4067 mounted on the upper top surface 4068 of the housing in an integrated manner, for displaying, in a real-time manner, captured images, data being entered into the system, and graphical user interfaces (GUIs) required in the support of various types of information-based transactions; a data entry keypad 4069 mounted on the middle top surface 4070 of the housing, for enabling the user to manually enter data into the imager required during the course of such information-based transactions; and an embedded-type computer and interface board 4071, contained within the housing, for carrying out image processing operations such as, for example, bar code symbol decoding operations, signature image processing operations, optical character recognition (OCR) operations, and the like, in a high-speed manner, as well as enabling a high-speed data communication interface 4072 with a digital communication network 4073, such as a LAN or WAN supporting a networking protocol such as TCP/IP, AppleTalk or the like.

As shown in FIG. 54B, the PLIIM-based image capture and processing engine 4062 comprises: an optical-bench/multi-layer PC board 4075, contained between the upper and lower portions of the engine housing 4076A and 4076B; an IFD module (i.e. camera subsystem) 4077 mounted on the optical bench, and including area CCD image detection array 4066 contained within a light-box 4078 provided with image formation optics 4079, through which light collected from the illuminated object along the 3-D field of view (FOV) 4065 is permitted to pass; a pair of PLIMs (i.e. comprising a dual-VLD PLIA) 4080A and 4080B mounted on optical bench 4075 on opposite sides of the IFD module, for producing PLIB 4063 within the 3-D FOV 4065; a pair of beam sweeping mechanisms 4081A and 4081B for sweeping the planar laser illumination beam (PLIB) 4063 produced from the PLIA across the 3-D FOV; and an optical assembly configured with each PLIM, including a micro-oscillating light reflective element 4082 and a cylindrical lens array 4083 which provides a despeckling mechanism that operates in accordance with the first generalized method of speckle-pattern noise reduction illustrated in FIGS. 1I5A through 1I5D.

Third Illustrative Embodiment of the PLIIM-Based Hand-Supportable Area Imager of the Present Invention Comprising Integrated Speckle-Pattern Noise Subsystem Operated in Accordance With the First Generalized Method of Speckle-Pattern Noise Reduction Illustrated in FIGS. 1I12G and 1I12H In FIG. 55A, there is shown a third illustrative embodiment of the PLIIM-based hand-supportable area imager of the present invention. As shown, the PLIIM-based imager 4090 comprises: a hand-supportable housing 4091; a PLIIM-based image capture and processing engine 4092 contained therein, for projecting a planar laser illumination beam (PLIB) 4093 through its imaging window 4094 in coplanar relationship with the 3-D field of view (FOV) 4095 of the area image detection array 4096 employed in the engine; a LCD display panel 4097 mounted on the upper top surface 4098 of the housing in an integrated manner, for displaying, in a real-time manner, captured images, data being entered into the system, and graphical user interfaces (GUIs) required in the support of various types of information-based transactions; a data entry keypad 4099 mounted on the middle top surface 4100 of the housing, for enabling the user to manually enter data into the imager required during the course of such information-based transactions; and an embedded-type computer and interface board 4101, contained within the housing, for carrying out image processing operations such as, for example, bar code symbol decoding operations, signature image processing operations, optical character recognition (OCR) operations, and the like, in a high-speed manner, as well as enabling a high-speed data communication interface 4102 with a digital communication network 4103, such as a LAN or WAN supporting a networking protocol such as TCP/IP, AppleTalk or the like.

As shown in FIG. 55B, the PLIIM-based image capture and processing engine 4092 comprises: an optical-bench/multi-layer PC board 4104, contained between the upper and lower portions of the engine housing 4105A and 4105B; an IFD (i.e. camera) subsystem 4106 mounted on the optical bench, and including area CCD image detection array 4096 contained within a light-box 4107 provided with image formation optics 4108, through which light collected from the illuminated object along 3-D field of view (FOV) 4095 is permitted to pass; a pair of PLIMs (i.e. single VLD PLIAs) 4109A and 4109B mounted on optical bench 4104 on opposite sides of the IFD module, for producing a PLIB within the 3-D FOV; a pair of beam sweeping mechanisms 4110A and 4110B for sweeping the planar laser illumination beam (PLIB) 4093 produced from the PLIA across the 3-D FOV; and an optical assembly configured with each PLIM, including an acousto-electric Bragg cell structure 4111 and a cylindrical lens array 4112, arranged above the PLIM in the named order, which provides a despeckling mechanism that operates in accordance with the first generalized method of speckle-pattern noise reduction illustrated in FIGS. 1I6A and 1I6B.

Fourth Illustrative Embodiment of the PLIIM-Based Hand-Supportable Area Imager of the Present Invention Comprising Integrated Speckle-Pattern Noise Subsystem Operated in Accordance With the First Generalized Method of Speckle-Pattern Noise Reduction Illustrated in FIGS. 1I7A Through 1I7C In FIG. 56A, there is shown a fourth illustrative embodiment of the PLIIM-based hand-supportable area imager of the present invention. As shown, the PLIIM-based imager 4120 comprises: a hand-supportable housing 4121; a PLIIM-based image capture and processing engine 4122 contained therein, for projecting a planar laser illumination beam (PLIB) 4123 through its imaging window 4124 in coplanar relationship with the field of view (FOV) 4125 of the area image detection array 4126 employed in the engine; a LCD display panel 4127 mounted on the upper top surface 4128 of the housing in an integrated manner, for displaying, in a real-time manner, captured images, data being entered into the system, and graphical user interfaces (GUIs) required in the support of various types of information-based transactions; a data entry keypad 4129 mounted on the middle top surface of the housing 4130, for enabling the user to manually enter data into the imager required during the course of such information-based transactions; and an embedded-type computer and interface board 4131, contained within the housing, for carrying out image processing operations such as, for example, bar code symbol decoding operations, signature image processing operations, optical character recognition (OCR) operations, and the like, in a high-speed manner, as well as enabling a high-speed data communication interface 4132 with a digital communication network 4133, such as a LAN or WAN supporting a networking protocol such as TCP/IP, AppleTalk or the like.

As shown in FIG. 56B, the PLIIM-based image capture and processing engine 4122 comprises: an optical-bench/multi-layer PC board 4134, contained between the upper and lower portions of the engine housing 4135A and 4135B; an IFD (i.e. camera) subsystem 4136 mounted on the optical bench, and including an area CCD image detection array 4126 contained within a light-box 4137 provided with image formation optics 4138, through which light collected from the illuminated object along the 3-D field of view (FOV) 4125 is permitted to pass; a pair of PLIMs (i.e. comprising a dual VLD PLIA) 4139A and 4139B mounted on optical bench 4134 on opposite sides of the IFD module, for producing PLIB 4123 within the 3-D FOV 4125; a pair of beam sweeping mechanisms 4140A and 4140 for sweeping the planar laser illumination beam (PLIB) 4123 produced from the PLIA across the 3-D FOV; and an optical assembly configured with each PLIM, including a high spatial-resolution piezoelectric driven deformable mirror (DM) structure 4141 and a cylindrical lens array 4142 mounted upon each PLIM in the named order, providing a despeckling mechanism that operates in accordance with the first generalized method of speckle-pattern noise reduction illustrated in FIGS. 1I7A through 1I7C.

Fifth Illustrative Embodiment of the PLIIM-Based Hand-Supportable Area Imager of the Present Invention Comprising Integrated Speckle-Pattern Noise Subsystem Operated in Accordance With the First Generalized Method of Speckle-Pattern Noise Reduction Illustrated in FIGS. 1I8F and 1I18G In FIG. 57A, there is shown a fifth illustrative embodiment of the PLIIM-based hand-supportable area imager of the present invention. As shown, the PLIIM-based imager 4150 comprises: a hand-supportable housing 4151; a PLIIM-based image capture and processing engine 4152 contained therein, for projecting a planar laser illumination beam (PLIB) 4153 through its imaging window 4154 in coplanar relationship with the 3-D field of view (FOV) 4154 of the area image detection array 4156 employed in the engine; a LCD display panel 4157 mounted on the upper top surface 4158 of the housing in an integrated manner, for displaying, in a real-time manner, captured images, data being entered into the system, and graphical user interfaces (GUIs) required in the support of various types of information-based transactions; a data entry keypad 4159 mounted on the middle top surface 4160 of the housing, for enabling the user to manually enter data into the imager required during the course of such information-based transactions; and an embedded-type computer and interface board 4161, contained within the housing, for carrying out image processing operations such as, for example, bar code symbol decoding operations, signature image processing operations, optical character recognition (OCR) operations, and the like, in a high-speed manner, as well as enabling a high-speed data communication interface 4162 with a digital communication network 4163, such as a LAN or WAN supporting a networking protocol such as TCP/IP, AppleTalk or the like.

As shown in FIG. 57B, the PLIIM-based image capture and processing engine 5152 comprises: an optical-bench/multi-layer PC board 4164, contained between the upper and lower portions of the engine housing 4165A and 4165B; an IFD (i.e. camera) subsystem 4166 mounted on the optical bench, and including area CCD image detection array 4156 contained within a light-box 4167 provided with image formation optics 4168, through which light collected from the illuminated object along the 3-D field of view (FOV) 4155 is permitted to pass; a pair of PLIMs (i.e. comprising a dual VLD PLIA) 4169A and 4169B mounted on optical bench 4164 on opposite sides of the IFD module, for producing PLIB 4153 within the 3-D FOV 4155; a pair of beam sweeping mechanisms 4170A and 4170B for sweeping the planar laser illumination beam (PLIB) produced from the PLIA across the 3-D FOV; and an optical assembly configured with each PLIM, including a spatial-only liquid crystal display (PO-LCD)type spatial phase modulation panel 4071 and a cylindrical lens array 4172 mounted beyond each PLIM in the named order, providing a despeckling mechanism that operates in accordance with the first generalized method of speckle-pattern noise reduction illustrated in FIGS. 1I8F and 1I8G.

Sixth Illustrative Embodiment of the PLIIM-Based Hand-Supportable Area Imager of the Present Invention Comprising Integrated Speckle-Pattern Noise Subsystem Operated in Accordance With the Second Generalized Method of Speckle-Pattern Noise Reduction Illustrated in FIGS. 1I14A Through 1I14D In FIG. 58A, there is shown a sixth illustrative embodiment of the PLIIM-based hand-supportable area imager of the present invention. As shown, the PLIIM-based imager 4180 comprises: a hand-supportable housing 4181; a PLIIM-based image capture and processing engine 4182 contained therein, for projecting a planar laser illumination beam (PLIB) 4183 through its imaging window 4184 in coplanar relationship with the field of view (FOV) 4185 of the area image detection array 4186 employed in the engine; a LCD display panel 4187 mounted on the upper top surface 4188 of the housing in an integrated manner, for displaying, in a real-time manner, captured images, data being entered into the system, and graphical user interfaces (GUIs) required in the support of various types of information-based transactions; a data entry keypad 4189 mounted on the middle top surface 4190 of the housing, for enabling the user to manually enter data into the imager required during the course of such information-based transactions; and an embedded-type computer and interface board 4191, contained within the housing, for carrying out image processing operations such as, for example, bar code symbol decoding operations, signature image processing operations, optical character recognition (OCR) operations, and the like, in a high-speed manner, as well as enabling a high-speed data communication interface 4192 with a digital communication network 4193, such as a LAN or WAN supporting a networking protocol such as TCP/IP, AppleTalk or the like.

As shown in FIG. 58B, the PLIIM-based image capture and processing engine 4182 comprises: an optical-bench/multi-layer PC board 4194, contained between the upper and lower portions of the engine housing 4195A and 4195B; an IFD (i.e. camera) subsystem 4196 mounted on the optical bench, and including an area CCD image detection array 4186 contained within a light-box 4197 provided with image formation optics 4198, through which light collected from the illuminated object along 3-D field of view (FOV) 4185 is permitted to pass; a pair of PLIMs (i.e. comprising a dual VLD PLIA) 4199A and 4199B mounted on optical bench 4194 on opposite sides of the IFD module, for producing PLIB 4193 within the 3-D FOV 4195; a pair of beam sweeping mechanisms 4200A and 4200B for sweeping the planar laser illumination beam (PLIB) produced from the PLIA across the 3-D FOV; and an optical assembly configured with each PLIM, including a high-speed optical shutter panel 4201 and a cylindrical lens array 4202 mounted before each PLIM, to provide a despeckling mechanism that operates in accordance with the second generalized method of speckle-pattern noise reduction illustrated in FIGS. 1I14A and 1I14B.

Seventh Illustrative Embodiment of the PLIIM-Based Hand-Supportable Area Imager of the Present Invention Comprising Integrated Speckle-Pattern Noise Subsystem Operated in Accordance With the Second Generalized Method of Speckle-Pattern Noise Reduction Illustrated in FIGS. 1I15A and 1I15B In FIG. 59A, there is shown a seventh illustrative embodiment of the PLIIM-based hand-supportable area imager of the present invention. As shown, the PLIIM-based imager 4210 comprises: a hand-supportable housing 4211; a PLIIM-based image capture and processing engine 4212 contained therein, for projecting a planar laser illumination beam (PLIB) 4213 through its imaging window 4214 in coplanar relationship with the field of view (FOV) 4215 of the area image detection array 4216 employed in the engine; a LCD display panel 4217 mounted on the upper top surface 4218 of the housing in an integrated manner, for displaying, in a real-time manner, captured images, data being entered into the system, and graphical user interfaces (GUIs) required in the support of various types of information-based transactions; a data entry keypad 4219 mounted on the middle top surface 4220 of the housing, for enabling the user to manually enter data into the imager required during the course of such information-based transactions; and an embedded-type computer and interface board 4221, contained within the housing, for carrying out image processing operations such as, for example, bar code symbol decoding operations, signature image processing operations, optical character recognition (OCR) operations, and the like, in a high-speed manner, as well as enabling a high-speed data communication interface 4222 with a digital communication network 4223, such as a LAN or WAN supporting a networking protocol such as TCP/IP, AppleTalk or the like.

As shown in FIG. 59B, the PLIIM-based image capture and processing engine 4212 comprises: an optical-bench/multi-layer PC board 4224, contained between the upper and lower portions of the engine housing 4225A and 4225B; an IFD (i.e. camera) subsystem 4226 mounted on the optical bench, and including an area CCD image detection array 4216 contained within a light-box 4227 provided with image formation optics 4228, through which light collected from the illuminated object along the 3-D field of view (FOV) 4215 is permitted to pass; a pair of PLIMs (i.e. comprising a dual VLD PLIA) 4229A and 4229B mounted on optical bench 4224 on opposite sides of the IFD module, for producing a PLIB within the 3-D FOV 4215; a pair of beam sweeping mechanisms 4230A and 4230B for sweeping the planar laser illumination beam (PLIB) produced from the PLIA across the 3-D FOV; and an optical assembly configured with each PLIM, including a visible mode locked laser diode (MLLD) 4231 within each PLIM and a cylindrical lens array 4232 after each PLIM, to provide a despeckling mechanism that operates in accordance with the second generalized method of speckle-pattern noise reduction illustrated in FIGS. 1I14A and 1I14B.

Eighth Illustrative Embodiment of the PLIIM-Based Hand-Supportable Area Imager of the Present Invention Comprising Integrated Speckle-Pattern Noise Subsystem Operated in Accordance With the Third Generalized Method of Speckle-Pattern Noise Reduction Illustrated in FIGS. 1I17A and 1I17C In FIG. 60A, there is shown an eighth illustrative embodiment of the PLIIM-based hand-supportable area imager of the present invention. As shown, the PLIIM-based imager 4240 comprises: a hand-supportable housing 4241; a PLIIM-based image capture and processing engine 4242 contained therein, for projecting a planar laser illumination beam (PLIB) 4243 through its imaging window 4244 in coplanar relationship with the field of view (FOV) 4245 of the area image detection array 4246 employed in the engine; a LCD display panel 4247 mounted on the upper top surface 4248 of the housing in an integrated manner, for displaying, in a real-time manner, captured images, data being entered into the system, and graphical user interfaces (GUIs) required in the support of various types of information-based transactions; a data entry keypad 4249 mounted on the middle top surface 4250 of the housing, for enabling the user to manually enter data into the imager required during the course of such information-based transactions; and an embedded-type computer and interface board 4251, contained within the housing, for carrying out image processing operations such as, for example, bar code symbol decoding operations, signature image processing operations, optical character recognition (OCR) operations, and the like, in a high-speed manner, as well as enabling a high-speed data communication interface 4252 with a digital communication network 4253, such as a LAN or WAN supporting a networking protocol such as TCP/IP, AppleTalk or the like.

As shown in FIG. 60B, the PLIIM-based image capture and processing engine 4242 comprises: an optical-bench/multi-layer PC board 4253, contained between the upper and lower portions of the engine housing 4255A and 4255B; an IFD (i.e. camera) subsystem 4256 mounted on the optical bench, and including an area CCD image detection array 4246 contained within a light-box 4257 provided with image formation optics 4258, through which light collected from the illuminated object along the 3-D field of view (FOV) 4245 is permitted to pass; a pair of PLIMs (i.e. comprising a dual VLD PLIA) 4259A and 4259B mounted on optical bench 4254 on opposite sides of the IFD module, for producing the 4253 PLIB within the 3-D FOV 4245; a pair of beam sweeping mechanisms 4260A and 4260B for sweeping the planar laser illumination beam (PLIB) produced from the PLIA across the 3-D FOV; and an optical assembly configured with each PLIM, including an electrically-passive optically-resonant cavity (i.e. etalon) 4261 mounted external to each VLD and a cylindrical lens array 4262 mounted beyond the PLIM, to provide a despeckling mechanism that operates in accordance with the third generalized method of speckle-pattern noise reduction illustrated in FIGS. 1I17A and 1I17B.

Ninth Illustrative Embodiment of the PLIIM-Based Hand-Supportable Area Imager of the Present Invention Comprising Integrated Speckle-Pattern Noise Subsystem Operated in Accordance With the Fourth Generalized Method of Speckle-Pattern Noise Reduction Illustrated in FIGS. 1I19A and 1I19B In FIG. 61A, there is shown a ninth illustrative embodiment of the PLIIM-based hand-supportable area imager of the present invention. As shown, the PLIIM-based imager 4290 comprises: a hand-supportable housing 4291; a PLIIM-based image capture and processing engine 4292 contained therein, for projecting a planar laser illumination beam (PLIB) 4293 through its imaging window 4294 in coplanar relationship with the field of view (FOV) 4295 of the area image detection array 4296 employed in the engine; a LCD display panel 4297 mounted on the upper top surface 4298 of the housing in an integrated manner, for displaying, in a real-time manner, captured images, data being entered into the system, and graphical user interfaces (GUIs) required in the support of various types of information-based transactions; a data entry keypad 4299 mounted on the middle top surface 4300 of the housing, for enabling the user to manually enter data into the imager required during the course of such information-based transactions; and an embedded-type computer and interface board 4301, contained within the housing, for carrying out image processing operations such as, for example, bar code symbol decoding operations, signature image processing operations, optical character recognition (OCR) operations, and the like, in a high-speed manner, as well as enabling a high-speed data communication interface 4302 with a digital communication network 4303, such as a LAN or WAN supporting a networking protocol such as TCP/IP, AppleTalk or the like.

As shown in FIG. 61B, the PLIIM-based image capture and processing engine 4292 comprises: an optical-bench/multi-layer PC board 4304, contained between the upper and lower portions of the engine housing 4305A and 4305B; an IFD module (i.e. camera subsystem) 4306 mounted on the optical bench, and including an area CCD image detection array 4296 contained within a light-box 4307 provided with image formation optics 4308, through which light collected from the illuminated object along a 3-D field of view (FOV) is permitted to pass; a pair of PLIMs (i.e. comprising a dual VLD PLIA) 4309A and 4309B mounted on optical bench 4304 on opposite sides of the IFD module, for producing a PLIB within the 3-D FOV; a pair of beam sweeping mechanisms 4310A and 4310B for sweeping the planar laser illumination beam produced from the PLIA across the 3-D FOV; and an optical assembly configured with each PLIM, including mode-hopping VLD drive circuitry 4311 associated with the driver circuit of each VLD, and a cylindrical lens array 4312 mounted before each PLIM, to provide a despeckling mechanism that operates in accordance with the fourth generalized method of speckle-pattern noise reduction illustrated in FIGS. 1I19A and 1I19B.

Tenth Illustrative Embodiment of the PLIIM-Based Hand-Supportable Area Imager of the Present Invention Comprising Integrated Speckle-Pattern Noise Subsystem Operated in Accordance With the Fifth Generalized Method of Speckle-Pattern Noise Reduction Illustrated in FIGS. 1I21A Through 1I21D In FIG. 62A, there is shown a tenth illustrative embodiment of the PLIIM-based hand-supportable area imager of the present invention. As shown, the PLIIM-based imager 4320 comprises: a hand-supportable housing 4320; a PLIIM-based image capture and processing engine 4322 contained therein, for projecting a planar laser illumination beam (PLIB) 4323 through its imaging window 4324 in coplanar relationship with the field of view (FOV) 4325 of the area image detection array 4326 employed in the engine; a LCD display panel 4327 mounted on the upper top surface 4328 of the housing in an integrated manner, for displaying, in a real-time manner, captured images, data being entered into the system, and graphical user interfaces (GUIs) required in the support of various types of information-based transactions; a data entry keypad 4329 mounted on the middle top surface 4330 of the housing, for enabling the user to manually enter data into the imager required during the course of such information-based transactions; and an embedded-type computer and interface board 4331, contained within the housing, for carrying out image processing operations such as, for example, bar code symbol decoding operations, signature image processing operations, optical character recognition (OCR) operations, and the like, in a high-speed manner, as well as enabling a high-speed data communication interface 4332 with a digital communication network 4333, such as a LAN or WAN supporting a networking protocol such as TCP/IP, AppleTalk or the like.

As shown in FIG. 62B, the PLIIM-based image capture and processing engine 4322 comprises: an optical-bench/multi-layer PC board 4334, contained between the upper and lower portions of the engine housing 4335A and 4335B; an IFD (i.e. camera) subsystem 4336 mounted on the optical bench, and including area CCD image detection array 4326 contained within a light-box 4337 provided with image formation optics 4338, through which light collected from the illuminated object along the 3-D field of view (FOV) 4325 is permitted to pass; a pair of PLIMs (i.e. comprising a dual VLD PLIA) 4339A and 4339B mounted on optical bench 4334 on opposite sides of the IFD module, for producing the PLIB 4323 within the 3-D FOV 4325; a pair of beam sweeping mechanisms 4340A and 4340B for sweeping the planar laser illumination beam (PLIB) produced from the PLIA across the 3-D FOV; and an optical assembly configured with each PLIM, including a micro-oscillating spatial intensity modulation panel 4341 and a cylindrical lens array 4341 mounted beyond the PLIM in the named order, to provide a despeckling mechanism that operates in accordance with the fifth generalized method of speckle-pattern noise reduction illustrated in FIGS. 1I21A through 1I21D.

In an alternative embodiment, micro-oscillating spatial intensity modulation panel 4541 can be replaced by a high-speed electro-optically controlled spatial intensity modulation panel designed to modulate the spatial intensity of the transmitted PLIB and generate a spatial coherence-reduced PLIB for illuminating target objects in accordance with the present invention.

Eleventh Illustrative Embodiment of the PLIIM-Based Hand-Supportable Area Imager of the Present Invention Comprising Integrated Speckle-Pattern Noise Subsystem Operated in Accordance With the Sixth Generalized Method of Speckle-Pattern Noise Reduction Illustrated in FIGS. 1I22 through 1I23B In FIG. 63A, there is shown an eleventh illustrative embodiment of the PLIIM-based hand-supportable area imager of the present invention. As shown, the PLIIM-based imager 4350 comprises: a hand-supportable housing 4351; a PLIIM-based image capture and processing engine 4352 contained therein, for projecting a planar laser illumination beam (PLIB) 4353 through its imaging window 4354 in coplanar relationship with the field of view (FOV) 4355 of the area image detection array 4356 employed in the engine; a LCD display panel 4357 mounted on the upper top surface 4358 of the housing in an integrated manner, for displaying, in a real-time manner, captured images, data being entered into the system, and graphical user interfaces (GUIs) required in the support of various types of information-based transactions; a data entry keypad 4359 mounted on the middle top surface 4360 of the housing, for enabling the user to manually enter data into the imager required during the course of such information-based transactions; and an embedded-type computer and interface board 4361, contained within the housing, for carrying out image processing operations such as, for example, bar code symbol decoding operations, signature image processing operations, optical character recognition (OCR) operations, and the like, in a high-speed manner, as well as enabling a high-speed data communication interface 4362 with a digital communication network 4363, such as a LAN or WAN supporting a networking protocol such as TCP/IP, AppleTalk or the like.

As shown in FIG. 63B, the PLIIM-based image capture and processing engine 4352 comprises: an optical-bench/multi-layer PC board 4364, contained between the upper and lower portions of the engine housing 4365A and 4365B; an IFD (i.e. camera) subsystem 4366 mounted on the optical bench, and including area CCD image detection array 4356 contained within a light-box 4367 provided with image formation optics 4368, through which light collected from the illuminated object alone the 3-D field of view (FOV) 4355 is permitted to pass; a pair of PLIMs (i.e. comprising a dual VLD PLIA) 4369A and 4369B mounted on optical bench 4364 on opposite sides of the IFD module, for producing the PLIB 4353 within the 3-D FOV 4355; a cylindrical lens array 4370 mounted before each PLIM; a pair of beam sweeping mechanisms 4371A and 4371B for sweeping the planar laser illumination beam (PLIB) produced from the PLIA across the 3-D FOV; and an optical assembly configured with the IFD module 4366, including an electro-optical or mechanically rotating aperture (i.e. iris) 4372 disposed before the entrance pupil of the IFD module, to provide a despeckling mechanism that operates in accordance with the sixth generalized method of speckle-pattern noise reduction illustrated in FIGS. 1I22 through 1I23B.

Twelfth Illustrative Embodiment of the PLIIM-Based Hand-Supportable Area Imager of the Present Invention Comprising Integrated Speckle-Pattern Noise Subsystem Operated in Accordance With the Seventh Generalized Method of Speckle-Pattern Noise Reduction Illustrated in FIGS. 1I24 Through 1I24C In FIG. 64A, there is shown a twelfth illustrative embodiment of the PLIIM-based hand-supportable area imager of the present invention. As shown, the PLIIM-based imager 4380 comprises: a hand-supportable housing 4381; a PLIIM-based image capture and processing engine 4382 contained therein, for projecting a planar laser illumination beam (PLIB) 4383 through its imaging window 4384 in coplanar relationship with the field of view (FOV) 4385 of the area image detection array 4386 employed in the engine; a LCD display panel 4387 mounted on the upper top surface 4388 of the housing in an integrated manner, for displaying, in a real-time manner, captured images, data being entered into the system, and graphical user interfaces (GUIs) required in the support of various types of information-based transactions; a data entry keypad 4389 mounted on the middle top surface 4390 of the housing, for enabling the user to manually enter data into the imager required during the course of such information-based transactions; and an embedded-type computer and interface board 4391, contained within the housing, for carrying out image processing operations such as, for example, bar code symbol decoding operations, signature image processing operations, optical character recognition (OCR) operations, and the like, in a high-speed manner, as well as enabling a high-speed data communication interface 4392 with a digital communication network 4393, such as a LAN or WAN supporting a networking protocol such as TCP/IP, AppleTalk or the like.

As shown in FIG. 64B, the PLIIM-based image capture and processing engine 4382 comprises: an optical-bench/multi-layer PC board 4394, contained between the upper and lower portions of the engine housing 4395A and 4395B; an IFD (i.e. camera) subsystem 4396 mounted on the optical bench, and including area CCD image detection array 4386 contained within a light-box 4397 provided with image formation optics 4398, through which light collected from the illuminated object along the 3-D field of view (FOV) 4385 is permitted to pass; a pair of PLIMs (i.e. comprising a dual VLD PLIA) 4399A and 4399B mounted on optical bench 4396 on opposite sides of the IFD module, for producing the PLIB 4383 within the 3-D FOV 4385; a cylindrical lens array 4400 mounted before each PLIM; a pair of beam sweeping mechanisms 4401A and 4401B for sweeping the planar laser illumination beam (PLIB) produced from the PLIA across the 3-D FOV; and an optical assembly configured with each IFD module, including a high-speed electro-optical shutter 4402 disposed before the entrance pupil thereof, which provides a despeckling mechanism that operates in accordance with the seventh generalized method of speckle-pattern noise reduction illustrated in FIGS. 1I24 through 1I24C.

LED-Based PLIMS of the Present Invention for Producing Spatially-Incoherent Planar Light Illumination Beams (PLIBs) for Use in PLIIM-Based Systems In the numerous illustrative embodiments described above, the planar light illumination beam (PLIB) is generated by laser based devices including, but not limited to VLDs. In long-range type PLIIM systems, laser diodes are preferred over light emitting diodes (LEDs) for producing planar light illumination beams (PLIBs), as such devices can be most easily focused over long focal distances (e.g. from 12 inches or so to 6 feet and beyond). When using laser illumination devices in imaging systems, there will typically be a need to reduce the coherence of the laser illumination beam in order that the RMS power of speckle-pattern noise patterns can be effectively reduced at the image detection array of the PLIIM system. In short-range type imaging applications having relatively short focal distances (e.g. less than 12 inches or so), it may be feasible to use LED-based illumination devices to produce PLIBs for use in diverse imaging applications. In such short-range imaging applications, LED-based planar light illumination devices should offer several advantages, namely: (1) no need for despeckling mechanisms as often required when using laser-based planar light illumination devices; and (2) the ability to produce color images when using white (i.e. broad-band) LEDs.

Referring to FIGS. 65A through 67C, three exemplary designs for LED-based PLIMs will be described in detail below. Each of these PLIM designs can be used in lieu of the VLD-based PLIMs disclosed hereinabove and incorporated into the various types of PLIIM-based systems of the present invention to produce numerous planar light illumination and imaging (PLIIM) systems which fall within the scope and spirit of the present invention disclosed herein. It is understood, however, that to due focusing limitations associated with LED-based PLIMs of the present invention, LED-based PLIMs are expected to more practical uses in short-range type imaging applications, than in long-range type imaging applications.

In FIG. 65A, there is shown a first illustrative embodiment of an LED-based PLIM 4500 for use in PLIIM-based systems having short working distances. As shown, the LED-based PLIM 4500 comprises: a light emitting diode (LED) 4501, realized on a semiconductor substrate 4502, and having a small and narrow (as possible) light emitting surface region 4503 (i.e. light emitting source); a focusing lens 4504 for focusing a reduced size image of the light emitting source 4503 to its focal point, which typically will be set by the maximum working distance of the system in which the PLIM is to be used; and a cylindrical lens element 4505 beyond the focusing lens 4504, for diverging or spreading out the light rays of the focused light beam along a planar extent to produce a spatially-incoherent planar light illumination beam (PLIB) 4506, while the height of the PLIB is determined by the focusing operations achieved by the focusing lens 4505; and a compact barrel or like structure 4507, for containing and maintaining the above described optical components in optical alignment, as an integrated optical assembly.

Preferably, the focusing lens 4504 used in LED-based PLIM 4500 is characterized by a large numerical aperture (i.e. a large lens having a small F #), and the distance between the light emitting source and the focusing lens is made as large as possible to maximize the collection of the largest percentage of light rays emitted therefrom, within the spatial constraints allowed by the particular design. Also, the distance between the cylindrical lens 4505 and the focusing lens 4504 should be selected so that beam spot at the point of entry into the cylindrical lens 4505 is sufficiently narrow in comparison to the width dimension of the cylindrical lens. Preferably, flat-top LEDs are used to construct the LED-based PLIM of the present invention, as this sort of optical device will produce a collimated light beam enabling a smaller focusing lens to be used without loss of optical power. The spectral composition of the LED 4501 can be associated with any or all of the colors in the visible spectrum, including “white” type light which is useful in producing color images in diverse applications in both the technical and fine arts.

The optical process carried out within the LED-based PLIM of FIG. 65A is illustrated in greater detail in FIG. 65B. As shown, the focusing lens 4504 focuses a reduced size image of the light emitting source of the LED 4501 towards the farthest working distance in the PLIIM-based system. The light rays associated with the reduced-sized image are transmitted through the cylindrical lens element 4505 to produce the spatially-incoherent planar light illumination beam (PLIB) 4506, as shown.

In FIG. 66A, there is shown a second illustrative embodiment of an LED-based PLIM 4510 for use in PLIIM-based systems having short working distances. As shown, the LED-based PLIM 4510 comprises: a light emitting diode (LED) 4511 having a small and narrow (as possible) light emitting surface region 4512 (i.e. light emitting source) realized on a semiconductor substrate 4513; a focusing lens 4514 (having a relatively short focal distance) for focusing a reduced size image of the light emitting source 4512 to its focal point; a collimating lens 4515 located at about the focal point of the focusing lens 4514, for collimating the light rays associated with the reduced size image of the light emitting source 4512; and a cylindrical lens element 4516 located closely beyond the collimating lens 4515, for diverging the collimated light beam substantially within a planar extent to produce a spatially-incoherent planar light illumination beam (PLIB) 4518; and a compact barrel or like structure 4517, for containing and maintaining the above described optical components in optical alignment, as an integrated optical assembly.

Preferably, the focusing lens 4514 in LED-based PLIM 4510 should be characterized by a large numerical aperture (i.e. a large lens having a small F #), and the distance between the light emitting source and the focusing lens be as large as possible to maximize the collection of the largest percentage of light rays emitted therefrom, within the spatial constraints allowed by the particular design. Preferably, flat-top LEDs are used to construct the PLIM of the present invention, as this sort of optical device will produce a collimated light beam, enabling a smaller focusing lens to be used without loss of optical power. The distance between the collimating lens 4515 and the focusing lens 4513 will be as close as possible to enable collimation of the light rays associated with the reduced size image of the light emitting source 4512. The spectral composition of the LED can be associated with any or all of the colors in the visible spectrum, including "white" type light which is useful in producing color images in diverse applications.

The optical process carried out within the LED-based PLIM of FIG. 66A is illustrated in greater detail in FIG. 66B. As shown, the focusing lens 4514 focuses a reduced size image of the light emitting source of the LED 4512 towards a focal point at about which the collimating tens is located. The light rays associated with the reduced-sized image are collimated by the collimating lens 4515 and then transmitted through the cylindrical lens element 4516 to produce a spatially-incoherent planar light illumination beam (PLIB), as shown.

Planar Light Illumination Array (PLIA) of the Present Invention Employing Micro-Optical Lenslet Array Stack Integrated to an LED Array Substrate Contained Within a Semiconductor Package Having a Light Transmission Window Through Which a Spatially-Incoherent Planar Light Illumination Beam (PLIB) is Transmitted In FIGS. 67A through 67C, there is shown a third illustrative embodiment of an LED-based PLIM 4600 for use in PLIIM-based systems of the present invention. As shown, the LED-based PLIM 4600 is realized as an array of components employed in the design of FIGS. 66A and 66B, contained within a miniature IC package, namely: a linear-type light emitting diode (LED) array 4601, on a semiconductor substrate 4602, providing a linear array of light emitting sources 4603 (having the narrowest size and dimension possible); a focusing-type microlens array 4604, mounted above and in spatial registration with the LED array 4601, providing a focusing-type lenslet 4604A above and in registration with each light emitting source, and projecting a reduced image of the light emitting source 4605 at its focal point above the LED array; a collimating-type microlens array 4607, mounted above and in spatial registration with the focusing-type microlens array 4604, providing each focusing lenslet with a collimating-type lenslet 4607A for collimating the light rays associated with the reduced image of each light emitting device; and a cylindrical-type microlens array 4608, mounted above and in spatial registration with the collimating-type micro-lens array 4607, providing each collimating lenslet with a linear-diverging type lenslet 4608A for producing a spatially-incoherent planar light illumination beam (PLIB) component 4611 from each light emitting source; and an IC package 4609 containing the above-described components in the stacked order described above, and having a light transmission window 4610 through which the spatially-incoherent PLIB 4611 is transmitted towards the target object being illuminated. The above-described IC chip can be readily manufactured using manufacturing techniques known in the micro-optical and semiconductor arts.

Notably, the LED-based PLIM 4500 illustrated in FIGS. 65A and 65B can also be realized within an IC package design employing a stacked microlens array structure as described above, to provide yet another illustrative embodiment of the present invention. In this alternative embodiment of the present invention, the following components will be realized within a miniature IC package, namely: a light emitting diode (LED) providing a light emitting source (having the narrowest size and dimension possible) on a semiconductor substrate; focusing lenslet, mounted above and in spatial registration with the light emitting source, for projecting a reduced image of the light emitting source at its focal point, which is preferably set by the further working distance required by the application at hand; a cylindrical-type microlens, mounted above and in spatial registration with the collimating-type microlens, for producing a spatially-incoherent planar light illumination beam (PLIB) from the light emitting source; and an IC package containing the above-described components in the stacked order described above, and having a light transmission window through which the composite spatially-incoherent PLIB is transmitted towards the target object being illuminated.

First Illustrative Embodiment of the Airport Security System of the Present Invention Including (i) Passenger Check-In Stations Employing Biometric-Based Passenger Identification Subsystems, (ii) Baggage Check-In Stations Employing X-Ray Baggage Scanning Subsystems Cooperating With Baggage Identification and Attribute Acquisition Subsystems, and (iii) an Internetworked Passenger and Baggage RDBMS Sophisticated types of screening and detection technology, based on advanced principles of applied science, have been developed to help secure airports, train stations and terminals, bus terminals, seaports and other passenger and cargo transportation terminals. Examples of such detection and inspection equipment include, for example, metal detectors, x-ray scanners, neutron beam detectors (e.g. thermal neutron analysis TNA, pulsed fast neutron analysis PFNA), as well as electromagnetic sensing techniques based on magnetic resonance analysis (MRA) or Quadrupole Resonance Analysis (QRA).

Prior art passenger, baggage, parcel and cargo screening (e.g. detection and inspection) systems have a great deal in common. Typically, each prior art security screening system collects raw data about the contents of the object in question, analyzes the raw data collected by the system, and then presents some form of information upon which a human operator or machine is enabled to make a decision (e.g. permit a particular passenger to board a particular aircraft, permit a particular item of baggage to be loaded onto a particular aircraft, or permit a particular item of cargo to be loaded on board a particular railcar, ship, or aircraft for transport to a particular destination). In each such security screening system or installation, the "decision" to grant or deny a particular passenger or object authorization to move along a particular course or trajectory along the space-time continuum resides with either a particular person or programmed computing machine, and must be made at a particular point along the space-time continuum, and once permission has been granted for a particular person and/or his or her objects to move along the scheduled course of travel, there typically is little or no opportunity to retract the authorization until a crisis condition has been either created or determined.

In response to the shortcomings and drawbacks associated with prior art security screening systems and methods, and proposals to integrate existing airport security equipment to improve system reliability and performance as disclosed in the October 2000 KPMG Consulting Report entitled "Potential System Integration of Existing Airport Security Equipment" by Paul Levelton and Adil Chagani, of KPMG Consulting LP, it is a further object of the present invention to provide improved methods of and systems for security screening at airline terminals, bus terminals, railway terminals, shipping terminals, marine terminals, and the like. For purpose of illustration only, such methods and systems of the present invention, depicted in FIGS. 68A through 69B2, will be illustrated in the context of an airline terminal (i.e. airport) environment, in order to improve security screening performance therein.

In FIGS. 68A through 68B, there is shown a first illustrative embodiment of the airport security system of the present invention, indicated by reference numeral 2600. While this system is shown installed in an airport, it is understood that it can be installed in any passenger transportation terminal (e.g. railway terminal, bus terminal, marine terminal and the like).

As shown in FIG. 68A, the first illustrative embodiment of the airport security system 2630 comprises a number of primary system components, namely: (i) a Passenger Screening Station or Subsystem 2631; (ii) a Baggage Screening Station or Subsystem 2632; (iii) a Passenger And Baggage Attribute RDBMS 2633; and (iv) one or more Automated Data Processing Subsystems 2634 for operating on co-indexed passenger and baggage data captured by subsystems 2631 and 2632 and stored in the Passenger and Baggage Attribute RDBMS 2633, in order to detect possible breaches of security during and after the screening of passengers and baggage within an airport or like terminal system.

As shown in FIG. 68A, the passenger screening subsystem 2631 comprises: (1) a PID/BID bar code symbol dispensing subsystem 2635 for dispensing a passenger identification (PID) bar code symbols and baggage identification (BID) bar code symbols to passengers; (2) a smart-type passenger identification card reader 2675 for reading a smart ID card 2676 having an IC chip supported thereon, as well as a magstripe, and a 2-D bar code symbol (e.g. commercially available from ActivCard, Inc., http://www.activcard.com); (3) a passenger face and body profiling and identification subsystem (i.e. 3-D digitizer) 2645; (4) one or more hand-held PLIIM-based imagers 2636; (5) a retinal (and/or iris) scanner 2637 and/or other biometric scanner 2638; and (6) a data element linking and tracking computer 2639. The information produced by subsystems, 122, 120, 2637, and 2638 is considered to be "passenger attribute" type data elements. Passenger screening station 2631 may also include a Trace element Detection System (TEDS) integrated into the system, for automatic detection of trace elements on the bodies of passengers during screen operations.

As shown in FIG. 68A, the PID/BID bar code symbol dispensing subsystem 2635 is installed at the passenger check-in or screening station 2631, for the purpose of dispensing (i) a unique PID bar code symbol 2640 and bracelet 2641 to be worn by each passenger checking into the airport system, and (ii) a unique BID bar code label 2642 for attachment to each article of baggage 2643 to be carried aboard the aircraft on which the checked-in passenger will fly (or on another aircraft). Each BID bar code symbol 2642 assigned to a baggage article is co-indexed (in RDBMS 2633) with the PID bar code symbol 2640 assigned to the passenger checking the article of baggage.

As shown in FIG. 68A1, the passenger face and body profiling and identification subsystem 2645, can be realized by a PLIIM subsystem 25, for capturing a digital image of the face, head and upper body of each passenger to board an aircraft at the airport, or by a LDIP subsystem 122 as a 3-D laser scanning digitizer for capturing a digital 3-D profile of the passenger's face and head (and possibly body). As shown, subsystem 2645 is mounted on an adjustable support pole 2646, located adjacent a conventional walk-through metal-detector 2647.

As illustrated in FIG. 68C1, the object identification and attribute information tracking and linking computer 2639 automatically links (i.e. co-indexes) passenger attribute information (i.e. data elements) with the corresponding passenger identification (PID) number which is encoded within the PID bar code symbol 2640 printed on the passenger's identification (PID) bracelet (or badge) 2641.

As shown in FIG. 68A, function of the hand-held PLIIM-based imager 2636 is to capture a digital image of the passenger's identification card(s) 2648. The function of the retinal (and/or iris) scanner 2637 and/or other biometric scanner 2638 is to collect biometric information (e.g. retinal pattern information, fingerprint pattern information, voice pattern information, facial pattern information, and/or DNA pattern information) about the passenger in order to confirm his or her identity. Such object (i.e. passenger) attribute data is linked to corresponding passenger identification data within the object identification and attribute information tracking and linking computer 2639 prior to storage of the collected data in the Passenger and Baggage Attribute RDBMS 2633.

As shown in FIG. 68A, the baggage screening station 2632 comprises: an X-radiation baggage scanning subsystem 2650; a conveyor belt structure 2651; and a baggage identification and attribute acquisition system 120B, mounted above the conveyor belt structure 2651, before the entry port of the X-radiation baggage scanning subsystem 2650 (or physically and electrically integrated therein), for automatically performing the following set of functions: (i) identifying each article of baggage 2643 by reading the baggage identification (BID) bar code symbol 2642 applied thereto at a baggage screening station 2632; (ii) dimensioning (i.e. profiling) the article of baggage and generating baggage profile information within subsystem 120B; (iii) capturing a digital image of each article of baggage; (iv) indexing such baggage image (i.e. attribute) data with the corresponding BID number encoded into the scanned BID bar code symbol; and (v) sending such BID-indexed baggage attribute data elements to the passenger and baggage attribute RDBMS 2633 for storage as a baggage attribute record, as illustrated in FIG. 68B. Notably, subsystem 120B performs a "baggage identify tagging" function, wherein each baggage attribute data element is automatically tagged with the baggage identification so that the package attribute data can be stored in the RDBMS 2633 in a way that is related in the RDBMS to other baggage articles and the corresponding passenger carrying the same on board a particular scheduled flight.

As shown in FIG. 68A, the baggage screening station 2632 further comprises a PFNA, MRI and QRA scanning subsystem 2660 installed slightly downstream from the x-ray scanning subsystem 2650, with an object identification and attribute acquisition subsystem 120B integrated therein, for automatically scanning each BID bar coded article of baggage prior to screening, and producing visible digital images corresponding to the interior and contents of each baggage article using either PFNA, MRI and/or QRA techniques well known in the bagging screening arts. Such scanning subsystems 2660 can be used to detect the presence of explosive materials, biological weapons (e.g. Anthrax spores), chemical agents, and the like within articles of baggage screened by the subsystem. Baggage screen station 2632 may also include a Trace Element Detection System (TEDS), integrated into the system, for automatic detection of trace elements in or on baggage during screening.

As shown in FIG. 68A, the Passenger And Baggage Attribute RDBMS 2633 is operably connected to the PLIIM-based passenger identification and profiling camera subsystem 120A, the baggage identification (BID) bar code symbol dispensing subsystem 2635, the object identification and attribute acquisition subsystem 120 integrated with the x-ray scanning subsystem 2650, the object identification and attribute acquisition subsystem 120B integrated with the EDS 2660 downstream from the x-ray screening subsystem 2650, the data element queuing, handling and processing (i.e. linking) computer 2639, and the baggage screening subsystem 2632. As illustrated in FIG. 68B, the primary function of RDBMS 2633 is to maintain co-indexed (i.e. correlated) records on (i) passenger identity and attribute information, (ii) baggage identity and attribute information, and (iii) between passenger identity and baggage identity information acquired and managed by the system.

The primary function of each Automated Data Processing Subsystems 2634 is to process passenger and baggage attribute records (e.g. text files, image files, voice files, etc.) maintained in the Passenger and Baggage RDBMS 2633. In the illustrative embodiment, each Data Processing System 2634 is programmed to automatically mine and detect suspect conditions in the information records in the RDBMS 2633, and in one or more remote RDBMSs 2670 in communication with the Data Processing Subsystem 2634 via the Internet 2671. Upon the detection for alarm or security breach (e.g. explosive devices, identify suspect passengers linked to criminal activity, etc.), the Data Processing Subsystem 2634 automatically generates a signal which is transmitted to one or more security breach alarm subsystems 2672 which, respond to the generated signals, and issue alarms to security personnel 2673 and/or other subsystems 2674 designed to respond to possible security breach conditions during and after passengers and baggage are checked into the airport terminal system.

In the illustrative embodiment, the PID number encoded into each PID bar code symbol assigned to each passenger encodes a unique passenger identification number. Preferably, this number is also encoded within each BID bar code symbol 2607 affixed to the baggage articles carried by the passenger. The PID and BID bar code symbols may be constructed from 1-D or 2-D bar code symbologies. It is also understood that diverse kinds of numbering systems may be used in the system with acceptable results.

In FIG. 68A1, the passenger face and body profiling and identification subsystem 2645 and retinal (and/or iris) scanner 2637 and/or other biometric scanner 2638 are illustrated in greater detail. As shown, PLIIM-based subsystem 25' can be used to acquire high-resolution face and 3-D body profiles, alongside of a conventional a metal-detection subsystem 2647 employed at the passenger screening station 2631 shown in FIG. 68A. Alternatively, just the LDIP subsystem 122 can be used as a 3-D digitizer to acquire 3-D profiles of each passenger's face, head and upper body during the passenger screening process. 3-D images captured by such subsystems are automatically tagged (co-indexed) with the PID number of the passenger whose face has been scanned, by virtue of the operation of the data element queuing, handling and processing (i.e. linking) computer 2639 into which the output of such subsystems feed, as shown in FIG. 68A. When using PLIIM-based subsystem 120 to perform facial scanning, data elements associated with the PID number obtained by first reading the passenger's identification card (e.g. drivers license, etc.) can be automatically linked to the data elements associated with passenger's facial image prior to transmission of such data to the RDBMS 2633. When using the LDIP subsystem 122 by itself for facial profiling, the data element queuing, handling and processing (i.e. linking) computer 2639 will perform the data tracking and linking function which the data element queuing, handling and processing subsystem 131 in the PLIIM-based subsystem 120 otherwise performs.

In FIG. 68B, there is shown an exemplary passenger and baggage database record 2680 which is created and maintained by the airport security system 2630 of FIG. 68A. Notably, for each passenger boarding a scheduled flight, PID-indexed information attributes 2681 are stored in Passenger and Baggage Attribute RDBMS 2633 with BID-indexed information attributes 2682 linked to the PID-indexed information attributes 2681 associated with the passenger carrying on the baggage articles.

FIG. 68CA1 illustrates the structure and function of the object identification and attribute information tracking and linking computer 2639 employed at the passenger screening subsystem 2631 of the illustrative embodiment, shown in FIG. 68A. As shown, a Passenger-ID (PID) index is automatically attached to each passenger attribute data element generated at the passenger screening subsystem of FIG. 68A.

FIG. 68C2 illustrates the structure and function of the data element queuing, handling and processing subsystem 131 in each object identification and attribute acquisition system 120 employed at the baggage screening station 2632 shown in FIG. 68A. As shown, a Baggage-ID (BID) index is automatically attached to each baggage attribute data element generated at the baggage screening subsystem of FIG. 68A.

Operation of the airport security system 2630 will be described in detail below with reference to the flow chart set forth in FIGS. 68C1 through 68C3.

As indicated at Block A in FIG. 68D1, each passenger who is about to board an aircraft at an airport, would first go to the passenger check-in screening station 2631 with personal identification (e.g. passport, driver's license, etc.) in hand as well as articles of baggage to be carried on the aircraft by the passenger.

As indicated at Block B in FIG. 68D1, upon checking in with this station 2631, the PID/BID bar code symbol dispensing subsystem 2635 issues: (1) a passenger identification device (e.g. bracelet, badge, pin, card, tag or other identification device) 2641 bearing (or encoded with) a PID number, a PID-encoded bar code symbol 2640, and/or a photographic image of the passenger, a smart identification card 2676, and possibly some other form of secure identity authentication (e.g. PDF417 bar code symbol encoded using Authx™ identity software by Authx, Inc., http://www.authx.com); and (2) a corresponding BID number or BID-encoded bar code symbol 2642 for attachment to each item of baggage to be carried on the aircraft by the passenger. Notable, the passenger identification device 2641 may serve as a boarding pass. At the same time, subsystem 2635 creates a passenger/baggage information record in the Passenger and Baggage Attribute RDBMS 2633 for each passenger and set of baggage being checked into the airport security system.

As indicated at Block C in FIG. 68D1, the passenger identification (PID) bracelet or badge 2641 is affixed to the passenger's person (e.g. wrist) at the passenger check-in station 2631 which is to be worn during the entire duration of the passenger's scheduled flight.

As indicated at Block D in FIG. 68D1, the PLIIM-based passenger identification and profiling camera subsystem 120 described in detail hereinabove automatically captures: (i) a digital image of the passenger's face, head and upper body; (ii) a digital profile of his or her face and head (and possibly body) using the LDIP subsystem 122 employed therein; and (iii) a digital image of the passenger's identification card(s) 2648, 2676. Optionally at Block D, additional biometric information about each passenger (e.g. retinal pattern, fingerprint pattern, voice pattern, facial pattern, DNA pattern) may be acquired at the passenger check-in station using dedicated biometric information acquisition devices 2637, 2638, representing additional passenger attribute information which can assist in the automated identification of the passenger checking-into the airport security system.

As indicated at Block E in FIG. 68D1, each such item of passenger attribute information collected at the passenger screening station 2631 is (i) co-indexed with the corresponding passenger identification (PID) number encoded within the passenger's PID No. (by data element queuing, handling and processing/linking computer 2639) and (ii) stored in the Passenger and Baggage RDBMS 2633 via the package-switched digital data communications network supporting the security system of the present invention.

As indicated at Block F in FIG. 68D2, each BID-encoded article of baggage is transported along the conveyor belt structure under the package identification and attribute acquisition subsystem 120A installed before or at the entry port of the X-radiation baggage scanning subsystem 2650 (or integrated therewith), and then through the X-radiation baggage scanning subsystem 2650. As this scanning process occurs, each BID-encoded article of baggage is automatically identified, imaged, and dimensioned/profiled by subsystem 120A and then imaged by x-radiation scanning subsystem 2650.

As indicated at Block G in FIG. 68D2, the passenger and baggage attribute information items (i.e. image data) generated by each of these subsystems are automatically co-indexed with the PID and BID numbers of the passengers and baggage, respectively, and stored in the Package and Baggage Attribute RDBMS 2633, for subsequent information processing.

As indicated at Block H in FIG. 68D2, each BID bar coded article of baggage is then transported along the conveyor belt structure under another object identification and attribute acquisition subsystem 120B, installed downstream, before or at the entry port of an automated explosive detection subsystem EDS 2660 (or integrated therewithin), and is subsequently conveyed through the EDS 2660 and subjected to an automated explosive detection process.

As indicated at Block I in FIG. 68D2, as this scanning process occurs, each bar coded article of baggage is automatically identified, imaged, and dimensioned/profiled by object identification and attribute acquisition subsystem 120B, and thereafter analyzed by EDS 2660 in a manner known in the baggage explosive detection art. While not shown in FIG. 68A, it is understood that that output port of the EDS 2660 will be connected to a baggage re-routing conveyor structure, along which suspect (e.g. explosive-containing) baggage is diverted either (i) through a second EDS, downstream from the first EDS, for a second level of explosive detection analysis, or (ii) into a protective/armored bomb container which can be carted away for denotation, defusing or other treatment specified by airport security procedures in place at the particular airport installation at hand.

As indicated at Block J in FIG. 68D2, each item of baggage attribute information acquired at each EDS station 2660 is co-indexed with the corresponding baggage identification (BID) number, and stored in the information records maintained in the Passenger and Baggage Attribute RDBMS 2633, for subsequent information processing.

As indicated at Block K in FIG. 68D3, conventional methods of detecting suspicious conditions revealed by x-ray images of baggage are used (e.g. using an x-ray monitor 2684 adjacent the x-ray scanning subsystem 2650), and passengers are authorized to either board the aircraft unless such a condition is detected.

As indicated in FIG. L in FIG. 68D3, in addition, intelligent information processing algorithms running on Data Processing Subsystem 2634 automatically operate on each passenger and baggage attribute record stored in the Passenger and Baggage Attribute RDBMS 2633.

As indicated at Block M in FIG. 68D3, intelligent information processing algorithms running on Data Processing Subsystem 2634 can also access passenger attribute records stored in remote intelligence RDBMS 2670 and be used with passenger and baggage attribute information in the Passenger and Baggage Attribute RBDMS 2633 in order to detect any suspicious conditions which may give concern or alarm about either a particular passenger or article of baggage presenting concern or a breach of security.

As indicated at Block N in FIG. 68D3, such post-check-in information processing operations can also be carried out with human assistance at a remote workstation 2685, if necessary, to determine or re-determine if a breach of security appears to have occurred.

As indicated at Block O in FIG. 68D3, if a security breach is determined prior to flight-time, then the flight related to the suspect passenger and/or baggage might be aborted with the use of security personnel signaled by subsystem. If a security breach is detected after an aircraft has lifted off, then the flight crew and pilot can be informed by radio communication of the detected security concern.

The primary advantages of the airport security system and method of present invention is that it enables passenger and baggage attribute information collected by the system to be further processed after a particular passenger and baggage article has been checked in, using automated information analyzing agents and remote intelligence RDBMS 2670. The digital images and facial profiles collected from each checked-in passenger can be compared against passenger attribute information records previously stored in the RDBMS 2633. Such information processing can be useful in identifying first-time passengers, as well as passengers who are trying to falsify their identity to gain passage aboard a particular flight. Also, in the event that subsequent analysis of baggage attributes reveal a security breach, the digital image and profile information of the particular article of baggage, in addition to its BID number, will be useful in finding and locating the baggage article aboard the aircraft in the event that this is necessary. The intelligent image and information processing algorithms carried out by Data Processing Subsystem 2634 are within the knowledge of those skilled in the art to which the present invention pertains.

Second Illustrative Embodiment of the Airport Security System of the Present Invention Including (i) Passenger Check-In Stations Employing Biometric-Based Passenger Identification Subsystems, (ii) Baggage Check-In Stations Employing Baggage Identification and Attribute Acquisition Subsystems Cooperating with X-Ray Baggage Scanning Subsystems and RFID Tag Readers, and (iii) an Internet-worked Passenger and Baggage RDBMS In FIGS. 69A1 through 69B, there is shown a second illustrative embodiment of the novel airport security system of the present invention, indicated by reference numeral 2690.

As shown in FIG. 69A1 through 69A3, the second illustrative embodiment of the airport security system 2690 comprises a number of primary system components, namely: (i) a Passenger Screening Station or Subsystem 2631; (ii) a Baggage Screening Station or Subsystem 2691; (iii) a Passenger And Baggage Attribute Relational Database Management Subsystems (RDBMS) 2633; and (iv) one or more Automated Data Processing Subsystems 2633 for operating on co-indexed passenger and baggage data captured by subsystems 2631 and 2691 and stored in the Passenger and Baggage Attribute RDBMS 2633, in order to detect possible breaches of security during and after the screening of passengers and baggage within an airport or like terminal system.

As shown in FIG. 69A1 through 69A3, the passenger screening subsystem 2631 comprises: (1) a PID/BID bar code symbol dispensing subsystem 2635 for dispensing a passenger identification (PID) bar code symbols and baggage identification (BID) bar code symbols to passengers; (2) a smart-type passenger identification card reader 2675 for reading a smart ID card 2676 having an IC chip supported thereon, as well as a magstripe, and a 2-D bar code symbol (e.g. commercially available from ActivCard, Inc., http://www.activcard.com); (3) a passenger face and body profiling and identification subsystem (i.e. 3-D digitizer) 2645; (4) one or more hand-held PLIIM-based imagers 2636; (5) a retinal (and/or iris) scanner 2637 and/or other biometric scanner 2638; and (6) a data element linking and tracking computer 2639. The information produced by subsystems, 122, 120, 2637, and 2638 is considered to be "passenger attribute" type data elements. Passenger screening station 2631 may also include a TDS integrated into the system.

As shown in FIG. 69A1 through 69A3, the PID/BID bar code symbol dispensing subsystem 2635 is installed at a passenger check-in or screening station, for the purpose of dispensing (i) a unique PID bar code symbol 2640 and bracelet 2641 to be worn by each passenger checking into the airport system, and (ii) a unique BID bar code label 2642 for attachment to each article of baggage to be carried aboard the aircraft on which the checked-in passenger will fly (or on another aircraft). Each BID bar code symbol 2642 assigned to a baggage article is co-indexed with the PID bar code symbol 2640 assigned to the passenger checking the article of baggage.

As shown in FIG. 69A1 through 69A31, the passenger face and body profiling and identification subsystem 2645, can be realized by a PLIIM subsystem 25, for capturing a digital image of the face, head and upper body of each passenger to board an aircraft at the airport, or by a LDIP subsystem 122 as a 3-D laser scanning digitizer for capturing a digital 3-D profile of the passenger's face and head (and possibly entire body).

As shown in FIG. 69A1 through 69A3, the baggage screening station 2691 comprises: an X-radiation baggage scanning subsystem 2650; a conveyor belt structure 2651; and a package identification and attribute acquisition system 120A and an RDIF-tag based object identification device 2693 mounted above the conveyor belt structure 2651, before the entry port of the X-radiation baggage scanning subsystem 2650 (or physically and electrically integrated therein), for automatically performing the following set of functions: (i) identifying each article of baggage 2643 by reading the baggage identification (BID) bar code symbol 2642 applied thereto at the baggage screening station 2691; (ii) dimensioning (i.e. profiling) the article of baggage and generating baggage profile information; (iii) capturing a digital image of the article of baggage; (iv) indexing such baggage attribute data with the corresponding BID number encoded either into the scanned BID-encoded bar code symbol or the scanned BID-encoded RFID-tag applied to each article of baggage; and (v) sending such BID-indexed baggage attribute data elements to the passenger and baggage attribute RDBMS 2633 for storage as a baggage attribute record, as illustrated in FIG. 68B. Notably, subsystem 120A (which receives RFID-tag reader input) performs a "baggage identify tagging" function, wherein each baggage attribute data element is automatically tagged with the baggage identification so that the package attribute data can be stored in the RDBMS 2633 in a way that is related in the RDBMS to other baggage articles and the corresponding passenger carrying the same on board a particular scheduled flight. As shown, the baggage screening subsystem 2691 further comprises a PFNA, MRI and QRA scanning subsystem 2660 installed slightly downstream from the x-ray scanner 2650, with an object identification and attribute acquisition subsystem 120B integrated therein, for automatically scanning each BID bar coded article of baggage prior to screening, and producing visible digital images corresponding to the interior and contents of each baggage article using either PFNA, MRI and/or QRA well known in the bagging screening arts. Such scanning subsystems 2660 can be used to detect the presence of explosive materials, biological weapons (e.g. Anthrax spores), chemical agents, and the like within articles of baggage screened by the subsystem. Baggage screening station 2691 may also include a TEDS integrated into the system.

As shown in FIG. 69A1 through 69A3, the system further comprises a hand-held RFID-tag reader 2695 with a LCD panel 2695A, keypad 2695B, and a RF interface 2695C providing a wireless communication link to a mobile base station 2696, comprising an RF transmitter 2696A and server 2696B which is operably connected to the LAN in which the RDBMS 2633 is connected. The function of the hand-held REID-tag reader 2695 is to receive instructions from the Data Processing Subsystem 2634 about the identity and attributes of a suspect passenger and/or articles of baggage, and to use the RFID-tag reader 2695 to determine exactly where the baggage resides in the event of there being a need to access the baggage article and remove it from the baggage handling system or aircraft. During operation, the hand-held RFID-tag reader 2695 generates a RF-based interrogation field which interrogates the whereabouts of a particular BID-encoded RFID-tag 2697 (on an article of baggage). This interrogation process is achieved by generating and locally broadcasting a set of RF-harmonic frequencies (from the RFID-tag reader 2697) which correspond to the natural resonant frequencies of the RF-tuned circuits used to create the BID-encoded structure underlying the RFID-tag. When the suspect baggage resides within the interrogation field of the hand-held RFID-tag reader 2695, an audible and/or visual alarm is signaled from the reader, causing the operator to take immediate action and retrieve the RFID-tag article of baggage from either the baggage handling system or a particular aircraft or other vehicle. Also, the LCD panel of the RFID-tag reader 2696 can access and display other types of attribute information maintained in the RDBMS 2633 about the suspect article of baggage.

Operation of the airport security system 2696 will be described in detail below with reference to the flow chart set forth in FIGS. 69B1 through 69B3.

As indicated at Block A in FIG. 69B1, each passenger who is about to board an aircraft at an airport, would first go to passenger check-in screening station 2631 with personal identification (e.g. passport, driver's license, smart ID card 2676, etc.) in hand, as well as articles of baggage to be carried on the aircraft by the passenger.

As indicated at Block B in FIG. 68B1, upon checking in with this station, the PID/BID bar code symbol dispensing subsystem 2635 issues two types of identification structures, namely: (1) a passenger identification device (e.g. bracelet, badge, pin, card, tag or other identification device) 2641 bearing (or encoded with) a PID number or PID-encoded bar code symbol 2640, photographic image of the passenger, and possibly other form of secure identity authenticator (e.g. PDF417 bar code symbol encoded using Authx™ identity software by Authx, Inc., http://www.authx.com); and (2) a corresponding BID number or BID-encoded bar code symbol 2642 for attachment to each item of baggage 2643 to be carried on the aircraft by the passenger. At the same time, subsystem 2635 creates a passenger/baggage information record in the Passenger and Baggage Attribute RDBMS 2633 for each passenger and set of baggage checked into the system.

As indicated at Block C in FIG. 69B1, the PID-encoded bracelet or badge 2640 is affixed to the passenger's person (e.g. wrist) at the passenger check-in screening station 2631 which is to be worn during the entire duration of the passenger's scheduled flight.

As indicated at Block D in FIG. 69B1, the PLIIM-based passenger identification and profiling camera subsystem 120 (or 122) described in detail hereinabove automatically captures: (i) a digital image of the passenger's face, head and upper body; (ii) a digital profile of his or her face and head (and possibly body) using the LDIP subsystem 122 employed therein; and (iii) a digital image of the passenger's identification card(s). Optionally at Block D, additional biometric information about each passenger (e.g. retinal pattern, fingerprint pattern, voice pattern, facial pattern, DNA pattern) may be acquired at the passenger check-in station using dedicated biometric information acquisition devices 2637 and 2638, representing additional passenger attribute information which can assist in the automated identification of passengers checking-into the airport security system.

As indicated at Block E in FIG. 69B1, each such item of passenger attribute information collected at the passenger check-in screening station 2631 is (i) co-indexed with (i.e. linked to) the corresponding PID number encoded within the passenger's PID No. by data element queuing, handling, and processing (i.e. linking) computer 2639, and (ii) stored in the Passenger and Baggage Attribute RDBMS 2633 via the package-switched digital data communications network supporting the security system of the present invention.

As indicated at Block F in FIG. 69B2, each BID bar coded article of baggage is transported alone the conveyor belt structure under the object identification and attribute acquisition subsystem 120A installed before or at the entry port of the X-radiation baggage scanning subsystem 2650 (or integrated therewithin), and then through the X-radiation baggage scanning subsystem 2650. As this scanning process occurs, each bar coded article of baggage is automatically identified, imaged, and dimensioned/profiled by subsystem 120A and thereafter imaged by the x-radiation scanning subsystem 2650 into which subsystem 120 is integrated.

As indicated at Block G in FIG. 69B2, the passenger and baggage attribute information items (i.e. image data) generated by each of these subsystems are automatically linked to (i.e. coindexed with) the PID and BID numbers of the passengers and baggage, respectively, and stored in the Package and Baggage Attribute RDBMS 2633, for subsequent information processing.

As indicated at Block H in FIG. 69B2, each BID-encoded article of baggage is transported along the conveyor belt structure through another object identification and attribute acquisition subsystem 120B installed downstream before the entry port of an automated explosive detection subsystem EDS (or PFNA, MRI or QRA scanning subsystem) 2660 (or integrated therewithin), and is subsequently conveyed through the subsystem 2660 and subjected to an automated material composition analysis for detection of dangerous articles or materials.

As indicated at Block I in FIG. 69B2, as this scanning process occurs, each bar coded article of baggage is automatically identified, imaged, and dimensioned/profiled by object identification and attribute acquisition subsystem 120B, and thereafter analyzed by EDS 2660 in a manner known in the baggage explosive detection art.

As indicated at Block J in FIG. 69B2, each item of baggage attribute information acquired at each EDS station 2660 is co-indexed with (i.e. linked to) the corresponding baggage identification (BID) number acquired by subsystem 120B, and stored in the information records maintained in the Passenger and Baggage Attribute RDBMS 2633, for storage and subsequent information processing.

As indicated at Block K in FIG. 69B3, conventional methods of detecting suspicious conditions revealed by x-ray images of baggage are used (e.g. using an x-ray monitor 2684 adjacent the x-ray scanning subsystem 2660), and passengers are authorized to either board the aircraft unless such a condition is detected.

As indicated in FIG. L in FIG. 69B3, in addition, intelligent information processing algorithms running on Data Processing Subsystem 2634 automatically operate on each passenger and baggage attribute record stored in the Passenger and Baggage Attribute RDBMS 2633.

As indicated at Block M in FIG. 69B3, intelligent information processing algorithms running on Data Processing Subsystem 2634 can also access passenger attribute records stored in remote intelligence RDBMS 2633 and be used with passenger and baggage attribute information in the Passenger and Baggage Attribute RBDMS 2633 in order to detect any suspicious conditions which may give concern or alarm about either a particular passenger or article of baggage presenting concern or a breach of security.

As indicated at Block N in FIG. 69B3, such post-check-in information processing operations can also be carried out with human assistance at a remote workstation 2685, if necessary, to determine or re-determine if a breach of security appears to have occurred.

As indicated at Block O in FIG. 69C3, if a security breach is determined prior to flight-time, then the flight related to the suspect passenger and/or baggage might be aborted with the use of security personnel 2673 signaled by subsystem 2672. If a security breach is detected after an aircraft has lifted off, then the flight crew and pilot can be informed by radio communication of the detected security concern.

The primary advantages of the airport security system and method of present invention is that it enables passenger and baggage attribute information collected by the system to be further processed after a particular passenger and baggage article has been checked in, using automated information analyzing agents and remote intelligence RDBMS 2670. The digital images and facial profiles collected from each checked-in passenger can be compared against passenger attribute information records previously stored in the RDBMS 2633. Such information processing can be useful in identifying first-time passengers, as well as passengers who are trying to falsify their identity to gain passage aboard a particular flight. Also, in the event that subsequent analysis of baggage attributes reveal a security breach, the digital image and profile information of the particular article of baggage, in addition to its BID number, will be useful in finding and locating the baggage article aboard the aircraft using the mobile RFID-tag reader 2695, in the event that this is necessary. The intelligent image and information processing algorithms carried out by Data Processing Subsystem 2634 are within the knowledge of those skilled in the art to which the present invention pertains.

Conventional methods of detecting suspicious conditions revealed by x-ray images of baggage are used (e.g. using an x-ray monitor 2684 adjacent the x-ray scanning subsystem 2660), and passengers are authorized to either board the aircraft unless such a condition is detected. In addition, intelligent information processing algorithms running on Data Processing Subsystem 2634 automatically operate on each passenger and baggage attribute record stored in RDBMS 2633 as well as remote RDBMS 2670 in order to detect any suspicious conditions which may given concern or alarm about either a particular passenger or article of baggage presenting concern or a breach of security. Such post-check-in information processing operations can also be carried out with human assistance, if necessary, to determine if a breach of security appears to have occurred. If a breach is determined prior to flight-time, then the flight related to the suspect passenger and/or baggage might be aborted with the use of security personnel 2673 signaled by subsystem 2672. If a breach is detected after an aircraft has lifted off, then the flight crew and pilot can be informed by radio communication of the detected security concern.

X-Ray Scanning-Tunnel System of the Present Invention Having Integrated Subsystems for Automatically Identifying Objects Transported Therethrough and Automatically Linking Object Identification Information With Object Attribute Information Acquired by the System In FIGS. 70A and 70B, a x-ray scanning-tunnel system 2700 of the present invention is shown comprising: a x-ray scanning machine 2701 having a conveyor belt structure 2701 for transporting objects (e.g. parcels, packages, baggage, etc.) through a tunnel-like housing 2703 provided with an entry port 2704 and an exit port 2705; and a PLIIM-based object identification and attribute acquisition subsystem 120 installed above the conveyor belt structure at the extra port 2704 of the tunnel-like housing, and receiving as object attribute data input, x-ray image data files produced by the x-ray scanning machine 2701 for display, processing and analysis. In accordance with convention, X-ray scanning machine automatically inspects the interior space of objects such as packages, parcels, baggage or the like, by the transmitting one or more bands of x-type electromagnetic radiation through the objects to produce x-ray images of the structure and composition of the scanned objects. These x-ray images are detected using solid-state image detectors and are converted to color-coded digital images for display, analysis and review. Rapiscan Security Products, Inc., http://www.rapiscan.com, makes and sells X-ray scanning equipment which can be used to realize a X-ray based scanning tunnel system of the present invention described above.

Optionally, a RFID-tag reader 2706 is installed at the entry port of the tunnel-like housing in order to automatically read RFID-tags applied to objects being x-ray scanned through the system. The output data port of the RFID-tag reader 2706 is operably connected to the object identity data input port provided on the object identification and attribute acquisition subsystem 120. As such, the object identification and attribute acquisition subsystem 120 is adapted to receive two different sources of object identification information from objects being transported through the x-ray scanning machine 2701, namely bar code symbol based object identity information, and RFID-tag based object identify information. As shown, the Ethernet data communications port of the object identification and attribute acquisition subsystem 120 is connected to the local network (LAN) or wide area network (WAN) 2708 via suitable communications cable, medium or link. In turn, the LAN or WAN 2708 is connected to the infrastructure of the Internet 2709 to which one or more remote intelligence RDBMSs 2710 are operably connected using the TCP/IP protocol.

The arrangement shown in FIGS. 70A and 70B enables the object identification and attribute subsystem 120 to transport linked object identification and attribute data elements to any RDBMS 2710 to which it is networked, for storage and subsequent processing in diverse applications. Object identification and attribute data elements linked by and transported from the object identification and attribute acquisition subsystem 120 can be used in diverse types of intelligence and security related applications.

Pulsed Fast Neutron Analysis (PFNA) Scanning-Tunnel System of the Present Invention Having Integrated Subsystems for Automatically Identifying Objects Transported Therethrough and Automatically Linking Object Identification Information With Object Attribute Information Acquired by the System In FIGS. 71A and 71B, a Pulsed Fast Neutron Analysis (PFNA) scanning-tunnel system 2720 of the present invention is shown comprising: a PFNA scanning machine 2721 having a conveyor belt structure 2722 for transporting objects (e.g. parcels, packages, baggage, etc.) through a tunnel-like housing 2723 provided with an entry port 2724 and an exit port 2725: and a PLIIM-based object identification and attribute acquisition subsystem 120 installed above the conveyor belt structure at the entry port 2724 of the tunnel-like housing, and receiving as object attribute data input, PFNA image data files produced by the PFNA scanning machine 2721 for display, processing and analysis. In accordance with convention, the PFNA scanning machine automatically inspects the interior space of objects such as packages, parcels, baggage or the like, by exposing the same to short pulses of fast neutrons. When the neutrons hit the matter constituting the object, gamma-type electromagnetic radiation is emitted from the object, and gamma detectors located around the inspected object collect elemental electromagnetic signals emitted from the object's contents. An electronic-data acquisition system processes the signals and routes the elemental and spatial data to a computer system that generates elemental images of what material is present in the object. Ancore, Inc. of Santa Clara, Calif., http:// www.ancore.com, makes and sells PFNA scanning equipment which can be used to realize a PFNA-based scanning tunnel system of the present invention described above.

Optionally, a RFID-tag reader 2726 is installed at the entry port of the tunnel-like housing in order to automatically read RFID-tags applied to objects being x-ray scanned through the system. The output data port of the RFID-tag reader 2726 is operably connected to the object identity data input port provided on the object identification and attribute acquisition subsystem 120. As such, the object identification and attribute acquisition subsystem 120 is adapted to receive two different sources of object identification information from objects being transported through the x-ray scanning machine 2721, namely bar code symbol based object identity information, and RFID-tag based object identify information. As shown, the Ethernet data communications port of the object identification and attribute acquisition subsystem 120 is connected to the local network (LAN) or wide area network (WAN) via suitable communications cable, medium or link. In turn, the LAN or WAN 2729 is connected to the infrastructure of the Internet 2730 to which one or more remote intelligence RDBMSs 2731 are operably connected using the TCP/IP protocol. This arrangement enables the object identification and attribute subsystem 120 to transport linked object identification and attribute data elements to any RDBMS 2731 to which it is networked, for storage and subsequent processing in diverse applications. Object identification and attribute data elements linked by and transported from the object identification and attribute acquisition subsystem 120 can be used in diverse types of intelligence and security related applications.

Quadrupole Resonance (QR) Scanning-Tunnel System of the Present Invention Having Integrated Subsystems for Automatically Identifying Objects Transported Therethrough and Automatically Linking Object Identification Information With Object Attribute Information Acquired by the System In FIGS. 72A and 72B, a Quadrupole Resonance Analysis (QRA) scanning-tunnel system of the present invention 2740 is shown comprising: a QRA scanning machine 2741 having a conveyor belt structure 2742 for transporting objects (e.g. parcels, packages, baggage, etc.) through a tunnel-like housing 2743 provided with an entry port 2744 and an exit port 2745: and a PLIIM-based object identification and attribute acquisition subsystem 120 installed above the conveyor belt structure at the entry port 2744 of the tunnel-like housing, and receiving as object attribute data input, QRA image data files produced by the QRA scanning machine 2741 for display, processing and analysis. In accordance with convention, QRA scanning machine automatically inspects the interior space of objects such as packages, parcels, baggage or the like, by the transmitting low-intensity electromagnetic radio waves through the objects to produce digital images of the structure and composition of the scanned objects, with the requirement of externally generated magnetic fields, required by MRI techniques. Quantum Magnetics, Inc. of San Diego, Calif., http://www.qm.com, makes and sells QRA scanning equipment which can be used to realize a QRA-based scanning tunnel system of the present invention described above.

Optionally, a RFID-tag reader 2746 is installed at the entry port of the tunnel-like housing in order to automatically read RFID-tags applied to objects being QRA scanned through the system. The output data port of the RFID-tag reader 2746 is operably connected to the object identity data input port provided on the object identification and attribute acquisition subsystem 120. As such, the object identification and attribute acquisition subsystem 120 is adapted to receive two different sources of object identification information from objects being transported through the QRA scanning machine 2741, namely bar code symbol based object identity information, and RFID-tag based object identify information. As shown, the Ethernet data communications port of the object identification and attribute acquisition subsystem 120 is connected to the local network (LAN) or wide area network (WAN) 2748 via suitable communications cable, medium or link. In turn, the LAN or WAN 2748 is connected to the infrastructure of the Internet 2749 to which one or more remote intelligence RDBMSs 2750 are operably connected using the TCP/IP protocol. This arrangement enables the object identification and attribute subsystem 120 to transport linked object identification and attribute data elements to any RDBMS 2750 to which it is networked, for storage and subsequent processing in diverse applications. Object identification and attribute data elements linked by and transported from the object identification and attribute acquisition subsystem 120 can be feature in diverse types of intelligence and security related applications.

PFNA, QRA or X-Ray Cargo-Type Scanning-Tunnel System of the Present Invention Having Integrated Subsystems for Automatically Identifying Objects Transported Therethrough and Automatically Linking Object Identification Information With Object Attribute Information Acquired by the System FIG. 73 is a perspective view of a PFNA, QRA or X-ray cargo scanning-tunnel system 2760 of the present invention is shown comprising: a QRA, PFNA or X-ray scanning machine 2761 having scanning arm 2761A supported over a road surface or the like, and under which objects (e.g. parcels, packages, baggage, etc.) can be transported during scanning operations; and a pair of PLIIM-based object identification and attribute acquisition subsystems 120A and 120B installed on the top and side of the scanning arm, to image and profile transported objects along their top and side surfaces, and receiving as object attribute data input, QRA, PFNA or X-ray image data files produced by the scanning machine 2761 for display, processing and analysis.

Optionally, a RFID-tag reader 2764 is installed on the scanning arm in order to automatically read RFID-tags applied to objects being QRA scanned through the system. The output data port of the RFID-tag reader 2764 is operably connected to the object identity data input port provided on the object identification and attribute acquisition subsystem 120A. As such, the object identification and attribute acquisition subsystem 120A is adapted to receive two different sources of object identification information from objects being transported through the QRA scanning machine 2761, namely bar code symbol based object identity information, and RFID-tag based object identify information from the RFID-tag reader 2764. As shown, the Ethernet data communications port of the object identification and attribute acquisition subsystem 120B is connected to the local network (LAN) or wide area network (WAN) 2768 via suitable communications cable, medium or link. In turn, the LAN or WAN 2768 is connected to the infrastructure of the Internet 2769 to which one or more remote intelligence RDBMSs 2770 are operably connected using the TCP/IP protocol. This arrangement enables the object identification and attribute subsystem 120B to transport linked object identification and attribute data elements to any RDBMS 2770 to which it is networked, for storage and subsequent processing in diverse applications. Object identification and attribute data elements linked by and transported from object identification and attribute acquisition subsystems 120A, 120B can be used in diverse types of intelligence and security related applications.

A First Embodiment of a "Horizontal-Type" 3-D PLIIM-Based CAT Scanning System of the Present Invention In FIG. 74, a first illustrative embodiment of a "horizontal-type" 3-D PLIIM-based CAT scanning system of the present invention 2780 is shown comprising: a support table 2781 for supporting a human or animal subject during imaging operations; a pair of support bars 2782A and 2782B for supporting a horizontally-extending rail structure 2783 extending above and along the central axis of the support table 2781; a motorized carriage 2784 supported on and adapted to travel along the length of the rail structure at a programmably controlled velocity; a PLIIM-based imaging and profiling subsystem 120 mounted to the motorized carriage, for producing a pair of amplitude modulated (AM) laser scanning beams 2785 and a single planar laser illumination beam (PLIB) 2786; and a computer workstation 2787 with LCD monitor 2787, operably connected to the PLIIM-based imaging and profiling subsystem 120 for collecting and storing both linear image slices and 3-D range data profiles of the subject under analysis, so that the workstation can reconstruct to generate a 3-D geometrical model of the object using computer-assisted tomographic (CAT) techniques applied to the collected data.

During operation of the system, the PLIIM-based imaging and profiling subsystem 120 is controllably transported by the motorized carriage horizontally through a 3-D scanning volume 2788 disposed above the support table, at a controlled velocity, so as to optically scan the subject under analysis and capture linear images and range-profile maps thereof relative to a global coordinate reference system (symbolically embedded within the system). The LDIP Subsystem 122 in each PLIIM-based subsystem 120 determines the range of the target surface at each instant in time, and provides such parameters to the camera control computer 22 within the corresponding PLIIM-based subsystem so that it can automatically control the focus and zoom characteristics of its camera module employed therein, thereby ensuring that each captured linear image has substantially constant dpi resolution. The image and range data collected during the scanning operation, which takes only a few seconds, is then processed using CAT techniques carried out within the computer workstation 2786 to reconstruct a 3-D geometrical model of the subject, for display and viewing on the monitor of the computer graphics workstation.

In an alternative embodiment of the horizontal-type 3-D PLIIM-based CAT scanning system described above, the PLIIM-based imaging and profiling subsystem 120 can be replaced by just the LDIP subsystem 122, to simplify and reduce the cost of construction of the system. In this modified CAT scanning system, each LDIP subsystem 122 performs an image capture function, in addition to its object profiling/ranging function. In particular, the intensity data collected by the return AM laser beams of LDIP subsystem 122, after each sweep across its scanning field, produces a linear image of the laser-scanned section of the target object. These linear images are then processed using CAT techniques carried out within computer workstation 2786 to reconstruct a 3-D geometrical model of the subject, for display and viewing on the monitor 2787 of the computer graphics workstation. In this alternative embodiment, it typically will be necessary for the LDIP imaging and profiling subsystem 122 to sample, during each sweep of the AM laser beams, many additional data points along the laser scanned object in order to generate relatively high-resolution linear images for use in the image reconstruction process.

A Second Embodiment of a "Horizontal-Type" 3-D PLIIM-Based CAT Scanning System of the Present Invention In FIG. 75, a second illustrative embodiment of a "horizontal-type" 2-D PLIIM-based CAT scanning system of the present invention 2790 is shown comprising: a support table 2791 for supporting a human or animal subject during imaging operations; a pair of support bars 2792A and 2792B for supporting three, angularly spaced horizontally-extending rail structures 2793A, 2793B and 2793C extending above and parallel to the central axis of the support table 2791; a motorized carriage 2792 supported on and adapted to travel along the length of each rail structure 2793A, 2793B and 2793C at a programmably controlled velocity; a PLIIM-based imaging and profiling subsystem 120 mounted to each motorized carriage, for producing a pair of amplitude modulated (AM) laser scanning beams 2795 and a single planar laser illumination beam (PLIB) 2796; and a computer workstation 2797 with LCD monitor 2798, operably connected to each PLIIM-based imaging and profiling subsystem 120, for collecting and storing both linear image slices and 3-D range data profiles of the subject generated during scanning operations, so that the workstation can reconstruct to generate a 3-D geometrical model of the object using computer-assisted tomographic (CAT) techniques applied to the collected data.

During operation of the system, each PLIIM-based imaging and profiling subsystem 120 is controllably transported by its motorized carriage horizontally through a 3-D scanning volume 2799 disposed above the support table, at a controlled velocity, so as to optically scan the subject under analysis and capture linear images and range-profile maps thereof relative to a global coordinate reference system (symbolically embedded within the system). The LDIP Subsystem 122 in each PLIIM-based subsystem 120 determines the range of the target surface at each instant in time, and provides such parameters to the camera control computer 22 within the corresponding PLIIM-based subsystem so that it can automatically control the focus and zoom characteristics of its camera module employed therein, thereby ensuring that each captured linear image has substantially constant dpi resolution. The image and range data collected during the scanning operation, which takes only a few seconds, is then processed using CAT techniques carried out within the computer workstation 2797 to reconstruct a 3-D geometrical model of the subject, for display and viewing on the monitor of the computer graphics workstation.

In an alternative embodiment of the horizontal-type 3-D PLIIM-based CAT scanning system 2790 described above, the PLIIM-based imaging and profiling subsystem 120 can be replaced by just the LDIP subsystem 122, to simplify and reduce the cost of construction of the system. In this modified CAT scanning system, each LDIP subsystem 122 performs an image capture function, in addition to its object profiling/ranging function. In particular, the intensity data collected by the return AM laser beams of LDIP subsystem 122, after each sweep across its scanning field, produces a linear image of the laser-scanned section of the target object. These linear images are then processed using CAT techniques carried out within computer workstation 2797 to reconstruct a 3-D geometrical model of the subject, for display and viewing on the monitor of the computer graphics workstation. In this alternative embodiment, it typically will be necessary for the LDIP imaging and profiling subsystem 122 to sample, during each sweep of the AM laser beams, many additional data points along the laser scanned object in order to generate relatively high-resolution linear images for use in the image reconstruction process.

A "Vertical-Type" 3-D PLIIM-Based CAT Scanning System of the Present Invention

In FIG. 76, a "vertical-type" 3-D PLIIM-based CAT scanning system of the present invention 2800 is shown comprising: a support base 2801 for supporting a human or animal subject during imaging operations; a pair of vertically extending rail structures 2802A and 2802B supported from the support base 2801; a motorized carriage 2803 supported on and adapted to travel along the length of each rail structure 2802A and 2802B at a programmably controlled velocity; a PLIIM-based imaging and profiling subsystem 120 mounted to each motorized 2803 for producing a pair of amplitude modulated (AM) laser scanning beams 2804 and a single planar laser illumination beam (PLIB) 2805, wherein the sets of PLIBs are orthogonal to each other; and a computer workstation 2806 with LCD monitor 2807, operably connected to each PLIIM-based imaging and profiling subsystem 120, for collecting and storing both linear image slices and 3-D range data profiles of the subject generated during scanning operations, so that the workstation can reconstruct to generate a 3-D geometrical model of the object using computer-assisted tomographic (CAT) techniques applied to the collected data.

During operation of the system, each PLIIM-based imaging and profiling subsystem 120 is controllably transported by its motorized carriage vertically through a 3-D scanning volume 2809 disposed above the support base, at a controlled velocity, so as to optically scan the subject under analysis and capture linear images and range-profile maps thereof relative to a global coordinate reference system (symbolically embedded within the system). The LDIP Subsystem 122 in each PLIIM-based subsystem 120 determines the range of the target surface at each instant in time, and provides such parameters to the camera control computer 22 within the corresponding PLIIM-based subsystem so that it can automatically control the focus and zoom characteristics of its camera module employed therein, thereby ensuring that each captured linear image has substantially constant dpi resolution. The image and range data collected during the scanning operation, which takes only a few seconds, is then processed using CAT techniques carried out within the computer workstation 2806 to reconstruct a 3-D geometrical model of the subject, for display and viewing on the monitor 2807 of the computer graphics workstation.

In an alternative embodiment of the vertical-type 3-D PLIIM-based CAT scanning system 2800 described above, the PLIIM-based imaging and profiling subsystem 120 can be replaced by just the LDIP subsystem 122, to simplify and reduce the cost of construction of the system. In this modified CAT scanning system, each LDIP subsystem 122 performs an image capture function, in addition to its object profiling/ranging function. In particular, the intensity data collected by the return AM laser beams of LDIP subsystem 122, after each sweep across its scanning field, produces a linear image of the laser-scanned section of the target object. These linear images are then processed using CAT techniques carried out within onboard image processing computer (or on an external image processing computer workstation) to reconstruct a 3-D geometrical model of the subject, for display and viewing on the monitor of the computer graphics workstation. In this alternative embodiment, it typically will be necessary for the LDIP imaging and profiling subsystem 122 to sample, during each sweep of the AM laser beams, many additional data points along the laser scanned object in order to generate relatively high-resolution linear images for use in the image reconstruction process.

A Hand-Supportable Mobile-Type PLIIM-Based 3-D Digitization Device of the Present Invention In FIG. 77A, a hand-supportable mobile-type PLIIM-based 3-D digitization device 2810 of the present invention is shown comprising: a hand-supportable housing 2811 having a handle structure 2812; a PLIIM-based camera subsystem 25'(or 25) mounted in the hand-supportable housing; a miniature-version of LDIP subsystem 122 mounted in the hand-supportable housing 2811; a set of optically isolated light transmission apertures 2813 and 2813B for transmission of the PLIBs from the PLIIM-based camera subsystem mounted therein, and a light transmission aperture 2814 for transmission of the FOV of the PLIIM-based camera subsystem, during object imaging operations; a light transmission aperture 2815, optically isolated from light transmission apertures 2813A, 2813B and 2814, for transmission of the AM laser beam transmitted from the LDIP subsystem 122 during object profiling operations; a LCD view finder 2816 integrated with the housing, for displaying 3-D digital data models and 3-D geometrical models of laser scanned objects. The mobile laser scanning 3-D digitization device 2810 of FIG. 77A also has an Ethernet data communications port 2817 for communicating information files with other computing machines on a LAN to which the mobile device is connected.

During operation, the user manually sweeps the single amplitude modulated (AM) laser scanning beams 2819 and the single planar laser illumination beam (PLIB) 2820 produced from the device across a 3-D scanning volume 2821, within which a 3-D object 2822 to be imaged and digitized exists, thereby optically scanning the object and capturing linear images and range-profile maps thereof relative to a coordinate reference system symbolically embodied within the scanning device. The LDIP Subsystem 122 within the hand-supportable digitizer determines the range (as well as the relative velocity) of the target surface at each instant in time with respect to coordinate reference system symbolically embodied in the digitizer. In turn, such parameters are provided to the camera control computer 22 within the 3-D digitizer so that it can automatically control the focus and zoom characteristics of its camera module (as well as the photo-integration time) employed therein, thereby ensuring that each captured linear image has substantially constant dpi resolution (and substantially square pixels). The collected image and range-data is stored in buffer memory, and processed so as to reconstruct a 3-D geometrical model of the object using computer-assisted tomographic (CAT) techniques. The reconstructed 3-D geometrical model can be displayed and viewed on the LCD viewfinder, or on an external display panel connected to a computer in communication the device through its Ethernet or USB communications ports.

In an alternative embodiment of the hand-supportable mobile-type PLIIM-based 3-D digitization device 2810 described above, the PLIIM-based imaging and profiling subsystem 120 can be replaced by just the LDIP subsystem 122, to simplify and reduce the cost of construction of the system. In this modified CAT scanning system, each LDIP subsystem 122 performs an image capture function, in addition to its object profiling/ranging function. In particular, the intensity data collected by the return AM laser beams of LDIP subsystem 122, after each sweep across its scanning field, produces a linear image of the laser-scanned section of the target object. These linear images are then processed using CAT techniques carried out within onboard image processing computer (or on an external image processing computer workstation) to reconstruct a 3-D geometrical model of the subject, for display and viewing on the monitor of the computer graphics workstation. In this alternative embodiment, it typically will be necessary for the LDIP imaging and profiling subsystem 122 to sample, during each sweep of the AM laser beams, many additional data points along the laser scanned object in order to generate relatively high-resolution linear images for use in the image reconstruction process.

A First Illustrative Embodiment of the Transportable PLIIM-Based 3-D Digitization Device ("3-D Digitizer") of the Present Invention In FIGS. 78A through 78C, a first illustrative embodiment of the transportable PLIIM-based 3-D digitization device ("3-D digitizer") 2830 of the present invention is shown comprising: a transportable housing 2831 of lightweight construction, having a handle 2832 on its top portion for transporting system device about from one location to another, and four rubber feet 2834 on its base portion for supporting the device on any stable surface, indoors and outdoors alike; a PLIIM-based imaging and profiling subsystem 120 as described above, contained within the transportable housing 2831, and including a PLIIM-based camera subsystem 25' and a LDIP subsystem 122, both described in detail hereinabove; a set of optically isolated light transmission apertures 2835A and 2835B for transmission of the PLIBs 2836 and light transmission aperture 2837 for transmission of the coplanar FOV 2836 of the PLIIM-based camera subsystem 25' mounted therein, during object imaging operations; a light transmission aperture 2838, optically isolated from light transmission apertures 2835A, 2835B and 2836, for transmission of the pair of planar AM laser beams 2839 transmitted from the LDIP subsystem 122 during object profiling operations; a LCD view finder 2840 integrated with the panel of the housing, for displaying 3-D digital data models produced by LDIP subsystem 122 and high-resolution 3-D geometrical models of the laser scanned object produced by PLIIM-based camera subsystem 25'; a touch-type control pad 2841 on the rear for controlling the operation of the device, and a removable media port(s) 2842 on the rear panel of the transportable housing for interfacing a removable media device capable of recording captured image and range-data maps; an Ethernet (USB, and/or Firewire) data communications port 2843 on the rear panel for connecting the device to a local or wide area network and communicating information files with other computing machines on the network; and an onboard computer 2844 equipped with computer-assisted tomographic (CAT) programs for processing linear images and range-data maps captured by the device, and generating therefrom a 3-D digitized data model of each laser scanned object, for display, viewing and use in diverse applications; and a computer-controlled object support platform 2845, interfaced with the onboard computer 2844 via a USB port 2846, for controllably rotating the object as it laser-scanned by the coplanar PLIB/FOV and AM laser scanning beams.

During operation, the object under analysis is controllably rotated through the coplanar PLIB/FOV and planar AM laser scanning beams generated by the 3-D digitization device 2830 so as to optically scan the object and automatically capture linear images and range-profile maps thereof relative to a coordinate reference system symbolically embodied within the 3-D digitization device. The LDIP Subsystem 122 in the PLIIM-based subsystem 120 determines the range of the target surface at each instant in time, and provides such parameters to the camera control computer 22 within the PLIIM-based camera subsystem 25' so that it can automatically control the focus and zoom characteristics of its variable-focus/variable-zoom camera module employed therein, thereby ensuring that each captured linear image has substantially constant dpi resolution. The collected image and range-data is stored in buffer memory, and processed by the onboard computer 2844 or an external workstation with CAT software so as to reconstruct a 3-D geometrical model of the object using computer-assisted tomographic (CAT) techniques. The reconstructed 3-D geometrical model can be displayed and viewed on the LCD viewfinder 2840, or on an external display panel connected to a computer in communication the device through its Ethernet (USB and/or Firewire) communications ports 2843.

In an alternative embodiment of the transportable PLIIM-based 3-D digitizer 2830 described above, the PLIIM-based imaging and profiling subsystem 120 can be replaced by just the LDIP subsystem 122, to simplify and reduce the cost of construction of the system. In this modified CAT scanning system, each LDIP subsystem 122 performs an image capture function, in addition to its object profiling/ranging function. In particular, the intensity data collected by the return AM laser beams of LDIP subsystem 122, after each sweep across its scanning field, produces a linear image of the laser-scanned section of the target object. These linear images are then processed using CAT techniques carried out within onboard computer 2844 to reconstruct a 3-D geometrical model of the subject, for display and viewing on the LCD viewfinder 2840 or on an LCD monitor of an auxiliary computer graphics workstation. In this alternative embodiment, it typically will be necessary for the LDIP imaging and profiling subsystem 122 to sample, during each sweep of the AM laser beams, many additional data points along the laser scanned object in order to generate relatively high-resolution linear images for use in the image reconstruction process.

A Second Illustrative Embodiment of the Transportable PLIIM-Based 3-D Digitization Device ("3-D Digitizer") of the Present Invention In FIGS. 79A through 79C, a second illustrative embodiment of the transportable PLIIM-based 3-D digitization device ("3-D digitizer") of the present invention 2850 is shown comprising: a transportable housing 2851 of lightweight construction, having a handle 2852 on its top portion for transporting system device about from one location to another, and four rubber feet 2853 on its base portion for supporting the device on any stable surface, indoors and outdoors alike; a PLIIM-based imaging and profiling subsystem 2855, contained within the transportable housing, and including a PLIIM-based camera subsystem 25" with a 2-D area CCD image detection array as shown in FIGS. 6D1 through 6D5 and described above, and a LDIP subsystem 122 as described above; a set of optically isolated light transmission apertures 2856A and 2856B for transmission of the PLIBs 2857 and a light transmission aperture 2858 for transmission of the coplanar FOV of the PLIIM-based camera subsystem 25" mounted therein, during object imaging operations; a light transmission aperture 2859, optically isolated from light transmission apertures 2856A, 2856B and 2858, for transmission of the AM laser beam transmitted from the LDIP subsystem 122 during object profiling operations; a LCD view finder 2860 integrated with the panel of the housing, for displaying 3-D digital data models captured by LDIP subsystem 122 and 3-D geometrical models of the laser scanned object by PLIIM-based camera subsystem 25"; a touch-type control pad 2861 on the rear for controlling the operation of the device, and a removable media port 2862 on the rear panel of the transportable housing for interfacing a removable media device capable of recording captured image and range-data maps; an Ethernet (USB, and/or Firewire) data communications port 2863 on the rear panel for connecting the device to a local or wide area network and communicating information files with other computing machines on the network; and an onboard computer 2864 equipped with computer-assisted tomographic (CAT) programs for processing linear images and range-data maps captured by the device, and generating therefrom a 3-D digitized data model of each laser scanned object, for display, viewing and use in diverse applications; and a computer-controlled object support platform 2865, interfaced with the onboard computer 2864 via a USB port 2866, for controllably rotating the object as it laser-scanned by the PLIB and AM laser scanning beams.

During operation, the object under analysis is controllably rotated through the PLIB/FOV and AM laser scanning beam generated by the 3-D digitization device so as to optically scan the object and automatically capture 2-D images and range-profile maps thereof relative to a coordinate reference system symbolically embodied within the 3-D digitization device. The collected 2-D image and 3-D range data elements are stored in buffer memory and processed by an onboard image processing computer 2864 or an external workstation provided with CAT software so as to reconstruct a 3-D geometrical model of the object using computer-assisted tomographic (CAT) techniques. The reconstructed 3-D geometrical model can be displayed and viewed on the LCD viewfinder 2860, or on an external display panel connected to a computer in communication the device through its Ethernet (USB and/or Firewire) communications ports 2863.

First Illustrative Embodiment of Automatic Vehicle Identification (AVI) System of the Present Invention Configured by a Pair of PLIIM-Based Imaging and Profiling Subsystems In FIG. 80, there is shown a first illustrative embodiment of the automatic vehicle identification (AVI) system of the present invention 2870 configured by a pair of PLIIM-based imaging and profiling subsystems 120, described in detail above.

The automatic vehicle identification (AVI) system of the first illustrative embodiment employs a pair of PLIIM-based imaging and profiling systems 120 to enable the automatic identification of automotive vehicles for the purpose of identifying fare violators, as well as identifying and acquiring intelligence on automotive vehicles before permitting passage over a bridge, through a tunnel, into a parking-garage, building or any highly-populated area (e.g. city), as well as onto any major road or highway. The AVI system provides an effective solution to such transportation problems by enabling high-resolution license plate image capture and recognition functions, including OCR of finely printed "owner/operator identification markings" on license plates, windshields, as well as on the side of passing vehicles, systems employing laterally mounted PLIIM-based imaging and profiling subsystems, 120. As described hereinabove, each PLIIM-based imaging and profiling subsystem 120 of the present invention is able to dynamically focus in on a planar portion of the target vehicle, in response to vehicle profile information acquired by its LDIP subsystem 122, ensuring that each captured linear image has a substantially constant dpi resolution independent of the depth of focus of the subsystem at any instant in time.

As shown in FIG. 80, the AVI system of the first illustrative embodiment comprises: a pair of PLIIM-based imaging and profiling subsystems 120A and 120B, mounted above a roadway surface 2871 by a support framework 2872 which extends thereover; a local area network (LAN) 2873 to which subsystems 120A and 120B are connected via their Ethernet network communication ports; a RDBMS 2874 containing one or more databases of license plate registration numbers, automotive vehicle registration information and associated owners and drivers; and an associated image processing computer workstation 2875 for reconstructing 2-D images from consecutively captured linear images, and automatically carrying out (i) OCR algorithms on captured license plate number images, and (ii) associated vehicle identification algorithms in response to OCR output data and possibly using data input supplied from remote intelligence databases 2876 operably connected to the infrastructure of the Internet (WAN) 2877, bridged with the LAN 2873 in a conventional manner.

As shown in FIG. 80, the first PLIIM-based imaging and profiling subsystem 120A is oriented in space so that (i) the first pair of AM laser beams 2878 and first coplanar PLIB/FOV 2879 are both arranged at about 45 degree angles with respect to the road surface, pointing in the direction against an oncoming automotive vehicle 2880 (whose identification and velocity are to be determined by the system). In this arrangement, the AM laser beams 2878 physically lead the coplanar PLIB/FOV 2879 slightly as shown in order to automatically detect the presence and absence of an oncoming automotive vehicle (e.g. car, truck, motorcycle) and capture linear images of the front of the detected oncoming vehicle (including its front license plate). When the automotive vehicle is detected by the LDIP Subsystem 122 in PLIIM-based Subsystem 120A, the linear camera module within PLIIM-based subsystem 120A automatically captures linear images of the oncoming automotive vehicle and its front mounted license plate. These linear images are then transmitted through LAN 2873 to the image processing computer workstation 2875 where they are buffered and reconstructed to form 2-D images and OCR algorithms are applied to recognize character strings in the reconstructed images, thereby identifying the vehicle by its front license plate number.

As shown in FIG. 80, the second PLIIM-based imaging and profiling subsystem 120B is oriented in space so that (i) the second pair of AM laser beams 2882 and the second coplanar PLIB/FOV 2883 are both arranged at about 45 degree angles with respect to the road surface, but pointing in the direction of oncoming automotive vehicles (whose identification and velocity are to be determined by the system). In this arrangement, the second set of AM laser beams 2882 physically lead the second coplanar PLIB/FOV 2883 as shown to automatically detect the presence and absence of an automotive vehicle (e.g. car, truck, motorcycle), and capture linear images of the rear license plate mounted on a detected passing vehicle. When the automotive vehicle is detected by the LDIP Subsystem 122 in PLIIM-based Subsystem 120B, the linear camera module within subsystem 120B automatically captures linear images of the receding automotive vehicle and its rear mounted license plate. These linear images are then transmitted through LAN 2873, to the computer workstation 2845, where they are reconstructed to form 2-D images and OCR algorithms are applied to recognize character strings in the reconstructed images, thereby identifying the vehicle by its rear license plate number.

Recognized front and rear license plates numbers are automatically compared within the computer workstation 2874 to determine that they match each other. Recognized license plate numbers are automatically analyzed against remote intelligence databases 2876 accessible over the Internet (WAN) 2877 to determine whether any alarms should be generated in response to detected conditions which warrant suspicion, danger or suspicion. Typically, the AVI system of the present invention described above will function as a subsystem within a state or national intelligence and/or security system realized using the global infrastructure of the Internet.

The arrangement taught in FIG. 80 enables the LDIP Subsystem 122 in each PLIIM-based subsystem 120 to compute the velocity of the incoming vehicle (which will vary slightly over time), and using this parameter, enable the camera control computer 22 within the corresponding PLIIM-based subsystem to automatically control the focus and zoom characteristics of its camera module employed therein, thereby ensuring that each captured linear image has substantially constant dpi resolution. Also, the intensity data collected by the return AM laser beams of each LDIP subsystem 122 will be sufficient to produce low-resolution 2-D images which can be analyzed in the LDIP subsystem 122 to detect diverse types of geometrically-definable patterns (e.g. having rectangular borders) which might indicate the presence of graphical intelligence contained within the interior boundaries thereof. As taught hereinabove, the LDIP subsystem 122 can also determine the locally-referenced coordinates of such detected patterns, and these coordinates can be transmitted to the camera control computer 22 and interpreted as Region of Interest (ROI) coordinates. In turn, these ROI coordinates can be converted into the camera's coordinate reference system and then used to crop only those pixels residing within the ROI of captured linear images, to substantially reduced the computational burden associated with OCR-based image processing operations carried out in the image processing computer workstation 2874.

Second Illustrative Embodiment of Automatic Vehicle Identification (AVI) System of the Present Invention Configured by a Pair of PLIIM-Based Imaging and Profiling Subsystems In FIGS. 81A through 81D, there is shown a second illustrative embodiment of the automatic vehicle identification (AVI) system of the present invention 2890 constructed from a single PLIIM-based imaging and profiling subsystem 120 shown in FIGS. 9 through 11, and an automatic PLIB/FOV direction-switching unit 2891, integrated with the subsystem 120 to perform its prespecified functions. While the AVI system of FIG. 81A has substantially the same system performance characteristics, it has the advantage of requiring the use of only a single PLIIM-based imaging and profiling subsystem 120, whereas the AVI system of FIG. 80 requires two such subsystems.

As shown in FIG. 81A, the AVI system of the second illustrative embodiment comprises: a single PLIIM-based imaging and profiling subsystem 120, mounted above a roadway surface 2892 by a support framework 2893 which extends thereover; an automatic PLIB/FOV direction-switching unit 2891, integrated with the subsystem 120 as shown in FIGS. 81B and 81C, to perform several direction switching functions on the coplanar PLIB/FOV 2894, to be described in greater detail below; a local area network (LAN) 2895 to which subsystem 120 is connected via its Ethernet network communication port; a RDBMS 2896 containing one or more databases of license plate registration numbers, automotive vehicle registration information and associated owners and drivers; and an associated computer workstation 2897 for reconstructing 2-D images from consecutively captured linear images, and automatically carrying out (i) OCR algorithms on captured license plate number images, and (ii) associated vehicle identification algorithms in response to OCR output data and possibly using data input supplied from remote intelligence databases 2898 operably connected to the infrastructure of the Internet (WAN) 2899, which is bridged with the LAN 2895 in a conventional manner.

As shown in FIGS. 81B and 81C, the automatic PLIB/FOV direction-switching unit 2891 comprises: an optical bench 2900 mounted to the housing of subsystem 120, and having a light transmission aperture 2901 which is in spatial registration with light transmission apertures 541A, 542 and 541B formed in the housing of subsystem 120; a stationary PLIB/FOV folding mirror 2903, fixedly mounted beneath the light transmission aperture 2901 in optical bench 2900, and arranged at about a 45 degree angle so that the outgoing PLIB/FOV 2894 from subsystem 120 is directed to travel substantially parallel to and beneath optical bench 2900; a pivotal PLIB/FOV folding mirror 2904, of about the same size as the stationary PLIB/FOV folding mirror 2903, connected to an electronically-controlled actuator 2906, and capable of angularly rotating the pivotal PLIB/FOV folding mirror 2904 into one of two extreme angular positions (i.e. Position 1 or Position 2) in automatic response to generation of control signals by the camera control computer 22 in the PLIIM-based system, so that the coplanar PLIB/FOV 2894 (from stationary PLIB/FOV mirror 2903) is automatically directed along (i) a First Optical Path (i.e. Optical Path No. 1) when the pivotal PLIB/FOV folding mirror 2904 is rotated to Position 1, and (ii) a Second Optical Path (i.e. Optical Path No. 2) when the pivotal PLIB/FOV folding mirror 2904 is rotated to Position 2, as shown in FIG. 81D; and a housing 2907 for containing the mirrors 2903 and 2904, actuator 2906 and optical bench 2900, and having a light transmission aperture 2908 disposed beneath pivotal PLIB/FOV folding mirror 2904 so as to permit the redirected optical path of the coplanar PLIB/FOV 2894 to exit and enter the PLIB/FOV direction-switching unit 2891 in accordance with its intended operation, described in detail below.

As shown in FIG. 81D, the PLIIM-based imaging and profiling subsystem 120 is oriented above the roadway 2892 so that when its pair of AM laser beams 2910 are directed substantially normal to the road surface. When these AM laser beams detect the presence of an automotive vehicle moving under subsystem 120, the camera control system 22 therewithin automatically generates a control signal which is supplied to the actuator 2906 causing the PLIB/FOV folding mirror to be switched to its Position 1, thereby directing the optical path of the outgoing coplanar PLIB/FOV 2894 along Optical Path No. 1, against the direction of oncoming the automotive vehicle. In this configuration, the linear camera module within PLIIM-based subsystem 120 captures linear images of the oncoming automotive vehicle and its front mounted license plate. These images are then transmitted through LAN 2895, to the computer workstation 2897, where they are buffered in image memory to reconstruct 2-D images and OCR algorithms are the applied thereto in effort to recognize character strings in the reconstructed images, thereby identifying the vehicle by its recognized license plate number.

As the automotive vehicle passes through the AM laser beams 2910 while the coplanar PLIB/FOV 2894 is directed along Optical Path 1, the LDIP subsystem 122 within the PLIIM-based system 120 automatically computes (i) the average velocity and (ii) the length of the oncoming vehicle. Based on these computed measures, the camera control computer 22 in the PLIIM-based subsystem 120 automatically computes when the vehicle will arrive at a position down the roadway where the coplanar PLIB/FOV 2894 should be redirected along Optical Path 2 to enable the imaging of the rear portion of the automotive vehicle. When camera control system 22 determines this instant in time (t2), it automatically generates a control signal which is supplied to the actuator 2906 within the PLIB/FOV direction switching unit 2891. This causes the pivotal PLIB/FOV folding mirror 2904 to be switched to Position 2, thereby directing the optical path of the outgoing coplanar PLIB/FOV along Optical Path No. 2, along the direction of oncoming the automotive vehicle. In this configuration, the linear camera (IFD) module within PLIIM-based subsystem 120 automatically captures linear images of the receding vehicle including its rear-mounted license plate. These images are then transmitted through LAN 2895, to the computer workstation 2897, where they are reconstructed in a 2-D image buffer and OCR algorithms are applied in effort to recognize any character strings in the reconstructed images, and thereby identify the vehicle by its recognized license plate number which is confirmed against remote intelligence databases, if required by the application at hand. When linear images of the vehicle are no longer being captured, the AVI system is automatically reset, whereby the LDIP subsystem 122 waits to detect another vehicle moving beneath the PLIIM-based system 120, enabling the vehicle profiling and imaging process to repeat over and over again in a cyclical manner for streams of vehicles traveling along the roadway.

Recognized front and rear license plates numbers are automatically compared within the computer workstation 2897 to determine that they match. Recognized license plate numbers are automatically analyzed against remote intelligence databases 2898 accessible over the Internet (WAN) 2899 to determine whether any alarms should be generated in response to detected conditions which warrant suspicion, danger or suspicion. Typically, the AVI system of the present invention described above will function as a subsystem within a state or national intelligence and/or security system realized using the global infrastructure of the Internet.

The arrangement taught in FIG. 81A enables the LDIP Subsystem 122 in the PLIIM-based subsystem 120 to compute the velocity of the incoming vehicle (which will vary slightly over time), and using this parameter, enable the camera control computer 22 within the corresponding PLIIM-based subsystem to automatically control the focus and zoom characteristics of its camera module employed therein. This ensures that each captured linear image has substantially constant dpi resolution. Also, the intensity data collected by the return AM laser beams of the LDIP subsystem 122 in PLIIM-based subsystem 120 will be sufficient to produce low-resolution 2-D images which can be analyzed in the LDIP subsystem 122 to detect diverse types of geometrically-definable patterns (e.g. having rectangular borders) which might indicate the presence of graphical intelligence contained within the interior boundaries thereof. As taught hereinabove, the LDIP subsystem 122 can also determine the locally-referenced coordinates of such detected patterns, and these coordinates can be transmitted to the camera control computer 22 and interpreted as Region of Interest (ROI) coordinates. In turn, these ROI coordinates can be converted into the camera's coordinate reference system and then used to crop only those pixels residing within the ROI of captured linear images, to substantially reduced the computational burden associated with OCR-based image processing operations carried out in the image processing computer workstation 2897.

Automatic Vehicle Classification (AVC) System of the Present Invention Employing PLIIM-Based Imaging and Profiling Subsystems In FIG. 82, there is shown an automatic vehicle classification (AVC) system of the present invention 2920 constructed using a tunnel-type arrangement of PLIIM-based imaging and profiling subsystems 120 taught hereinabove, mounted overhead and laterally along the roadway passing through the tunnel-structure of the AVC system. The tunnel-type arrangement of PLIIM-based imaging and profiling systems 120 cooperate to enable the automatic profiling and imaging of automotive vehicles passing through its tunnel structure, primarily for vehicular classification purposes. The AVC system of the present invention can be used to automatically count the number of axles on vehicles (e.g. tractor-trailer trucks) based on streams of captured vehicle profile and dimension data. Such vehicles classifications can be used to automatically charge fares to the registered owners or users of such vehicles, for using a particular highway. In many instances, the AVC system shown in FIG. 82 will cooperate with an AVI system, as shown in FIG. 83. Typically, the AVC system of the present invention will function as part of a highway revenue generating/accounting system. In addition, the PLIIM-based AVC system of the present invention can also enable the automated optical character recognition (OCR) of "owner/operator" type identification markings and other graphical intelligence printed on the sides of passing vehicles.

As shown in FIG. 82, the AVC system of the illustrative embodiment comprises: one PLIIM-based imaging and profiling subsystem 120A mounted above a roadway surface 2921 by a support framework 2922 which extends thereover; a first pair of PLIIM-based imaging and profiling subsystem 120B and 120C mounted on the first side of the support framework 2921; a second pair of PLIIM-based imaging and profiling subsystem 120D and 120E mounted on the second side of the support framework 2921; a local area network (LAN) 2923 to which subsystems 120A through 120E are connected via their Ethernet network communication ports; a RDBMS 2924 containing one or more databases of license plate registration numbers, automotive vehicle registration information and associated owners and drivers; and an associated computer workstation 2925 for automatically carrying out: (1) vehicle profile based classification algorithms designed to operate on vehicle profile data captured by the LDIP Subsystem 122 in each PLIIM-based subsystem 120A–120E; and (2) OCR algorithms designed to operate on 2-D images reconstructed from captured linear images. Forms of intelligence recognized by the ACI system hereof can then be compared against data input supplied from remote intelligence databases 2926 operably connected to the infrastructure of the Internet (WAN) 2927 bridged to the LAN 2923 in a conventional manner.

As shown in FIG. 82, the AM laser beams 2929 projected from each PLIIM-based imaging and profiling subsystem 120A–120E are arranged on the incoming traffic side of the tunnel system. This arrangement enables each LDIP Subsystem 122 to compute the velocity of the incoming vehicle (which vary slightly), and using this parameter, enable the camera control computer 22 within the corresponding PLIIM-based subsystem to automatically control the focus and zoom characteristics of its camera module employed therein, thereby ensuring that each captured linear image has substantially constant dpi resolution. At the same time, the coplanar PLIB/FOV 2930 of each PLIIM-based subsystem 120A–120E will be directed substantially normal to the central axis of the rectilinear roadway along which vehicles are directed, ensuring strong return signals to the linear image detector of each PLIIM-based subsystem. The intensity data collected by the return AM laser beams of each LDIP subsystem 122 will be sufficient to produce low-resolution 2-D images which can be analyzed for geometrically-definable patterns (e.g. rectangular borders) which might indicate the presence of graphical intelligence contained within the interior boundaries thereof. As taught hereinabove, the LDIP subsystem can determine the locally-referenced coordinates of such detected patterns, and these coordinates can be transmitted to the camera control computer 22 and interpreted as Region of Interest (ROI) coordinates. In turn, these ROI coordinates can be converted into the camera's coordinate reference system and used to crop only those pixels residing within the ROI of captured linear images, to substantially reduced the computational burden associated with OCR-based image processing operations carried out in the image processing computer workstation 2925.

It is understood that in certain cases, some or every vehicle passing through the system of FIG. 82 may carry an RFID-tag 2931, and thus an RFID-tag reader 2932 can be mounted on the support structure 2922 of the AVC system, with its output port being connected to an object identification data input port provided on one of the PLIIM-based subsystems 120 employed in the system. This will enable the system to identify vehicles based on the code embodied within their RFID-tags.

In an alternative embodiment of the AVC system of the present invention 2920, each PLIIM-based imaging and profiling subsystem 120 can be replaced by just an LDIP subsystem 122, to simply and reduce the cost of construction of the system. In this modified AVC system, each LDIP subsystem 122 performs an image capture function, in addition to its object profiling/ranging function. In particular, the intensity data collected by the return AM laser beams of LDIP subsystem 122, after each sweep across its scanning field, produces a linear image of the laser-scanned section of the target object. These linear images are transported over the LAN computer workstation 2925 where they are buffered in an image buffer to produce 2-D images of the vehicle, and thereafter OCR processed in effort to recognized intelligence contained in each analyzed image. In this alternative embodiment, it typically will be necessary for the LDIP imaging and profiling subsystem 122 to sample, during each sweep of the AM laser beams, many additional data points along the laser scanned object in order to generate relatively high-resolution linear images for use in the image reconstruction process.

Typically, the AVC system of the present invention described above will function as a subsystem within a state or national fare collection system, or within an intelligence and/or security system realized using the global infrastructure of the Internet.

Automatic Vehicle Identification and Classification (AVIC) System of the Present Invention Employing PLIIM-Based Imaging, and Profiling Subsystems In FIG. 83, there is shown is a schematic representation of the automatic vehicle identification and classification (AVIC) system of the present invention 2940 constructed by combining the AVI system shown in FIG. 81A with the AVC system shown in FIG. 82, wherein a common LAN 2941 is employed to internetwork the two systems. The added value provided by such a resultant system is that vehicles can be automatically identified and classified, thereby enabling accurate automated charging of fares (i.e. tolls) to the owners/operators of trucks and like vehicles based on (i) the automated counting of wheel axles and/or other vehicular criteria, and (ii) the automated identification of the vehicle by reading its license plate number and/or owner or operator information printed on the side of the vehicle.

It is understood that in certain cases, some or every vehicle passing through the system of FIG. 83 may carry an RFID-tag, and thus an RFID-tag reader can be mounted on the support structure 2932 of the system, with its output port being connected to an object identification data input port provided on one of the PLIIM-based subsystems 120 employed in the system. This will enable the system to identify vehicles based on the code embodied within their RFID-tags.

PLIIM-Based Object Identification and Attribute Acquisition System of the Present Invention, Into Which a High-Intensity Ultra-Violet Germicide Irradiator (UVGI) Unit is Integrated In FIG. 84A, there is shown the PLIIM-based object identification and attribute acquisition system of the present invention 120, into which a high-intensity ultra-violet germicide irradiator (UVGI) unit 2950 is integrated. Typically, this system will be configured above a conveyor belt structure or function as part of a tunnel-based system. In the illustrative embodiment, the primary wavelength produced from the UV light source 2951 contained within the unit 2950 is about 253.7 nanometers, although the spectrum of this source may be broadened about this wavelength in the UV band to provide more effect germicidal performance. Notably, such spectrum broadening will depend upon the class of pathogens being targeted.

In the illustrative embodiment, light focusing optics (e.g. parabolic/cylindrical reflector 2952 and light focusing optics 2953) are provided between a UV-type tube illuminator 2951, to generate an intensely-focused strip of UV radiation which is transmitted through a light transmission aperture 2954 and into the working range of PLIIM-based system.

In alternative embodiments, the UVGI source employed in the UVGI unit 2950 may be realized using one or more solid state UV illumination devices, such as laser diodes, or other semiconductor devices, which can be arranged in a linear or area array, and focused much in the same way as taught herein. This will enable the generation of high-power UV planar laser illumination beams capable of focusing high-power UVGI-based PLIBS onto surfaces where germicidal irradiation is required or desired by the application at hand. Electrical power for the UVGI unit 2950, however realized, can be supplied through PLIIM-based system 120, or via a separate electrical power line well known in the art.

However realized, the purpose of the UVGI unit 2950 is to irradiate germs and other microbial agents, including viruses, bacterial spores and the like which may be carried by mail, parcels, packages and/or other objects as they are being automatically identified by bar code reading and/or image-lift/OCR operations carried out by the PLIIM-based system. Also, it is understood that the UVGI unit and germicide irradiation technique of the present invention may be integrated with other types of optical scanners.

Modifications of the Illustrative Embodiments

While each embodiment of the PLIIM system of the present invention disclosed herein has employed a pair of planar laser illumination arrays, it is understood that in other embodiments of the present invention, only a single PLIA may be used, whereas in other embodiments three or more PLIAs may be used depending on the application at band.

While the illustrative embodiments disclosed herein have employed electronic-type imaging detectors (e.g. 1-D and 2-D CCD-type image sensing/detecting arrays) for the clear advantages that such devices provide in bar code and other photo-electronic scanning applications, it is understood, however, that photo-optical and/or photo-chemical image detectors/sensors (e.g. optical film) can be used to practice the principles of the present invention disclosed herein.

While the package conveyor subsystems employed in the illustrative embodiments have utilized belt or roller structures to transport packages, it is understood that this subsystem can be realized in many ways, for example: using trains running on tracks passing through the laser scanning tunnel; mobile transport units running through the scanning tunnel installed in a factory environment; robotically-controlled platforms or carriages supporting packages, parcels or other bar coded objects, moving through a laser scanning tunnel subsystem.

Expectedly, the PLIIM-based systems disclosed herein will find many useful applications in diverse technical fields. Examples of such applications include, but are not limited to: automated plastic classification systems; automated road surface analysis systems; rut measurement systems; wood inspection systems; high speed 3D laser proofing sensors; stereoscopic vision systems; stroboscopic vision systems; food handling equipment; food harvesting equipment (harvesters); optical food sortation equipment; etc.

The various embodiments of the package identification and measuring system hereof have been described in connection with scanning linear (1-D) and 2-D code symbols, graphical images as practiced in the graphical scanning arts, as well as alphanumeric characters (e.g. textual information) in optical character recognition (OCR) applications. Examples of OCR applications are taught in U.S. Pat. No. 5,727,081 to Burges, et al, incorporated herein by reference. It is understood that the systems, modules, devices and subsystems of the illustrative embodiments may be modified in a variety of ways which will become readily apparent to those skilled in the art, and having the benefit of the novel teachings disclosed herein. All such modifications and variations of the illustrative embodiments thereof shall be deemed to be within the scope and spirit of the present invention as defined by the claims to Invention appended hereto.

What is claimed is:

1. A method of reducing speckle-pattern moise at the image detection array of a planar laser illumination and imaging (PLLIM) based camera system, said method comprising the steps of:

(a) producing a planar laser illumination laser beam (PLIB) within a planar laser illumination and imaging (PLIIM) based system including an image detection array having image forming optics with a field of view (FOV) arranged in a coplanar relationship with said PLIB;

(b) reducing the temporal-coherence of said planar laser illumination beam (PLIB) before said PLIB illuminates a target object, by applying a temporal phase modulation technique during the transmission of said PLIB towards the target, so that the object is illuminated with a temporally coherent-reduced planar laser illumination beam (PLIB) and numerous substantially different time-varying speckle-noise patterns are produced at said image detection array over the photo-integration time period thereof;

(c) detecting said numerous substantially different time-varying speckle-noise patterns over said photo-integration time period; and (d) temporally averaging said detected speckle-noise patterns at said image detection array during said photo-integration time period thereof, thereby reducing the RMS power of observable speckle-noise patterns at said image detection array.

2. The method of claim 1, wherein the temporal phase modulation technique practiced during step (b) comprises:

modulating the temporal phase of the transmitted PLIB along the planar extent thereof according to a temporal phase modulation function (TIMF) so as to modulate the temporal phase along the wavefront of the PLIB and produce said numerous substantially different time-varying speckle-noise patterns at the image detection array during the photo-integration time period thereof.

3. The method of claim 1, wherein the temporal phase modulation technique practiced during step (b) is selected from the group consisting of: using an optically-reflective cavity (i.e. etalon device) affixed to external portion of each VLD; using a phase-only LCD temporal intensity modulation panel; and using a fiber optical array.

4. The method of claim 1, wherein step (b) comprises using the planar laser illumination beam is temporal phase modulated prior to target object illumination employing photon trapping, delaying and releasing principles within an optically reflective cavity (i.e. etalon) externally affixed to each visible laser diode within the planar laser illumination array.

5. The method of claim 1, wherein the planar laser illumination beam (PLIB) is temporal phase modulated using a phase-only type LCD-based phase modulation panel prior to target object illumination.

6. The method of claim 1, wherein the planar laser illumination beam (PLIB) is temporal phase modulated using a high-density fiber-optic array prior to target object illumination.

7. A planar laser illumination and imaging (PLLIM) based system capable of producing digital images with reduced levels of speckle-pattern noise, said PLIIM based camera system comprising:

a planar laser illumination array (PLIA) including a plurality of laser diodes for producing and projecting a planar laser illumination beam (PLIB) so as to illuminate an object as it is moving past said PLIIM based camera system;

an image formation and detection (IFD) module having a image detection array and imaging forming optics for providing said image detection array with a field of view (FOV), wherein said PLIB and FOV are arranged in a coplanar relationship along the working range of said PLIIM based camera system so that the PLIB illuminates primarily within said FOV of the IFD module; and a speckle-pattern noise reduction subsystem, integrated with said PLIA, for reducing the temporal-coherence of said planar laser illumination beam (PLIB) before said PLIB illuminates a target object;

said speckle-pattern noise reduction subsystem applying a temporal intensity modulation technique during the transmission of said PLIB towards the target, so that the object is illuminated with a temporally coherent-reduced planar laser illumination beam (PLIB) and numerous substantially different time-varying speckle-noise patterns are produced at said image detection array over the photo-integration time period thereof;

whereby said numerous substantially different time-varying speckle-noise patterns are detected at said image detection array over said photo-integration time period, and said detected speckle-noise patterns are temporally averaged at said image detection array during said photo-integration time period thereof, thereby, reducing the RMS power of observable speckle-noise patterns at said image detection array.

8. The PLIIM based camera system of claim 7, wherein the temporal intensity modulation technique comprises modulating the temporal intensity of the transmitted PLIB along the planar extent thereof according to a temporal intensity modulation function (TPMF) so as to modulate the temporal intensity along the wavefront of the PLIB and produce said numerous substantially different time-varying speckle-noise patterns at the image detection array during the photo-integration time period thereof.

9. The PLIIM based camera system of claim 7, wherein said speckle-pattern noise reduction subsystem is selected from the group consisting of: an optically-reflective cavity (i.e. etalon device) affixed to external portion of each VLD; a phase-only LCD temporal intensity modulation panel disposed in the optical path of the PLIB being transmitted to the target object; and a fiber optical array disposed in the optical path of the laser beam used to generated said PLIB prior to its transmission to the target object.

10. The PLIIM based camera system of claim 7, wherein said speckle-pattern noise reduction subsystem comprises means for photon trapping, delaying and releasing principles within an optically reflective cavity (i.e. etalon) externally affixed to each visible laser diode within said planar laser illumination array.

11. The PLIIM based camera system of claim 7, wherein said speckle-pattern noise reduction subsystem comprises a phase-only type LCD-based phase modulation panel disposed in the optical path of said PLIB prior to target object illumination.

12. The PLIIM based camera system of claim 7, wherein said speckle-pattern noise reduction subsystem comprises a high-density fiber-optic array disposed in the optical path of said PLIB prior to target object illumination.

* * * * *